US010243586B2

(12) United States Patent
Murakami

(10) Patent No.: US 10,243,586 B2
(45) **Date of Patent: *Mar. 26, 2019**

(54) CODING METHOD, DECODING METHOD, CODER, AND DECODER

(71) Applicant: Sun Patent Trust, New York, NY (US)

(72) Inventor: Yutaka Murakami, Kanagawa (JP)

(73) Assignee: SUN PATENT TRUST, New York, NY (US)

( * ) Notice: Subject to any disclaimer, the term of this patent is extended or adjusted under 35 U.S.C. 154(b) by 58 days.

This patent is subject to a terminal disclaimer.

(21) Appl. No.: 15/405,554

(22) Filed: Jan. 13, 2017

(65) Prior Publication Data

US 2017/0134047 A1 May 11, 2017

Related U.S. Application Data

(63) Continuation of application No. 14/432,859, filed as application No. PCT/JP2013/005886 on Oct. 2, 2013, now Pat. No. 9,584,157.

(30) Foreign Application Priority Data

Oct. 5, 2012 (JP) ................................ 2012-223569
Oct. 5, 2012 (JP) ................................ 2012-223570
(Continued)

(51) Int. Cl.
*G06F 11/10* (2006.01)
*H03M 13/00* (2006.01)
(Continued)

(52) U.S. Cl.
CPC ......... *H03M 13/1111* (2013.01); *G06F 11/10* (2013.01); *H03M 13/033* (2013.01);
(Continued)

(58) Field of Classification Search
CPC .......... H03M 13/1154; H03M 13/118; H03M 13/23; H03M 13/1111; H03M 13/235; H03M 13/116
(Continued)

(56) References Cited

U.S. PATENT DOCUMENTS 6,134,696 A * 10/2000 Morelos-Zaragoza ...................... H03M 13/23 375/262
6,209,116 B1 * 3/2001 Hammons, Jr. ......... H04L 1/004 714/786
(Continued)

FOREIGN PATENT DOCUMENTS

JP 2009-246926 10/2009
JP 4928613 5/2012
(Continued)

OTHER PUBLICATIONS

International Search Report (ISR) dated Oct. 29, 2013 in International (PCT) Application No. PCT/JP2013/005886.
(Continued)

*Primary Examiner* — James C Kerveros
(74) *Attorney, Agent, or Firm* — Wenderoth, Lind & Ponack, L.L.P.

(57) ABSTRACT

An encoding method of generating an encoded sequence by performing encoding of a given encoding rate based on a predetermined parity check matrix. The predetermined matrix is either a first parity check matrix or a second parity check matrix. The first parity check matrix corresponds to a low density parity check (LDPC) convolutional code that uses a plurality of parity check polynomials, and the second parity check matrix is generated by performing at least one of row permutation and column permutation on the first parity check matrix. A parity check polynomial satisfying
(Continued)

zero of the LDPC convolutional code is expressible by using a specific mathematical expression.

2 Claims, 101 Drawing Sheets

(30) Foreign Application Priority Data

Oct. 5, 2012 (JP) ................................ 2012-223571
Oct. 5, 2012 (JP) ................................ 2012-223572
Oct. 5, 2012 (JP) ................................ 2012-223573

(51) Int. Cl.
*H03M 13/03* (2006.01)
*H03M 13/11* (2006.01)
*H03M 13/23* (2006.01)
*H03M 13/39* (2006.01)
*H04L 1/00* (2006.01)

(52) U.S. Cl.
CPC ....... *H03M 13/036* (2013.01); *H03M 13/118* (2013.01); *H03M 13/1154* (2013.01); *H03M 13/23* (2013.01); *H03M 13/611* (2013.01); *H03M 13/616* (2013.01); *H03M 13/617* (2013.01); *H04L 1/0041* (2013.01); *H04L 1/0058* (2013.01); *H04L 1/0059* (2013.01); *H03M 13/1105* (2013.01); *H03M 13/235* (2013.01); *H03M 13/3988* (2013.01)

(58) Field of Classification Search
USPC .................................................. 714/781, 786
See application file for complete search history.

(56) References Cited

U.S. PATENT DOCUMENTS

| | | | | |
|---|---|---|---|---|
| 6,460,159 | B1 * | 10/2002 | Kim | H03M 13/03 714/790 |
| 6,665,833 | B1 * | 12/2003 | Tong | H03M 13/2957 714/790 |
| 7,225,392 | B2 * | 5/2007 | Huang | H03M 13/23 714/786 |
| 7,853,859 | B2 * | 12/2010 | Ojard | H03M 13/23 714/752 |
| 8,205,142 | B2 * | 6/2012 | Kamiya | H03M 13/11 714/752 |
| 8,286,050 | B2 * | 10/2012 | Murakami | H03M 13/1102 714/752 |
| 8,595,588 | B2 * | 11/2013 | Murakami | H03M 13/1111 714/752 |
| 8,745,471 | B2 * | 6/2014 | Murakami | H03M 13/118 714/781 |
| 9,032,275 | B2 * | 5/2015 | Murakami | H03M 13/1111 714/776 |
| 9,276,611 | B2 * | 3/2016 | Murakami | H03M 13/118 |
| 9,281,841 | B2 * | 3/2016 | Chen | H03M 13/116 |
| 2005/0050433 | A1 * | 3/2005 | Paul | H03M 13/1525 714/784 |
| 2008/0201628 | A1 * | 8/2008 | Liou | H03M 13/256 714/786 |
| 2008/0301536 | A1 * | 12/2008 | Shin | H04L 1/0043 714/786 |
| 2010/0205511 | A1 | 8/2010 | Murakami et al. | |
| 2011/0283162 | A1 | 11/2011 | Murakami | |

FOREIGN PATENT DOCUMENTS

| | | |
|---|---|---|
| WO | 2008/045001 | 4/2008 |
| WO | 2011/058760 | 5/2011 |

OTHER PUBLICATIONS

Yutaka Murakami et al., "A Design Scheme for LDPC Convolutional Codes Based on Parity Check Polynomials with a Time Period of 2", IEICE Technical Report, vol. 109, No. 440, pp. 309-314, RCS2009-311, Feb. 24, 2010, cited in the ISR.
Takaaki Kishigami et al., Rate Compatible LDPC-Convolutional Codes for the Change Request to 802.16m SDD, IEEE C802.16m-09/0412, Feb. 27, 2009, cited in the ISR.
R. G. Gallager, "Low-Density Parity-Check Codes", IRE Transactions on Information Theory, IT-8, pp. 21-28, 1962, cited in the specification.
David J. C. MacKay, "Good Error-Correcting Codes Based on Very Sparse Matrices", IEEE Transactions on Information Theory, vol. 45, No. 2, pp. 399-431, Mar. 1999, cited in the specification.
Marc P. C. Fossorier, "Quasi-Cyclic Low-Density Parity-Check Codes From Circulant Permutation Matrices", IEEE Transactions on Information Theory, vol. 50, No. 8, pp. 1788-1793, Aug. 2004, cited in the specification.
Alberto J. Felström et al. "Time-Varying Periodic Convolutional Codes With Low-Density Parity-Check Matrix", IEEE Transactions on Information Theory, vol. 45, No. 6, pp. 2181-2191, Sep. 1999, cited in the specification.
R. Michael Tanner et al., "LDPC Block and Convolutional Codes Based on Circulant Matrices", IEEE Transactions on Information Theory, vol. 50, No. 12, pp. 2966-2984, Dec. 2004, cited in the specification.
Marc P. C. Fossorier et al., "Reduced Complexity Iterative Decoding of Low-Density Parity Check Codes Based on Belief Propagation", IEEE Transactions on Communications, vol. 47, No. 5, pp. 673-680, May 1999, cited in the specification.
Jinghu Chen et al., "Reduced-Complexity Decoding of LDPC Codes", IEEE Transactions on Communications, vol. 53., No. 8, pp. 1288-1299, Aug. 2005, cited in the specification.
Juntan Zhang et al., "Shuffled Iterative Decoding", IEEE Transactions on Communications, vol. 53., No. 2, pp. 209-213, Feb. 2005, cited in the specification.
Gadi Miller et al., "Bounds on the Maximum-Likelihood Decoding Error Probability of Low-Density Parity-Check Codes", IEEE Transactions on Information Theory, vol. 47, No. 7, pp. 2696-2710, Nov. 2001, cited in the specification.
Robert G. Gallager, "A Simple Derivation of the Coding Theorem and Some Applications", IEEE Transactions on Information Theory, vol. IT-11, No. 1, pp. 3-18, Jan. 1965, cited in the specification.
Andrew J. Viterbi, "Error Bounds for Convolutional Codes and an Asymptotically Optimum Decoding Algorithm", IEEE Transactions on Information Theory, vol. IT-13, No. 2, pp. 260-269, Apr. 1967, cited in the specification.
Andrew J. Viterbi et al., "Principles of Digital Communication and Coding", McGraw-Hill, New York 1979, cited in the specification.
Yutaka Murakami et al., "LDPC Convolutional Codes Based on Parity Check Polynomials with a Time Period of 3", IEICE Trans. Fundamentals, vol. E92-A, No. 10, Oct. 2009, cited in the specification.
Marcos B.S. Tavares et al., "Tail-Biting LDPC Convolutional Codes", Proc. of IEEE ISIT 2007, pp. 2341-2345, Jun. 2007, cited in the specification.
Howard H. Ma et al., "On Tail Biting Convolutional Codes", IEEE Transactions Communications, vol. com-34, No. 2, pp. 104-111, Feb. 1986, cited in the specification.
Christian Weiß et al., "Code Construction and Decoding of Parallel Concatenated Tail-Biting Codes", IEEE Transactions on Information Theory, vol. 47, No. 1, pp. 366-386, Jan. 2001, cited in the specification.
Juntan Zhang et al., "A Modified Weighted Bit-Flipping Decoding of Low-Density Parity-Check Codes", IEEE Communications Letters, vol. 8, No. 3, pp. 165-167, Mar. 2004, cited in the specification.
IEEE Standard for Local and Metropolitan Area Networks, IEEE P802.16e/D12, Oct. 2005, cited in the specification.
Extended European Search Report dated Dec. 10, 2015 in cooresponding European Application No. 13843816.3.
Chen Z., et al., "Construction of Low-Density Parity-Check Convolutional Codes Through Progressive Edge-Growth," IEEE Com-

(56) References Cited

OTHER PUBLICATIONS munications Letters, IEEE Service Center, Piscataway, NJ, US, vol. 9, No. 12, Dec. 1, 2005, pp. 1058-1060, XP001237858, ISSN: 1089-7798, DOI: 10.1109/LCOMM.2005.1576587.
Yixiang, Wang et al., "Quasi-Cyclic Low-Density Parity-Check Convolutional Code," Proc., IEEE 7th International Conference on Wireless and Mobile-Computing, Networking and Communications, WIMBO 2—ISBN: 011, Oct. 10, 2011, pp. 351-356, XP032000196, DOI: 10.1109/WIMOB.2011.6085376 ISBN: 978-1-4577-2013-0.
Pusane A. et al., "Deriving Good LDPC Convolutional Codes from LDPC Block Codes," IEEE Transactions on Information Theory, IEEE Press, USA, vol. 57, No. 2, Feb. 1, 2011, pp. 835-857, XP011348929, ISSN: 0018-9448, DOI: 10.1109/TIT.2010.2095211.

* cited by examiner

FIG.1

$$\mathbf{H}^{T}_{[0,n]} = \begin{pmatrix} h_1^{(0)}(0) & h_1^{(1)}(1) & \cdots & h_1^{(M)}(M) & 0 & \cdots & 0 \\ h_2^{(0)}(0) & h_2^{(1)}(1) & \cdots & h_2^{(0)}(M) & 0 & & \\ 0 & h_1^{(0)}(1) & \cdots & \vdots & h_1^{(M)}(M+1) & & \\ & h_2^{(0)}(1) & \cdots & & h_2^{(M)}(M+1) & & \vdots \\ & 0 & \ddots & & \vdots & & 0 \\ & & \ddots & & & & h_1^{(M)}(n) \\ & & & & & & h_2^{(M)}(n) \\ & & & & & & \vdots \\ & & & & & 0 & h_2^{(0)}(n) \end{pmatrix}$$

FIG.3

GENERATOR POLYNOMIAL $G = \left[1 \ \ (D^2+1)/(D^2+D+1)\right]$

PARITY CHECK POLYNOMIAL $\left(D^2+1\right)X\left(D\right)+\left(D^2+D+1\right)P\left(D\right)=0$

CHECK MATRIX H =

```
110000000000000000000000000000000...
011100000000000000000000000000000...
110111000000000000000000000000000...
001101110000000000000000000000000...
000011011100000000000000000000000...
000000110111000000000000000000000...
000000001101110000000000000000000...
000000000011011100000000000000000...
000000000000110111000000000000000...
000000000000001101110000000000000...
.....................................
```

TRANSMISSION SEQUENCE wi = (xi, pi)

TRANSMISSION VECTOR w = (x1,p1,x2,p2,x3,p3,x4,p4,x5,p5,• • •,xi,pi,• • •)

$Hw=0$

100

TRANSMISSION SEQUENCE $v_j^T = (Y_{j,1}, Y_{j,2}, Y_{j,3}, \cdots, Y_{j,N-2}, Y_{j,N-1}, Y_{j,N})$

PARITY CHECK MATRIX H:

FIG. 37

PARITY CHECK MATRIX H:

| |
|---|
| FIRST ROW:#0: FIRST EXPRESSION |
| SECOND ROW:#0: SECOND EXPRESSION |
| THIRD ROW:#1: FIRST EXPRESSION |
| FOURTH ROW:#1: SECOND EXPRESSION |
| ⋮ |
| 2×(2m-1)-1TH ROW: #(2m-2): FIRST EXPRESSION |
| 2×(2m-1)TH ROW: #(2m-2): SECOND EXPRESSION |
| 2×(2m)-1TH ROW: #(2m-1): FIRST EXPRESSION |
| 2×(2m)TH ROW: #(2m-1): SECOND EXPRESSION |
| 2×(2m+1)-1TH ROW: #0: FIRST EXPRESSION |
| 2×(2m+1)TH ROW: #0: SECOND EXPRESSION |
| 2×(2m+2)-1TH ROW: #1: FIRST EXPRESSION |
| 2×(2m+2)TH ROW: #1: SECOND EXPRESSION |
| ⋮ |
| 2×i-1TH ROW: #((i-1)%2m): FIRST EXPRESSION |
| 2×iTH: #((i-1)%2m): SECOND EXPRESSION |
| ⋮ |

PARITY CHECK MATRIX H

Frame configuration when SISO scheme is used

Frame configuration when MIMO scheme is used

FIG.56
VIDEO STREAM (MAIN VIDEO OF PID = 0x1011)
AUDIO STREAM (PID = 0x1100)
AUDIO STREAM (PID = 0x1101)
PRESENTATION GRAPHICS STREAM (PID = 0x1200)
PRESENTATION GRAPHICS STREAM (PID = 0x1201)
INTERACTIVE GRAPHICS STREAM (PID = 0x1400)
VIDEO STREAM (SUB-VIDEO OF PID = 0x1B00)
VIDEO STREAM (SUB-VIDEO OF PID = 0x1B01)

FIG. 66

PARITY CHECK MATRIX H:

| |
|---|
| FIRST ROW:#0: FIRST EXPRESSION |
| SECOND ROW:#0: SECOND EXPRESSION |
| THIRD ROW:#1: FIRST EXPRESSION |
| FOURTH ROW:#1: SECOND EXPRESSION |
| ⋮ |
| 2×(2m−1)−1TH ROW: #(2m−2): FIRST EXPRESSION |
| 2×(2m−1)TH ROW: #(2m−2): SECOND EXPRESSION |
| 2×(2m)−1TH ROW: #(2m−1): FIRST EXPRESSION |
| 2×(2m)TH ROW: #(2m−1): SECOND EXPRESSION |
| 2×(2m+1)−1TH ROW: #0: FIRST EXPRESSION |
| 2×(2m+1)TH ROW: #0: SECOND EXPRESSION |
| 2×(2m+2)−1TH ROW: #1: FIRST EXPRESSION |
| 2×(2m+2)TH ROW: #1: SECOND EXPRESSION |
| ⋮ |
| 2×i−1TH ROW: #((i−1)%2m): FIRST EXPRESSION |
| 2×i TH ROW: #((i−1)%2m): SECOND EXPRESSION |
| ⋮ |

FIG. 75

PARITY CHECK MATRIX H:

| |
|---|
| FIRST ROW:#0: FIRST EXPRESSION |
| SECOND ROW:#0: SECOND EXPRESSION |
| THIRD ROW:#1: FIRST EXPRESSION |
| FOURTH ROW:#1: SECOND EXPRESSION |
| ⋮ |
| 2×(2m−1)−1TH ROW: #(2m−2); FIRST EXPRESSION |
| 2×(2m−1)TH ROW: #(2m−2); SECOND EXPRESSION |
| 2×(2m)−1TH ROW: #(2m−1); FIRST EXPRESSION |
| 2×(2m)TH ROW: #(2m−1); SECOND EXPRESSION |
| 2×(2m+1)−1TH ROW: #0: FIRST EXPRESSION |
| 2×(2m+1)TH ROW: #0: SECOND EXPRESSION |
| 2×(2m+2)−1TH ROW: #1: FIRST EXPRESSION |
| 2×(2m+2)TH ROW: #1: SECOND EXPRESSION |
| ⋮ |
| 2×i−1TH ROW: #((i−1)%2m); FIRST EXPRESSION |
| 2×i TH ROW: #((i−1)%2m); SECOND EXPRESSION |
| ⋮ |

PARITY CHECK MATRIX $H_{pro\_m}$

FIG. 84

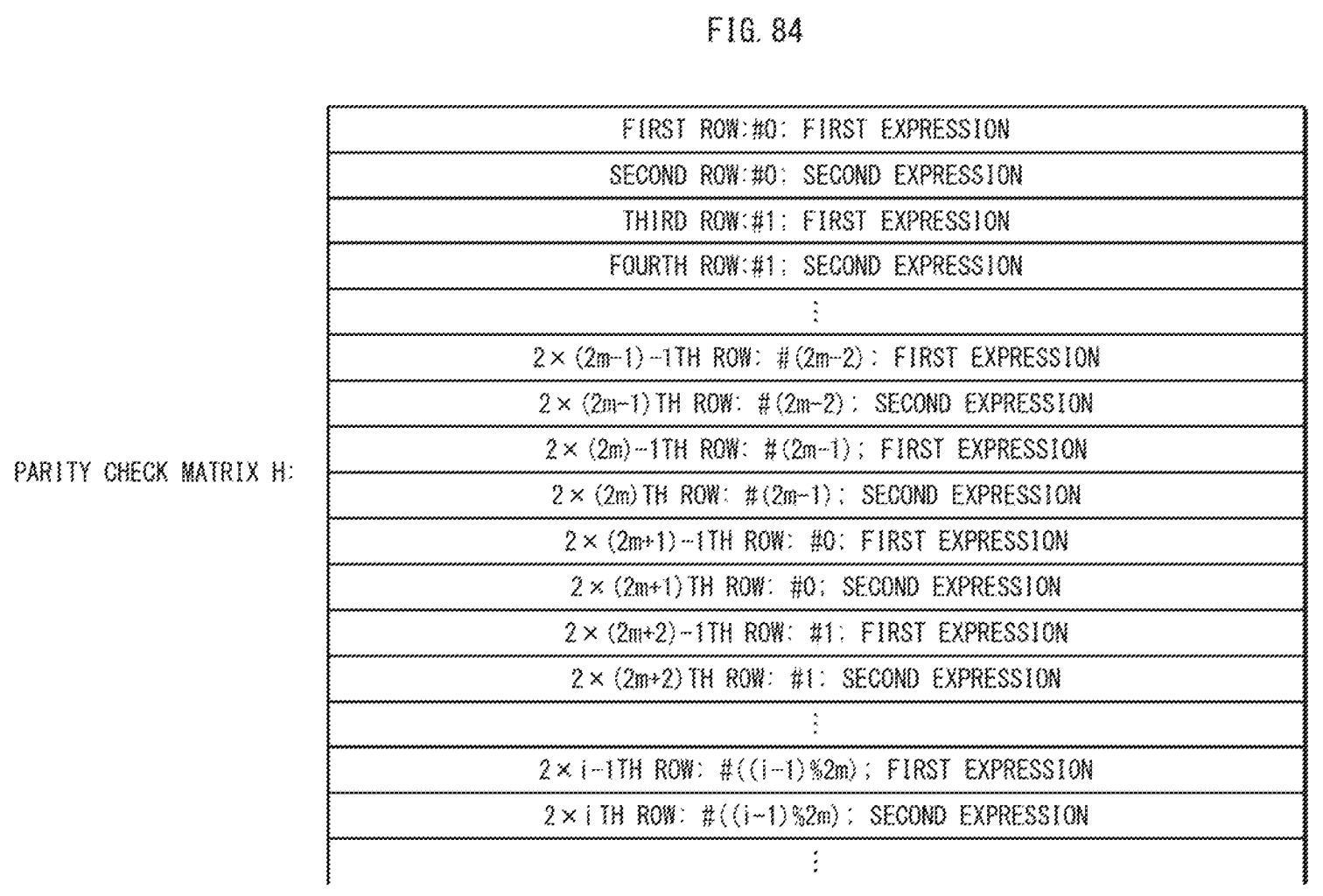

PARITY CHECK MATRIX H:

| |
|---|
| FIRST ROW:#0: FIRST EXPRESSION |
| SECOND ROW:#0: SECOND EXPRESSION |
| THIRD ROW:#1: FIRST EXPRESSION |
| FOURTH ROW:#1: SECOND EXPRESSION |
| ⋮ |
| 2×(2m−1)−1TH ROW: #(2m−2); FIRST EXPRESSION |
| 2×(2m−1)TH ROW: #(2m−2); SECOND EXPRESSION |
| 2×(2m)−1TH ROW: #(2m−1); FIRST EXPRESSION |
| 2×(2m)TH ROW: #(2m−1); SECOND EXPRESSION |
| 2×(2m+1)−1TH ROW: #0; FIRST EXPRESSION |
| 2×(2m+1)TH ROW: #0; SECOND EXPRESSION |
| 2×(2m+2)−1TH ROW: #1; FIRST EXPRESSION |
| 2×(2m+2)TH ROW: #1; SECOND EXPRESSION |
| ⋮ |
| 2×i−1TH ROW: #((i−1)%2m); FIRST EXPRESSION |
| 2×i TH ROW: #((i−1)%2m); SECOND EXPRESSION |
| ⋮ |

FIG. 85

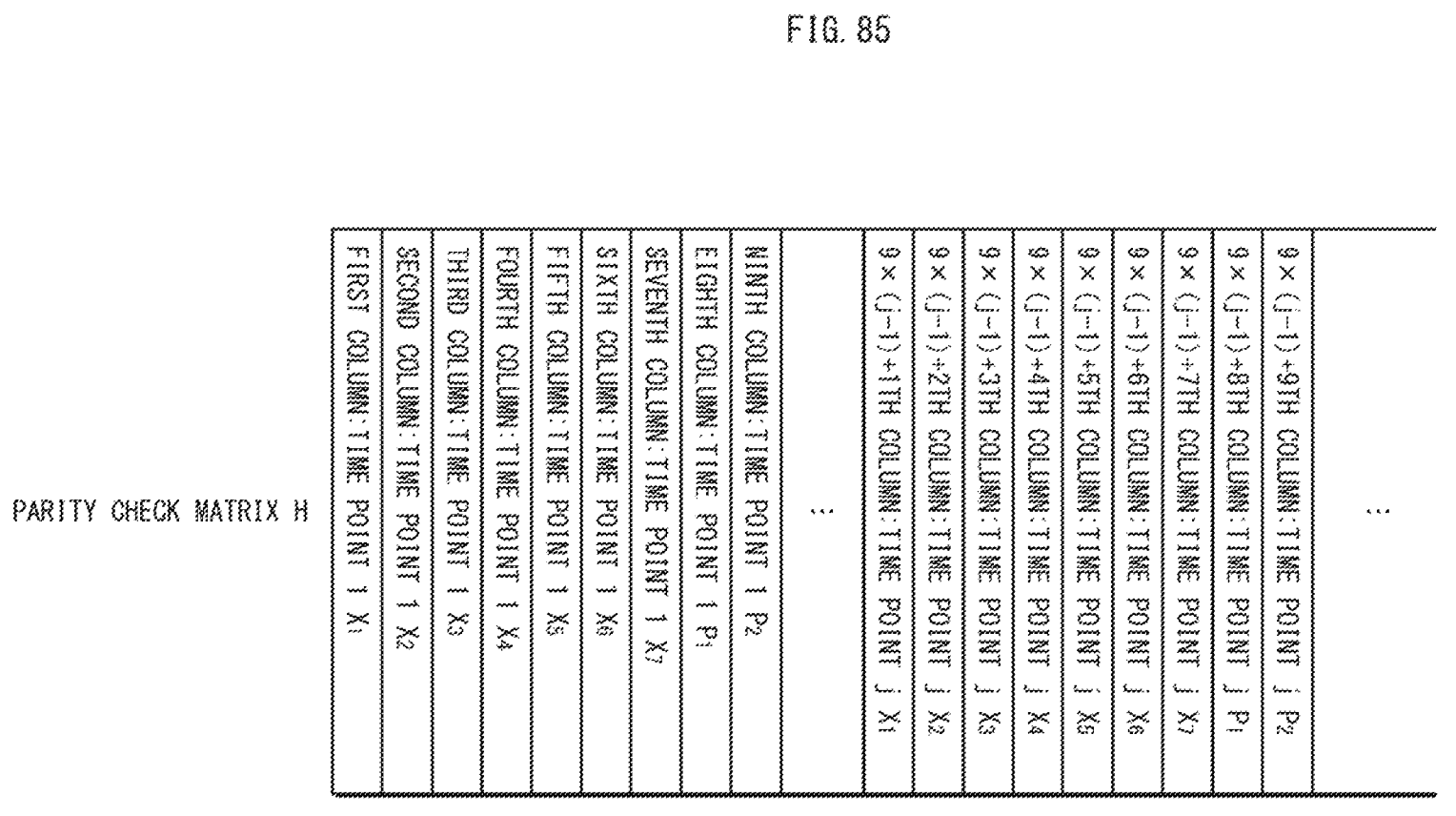

| |
|---|
| ⋮ |
| 9×(j−1)+9TH COLUMN:TIME POINT j $P_2$ |
| 9×(j−1)+8TH COLUMN:TIME POINT j $P_1$ |
| 9×(j−1)+7TH COLUMN:TIME POINT j $X_7$ |
| 9×(j−1)+6TH COLUMN:TIME POINT j $X_6$ |
| 9×(j−1)+5TH COLUMN:TIME POINT j $X_5$ |
| 9×(j−1)+4TH COLUMN:TIME POINT j $X_4$ |
| 9×(j−1)+3TH COLUMN:TIME POINT j $X_3$ |
| 9×(j−1)+2TH COLUMN:TIME POINT j $X_2$ |
| 9×(j−1)+1TH COLUMN:TIME POINT j $X_1$ |
| ⋮ |
| NINTH COLUMN:TIME POINT 1 $P_2$ |
| EIGHTH COLUMN:TIME POINT 1 $P_1$ |
| SEVENTH COLUMN:TIME POINT 1 $X_7$ |
| SIXTH COLUMN:TIME POINT 1 $X_6$ |
| FIFTH COLUMN:TIME POINT 1 $X_5$ |
| FOURTH COLUMN:TIME POINT 1 $X_4$ |
| THIRD COLUMN:TIME POINT 1 $X_3$ |
| SECOND COLUMN:TIME POINT 1 $X_2$ |
| FIRST COLUMN:TIME POINT 1 $X_1$ |

PARITY CHECK MATRIX H

FIG. 93

PARITY CHECK MATRIX H:

| |
|---|
| FIRST ROW:#0: FIRST EXPRESSION |
| SECOND ROW:#0: SECOND EXPRESSION |
| THIRD ROW:#1: FIRST EXPRESSION |
| FOURTH ROW:#1: SECOND EXPRESSION |
| ⋮ |
| 2×(2m-1)-1TH ROW: #(2m-2); FIRST EXPRESSION |
| 2×(2m-1)TH ROW: #(2m-2); SECOND EXPRESSION |
| 2×(2m)-1TH ROW: #(2m-1); FIRST EXPRESSION |
| 2×(2m)TH ROW: #(2m-1); SECOND EXPRESSION |
| 2×(2m+1)-1TH ROW: #0; FIRST EXPRESSION |
| 2×(2m+1)TH ROW: #0; SECOND EXPRESSION |
| 2×(2m+2)-1TH ROW: #1; FIRST EXPRESSION |
| 2×(2m+2)TH ROW: #1; SECOND EXPRESSION |
| ⋮ |
| 2×i-1TH ROW: #((i-1)%2m); FIRST EXPRESSION |
| 2×iTH ROW: #((i-1)%2m); SECOND EXPRESSION |
| ⋮ |

FIG. 94

| |
|---|
| ⋮ |
| 15×(j−1)+15TH COLUMN:TIME POINT j $P_2$ |
| 15×(j−1)+14TH COLUMN:TIME POINT j $P_1$ |
| 15×(j−1)+13TH COLUMN:TIME POINT j $X_{13}$ |
| 15×(j−1)+12TH COLUMN:TIME POINT j $X_{12}$ |
| 15×(j−1)+11TH COLUMN:TIME POINT j $X_{11}$ |
| 15×(j−1)+10TH COLUMN:TIME POINT j $X_{10}$ |
| 15×(j−1)+9TH COLUMN:TIME POINT j $X_9$ |
| 15×(j−1)+8TH COLUMN:TIME POINT j $X_8$ |
| 15×(j−1)+7TH COLUMN:TIME POINT j $X_7$ |
| 15×(j−1)+6TH COLUMN:TIME POINT j $X_6$ |
| 15×(j−1)+5TH COLUMN:TIME POINT j $X_5$ |
| 15×(j−1)+4TH COLUMN:TIME POINT j $X_4$ |
| 15×(j−1)+3TH COLUMN:TIME POINT j $X_3$ |
| 15×(j−1)+2TH COLUMN:TIME POINT j $X_2$ |
| 15×(j−1)+1TH COLUMN:TIME POINT j $X_1$ |
| ⋮ |
| FIFTEENTH COLUMN:TIME POINT 1 $P_2$ |
| FOURTEENTH COLUMN:TIME POINT 1 $P_1$ |
| THIRTEENTH COLUMN:TIME POINT 1 $X_{13}$ |
| TWELFTH COLUMN:TIME POINT 1 $X_{12}$ |
| ELEVENTH COLUMN:TIME POINT 1 $X_{11}$ |
| TENTH COLUMN:TIME POINT 1 $X_{10}$ |
| NINTH COLUMN:TIME POINT 1 $X_9$ |
| EIGHTH COLUMN:TIME POINT 1 $X_8$ |
| SEVENTH COLUMN:TIME POINT 1 $X_7$ |
| SIXTH COLUMN:TIME POINT 1 $X_6$ |
| FIFTH COLUMN:TIME POINT 1 $X_5$ |
| FOURTH COLUMN:TIME POINT 1 $X_4$ |
| THIRD COLUMN:TIME POINT 1 $X_3$ |
| SECOND COLUMN:TIME POINT 1 $X_2$ |
| FIRST COLUMN:TIME POINT 1 $X_1$ |

PARITY CHECK MATRIX H

CODING METHOD, DECODING METHOD, CODER, AND DECODER

TECHNICAL FIELD

This application is based on Japanese Patent Applications No. 2012-223569, No. 2012-223570, No. 2012-223571, No. 2012-223572, and No. 2012-223573, the contents of which are hereby incorporated by reference.

The present invention relates to an encoding method, a decoding method, an encoder, and a decoder using low-density parity check convolutional codes (LDPC-CCs) having coding rates no smaller than 1/2 and not satisfying (n−1)/n (where n is an integer no smaller than two), and LDPC-CCs using improved tail-biting schemes (LDPC block codes using LDPC-CC).

BACKGROUND ART

In recent years, attention has been attracted to a low-density parity-check (LDPC) code as an error correction code that provides high error correction capability with a feasible circuit scale. Because of its high error correction capability and ease of implementation, an LDPC code has been adopted in an error correction coding scheme for IEEE802.11n high-speed wireless LAN systems, digital broadcasting systems, and so forth.

An LDPC code is an error correction code defined by low-density parity check matrix H. Furthermore, the LDPC code is a block code having the same block length as the number of columns N of check matrix H (see Non-Patent Literature 1, Non-Patent Literature 2, Non-Patent Literature 3). For example, random LDPC code, QC-LDPC code (QC: Quasi-Cyclic) are proposed.

Studies are being carried out on LDPC-CC (Low-Density Parity Check Convolutional Codes) capable of performing encoding or decoding on an information sequence of an arbitrary length for LDPC code (hereinafter, LDPC-BC: Low-Density Parity Check Block Code) of a block code (e.g. see Non-Patent Literature 4 and Non-Patent Literature 5).

LDPC-CC is a convolutional code defined by a low-density parity check matrix. For example, parity check matrix $H^T[0, n]$ of LDPC-CC having a coding rate of R=1/2 (=b/c) is shown in FIG. 1. Here, element $h_1^{(m)}(t)$ of $H^T[0, n]$ takes zero or one. All elements other than $h_1^{(m)}(t)$ are zeroes. M represents the LDPC-CC memory length, and n represents the length of an LDPC-CC codeword. As shown in FIG. 1, a characteristic of an LDPC-CC check matrix is that it is a parallelogram-shaped matrix in which ones are placed only in diagonal terms of the matrix and neighboring elements, and the bottom-left and top-right elements of the matrix are zero.

An LDPC-CC encoder defined by parity check matrix $H^T[0, n]$ where $h_1^{(0)}(t)=1$ and $h_2^{(0)}(t)=1$ is represented by FIG. 2. As shown in FIG. 2, an LDPC-CC encoder is formed with 2×(M+1) shift registers having a bit length of c and a mod 2 adder (exclusive OR operator). Thus, a feature of the LDPC-CC encoder is that it can be realized with a very simple circuit compared to a circuit that performs multiplication of a generator matrix or an LDPC-BC encoder that performs calculation based on a backward (forward) substitution method. Also, since the encoder in FIG. 2 is a convolutional code encoder, it is not necessary to divide an information sequence into fixed-length blocks when encoding, and an information sequence of any length can be encoded.

Patent Literatures 1 and 2 describe an LDPC-CC generating method based on a parity check polynomial. In particular, Patent Literature 1 describes a method of generating an LDPC-CC using parity check polynomials having a time-varying period of two, a time-varying period of three, a time-varying period of four, and a time-varying period of a multiple of three. In particular, Patent Literature 2 describes a relationship between time-varying periods and parity check polynomials.

CITATION LIST

Patent Literature

[Patent Literature 1]
Japanese Patent Application Publication No. 2009-246926
[Patent Literature 2]
International Application WO 2011/058760

Non-Patent Literature

[Non-Patent Literature 1]
R. G. Gallager, "Low-density parity check codes," IRE Trans. Inform. Theory, IT-8, pp. 21-28, 1962.
[Non-Patent Literature 2]
D. J. C. Mackay, "Good error-correcting codes based on very sparse matrices," IEEE Trans. Inform. Theory, vol. 45, no. 2, pp. 399-431, March 1999.
[Non-Patent Literature 3]
M. P. C. Fossorier, "Quasi-cyclic low-density parity-check codes from circulant permutation matrices," IEEE Trans. Inform. Theory, vol. 50, no. 8, pp. 1788-1793, November 2001.
[Non-Patent Literature 4]
A. J. Feltstrom, and K. S. Zigangirov, "Time-varying periodic convolutional codes with low-density parity-check matrix," IEEE Trans. Inform. Theory, vol. 45, no. 6, pp. 2181-2191, September 1999.
[Non-Patent Literature 5]
R. M. Tanner, D. Sridhara, A. Sridharan, T. E. Fuja, and D. J. Costello Jr., "LDPC block and convolutional codes based on circulant matrices," IEEE Trans. Inform. Theory, vol. 50, no. 12, pp. 2966-2984, December 2004.
[Non-Patent Literature 6]
M. P. C. Fossorier, M. Mihaljevic, and H. Imai, "Reduced complexity iterative decoding of low-density parity check codes based on belief propagation," IEEE Trans. Commun., vol. 47, no. 5, pp. 673-680, May 1999.
[Non-Patent Literature 7]
J. Chen, A. Dholakia, E. Eleftheriou, M. P. C. Fossorier, and X.-Yu Hu, "Reduced-complexity decoding of LDPC codes," IEEE Trans. Commun., vol. 53, no. 8, pp. 1288-1299, August 2005.
[Non-Patent Literature 8]
J. Zhang, and M. P. C. Fossorier, "Shuffled iterative decoding," IEEE Trans. Commun., vol. 53, no. 2, pp. 209-213, February 2005.
[Non-Patent Literature 9]
G. Miller, and D. Burshtein, "Bounds on the maximum likelihood decoding error probability of low-density parity check codes," IEEE Trans. Inf. Theory, vol. 47, no. 7, pp. 2696-2710, November 2001.
[Non-Patent Literature 10]
R. G. Gallager, "A simple derivation of the coding theorem and some applications," IEEE Trans. Inf. Theory, vol. IT-11, no. 1, pp. 3-18, January 1965.

[Non-Patent Literature 11]

A. J. Viterbi, "Error bounds for convolutional codes and an asymptotically optimum decoding algorithm," IEEE Trans. Inf. Theory, vol. IT-13, no. 2, pp. 260-269, April 1967.

[Non-Patent Literature 12]

A. J. Viterbi, and J. K. Omura, "Principles of digital communication and coding," McGraw-Hill, New York, 1979.

[Non-Patent Literature 13]

Y. Murakami, S. Okamura, S. Okasaka, T. Kishigami, and M. Orihashi, "LDPC convolutional codes based on parity check polynomials with time period of 3," IEICE Trans. Fundamentals, vol. E-92, no. 10, pp. 2479-2483, October 2009.

[Non-Patent Literature 14]

M. B. S. Tavares, K. S. Zigangirov, and G. P. Fettweis, "Tail-biting LDPC convolutional codes," Proc. of IEEE ISIT 2007, pp. 2341-2345, June 2007.

[Non-Patent Literature 15]

H. H. Ma, and J. K. Wolf, "On tail biting convolutional codes," IEEE Trans. Commun., vol. com-34, no. 2, pp. 104-111, February 1986.

[Non-Patent Literature 16]

C. Weiss, C. Bettstetter, and S. Riedel, "Code construction and decoding of parallel concatenated tail-biting codes," IEEE Trans. Inform. Theory, vol. 47, no. 1, pp. 366-386, January 2001.

[Non-Patent Literature 17]

J. Zhang, and M. P. C Fossorier, "A modified weighted bit-flipping decoding of low density parity-check codes," IEEE Communications Letters, vol. 8, no. 3, pp. 165-167, 2004.

[Non-Patent Literature 18]

IEEE Standard for Local and Metropolitan Area Networks, IEEEP802.16e/D12, October 2005.

SUMMARY OF INVENTION

Technical Problem

Although Patent Literatures 1 and 2 describe a code generation method for an LDPC-CC of coding rate (n−1)/n (where n is an integer no smaller than two) based on a parity check polynomial, Patent Literatures 1 and 2 lack disclosure of a method of generating an LDPC-CC of a coding rate no smaller than 1/2 and not satisfying (n−1)/n (where n is an integer no smaller than two), and an LDPC-CC based on a parity check polynomial that uses an improved tail-biting scheme (LDPC block codes using LDPC-CC)

It is therefore an object of the present invention to provide an encoding method, a decoding method, an encoder, and a decoder for an LDPC-CC of a coding rate no smaller than 1/2 and not satisfying (n−1)/n (where n is an integer no smaller than two), and an LDPC-CC based on a parity check polynomial that uses an improved tail-biting scheme (LDPC block codes using LDPC-CC)

Solution to Problem

One aspect of the present invention is an encoding method of generating, by performing encoding of coding rate (n−1)/n on (n−1) information sequences (information sequences $X_1$ to $X_{n-1}$) based on a predetermined parity check matrix having m×z rows and n×m×z columns (where n is an integer no smaller than two, m is an even number no smaller than two, and z is a natural number), an encoded sequence composed of the (n−1) information sequences and a parity check sequence P. The predetermined parity check matrix is either a first parity check matrix or a second parity check matrix. The first parity check matrix corresponds to a low density parity check (LDPC) convolutional code that uses a plurality of parity check polynomials, and the second parity check matrix is generated by performing at least one of row permutation and column permutation on the first parity check matrix. An eth parity check polynomial satisfying zero of the LDPC convolutional code (where e is an integer no smaller than zero and no greater than m×z−1) is expressible by using a specific mathematical expression.

One aspect of the present invention is a decoding method of decoding an encoded sequence encoded by employing a predetermined encoding method. The predetermined encoding method generates, by performing encoding of coding rate (n−1)/n on (n−1) information sequences (information sequences $X_1$ to $X_{n-1}$) based on a predetermined parity check matrix having m×z rows and n×m×z columns (where n is an integer no smaller than two, m is an even number no smaller than two, and z is a natural number), an encoded sequence composed of the (n−1) information sequences and a parity check sequence P. The predetermined parity check matrix is either a first parity check matrix or a second parity check matrix. The first parity check matrix corresponds to a low density parity check (LDPC) convolutional code that uses a plurality of parity check polynomials, and the second parity check matrix is generated by performing at least one of row permutation and column permutation on the first parity check matrix. An eth parity check polynomial satisfying zero of the LDPC convolutional code (where e is an integer no smaller than zero and no greater than m×z−1) is expressible by using a specific mathematical expression.

Advantageous Effects of Invention

The present invention can achieve high error correction capability, and can thereby secure high data quality.

BRIEF DESCRIPTION OF DRAWINGS

FIG. 1 shows an LDPC-CC check matrix.

FIG. 3 shows a parity check matrix of a (7, 5) convolutional code.

FIG. 37 shows an example of the configuration of check matrix for LDPC-CC of coding rate 2/4 and time-varying period 2×m that is based on a parity check polynomial.

FIG. 66 shows an example of the configuration of check matrix for LDPC-CC of coding rate 3/5 and time-varying period 2×m that is based on a parity check polynomial.

FIG. 75 shows an example of the configuration of check matrix for LDPC-CC of coding rate 5/7 and time-varying period 2×m that is based on a parity check polynomial.

FIG. 84 shows an example of the configuration of check matrix for LDPC-CC of coding rate 7/9 and time-varying period 2×m that is based on a parity check polynomial.

FIG. 85 shows an example of the configuration of check matrix for LDPC-CC of coding rate 7/9 and time-varying period 2×m that is based on a parity check polynomial.

FIG. 93 shows an example of the configuration of check matrix for LDPC-CC of coding rate 13/15 and time-varying period 2×m that is based on a parity check polynomial.

FIG. 94 shows an example of the configuration of check matrix for LDPC-CC of coding rate 13/15 and time-varying period 2×m that is based on a parity check polynomial.

DESCRIPTION OF EMBODIMENTS

Figure 2:
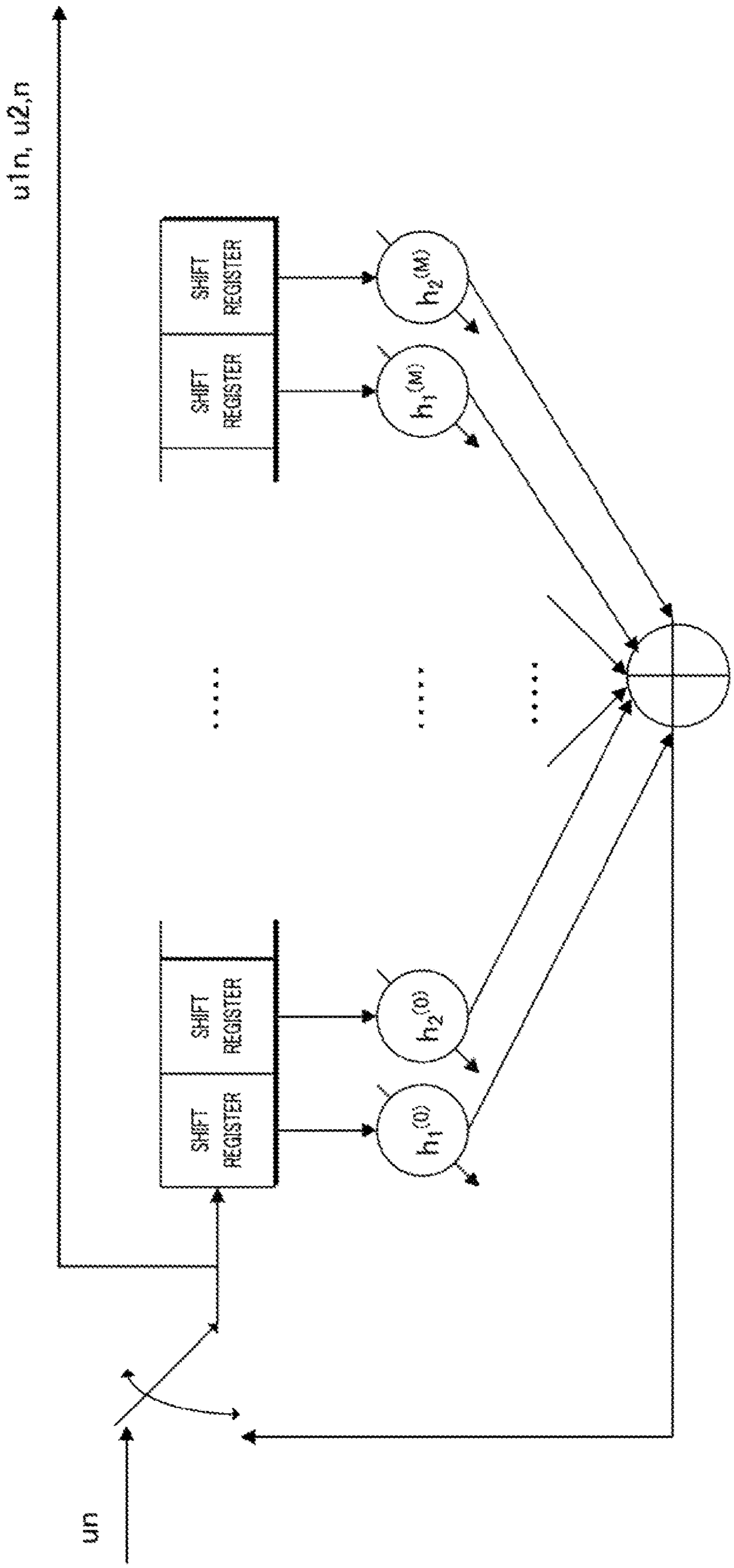
FIG. 2 shows a configuration of an LDPC-CC encoder.

Embodiments of the present invention are described below, with reference to the accompanying drawings.

Before describing specific configurations and operations of the embodiments, an LDPC-CC based on parity check polynomials described in Patent Literatures 1 and 2 is described first.

For example, a convolutional code of a coding rate of 1/2 and generator polynomial $G=[1G_1(D)/G_0(D)]$ will be considered as an example. Here, $G_1$ represents a feed-forward polynomial and $G_0$ represents a feedback polynomial. If a polynomial representation of an information sequence (data) is X(D), and a polynomial representation of a parity sequence is P(D), a parity check polynomial is represented as shown in expression 1 below.

[Math. 1]

$$G_1(D)X(D)+G_0(D)P(D)=0 \quad (1)$$

where D is a delay operator.

FIG. 3 shows information relating to a (7, 5) convolutional code. A (7, 5) convolutional code generator polynomial is represented as $G=[1(D^2+1)/(D^2+D+1)]$. Therefore, a parity check polynomial is as shown in expression 2 below.

[Math. 2]

$$(D^2+1)X(D)+(D^2+D+1)P(D)=0 \quad (2)$$

Here, data at point in time i are represented by Xi, and parity bit by $P_i$, and transmission sequence Wi is represented as $W_i=(X_i, P_i)$. Then, transmission vector w is represented as $w=(X_1, P_1, X_2, P_2, \ldots, X_1, P_i \ldots)^T$. Thus, from expression 2, parity check matrix H can be represented as shown in FIG. 3. At this time, the relational expression in expression 3 below holds true.

[Math. 3]

$$Hw=0 \quad (3)$$

Therefore, with parity check matrix H, the decoding side can perform decoding using belief propagation (BP) decoding, min-sum decoding similar to BP decoding, offset BP decoding, normalized BP decoding, shuffled BP decoding, scheduled layered BP decoding, or suchlike belief propagation, as shown in Non-Patent Literature 4, Non-Patent Literature 6, Non-Patent Literature 7, and Non-Patent Literature 8.

[LDPC-CC of Coding Rate (n−1)/n (where n is an Integer No Smaller than Two) Based on Parity Check Polynomial]

The following describes a code configuration method of an LDPC-CC based on a parity check polynomial having a time-varying period greater than three and having excellent error correction capability.

[Time-Varying Period of Six]

First, an LDPC-CC having a time-varying period of six is described as an example.

Consider expression 4-0 through 4-5 as parity check polynomials (that satisfy 0) of an LDPC-CC having a coding rate of (n−1)/n (n is an integer no smaller than two) and a time-varying period of six.

[Math. 4]

$$(D^{a\#0,1,1}+D^{a\#0,1,2}+D^{a\#0,1,3})X_1+(D)+(D^{a\#0,2,1}+D^{a\#0,2,2}+D^{a\#0,2,3})X_2(D)+\ldots+(D^{a\#0,n-1,1}+D^{a\#0,n-1,2}+D^{a\#0,n-1,3})X_{n-1}(D)+(D^{b\#0,1}+D^{b\#0,2}+D^{b\#0,3})P(D)=0 \tag{4-0}$$

$$(D^{a\#1,1,1}+D^{a\#1,1,2}+D^{a\#1,1,3})X_1+(D)+(D^{a\#1,2,1}+D^{a\#1,2,2}+D^{a\#1,2,3})X_2(D)+\ldots+(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \tag{4-1}$$

$$(D^{a\#2,1,1}+D^{a\#2,1,2}+D^{a\#2,1,3})X_1+(D)+(D^{a\#2,2,1}+D^{a\#2,2,2}+D^{a\#2,2,3})X_2(D)+\ldots+(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \tag{4-2}$$

$$(D^{a\#3,1,1}+D^{a\#3,1,2}+D^{a\#3,1,3})X_1+(D)+(D^{a\#3,2,1}+D^{a\#3,2,2}+D^{a\#3,2,3})X_2(D)+\ldots+(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \tag{4-3}$$

$$(D^{a\#4,1,1}+D^{a\#4,1,2}+D^{a\#4,1,3})X_1+(D)+(D^{a\#4,2,1}+D^{a\#4,2,2}+D^{a\#4,2,3})X_2(D)+\ldots+(D^{a\#4,n-1,1}+D^{a\#4,n-1,2}+D^{a\#4,n-1,3})X_{n-1}(D)+(D^{b\#4,1}+D^{b\#4,2}+D^{b\#4,3})P(D)=0 \tag{4-4}$$

$$(D^{a\#5,1,1}+D^{a\#5,1,2}+D^{a\#5,1,3})X_1+(D)+(D^{a\#5,2,1}+D^{a\#5,2,2}+D^{a\#5,2,3})X_2(D)+\ldots+(D^{a\#5,n-1,1}+D^{a\#5,n-1,2}+D^{a\#5,n-1,3})X_{n-1}(D)+(D^{b\#5,1}+D^{b\#5,2}+D^{b\#5,3})P(D)=0 \tag{4-5}$$

Here, $X_1(D)$, $X_2(D)$, . . . , $X_{n-1}(D)$ are polynomial representations of data (information) $X_1, X_2, \ldots, X_{n-1}$, P(D) is a polynomial representation of parity, and D is a delay operator. In expression 4-0 through 4-5, when, for example, the coding rate is 1/2, only the terms of $X_1(D)$ and P(D) are present and the terms of $X_2(D), \ldots, X_{n-1}(D)$ are not present. Similarly, when the coding rate is 2/3, only the terms of $X_1(D)$, $X_2(D)$ and P(D) are present and the terms of $X_3(D), \ldots, X_{n-1}(D)$ are not present. The other coding rates may also be considered in a similar manner.

Here, expression 4-0 through 4-5 are assumed to have such parity check polynomials that three terms are present in each of $X_1(D), X_2(D), \ldots, X_{n-1}(D)$ and P(D).

Furthermore, in expression 4-0 through 4-5, it is assumed that the following holds true for $X_1(D), X_2(D), \ldots, X_{n-1}(D)$ and P(D).

In expression 4-q, it is assumed that $a_{\#q,p,1}$, $a_{\#q,p,2}$ and $a_{\#q,p,3}$ are natural numbers and $a_{\#q,p,1} \neq a\#_{q,p,2}$, $a_{\#q,p,1} \neq a_{\#p,q,3}$ and $a_{\#q,p,2} \neq a_{\#q,p,3}$ hold true. Furthermore, it is assumed that $b_{\#q,1}$, $b_{\#q,2}$ and $b_{\#q,3}$ are natural numbers and $b_{\#q,1} \neq b_{\#q,2}$, $b_{\#q,1} \neq b_{\#q,3}$ and $b_{\#q,1} \neq b_{\#q,3}$ hold true (q=0, 1, 2, 3, 4, 5; p=1, 2, . . . , n−1).

The parity check polynomial of expression 4-q is called check equation #q and the sub-matrix based on the parity check polynomial of expression 4-q is called qth sub-matrix $H_q$. Next, consider an LDPC-CC of a time-varying period of six generated from zeroth sub-matrix $H_0$, first sub-matrix $H_1$, second sub-matrix $H_2$, third sub-matrix $H_3$, fourth sub-matrix $H_4$ and fifth sub-matrix $H_5$.

In an LDPC-CC having a time-varying period of six and a coding rate of (n−1)/n (where n is an integer no smaller than two), the parity bit and information bits at point in time i are represented by Pi and $X_{i,1}, X_{i,2}, \ldots, X_{i,n-1}$, respectively. If i%6g=k (where k=0, 1, 2, 3, 4, 5) is assumed at this time, a parity check polynomial of expression 4-(k) holds true. For example, if i=8, i%6g=2 (k=2), expression 5 holds true.

[Math. 5]

$$(D^{a\#2,1,1}+D^{a\#2,1,2}+D^{a\#2,1,3})X_{8,1}+(D^{a\#2,2,1}+D^{a\#2,2,2}+D^{a\#2,2,3})X_{8,2}+\ldots+(D^{a\#2,n-1,1}+D^{a\#2,n-1,2}+D^{a\#2,n-1,3})X_{8,n-1}+(D^{b\#2,1}+D^{b\#2,2}+D^{b\#2,3})P_8=0 \tag{5}$$

It is assumed that $a_{\#q,1,3}=0$ and $b_{\#q,3}=0$ (q=0, 1, 2, 3, 4, 5) so as to simplify the relationship between the parity bits and information bits in expression 4-0 through 4-5 and sequentially find the parity bits when tail-biting is not performed. Therefore, the parity check polynomials (that satisfy 0) of expression 4-0 through 4-5 are represented as shown in expression 6-0 through expression 6-5.

[Math. 6]

$$(D^{a\#0,1,1}+D^{a\#0,1,2}+1)X_1+(D)+(D^{a\#0,2,1}+D^{a\#0,2,2}+1)X_2(D)+\ldots+(D^{a\#0,n-1,1}+D^{a\#0,n-1,2}+1)X_{n-1}(D)+(D^{b\#0,1}+D^{b\#0,2}+1)P(D)=0 \tag{6-0}$$

$$(D^{a\#1,1,1}+D^{a\#1,1,2}+1)X_1+(D)+(D^{a\#1,2,1}+D^{a\#1,2,2}+1)X_2(D)+\ldots+(D^{a\#1,n-1,1}+D^{a\#1,n-1,2}+1)X_{n-1}(D)+(D^{b\#1,1}+D^{b\#1,2}+1)P(D)=0 \tag{6-1}$$

$$(D^{a\#2,1,1}+D^{a\#2,1,2}+1)X_1+(D)+(D^{a\#2,2,1}+D^{a\#2,2,2}+1)X_2(D)+\ldots+(D^{a\#2,n-1,1}+D^{a\#2,n-1,2}+1)X_{n-1}(D)+(D^{b\#2,1}+D^{b\#2,2}+1)P(D)=0 \tag{6-2}$$

$$(D^{a\#3,1,1}+D^{a\#3,1,2}+1)X_1+(D)+(D^{a\#3,2,1}+D^{a\#3,2,2}+1)X_2(D)+\ldots+(D^{a\#3,n-1,1}+D^{a\#3,n-1,2}+1)X_{n-1}(D)+(D^{b\#3,1}+D^{b\#3,2}+1)P(D)=0 \tag{6-3}$$

$$(D^{a\#4,1,1}+D^{a\#4,1,2}+1)X_1+(D)+(D^{a\#4,2,1}+D^{a\#4,2,2}+1)X_2(D)+\ldots+(D^{a\#4,n-1,1}+D^{a\#4,n-1,2}+1)X_{n-1}(D)+(D^{b\#4,1}+D^{b\#4,2}+1)P(D)=0 \tag{6-4}$$

$$(D^{a\#5,1,1}+D^{a\#5,1,2}+1)X_1+(D)+(D^{a\#5,2,1}+D^{a\#5,2,2}+1)X_2(D)+\ldots+(D^{a\#5,n-1,1}+D^{a\#5,n-1,2}+1)X_{n-1}(D)+(D^{b\#5,1}+D^{b\#5,2}+1)P(D)=0 \tag{6-5}$$

Furthermore, it is assumed that zeroth sub-matrix $H_0$, first sub-matrix $H_1$, second sub-matrix $H_2$, third sub-matrix $H_3$, fourth sub-matrix $H_4$ and fifth sub-matrix $H_5$ are represented as shown in expression 7-0 through expression 7-5.

[Math. 7]

$$H_0 = \left\{H'_0, \underbrace{1\ 1\ \ldots\ 1}_{n}\right\} \tag{7-0}$$

$$H_1 = \left\{H'_1, \underbrace{1\ 1\ \ldots\ 1}_{n}\right\} \tag{7-1}$$

$$H_2 = \left\{H'_2, \underbrace{1\ 1\ \ldots\ 1}_{n}\right\} \tag{7-2}$$

$$H_3 = \left\{H'_3, \underbrace{1\ 1\ \ldots\ 1}_{n}\right\} \tag{7-3}$$

$$H_4 = \left\{H'_4, \underbrace{1\ 1\ \ldots\ 1}_{n}\right\} \tag{7-4}$$

-continued $$H_5 = \left\{H'_5, \underbrace{1\ 1\ \ldots\ 1}_{n}\right\} \quad (7\text{-}5)$$

In expression 7-0 through expression 7-5, n continuous ones correspond to the terms of $X_1(D), X_2(D), \ldots, X_{n-1}(D)$ and P(D) in each of expression 6-0 through expression 6-5.

Figure 4:
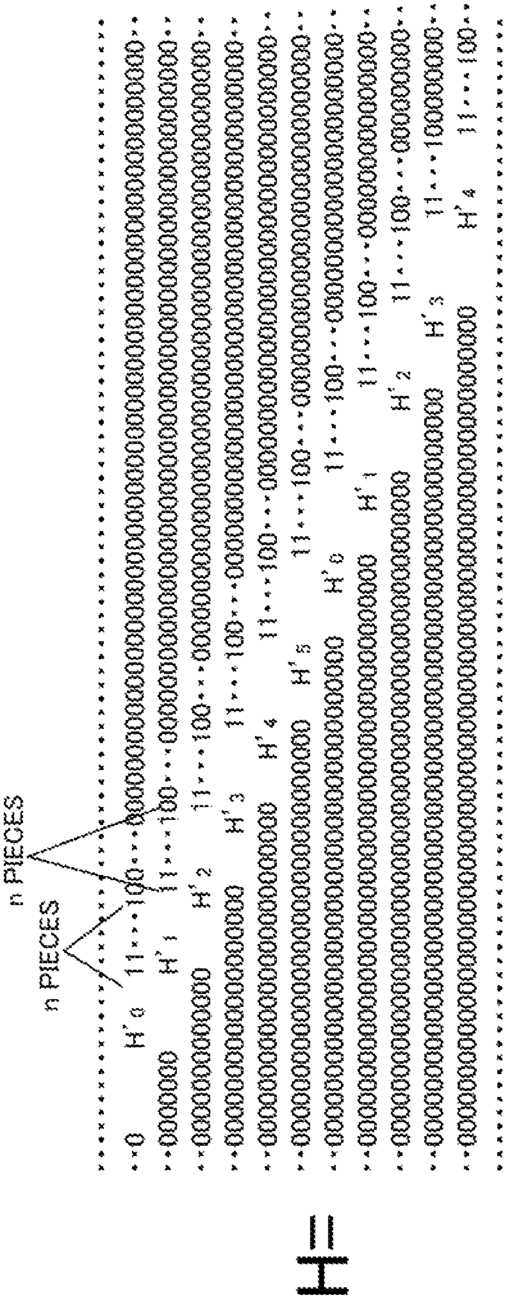
FIG. 4 shows an example of the configuration of LDPC-CC check matrix having a coding rate of (n−1)/n and a time-varying period of six.

Here, parity check matrix H can be represented as shown in FIG. 4. As shown in FIG. 4, a configuration is employed in which a sub-matrix is shifted n columns to the right between an ith row and (i+1)th row in parity check matrix H (see FIG. 4).

Assuming transmission vector u as $u=(X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, Hu=0 holds true. (Here, the zero in Hu=0 indicates that vector Hu is a (column) vector all elements of which are zeroes.)

Here, examples of conditions for the parity check polynomials in expression 6-0 through expression 6-5 are described under which high error correction capability can be achieved.

Condition #1-1 and Condition #1-2 below are important for the terms relating to $X_1(D), X_2(D), \ldots, X_{n-1}(D)$. In the following conditions, % means a modulo, and for example, α%6 represents a remainder after dividing α by 6.

<Condition #1-1>

$$a_{\#0,1,1}\%6 = a_{\#1,1,1}\%6 = a_{\#2,1,1}\%6 = a_{\#3,1,1}\%6 = a_{\#4,1,1}\%6 = a_{\#5,1,1}\%6 = v_{p=1}(v_{p=1}\text{: fixed-value})$$

$$a_{\#0,2,1}\%6 = a_{\#1,2,1}\%6 = a_{\#2,2,1}\%6 = a_{\#3,2,1}\%6 = a_{\#4,2,1}\%6 = a_{\#5,2,1}\%6 = v_{p=2}(v_{p=2}\text{: fixed-value})$$

$$a_{\#0,3,1}\%6 = a_{\#1,3,1}\%6 = a_{\#2,3,1}\%6 = a_{\#3,3,1}\%6 = a_{\#4,3,1}\%6 = a_{\#5,3,1}\%6 = v_{p=3}(v_{p=3}\text{: fixed-value})$$

$$a_{\#0,4,1}\%6 = a_{\#1,4,1}\%6 = a_{\#2,4,1}\%6 = a_{\#3,4,1}\%6 = a_{\#4,4,1}\%6 = a_{\#5,4,1}\%6 = v_{p=4}(v_{p=4}\text{: fixed-value})$$

$$\vdots$$

$$a_{\#0,k,1}\%6 = a_{\#1,k,1}\%6 = a_{\#2,k,1}\%6 = a_{\#3,k,1}\%6 = a_{\#4,k,1}\%6 = a_{\#5,k,1}\%6 = v_{p=k}(v_{p=k}\text{: fixed-value})(\text{therefore, } k = 1, 2, \ldots, n-1)$$

$$\vdots$$

$$a_{\#0,n-2,1}\%6 = a_{\#1,n-2,1}\%6 = a_{\#2,n-2,1}\%6 = a_{\#3,n-2,1}\%6 = a_{\#4,n-2,1}\%6 = a_{\#5,n-2,1}\%6 = v_{p=n-2}(v_{p=n-2}\text{: fixed-value})$$

$$a_{\#0,n-1,1}\%6 = a_{\#1,n-1,1}\%6 = a_{\#2,n-1,1}\%6 = a_{\#3,n-1,1}\%6 = a_{\#4,n-1,1}\%6 = a_{\#5,n-1,1}\%6 = v_{p=n-1}(v_{p=n-1}\text{: fixed-value})$$

and $$b_{\#0,1}\%6 = b_{\#1,1}\%6 = b_{\#2,1}\%6 = b_{\#3,1}\%6 = b_{\#4,1}\%6 = b_{\#5,1}\%6 = w(w\text{: fixed-value})$$

<Condition #1-2>

$$a_{\#0,1,2}\%6 = a_{\#1,1,2}\%6 = a_{\#2,1,2}\%6 = a_{\#3,1,2}\%6 = a_{\#4,1,2}\%6 = a_{\#5,1,2}\%6 = y_{p=1}(y_{p=1}\text{: fixed-value})$$

-continued $$a_{\#0,2,2}\%6 = a_{\#1,2,2}\%6 = a_{\#2,2,2}\%6 = a_{\#3,2,2}\%6 = a_{\#4,2,2}\%6 = a_{\#5,2,2}\%6 = y_{p=2}(y_{p=2}\text{: fixed-value})$$

$$a_{\#0,3,2}\%6 = a_{\#1,3,2}\%6 = a_{\#2,3,2}\%6 = a_{\#3,3,2}\%6 = a_{\#4,3,2}\%6 = a_{\#5,3,2}\%6 = y_{p=3}(y_{p=3}\text{: fixed-value})$$

$$a_{\#0,4,2}\%6 = a_{\#1,4,2}\%6 = a_{\#2,4,2}\%6 = a_{\#3,4,2}\%6 = a_{\#4,4,2}\%6 = a_{\#5,4,2}\%6 = y_{p=4}(y_{p=4}\text{: fixed-value})$$

$$\vdots$$

$$a_{\#0,k,2}\%6 = a_{\#1,k,2}\%6 = a_{\#2,k,2}\%6 = a_{\#3,k,2}\%6 = a_{\#4,k,2}\%6 = a_{\#5,k,2}\%6 = y_{p=k}(y_{p=k}\text{: fixed-value})(\text{therefore, } k = 1, 2, \ldots, n-1)$$

$$\vdots$$

$$a_{\#0,n-2,2}\%6 = a_{\#1,n-2,2}\%6 = a_{\#2,n-2,2}\%6 = a_{\#3,n-2,2}\%6 = a_{\#4,n-2,2}\%6 = a_{\#5,n-2,2}\%6 = y_{p=n-2}(y_{p=n-2}\text{: fixed-value})$$

$$a_{\#0,n-1,2}\%6 = a_{\#1,n-1,2}\%6 = a_{\#2,n-1,2}\%6 = a_{\#3,n-1,2}\%6 = a_{\#4,n-1,2}\%6 = a_{\#5,n-1,2}\%6 = y_{p=n-1}(y_{p=n-1}\text{: fixed-value})$$

and $$b_{\#0,2}\%6 = b_{\#1,2}\%6 = b_{\#2,2}\%6 = b_{\#3,2}\%6 = b_{\#4,2}\%6 = b_{\#5,2}\%6 = z(z\text{: fixed-value})$$

By designating Condition #1-1 and Condition #1-2 as constraint conditions, the LDPC-CC that satisfies the constraint conditions becomes a regular LDPC code, and can thereby achieve high error correction capability.

Next, other important constraint conditions are described.

<Conditions #2-1>

In Condition #1-1, $v_{p=1}, v_{p=2}, v_{p=3}, v_{p=4}, \ldots, v_{p=k}, \ldots, v_{p=n-2}, v_{p=n-1}$, and w are set to one, four, and five. That is, $v_{p=k}$ (k=1, 2, . . . , n−1) and w are set to one and natural numbers other than divisors of a time-varying period of six.

<Condition #2-2>

In Condition #1-2, $y_{p=1}, y_{p=2}, y_{p=3}, y_{p=4}, \ldots, y_{p=k}, \ldots, y_{p=n-2}, y_{p=n-1}$, and z are set to one, four, and five. That is, $y_{p=k}$ (k=1, 2, . . . , n−1) and z are set to one and natural numbers other than divisors of a time-varying period of six By adding the constraint conditions of Condition #2-1 and Condition #2-2 or the constraint conditions of Condition #2-1 or Condition #2-2, it is possible to use time-varying periods effectively. This point is described in detail with reference to the accompanying drawings.

For simplicity of explanation, a case is considered where $X_1(D)$ in parity check polynomials 6-0 to 6-5 of an LDPC-CC having a time-varying period of six and a coding rate of (n−1)/n based on parity check polynomials has two terms. At this time, the parity check polynomials are represented as shown in expression 8-0 through expression 8-5.

[Math. 8]

$$(D^{a\#0,1,1}+1)X_1(D)+(D^{a\#0,2,1}+D^{a\#0,2,2}+1)X_2(D)+\ldots+(D^{a\#0,n-1,1}+D^{a\#0,n-1,2}+1)X_{n-1}(D)+(D^{b\#0,1}+D^{b\#0,2}+1)P(D)=0 \quad (8\text{-}0)$$

$$(D^{a\#1,1,1}+1)X_1(D)+(D^{a\#1,2,1}+D^{a\#1,2,2}+1)X_2(D)+\ldots+(D^{a\#1,n-1,1}+D^{a\#1,n-1,2}+1)X_{n-1}(D)+(D^{b\#1,1}+D^{b\#1,2}+1)P(D)=0 \quad (8\text{-}1)$$

$$(D^{a\#2,1,1}+1)X_1(D)+(D^{a\#2,2,1}+D^{a\#2,2,2}+1)X_2(D)+\ldots+(D^{a\#2,n-1,1}+D^{a\#2,n-1,2}+1)X_{n-1}(D)+(D^{b\#2,1}+D^{b\#2,2}+1)P(D)=0 \quad (8\text{-}2)$$

$$(D^{a\#3,1,1}+1)X_1+(D)+(D^{a\#3,2,1}+D^{a\#3,2,2}+1)X_2(D)+\ldots+(D^{a\#3,n-1,1}+D^{a\#3,n-1,2}+1)X_{n-1}(D)+(D^{b\#3,1}+D^{b\#3,2}+1)P(D)=0 \quad (8\text{-}3)$$

$$(D^{a\#4,1,1}+1)X_1+(D)+(D^{a\#4,2,1}+D^{a\#4,2,2}+1)X_2(D)+\ldots+(D^{a\#4,n-1,1}+D^{a\#4,n-1,2}+1)X_{n-1}(D)+(D^{b\#4,1}+D^{b\#4,2}+1)P(D)=0 \quad (8\text{-}4)$$

$$(D^{a\#5,1,1}+1)X_1+(D)+(D^{a\#5,2,1}+D^{a\#5,2,2}+1)X_2(D)+\ldots+(D^{a\#5,n-1,1}+D^{a\#5,n-1,2}+1)X_{n-1}(D)+(D^{b\#5,1}+D^{b\#5,2}+1)P(D)=0 \quad (8\text{-}5)$$

Here, a case is considered where $v_{p=k}$ (k=1, 2, . . . , n−1) and w are set to three. Three is a divisor of a time-varying period of six.

Figure 5:
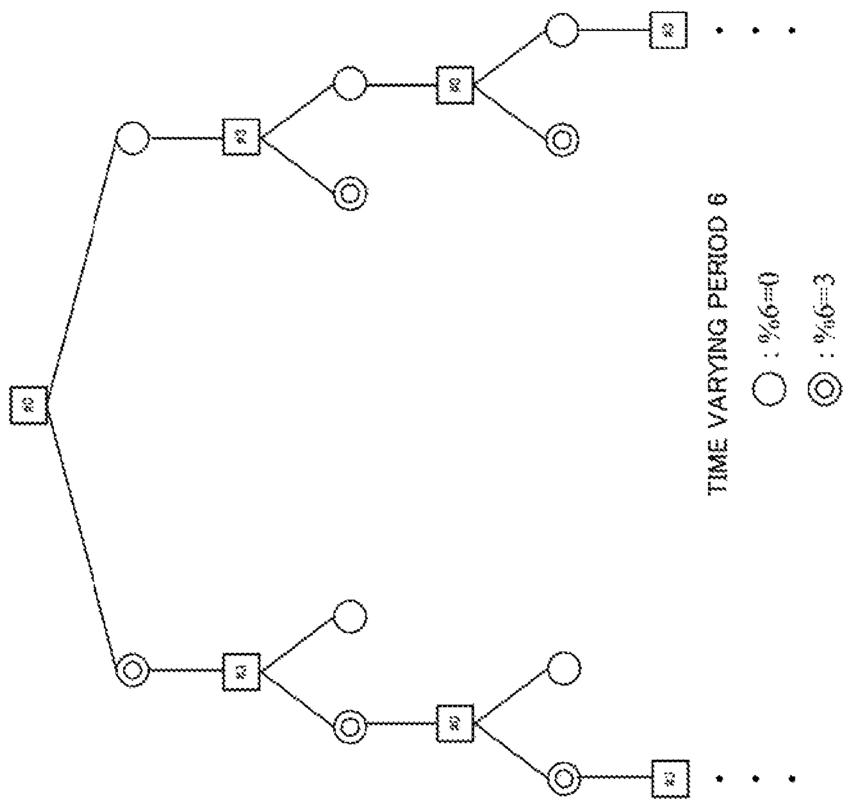
FIG. 5 shows an example of an LDPC-CC tree having a time-varying period of six.

FIG. 5 shows a tree of check nodes and variable nodes when only information $X_1$ is focused upon when it is assumed that $v_{v1}$ and w are set to three and ($a_{\#0,1,1}\%6=a_{\#1,1,1}\%6=a_{\#2,1,1}\%6=a_{\#3,1,1}\%6=a_{\#4,1,1}\%6=a_{\#5,1,1}\%6=3$).

The parity check polynomial of expression 8-q is termed check equation #q. In FIG. 5, a tree is drawn from check equation #0. In FIG. 5, the symbols ○ (single circle) and ◎ (double circle) represent variable nodes, and the symbol □ (square) represents a check node. The symbol ○ (single circle) represents a variable node relating to $X_1(D)$ and the symbol ◎ (double circle) represents a variable node relating to $D^{a\#q,1,1}X_1(D)$. Furthermore, the symbol □ (square) described as #Y (Y=0, 1, 2, 3, 4, 5) means a check node corresponding to a parity check polynomial of expression 8-Y.

In FIG. 5, values that do not satisfy Condition #2-1, that is, $v_{p=1}$, $v_{p=2}$, $v_{p=3}$, $v_{p=4}$, . . . , $v_{p=k}$, . . . , $v_{p=n-2}$, $v_{p=n-1}$ (k=1, 2, . . . , n−1) and w are set to a divisor other than one among divisors of time-varying period of six (w=3).

In this case, as shown in FIG. 5, #Y only have limited values such as zero or three at check nodes. That is, even if the time-varying period is increased, belief is propagated only from a specific parity check polynomial, which means that the effect of having increased the time-varying period is not achieved.

In other words, the condition for #Y to have only limited values is to set $v_{p=1}$, $v_{p=2}$, $v_{p=3}$, $v_{p=4}$, . . . , $v_{p=k}$, . . . , $v_{p=n-2}$, $v_{p=n-1}$ (k=1, 2, . . . , n−1) and w to a divisor other than one among divisors of a time-varying period of six.

Figure 6:
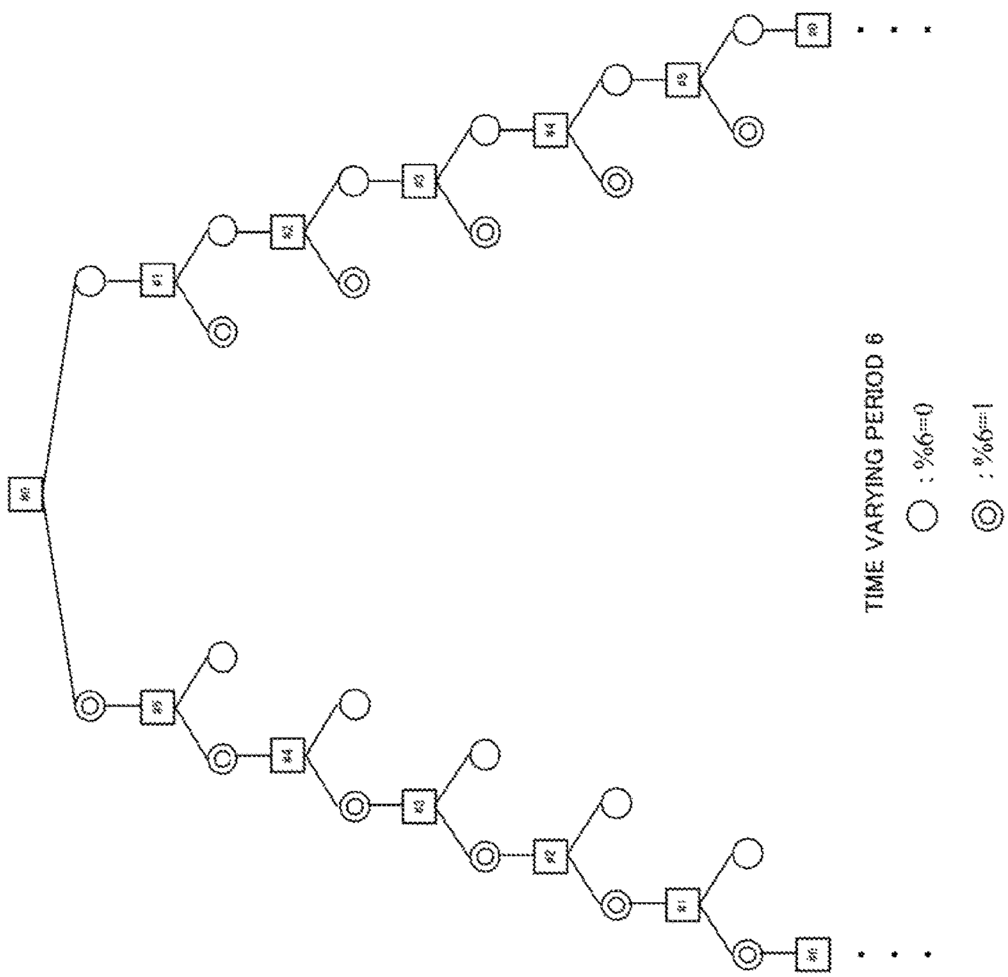
FIG. 6 shows an example of an LDPC-CC tree having a time-varying period of six.

By contrast, FIG. 6 shows a tree when $v_{p=k}$ (k=1, 2, . . . , n−1) and w are set to one in the parity check polynomial. When $v_{p=k}$ (k=1, 2, . . . , n−1) and w are set to one, the condition of Condition #2-1 is satisfied.

As shown in FIG. 6, when the condition of Condition #2-1 is satisfied, #Y takes all values from zero to five at check nodes. That is, when the condition of Condition #2-1 is satisfied, belief is propagated by all parity check polynomials corresponding to the values of #Y. As a result, even when the time-varying period is increased, belief is propagated from a wide range and the effect of having increased the time-varying period can be achieved. That is, it is clear that Condition #2-1 is an important condition to achieve the effect of having increased the time-varying period. Similarly, Condition #2-2 becomes an important condition to achieve the effect of having increased the time-varying period.

[Time-Varying Period of Seven]

When the above is taken into consideration, the time-varying period being a prime number is an important condition to achieve the effect of having increased the time-varying period.

Consider expression 9-0 through 9-6 as parity check polynomials (that satisfy 0) of an LDPC-CC having a coding rate of (n−1)/n (n is an integer no smaller than two) and a time-varying period of seven.

[Math. 9]

$$(D^{a\#0,1,1}+D^{a\#0,1,2}+1)X_1+(D)+(D^{a\#0,2,1}+D^{a\#0,2,2}+1)X_2(D)+\ldots+(D^{a\#0,n-1,1}+D^{a\#0,n-1,2}+1)X_{n-1}(D)+(D^{b\#0,1}+D^{b\#0,2}+1)P(D)=0 \quad (9\text{-}0)$$

$$(D^{a\#1,1,1}+D^{a\#1,1,2}+1)X_1+(D)+(D^{a\#1,2,1}+D^{a\#1,2,2}+1)X_2(D)+\ldots+(D^{a\#1,n-1,1}+D^{a\#1,n-1,2}+1)X_{n-1}(D)+(D^{b\#1,1}+D^{b\#1,2}+1)P(D)=0 \quad (9\text{-}1)$$

$$(D^{a\#2,1,1}+D^{a\#2,1,2}+1)X_1+(D)+(D^{a\#2,2,1}+D^{a\#2,2,2}+1)X_2(D)+\ldots+(D^{a\#2,n-1,1}+D^{a\#2,n-1,2}+1)X_{n-1}(D)+(D^{b\#2,1}+D^{b\#2,2}+1)P(D)=0 \quad (9\text{-}2)$$

$$(D^{a\#3,1,1}+D^{a\#3,1,2}+1)X_1+(D)+(D^{a\#3,2,1}+D^{a\#3,2,2}+1)X_2(D)+\ldots+(D^{a\#3,n-1,1}+D^{a\#3,n-1,2}+1)X_{n-1}(D)+(D^{b\#3,1}+D^{b\#3,2}+1)P(D)=0 \quad (9\text{-}3)$$

$$(D^{a\#4,1,1}+D^{a\#4,1,2}+1)X_1+(D)+(D^{a\#4,2,1}+D^{a\#4,2,2}+1)X_2(D)+\ldots+(D^{a\#4,n-1,1}+D^{a\#4,n-1,2}+1)X_{n-1}(D)+(D^{b\#4,1}+D^{b\#4,2}+1)P(D)=0 \quad (9\text{-}4)$$

$$(D^{a\#5,1,1}+D^{a\#5,1,2}+1)X_1+(D)+(D^{a\#5,2,1}+D^{a\#5,2,2}+1)X_2(D)+\ldots+(D^{a\#5,n-1,1}+D^{a\#5,n-1,2}+1)X_{n-1}(D)+(D^{b\#5,1}+D^{b\#5,2}+1)P(D)=0 \quad (9\text{-}5)$$

$$(D^{a\#6,1,1}+D^{a\#6,1,2}+1)X_1+(D)+(D^{a\#6,2,1}+D^{a\#6,2,2}+1)X_2(D)+\ldots+(D^{a\#6,n-1,1}+D^{a\#6,n-1,2}+1)X_{n-1}(D)+(D^{b\#6,1}+D^{b\#6,2}+1)P(D)=0 \quad (9\text{-}6)$$

In expression 9-q, it is assumed that $a_{\#q,p,1}$ and $a_{\#q,p,2}$ are natural numbers no smaller than one, and $a_{\#q,p,1}\neq a_{\#q,p,2}$ holds true. Furthermore, it is assumed that $b_{\#q,1}$ and $b_{\#q,2}$ are natural numbers no smaller than one, and $b_{\#q,1}\neq b_{\#q,2}$ holds true (q=0, 1, 2, 3, 4, 5, 6; p=1, 2, . . . , n−1).

In an LDPC-CC having a time-varying period of seven and a coding rate of (n−1)/n (where n is an integer no smaller than two), the parity bit and information bits at point in time i are represented by Pi and $X_{i,1}$, $X_{i,2}$, . . . , $X_{i,n-1}$ respectively. If i%7=k (where k=0, 1, 2, 3, 4, 5, 6) is assumed at this time, the parity check polynomial of expression 9-(k) holds true.

For example, if i=8, i%7=1 (k=1), expression 10 holds true.

[Math. 10]

$$(D^{a\#1,1,1}+D^{a\#1,1,2}+1)X_{8,1}+(D^{a\#1,2,1}+D^{a\#1,2,2}+1)X_{8,2}+\ldots+(D^{a\#1,n-1,1}+D^{a\#1,n-1,2}+1)X_{8,n-1}+(D^{b\#1,1}+D^{b\#1,2}+1)P_8=0 \quad (10)$$

Furthermore, when the sub-matrix (vector) of expression 9-g is assumed to be $H_g$, the parity check matrix can be created using the method described in [LDPC-CC based on parity check polynomial]. Here, the 0th sub-matrix, first sub-matrix, second sub-matrix, third sub-matrix, fourth sub-matrix, fifth sub-matrix and sixth sub-matrix are represented as shown in expression 11-0 through expression 11-6.

[Math. 11]

$$H_0=\left\{H'_0,\ \underbrace{1\ 1\ \ldots\ 1}_{n}\right\} \quad (11\text{-}0)$$

$$H_1=\left\{H'_1,\ \underbrace{1\ 1\ \ldots\ 1}_{n}\right\} \quad (11\text{-}1)$$

$$H_2=\left\{H'_2,\ \underbrace{1\ 1\ \ldots\ 1}_{n}\right\} \quad (11\text{-}2)$$

-continued $$H_3 = \left\{H'_3, \underbrace{1\ 1\ \ldots\ 1}_{n}\right\} \quad (11\text{-}3)$$

$$H_4 = \left\{H'_4, \underbrace{1\ 1\ \ldots\ 1}_{n}\right\} \quad (11\text{-}4)$$

$$H_5 = \left\{H'_5, \underbrace{1\ 1\ \ldots\ 1}_{n}\right\} \quad (11\text{-}5)$$

$$H_6 = \left\{H'_6, \underbrace{1\ 1\ \ldots\ 1}_{n}\right\} \quad (11\text{-}6)$$

In expression 11-0 through expression 11-6, n continuous ones correspond to the terms of $X_1(D)$, $X_2(D)$, . . . , $X_{n-1}(D)$, and P(D) in each of expression 9-0 through expression 9-6.

Figure 7:
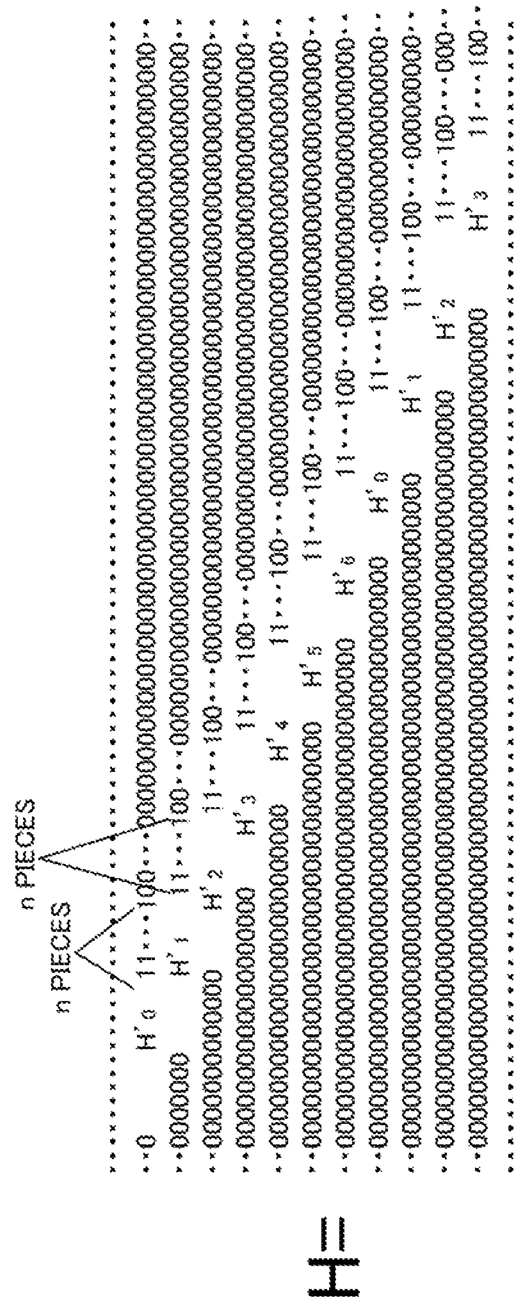
FIG. 7 shows an example of the configuration of LDPC-CC check matrix having a coding rate of (n−1)/n and a time-varying period of seven.

Here, parity check matrix H can be represented as shown in FIG. 7. As shown in FIG. 7, a configuration is employed in which a sub-matrix is shifted n columns to the right between an ith row and (i+1)th row in parity check matrix H (see FIG. 7). When transmission vector u is assumed to be $u=(X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, Hu=0 holds true. (Here, the zero in Hu=0 indicates that vector Hu is a column vector all elements of which are zeroes.) Here, the condition for the parity check polynomials in expression 9-0 through expression 9-6 to achieve high error correction capability is as follows as in the case of the time-varying period of six. In the following conditions, % means a modulo, and for example, α%7 represents a remainder after dividing α by seven.

<Condition #1-1'>

$$a_{\#0,1,1}\%7 = a_{\#1,1,1}\%7 = a_{\#2,1,1}\%7 = a_{\#3,1,1}\%7 = a_{\#4,1,1}\%7 = a_{\#5,1,1}\%7 = a_{\#6,1,1}\%7 = v_{p=1}(v_{p=1}\text{: fixed-value})$$

$$a_{\#0,2,1}\%7 = a_{\#1,2,1}\%7 = a_{\#2,2,1}\%7 = a_{\#3,2,1}\%7 = a_{\#4,2,1}\%7 = a_{\#5,2,1}\%7 = a_{\#6,2,1}\%7 = v_{p=2}(v_{p=2}\text{: fixed-value})$$

$$a_{\#0,3,1}\%7 = a_{\#1,3,1}\%7 = a_{\#2,3,1}\%7 = a_{\#3,3,1}\%7 = a_{\#4,3,1}\%7 = a_{\#5,3,1}\%7 = a_{\#6,3,1}\%7 = v_{p=3}(v_{p=3}\text{: fixed-value})$$

$$a_{\#0,4,1}\%7 = a_{\#1,4,1}\%7 = a_{\#2,4,1}\%7 = a_{\#3,4,1}\%7 = a_{\#4,4,1}\%7 = a_{\#5,4,1}\%7 = a_{\#6,4,1}\%7 = v_{p=4}(v_{p=4}\text{: fixed-value})$$

$$\vdots$$

$$a_{\#0,k,1}\%7 = a_{\#1,k,1}\%7 = a_{\#2,k,1}\%7 = a_{\#3,k,1}\%7 = a_{\#4,k,1}\%7 = a_{\#5,k,1}\%7 = a_{\#6,k,1}\%7 = v_{p=k}(v_{p=k}\text{: fixed-value})(\text{therefore, } k = 1, 2, \ldots, n-1)$$

$$\vdots$$

$$a_{\#0,n-2,1}\%7 = a_{\#1,n-2,1}\%7 = a_{\#2,n-2,1}\%7 = a_{\#3,n-2,1}\%7 = a_{\#4,n-2,1}\%7 = a_{\#5,n-2,1}\%7 = a_{\#6,n-2,1}\%7 = v_{p=n-2}(v_{p=n-2}\text{: fixed-value})$$

$$a_{\#0,n-1,1}\%7 = a_{\#1,n-1,1}\%7 = a_{\#2,n-1,1}\%7 = a_{\#3,n-1,1}\%7 = a_{\#4,n-1,1}\%7 = a_{\#5,n-1,1}\%7 = a_{\#6,n-1,1}\%7 = v_{p=n-1}(v_{p=n-1}\text{: fixed-value})$$

and $$b_{\#0,1}\%7 = b_{\#1,1}\%7 = b_{\#2,1}\%7 = b_{\#3,1}\%7 = b_{\#4,1}\%7 = b_{\#5,1}\%7 = b_{\#6,1}\%7 = w(w\text{: fixed-value})$$

<Condition #1-2'>

$$a_{\#0,1,2}\%7 = a_{\#1,1,2}\%7 = a_{\#2,1,2}\%7 = a_{\#3,1,2}\%7 = a_{\#4,1,2}\%7 = a_{\#5,1,2}\%7 = a_{\#6,1,2}\%7 = y_{p=1}(y_{p=1}\text{: fixed-value})$$

$$a_{\#0,2,2}\%7 = a_{\#1,2,2}\%7 = a_{\#2,2,2}\%7 = a_{\#3,2,2}\%7 = a_{\#4,2,2}\%7 = a_{\#5,2,2}\%7 = a_{\#6,2,2}\%7 = y_{p=2}(y_{p=2}\text{: fixed-value})$$

$$a_{\#0,3,2}\%7 = a_{\#1,3,2}\%7 = a_{\#2,3,2}\%7 = a_{\#3,3,2}\%7 = a_{\#4,3,2}\%7 = a_{\#5,3,2}\%7 = a_{\#6,3,2}\%7 = y_{p=3}(y_{p=3}\text{: fixed-value})$$

$$a_{\#0,4,2}\%7 = a_{\#1,4,2}\%7 = a_{\#2,4,2}\%7 = a_{\#3,4,2}\%7 = a_{\#4,4,2}\%7 = a_{\#5,4,2}\%7 = a_{\#6,4,2}\%7 = y_{p=4}(y_{p=4}\text{: fixed-value})$$

$$\vdots$$

$$a_{\#0,k,2}\%7 = a_{\#1,k,2}\%7 = a_{\#2,k,2}\%7 = a_{\#3,k,2}\%7 = a_{\#4,k,2}\%7 = a_{\#5,k,2}\%7 = a_{\#6,k,2}\%7 = y_{p=k}(y_{p=k}\text{: fixed-value})(\text{therefore, } k = 1, 2, \ldots, n-1)$$

$$\vdots$$

$$a_{\#0,n-2,2}\%7 = a_{\#1,n-2,2}\%7 = a_{\#2,n-2,2}\%7 = a_{\#3,n-2,2}\%7 = a_{\#4,n-2,2}\%6 = a_{\#5,n-2,2}\%7 = a_{\#6,n-2,2}\%7 = y_{p=n-2}(y_{p=n-2}\text{: fixed-value})$$

$$a_{\#0,n-1,2}\%7 = a_{\#1,n-1,2}\%7 = a_{\#2,n-1,2}\%7 = a_{\#3,n-1,2}\%7 = a_{\#4,n-1,2}\%7 = a_{\#5,n-1,2}\%7 = a_{\#6,n-1,2}\%7 = y_{p=n-1}(y_{p=n-1}\text{: fixed-value})$$

and $$b_{\#0,2}\%7 = b_{\#1,2}\%7 = b_{\#2,2}\%7 = b_{\#3,2}\%7 = b_{\#4,2}\%7 = b_{\#5,2}\%7 = b_{\#6,2}\%7 = z(z\text{: fixed-value})$$

By designating Condition #1-1' and Condition #1-2' constraint conditions, the LDPC-CC that satisfies the constraint conditions becomes a regular LDPC code, and can thereby achieve high error correction capability.

In the case of a time-varying period of six, achieving high error correction capability further requires Condition #2-1 and Condition #2-2, or Condition #2-1, or Condition #2-2. By contrast, when the time-varying period is a prime number as in the case of a time-varying period of seven, the condition corresponding to Condition #2-1 and Condition #2-2, or Condition #2-1, or Condition #2-2 required in the case of the time-varying period of six, is unnecessary.

That is to say, in Condition #1-1', values of $v_{p=1}$, $v_{p=2}$, $v_{p=3}$, $v_{p=4}$, . . . , $v_{p=k}$ . . . , $v_{p=n-2}$, $v_{p=n-1}$ (k=1, 2, . . . , n−1) and w may be one of values 0, 1, 2, 3, 4, 5 and 6.

Also, in Condition #1-2', values of $y_{p=1}$, $y_{p=2}$, $y_{p=3}$, $y_{p=4}$, . . . , $y_{p=k}$, . . . , $y_{p=n-2}$, $y_{p=n-1}$ (k=1, 2, . . . , n−1) and z may be one of values 0, 1, 2, 3, 4, 5, and 6.

The reason is described below.

For simplicity of explanation, a case is considered where $X_1(D)$ in parity check polynomials 9-0 to 9-6 of an LDPC-CC having a time-varying period of seven and a coding rate of (n−1)/n based on parity check polynomials has two terms. In this case, the parity check polynomials are represented as shown in expression 12-0 through expression 12-6.

[Math. 12]

$$(D^{a\#0,1,1}+1)X_1+(D)+(D^{a\#0,2,1}+D^{a\#0,2,2}+1)X_2(D)+ \ldots +(D^{a\#0,n-1,1}+D^{a\#0,n-1,2}+1)X_{n-1}(D)+(D^{b\#0,1}+D^{b\#0,2}+1)P(D)=0 \quad (12\text{-}0)$$

$$(D^{a\#1,1,1}+1)X_1+(D)+(D^{a\#1,2,1}+D^{a\#1,2,2}+1)X_2(D)+ \ldots +(D^{a\#1,n-1,1}+D^{a\#1,n-1,2}+1)X_{n-1}(D)+(D^{b\#1,1}+D^{b\#1,2}+1)P(D)=0 \quad (12\text{-}1)$$

$$(D^{a\#2,1,1}+1)X_1+(D)+(D^{a\#2,2,1}+D^{a\#2,2,2}+1)X_2(D)+\ldots+(D^{a\#2,n-1,1}+D^{a\#2,n-1,2}+1)X_{n-1}(D)+(D^{b\#2,1}+D^{b\#2,2}+1)P(D)=0 \quad (12\text{-}2)$$

$$(D^{a\#3,1,1}+1)X_1+(D)+(D^{a\#3,2,1}+D^{a\#3,2,2}+1)X_2(D)+\ldots+(D^{a\#3,n-1,1}+D^{a\#3,n-1,2}+1)X_{n-1}(D)+(D^{b\#3,1}+D^{b\#3,2}+1)P(D)=0 \quad (12\text{-}3)$$

$$(D^{a\#4,1,1}+1)X_1+(D)+(D^{a\#4,2,1}+D^{a\#4,2,2}+1)X_2(D)+\ldots+(D^{a\#4,n-1,1}+D^{a\#4,n-1,2}+1)X_{n-1}(D)+(D^{b\#4,1}+D^{b\#4,2}+1)P(D)=0 \quad (12\text{-}4)$$

$$(D^{a\#5,1,1}+1)X_1+(D)+(D^{a\#5,2,1}+D^{a\#5,2,2}+1)X_2(D)+\ldots+(D^{a\#5,n-1,1}+D^{a\#5,n-1,2}+1)X_{n-1}(D)+(D^{b\#5,1}+D^{b\#5,2}+1)P(D)=0 \quad (12\text{-}5)$$

$$(D^{a\#6,1,1}+1)X_1+(D)+(D^{a\#6,2,1}+D^{a\#6,2,2}+1)X_2(D)+\ldots+(D^{a\#6,n-1,1}+D^{a\#6,n-1,2}+1)X_{n-1}(D)+(D^{b\#6,1}+D^{b\#6,2}+1)P(D)=0 \quad (12\text{-}6)$$

Here, a case is considered where $v_{p=k}$ (k=1, 2, . . . , n−1) and w are set to two.

Figure 8:
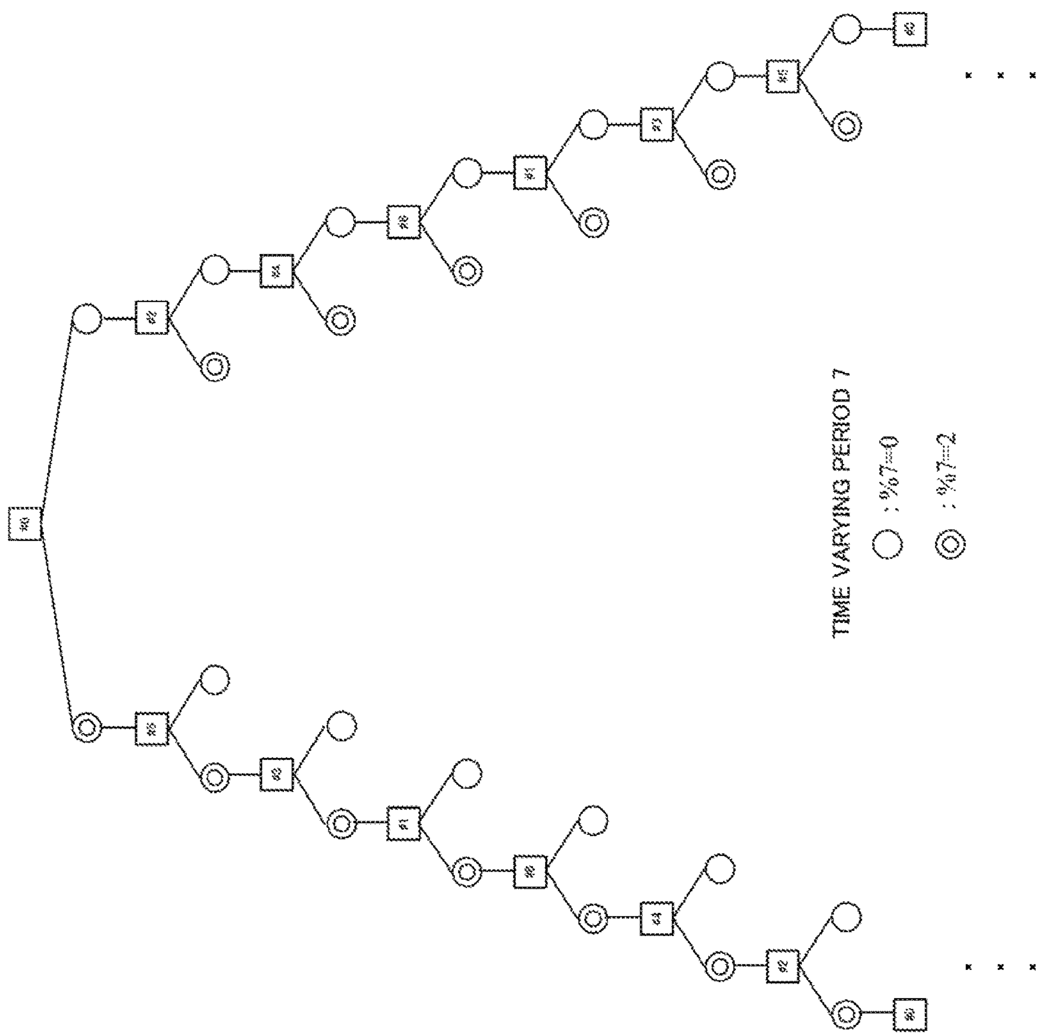
FIG. 8 shows an example of an LDPC-CC tree having a time-varying period of seven.

FIG. 8 shows a tree of check nodes and variable nodes when only information $X_1$ is focused upon when $v_{p=1}$ and w are set to two and $a\#_{0,1,1}\%7=a\#_{1,1,1}\%7=a\#_{2,1,1}\%7=a\#_{3,1,1}\%7=a\#_{4,1,1}\%7=a\#_{5,1,1}\%7=a\#_{6,1,1}\%7=2$.

The parity check polynomial of expression 12-q is termed check equation #q. In FIG. 8, a tree is drawn from check equation #0. In FIG. 8, the symbols ○ (single circle) and ◎ (double circle) represent variable nodes, and the symbol □ (square) represents a check node. The symbol ○ (single circle) represents a variable node relating to $X_1(D)$ and the symbol ◎ (double circle) represents a variable node relating to $D^{a\#q,1,1}X_1(D)$ Furthermore, the symbol □ (square) described as #Y (Y=0, 1, 2, 3, 4, 5, 6) means a check node corresponding to a parity check polynomial of expression 12-Y.

In the case of a time-varying period of six, for example, as shown in FIG. 5, there may be cases where #Y only has a limited value and check nodes are only connected to limited parity check polynomials. By contrast, when the time-varying period is seven (a prime number) such as a time-varying period of seven, as shown in FIG. 8, #Y have all values from zero to six and check nodes are connected to all parity check polynomials. Thus, belief is propagated by all parity check polynomials corresponding to the values of #Y. As a result, even when the time-varying period is increased, belief is propagated from a wide range and it is possible to achieve the effect of having increased the time-varying period. Although FIG. 8 shows the tree when $a_{\#q,1,1}\%7$ (q=0, 1, 2, 3, 4, 5, 6) is set to two, check nodes can be connected to all the applicable parity check polynomials if $a_{\#q,1,1}\%7$ is set to any value other than zero.

Thus, it is clear that if the time-varying period is set to a prime number in this way, constraint conditions relating to parameter settings for achieving high error correction capability are drastically relaxed compared to a case where the time-varying period is not a prime number. When the constraint conditions are relaxed, adding another constraint condition enables higher error correction capability to be achieved. Such a code configuration method is described below.

[Time-Varying Period of q (q is a Prime Number Greater than Three): Expression 13]

First, a case will be considered where a gth (g=0, 1, . . . , q−1) parity check polynomial of a coding rate of (n−1)/n and a time-varying period of q (q is a prime number greater than three) is represented as shown in expression 13.

[Math. 13]

$$(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D)+(D^{b\#g,1}+D^{b\#g,2}+1)P(D)=0 \quad (13)$$

In expression 13, it is also assumed that $a_{\#g,p,1}$ and $a_{\#g,p,2}$ are natural numbers no smaller than one and that $a_{\#g,p,1}\neq a_{\#g,p,2}$ holds true. Furthermore, it is also assumed that $b_{\#g,1}$ and $b_{\#g,2}$ are natural numbers no smaller than one and that $b_{\#g,1}\neq b_{\#g,2}$ holds true (g=0, 1, 2, . . . , q−2, q−1; p=1, 2, . . . , n−1).

In the same way as the above description, Condition #3-1 and Condition #3-2 described below are one of important requirements for an LDPC-CC to achieve high error correction capability. In the following conditions, % means a modulo, and for example, a % q represents a remainder after dividing α by q.

<Condition #3-1>

$$a_{\#0,1,1}\%q=a_{\#1,1,1}\%q=a_{\#2,1,1}\%q=a_{\#3,1,1}\%q=\ldots=a_{\#g,1,1}\%q=\ldots=a_{\#q-2,1,1}\%q=a_{\#q-1,1,1}\%q=v_{p=1}\ (v_{p=1}\text{: fixed-value})$$

$$a_{\#0,2,1}\%q=a_{\#1,2,1}\%q=a_{\#2,2,1}\%q=a_{\#3,2,1}\%q=\ldots=a_{\#g,2,1}\%q=\ldots=a_{\#q-2,2,1}\%q=a_{\#q-1,2,1}\%q=v_{p=2}\ (v_{p=2}\text{: fixed-value})$$

$$a_{\#0,3,1}\%q=a_{\#1,3,1}\%q=a_{\#2,3,1}\%q=a_{\#3,3,1}\%q=\ldots=a_{\#g,3,1}\%q=\ldots=a_{\#q-2,3,1}\%q=a_{\#q-1,3,1}\%q=v_{p=3}\ (v_{p=3}\text{: fixed-value})$$

$$a_{\#0,4,1}\%q=a_{\#1,4,1}\%q=a_{\#2,4,1}\%q=a_{\#3,4,1}\%q=\ldots=a_{\#g,4,1}\%q=\ldots=a_{\#q-2,4,1}\%q=a_{\#q-1,4,1}\%q=v_{p=4}\ (v_{p=4}\text{: fixed-value})$$

$$\vdots$$

$$a_{\#0,k,1}\%q=a_{\#1,k,1}\%q=a_{\#2,k,1}\%q=a_{\#3,k,1}\%q=\ldots=a_{\#g,k,1}\%q=\ldots=a_{\#q-2,k,1}\%q=a_{\#q-1,k,1}\%q=v_{p=k}\ (v_{p=k}\text{: fixed-value})(\text{therefore, } k=1,2,\ldots,n-1)$$

$$\vdots$$

$$a_{\#0,n-2,1}\%q=a_{\#1,n-2,1}\%q=a_{\#2,n-2,1}\%q=a_{\#3,n-2,1}\%q=\ldots=a_{\#g,n-2,1}\%q=\ldots=a_{\#q-2,n-2,1}\%q=a_{\#q-1,n-2,1}\%q=v_{p=n-2}\ (v_{p=n-2}\text{: fixed-value})$$

$$a_{\#0,n-1,1}\%q=a_{\#1,n-1,1}\%q=a_{\#2,n-1,1}\%q=a_{\#3,n-1,1}\%q=\ldots=a_{\#g,n-1,1}\%q=\ldots=a_{\#q-2,n-1,1}\%q=a_{\#q-1,n-1,1}\%q=v_{p=n-1}\ (v_{p=n-1}\text{: fixed-value})$$

and $$b_{\#0,1}\%q=b_{\#1,1}\%q=b_{\#2,1}\%q=b_{\#3,1}\%q=\ldots=b_{\#g,1}q\%=\ldots=b_{\#q-2,1}\%q=b_{\#q-1,1}q\%=w\ (w\text{: fixed-value})$$

<Condition #3-2>

$$a_{\#0,1,2}\%q=a_{\#1,1,2}\%q=a_{\#2,1,2}\%q=a_{\#3,1,2}\%q=\ldots=a_{\#g,1,2}\%q=\ldots=a_{\#q-2,1,2}\%q=a_{\#q-1,1,2}\%q=y_{p=2}\ (y_{p=2}\text{: fixed-value})$$

$$a_{\#0,2,2}\%q=a_{\#1,2,2}\%q=a_{\#2,2,2}\%q=a_{\#3,2,2}\%q=\ldots=a_{\#g,2,2}\%q=\ldots=a_{\#q-2,2,2}\%q=a_{\#q-1,2,2}\%q=y_{p=2}\ (y_{p=2}\text{: fixed-value})$$

$$a_{\#0,3,2}\%q=a_{\#1,3,2}\%q=a_{\#2,3,2}\%q=a_{\#3,3,2}\%q=\ldots=a_{\#g,3,2}\%q=\ldots=a_{\#q-2,3,2}\%q=a_{\#q-1,3,2}\%q=y_{p=3}\ (y_{p=3}\text{: fixed-value})$$

-continued $$a_{\#0,4,2}\%q = a_{\#1,4,2}\%q = a_{\#2,4,2}\%q = a_{\#3,4,2}\%q = \ldots = a_{\#g,4,2}\%q = \ldots = a_{\#q-2,4,2}\%q = a_{\#q-1,4,2}\%q = y_{p=4}\ (y_{p=4}\text{: fixed-value})$$

$$\vdots$$

$$a_{\#0,k,2}\%q = a_{\#1,k,2}\%q = a_{\#2,k,2}\%q = a_{\#3,k,2}\%q = \ldots = a_{\#g,k,2}\%q = \ldots = a_{\#q-2,k,2}\%q = a_{\#q-1,k,2}\%q = y_{p=k}\ (y_{p=k}\text{: fixed-value})(\text{therefore, } k = 1, 2, \ldots, n-1)$$

$$\vdots$$

$$a_{\#0,n-2,2}\%q = a_{\#1,n-2,2}\%q = a_{\#2,n-2,2}\%q = a_{\#3,n-2,2}\%q = \ldots = a_{\#g,n-2,2}\%q = \ldots = a_{\#q-2,n-2,2}\%q = a_{\#q-1,n-2,2}\%q = y_{p=n-2}\ (y_{p=n-2}\text{: fixed-value})$$

$$a_{\#0,n-1,2}\%q = a_{\#1,n-1,2}\%q = a_{\#2,n-1,2}\%q = a_{\#3,n-1,2}\%q = \ldots = a_{\#g,n-1,2}\%q = \ldots = a_{\#q-2,n-1,2}\%q = a_{\#q-1,n-1,2}\%q = y_{p=n-1}\ (y_{p=n-1}\text{: fixed-value})$$

and $$b_{\#0,2}\%q = b_{\#1,2}\%q = b_{\#2,2}\%q = b_{\#3,2}\%q = \ldots = b_{\#g,2}q\% = \ldots = b_{\#q-2,2}\%q = b_{\#q-1,2}q\% = z\ (z\text{: fixed-value})$$

In addition, when Condition #4-1 or Condition #4-2 holds true for a set of $(v_{p=1}, y_{p=1})$, $(v_{p=2}, y_{p=2})$, $(v_{p=3}, y_{p=3})$, . . . $(v_{p=k}, y_{p=k})$, . . . $(v_{p=n-2}, y_{p=n-2})$, $(v_{p=n-1}, y_{p=n-1})$, and (w, z), high error correction capability can be achieved. Here, k=1, 2, . . . , n−1.

<Condition #4-1>

Consider $(v_{p=i}, y_{p=i})$ and $(v_{p=j}, y_{p=j})$, where it is assumed that i=1, 2, . . . , n−1, j=1, 2, . . . , n−1, and i≠j. At this time, i and j (i≠j) are present where $(v_{p=i}, y_{p=i}) \neq (v_{p=j}, y_{p=j})$ and $(v_{p=i}, y_{p=i}) \neq (y_{p=j}, v_{p=j})$ hold true.

<Condition #4-2>

Consider $(v_{p=i}, y_{p=i})$ and (w, z), where it is assumed that i=1, 2, . . . , n−1. At this time, i is present where $(v_{p=i}, y_{p=i}) \neq (w, z)$ and $(v_{p=i}, y_{p=i}) \neq (z, w)$ hold true.

By making more severe the constraint conditions of Condition #4-1 and Condition #4-2, it is more likely to be able to generate an LDPC-CC of a time-varying period of q (q is a prime number no smaller than three) with higher error correction capability. The condition is that Condition #5-1 and Condition #5-2, or Condition #5-1, or Condition #5-2 should hold true.

<Condition #5-1>

Consider $(v_{p=i}, y_{p=i})$ and $(v_{p=j}, y_{p=j})$, where i=1, 2, . . . , n−1, j=1, 2, . . . , n−1, and i≠j. At this time, $(v_{p=i}, y_{p=i}) \neq (v_{p=j}, y_{p=j})$ and $(v_{p=i}, y_{p=i}) \neq (y_{p=j}, v_{p=j})$ hold true for all i and j (i≠j).

<Condition #5-2>

Consider $(v_{p=i}, y_{p=i})$ and (w, z), where i=1, 2, . . . , n−1. Here, $(v_{p=i}, y_{p=i}) \neq (w, z)$ and $(v_{p=i}, y_{p=i}) \neq (z, w)$ hold true for all i.

Furthermore, when $v_{p=i} \neq y_{p=i}$ (i=1, 2, . . . , n−1) and w≠z hold true, it is possible to suppress the occurrence of short loops in a Tanner graph.

In addition, when 2n<q, if $(v_{p=i}, y_{p=i})$ and (z, w) have different values, it is more likely to be able to generate an LDPC-CC of a time-varying period of q (q is a prime number greater than three) with higher error correction capability.

Furthermore, when 2n≥q, if $(v_{p=i}, y_{p=i})$ and (z, w) are set so that all values of 0, 1, 2, . . . , q−1 are present, it is more likely to be able to generate an LDPC-CC having a time-varying period of q (q is a prime number greater than three) with higher error correction capability.

In the above description, expression 13 having three terms in $X_1(D)$, $X_2(D)$, . . . , $X_{n-1}(D)$ and P(D) has been handled as the gth parity check polynomial of an LDPC-CC having a time-varying period of q (q is a prime number greater than three). In expression 13, it is also likely to be able to achieve high error correction capability when the number of terms of any of $X_1(D)$, $X_2(D)$, . . . , $X_{n-1}(D)$ and P(D) is one or two. For example, the following method is available as the method of setting the number of terms of $X_1(D)$ to one or two. In the case of a time-varying period of q, there are q parity check polynomials that satisfy zero and the number of terms of $X_1(D)$ is set to one or two for all the q parity check polynomials that satisfy zero. Alternatively, instead of setting the number of terms of $X_1(D)$ to one or two for all the q parity check polynomials that satisfy zero, the number of terms of $X_1(D)$ may be set to one or two for any number (equal to or less than q−1) of parity check polynomials that satisfy zero. The same applies to $X_2(D)$, . . . , $X_{n-1}(D)$ and P(D). In this case, satisfying the above-described condition constitutes an important condition in achieving high error correction capability. However, the condition relating to the deleted terms is unnecessary.

Furthermore, high error correction capability may also be likely to be achieved even when the number of terms of any of $X_1(D)$, $X_2(D)$, . . . , $X_{n-1}(D)$ and P(D) is four or more. For example, the following method is available as the method of setting the number of terms of $X_1(D)$ to four or more. In the case of a time-varying period of q, there are q parity check polynomials that satisfy zero and the number of terms of $X_1(D)$ is set to four or more for all the q parity check polynomials that satisfy zero. Alternatively, instead of setting the number of terms of X1(D) to four or more for all the q parity check polynomials that satisfy zero, the number of terms of $X_1(D)$ may be set to four or more for any number (equal to or less than q−1) of parity check polynomials that satisfy zero. The same applies to $X_2(D)$, . . . , $X_{n-1}(D)$ and P(D). Here, the above-described condition is excluded for the added terms.

[Time-Varying Period of h (h is a Non-Prime Integer Greater than Three): Expression 14]

Next, a code configuration method when time-varying period h is a non-prime integer greater than three will be considered.

First, a case will be considered where the gth (g=0, 1, . . . , h−1) parity check polynomial of a coding rate of (n−1)/n and a time-varying period of h (h is a non-prime integer greater than three) is represented as shown in expression 14.

[Math. 14]

$$(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D)+(D^{b\#g,1}+D^{b\#g,2}+1)P(D)=0 \quad (14)$$

In expression 14, it is assumed that $a_{\#g,p,1}$ and $a_{\#g,p,2}$ are natural numbers no smaller than one and $a_{\#g,p,1} \neq a_{\#g,p,2}$ holds true. Furthermore, it is assumed that $b_{\#g,1}$ and $b_{\#g,2}$ are natural numbers no smaller than one and $b_{\#g,1} \neq b_{\#g,2}$ holds true (g=0, 1, 2, . . . , h−2, h−1; p=1, 2, . . . , n−1).

In the same way as the above description, Condition #6-1 and Condition #6-2 described below are one of important requirements for an LDPC-CC to achieve high error correction capability. In the following conditions, % means a modulo, and for example, α%h represents a remainder after dividing α by h.

<Condition #6-1>

$$a_{\#0,1,1}\%h = a_{\#1,1,1}\%h = a_{\#2,1,1}\%h = a_{\#3,1,1}\%h = \ldots = a_{\#g,1,1}\%h = \ldots = a_{\#h-2,1,1}\%h = a_{\#h-1,1,1}\%h = v_{p=1}\ (v_{p=1}\text{: fixed-value})$$

$$a_{\#0,2,1}\%h = a_{\#1,2,1}\%h = a_{\#2,2,1}\%h = a_{\#3,2,1}\%h = \ldots = a_{\#g,2,1}\%h = \ldots = a_{\#h-2,2,1}\%h = a_{\#h-1,2,1}\%h = v_{p=2}\ (v_{p=2}\text{: fixed-value})$$

$$a_{\#0,3,1}\%h = a_{\#1,3,1}\%h = a_{\#2,3,1}\%h = a_{\#3,3,1}\%h = \ldots = a_{\#g,3,1}\%h = \ldots = a_{\#h-2,3,1}\%h = a_{\#h-1,3,1}\%h = v_{p=3}\ (v_{p=3}\text{: fixed-value})$$

$$a_{\#0,4,1}\%h = a_{\#1,4,1}\%h = a_{\#2,4,1}\%h = a_{\#3,4,1}\%h = \ldots = a_{\#g,4,1}\%h = \ldots = a_{\#h-2,4,1}\%h = a_{\#h-1,4,1}\%h = v_{p=4}\ (v_{p=4}\text{: fixed-value})$$

$$\vdots$$

$$a_{\#0,k,1}\%h = a_{\#1,k,1}\%h = a_{\#2,k,1}\%h = a_{\#3,k,1}\%h = \ldots = a_{\#g,k,1}\%h = \ldots = a_{\#h-2,k,1}\%h = a_{\#h-1,k,1}\%h = v_{p=k}\ (v_{p=k}\text{: fixed-value}) \text{ (therefore, } k = 1, 2, \ldots, n-1)$$

$$\vdots$$

$$a_{\#0,n-2,1}\%h = a_{\#1,n-2,1}\%h = a_{\#2,n-2,1}\%h = a_{\#3,n-2,1}\%h = \ldots = a_{\#g,n-2,1}\%h = \ldots = a_{\#h-2,n-2,1}\%h = a_{\#h-1,n-2,1}\%h = v_{p=n-2}\ (v_{p=n-2}\text{: fixed-value})$$

$$a_{\#0,n-1,1}\%h = a_{\#1,n-1,1}\%h = a_{\#2,n-1,1}\%h = a_{\#3,n-1,1}\%h = \ldots = a_{\#g,n-1,1}\%h = \ldots = a_{\#h-2,n-1,1}\%h = a_{\#h-1,n-1,1}\%h = v_{p=n-1}\ (v_{p=n-1}\text{: fixed-value}) \text{ and}$$

$$b_{\#0,1}\%h = b_{\#1,1}\%h = b_{\#2,1}\%h = b_{\#3,1}\%h = \ldots = b_{\#g,1}\%h = \ldots = b_{\#h-2,1}\%h = b_{\#h-1,1}\%h = w\ (w\text{: fixed-value})$$

<Condition #6-2>

$$a_{\#0,1,2}\%h = a_{\#1,1,2}\%h = a_{\#2,1,2}\%h = a_{\#3,1,2}\%h = \ldots = a_{\#g,1,2}\%h = \ldots = a_{\#h-2,1,2}\%h = a_{\#h-1,1,2}\%h = y_{p=1}\ (y_{p=1}\text{: fixed-value})$$

$$a_{\#0,2,2}\%h = a_{\#1,2,2}\%h = a_{\#2,2,2}\%h = a_{\#3,2,2}\%h = \ldots = a_{\#g,2,2}\%h = \ldots = a_{\#h-2,2,2}\%h = a_{\#h-1,2,2}\%h = y_{p=2}\ (y_{p=2}\text{: fixed-value})$$

$$a_{\#0,3,2}\%h = a_{\#1,3,2}\%h = a_{\#2,3,2}\%h = a_{\#3,3,2}\%h = \ldots = a_{\#g,3,2}\%h = \ldots = a_{\#h-2,3,2}\%h = a_{\#h-1,3,2}\%h = y_{p=3}\ (y_{p=3}\text{: fixed-value})$$

$$a_{\#0,4,2}\%h = a_{\#1,4,2}\%h = a_{\#2,4,2}\%h = a_{\#3,4,2}\%h = \ldots = a_{\#g,4,2}\%h = \ldots = a_{\#h-2,4,2}\%h = a_{\#h-1,4,2}\%h = y_{p=4}\ (y_{p=4}\text{: fixed-value})$$

$$\vdots$$

$$a_{\#0,k,2}\%h = a_{\#1,k,2}\%h = a_{\#2,k,2}\%h = a_{\#3,k,2}\%h = \ldots = a_{\#g,k,2}\%h = \ldots = a_{\#h-2,k,2}\%h = a_{\#h-1,k,2}\%h = y_{p=k}\ (y_{p=k}\text{: fixed-value}) \text{ (therefore, } k = 1, 2, \ldots, n-1)$$

$$\vdots$$

$$a_{\#0,n-2,2}\%h = a_{\#1,n-2,2}\%h = a_{\#2,n-2,2}\%h = a_{\#3,n-2,2}\%h = \ldots = a_{\#g,n-2,2}\%h = \ldots = a_{\#h-2,n-2,2}\%h = a_{\#h-1,n-2,2}\%h = y_{p=n-2}\ (y_{p=n-2}\text{: fixed-value})$$

-continued $$a_{\#0,n-1,2}\%h = a_{\#1,n-1,2}\%h = a_{\#2,n-1,2}\%h = a_{\#3,n-1,2}\%h = \ldots = a_{\#g,n-1,2}\%h = \ldots = a_{\#h-2,n-1,2}\%h = a_{\#h-1,n-1,2}\%h = y_{p=n-1}\ (y_{p=n-1}\text{: fixed-value}) \text{ and}$$

$$b_{\#0,2}\%h = b_{\#1,2}\%h = b_{\#2,2}\%h = b_{\#3,2}\%h = \ldots = b_{\#g,2}\%h = \ldots = b_{\#h-2,2}\%h = b_{\#h-1,2}\%h = z\ (z\text{: fixed-value})$$

In addition, as described above, high error correction capability can be achieved by adding Condition #7-1 or Condition #7-2.

<Condition #7-1>

In Condition #6-1, $v_{p=1}$, $v_{p=2}$, $v_{p=3}$, $v_{p=4}$, . . . , $v_{p=k}$, . . . , $v_{p=n-2}$, $v_{p=n-1}$ (k=1, 2, . . . , n−1) and w are set to one and are natural numbers other than divisors of a time-varying period of h.

<Condition #7-2>

In Condition #6-2, $y_{p=1}$, $y_{p=2}$, $y_{p=3}$, $y_{p=4}$, . . . , $y_{p=k}$, . . . , $y_{p=n-2}$, $y_{p=n-1}$ (k=1, 2, . . . , n−1) and z are set to one and are natural numbers other than divisors of a time-varying period of h.

Then, Consider a set of $(v_{p=1}, y_{p=1})$, $(v_{p=2}, y_{p=2})$, $(v_{p=3}, y_{p=3})$, . . . $(v_{p=k}, y_{p=k})$, . . . , $(v_{p=n-2}, y_{p=n-2})$, $(v_{p=n-1}, y_{p=n-1})$ and (w, z). Here, it is assumed that k=1, 2, . . . , n−1. If Condition #8-1 or Condition #8-2 holds true, higher error correction capability can be achieved.

<Condition #8-1>

Consider $(v_{p=i}, y_{p=i})$ and $(v_{p=j}, y_{p=j})$, where it is assumed that i=1, 2, . . . , n−1, j=1, 2, . . . , n−1 and i≠j. At this time, there are i and j (i≠j) for which $(v_{p=i}, y_{p=i}) \neq (v_{p=j}, y_{p=j})$ and $(v_{p=i}, y_{p=i}) \neq (y_{p=j}, v_{p=j})$ hold true.

<Condition #8-2>

Consider $(v_{p=i}, y_{p=i})$ and (w, z), where it is assumed that i=1, 2, . . . , n−1. At this time, there is i for which $(v_{p=i}, y_{p=i}) \neq (w, z)$ and $(v_{p=i}, y_{p=i}) \neq (z, w)$ hold true.

Furthermore, by making more severe the constraint conditions of Condition #8-1 and condition #8-2, it is more likely to be able to generate an LDPC-CC of a time-varying period of h (h is a non-prime integer no smaller than three) with higher error correction capability. The condition is that Condition #9-1 and Condition #9-2, Condition #9-1, or Condition #9-2 should hold true.

<Condition #9-1>

Consider $(v_{p=i}, y_{p=i})$ and $(v_{p=j}, y_{p=j})$, where it is assumed that i=1, 2, . . . , n−1, j=1, 2, . . . , n−1 and i≠j. At this time, $(v_{p=i}, y_{p=i}) \neq (v_{p=j}, y_{p=j})$ and $(v_{p=i}, y_{p=i}) \neq (y_{p=j}, v_{p=j})$ hold true for all i and j (i≠j).

<Condition #9-2>

Consider $(v_{p=i}, y_{p=i})$ and (w, z), where it is assumed that i=1, 2, . . . , n−1. At this time, $(v_{p=i}, y_{p=i}) \neq (w, z)$ and $(v_{p=i}, y_{p=i}) \neq (z, w)$ hold true for all i.

Furthermore, when $v_{p=i} \neq y_{p=i}$ (i=1, 2, . . . , n−1) and w≠z hold true, it is possible to suppress the occurrence of short loops in a Tanner graph.

In the above description, expression 14 having three terms in $X_1(D)$, $X_2(D)$, . . . , $X_{n-1}(D)$ and P(D) has been handled as the gth parity check polynomial of an LDPC-CC having a time-varying period of h (h is a non-prime integer greater than three). In expression 14, it is also likely to be able to achieve high error correction capability when the number of terms of any of $X_1(D)$, $X_2(D)$, . . . , $X_{n-1}(D)$ and P(D) is one or two. For example, the following method is available as the method of setting the number of terms of $X_1(D)$ to one or two. In the case of a time-varying period of h, there are h parity check polynomials that satisfy zero and the number of terms of $X_1(D)$ is set to one or two for all the h parity check polynomials that satisfy zero. Alternatively, instead of setting the number of terms of $X_1(D)$ to one or two for all the h parity check polynomials that satisfy zero, the number of terms of $X_1(D)$ may be set to one or two for any number (equal to or less than h−1) of parity check polynomials that satisfy zero. The same applies to $X_2(D), \ldots, X_{n-1}(D)$ and P(D). In this case, satisfying the above-described condition constitutes an important condition in achieving high error correction capability. However, the condition relating to the deleted terms is unnecessary.

Moreover, even when the number of terms of any of $X_1(D), X_2(D), \ldots, X_{n-1}(D)$ and P(D) is four or more, it is also likely to be able to achieve high error correction capability. For example, the following method is available as the method of setting the number of terms of $X_1(D)$ to four or more. In the case of a time-varying period of h, there are h parity check polynomials that satisfy zero, and the number of terms of $X_1(D)$ is set to four or more for all the h parity check polynomials that satisfy zero. Alternatively, instead of setting the number of terms of $X_1(D)$ to four or more for all the h parity check polynomials that satisfy zero, the number of terms of $X_1(D)$ may be set to four or more for any number (equal to or less than h−1) of parity check polynomials that satisfy zero. The same applies to $X_2(D), \ldots, X_{n-1}(D)$ and P(D). At this time, the above-described condition is excluded for the added terms.

The following describes an LDPC-CC encoding method and the configuration of an encoder based on the parity check polynomials described above.

First, consider an LDPC-CC having a coding rate of 1/2 and a time-varying period of three as an example. Parity check polynomials of a time-varying period of three are provided below.

[Math. 15]

$$(D^2+D^1+1)X_1(D)++(D^3+D^1+1)P(D)=0 \tag{15-0}$$

$$(D^3+D^1+1)X_1(D)+(D^2+D^1+1)P(D)=0 \tag{15-1}$$

$$(D^3+D^2+1)X_1(D)+(D^3+D^2+1)P(D)=0 \tag{15-2}$$

At this time, P(D) is obtained as shown below.

[Math. 16]

$$P(D)=(D^2+D^1+1)X_1(D)+(D^3+D^1)P(D) \tag{16-0}$$

$$P(D)=(D^3+D^1+1)X_1(D)+(D^2+D^1)P(D) \tag{16-1}$$

$$P(D)=(D^3+D^2+1)X_1(D)+(D^3+D^2)P(D) \tag{16-2}$$

Then, expression 16-0 through expression 16-2 are represented as follows:

[Math. 17]

$$P[i]=X_1[i]\oplus X_1[i-1]\oplus X_1[i-2]\oplus P[i-1]\oplus P[i-3] \tag{17-1}$$

$$P[i]=X_1[i]\oplus X_1[i-1]\oplus X_1[i-3]\oplus P[i-1]\oplus P[i-2] \tag{17-2}$$

$$P[i]=X_1[i]\oplus X_1[i-2]\oplus X_1[i-3]\oplus P[i-2]\oplus P[i-3] \tag{17-3}$$

where the symbol ⊕ represents the exclusive OR operator.

Figure 9:
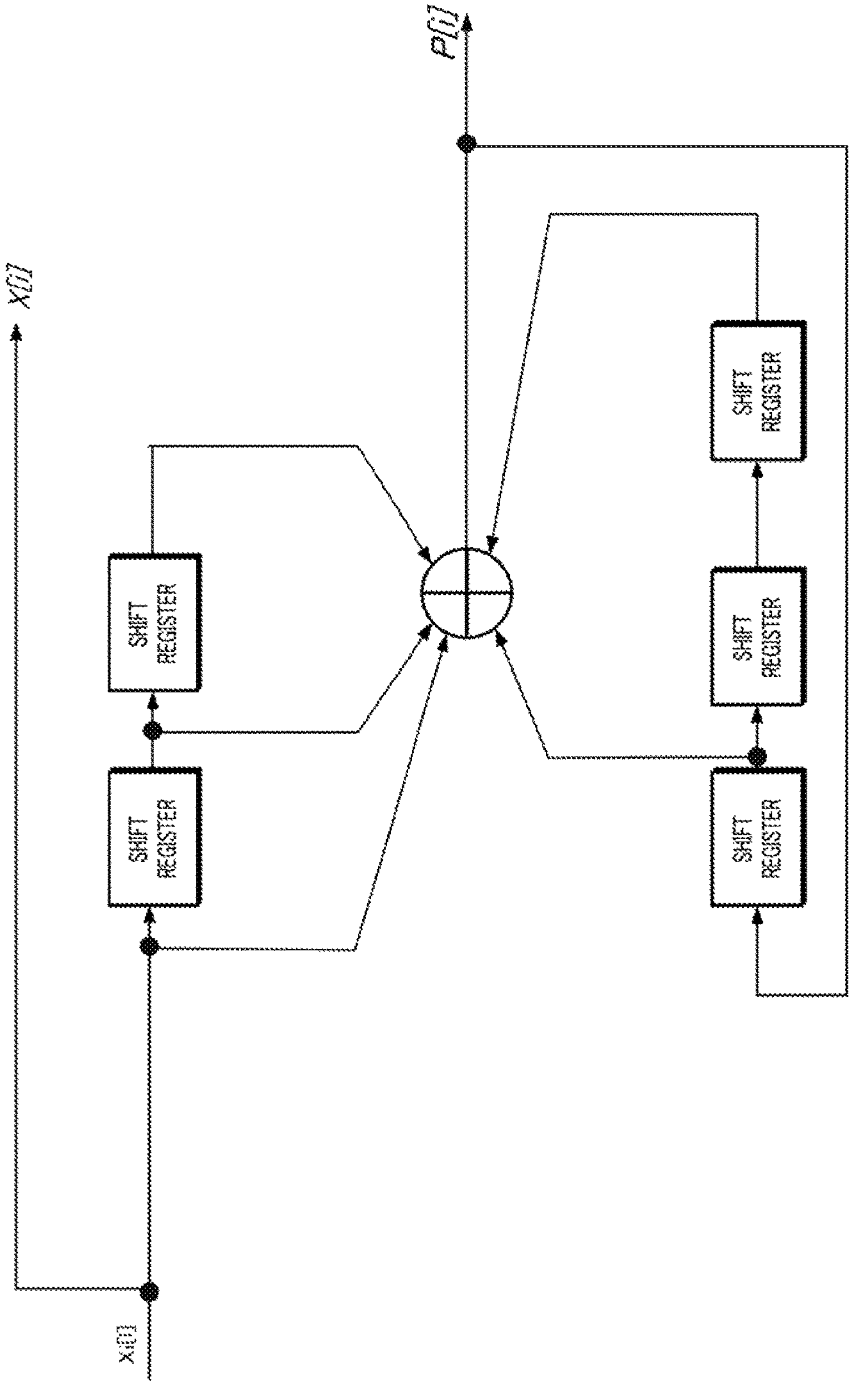
FIG. 9 shows a circuit example of encoder having a coding rate of 1/2.
Figure 10:
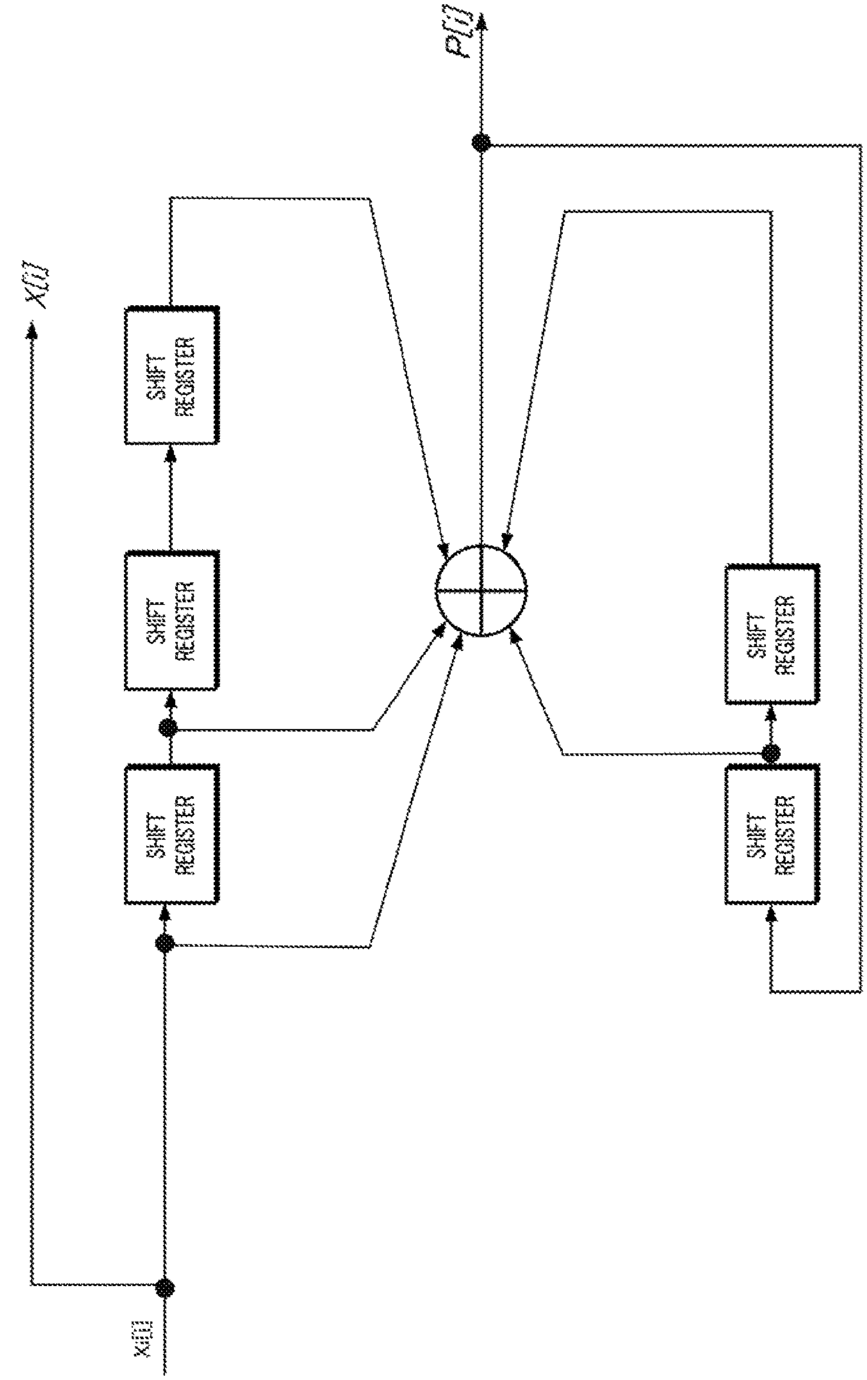
FIG. 10 shows a circuit example of encoder having a coding rate of 1/2.
Figure 11:
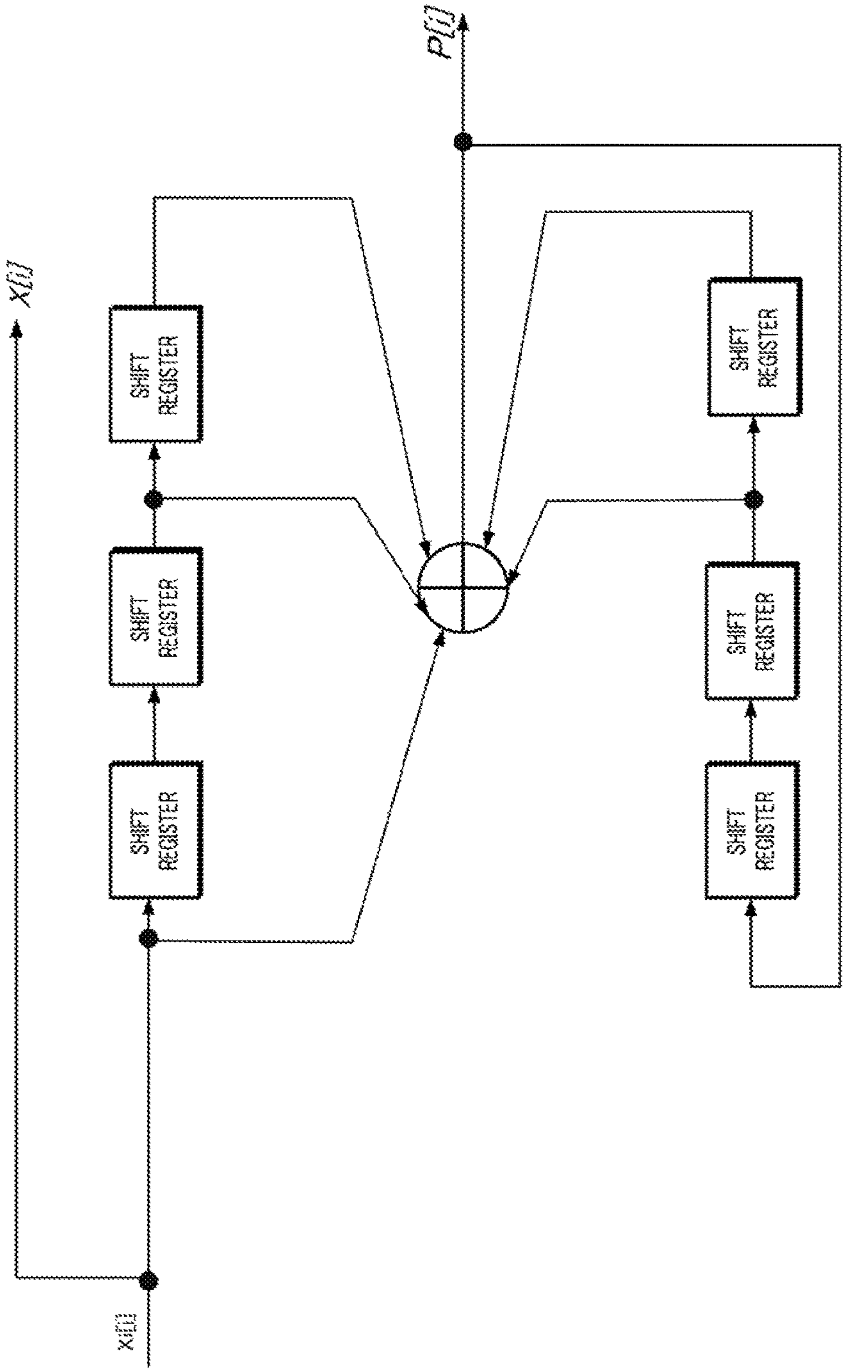
FIG. 11 shows a circuit example of encoder having a coding rate of 1/2.

Here, FIG. 9 shows the circuit corresponding to expression 17-0, FIG. 10 shows the circuit corresponding to expression 17-1 and FIG. 11 shows the circuit corresponding to expression 17-2. (Here, it is assumed that tail-biting is not performed.)

Figure 12:
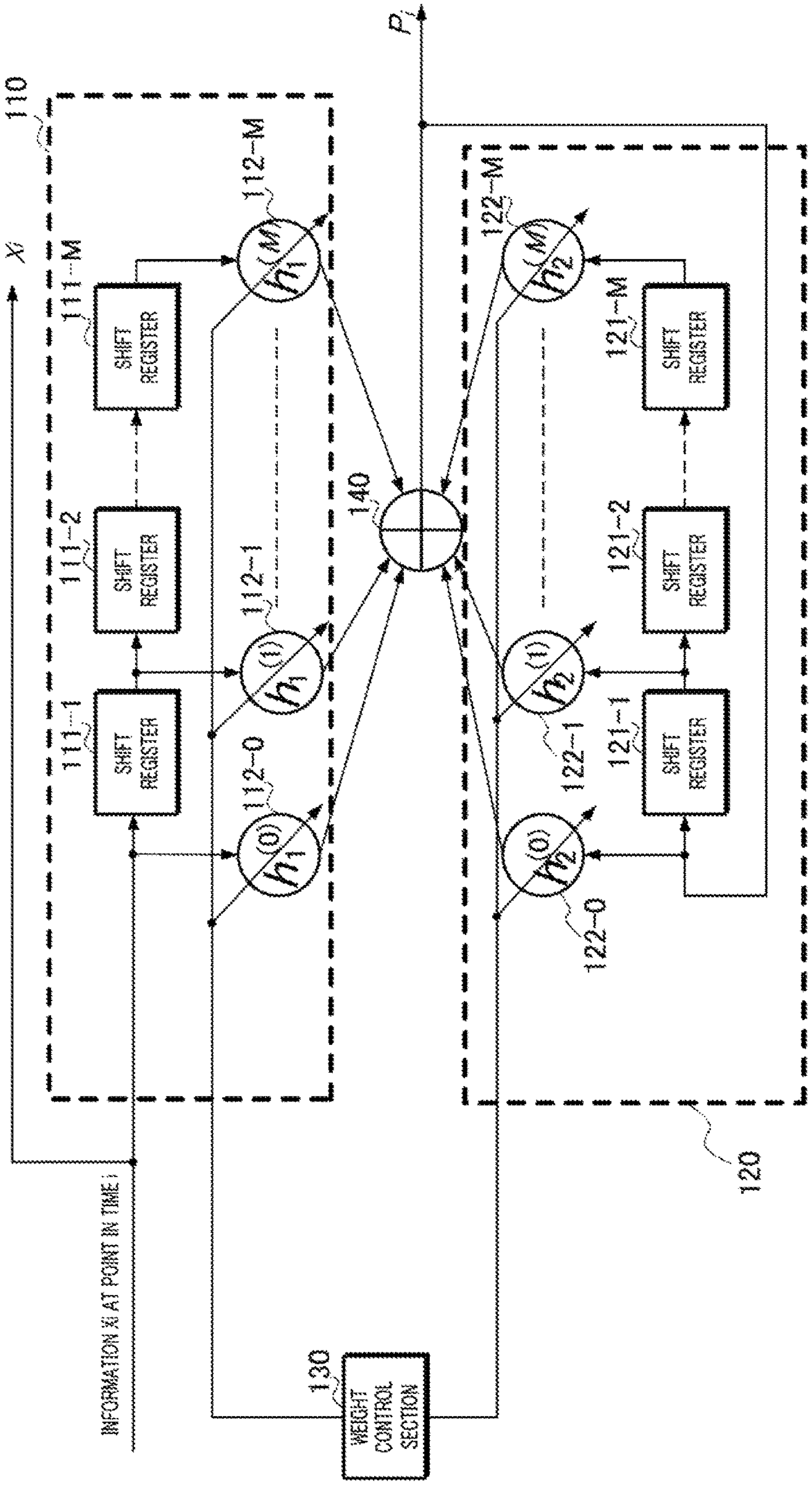
FIG. 12 shows an example of the configuration of an LDPC-CC encoding section.

At point in time i=3k, the parity bit at point in time i is obtained through the circuit shown in FIG. 9 corresponding to expression 16-0, that is, expression 17-0. At point in time i=3k+1, the parity bit at point in time i is obtained through the circuit shown in FIG. 10 corresponding to expression 16-1, that is, expression 17-1. At point in time i=3k+2, the parity bit at point in time i is obtained through the circuit shown in FIG. 11 corresponding to expression 16-2, that is, expression 17-2. Therefore, the encoder can adopt the configuration of FIG. 12. In FIG. 12, a weight control section 130 outputs signals for controlling weight as time elapses. Further, 112-0 through 112-M and 122-0 through 122-M in FIG. 12 change weight as time elapses, based on these signals for controlling weight.

Encoding can be performed also when the time-varying period is other than three and the coding rate is (n−1)/n in the same way as that described above. For example, the gth (g=0, 1, . . . , q−1) parity check polynomial of an LDPC-CC having a time-varying period of q and a coding rate of (n−1)/n is represented as shown in expression 13, and therefore P(D) is represented as follows, where q is not limited to a prime number.

[Math. 18]

$$P(D)=(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D)+(D^{b\#g,1}+D^{b\#g,2}+1)P(D) \tag{18}$$

When expressed in the same way as expression 17-0 through expression 17-2, expression 18 is represented as follows:

[Math. 19]

$$P[i]=X_1[i]\oplus X_1[i-_{a\#g,1,1}]\oplus X_1[i-_{a\#g,1,2}]\oplus X_2[i]\oplus X_2[i-_{a\#g,2,1}]\oplus X_2[i-_{a\#g,2,2}]\oplus\ldots\oplus X_{n-1}[i]\oplus X_{n-1}[i-_{a\#g,n-1,1}]\oplus X_{n-1}[i-_{a\#g,n-1,2}]\oplus P[i-_{b\#g,1}]\oplus P[i-_{b\#g,2}] \tag{19}$$

where the symbol ⊕ represents the exclusive OR operator.

Here, $X_r[i]$ (r=1, 2, . . . , n−1) represents an information bit at point in time i and P[i] represents a parity bit at point in time i.

Therefore, when i%q=k at point in time i, the parity bit at point in time i in expression 18 and expression 19 can be achieved using a formula resulting from substituting k for g in expression 18 and expression 19.

Since an LDPC-CC is a kind of convolutional code, securing belief in decoding of information bits requires termination or tail-biting, or performing tail-biting. Here, a case is considered where termination is performed (hereinafter, information-zero-termination, or simply zero-termination).

Figure 13:
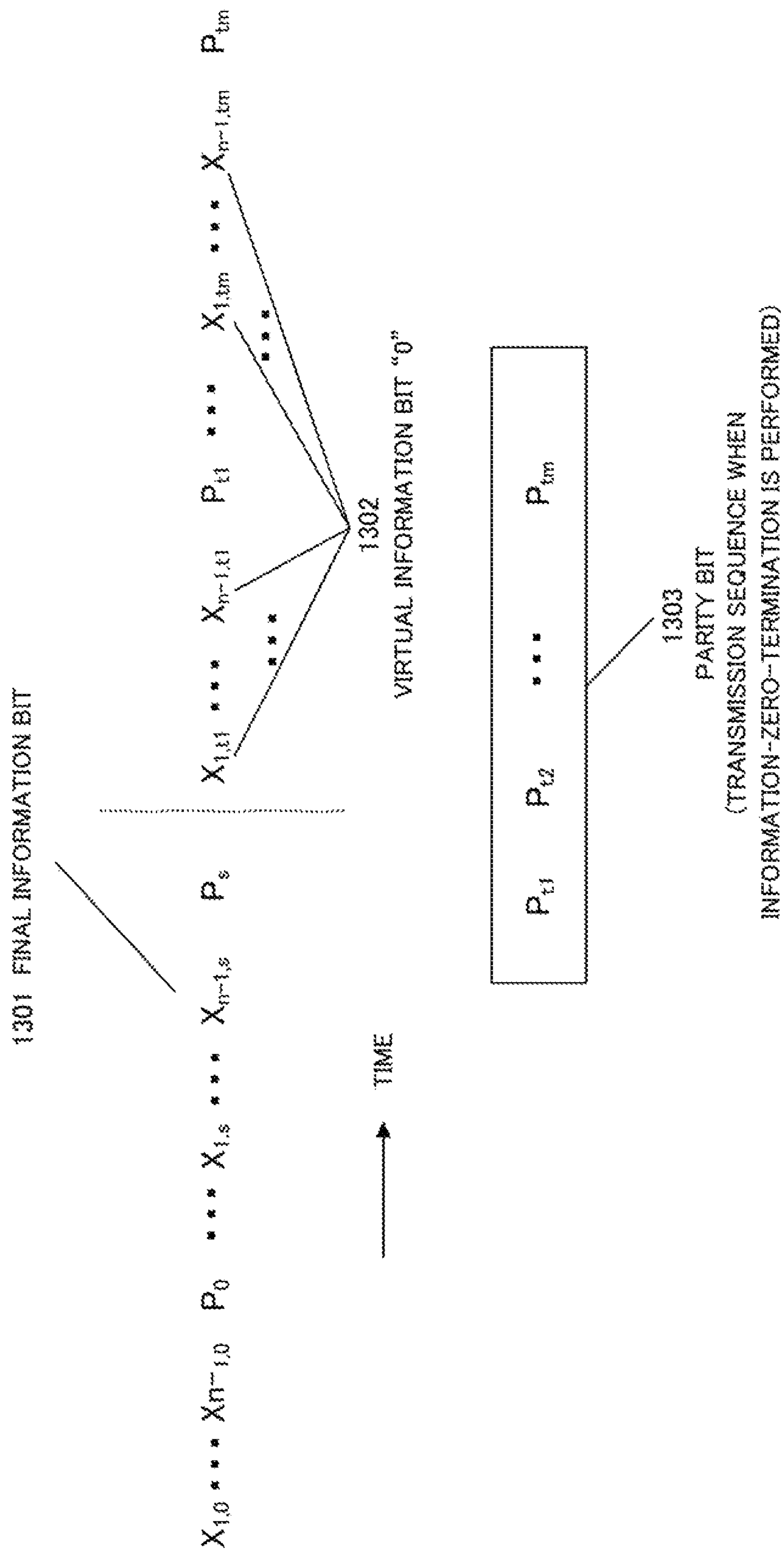
FIG. 13 shows a zero-termination method.

FIG. 13 is a diagram illustrating information-zero-termination for an LDPC-CC having a coding rate of (n−1)/n. It is assumed that information bits $X_1, X_2, \ldots, X_{n-1}$ and parity bit P at point in time i (i=0, 1, 2, 3, . . . , s) are represented by $X_{1,i}, X_{2,i}, \ldots, X_{n-1,i}$, and parity bit $P_i$, respectively. As shown in FIG. 13, $X_{n-1,s}$ is assumed to be the final bit of the information to transmit.

If the encoder performs encoding only until point in time s and the transmitting apparatus on the encoding side performs transmission only up to $P_s$ to the receiving apparatus on the decoding side, receiving quality of information bits of the decoder considerably deteriorates. To solve this problem, encoding is performed assuming information bits from final information bit $X_{n-1,s}$ onward (hereinafter virtual information bits) to be zeroes, and a parity bit (1303) is generated.

To be more specific, as shown in FIG. 13, the encoder performs encoding assuming $X_{1,k}, X_{2,k}, \ldots, X_{n-1,k}$ (k=t1, t2, . . . , tm) to be zeroes and obtains $P_{t1}, P_{t2}, \ldots, P_{tm}$. After transmitting $X_{1,s}, X_{2,s}, \ldots, X_{n-1,s}$, and $P_s$ at point in time s, the transmitting apparatus on the encoding side transmits $P_{t1}, P_{t2}, \ldots, P_{tm}$. The decoder performs decoding taking advantage of knowing that virtual information bits are zeroes from point in time s onward.

In termination such as information-zero-termination, for example, LDPC-CC encoder 100 in FIG. 12 performs encoding assuming the initial state of the register is zero. As another interpretation, when encoding is performed from point in time i=0, if, for example, z is less than zero in expression 19, encoding is performed assuming $X_1[z]$, $X_2[z], \ldots, X_{n-1}[z]$, and $P[z]$ to be zeroes.

Assuming a sub-matrix (vector) in expression 13 to be $H_g$, a gth sub-matrix can be represented as shown below.

[Math. 20]

$$H_g = \left\{H'_g, \underbrace{11 \ldots 1}_{n}\right\} \tag{20}$$

Here, n continuous ones correspond to the terms of $X_1(D)$, $X_2(D), \ldots, X_{n-1}(D)$ and $P(D)$ in expression 13.

Figure 14:
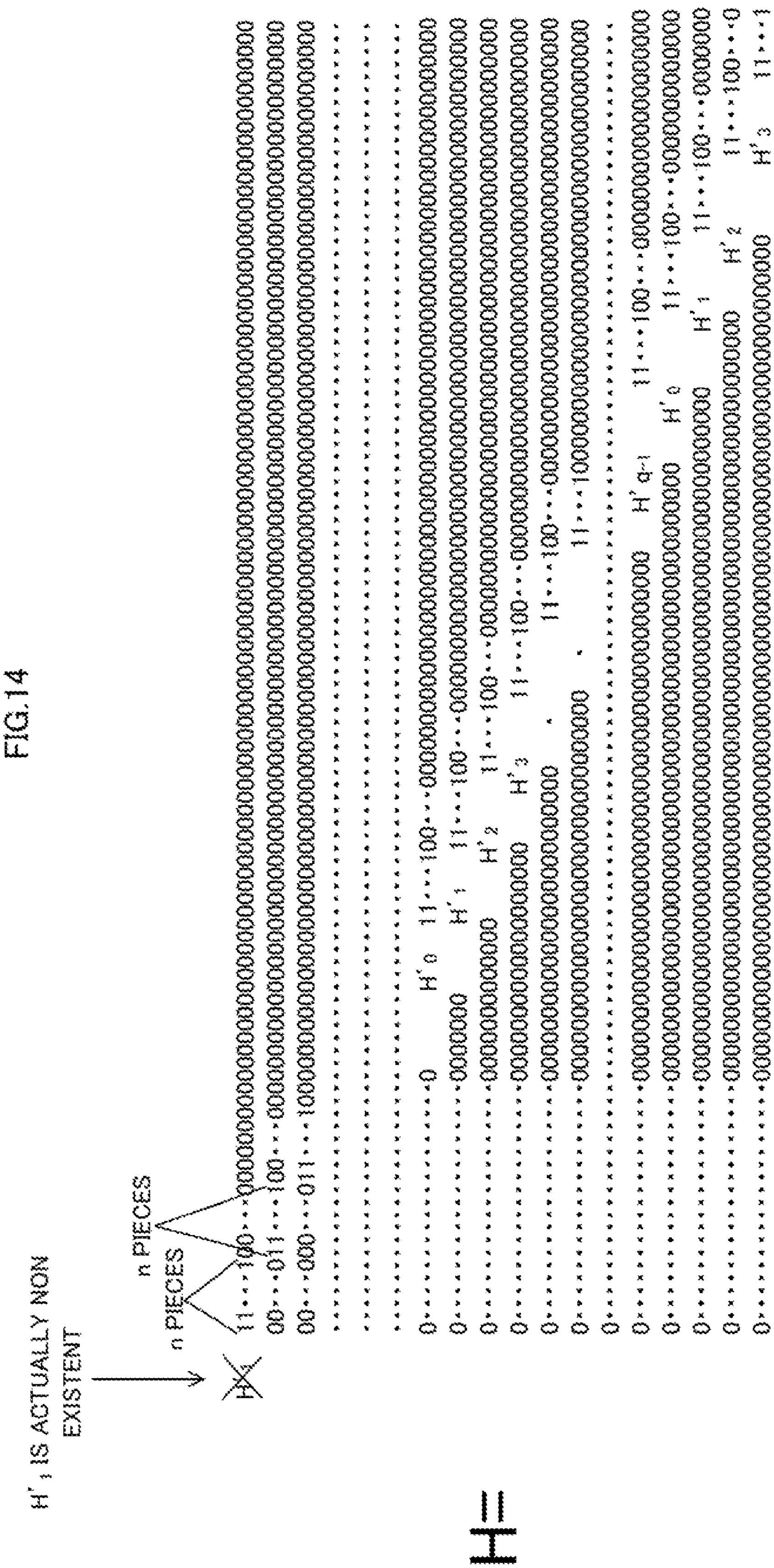
FIG. 14 shows an example of check matrix when zero-termination is performed.

Therefore, when termination is used, the LDPC-CC check matrix having a coding rate of (n−1)/n and a time-varying period of q represented by expression 13 is represented as shown in FIG. 14.

As shown in FIG. 14, a configuration is employed in which a sub-matrix is shifted n columns to the right between an ith row and (i+1)th row in parity check matrix H (see FIG. 14). However, an element to the left of the first column ($H'_1$ in the example of FIG. 14) is not reflected in the parity check matrix (see FIG. 14). When transmission vector u is assumed to be $u=(X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,1}, P_k, \ldots)^T$, Hu=0 holds true. (Here, the zero in Hu=0 indicates that vector Hu is a column vector all elements of which are zeroes.)

As described above, the encoder receives information bits $X_r[i]$ (r=1, 2, . . . , n−1) at point in time i as input, generates parity bit P[i] at point in time i using expression 19, outputs parity bit [i], and can thereby perform encoding of the LDPC-CC described in embodiment 1.

The following describes a conventional time-varying LDPC-CC having a coding rate of R=(n−1)/n (where n is an integer no smaller than two). Information bits of $X_1$, $X_2$, . . . and $X_{n-1}$ and parity bit P at point in time j are represented by $X_{1,j}, X_{2,j}, \ldots, X_{n-1,j}$, and $P_j$, respectively. Vector $u_j$ at point in time j is represented by $u_j=(X_{1,j}, X_{2,j}, \ldots, X_{n-1,j}, P_j)$ Furthermore, the encoded sequence is represented by $u=(u_0, u_1, \ldots, u_j, \ldots)^T$. Assuming D to be a delay operator, the polynomial of information bits $X_1$, $X_2, \ldots, X_{n-1}$ is represented by $X_1(D), X_2(D), \ldots, X_{n-1}(D)$ and the polynomial of parity bit P is represented by P(D). At this time, consider a parity check polynomial that satisfies zero represented as shown in expression 21.

[Math. 21]

$$(D^{a1,1}+D^{a1,2}+ \ldots +D^{a1,r1}+1)X_1(D)+(D^{a2,1}+D^{a2,2}+ \ldots +D^{a2,r2}+1)X_2(D)+ \ldots +(D^{an-1,1}+D^{an-1,2}+ \ldots +D^{an-1,r1}+1)X_{n-1}(D)+(D^{b1}+D^{b2}+ \ldots +D^{b\varepsilon}+1)P(D)=0 \tag{21}$$

In expression 21, it is assumed that $a_{p,q}$ (p=1, 2, . . . , n−1; q=1, 2, . . . , $r_p$) and $b_s$ (s=1, 2, . . . , ε) are natural numbers. Furthermore, $a_{p,y} \neq a_{p,z}$ is satisfied for $^\forall(y, z)$ of y, z=1, 2, . . . , $r_p$, y≠z. Furthermore, $b_y \neq b_z$ is satisfied for $^\forall(y, z)$ of y, z=1, 2, . . . , ε, y≠z. Here, ∀ is the universal quantifier.

To create an LDPC-CC having a coding rate of R=(n−1)/n and a time-varying period of m, a parity check polynomial based on expression 21 is provided. At this time, an ith (i=0, 1, . . . , m−1) parity check polynomial is represented as shown in expression 22.

[Math. 22]

$$A_{X1,i}(D)X_1(D)+A_{X2,i}(D)X_2(D)+ \ldots +A_{Xn-1,i}(D)X_{n-1}(D)+B_i(D)P(D)=0 \tag{22}$$

In expression 22, maximum orders of D of $A_{X\delta,i}(D)$ (δ=1, 2, . . . , n−1) and $B_i(D)$ are represented by $\Gamma_{X\delta,i}$ and $\Gamma_{P,i}$, respectively. A maximum value of $\Gamma_{X\delta,i}$ and $\Gamma_{P,i}$ is assumed to be $\Gamma_i$. A maximum value of $\Gamma_i$ (i=0, 1, . . . , m−1) is assumed to be Γ. When encoded sequence u is taken into consideration, using Γ, vector $h_i$ corresponding to an ith parity check matrix is represented as shown in expression 23.

[Math. 23]

$$h_i=[h_{i,\Gamma}, h_{i,\Gamma-1}, \ldots, h_{i,1}, h_{i,0}] \tag{23}$$

In expression 23, $h_{i,v}$ (v=0, 1, . . . , Γ) is a vector of 1×n and represented as shown in expression 24.

[Math. 24]

$$h_{i,v}=[\alpha_{i,v,X1}, \alpha_{i,v,X2}, \ldots, \alpha_{i,v,Xn-1}, \beta_{i,v}] \tag{24}$$

This is because the parity check polynomial of expression 22 has $\alpha_{i,v,Xw}D^vX_w(D)$ and $\alpha_{i,v}D^vP(D)$ (w=1, 2, . . . , n−1, and $\alpha_{i,v,Xw}$, $\beta_{i,v} \varepsilon [0, 1]$). At this time, the parity check polynomial that satisfies zero of expression 22 has $D^0X_1(D)$, $D^0X_2(D), \ldots, D^0X_{n-1}(D)$ and $D^0P(D)$, and therefore satisfies expression 25.

[Math. 25]

$$h_{i,0} = [\underbrace{1 \ldots 1}_{n}] \tag{25}$$

In expression 25, Λ(k)=Λ(k+m) is satisfied for $^\forall k$, where Λ(k) corresponds to $h_i$ on a kth row of the parity check matrix.

Using expression 23, expression 24 and expression 25, an LDPC-CC parity check matrix based on the parity check polynomial having a coding rate of R=(n−1)/n and a time-varying period of m is represented as shown in expression 26.

[Math. 26]

$$H = \begin{bmatrix} \ddots & & & & & & & & \ddots & & & & & & \\ & h_{0,\Gamma} & h_{0,\Gamma-1} & \cdots & \cdots & \cdots & \cdots & \cdots & h_{0,0} & & & & & & \\ & & h_{1,\Gamma} & \cdots & \cdots & \cdots & \cdots & \cdots & h_{1,1} & h_{1,0} & & & & & \\ & & & \ddots & & & & & & & \ddots & & & & \\ & & & & h_{m-1,\Gamma} & h_{m-1,\Gamma-1} & \cdots & \cdots & \cdots & \cdots & \cdots & h_{m-1,0} & & & \\ & & & & & h_{0,\Gamma} & \cdots & \cdots & \cdots & \cdots & \cdots & h_{0,1} & h_{0,0} & & \\ & & & & & & \ddots & & & & & & & \ddots & \\ & & & & & & & h_{m-1,\Gamma} & \cdots & \cdots & \cdots & \cdots & \cdots & \cdots & h_{m-1,0} \\ & & & & & & & & \ddots & & & & & & & \ddots \end{bmatrix} \quad (26)$$

[Overview of LDPC-CC Based on Parity Check Polynomial]

The following describes important items relating to an LDPC-CC based on a parity check polynomial having a time-varying period greater than three.

An LDPC-CC is a code defined by a low-density parity check matrix as in the case of an LDPC-BC, can be defined by a time-varying parity check matrix of an infinite length, but can actually be considered with a periodically time-varying parity check matrix.

Assuming that a parity check matrix is H and a syndrome former is $H^T$, $H^T$ of an LDPC-CC having a coding rate of R=d/c (d<c) can be represented as shown in expression 27.

[Math. 29]

$$G_1(D)X(D)+G_0(D)P(D)=0 \quad (29)$$

Here, the parity check polynomial is provided as expression 30 that satisfies expression 29.

[Math. 30]

$$(D^{a1}+D^{a2}+\ldots+D^{ar}+1)X(D)+(D^{b1}+D^{b2}+\ldots+D^{bs}+1)P(D)=0 \quad (30)$$

In expression 30, $a_p$ and $b_q$ are integers no smaller than one (p=1, 2, . . . , r; q=1, 2, . . . , s), terms of $D^0$ are present in X(D) and P(D). The code defined by a parity check matrix based on the parity check polynomial that satisfies zero of expression 30 becomes a time-invariant LDPC-CC.

[Math. 27]

$$H^T = \begin{bmatrix} \ddots & \vdots & \vdots & \ddots & & & & \\ H_0^T(t-M_s) & H_1^T(t-M_s+1) & \cdots & H_{Ms}^T(t) & & & & \\ & H_0^T(t-M_s+1) & \cdots & H_{Ms-1}^T(t) & H_{Ms}^T(t+1) & & & \\ & & \ddots & \vdots & \vdots & \ddots & & \\ & & & H_0^T(t) & H_1^T(t+1) & \cdots & H_{Ms}^T(t+M_s) & \\ & & & & \ddots & \vdots & \vdots & \ddots \end{bmatrix} \quad (27)$$

In expression 27, $H^T_i(t)$ (i=0, 1, . . . , $m_s$) is a c×(c−d) periodic sub-matrix and if the period is assumed to be $T_s$, $H^T_i(t)=H^T_i(t+T_s)$ holds true for ∀i and ∀t. Furthermore, $M_s$ is a memory size.

The LDPC-CC defined by expression 27 is a time-varying convolutional code and this code is called a time-varying LDPC-CC. As for decoding, BP decoding is performed using parity check matrix H. When encoded sequence vector u is assumed, the following relational expression holds true.

[Math. 28]

$$Hu=0 \quad (28)$$

An information sequence is obtained by performing BP decoding using the relational expression in expression 28.

<LDPC-CC Based on Parity Check Polynomial>

Consider a systematic convolutional code of a coding rate of R=1/2 of generator matrix $G=[1G_1(D)/G_0(D)]$. At this time, $G_1$ represents a feed forward polynomial and $G_0$ represents a feedback polynomial.

Assuming a polynomial representation of an information sequence is X(D) and a polynomial representation of a parity sequence is P(D), a parity check polynomial that satisfies zero can be represented as shown below.

An m (m is an integer no smaller than two) number of different parity check polynomials based on expression 30 are provided. The parity check polynomial that satisfies zero is represented as shown below.

[Math. 31]

$$A_i(D)X(D)+B_i(D)P(D)=0 \quad (31)$$

At this time, i=0, 1, . . . , m−1.

The data and parity at point in time j are represented by $X_j$ and $P_j$ as $u_j=(X_j, P_j)$. It is then assumed that the parity check polynomial that satisfies zero of expression 32 holds true.

[Math. 32]

$$A_k(D)X(D)+B_k(D)P(D)=0 (k=j \bmod m) \quad (32)$$

Parity $P_j$ at point in time j can then be determined from expression 32. The code defined by the parity check matrix generated based on the parity check polynomial that satisfies zero of expression 32 becomes an LDPC-CC having a time-varying period of m (TV-m-LDPC-CC: Time-Varying LDPC-CC with a time period of m).

At this time, there are terms of $D^o$ in P(D) of the time-invariant LDPC-CC defined in expression 30 and TVm-LDPC-CC defined in expression 32, where $b_j$ is an integer no smaller than zero. Therefore, there is a characteristic that parity can be easily found sequentially by means of a register and exclusive OR (when tail-biting is not performed).

The decoding section creates parity check matrix H from expression 30 using the time-invariant LDPC-CC and creates parity check matrix H from expression 32 using the TV-m-LDPC-CC. The decoding section performs BP decoding on encoded sequence $u=(u_0, u_1, \ldots, u_j, \ldots)^T$ using expression 28 and obtains an information sequence.

Next, consider a time-invariant LDPC-CC and TV-m-LDPC-CC of a coding rate of (n−1)/n (where n is an integer no smaller than two). It is assumed that information sequence $X_1, X_2, \ldots, X_{n-1}$ and parity P at point in time j are represented by $X_{2,j}, \ldots, X_{n-1,j}$, and $P_j$ respectively, and $u_j=(X_{1,j}, X_{2,j}, \ldots, X_{n-1,j}, P_j)$. When it is assumed that a polynomial representation of information sequence $X_1, X_2, \ldots, X_{n-1}$ is $X_1(D), X_2(D), \ldots, X_{n-1}(D)$, the parity check polynomial that satisfies zero is represented as shown below.

[Math. 33]

$$(D^{a1,1}+D^{a1,2}+\ldots+D^{a1,r1}+1)X_1(D)+(D^{a2,1}+D^{a2,2}+\ldots+D^{a2,r2}+1)X_2(D)+\ldots+(D^{an-1,1}+D^{an-1,2}+\ldots+D^{an-1,rn-1}+1)X_{n-1}(D)+(D^{b1}+D^{b2}+\ldots+D^{bs}+1)P(D)=0 \tag{33}$$

In expression 33, $a_{p,i}$ is an integer no smaller than one (p=1, 2, . . . , n−1; i=1, 2, . . . $r_p$), and satisfies $a_{p,y} \neq a_{p,z}$ ($^\forall$(y, z)|y, z=1, 2, . . . , $r_p$, y≠z) and $b \neq b_z$ ($^\forall$(y, z)|y, z=1, 2, . . . , ε, y≠z).

m (m is an integer no smaller than two) different parity check polynomials based on expression 33 are provided. A parity check polynomial that satisfies zero is represented as shown below.

[Math. 34]

$$A_{X1,i}(D)X_1(D)+A_{X2,i}(D)X_2(D)+\ldots+A_{Xn-1,i}(D)X_{n-1}(D)+B_i(D)P(D)=0 \tag{34}$$

where i=0, 1, . . . , m−1.

It is then assumed that expression 35 holds true for $X_{1,j}, X_{2,j}, \ldots, X_{n-1,j}$, and $P_j$ of information $X_1, X_2, \ldots, X_{n-1}$ and parity P at point in time j.

[Math. 35]

$$A_{X1,k}(D)X_1(D)+A_{X2,k}(D)X_2(D)+\ldots+A_{Xn-1,k}(D)X_{n-1}(D)+B_k(D)P(D)=0 (k=j \bmod m) \tag{35}$$

At this time, the codes based on expression 33 and expression 35 become time-invariant LDPC-CC and TV-m-LDPC-CC having a coding rate of (n−1)/n.

The following describes a regular TV-m-LDPC-CC.

A #qth parity check polynomial of a TV-m-LDPC-CC of a coding rate of (n−1)/n that satisfies zero is provided as shown below (q=0, 1, . . . , m−1).

[Math. 36]

$$(D^{a\#q,1,1}+D^{a\#q,1,2}+\ldots+D^{a\#q,1,r1})X_1(D)+(D^{a\#q,2,1}+D^{a\#q,2,2}+\ldots+D^{a\#q,2,r2})X_2(D)+\ldots+(D^{a\#q,n-1,1}+D^{a\#q,n-1,2}+\ldots+D^{a\#q,n-1,rn-1})X_{n-1}(D)+(D^{b\#q,1}+D^{b\#q,2}+\ldots+D^{b\#q,s})P(D)=0 \tag{36}$$

In expression 36, $a_{\#q,p,i}$ is an integer no smaller than zero (p=1, 2, . . . , n−1; i=1, 2, . . . , $r_p$) and satisfies $a_{\#q,p,y} \neq a_{\#q,p,z}$ ($^\forall$(y,z)|y, z=1, 2, . . . , $r_p$, y≠z) and $b_{\#q,y} \neq b_{\#q,z}$($^\forall$(y,z)|y, z=1, 2, . . . , ε, y≠z).

The following features are then provided.

Feature 1:

There is a relationship as shown below between the term of $D^{a\#\alpha,p,i}X_p(D)$ of parity check polynomial #α, the term of $D^{a\#\beta,p,j}X_p(D)$ of parity check polynomial #β (α, β=0, 1, . . . , m−1; p=1, 2, . . . , n−1; i, j=1, 2, . . . , $r_p$) and between the term of $D^{b\#\alpha,i}P(D)$ of parity check polynomial #α and the term of $D^{b\#\beta,j}P(D)$ of parity check polynomial #β (α, β=0, 1, . . . , m−1 (β≥α); i, j=1, 2, . . . , $r_p$).

Figure 15:
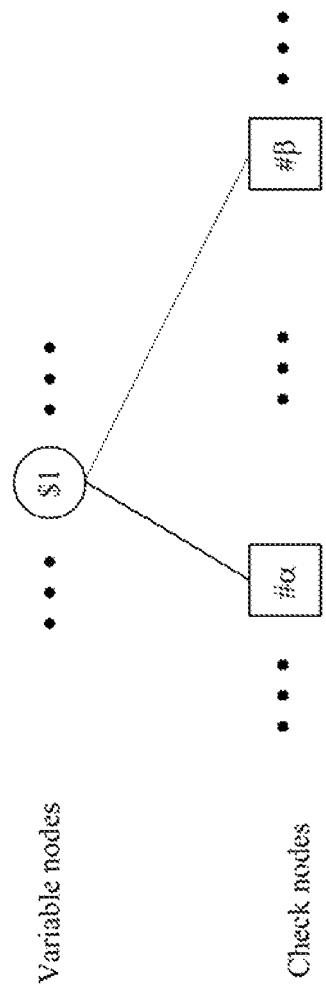
FIG. 15 shows a relationship between check nodes corresponding to parity check polynomials #α and #β, and a variable node.

<1> When β=α:

When $\{a_{\#\alpha,p,i} \bmod m = a_{\#\beta,p,j} \bmod m\} \cap \{i \neq j\}$ holds true, variable node $1 is present which forms edges of both a check node corresponding to parity check polynomial #α and a check node corresponding to parity check polynomial #β as shown in FIG. 15.

When $\{b_{\#\alpha,i} \bmod m = b_{\#\beta,j} \bmod m\} \cap \{i \neq j\}$ holds true, variable node $1 is present which forms edges of both a check node corresponding to parity check polynomial #α and a check node corresponding to parity check polynomial #β as shown in FIG. 15.

When β≠α:

It is assumed that β−α=L.

1) When $a_{\#\alpha,p,i} \bmod m < a_{\#\beta,p,j} \bmod m$

When $(a_{\#\beta,p,j} \bmod m)-(a_{\#\alpha,p,i} \bmod m)=L$, variable node $1 is present which forms edges of both a check node corresponding to parity check polynomial #α and a check node corresponding to parity check polynomial #β as shown in FIG. 15.

2) When $a_{\alpha,p,i} \bmod m > a_{\#\beta,p,j} \bmod m$

When $(a_{\#\beta,p,j} \bmod m)-(a_{\#\alpha,p,i} \bmod m)=L+m$, variable node $1 is present which forms edges of both a check node corresponding to parity check polynomial #α and a check node corresponding to parity check polynomial #β as shown in FIG. 15.

3) When $b_{\#\alpha,i} \bmod m < b_{\#\beta,j} \bmod m$

When $(b_{\#\beta,j} \bmod m)-(b_{\#\alpha,i} \bmod m)=L$, variable node $1 is present which forms edges of both a check node corresponding to parity check polynomial #α and a check node corresponding to parity check polynomial #β as shown in FIG. 15.

4) When $b_{\#\alpha,i} \bmod m > b_{\#\beta,j} \bmod m$

When $(b_{\#\beta,j} \bmod m)-(b_{\#\alpha,i} \bmod m)=L+m$, variable node $1 is present which forms edges of both a check node corresponding to parity check polynomial #α and a check node corresponding to parity check polynomial #β as shown in FIG. 15.

Theorem 1 holds true for cycle length six (CL6: cycle length of six) of a TV-m-LDPC-CC.

Theorem 1: The following two conditions are provided for a parity check polynomial that satisfies zero of the TV-m-LDPC-CC:

There are p and q that satisfy C#1.1: $a_{\#q,p,i} \bmod m = a_{\#q,p,j} \bmod m = a_{\#q,p,k} \bmod m$, where i≠j, i≠k and j≠k.

There is q that satisfies C#1.2: $=b_{\#q,i} \bmod m = b_{\#q,j} \bmod m = b_{\#q,k} \bmod m$, where i≠k and j≠k.

There is at least one CL6 when C#1.1 or C#1.2 is satisfied.

Proof:

If it is possible to prove that at least one CL6 is present when $a_{\#0,1,i} \bmod m = a_{\#0,1,j} \bmod m = a_{\#0,1,k} \bmod m$ when p=1 and q=0, it is possible to prove that at least one CL6 is present also for $X_2(D), \ldots, X_{n-1}(D)$, P(D) by substituting $X_2(D), \ldots, X_{n-1}(D)$, P(D) for $X_1(D)$, if C#1.1 and C#1.2 hold true when q=0.

Furthermore, when q=0 if the above description can be proved, it is possible to prove that at least one CL6 is present also when q=1, . . . , m−1 if C#1.1 and C#1.2 hold true, in the same way of thinking.

Therefore, when p=1, q=0, if $a_{\#0,1,i} \bmod m = a_{\#0,1,j} \bmod m = a_{\#0,1,k} \bmod m$ holds true, it is possible to prove that at least one CL6 is present.

In $X_1(D)$ when q=0 is assumed for a parity check polynomial that satisfies zero of the TV-m-LDPC-CC in expression 36, if two or fewer terms are present, C#1.1 is never satisfied.

In $X_1(D)$ when q=0 is assumed for a parity check polynomial that satisfies zero of the TV-m-LDPC-CC in expression 36, if three terms are present and $a_{\#q,p,i}$ mod m=$a_{\#q,p,j}$ modm=$a_{\#q,p,k}$ modm is satisfied, the parity check polynomial that satisfies zero of q=0 can be represented as shown in expression 37.

[Math. 37]

$$(D^{a\#0,1,1}+D^{a\#0,1,2}+D^{a\#0,1,3})X_1(D)+(D^{a\#0,2,1}+D^{a\#0,2,2}+\dots+D^{a\#0,2,r2})X_2(D)+\dots+(D^{a\#0,n-1,1}+D^{a\#0,n-1,2}+\dots+D^{a\#0,n-1,rn-1})X_{n-1}(D)++(D^{b\#0,1}+D^{b\#0,2}+\dots+D^{b\#0,s})P(D)=(D^{a\#0,1,3+m\gamma+m\delta}+D^{a\#0,1,3+m\delta}+D^{a\#0,1,3})X_1(D)+(D^{a\#0,2,1}+D^{a\#0,2,2}+\dots+D^{a\#0,2,r2})X_2(D)+\dots+(D^{a\#0,n-1,1}+D^{a\#0,n-1,2}+\dots+D^{a\#0,n-1,rn-1})X_{n-1}(D)++(D^{b\#0,1}+D^{b\#0,2}+\dots+D^{b\#0,s})P(D)=0 \quad (37)$$

Figure 16:
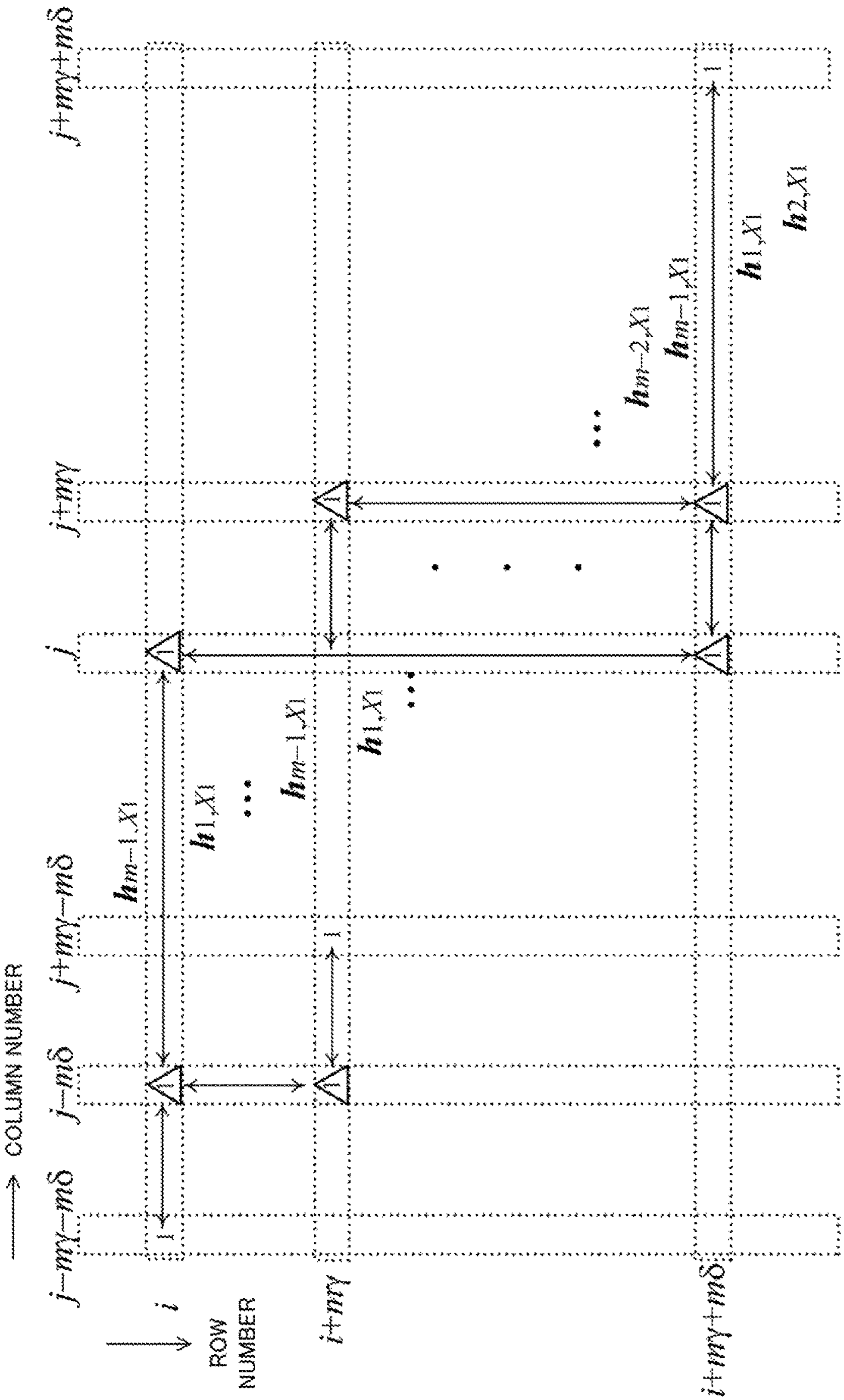
FIG. 16 shows a sub-matrix generated by extracting only parts relating to $X_1(D)$ of parity check matrix H.

Here, even when $a_{\#0,1,1}>a_{\#0,1,2}>a_{\#0,1,3}$ is assumed, generality is not lost, and γ and δ become natural numbers. At this time, in expression 37, when q=0, the term relating to $X_1(D)$, that is, $(D^{a\#0,1,3+m\gamma+m\delta}+D^{a\#0,1,3+m\delta}+D^{a\#0,1,3})\ X_1(D)$ is focused upon. At this time, a sub-matrix generated by extracting only a portion relating to $X_1(D)$ in parity check matrix H is represented as shown in FIG. 16. In FIG. 16, $h_{1,X1}, h_{2,X1}, \dots, h_{m-1,X1}$ are vectors generated by extracting only portions relating to $X_1(D)$ when q=1, 2, . . . , m−1 in the parity check polynomial that satisfies zero of expression 37, respectively.

At this time, the relationship as shown in FIG. 16 holds true because <1> of feature 1 holds true. Therefore, CL6 formed with a one shown by the symbol Δ as shown in FIG. 16 is always generated only in a sub-matrix generated by extracting only a portion relating to $X_1(D)$ of the parity check matrix in expression 37 regardless of γ and δ values.

When four or more $X_1(D)$-related terms are present, three terms are selected from among four or more terms and if $a_{\#0,1,i}$ modm=$a_{\#0,1,j}$ modm=$a_{\#0,1,k}$ modm holds true in the selected three terms, CL6 is formed as shown in FIG. 16.

As shown above, when q=0, if $a_{\#0,1,i}$ modm=$a_{\#0,1,j}$ modm=$_{a\#0,1,k}$ modm holds true about $X_1(D)$, CL6 is present.

Furthermore, by also substituting $X_1(D)$ for $X_2(D), \dots, X_{n-1}(D)$, P(D), at least one CL6 occurs when C#1.1 or C#1.2 holds true.

Furthermore, in the same way of thinking, also for when q=1, . . . , m−1, at least one CL6 is present when C#1.1 or C#1.2 is satisfied.

Therefore, in the parity check polynomial that satisfies zero of expression 37, when C#1.1 or C#1.2 holds true, at least one CL6 is generated.

□ (end of proof)

The #qth parity check polynomial that satisfies zero of a TV-m-LDPC-CC having a coding rate of (n−1)/n, which will be described hereinafter, is provided below based on expression 30 (q=0, . . . , m−1):

[Math. 38]

$$(D^{a\#q,1,1}+D^{a\#q,1,2}+D^{a\#q,1,3})X_1(D)+(D^{a\#q,2,1}+D^{a\#q,2,2}+D^{a\#q,2,3})X_2(D)+\dots+(D^{a\#q,n-1,1}+D^{a\#q,n-1,2}+D^{a\#q,n-1,3})X_{n-1}(D)+(D^{b\#q,1}+D^{b\#q,2}+D^{b\#q,3})P(D)=0 \quad (38)$$

Here, in expression 38, it is assumed that there are three terms in $X_i(D), X_2(D), \dots, X_{n-1}(D)$ and P(D), respectively.

According to theorem 1, to suppress the occurrence of CL6, it is necessary to satisfy {a#q,p,1 modm≠a#q,p,2 modm}∩{a#q,p,1 modm≠a#q,p,3 modm}∩{a#q,p,2 mod m≠a#q,p,3 modm} in Xq(D) of expression 38. Similarly, it is necessary to satisfy {b#q,1 modm≠b#q,2 modm}∩{b#q,1 modm≠b#q,3 modm}∩{b#q,2 mod m≠b#q,3 modm} in P(D) of expression 38. ∩ represents an intersection.

Then, according to feature 1, the following condition is considered as an example of the condition to be a regular LDPC code.

C#2: for ∀q, ($a_{\#q,p,1}$ modm, $a_{\#q,p,2}$ modm, $a_{\#q,p,3}$ modM)=($N_{p,1}, N_{p,2}, N_{p,3}$)∩($b_{\#q,1}$ mod m, $b_{\#q,2}$ modm, $b_{\#q,3}$ modm)=($M_1, M_2, M_3$) holds true. However, {$a_{\#q,p,1}$ mod m≠$a_{\#q,p,2}$ modm}∩{$a_{\#q,p,1}$ modm≠$a_{\#q,p,3}$ modm}∩{$a_{\#q,p,2}$ modm≠$a_{\#q,p,3}$ modm} and {$b_{\#q,1}$ modm≠$b_{\#q,2}$ modm}∩{$b_{\#q,1}$ modm≠$b_{\#q,3}$ modm}∩{$b_{\#q,2}$ modm≠$b_{\#q,3}$ modm} is satisfied. Here, the symbol ∀ of ∀q is a universal quantifier and ∀q means all q.

The following discussion will treat a regular TV-m-LDPC-CC that satisfies the condition of C#2.

[Code Design of Regular TV-m-LDPC-CC]

Non-Patent Literature 9 shows a decoding error rate when a uniformly random regular LDPC code is subjected to maximum likelihood decoding in a binary-input output-symmetric channel and shows that Gallager's belief function (see Non-Patent Literature 10) can be achieved by a uniformly random regular LDPC code. However, when BP decoding is performed, it is unclear whether or not Gallager's belief function can be achieved by a uniformly random regular LDPC code.

As it happens, an LDPC-CC belongs to a convolutional code. Non-Patent Literature 11 and Non-Patent Literature 12 describe the belief function of the convolutional code and describe that the belief depends on a constraint length. Since the LDPC-CC is a convolutional code, it has a structure specific to a convolutional code in a parity check matrix, but when the time-varying period is increased, positions at which ones of the parity check matrix exist approximate to uniform randomness. However, since the LDPC-CC is a convolutional code, the parity check matrix has a structure specific to a convolutional code and the positions at which ones exist depend on the constraint length.

From these results, inference of inference #1 on a code design is provided in a regular TV-m-LDPC-CC that satisfies the condition of C#2.

Inference #1:

When BP decoding is used, if time-varying period m of a TV-m-LDPC-CC increases in a regular TV-m-LDPC-CC that satisfies the condition of C#2, uniform randomness is approximated for positions at which ones exist in the parity check matrix and a code of high error correction capability is obtained.

The method of realizing inference #1 will be discussed below.

[Feature of Regular TV-m-LDPC-CC]

A feature will be described that holds true when drawing a tree about expression 38 which is a #qth parity check polynomial that satisfies zero of a regular TV-m-LDPC-CC that satisfies the condition of C#2 having a coding rate of (n−1)/n, which will be treated in the present discussion.

Feature 2:

In a regular TV-m-LDPC-CC that satisfies the condition of C#2, when time-varying period m is a prime number, consider a case where C#3.1 holds true with attention focused on one of $X_1(D), \dots, X_{n-1}(D)$.

C#3.1: In parity check polynomial (38) that satisfies zero of a regular TV-m-LDPC-CC that satisfies the condition of C#2, $a_{\#q,p,i}$ modm≠$a_{\#q,p,j}$ modm holds true in $X_p(D)$ for ∀q (q=0, . . . , m−1), where i≠j.

In parity check polynomial (38) that satisfies zero of a regular TV-m-LDPC-CC that satisfies the condition of C#2, a case will be considered where a tree is drawn exclusively for variable nodes corresponding to $D^{a\#q,p,i}X_p(D)$ and $D^{a\#q,p,j}X_p(D)$ that satisfy C#3.1.

At this time, according to feature 1, there are check nodes corresponding to all #0 to #m−1 parity check polynomials for $^\forall$q in a tree whose starting point is a check node corresponding to a #qth parity check polynomial that satisfies zero of expression 38.

Similarly, when time-varying period m is a prime number in a regular TV-m-LDPC-CC that satisfies the condition of C#2, consider a case where C#3.2 holds true with attention focused on the term of P(D).

C#3.2: In parity check polynomial (38) that satisfies zero of a regular TV-m-LDPC-CC that satisfies the condition of C#2, $b_{\#q,i}$ modm≠$b_{\#q,j}$ modm holds true in P(D) for $^\forall$q, where i≠j.

In parity check polynomial (38) that satisfies zero of a regular TV-m-LDPC-CC that satisfies the condition of C#2, a case will be considered where a tree is drawn exclusively for variable nodes corresponding to $D^{b\#q,i}P(D)$ and $D^{b\#q,j}P(D)$ that satisfy C#3.2.

At this time, according to feature 1, there are check nodes corresponding to all #0 to #m−1 parity check polynomials for $^\forall$q in a tree whose starting point is a check node corresponding to a #qth parity check polynomial that satisfies zero of expression 38.

Example: In parity check polynomial (38) that satisfies zero of a regular TV-m-LDPC-CC that satisfies the condition of C#2, it is assumed that time-varying period m=7 (prime number) and ($b_{\#q,1}$, $b_{\#q,2}$)=(2, 0) holds true for $^\forall$q. Therefore, C#3.2 is satisfied.

Figure 17:
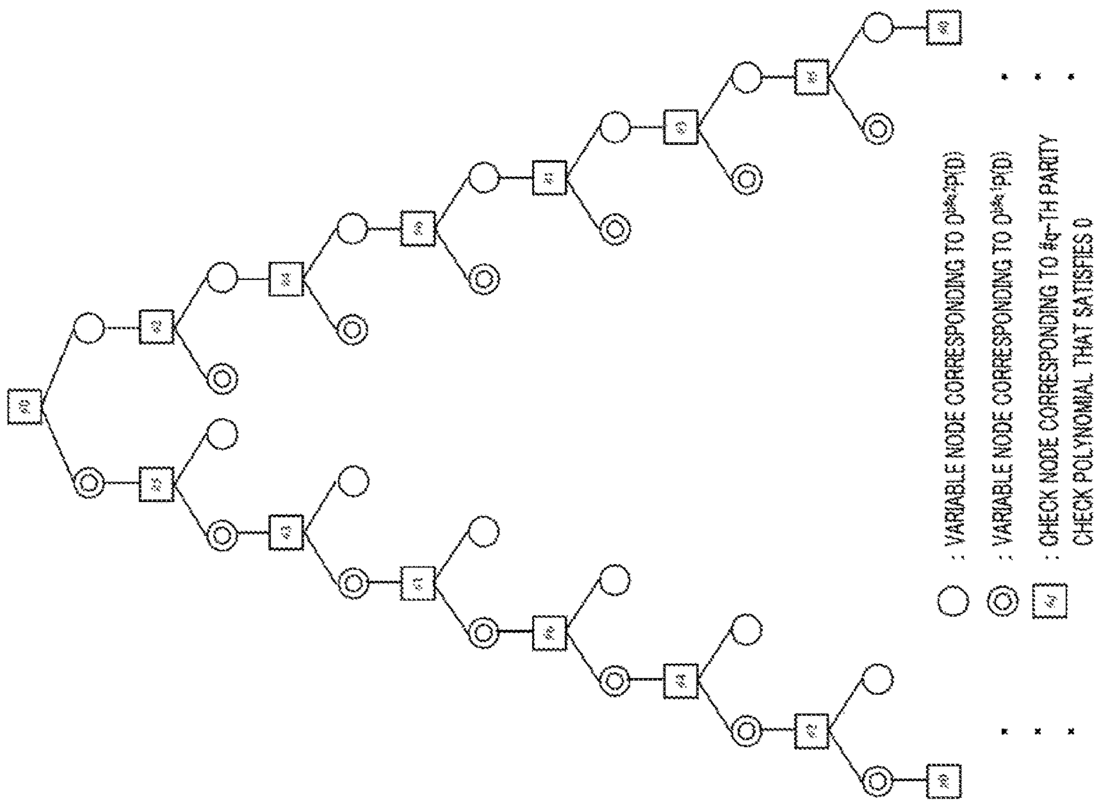
FIG. 17 shows an example of LDPC-CC tree having a time-varying period of seven.

When a tree is drawn exclusively for variable nodes corresponding to $D^{b\#q,1}P(D)$ and $D^{b\#q,2}P(D)$, a tree whose starting point is a check node corresponding to a #0th parity check polynomial that satisfies zero of expression 38 is represented as shown in FIG. 17. As is clear from FIG. 17, time-varying period m=7 satisfies feature 2.

Feature 3:

In a regular TV-m-LDPC-CC that satisfies the condition of C#2, when time-varying period m is not a prime number, consider a case where C#4.1 holds true with attention focused on one of $X_1(D), \ldots, X_{n-1}(D)$.

C#4.1: In parity check polynomial (38) that satisfies zero of a regular TV-m-LDPC-CC that satisfies the condition of C#2, when $a_{\#q,p,i}$ modm≥$a_{\#q,p,j}$ modm in $X_p(D)$ for $^\forall$q, |$a_{\#q,p,i}$ modm-$a_{\#q,p,j}$ modm| is a divisor other than one of m, where i≠j.

In parity check polynomial (38) that satisfies zero of the regular TV-m-LDPC-CC that satisfies the condition of C#2, a case will be considered where a tree is drawn exclusively for variable nodes corresponding to $D^{a\#q,p,i}X_p(D)$ and $D^{a\#q,p,j}X_p(D)$ that satisfy C#4.1. At this time, according to feature 1, in the tree whose starting point corresponds to the #q-th parity check polynomial that satisfies zero of expression 38, there is no check node corresponding to all #0 to #m−1 parity check polynomials for $^\forall$q.

Similarly, in the regular TV-m-LDPC-CC that satisfies the condition of C#2, consider a case where C#4.2 holds true when time-varying period m is not a prime number with attention focused on the term of P(D).

C#4.2: In parity check polynomial (38) that satisfies zero of the regular TV-m-LDPC-CC that satisfies the condition of C#2, when $b_{\#q,i}$ modm≥$b_{\#q,j}$ modm in P(D) for $^\forall$q, |$b_{\#q,i}$ modm−$b_{\#q,j}$ modm| is a divisor other than one of m, where i≠j.

In parity check polynomial (38) that satisfies zero of the regular TV-m-LDPC-CC that satisfies the condition of C#2, a case will be considered where a tree is drawn exclusively for variable nodes corresponding to $D^{b\#q,i}P(D)$ and $D^{b\#q,j}P(D)$ that satisfy C#4.2. At this time, according to feature 1, in the tree whose starting point is a check node corresponds to the #qth parity check polynomial that satisfies zero of expression 38, there are not all check nodes corresponding to #0 to #m−1 parity check polynomials for $^\forall$q.

Example: In parity check polynomial (38) that satisfies zero of the regular TV-m-LDPC-CC that satisfies the condition of C#2, it is assumed that time-varying period m=6 (not a prime number) and ($b_{\#q,1}$, $b_{\#q,2}$)=(3, 0) holds true for $^\forall$q. Therefore, C#4.2 is satisfied.

Figure 18:
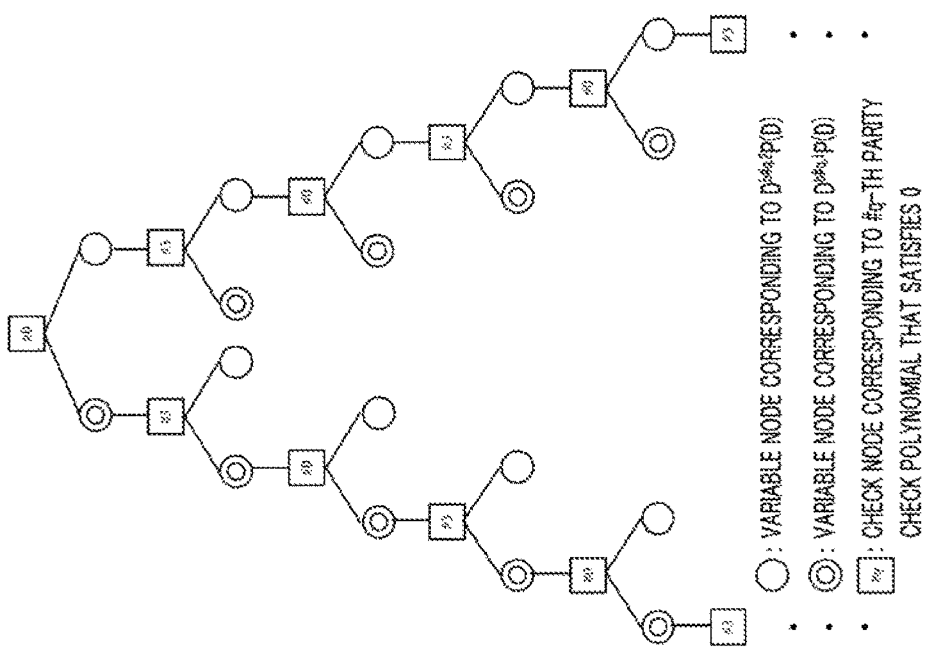
FIG. 18 shows an example of LDPC-CC tree having a time-varying period of h as a time-varying period of six.

When a tree is drawn exclusively for variable nodes $D^{b\#q,1}P(D)$ and $D^{b\#q,2}P(D)$, a tree whose starting point is a check node corresponding to #0th parity check polynomial that satisfies zero of expression 38 is represented as shown in FIG. 18. As is clear from FIG. 18, time-varying period m=6 satisfies feature 3.

Next, in the regular TV-m-LDPC-CC that satisfies the condition of C#2, a feature will be described which particularly relates to when time-varying period m is an even number.

Feature 4:

In the regular TV-m-LDPC-CC that satisfies the condition of C#2, when time-varying period m is an even number, consider a case where C#5.1 holds true with attention focused on one of $X_1(D), \ldots, X_{n-1}(D)$.

C#5.1: In parity check polynomial (82) that satisfies zero of the regular TV-m-LDPC-CC that satisfies the condition of C#2, when $a_{\#q,p,i}$ modm≥$a_{\#q,p,j}$ modm in $X_p(D)$ for $^\forall$q, |$a_{\#q,p,i}$ modm-$a_{\#q,p,j}$ modm| is an even number, where i≠j.

In parity check polynomial (38) that satisfies zero of the regular TV-m-LDPC-CC that satisfies the condition of C#2, a case will be considered where a tree is drawn exclusively for variable nodes corresponding to $D^{a\#q,p,i}X_p(D)$ and $D^{a\#q,p,j}X_p(D)$ that satisfy C#5.1. At this time, according to feature 1, when q is an odd number, there are only check nodes corresponding to odd-numbered parity check polynomials in a tree whose starting point is a check node corresponding to the #qth parity check polynomial that satisfies zero of expression 38. On the other hand, when q is an even number, there are only check nodes corresponding to even-numbered parity check polynomials in a tree whose starting point is a check node corresponding to the #q-th parity check polynomial that satisfies zero of expression 38.

Similarly, in the regular TV-m-LDPC-CC that satisfies the condition of C#2, when time-varying period m is an even number, consider a case where C#5.2 holds true with attention focused on the term of P(D).

C#5.2: In parity check polynomial (38) that satisfies zero of the regular TV-m-LDPC-CC that satisfies the condition of C#2, when $b_{\#q,i}$ modm≥$b_{\#q,j}$ modm in P(D) for $^\forall$q, |$b_{\#q,i}$ modm−$b_{\#q,j}$ modM is an even number, where i≠j.

In parity check polynomial (38) that satisfies zero of the regular TV-m-LDPC-CC that satisfies the condition of C#2, a case will be considered where a tree is drawn exclusively for variable nodes corresponding to $D^{b\#q,i}P(D)$ and $D^{b\#q,j}P(D)$ that satisfy C#5.2. At this time, according to feature 1, when q is an odd number, only check nodes corresponding to odd-numbered parity check polynomials are present in a tree whose starting point is a check node corresponding to the #qth parity check polynomial that satisfies zero of expression 38. On the other hand, when q is an even number, only check nodes corresponding to even-numbered parity check polynomials are present in a tree whose starting point is a check node corresponding to the #qth parity check polynomial that satisfies zero of expression 38.

[Design Method of Regular TV-m-LDPC-CC]

A design policy will be considered for providing high error correction capability in the regular TV-m-LDPC-CC that satisfies the condition of C#2. Here, a case of C#6.1, C#6.2, or the like will be considered.

C#6.1: In parity check polynomial (82) that satisfies zero of the regular TV-m-LDPC-CC that satisfies the condition of C#2, a case will be considered where a tree is drawn exclusively for variable nodes corresponding to $D^{a\#q,p,i}X_p(D)$ and $D^{a\#q,p,j}X_p(D)$ (where i≠j). At this time, all check nodes corresponding to #0 to #m−1 parity check polynomials for $^{\forall}$q are not present in a tree whose starting point is a check node corresponding to the #qth parity check polynomial that satisfies zero of expression 38.

C#6.2: In parity check polynomial (38) that satisfies zero of the regular TV-m-LDPC-CC that satisfies the condition of C#2, a case will be considered where a tree is drawn exclusively for variable nodes corresponding to $D^{b\#q,i}P(D)$ and $D^{b\#q,j}P(D)$ (where i≠j). At this time, all check nodes corresponding to #0 to #m−1 parity check polynomials for $^{\forall}$q are not present in a tree whose starting point is a check node corresponding to the #qth parity check polynomial that satisfies zero of expression 38.

In such cases as C#6.1 and C#6.2, since all check nodes corresponding to #0 to #m−1 parity check polynomials for $^{\forall}$q are not present, the effect in inference #1 when the time-varying period is increased is not obtained. Therefore, with the above description taken into consideration, the following design policy is given to provide high error correction capability.

[Design Policy]: In the Regular TV-m-LDPC-CC that Satisfies the Condition of C#2, a Condition of C#7.1 is Provided with Attention Focused on One of $X_1(D), \ldots, X_{n-1}(D)$.

C#7.1: A case will be considered where a tree is drawn exclusively for variable nodes corresponding to $D^{a\#q,p,i}X_p(D)$ and $D^{a\#q,p,j}X_p(D)$ in parity check polynomial (38) that satisfies zero of a regular TV-m-LDPC-CC that satisfies the condition of C#2 (where i≠j). At this time, check nodes corresponding to all #0 to #m−1 parity check polynomials are present in a tree whose starting point is a check node corresponding to the #qth parity check polynomial that satisfies zero of expression 38 for $^{\forall}$q.

Similarly, in the regular TV-m-LDPC-CC that satisfies the condition of C#2, the condition of C#7.2 is provided with attention focused on the term of P(D).

C#7.2: In parity check polynomial (38) that satisfies zero of the regular TV-m-LDPC-CC that satisfies the condition of C#2, a case will be considered where a tree is drawn exclusively for variable nodes corresponding to $D^{b\#q,i}P(D)$ and $D^{b\#q,j}P(D)$ (where i≠j). At this time, check nodes corresponding to all #0 to #m−1 parity check polynomials are present in a tree whose starting point is a check node corresponding to the #qth parity check polynomial that satisfies zero of expression 38 for $^{\forall}$q.

In the present design policy, it is assumed that C#7.1 holds true for $^{\forall}$(i, j) and also holds true for $^{\forall}$p, and C#7.2 holds true for $^{\forall}$(i, j).

Inference #1 is then satisfied.

Next, a theorem relating to the design policy will be described.

Theorem 2: Satisfying the design policy requires $a_{\#q,p,i}$ modm≠$a_{\#q,p,j}$ modm and $b_{\#q,i}$ modm≠$b_{\#q,j}$ modm to be satisfied, where i≠j.

Proof: When a tree is drawn exclusively for variable nodes corresponding to $D^{a\#q,p,i}X_p(D)$ and $D^{a\#q,p,j}X_p(D)$ in expression 38 of the parity check polynomial that satisfies zero of the regular TV-m-LDPC-CC that satisfies the condition of C#2, if theorem 2 is satisfied, check nodes corresponding to all #0 to #m−1 parity check polynomials are present in a tree whose starting point is a check node corresponding to the #qth parity check polynomial that satisfies zero of expression 38. This holds true for all p.

Similarly, when a tree is drawn exclusively for variable nodes corresponding to $D^{b\#q,i}P(D)$ and $D^{b\#q,j}P(D)$ in expression 38 of the parity check polynomial that satisfies zero of the regular TV-m-LDPC-CC that satisfies the condition of C#2, if theorem 2 is satisfied, check nodes corresponding to all #0 to #m−1 parity check polynomials are present in a tree whose starting point is a check node corresponding to the #qth parity check polynomial that satisfies zero of expression 38.

Therefore, theorem 2 is proven.

□ (end of proof)

Theorem 3: In the regular TV-m-LDPC-CC that satisfies the condition of C#2, when time-varying period m is an even number, there is no code that satisfies the design policy.

Proof: In parity check polynomial (38) that satisfies zero of the regular TV-m-LDPC-CC that satisfies the condition of C#2, when p=1, if it is possible to prove that the design policy is not satisfied, this means that theorem 3 has been proven. Therefore, the proof is continued assuming p=1.

In the regular TV-m-LDPC-CC that satisfies the condition of C#2, $(N_{p,1}, N_{p,2}, N_{p,3})$=(o, o, o)∪(o, o, e)∪(o, e, e)∪(e, e, e) can represent all cases. Here, o represents an odd number and e represents an even number. Therefore, $(N_{p,1}, N_{p,2}, N_{p,3})$=(o, o, o)∪(o, o, e)∪(o, e, e)∪(e, e, e) shows that C#7.1 is not satisfied. U represents a union.

When $(Np,_1, Np,_2, Np,_3)$=(o, o, o), C#5.1 is satisfied so that i, j=1, 2, 3 (i≠j) is satisfied in C#5.1 no matter what the value of the set of (i, j) may be.

When $(Np,_1, Np,_2, Np,_3)$=(o, o, e), C#5.1 is satisfied when (i, j)=(1, 2) in C#5.1.

When $(Np,_1, Np,_2, Np,_3)$=(o, e, e), C#5.1 is satisfied when (i, j)=(2, 3) in C#5.1.

When $(Np,_1, Np,_2, Np,_3)$=(e, e, e), C#5.1 is satisfied so that i, j=1, 2, 3 (i≠j) is satisfied in C#5.1 no matter what the value of the set of (i, j) may be.

Therefore, when $(Np,_1, Np,_2, Np,_3)$=(o, o, o)∪(o, o, e)∪(o, e, e)∪(e, e, e), there are always sets of (i, j) that satisfy C#5.1. Thus, theorem 3 has been proven according to feature 4.

□ (end of proof)

Therefore, to satisfy the design policy, time-varying period m must be an odd number. Furthermore, to satisfy the design policy, the following conditions are effective according to feature 2 and feature 3.

Time-varying period m is a prime number.

Time-varying period m is an odd number and the number of divisors of m is small.

Especially, when the condition that time-varying period m is an odd number and the number of divisors of m is small is taken into consideration, the following cases can be considered as examples of conditions under which codes of high error correction capability are likely to be achieved: (Note that the following cases are mere examples, and codes of high error correction capability may be achieved under other conditions.)

(1) The time-varying period m is assumed to be α×β, where α and β are odd numbers other than one and are prime numbers.

(2) The time-varying period m is assumed to be $\alpha^n$, where α is an odd number other than one and is a prime number, and n is an integer no smaller than two.

(3) The time-varying period m is assumed to be α×β×γ, where α, β, and γ are odd numbers other than one and are prime numbers.

However, when z mod m (z is an integer no smaller than zero) is computed, there are m values that can be taken, and therefore the number of values taken when z mod m is computed increases as m increases. Therefore, when m is increased, it is easier to satisfy the above-described design policy. However, when time-varying period m is assumed to be an even number, this does not mean that a code having high error correction capability cannot be obtained.

The following describes tail-biting in an LDPC-CC. An LDPC-CC based on parity check polynomials described in Non-Patent Literature 13 is described first, as an example.

A time-varying LDPC-CC having a coding rate of R=(n−1)/n based on parity check polynomials is described below. At time j, the information bits $X_1, X_2, \ldots, X_{n-1}$ and the parity bit P are respectively represented as $X_{1,j}, X_{2,j}, \ldots, X_{n-1,j}$ and $P_j$. Thus, vector $u_j$ at time j is expressed as $u_j=(X_{1,j}, X_{2,j}, \ldots, X_{n-1,j}, P_j)$. Also, the encoded sequence is expressed as $u=(u_0, u_1, \ldots, u_j, \ldots)^T$. Given a delay operator D, the polynomial of the information bits $X_1, X_2, \ldots, X_{n-1}$ is expressed as $X_1(D), X_2(D), \ldots, X_{n-1}(D)$, and the polynomial of the parity bit P is expressed as P(D). Thus, a parity check polynomial satisfying zero is expressed by expression 39.

[Math. 39]

$$(D^{a1,1}+D^{a1,2}+\ldots+D^{a1,r1}+1)X_1(D)+(D^{a2,3}+D^{a2,2}+\ldots+D^{a2,r2}+1)X_2(D)+\ldots+(D^{an-1,1}+D^{an-1,2}+\ldots+D^{an-1,rn-1}+1)X_{n-1}(D)+(D^{b1}+D^{b2}+\ldots+D^{b\varepsilon}+1)P(D)=0 \quad (39)$$

In expression 39, $a_{p,q}$ (p=1, 2, . . . , n−1; q=1, 2, . . . , $r_p$) and $b_s$ (s=1, 2, . . . , ε) are natural numbers. Also, for $^\forall$(y, z) where y, z=1, 2, . . . , r, y≠z, $a_{p,y}\neq a_{p,z}$ holds. Also, for $^\forall$(y, z) where y, z=1, 2, . . . , ε, y≠z, $b_y\neq b_z$ holds.

In order to create an LDPC-CC having a time-varying period of m and a coding rate of R=(n−1)/n, a parity check polynomial that satisfies zero based on expression 39 is prepared. A parity check polynomial that satisfies zero for the ith (i=0, 1, . . . , m−1) is expressed as follows in expression 40.

[Math. 40]

$$A_{X1,i}(D)X_1(D)+A_{X2,i}(D)X_2(D)+\ldots+A_{Xn-1,i}(D)X_{n-1}(D)+B_i(D)P(D)=0 \quad (40)$$

In expression 40, the maximum degrees of D in $A_{X\delta,i}(D)$ (δ=1, 2, . . . , n−1) and $B_i(D)$ are, respectively, $\Gamma_{X\delta,i}$ and $\Gamma_{P,i}$. The maximum values of $\Gamma_{X\delta,i}$ and $\Gamma_{P,i}$ are $\Gamma_i$. The maximum value of $\Gamma_i$ (i=0, 1, . . . , m−1) is Γ. Taking the encoded sequence u into consideration and using Γ, vector $h_i$ corresponding to the ith parity check polynomial is expressed as follows in expression 41.

[Math. 41]

$$h_i=[h_{i,\Gamma}, h_{i,\Gamma-1}, \ldots, h_{i,1}, h_{i,0}] \quad (41)$$

In expression 41, $h_{i,v}$ (v=0, 1, . . . , Γ) is a 1×n vector expressed as $[\alpha_{i,v,X1}, \alpha_{i,v,X2}, \ldots, \alpha_{i,v,Xn-1}, \beta_{i,v}]$. This is because, for the parity check polynomial of expression 41, $\alpha_{i,v,Xw}D^vX_w(D)$ and $\beta_{i,v}D^vP(D)$ (w=1, 2, . . . , n−1, and $\alpha_{i,v,Xw}, \beta_{i,v}\in[0,1]$). In such cases, the parity check polynomial that satisfies zero for expression 41 has terms $D^0X_1(D)$, $D^0X_2(D)$, . . . , $D^0X_{n-1}(D)$ and $D^0P(D)$, thus satisfying expression 42.

[Math. 42]

$$h_{i,0}=[\underbrace{1 \ \ldots \ 1}_{n}] \quad (42)$$

Using expression 42, the check matrix of the LDPC-CC based on the parity check polynomial having a time-varying period of m and a coding rate of R=(n−1)/n is expressed as follows in expression 43.

[Math. 43]

$$H=\begin{bmatrix} \ddots & & & & & & & \ddots & & & & \\ & h_{0,\Gamma} & h_{0,\Gamma-1} & \cdots & \cdots & \cdots & \cdots & h_{0,0} & & & & \\ & & h_{1,\Gamma} & \cdots & \cdots & \cdots & \cdots & h_{1,1} & h_{1,0} & & & \\ & & & \ddots & & & & & & \ddots & & \\ & & & & h_{m-1,\Gamma} & h_{m-1,\Gamma-1} & \cdots & \cdots & \cdots & h_{m-1,0} & & \\ & & & & & h_{0,\Gamma} & \cdots & \cdots & \cdots & h_{0,1} & h_{0,0} & \\ & & & & & & \ddots & & & & & \ddots \\ & & & & & & & h_{m-1,\Gamma} & \cdots & \cdots & \cdots & h_{m-1,0} \\ & & & & & & & \ddots & & & & \ddots \end{bmatrix} \quad (43)$$

In expression 43, Λ(k)=Λ(k+m) is satisfied for $^\forall$k. Here, Λ(k) corresponds to $h_i$ at the kth row of the parity check matrix.

Although expression 39 is handled, above, as a parity check polynomial serving as a base, no limitation to the format of expression 39 is intended. For example, instead of expression 39, a parity check polynomial satisfying zero for expression 44 may be used.

[Math. 44]

$$(D^{a1,1}+D^{a1,2}+\ldots+D^{a1,r1})X_1(D)+(D^{a2,1}+D^{a2,2}+\ldots+D^{a2,r2})X_2(D)+\ldots+(D^{an-1,1}+D^{an-1,2}+\ldots+D^{an-1,rn-1})X_{n-1}(D)+(D^{b1}+D^{b2}+\ldots+D^{b\varepsilon})P(D)=0 \quad (44)$$

In expression 44, $a_{p,q}$ (p=1, 2, . . . , n−1; q=1, 2, . . . , $r_p$) and $b_s$ (s=1, 2, . . . , δ) are natural numbers. Also, for $^\forall$(y, z) where y, z=1, 2, . . . , $r_p$, y≠z, $a_{p,y}\neq a_{p,z}$ holds. Also, for $^\forall$(y, z) where y, z=1, 2, . . . , ε, y≠z, $b_y\neq b_z$ holds.

The following describes a tail-biting scheme for the present embodiment, using time-varying LDPC-CC based on the above-described parity check polynomial.

[Tail-Biting Scheme]

For the LDPC-CC based on the above-discussed parity check polynomials, the gth (g=0, 1, . . . , q−1) that satisfies zero for a time-varying period of q is expressed below as a parity check polynomial (see expression 40) of expression 45.

[Math. 45]

$$(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D)+(D^{b\#g,1}+D^{b\#g,2}+1)P(D)=0 \quad (45)$$

Let $a_{\#g,p,1}$ and $a_{\#g,p,2}$ be natural numbers, and let $a_{\#g,p,1}\neq a_{\#g,p,2}$ hold true. Furthermore, let $b_{\#g,1}$ and $b_{\#g,2}$ be natural numbers, and let $b_{\#g,1}\neq b_{\#g,2}$ hold true (g=0, 1, 2, . . . , q−1; p=1, 2, . . . , n−1). For simplicity, the quantity of terms $X_1(D)$, $X_2(D)$, . . . $X_{n-1}(D)$ and P(D) is three.

Assuming a sub-matrix (vector) in a parity check matrix to be $H_g$, a gth sub-matrix can be represented as expression 46, shown below.

[Math. 46]

$$H_g=\left\{H'_g,\ \underbrace{11\ \ldots\ 1}_{n}\right\} \quad (46)$$

In expression 46, the n consecutive ones correspond to the terms $X_1(D)$, $X_2(D)$, $X_{n-1}(D)$ and P(D) in each form of expression 45.

Figure 19:
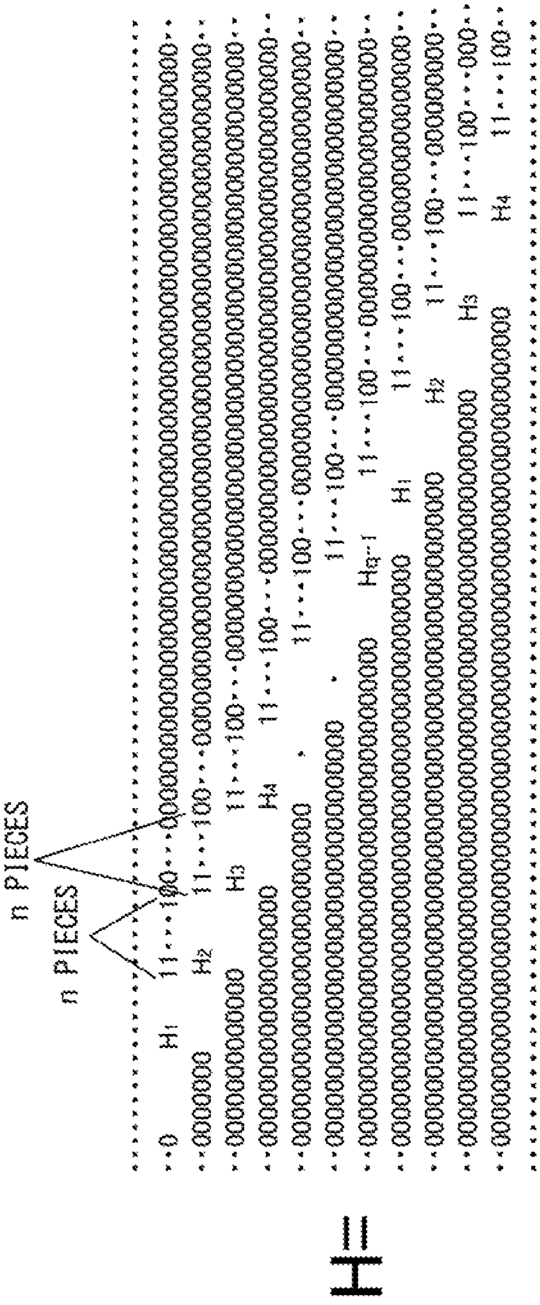
FIG. 19 shows an example of LDPC-CC check matrix.

Here, parity check matrix H can be represented as shown in FIG. 19. As shown in FIG. 19, a configuration is employed in which a sub-matrix is shifted n columns to the right between an ith row and (i+1)th row in parity check matrix H (see FIG. 19). In addition, a sub-matrix is shifted n columns to the right between an (i+1)th row and ith row in parity check matrix H. Thus, the data at time k for information $X_1, X_2, \ldots, X_{n-1}$ and parity P are respectively given as $X_{1,k}, X_{2,k}, \ldots, X_{n-1,k}$, and $P_k$. When transmission vector u is given as $u=(X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, Hu=0 holds true. (Here, the zero in Hu=0 indicates that vector Hu is a (column) vector all elements of which are zeroes.)

In Non-Patent Literature 14, a check matrix is described for when tail-biting is employed. The parity check matrix is given as follows.

In expression 47, H is the check matrix and $H^T$ is the syndrome former. Also, $H^T_i(t)$ (i=0, 1, . . . , $M_s$) is a c×(c−b) sub-matrix, and $M_s$ is the memory size.

FIG. 19 and expression 47 show that, for the LDPC-CC having a coding rate of (n−1)/n and a time-varying period of q that is based on the parity check polynomial, the parity check matrix H required for decoding that obtains greater error-correction capability strongly prefers the following conditions.

<Condition #1>

The number of rows in the parity check matrix is a multiple of q.

Accordingly, the number of columns in the parity check matrix is a multiple of n×q. Here, the (for example) log-likelihood ratio needed upon decoding is the log-likelihood ratio of the bit portion that is a multiple of n×q.

Here, the parity check polynomial that satisfies zero for the LDPC-CC having a coding rate of (n−1)/n and a time-varying period of q required by Condition #1 is not limited to that of expression 45, but may also be the time-varying LDPC-CC based on expression 39 or 44.

Incidentally, for the parity check polynomial, when there is only one parity term P(D), expression 47 is expressible as expression 48.

[Math. 48]

$$(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D)+P(D)=0 \quad (48)$$

Such a time-varying period LDPC-CC is a type of feed-forward convolutional code. Thus, a coding scheme given by Non-Patent Literature 15 or Non-Patent Literature 16 can be applied as the coding scheme used when tail-biting is used. The procedure is as shown below.

<Procedure 1>

For example, the time-varying LDPC-CC defined by expression 48 has a term P(D) expressed as follows.

[Math. 49]

$$P(D)=(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D) \quad (49)$$

Then, expression 49 is represented as follows.

[Math. 50]

$$P[i]=X_1[i]\oplus X_1[i-a_{\#g,1,1}]\oplus X_1[i-a_{\#g,1,2}]\oplus X_2[i]\oplus X_2[i-a_{\#g,2,1}]\oplus X_2[i-a_{\#g,2,2}]\oplus\ \ldots\ \oplus X_{n-1}[i]\oplus X_{n-1}[i-a_{\#g,n-1,1}]\oplus X_{n-1}[i-a_{\#g,n-1,2}] \quad (50)$$

where ⊕ represents the exclusive OR operator.

Accordingly, at time i, when (i−1)%q=k (% represents the modulo operator), parity is calculated in expression 49 and

[Math. 47]

$$H^T=\begin{bmatrix} H_0^T & H_t^T(1) & \ldots & H_{Ms}^T(M_s) & 0 & & \ldots & & 0 \\ 0 & H_0^T(1) & \ldots & H_{Ms-1}^T(M_s) & H_{Ms}^T(M_s+1) & 0 & \ldots & & 0 \\ & \ddots & & & \ddots & & & \ddots & \\ H_{Ms}^T(N) & 0 & & \ldots & & & & H_{Ms-2}^T(N-2) & H_{Ms-1}^T(N-1) \\ H_{Ms-1}^T(N) & H_{Ms}^T(N+1) & 0 & & & & & H_{Ms-3}^T(N-2) & H_{Ms-2}^T(N-1) \\ \vdots & & & & \ldots & & & \vdots & \vdots \\ H_1^T(N) & H_2^T(N+1) & \ldots & 0 & & \ldots & & 0 & H_0^T(N-1) \end{bmatrix} \quad (47)$$

expression 50 at time i when g=k. The registers are initialized to values of zero. That is, using expression 49, when (i−1)%q=k at time i (i=1, 2, . . . ), then in expression 49, the parity at time i is calculated for g=k. In expression 49, for terms $X_1[z]$, $X_2[z]$, . . . , $X_{n-1}[z]$ and P[z], any term for which z is less than one is taken as a zero and expression 49 is used for coding. Calculations proceed up to the final parity bit. The state of each register of the encoder at this time is stored.

<Procedure 2>

Coding is performed a second time from time i=1 from the state of the registers stored during Procedure 1 (that is, for terms $X_1$ [z], $X_2[z]$, . . . , $X_{n-1}[Z]$, and P[z] of expression 49, the values obtained using Procedure 1 are used where z is less than one) and parity is calculated.

The parity bit and information bits obtained at this time constitute an encoded sequence when tail-biting is performed.

However, upon comparison of feed-forward LDPC-CCs and feedback LDPC-CCs under conditions of having the same coding rate and substantially similar constraint lengths, the feedback LDPC-CCs have a stronger tendency to exhibit strong error-correction capability but present difficulties in calculating the encoded sequence (i.e., calculating the parity). The following presents a new tail-biting scheme as a solution to this problem, enabling simple encoded sequence (parity) calculation.

First, a parity check matrix for performing tail-biting with an LDPC-CC based on a parity check polynomial is described.

For example, for the LDPC-CC based on the parity check polynomial having a time-varying period of q and a coding rate of (n−1)/n as defined by expression 45, the information terms $X_1, X_2, \ldots, X_{n-1}$ and the parity term P are represented at time i as $X_{1,i}, X_{2,i}, \ldots, X_{n-1,i}$, and $P_1$. Then, in order to satisfy Condition #1, tail-biting is performed such that i=1, 2, 3, . . . , q, . . . , q×N−q+1, q×N−q+2, q×N−q+3, q×N.

Here, N is a natural number, the transmission sequence u is $u=(X_{1,1}, X_{2,1}, \ldots, X_{n-1,1}, P_0, X_{1,2}, X_{2,2}, \ldots, X_{n-1,2}, P_2, \ldots, X_{1,k}, X_{2,k}, \ldots, X_{n-1,k}, P_k, \ldots, X_{1,q\times N}, X_{2,q\times N}, \ldots, X_{n-1,q\times N}, P_{q\times N})^T$, and Hu=0 all hold true. (Here, the zero in Hu=0 indicates that vector Hu is a (column) vector all elements of which are zeroes.)

Figure 20:
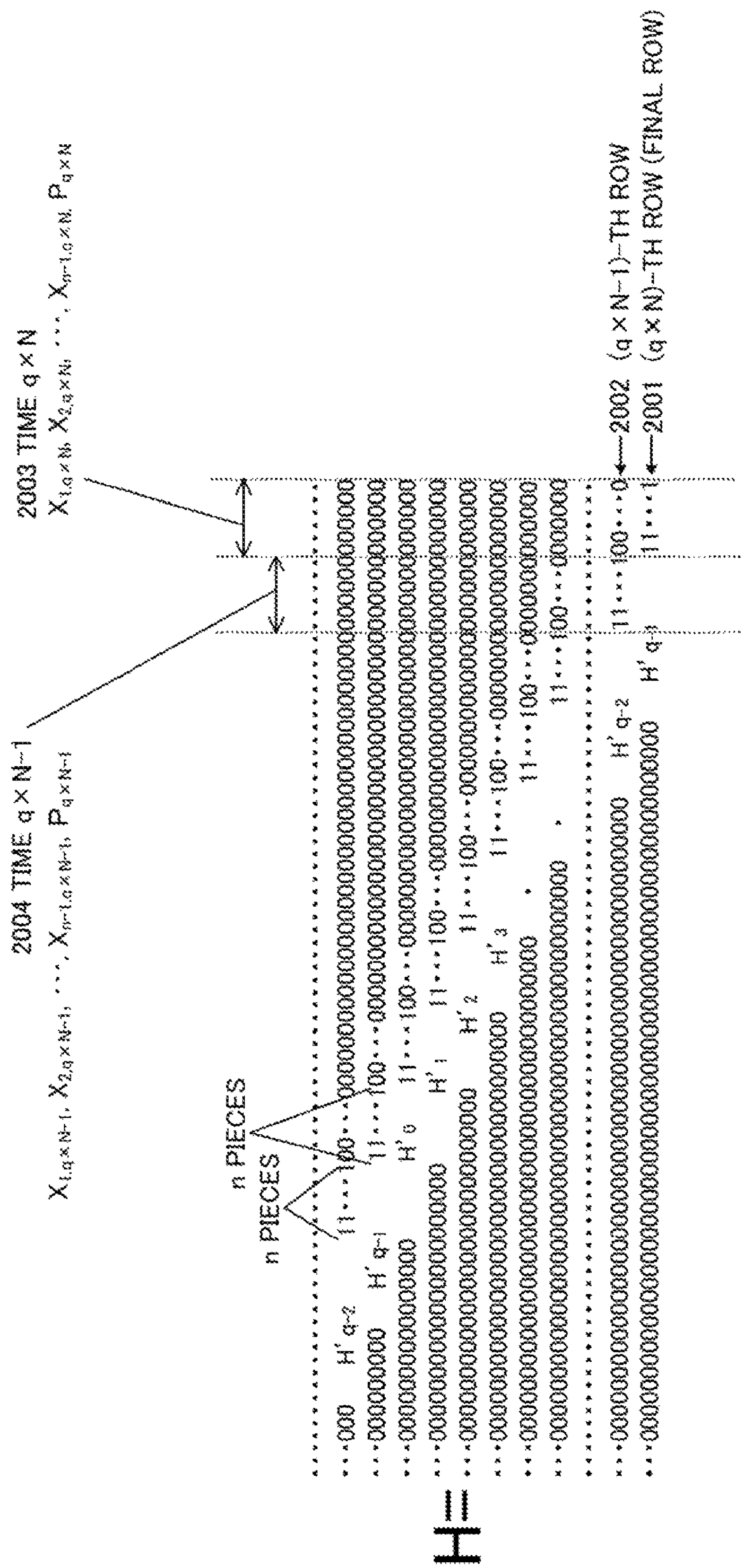
FIG. 20 shows an example of the configuration of check matrix when tail-biting is performed.
Figure 21:
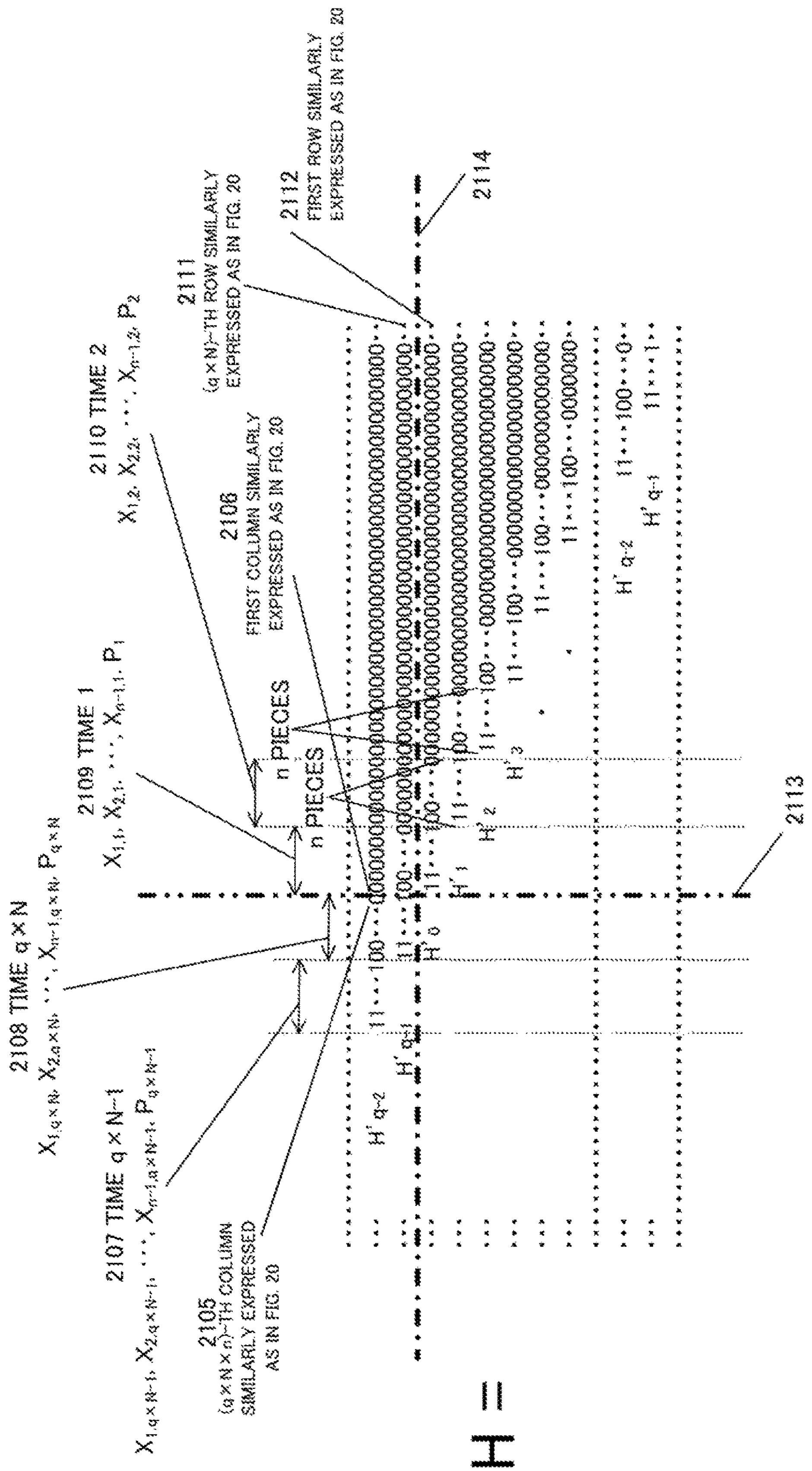
FIG. 21 shows an example of the configuration of check matrix when tail-biting is performed.

The configuration of the parity check matrix is described using FIGS. 20 and 21.

Assuming a sub-matrix (vector) in expression 45 to be Hg, a gth sub-matrix can be represented as expression 51, shown below.

[Math 51]

$$H_g = \left\{H'_g, \underbrace{11 \ldots 1}_{n}\right\} \tag{51}$$

In expression 51, the n consecutive ones correspond to the terms $X_1(D)$, $X_2(D)$, $X_{n-1}(D)$, and P(D) in each form of expression 45.

Among the parity check matrix corresponding to the transmission sequence u defined above, the parity check matrix in the vicinity of time q×N are represented by FIG. 20. As shown in FIG. 20, a configuration is employed in which a sub-matrix is shifted n columns to the right between an ith row and (i+1)th row in parity check matrix H (see FIG. 20).

Also, in FIG. 20, the q×Nth (i.e., the last) row of the parity check matrix has reference sign 2001, and corresponds to the (q−1)th parity check polynomial that satisfies zero in order to satisfy Condition #1. The q×N−1th row of the parity check matrix has reference sign 2002, and corresponds to the (q−2)th parity check polynomial that satisfies zero in order to satisfy Condition #1. Reference sign 2003 represents a column group corresponding to time q×N. Column group 2003 is arranged in the order $X_{1,q\times N}, X_{2,q\times N}, \ldots, X_{n-1,q\times N}, P_{q\times N}$. Reference sign 2004 represents a column group corresponding to time q×N−1. Column group 2004 is arranged in the order $X_{1,q\times N-1}, X_{2,q\times N-1}, \ldots, X_{n-1,q\times N-1}, P_{q\times N-1}$.

Next, by reordering the transmission sequence, the parity check matrix corresponding to $u=(\ldots, X_{1,q\times N-1}, X_{2,q\times N-1}, \ldots, X_{n-1,q\times N-1}, P_{q\times N-1}, X_{1,q\times N}, X_{2,q\times N}, \ldots, X_{n-1,q\times N}, P_{q\times N}, X_{1,0}, X_{2,1}, \ldots, X_{n-1,1}, P_1, X_{1,2}, X_{2,2}, \ldots, X_{n-1,2}, P_2, \ldots)^T$ in the vicinity of times q×N—1, q×N, 1, 2 is the parity check matrix shown in FIG. 21. Here, the parity check matrix portion shown in FIG. 21 is a characteristic portion when tail-biting is performed. The configuration thereof is identical to the configuration shown in expression 47. As shown in FIG. 21, a configuration is employed in which a sub-matrix is shifted n columns to the right between an ith row and (i+1)th row in parity check matrix H (see FIG. 21).

Also, in FIG. 21, when expressed as a parity check matrix like that of FIG. 20, reference sign 2105 corresponds to the (q×N×n)th column and, when similarly expressed as a parity check matrix like that of FIG. 20, reference sign 2106 corresponds to the first column.

Reference sign 2107 represents a column group corresponding to time q×N−1. Column group 2107 is arranged in the order $X_{1,q\times N-1}, X_{2,q\times N-1}, \ldots, X_{n-1,q\times N-1}, P_{q\times N-1}$. Reference sign 2108 represents a column group corresponding to time q×N. Column group 2108 is arranged in the order $X_{1,q\times N}, X_{2,q\times N}, \ldots, X_{n-1,q\times N}$, Pq×N. Reference sign 2109 represents a column group corresponding to time 1. Column group 2109 is arranged in the order $X_{1,1}, X_{2,1}, \ldots, X_{n-1,1}, P_1$. Reference sign 2110 represents a column group corresponding to time 2. Column group 2110 is arranged in the order $X_{1,2}, X_{2,2}, \ldots, X_{n-1,2}, P_2$.

When expressed as a parity check matrix like that of FIG. 20, reference sign 2111 corresponds to the (q×N)th row, and when similarly expressed as a parity check matrix like that of FIG. 20, reference sign 2112 corresponds to the first row.

In FIG. 21, the characteristic portion of the parity check matrix on which tail-biting is performed is the portion left of reference sign 2113 and below reference sign 2114 (See also expression 47).

When expressed as a parity check matrix like that of FIG. 20, and when Condition #1 is satisfied, the rows begin with a row corresponding to a parity check polynomial that satisfies a zeroth zero, and the rows end with a parity check polynomial that satisfies a (q−1)th zero. This point is critical for obtaining better error-correction capability. In practice, the time-varying LDPC-CC is designed such that the code thereof produces a small number of cycles of length each being of a short length on a Tanner graph. As the description of FIG. 21 makes clear, in order to ensure a small number of cycles of length each being of a short length on a Tanner graph when tail-biting is performed, maintaining conditions like those of FIG. 21, i.e., maintaining Condition #1, is critical.

However, in a communication system, when tail-biting is performed, circumstances occasionally arise in which some shenanigans are required in order to satisfy Condition #1 for the block length (or information length) requested by the system. This point is explained by way of example.

Figure 22:
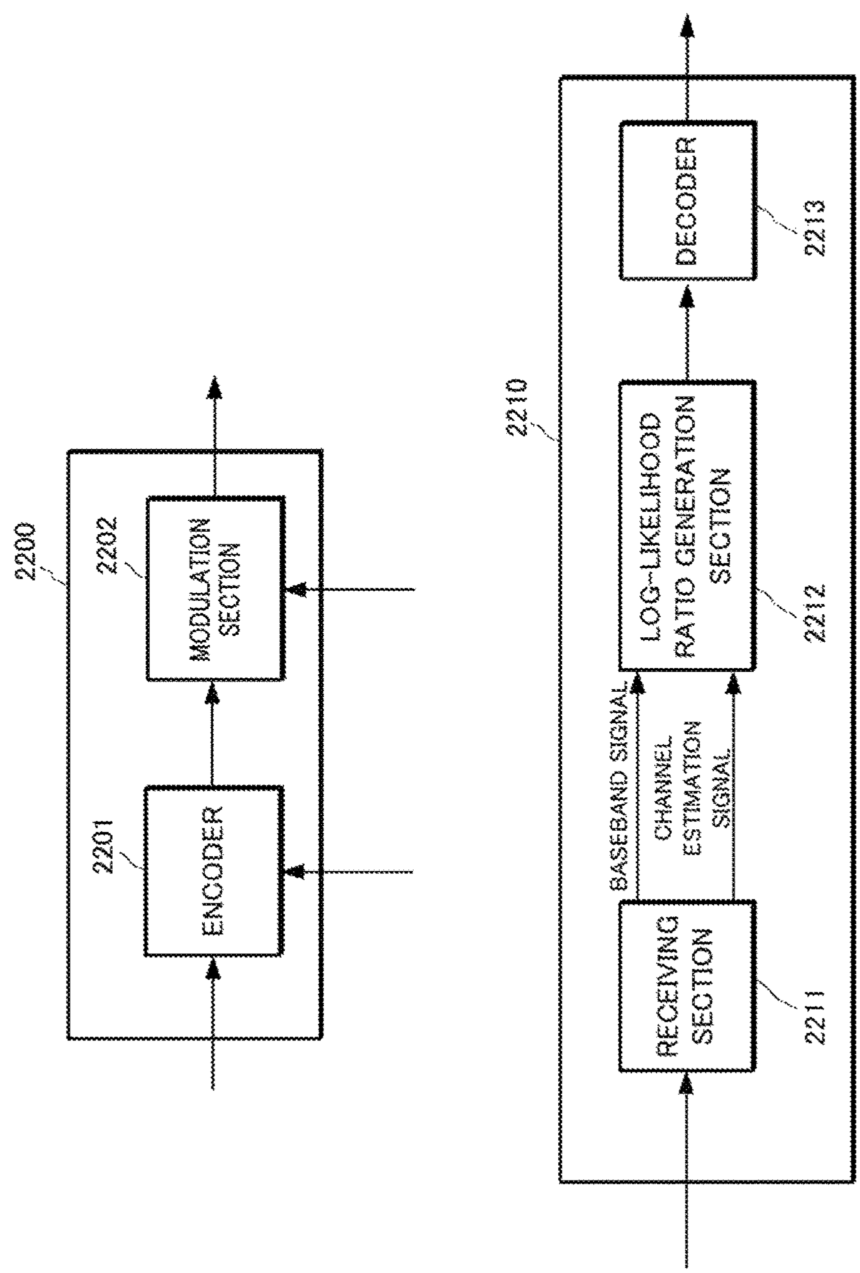
FIG. 22 is an overall diagram of a communication system.

FIG. 22 is an overall diagram of the communication system. The communication system is configured to include a transmitting device 2200 and a receiving device 2210.

The transmitting device 2200 is in turn configured to include an encoder 2201 and a modulation section 2202. The encoder 2201 receives information as input, performs encoding, and generates and outputs a transmission sequence. Then, the modulation section 2202 receives the transmission sequence as input, performs predetermined processing such as mapping, quadrature modulation, frequency conversion, and amplification, and outputs a transmission signal. The transmission signal arrives at the receiving device 2210 via a communication medium (radio, power line, light or the like).

The receiving device 2210 is configured to include a receiving section 2211, a log-likelihood ratio generation section 2212, and a decoder 2213. The receiving section 2211 receives a received signal as input, performs processing such as amplification, frequency conversion, quadrature demodulation, channel estimation, and demapping, and outputs a baseband signal and a channel estimation signal. The log-likelihood ratio generation section 2212 receives the baseband signal and the channel estimation signal as input, generates a log-likelihood ratio in bit units, and outputs a log-likelihood ratio signal. The decoder 2213 receives the log-likelihood ratio signal as input, performs iterative decoding using, specifically, BP (Belief Propagation) decoding (see Non-Patent Literature 4, Non-Patent Literature 6, Non-Patent Literature 7, and Non-Patent Literature 8), and outputs an estimated transmission sequence or (and) an estimated information sequence.

For example, consider an LDPC-CC having a coding rate of 1/2 and a time-varying period of 12 as an example. Assuming that tail-biting is performed at this time, the set information length (coding length) is designated 16384. The information bits are designated $X_{1,1}$, $X_{1,2}$, $X_{1,3}$, . . . , $X_{1,16384}$. If parity bits are determined without any shenanigans, $P_1$, $P_2$, P3, . . . , $P_{16384}$ are determined. However, despite a parity check matrix being created for transmission sequence $u=(X_{1,1}, P_1, X_{1,2}, P_2, \ldots, X_{1,16384}, P_{16384})$, Condition #1 is not satisfied. Therefore, $X_{1,16385}$, $X_{1,16386}$, $X_{1,16387}$, and $X_{1,16388}$ may be added to the transmission sequence so as to determine $P_{16385}$, $P_{16386}$, $P_{16387}$, and $P_{16388}$. Here, the encoder (transmitting device) is set such that, for example, $X_{1,16385}=0$, $X_{1,16386}=0$, $X_{1,16387}=0$, and $X_{1,16388}=0$, then performs decoding to obtain $P_{16385}$, $P_{16386}$, $P_{16387}$, and $P_{16388}$. However, for the encoder (transmitting device) and the decoder (receiving device), when mutually agreed-upon settings are in place such that $X_{1,16385}=0$, $X_{1,16386}=0$, $X_{1,16387}=0$, and $X_{1,16388}=0$, there is no need to transmit $X_{1,16385}$, $X_{1,16386}$, $X_{1,16387}$, and $X_{1,16388}$.

Accordingly, the encoder takes the information sequence $X=(X_{1,1}, X_{1,2}, X_{1,3}, \ldots, X_{1,16384}, X_{1,16385}, X_{1,16386}, X_{1,16387}, X_{1,16388})=(X_{1,1}, X_{1,2}, X_{1,3}, \ldots, X_{1,16384}, 0, 0, 0, 0)$ as input, and obtains the sequence $(X_{1,1}, P_1, X_{1,2}, P_2, \ldots, X_{1,16384}, P_{16384}, X_{1,16385}, P_{16385}, X_{1,16386}, P_{16386}, X_{1,16387}, P_{16387}, X_{1,16388}, P_{16388})=(X_{1,1}, P_1, X_{1,2}, P_2, \ldots, X_{1,16384}, P_{16384}, 0, P_{16385}, 0, P_{16386}, 0, P_{16387}, 0, P_{16388})$ therefrom. Then, the encoder (transmitting device) and the decoder (receiving device) delete the known zeroes, such that the transmitting device transmits the transmission sequence as $(X_{1,1}, P_1, X_{1,2}, P_2, \ldots, X_{1,16384}, P_{16384}, P_{16385}, P_{16386}, P_{16387}, P_{16388})$.

The receiving device 2210 obtains, for example, the log-likelihood ratios for each transmission sequence of $LLR(X_{1,1})$, $LLR(P_1)$, $LLR(X_{1,2})$, $LLR(P_2)$, . . . , $LLR(X_{1,16384})$, $LLR(P_{16384})$, $LLR(P_{16385})$, $LLR(P_{16386})$, $LLR(P_{16387})$, $LLR(P_{16388})$.

Then, the log-likelihood ratios $LLR(X_{1,16385})=LLR(0)$, $LLR(X_{1,16386})=LLR(0)$, $LLR(X_{1,16387})=LLR(0)$, $LLR(X_{1,16388})=LLR(0)$ of the zero-value terms $X_{1,16385}$, $X_{1,16386}$, $X_{1,16387}$, and $X_{1,16388}$ not transmitted by the transmitting device 2200 are generated, obtaining $LLR(X_{1,1})$, $LLR(P_1)$, $LLR(X_{1,2})$, $LLR(P_2)$, . . . , $LLR(X_{1,16384})$, $LLR(P_{16384})$, $LLR(X_{1,16385})=LLR(0)$, $LLR(P_{16385})$, $LLR(X_{1,16386})=LLR(0)$, $LLR(P_{16386})$, $LLR(X_{1,16387})=LLR(0)$, $LLR(P_{16387})$, $LLR(X_{1,16388})=LLR(0)$, and $LLR(P_{16388})$. As such, the estimated transmission sequence and the estimated information sequence are obtainable by using the 16388×32776 parity check matrix of the LDPC-CC having a time-varying period of 12 and a coding rate of 1/2 and performing decoding using belief propagation, such as BP decoding described in Non-Patent Literature 4, Non-Patent Literature 6, Non-Patent Literature 7, and Non-Patent Literature 8, min-sum decoding that approximates BP decoding, offset BP decoding, Normalized BP decoding, or shuffled BP decoding.

As the example makes clear, for an LDPC-CC having a time-varying period of q and a coding rate of (n−1)/n and for which tail-biting is performed, when the receiving device performs decoding, the decoding proceeds with a parity check matrix that satisfies Condition #1. Accordingly, the decoder holds a parity check matrix in which (rows)×(columns)=(q×M)×(q×n×M) (where M is a natural number).

The corresponding encoder uses a number of information bits needed for coding that corresponds to q×(n−1)×M. Accordingly, q×M bits of parity are computed. In contrast, when the number of information bits input to the encoder is less than q×(n−1)×M, the encoder inserts known bits (for example, zeroes (or ones)) into inter-device transmissions (between the encoder and the decoder) such that the total number of information bits is q×(n−1)×M. Thus, q×M bits of parity are computed. Here, the transmitting device transmits the parity bits computed from the information bits with the inserted known bits deleted. (However, although the known bits are normally transmitted with q×(n−1)×M bits of information and q×M bits of parity, the presence of known bits may lead to a decrease in transmission speeds).

The following describes a periodic time-varying LDPC-CC that is based on a parity check polynomial and that uses improved tail-biting of coding rate (n−1)/n (where n is an integer no smaller than two) described in Patent Literature 2.

[Periodic Time-Varying LDPC-CC Based on Parity Check Polynomial and Using Improved Tail-Biting of Coding Rate (n−1)/n (where n is an Integer No Smaller than Two)]

First, explanation is provided of a problem present in a conventional LDPC convolutional code using a tail-biting scheme.

Here, explanation is provided of a time-varying LDPC-CC having a coding rate of $R=(n-1)/n$ based on a parity check polynomial. Information bits $X_1, X_2, \ldots, X_{n-1}$ and parity bit P at time j are respectively expressed as $X_{1,j}, X_{2,j}, \ldots, X_{n-1,j}$ and $P_j$. Further, a vector $u_j$ at time j is expressed as $u_j=(X_{1,j}, X_{2,j}, \ldots, X_{n-1,j}, P_j)$. Also, an encoded sequence is expressed as $u=(u_0, u_1, \ldots, u_j, \ldots)^T$. Given a delay operator D, a polynomial expression of the information bits $X_1, X_2, \ldots, X_{n-1}$ is $X_1(D), X_2(D), \ldots, X_{n-1}(D)$, and a polynomial expression of the parity bit P is P(D). Here, a parity check polynomial that satisfies zero, according to expression 52, is considered.

[Math. 52]

$$(D^{a1,1}+D^{a1,2}+\ldots+D^{a1,r1}+1)X_1(D)+(D^{a2,1}+D^{a2,2}+\ldots+D^{a2,r2}+1)X_2(D)+\ldots+(D^{an-1,1}+D^{an-1,2}+\ldots+D^{an-1,rn-1}+1)X_{n-1}(D)+(D^{b1}+D^{b2}+\ldots+D^{b\varepsilon}+1)P(D)=0 \quad (52)$$

In expression 52, $a_{p,q}$ (p=1, 2, . . . , n−1; q=1, 2, . . . , $r_p$) and $b_s$ (s=1, 2, . . . , ε) are natural numbers. Also, for $^\forall$(y, z) where y, z=1, 2, . . . , $r_p$ and y≠z, $a_{p,y}\neq a_{p,z}$ holds true. Also, for $^\forall$(y, z) where y, z=1, 2, . . . , ε and y≠z, $b_y\neq b_z$ holds true. In order to create an LDPC-CC having a time-varying period of m, m parity check polynomials that satisfy zero are prepared. Here, the m parity check polynomials that satisfy zero are referred to as a parity check polynomial #0, a parity check polynomial #1, a parity check polynomial #2, . . . , a parity check polynomial #(m−2), and a parity check polynomial #(m−1). Based on parity check polynomials that satisfy zero, according to expression 52, the number of terms of $X_p(D)$ (p=1, 2, . . . , n−1) is equal in the parity check polynomial #0, the parity check polynomial #1, the parity check polynomial #2, . . . , the parity check polynomial #(m−2), and the parity check polynomial #(m−1), and the number of terms of P(D) is equal in the parity check polynomial #0, the parity check polynomial #1, the parity check polynomial #2, . . . , the parity check polynomial #(m−2), and the parity check polynomial #(m−1). However, expression 52 merely provides one example of a parity check polynomial that satisfies zero, and the number of terms of Xp(D) (p=1, 2, . . . , n−1) need not be equal in the parity check polynomial #0, the parity check polynomial #1, the parity check polynomial #2, . . . , the parity check polynomial #(m−2), and the parity check polynomial #(m−1), and the number of terms of P(D) need not be equal in the parity check polynomial #0, the parity check polynomial #1, the parity check polynomial #2, . . . , the parity check polynomial #(m−2), and the parity check polynomial #(m−1).

In order to create an LDPC-CC having a coding rate of R=(n−1)/n and a time-varying period of m, parity check polynomials that satisfy zero are prepared. An ith parity check polynomial (i=0, 1, . . . , m−1) that satisfies zero, according to expression 52, is expressed as shown in expression 53.

[Math. 53]

$$A_{X1,i}(D)X_1(D)+A_{X2,i}(D)X_2(D)+\ldots+A_{Xn-1,i}(D)X_{n-1}(D)+B_i(D)P(D)=0 \quad (53)$$

In expression 53, the maximum degrees of D in $A_{X\delta,i}(D)$ (δ=1, 2, . . . , n−1) and $B_i(D)$ are respectively expressed as $\Gamma_{X\delta,i}$ and $\Gamma_{P,i}$. Further, the maximum values of $\Gamma_{X\delta,i}$ and $\Gamma_{P,i}$ are Γi. Also, the maximum value of Γi (i=0, 1, . . . , m−1) is Γ. When taking the encoded sequence u into consideration and when using Γ, a vector $h_i$ corresponding to the ith parity check polynomial is expressed as shown in expression 54.

[Math. 54]

$$h_i=[h_{i,\Gamma},h_{i,\Gamma-1},\ldots,h_{i,1},h_{i,0}] \quad (54)$$

In expression 54, $h_{i,v}$ (v=0, 1, . . . , Γ) is a vector having one row and n columns and is expressed as rot $[\alpha_{i,v,X1}, \alpha_{i,v,X2}, \ldots, \alpha_{i,v,Xn-1}, \beta_{1,v}]$. This is because a parity check polynomial, according to expression 53, has $\alpha_{i,v,Xw}D^vX_w(D)$ and $\beta_{i,v}D^vP(D)$ (w=1, 2, . . . , n—1, and $\alpha_{i,v,Xw}, \beta_{i,v}\varepsilon[0,1]$). In such a case, a parity check polynomial that satisfies zero, according to expression 53, has terms $D^0X_1(D)$, $D^0X_2(D)$, . . . , $D^0X_{n-1}(D)$ and $D^0P(D)$, thus satisfying expression 55.

[Math 55]

$$h_{i,0}=[\underbrace{1\ \ldots\ 1}_{n}] \quad (55)$$

When using expression 55, a parity check matrix for an LDPC-CC based on a parity check polynomial having a coding rate of R=(n−1)/n and a time-varying period of m is expressed as shown in expression 56.

[Math. 56]

$$H=\begin{bmatrix} \ddots & & & & & & & & \ddots & & & & & & \\ & h_{0,\Gamma} & h_{0,\Gamma-1} & \cdots & \cdots & \cdots & \cdots & \cdots & h_{0,0} & & & & & & \\ & & h_{1,\Gamma} & \cdots & \cdots & \cdots & \cdots & \cdots & h_{1,1} & h_{1,0} & & & & & \\ & & & \ddots & & & & & & & \ddots & & & & \\ & & & & h_{m-1,\Gamma} & h_{m-1,\Gamma-1} & \cdots & \cdots & \cdots & \cdots & \cdots & h_{m-1,0} & & & \\ & & & & & h_{0,\Gamma} & \cdots & \cdots & \cdots & \cdots & \cdots & h_{0,1} & h_{0,0} & & \\ & & & & & & \ddots & & & & & & & \ddots & \\ & & & & & & & h_{m-1,\Gamma} & \cdots & \cdots & \cdots & \cdots & \cdots & \cdots & h_{m-1,0} \\ & & & & & & & & \ddots & & & & & & \ddots \end{bmatrix} \quad (56)$$

In expression 56, Λ(k)=Λ(k+m) is satisfied for $^\forall$k. Here, Λ(k) corresponds to $h_i$ of a kth row of the parity check matrix.

Although explanation is provided above while referring to expression 52 as a parity check polynomial serving as a basis, no limitation to the format of expression 52 is intended. For example, instead of a parity check polynomial according to expression 52, a parity check polynomial that satisfies zero, according to expression 57, may be used.

[Math. 57]

$$(D^{a1,1}+D^{a1,2}+\ldots+D^{a1,r1})X_1(D)+(D^{a2,1}+D^{a2,2}+\ldots+D^{a2,r2})X_2(D)+\ldots+(D^{an-1,1}+D^{an-1,2}+\ldots+D^{an-1,rn-1})X_{n-1}(D)+(D^{b1}+D^{b2}+\ldots+D^{b\varepsilon})P(D)=0 \quad (57)$$

In expression 57, $a_{p,q}$ (p=1, 2, . . . , n−1; q=1, 2, . . . , $r_p$) and $b_s$ (s=1, 2, . . . , ε) are natural numbers. Also, for $^\forall$(y, z) where y, z=1, 2, . . . , $r_p$ and y≠z, $a_{p,y}\neq a_{p,z}$ holds true. Also, for $^\forall$(y, z) where y, z=1, 2, . . . , ε and y≠z, $b_y\neq b_z$ holds true.

Here, an ith parity check polynomial (i=0, 1, . . . , m−1) that satisfies zero for an LDPC-CC having a coding rate of R=(n−1)/n and a time-varying period of m is expressed as shown below.

[Math. 58]

$$A_{X1,i}(D)X_1(D)+A_{X2,i}(D)X_2(D)+\ldots+A_{Xn-1,i}(D)X_{n-1}(D)+(D^{b1,i}+\ldots+D^{b\varepsilon,i}+1)P(D)=0 \quad (58)$$

Here, $b_{s,i}$ (s=1, 2, . . . ,) is a natural number, and for $\forall$(y, z) where y, z=1, 2, . . . , ε and y≠z, $b_{y,i}\neq b_{z,i}$ holds true. Also, ε is a natural number. Accordingly, there are two or more terms of P(D) in an ith parity check polynomial (i=0, 1, . . . , m−1) that satisfies zero, which serves as a parity check polynomial that satisfies zero for an LDPC-CC having a coding rate of R=(n−1)/n and a time-varying period of m.

In the following, a case is considered where tail-biting is performed when there are two or more terms of P(D) in an ith parity check polynomial (i=0, 1, . . . , m−1) that satisfies zero, which serves as a parity check polynomial that satisfies zero for an LDPC-CC having a coding rate of R=(n−1)/n and a time-varying period of m. In such a case, an encoder obtains a parity P from information bits $X_1, X_2, \ldots, X_{n-1}$ by performing encoding.

Here, when assuming a transmission vector u to be $u=(X_{1,1}, X_{2,1}, \ldots, X_{n-1,1}, P_1, X_{1,2}, X_{2,2}, \ldots, X_{n-1,2}, P_2, \ldots, X_{1,k}, X_{2,k}, \ldots, X_{n-1,k}, P_k, \ldots)^T$ and assuming a parity check matrix for an LDPC-CC having a coding rate of R=(n−1)/n and a time-varying period of m using the tail-biting scheme to be H, Hu=0 holds true. (here, the zero in Hu=0 indicates that all elements of the vector are zeros.) Accordingly, parities $P_1, P_2, \ldots, P_k, \ldots$, can be obtained by solving simultaneous equations for Hu=0. However, one problem is that a great amount of computation (i.e., a great circuit scale) is required for obtaining the parities since there are two or more terms of P(D).

Taking this into consideration, there is a tail-biting scheme using a feed-forward LDPC-CC having a time-varying period of m in order to reduce the amount of computation (i.e., circuit scale) required for obtaining parities. However, as is commonly known, the use of a feed-forward LDPC-CC is problematic in that a feed-forward LDPC-CC has relatively low error correction capability (when comparing a feed-forward LDPC-CC and a feedback LDPC-CC having substantially similar constraint lengths, it is more likely that the feedback LDPC-CC has higher error correction capability than the feed-forward LDPC-CC).

In view of the two problems presented above, Patent Literature 2 describes an LDPC-CC using an improved tail-biting scheme that achieves high error correction capability and a reduced amount of computation performed by an encoder (i.e., a reduced circuit scale of an encoder).

Explanation is provided in the following of the LDPC-CC having a coding rate of R=(n−1)/n using the improved tail-biting scheme that is described in Patent Literature 2. Note that in the following, n is assumed to be a natural number no smaller than two.

As a basis (i.e., a basic structure) of the LDPC-CC having a coding rate of R=(n−1)/n using the improved tail-biting scheme that is described in Patent Literature 2, an LDPC-CC based on a parity check polynomial having a coding rate of R=(n−1)/n and a time-varying period of m is used.

An ith parity check polynomial (i=0, 1, . . . , m−1) that satisfies zero for the LDPC-CC based on a parity check polynomial having a coding rate of R=(n−1)/n and a time-varying period of m, which serves as the basis of the LDPC-CC described in Patent Literature 2, is expressed as shown in expression 59.

[Math. 59]

$$\begin{aligned}(D^{b1,i}+1)P(D)+\sum_{k=1}^{n-1}A_{Xk,i}(D)X_k(D) &= A_{X1,i}(D)X_1(D)+A_{X2,i}(D)X_2(D)+\ldots+A_{Xn-1,i}(D)X_{n-1}(D)+(D^{b1,i}+1)P(D)\\ &= 0\end{aligned} \quad (59)$$

Here, k=1, 2, . . . , n−2, n−1 (k is an integer no smaller than one and less than or equal to n−1), i=1, 2, . . . , m−1 (i is an integer no smaller than zero and less than or equal to m−1), and $A_{Xk,i}(D)\neq 0$ holds true for all conforming k and i. Also, $b_{1,i}$ is a natural number.

Accordingly, there are two terms P(D) in the ith parity check polynomial (i=0, 1, . . . , m−1) that satisfies zero, according to expression 59, for the LDPC-CC based on a parity check polynomial having a coding rate of R=(n−1)/n and a time-varying period of m, which serves as the basis of the LDPC-CC described in Patent Literature 2. This is one important requirement for enabling finding parities sequentially and reducing computation amount (i.e., reducing circuit scale).

Note that the following function is defined for a polynomial part of a parity check polynomial that satisfies zero, according to expression 59.

[Math. 60]

$$\begin{aligned}F_i(D) &= (D^{b1,i}+1)P(D)+\sum_{k=1}^{n-1}A_{Xk,i}(D)X_k(D)\\ &= A_{X1,i}(D)X_1(D)+A_{X2,i}(D)X_2(D)+\ldots+A_{Xn-1,i}(D)X_{n-1}(D)+(D^{b1,i}+1)P(D)\end{aligned} \quad (60)$$

Here, the two methods presented below realize a time-varying period of m.

Method 1:

[Math. 61]

$$F_v(D)\neq F_w(D)\ \forall v\forall w\ v,w=0,1,2,\ldots,m-2,m-1;v\neq w \quad (61)$$

In the above expression, v is an integer no smaller than zero and less than or equal to m−1, w is an integer no smaller than zero and less than or equal to m−1, v≠w, and $F_v(D)\neq F_w(D)$ holds true for all conforming v and w.

Method 2:

[Math. 62]

$$F_v(D)\neq F_w(D) \quad (62)$$

In the above expression, v is an integer no smaller than zero and less than or equal to m−1, w is an integer no smaller than zero and less than or equal to m−1, v≠w, and values of v and w that satisfy expression 62 exist. In addition, expression 63 also holds true.

[Math. 63]

$$F_v(D)=F_w(D) \quad (63)$$

In the above expression, v is an integer no smaller than zero and less than or equal to m−1, w is an integer no smaller than zero and less than or equal to m−1, vow, values of v and w that satisfy expression 63 exist. However, a time-varying period is m is realized.

Next, a relationship is described between a time-varying period m of a parity check polynomial that satisfies zero, according to expression 59, for the LDPC-CC based on a parity check polynomial having a coding rate of R=(n−1)/n and a time-varying period of m, which serves as the basis (i.e., the basic structure) of the LDPC-CC having a coding rate of R=(n−1)/n using the improved tail-biting scheme that is described in Patent Literature 2, and a block size of the proposed LDPC-CC having a coding rate of R=(n−1)/n using the tail-biting scheme.

Concerning this point, the following conditions are important when performing tail-biting on the LDPC-CC based on a parity check polynomial (a parity check polynomial that satisfies zero as defined in expression 59) having a coding rate of R=(n−1)/n and a time-varying period of m, which serves as the basis (i.e., the basic structure) of the LDPC-CC described in Patent Literature 2, in order to achieve higher error correction capability.

<Condition #A1>

The number of rows in a parity check matrix is a multiple of m.

Thus, the number of columns in the parity check matrix is a multiple of n×m. According to this condition, (for example) a log-likelihood ratio that is necessary when performing decoding is a log-likelihood ratio of the number of columns in the parity check matrix.

However, a parity check polynomial that satisfies zero for the LDPC-CC having a time-varying period of m and a coding rate of (n−1)/n, which serves as the basic structure of the proposed LCPC-CC, and requires Condition #A1 is not limited to expression 59.

Further, the LDPC-CC having a coding rate of R=(n−1)/n using the improved tail-biting scheme described in Patent Literature 2 also satisfies Condition #A1. (Note that detailed explanation of the difference between the proposed LDPC-CC having a coding rate of R=(n−1)/n using the tail-biting scheme and the LDPC-CC based on a parity check polynomial having a coding rate of R=(n−1)/n and a time-varying period of m, which serves as the basis (i.e., the basic structure) of the LDPC-CC described in Patent Literature 2, is provided in the following.) Thus, when assuming that a parity check matrix for the LDPC-CC having a coding rate of R=(n−1)/n using the improved tail-biting scheme described in Patent Literature 2 is $H_{pro}$, the number of columns of $H_{pro}$ can be expressed as n×m×z (where z is a natural number). Accordingly, a transmission sequence (encoded sequence (codeword)) composed of an sth block of the LDPC-CC having a coding rate of R=(n−1)/n using the improved tail-biting scheme described in Patent Literature 2 can be expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,k}, X_{s,2,k}, \ldots, X_{s,n-1,k}, P_{pro,s,k}, X_{s,1,m\times z}, X_{s,2,m\times z}, \ldots, X_{s,n-1,m\times z}, P_{pro,s,m\times z})^T$ (where k=1, 2, . . . , m×z−1), and $H_{pro}v_s=0$ holds true (here, the zero in $H_{pro}v_s=0$ indicates that all elements of the vector are zeros). Here, $X_{s,j,k}$ represents an information bit $X_j$ (j is an integer no smaller than one and less than or equal to n−1), and $P_{pro,s,k}$ represents a bit of parity P. Further, the number of rows of $H_{pro}$, which is the parity check matrix for the LDPC-CC having a coding rate of R=(n−1)/n using the improved tail-biting scheme described in Patent Literature 2, is m×z.

Next, explanation is provided of requirements that enable finding parities sequentially in the LDPC-CC having a coding rate of R=(n−1)/n using the improved tail-biting scheme described in Patent Literature 2.

When drawing a tree as in each of FIGS. 5, 6, 8, 17, and 18, which is composed of only terms corresponding to parities of parity check polynomials that satisfy zero, according to expression 59, for the LDPC-CC based on a parity check polynomial having a coding rate of R=(n−1)/n and a time-varying period of m, which serves as the basis (i.e., the basic structure) of the LDPC-CC having a coding rate of R=(n−1)/n using the improved tail-biting scheme described in Patent Literature 2, it is required that check nodes corresponding to all parity check polynomials from the zeroth to the (m−1)th parity check polynomials, according to expression 59, appear in such a tree, as in each of FIGS. 6, 8, and 17. As such, the following conditions are considered as being effective.

<Condition #A2-1>

In a parity check polynomial that satisfies zero, according to expression 59, i is an integer greater than equal to zero and less than or equal to m−1, j is an integer greater than equal to zero and less than or equal to m−1, i≠j, and $b_{1,1}\%m=b_{1,j}\%m=\beta$ (where β is a fixed value that is a natural number) holds true for all conforming i and j.

<Condition #A2-2>

When expressing a set of divisors of m other than one as R, β is not to belong to R.

In the present embodiment (in fact, commonly applying to the entirety of the present disclosure), % means a modulo, and for example, α%q represents a remainder after dividing α by q (where α is an integer no smaller than zero, and q is a natural number).

Note that, in addition to the above-described condition that, when expressing a set of divisors of m other than one as R, β is not to belong to R, it is desirable that the new condition below be satisfied.

<Condition #A2-3>

β belongs to a set of integers no smaller than one and less than or equal to m−1, and β also satisfies the following condition.

When expressing a set of values w obtained by extracting all values w satisfying β/w=g (where g is a natural number) as S, an intersection R∩S produces an empty set. The set R has been defined in Condition #A2-2.

Condition #A2-3 is also expressible as Condition #A2-3'.

<Condition #A2-3'>

β belongs to a set of integers no smaller than one and less than or equal to m−1, and β also satisfies the following condition.

When expressing a set of divisors of β as S, an intersection R∩S produces an empty set.

Condition #A2-3 and Condition #A2-3' are also expressible as Condition #A2-3".

<Condition #A2-3">

β belongs to a set of integers no smaller than one and less than or equal to m−1, and β also satisfies the following condition.

The greatest common divisor of 13 and m is one.

A supplementary explanation of the above is provided. According to Condition #A2-1, β is an integer no smaller than one and less than or equal to m−1. Also, when β satisfies both Condition #A2-2 and Condition #A2-3, β is not a divisor of m other than one, and β is not a value expressible as an integral multiple of a divisor of m other than one.

In the following, explanation is provided while referring to an example. Assume a time-varying period of m=6. Then, according to Condition #A2-1, β={1, 2, 3, 4, 5} since β is a natural number.

Further, according to Condition #A2-2, when expressing a set of divisors of m other than one as R, β is not to belong to R. As such, R={2, 3, 6} (since, among the divisors of six, one is excluded from the set R). As such, when 13 satisfies both Condition #A2-1 and Condition #A2-2, β={1, 4, 5}.

Next, Condition #A2-3 is considered (similar as when considering Condition #A2-3' or Condition #A2-3"). First, since β belongs to a set of integers no smaller than one and less than or equal to m−1, β={1, 2, 3, 4, 5}.

Further, when expressing a set of values w obtained by extracting all values w that satisfy β/w=g (where g is a natural number) as S, the intersection R∩S produces an empty set. Here, as explained above, the set R={2, 3, 6}.

When β=1, the set S={1}. As such, the intersection R∩S produces an empty set, and Condition #A2-3 is satisfied.

When β=2, the set S={1, 2}. As such, R∩S={2}, and Condition #A2-3 is not satisfied.

When β=3, the set S={1, 3}. As such, R∩S={3}, and Condition #A2-3 is not satisfied.

When β=4, the set S={1, 2, 4}. As such, R∩S={2}, and Condition #A2-3 is not satisfied.

When β=5, the set S={1, 5}. As such, the intersection R∩S produces an empty set, and Condition #A2-3 is satisfied.

As such, β satisfies both Condition #A2-1 and Condition #A2-3 when β={1, 5}.

In the following, explanation is provided while referring to another example. Assume a time-varying period of m=7. Then, since β is a natural number according to Condition #A2-1, β={1, 2, 3, 4, 5, 6}.

Further, according to Condition #A2-2, when expressing a set of divisors of m other than one as R, β is not to belong to R. Here, R={7} (since, among the divisors of seven, one is excluded from the set R). As such, when 13 satisfies both Condition #A2-1 and Condition #A2-2,13={1, 2, 3, 4, 5, 6}.

Next, Condition #A2-3 is considered. First, since 13 is an integer no smaller than one and less than or equal to m−1, β={1, 2, 3, 4, 5, 6}.

Next, when expressing a set of values w obtained by extracting all values w that satisfy β/w=g (where g is a natural number) as S, the intersection R∩S produces an empty set. Here, as explained above, the set R={7}.

When β=1, the set S={1}. As such, the intersection R∩S produces an empty set, and Condition #A2-3 is satisfied.

When β=2, the set S={1, 2}. As such, the intersection R∩S produces an empty set, and Condition #A2-3 is satisfied.

When β=3, the set S={1, 3}. As such, the intersection R∩S produces an empty set, and Condition #A2-3 is satisfied.

When β=4, the set S={1, 2, 4}. As such, the intersection R∩S produces an empty set, and Condition #A2-3 is satisfied.

When β=5, the set S={1, 5}. As such, the intersection R∩S produces an empty set, and Condition #A2-3 is satisfied.

When β=6, the set S={1, 2, 3, 6}. As such, the intersection R∩S produces an empty set, and Condition #A2-3 is satisfied.

As such, β satisfies both Condition #A2-1 and Condition #A2-3 when β={1, 2, 3, 4, 5, 6}.

In addition, as described in Non-Patent Literature 2, the possibility of high error correction capability being achieved is high if there is randomness in the positions at which ones are present in a parity check matrix. So as to make this possible, it is desirable that the following conditions be satisfied.

<Condition #A2-4>

In a parity check polynomial that satisfies zero, according to expression 59, i is an integer greater than equal to zero and no greater than m−1, j is an integer greater than equal to zero and no greater than m−1, i≠j, $b_{1,i}\%m=b_{1,j}\%m=\beta$ (where β is a fixed value that is a natural number) holds true for all conforming i and j.

Also, v is an integer no smaller than zero and less than or equal to m−1, w is an integer no smaller than zero and less than or equal to m−1, v≠w, and values of v and w that satisfy $b_{1,v}\neq b_{1,w}$ exist.

However, note that even when Condition #A2-4 is not satisfied, high error correction capability may be achieved. In addition, the following conditions can be considered so as to increase the randomness as described above.

<Condition #A2-5>

In a parity check polynomial that satisfies zero, according to expression 59, i is an integer greater than equal to zero and no greater than m−1, j is an integer greater than equal to zero and no greater than m−1, i≠j, and $b_{1,i}\%m=b_{1,j}\%m=\beta$ (where β is a fixed value that is a natural number) holds true for all conforming i and j.

Also, v is an integer no smaller than zero and less than or equal to m−1, w is an integer no smaller than zero and less than or equal to m−1, v≠w, and $b_{1,v}\neq b_{1,w}$ holds true for all conforming v and w.

However, note that even when Condition #A2-5 is not satisfied, high error correction capability may be achieved.

Further, when taking into consideration that the proposed code is a convolutional code, the possibility is high of higher error correction capability being achieved for relatively long constraint lengths. Considering this point, it is desirable that the following condition be satisfied.

<Condition #A2-6>

The condition is not satisfied that, in a parity check polynomial that satisfies zero, according to expression 59, i is an integer greater than equal to zero and no greater than m−1, and $b_{1,i}=1$ holds true for all conforming i.

However, note that even when Condition #A2-6 is not satisfied, high error correction capability may be achieved.

In the following, explanation is provided of the description above that, as the basis (i.e., the basic structure) of the LDPC-CC having a coding rate of R=(n−1)/n using the improved tail-biting scheme described in Patent Literature 2, a parity check polynomial that satisfies zero, according to expression 59, for the LDPC-CC based on a parity check polynomial having a coding rate of R=(n−1)/n and a time-varying period of m is used.

Description regarding tail-biting schemes has been provided above.

First, a parity check matrix is considered for a periodic time-varying LDPC-CC formed by using only a parity check polynomial that satisfies zero, according to expression 59, for the LDPC-CC based on a parity check polynomial having a coding rate of R=(n−1)/n and a time-varying period of m.

Figure 23:
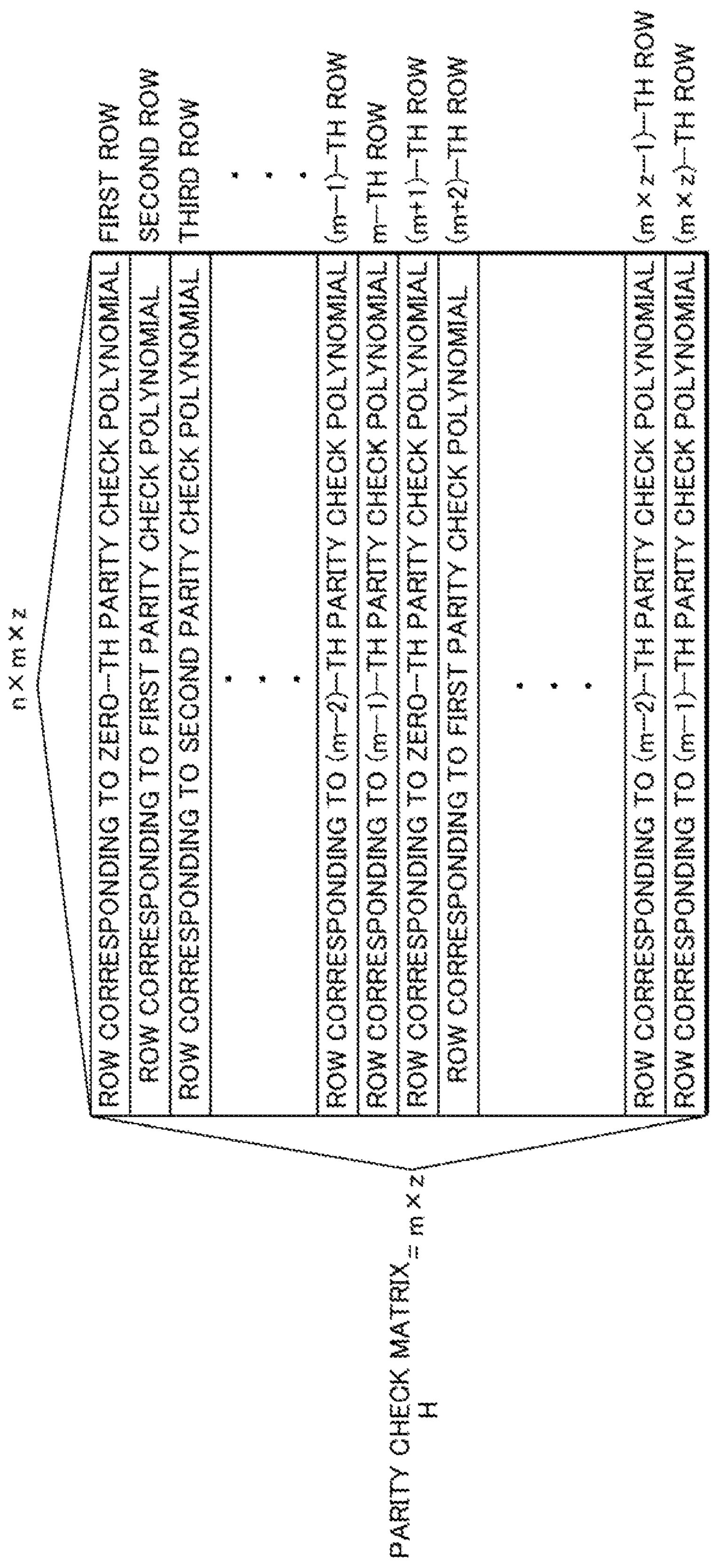
FIG. 23 shows an example of the configuration of check matrix when improved tail-biting is performed.

FIG. 23 illustrates a configuration of a parity check matrix H for the periodic time-varying LDPC-CC using tail-biting formed by performing tail-biting by using only a parity check polynomial that satisfies zero, according to expression 59, for the LDPC-CC based on a parity check polynomial having a coding rate of R=(n−1)/n and a time-varying period of m. Since Condition #A1 is satisfied in FIG. 23, the number of rows of the parity check matrix H is m×z and the number of columns of the parity check matrix H is n×m×z.

The first row of the parity check matrix H in FIG. 23 can be obtained by converting a zeroth parity check polynomial among the zeroth to (m−1)th parity check polynomials that satisfy zero, according to expression 59 (i.e., can be obtained by generating a vector having one row and n×m×z columns from the zeroth parity check polynomial). As such, the first row of the parity check matrix H in FIG. 23 is indicated as a "row corresponding to zeroth parity check polynomial".

The second row of the parity check matrix H in FIG. 23 can be obtained by converting the first parity check polynomial among the zeroth to (m−1)th parity check polynomials that satisfy zero, according to expression 59 (i.e., can be obtained by generating a vector having one row and n×m×z columns from the first parity check polynomial). As such, the second row of the parity check matrix H in FIG. 23 is indicated as a "row corresponding to first parity check polynomial".

⋮

The (m−1)th row of the parity check matrix H in FIG. 23 can be obtained by converting the (m−2)th parity check polynomial among the zeroth to (m−1)th parity check polynomials that satisfy zero, according to expression 59 (i.e., can be obtained by generating a vector having one row and n×m×z columns from the (m−2)th parity check polynomial). As such, the (m−1)th row of the parity check matrix H in FIG. 23 is indicated as a "row corresponding to (m−2)th parity check polynomial".

The mth row of the parity check matrix H in FIG. 23 can be obtained by converting the (m−1)th parity check polynomial among the zeroth to (m−1)th parity check polynomials that satisfy zero, according to expression 59 (i.e., can be obtained by generating a vector having one row and n×m×z columns from the (m−1)th parity check polynomial). As such, the mth row of the parity check matrix H in FIG. 23 is indicated as a "row corresponding to (m−1)th parity check polynomial".

⋮

The (m×z−1)th row of the parity check matrix H in FIG. 23 can be obtained by converting the (m−2)th parity check polynomial among the zeroth to (m−1)th parity check polynomials that satisfy zero, according to expression 59 (i.e., can be obtained by generating a vector having one row and n×m×z columns from the (m−2)th parity check polynomial).

The (m×z)th row of the parity check matrix H in FIG. 23 can be obtained by converting the (m−1)th parity check polynomial among the zeroth to (m−1)th parity check polynomials that satisfy zero, according to expression 59 (i.e., can be obtained by generating a vector having one row and n×m×z columns from the (m−1)th parity check polynomial).

As such, a kth row (where k is an integer no smaller than one and less than or equal to (m×z)) of the parity check matrix H in FIG. 23 can be obtained by converting the (k−1)%mth parity check polynomial among the zeroth to (m−1)th parity check polynomials that satisfy zero, according to expression 59 (i.e., can be obtained by generating a vector having one row and n×m×z columns from the (k−1)%mth parity check polynomial).

To prepare for the explanation to be provided in the following, a mathematical expression is provided of the parity check matrix H in FIG. 23 for the periodic time-varying LDPC-CC using tail-biting formed by performing tail-biting by using only a parity check polynomial that satisfies zero, according to expression 59, for the LDPC-CC based on a parity check polynomial having a coding rate of R=(n−1)/n and a time-varying period of m. When assuming a vector having one row and n×m×z columns of the kth row of the parity check matrix H to be a vector $h_k$, the parity check matrix H in FIG. 23 is expressed as shown in expression A13.

[Math. 64-1]

$$H = \begin{pmatrix} h_1 \\ h_2 \\ \vdots \\ h_{m\times z-1} \\ h_{m\times z} \end{pmatrix} \tag{64-1}$$

In the following, explanation is provided of a parity check matrix for the LDPC-CC having a coding rate of R=(n−1)/n using the improved tail-biting scheme described in Patent-Literature 2.

Figure 24:
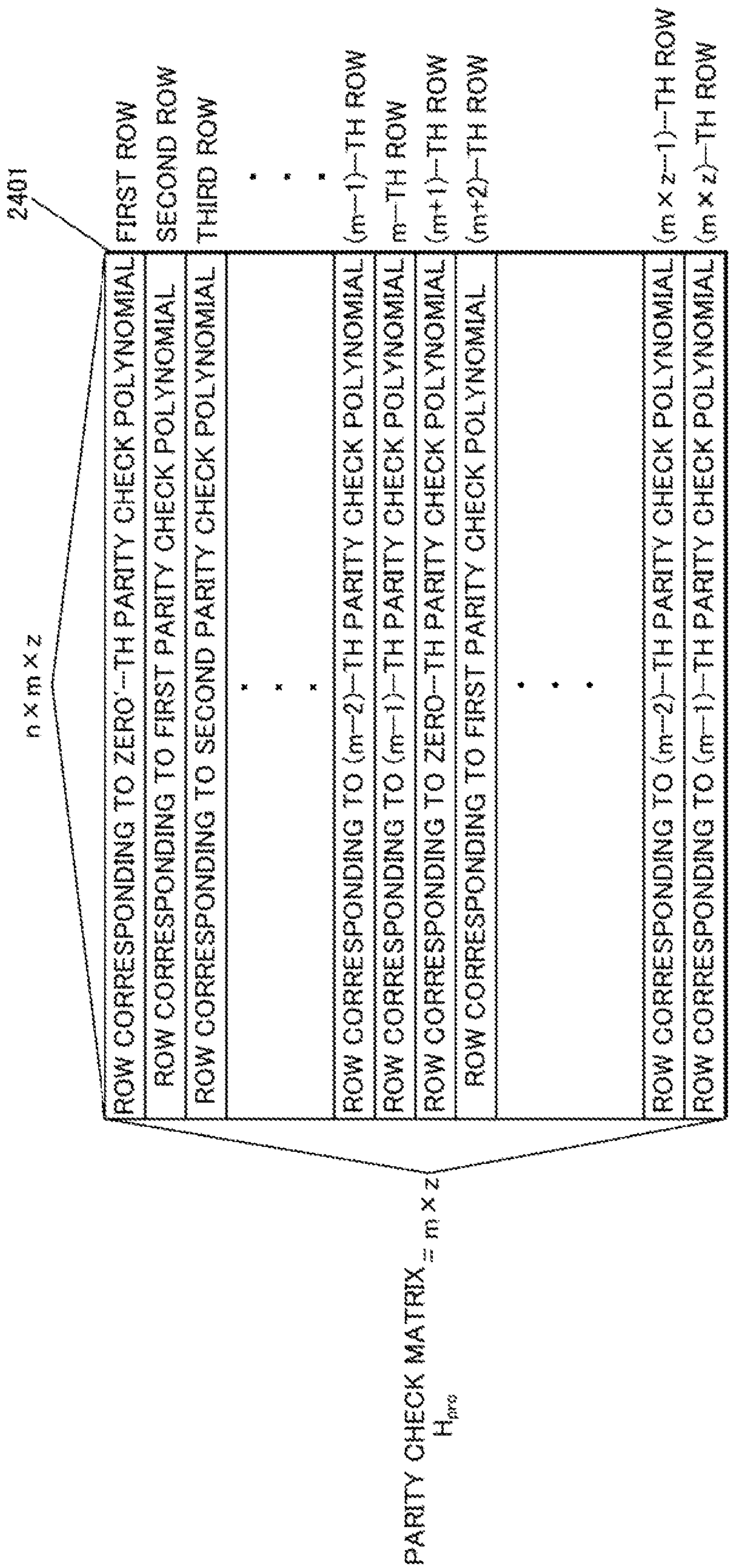
FIG. 24 shows an example of the configuration of check matrix when improved tail-biting is performed.

FIG. 24 illustrates one example configuration of a parity check matrix $H_{pro}$ for the DPC-CC having a coding rate of R=(n−1)/n using the improved tail-biting scheme described in Patent-Literature 2. Note that the parity check matrix $H_{pro}$ for LDPC-CC having a coding rate of R=(n−1)/n using the improved tail-biting scheme described in Patent-Literature 2 satisfies Condition #A1.

When assuming a vector having one row and n×m×z columns in a kth row of the parity check matrix $H_{pro}$ for the LDPC-CC having a coding rate of R=(n−1)/n using the improved tail-biting scheme described in Patent Literature 2 to be a vector $g_k$, the parity check matrix $H_{pro}$ in FIG. 24 is expressed as shown in expression 64-2.

[Math. 64-2]

$$H_{pro} = \begin{pmatrix} g_1 \\ g_2 \\ \vdots \\ g_{m\times z-1} \\ g_{m\times z} \end{pmatrix} \tag{64-2}$$

Note that, the transmission sequence (encoded sequence (codeword)) composed of an sth block of the LDPC-CC having a coding rate of R=(n−1)/n using the improved tail-biting scheme described in Patent Literature 2 can be expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,k}, X_{s,2,k}, \ldots, X_{s,n-1,k}, P_{pro,s,k}, X_{s,1,m\times z}, X_{s,2,m\times z}, \ldots, X_{s,n-1,m\times z}, P_{pro,s,m\times Z})^T$ (where k=1, 2, . . . , m×z−1, m×z), and $H_{pro}v_s=0$ holds true (here, the zero in $H_{pro}v_s=0$ indicates that all elements of the vector are zeros). Here, $X_{s,j,k}$ represents an information bit $X_j$ (j is an integer no smaller than one and less than or equal to n−1) and $P_{pro,s,k}$ represents a bit of parity P.

In FIG. 24, which illustrates one example of the configuration of the parity check matrix $H_{pro}$ for the LDPC-CC having a coding rate of R=(n−1)/n using the improved tail-biting scheme described in Patent Literature 2, the rows of the parity check matrix $H_{pro}$ other than the first row, or that is, the configuration of the second row to the (m×z)th row of the parity check matrix $H_{pro}$ in FIG. 24 is identical to the configuration of the second row to the (m×z)th row of the parity check matrix H in FIG. 23 (refer to FIGS. 23 and 24). As such, a first row 2401 in FIG. 24 is indicated as a "row corresponding to zero'th parity check polynomial" (further explanation concerning this point is provided in the following). Accordingly, the following relational expression holds true from expression 64-1 and expression 64-2.

[Math. 65]

$$g_i = h_i \tag{65}$$

(i is an integer greater than equal to two and less than or equal to m×z, and expression 65 holds true for all conforming i)

Further, the following expression holds true when i equals one.

[Math. 66]

$$g_1 \neq h_1 \tag{66}$$

Accordingly, the parity check matrix $H_{pro}$ for the LDPC-CC having a coding rate of R=(n−1)/n using the improved tail-biting scheme described in Patent Literature 2 can be expressed as shown in expression 67.

[Math. 67]

$$H_{pro} = \begin{pmatrix} g_1 \\ h_2 \\ \vdots \\ h_{m\times z-1} \\ h_{m\times z} \end{pmatrix} \tag{67}$$

Note that, in expression 67, expression 66 holds true.

Next, explanation is provided of a configuration method of $g_1$ in expression 67 for enabling finding parities sequentially and achieving high error correction capability.

One example of a configuration method of $g_1$ in expression 67 for enabling finding parities sequentially and achieving high error correction capability can be created by using a parity check polynomial that satisfies zero, according to expression 59, for the LDPC-CC based on a parity check polynomial having a coding rate of R=(n−1)/n and a time-varying period of m, which serves as the basis (i.e., the basic structure) of the LDPC-CC described in Patent Literature 2.

Since $g_1$ is the first row of the parity check matrix $H_{pro}$ for the LDPC-CC having a coding rate of R=(n−1)/n using the improved tail-biting scheme described in Patent Literature 2, (row number−1)% m=(1−1)% m=0. As such, $g_1$ is created from a parity check polynomial that satisfies zero that is obtained by transforming the zeroth parity check polynomial that satisfies zero among the parity check polynomials that satisfy zero, according to expression 59, for the LDPC-CC based on a parity check polynomial having a coding rate of R=(n−1)/n and a time-varying period of m, which serves as the basis (i.e., the basic structure) of the LDPC-CC described in Patent Literature 2.

[Math. 68]

$$\begin{aligned}(D^{b1,0}+1)P(D)+\sum_{k=1}^{n-1}A_{Xk,0}(D)X_k(D) &= A_{X1,0}(D)X_1(D)+ \\ &\quad A_{X2,0}(D)X_2(D)+\ldots+ \\ &\quad A_{Xn-1,0}(D)X_{n-1}(D)+ \\ &\quad (D^{b1,0}+1)P(D) \\ &= 0\end{aligned} \tag{68}$$

One example of a parity check polynomial that satisfies zero for generating a vector $g_1$ of the first row of the parity check matrix $H_{pro}$ for the LDPC-CC having a coding rate of R=(n−1)/n using the improved tail-biting scheme described in Patent Literature 2 is expressed as shown in expression 69, by using expression 59.

[Math. 69]

$$\begin{aligned}P(D)+\sum_{k=1}^{n-1}A_{Xk,0}(D)X_k(D) &= A_{X1,0}(D)X_1(D)+A_{X2,0}(D)X_2(D)+\ldots+ \\ &\quad A_{Xn-1,0}(D)X_{n-1}(D)+P(D) \\ &= 0\end{aligned} \tag{69}$$

Accordingly, a vector having one row and n×m×z columns that is created by performing tail-biting on expression 69 is the vector $g_1$.

Note that in the following, a parity check polynomial that satisfies zero, according to expression 69, is referred to as a parity check polynomial Y that satisfies zero.

Accordingly, the first row of the parity check matrix $H_{pro}$ for the LDPC-CC having a coding rate of R=(n−1)/n using the improved tail-biting scheme described in Patent Literature 2 can be obtained by transforming the parity check polynomial Y that satisfies zero, according to expression 69 (that is, a vector $g_1=c_1$ having one row and n×m×z columns can be obtained).

The transmission sequence (encoded sequence (codeword)) composed of an sth block of the LDPC-CC having a coding rate of R=(n−1)/n using the improved tail-biting scheme described in Patent Literature 2 is $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,k}, X_{s,2,k}, \ldots, X_{s,n-1,k}, P_{pro,s,k}, X_{s,1,m\times z}, X_{s,2,m\times z}, \ldots, X_{s,n-1,m\times z}, P_{pro,s,m\times z})^T$, and m×z parity check polynomials that satisfy zero are necessary for obtaining this transmission sequence $v_s$. Here, a parity check polynomial that satisfies zero appearing eth, when the m×z parity check polynomials that satisfy zero are arranged in sequential order, is referred to as an eth parity check polynomial that satisfies zero (where e is an integer no smaller than zero and less than or equal to m×z−1). As such, the m×z parity check polynomials that satisfy zero are arranged in the following order.

zeroth: zeroth parity check polynomial that satisfies zero first: first parity check polynomial that satisfies zero second: second parity check polynomial that satisfies zero

⋮ eth: eth parity check polynomial that satisfies zero

⋮

(m×z−2)th: (m×z−2)th parity check polynomial that satisfies zero (m×z−1)th: (m×z−1)th parity check polynomial that satisfies zero As such, the transmission sequence (encoded sequence (codeword)) $v_s$ of an sth block of the LDPC-CC having a coding rate of R=(n−1)/n using the improved tail-biting scheme described in Patent Literature 2 can be obtained. (Note that, as can be seen from the above, when expressing the parity check matrix $H_{pro}$ for the LDPC-CC having a coding rate of R=(n−1)/n using the improved tail-biting scheme described in Patent Literature 2 as shown in expression 64-2, a vector composed of the (e+1)th row of the parity check matrix $H_{pro}$ corresponds to the eth parity check polynomial that satisfies zero.)

Then, in the proposed LDPC-CC having a coding rate of R=(n−1)/n using the improved tail-biting scheme described in Patent Literature 2, the zeroth parity check polynomial that satisfies zero is the parity check polynomial Y that satisfies zero, according to expression 69, the first parity check polynomial that satisfies zero is the first parity check polynomial that satisfies zero, according to expression 59, the second parity check polynomial that satisfies zero is the second parity check polynomial that satisfies zero, according to expression 59,

⋮ the (m−2)th parity check polynomial that satisfies zero is the (m−2)th parity check polynomial that satisfies zero, according to expression 59, the (m−1)th parity check polynomial that satisfies zero is the (m−1)th parity check polynomial that satisfies zero, according to expression 59, the mth parity check polynomial that satisfies zero is the zeroth parity check polynomial that satisfies zero, according to expression 59, the (m+1)th parity check polynomial that satisfies zero is the first parity check polynomial that satisfies zero, according to expression 59, the (m+2)th parity check polynomial that satisfies zero is the second parity check polynomial that satisfies zero, according to expression 59,

⋮ the (2m−2)th parity check polynomial that satisfies zero is the (m−2)th parity check polynomial that satisfies zero, according to expression 59, the (2m−1)th parity check polynomial that satisfies zero is the (m−1)th parity check polynomial that satisfies zero, according to expression 59, the 2mth parity check polynomial that satisfies zero is the zeroth parity check polynomial that satisfies zero, according to expression 59, the (2m+1)th parity check polynomial that satisfies zero is the first parity check polynomial that satisfies zero, according to expression 59, the (2m+2)th parity check polynomial that satisfies zero is the second parity check polynomial that satisfies zero, according to expression 59,

⋮ the (m×z−2)th parity check polynomial that satisfies zero is the (m−2)th parity check polynomial that satisfies zero, according to expression 59, and the (m×z−1)th parity check polynomial that satisfies zero is the (m−1)th parity check polynomial that satisfies zero, according to expression 59.

That is, the zeroth parity check polynomial that satisfies zero is the parity check polynomial Y that satisfies zero, according to expression 69, and the eth parity check polynomial that satisfies zero (where e is an integer no smaller than one and less than or equal to m×z−1) is the e%mth parity check polynomial that satisfies zero, according to expression 59.

Further, when the LDPC-CC having a coding rate of R=(n−1)/n using the improved tail-biting scheme described in Patent Literature 2 satisfies Conditions #A1, #A2-1, and #A2-2 as described in the present embodiment, multiple parities can be found sequentially, and therefore, an advantageous effect of a reduction in the amount of computation (a reduction in circuit scale) can be achieved.

Note that, when Conditions #A1, #A2-1, #A2-2, and #A2-3 are satisfied, an advantageous effect is achieved such that a great number of parities can be found sequentially. (Alternatively, the same advantageous effect can be achieved when Conditions #A1, #A2-1, #A2-2, and #A2-3' are satisfied or when Conditions #A1, #A2-1, #A2-2, and #A2-3" are satisfied.)

In the following, explanation is provided of what is meant by enabling finding parities sequentially.

In the example described above, since $H_{pro}v_s=0$ holds true for the transmission sequence (encoded sequence (codeword)) $v_s$ composed of an sth block of the LDPC-CC having a coding rate of R=(n−1)/n using the improved tail-biting scheme described in Patent Literature 2, which is expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,k}, X_{s,2,k}, \ldots, X_{s,n-1,k}, P_{pro,s,1}, X_{s,1,m\times z}, X_{s,2,m\times z}, \ldots, X_{s,n-1,m\times z}, P_{pro,s,m\times z})^T$ (where k=1, 2, . . . , m×z−1,m×z), $g_1v_s=0$ holds true from expression 67. Since $g_1$ is obtained by transforming the parity check polynomial Y that satisfies zero, according to expression 69, $P_{pro,s,1}$ can be calculated from $g_1v_s=0$ ($P_{pro,s,1}$ can be determined since there is only one term of P(D) in a parity check polynomial that satisfies zero, according to expression 69).

Since $X_{s,j,k}$ is a known bit (i.e., a bit before encoding) for all j that is an integer no smaller than one and less than n−1 and all k that is an integer no smaller than one and less than or equal to m×z, and since $P_{pro,s,1}$ is already obtained, $g_{a[2]}v_s=0$ holds true for $g_{a[2]}$ (refer to expression 64-2) that is a vector in the a[2]th row (a[2]≠1) of $H_{pro}$ and $v_s$, and therefore, $P_{pro,s,a[2]}$ can be calculated.

Further, since $X_{s,j,k}$ is a known bit (i.e., a bit before encoding) for all j that is an integer no smaller than one and less than n−1 and all k that is an integer no smaller than one and less than or equal to m×z, and since $P_{pro,s,a[2]}$ is already obtained, $g_{a[3]}v_s=0$ holds true for $g_{a[3]}$ (refer to expression 64-2) that is a vector in the a[3]th row (a[3]≠1 and a[3]≠a[2]) of $H_{pro}$ and $v_s$, and therefore, $P_{pro,s,a[3]}$ can be calculated.

Similarly, since $X_{s,j,k}$ is a known bit (i.e., a bit before encoding) for all j that is an integer no smaller than one and less than n−1 and all k that is an integer no smaller than one and less than or equal to m×z, and since $P_{pro,s,a[3]}$ is already obtained, $g_{a[4]}v_s=0$ holds true for $g_{a[4]}$ (refer to expression 64-2) that is a vector in the a[4]th row (a[4]≠1, a[4]≠a[2], and a[4]≠a[3]) of $H_{pro}$ and $v_s$, and therefore, $P_{pro,s,a[4]}$ can be calculated.

By repeating the operations as described above, multiple parities $P_{pro,s,k}$ can be calculated. In the explanation provided above, the repetitive execution of such operations is referred to as finding parities sequentially, which has an advantageous effect such that circuit scale of an encoder (amount of computation performed by an encoder) can be reduced due to the multiple parities $P_{pro,s,k}$ being obtainable without calculation of complex simultaneous equations. Note that, when $P_{pro,s,k}$ can be calculated for all k that is an integer no smaller than one and less than or equal to m×z by repetitively performing similar operations as those described above, an advantageous effect is achieved such that circuit scale (amount of computation) can be reduced to be extremely small.

Note that in the description provided above, high error correction capability may be achieved when at least one of Conditions #A2-4, #A2-5, and #A2-6 is satisfied, but high error correction capability may also be achieved when none of Conditions #A2-4, #A2-5, and #A2-6 is satisfied.

As description has been provided above, the LDPC-CC having a coding rate of R=(n−1)/n using the improved tail-biting scheme described in Patent Literature 2, at the same time as achieving high error correction capability, enables finding multiple parities sequentially, and therefore, achieves an advantageous effect of reducing circuit scale of an encoder.

Note that, in a parity check polynomial that satisfies zero for the LDPC-CC based on a parity check polynomial having a coding rate of R=(n−1)/n and a time-varying period of m, which serves as the basis (i.e., the basic structure) of the LDPC-CC having a coding rate of R=(n−1)/n using the improved tail-biting scheme described in Patent Literature 2, high error correction capability may be achieved by setting the number of terms of either one of or all of information $X_1(D)$, $X_2(D)$, . . . , $X_{n-2}(D)$, and $X_{n-1}(D)$ to two or more or three or more. Further, in such a case, to achieve the effect of having an increased time-varying period when a Tanner graph is drawn, the time-varying period m is beneficially an odd number, and further, the conditions as provided in the following are effective, for example.

(1) The time-varying period m is a prime number.

(2) The time-varying period m is an odd number, and the number of divisors of m is small.

(3) The time-varying period m is assumed to be $\alpha\times\beta$, where $\alpha$ and $\beta$ are odd numbers other than one and are prime numbers.

(4) The time-varying period m is assumed to be $\alpha^n$, where $\alpha$ is an odd number other than one and is a prime number, and n is an integer no smaller than two.

(5) The time-varying period m is assumed to be $\alpha\times\beta\times\gamma$, where $\alpha$, $\beta$, and $\gamma$ are odd numbers other than one and are prime numbers.

(6) The time-varying period m is assumed to be $\alpha\times\beta\times\gamma\times\delta$, where, $\alpha$, $\beta$, $\gamma$, and $\delta$ are odd numbers other than one and are prime numbers.

(7) The time-varying period m is assumed to be $A^u\times B^v$, where, A and B are odd numbers other than one and are prime numbers, $A\neq B$, and u and v are integers no smaller than one.

(8) The time-varying period m is assumed to be $A^u\times B^v\times C^w$, where, A, B, and C are odd numbers other than one and are prime numbers, $A\neq B$, $A\neq C$, and $B\neq C$, and u, v, and w are integers no smaller than one.

(9) The time-varying period m is assumed to be $A^u\times B^v\times C^w\times D^x$, where, A, B, C, and D are odd numbers other than one and are prime numbers, $A\neq B$, $A\neq C$, $A\neq D$, $B\neq C$, $B\neq D$, and $C\neq D$, and u, v, w, and x are integers no smaller than one.

However, it is not necessarily true that a code having high error-correction capability cannot be obtained when the time-varying period m is an even number, and for example, the conditions as shown below may be satisfied when the time-varying period m is an even number.

(10) The time-varying period m is assumed to be $2^g\times K$, where, K is a prime number, and g is an integer no smaller than one.

(11) The time-varying period m is assumed to be $2^g\times L$, where, L is an odd number and the number of divisors of L is small, and g is an integer no smaller than one.

(12) The time-varying period m is assumed to be $2^g\times\alpha\times\beta$, where, $\alpha$ and $\beta$ are odd numbers other than one and are prime numbers, and g is an integer no smaller than one.

(13) The time-varying period m is assumed to be $2^g\times\alpha^n$, where, $\alpha$ is an odd number other than one and is a prime number, n is an integer no smaller than two, and g is an integer no smaller than one.

(14) The time-varying period m is assumed to be $2^g\times\alpha\times\beta\times\gamma$, where, $\alpha$, $\beta$, and $\gamma$ are odd numbers other than one and are prime numbers, and g is an integer no smaller than one.

(15) The time-varying period m is assumed to be $2^g\times\alpha\times\beta\times\gamma\times\delta$, where, $\alpha$, $\beta$, $\gamma$, and $\delta$ are odd numbers other than one and are prime numbers, and g is an integer no smaller than one.

(16) The time-varying period m is assumed to be $2^g\times A^u\times B^v$, where, A and B are odd numbers other than one and are prime numbers, $A\neq B$, u and v are integers no smaller than one, and g is an integer no smaller than one.

(17) The time-varying period m is assumed to be $2^g\times A^u\times B^v\times C^w$, where, A, B, and C are odd numbers other than one and are prime numbers, $A\neq B$, $A\neq C$, and $B\neq C$, u, v, and w are integers no smaller than one, and g is an integer no smaller than one.

(18) The time-varying period m is assumed to be $2^g\times A^u\times B^v\times C^w\times D^x$, where, A, B, C, and D are odd numbers other than one and are prime numbers, $A\neq B$, $A\neq C$, $A\neq D$, $B\neq C$, $B\neq D$, and $C\neq D$, u, v, w, and x are integers no smaller than one, and g is an integer no smaller than one.

As a matter of course, high error-correction capability may also be achieved when the time-varying period m is an odd number that does not satisfy the above conditions (1) through (9). Similarly, high error-correction capability may also be achieved when the time-varying period m is an even number that does not satisfy the above conditions (10) through (18).

In addition, when the time-varying period m is small, error floor may occur at a high bit error rate particularly for a small coding rate. When the occurrence of error floor is problematic in implementation in a communication system, a broadcasting system, a storage, a memory etc., it is desirable that the time-varying period m be set so as to be greater than three. However, when within a tolerable range of a system, the time-varying period m may be set so as to be less than or equal to three.

Next, explanation is provided of configurations and operations of an encoder and a decoder supporting the LDPC-CC having a coding rate of R=(n−1)/n using the improved tail-biting scheme described in Patent Literature 2.

In the following, one example case is considered where the LDPC-CC having a coding rate of R=(n−1)/n using the improved tail-biting scheme described in Patent Literature 2 is used in a communication system. When the LDPC-CC having a coding rate of R=(n−1)/n using the improved tail-biting scheme described in Patent Literature 2 is applied to a communication system, an encoder and a decoder for the LDPC-CC having a coding rate of R=(n−1)/n using the improved tail-biting scheme described in Patent Literature 2 are characterized for being configured and operating based on the parity check matrix $H_{pro}$ for the LDPC-CC having a coding rate of R=(n−1)/n using the improved tail-biting scheme described in Patent Literature 2 and the relation $H_{pro}v_s=0$.

Figure 25:
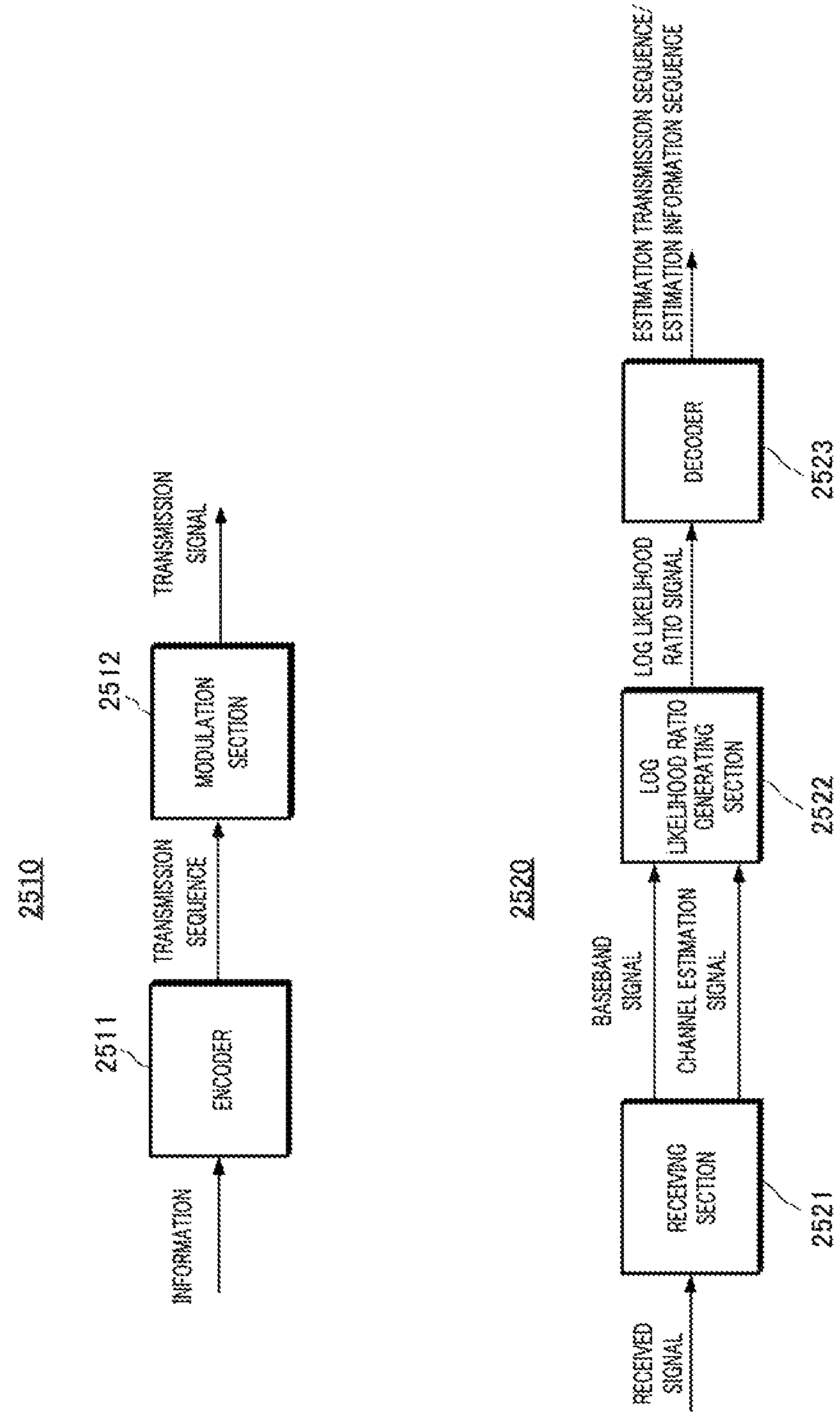
FIG. 25 is an overall diagram of a communication system.

Here, explanation is provided while referring to the overall diagram of the communication system in FIG. 25.

An encoder 2511 of a transmitting device 2501 takes an information sequence of an sth block ($X_{s,1,1}$, $X_{s,2,1}$, . . . , $X_{s,n-1,1}$, $X_{s,1,2}$, $X_{s,2,2}$, . . . , $X_{s,n-1,2}$, . . . , $X_{s,1,k}$, $X_{s,2,k}$, . . . , $X_{s,n-1,k}$, . . . , $X_{s,1,m\times z}$, $X_{s,2,m\times z}$, . . . , $X_{s,n-1,m\times z}$) as input, performs encoding based on the parity check matrix $H_{pro}$ for the LDPC-CC having a coding rate of R=(n−1)/n using the improved tail-biting scheme described in Patent Literature 2 and the relation $H_{pro}v_s=0$, and generates and outputs the transmission sequence (encoded sequence (codeword)) $v_s$ of the sth block of the LDPC-CC having a coding rate of R=(n−1)/n using the improved tail-biting scheme described in Patent Literature 2, which is expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,k}, X_{s,2,k}, \ldots, X_{s,n-1,k}, P_{pro,s,k}, X_{s,1,m\times z}, X_{s,2,m\times z}, \ldots, X_{s,n-1,m\times z}, P_{pro,s,m\times z})^T$. Here, note that, as explanation has been provided above, the LDPC-CC having a coding rate of R=(n−1)/n using the improved tail-biting scheme described in Patent Literature 2 is characterized for enabling finding parities sequentially.

A decoder 2523 of a receiving device 2520 in FIG. 25 takes as input a log-likelihood ratio of each bit of, for instance, the transmission sequence (encoded sequence (codeword)) $v_s$ c of the sth block, which is expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,k}, X_{s,2,k}, \ldots, X_{s,n-1,k}, P_{pro,s,k}, X_{s,1,m\times z}, X_{s,2,m\times z}, \ldots, X_{s,n-1,m\times z}, P_{pro,s,m\times z})^T$, output from a log-likelihood ratio generation section 2522, performs decoding according to the parity check matrix $H_{pro}$ for the LDPC-CC having a coding rate of R=(n−1)/n using the improved tail-biting scheme described in Patent Literature 2, and thereby obtains and outputs an estimation transmission sequence (an estimation encoded sequence) (a reception sequence). Here, the decoding performed by the decoder 2523 may be Belief Propagation (BP) decoding as described in, for instance, Non-Patent Literatures 4, 6, 7, and 8, including simple BP decoding such as min-sum decoding, offset BP decoding, and Normalized BP decoding, and Shuffled BP decoding and Layered BP decoding in which scheduling is performed with respect to the row operations (Horizontal operations) and the column operations (Vertical operations), or may be decoding for an LDPC code such as bit-flipping decoding described in Non-Patent Literature 17, etc.

Note that, although explanation has been provided on operations of an encoder and a decoder by taking a communication system as one example in the above, an encoder and a decoder may be used in the field of storages, memories, etc.

[Periodic Time-Varying LDPC-CC Based on Parity Check Polynomial and Using Improved Tail-Biting of Coding Rate (n−1)/n (where n is an Integer No Smaller than Two)]

The following provides a specific example of a configuration of a parity check matrix for the LDPC-CC (an LDPC block code using LDPC-CC) having a coding rate of R=(n−1)/n using the improved tail-biting scheme described in Patent Literature 2.

When assuming that a parity check matrix for the proposed LDPC-CC (an LDPC block code using LDPC-CC) having a coding rate of R=(n−1)/n (where n is an integer no smaller than two) using the improved tail-biting scheme described in Patent Literature 2 is $H_{pro}$, the number of columns of $H_{pro}$ can be expressed as n×m×z (where z is a natural number) (here, note that m is the time-varying period of the LDPC-CC based on a parity check polynomial having a coding rate of R=(n−1)/n, which serves as the basis of the proposed LDPC-CC).

Accordingly, a transmission sequence (encoded sequence (codeword)) composed of an n×m×z number of bits of an sth block of the LDPC-CC (an LDPC block code using LDPC-CC) having a coding rate of R=(n−1)/n using the improved tail-biting scheme described in Patent Literature 2 can be expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, X_{pro,s,m\times z-1}, \lambda_{pro,s,m\times z})^T$, and $H_{pro}v_s=0$ holds true (here, the zero in $H_{pro}v_s=0$ indicates that all elements of the vector are zeros). Here, $X_{s,j,k}$ represents an information bit $X_j$ (j is an integer no smaller than one and less than or equal to n−1), $P_{pro,s,k}$ represents the parity bit of the LDPC-CC (an LDPC block code using LDPC-CC) having a coding rate of R=(n−1)/n using the improved tail-biting scheme described in Patent Literature 2, and $\lambda_{pro,s,k}=(X_{s,1,k}, X_{s,2,k}, \ldots, X_{s,n-1,k}, P_{pro,s,k})$ (accordingly, $\lambda_{pro,s,k}=(X_{s,1,k}, P_{pro,s,k})$ when n=2, $\lambda_{pro,s,k}=(X_{s,1,k}, X_{s,2,k}, P_{pro,s,k})$ when n=3, $\lambda_{pro,s,k}=(X_{s,1,k}, X_{s,2,k}, X_{s,3,k}, P_{pro,s,k})$ when n=4, $\lambda_{pro,s,k}=(X_{s,1,k}, X_{s,2,k}, X_{s,3,k}, X_{s,4,k}, P_{pro,s,k})$ when n=5, and $\lambda_{pro,s,k}=(X_{s,1,k}, X_{s,2,k}, X_{s,3,k}, X_{s,4,k}, X_{s,5,k}, P_{pro,s,k})$ when n=6). Here, k=1, 2, . . . , m×z−1, m×z, or that is, k is an integer no smaller than one and less than or equal to m×z. Further, the number of rows of $H_{pro}$, which is the parity check matrix for the LDPC-CC (an LDPC block code using LDPC-CC) having a coding rate of R=(n−1)/n using the improved tail-biting scheme described in Patent Literature 2, is m×z.

In addition, as explained above, an ith parity check polynomial (where i is an integer no smaller than zero and less than or equal to m−1) for the LDPC-CC based on a parity check polynomial having a coding rate of R=(n−1)/n and a time-varying period of m, which serves as the basis of the LDPC-CC having a coding rate of R=(n−1)/n using the improved tail-biting scheme described in Patent Literature 2, can be expressed as shown in expression 59.

Here, an ith parity check polynomial that satisfies zero, according to expression 59, is expressed as shown in expression 70.

[Math. 70]

$$
\begin{aligned}
(D^{b1,i}+1)P(D)+\sum_{k=1}^{n-1}A_{Xk,i}(D)X_k(D) &= A_{X1,i}(D)X_1(D)+A_{X2,i}(D)X_2(D)+\ldots+A_{Xn-1,i}(D)X_{n-1}(D)+(D^{b1,i}+1)P(D)\\
&=(D^{b1,i}+1)P(D)+\sum_{k=1}^{n-1}\left\{\left(1+\sum_{j=1}^{r_{k,i}}D^{ak,i,j}\right)X_k(D)\right\}\\
&=(D^{a1,i,1}+D^{a1,i,2}+\ldots+D^{a1,i,r_1}+1)X_1(D)+(D^{a2,i,1}+D^{a2,i,2}+\ldots+D^{a2,i,r_2}+1)X_2(D)+\ldots+\\
&\quad(D^{an-1,i,1}+D^{an-1,i,2}+\ldots+D^{an-1,i,r_{n-1}}+1)X_{n-1}(D)+(D^{b1,i}+1)P(D)\\
&=0
\end{aligned}
\tag{70}
$$

In expression 70, $a_{p,i,q}$ (p=1, 2, . . . , n—1 (p is an integer no smaller than one and less than or equal to n−1); q=1, 2, . . . , $r_p$ (q is an integer no smaller than one and less than or equal to $r_p$)) is a natural number. Also, when y, z=1, 2, . . . , $r_p$ (y and z are integers no smaller than one and less than or equal to $r_p$) and y≠z, and $a_{p,i,y}\neq a_{p,i,z}$ holds true for conforming $\forall$(y, z) (for all conforming y and z).

Further, in order to achieve high error correction capability, each of $r_1, r_2, \ldots, r_{n-2}, r_{n-1}$ is set to three or greater (k is an integer no smaller than one and less than or equal to n−1, and $r_k$ is three or greater for all conforming k). In other words, k is an integer no smaller than one and less than or equal to n−1 in expression 70, and the number of terms of $X_k(D)$ is four or greater for all conforming k. Also, $b_{1,i}$ is a natural number.

As such, expression 69, which is a parity check polynomial that satisfies zero for generating a vector of the first row of the parity check matrix $H_{pro}$ for the LDPC-CC (an LDPC block code using LDPC-CC) having a coding rate of R=(n−1)/n (where n is an integer no smaller than two) using the improved tail-biting scheme described in Patent Literature 2, is expressed as shown in expression 71 (is expressed by using the zeroth parity check polynomial that satisfies zero, according to expression 70).

[Math. 71]

$$P(D)+\sum_{k=1}^{n-1}A_{Xk,0}(D)X_k(D) = A_{X1,0}(D)X_1(D) + A_{X2,0}(D)X_2(D)+\ldots+A_{Xn-1,0}(D)X_{n-1}(D)+P(D)$$
$$= P(D)+\sum_{k=1}^{n-1}\left\{\left(1+\sum_{j=1}^{r_k}D^{ak,0,j}\right)X_k(D)\right\}$$
$$= (D^{a1,0,1}+D^{a1,0,2}+\ldots+D^{a1,0,r_1}+1)X_1(D)+(D^{a2,0,1}+D^{a2,0,2}+\ldots+D^{a2,0,r_2}+1)X_2(D)+\ldots+(D^{an-1,0,1}+D^{an-1,0,2}+\ldots+D^{an-1,0,r_{n-1}}+1)X_{n-1}(D)+P(D)$$
$$= 0 \tag{71}$$

Note that the zeroth parity check polynomial (that satisfies zero), according to expression 70, that is used for generating expression 71 is expressed as shown in expression 72.

[Math. 72]

$$(D^{b1,0}+1)P(D)+\sum_{k=1}^{n-1}A_{Xk,0}(D)X_k(D) = A_{X1,0}(D)X_1(D)+A_{X2,0}(D)X_2(D)+\ldots+A_{Xn-1,0}(D)X_{n-1}(D)+(D^{b1,0}+1)P(D)$$
$$= (D^{b1,0}+1)P(D)+\sum_{k=1}^{n-1}\left\{\left(1+\sum_{j=1}^{r_k}D^{ak,0,j}\right)X_k(D)\right\}$$
$$= (D^{a1,0,1}+D^{a1,0,2}+\ldots+D^{a1,0,r_1}+1)X_1(D)+(D^{a2,0,1}+D^{a2,0,2}+\ldots+D^{a2,0,r_2}+1)X_2(D)+\ldots+(D^{an-1,0,1}+D^{an-1,0,2}+\ldots+D^{an-1,0,r_{n-1}}+1)X_{n-1}(D)+(D^{b1,0}+1)P(D)$$
$$= 0 \tag{72}$$

As described above, the transmission sequence (encoded sequence (codeword)) composed of an n×m×z number of bits of an sth block of the LDPC-CC (an LDPC block code using LDPC-CC) having a coding rate of R=(n−1)/n using the improved tail-biting scheme described in Patent Literature 2 is $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and m×z parity check polynomials that satisfy zero are necessary for obtaining this transmission sequence $v_s$. Here, a parity check polynomial that satisfies zero appearing eth, when the m×z parity check polynomials that satisfy zero are arranged in sequential order, is referred to as an eth parity check polynomial that satisfies zero (where e is an integer no smaller than zero and less than or equal to m×z−1). As such, the m×z parity check polynomials that satisfy zero are arranged in the following order.

zeroth: zeroth parity check polynomial that satisfies zero first: first parity check polynomial that satisfies zero second: second parity check polynomial that satisfies zero

⋮ eth: eth parity check polynomial that satisfies zero

⋮

(m×z−2)th: (m×z−2)th parity check polynomial that satisfies zero (m×z−1)th: (m×z−1)th parity check polynomial that satisfies zero As such, the transmission sequence (encoded sequence (codeword)) $v_s$ of an sth block of the LDPC-CC (an LDPC block code using LDPC-CC) having a coding rate of R=(n−1)/n using the improved tail-biting scheme described in Patent Literature 2 can be obtained. (Note that a vector composed of the (e+1)th row of the parity check matrix $H_{pro}$ for the LDPC-CC (an LDPC block code using LDPC-CC) having a coding rate of R=(n−1)/n using the improved tail-biting scheme described in Patent Literature 2 corresponds to the eth parity check polynomial that satisfies zero.)

From the explanation provided above, in the LDPC-CC (an LDPC block code using LDPC-CC) having a coding rate of R=(n−1)/n using the improved tail-biting scheme described in Patent Literature 2, the zeroth parity check polynomial that satisfies zero is a parity check polynomial that satisfies zero, according to expression 71, the first parity check polynomial that satisfies zero is the first parity check polynomial that satisfies zero, according to expression 70, the second parity check polynomial that satisfies zero is the second parity check polynomial that satisfies zero, according to expression 70,

⋮ the (m−2)th parity check polynomial that satisfies zero is the (m−2)th parity check polynomial that satisfies zero, according to expression 70, the (m−1)th parity check polynomial that satisfies zero is the (m−1)th parity check polynomial that satisfies zero, according to expression 70, the mth parity check polynomial that satisfies zero is the zeroth parity check polynomial that satisfies zero, according to expression 70, the (m+1)th parity check polynomial that satisfies zero is the first parity check polynomial that satisfies zero, according to expression 70, the (m+2)th parity check polynomial that satisfies zero is the second parity check polynomial that satisfies zero, according to expression 70,

⋮ the (2m−2)th parity check polynomial that satisfies zero is the (m−2)th parity check polynomial that satisfies zero, according to expression 70, the (2m−1)th parity check polynomial that satisfies zero is the (m−1)th parity check polynomial that satisfies zero, according to expression 70, the 2mth parity check polynomial that satisfies zero is the zeroth parity check polynomial that satisfies zero, according to expression 70, the (2m+1)th parity check polynomial that satisfies zero is the first parity check polynomial that satisfies zero, according to expression 70, the (2m+2)th parity check polynomial that satisfies zero is the second parity check polynomial that satisfies zero, according to expression 70,

⋮ the (m×z−2)th parity check polynomial that satisfies zero is the (m−2)th parity check polynomial that satisfies zero, according to expression 70, and the (m×z−1)th parity check polynomial that satisfies zero is the (m−1)th parity check polynomial that satisfies zero, according to expression 70.

That is, the zeroth parity check polynomial that satisfies zero is the parity check polynomial that satisfies zero, according to expression 71, and the eth parity check polynomial that satisfies zero (where e is an integer no smaller than one and less than or equal to m×z−1) is the e%mth parity check polynomial that satisfies zero, according to expression 70.

In the present embodiment (in fact, commonly applying to the entirety of the present disclosure), % means a modulo, and for example, α%q represents a remainder after dividing α by q (where α is an integer no smaller than zero, and q is a natural number).

Next, detailed explanation is provided of a configuration of a parity check matrix in the case described above.

As described above, a transmission sequence (encoded sequence (codeword)) composed of an n×m×z number of bits of an sth block of the LDPC-CC (an LDPC block code using LDPC-CC), which is definable by expression 70 and expression 71, having a coding rate of R=(n−1)/n using the improved tail-biting scheme described in Patent Literature 2 can be expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,n-1,m\times z-1}, X_{s,n-2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and $H_{pro}v_s=0$ holds true (here, the zero in $H_{pro}v_s=0$ indicates that all elements of the vector are zeros). Here, $X_{s,j,k}$ represents an information bit (j is an integer no smaller than one and less than or equal to n−1), $P_{pro,s,k}$ represents the parity bit of the LDPC-CC (an LDPC block code using LDPC-CC) having a coding rate of R=(n−1)/n using the improved tail-biting scheme described in Patent Literature 2, and $\lambda_{pro,s,k}=(X_{s,1,k}, X_{s,2,k}, \ldots, X_{s,n-1,k}, P_{pro,s,k})$ (accordingly, $\lambda_{pro,s,k}=(X_{s,1,k}, P_{pro,s,k})$ when n=2, $\lambda_{pro,s,k}=(X_{s,1,k}, X_{s,2,k}, P_{pro,s,k})$ when n=3, $\lambda_{pro,s,k}=(X_{s,1,k}, X_{s,2,k}, X_{s,3,k}, P_{pro,s,k})$ when n=4, $\lambda_{pro,s,k}=(X_{s,1,k}, X_{s,2,k}, X_{s,3,k}, X_{s,4,k}, P_{pro,s,k})$ when n=5, and $\lambda_{pro,s,k}+(X_{s,1,k}, X_{s,2,k}, X_{s,3,k}, X_{s,4,k}, X_{s,5,k}, P_{pro,s,k})$ when n=6). Here, k=1, 2, . . . , m×z−1, m×z, or that is, k is an integer no smaller than one and less than or equal to m×z. Further, the number of rows of $H_{pro}$, which is the parity check matrix for the LDPC-CC (an LDPC block code using LDPC-CC) having a coding rate of R=(n−1)/n using the improved tail-biting scheme described in Patent Literature 2, is m×z.

In the following, explanation is provided of a configuration, when tail-biting is performed according to the improved tail-biting scheme, of the parity check matrix $H_{pro}$ for the LDPC-CC (an LDPC block code using LDPC-CC) having a coding rate of R=(n−1)/n using the improved tail-biting scheme described in Patent Literature 2 while referring to FIGS. 26 and 27.

When assuming a sub-matrix (vector) corresponding to the parity check polynomial shown in expression 70, which is the ith parity check polynomial (where i is an integer no smaller than zero and less than or equal to m−1) for the LDPC-CC based on a parity check polynomial having a coding rate of R=(n−1)/n and a time-varying period of m, which serves as the basis of the LDPC-CC having a coding rate of R=(n−1)/n using the improved tail-biting scheme described in Patent Literature 2, to be $H_i$, an ith sub-matrix $H_i$ is expressed as shown in expression 73.

[Math. 73]

$$H_i = \left\{ H_i', \underbrace{11 \ldots 1}_{n} \right\} \tag{73}$$

In expression 73, the n consecutive ones correspond to the terms $D^0X_1(D)=1\times X_1(D)$, $D^0X_2(D)=1\times X_2(D)$, . . . , $D^0X_{n-1}(D)=1\times X_{n-1}(D)$ (that is, $D^0X_k(D)=1\times X_k(D)$, where k is an integer no smaller than one and less than or equal to n−1), and $D^0P(D)=1\times P(D)$ in each form of expression 70.

Figure 26:
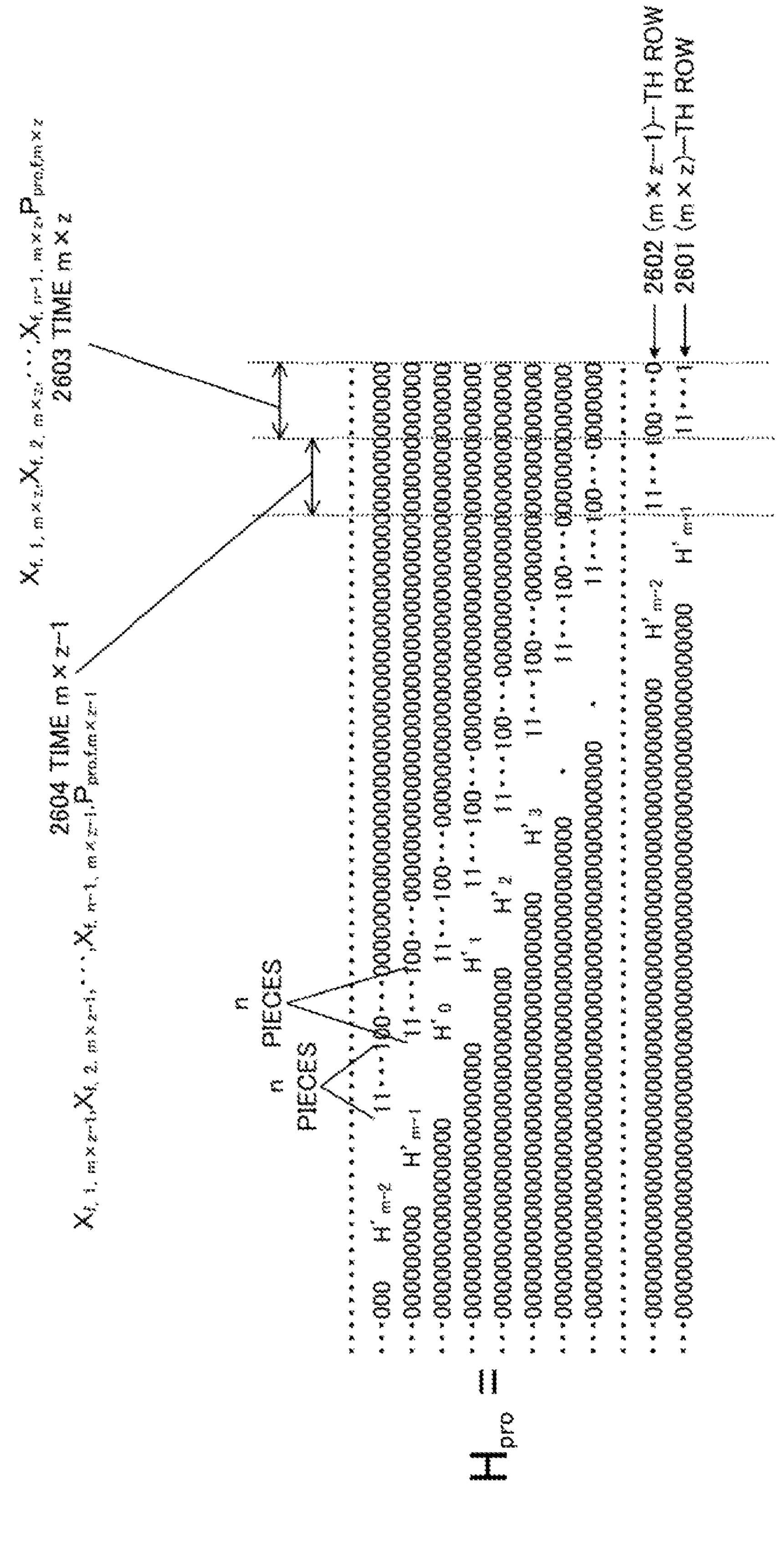
FIG. 26 shows an example of the configuration of check matrix when improved tail-biting is performed.

A parity check matrix $H_{pro}$ in the vicinity of time m×z, among the parity check matrix $H_{pro}$ corresponding to the above-defined transmission sequence $v_s$ for the LDPC-CC (an LDPC block code using LDPC-CC) having a coding rate of R=(n−1)/n using the improved tail-biting scheme described in Patent Literature 2 when tail-biting is performed according to the improved tail-biting scheme, is shown in FIG. 26. As shown in FIG. 26, a configuration is employed in which a sub-matrix is shifted n columns to the right between an ith row and an (i+1)th row in the parity check matrix $H_{pro}$ (see FIG. 26).

Also, in FIG. 26, a reference sign 2601 indicates the (m×z)th (i.e., the last) row of the parity check matrix $H_{pro}$, and corresponds to the (m−1)th parity check polynomial that satisfies zero, according to expression 70, as described above. Similarly, a reference sign 2602 indicates the (m×z−1)th row of the parity check matrix $H_{pro}$, and corresponds to the (m−2)th parity check polynomial that satisfies zero, according to expression 70, as described above. Further, a reference sign 2603 indicates a column group corresponding to time point m×z, and the column group of the reference sign 2603 is arranged in the order of: $X_{s,1,m\times z}$; $X_{s,2,m\times z}$; $X_{s,n-1,m\times z}$; . . . , and $P_{pro,s,m\times z}$. A reference sign 2604 indicates a column group corresponding to time point m×z−1, and the column group of the reference sign 2604 is arranged in the order of: $X_{s,1,m\times z-1}$; $X_{s,2,m\times z-1}$; $X_{s,n-1,m\times z-1}$; and $P_{pro,s,m\times z-1}$.

Figure 27:
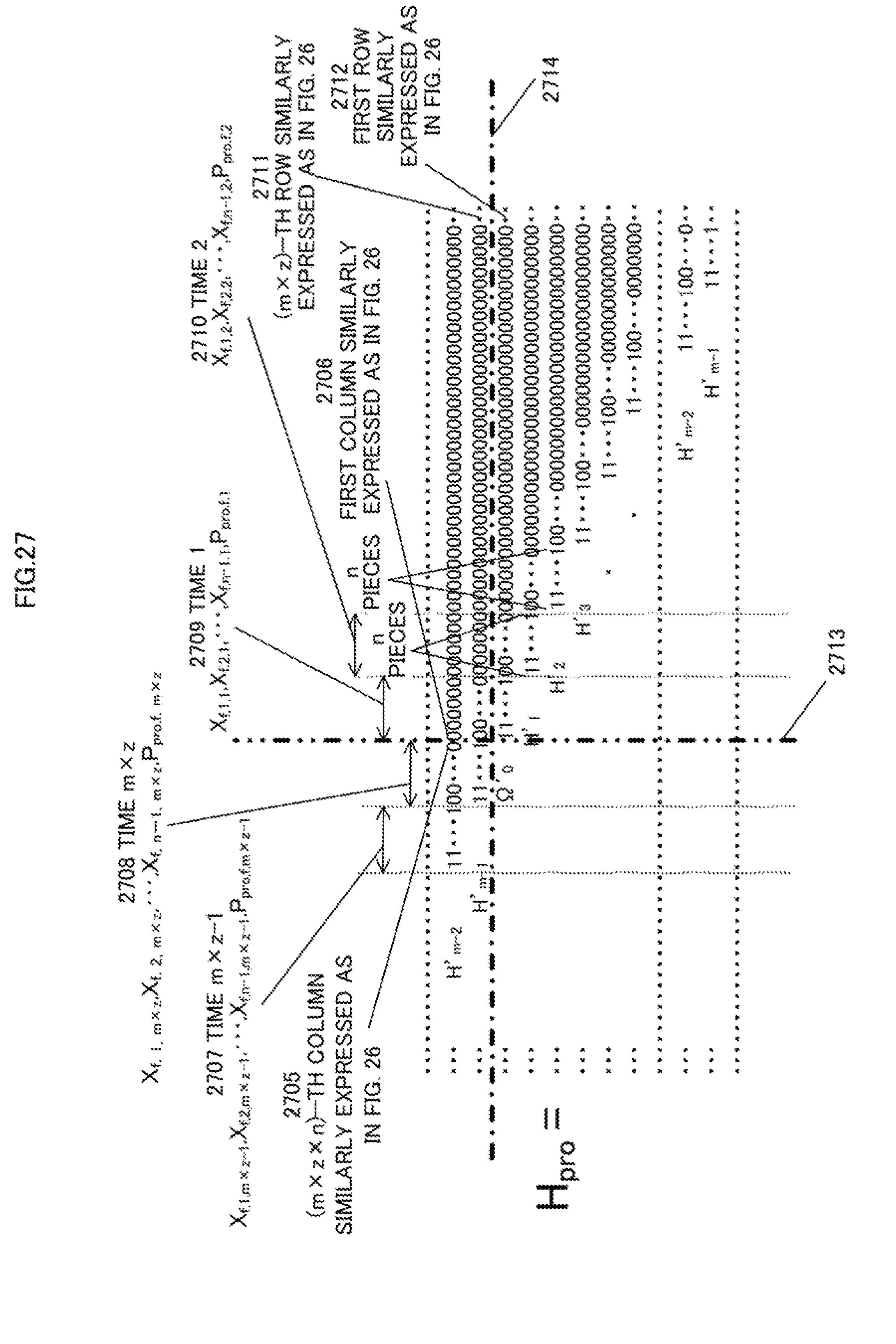
FIG. 27 shows an example of the configuration of check matrix when improved tail-biting is performed.

Next, a parity check matrix $H_{pro}$ in the vicinity of times m×z−1, m×z, 1, 2, among the parity check matrix $H_{pro}$ corresponding to a reordered transmission sequence, specifically $v_s=(\ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z}, \ldots, X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots,)^T$ is shown in FIG. 27. In this case, the portion of the parity check matrix $H_{pro}$ shown in FIG. 27 is the characteristic portion of the parity check matrix $H_{pro}$ when tail-biting is performed according to the improved tail-biting scheme. As shown in FIG. 27, a configuration is employed in which a sub-matrix is shifted n columns to the right between an ith row and an (i+1)th row in the parity check matrix $H_{pro}$ when the transmission sequence is reordered (refer to FIG. 27).

Also, in FIG. 27, when the parity check matrix is expressed as shown in FIG. 26, a reference sign 2705 indicates a column corresponding to a (m×z×n)th column and a reference sign 2706 indicates a column corresponding to the first column.

A reference sign 2707 indicates a column group corresponding to time point m×z−1, and the column group of the reference sign 2707 is arranged in the order of: $X_{s,1,m\times z-1}$; $X_{s,2,m\times z-1}$; . . . , $X_{s,n-1,m\times z-1}$; and $P_{pro,s,m\times z-1}$. Further, a reference sign 2708 indicates a column group corresponding to time point m×z, and the column group of the reference sign 2708 is arranged in the order of: $X_{s,1,m\times z}$; $X_{s,2,m\times z}$; . . . , $X_{s,n-1,m\times z}$; and $P_{pro,s,m\times z}$. A reference sign 2709 indicates a column group corresponding to time point one, and the column group of the reference sign 2709 is arranged in the order of: $X_{s,1,1}$; $X_{s,2,1}$; . . . , $X_{s,n-1,1}$; and $P_{pro,s,1}$. A reference sign 2710 indicates a column group corresponding to time point two, and the column group of the reference sign 2710 is arranged in the order of: $X_{s,1,2}$; $X_{s,2,2}$; . . . , $X_{s,n-1,2}$; and $P_{pro,s,2}$.

When the parity check matrix is expressed as shown in FIG. 26, a reference sign 2711 indicates a row corresponding to a (m×z)th row and a reference sign 2712 indicates a row corresponding to the first row. Further, the characteristic portions of the parity check matrix H when tail-biting is performed according to the improved tail-biting scheme are the portion left of the reference sign 2713 and below the reference sign 2714 in FIG. 27 and the portion corresponding to the first row indicated by the reference sign 2712 in FIG. 27 when the parity check matrix is expressed as shown in FIG. 26.

When assuming a sub-matrix (vector) corresponding to expression 71, which is the parity check polynomial that satisfies zero for generating a vector of the first row of the parity check matrix $H_{pro}$ for the LDPC-CC (an LDPC block code using LDPC-CC) having a coding rate of R=(n−1)/n (where n is an integer no smaller than two) using the improved tail-biting scheme described in Patent Literature 2, to be $\Omega_0$, $\Omega_0$ can be expressed as shown in expression 74.

[Math. 74]

$$\Omega_0 = \left\{\Omega'_0, \underbrace{11 \ldots 1}_{n}\right\} \tag{74}$$

In expression 74, the n consecutive ones correspond to the terms $D^0X_1(D)=1\times X_1(D)$, $D^0X_2(D)=1\times X_2(D)$, . . . , $D^0X_{n-1}(D)=1\times X_{n-1}(D)$ (that is, $D^0X_k(D)=1\times X_k(D)$, where k is an integer no smaller than one and less than or equal to n−1), and $D^0P(D)=1\times P(D)$ in each form of expression 71.

Then, the row corresponding to the first row indicated by the reference sign 2712 in FIG. 27 when the parity check matrix is expressed as shown in FIG. 26 can be expressed by using expression 74 (refer to reference sign 2712 in FIG. 27). Further, the rows other than the row corresponding to the reference sign 2712 in FIG. 27 (i.e., the row corresponding to the first row when the parity check matrix is expressed as shown in FIG. 26) are rows each corresponding to one of the parity check polynomials that satisfy zero according to expression 70, which is the ith parity check polynomial (where i is an integer no smaller than zero and less than or equal to m−1) for the LDPC-CC based on a parity check polynomial having a coding rate of R=(n−1)/n and a time-varying period of m, which serves as the basis of the LDPC-CC having a coding rate of R=(n−1)/n using the improved tail-biting scheme described in Patent Literature 2 (as explanation has been provided above).

To provide a supplementary explanation of the above, although not shown in FIG. 26, in the parity check matrix $H_{pro}$ for the LDPC-CC (an LDPC block code using LDPC-CC) having a coding rate of R=(n−1)/n using the improved tail-biting scheme described in Patent Literature 2 as expressed in FIG. 26, a vector obtained by extracting the first row of the parity check matrix $H_{pro}$ is a vector corresponding to expression 71, which is a parity check polynomial that satisfies zero.

Further, a vector composed of the (e+1)th row (where e is an integer no smaller than one and less than or equal to m×z−1) of the parity check matrix $H_{pro}$ for the LDPC-CC (an LDPC block code using LDPC-CC) having a coding rate of R=(n−1)/n using the improved tail-biting scheme described in Patent Literature 2 as expressed in FIG. 26, corresponds to an e%mth parity check polynomial that satisfies zero, according to expression 70, which is the ith parity check polynomial (where i is an integer no smaller than zero and less than or equal to m−1) for the LDPC-CC based on a parity check polynomial having a coding rate of R=(n−1)/n and a time-varying period of m, which serves as the basis of the LDPC-CC having a coding rate of R=(n−1)/n using the improved tail-biting scheme described in Patent Literature 2.

In the description provided above, for ease of explanation, explanation has been provided of the parity check matrix for the LDPC-CC in the present embodiment, which is definable by expression 70 and expression 71, having a coding rate of R=(n−1)/n using the improved tail-biting scheme described in Patent Literature 2. However, a parity check matrix for the LDPC-CC, which is definable by expression 59 and expression 68, having a coding rate of R=(n−1)/n using the improved tail-biting scheme described in Patent Literature 2 can be generated in a similar manner as described above.

Next, explanation is provided of a parity check polynomial matrix that is equivalent to the above-described parity check matrix for the LDPC-CC, which is definable by expression 70 and expression 71, having a coding rate of R=(n−1)/n using the improved tail-biting scheme described in Patent Literature 2.

In the above, explanation has been provided of the configuration of the parity check matrix $H_{pro}$ for the LDPC-CC (an LDPC block code using LDPC-CC) having a coding rate of R=(n−1)/n using the improved tail-biting scheme described in Patent Literature 2 where the transmission sequence (encoded sequence (codeword)) of an sth block is $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and $H_{pro}v_s=0$ holds true (here, the zero in $H_{pro}v_s=0$ indicates that all elements of the vector are zeros). In the following, explanation is provided of a configuration of a parity check matrix $H_{pro\_m}$ for the LDPC-CC (an LDPC block code using LDPC-CC) having a coding rate of R=(n−1)/n using the improved tail-biting scheme described in Patent Literature 2 where $H_{pro\_m}u_s=0$ holds true (here, the zero in $H_{pro\_m}u_s=0$ indicates that all elements of the vector are zeros) when a transmission sequence (encoded sequence (codeword)) of an sth block is expressed as $u_s=(X_{s,1,1}, X_{s,1,2}, \ldots, X_{s,1,m\times z}, X_{s,2,1}, X_{s,2,2}, \ldots, X_{s,2,m\times z}, \ldots, X_{s,n-2,1}, X_{s,n-2,2}, \ldots, X_{s,n-2,m\times z}, X_{s,n-1,1}, X_{s,n-1,2}, \ldots, X_{s,n-1,m\times z}, P_{pro,s,1}, P_{pro,s,2}, \ldots, P_{pro,s,m\times z})^T=(\Lambda_{X1,s}, \Lambda_{X2,s}, \Lambda_{X3,s}, \ldots, \Lambda X_{n-2,s}, \Lambda_{Xn-1,s}, \Lambda_{pro,s})^T$.

Here, note that $\Lambda_{Xk,s}$ is expressible as $\Lambda_{Xk,s}=(X_{s,k,1}, X_{s,k,2}, X_{s,k,3}, \ldots, X_{s,k,m\times z-2}, X_{s,k,m\times z-1}, X_{s,k,m\times z})$ (where k is an integer no smaller than one and less than or equal to n−1) and $\Lambda_{pro,s}$ is expressible as $\Lambda_{pro,s}=(P_{pro,s,1}, P_{pro,s,2}, P_{pro,s,3}, \ldots, P_{pro,s,m\times z-2}, P_{pro,s,m\times z-1}, P_{pro,s,m\times z})$. Accordingly, for example, $u_s=(\Lambda_{X1,s}, \Lambda_{pro,s})^T$ when n=2, $u_s=(\Lambda_{X1,s}, \Lambda_{X2,s}, \Lambda_{pro,s})^T$ when n=3, $u_s=(\Lambda_{X1,s}, \Lambda_{X2,s}, \Lambda_{X3,s}, \Lambda_{pro,s})^T$ when n=4, $u_s=(\Lambda_{X1,s}, \Lambda_{X2,s}, \Lambda_{X3,s}, \Lambda_{X4,s}, \Lambda_{pro,s})^T$ when n=5, $u_s=(\Lambda_{X1,s}, \Lambda_{X2,s}, \Lambda_{X3,s}, \Lambda_{X4,s}, \Lambda_{X5,s}, \Lambda_{pro,s})^T$ when n=6, $u_s=(\Lambda_{X1,s}, \Lambda_{X2,s}, \Lambda_{X3,s}, \Lambda_{X4,s}, \Lambda_{X5,s}, \Lambda_{X6,s}, \Lambda_{pro,s})^T$ when n=7, and $u_s=(\Lambda_{X1,s}, \Lambda_{X2,s}, \Lambda_{X3,s}, \Lambda_{X4,s}, \Lambda_{X5,s}, \Lambda_{X6,s}, \Lambda_{X7,s}, \Lambda_{pro,s})^T$ when n=8.

Figure 28:
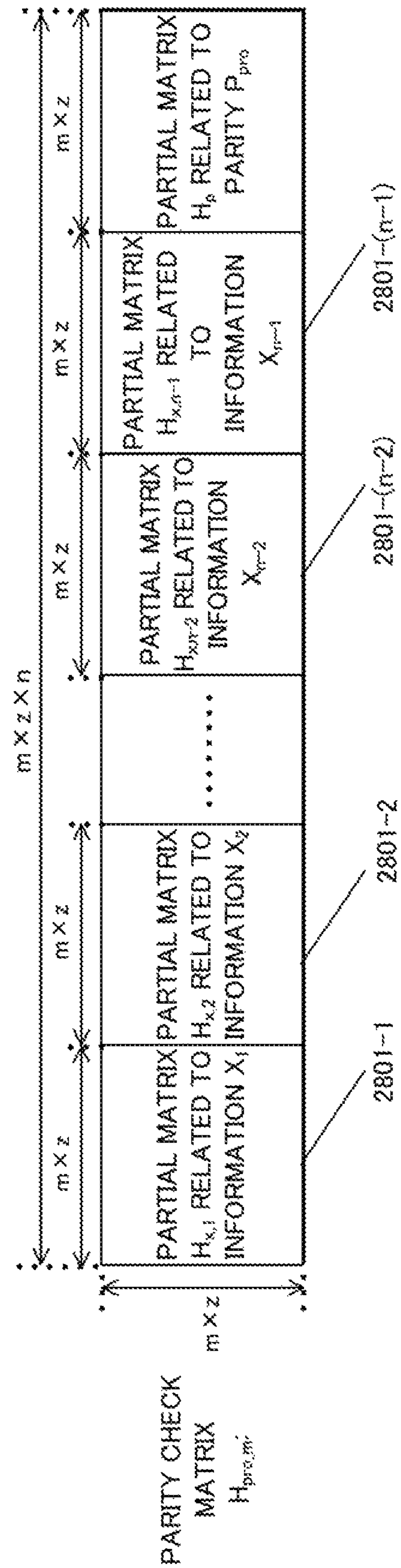
FIG. 28 shows an example of the configuration of check matrix when improved tail-biting is performed.

Here, since an m×z number of information bits $X_1$ are included in one block, an m×z number of information bits $X_2$ are included in one block, . . . , an m×z number of information bits $X_{n-2}$ are included in one block, an m×z number of information bits $X_{n-1}$, are included in one block (as such, an m×z number of information bits $X_k$ are included in one block (where k is an integer no smaller than one and less than or equal to n−1)), and an m×z number of parity bits $P_{pro}$ are included in one block, the parity check matrix $H_{pro\_m}$ for the LDPC-CC (an LDPC block code using LDPC-CC) having a coding rate of R=(n−1)/n using the improved tail-biting scheme described in Patent Literature 2 can be expressed as $H_{pro\_m}=[H_{x,1}, H_{x,2}, \ldots, H_{x,n-2}, H_{x,n-1}, H_p]$ as shown in FIG. 28.

Further, since the transmission sequence (encoded sequence (codeword)) of an sth block is expressed as $u_s=(X_{s,1,1}, X_{s,1,2}, \ldots, X_{s,1,m\times z}, X_{s,2,1}, X_{s,2,2}, \ldots, X_{s,2,m\times z}, \ldots, X_{s,n-2,1}, X_{s,n-2,2}, \ldots, X_{s,n-2,m\times z}, X_{s,n-1,1}, X_{s,n-1,2}, \ldots, X_{s,n-1,m\times z}, P_{pro,s,1}, P_{pro,s,2}, \ldots, P_{pro,s,m\times z})^T=(\Lambda_{X1,s}, \Lambda_{X2,s}, \Lambda_{X3,s}, \ldots, \Lambda_{Xn-2,s}, \Lambda_{Xn-1,s}, \Lambda_{pro,s})^T$, $H_{x,1}$ is a partial matrix pertaining to information $X_1$, $H_{x,2}$ is a partial matrix pertaining to information $X_2$, . . . , $H_{x,n-2}$ is a partial matrix pertaining to information $X_{n-2}$, $H_{x,n-1}$ is a partial matrix pertaining to information $X_{n-1}$ (as such, $H_{x,k}$ is a partial matrix pertaining to information $X_k$ (where k is an integer no smaller than one and less than or equal to n−1)), and $H_p$ is a partial matrix pertaining to a parity $P_{pro}$. In addition, as shown in FIG. 28, the parity check matrix $H_{pro\_m}$ is a matrix having m×z rows and n×m×z columns, the partial matrix $H_{x,1}$ pertaining to information $X_1$ is a matrix having m×z rows and m×z columns, the partial matrix $H_{x,2}$ pertaining to information $X_2$ is a matrix having m×z rows and m×z columns, . . . , the partial matrix $H_{x,n-2}$ pertaining to information $X_{n-2}$ is a matrix having m×z rows and m×z columns, the partial matrix $H_{x,n-1}$ pertaining to information $X_{n-1}$ is a matrix having m×z rows and m×z columns (as such, the partial matrix $H_{x,k}$ pertaining to information $X_k$ is a matrix having m×z rows and m×z columns (where k is an integer no smaller than one and less than or equal to n−1)), and the partial matrix $H_p$ pertaining to the parity $P_{pro}$ is a matrix having m×z rows and m×z columns.

The transmission sequence (encoded sequence (codeword)) composed of an n×m×z number of bits of an sth block of the LDPC-CC (an LDPC block code using LDPC-CC) having a coding rate of R=(n−1)/n using the improved tail-biting scheme described in Patent Literature 2 is $u_s=(X_{s,1,1}, X_{s,1,2}, \ldots, X_{s,1,m\times z}, X_{s,2,1}, X_{s,2,2}, \ldots, X_{s,2,m\times z}, \ldots, X_{s,n-2,1}, X_{s,n-2,2}, \ldots, X_{s,n-2,m\times z}, X_{s,n-1,1}, X_{s,n-1,2}, \ldots, X_{s,n-1,m\times z}, P_{pro,s,1}, P_{pro,s,2}, \ldots, P_{pro,s,m\times z})^T=(\Lambda_{X1,s}, \Lambda_{X2,s}, \Lambda_{X3,s}, \ldots, \Lambda_{Xn-2,s}, \Lambda_{Xn-1,s}, \Lambda_{pro,s})^T$, and m×z parity check polynomials that satisfy zero are necessary for obtaining this transmission sequence $u_s$. Here, a parity check polynomial that satisfies zero appearing eth, when the m×z parity check polynomials that satisfy zero are arranged in sequential order, is referred to as an eth parity check polynomial that satisfies zero (where e is an integer no smaller than zero and less than or equal to m×z−1). As such, the m×z parity check polynomials that satisfy zero are arranged in the following order.

zeroth: zeroth parity check polynomial that satisfies zero
first: first parity check polynomial that satisfies zero
second: second parity check polynomial that satisfies zero
⋮
eth: eth parity check polynomial that satisfies zero
⋮
(m×z−2)th: (m×z−2)th parity check polynomial that satisfies zero
(m×z−1)th: (m×z−1)th parity check polynomial that satisfies zero As such, the transmission sequence (encoded sequence (codeword)) $u_s$ of an sth block of the LDPC-CC (an LDPC block code using LDPC-CC) having a coding rate of R=(n−1)/n using the improved tail-biting scheme described in Patent Literature 2 can be obtained. (Note that a vector composed of the (e+1)th row of the parity check matrix $H_{pro\_m}$ for the LDPC-CC (an LDPC block code using LDPC-CC) having a coding rate of R=(n−1)/n using the improved tail-biting scheme described in Patent Literature 2 corresponds to the eth parity check polynomial that satisfies zero.)

Accordingly, in the LDPC-CC (an LDPC block code using LDPC-CC) having a coding rate of R=(n−1)/n using the improved tail-biting scheme described in Patent Literature 2, the zeroth parity check polynomial that satisfies zero is a parity check polynomial that satisfies zero, according to expression 71, the first parity check polynomial that satisfies zero is the first parity check polynomial that satisfies zero, according to expression 70, the second parity check polynomial that satisfies zero is the second parity check polynomial that satisfies zero, according to expression 70,

⋮ the (m−2)th parity check polynomial that satisfies zero is the (m−2)th parity check polynomial that satisfies zero, according to expression 70, the (m−1)th parity check polynomial that satisfies zero is the (m−1)th parity check polynomial that satisfies zero, according to expression 70, the mth parity check polynomial that satisfies zero is the zeroth parity check polynomial that satisfies zero, according to expression 70, the (m+1)th parity check polynomial that satisfies zero is the first parity check polynomial that satisfies zero, according to expression 70, the (m+2)th parity check polynomial that satisfies zero is the second parity check polynomial that satisfies zero, according to expression 70,

⋮ the (2m−2)th parity check polynomial that satisfies zero is the (m−2)th parity check polynomial that satisfies zero, according to expression 70, the (2m−1)th parity check polynomial that satisfies zero is the (m−1)th parity check polynomial that satisfies zero, according to expression 70, the 2mth parity check polynomial that satisfies zero is the zeroth parity check polynomial that satisfies zero, according to expression 70, the (2m+1)th parity check polynomial that satisfies zero is the first parity check polynomial that satisfies zero, according to expression 70, the (2m+2)th parity check polynomial that satisfies zero is the second parity check polynomial that satisfies zero, according to expression 70,

⋮ the (m×z−2)th parity check polynomial that satisfies zero is the (m−2)th parity check polynomial that satisfies zero, according to expression 70, and the (m×z−1)th parity check polynomial that satisfies zero is the (m−1)th parity check polynomial that satisfies zero, according to expression 70.

That is, the zeroth parity check polynomial that satisfies zero is the parity check polynomial that satisfies zero, according to expression 71, and the eth parity check polynomial that satisfies zero (where e is an integer no smaller than one and less than or equal to m×z−1) is the e%mth parity check polynomial that satisfies zero, according to expression 70.

In the present embodiment (in fact, commonly applying to the entirety of the present disclosure), % means a modulo, and for example, α%q represents a remainder after dividing α by q (where α is an integer no smaller than zero, and q is a natural number).

Figure 29:
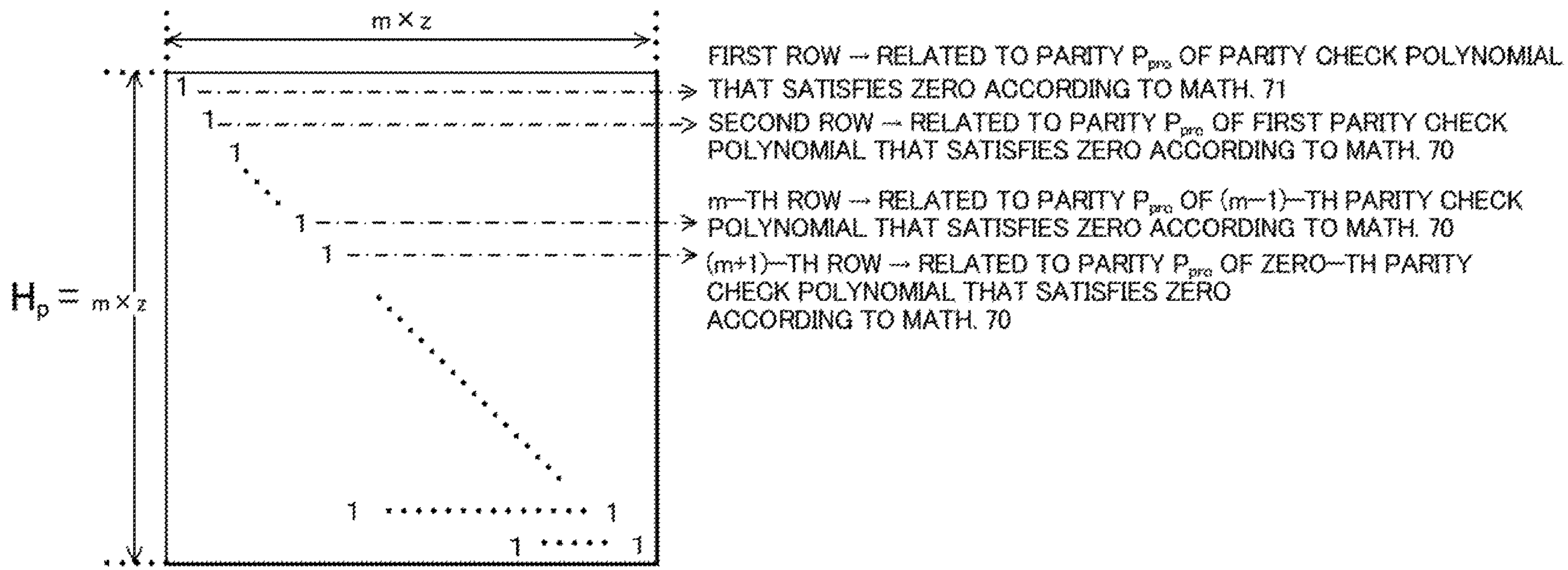
FIG. 29 shows an example of the configuration of partial matrix of check matrix when improved tail-biting is performed.

FIG. 29 shows a configuration of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2.

According to the explanation provided above, a vector composing the first row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the zeroth parity check polynomial that satisfies zero, or that is, the parity check polynomial that satisfies zero, according to expression 71.

Similarly, a vector composing the second row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the first parity check polynomial that satisfies zero, or that is, the first parity check polynomial that satisfies zero, according to expression 70.

A vector composing the third row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the second parity check polynomial that satisfies zero, or that is, the second parity check polynomial that satisfies zero, according to expression 70.

⋮

A vector composing the (m−1)th row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the (m−2)th parity check polynomial that satisfies zero, or that is, the (m−2)th parity check polynomial that satisfies zero, according to expression 70.

A vector composing the mth row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the (m−1)th parity check polynomial that satisfies zero, or that is, the (m−1)th parity check polynomial that satisfies zero, according to expression 70.

A vector composing the (m+1)th row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the mth parity check polynomial that satisfies zero, or that is, the zeroth parity check polynomial that satisfies zero, according to expression 70.

A vector composing the (m+2)th row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the (m+1)th parity check polynomial that satisfies zero, or that is, the first parity check polynomial that satisfies zero, according to expression 70.

A vector composing the (m+3)th row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the (m+2)th parity check polynomial that satisfies zero, or that is, the second parity check polynomial that satisfies zero, according to expression 70.

⋮

A vector composing the (2m−1)th row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the (2m−2)th parity check polynomial that satisfies zero, or that is, the (m−2)th parity check polynomial that satisfies zero, according to expression 70.

A vector composing the 2mth row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the (2m−1)th parity check polynomial that satisfies zero, or that is, the (m−1)th parity check polynomial that satisfies zero, according to expression 70.

A vector composing the (2m+1)th row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the 2mth parity check polynomial that satisfies zero, or that is, the zeroth parity check polynomial that satisfies zero, according to expression 70.

A vector composing the (2m+2)th row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the (2m+1)th parity check polynomial that satisfies zero, or that is, the first parity check polynomial that satisfies zero, according to expression 70.

A vector composing the (2m+3)th row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the (2m+2)th parity check polynomial that satisfies zero, or that is, the second parity check polynomial that satisfies zero, according to expression 70.

⋮

A vector composing the (m×z−1)th row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the (m×z−2)th parity check polynomial that satisfies zero, or that is, the (m−2)th parity check polynomial that satisfies zero, according to expression 70.

A vector composing the (m×z)th row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the (m×z−1)th parity check polynomial that satisfies zero, or that is, the (m−1)th parity check polynomial that satisfies zero, according to expression 70.

As such, a vector composing the first row of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the zeroth parity check polynomial that satisfies zero, or that is, the parity check polynomial that satisfies zero, according to expression 71, and a vector composing the (e+1)th row (where e is an integer no smaller than one and less than or equal to m×z−1) of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 can be generated from a term pertaining to a parity of the eth parity check polynomial that satisfies zero, or that is, the e%mth parity check polynomial that satisfies zero, according to expression 70.

Here, note that m is the time-varying period of the LDPC-CC based on a parity check polynomial having a coding rate of R=(n−1)/n, which serves as the basis of the LDPC-CC having a coding rate of R=(n−1)/n using the improved tail-biting scheme described in Patent Literature 2.

FIG. 29 shows the configuration of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2. In the following, an element at row i, column j of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 is expressed as $H_{p,comp}[i][j]$ (where i and j are integers no smaller than one and less than or equal to m×z (i, j=1, 2, 3, . . . , m×z−1, m×z)). The following logically follows.

In the LDPC-CC having a coding rate of R=(n−1)/n using the improved tail-biting scheme described in Patent Literature 2, when a parity check polynomial that satisfies zero satisfies expression 70 and expression 71, a parity check polynomial pertaining to the first row of the partial matrix $H_p$ pertaining to the parity $P_{pro}$ is expressed as shown in expression 71.

As such, when the first row of the partial matrix $H_p$ pertaining to the parity $P_{pro}$ has elements satisfying one, expression 75 holds true.

[Math. 75]

$$H_{p,comp}[1][1]=1 \quad (75)$$

Further, elements of $H_{p,comp}[1][j]$ in the first row of the partial matrix $H_p$ pertaining to the parity $P_{pro}$ other than those given by expression 75 are zeroes. That is, when j is an integer no smaller than one and less than or equal to m×z and satisfies k≠1, $H_{p,comp}[1][j]=0$ holds true for all conforming j. Note that expression 75 expresses elements corresponding to $D^0P(D)$ (=P(D)) in expression 71 (refer to FIG. 29).

In the LDPC-CC having a coding rate of R=(n−1)/n using the improved tail-biting scheme described in Patent Literature 2, when a parity check polynomial that satisfies zero satisfies expression 70 and expression 71, and further, when assuming that (s−1)%m=k (where % is the modulo operator (modulo)) holds true for an sth row (where s in an integer no smaller than two and less than or equal to m×z) of the partial matrix $H_p$ pertaining to the parity $P_{pro}$, a parity check polynomial pertaining to the sth row of the partial matrix $H_p$ pertaining to the parity $P_{pro}$ is expressed as shown in expression 76, according to expression 70.

[Math. 76]

$$(D^{a1,k,1}+D^{a1,k,2}+\ldots+D^{a1,k,r1}+1)X_1(D)+(D^{a2,k,1}+D^{a2,k,2}+\ldots+D^{a2,k,r2}+1)X_2(D)+\ldots+(D^{an-1,k,1}+D^{an-1,k,2}+\ldots+D^{an-1,k,rn-1}+1)X_{n-1}(D)+(D^{b1,k}+1)P(D)=0 \quad (76)$$

As such, when the sth row of the partial matrix $H_p$ pertaining to the parity $P_{pro}$ has elements satisfying one, expression 77 holds true.

[Math. 77]

$$H_{p,comp}[s][s]=1 \quad (77)$$

Expressions. 78-1 and 78-2 also hold true.

[Math. 78]

when $s-b_{1,k}\geq 1$:

$$H_{p,comp}[s][s-b_{1,k}]=1 \quad (78\text{-}1)$$

when $s-b_{1,k}<1$:

$$H_{p,comp}[s][s-b_{1,k}+m\times z]=1 \quad (78\text{-}2)$$

Further, elements of $H_{p,comp}[s][j]$ in the sth row of the partial matrix $H_p$ pertaining to the parity $P_{pro}$ other than those given by expression 77, expression 78-1, and expression 78-2 are zeroes. That is, when $s-b_{1,k}\geq 1$, j≠s, and $j\neq s-b_{1,k}$, $H_{p,comp}[s][j]=0$ holds true for all conforming j (where j is an integer no smaller than one and less than or equal to m×z). On the other hand, when $s-b_{1,k}<1$, j≠s, and $j\neq s-b_{1,k}+(m\times z)$, $H_{p,comp}[s][j]=0$ holds true for all conforming j (where j is an integer no smaller than one and less than or equal to m×z).

Note that expression 77 expresses elements corresponding to $D^0P(D)$ (=P(D)) in expression 76 (corresponding to the ones in the diagonal component of the matrix shown in FIG. 29), the sorting in expression 78-1 and expression 78-2 applies since the partial matrix $H_p$ pertaining to the parity $P_{pro}$ has the first to (m×z)th rows, and in addition, also has the first to (m×z)th columns.

In addition, the relation between the rows of the partial matrix $H_p$ pertaining to the parity $P_{pro}$ in the parity check matrix $H_{pro\_m}$ for the LDPC-CC having a coding rate of R=(n−1)/n using the improved tail-biting scheme described in Patent Literature 2 and the parity check polynomials shown in expression 70 and expression 71 is as shown in FIG. 29, and is therefore similar to the relation shown in FIG. 24, explanation of which being provided above.

Next, explanation is provided of values of elements composing a partial matrix $H_{x,q}$ pertaining to information $X_q$ in the parity check matrix $H_{pro\_m}$ for the LDPC-CC having a coding rate of R=(n−1)/n using the improved tail-biting scheme described in Patent Literature 2 (here, q is an integer no smaller than one and less than or equal to n−1).

Figure 30:
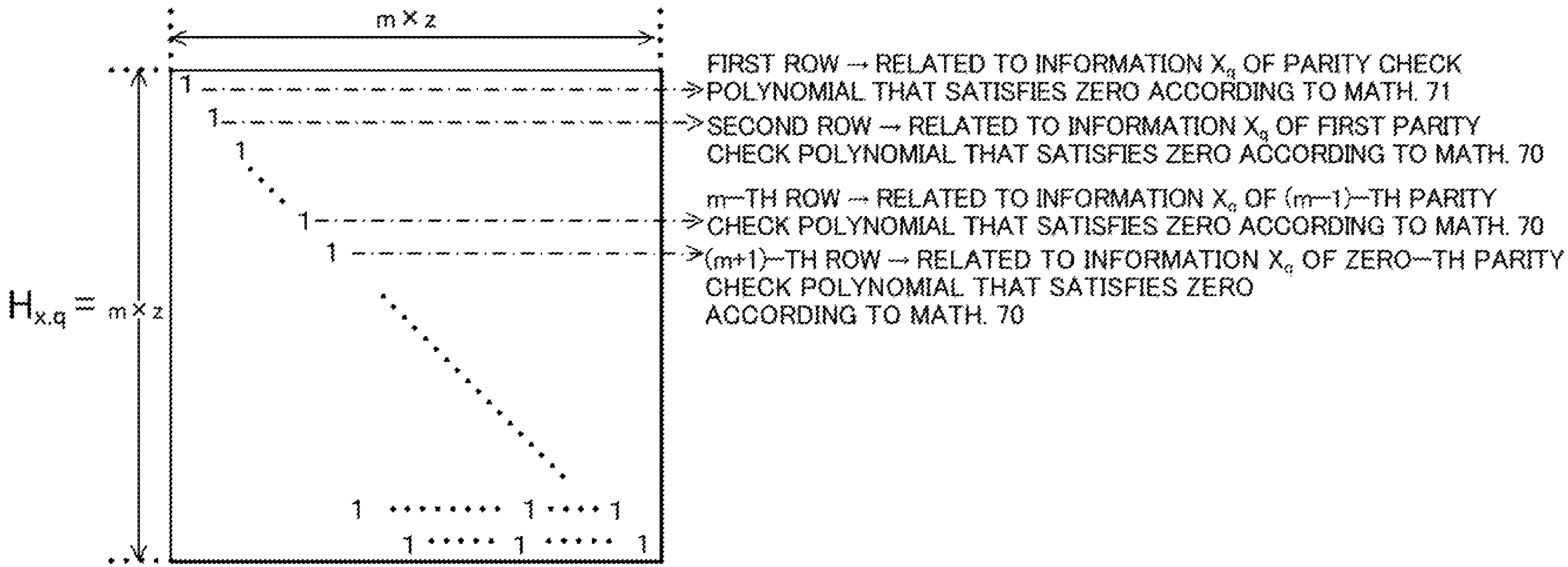
FIG. 30 shows an example of the configuration of partial matrix of check matrix when improved tail-biting is performed.

FIG. 30 shows a configuration of the partial matrix $H_{x,q}$ pertaining to information $X_q$ in the parity check matrix $H_{pro\_m}$ for the LDPC-CC having a coding rate of R=(n−1)/n using the improved tail-biting scheme described in Patent Literature 2.

In the following, an element at row i, column j of the partial matrix $H_{x,1}$ pertaining to information $X_1$ in the parity check matrix $H_{pro\_m}$ for the LDPC-CC having a coding rate of $R=(n-1)/n$ using the improved tail-biting scheme described in Patent Literature 2 is expressed as $H_{x,1,comp}[i][j]$ (where i and j are integers no smaller than one and less than or equal to m×z (i, j=1, 2, 3, . . . , m×z−1, m×z)). The following logically follows.

In the LDPC-CC having a coding rate of $R=(n-1)/n$ using the improved tail-biting scheme described in Patent Literature 2, when a parity check polynomial that satisfies zero satisfies expression 70 and expression 71, a parity check polynomial pertaining to the first row of the partial matrix $X_1$ pertaining to information $X_1$ is expressed as shown in expression 71.

As such, when the first row of the partial matrix $H_{x,1}$ pertaining to information $X_1$ has elements satisfying one, expression 79 holds true.

[Math. 79]

$$H_{x,1,comp}[1][1]=1 \tag{79}$$

Expression 80 also holds true since $1-a_{1,0,y}<1$ (where $a_{1,0,y}$ is a natural number).

[Math. 80]

$$H_{x,1,comp}[1][1-a_{1,0,y}+m\times z]=1 \tag{80}$$

Expression 80 is satisfied when y is an integer no smaller than one and less than or equal to $r_1$ (y=1, 2, . . . , $r_1-1$, $r_1$). Further, elements of $H_{x,1,comp}[1][j]$ in the first row of the partial matrix $H_{x,1}$ pertaining to information $X_1$ other than those given by expression 79 and expression 80 are zeroes. That is, $H_{x,1,comp}[1][j]=0$ holds true for all j (j is an integer no smaller than one and less than or equal to m×z) satisfying the conditions of $\{j\neq 1\}$ and $\{j\neq 1a_{1,0,y}+m\times z$ for all y, where y is an integer no smaller than one and less than or equal to $r_1\}$.

Here, note that expression 79 expresses elements corresponding to $D^0X_1(D)$ $(=X_1(D))$ in expression 71 (corresponding to the ones in the diagonal component of the matrix shown in FIG. 30), and expression 80 is satisfied since the partial matrix $H_{x,1}$ pertaining to information $X_1$ has the first to (m×z)th rows, and in addition, also has the first to (m×z)th columns.

In the LDPC-CC having a coding rate of $R=(n-1)/n$ using the improved tail-biting scheme described in Patent Literature 2, when a parity check polynomial that satisfies zero satisfies expression 70 and expression 71, and further, when assuming that (s−1)%m=k (where % is the modulo operator (modulo)) holds true for an sth row (where s in an integer no smaller than two and less than or equal to m×z) of the partial matrix $H_{x,1}$ pertaining to information $X_1$, a parity check polynomial pertaining to the sth row of the partial matrix $H_{x,1}$ pertaining to information $X_1$ is expressed as shown in expression 76, according to expression 70.

As such, when the first row of the partial matrix $H_{x,1}$ pertaining to information $X_1$ has elements satisfying one, expression 81 holds true.

[Math. 81]

$$H_{x,1,comp}[s][s]=1 \tag{81}$$

Expressions. 82-1 and 82-2 also hold true.

[Math. 82]

when $s-a_{1,k,y}\geq 1$:

$$H_{x,1,comp}[s][s-a_{1,k,y}]=1 \tag{82-1}$$

when $s-a_{1,k,y}<1$:

$$H_{x,1,comp}[s][s-a_{1,k,y}+m\times z]=1 \tag{82-2}$$

(where y is an integer no smaller than one and less than or equal to $r_1$ (y=1, 2, . . . , $r_1-1$, $r_1$))

Further, elements of $H_{x,1,comp}[s][j]$ in a sth row of the partial matrix $H_{x,1}$ pertaining to information $X_1$ other than those given by expression 81, expression 82-1, and expression 82-2 are zeroes. That is, $H_{x,1,comp}[s][j]=0$ holds true for all j (j is an integer no smaller than one and less than or equal to m×z) satisfying the conditions of $\{j\neq s\}$ and $\{j\neq s-a_{1,k,y}$ when $s-a_{1,k,y}\geq 1$, and $j\neq s-a_{1,k,y}+m\times z$ when $s-a_{1,k,y}<1$, for all y, where y is an integer no smaller than one and less than or equal to $r_1\}$.

Here, note that expression 81 expresses elements corresponding to $D^0X_1(D)(=X_1(D))$ in expression 76 (corresponding to the ones in the diagonal component of the matrix shown in FIG. 30), and the sorting in expression 82-1 and expression 82-2 applies since the partial matrix $H_{x,1}$ pertaining to information $X_1$ has the first to (m×z)th rows, and in addition, also has the first to (m×z)th columns.

In addition, the relation between the rows of the partial matrix $H_{x,1}$ pertaining to information $X_1$ in the parity check matrix $H_{pro\_m}$ for the LDPC-CC having a coding rate of $R=(n-1)/n$ using the improved tail-biting scheme described in Patent Literature 2 and the parity check polynomials shown in expression 70 and expression 71 is as shown in FIG. 30 (where q=1), and is therefore similar to the relation shown in FIG. 24, explanation of which being provided above.

In the above, explanation has been provided of the configuration of the partial matrix $H_{x,1}$ pertaining to information $X_1$ in the parity check matrix $H_{pro\_m}$ for the LDPC-CC having a coding rate of $R=(n-1)/n$ using the improved tail-biting scheme described in Patent Literature 2. In the following, explanation is provided of a configuration of a partial matrix $H_{x,q}$ pertaining to information $X_q$ (where q is an integer no smaller than one and less than or equal to n−1) in the parity check matrix $H_{pro\_m}$ for the LDPC-CC having a coding rate of $R=(n-1)/n$ using the improved tail-biting scheme described in Patent Literature 2 (Note that the configuration of the partial matrix $H_{x,q}$ can be explained in a similar manner as the configuration of the partial matrix $H_{x,1}$ explained above).

FIG. 30 shows a configuration of the partial matrix $H_{x,q}$ pertaining to information $X_q$ in the parity check matrix $H_{pro\_m}$ for the LDPC-CC having a coding rate of $R=(n-1)/n$ using the improved tail-biting scheme described in Patent Literature 2.

In the following, an element at row i, column j of the partial matrix $H_{x,q}$ pertaining to information $X_q$ in the parity check matrix $H_{pro\_m}$ for the LDPC-CC having a coding rate of $R=(n-1)/n$ using the improved tail-biting scheme described in Patent Literature 2 is expressed as $H_{x,q,comp}[i][j]$ (where i and j are integers no smaller than one and less than or equal to m×z (i, j=1, 2, 3, . . . , m×z−1, m×z)). The following logically follows.

In the LDPC-CC having a coding rate of $R=(n-1)/n$ using the improved tail-biting scheme described in Patent Literature 2, when a parity check polynomial that satisfies zero satisfies expression 70 and expression 71, a parity check polynomial pertaining to the first row of the partial matrix $H_{x,q}$ pertaining to information $X_q$ is expressed as shown in expression 71.

As such, when the first row of the partial matrix $H_{x,q}$ pertaining to information $X_q$ has elements satisfying one, expression 83 holds true.

[Math. 83]

$$H_{x,q,comp}[1][1]=1 \tag{83}$$

Expression 84 also holds true since $1-a_{q,0,y}<1$ (where $a_{q,0,y}$ is a natural number).

[Math. 84]

$$H_{x,q,comp}[1][1-a_{q,0,y}+m\times z]=1 \quad (84)$$

Expression 84 is satisfied when y is an integer no smaller than one and less than or equal to $r_q$ (where y=1, 2, . . . , $r_q-1$, $r_q$).

Further, elements of $H_{x,q,comp}[1][j]$ in the first row of the partial matrix $H_{x,q}$ pertaining to information $X_q$ other than those given by expression 83 and expression 83 are zeroes. That is, $H_{x,q,comp}[1][j]=0$ holds true for all j (j is an integer no smaller than one and less than or equal to m×z) satisfying the conditions of {j≠1} and {j≠1−$a_{q,0,y}$+m×z for all y, where y is an integer no smaller than one and less than or equal to $r_q$}.

Here, note that expression 83 expresses elements corresponding to $D^0X_q(D)$ (=$X_q(D)$) in expression 71 (corresponding to the ones in the diagonal component of the matrix shown in FIG. 30), and expression 84 is satisfied since the partial matrix $H_{x,q}$ pertaining to information $X_q$ has the first to (m×z)th rows, and in addition, also has the first to (m×z)th columns.

In the LDPC-CC having a coding rate of R=(n−1)/n using the improved tail-biting scheme described in Patent Literature 2, when a parity check polynomial that satisfies zero satisfies expression 70 and expression 71, and further, when assuming that (s−1)%m=k (where % is the modulo operator (modulo)) holds true for an sth row (where s in an integer no smaller than two and less than or equal to m×z) of the partial matrix $H_{x,q}$ pertaining to information $X_q$, a parity check polynomial pertaining to the sth row of the partial matrix $H_{x,q}$ pertaining to information $X_q$ is expressed as shown in expression 76, according to expression 70.

As such, when the sth row of the partial matrix $H_{x,q}$ pertaining to information $X_q$ has elements satisfying one, expression 85 holds true.

[Math. 85]

$$H_{x,q,comp}[s][s]=1 \quad (85)$$

Expressions. 86-1 and 86-2 also hold true.

[Math. 86]

when $s-a_{q,k,y}\geq 1$:

$$H_{x,q,comp}[s][s-a_{q,k,y}]=1 \quad (86\text{-}1)$$

when $s-a_{q,k,y}<1$:

$$H_{x,q,comp}[s][s-a_{q,k,y}+m\times z]=1 \quad (86\text{-}2)$$

(where y is an integer no smaller than one and less than or equal to $r_q$ (y=1, 2, . . . , $r_q-1$, $r_q$))

Further, elements of $H_{x,q,comp}[s][j]$ in the sth row of the partial matrix $H_{x,q}$ pertaining to information $X_q$ other than those given by expression 85, expression 86-1, and expression 86-2 are zeroes. That is, $H_{x,q,comp}[s][j]=0$ holds true for all j (j is an integer no smaller than one and less than or equal to m×z) satisfying the conditions of {j≠s} and {j≠s−$a_{q,k,y}$ when s−$a_{q,k,y}$≥1, and j≠s−$a_{q,k,y}$+m×z when s−$a_{q,k,y}$<1, for all y, where y is an integer no smaller than one and less than or equal to $r_q$}.

Here, note that expression 85 expresses elements corresponding to $D^0X_q(D)$ (=$X_q(D)$) in expression 76 (corresponding to the ones in the diagonal component of the matrix shown in FIG. 30), and the sorting in expression 86-1 and expression 85-2 applies since the partial matrix $H_{x,q}$ pertaining to information $X_q$ has the first to (m×z)th rows, and in addition, also has the first to (m×z)th columns.

In addition, the relation between the rows of the partial matrix $H_{x,q}$ pertaining to information $X_q$ in the parity check matrix $H_{pro\_m}$ for the LDPC-CC having a coding rate of R=(n−1)/n using the improved tail-biting scheme described in Patent Literature 2 and the parity check polynomials shown in expression 70 and expression 71 is as shown in FIG. 30, and is therefore similar to the relation shown in FIG. 24, explanation of which being provided above.

In the above, explanation has been provided of the configuration of the parity check matrix $H_{pro\_m}$ for the LDPC-CC having a coding rate of R=(n−1)/n using the improved tail-biting scheme described in Patent Literature 2. In the following, explanation is provided of a generation method of a parity check matrix that is equivalent to the parity check matrix $H_{pro\_m}$ for the LDPC-CC having a coding rate of R=(n−1)/n using the improved tail-biting scheme described in Patent Literature 2.

Figure 31:
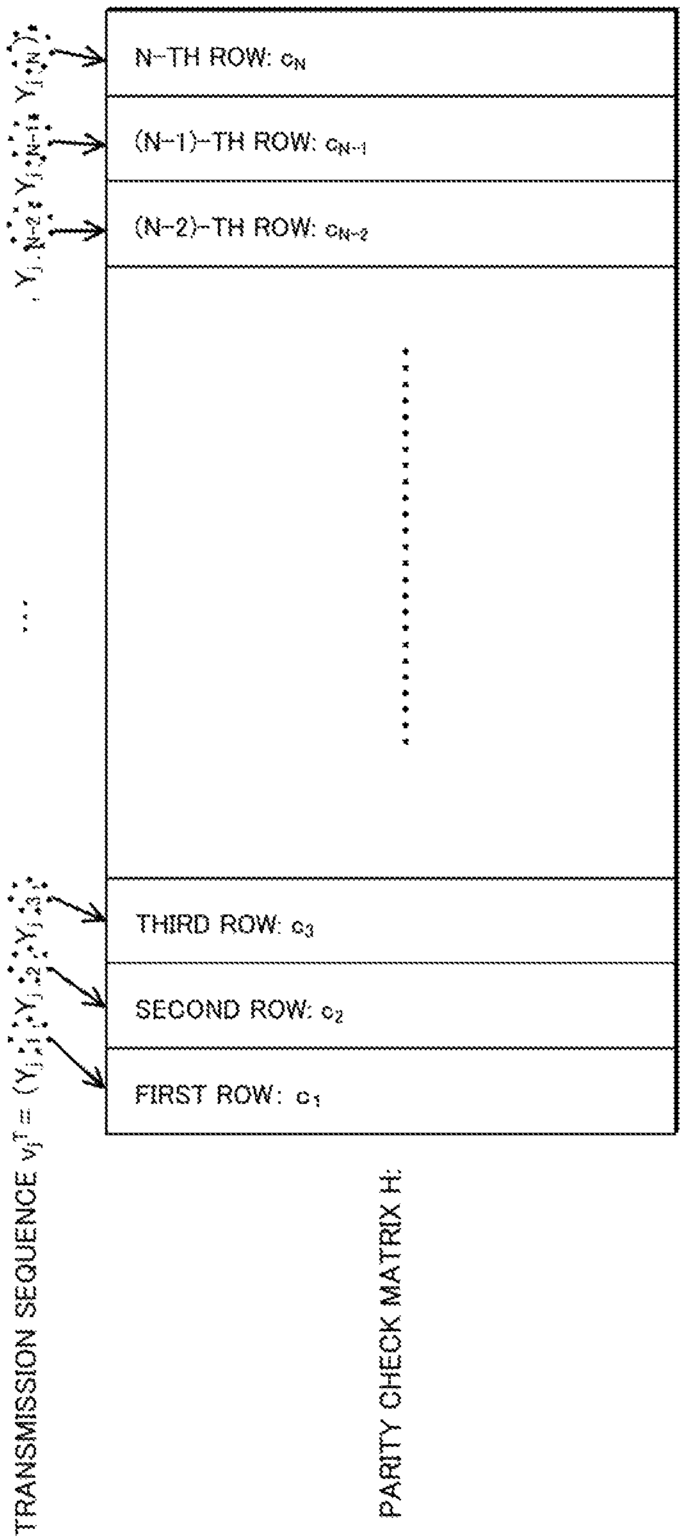
FIG. 31 shows an example of the configuration of check matrix when improved tail-biting is performed.

FIG. 31 illustrates the configuration of a parity check matrix H for an LDPC (block) code having a coding rate of (N−M)/N (where N>M>0). For example, the parity check matrix of FIG. 31 has M rows and N columns. In the following, explanation is provided under the assumption that the parity check matrix H of FIG. 31 represents the parity check matrix $H_{pro\_m}$ for the LDPC-CC having a coding rate of R=(n−1)/n using the improved tail-biting scheme described in Patent Literature 2 (as such, $H_{pro\_m}$=H (of FIG. 31), and in the following, H refers to the parity check matrix for the LDPC-CC having a coding rate of R=(n−1)/n using the improved tail-biting scheme described in Patent Literature 2).

In FIG. 31, the transmission sequence (codeword) for a jth block is $v_j^T=(Y_{j,1}, Y_{j,2}, Y_{j,3}, \ldots, Y_{j,N-2}, Y_{j,N-1}, Y_{j,N})$ (for systematic codes, $Y_{j,k}$ (where k is an integer no smaller than one and less than or equal to N) is the information X or the parity P (parity $P_{pro}$)).

Here, $Hv_j=0$ is satisfied (where the zero in $Hv_j=0$ indicates that all elements of the vector are zeroes, or that is, a kth row has a value of zero for all k (where k is an integer no smaller than one and less than or equal to M)).

Here, the element of the kth row (where k is an integer no smaller than one and less than or equal to M) of the transmission sequence $v_j$ for the jth block (in FIG. 31, the element in a kth column of a transpose matrix $v_j^T$ of the transmission sequence $v_j$) is $Y_{j,k}$, and a vector extracted from a kth column of the parity check matrix H for the LDPC (block) code having a coding rate of (N−M)/N (where N>M>0) (i.e., the parity check matrix for the LDPC-CC having a coding rate of R=(n−1)/n using the improved tail-biting scheme described in Patent Literature 2) is expressed as $c_k$, as shown in FIG. 31. Here, the parity check matrix H for the LDPC (block) code (i.e., the parity check matrix for the LDPC-CC having a coding rate of R=(n−1)/n using the improved tail-biting scheme described in Patent Literature 2) is expressed as shown in expression 87.

[Math. 87]

$$H=[c_1 c_2 c_3 \ldots c_{N-2} c_{N-1} c_N]$$

Figure 32:
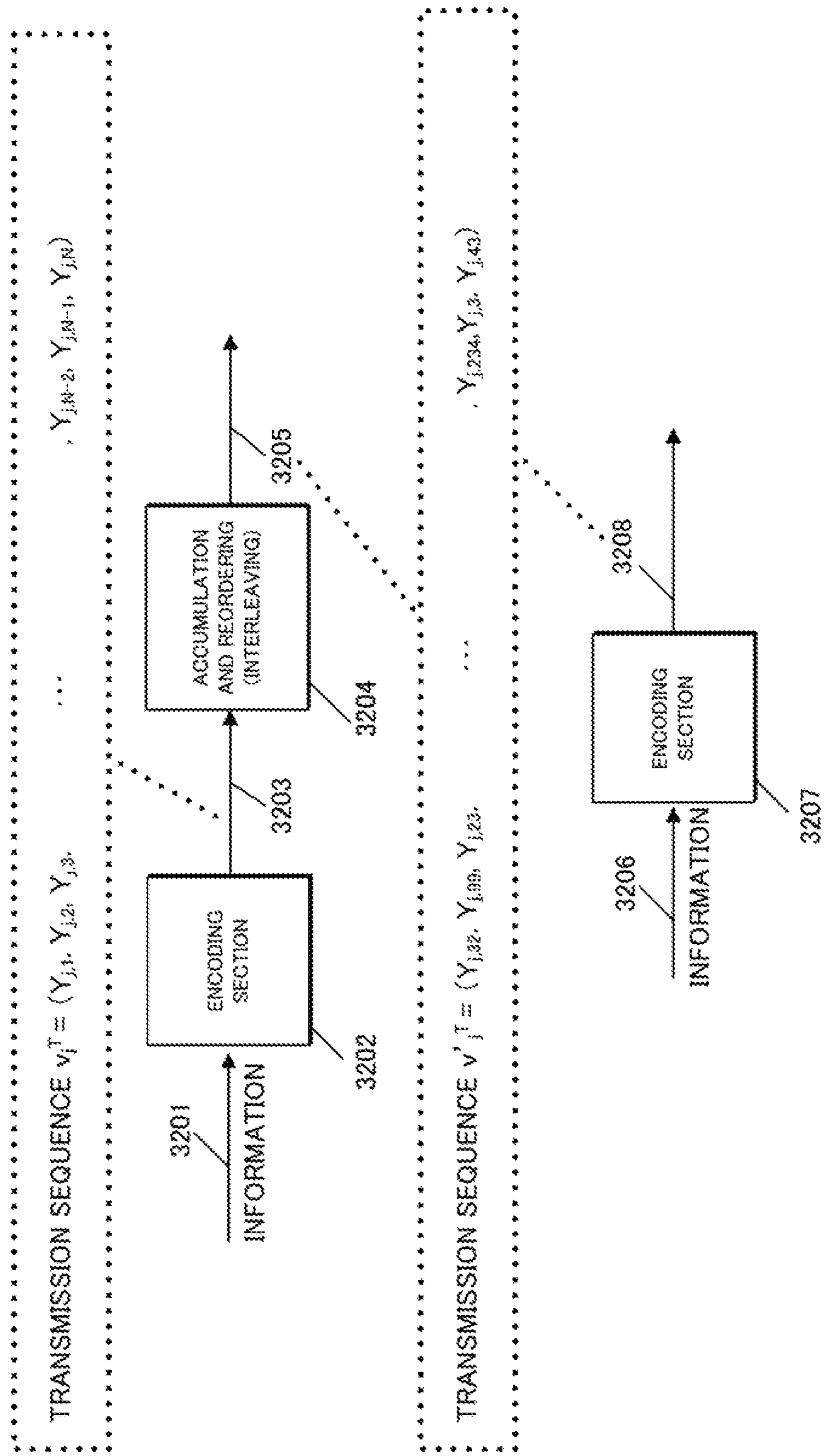
FIG. 32 shows an example of the configuration of a transmitting device when interleaving is performed on a transmission sequence.

FIG. 32 indicates a configuration when interleaving is applied to the transmission sequence (codeword) $v_j^T$ for the jth block expressed as $v_j^T=(Y_{j,1}, Y_{j,2}, Y_{j,3}, \ldots, Y_{j,N-2}, Y_{j,N-1}, Y_{j,N})$. In FIG. 32, an encoding section 3202 takes information 3201 as input, performs encoding thereon, and outputs encoded data 3203. For example, when encoding the LDPC (block) code having a coding rate (N−M)/N (where N>M>0) (i.e., the LDPC-CC having a coding rate of R=(n−1)/n using the improved tail-biting scheme described in Patent Literature 2) as shown in FIG. 32, the encoding section 3202 takes the information for the jth block as input, performs encoding thereon based on the parity check matrix H for the LDPC (block) code having a coding rate of (N−M)/N (where N>M>0) (i.e., the parity check matrix for the LDPC-CC having a coding rate of R=(n−1)/n using the improved tail-biting scheme described in Patent Literature 2) as shown in FIG. 31, and outputs the transmission sequence (codeword) $v_j^T=(Y_{j,1}, Y_{j,2}, Y_{j,3}, \ldots, Y_{j,N-2}, Y_{j,N-1}, Y_{j,N})$ for the jth block.

Then, an accumulation and reordering section (interleaving section) 3204 takes the encoded data 3203 as input, accumulates the encoded data 3203, performs reordering thereon, and outputs interleaved data 3205. Accordingly, the accumulation and reordering section (interleaving section) 3204 takes the transmission sequence $v_j=(Y_{j,1}, Y_{j,2}, Y_{j,3}, \ldots, Y_{j,N-2}, Y_{j,N-1}, Y_{j,N})^T$ for the jth block as input, and outputs a transmission sequence (codeword) $v'_j=(Y_{j,32}, Y_{j,99}, Y_{j,23}, \ldots, Y_{j,234}, Y_{j,3}, Y_{j,43})^T$ as shown in FIG. 32, which is a result of reordering being performed on the elements of the transmission sequence $v_j$ (here, note that $v'_j$ is one example of a transmission sequence output by the accumulation and reordering section (interleaving section) 3204). Here, as discussed above, the transmission sequence $v'_j$ is obtained by reordering the elements of the transmission sequence $v_j$ for the jth block. Accordingly, v'j is a vector having one row and n columns, and the N elements of v'j are such that one each of the terms $Y_{j,1}, Y_{j,2}, Y_{j,3}, \ldots, Y_{j,N-2}, Y_{j,N-1}, Y_{j,N}$ is present.

Here, an encoding section 3207 as shown in FIG. 32 having the functions of the encoding section 3202 and the accumulation and reordering section (interleaving section) 3204 is considered. Accordingly, the encoding section 3207 takes the information 3201 as input, performs encoding thereon, and outputs the encoded data 3203. For example, the encoding section 3207 takes the information of the jth block as input, and as shown in FIG. 32, outputs the transmission sequence (codeword) $v'_j=(Y_{j,32}, Y_{j,99}, Y_{j,23}, \ldots, Y_{j,234}, Y_{j,3}, Y_{j,43})^T$. In the following, explanation is provided of a parity check matrix H' for the LDPC (block) code having a coding rate of (N−M)/N (where N>M>0) corresponding to the encoding section 3207 (i.e., a parity check matrix H' that is equivalent to the parity check matrix for the LDPC-CC having a coding rate of R=(n−1)/n using the improved tail-biting scheme described in Patent Literature 2) while referring to FIG. 33.

Figure 33:
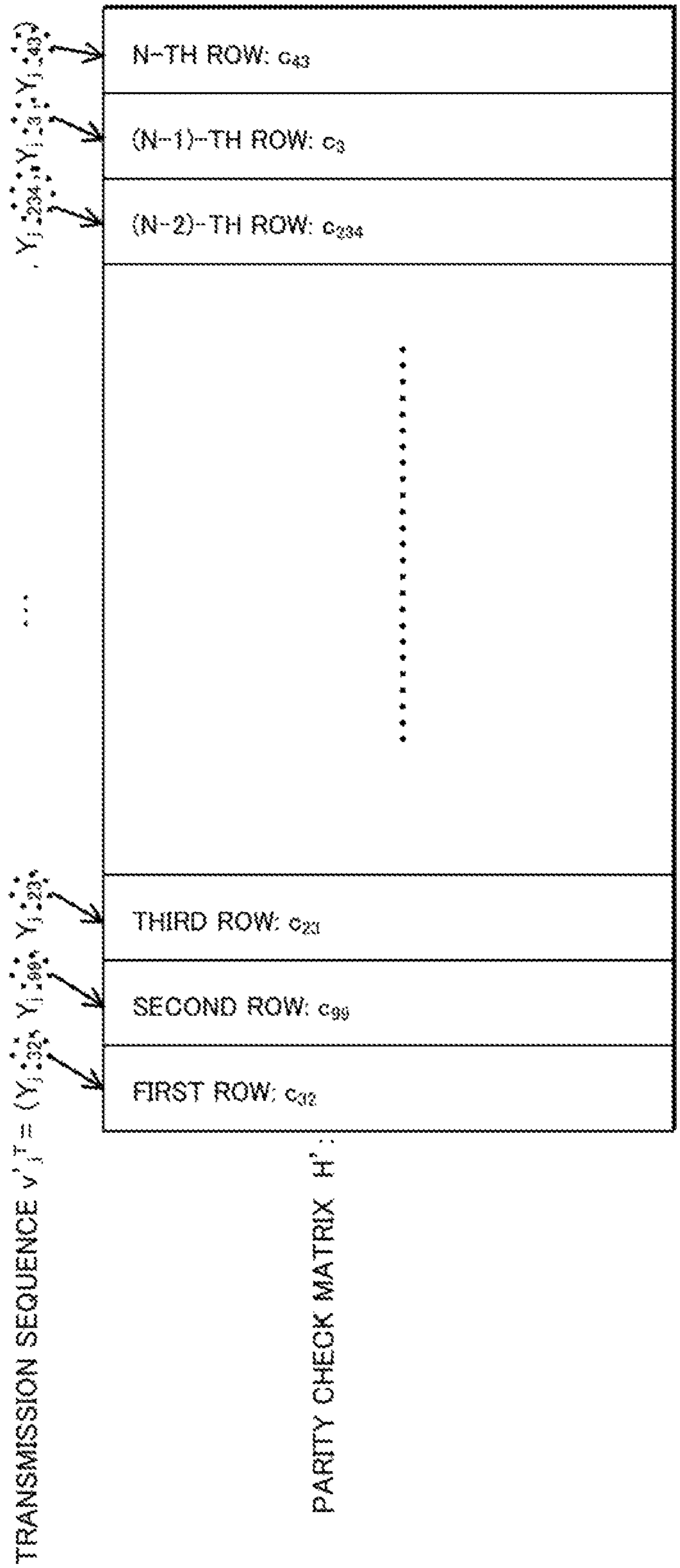
FIG. 33 shows an example of the configuration of check matrix equivalent to check matrix when improved tail-biting is performed.

FIG. 33 a configuration of the parity check matrix H' when the transmission sequence (codeword) is $v'_j=(Y_{j,32}, Y_{j,99}, Y_{j,23}, \ldots, Y_{j,234}, Y_{j,3}, Y_{j,43})^T$ Here, the element in the first row of the transmission sequence $v'_j$ for the jth block (the element in the first column of the transpose matrix $v'^T_j$ of the transmission sequence $v'_j$, in FIG. 33) is $Y_{j,32}$. Accordingly, a vector extracted from the first row of the parity check matrix H', when using the above-described vector $c_k$ (k=1, 2, 3, . . . , N−2, N−1, N), is $c_{32}$. Similarly, the element in the second row of the transmission sequence $v'_j$ for the jth block (the element in the second column of the transpose matrix $v'^T_j$ of the transmission sequence $v'_j$ in FIG. 33) is $Y_{j,99}$. Accordingly, a vector extracted from the second row of the parity check matrix H' is $c_{99}$. Further, as shown in FIG. 33, a vector extracted from the third row of the parity check matrix H' is $c_{23}$, a vector extracted from the (N−2)th row of the parity check matrix H' is $c_{234}$, a vector extracted from the (N−1)th row of the parity check matrix H' is $c_3$, and a vector extracted from the Nth row of the parity check matrix H' is $c_{43}$.

That is, when the element in the ith row of the transmission sequence v'j for the jth block (the element in the ith column of the transpose matrix $v'^T_j$ of the transmission sequence $v'_j$, in FIG. 33) is expressed as $Y_{j,g}$ (g=1, 2, 3, . . . , N−2, N−1, N), then the vector extracted from the ith column of the parity check matrix H' is $c_g$, when using the above-described vector $c_k$.

Thus, the parity check matrix H' for the transmission sequence (codeword) $v'_j=(Y_{j,32}, Y_{j,99}, Y_{j,23}, \ldots, Y_{j,234}, Y_{j,3}, Y_{j,43})^T$ is expressed as shown in expression 88.

[Math. 88]

$$H'=[c_{32}c_{99}c_{23} \ldots c_{234}c_3c_{43}] \quad (88)$$

When the element in the ith row of the transmission sequence $v'_j$ for the jth block (the element in the ith column of the transpose matrix $v'^T_j$ of the transmission sequence $v'_j$ in FIG. 33) is represented as $Y_{j,g}$ (g=1, 2, 3, . . . , N−2, N−1, N), then the vector extracted from the ith column of the parity check matrix H' is $c_g$, when using the above-described vector $c_k$. When the above is followed to create a parity check matrix, then a parity check matrix for the transmission sequence $v'_j$ of the jth block is obtainable with no limitation to the above-given example.

Accordingly, when interleaving is applied to the transmission sequence (codeword) of the parity check matrix for the LDPC-CC having a coding rate of R=(n−1)/n using the improved tail-biting scheme described in Patent Literature 2, a parity check matrix of the interleaved transmission sequence (codeword) is obtained by performing reordering of columns (i.e., a column permutation) as described above on the parity check matrix for the LDPC-CC having a coding rate of R=(n−1)/n using the improved tail-biting scheme described in Patent Literature 2.

As such, it naturally follows that the transmission sequence (codeword) ($v_j$) obtained by returning the interleaved transmission sequence (codeword) ($v'_j$) to the original order is the transmission sequence (codeword) of the LDPC-CC having a coding rate of R=(n−1)/n using the improved tail-biting scheme described in Patent Literature 2. Accordingly, by returning the interleaved transmission sequence (codeword) ($v'_j$) and the parity check matrix H' corresponding to the interleaved transmission sequence (codeword) ($v'_j$) to their respective orders, the transmission sequence $v_j$ and the parity check matrix corresponding to the transmission sequence $v_j$ can be obtained, respectively. Further, the parity check matrix obtained by performing the reordering as described above is the parity check matrix H of FIG. 31, or in other words, the parity check matrix $H_{pro\_m}$ for the LDPC-CC having a coding rate of R=(n−1)/n using the improved tail-biting scheme described in Patent Literature 2.

Figure 34:
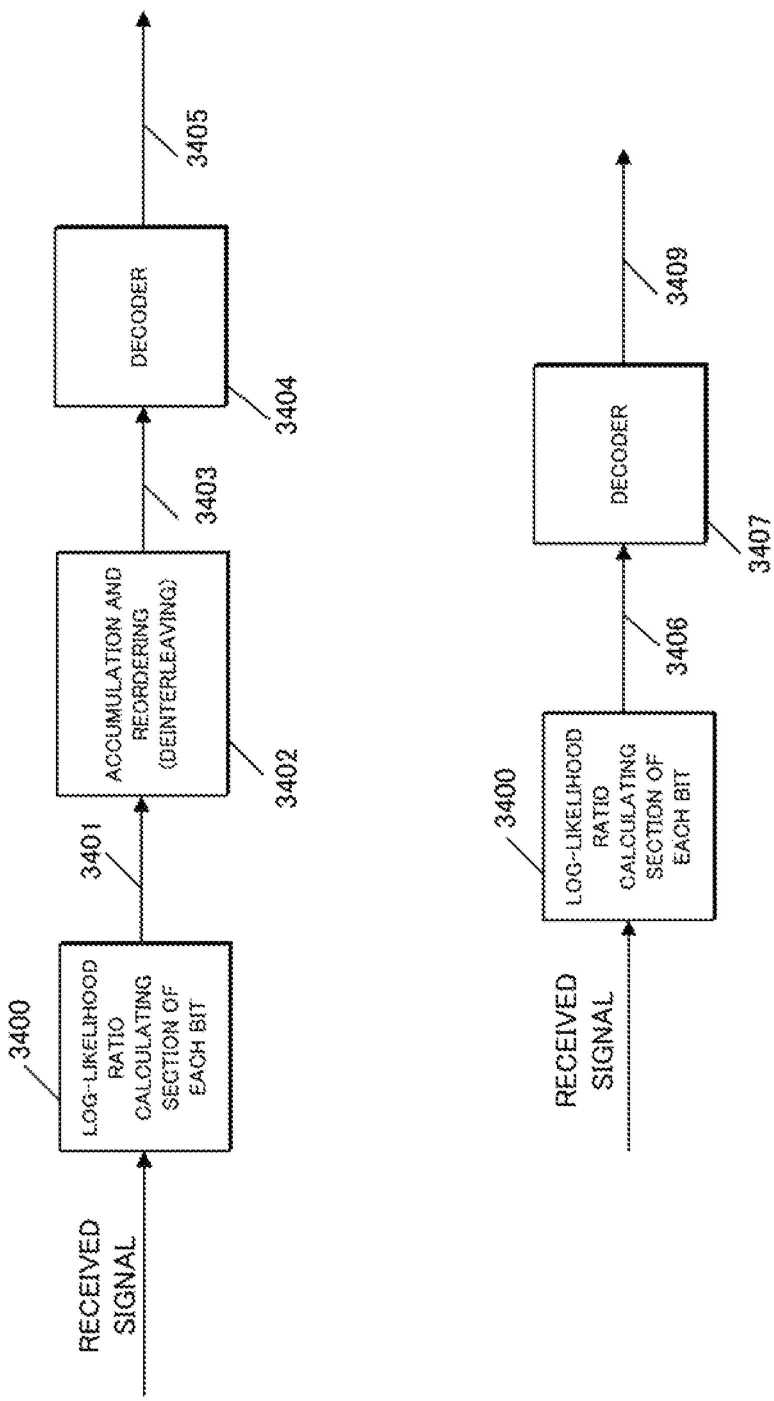
FIG. 34 shows an example of the configuration of a receiving device when interleaving is performed on a transmission sequence.

FIG. 34 illustrates an example of a decoding-related configuration of a receiving device, when encoding of FIG. 32 has been performed. The transmission sequence obtained when the encoding of FIG. 32 is performed undergoes processing, in accordance with a modulation scheme, such as mapping, frequency conversion and modulated signal amplification, whereby a modulated signal is obtained. A transmitting device transmits the modulated signal. The receiving device then receives the modulated signal transmitted by the transmitting device to obtain a received signal. A log-likelihood ratio calculation section 3400 in FIG. 34 takes the received signal as input, calculates a log-likelihood ratio for each bit of the codeword, and outputs a log-likelihood ratio signal 3401.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ for the jth block. Then, the log-likelihood ratio calculation section 3400 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios.

An accumulation and reordering section (deinterleaving section) 3402 takes the log-likelihood ratio signal 3401 as input, performs accumulation and reordering thereon, and outputs a deinterleaved log-likelihood ratio signal 3403.

For example, the accumulation and reordering section (deinterleaving section) 3402 takes, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, performs reordering, and outputs the log-likelihood ratios in the order of: the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order.

A decoder 3404 takes the deinterleaved log-likelihood ratio signal 3403 as input, performs belief propagation decoding, such as the BP decoding given in Non-Patent Literature 6 to 8, sum-product decoding, min-sum decoding, offset BP decoding, Normalized BP decoding, Shuffled BP decoding, and Layered BP decoding in which scheduling is performed, based on the parity check matrix H for the LDPC (block) code having a coding rate of (N−M)/N (where N>M>0) as shown in FIG. 31 (that is, based on the parity check matrix for the LDPC-CC having a coding rate of R=(n−1)/n using the improved tail-biting scheme described in Patent Literature 2), and thereby obtains an estimation sequence 3405 (note that the decoder 3404 may perform decoding according to decoding methods other than belief propagation decoding).

For example, the decoder 3404 takes, as input, the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order, performs belief propagation decoding based on the parity check matrix H for the LDPC (block) code having a coding rate of (N−M)/N (where N>M>0) as shown in FIG. 31 (that is, based on the parity check matrix for the LDPC-CC having a coding rate of R=(n−1)/n using the improved tail-biting scheme described in Patent Literature 2), and obtains the estimation sequence (note that the decoder 3404 may perform decoding according to decoding methods other than belief propagation decoding).

In the following, a decoding-related configuration that differs from the above is described. The decoding-related configuration described in the following differs from the decoding-related configuration described above in that the accumulation and reordering section (deinterleaving section) 3402 is not included. The operations of the log-likelihood ratio calculation section 3400 are identical to those described above, and thus, explanation thereof is omitted in the following.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ for the jth block. Then, the log-likelihood ratio calculation section 3400 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios (corresponding to 3406 in FIG. 34).

A decoder 3407 takes a log-likelihood ratio signal 3406 as input, performs belief propagation decoding, such as the BP decoding given in Non-Patent Literature 6 to 8, sum-product decoding, min-sum decoding, offset BP decoding, Normalized BP decoding, Shuffled BP decoding, and Layered BP decoding in which scheduling is performed, based on the parity check matrix H' for the LDPC (block) code having a coding rate of (N−M)/N (where N>M>0) as shown in FIG. 33 (that is, based on the parity check matrix H' that is equivalent to the parity check matrix for the LDPC-CC having a coding rate of R=(n−1)/n using the improved tail-biting scheme described in Patent Literature 2), and thereby obtains an estimation sequence 3409 (note that the decoder 3407 may perform decoding according to decoding methods other than belief propagation decoding).

For example, the decoder 3407 takes, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$ in the stated order, performs belief propagation decoding based on the parity check matrix H' for the LDPC (block) code having a coding rate of (N−M)/N (where N>M>0) as shown in FIG. 33 (that is, based on the parity check matrix H' that is equivalent to the parity check matrix for the LDPC-CC having a coding rate of R=(n−1)/n using the improved tail-biting scheme described in Patent Literature 2), and obtains the estimation sequence (note that the decoder 3407 may perform decoding according to decoding methods other than belief propagation decoding).

As explained above, even when the transmitted data is reordered due to the transmitting device interleaving the transmission sequence $v_j=(Y_{j,1}, Y_{j,2}, Y_{j,3}, \ldots, Y_{j,N-2}, Y_{j,N-1}, Y_{j,N})^T$ for the jth block, the receiving device is able to obtain the estimation sequence by using a parity check matrix corresponding to the reordered transmitted data.

Accordingly, when interleaving is applied to the transmission sequence (codeword) of the LDPC-CC having a coding rate of R=(n−1)/n using the improved tail-biting scheme described in Patent Literature 2, the receiving device uses, as a parity check matrix for the interleaved transmission sequence (codeword), a matrix obtained by performing reordering of columns (i.e., column permutation) as described above on the parity check matrix for the LDPC-CC having a coding rate of R=(n−1)/n using the improved tail-biting scheme described in Patent Literature 2. As such, the receiving device is able to perform belief propagation decoding and thereby obtain an estimation sequence without performing interleaving on the log-likelihood ratio for each acquired bit.

In the above, explanation is provided of the relation between interleaving applied to a transmission sequence and a parity check matrix. In the following, explanation is provided of reordering of rows (row permutation) performed on a parity check matrix.

Figure 35:
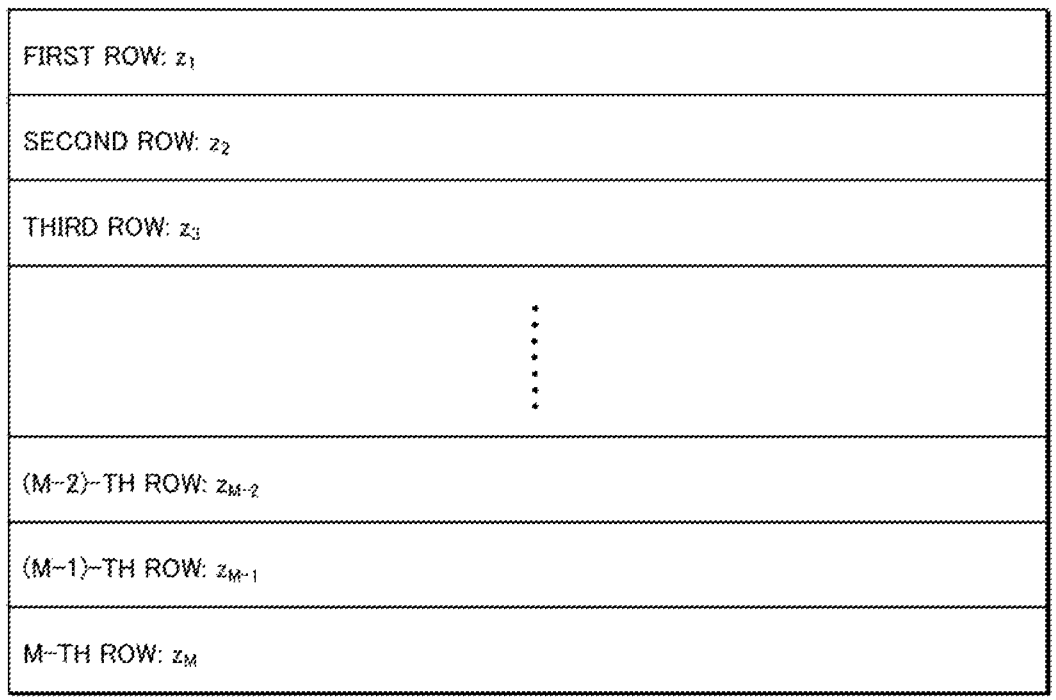
FIG. 35 shows an example of the configuration of check matrix corresponding to transmission sequence of jth block of LDPC code of coding rate nm/n.

FIG. 35 illustrates a configuration of a parity check matrix H corresponding to the transmission sequence (codeword) $v_j^T=(Y_{j,1}, Y_{j,2}, Y_{j,3}, \ldots, Y_{j,N-2}, Y_{j,N-1}, Y_{j,N})$ for the jth block of the LDPC (block) code having a coding rate of (N−M)/N. For example, the parity check matrix H of FIG. 35 is a matrix having M rows and N columns. In the following, explanation is provided under the assumption that the parity check matrix H of FIG. 35 represents the parity check matrix $H_{pro\_m}$ for the LDPC-CC having a coding rate of R=(n−1)/n using the improved tail-biting scheme described in Patent Literature 2 (as such, $H_{pro\_m}$=H (of FIG. 35), and in the following, H refers to the parity check matrix for the LDPC-CC having a coding rate of R=(n−1)/n using the improved tail-biting scheme described in Patent Literature 2) (for systematic codes, $Y_{j,k}$ (where k is an integer no smaller than one and less than or equal to N) is the information X or the parity P (the parity $P_{pro}$), and is composed of (N−M) information bits and M parity bits). Here, $Hv_j=0$ is satisfied (where the zero in $Hv_j=0$ indicates that all elements of the vector are zeroes, or that is, a kth row has a value of zero for all k (where k is an integer no smaller than one and less than or equal to M)).

Further, a vector extracted from the kth row (where k is an integer no smaller than one and less than or equal to M) of the parity check matrix H of FIG. 35 is expressed as a vector $z_k$. Here, the parity check matrix H for the LDPC (block) code (i.e., the parity check matrix for the LDPC-CC having a coding rate of R=(n−1)/n using the improved tail-biting scheme described in Patent Literature 2) is expressed as shown in expression 89.

[Math. 89]

$$H = \begin{bmatrix} z_1 \\ z_2 \\ \vdots \\ z_{M-1} \\ z_M \end{bmatrix} \quad (89)$$

Next, a parity check matrix obtained by performing reordering of rows (row permutation) on the parity check matrix H of FIG. 35 is considered.

Figure 36:
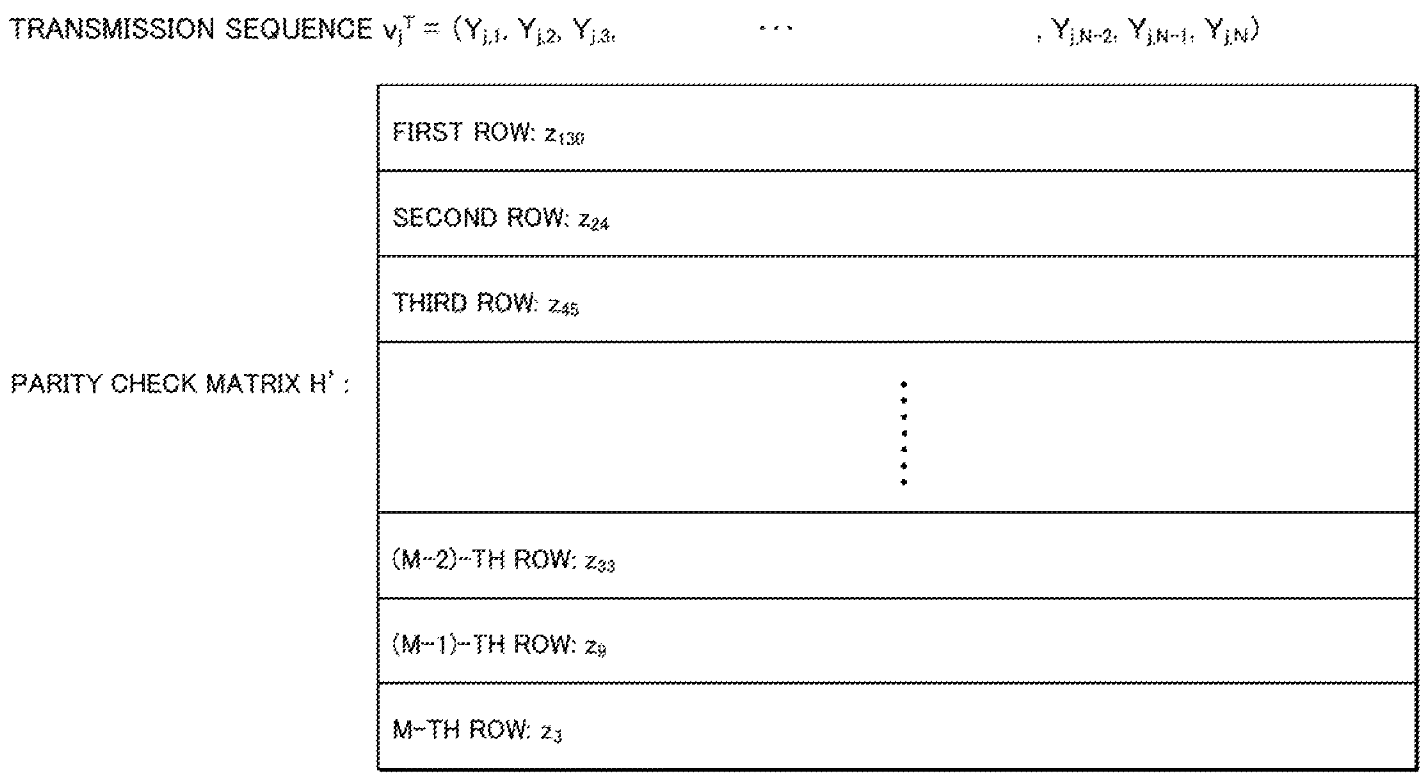
FIG. 36 shows an example of the configuration of check matrix obtained by performing row permutation on check matrix corresponding to transmission sequence of jth block of LDPC code of coding rate nm/n.

FIG. 36 shows an example of a parity check matrix H' obtained by performing reordering of rows (row permutation) on the parity check matrix H of FIG. 35. The parity check matrix H', similar as the parity check matrix shown in FIG. 35, is a parity check matrix corresponding to the transmission sequence (codeword) $v_j^T=(Y_{j,1}, Y_{j,2}, Y_{j,3}, \ldots, Y_{j,N-2}, Y_{j,N-1}, Y_{j,N})$ for the jth block of the LDPC (block) code having a coding rate of (N−M)/N (i.e., the LDPC-CC having a coding rate of R=(n−1)/n using the improved tail-biting scheme described in Patent Literature 2) (or that is, a parity check matrix for the LDPC-CC having a coding rate of R=(n−1)/n using the improved tail-biting scheme described in Patent Literature 2).

The parity check matrix H' of FIG. 36 is composed of vectors $z_k$ extracted from the kth row (where k is an integer no smaller than one and less than or equal to M) of the parity check matrix H of FIG. 35. For example, in the parity check matrix H', the first row is composed of vector $z_{130}$, the second row is composed of vector $z_{24}$, the third row is composed of vector $z_{45}$, . . . , the (M−2)th row is composed of vector $z_{33}$, the (M−1)th row is composed of vector $z_9$, and the Mth row is composed of vector $z_3$. Note that M row-vectors extracted from the kth row (where k is an integer no smaller than one and less than or equal to M) of the parity check matrix H' are such that one each of the terms $z_1, z_2, z_3, \ldots, z_{M-2}, z_{M-1}, z_M$ is present.

The parity check matrix H' for the LDPC (block) code (i.e., the LDPC-CC having a coding rate of R=(n−1)/n using the improved tail-biting scheme described in Patent Literature 2) is expressed as shown in expression 90.

[Math. 90]

$$H' = \begin{bmatrix} z_{130} \\ z_{24} \\ \vdots \\ z_9 \\ z_3 \end{bmatrix} \quad (90)$$

Here, $H'v_j=0$ is satisfied (where the zero in $H'v_j=0$ indicates that all elements of the vector are zeroes, or that is, a kth row has a value of zero for all k (where k is an integer no smaller than one and less than or equal to M)).

That is, for the transmission sequence $v_j^T$ for the jth block, a vector extracted from the ith row of the parity check matrix H' of FIG. 36 is expressed as $c_k$ (where k is an integer no smaller than one and less than or equal to M), and the M row-vectors extracted from the kth row (where k is an integer no smaller than one and less than or equal to M) of the parity check matrix H' of FIG. 36 are such that one each of the terms $z_1, z_2, z_3, \ldots, z_{M-2}, z_{M-1}, z_M$ is present.

As described above, for the transmission sequence $v_j^T$ for the jth block, a vector extracted from the ith row of the parity check matrix H' of FIG. 36 is expressed as $c_k$ (where k is an integer no smaller than one and less than or equal to M), and the M row-vectors extracted from the kth row (where k is an integer no smaller than one and less than or equal to M) of the parity check matrix H' of FIG. 36 are such that one each of the terms $z_1, z_2, z_3, \ldots, z_{M-2}, z_{M-1}, z_M$ is present. Note that, when the above is followed to create a parity check matrix, then a parity check matrix for the transmission sequence $v_j$ of the jth block is obtainable with no limitation to the above-given example.

Accordingly, even when the LDPC-CC having a coding rate of R=(n−1)/n using the improved tail-biting scheme described in Patent Literature 2 is being used, it does not necessarily follow that a transmitting device and a receiving device are using the parity check matrix explained above or the parity check matrix explained with reference to FIGS. 26 through 30. As such, a transmitting device and a receiving device may use, in place of the parity check matrix explained above, a matrix obtained by performing reordering of columns (column permutation) as described above or a matrix obtained by performing reordering of rows (row permutation) as described above as a parity check matrix. Similarly, a transmitting device and a receiving device may use, in place of the parity check matrix explained with reference to FIGS. 26 through 30, a matrix obtained by performing reordering of columns (column permutation) as described above or a matrix obtained by performing reordering of rows (row permutation) as described above as a parity check matrix.

In addition, a matrix obtained by performing both reordering of columns (column permutation) as described above and reordering of rows (row permutation) as described above on the parity check matrix explained above for the LDPC-CC having a coding rate of R=(n−1)/n using the improved tail-biting scheme described in Patent Literature 2 may be used as a parity check matrix.

In such a case, a parity check matrix $H_1$ is obtained by performing reordering of columns (column permutation) on the parity check matrix explained above for the LDPC-CC having a coding rate of R=(n−1)/n using the improved tail-biting scheme described in Patent Literature 2 (for example, through conversion from the parity check matrix shown in FIG. 31 to the parity check matrix shown in FIG. 33). Subsequently, a parity check matrix $H_2$ is obtained by performing reordering of rows (row permutation) on the parity check matrix $H_1$ (for example, through conversion from the parity check matrix shown in FIG. 35 to the parity check matrix shown in FIG. 36). A transmitting device and a receiving device may perform encoding and decoding by using the parity check matrix $H_2$ so obtained.

Alternatively, a parity check matrix $H_{1,1}$ may be obtained by performing a first reordering of columns (column permutation) on the parity check matrix explained above for the LDPC-CC having a coding rate of R=(n−1)/n using the improved tail-biting scheme described in Patent Literature 2 (for example, through conversion from the parity check matrix shown in FIG. 31 to the parity check matrix shown in FIG. 33). Subsequently, a parity check matrix $H_{2,1}$ may be obtained by performing a first reordering of rows (row permutation) on the parity check matrix $H_{1,1}$ (for example, through conversion from the parity check matrix shown in FIG. 35 to the parity check matrix shown in FIG. 36).

Further, a parity check matrix $H_{1,2}$ may be obtained by performing a second reordering of columns (column permutation) on the parity check matrix $H_{2,1}$. Finally, a parity check matrix $H_{2,2}$ may be obtained by performing a second reordering of rows (row permutation) on the parity check matrix $H_{1,2}$.

As described above, a parity check matrix $H_{2,s}$ may be obtained by repetitively performing reordering of columns (column permutation) and reordering of rows (row permutation) for s iterations (where s is an integer no smaller than two). In such a case, a parity check matrix $H_{1,k}$ is obtained by performing a kth (where k is an integer no smaller than two and less than or equal to s) reordering of columns (column permutation) on a parity check matrix $H_{2,k-1}$. Then, a parity check matrix $H_{2,k}$ is obtained by performing a kth reordering of rows (row permutation) on the parity check matrix $H_{1,k}$. Note that in the first iteration in such a case, a parity check matrix $H_{1,1}$ is obtained by performing a first reordering of columns (column permutation) on the parity check matrix explained above for the LDPC-CC having a coding rate of R=(n−1)/n using the improved tail-biting scheme described in Patent Literature 2. Then, a parity check matrix $H_{2,1}$ is obtained by performing a first reordering of rows (row permutation) on the parity check matrix $H_{1,1}$.

In such a case, a transmitting device and a receiving device may perform encoding and decoding by using the parity check matrix $H_{2,s}$.

In another method, a parity check matrix $H_3$ is obtained by performing reordering of rows (row permutation) on the parity check matrix explained above for the LDPC-CC having a coding rate of R=(n−1)/n using the improved tail-biting scheme described in Patent Literature 2 (for example, through conversion from the parity check matrix shown in FIG. 35 to the parity check matrix shown in FIG. 36). Subsequently, a parity check matrix $H_4$ is obtained by performing reordering of columns (column permutation) on the parity check matrix $H_3$ (for example, through conversion from the parity check matrix shown in FIG. 31 to the parity check matrix shown in FIG. 33). In such a case, a transmitting device and a receiving device may perform encoding and decoding by using the parity check matrix $H_4$ so obtained.

Alternatively, a parity check matrix $H_{3,1}$ may be obtained by performing a first reordering of rows (row permutation) on the parity check matrix explained above for the LDPC-CC having a coding rate of R=(n−1)/n using the improved tail-biting scheme described in Patent Literature 2 (for example, through conversion from the parity check matrix shown in FIG. 35 to the parity check matrix shown in FIG. 36). Subsequently, a parity check matrix $H_{4,1}$ may be obtained by performing a first reordering of columns (column permutation) on the parity check matrix $H_{3,1}$ (for example, through conversion from the parity check matrix shown in FIG. 31 to the parity check matrix shown in FIG. 33).

Further, a parity check matrix $H_{3,2}$ may be obtained by performing a second reordering of rows (row permutation) on the parity check matrix $H_{4,1}$. Finally, a parity check matrix $H_{4,2}$ may be obtained by performing a second reordering of columns (column permutation) on the parity check matrix $H_{3,2}$.

As described above, a parity check matrix $H_{4,s}$ may be obtained by repetitively performing reordering of rows (row permutation) and reordering of columns (column permutation) for s iterations (where s is an integer no smaller than two). In such a case, a parity check matrix $H_{3,k}$ is obtained by performing a kth (where k is an integer no smaller than two and less than or equal to s) reordering of rows (row permutation) on a parity check matrix $H_{4,k-1}$. Then, a parity check matrix $H_{4,k}$ is obtained by performing a kth reordering of columns (column permutation) on the parity check matrix $H_{3,k}$. Note that in the first iteration in such a case, a parity check matrix $H_{3,1}$ is obtained by performing a first reordering of rows (row permutation) on the parity check matrix explained above for the LDPC-CC having a coding rate of R=(n−1)/n using the improved tail-biting scheme described in Patent Literature 2. Then, a parity check matrix $H_{4,1}$ is obtained by performing a first reordering of columns (column permutation) on the parity check matrix $H_{3,1}$.

In such a case, a transmitting device and a receiving device may perform encoding and decoding by using the parity check matrix $H_{4,s}$.

Here, note that by performing reordering of rows (row permutation) and reordering of columns (column permutation), the parity check matrix for the LDPC-CC having a coding rate of R=(n−1)/n using the improved tail-biting scheme described in Patent Literature 2 or the parity check matrix explained with reference to FIGS. 26 through 30 for the LDPC-CC having a coding rate of R=(n−1)/n using the improved tail-biting scheme described in Patent Literature 2 can be obtained from each of the parity check matrix $H_2$, the parity check matrix $H_{2,s}$, the parity check matrix $H_4$, and the parity check matrix $H_{4,s}$.

In addition, a matrix obtained by performing both reordering of columns (column permutation) as described above and reordering of rows (row permutation) as described above on the parity check matrix explained with reference to FIGS. 26 through 30 for the LDPC-CC having a coding rate of R=(n−1)/n using the improved tail-biting scheme described in Patent Literature 2 may be used as a parity check matrix.

In such a case, a parity check matrix $H_5$ is obtained by performing reordering of columns (column permutation) on the parity check matrix explained with reference to FIGS. 26 through 30 for the LDPC-CC having a coding rate of R=(n−1)/n using the improved tail-biting scheme described in Patent Literature 2 (for example, through conversion from the parity check matrix shown in FIG. 31 to the parity check matrix shown in FIG. 33). Subsequently, a parity check matrix $H_6$ is obtained by performing reordering of rows (row permutation) on the parity check matrix $H_5$ (for example, through conversion from the parity check matrix shown in FIG. 35 to the parity check matrix shown in FIG. 36). A transmitting device and a receiving device may perform encoding and decoding by using the parity check matrix $H_6$ so obtained.

Alternatively, a parity check matrix $H_{5,1}$ may be obtained by performing a first reordering of columns (column permutation) on the parity check matrix explained with reference to FIGS. 26 through 30 for the LDPC-CC having a coding rate of R=(n−1)/n using the improved tail-biting scheme described in Patent Literature 2 (for example, through conversion from the parity check matrix shown in FIG. 31 to the parity check matrix shown in FIG. 33). Subsequently, a parity check matrix $H_{6,1}$ may be obtained by performing a first reordering of rows (row permutation) on the parity check matrix $H_{5,1}$ (for example, through conversion from the parity check matrix shown in FIG. 35 to the parity check matrix shown in FIG. 36).

Further, a parity check matrix $H_{5,2}$ may be obtained by performing a second reordering of columns (column permutation) on the parity check matrix $H_{6,1}$. Finally, a parity check matrix $H_{6,2}$ may be obtained by performing a second reordering of rows (row permutation) on the parity check matrix $H_{5,2}$.

As described above, a parity check matrix $H_{6,s}$ may be obtained by repetitively performing reordering of columns (column permutation) and reordering of rows (row permutation) for s iterations (where s is an integer no smaller than two). In such a case, a parity check matrix $H_{5,k}$ is obtained by performing a kth (where k is an integer no smaller than two and less than or equal to s) reordering of columns (column permutation) on a parity check matrix $H_{6,k-1}$. Then, a parity check matrix $H_{6,k}$ is obtained by performing a kth reordering of rows (row permutation) on the parity check matrix $H_{5,k}$. Note that in the first iteration in such a case, a parity check matrix $H_{5,1}$ is obtained by performing a first reordering of columns (column permutation) on the parity check matrix explained with reference to FIGS. 26 through 30 for the LDPC-CC having a coding rate of R=(n−1)/n using the improved tail-biting scheme described in Patent Literature 2. Then, a parity check matrix $H_{6,1}$ is obtained by performing a first reordering of rows (row permutation) on the parity check matrix $H_{5,1}$.

In such a case, a transmitting device and a receiving device may perform encoding and decoding by using the parity check matrix $H_{6,s}$.

In another method, a parity check matrix $H_7$ is obtained by performing reordering of rows (row permutation) on the parity check matrix explained with reference to FIGS. 26 through 30 for the LDPC-CC having a coding rate of R=(n−1)/n using the improved tail-biting scheme described in Patent Literature 2 (for example, through conversion from the parity check matrix shown in FIG. 35 to the parity check matrix shown in FIG. 36). Subsequently, a parity check matrix $H_8$ is obtained by performing reordering of columns (column permutation) on the parity check matrix $H_7$ (for example, through conversion from the parity check matrix shown in FIG. 31 to the parity check matrix shown in FIG. 33). In such a case, a transmitting device and a receiving device may perform encoding and decoding by using the parity check matrix $H_8$ so obtained.

Alternatively, a parity check matrix $H_{7,1}$ may be obtained by performing a first reordering of rows (row permutation) on the parity check matrix explained with reference to FIGS. 26 through 30 for the LDPC-CC having a coding rate of R=(n−1)/n using the improved tail-biting scheme described in Patent Literature 2 (for example, through conversion from the parity check matrix shown in FIG. 35 to the parity check matrix shown in FIG. 36). Subsequently, a parity check matrix $H_{8,1}$ may be obtained by performing a first reordering of columns (column permutation) on the parity check matrix $H_{7,1}$ (for example, through conversion from the parity check matrix shown in FIG. 31 to the parity check matrix shown in FIG. 33).

Then, a parity check matrix $H_{7,2}$ may be obtained by performing a second reordering of rows (row permutation) on the parity check matrix $H_{8,1}$. Finally, a parity check matrix $H_{8,2}$ may be obtained by performing a second reordering of columns (column permutation) on the parity check matrix $H_{7,2}$.

As described above, a parity check matrix $H_8$ be obtained by repetitively performing reordering of rows (row permutation) and reordering of columns (column permutation) for s iterations (where s is an integer no smaller than two). In such a case, a parity check matrix $H_{7,k}$ is obtained by performing a kth (where k is an integer no smaller than two and less than or equal to s) reordering of rows (row permutation) on a parity check matrix $H_{8,k-1}$. Then, a parity check matrix $H_{8,k}$ is obtained by performing a kth reordering of columns (column permutation) on the parity check matrix $H_{7,k}$. Note that in the first iteration in such a case, a parity check matrix $H_{7,1}$ is obtained by performing a first reordering of rows (row permutation) on the parity check matrix explained with reference to FIGS. 26 through 30 for the LDPC-CC having a coding rate of R=(n−1)/n using the improved tail-biting scheme described in Patent Literature 2. Then, a parity check matrix $H_{8,1}$ is obtained by performing a first reordering of columns (column permutation) on the parity check matrix $H_{7,1}$.

In such a case, a transmitting device and a receiving device may perform encoding and decoding by using the parity check matrix $H_{8,s}$.

Here, note that by performing reordering of rows (row permutation) and reordering of columns (column permutation), the parity check matrix for the LDPC-CC having a coding rate of R=(n−1)/n using the improved tail-biting scheme described in Patent Literature 2 or the parity check matrix explained with reference to FIGS. 26 through 30 for the LDPC-CC having a coding rate of R=(n−1)/n using the improved tail-biting scheme described in Patent Literature 2 can be obtained from each of the parity check matrix $H_6$, the parity check matrix $H_{6,s}$, the parity check matrix $H_8$, and the parity check matrix $H_{8,s}$.

Expression 70 and expression 71 have been used as the parity check polynomials for forming the LDPC-CC (an LDPC block code using LDPC-CC) having a coding rate of R=(n−1)/n using the improved tail-biting scheme. However, parity check polynomials usable for forming the LDPC-CC (an LDPC block code using LDPC-CC) having a coding rate of R=(n−1)/n using the improved tail-biting scheme are not limited to those shown in expression 70 and expression 71. For instance, instead of the parity check polynomial shown in expression 70, a parity check polynomial as shown in expression 91 may used as an ith parity check polynomial (where i is an integer no smaller than zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 91]

$$
\begin{aligned}
&(D^{b1,i}+1)P(D)+\sum_{k=1}^{n-1}A_{Xk,i}(D)X_k(D) = A_{X1,i}(D)X_1(D)+ \\
&\quad A_{X2,i}(D)X_2(D)+\dots+ \\
&\quad A_{Xn-1,i}(D)X_{n-1}(D)+ \\
&\quad (D^{b1,i}+1)P(D) \\
&= (D^{b1,i}+1)P(D)+ \\
&\quad \sum_{k=1}^{n-1}\left\{\left(\sum_{j=1}^{r_{k,i}}D^{ak,i,j}\right)X_k(D)\right\} \\
&= (D^{a1,i,1}+ \\
&\quad D^{a1,i,2}+\dots+D^{a1,i,r_{1,i}})X_1(D)+ \\
&\quad (D^{a2,i,1}+D^{a2,i,2}+\dots+D^{a2,i,r_{2,i}}) \\
&\quad X_2(D)+\dots+ \\
&\quad (D^{an-1,i,1}+D^{an-1,i,2}+\dots+ \\
&\quad D^{an-1,i,r_{n-1}}) \\
&\quad X_{n-1}(D)+(D^{b1,i}+1)P(D) \\
&= 0
\end{aligned}
\tag{91}
$$

Here, $a_{p,i,q}$ (p=1, 2, . . . , n−1 (p is an integer no smaller than one and less than or equal to n−1); q=1, 2, . . . , $r_p$ (q is an integer no smaller than one and less than or equal to $r_p$)) is assumed to be a natural number. Also, when y, z=1, 2, . . . , $r_p$ (y and z are integers no smaller than one and less than or equal to $r_p$) and y≠z, $a_{p,i,y} \neq a_{p,i,z}$ holds true for conforming $^\forall$(y, z) (for all conforming y and z).

Further, in order to achieve high error correction capability, each of $r_1$, $r_2$, . . . , $r_{n-2}$, and $r_{n-1}$ is set to four or greater (k is an integer no smaller than one and less than or equal to n−1, and $r_k$ is four or greater for all conforming k). In other words, k is an integer no smaller than one and less than or equal to n−1 in expression 91, and the number of terms of $X_k(D)$ is four or greater for all conforming k. Also, $b_{1,i}$ is a natural number.

As such, expression 69, which is a parity check polynomial that satisfies zero for generating a vector of the first row of the parity check matrix $H_{pro}$ for the LDPC-CC (an LDPC block code using LDPC-CC) having a coding rate of R=(n−1)/n (where n is an integer no smaller than two) using the improved tail-biting scheme described in Patent Literature 2, is expressed as shown in expression 92 (is expressed by using the zeroth parity check polynomial that satisfies zero, according to expression 91).

[Math. 92]

$$
\begin{aligned}
&P(D)+\sum_{k=1}^{n-1}A_{Xk,i}(D)X_k(D) = A_{X1,0}(D)X_1(D)+A_{X2,0}(D)X_2(D)+\dots+ \\
&\quad A_{Xn-1,0}(D)X_{n-1}(D)+P(D) \\
&= P(D)+\sum_{k=1}^{n-1}\left\{\left(\sum_{j=1}^{r_{k,i}}D^{ak,0,j}\right)X_k(D)\right\} \\
&= (D^{a1,0,1}+D^{a1,0,2}+\dots+D^{a1,0,r_1})X_1(D)+ \\
&\quad \begin{pmatrix} D^{a2,0,1}+D^{a2,0,2}+\dots+ \\ D^{a2,0,r_2} \end{pmatrix}X_2(D)+\dots+ \\
&\quad (D^{an-1,0,1}+D^{an-1,0,2}+\dots+D^{an-1,0,r_{n-1}}) \\
&\quad X_{n-1}(D)+P(D) \\
&= 0
\end{aligned}
\tag{92}
$$

Further, as another method, in an ith parity check polynomial (where i is an integer no smaller than zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme, the number of terms of $X_k(D)$ (where k is an integer no smaller than one and less than or equal to n−1) may be set for each parity check polynomial. According to this method, for instance, instead of the parity check polynomial shown in expression 70, a parity check polynomial as shown in expression 93 may used as an ith parity check polynomial (where i is an integer no smaller than zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 93]

$$
\begin{aligned}
&(D^{b1,i}+1)P(D)+\sum_{k=1}^{n-1}A_{Xk,i}(D)X_k(D) = A_{X1,i}(D)X_1(D)+A_{X2,i}(D)X_2(D)+\dots+ \\
&\quad A_{Xn-1,i}(D)X_{n-1}(D)+(D^{b1,i}+1)P(D) \\
&= (D^{b1,i}+1)P(D)+ \\
&\quad \sum_{k=1}^{n-1}\left\{\left(1+\sum_{j=1}^{r_{k,i}}D^{ak,i,j}\right)X_k(D)\right\} \\
&= (D^{a1,i,1}+D^{a1,i,2}+\dots+D^{a1,i,r_{1,i}}+1)X_1(D)+ \\
&\quad \begin{pmatrix} D^{a2,i,1}+D^{a2,i,2}+\dots+ \\ D^{a2,i,r_{2,i}}+1 \end{pmatrix}X_2(D)+\dots+ \\
&\quad (D^{an-1,i,1}+D^{an-1,i,2}+\dots+D^{an-1,i,r_{n-1,i}}+1) \\
&\quad X_{n-1}(D)+(D^{b1,i}+1)P(D) \\
&= 0
\end{aligned}
\tag{93}
$$

Here, $a_{p,i,q}$ (p=1, 2, . . . , n−1 (p is an integer no smaller than one and less than or equal to n−1); q=1, 2, . . . , $r_{p,i}$ (q is an integer no smaller than one and less than or equal to $r_{p,i}$) is assumed to be a natural number. Also, when y, z=1, 2, . . . , $r_{p,i}$ (y and z are integers no smaller than one and less than or equal to $r_{p,i}$) and y≠z, $a_{p,i,y} \neq a_{p,i,z}$ holds true for conforming $^\forall$(y, z) (for all conforming y and z). Also, $b_{1,i}$ is a natural number. Note that expression 93 is characterized in that $r_{p,i}$ can be set for each i.

Further, in order to achieve high error correction capability, it is desirable that p is an integer no smaller than one and less than or equal to n−1, i is an integer no smaller than zero and less than or equal to m−1, and $r_{p,i}$ be set to one or greater for all conforming p and i.

As such, expression 69, which is a parity check polynomial that satisfies zero for generating a vector of the first row of the parity check matrix $H_{pro}$ for the LDPC-CC (an LDPC block code using LDPC-CC) having a coding rate of R=(n−1)/n (where n is an integer no smaller than two) using the improved tail-biting scheme described in Patent Literature 2, is expressed as shown in expression 94 (is expressed by using the zeroth parity check polynomial that satisfies zero, according to expression 93).

[Math. 94]

$$P(D)+\sum_{k=1}^{n-1}A_{Xk,0}(D)X_k(D)=A_{X1,0}(D)X_1(D)+A_{X2,0}(D)X_2(D)+\dots+A_{Xn-1,0}(D)X_{n-1}(D)+P(D)=P(D)+\sum_{k=1}^{n-1}\left\{\left(1+\sum_{j=1}^{r_{k,0}}D^{ak,0,j}\right)X_k(D)\right\}=(D^{a1,0,1}+D^{a1,0,2}+\dots+D^{a1,0,r_{1,0}}+1)X_1(D)+(D^{a2,0,1}+D^{a2,0,2}+\dots+D^{a2,0,r_{2,0}}+1)X_2(D)+\dots+(D^{an-1,0,1}+D^{an-1,0,2}+\dots+D^{an-1,0,r_{n-1,0}}+1)X_{n-1}(D)+P(D)=0 \tag{94}$$

Further, as another method, in an ith parity check polynomial (where i is an integer no smaller than zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme, the number of terms of $X_k(D)$ (where k is an integer no smaller than one and less than or equal to n−1) may be set for each parity check polynomial. According to this method, for instance, instead of the parity check polynomial shown in expression 70, a parity check polynomial as shown in expression 95 may used as an ith parity check polynomial (where i is an integer no smaller than zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 95]

$$(D^{b1,i}+1)P(D)+\sum_{k=1}^{n-1}A_{Xk,i}(D)X_k(D)=A_{X1,i}(D)X_1(D)+A_{X2,i}(D)X_2(D)+\dots+A_{Xn-1,i}(D)X_{n-1}(D)+(D^{b1,i}+1)P(D)=(D^{b1,i}+1)P(D)+\sum_{k=1}^{n-1}\left\{\left(\sum_{j=1}^{r_{k,i}}D^{ak,i,j}\right)X_k(D)\right\}=(D^{a1,i,1}+D^{a1,i,2}+\dots+D^{a1,i,r_{1,i}})X_1(D)+(D^{a2,i,1}+D^{a2,i,2}+\dots+D^{a2,i,r_{2,i}})X_2(D)+\dots+(D^{an-1,i,1}+D^{an-1,i,2}+\dots+D^{an-1,i,r_{n-1,i}})X_{n-1}(D)+(D^{b1,i}+1)P(D)=0 \tag{95}$$

Here, $a_{p,i,q}$ (p=1, 2, . . . , n−1 (p is an integer no smaller than one and less than or equal to n−1); q=1, 2, . . . , $r_{p,i}$ (q is an integer no smaller than one and less than or equal to $r_{p,i}$) is assumed to be an integer no smaller than zero. Also, when y, z=1, 2, . . . , $r_{p,i}$ (y and z are integers no smaller than one and less than or equal to $r_{p,i}$) and y≠z, $a_{p,i,y}\neq a_{p,i,z}$ holds true for conforming ∀(y, z) (for all conforming y and z). Also, $b_{1,i}$ is a natural number. Note that expression 95 is characterized in that $r_{p,i}$ can be set for each i.

Further, in order to achieve high error correction capability, it is desirable that p is an integer no smaller than one and less than or equal to n−1, i is an integer no smaller than zero and less than or equal to m−1, and $r_{p,i}$ be set to two or greater for all conforming p and i.

As such, expression 69, which is a parity check polynomial that satisfies zero for generating a vector of the first row of the parity check matrix $H_{pro}$ for the LDPC-CC (an LDPC block code using LDPC-CC) having a coding rate of R=(n−1)/n (where n is an integer no smaller than two) using the improved tail-biting scheme described in Patent Literature 2, is expressed as shown in expression 96 (is expressed by using the zeroth parity check polynomial that satisfies zero, according to expression 95).

[Math. 96]

$$P(D)+\sum_{k=1}^{n-1}A_{Xk,0}(D)X_k(D)=A_{X1,0}(D)X_1(D)+A_{X2,0}(D)X_2(D)+\dots+A_{Xn-1,0}(D)X_{n-1}(D)+P(D)=P(D)+\sum_{k=1}^{n-1}\left\{\left(\sum_{j=1}^{r_{k,0}}D^{ak,0,j}\right)X_k(D)\right\}=(D^{a1,0,1}+D^{a1,0,2}+\dots+D^{a1,0,r_{1,0}})X_1(D)+(D^{a2,0,1}+D^{a2,0,2}+\dots+D^{a2,0,r_{2,0}})X_2(D)+\dots+(D^{an-1,0,1}+D^{an-1,0,2}+\dots+D^{an-1,0,r_{n-1,0}})X_{n-1}(D)+P(D)=0 \tag{96}$$

In the above, expression 70 and expression 71 have been used as the parity check polynomials for forming the LDPC-CC (an LDPC block code using LDPC-CC) having a coding rate of R=(n−1)/n using the improved tail-biting scheme. In the following, explanation is provided of examples of conditions to be applied to the parity check polynomials in expression 70 and expression 71 for achieving high error correction capability.

As explanation is provided above, in order to achieve high error correction capability, each of $r_1$, $r_2$, . . . , $r_{n-2}$, and $r_{n-1}$ is set to three or greater (k is an integer no smaller than one and less than or equal to n−1, and $r_k$ is three or greater for all conforming k), or that is, in expression 70, k is an integer no smaller than one and less than or equal to n−1, and the number of terms of $X_k(D)$ is set to four or greater for all conforming k. In the following, explanation is provided of examples of conditions for achieving high error correction capability when each of $r_1$, $r_2$, . . . , $r_{n-2}$, and $r_{n-1}$ is set to three or greater.

Here, note that since the parity check polynomial of expression 71 is created by using the zeroth parity check polynomial of expression 70, in expression 71, k is an integer no smaller than one and less than or equal to n−1, and the number of terms of $X_k(D)$ is four or greater for all conforming k. Further, as explained above, the parity check polynomial that satisfies zero, according to expression 70, becomes an ith parity check polynomial (where i is an integer no smaller than zero and less than or equal to m−1) that satisfies zero for the LDPC-CC based on a parity check polynomial having a coding rate of R=(n−1)/n and a time-varying period of m, which serves as the basis of the LDPC-CC having a coding rate of R=(n−1)/n using the improved tail-biting scheme described in Patent Literature 2, and the parity check polynomial that satisfies zero, according to expression 71, becomes a parity check polynomial that satisfies zero for generating a vector of the first row of the parity check matrix $H_{pro}$ for the LDPC-CC (an LDPC block code using LDPC-CC) having a coding rate of R=(n−1)/n (where n is an integer no smaller than two) using the improved tail-biting scheme described in Patent Literature 2.

Here, high error-correction capability is achievable when the following conditions are taken into consideration in order to have a minimum column weight of three in a partial matrix pertaining to information $X_1$ in the parity check matrix $H_{pro\_m}$ shown in FIG. 28 for the LDPC-CC (an LDPC block code using LDPC-CC) having a coding rate of R=(n−1)/n using the improved tail-biting scheme. Note that a column weight of a column α in a parity check matrix is defined as the number of ones existing among vector elements in a vector extracted from the column α.

<Condition #B-1-1>

$a_{1,0,1}\%m=a_{1,1,1}\%m=a_{1,2,1}\%m=a_{1,3,1}\%m= \ldots =a_{1,g,1}\%m= \ldots =a_{1,m-2,1}\%m=a_{1,m-1,1}\%m=v_{1,1}$ (where $v_{1,1}$ is a fixed value)

$a_{1,0,2}\%m=a_{1,1,2}\%m=a_{1,2,2}\%m=a_{1,3,2}\%m= \ldots =a_{1,g,2}\%m= \ldots =a_{1,m-2,2}\%m=a_{1,m-1,2}\%m=v_{1,2}$ (where $v_{1,2}$ is a fixed value)

(where, in the above, g is an integer no smaller than zero and less than or equal to m−1)

Similarly, high error-correction capability is achievable when the following conditions are taken into consideration in order to have a minimum column weight of three in a partial matrix pertaining to information $X_2$ in the parity check matrix $H_{pro\_m}$ shown in FIG. 28 for the LDPC-CC (an LDPC block code using LDPC-CC) having a coding rate of R=(n−1)/n using the improved tail-biting scheme.

<Condition #B-1-2>

$a_{2,0,1}\%m=a_{2,1,1}\%m=a_{2,2,1}\%m=a_{2,3,1}\%m= \ldots =a_{2,g,1}\%m= \ldots =a_{2,m-2,1}\%m=a_{2,m-1,1}\%m=v_{2,1}$ (where $v_{2,1}$ is a fixed value)

$a_{2,0,2}\%m=a_{2,1,2}\%m=a_{2,2,2}\%m=a_{2,3,2}\%m= \ldots =a_{2,g,2}\%m= \ldots =a_{2,m-2,2}\%m=a_{2,m-1,2}\%m=v_{2,2}$ (where $v_{2,2}$ is a fixed value)

(where, in the above, g is an integer no smaller than zero and less than or equal to m−1)

⋮

Generalizing the above, high error-correction capability is achievable when the following conditions are taken into consideration in order to have a minimum column weight of three in a partial matrix pertaining to information $X_k$ in the parity check matrix $H_{pro\_m}$ shown in FIG. 28 for the LDPC-CC (an LDPC block code using LDPC-CC) having a coding rate of R=(n−1)/n using the improved tail-biting scheme (where k is an integer no smaller than one and less than or equal to n−1).

<Condition #B-1-k>

$a_{k,0,1}\%m=a_{k,1,1}\%m=a_{k,2,1}\%m=a_{k,3,1}\%m= \ldots =a_{k,g,1}\%= \ldots =a_{k,m-2,1}\%m=a_{k,m-1,1}\%m=v_{k,1}$ (where $v_{k,1}$ is a fixed value)

$a_{k,0,2}\%m=a_{k,1,2}\%m=a_{k,2,2}\%m=a_{k,3,2}\%m= \ldots =a_{k,g,2}\%m= \ldots =a_{k,m-2,2}\%m=a_{k,m-1,2}\%m=v_{k,2}$ (where $v_{k,2}$ is a fixed value)

(where, in the above, g is an integer no smaller than zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro}$ shown in FIG. 28 for the LDPC-CC (an LDPC block code using LDPC-CC) having a coding rate of R=(n−1)/n using the improved tail-biting scheme.

<Condition #B-1-(n−1)>

$a_{n-1,0,1}\%m=a_{n-1,1,1}\%m=a_{n-1,2,1}\%m=a_{n-1,3,1}\%m= \ldots =a_{n-1,g,1}\%m= \ldots =a_{n-1,2,1}\%m=a_{n-1,m-1,1}\%m=v_{n-1,1}$ (where $v_{n-1,1}$ is a fixed value)

$a_{n-1,0,2}\%m=a_{n-1,1,2}\%m=a_{n-1,2,2}\%m=a_{n-1,3,2}\%m= \ldots =a_{n-1,g,2}\%m= \ldots =a_{n-1,m-2,2}\%m=a_{n-1,m-1,2}\%m=v_{n-1,2}$ (where $v_{n-1,2}$ is a fixed value)

(where, in the above, g is an integer no smaller than zero and less than or equal to m−1)

In the above, % means a modulo, and for example, α%m represents a remainder after dividing α by m. Conditions #B-1-1 through #B-1-(n−1) are also expressible as follows. In the following, j is one or two.

<Condition #B-1'-1>

$a_{1,g,j}\%m=v_{1,j}$ for ∀g, g=0, 1, 2, . . . , m−3, m−2, m−1 (where $v_{1,j}$ is a fixed value)

(The above indicates that g is an integer no smaller than zero and less than or equal to m−1, and $a_{1,g,j}\%m=v_{1,j}$ (where $v_{1,j}$ is a fixed value) holds true for all conforming g.)

<Condition #B-1'-2>

$a_{2,g,j}\%m=v_{2,j}$ for ∀g, g=0, 1, 2, . . . , m−3, m−2, m−1 (where $v_{2,j}$ is a fixed value)

(The above indicates that g is an integer no smaller than zero and less than or equal to m−1, and $a_{2,g,j}\%m=v_{2,j}$ (where $v_{2,j}$ is a fixed value) holds true for all conforming g.)

⋮

The following is a generalization of the above.

<Condition #B-1'-k>

$a_{k,g,j}\%m=v_{k,j}$ for ∀g, g=0, 1, 2, . . . , m−3, m−2, m−1 (where $v_{k,j}$ is a fixed value)

(The above indicates that g is an integer no smaller than zero and less than or equal to m−1, and $a_{k,g,j}\%m=v_{k,j}$ (where $v_{k,j}$ is a fixed value) holds true for all conforming g.)

(In the above, k is an integer no smaller than one and less than or equal to n−1.)

⋮

<Condition #B-1'-(n−1)>

$a_{n-1,g,j}\%m=v_{n-1,j}$ for ∀g, g=0, 1, 2, . . . , m−3, m−2, m−1 (where is a fixed value)

(The above indicates that g is an integer no smaller than zero and less than or equal to m−1, and $a_{n-1,g,j}\%m=v_{n-1,j}$ (where $v_{n-1,j}$ is a fixed value) holds true for all conforming g.)

Further, high error correction capability is achievable when the following conditions are also satisfied.

<Condition #B-2-1>

$v_{1,1}\neq 0$, and $v_{1,2}\neq 0$ hold true, and also, $v_{1,1}\neq v_{1,2}$ holds true.

<Condition #B-2-2>

$v_{2,1}\neq 0$, and $v_{2,2}\neq 0$ hold true, and also, $v_{2,1}\neq v_{2,2}$ holds true.

⋮

The following is a generalization of the above.

<Condition #B-2-k>

$v_{k,1}\neq 0$, and $v_{k,2}\neq 0$ hold true, and also, $v_{k,1}\neq v_{k,2}$ holds true.

(In the above, k is an integer no smaller than one and less than or equal to n−1.)

⋮

<Condition #B-2-(n−1)>

$v_{n-1,1}\neq 0$, and $v_{n-1,2}\neq 0$ hold true, and also, $v_{n-1,1}\neq v_{n-1,2}$ holds true.

Further, since partial matrices pertaining to information $X_1$ through $X_{n-1}$ in the parity check matrix $H_{pro\_m}$ shown in FIG. 28 for the LDPC-CC (an LDPC block code using LDPC-CC) having a coding rate of R=(n−1)/n using the improved tail-biting scheme should be irregular, the following conditions are taken into consideration.

<Condition #B-3-1>

$a_{1,g,v}\%m=a_{1,h,v}\%m$ for $\forall g\forall h$, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and $a_{1,g,v}\%m=a_{1,h,v}\%m$ holds true for all conforming g and h.) . . . Condition #Xa-1

In the above, v is an integer no smaller than three and less than or equal to $r_1$, and Condition #Xa-1 does not hold true for all v.

<Condition #B-3-2>

$a_{2,g,v}\%m=a_{2,h,v}\%m$ for $\forall g\forall h$, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and $a_{2,g,v}\%m=a_{2,h,v}\%m$ holds true for all conforming g and h.) . . . Condition #Xa-2

In the above, v is an integer no smaller than three and less than or equal to $r_2$, and Condition #Xa-2 does not hold true for all v.

⋮

The following is a generalization of the above.

<Condition #B-3-k>

$a_{k,g,v}\%m=a_{k,h,v}\%m$ for $\forall g\forall h$, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and $a_{k,g,v}\%m=a_{k,h,v}\%m$ holds true for all conforming g and h.) . . . Condition #Xa-k In the above, v is an integer no smaller than three and less than or equal to $r_k$, and Condition #Xa-k does not hold true for all v.

(In the above, k is an integer no smaller than one and less than or equal to n−1.)

⋮

<Condition #B-3-(n−1)>

$a_{n-1,g}\%m=a_{n-1,h,v}\%m$ for $\forall g\forall h$, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and $a_{n-1,g}\%m=a_{n-1,h,v}\%m$ holds true for all conforming g and h.) . . . Condition #Xa-(n−1)

In the above, v is an integer no smaller than three and less than or equal to $r_{n-1}$, and Condition #Xa-(n−1) does not hold true for all v.

Conditions #B-3-1 through #B-3-(n−1) are also expressible as follows.

<Condition #B-3'-1>

$a_{1,g,v}\%m\neq a_{1,h,v}\%m$ for $\exists g\exists h$, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and values of g and h that satisfy $a_{1,g,v}\%m\neq a_{1,h,v}\%m$ exist.) . . . Condition #Ya-1

In the above, v is an integer no smaller than three and less than or equal to $r_1$, and Condition #Ya-1 holds true for all conforming v.

<Condition #B-3'-2>

$a_{2,g,v}\%m\neq a_{2,h,v}\%m$ for $\exists g\exists h$, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and values of g and h that satisfy $a_{2,g,v}\%m\neq a_{2,h,v}\%m$ exist.) . . . Condition #Ya-2

In the above, v is an integer no smaller than three and less than or equal to $r_2$, and Condition #Ya-2 holds true for all conforming v.

⋮

The following is a generalization of the above.

<Condition #B-3'-k>

$a_{k,g,v}\%m\neq a_{k,h,v}\%m$ for $\exists g\exists h$, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and values of g and h that satisfy $a_{k,g,v}\%m\neq a_{k,h,v}\%m$ exist.) . . . Condition #Ya-k In the above, v is an integer no smaller than three and less than or equal to $r_k$, and Condition #Ya-k holds true for all conforming v.

(In the above, k is an integer no smaller than one and less than or equal to n−1.)

⋮

<Condition #B-3'-(n−1)>

$a_{n-1,g,v}\%m\neq a_{n-1,h,v}\%m$ for $\exists g\exists h$, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and values of g and h that satisfy $a_{n-1,g,v}\%m\neq a_{n-1,h,v}\%m$ exist.) . . . Condition #Ya-(n−1)

In the above, v is an integer no smaller than three and less than or equal to $r_{n-1}$, and Condition #Ya-(n−1) holds true for all conforming v.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 28 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

Based on the conditions above, an LDPC-CC (an LDPC block code using LDPC-CC) having a coding rate of R=(n−1)/n using the improved tail-biting scheme, and achieving high error correction capability, can be generated. Note that, in order to easily obtain an LDPC-CC (an LDPC block code using LDPC-CC) having a coding rate of R=(n−1)/n using the improved tail-biting scheme, and achieving high error correction capability, it is desirable that $r_1=r_2=\ldots=r_{n-2}=r_{n-1}=r$ (where r is three or greater) be satisfied.

In addition, it may be desirable that, when drawing a tree, check nodes corresponding to the parity check polynomials of expression 70 and expression 71, which are parity check polynomials for forming the LDPC-CC (an LDPC block code using LDPC-CC) having a coding rate of R=(n−1)/n using the improved tail-biting scheme, appear in a great number as possible in the tree.

In order to ensure that check nodes corresponding to the parity check polynomials of expression 70 and expression 71 appear in a great number as possible in the above-described tree, it is desirable that $v_{k,1}$ and $v_{k,2}$ (where k is an integer no smaller than one and less than or equal to n−1) as described above satisfy the following conditions.

<Condition #B-4-1>

When expressing a set of divisors of m other than one as R, $v_{k,1}$ is not to belong to R.

<Condition #B-4-2>

When expressing a set of divisors of m other than one as R, $v_{k,2}$ is not to belong to R.

In addition to the above-described conditions, the following conditions may further be satisfied.

<Condition #B-5-1>

$v_{k,1}$ belongs to a set of integers no smaller than one and less than or equal to m−1, and $v_{k,1}$ also satisfies the following condition. When expressing a set of values w obtained by extracting all values w satisfying $v_{k,1}/w=g$ (where g is a natural number) as S, an intersection R∩S produces an empty set. The set R has been defined in Condition #B-4-1.

<Condition #B-5-2>

$v_{k,2}$ belongs to a set of integers no smaller than one and less than or equal to m−1, and $v_{k,2}$ also satisfies the following condition. When expressing a set of values w obtained by extracting all values w satisfying $v_{k,2}/w=g$ (where g is a natural number) as S, an intersection R∩S produces an empty set. The set R has been defined in Condition #B-4-2.

Condition #B-5-1 and Condition #B-5-2 are also expressible as Condition #B-5-1' and Condition #B-5-2', respectively.

<Condition #B-5-1'>

$v_{k,1}$ belongs to a set of integers no smaller than one and less than or equal to m−1, and $v_{k,1}$ also satisfies the following condition. When expressing a set of divisors of $v_{k,1}$ as S, an intersection R∩S produces an empty set.

<Condition #B-5-2'>

$v_{k,2}$ belongs to a set of integers no smaller than one and less than or equal to m−1, and $v_{k,2}$ also satisfies the following condition. When expressing a set of divisors of $v_{k,2}$ as S, an intersection R∩S produces an empty set.

Condition #B-5-1 and Condition #B-5-1' are also expressible as Condition #B-5-1", and Condition #B-5-2 and Condition #B-5-2' are also expressible as Condition #B-5-2".

<Condition #B-5-1">

$v_{k,1}$ belongs to a set of integers no smaller than one and less than or equal to m−1, and $v_{k,1}$ also satisfies the following condition. The greatest common divisor of $v_{k,1}$ and m is one.

<Condition #B-5-2">

$v_{k,2}$ belongs to a set of integers no smaller than one and less than or equal to m−1, and $v_{k,2}$ also satisfies the following condition. The greatest common divisor of $v_{k,2}$ and m is one.

In the above, expression 91 and expression 92 have been used as the parity check polynomials for forming the LDPC-CC (an LDPC block code using LDPC-CC) having a coding rate of R=(n−1)/n using the improved tail-biting scheme. In the following, explanation is provided of examples of conditions to be applied to the parity check polynomials in expression 91 and expression 92 for achieving high error correction capability.

As explained above, in order to achieve high error correction capability, each of $r_1, r_2, \ldots, r_{n-2}$, and $r_{n-1}$ is set to four or greater (k is an integer no smaller than one and less than or equal to n−1, and $r_k$ is three or greater for all conforming k). In other words, k is an integer no smaller than one and less than or equal to n−1 in expression 70, and the number of terms of $X_k(D)$ is four or greater for all conforming k.

In the following, explanation is provided of examples of conditions for achieving high error correction capability when each of $r_1, r_2, \ldots, r_{n-2}$, and $r_{n-1}$ is set to four or greater.

Here, note that since the parity check polynomial of expression 92 is created by using the zeroth parity check polynomial of expression 91, in expression 92, k is an integer no smaller than one and less than or equal to n−1, and the number of terms of $X_k(D)$ is four or greater for all conforming k.

Further, as explained above, the parity check polynomial that satisfies zero, according to expression 91, becomes an ith parity check polynomial (where i is an integer no smaller than zero and less than or equal to m−1) that satisfies zero for the LDPC-CC based on a parity check polynomial having a coding rate of R=(n−1)/n and a time-varying period of m, which serves as the basis of the LDPC-CC having a coding rate of R=(n−1)/n using the improved tail-biting scheme described in Patent Literature 2, and the parity check polynomial that satisfies zero, according to expression 92, becomes a parity check polynomial that satisfies zero for generating a vector of the first row of the parity check matrix $H_{pro}$ for the LDPC-CC (an LDPC block code using LDPC-CC) having a coding rate of R=(n−1)/n (where n is an integer no smaller than two) using the improved tail-biting scheme described in Patent Literature 2.

Here, high error-correction capability is achievable when the following conditions are taken into consideration in order to have a minimum column weight of three in the partial matrix pertaining to information $X_1$ in the parity check matrix $H_{pro\_m}$ shown in FIG. 28 for the LDPC-CC (an LDPC block code using LDPC-CC) having a coding rate of R=(n−1)/n using the improved tail-biting scheme. Note that a column weight of a column α in a parity check matrix is defined as the number of ones existing among vector elements in a vector extracted from the column α.

<Condition #B-6-1>

$a_{1,0,1}\%m=a_{1,1,1}\%m=a_{1,2,1}\%m=a_{1,3,1}\%m= \ldots =a_{1,g,1}\%m= \ldots =a_{1,m-2,1}\%m=a_{1,m-1,1}\%m=v_{1,1}$ (where $v_{1,1}$ is a fixed value)

$a_{1,0,2}\%m=a_{1,1,2}\%m=a_{1,2,2}\%m=a_{1,3,2}\%m= \ldots =a_{1,g,2}\%m= \ldots =a_{1,m-2,2}\%m=a_{1,m-1,2}\%m=v_{1,2}$ (where $v_{1,2}$ is a fixed value)

$a_{1,0,3}\%m=a_{1,1,3}\%m=a_{1,2,3}\%m=a_{1,3,3}\%m= \ldots =a_{1,g,3}\%m= \ldots =a_{1,m-2,3}\%m=a_{1,m-1,3}\%m=v_{1,3}$ (where $v_{1,3}$ is a fixed value)

(where, in the above, g is an integer no smaller than zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 28 for the LDPC-CC (an LDPC block code using LDPC-CC) having a coding rate of R=(n−1)/n using the improved tail-biting scheme.

<Condition #B-6-2>

$a_{2,0,1}\%m=a_{2,1,1}\%m=a_{2,2,1}\%m=a_{2,3,1}\%m= \ldots =a_{2,g,1}\%m= \ldots =a_{2,m-2,1}\%m=a_{2,m-1,1}\%m=v_{2,1}$ (where $v_{2,1}$ is a fixed value)

$a_{2,0,2}\%m=a_{2,1,2}\%m=a_{2,2,2}\%m=a_{2,3,2}\%m= \ldots =a_{2,g,2}\%m= \ldots =a_{2,m-2,2}\%m=a_{2,m-1,2}\%m=v_{2,2}$ (where $v_{2,2}$ is a fixed value)

$a_{2,0,3}\%m=a_{2,1,3}\%m=a_{2,2,3}\%m=a_{2,3,3}\%m= \ldots =a_{2,g,3}\%m= \ldots =a_{2,m-2,3}\%m=a_{2,m-1,3}\%m=v_{2,3}$ (where $v_{2,2}$ is a fixed value)

(where, in the above, g is an integer no smaller than zero and less than or equal to m−1)

⋮

Generalizing the above, high error-correction capability is achievable when the following conditions are taken into consideration in order to have a minimum column weight of three in a partial matrix pertaining to information $X_k$ in the parity check matrix $H_{pro\_m}$ shown in FIG. 28 for the LDPC-CC (an LDPC block code using LDPC-CC) having a coding rate of R=(n−1)/n using the improved tail-biting scheme (where k is an integer no smaller than one and less than or equal to n−1).

<Condition #B-6-k>

$a_{k,0,1}\%m=a_{k,1,1}\%m=a_{k,2,1}\%m=a_{k,3,1}\%m= \ldots =a_{k,g,1}\%= \ldots =a_{k,m-2,1}\%m=a_{k,m-1,1}\%m=v_{k,1}$ (where $v_{k,1}$ is a fixed value)

$a_{k,0,2}\%m=a_{k,1,2}\%m=a_{k,2,2}\%m=a_{k,3,2}\%m= \ldots =a_{k,g,2}\%m= \ldots =a_{k,m-2,2}\%m=a_{k,m-1,2}\%m=v_{k,2}$ (where $v_{k,2}$ is a fixed value)

$a_{k,0,3}\%m=a_{k,1,3}\%m=a_{k,2,3}\%m=a_{k,3,3}\%m= \ldots =a_{k,g,3}\%m= \ldots =a_{k,m-2,3}\%m=a_{k,m-1,3}\%m=v_{k,3}$ (where $v_{k,3}$ is a fixed value)

(where, in the above, g is an integer no smaller than zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 28 for the LDPC-CC (an LDPC block code using LDPC-CC) having a coding rate of R=(n−1)/n using the improved tail-biting scheme.

<Condition #B-6-(n−1)>

$a_{n-1,0,1}\%m=a_{n-1,1,1}\%m=a_{n-1,2,1}\%m=a_{n-1,3,1}\%m= \ldots =a_{n-1,g,1}\%m= \ldots =a_{n-1,2,1}\%m=a_{n-1,m-1,1}\%m=v_{n-1,1}$ (where $v_{n-1,1}$ is a fixed value)

$a_{n-1,0,2}\%m=a_{n-1,1,2}\%m=a_{n-1,2,2}\%m=a_{n-1,3,2}\%m= \ldots =a_{n-1,g,2}\%m= \ldots =a_{n-1,m-2,2}\%m=a_{n-1,m-1,2}\%m=v_{n-1,2}$ (where $v_{n-1,2}$ is a fixed value)

$a_{n-1,0,3}\%m=a_{n-1,1,3}\%m=a_{n-1,2,3}\%m=a_{n-1,3,3}\%m= \ldots =a_{n-1,g,3}\%m= \ldots =a_{n-1,m-2,3}\%m=a_{n-1,m-1,3}\%m=v_{n-1,3}$ (where $v_{n-1,3}$ is a fixed value)

(where, in the above, g is an integer no smaller than zero and less than or equal to m−1)

In the above, % means a modulo, and for example, α%m represents a remainder after dividing α by m. Conditions #B-6-1 through #B-6-(n−1) are also expressible as follows. In the following, j is one, two, or three.

<Condition #B-6'-1>

$a_{1,g,j}\%m=v_{1,j}$ for ∀g, g=0, 1, 2, . . . , m−3, m−2, m−1 (where $v_{1,j}$ is a fixed value)

(The above indicates that g is an integer no smaller than zero and less than or equal to m−1, and $a_{1,g,j}\%m=v_{1,j}$ (where $v_{1,j}$ is a fixed value) holds true for all conforming g.)

<Condition #B-6'-2>

$a_{2,g,j}\%m=v_{2,j}$ for ∀g, g=0, 1, 2, . . . , m−3, m−2, m−1 (where $v_{2,j}$ is a fixed value)

(The above indicates that g is an integer no smaller than zero and less than or equal to m−1, and $a_{2,g,v}\%m=v_{2,j}$ (where $v_{2,j}$ is a fixed value) holds true for all conforming g.)

⋮

The following is a generalization of the above.

<Condition #B-6'-k>

$a_{k,g,j}\%m=v_{k,j}$ for ∀g, g=0, 1, 2, . . . , m−3, m−2, m−1 (where $v_{k,j}$ is a fixed value)

(The above indicates that g is an integer no smaller than zero and less than or equal to m−1, and $a_{k,g,j}\%m=v_{k,j}$ (where $v_{k,j}$ is a fixed value) holds true for all conforming g.)

(In the above, k is an integer no smaller than one and less than or equal to n−1.)

⋮

<Condition #B-6'-(n−1)>

$a_{n-1,g,j}\%m=v_{n-1,j}$ for ∀g, g=0, 1, 2, . . . , m−3, m−2, m−1 (where is a fixed value)

(The above indicates that g is an integer no smaller than zero and less than or equal to m−1, and $a_{n-1,g,j}\%m=v_{n-1,j}$ (where $v_{n-1,j}$ is a fixed value) holds true for all conforming g.)

Further, high error-correction capability is achievable when the following conditions are also satisfied.

<Condition #B-7-1>

$v_{1,1}\neq v_{1,2}$, $v_{1,1}\neq v_{1,3}$, $v_{1,2}\neq v_{1,3}$ holds true.

<Condition #B-7-2>

$v_{2,1}\neq v_{2,2}$, $v_{2,1}\neq v_{2,3}$, $v_{2,2}\neq v_{2,3}$ holds true.

⋮

The following is a generalization of the above.

<Condition #B-7-k>

$v_{k,1}\neq v_{k,2}$, $v_{k,1}\neq v_{k,3}$, $v_{k,2}\neq v_{k,3}$ holds true.

(where, in the above, k is an integer no smaller than one and less than or equal to n−1)

⋮

<Condition #B-7-(n−1)>

$v_{n-1,1}\neq v_{n-1,2}$, $v_{n-1,1}\neq v_{n-1,3}$, $v_{n-1,2}\neq v_{n-1,3}$ holds true.

Further, since the partial matrices pertaining to information $X_1$ through $X_{n-1}$ in the parity check matrix $H_{pro\_m}$ shown in FIG. 28 for the LDPC-CC (an LDPC block code using LDPC-CC) having a coding rate of R=(n−1)/n using the improved tail-biting scheme should be irregular, the following conditions are taken into consideration.

<Condition #B-8-1>

$a_{1,g,v}\%m=a_{1,h,v}\%m$ for ∀g∀h, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and $a_{1,g,v}\%m=a_{1,h,v}\%m$ holds true for all conforming g and h.) . . . Condition #Xa-1

In the above, v is an integer no smaller than four and less than or equal to $r_1$, and Condition #Xa-1 does not hold true for all v.

<Condition #B-8-2>

$a_{2,g,v}\%m=a_{2,h,v}\%m$ for ∀g∀h, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and $a_{2,g,v}\%m=a_{2,h,v}\%m$ holds true for all conforming g and h.) . . . Condition #Xa-2

In the above, v is an integer no smaller than four and less than or equal to $r_2$, and Condition #Xa-2 does not hold true for all v.

⋮

The following is a generalization of the above.

<Condition #B-8-k>

$a_{k,g,v}\%m=a_{k,h,v}\%m$ for $\forall g \forall h$, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and $a_{k,g,v}\%m=a_{k,h,v}\%m$ holds true for all conforming g and h.) . . . Condition #Xa-k In the above, v is an integer no smaller than four and less than or equal to $r_k$, and Condition #Xa-k does not hold true for all v.

(In the above, k is an integer no smaller than one and less than or equal to n−1.)

⋮

<Condition #B-8-(n−1)>

$a_{n-1,g,v}\%m=a_{n-1,h,v}\%m$ for $\forall g \forall h$, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and $a_{n-1,g,v}\%m=a_{n-1,h,v}\%m$ holds true for all conforming g and h.) . . . Condition #Xa-(n−1)

In the above, v is an integer no smaller than four and less than or equal to $r_{n-1}$, and Condition #Xa-(n−1) does not hold true for all v.

Conditions #B-8-1 through #B-8-(n−1) are also expressible as follows.

<Condition #B-8'-1>

$a_{1,g,v}\%m \neq a_{1,h,v}\%m$ for $\exists g \exists h$, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and values of g and h that satisfy $a_{1,g,v}\%m \neq a_{1,h,v}\%m$ exist.) . . . Condition #Ya-1

In the above, v is an integer no smaller than four and less than or equal to $r_1$, and Condition #Ya-1 holds true for all conforming v.

<Condition #B-8'-2>

$a_{2,g,v}\%m \neq a_{2,h,v}\%m$ for $\exists g \exists h$, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and values of g and h that satisfy $a_{2,g,v}\%m \neq a_{2,h,v}\%m$ exist.) . . . Condition #Ya-2

In the above, v is an integer no smaller than four and less than or equal to $r_2$, and Condition #Ya-2 holds true for all conforming v.

⋮

The following is a generalization of the above.

<Condition #B-8'-k>

$a_{k,g,v}\%m \neq a_{k,h,v}\%m$ for $\exists g \exists h$, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and values of g and h that satisfy $a_{k,g,v}\%m \neq a_{k,h,v}\%m$ exist.) . . . Condition #Ya-k In the above, v is an integer no smaller than four and less than or equal to $r_k$, and Condition #Ya-k holds true for all conforming v.

(In the above, k is an integer no smaller than one and less than or equal to n−1)

⋮

<Condition #B-8'-(n−1)>

$a_{n-1,g,v}\%m \neq a_{n-1,h,v}\%m$ for $\exists g \exists h$, g, h=0, 1, 2, . . . , m−3, m−2, m−1; g≠h (The above indicates that g is an integer no smaller than zero and less than or equal to m−1, h is an integer no smaller than zero and less than or equal to m−1, g≠h, and values of g and h that satisfy $a_{n-1,g,v}\%m \neq a_{n-1,h,v}\%m$ exist.) . . . Condition #Ya-(n−1)

In the above, v is an integer no smaller than four and less than or equal to and Condition #Ya-(n−1) holds true for all conforming v.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$, shown in FIG. 28 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

Based on the conditions above, an LDPC-CC (an LDPC block code using LDPC-CC) having a coding rate of R=(n−1)/n using the improved tail-biting scheme, and achieving high error correction capability, can be generated. Note that, in order to easily obtain an LDPC-CC (an LDPC block code using LDPC-CC) having a coding rate of R=(n−1)/n using the improved tail-biting scheme, and achieving high error correction capability, it is desirable that $r_1=r_2= \ldots =r_{n-2}=r_{n-1}=r$ (where r is four or greater) be satisfied.

In the above, expression 93 and expression 94 have been used as the parity check polynomials for forming the LDPC-CC (an LDPC block code using LDPC-CC) having a coding rate of R=(n−1)/n using the improved tail-biting scheme. In the following, explanation is provided of examples of conditions to be applied to the parity check polynomials in expression 93 and expression 94 for achieving high error correction capability.

In order to achieve high error correction capability, when i is an integer no smaller than zero and less than or equal to m−1, each of $r_{1,i}$, $r_{2,i}$, . . . , $r_{n-2,i}$, $r_{n-1,i}$ is set to two or greater for all conforming i. In the following, explanation is provided of conditions for achieving high error correction capability in the above-described case.

As described above, the parity check polynomial that satisfies zero, according to expression 93, becomes an ith parity check polynomial (where i is an integer no smaller than zero and less than or equal to m−1) that satisfies zero for the LDPC-CC based on a parity check polynomial having a coding rate of R=(n−1)/n and a time-varying period of m, which serves as the basis of the LDPC-CC having a coding rate of R=(n−1)/n using the improved tail-biting scheme described in Patent Literature 2, and the parity check polynomial that satisfies zero, according to expression 94, becomes a parity check polynomial that satisfies zero for generating a vector of the first row of the parity check matrix $H_{pro}$ for the LDPC-CC (an LDPC block code using LDPC-CC) having a coding rate of R=(n−1)/n (where n is an integer no smaller than two) using the improved tail-biting scheme described in Patent Literature 2.

Here, high error-correction capability is achievable when the following conditions are taken into consideration in order to have a minimum column weight of three in the partial matrix pertaining to information $X_1$ in the parity check matrix $H_{pro\_m}$ shown in FIG. 28 for the LDPC-CC (an LDPC block code using LDPC-CC) having a coding rate of R=(n−1)/n using the improved tail-biting scheme. Note that a column weight of a column $\alpha$ in a parity check matrix is defined as the number of ones existing among vector elements in a vector extracted from the column $\alpha$.

<Condition #B-9-1>

$a_{1,0,1}\%m=a_{1,1,1}\%m=a_{1,2,1}\%m=a_{1,3,1}\%m= \ldots =a_{1,g,1}\%m= \ldots =a_{1,m-2,1}\%m=a_{1,m-1,1}\%m=v_{1,1}$ (where $v_{1,1}$ is a fixed value)

$a_{1,0,2}\%m=a_{1,1,2}\%m=a_{1,2,2}\%m=a_{1,3,2}\%m= \ldots =a_{1,g,2}\%m= \ldots =a_{1,m-2,2}\%m=a_{1,m-1,2}\%m=v_{1,2}$ (where $v_{1,2}$ is a fixed value)

(where, in the above, g is an integer no smaller than zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 28 for the LDPC-CC (an LDPC block code using LDPC-CC) having a coding rate of R=(n−1)/n using the improved tail-biting scheme.

<Condition #B-9-2>

$a_{2,0,1}\%m=a_{2,1,1}\%m=a_{2,2,1}\%m=a_{2,3,1}\%m= \ldots =a_{2,g,1}\%m= \ldots =a_{2,m-2,1}\%m=a_{2,m-1,1}\%m=v_{2,1}$ (where $v_{2,1}$ is a fixed value)

$a_{2,0,2}\%m=a_{2,1,2}\%m=a_{2,2,2}\%m=a_{2,3,2}\%m= \ldots =a_{2,g,2}\%m= \ldots =a_{2,m-2,2}\%m=a_{2,m-1,2}\%m=v_{2,2}$ (where $v_{2,2}$ is a fixed value)

(where, in the above, g is an integer no smaller than zero and less than or equal to m−1)

⋮

Generalizing the above, high error-correction capability is achievable when the following conditions are taken into consideration in order to have a minimum column weight of three in a partial matrix pertaining to information $X_k$ in the parity check matrix $H_{pro\_m}$ shown in FIG. 28 for the LDPC-CC (an LDPC block code using LDPC-CC) having a coding rate of R=(n−1)/n using the improved tail-biting scheme (where k is an integer no smaller than one and less than or equal to n−1).

<Condition #B-9-k>

$a_{k,0,1}\%m=a_{k,1,1}\%m=a_{k,2,1}\%m=a_{k,3,1}\%m= \ldots = a_{k,g,1}\%= \ldots =a_{k,m-2,1}\%m=a_{k,m-1,1}\%m=v_{k,1}$ (where $v_{k,1}$ is a fixed value)

$a_{k,0,2}\%m=a_{k,1,2}\%m=a_{k,2,2}\%m=a_{k,3,2}\%m= \ldots =a_{k,g,2}\%m= \ldots =a_{k,m-2,2}\%m=a_{k,m-1,2}\%m=v_{k,2}$ (where $v_{k,2}$ is a fixed value)

(where, in the above, g is an integer no smaller than zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 28 for the LDPC-CC (an LDPC block code using LDPC-CC) having a coding rate of R=(n−1)/n using the improved tail-biting scheme.

<Condition #B-9-(n−1)>

$a_{n-1,0,1}\%m=a_{n-1,1,1}\%m=a_{n-1,2,1}\%m= a_{n-1,3,1}\%m= \ldots =a_{n-1,g,1}\%m= \ldots =a_{n-1,2,1}\%m= a_{n-1,m-1,1}\%m=v_{n-1,1}$ (where $v_{n-1,1}$ is a fixed value)

$a_{n-1,0,2}\%m=a_{n-1,1,2}\%m=a_{n-1,2,2}\%m=a_{n-1,3,2}\%m= \ldots =a_{n-1,g,2}\%m= \ldots =a_{n-1,m-2,2}\%m=a_{n-1,m-1,2}\%m= v_{n-1,2}$ (where $v_{n-1,2}$ is a fixed value)

(where, in the above, g is an integer no smaller than zero and less than or equal to m−1)

In the above, % means a modulo, and for example, $\alpha\%m$ represents a remainder after dividing $\alpha$ by m. Conditions #B-9-1 through #B-9-(n−1) are also expressible as follows. In the following, j is one or two.

<Condition #B-9'-1>

$a_{1,g,j}\%m=v_{1,j}$ for $\forall g$, g=0, 1, 2, . . . , m−3, m−2, m−1 (where $v_{1,j}$ is a fixed value)

(The above indicates that g is an integer no smaller than zero and less than or equal to m−1, and $a_{1,g,j}\%m=v_{1,j}$ (where $v_{1,j}$ is a fixed value) holds true for all conforming g.)

<Condition #B-9'-2>

$a_{2,g,j}\%m=v_{2,j}$ for $\forall g$, g=0, 1, 2, . . . , m−3, m−2, m−1 (where $v_{2,j}$ is a fixed value)

(The above indicates that g is an integer no smaller than zero and less than or equal to m−1, and $a_{2,g,j}{}^{1}/0m=v_{2,j}$ (where $v_{2,j}$ is a fixed value) holds true for all conforming g.)

⋮

The following is a generalization of the above.

<Condition #B-9'-k>

$a_{k,g,j}\%m=v_{k,j}$ for $\forall g$, g=0, 1, 2, . . . , m−3, m−2, m−1 (where $v_{k,j}$ is a fixed value)

(The above indicates that g is an integer no smaller than zero and less than or equal to m−1, and $a_{k,g,v}\%m=v_{k,j}$ (where $v_{k,j}$ is a fixed value) holds true for all conforming g.)

(In the above, k is an integer no smaller than one and less than or equal to n−1.)

⋮

<Condition #B-9'-(n−1)>

$a_{n-1,g,j}\%m=v_{n-1,j}$ for $\forall g$, g=0, 1, 2, . . . , m−3, m−2, m−1 (where is a fixed value)

(The above indicates that g is an integer no smaller than zero and less than or equal to m−1, and $a_{n-1,g,j}\%m=v_{n-1,j}$ (where $v_{n-1,j}$ is a fixed value) holds true for all conforming g.)

Further, high error-correction capability is achievable when the following conditions are also satisfied.

<Condition #B-10-1>

$v_{1,1}\neq 0$, and $v_{1,2}\neq 0$ hold true, and also, $v_{1,1}\neq v_{1,2}$ holds true.

<Condition #B-10-2>

$v_{2,1}\neq 0$, and $v_{2,2}\neq 0$ hold true, and also, $v_{2,1}\neq v_{2,2}$ holds true.

⋮

The following is a generalization of the above.

<Condition #B-10-k>

$v_{k,1}\neq 0$, and $v_{k,2}\neq 0$ hold true, and also, $v_{k,1}\neq v_{k,2}$ holds true.

(where, in the above, k is an integer no smaller than one and less than or equal to n−1)

⋮

<Condition #B-10-(n−1)>

$v_{n-1,1}\neq 0$, and $v_{n-1,2}\neq 0$ hold true, and also, $v_{n-1,1}\neq v_{n-1,2}$ holds true.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 28 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

In addition, it may be desirable that, when drawing a tree, check nodes corresponding to the parity check polynomials of expression 93 and expression 94, which are parity check polynomials for forming the LDPC-CC (an LDPC block code using LDPC-CC) having a coding rate of R=(n−1)/n using the improved tail-biting scheme, appear in a great number as possible in the tree.

In order to ensure that check nodes corresponding to the parity check polynomials of expression 93 and expression 94 appear in a great number as possible in the above-described tree, it is desirable that $v_{k,1}$ and $v_{k,2}$ (where k is an integer no smaller than one and less than or equal to n−1) as described above satisfy the following conditions.

<Condition #B-11-1>

When expressing a set of divisors of m other than one as R, $v_{k,1}$ is not to belong to R.

<Condition #B-11-2>

When expressing a set of divisors of m other than one as R, $v_{k,2}$ is not to belong to R.

In addition to the above-described conditions, the following conditions may further be satisfied.

<Condition #B-12-1>

$v_{k,1}$ belongs to a set of integers no smaller than one and less than or equal to m−1, and $v_{k,1}$ also satisfies the following condition. When expressing a set of values w obtained by extracting all values w satisfying $v_{k,1}/w=g$ (where g is a natural number) as S, an intersection R∩S produces an empty set. The set R has been defined in Condition #B-11-1.

<Condition #B-12-2>

$v_{k,2}$ belongs to a set of integers no smaller than one and less than or equal to m−1, and $v_{k,2}$ also satisfies the following condition. When expressing a set of values w obtained by extracting all values w satisfying $v_{k,2}/w=g$ (where g is a natural number) as S, an intersection R∩S produces an empty set. The set R has been defined in Condition #B-11-2.

Condition #B-12-1 and Condition #B-12-2 are also expressible as Condition #B-12-1' and Condition #B-12-2', respectively.

<Condition #B-12-1'>

$v_{k,1}$ belongs to a set of integers no smaller than one and less than or equal to m−1, and $v_{k,1}$ also satisfies the following condition. When expressing a set of divisors of $v_{k,1}$ as S, an intersection R∩S produces an empty set.

<Condition #B-12-2'>

$v_{k,2}$ belongs to a set of integers no smaller than one and less than or equal to m−1, and $v_{k,2}$ also satisfies the following condition. When expressing a set of divisors of $v_{k,2}$ as S, an intersection R∩S produces an empty set.

Condition #B-12-1 and Condition #B-12-1' are also expressible as Condition #B-12-1", and Condition #B-12-2 and Condition #B-12-2' are also expressible as Condition #B-12-2".

<Condition #B-12-1">

$v_{k,1}$ belongs to a set of integers no smaller than one and less than or equal to m−1, and $v_{k,1}$ also satisfies the following condition. The greatest common divisor of $v_{k,1}$ and m is one.

<Condition #B-12-2">

$v_{k,2}$ belongs to a set of integers no smaller than one and less than or equal to m−1, and $v_{k,2}$ also satisfies the following condition. The greatest common divisor of $v_{k,2}$ and m is one.

In the above, expression 95 and expression 96 have been used as the parity check polynomials for forming the LDPC-CC (an LDPC block code using LDPC-CC) having a coding rate of R=(n−1)/n using the improved tail-biting scheme. In the following, explanation is provided of examples of conditions to be applied to the parity check polynomials in expression 95 and expression 96 for achieving high error correction capability.

In order to achieve high error correction capability, when i is an integer no smaller than zero and less than or equal to m−1, each of $r_1, r_2, \ldots, r_{n-2,i}, r_{n-1,i}$ is set to three or greater for all conforming i. In the following, explanation is provided of conditions for achieving high error correction capability in the above-described case.

As described above, the parity check polynomial that satisfies zero, according to expression 95, becomes an ith parity check polynomial (where i is an integer no smaller than zero and less than or equal to m−1) that satisfies zero for the LDPC-CC based on a parity check polynomial having a coding rate of R=(n−1)/n and a time-varying period of m, which serves as the basis of the LDPC-CC having a coding rate of R=(n−1)/n using the improved tail-biting scheme described in Patent Literature 2, and the parity check polynomial that satisfies zero, according to expression 96, becomes a parity check polynomial that satisfies zero for generating a vector of the first row of the parity check matrix $H_{pro}$ for the LDPC-CC (an LDPC block code using LDPC-CC) having a coding rate of R=(n−1)/n (where n is an integer no smaller than two) using the improved tail-biting scheme described in Patent Literature 2.

Here, high error-correction capability is achievable when the following conditions are taken into consideration in order to have a minimum column weight of three in the partial matrix pertaining to information $X_1$ in the parity check matrix $H_{pro\_m}$ shown in FIG. 28 for the LDPC-CC (an LDPC block code using LDPC-CC) having a coding rate of R=(n−1)/n using the improved tail-biting scheme. Note that a column weight of a column α in a parity check matrix is defined as the number of ones existing among vector elements in a vector extracted from the column α.

<Condition #B-13-1>

$a_{1,0,1}\%m=a_{1,1,1}\%m=a_{1,2,1}\%m=a_{1,3,1}\%m= \ldots =a_{1,g,1}\%m= \ldots =a_{1,m-2,1}\%m=a_{1,m-1,1}\%m=v_{1,1}$ (where $v_{1,1}$ is a fixed value)

$a_{1,0,2}\%m=a_{1,1,2}\%m=a_{1,2,2}\%m=a_{1,3,2}\%m= \ldots =a_{1,g,2}\%m= \ldots =a_{1,m-2,2}\%m=a_{1,m-1,2}\%m=v_{1,2}$ (where $v_{1,2}$ is a fixed value)

$a_{1,0,3}\%m=a_{1,1,3}\%m=a_{1,2,3}\%m=a_{1,3,3}\%m= \ldots =a_{1,g,3}\%m= \ldots =a_{1,m-2,3}\%m=a_{1,m-1,3}\%m=v_{1,3}$ (where $v_{1,3}$ is a fixed value)

(where, in the above, g is an integer no smaller than zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 28 for the LDPC-CC (an LDPC block code using LDPC-CC) having a coding rate of R=(n−1)/n using the improved tail-biting scheme.

<Condition #B-13-2>

$a_{2,0,1}\%m=a_{2,1,1}\%m=a_{2,2,1}\%m=a_{2,3,1}\%m= \ldots =a_{2,g,1}\%m= \ldots =a_{2,m-2,1}\%m=a_{2,m-1,1}\%m=v_{2,1}$ (where $v_{2,1}$ is a fixed value)

$a_{2,0,2}\%m=a_{2,1,2}\%m=a_{2,2,2}\%m=a_{2,3,2}\%m= \ldots =a_{2,g,2}\%m= \ldots =a_{2,m-2,2}\%m=a_{2,m-1,2}\%m=v_{2,2}$ (where $v_{2,2}$ is a fixed value)

$a_{2,0,3}\%m=a_{2,1,3}\%m=a_{2,2,3}\%m=a_{2,3,3}\%m= \ldots =a_{2,g,3}\%m= \ldots =a_{2,m-2,3}\%m=a_{2,m-1,3}\%m=v_{2,3}$ (where $v_{2,2}$ is a fixed value)

(where, in the above, g is an integer no smaller than zero and less than or equal to m−1)

⋮

Generalizing the above, high error-correction capability is achievable when the following conditions are taken into consideration in order to have a minimum column weight of three in a partial matrix pertaining to information $X_k$ in the parity check matrix $H_{pro\_m}$ shown in FIG. 28 for the LDPC-CC (an LDPC block code using LDPC-CC) having a coding rate of R=(n−1)/n using the improved tail-biting scheme (where k is an integer no smaller than one and less than or equal to n−1).

<Condition #B-13-k>

$a_{k,0,1}\%m=a_{k,1,1}\%m=a_{k,2,1}\%m=a_{k,3,1}\%m= \ldots = a_{k,g,1}\%= \ldots =a_{k,m-2,1}\%m=a_{k,m-1,1}\%m=v_{k,1}$ (where $v_{k,1}$ is a fixed value)

$a_{k,0,2}\%m=a_{k,1,2}\%m=a_{k,2,2}\%m=a_{k,3,2}\%m= \ldots = a_{k,g,2}\%m= \ldots =a_{k,m-2,2}\%m=a_{k,m-1,2}\%m=v_{k,2}$ (where $v_{k,2}$ is a fixed value)

$a_{k,0,3}\%m=a_{k,1,3}\%m=a_{k,2,3}\%m=a_{k,3,3}\%m= \ldots = a_{k,g,3}\%m= \ldots =a_{k,m-2,3}\%m=a_{k,m-1,3}\%m=v_{k,3}$ (where $v_{k,3}$ is a fixed value)

(where, in the above, g is an integer no smaller than zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 28 for the LDPC-CC (an LDPC block code using LDPC-CC) having a coding rate of R=(n−1)/n using the improved tail-biting scheme.

<Condition #B-13-(n−1)>

$a_{n-1,0,1}\%m=a_{n-1,1,1}\%m=a_{n-1,2,1}\%m=a_{n-1,3,1}\%m= \ldots =a_{n-1,g,1}\%m= \ldots =a_{n-1,2,1}\%m=a_{n-1,m-1,1}\%m=v_{n-1,1}$ (where $v_{n-1,1}$ is a fixed value)

$a_{n-1,0,2}\%m=a_{n-1,1,2}\%m=a_{n-1,2,2}\%m=a_{n-1,3,2}\%m= \ldots =a_{n-1,g,2}\%m= \ldots =a_{n-1,m-2,2}\%m=a_{n-1,m-1,2}\%m=v_{n-1,2}$ (where $v_{n-1,2}$ is a fixed value)

$a_{n-1,0,3}\%m=a_{n-1,1,3}\%m=a_{n-1,2,3}\%m=a_{n-1,3,3}\%m= \ldots =a_{n-1,g,3}\%m= \ldots =a_{n-1,m-2,3}\%m=a_{n-1,m-1,3}\%m=v_{n-1,3}$ (where $v_{n-1,3}$ is a fixed value)

(where, in the above, g is an integer no smaller than zero and less than or equal to m−1)

In the above, % means a modulo, and for example, α%m represents a remainder after dividing α by m. Conditions #B-13-1 through #B-13-(n−1) are also expressible as follows. In the following, j is one, two, or three.

<Condition #B-13'-1>

$a_{1,g,j}\%m=v_{1,j}$ for ∀g, g=0, 1, 2, . . . , m−3, m−2, m−1 (where $v_{1,j}$ is a fixed value)

(The above indicates that g is an integer no smaller than zero and less than or equal to m−1, and $a_{1,g,j}\%m=v_{1,j}$ (where $v_{1,j}$ is a fixed value) holds true for all conforming g.)

<Condition #B-13'-2>

$a_{2,g,j}\%m=v_{2,j}$ for ∀g, g=0, 1, 2, . . . , m−3, m−2, m−1 (where $v_{2,j}$ is a fixed value)

(The above indicates that g is an integer no smaller than zero and less than or equal to m−1, and $a_{2,g,v}\%m=v_{2,j}$ (where $v_{2,j}$ is a fixed value) holds true for all conforming g.)

⋮

The following is a generalization of the above.

<Condition #B-13'-k>

$a_{k,g,j}\%m=v_{k,j}$ for ∀g, g=0, 1, 2, . . . , m−3, m−2, m−1 (where $v_{k,j}$ is a fixed value)

(The above indicates that g is an integer no smaller than zero and less than or equal to m−1, and $a_{k,g,j}\%m=v_{k,j}$ (where $v_{k,j}$ is a fixed value) holds true for all conforming g.)

(In the above, k is an integer no smaller than one and less than or equal to n−1.)

⋮

<Condition #B-13'-(n−1)>

$a_{n-1,g,j}\%m=v_{n-1,j}$ for ∀g, g=0, 1, 2, . . . , m−3, m−2, m−1 (where $y_{n-1,j}$ is a fixed value)

(The above indicates that g is an integer no smaller than zero and less than or equal to m−1, and $a_{n-1,g,j}\%m=v_{n-1,j}$ (where $v_{n-1,j}$ is a fixed value) holds true for all conforming g.)

Further, high error-correction capability is achievable when the following conditions are also satisfied.

<Condition #B-14-1>

$v_{1,1}\neq v_{1,2}$, $v_{1,1}\neq v_{1,3}$, $v_{1,2}\neq v_{1,3}$ holds true.

<Condition #B-14-2>

$v_{2,1}\neq v_{2,2}$, $v_{2,1}\neq v_{2,3}$, $v_{2,2}\neq v_{2,3}$ holds true.

⋮

The following is a generalization of the above.

<Condition #B-14-k>

$v_{k,1}\neq v_{k,2}$, $v_{k,1}\neq v_{k,3}$, $v_{k,2}\neq v_{k,3}$ holds true.

(where, in the above, k is an integer no smaller than one and less than or equal to n−1)

⋮

<Condition #B-14-(n−1)>

$v_{n-1,1}\neq v_{n-1,2}$, $v_{n-1,1}\neq v_{n-1,3}$, $v_{n-1,2}\neq v_{n-1,3}$ holds true.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 28 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

Description is provided on specific examples of the configuration of a parity check matrix for the LDPC-CC (an LDPC block code using LDPC-CC) having a coding rate of R=(n−1)/n using the improved tail-biting scheme described in Patent Literature 2. An LDPC-CC (an LDPC block code using LDPC-CC) having a coding rate of R=(n−1)/n using the improved tail-biting scheme, when generated as described above, may achieve high error correction capability. Due to this, an advantageous effect is realized such that a receiving device having a decoder, which may be included in a broadcasting system, a communication system, etc., is capable of achieving high data reception quality. Note that the configuration methods of codes described in the present embodiment are mere examples, and an LDPC-CC (an LDPC block code using LDPC-CC) having a coding rate of R=(n−1)/n using the improved tail-biting scheme generated according to a method different from those explained above may also achieve high error correction capability.

In the above, description is provided of an example of the LDPC-CC (an LDPC block code using LDPC-CC) having a coding rate of R=(n−1)/n using the improved tail-biting scheme described in Patent Literature 2. In the example described above, explanation is provided of using a parity check polynomial that satisfies zero for the LDPC-CC based on a parity check polynomial having a coding rate of R=(n−1)/n and a time-varying period of m, which serves as the basis of the LDPC-CC having a coding rate of R=(n−1)/n using the improved tail-biting scheme described in Patent Literature 2, and further, of applying a specific parity check polynomial satisfying zero to the first row of a parity check matrix. Note that Patent Literature 2 also describes applying a specific parity check polynomial satisfying zero to a jth row of a parity check matrix (where j is a natural number).

While describing an LDPC-CC (an LDPC block code using LDPC-CC) having a coding rate of (n−1)/n (n being an integer no smaller than two) using an improved tail-biting scheme, Patent Literature 2 does not disclose an LDPC-CC (an LDPC block code using LDPC-CC) that uses an improved tail-biting scheme and does not satisfy coding rate (n−1)/n (n being an integer no smaller than two).

The present invention is related to an LDPC-CC (an LDPC block code using LDPC-CC) that uses an improved tail-biting scheme and does not satisfy coding rate (n−1)/n (n being an integer no smaller than two).

Embodiment 1

The present embodiment describes a method of configuring an LDPC-CC of coding rate 2/4 that is based on a parity check polynomial, as one example of an LDPC-CC not satisfying coding rate (n−1)/n.

Although coding rate 2/4 equals coding rate 1/2, the LDPC-CC of coding rate 2/4 that is based on a parity check polynomial pertaining to the present embodiment differs, in terms of generation method, from a conventional LDPC-CC of coding rate (n−1)/n or a conventional LDPC-CC of coding rate (n−1)/n that uses an improved tail-biting scheme (an LDPC block code using an LDPC-CC).

Bits of information bits $X_1$, $X_2$ and parity bits $P_1$, $P_2$, at time point j, are expressed $X_{1,j}$, $X_{2,j}$ and $P_{1,j}$, $P_{2,j}$ respectively.

A vector $u_p$ at time point j, is expressed $u_j=(X_{1,j}, X_{2,j}, P_{1,j}, P_{2,j})$.

Given a delay operator D, polynomial expressions of the information bits $X_1$, $X_2$ are $X_1(D)$, $X_2(D)$, and polynomial expressions of the parity bits $P_1$, $P_2$ are $P_1(D)$, $P_2(D)$.

Further, consideration is given to an LDPC-CC of coding rate 2/4 and time-varying period 2m that is based on a parity check polynomial.

The following mathematical expressions are provided as parity check polynomials satisfying zero for an LDPC-CC of coding rate 2/4 and time-varying period 2m that is based on a parity check polynomial.

First, because two parities $P_1$ and $P_2$ exist, parity check polynomials satisfying zero are provided as described in the following, two for $1\times P_1(D)$ and two for $1\times P_2(D)$.

[Math. 97]

$$\begin{aligned}(D^{\alpha\#(2i),1,2}+D^{\alpha\#(2i),1,1}+1)X_1(D)+\left(\sum_{s=3}^{r_{\#(2i),2}} D^{\alpha\#(2i),2,s}\right)X_2(D)+\\ P_1(D)+D^{\beta\#(2i),0}P_2(D)=(D^{\alpha\#(2i),1,2}+D^{\alpha\#(2i),1,1}+1)X_1(D)+\\ (D^{\alpha\#(2i),2,r_{\#(2i),2}}+\dots+D^{\alpha\#(2i),2,3})X_2(D)+\\ P_1(D)+D^{\beta\#(2i),0}P_2(D)=0\end{aligned} \tag{97-1-1}$$

$$\begin{aligned}(D^{\alpha\#(2i),1,2}+D^{\alpha\#(2i),1,1}+1)X_1(D)+\left(\sum_{s=3}^{r_{\#(2i),2}} D^{\alpha\#(2i),2,s}\right)X_2(D)+\\ P_1(D)+D^{\beta\#(2i),1}P_1(D)=(D^{\alpha\#(2i),1,2}+D^{\alpha\#(2i),1,1}+1)X_1(D)+\\ (D^{\alpha\#(2i),2,r_{\#(2i),2}}+\dots+D^{\alpha\#(2i),2,3})X_2(D)+\\ P_1(D)+D^{\beta\#(2i),1}P_1(D)=0\end{aligned} \tag{97-1-2}$$

-continued $$\begin{aligned}\left(\sum_{s=3}^{r_{\#(2i),1}} D^{\alpha\#(2i),1,s}\right)X_1(D)+\\ (D^{\alpha\#(2i),2,2}+D^{\alpha\#(2i),2,1}+1)X_2(D)+P_2(D)+D^{\beta\#(2i),2}P_1(D)=\\ (D^{\alpha\#(2i),1,r_{\#(2i),1}}+\dots+D^{\alpha\#(2i),1,3})X_1(D)+\\ (D^{\alpha\#(2i),2,2}+D^{\alpha\#(2i),2,1}+1)X_2(D)+\\ P_2(D)+D^{\beta\#(2i),2}P_1(D)=0\end{aligned} \tag{97-2-1}$$

$$\begin{aligned}\left(\sum_{s=3}^{r_{\#(2i),1}} D^{\alpha\#(2i),1,s}\right)X_1(D)+\\ (D^{\alpha\#(2i),2,2}+D^{\alpha\#(2i),2,1}+1)X_2(D)+P_2(D)+D^{\beta\#(2i),3}P_2(D)=\\ (D^{\alpha\#(2i),1,r_{\#(2i),1}}+\dots+D^{\alpha\#(2i),1,3})X_1(D)+\\ (D^{\alpha\#(2i),2,2}+D^{\alpha\#(2i),2,1}+1)X_2(D)+\\ P_2(D)+D^{\beta\#(2i),3}P_2(D)=0\end{aligned} \tag{97-2-2}$$

In expression (97-1-1), (97-1-2), (97-2-1), (97-2-2), i is an integer no smaller than zero and no greater than m−1 (i=0, 1, . . . , m—2, m−1).

In expression (97-1-1), (97-1-2), (97-2-1), (97-2-2), $\alpha_{\#(2i),p,q}$ (where p is an integer no smaller than one and no greater than two, q is an integer no smaller than one and no greater than $r_{\#(2i),p}$ (where $r_{\#(2i),p}$ is a natural number)) and $\beta_{\#(2i),0}$ is a natural number, $\beta_{\#(2i),1}$ is a natural number, $\beta_{\#(2i),2}$ is an integer no smaller than zero, and $\beta_{\#(2i),3}$ is a natural number.

Further, y is an integer no smaller than one and no greater than $r_{\#(2i),p,z}$ is an integer no smaller than one and no greater than $r_{\#2i,p}$, and $\alpha_{\#(2i),p,y}\neq\alpha_{\#(2i),p,z}$ holds true for $\forall$(y, z) where y≠z. $\forall$ is a universal quantifier. (y is an integer no smaller than one and no greater than $r_{\#(2i),p,z}$ is an integer no smaller than one and no greater than $r_{\#2i,p}$, and $\alpha_{\#(2i),p,y}\neq\alpha_{\#(2i),p,z}$ holds true for all y and all z satisfying y≠z.)

Note that in the following, to simplify explanation, a parity check polynomial satisfying zero that is expressed by expression (97-1-1) or expression (97-1-2) is referred to as "#(2i); first expression" for realizing a time-varying period 2m, and a parity check polynomial satisfying zero that is expressed by expression (97-2-1) or expression (97-2-2) is referred to as "#(2i); second expression" for realizing a time-varying period 2m.

Thus, for each i, as #(2i); first expression for realizing a time-varying period 2m, a parity check polynomial satisfying zero expressed by either expression (97-1-1) or expression (97-1-2) is prepared.

That is, for i=0, a parity check polynomial satisfying zero provided by expression (97-1-1) where i=0, or a parity check polynomial satisfying zero provided by expression (97-1-2) where i=0 is prepared.

Similarly:

for i=1, a parity check polynomial satisfying zero provided by expression (97-1-1) where i=1, or a parity check polynomial satisfying zero provided by expression (97-1-2) where i=1 is prepared;

for i=2, a parity check polynomial satisfying zero provided by expression (97-1-1) where i=2, or a parity check polynomial satisfying zero provided by expression (97-1-2) where i=2 is prepared;

⋮ for i=z, a parity check polynomial satisfying zero provided by expression (97-1-1) where i=z, or a parity check polynomial satisfying zero provided by expression (97-1-2)

where i=z is prepared (where z is an integer no smaller than zero and no greater than m−1); and

⋮ for i=m−1, a parity check polynomial satisfying zero provided by expression (97-1-1) where i=m−1, or a parity check polynomial satisfying zero provided by expression (97-1-2) where i=m−1 is prepared.

Similarly, for each i, as #(2i); second expression for realizing a time-varying period 2m, a parity check polynomial satisfying zero expressed by either expression (97-2-1) or expression (97-2-2) is prepared.

That is, for i=0, a parity check polynomial satisfying zero provided by expression (97-2-1) where i=0, or a parity check polynomial satisfying zero provided by expression (97-2-2) where i=0 is prepared.

Similarly:

for i=1, a parity check polynomial satisfying zero provided by expression (97-2-1) where i=1, or a parity check polynomial satisfying zero provided by expression (97-2-2) where i=1 is prepared;

for i=2, a parity check polynomial satisfying zero provided by expression (97-2-1) where i=2, or a parity check polynomial satisfying zero provided by expression (97-2-2) where i=2 is prepared;

⋮ for i=z, a parity check polynomial satisfying zero provided by expression (97-2-1) where i=z, or a parity check polynomial satisfying zero provided by expression (97-2-2) where i=z is prepared (where z is an integer no smaller than zero and no greater than m−1); and

⋮ for i=m−1, a parity check polynomial satisfying zero provided by expression (97-2-1) where i=m−1, or a parity check polynomial satisfying zero provided by expression (97-2-2) where i=m−1 is prepared.

Similarly, because two parities $P_1$ and $P_2$ exist, parity check polynomials satisfying zero are provided as described in the following, two for $1\times P_1(D)$ and two for $1\times P_2(D)$.

[Math. 98]

$$\begin{aligned}\left(\sum_{s=3}^{r_{\#(2i+1),1}} D^{\alpha\#(2i+1),1,s}\right)X_1(D) &+ (D^{\alpha\#(2i+1),2,2}+D^{\alpha\#(2i+1),2,1}+1)X_2(D) + P_1(D)+D^{\beta\#(2i+1),0}P_2(D) = \\ &(D^{\alpha\#(2i+1),1,r_{\#(2i+1),1}}+\dots+D^{\alpha\#(2i+1),1,3})X_1(D) + (D^{\alpha\#(2i+1),2,2}+D^{\alpha\#(2i+1),2,1}+1)X_2(D) + P_1(D)+D^{\beta\#(2i+1),0}P_2(D)=0\end{aligned} \tag{98-1-1}$$

$$\begin{aligned}\left(\sum_{s=3}^{r_{\#(2i+1),1}} D^{\alpha\#(2i+1),1,s}\right)X_1(D) &+ (D^{\alpha\#(2i+1),2,2}+D^{\alpha\#(2i+1),2,1}+1)X_2(D) + P_1(D)+D^{\beta\#(2i+1),1}P_1(D) = \\ &(D^{\alpha\#(2i+1),1,r_{\#(2i+1),1}}+\dots+D^{\alpha\#(2i+1),1,3})X_1(D) + (D^{\alpha\#(2i+1),2,2}+D^{\alpha\#(2i+1),2,1}+1)X_2(D) + P_1(D)+D^{\beta\#(2i+1),1}P_1(D)=0\end{aligned} \tag{98-1-2}$$

$$\begin{aligned}(D^{\alpha\#(2i+1),1,2}+D^{\alpha\#(2i+1),1,1}+1)X_1(D) &+ \left(\sum_{s=3}^{r_{\#(2i+1),2}} D^{\alpha\#(2i+1),2,s}\right)X_2(D) + P_2(D)+D^{\beta\#(2i+1),2}P_1(D) = \\ &(D^{\alpha\#(2i+1),1,2}+D^{\alpha\#(2i+1),1,1}+1)X_1(D) + (D^{\alpha\#(2i+1),2,r_{\#(2i+1),2}}+\dots+D^{\alpha\#(2i+1),2,3})X_2(D) + P_2(D)+D^{\beta\#(2i+1),2}P_1(D)=0\end{aligned} \tag{98-2-1}$$

-continued $$\begin{aligned}(D^{\alpha\#(2i+1),1,2}+D^{\alpha\#(2i+1),1,1}+1)X_1(D) &+ \left(\sum_{s=3}^{r_{\#(2i+1),2}} D^{\alpha\#(2i+1),2,s}\right)X_2(D) + P_2(D)+D^{\beta\#(2i+1),3}P_2(D) = \\ &(D^{\alpha\#(2i+1),1,2}+D^{\alpha\#(2i+1),1,1}+1)X_1(D) + (D^{\alpha\#(2i+1),2,r_{\#(2i+1),2}}+\dots+D^{\alpha\#(2i+1),2,3})X_2(D) + P_2(D)+D^{\beta\#(2i+1),3}P_2(D)=0\end{aligned} \tag{98-2-2}$$

In expression (98-1-1), (98-1-2), (98-2-1), (98-2-2), i is an integer no smaller than zero and no greater than m−1 (i=0, 1, . . . , m−2, m−1).

In expression (98-1-1), (98-1-2), (98-2-1), (98-2-2), $\alpha_{\#(2i+1),p,q}$ (where p is an integer no smaller than one and no greater than two, q is an integer no smaller than one and no greater than $r_{\#(2i+1),p}$ (where $r_{\#(2i+1),p}$ is a natural number)) and $\beta_{\#(2i+0),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, y is an integer no smaller than one and no greater than $r_{\#(2i+1),p,z}$ is an integer no smaller than one and no greater than $r_{\#(2i+1),p}$, and $\alpha_{\#(2i+1),1}\neq\alpha_{\#(2i+1),p,z}$ holds true for $\forall$(y, z) where y≠z. ∀ is a universal quantifier. (y is an integer no smaller than one and no greater than $r_{\#(2i+1),p,z}$ is an integer no smaller than one and no greater than $r_{\#(2i+1),p}$, and $\alpha_{\#(2i+1),p,y}\neq\alpha_{\#(2i+1),p,z}$ holds true for all y and all z satisfying y≠z.)

Note that in the following, to simplify explanation, a parity check polynomial satisfying zero that is expressed by expression (98-1-1) or expression (98-1-2) is referred to as "#(2i+1); first expression" for realizing a time-varying period 2m, and a parity check polynomial satisfying zero that is expressed by expression (98-2-1) or expression (98-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (98-1-1) or expression (98-1-2) is prepared.

That is, for i=0, a parity check polynomial satisfying zero provided by expression (98-1-1) where i=0, or a parity check polynomial satisfying zero provided by expression (98-1-2) where i=0 is prepared.

Similarly:

for i=1, a parity check polynomial satisfying zero provided by expression (98-1-1) where i=1, or a parity check polynomial satisfying zero provided by expression (98-1-2) where i=1 is prepared;

for i=2, a parity check polynomial satisfying zero provided by expression (98-1-1) where i=2, or a parity check polynomial satisfying zero provided by expression (98-1-2) where i=2 is prepared;

⋮ for i–z, a parity check polynomial satisfying zero provided by expression (98-1-1) where i=z, or a parity check polynomial satisfying zero provided by expression (98-1-2) where i=z is prepared (where z is an integer no smaller than zero and no greater than m−1); and

⋮ for i=m−1, a parity check polynomial satisfying zero provided by expression (98-1-1) where i=m−1, or a parity check polynomial satisfying zero provided by expression (98-1-2) where i=m−1 is prepared.

Similarly, for each i, as #(2i+1); second expression for realizing a time-varying period 2m, a parity check polynomial satisfying zero expressed by either expression (98-2-1) or expression (98-2-2) is prepared.

That is, for i=0, a parity check polynomial satisfying zero provided by expression (98-2-1) where i=0, or a parity check polynomial satisfying zero provided by expression (98-2-2) where i=0 is prepared.

Similarly:

for i=1, a parity check polynomial satisfying zero provided by expression (98-2-1) where i=1, or a parity check polynomial satisfying zero provided by expression (98-2-2) where i=1 is prepared;

for i=2, a parity check polynomial satisfying zero provided by expression (98-2-1) where i=2, or a parity check polynomial satisfying zero provided by expression (98-2-2) where i=2 is prepared;

⋮ for i=z, a parity check polynomial satisfying zero provided by expression (98-2-1) where i=z, or a parity check polynomial satisfying zero provided by expression (98-2-2) where i=z is prepared (where z is an integer no smaller than zero and no greater than m−1); and

⋮ for i=m−1, a parity check polynomial satisfying zero provided by expression (98-2-1) where i=m−1, or a parity check polynomial satisfying zero provided by expression (98-2-2) where i=m−1 is prepared.

As such, an LDPC-CC of coding rate 2/4 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (97-1-1) or expression (97-1-2), parity check polynomials satisfying zero provided by expression (97-2-1) or expression (97-2-2), parity check polynomials satisfying zero provided by expression (98-1-1) or expression (98-1-2), and parity check polynomials satisfying zero provided by expression (98-2-1) or expression (98-2-2).

For example, the time varying period 2×m can be formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expression (97-1-1), (97-1-2), (97-2-1), (97-2-2), (98-1-1), (98-1-2), (98-2-1), and (98-2-2) (where j is an integer no smaller than zero).

The following presumes that 2k=j%2m holds true. In the following, % means a modulo, and for example, α%6 represents a remainder after dividing α by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

The following describes a method of configuring a parity check matrix for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a vector $u_j$ at time point j is expressed as $u_j=(X_{1,j}, X_{2,j}, P_{1,j}, P_{2,j})$ (where j is an integer no smaller than zero). In the following, a case where u is a transmission vector is considered. Note that in the following, j is an integer no smaller than one, and thus j differs between the description having been provided above and the description provided in the following. (j is set as such to facilitate understanding of the correspondence between the column numbers and the row numbers of the parity check matrix.)

Accordingly, $u=(u_1, u_2, u_3, \ldots, u_{y-1}, u_y, u_{y+1}, \ldots)^T=(X_{1,1}, X_{2,1}, P_{1,1}, P_{2,1}, X_{1,2}, X_{2,2}, P_{1,2}, P_{2,2}, X_{1,3} X_{2,3} P_{1,3}, P_{2,3}, \ldots, X_{1,y-1}, X_{2,y-1}, P_{1,y-1}, P_{2,y-1}, X_{1,y}, X_{2,y}, P_{1,y}, P_{2,y}, X_{1,y+1}, X_{2,y+1}, P_{1,y+1}, P_{2,y+1}, \ldots)^T$. Further, when using H to denote a parity check matrix for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, Hu=0 holds true (here, Hu=0 indicates that all elements of the vector Hu are zeroes).

FIG. 37 indicates a configuration of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the topmost row of the parity check matrix is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

As illustrated in FIG. 37:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression"; and "a vector for the (2×i)th row of the parity check matrix H can be generated from a parity check polynomial satisfying zero of #((i−1)%2m); second expression", and so on (where i is an integer no smaller than one).

Figure 38:
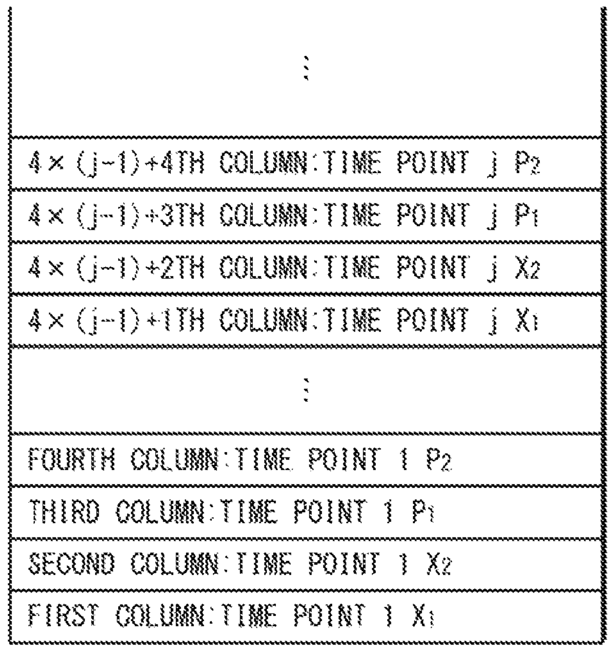
FIG. 38 shows an example of the configuration of check matrix for LDPC-CC of coding rate 2/4 and time-varying period 2×m that is based on a parity check polynomial.

FIG. 38 indicates a configuration of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the leftmost column of the parity check matrix is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

As illustrated in FIG. 38:

"a vector for the first column of the parity check matrix H is related to $X_1$ at time point 1";

"a vector for the second column of the parity check matrix H is related to $X_2$ at time point 1";

"a vector for the third column of the parity check matrix H is related to $P_1$ at time point 1";

"a vector for the fourth column of the parity check matrix H is related to $P_2$ at time point 1";

⋮

"a vector for the 4×(j−1)+1th column of the parity check matrix H is related to $X_1$ at time point j";

"a vector for the 4×(j−1)+2th column of the parity check matrix H is related to $X_2$ at time point j";

"a vector for the 4×(j−1)+3th column of the parity check matrix H is related to $P_1$ at time point j"; and "a vector for the 4×(j−1)+4th column of the parity check matrix H is related to $P_2$ at time point j", and so on (where j is an integer no smaller than one).

Figure 39:
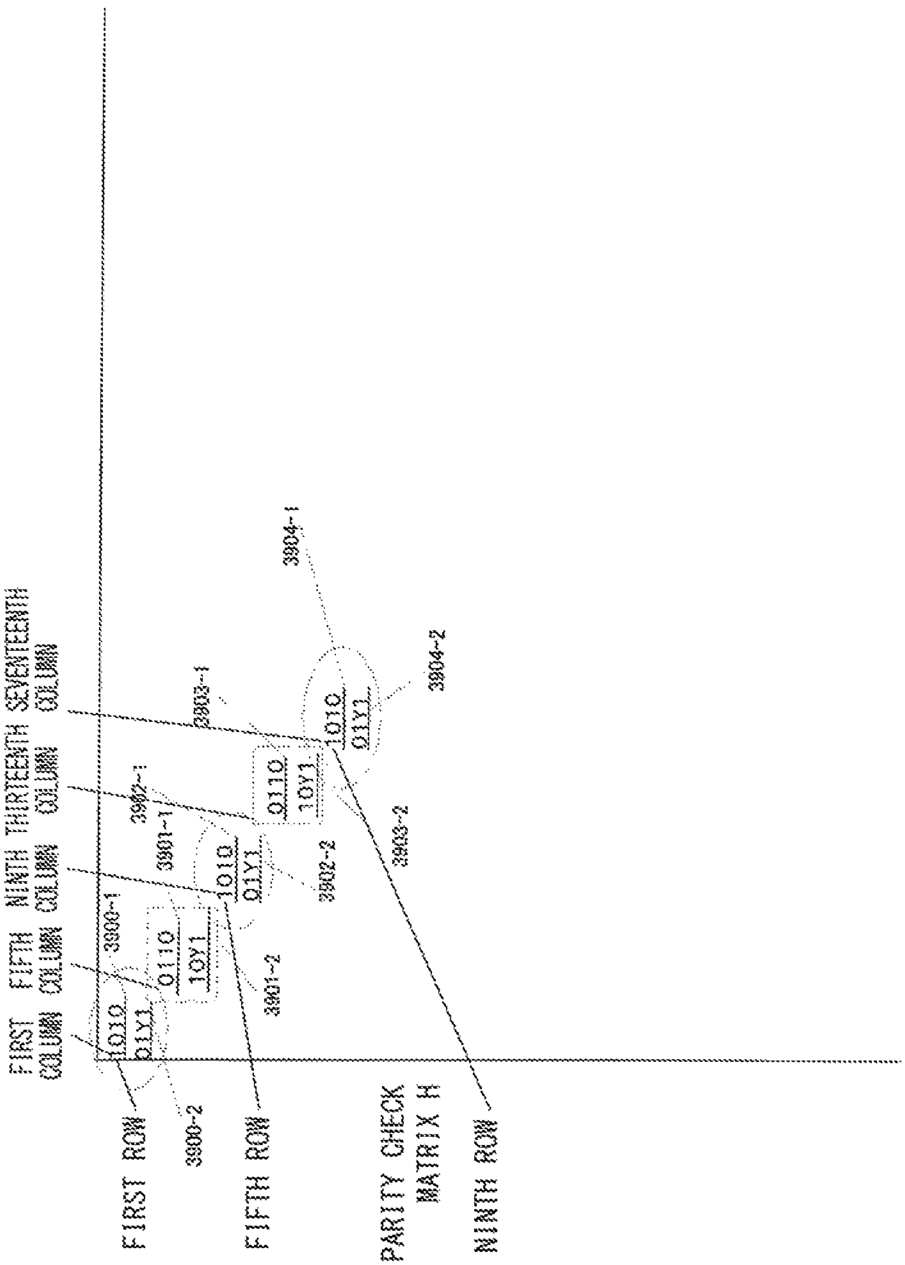
FIG. 39 shows an example of the configuration of check matrix for LDPC-CC of coding rate 2/4 and time-varying period 2×m that is based on a parity check polynomial.

FIG. 39 indicates a parity check matrix for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The following focuses on $1\times X_1(D)$, $1\times X_2(D)$, $1\times P_1(D)$, $1\times P_2(D)$ in the parity check matrix for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The parity check polynomials at time point j=1 are parity check polynomials when i=0 in expression (97-1-1), (97-1-2), (97-2-1), (97-2-2).

A vector for the first row in FIG. 39 can be generated from a parity check polynomial when i=0 in expression (97-1-1) or expression (97-1-2) (refer to FIG. 37).

In expression (97-1-1) and (97-1-2):

a term for $1\times X_1(D)$ exists;

a term for $1\times X_2(D)$ does not exist; and a term for $1\times P_1(D)$ exists but a term for $1\times P_2(D)$ does not exist.

Further, the relationship between column numbers and $X_1$, $X_2$, $P_1$, $P_2$ is as indicated in FIG. 38. Based on the relationship indicated in FIG. 38 and the fact that a term for $1\times X_1(D)$ exists, a column related to $X_1$ in the vector for the first row in FIG. 39 is "1". Further, based on the relationship indicated in FIG. 38 and the fact that a term for $1\times X_2(D)$ does not exist, a column related to $X_2$ in the vector for the first row in FIG. 39 is "0". In addition, based on the relationship indicated in FIG. 38 and the fact that a term for $1\times P_1(D)$ exists but a term for $1\times P_2(D)$ does not exist, a column related to $P_1$ in the vector for the first row in FIG. 39 is "1", and a column related to $P_2$ in the vector for the first row in FIG. 39 is "0".

As such, the vector for the first row in FIG. 39 is "1010", as indicated by 3900-1 in FIG. 39.

A vector for the second row in FIG. 39 can be generated from a parity check polynomial when i=0 in expression (97-2-1) or expression (97-2-2) (refer to FIG. 37).

In expression (97-2-1) and (97-2-2):

a term for $1 \times X_1(D)$ does not exist;

a term for $1 \times X_2(D)$ exists; and a term for $1 \times P_1(D)$ may or may not exist but a term for $1 \times P_2(D)$ exists.

Further, the relationship between column numbers and $X_1$, $X_2$, $P_1$, $P_2$ is as indicated in FIG. 38. Based on the relationship indicated in FIG. 38 and the fact that a term for $1 \times X_1(D)$ does not exist, a column related to $X_1$ in the vector for the second row in FIG. 39 is "0". Further, based on the relationship indicated in FIG. 38 and the fact that a term for $1 \times X_2(D)$ exists, a column related to $X_2$ in the vector for the second row in FIG. 39 is "1". In addition, based on the relationship indicated in FIG. 38 and the fact that a term for $1 \times P_1(D)$ may or may not exist but a term for $1 \times P_2(D)$ exists, a column related to $P_1$ in the vector for the second row in FIG. 39 is "Y", and a column related to $P_2$ in the vector for the second row in FIG. 39 is "1", where Y is either "0" or "1".

As such, the vector for the second row in FIG. 39 is "01Y1", as indicated by 3900-2 in FIG. 39.

The parity check polynomials at time point j=2 are parity check polynomials when i=0 in expression (98-1-1), (98-1-2), (98-2-1), (98-2-2).

A vector for the third row in FIG. 39 can be generated from a parity check polynomial when i=0 in expression (98-1-1) or expression (98-1-2) (refer to FIG. 37).

In expression (98-1-1) and (98-1-2):

a term for $1 \times X_1(D)$ does not exist;

a term for $1 \times X_2(D)$ exists; and a term for $1 \times P_1(D)$ exists but a term for $1 \times P_2(D)$ does not exist.

Further, the relationship between column numbers and $X_1$, $X_2$, $P_1$, $P_2$ is as indicated in FIG. 38. Based on the relationship indicated in FIG. 38 and the fact that a term for $1 \times X_1(D)$ does not exist, a column related to $X_1$ in the vector for the third row in FIG. 39 is "0". Further, based on the relationship indicated in FIG. 38 and the fact that a term for $1 \times X_2(D)$ exists, a column related to $X_2$ in the vector for the third row in FIG. 39 is "1". In addition, based on the relationship indicated in FIG. 38 and the fact that a term for $1 \times P_1(D)$ exists but a term for $1 \times P_2(D)$ does not exist, a column related to $P_1$ in the vector for the third row in FIG. 39 is "1", and a column related to $P_2$ in the vector for the third row in FIG. 39 is "0".

As such, the vector for the third row in FIG. 39 is "0110", as indicated by 3901-1 in FIG. 39.

A vector for the fourth row in FIG. 39 can be generated from a parity check polynomial when i=0 in expression (98-2-1) or expression (98-2-2) (refer to FIG. 37).

In expression (98-2-1) and (98-2-2):

a term for $1 \times X_1(D)$ exists;

a term for $1 \times X_2(D)$ does not exist; and a term for $1 \times P_1(D)$ may or may not exist but a term for $1 \times P_2(D)$ exists.

Further, the relationship between column numbers and $X_1$, $X_2$, $P_1$, $P_2$ is as indicated in FIG. 38. Based on the relationship indicated in FIG. 38 and the fact that a term for $1 \times X_1(D)$ exists, a column related to $X_1$ in the vector for the fourth row in FIG. 39 is "1". Further, based on the relationship indicated in FIG. 38 and the fact that a term for $1 \times X_2(D)$ does not exist, a column related to $X_2$ in the vector for the fourth row in FIG. 39 is "0". In addition, based on the relationship indicated in FIG. 38 and the fact that a term for $1 \times P_1(D)$ may or may not exist but a term for $1 \times P_2(D)$ exists, a column related to $P_1$ in the vector for the fourth row in FIG. 39 is "Y", and a column related to $P_2$ in the vector for the fourth row in FIG. 39 is "1".

As such, the vector for the fourth row in FIG. 39 is "10Y1", as indicated by 3901-2 in FIG. 39.

Because it can be considered that the above similarly applies to cases where time point j=3, 4, 5, the parity check matrix H has the configuration indicated in FIG. 39.

That is, due to the parity check polynomials of expression (97-1-1), (97-1-2), (97-2-1), (97-2-2) being used at time point j=2k+1 (where k is an integer no smaller than zero), "1010" exists in the 2×(2k+1)−1th row of the parity check matrix H, and "01Y1" exists in the 2×(2k+1)th row of the parity check matrix H, as illustrated in FIG. 39.

Further, due to the parity check polynomials of expression (98-1-1), (98-1-2), (98-2-1), (98-2-2) being used at time point j=2k+2 (where k is an integer no smaller than zero), "0110" exists in the 2×(2k+2)−1th row of the parity check matrix H, and "10Y1" exists in the 2×(2k+2)th row of the parity check matrix H, as illustrated in FIG. 39.

Accordingly, as illustrated in FIG. 39, when denoting a column number of a leftmost column corresponding to "1" in "1010" in a row where "1010" exists (e.g., 3900-1 in FIG. 39) as "a", "0110" (e.g., 3901-1 in FIG. 39) exists in a row that is two rows below the row where "1010" exists, starting from column "a+4".

Similarly, as illustrated in FIG. 39, when denoting a column number of a leftmost column corresponding to "1" in "01Y1" in a row where "01Y1" exists (e.g., 3900-2 in FIG. 39) as "b", "10Y1" (e.g., 3901-2 in FIG. 39) exists in a row that is two rows below the row where "01Y1" exists, starting from column "b+4".

Similarly, as illustrated in FIG. 39, when denoting a column number of a leftmost column corresponding to "1" in "0110" in a row where "0110" exists (e.g., 3901-1 in FIG. 39) as "c", "1010" (e.g., 3902-1 in FIG. 39) exists in a row that is two rows below the row where "0110" exists, starting from column "c+4".

Similarly, as illustrated in FIG. 39, when denoting a column number of a leftmost column corresponding to "1" in "10Y1" in a row where "10Y1" exists (e.g., 3901-2 in FIG. 39) as "d", "01Y1" (e.g., 3902-2 in FIG. 39) exists in a row that is two rows below the row where "10Y1" exists, starting from column "d+4".

The following describes a parity check matrix for an LDPC-CC of coding rate 2/4 and time-varying period 2×m that is based on a parity check polynomial when tail-biting is not performed, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

In the following, $H_{com}[u][v]$ (where u and v are integers no smaller than one) denotes an element at row "u" column "v" of a parity check matrix for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Based on description above provided with reference to FIG. 37:

"a vector for the 2×g−1th row of the parity check matrix H can be generated from a parity check polynomial satisfying zero of #((g−1)%2m); first expression"; and "a vector for the (2×g)th row of the parity check matrix H can be generated from a parity check polynomial satisfying zero of #((g−1)%2m); second expression" (where g is an integer no smaller than one).

Based on description above provided with reference to FIG. 38:

"a vector for the 4×(j−1)+1th column of the parity check matrix H is related to $X_1$ at time point j";

"a vector for the 4×(j−1)+2th column of the parity check matrix H is related to $X_2$ at time point j";

"a vector for the 4×(j−1)+3th column of the parity check matrix H is related to $P_1$ at time point j"; and "a vector for the 4×(j−1)+4th column of the parity check matrix H is related to $P_2$ at time point j" (where j is an integer no smaller than one).

Based on the above, the following describes component $H_{com}[2\times g-1][v]$ in row 2×g−1 (where g is an integer no smaller than one) and component $H_{com}[2\times g][v]$ in row 2×g of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a parity check polynomial satisfying zero of #((g−1)%2m); first expression can be used to generate a vector for row 2×g−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #((g−1)%2m); second expression can be used to generate a vector for row 2×g of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, when g=2×f−1 (where f is an integer no smaller than one), a parity check polynomial satisfying zero of #(((2×f−1)−1)%2m); first expression, or that is, a parity check polynomial satisfying zero of either expression (97-1-1) or expression (97-1-2), can be used to generate a vector for row 2×(2×f−1)−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f−1)−1)%2m); second expression, or that is, a parity check polynomial satisfying zero of either expression (97-2-1) or expression (97-2-2), can be used to generate a vector for row 2×(2×f−1) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, when g=2×f (where f is an integer no smaller than one), a parity check polynomial satisfying zero of #(((2×f)−1)%2m); first expression, or that is, a parity check polynomial satisfying zero of either expression (98-1-1) or expression (98-1-2), can be used to generate a vector for row 2×(2×f)−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f)−1)%2m); second expression, or that is, a parity check polynomial satisfying zero of either expression (98-2-1) or expression (98-2-2), can be used to generate a vector for row 2×(2×f) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, (1) when g=2×f−1 (where f is an integer no smaller than one), when a vector for row 2×(2×f−1)−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-1-1), $(2\times f-1)-1)\%2m=2c$ holds true. Accordingly, a parity check polynomial satisfying zero of expression (97-1-1) where $2i=2c$ holds true (where c is an integer no smaller than zero and no greater than $m-1$).

Accordingly, component $H_{com}[2\times g-1][v]=H_{com}[2\times(2\times f-1)-1][v]$ in row $2\times g-1$, or that is, row $2\times(2\times f-1)-1$ of the parity check matrix H, which is for an LDPC-CC of coding rate 2/4 and time-varying period $2\times m$ that is based on a parity check polynomial, the parity check matrix H definable by using a total of $4\times m$ parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, w=1.

[Math. 99]

$$H_{com}[2\times(2\times f-1)-1][4\times((2\times f-1)-0-1)+w]=1 \tag{99-1}$$

When $(2\times f-1)-a_{\#(2c),w,1}-1\geq 0$:

$$H_{com}[2\times(2\times f-1)-1][4\times((2\times f-1)-\alpha_{\#(2c),w,1}-1)+w]=1 \tag{99-2}$$

When $(2\times f-1)-\alpha_{\#(2c),w,2}-1\geq 0$:

$$H_{com}[2\times(2\times f-1)-1][4\times((2\times f-1)-\alpha_{\#(2c),w,2}-1)+w]=1 \tag{99-3}$$

For all u being an integer no smaller than one satisfying $\{u\neq(2\times f-1)-0,\ u\neq(2\times f-1)-\alpha_{\#(2c),w,1},$ and $u\neq(2\times f-1)-\alpha_{\#(2c),w,2}\}$:

$$H_{com}[2\times(2\times f-1)-1][4\times(u-1)+w]=0 \tag{99-4}$$

The following holds true for $X_2$. In the following, z=2, and y is an integer no smaller than three and no greater than $r_{\#(2c),z}$.

[Math. 100]

When $(2\times f-1)-\alpha_{\#(2c),z,y}-1\geq 0$:

$$H_{com}[2\times(2\times f-1)-1][4\times((2\times f-1)-\alpha_{\#(2c),z,y}-1)+z]=1 \tag{100-1}$$

For all u being an integer no smaller than one satisfying $\{u\neq(2\times f-1)-\alpha_{\#(2c),z,y}\}$ (where y is an integer no smaller than three and no smaller than $r_{\#(2c),z}$):

$$H_{com}[2\times(2\times f-1)-1][4\times(u-1)+z]=0 \tag{100-2}$$

The following holds true for $P_1$.

[Math. 101]

$$H_{com}[2\times(2\times f-1)-1][4\times((2\times f-1)-0-1)+3]=1 \tag{101-1}$$

For all u being an integer no smaller than one satisfying $\{u\neq(2\times f-1)-0\}$:

$$H_{com}[2\times(2\times f-1)-1][4\times(u-1)+3]=0 \tag{101-2}$$

The following holds true for $P_2$.

[Math. 102]

When $(2\times f-1)-\beta_{\#(2c),0}-1\geq 0$:

$$H_{com}[2\times(2\times f-1)-1][4\times((2\times f-1)-\beta_{\#(2c),0}-1)+4]=1 \tag{102-1}$$

For all u being an integer no smaller than one satisfying $\{u\neq(2\times f-1)-\beta_{\#(2c),0}\}$:

$$H_{com}[2\times(2\times f-1)-1][4\times(u-1)+4]=0 \tag{102-2}$$

Further, (2) when $g=2\times f-1$ (where f is an integer no smaller than one), when a vector for row $2\times(2\times f-1)-1$ of the parity check matrix H, which is for an LDPC-CC of coding rate 2/4 and time-varying period $2\times m$ that is based on a parity check polynomial, the parity check matrix H definable by using a total of $4\times m$ parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-1-2), $((2\times f-1)-1)\%2m=2c$ holds true. Accordingly, a parity check polynomial satisfying zero of expression (97-1-2) where $2i=2c$ holds true (where c is an integer no smaller than zero and no greater than $m-1$).

Accordingly, component $H_{com}[2\times g-1][v]=H_{com}[2\times(2\times f-1)-1][v]$ in row $2\times g-1$, or that is, row $2\times(2\times f-1)-1$ of the parity check matrix H, which is for an LDPC-CC of coding rate 2/4 and time-varying period $2\times m$ that is based on a parity check polynomial, the parity check matrix H definable by using a total of $4\times m$ parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, w=1.

[Math. 103]

$$H_{com}[2\times(2\times f-1)-1][4\times((2\times f-1)-0-1)+w]=1 \tag{103-1}$$

When $(2\times f-1)-\alpha_{\#(2c),w,1}-1\geq 0$:

$$H_{com}[2\times(2\times f-1)-1][4\times((2\times f-1)-\alpha_{\#(2c),w,1}-1)-w]=1 \tag{103-2}$$

When $(2\times f-1)-\alpha_{\#(2c),w,2}-1\geq 0$:

$$H_{com}[2\times(2\times f-1)-1][4\times((2\times f-1)-\alpha_{\#(2c),w,2}-1)+w]=1 \tag{103-3}$$

For all u being an integer no smaller than one satisfying $\{u\neq(2\times f-1)-0,\ u\neq(2\times f-1)-\alpha_{\#(2c),w,1},$ and $u\neq(2\times f-1)-\alpha_{\#(2c),w,2}\}$:

$$H_{com}[2\times(2\times f-1)-1][4\times(u-1)+w]=0 \tag{103-4}$$

The following holds true for $X_2$. In the following, z=2, and y is an integer no smaller than three and no greater than $r_{\#(2c),z}$.

[Math. 104]

When $(2\times f-1)-\alpha_{\#(2c),z,y}-1\geq 0$:

$$H_{com}[2\times(2\times f-1)-1][4\times((2\times f-1)-\alpha_{\#(2c),z,y}-1)+z]=1 \tag{104-1}$$

For all u being an integer no smaller than one satisfying $\{u\neq(2\times f-1)-\alpha_{\#(2c),z,y}\}$ (where y is an integer no smaller than three and no greater than $r_{\#(2c),z}$):

$$H_{com}[2\times(2\times f-1)-1][4\times(u-1)+z]=0 \tag{104-2}$$

The following holds true for $P_1$.

[Math. 105]

$$H_{com}[2\times(2\times f-1)-1][4\times((2\times f-1)-0-1)+3]=1 \tag{105-1}$$

When $(2\times f-1)-\beta_{\#(2c),1}-1\geq 0$:

$$H_{com}[2\times(2\times f-1)-1][4\times((2\times f-1)-\beta_{\#(2c),1}-1)+3]=1 \tag{105-2}$$

For all u being an integer no smaller than one satisfying $\{u\neq(2\times f-1)-0$ and $u\neq(2\times f-1)-\beta_{\#(2c),1}\}$:

$$H_{com}[2\times(2\times f-1)-1][4\times(u-1)+3]=0 \tag{105-3}$$

The following holds true for $P_2$.

[Math. 106]

For all u being an integer no smaller than one:

$$H_{com}[2\times(2\times f-1)-1][4\times(u-1)+4]=0 \qquad (106)$$

Further, (3) when g=2×f−1 (where f is an integer no smaller than one), when a vector for row 2×(2×f−1) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-2-1), (2×f−1)−1)%2m=2c holds true. Accordingly, a parity check polynomial satisfying zero of expression (97-2-1) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, z=1, and y is an integer no smaller than three and no greater than $r_{\#(2c),z}$.

[Math. 107]

When $(2\times f-1)-\alpha_{\#(2c),z,y}-1\geq 0$:

$$H_{com}[2\times(2\times f-1)][4\times((2\times f-1)-\alpha_{\#(2c),z,y}-1)+z]=1 \qquad (107\text{-}1)$$

For all u being an integer no smaller than one satisfying $\{u\neq(2\times f-1)-\alpha_{\#(2c),z,y}\}$ (where y is an integer no smaller than three and no greater than $r_{\#(2c),z}$):

$$H_{com}[2\times(2\times f-1)][4\times(u-1)+z]=0 \qquad (107\text{-}2)$$

The following holds true for $X_2$. In the following, w=2.

[Math. 108]

$$H_{com}[2\times(2\times f-1)][4\times((2\times f-1)-0-1)+w]=1 \qquad (108\text{-}1)$$

When $(2\times f-1)-\alpha_{\#(2c),w,1}-1\geq 0$:

$$H_{com}[2\times(2\times f-1)][4\times((2\times f-1)-\alpha_{\#(2c),w,1}-1)+w]=1 \qquad (108\text{-}2)$$

When $(2\times f-1)-\alpha_{\#(2c),w,2}-1\geq 0$:

$$H_{com}[2\times(2\times f-1)][4\times((2\times f-1)-\alpha_{\#(2c),w,2}-1)+w]=1 \qquad (108\text{-}3)$$

For all u being an integer no smaller than one satisfying $\{u\neq(2\times f-1)-0,\ u\neq(2\times f-1)-\alpha_{\#(2c),w,1},$ and $u\neq(2\times f-1)-\alpha_{\#(2c),w,2}\}$:

$$H_{com}[2\times(2\times f-1)][4\times(u-1)+w]=0 \qquad (108\text{-}4)$$

The following holds true for $P_1$.

[Math. 109]

When $(2\times f-1)-\beta_{\#(2c),2}-1\geq 0$:

$$H_{com}[2\times(2\times f-1)][4\times((2\times f-1)-\beta_{\#(2c),2}-1)+3]=1 \qquad (109\text{-}1)$$

For all u being an integer no smaller than one satisfying $\{u\neq(2\times f-1)-\beta_{\#(2c),2}\}$:

$$H_{com}[2\times(2\times f-1)][4\times(u-1)+3]=0 \qquad (109\text{-}2)$$

The following holds true for $P_2$.

[Math. 110]

$$H_{com}[2\times(2\times f-1)][4\times((2\times f-1)-0-1)+4]=1 \qquad (110\text{-}1)$$

For all u being an integer no smaller than one satisfying $\{u\neq(2\times f-1)-0\}$:

$$H_{com}[2\times(2\times f-1)][4\times(u-1)+4]=0 \qquad (110\text{-}2)$$

Further, (4) when g=2×f−1 (where f is an integer no smaller than one), when a vector for row 2×(2×f−1) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-2-2), (2×f−1)−1)%2m=2c holds true. Accordingly, a parity check polynomial satisfying zero of expression (97-2-2) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, z=1, and y is an integer no smaller than three and no greater than $r_{\#(2c),z}$.

[Math. 111]

When $(2\times f-1)-\alpha_{\#(2c),z,y}-1\geq 0$:

$$H_{com}[2\times(2\times f-1)][4\times((2\times f-1)-\alpha_{\#(2c),z,y}-1)+z]=1 \qquad (111\text{-}1)$$

For all u being an integer no smaller than one satisfying $\{u\neq(2\times f-1)-\alpha_{\#(2c),z,y}\}$ (where y is an integer no smaller than three and no greater than $r_{\#(2c),z}$):

$$H_{com}[2\times(2\times f-1)][4\times(u-1)+z]=0 \qquad (111\text{-}2)$$

The following holds true for $X_2$. In the following, w=2.

[Math. 112]

$$H_{com}[2\times(2\times f-1)][4\times((2\times f-1)-0-1)+w]=1 \qquad (112\text{-}1)$$

When $(2\times f-1)-\alpha_{\#(2c),w,1}-1\geq 0$:

$$H_{com}[2\times(2\times f-1)][4\times((2\times f-1)-\alpha_{\#(2c),w,1}-1)+w]=1 \qquad (112\text{-}2)$$

When $(2\times f-1)-\alpha_{\#(2c),w,2}-1\geq 0$:

$$H_{com}[2\times(2\times f-1)][4\times((2\times f-1)-\alpha_{\#(2c),w,2}-1)+w]=1 \qquad (112\text{-}3)$$

For all u being an integer no smaller than one satisfying $\{u\neq(2\times f-1)-0,\ u\neq(2\times f-1)-\alpha_{\#(2c),w,1},$ and $u\neq(2\times f-1)-\alpha_{\#(2c),w,2}\}$:

$$H_{com}[2\times(2\times f-1)][4\times(u-1)+w]=0 \qquad (112\text{-}4)$$

The following holds true for $P_1$.

[Math. 113]

For all u being an integer no smaller than one:

$$H_{com}[2\times(2\times f-1)][4\times(u-1)+3]=0 \quad (113)$$

The following holds true for $P_2$.

[Math. 114]

$$H_{com}[2\times(2\times f-1)][4\times((2\times f-1)-0-1)+4]=1 \quad (114\text{-}1)$$

When $(2\times f-1)-\beta_{\#(2c),3}-1\geq 0$:

$$H_{com}[2\times(2\times f-1)][4\times((2\times f-1)-\beta_{\#(2c),3}-1)+4]=1 \quad (114\text{-}2)$$

For all u being an integer no smaller than one satisfying $\{u\neq(2\times f-1)-0 \text{ and } u\neq(2\times f-1)-\beta_{\#(2c),3}\}$:

$$H_{com}[2\times(2\times f-1)][4\times(u-1)+4]=0 \quad (114\text{-}3)$$

Further, (5) when g=2×f (where f is an integer no smaller than one), when a vector for row 2×(2×f)−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-1-1), ((2×f)−1) %2m=2d+1 holds true. Accordingly, a parity check polynomial satisfying zero of expression (98-1-1) where 2i+1=2d+1 holds true (where d is an integer no smaller than zero and no greater than m−1).

Accordingly, component $H_{com}[2\times g-1][v]=H_{com}[2\times(2\times f)-1][v]$ in row 2×g−1, or that is, row 2×(2×f)−1 of the parity check matrix H, which is for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, z=1, and y is an integer no smaller than three and no greater than $r_{\#(2d+1),z}$.

[Math. 115]

When $(2\times f)-\alpha_{\#(d2+1),z,y}-1\geq 0$:

$$H_{com}[2\times(2\times f)-1][4\times((2\times f)-\alpha_{\#(2d+1),z,y}-1)+z]=1 \quad (115\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)-1][4\times(u-1)+z]=0 \quad (115\text{-}2)$$

The following holds true for $X_2$. In the following, w=2.

[Math. 116]

$$H_{com}[2\times(2\times f)-1][4\times((2\times f)-0-1)+w]=1 \quad (116\text{-}1)$$

When $(2\times f)-\alpha_{\#(2d+1),w,1}-1\geq 0$:

$$H_{com}[2\times(2\times f)-1][4\times((2\times f)-\alpha_{\#(2d+1),w,1}-1)+w]=1 \quad (116\text{-}2)$$

When $(2\times f)-\alpha_{\#(2d+1),w,2}-1\geq 0$:

$$H_{com}[2\times(2\times f)-1][4\times((2\times f)-\alpha_{\#(2d+1),w,2}-1)+w]=1 \quad (116\text{-}3)$$

For all u being an integer no smaller than one satisfying $\{u\neq(2\times f)-0,\ u\neq(2\times f)-\alpha_{\#(2d+1),w,1}, \text{ and } u\neq(2\times f)-\alpha_{\#(2d+1),w,2}\}$:

$$H_{com}[2\times(2\times f)-1][4\times(u-1)+w]=0 \quad (116\text{-}4)$$

The following holds true for $P_1$.

[Math. 117]

$$H_{com}[2\times(2\times f)-1][4\times((2\times f)-0-1)+3]=1 \quad (117\text{-}1)$$

For all u being an integer no smaller than one satisfying $\{u\neq(2\times f)-0\}$:

$$H_{com}[2\times(2\times f)-1][4\times(u-1)+3]=0 \quad (117\text{-}2)$$

The following holds true for $P_2$.

[Math. 118]

When $(2\times f)-\beta_{\#(2d+1),0}-1\geq 0$:

$$H_{com}[2\times(2\times f)-1][4\times((2\times f)-\beta_{\#(2d+1),0}-1)+4]=1 \quad (118\text{-}1)$$

For all u being an integer no smaller than one satisfying $\{u\neq(2\times f)-\beta_{\#(2d+1),0}\}$:

$$H_{com}[2\times(2\times f)-1][4\times(u-1)+4]=0 \quad (118\text{-}2)$$

Further, (6) when g=2×f (where f is an integer no smaller than one), when a vector for row 2×(2×f)−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-1-2), ((2×f)−1) %2m=2d+1 holds true. Accordingly, a parity check polynomial satisfying zero of expression (98-1-2) where 2i+1=2d+1 holds true (where d is an integer no smaller than zero and no greater than m−1).

Accordingly, component $H_{com}[2\times g-1][v]=H_{com}[2\times(2\times f)-1][v]$ in row 2×g−1, or that is, row 2×(2×f)−1 of the parity check matrix H, which is for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, z=1, and y is an integer no smaller than three and no greater than $r_{\#(2d+1),z}$.

[Math. 119]

When $(2\times f)-\alpha_{\#(2d+1),z,y}-1\geq 0$:

$$H_{com}[2\times(2\times f)-1][4\times((2\times f)-\alpha_{\#(2d+1),z,y}-1)+z]=1 \quad (119\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)-1][4\times(u-1)+z]=0 \quad (119\text{-}2)$$

The following holds true for $X_2$. In the following, w=2.

[Math. 120]

$$H_{com}[2\times(2\times f)-1][4\times((2\times f)-0-1)+w]=1 \quad (120\text{-}1)$$

When $(2\times f)-\alpha_{\#(2d+1),w,1}-1\geq 0$:

$$H_{com}[2\times(2\times f)-1][4\times((2\times f)-\alpha_{\#(2d+1),w,1}-1)+w]=1 \quad (120\text{-}2)$$

When $(2\times f)-\alpha_{\#(2d+1),w,2}-1\geq 0$:

$$H_{com}[2\times(2\times f)-1][4\times((2\times f)-\alpha_{\#(2d+1),w,2}-1)+w]=1 \quad (120\text{-}3)$$

For all u being an integer no smaller than one satisfying $\{u\neq(2\times f)-0,\ u\neq(2\times f)-\alpha_{\#(2d+1),w,1},\ \text{and}\ u\neq(2\times f)-\alpha_{\#(2d+1),w,2}\}$:

$$H_{com}[2\times(2\times f)-1][4\times(u-1)+w]=0 \quad (120\text{-}4)$$

The following holds true for $P_1$.

[Math. 121]

$$H_{com}[2\times(2\times f)-1][4\times((2\times f)-0-1)+3]=1 \quad (121\text{-}1)$$

When $(2\times f)-\beta_{\#(2d+1),1}-1\geq 0$:

$$H_{com}[2\times(2\times f)-1][4\times((2\times f)-\beta_{\#(2d+1),1}-1)+3]=1 \quad (121\text{-}2)$$

For all u being an integer no smaller than one satisfying $\{u\neq(2\times f)-0\ \text{and}\ u\neq(2\times f)-\beta_{\#(2d+1),1}\}$:

$$H_{com}[2\times(2\times f)-1][4\times(u-1)+3]=0 \quad (121\text{-}3)$$

The following holds true for $P_2$.

[Math. 122]

For all u being an integer no smaller than one:

$$H_{com}[2\times(2\times f)-1][4\times(u-1)+4]=0 \quad (122)$$

Further, (7) when g=2×f (where f is an integer no smaller than one), when a vector for row 2×(2×f) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-2-1), ((2×f)−1)%2m=2d+1 holds true. Accordingly, a parity check polynomial satisfying zero of expression (98-2-1) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, w=1.

[Math. 123]

$$H_{com}[2\times(2\times f)][4\times((2\times f)-0-1)+w]=1 \quad (123\text{-}1)$$

When $(2\times f)-\alpha_{\#(2d+1),w,1}-1\geq 0$:

$$H_{com}[2\times(2\times f)][4\times((2\times f)-\alpha_{\#(2d+1),w,1}-1)+w]=1 \quad (123\text{-}2)$$

When $(2\times f)-\alpha_{\#(2d+1),w,2}-1\geq 0$:

$$H_{com}[2\times(2\times f)][4\times(2\times f)-\alpha_{\#(2d+1),w,2}-1)+W]=1 \quad (123\text{-}3)$$

For all u being an integer no smaller than one satisfying $\{u\neq(2\times f)-0,\ u\neq(2\times f)-\alpha_{\#(2d+1),w,1},\ \text{and}\ u\neq(2\times f)-\alpha_{\#(2d+1),w,2}\}$:

$$H_{com}[2\times(2\times f)][4\times(u-1)+w]=0 \quad (123\text{-}4)$$

The following holds true for $X_2$. In the following, z=2, and y is an integer no smaller than three and no greater than $r_{\#(2d+1),z}$.

[Math. 124]

When $(2\times f)-\alpha_{\#(2d+1),z,y}-1\geq 0$:

$$H_{cam}[2\times(2\times f)][4\times((2\times f)-\alpha_{\#(2d+1),z,y}-1)+z]=1 \quad (124\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)][4\times(u-1)+z]=0 \quad (124\text{-}2)$$

The following holds true for $P_1$.

[Math. 125]

When $(2\times f)-\beta_{\#(2d+1),2}-1\geq 0$:

$$H_{com}[2\times(2\times f)][4\times((2\times f)-\beta_{\#(2d+1),2}-1)+3]=1 \quad (125\text{-}1)$$

For all u being an integer no smaller than one satisfying $\{u\neq(2\times f)-\alpha_{\#(2d+1),2}\}$:

$$H_{com}[2\times(2\times f)][4\times(u-1)+3]=0 \quad (125\text{-}2)$$

The following holds true for $P_2$.

[Math. 126]

$$H_{com}[2\times(2\times f)][4\times((2\times f)-0-1)+4]=1 \quad (126\text{-}1)$$

For all u being an integer no smaller than one satisfying $\{u\neq(2\times f)-0\}$:

$$H_{com}[2\times(2\times f)][4\times(u-1)+4]=0 \quad (126\text{-}2)$$

Further, (8) when g=2×f (where f is an integer no smaller than one), when a vector for row 2×(2×f) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-2-2), ((2×f)−1)%2m=2d+1 holds true. Accordingly, a parity check polynomial satisfying zero of expression (98-2-2) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, w=1.

[Math. 127]

$$H_{com}[2\times(2\times f)][4\times((2\times f)-0-1)+w]=1 \quad (127\text{-}1)$$

When $(2\times f)-\alpha_{\#(2d+1),w,1}-1\geq 0$:

$$H_{com}[2\times(2\times f)][4\times((2\times f)-\alpha_{\#(2d+1),w,1}-1)+w]=1 \quad (127\text{-}2)$$

When $(2\times f)-\alpha_{\#(2d+1),w,2}-1\geq 0$:

$$H_{com}[2\times(2\times f)][4\times((2\times f)-\alpha_{\#(2d+1),w,2}-1)+w]=1 \quad (127\text{-}3)$$

For all u being an integer no smaller than one satisfying $\{u\neq(2\times f)-0,\ u\neq(2\times f)-\alpha_{\#(2d+1),w,1},$ and $u\neq(2\times f)-\alpha_{\#(2d+1),w,2}\}$:

$$H_{com}[2\times(2\times f)][4\times(u-1)+w]=0 \quad (127\text{-}4)$$

The following holds true for $X_2$. In the following, z=2, and y is an integer no smaller than three and no greater than $r_{\#(2d+1),z}$.

[Math. 128]

When $(2\times f)-\alpha_{\#(2d+1),z,y}-1\geq 0$:

$$H_{com}[2\times(2\times f)][4\times((2\times f)-\alpha_{\#(2d+1),z,y}-1)+z]=1 \quad (128\text{-}1)$$

For all u being an integer no smaller than one satisfying $\{u\neq(2\times f)-\alpha_{\#(2d+1),z,y}\}$ (Where y is an integer no smaller than three and no greater than $r_{\#(2d+1),z}$):

$$H_{com}[2\times(2\times f)][4\times(u-1)+z]=0 \quad (128\text{-}2)$$

The following holds true for $P_1$.

[Math. 129]

For all u being an integer no smaller than one:

$$H_{com}[2\times(2\times f)][4\times(u-1)+3]=0 \quad (129)$$

The following holds true for $P_2$.

[Math. 130]

$$H_{com}[2\times(2\times f)][4\times((2\times f)-0-1)+4]=1 \quad (130\text{-}1)$$

When $(2\times f)-\beta_{\#(2d+1),3}-1\geq 0$:

$$H_{com}[2\times(2\times f)][4\times((2\times f)-\beta_{\#(2d+1),3}-1)+4]=1 \quad (130\text{-}2)$$

For all u being an integer no smaller than one satisfying $\{u\neq(2\times f)-0$ and $u\neq(2\times f)-\beta_{\#(2d+1),3}\}$:

$$H_{com}[2\times(2\times f)][4\times(u-1)+4]=0 \quad (130\text{-}3)$$

As such, an LDPC-CC of coding rate 2/4 and time-varying period 2×m that is based on a parity check polynomial can be generated by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, and the code so generated achieves high error correction capability.

Embodiment 2

In the present embodiment, description is provided of a method of code configuration that is a generalization of the method described in embodiment 1 of configuring an LDPC-CC of coding rate 2/4 that is based on a parity check polynomial.

Bits of information bits $X_1$, $X_2$ and parity bits $P_1$, $P_2$, at time point j, are expressed $X_{1,j}$, $X_{2,j}$ and $P_{1,j}$, $P_{2,j}$, respectively.

A vector $u_j$, at time point j, is expressed $u_j=(X_{1,j}, X_{2,j}, P_{2,j})$.

Given a delay operator D, polynomial expressions of the information bits $X_1$, $X_2$ are $X_1(D)$, $X_2(D)$, and polynomial expressions of the parity bits $P_1$, $P_2$ are $P_1(D)$, $P_2(D)$.

Further, consideration is given to an LDPC-CC of coding rate 2/4 and time-varying period 2m that is based on a parity check polynomial.

The following mathematical expressions are provided as parity check polynomials satisfying zero for an LDPC-CC of coding rate 2/4 and time-varying period 2m that is based on a parity check polynomial.

First, because two parities $P_1$ and $P_2$ exist, parity check polynomials satisfying zero are provided as described in the following, two for $1\times P_1(D)$ and two for $1\times P_2(D)$.

[Math. 131]

$$\left(1+\sum_{s=1}^{R_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+P_1(D)+D^{\beta\#(2i),0}P_2(D)=$$
$$(D^{\alpha\#(2i),1,R_{\#(2i),1}}+\ldots+D^{\alpha\#(2i),1,1}+1)X_1(D)+(D^{\alpha\#(2i),2,r_{\#(2i),2}}+\ldots+D^{\alpha\#(2i),2,R_{\#(2i),2}}+1)X_2(D)+P_1(D)+D^{\beta\#(2i),0}P_2(D)=0 \quad (131\text{-}1\text{-}1)$$

$$\left(1+\sum_{s=1}^{R_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+P_1(D)+D^{\beta\#(2i),1}P_1(D)=$$
$$(D^{\alpha\#(2i),1,R_{\#(2i),1}}+\ldots+D^{\alpha\#(2i),1,1}+1)X_1(D)+(D^{\alpha\#(2i),2,r_{\#(2i),2}}+\ldots+D^{\alpha\#(2i),2,R_{\#(2i),2}}+1)X_2(D)+P_1(D)+D^{\beta\#(2i),1}P_1(D)=0 \quad (131\text{-}1\text{-}2)$$

$$\left(\sum_{s=R_{\#(2i),1}+1}^{r_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+P_2(D)+D^{\beta\#(2i),2}P_1(D)=$$
$$(D^{\alpha\#(2i),1,r_{\#(2i),1}}+\ldots+D^{\alpha\#(2i),1,R_{\#(2i),1}}+1)X_1(D)+(D^{\alpha\#(2i),2,R_{\#(2i),2}}+\ldots+D^{\alpha\#(2i),2,1}+1)X_2(D)+P_2(D)+D^{\beta\#(2i),2}P_1(D)=0 \quad (131\text{-}2\text{-}1)$$

$$\left(\sum_{s=R_{\#(2i),1}+1}^{r_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+P_2(D)+D^{\beta\#(2i),3}P_2(D)=$$
$$(D^{\alpha\#(2i),1,r_{\#(2i),1}}+\ldots+D^{\alpha\#(2i),1,R_{\#(2i),1}}+1)X_1(D)+(D^{\alpha\#(2i),2,R_{\#(2i),2}}+\ldots+D^{\alpha\#(2i),2,1}+1)X_2(D)+P_2(D)+D^{\beta\#(2i),3}P_2(D)=0 \quad (131\text{-}2\text{-}2)$$

In expression (131-1-1), (131-1-2), (131-2-1), (131-2-2), i is an integer no smaller than zero and no greater than m−1 (i=0, 1, . . . , m−2, m−1).

In expression (131-1-1), (131-1-2), (131-2-1), (131-2-2), $\alpha_{\#(2c),p,q}$ (where p is an integer no smaller than one and no greater than two, q is an integer no smaller than one and no greater than $r_{\#(2i),p}$ (where $r_{\#(2i),p}$ is a natural number)) and $\beta_{\#(2i),0}$ is a natural number, $\beta_{\#(2i),1}$ is a natural number, $\beta_{\#(2i),2}$ is an integer no smaller than zero, and $\beta_{\#(2i),3}$ is a natural number.

Further, $R_{\#(2i),p}$ is a natural number satisfying $1 \leq R_{\#(2i),p} < r_{\#(2i),p}$.

Further, y is an integer no smaller than one and no greater than $r_{\#(2i),p,z}$ is an integer no smaller than one and no greater than $r_{\#(2i),p}$, and $\alpha_{\#(2i),p,y} \neq \alpha_{\#(2i),p,z}$ holds true for $\forall$(y, z) where y≠z. ∀ is a universal quantifier. (y is an integer no smaller than one and no greater than $r_{\#(2i),p,z}$ is an integer no smaller than one and no greater than $r_{\#2i,p}$, and $\alpha_{\#(2i),p,y} \neq \alpha_{\#(2i),p,z}$ holds true for all y and all z satisfying y≠z.

Note that in the following, to simplify explanation, a parity check polynomial satisfying zero that is expressed by expression (131-1-1) or expression (131-1-2) is referred to as "#(2i); first expression" for realizing a time-varying period 2m, and a parity check polynomial satisfying zero that is expressed by expression (131-2-1) or expression (131-2-2) is referred to as "#(2i); second expression" for realizing a time-varying period 2m.

Thus, for each i, as #(2i); first expression for realizing a time-varying period 2m, a parity check polynomial satisfying zero expressed by either expression (131-1-1) or expression (131-1-2) is prepared.

That is, for i=0, a parity check polynomial satisfying zero provided by expression (131-1-1) where i=0, or a parity check polynomial satisfying zero provided by expression (131-1-2) where i=0 is prepared.

Similarly:

for i=1, a parity check polynomial satisfying zero provided by expression (131-1-1) where i=1, or a parity check polynomial satisfying zero provided by expression (131-1-2) where i=1 is prepared;

for i=2, a parity check polynomial satisfying zero provided by expression (131-1-1) where i=2, or a parity check polynomial satisfying zero provided by expression (131-1-2) where i=2 is prepared;

⋮ for i=z, a parity check polynomial satisfying zero provided by expression (131-1-1) where i=z, or a parity check polynomial satisfying zero provided by expression (131-1-2) where i=z is prepared (where z is an integer no smaller than zero and no greater than m−1); and

⋮ for i=m−1, a parity check polynomial satisfying zero provided by expression (131-1-1) where i=m−1, or a parity check polynomial satisfying zero provided by expression (131-1-2) where i=m−1 is prepared.

Similarly, for each i, as #(2i); second expression for realizing a time-varying period 2m, a parity check polynomial satisfying zero expressed by either expression (131-2-1) or expression (131-2-2) is prepared.

That is, for i=0, a parity check polynomial satisfying zero provided by expression (131-2-1) where i=0, or a parity check polynomial satisfying zero provided by expression (131-2-2) where i=0 is prepared.

Similarly:

for i=1, a parity check polynomial satisfying zero provided by expression (131-2-1) where i=1, or a parity check polynomial satisfying zero provided by expression (131-2-2) where i=1 is prepared;

for i=2, a parity check polynomial satisfying zero provided by expression (131-2-1) where i=2, or a parity check polynomial satisfying zero provided by expression (131-2-2) where i=2 is prepared;

⋮ for i=z, a parity check polynomial satisfying zero provided by expression (131-2-1) where i=z, or a parity check polynomial satisfying zero provided by expression (131-2-2) where i=z is prepared (where z is an integer no smaller than zero and no greater than m−1); and

⋮ for i=m−1, a parity check polynomial satisfying zero provided by expression (131-2-1) where i=m−1, or a parity check polynomial satisfying zero provided by expression (131-2-2) where i=m−1 is prepared.

Similarly, because two parities $P_1$ and $P_2$ exist, parity check polynomials satisfying zero are provided as described in the following, two for $1 \times P_1(D)$ and two for $1 \times P_2(D)$.

[Math. 132]

$$\begin{aligned}&\left(\sum_{s=R_{\#(2i+1),1}+1}^{r_{\#(2i+1),1}} D^{\alpha\#(2i+1),1,s}\right)X_1(D) + \left(1+\sum_{s=1}^{R_{\#(2i+1),2}} D^{\alpha\#(2i+1),2,s}\right)X_2(D) + P_1(D) + D^{\beta\#(2i+1),0}P_2(D) = \\ &(D^{\alpha\#(2i+1),1,r_{\#(2i+1),1}} + \ldots + D^{\alpha\#(2i+1),1,R_{\#(2i+1),1}} + 1)X_1(D) + \\ &(D^{\alpha\#(2i+1),2,R_{\#(2i+1),2}} + \ldots + D^{\alpha\#(2i+1),2,1} + 1)X_2(D) + \\ &P_1(D) + D^{\beta\#(2i+1),0}P_2(D) = 0\end{aligned} \tag{132-1-1}$$

$$\begin{aligned}&\left(\sum_{s=R_{\#(2i+1),1}+1}^{r_{\#(2i+1),1}} D^{\alpha\#(2i+1),1,s}\right)X_1(D) + \left(1+\sum_{s=1}^{R_{\#(2i+1),2}} D^{\alpha\#(2i+1),2,s}\right)X_2(D) + P_1(D) + D^{\beta\#(2i+1),1}P_1(D) = \\ &(D^{\alpha\#(2i+1),1,r_{\#(2i+1),1}} + \ldots + D^{\alpha\#(2i+1),1,R_{\#(2i+1),1}} + 1)X_1(D) + \\ &(D^{\alpha\#(2i+1),2,R_{\#(2i+1),2}} + \ldots + D^{\alpha\#(2i+1),2,1} + 1)X_2(D) + \\ &P_1(D) + D^{\beta\#(2i+1),1}P_1(D) = 0\end{aligned} \tag{132-1-2}$$

$$\begin{aligned}&\left(1+\sum_{s=1}^{R_{\#(2i+1),1}} D^{\alpha\#(2i+1),1,s}\right)X_1(D) + \left(\sum_{s=R_{\#(2i+1),2}+1}^{r_{\#(2i+1),2}} D^{\alpha\#(2i+1),2,s}\right)X_2(D) + P_2(D) + D^{\beta\#(2i+1),2}P_1(D) = \\ &(D^{\alpha\#(2i+1),1,R_{\#(2i+1),1}} + \ldots + D^{\alpha\#(2i+1),1,1} + 1)X_1(D) + \\ &(D^{\alpha\#(2i+1),2,r_{\#(2i+1),13}} + \ldots + D^{\alpha\#(2i+1),2,R_{\#(2i+1),2}} + 1) \\ &X_2(D) + P_2(D) + D^{\beta\#(2i+1),2}P_1(D) = 0\end{aligned} \tag{132-2-1}$$

$$\begin{aligned}&\left(1+\sum_{s=1}^{R_{\#(2i+1),1}} D^{\alpha\#(2i+1),1,s}\right)X_1(D) + \left(\sum_{s=R_{\#(2i+1),2}+1}^{r_{\#(2i+1),2}} D^{\alpha\#(2i+1),2,s}\right)X_2(D) + P_2(D) + D^{\beta\#(2i+1),3}P_2(D) = \\ &(D^{\alpha\#(2i+1),1,R_{\#(2i+1),1}} + \ldots + D^{\alpha\#(2i+1),1,1} + 1)X_1(D) + \\ &(D^{\alpha\#(2i+1),2,r_{\#(2i+1),13}} + \ldots + D^{\alpha\#(2i+1),2,R_{\#(2i+1),2}} + 1) \\ &X_2(D) + P_2(D) + D^{\beta\#(2i+1),3}P_2(D) = 0\end{aligned} \tag{132-2-2}$$

In expression (132-1-1), (132-1-2), (132-2-1), (132-2-2), i is an integer no smaller than zero and no greater than m−1 (i=0, 1, . . . , m−2, m−1).

In expression (132-1-1), (132-1-2), (132-2-1), (132-2-2), $\alpha_{\#(2i+1),p,q}$ (where p is an integer no smaller than one and no greater than two, q is an integer no smaller than one and no greater than $r_{\#(2i+1),p}$ (where $r_{\#(2i+1),p}$ is a natural number))

and $\beta_{\#(2i+1),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, $R_{\#(2i+1),p}$ is a natural number satisfying $1 \leq R_{\#(2i+1),p} < r_{\#(2i+1),p}$.

Further, y is an integer no smaller than one and no greater than $r_{\#(2i+1),p,z}$ is an integer no smaller than one and no greater than $r_{\#(2i+1),p}$, and $\alpha_{\#(2i+1),p,y} \neq \alpha_{\#(2i+1),p,z}$ holds true for $^{\forall}(y, z)$ where $y \neq z$. $\forall$ is a universal quantifier. (y is an integer no smaller than one and no greater than $r_{\#(2i+1),p,z}$ is an integer no smaller than one and no greater than $r_{\#(2i+1),p}$, and $\alpha_{\#(2i+1),p,y} \neq \alpha_{\#(2i+1),p,z}$ holds true for all y and all z satisfying $y \neq z$.)

Note that in the following, to simplify explanation, a parity check polynomial satisfying zero that is expressed by expression (132-1-1) or expression (132-1-2) is referred to as "#(2i+1); first expression" for realizing a time-varying period 2m, and a parity check polynomial satisfying zero that is expressed by expression (132-2-1) or expression (132-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (132-1-1) or expression (132-1-2) is prepared.

That is, for i=0, a parity check polynomial satisfying zero provided by expression (132-1-1) where i=0, or a parity check polynomial satisfying zero provided by expression (132-1-2) where i=0 is prepared.

Similarly:

for i=1, a parity check polynomial satisfying zero provided by expression (132-1-1) where i=1, or a parity check polynomial satisfying zero provided by expression (132-1-2) where i=1 is prepared;

for i=2, a parity check polynomial satisfying zero provided by expression (132-1-1) where i=2, or a parity check polynomial satisfying zero provided by expression (132-1-2) where i=2 is prepared;

⋮ for i=z, a parity check polynomial satisfying zero provided by expression (132-1-1) where i=z, or a parity check polynomial satisfying zero provided by expression (132-1-2) where i=z is prepared (where z is an integer no smaller than zero and no greater than m−1); and

⋮ for i=m−1, a parity check polynomial satisfying zero provided by expression (132-1-1) where i=m−1, or a parity check polynomial satisfying zero provided by expression (132-1-2) where i=m−1 is prepared.

Similarly, for each i, as #(2i+1); second expression for realizing a time-varying period 2m, a parity check polynomial satisfying zero expressed by either expression (132-2-1) or expression (132-2-2) is prepared.

That is, for i=0, a parity check polynomial satisfying zero provided by expression (132-2-1) where i=0, or a parity check polynomial satisfying zero provided by expression (132-2-2) where i=0 is prepared.

Similarly:

for i=1, a parity check polynomial satisfying zero provided by expression (132-2-1) where i=1, or a parity check polynomial satisfying zero provided by expression (132-2-2) where i=1 is prepared;

for i=2, a parity check polynomial satisfying zero provided by expression (132-2-1) where i=2, or a parity check polynomial satisfying zero provided by expression (132-2-2) where i=2 is prepared;

⋮ for i=z, a parity check polynomial satisfying zero provided by expression (132-2-1) where i=z, or a parity check polynomial satisfying zero provided by expression (132-2-2) where i=z is prepared (where z is an integer no smaller than zero and no greater than m−1); and

⋮ for i=m−1, a parity check polynomial satisfying zero provided by expression (132-2-1) where i=m−1, or a parity check polynomial satisfying zero provided by expression (132-2-2) where i=m−1 is prepared.

As such, an LDPC-CC of coding rate 2/4 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (131-1-1) or expression (131-1-2), parity check polynomials satisfying zero provided by expression (131-2-1) or expression (131-2-2), parity check polynomials satisfying zero provided by expression (132-1-1) or expression (132-1-2), and parity check polynomials satisfying zero provided by expression (132-2-1) or expression (132-2-2).

For example, the time varying period 2×m can be formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expression (131-1-1), (131-1-2), (131-2-1), (131-2-2), (132-1-1), (132-1-2), (132-2-1), and (132-2-2) (where j is an integer no smaller than zero).

The following presumes that 2k=j%2m holds true. In the following, % means a modulo, and for example, α%6 represents a remainder after dividing α by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

The following describes a method of configuring a parity check matrix for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of

#(2i+1); first expression, and an m number of parity check polynomials satisfying zero of #(2i+1); second expression.

As already described above, a vector $u_j$ at time point j is expressed as $u_j=(X_{1,j}, X_{2,j}, P_{1,j}, P_{2,j})$ (where j is an integer no smaller than zero). In the following, a case where u is a transmission vector is considered. Note that in the following, j is an integer no smaller than one, and thus j differs between the description having been provided above and the description provided in the following. (j is set as such to facilitate understanding of the correspondence between the column numbers and the row numbers of the parity check matrix.)

Accordingly, $u=(u_1, u_2, u_3, \ldots, u_{y-1}, u_y, u_{y+1}, \ldots)^T=(X_{1,1}, X_{2,1}, P_{1,1}, P_{2,1}, X_{1,2}, X_{2,2}, P_{1,2}, P_{2,2}, X_{1,3}, X_{2,3}, P_{1,3}, P_{2,3}, \ldots, X_{1,y-1}, X_{2,y-1}, P_{1,y-1}, P_{2,y-1}, X_{1,y}, X_{2,y}, P_{1,y}, P_{2,y}, X_{1,y+1}, X_{2,y+1}, P_{1,y+1}, P_{2,y+1}, \ldots)^T$. Further, when using H to denote a parity check matrix for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, Hu=0 holds true (here, Hu=0 indicates that all elements of the vector Hu are zeroes).

FIG. 37 indicates a configuration of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the topmost row of the parity check matrix is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

As illustrated in FIG. 37:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression"; and "a vector for the (2×i)th row of the parity check matrix H can be generated from a parity check polynomial satisfying zero of #((i−1)%2m); second expression", and so on (where i is an integer no smaller than one).

FIG. 38 indicates a configuration of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the leftmost column of the parity check matrix $H_{pro\_m}$ is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

As illustrated in FIG. 38:

"a vector for the first column of the parity check matrix H is related to $X_1$ at time point 1";

"a vector for the second column of the parity check matrix H is related to $X_2$ at time point 1";

"a vector for the third column of the parity check matrix H is related to $P_1$ at time point 1";

"a vector for the fourth column of the parity check matrix H is related to $P_2$ at time point 1";

⋮

"a vector for the 4×(j−1)+1th column of the parity check matrix H is related to $X_1$ at time point j";

"a vector for the 4×(j−1)+2th column of the parity check matrix H is related to $X_2$ at time point j";

"a vector for the 4×(j−1)+3th column of the parity check matrix H is related to $P_1$ at time point j"; and "a vector for the 4×(j−1)+4th column of the parity check matrix H is related to $P_2$ at time point j", and so on (where j is an integer no smaller than one).

FIG. 39 indicates a parity check matrix for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The following focuses on $1 \times X_1(D)$, $1 \times X_2(D)$, $1 \times P_1(D)$, $1 \times P_2(D)$ in the parity check matrix for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The parity check polynomials at time point j=1 are parity check polynomials when i=0 in expression (131-1-1), (131-1-2), (131-2-1), (131-2-2).

A vector for the first row in FIG. 39 can be generated from a parity check polynomial when i=0 in expression (131-1-1) or expression (131-1-2) (refer to FIG. 37).

In expression (131-1-1) and (131-1-2):

a term for $1 \times X_1(D)$ exists;

a term for $1 \times X_2(D)$ does not exist; and a term for $1 \times P_1(D)$ exists but a term for $1 \times P_2(D)$ does not exist.

Further, the relationship between column numbers and $X_1$, $X_2$, $P_1$, $P_2$ is as indicated in FIG. 38. Based on the relationship indicated in FIG. 38 and the fact that an item for $1 \times X_1(D)$ exists, a column related to $X_1$ in the vector for the first row in FIG. 39 is "1". Further, based on the relationship indicated in FIG. 38 and the fact that an item for $1 \times X_2(D)$ does not exist, a column related to $X_2$ in the vector for the first row in FIG. 39 is "0". In addition, based on the relationship indicated in FIG. 38 and the fact that an item for $1 \times P_1(D)$ exists but an item for $1 \times P_2(D)$ does not exist, a column related to $P_1$ in the vector for the first row in FIG. 39 is "1", and a column related to $P_2$ in the vector for the first row in FIG. 39 is "0".

As such, the vector for the first row in FIG. 39 is "1010", as indicated by 3900-1 in FIG. 39.

A vector for the second row in FIG. 39 can be generated from a parity check polynomial when i=0 in expression (131-2-1) or expression (131-2-2) (refer to FIG. 37).

In expression (131-2-1) and (131-2-2):

a term for $1 \times X_1(D)$ does not exist;

a term for $1 \times X_2(D)$ exists; and a term for $1 \times P_1(D)$ may or may not exist but a term for $1 \times P_2(D)$ exists.

Further, the relationship between column numbers and $X_1$, $X_2$, $P_1$, $P_2$ is as indicated in FIG. 38. Based on the relationship indicated in FIG. 38 and the fact that an item for $1 \times X_1(D)$ does not exist, a column related to $X_1$ in the vector for the second row in FIG. 39 is "0". Further, based on the relationship indicated in FIG. 38 and the fact that an item for $1 \times X_2(D)$ exists, a column related to $X_2$ in the vector for the second row in FIG. 39 is "1". In addition, based on the relationship indicated in FIG. 38 and the fact that an item for $1 \times P_1(D)$ may or may not exist but an item for $1 \times P_2(D)$ exists, a column related to $P_1$ in the vector for the second row in FIG. 39 is "Y", and a column related to $P_2$ in the vector for the second row in FIG. 39 is "1", where Y is either "0" or "1".

As such, the vector for the second row in FIG. 39 is "01Y1", as indicated by 3900-2 in FIG. 39.

The parity check polynomials at time point j=2 are parity check polynomials when i=0 in expression (132-1-1), (132-1-2), (132-2-1), (132-2-2).

A vector for the third row in FIG. 39 can be generated from a parity check polynomial when i=0 in expression (132-1-1) or expression (132-1-2) (refer to FIG. 37).

In expression (132-1-1) and (132-1-2):

a term for $1 \times X_1(D)$ does not exist;

a term for $1 \times X_2(D)$ exists; and a term for $1 \times P_1(D)$ exists but a term for $1 \times P_2(D)$ does not exist.

Further, the relationship between column numbers and $X_1$, $X_2$, $P_1$, $P_2$ is as indicated in FIG. 38. Based on the relationship indicated in FIG. 38 and the fact that an item for $1 \times X_1(D)$ does not exist, a column related to $X_1$ in the vector for the third row in FIG. 39 is "0". Further, based on the relationship indicated in FIG. 38 and the fact that an item for $1 \times X_2(D)$ exists, a column related to $X_2$ in the vector for the third row in FIG. 39 is "1". In addition, based on the relationship indicated in FIG. 38 and the fact that an item for $1 \times P_1(D)$ exists but an item for $1 \times P_2(D)$ does not exist, a column related to $P_1$ in the vector for the third row in FIG. 39 is "1", and a column related to $P_2$ in the vector for the third row in FIG. 39 is "0".

As such, the vector for the third row in FIG. 39 is "0110", as indicated by 3901-1 in FIG. 39.

A vector for the fourth row in FIG. 39 can be generated from a parity check polynomial when i=0 in expression (132-2-1) or expression (132-2-2) (refer to FIG. 37).

In expression (132-2-1) and (132-2-2):

a term for $1 \times X_1(D)$ exists;

a term for $1 \times X_2(D)$ does not exist; and a term for $1 \times P_1(D)$ may or may not exist but a term for $1 \times P_2(D)$ exists.

Further, the relationship between column numbers and $X_1$, $X_2$, $P_1$, $P_2$ is as indicated in FIG. 38. Based on the relationship indicated in FIG. 38 and the fact that an item for $1 \times X_1(D)$ exists, a column related to $X_1$ in the vector for the fourth row in FIG. 39 is "1". Further, based on the relationship indicated in FIG. 38 and the fact that an item for $1 \times X_2(D)$ does not exist, a column related to $X_2$ in the vector for the fourth row in FIG. 39 is "0". In addition, based on the relationship indicated in FIG. 38 and the fact that an item for $1 \times P_1(D)$ may or may not exist but an item for $1 \times P_2(D)$ exists, a column related to $P_1$ in the vector for the fourth row in FIG. 39 is "Y", and a column related to $P_2$ in the vector for the fourth row in FIG. 39 is "1".

As such, the vector for the fourth row in FIG. 39 is "10Y1", as indicated by 3901-2 in FIG. 39.

Because it can be considered that the above similarly applies to cases where time point j=3, 4, 5, the parity check matrix H has the configuration indicated in FIG. 39.

That is, due to the parity check polynomials of expression (131-1-1), (131-1-2), (131-2-1), (131-2-2) being used at time point j=2k+1 (where k is an integer no smaller than zero), "1010" exists in the 2×(2k+1)−1th row of the parity check matrix H, and "01Y1" exists in the 2×(2k+1)th row of the parity check matrix H, as illustrated in FIG. 39.

Further, due to the parity check polynomials of expression (132-1-1), (132-1-2), (132-2-1), (132-2-2) being used at time point j=2k+2 (where k is an integer no smaller than zero), "0110" exists in the 2×(2k+2)−1th row of the parity check matrix H, and "10Y1" exists in the 2×(2k+2)th row of the parity check matrix H, as illustrated in FIG. 39.

Accordingly, as illustrated in FIG. 39, when denoting a column number of a leftmost column corresponding to "1" in "1010" in a row where "1010" exists (e.g., 3900-1 in FIG. 39) as "a", "0110" (e.g., 3901-1 in FIG. 39) exists in a row that is two rows below the row where "1010" exists, starting from column "a+4".

Similarly, as illustrated in FIG. 39, when denoting a column number of a leftmost column corresponding to "1" in "01Y1" in a row where "01Y1" exists (e.g., 3900-2 in FIG. 39) as "b", "10Y1" (e.g., 3901-2 in FIG. 39) exists in a row that is two rows below the row where "01Y1" exists, starting from column "b+4".

Similarly, as illustrated in FIG. 39, when denoting a column number of a leftmost column corresponding to "1" in "0110" in a row where "0110" exists (e.g., 3901-1 in FIG. 39) as "c", "1010" (e.g., 3902-1 in FIG. 39) exists in a row that is two rows below the row where "0110" exists, starting from column "c+4".

Similarly, as illustrated in FIG. 39, when denoting a column number of a leftmost column corresponding to "1" in "10Y1" in a row where "10Y1" exists (e.g., 3901-2 in FIG. 39) as "d", "01Y1" (e.g., 3902-2 in FIG. 39) exists in a row that is two rows below the row where "0110" exists, starting from column "d+4".

The following describes a parity check matrix for an LDPC-CC of coding rate 2/4 and time-varying period 2×m that is based on a parity check polynomial when tail-biting is not performed, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

In the following, $H_{com}[u][v]$ (where u and v are integers no smaller than one) denotes an element at row "u" column "v" of a parity check matrix for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Based on description above provided with reference to FIG. 37:

"a vector for the 2×g−1th row of the parity check matrix H can be generated from a parity check polynomial satisfying zero of #((g−1)%2m); first expression"; and "a vector for the (2×g)th row of the parity check matrix H can be generated from a parity check polynomial satisfying zero of #((g−1)%2m); second expression" (where g is an integer no smaller than one).

Based on description above provided with reference to FIG. 38:

"a vector for the 4×(j−1)+1th column of the parity check matrix H is related to $X_1$ at time point j";

"a vector for the 4×(j−1)+2th column of the parity check matrix H is related to $X_2$ at time point j";

"a vector for the 4×(j−1)+3th column of the parity check matrix H is related to $P_1$ at time point j"; and "a vector for the 4×(j−1)+4th column of the parity check matrix H is related to $P_2$ at time point j" (where j is an integer no smaller than one).

Based on the above, the following describes component $H_{com}[2\times g-1][v]$ in row 2×g−1 (where g is an integer no smaller than one) and component $H_{com}[2\times g][v]$ in row 2×g of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a parity check polynomial satisfying zero of #((g−1)%2m); first expression can be used to generate a vector for row 2×g−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #((g−1)%2m); second expression can be used to generate a vector for row 2×g of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, when g=2×f−1 (where f is an integer no smaller than one), a parity check polynomial satisfying zero of #(((2×f−1)−1)%2m); first expression, or that is, a parity check polynomial satisfying zero of either expression (131-1-1) or expression (131-1-2), can be used to generate a vector for row 2×(2×f−1)−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f−1)−1)%2m); second expression, or that is, a parity check polynomial satisfying zero of either expression (131-2-1) or expression (131-2-2), can be used to generate a vector for row 2×(2×f−1) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, when g=2×f (where f is an integer no smaller than one), a parity check polynomial satisfying zero of #(((2×f)−1)%2m); first expression, or that is, a parity check polynomial satisfying zero of either expression (132-1-1) or expression (132-1-2), can be used to generate a vector for row 2×(2×f)−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f)−1)%2m); second expression, or that is, a parity check polynomial satisfying zero of either expression (132-2-1) or expression (132-2-2), can be used to generate a vector for row 2×(2×f) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, (1) when g=2×f−1 (where f is an integer no smaller than one), when a vector for row 2×(2×f−1)−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (131-1-1), (2×f−1)−1)%2m=2c holds true. Accordingly, a parity check polynomial satisfying zero of expression (131-1-1) where 2i=2c holds true (where c is an integer no smaller than zero and no greater than m−1).

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, w=1.

[Math. 133]

$$H_{com}[2\times(2\times f-1)-1][4\times((2\times f-1)-0-1)+w]=1 \tag{133-1}$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)-1][4\times((2\times f-1)-0-1)+w]=1 \tag{133-2}$$

For all u being an integer no smaller than one satisfying $\{u\neq(2\times f-1)-0$, and $u\neq(2\times f-1)-\alpha_{\#(2c),w,y}\}$ (where y is an integer no smaller than one and no greater than $R_{\#(2c),w}$);

$$H_{com}[2\times(2\times f-1)-1][4\times(u-1)+w]=0 \tag{133-3}$$

The following holds true for $X_2$. In the following, z=2, and y is an integer no smaller than $R_{\#(2c),z}+1$ and no greater than $r_{\#(2c),z}$.

[Math. 134]

When $(2\times f-1)-\alpha_{\#(2c),z,y}-1\geq 0$:

$$H_{com}[2\times(2\times f-1)-1][4\times((2\times f-1)-\alpha_{\#(2c),z,y}-1)+z] \tag{134-1}$$

For all u being an integer no smaller than one satisfying $\{u\neq(2\times f-1)-\alpha_{\#(2c),z,y}\}$ (where y is an integer no smaller than $R_{\#(2c),z}+1$ and no smaller than $r_{\#(2c),z}$);

$$H_{com}[2\times(2\times f-1)-1][4\times(u-1)+z]=0 \tag{134-2}$$

The following holds true for $P_1$.

[Math. 135]

$$H_{com}[2\times(2\times f-1)-1][4\times((2\times f-1)-0-1)+3]=1 \tag{135-1}$$

For all u being an integer no smaller than one satisfying $\{u\neq(2\times f-1)-0\}$;

$$H_{com}[2\times(2\times f-1)-1][4\times(u-1)+3]=0 \tag{135-2}$$

The following holds true for $P_2$.

[Math. 136]

When $(2\times f-1)-\beta_{\#(2c),0}-1\geq 0$:

$$H_{com}[2\times(2\times f-1)-1][4\times((2\times f)-\beta_{\#(2c),0}-1)+4]=1 \tag{136-1}$$

For all u being an integer no smaller than one satisfying $\{u\neq(2\times f-1)-\beta_{\#(2c),0}\}$;

$$H_{com}[2\times(2\times f-1)-1][4\times(u-1)+4]=0 \tag{136-2}$$

Further, (2) when g=2×f−1 (where f is an integer no smaller than one), when a vector for row 2×(2×f−1)−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (131-1-2), ((2×f−1)−1)%2m=2c holds true. Accordingly, a parity check polynomial satisfying zero of expression (131-1-2) where 2i=2c holds true (where c is an integer no smaller than zero and no greater than m−1).

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, w=1.

[Math. 137]

$$H_{com}[2\times(2\times f-1)-1][4\times((2\times f-1)-0-1)+w]=1 \quad (137\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)-1][4\times((2\times f-1)-\alpha_{\#(2c),w,y}-1)+w]=1 \quad (137\text{-}2)$$

For all u being an integer no smaller than one satisfying $\{u\neq(2\times f-1)-0$ and $u\neq(2\times f-1)-\alpha_{\#(2c),w,y}\}$ (where y is an integer no smaller than one and no greater than $R_{\#(2c),w}$);

$$H_{com}[2\times(2\times f-1)-1][4\times(u-1)+w]=0 \quad (137\text{-}3)$$

The following holds true for $X_2$. In the following, z=2, and y is an integer no smaller than $R_{\#(2c),z}+1$ and no greater than $r_{\#(2c),z}$.

[Math. 138]

When $(2\times f-1)-\alpha_{\#(2c),z,y}-1\geq 0$:

$$H_{com}[2\times(2\times f-1)-1][4\times((2\times f-1)-\alpha_{\#(2c),z,y}-1)+z]=1 \quad (138\text{-}1)$$

For all u being an integer no smaller than one satisfying $\{u\neq(2\times f-1)-\alpha_{\#(2c),z,y}\}$ (where y is an integer no smaller than $R_{\#(2c),z}+1$ and no greater than $r_{\#(2c),z}$);

$$H_{com}[2\times(2\times f-1)-1][4\times(u-1)+z]=0 \quad (138\text{-}2)$$

The following holds true for $P_1$.

[Math. 139]

$$H_{com}[2\times(2\times f-1)-1][4\times((2\times f-1)-0-1)+3]=1 \quad (139\text{-}1)$$

When $(2\times f-1)-\beta_{\#(2c),1}-1\geq 0$:

$$H_{com}[2\times(2\times f-1)-1][4\times((2\times f-1)-\beta_{\#(2c),1}-1)+3]=1 \quad (139\text{-}2)$$

For all u being an integer no smaller than one satisfying $\{u\neq(2\times f-1)-0$ and $u\neq(2\times f-1)-\beta_{\#(2c),1}\}$;

$$H_{com}[2\times(2\times f-1)-1][4\times(u-1)+3]=0 \quad (139\text{-}3)$$

The following holds true for $P_2$.

[Math. 140]

For all u being an integer no smaller than one;

$$H_{com}[2\times(2\times f-1)-1][4\times(u-1)+4]=0 \quad (140)$$

Further, (3) when g=2×f−1 (where f is an integer no smaller than one), when a vector for row 2×(2×f−1) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (131-2-1), (2×f−1)−1)%2m=2c holds true. Accordingly, a parity check polynomial satisfying zero of expression (131-2-1) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, z=1, and y is an integer no smaller than $R_{\#(2c),z}+1$ and no greater than $r_{\#(2c),z}$.

[Math. 141]

When $(2\times f-1)-\alpha_{\#(2c),z,y}-1\geq 0$:

$$H_{com}[2\times(2\times f-1)][4\times((2\times f-1)-\alpha_{\#(2c),z,y}-1)+z]=1 \quad (141\text{-}1)$$

For all u being an integer no smaller than one satisfying $\{u\neq(2\times f-1)-\alpha_{\#(2c),z,y}\}$ (where y is an integer no smaller than $R_{\#(2c),z}+1$ and no greater than $r_{\#(2c),z}$;

$$H_{com}[2\times(2\times f-1)][4\times(u-1)+z]=0 \quad (141\text{-}2)$$

The following holds true for $X_2$. In the following, w=2.

[Math. 142]

$$H_{com}[2\times(2\times f-1)][4\times((2\times f-1)-0-1)+w]=1 \quad (142\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)][4\times((2\times f-1)-\alpha_{\#(2c),w,y}-1)+w]=1 \quad (142\text{-}2)$$

For all u being an integer no smaller than one satisfying $\{u\neq(2\times f-1)-0$ and $u\neq(2\times f-1)-\alpha_{\#(2c),w,y}\}$ (where y is an integer no smaller than one and no greater than $R_{\#(2c),w}$);

$$H_{com}[2\times(2\times f-1)][4\times(u-1)+w]=0 \quad (142\text{-}3)$$

The following holds true for $P_1$.

[Math. 143]

When $(2\times f-1)-\beta_{\#(2c),2}-1\geq 0$:

$$H_{com}[2\times(2\times f-1)][4\times((2\times f-1)-\beta_{\#(2c),2}-1)+3]=1 \quad (143\text{-}1)$$

For all u being an integer no smaller than one satisfying $\{u\neq(2\times f-1)-\beta_{\#(2c),2}\}$;

$$H_{com}[2\times(2\times f-1)][4\times(u-1)+3]=0 \quad (143\text{-}2)$$

The following holds true for $P_2$.

[Math. 144]

$$H_{com}[2\times(2\times f-1)][4\times((2\times f-1)-0-1)+4]=1 \quad (144\text{-}1)$$

For all u being an integer no smaller than one satisfying $\{u\neq(2\times f-1)-0\}$;

$$H_{com}[2\times(2\times f-1)][4\times(u-1)+4]=0 \quad (144\text{-}2)$$

Further, (4) when g=2×f−1 (where f is an integer no smaller than one), when a vector for row 2×(2×f−1) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (131-2-2), $(2\times f-1)-1)\%2m=2c$ holds true. Accordingly, a parity check polynomial satisfying zero of expression (131-2-2) where $2i=2c$ holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, z=1, and y is an integer no smaller than $R_{\#(2c),z}+1$ and no greater than $r_{\#(2c),z}$.

[Math. 145]

When $(2\times f-1)-\alpha_{\#(2c),z,y}-1\geq 0$:

$$H_{com}[2\times(2\times f-1)][4\times((2\times f-1)-\alpha_{\#(2c),z,y}-1)+z]=1 \quad (145\text{-}1)$$

For all u being an integer no smaller than one satisfying $\{u\neq(2\times f-1)-\alpha_{\#(2c),z,y}\}$ (where y is an integer no smaller than $R_{\#(2c),z}+1$ and no greater than $r_{\#(2c),z}$);

$$H_{com}[2\times(2\times f-1)][4\times(u-1)+z]=0 \quad (145\text{-}2)$$

The following holds true for $X_2$. In the following, w=2.

[Math. 146]

$$H_{com}[2\times(2\times f-1)][4\times((2\times f-1)-0-1)+w]=1 \quad (146\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)][4\times((2\times f-1)-\alpha_{\#(2c),w,y}-1)+w]=1 \quad (146\text{-}2)$$

For all u being an integer no smaller than one satisfying $\{u\neq(2\times f-1)-0\}$ and $u\neq(2\times f-1)-\alpha_{\#(2c),w,y}\}$ (where y is an integer no smaller than one and no greater than $R_{\#(2c),w}$);

$$H_{com}[2\times(2\times f-1)][4\times(u-1)+w]=0 \quad (146\text{-}3)$$

The following holds true for $P_1$.

[Math. 147]

For all u being an integer no smaller than one;

$$H_{com}[2\times(2\times f-1)][4\times(u-1)+3]=0 \quad (147)$$

The following holds true for $P_2$.

[Math. 114]

$$H_{com}[2\times(2\times f-1)][4\times((2\times f-1)-0-1)+4]=1 \quad (148\text{-}1)$$

When $(2\times f-1)-\beta_{\#(2c),3}-1\geq 0$:

$$H_{com}[2\times(2\times f-1)][4\times((2\times f-1)-\beta_{\#(2c),3}-1)+4]=1 \quad (148\text{-}2)$$

For all u being an integer no smaller than one satisfying $\{u\neq(2\times f-1)-0$ and $u\neq(2\times f-1)-\beta_{\#(2c),3}\}$;

$$H_{com}[2\times(2\times f-1)][4\times(u-1)+4]=0 \quad (148\text{-}3)$$

Further, (5) when g=2×f (where f is an integer no smaller than one), when a vector for row 2×(2×f)−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (132-1-1), $((2\times f)-1)\%2m=2d+1$ holds true. Accordingly, a parity check polynomial satisfying zero of expression (132-1-1) where $2i+1=2d+1$ holds true (where d is an integer no smaller than zero and no greater than m−1).

Accordingly, component $H_{com}[2\times g-1][v]=H_0[2\times(2\times f)-1][v]$ in row 2×g−1, or that is, row 2×(2×f)−1 of the parity check matrix H, which is for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, z=1, and y is an integer no smaller than $R_{\#(2d+1),z}+1$ and no greater than $r_{\#(2d+1),z}$.

[Math. 149]

When $(2\times f)-\alpha_{\#(2d+1),z,y}-1\geq 0$:

$$H_{com}[2\times(2\times f)-1][4\times((2\times f)-\alpha_{\#(2d+1),z,y}-1)+z]=1 \quad (149\text{-}1)$$

For all u being an integer no smaller than one satisfying $\{u\neq(2\times f)-\alpha_{\#(2d+1),z,y}\}$ (where y is an integer no smaller than $R_{\#(2d+1),z}+1$ and no greater than $r_{\#(2d+1),z}$);

$$H_{com}[2\times(2\times f)-1][4\times(u-1)+z]=0 \quad (149\text{-}2)$$

The following holds true for $X_2$. In the following, w=2.

[Math. 150]

$$H_{com}[2\times(2\times f)-1][4\times((2\times f)-0-1)+w]=1 \quad (150\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)-1][4\times((2\times f)-\alpha_{\#(2d+1),w,y}-1)+w]=1 \quad (150\text{-}2)$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$);

$$H_{com}[2\times(2\times f)-1][4\times(u-1)+w]=0 \quad (150\text{-}3)$$

The following holds true for $P_1$.

[Math. 151]

$$H_{com}[2\times(2\times f)-1][4\times((2\times f)-0-1)+3]=1 \quad (151\text{-}1)$$

For all u being an integer no smaller than one satisfying $\{u\neq(2\times f)-0\}$;

$$H_{com}[2\times(2\times f)-1][4\times(u-1)+3]=0 \quad (151\text{-}2)$$

The following holds true for $P_2$.

[Math. 152]

When $(2\times f)-\beta_{\#(2d+1),0}-1\geq 0$:

$$H_{com}[2\times(2\times f)-1][4\times((2\times f)-\beta_{\#(2d+1),0}-1)+4]=1 \quad (152\text{-}1)$$

For all u being an integer no smaller than one satisfying $\{u\neq(2\times f)-\beta_{\#(2d+1),0}\}$;

$$H_{com}[2\times(2\times f)-1][4\times(u-1)+4]=0 \quad (152\text{-}2)$$

Further, (6) when g=2×f (where f is an integer no smaller than one), when a vector for row 2×(2×f)−1 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (132-1-2), ((2×f)−1) %2m=2d+1 holds true. Accordingly, a parity check polynomial satisfying zero of expression (132-1-2) where 2i+1=2d+1 holds true (where d is an integer no smaller than zero and no greater than m−1).

Accordingly, component $H_{com}[2\times g-1][v]=H_0[2\times(2\times f)-1][v]$ in row 2×g−1, or that is, row 2×(2×f)−1 of the parity check matrix H, which is for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, z=1, and y is an integer no smaller than $R_{\#(2d+1),z}+1$ and no greater than $r_{\#(2d+1),z}$.

[Math. 153]

When $(2\times f)-\alpha_{\#(2d+1),z,y}-1\geq 0$:

$$H_{com}[2\times(2\times f)-1][4\times((2\times f)-\alpha_{\#(2d+1),z,y}-1)+z]=1 \tag{153-1}$$

For all u being an integer no smaller than one satisfying $\{u\neq(2\times f)-\alpha_{\#(2d+1),z,y}\}$ (where y is an integer no smaller than $R_{\#(2d+1),z}+1$ and no greater than $r_{\#(2d+1),z}$);

$$H_{com}[2\times(2\times f)-1][4\times(u-1)+z]=0 \tag{153-2}$$

The following holds true for $X_2$. In the following, w=2.

[Math. 154]

$$H_{com}[2\times(2\times f)-1][4\times((2\times f)-0-1)+w]=1 \tag{154-1}$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)-1][4\times((2\times f)-\alpha_{\#(2d+1),w,1}-1)+w]=1 \tag{154-2}$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$);

$$H_{com}[2\times(2\times f)-1][4\times(u-1)+w]=0 \tag{154-3}$$

The following holds true for $P_1$.

[Math. 155]

$$H_{com}[2\times(2\times f)-1][4\times((2\times f)-0-1)+3]=1 \tag{155-1}$$

When $(2\times f)-\beta_{\#(2d+1),1}-1\geq 0$:

$$H_{com}[2\times(2\times f)-1][4\times((2\times f)-\beta_{\#(2d+1),1}-1)+3]=1 \tag{155-2}$$

For all u being an integer no smaller than one satisfying $\{u\neq(2\times f)-0 \text{ and } u\neq(2\times f)-\beta_{\#(2d+1),1}\}$;

$$H_{com}[2\times(2\times f)-1][4\times(u-1)+3]=0 \tag{155-3}$$

The following holds true for $P_2$.

[Math. 156]

For all u being an integer no smaller than one;

$$H_{com}[2\times(2\times f)-1][4\times(u-1)+4]=0 \tag{156}$$

Further, (7) when g=2×f (where f is an integer no smaller than one), when a vector for row 2×(2×0 of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (132-2-1), ((2×f)−1) %2m=2d+1 holds true. Accordingly, a parity check polynomial satisfying zero of expression (132-2-1) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, w=1.

[Math. 157]

$$H_{com}[2\times(2\times f)][4\times((2\times f)-0-1)+w]=1 \tag{157-1}$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)][4\times((2\times f)-\alpha_{\#(2d+1),w,y}-1)+w]=1 \tag{157-2}$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$);

$$H_{com}[2\times(2\times f)][4\times(u-1)+w]=0 \tag{157-3}$$

The following holds true for $X_2$. In the following, z=2, and y is an integer no smaller than $R_{\#(2d+1),z}+1$ and no greater than $r_{\#(2d+1),z}$.

[Math. 158]

When $(2\times f)-\alpha_{\#(2d+1),z,y}-1\geq 0$:

$$H_{com}[2\times(2\times f)][4\times((2\times f)-\alpha_{\#(2d+1),z,y}-1)+z]=1 \tag{158-1}$$

For all u being an integer no smaller than one satisfying $\{u\neq(2\times f)-\alpha_{\#(2d+1),z,y}\}$ (where y is an integer no smaller than $R_{\#(2d+1),z}+1$ and no greater than $r_{\#(2d+1),z}$);

$$H_{com}[2\times(2\times f)][4\times(u-1)+z]=0 \tag{158-2}$$

The following holds true for $P_1$.

[Math. 159]

When $(2\times f)-\beta_{\#(2d+1),2}-1\geq 0$;

$$H_{com}[2\times(2\times f)][4\times((2\times f)-\beta_{\#(2d+1),2}-1)+3]=1 \tag{159-1}$$

For all u being an integer no smaller than one satisfying $\{u\neq(2\times f)-\beta_{\#(2d+1),2}\}$;

$$H_{com}[2\times(2\times f)][4\times(u-1)+3]=0 \tag{159-2}$$

The following holds true for $P_2$.

[Math. 160]

$$H_{com}[2\times(2\times f)][4\times((2\times f)-0-1)+4]=1 \tag{160-1}$$

For all u being an integer no smaller than one satisfying $\{u \neq (2\times f)-0\}$;

$$H_{com}[2\times(2\times f)][4\times(u-1)+4]=0 \quad (160\text{-}2)$$

Further, (8) when g=2×f (where f is an integer no smaller than one), when a vector for row 2×(2×f) of the parity check matrix H, which is for an LDPC-CC of coding rate 2/4 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (132-2-2), ((2×f)−1) %2m=2d+1 holds true. Accordingly, a parity check polynomial satisfying zero of expression (132-2-2) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 2/4 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, w=1.

[Math. 161]

$$H_{com}[2\times(2\times f)][4\times((2\times f)-0-1)+w]=1 \quad (161\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)][4\times((2\times f)-\alpha_{\#(2d+1),w,y}-1)+w]=1 \quad (161\text{-}2)$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$);

$$H_{com}[2\times(2\times f)][4\times(u-1)+w]=0 \quad (161\text{-}3)$$

The following holds true for $X_2$. In the following, z=2, and y is an integer no smaller than $R_{\#(2d+1),z}+1$ and no greater than $r_{\#(2d+1),z}$.

[Math. 162]

When $(2\times f)-\alpha_{\#(2d+1),z,y}-1\geq 0$:

$$H_{com}[2\times(2\times f)][4\times((2\times f)-\alpha_{\#(2d+1),z,y}-1)+z]=1 \quad (162\text{-}1)$$

For all u being an integer no smaller than one satisfying $\{u\neq(2\times f)-\alpha_{\#(2d+1),z,y}\}$ (Where y is an integer no smaller than $R_{\#(2d+1),z}+1$ and no greater than $r_{\#(2d+1),z}$);

$$H_{com}[2\times(2\times f)][4\times(u-1)+z]=0 \quad (162\text{-}2)$$

The following holds true for $P_1$.

[Math. 163]

For all u being an integer no smaller than one;

$$H_{com}[2\times(2\times f)][4\times(u-1)+3]=0 \quad (163)$$

The following holds true for $P_2$.

[Math. 164]

$$H_{com}[2\times(2\times f)][4\times((2\times f)-0-1)+4]=1 \quad (164\text{-}1)$$

When $(2\times f)-\beta_{\#(2d+1),3}-1\geq 0$:

$$H_{com}[2\times(2\times f)][4\times((2\times f)-\beta_{\#(2d+1),3}-1)+4]=1 \quad (164\text{-}2)$$

For all u being an integer no smaller than one satisfying $\{u\neq(2\times f)-0$ and $u\neq(2\times f)-\beta_{\#(2d+1),3}\}$;

$$H_{com}[2\times(2\times f)][4\times(u-1)+4]=0 \quad (164\text{-}3)$$

As such, an LDPC-CC of coding rate 2/4 and time-varying period 2×m that is based on a parity check polynomial can be generated by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, and the code so generated achieves high error correction capability.

Embodiment 3

In the present embodiment, description is provided of a device that uses the LDPC-CC of coding rate 2/4 that is based on a parity check polynomial, description of which has been provided in embodiments 1 and 2.

As one example, description is provided of a case where the LDPC-CC of coding rate 2/4 that is based on a parity check polynomial, description of which has been provided in embodiments 1 and 2, is applied to a communication device.

FIG. 22 illustrates the structures of a transmitting device 2200 and a receiving device 2210 in the communication device pertaining to the present embodiment.

An encoder 2201 receives information to be transmitted as input, and is capable of performing various types of encoding. In particular, when receiving a specification to perform encoding by using the LDPC-CC of coding rate 2/4 that is based on a parity check polynomial, description of which has been provided in embodiments 1 and 2, the encoder 2201 performs encoding by using the LDPC-CC of coding rate 2/4 that is based on a parity check polynomial, description of which has been provided in embodiments 1 and 2, to calculate parities $P_1$ and $P_2$. Further, the encoder 2201 outputs the information to be transmitted and the parities $P_1$ and $P_2$ as a transmission sequence.

A modulator 2202 receives the transmission sequence, which includes the information to be transmitted and the parities $P_1$ and $P_2$, performs mapping based on a predetermined modulation scheme (e.g., BPSK, QPSK, 16QAM, 64QAM), and outputs a baseband signal. Further, the modulator 2202 may also receive information other than the transmission sequence, which includes the information to be transmitted and the parities $P_1$ and $P_2$, as input, perform mapping, and output a baseband signal. For example, the modulator 2202 may receive control information as input.

The transmitting device outputs a transmission signal after performing predetermined signal processing (e.g., signal processing for generation of an OFDM signal, frequency conversion, amplification) with respect to such signals (e.g., baseband signals, pilot signals). The transmitting device may transmit the transmission signal over a wireless transmission path utilizing electromagnetic waves, or over a wired transmission path utilizing a coaxial cable, a power line, an optical cable, or the like.

The transmission signal is received by the receiving device 2210 after travelling over the transmission path. A receiver 2211 receives a reception signal as input, performs predetermined signal processing (e.g., bandwidth limitation, frequency conversion, signal processing for OFDM, frequency offset estimation, signal detection, channel estimation), and outputs a baseband signal and a channel estimation signal.

A log-likelihood ratio generation section 2212 receives the baseband signal and the channel estimation signal as input (may receive other signals as input), and for example, calculates and outputs a log-likelihood ratio for each bit (may calculate and output a hard value (hard decision value)).

A decoder 2213 receives the log-likelihood ratio for each bit as input, performs belief propagation decoding (e.g., sum-product decoding, scheduled sum-product decoding (Layered BP (belief propagation) decoding), min-sum decoding, Normalized BP decoding, offset BP decoding), and outputs an estimation sequence. The decoder 2213 performs the belief propagation decoding based on the parity check matrix for the LDPC-CC of coding rate 2/4 that is based on a parity check polynomial, description of which has been provided in embodiments 1 and 2.

Figure 40:
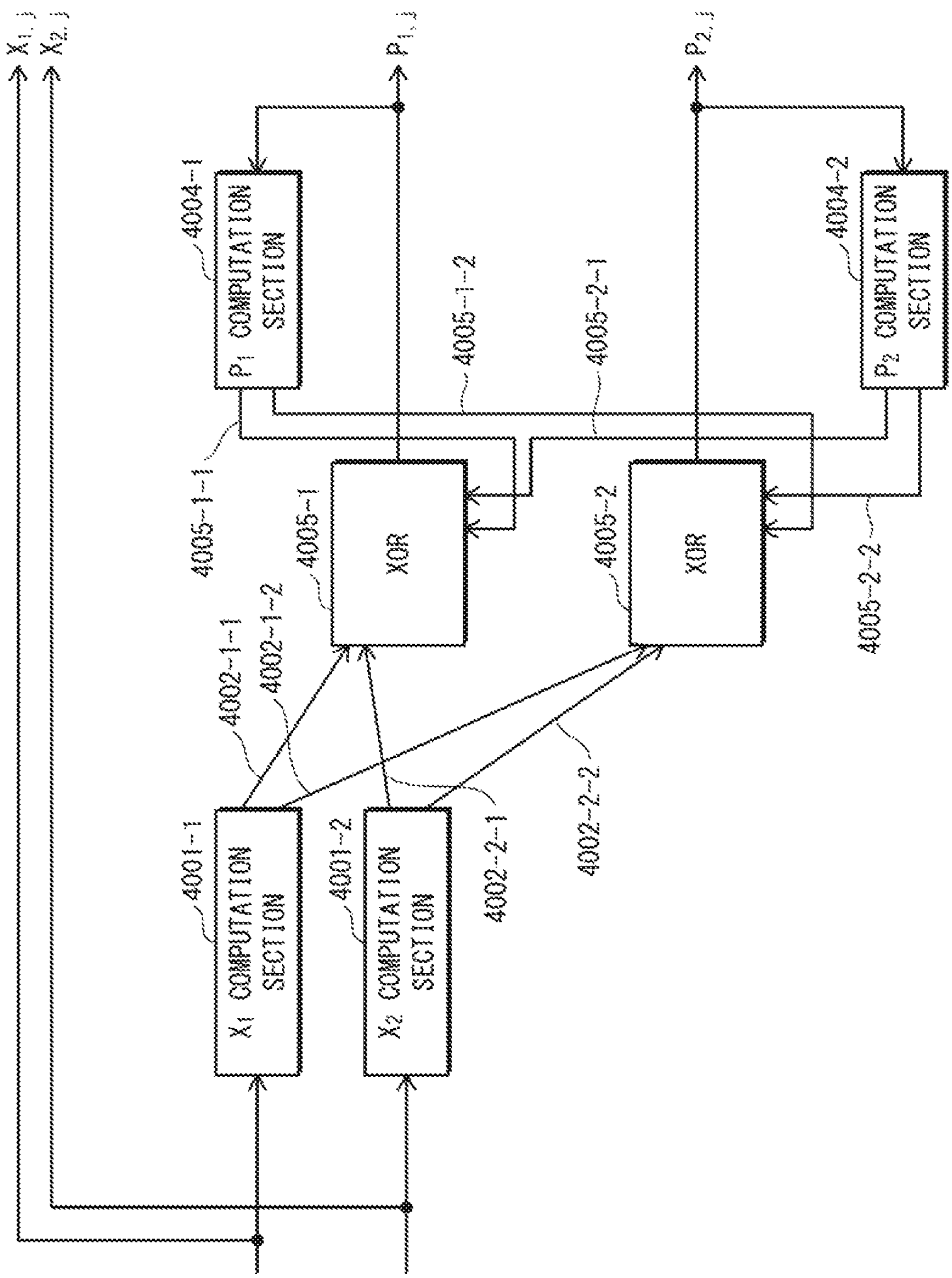
FIG. 40 shows an example of the configuration of an encoder for LDPC-CC of coding rate 2/4 that is based on a parity check polynomial.

FIG. 40 illustrates one example of the structure of an encoder for the LDPC-CC of coding rate 2/4 that is based on a parity check polynomial, description of which has been provided in embodiments 1 and 2. Description on such an encoder has been provided with reference to the encoder 2201 in FIG. 22.

In FIG. 40, an $X_z$ computation section 4001-*z* (where z is an integer no smaller than one and no greater than two) includes a plurality of shift registers that are connected in series and a calculator that performs XOR calculation on bits collected from some of the shift registers (refer to FIGS. 2 and 22).

The $X_z$ computation section 4001-*z* receives an information bit $X_{z,j}$ at time point j as input, performs the XOR calculation, and outputs bits 4002-*z*−1 and 4002-*z*−2, which are acquired through the $X_z$ calculation.

A $P_1$ computation section 4004-1 includes a plurality of shift registers that are connected in series and a calculator that that performs XOR calculation on bits collected from some of the shift registers (refer to FIGS. 2 and 22).

The $P_1$ computation section 4004-1 receives a bit $P_{1,j}$ of parity $P_1$ at time point j as input, performs the XOR calculation, and outputs bits 4005-1-1 and 4005-1-2, which are acquired through the $P_1$ calculation.

A $P_2$ computation section 4004-2 includes a plurality of shift registers that are connected in series and a calculator that that performs XOR calculation on bits collected from some of the shift registers (refer to FIGS. 2 and 22).

The $P_2$ computation section 4004-2 receives a bit $P_{2,j}$ of parity $P_2$ at time point j as input, performs the XOR calculation, and outputs bits 4005-2-1 and 4005-2-2, which are acquired through the $P_2$ calculation.

An XOR (calculator) 4005-1 receives the bit 4002-1-1 acquired by $X_1$ calculation, the bit 4002-2-1 acquired by $X_2$ calculation, the bit 4005-1-1 acquired by $P_1$ calculation, and the bit 4005-2-1 acquired by the $P_2$ calculation as input, performs XOR calculation, and outputs a bit $P_{1,j}$ of parity $P_1$ at time point j.

An XOR (calculator) 4005-2 receives the bit 4002-1-2 acquired by $X_1$ calculation, the bit 4002-2-2 acquired by $X_2$ calculation, the bit 4005-1-2 acquired by $P_1$ calculation, and the bit 4005-2-2 acquired by the $P_2$ calculation as input, performs XOR calculation, and outputs a bit $P_{2,j}$ of parity $P_2$ at time point j.

It is preferable that initial values of the shift registers of the $X_z$ computation section 4001-*z*, the $P_1$ computation section 4004-1, and the $P_2$ computation section 4004-2 illustrated in FIG. 40 be set to "0" (zero). By making such a configuration, it becomes unnecessary to transmit to the receiving device parities $P_1$ and $P_2$ before the setting of initial values.

The following describes a method of information-zero termination.

Figure 41:
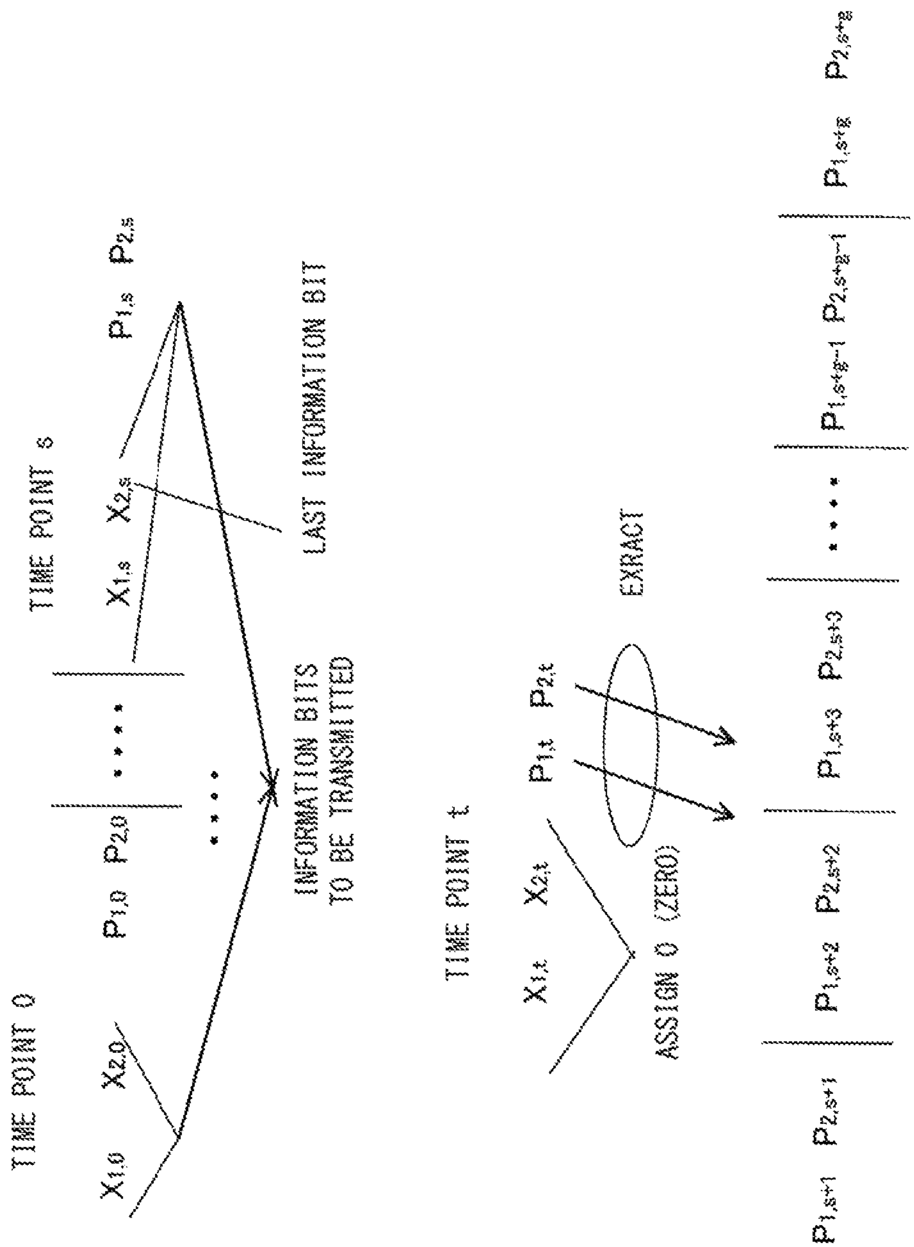
FIG. 41 is a diagram for explaining a zero-termination method.

Suppose that in FIG. 41, information $X_1$ and information $X_2$ exist from time point 0, and information $X_2$ at time point s (where s is an integer no smaller than zero) is the last information bit. That is, suppose that the information to be transmitted from the transmitting device to the receiving device is information $X_{1,j}$ and information $X_{2,j}$, being information $X_1$ and information $X_2$ at time point j, respectively, where j is an integer no smaller than zero and no greater than s.

In such a case, the transmitting device transmits information $X_1$, information $X_2$, parity $P_1$, and parity $P_2$ from time point 0 to time point s, or that is, transmits $X_{1,j}$, $P_{1,j}$, $P_{2,j}$, where j is an integer no smaller than zero and no greater than s. (Note that $P_{1,j}$ and $P_{2,j}$ denote parity $P_1$ and parity $P_2$ at time point j, respectively.)

Further, suppose that information $X_1$ and information $X_2$ from time point s+1 to time point s+g (where g is an integer no smaller than one) is "0", or that is, when denoting information $X_1$ and information $X_2$ at time point t as $X_{1,t}$, $X_{2,t}$, respectively, $X_{1,t}=0$ and $X_{2,t}=0$ hold true for t being an integer no smaller than s+1 and no greater than s+g. The transmitting device, by performing encoding, acquires parities $P_{1,t}$ and $P_{2,t}$ for t being an integer no smaller than s+1 and no greater than s+g. The transmitting device, in addition to the information and parities described above, transmits parities $P_{1,t}$ and $P_{2,t}$ for t being an integer no smaller than s+1 and no greater than s+g.

Meanwhile, the receiving device performs decoding by using log-likelihood ratios for the information and the parities transmitted by the transmitting device, and log-likelihood ratios corresponding to $X_{1,t}=0$ and $X_{2,t}=0$ for t being an integer no smaller than s+1 and no greater than s+g, and thereby acquires an estimation sequence of information.

Figure 42:
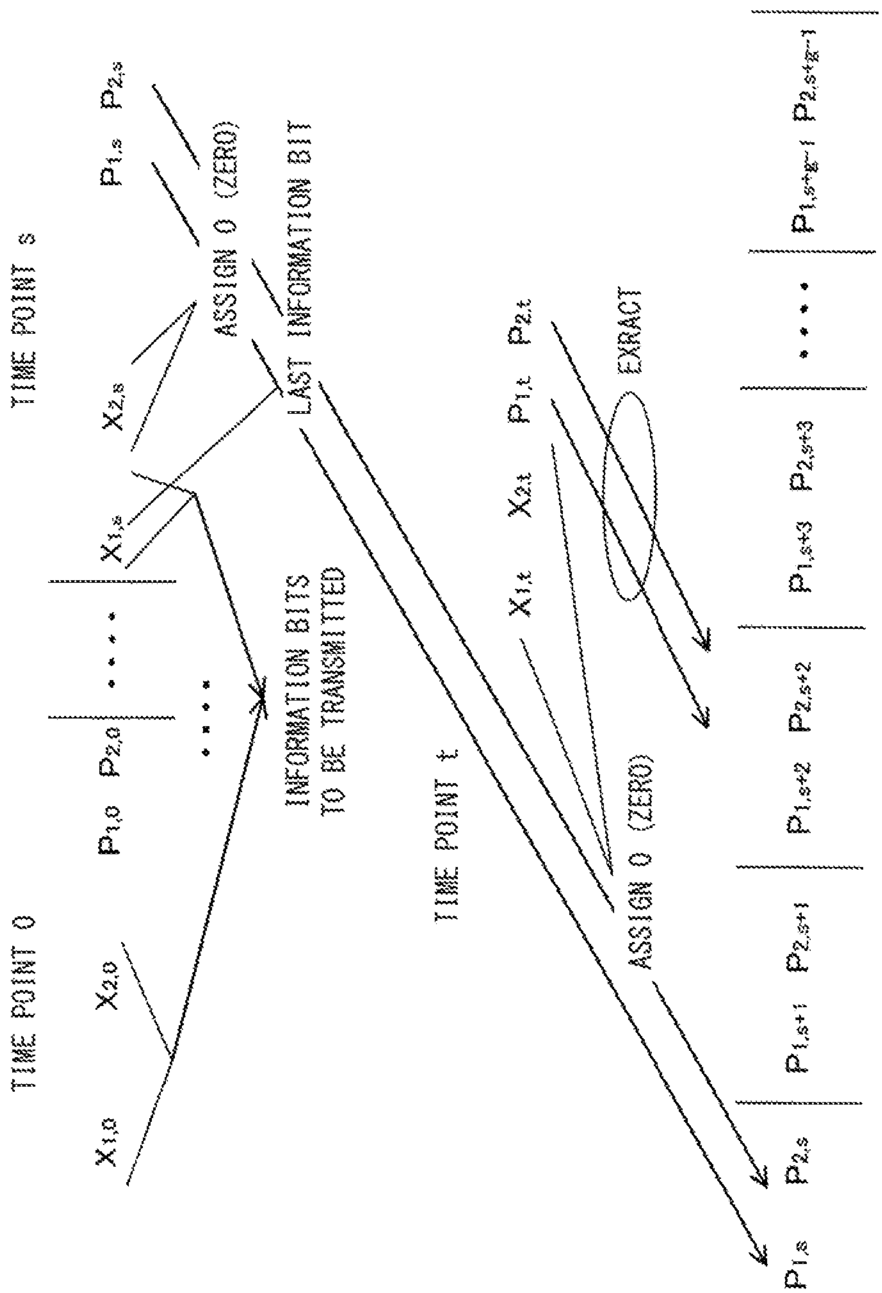
FIG. 42 is a diagram for explaining a zero-termination method.

FIG. 42 illustrates an example differing from that illustrated in FIG. 41. Suppose that information $X_1$ and information $X_2$ exist from time point 0, and information $X_f$ for time point s (where s is an integer no smaller than zero) is the last information bit. Here, f equals one. In FIG. 41, f equals 2. That is, suppose that the information to be transmitted from the transmitting device to the receiving device is information $X_{i,s}$, where i is an integer no smaller than one and no greater than f, and information $X_{1,j}$ and information $X_{2,j}$, being information $X_1$ and information $X_2$ at time point j, respectively, where j is an integer no smaller than zero and no greater than s−1.

In such a case, the transmitting device transmits information $X_1$, information $X_2$, parity $P_1$, and parity $P_2$ from time point 0 to time point s−1, or that is, transmits $X_{1,j}$, $X_{2,j}$, $P_{1,j}$, $P_{2,j}$, where j is an integer no smaller than zero and no greater than s−1. (Note that $P_{1,j}$ and $P_{2,j}$ denote parity $P_1$ and parity $P_2$ at time point j, respectively.)

Further, suppose that at time point s, information $X_{i,s}$, when i is an integer no smaller than one and no greater than f, is information that the transmitting device is to transmit, and suppose that $X_{k,s}$, when k is an integer equaling f+1, equals "0" (zero).

Further, suppose that information $X_1$ and information $X_2$ from time point s+1 to time point s+g−1 (where g is an integer no smaller than two) is "0", or that is, when denoting information $X_1$ and information $X_2$ at time point t as $X_{1,t}$, $X_{2,t}$, respectively, $X_{1,t}=0$ and $X_{2,t}=0$ hold true when t is an integer no smaller than s+1 and no greater than s+g−1. The transmitting device, by performing encoding from time point s to time point s+g−1, acquires parities $P_{1,u}$ and $P_{2,u}$ for u being an integer no smaller than s and no greater than s+g−1. The transmitting device, in addition to the information and parities described above, transmits $X_{i,s}$ for i being an integer no smaller than one and no greater than f, and parities $P_{1,u}$ and $P_{2,u}$ for u being an integer no smaller than s and no greater than s+g−1.

Meanwhile, the receiving device performs decoding by using log-likelihood ratios for the information and the parities transmitted by the transmitting device, log-likelihood ratios corresponding to $X_{k,s}=0$ (where k is an integer equaling f+1) and log-likelihood ratios corresponding to $X_{1,t}=0$ and $X_{2,t}=0$ for t being an integer no smaller than s+1 and no greater than s+g−1, and thereby acquires an estimation sequence of information.

Although description is provided above taking an example where error correction coding is introduced to a communication device, the error correction coding described above is not limited to being introduced to a communication device, and for example, may be introduced to a storage medium (storage). When making such a modification, information that is to be stored to a storage medium (storage) is encoded by using the LDPC-CC of coding rate 2/4 that is based on a parity check polynomial, description of which has been provided in embodiments 1 and 2, and resultant information and parities are stored to the storage medium (storage). When making such a modification, it is preferable that information-zero termination be introduced as described above and that a data sequence as described above corresponding to a data sequence (information and parities) transmitted by the transmitting device when information-zero termination is applied be stored to the storage medium (storage).

Further, the LDPC-CC of coding rate 2/4 that is based on a parity check polynomial, description of which has been provided in embodiments 1 and 2, is applicable to any device that requires error correction coding (e.g., a memory, a hard disk).

Embodiment 4

In the present embodiment, description is provided of a method of configuring an LDPC-CC of coding rate 2/4 that uses an improved tail-biting scheme (an LDPC block code using an LDPC-CC). The LDPC-CC of coding rate 2/4 that uses an improved tail-biting scheme described in the present embodiment is based on the LDPC-CC of coding rate 2/4 that is based on a parity check polynomial, description of which has been provided in embodiments 1 and 2.

Patent Literature 2 includes explanation regarding an LDPC-CC of coding rate (n−1)/n (where n is an integer no smaller than two) that uses an improved tail-biting scheme (an LDPC block code using an LDPC-CC). However, Patent Literature 2 poses a problem for not disclosing an LDPC-CC of a coding rate not satisfying (n−1)/n that uses an improved tail-biting scheme (an LDPC block code using an LDPC-CC).

In the present embodiment, as one example of an LDPC-CC of a coding rate not satisfying (n−1)/n that uses an improved tail-biting scheme (an LDPC block code using an LDPC-CC), description is provided of a method of configuring an LDPC-CC of coding rate 2/4 that uses an improved tail-biting scheme (an LDPC block code using an LDPC-CC).

Although coding rate 2/4 equals coding rate 1/2, the LDPC-CC of coding rate 2/4 that uses an improved tail-biting scheme pertaining to the present embodiment differs, in terms of generation method, from a conventional LDPC-CC of coding rate (n−1)/n or a conventional LDPC-CC of coding rate (n−1)/n that uses an improved tail-biting scheme (an LDPC block code using an LDPC-CC).

[Periodic Time-Varying LDPC-CC of Coding Rate 2/4 Using Improved Tail-Biting Scheme and Based on Parity Check Polynomial]

The following describes a periodic time-varying LDPC-CC of coding rate 2/4 that uses an improved tail-biting scheme and is based on a parity check polynomial, based on the configuration of the LDPC-CC of coding rate 2/4 and time-varying period 2m that is based on a parity check polynomial, description of which has been provided in embodiments 1 and 2.

The following describes a method of configuring an LDPC-CC of coding rate 2/4 and time-varying period 2m that is based on a parity check polynomial. Such method has already been described in embodiment 2.

First, the following parity check polynomials satisfying zero are prepared.

[Math. 165]

$$\begin{aligned}&\left(1+\sum_{s=1}^{R_{\#(2i+1),1}} D^{\alpha\#(2i),1,s}\right)X_1(D)+\\&\left(\sum_{s=R_{\#(2i),2}+1}^{r_{\#(2i),2}} D^{\alpha\#(2i),2,s}\right)X_2(D)+P_1(D)+D^{\beta\#(2i),0}P_2(D)=\\&(D^{\alpha\#(2i),1,R_{\#(2i),1}}+\ldots+D^{\alpha\#(2i),1,1}+1)X_1(D)+\\&(D^{\alpha\#(2i),2,r_{\#(2i),2}}+\ldots+D^{\alpha\#(2i),2,R_{\#(2i),2}}+1)X_2(D)+\\&P_1(D)+D^{\beta\#(2i),0}P_2(D)=0\end{aligned} \tag{165-1-1}$$

$$\begin{aligned}&\left(1+\sum_{s=1}^{R_{\#(2i),1}} D^{\alpha\#(2i),1,s}\right)X_1(D)+\\&\left(\sum_{s=R_{\#(2i),2}+1}^{r_{\#(2i),2}} D^{\alpha\#(2i),2,s}\right)X_2(D)+P_1(D)+D^{\beta\#(2i),1}P_1(D)=\\&(D^{\alpha\#(2i),1,R_{\#(2i),1}}+\ldots+D^{\alpha\#(2i),1,1}+1)X_1(D)+\\&(D^{\alpha\#(2i),2,r_{\#(2i),2}}+\ldots+D^{\alpha\#(2i),2,R_{\#(2i),2}}+1)X_2(D)+\\&P_1(D)+D^{\beta\#(2i),1}P_1(D)=0\end{aligned} \tag{165-1-2}$$

$$\begin{aligned}&\left(\sum_{s=R_{\#(2i),1}+1}^{r_{\#(2i),1}} D^{\alpha\#(2i),1,s}\right)X_1(D)+\\&\left(1+\sum_{s=1}^{R_{\#(2i),2}} D^{\alpha\#(2i),2,s}\right)X_2(D)+P_2(D)+D^{\beta\#(2i),2}P_1(D)=\\&(D^{\alpha\#(2i),1,r_{\#(2i),1}}+\ldots+D^{\alpha\#(2i),1,R_{\#(2i),1}}+1)X_1(D)+\\&(D^{\alpha\#(2i),2,R_{\#(2i),2}}+\ldots+D^{\alpha\#(2i),2,1}+1)X_2(D)+\\&P_2(D)+D^{\beta\#(2i),2}P_1(D)=0\end{aligned} \tag{165-2-1}$$

-continued $$\left(\sum_{s=R_{\#(2i),1}+1}^{r_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+P_2(D)+D^{\beta\#(2i),3}P_2(D)=(D^{\alpha\#(2i),1,r_{\#(2i),1}}+\dots+D^{\alpha\#(2i),1,R_{\#(2i),1}}+1)X_1(D)+(D^{\alpha\#(2i),2,R_{\#(2i),2}}+\dots+D^{\alpha\#(2i),2,1}+1)X_2(D)+P_2(D)+D^{\beta\#(2i),3}P_2(D)=0 \quad (165\text{-}2\text{-}2)$$

In expressions (165-1-1), (165-1-2), (165-2-1), (165-2-2), i is an integer no smaller than zero and no greater than m−1 (i=0, 1, . . . , m−2, m−1).

In expressions (165-1-1), (165-1-2), (165-2-1), (165-2-2), $\alpha_{\#(2i),p,q}$ (where p is an integer no smaller than one and no greater than two, q is an integer no smaller than one and no greater than $r_{\#(2i),p}$ (where $r_{\#(2i),p}$ is a natural number)) and $\beta_{\#(2i),0}$ is a natural number, $\beta_{\#(2i),1}$ is a natural number, $\beta_{\#(2i),2}$ is an integer no smaller than zero, and $\beta_{\#(2i),3}$ is a natural number.

Further, $R_{\#(2i),p}$ is a natural number satisfying $1 \le R_{\#(2i),p} < r_{\#(2i),p}$.

Further, y is an integer no smaller than one and no greater than $r_{\#(2i),p,z}$ is an integer no smaller than one and no greater than $r_{\#2i,p}$, and $\alpha_{\#(2i),p,y} \neq \alpha_{\#(2i),p,z}$ holds true for $\forall$(y, z) where y≠z. $\forall$ is a universal quantifier. (y is an integer no smaller than one and no greater than $r_{\#(2i),p,z}$ is an integer no smaller than one and no greater than $r_{\#2i,p}$, and $\alpha_{\#(2i),p,y} \neq \alpha_{\#(2i)p,z}$ holds true for all y and all z satisfying y≠z.)

Note that in the following, to simplify explanation, a parity check polynomial satisfying zero that is expressed by expression (165-1-1) or expression (165-1-2) is referred to as "#(2i); first expression" for realizing a time-varying period 2m, and a parity check polynomial satisfying zero that is expressed by expression (165-2-1) or expression (165-2-2) is referred to as "#(2i); second expression" for realizing a time-varying period 2m.

Thus, for each i, as #(2i); first expression for realizing a time-varying period 2m, a parity check polynomial satisfying zero expressed by either expression (165-1-1) or expression (165-1-2) is prepared.

That is, for i=0, a parity check polynomial satisfying zero provided by expression (165-1-1) where i=0, or a parity check polynomial satisfying zero provided by expression (165-1-2) where i=0 is prepared.

Similarly:

for i=1, a parity check polynomial satisfying zero provided by expression (165-1-1) where i=1, or a parity check polynomial satisfying zero provided by expression (165-1-2) where i=1 is prepared;

for i=2, a parity check polynomial satisfying zero provided by expression (165-1-1) where i=2, or a parity check polynomial satisfying zero provided by expression (165-1-2) where i=2 is prepared;

⋮ for i=z, a parity check polynomial satisfying zero provided by expression (165-1-1) where i=z, or a parity check polynomial satisfying zero provided by expression (165-1-2) where i=z is prepared (where z is an integer no smaller than zero and no greater than m−1); and

⋮ for i=m−1, a parity check polynomial satisfying zero provided by expression (165-1-1) where i=m−1, or a parity check polynomial satisfying zero provided by expression (165-1-2) where i=m−1 is prepared.

Similarly, for each i, as #(2i); second expression for realizing a time-varying period 2m, a parity check polynomial satisfying zero expressed by either expression (165-2-1) or expression (165-2-2) is prepared.

That is, for i=0, a parity check polynomial satisfying zero provided by expression (165-2-1) where i=0, or a parity check polynomial satisfying zero provided by expression (165-2-2) where i=0 is prepared.

Similarly:

for i=1, a parity check polynomial satisfying zero provided by expression (165-2-1) where i=1, or a parity check polynomial satisfying zero provided by expression (165-2-2) where i=1 is prepared;

for i=2, a parity check polynomial satisfying zero provided by expression (165-2-1) where i=2, or a parity check polynomial satisfying zero provided by expression (165-2-2) where i=2 is prepared;

⋮ for i=z, a parity check polynomial satisfying zero provided by expression (165-2-1) where i=z, or a parity check polynomial satisfying zero provided by expression (165-2-2) where i=z is prepared (where z is an integer no smaller than zero and no greater than m−1); and

⋮ for i=m−1, a parity check polynomial satisfying zero provided by expression (165-2-1) where i=m−1, or a parity check polynomial satisfying zero provided by expression (165-2-2) where i=m−1 is prepared.

Similarly, the following parity check polynomials satisfying zero are provided.

[Math. 166]

$$\left(\sum_{s=R_{\#(2i+1),1}+1}^{r_{\#(2i+1),1}} D^{\alpha\#(2i+1),1,s}\right)X_1(D)+\left(1+\sum_{s=1}^{R_{\#(2i+1),2}} D^{\alpha\#(2i+1),2,s}\right)X_2(D)+P_1(D)+D^{\beta\#(2i+1),0}P_2(D)=(D^{\alpha\#(2i+1),1,r_{\#(2i+1),1}}+\dots+D^{\alpha\#(2i+1),1,R_{\#(2i+1),1}}+1)X_1(D)+(D^{\alpha\#(2i+1),2,R_{\#(2i+1),2}}+\dots+D^{\alpha\#(2i+1),2,1}+1)X_2(D)+P_1(D)+D^{\beta\#(2i+1),0}P_2(D)=0 \quad (166\text{-}1\text{-}1)$$

$$\left(\sum_{s=R_{\#(2i+1),1}+1}^{r_{\#(2i+1),1}} D^{\alpha\#(2i+1),1,s}\right)X_1(D)+\left(1+\sum_{s=1}^{R_{\#(2i+1),2}} D^{\alpha\#(2i+1),2,s}\right)X_2(D)+P_1(D)+D^{\beta\#(2i+1),1}P_1(D)=(D^{\alpha\#(2i+1),1,r_{\#(2i+1),1}}+\dots+D^{\alpha\#(2i+1),1,R_{\#(2i+1),1}}+1)X_1(D)+(D^{\alpha\#(2i+1),2,R_{\#(2i+1),2}}+\dots+D^{\alpha\#(2i+1),2,1}+1)X_2(D)+P_1(D)+D^{\beta\#(2i+1),1}P_1(D)=0 \quad (166\text{-}1\text{-}2)$$

-continued $$\left(1+\sum_{s=1}^{R_{\#(2i+1),1}} D^{\alpha\#(2i+1),1,s}\right)X_1(D)+\left(\sum_{s=R_{\#(2i+1),2}+1}^{r_{\#(2i+1),2}} D^{\alpha\#(2i+1),2,s}\right)X_2(D)+P_2(D)+D^{\beta\#(2i+1),2}P_1(D)=$$
$$(D^{\alpha\#(2i+1),1,R_{\#(2i+1),1}}+\ldots+D^{\alpha\#(2i+1),1,1}+1)X_1(D)+(D^{\alpha\#(2i+1),2,r_{\#(2i+1),13}}+\ldots+D^{\alpha\#(2i+1),2,R_{\#(2i+1),2}}+1)X_2(D)+P_2(D)+D^{\beta\#(2i+1),2}P_1(D)=0 \tag{166-2-1}$$

$$\left(1+\sum_{s=1}^{R_{\#(2i+1),1}} D^{\alpha\#(2i+1),1,s}\right)X_1(D)+\left(\sum_{s=R_{\#(2i+1),2}+1}^{r_{\#(2i+1),2}} D^{\alpha\#(2i+1),2,s}\right)X_2(D)+P_2(D)+D^{\beta\#(2i+1),3}P_2(D)=$$
$$(D^{\alpha\#(2i+1),1,R_{\#(2i+1),1}}+\ldots+D^{\alpha\#(2i+1),1,1}+1)X_1(D)+(D^{\alpha\#(2i+1),2,r_{\#(2i+1),13}}+\ldots+D^{\alpha\#(2i+1),2,R_{\#(2i+1),2}}+1)X_2(D)+P_2(D)+D^{\beta\#(2i+1),3}P_2(D)=0 \tag{166-2-2}$$

In expression (166-1-1), (166-1-2), (166-2-1), (166-2-2), i is an integer no smaller than zero and no greater than m−1 (i=0, 1, . . . , m−2, m−1).

In expression (166-1-1), (166-1-2), (166-2-1), (166-2-2), $\alpha_{\#(2i+1),p,q}$ (where p is an integer no smaller than one and no greater than two, q is an integer no smaller than one and no greater than $r_{\#(2i+1)p}$ (where $r_{\#(2i+1),p}$ is a natural number)) and $\beta_{\#(2i+1),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, $R_{\#(2i+1),p}$ is a natural number satisfying $1 \le R_{\#(2i+1),p} < r_{\#(2i+1),p}$.

Further, y is an integer no smaller than one and no greater than $r_{\#(2i+1),p}$, z is an integer no smaller than one and no greater than $r_{\#(2i+1),p}$, and $\alpha_{\#(2i+1),p,y} \ne \alpha_{\#(2i+1),p,z}$ holds true for $^{\forall}$(y, z) where y≠z. ∀ is a universal quantifier. (y is an integer no smaller than one and no greater than $r_{\#(2i+1),p}$, z is an integer no smaller than one and no greater than $r_{\#(2i+1),p}$, and $\alpha_{\#(2i+1),p,y} \ne \alpha_{\#(2i+1),p,z}$ holds true for all y and all z satisfying y≠z.)

Note that in the following, to simplify explanation, a parity check polynomial satisfying zero that is expressed by expression (166-1-1) or expression (166-1-2) is referred to as "#(2i+1); first expression" for realizing a time-varying period 2m, and a parity check polynomial satisfying zero that is expressed by expression (166-2-1) or expression (166-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (166-1-1) or expression (166-1-2) is prepared.

That is, for i=0, a parity check polynomial satisfying zero provided by expression (166-1-1) where i=0, or a parity check polynomial satisfying zero provided by expression (166-1-2) where i=0 is prepared.

Similarly:

for i=1, a parity check polynomial satisfying zero provided by expression (166-1-1) where i=1, or a parity check polynomial satisfying zero provided by expression (166-1-2) where i=1 is prepared;

for i=2, a parity check polynomial satisfying zero provided by expression (166-1-1) where i=2, or a parity check polynomial satisfying zero provided by expression (166-1-2) where i=2 is prepared;

⋮ for i=z, a parity check polynomial satisfying zero provided by expression (166-1-1) where i=z, or a parity check polynomial satisfying zero provided by expression (166-1-2) where i=z is prepared (where z is an integer no smaller than zero and no greater than m−1); and

⋮ for i=m−1, a parity check polynomial satisfying zero provided by expression (166-1-1) where i=m−1, or a parity check polynomial satisfying zero provided by expression (166-1-2) where i=m−1 is prepared.

Similarly, for each i, as #(2i+1); second expression for realizing a time-varying period 2m, a parity check polynomial satisfying zero expressed by either expression (166-2-1) or expression (166-2-2) is prepared.

That is, for i=0, a parity check polynomial satisfying zero provided by expression (166-2-1) where i=0, or a parity check polynomial satisfying zero provided by expression (166-2-2) where i=0 is prepared.

Similarly:

for i=1, a parity check polynomial satisfying zero provided by expression (166-2-1) where i=1, or a parity check polynomial satisfying zero provided by expression (166-2-2) where i=1 is prepared;

for i=2, a parity check polynomial satisfying zero provided by expression (166-2-1) where i=2, or a parity check polynomial satisfying zero provided by expression (166-2-2) where i=2 is prepared;

⋮ for i=z, a parity check polynomial satisfying zero provided by expression (166-2-1) where i=z, or a parity check polynomial satisfying zero provided by expression (166-2-2) where i=z is prepared (where z is an integer no smaller than zero and no greater than m−1); and

⋮ for i=m−1, a parity check polynomial satisfying zero provided by expression (166-2-1) where i=m−1, or a parity check polynomial satisfying zero provided by expression (166-2-2) where i=m−1 is prepared.

As such, an LDPC-CC of coding rate 2/4 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (165-1-1) or expression (165-1-2), parity check polynomials satisfying zero provided by expression (165-2-1) or expression (165-2-2), parity check polynomials satisfying zero provided by expression (166-1-1) or expression (166-1-2), and parity check polynomials satisfying zero provided by expression (166-2-1) or expression (166-2-2).

For example, the time varying period 2×m is formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expression (165-1-1), (165-1-2), (165-2-1), (165-2-2), (166-1-1), (166-1-2), (166-2-1), and (166-2-2) (where j is an integer no smaller than zero).

The following presumes that 2k=j%2m holds true. In the following, % means a modulo, and for example, $\alpha\%6$ represents a remainder after dividing $\alpha$ by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

Note that in the parity check polynomials satisfying zero of expression (165-1-1), (165-1-2), (165-2-1), (165-2-2), (166-1-1), (166-1-2), (166-2-1), and (166-2-2), a sum of the number of terms of $P_1(D)$ and the number of terms of $P_2(D)$ equals two. This realizes sequentially finding parities $P_1$ and $P_2$ when applying an improved tail-biting scheme, and thus, is a significant factor realizing a reduction in computation amount (circuit scale).

The following describes the relationship between the time-varying period of the parity check polynomials satisfying zero for the LDPC-CC of coding rate 2/4 and time-varying period 2m that is based on a parity check polynomial, description of which has been provided in embodiments 1 and 2 and on which the LDPC-CC of coding rate 2/4 that uses an improved tail-biting scheme (an LDPC block code using an LDPC-CC) is based, and block size in the LDPC-CC of coding rate 2/4 that uses an improved tail-biting scheme (an LDPC block code using an LDPC-CC) proposed in the present embodiment.

Regarding this point, in order to achieve error correction capability of even higher level, a configuration is preferable where a Tanner graph formed by the LDPC-CC of coding rate 2/4 and time-varying period 2m that is based on a parity check polynomial, description of which has been provided in embodiments 1 and 2 and on which the LDPC-CC of coding rate 2/4 that uses an improved tail-biting scheme (an LDPC block code using an LDPC-CC) is based, resembles a Tanner graph of the LDPC-CC of coding rate 2/4 that uses an improved tail-biting scheme (an LDPC block code using an LDPC-CC). Thus, the following conditions are significant.

<Condition #N1>

The number of rows in a parity check matrix for the LDPC-CC of coding rate 2/4 that uses an improved tail-biting scheme (an LDPC block code using an LDPC-CC) is a multiple of 4×m.

Accordingly, the number of columns in the parity check matrix for the LDPC-CC of coding rate 2/4 that uses an improved tail-biting scheme (an LDPC block code using an LDPC-CC) is a multiple of 4×2×m. According to this condition, (for example) a log-likelihood ratio that is necessary in decoding is a log-likelihood ratio of the number of columns in the parity check matrix for the LDPC-CC of coding rate 2/4 that uses an improved tail-biting scheme (an LDPC block code using an LDPC-CC).

Note that the relationship between the LDPC-CC of coding rate 2/4 that uses an improved tail-biting scheme (an LDPC block code using an LDPC-CC) and the LDPC-CC of coding rate 2/4 and time-varying period 2m that is based on a parity check polynomial, description of which has been provided in embodiments 1 and 2 and on which the LDPC-CC of coding rate 2/4 that uses an improved tail-biting scheme (an LDPC block code using an LDPC-CC) is based, is described in detail later in the present disclosure.

Thus, when denoting the parity check matrix for the LDPC-CC of coding rate 2/4 that uses an improved tail-biting scheme (an LDPC block code using an LDPC-CC) as $H_{pro}$, the number of columns of $H_{pro}$ can be expressed as 4×2×m×z (where z is a natural number).

Accordingly, a transmission sequence (encoded sequence (codeword)) $v_s$ of block s of the LDPC-CC of coding rate 2/4 that uses an improved tail-biting scheme (an LDPC block code using an LDPC-CC) can be expressed as $v_s=(X_{s,1,1}, X_{s,2,1}, P^{pro}_{s,1,1}, P^{pro}_{s,2,1}, X_{s,1,2}, X_{s,2,2}, P^{pro}_{s,1,2}, P^{pro}_{s,2,2}, \ldots, X_{s,1,k}, X_{s,2,1}, P^{pro}_{s,1,k}, P^{pro}_{s,2,k}, \ldots, X_{s,1,2\times m\times z}, X_{s,2,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}v_s$ are zeroes).

$X_{s,j,k}$ (where j is an integer no smaller than one and no greater than two) is a bit of information $X_j$, $P^{pro}_{s,1,k}$ is a bit of parity $P_1$ of the LDPC-CC of coding rate 2/4 that uses an improved tail-biting scheme (an LDPC block code using an LDPC-CC), and $P^{pro}_{s,2,k}$ is a bit of parity $P_2$ of the LDPC-CC of coding rate 2/4 that uses an improved tail-biting scheme (an LDPC block code using an LDPC-CC).

Further, $\lambda_{s,2,k}=(X_{s,1,k}, X_{s,2,k}, P^{pro}_{s,1,k}, P^{pro}_{s,2,k})$ holds true.

In addition, the number of rows in the parity check matrix $H_{pro}$ for the LDPC-CC of coding rate 2/4 that uses an improved tail-biting scheme (an LDPC block code using an LDPC-CC) is 4×m×z.

It has been indicated above that the LDPC-CC of coding rate 2/4 that uses an improved tail-biting scheme (an LDPC block code using an LDPC-CC) is based on the LDPC-CC of coding rate 2/4 and time-varying period 2m that is based on a parity check polynomial, description of which has been provided in embodiments 1 and 2. This is explained in the following.

First, consideration is made of a parity check matrix when configuring a periodic time-varying LDPC-CC using tail-biting by using only parity check polynomials satisfying zero for the LDPC-CC of coding rate 2/4 and time-varying period 2m that is based on a parity check polynomial, description of which has been provided in embodiments 1 and 2.

Figure 43:
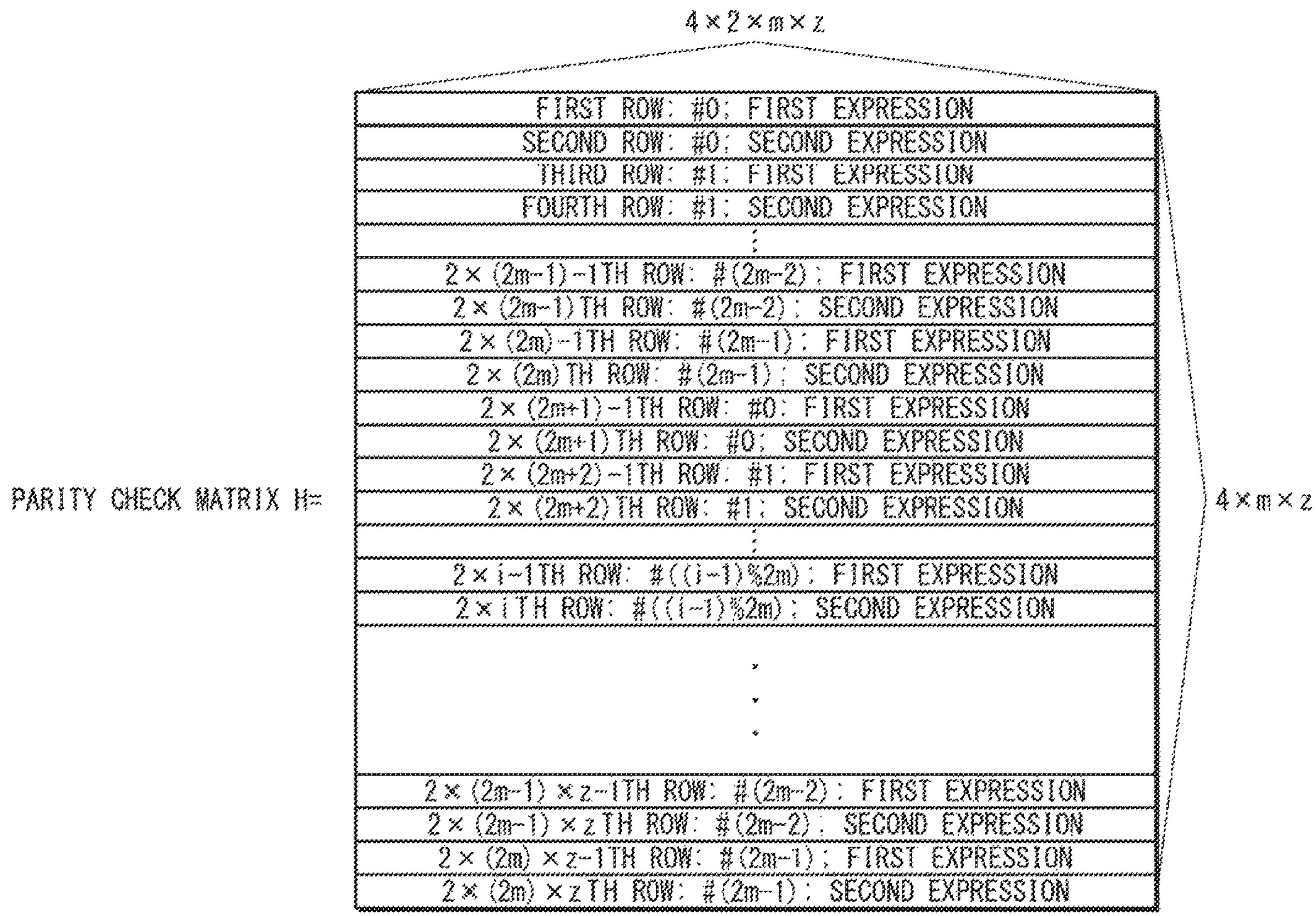
FIG. 43 shows an example of the configuration of check matrix for LDPC-CC of coding rate 2/4 when tail-biting is performed.

FIG. 43 illustrates a configuration of a parity check matrix H when configuring a periodic time-varying LDPC-CC using tail-biting by performing tail-biting by using only parity check polynomials satisfying zero for an LDPC-CC of coding rate 2/4 and time-varying period 2m.

Since Condition #N1 is satisfied in FIG. 43, the number of rows of the parity check matrix is m×z and the number of columns of the parity check matrix is 4×2×m×z.

As illustrated in FIG. 43:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression";

"a vector for the (2×i)th row of the parity check matrix H can be generated from a parity check polynomial satisfying zero of #((i−1)%2m); second expression" (where i is an integer no smaller than one and no greater than 2×m×z);

⋮

"a vector for the 2×(2m−1)×z−1th row of the parity check matrix H can be generated from a parity check polynomial satisfying zero of #(2m−2); first expression";

"a vector for the 2×(2m−1)×zth row of the parity check matrix H can be generated from a parity check polynomial satisfying zero of #(2m−2); second expression";

"a vector for the 2×(2m)×z−1th row of the parity check matrix H can be generated from a parity check polynomial satisfying zero of #(2m−1); first expression"; and "a vector for the 2×(2m)×zth row of the parity check matrix H can be generated from a parity check polynomial satisfying zero of #(2m−1); second expression".

To prepare for the explanation to be provided in the following, a mathematical expression is provided of the parity check matrix H in FIG. 43, which is a parity check matrix when configuring a periodic time-varying LDPC-CC by performing tail-biting by using only parity check polynomials satisfying zero for the LDPC-CC of coding rate 2/4 and time-varying period 2m that is based on a parity check polynomial, description of which is provided in embodiments 1 and 2. When denoting a vector having one row and 4×2×m×z columns in row k of the parity check matrix H as $h_k$, the parity check matrix H in FIG. 43 is expressed as follows.

[Math. 167]

$$H = \begin{pmatrix} h_1 \\ h_2 \\ \vdots \\ h_{2\times(2m)\times z-1} \\ h_{2\times(2m)\times z} \end{pmatrix} \tag{167}$$

The following describes a parity check matrix for the LDPC-CC of coding rate 2/4 that uses an improved tail-biting scheme (an LDPC block code using an LDPC-CC).

Figure 44:
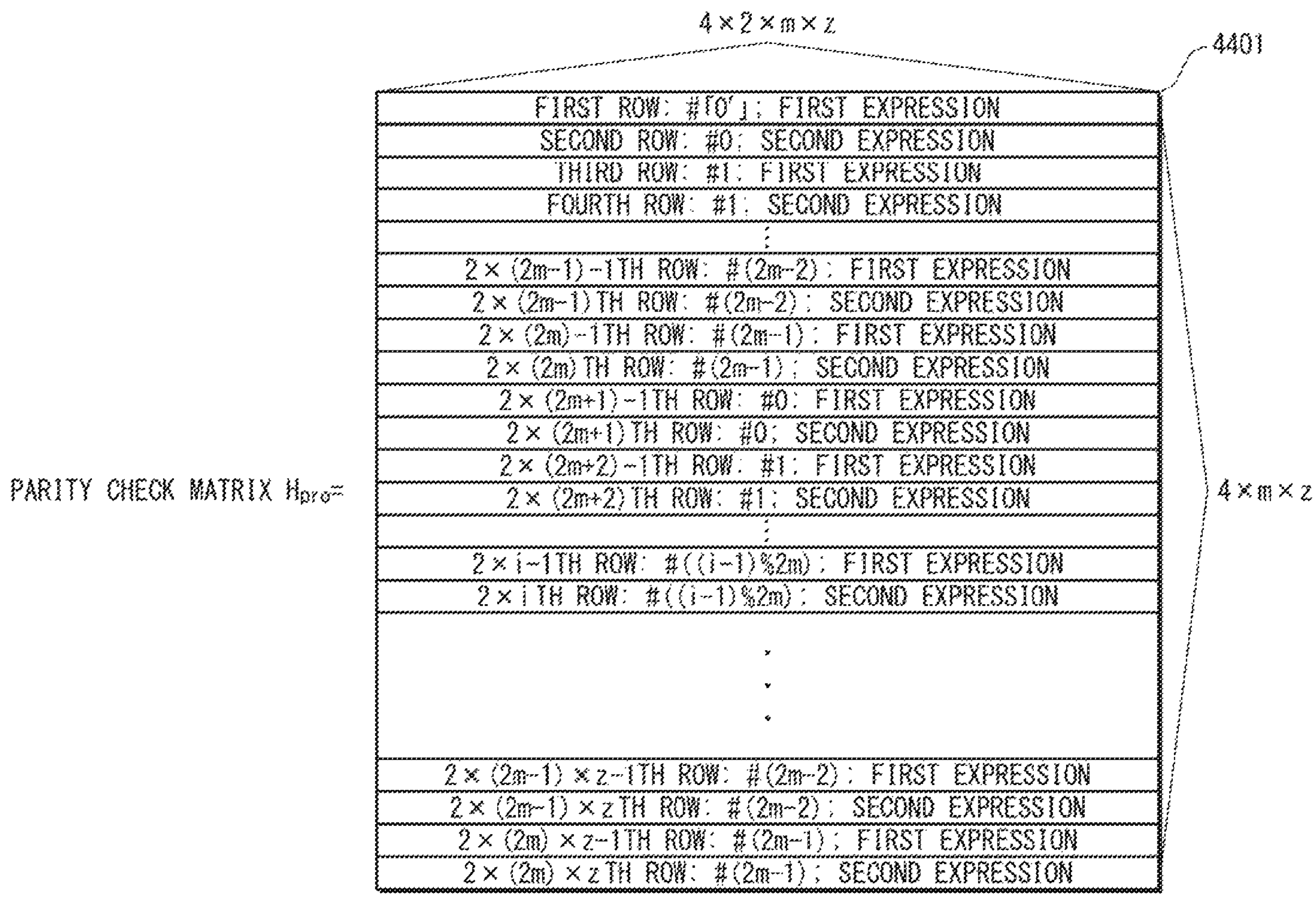
FIG. 44 shows an example of the configuration of check matrix for LDPC-CC of coding rate 2/4 when improved tail-biting is performed.

FIG. 44 illustrates one example of a configuration of a parity check matrix $H_{pro}$ for the LDPC-CC of coding rate 2/4 that uses an improved tail-biting scheme (an LDPC block code using an LDPC-CC).

The parity check matrix $H_{pro}$ for the LDPC-CC of coding rate 2/4 that uses an improved tail-biting scheme (an LDPC block code using an LDPC-CC) satisfies Condition #N1.

When denoting a vector having one row and 4×2×m×z columns in row k of the parity check matrix $H_{pro}$ in FIG. 44, which is for the LDPC-CC of coding rate 2/4 that uses an improved tail-biting scheme (an LDPC block code using an LDPC-CC), as $g_k$, the parity check matrix $H_{pro}$ in FIG. 44 is expressed as follows.

[Math. 168]

$$H_{pro} = \begin{pmatrix} g_1 \\ g_2 \\ \vdots \\ g_{2\times(2m)\times z-1} \\ g_{2\times(2m)\times z} \end{pmatrix} \tag{168}$$

A transmission sequence (encoded sequence (codeword)) $v_s$ of block s of the LDPC-CC of coding rate 2/4 that uses an improved tail-biting scheme (an LDPC block code using an LDPC-CC) can be expressed as $v_s=(X_{s,1,1}, X_{s,2,1}, P^{pro}_{s,1,1}, P^{pro}_{s,2,1}, X_{s,1,2}, X_{s,2,2}, P^{pro}_{s,1,2}, P^{pro}_{s,2,2}, \ldots, X_{s,1,k}, X_{s,2,1}, P^{pro}_{s,1,k}, P^{pro}_{s,2,k}, \ldots, X_{s,1,2\times m\times z}, X_{s,2,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}$ $v_s$ are zeroes).

$X_{s,j,k}$ (where j is an integer no smaller than one and no greater than two) is a bit of information $X_j$, $P^{pro}_{s,1,k}$ is a bit of parity $P_1$ of the LDPC-CC of coding rate 2/4 that uses an improved tail-biting scheme (an LDPC block code using an LDPC-CC), and $P^{pro}_{s,2,k}$ is a bit of parity $P_2$ of the LDPC-CC of coding rate 2/4 that uses an improved tail-biting scheme (an LDPC block code using an LDPC-CC).

In the parity check matrix $H_{pro}$ in FIG. 44, which illustrates one example of a configuration of a parity check matrix $H_{pro}$ for the LDPC-CC of coding rate 2/4 that uses an improved tail-biting scheme (an LDPC block code using an LDPC-CC), rows other than row one, or that is, rows between row two to row 2×(2×m)×z in the parity check matrix $H_{pro}$ in FIG. 44, have the same configuration as rows between row two and row 2×(2×m)×z in the parity check matrix H in FIG. 43 (refer to FIGS. 43 and 44). Accordingly, FIG. 44 includes an indication of #0'; first expression at 4401 in the first row. (This point is explained later in the present disclosure.) Accordingly, the following relational expression holds true based on expression 167 and 168.

[Math. 169]

For all i no smaller than two and no greater than 2×(2×m)×z, the following holds true:

$$g_i = h_i \tag{169}$$

Further, the following holds true when i=1.

[Math. 170]

$$g_1 \neq h_1 \tag{170}$$

Accordingly, the parity check matrix $H_{pro}$ for the LDPC-CC of coding rate 2/4 that uses an improved tail-biting scheme (an LDPC block code using an LDPC-CC) can be expressed as follows.

[Math. 171]

$$H_{pro} = \begin{pmatrix} g_1 \\ h_2 \\ \vdots \\ h_{2\times(2m)\times z-1} \\ h_{2\times(2m)\times z} \end{pmatrix} \tag{171}$$

In expression 171, expression 170 holds true.

Next, explanation is provided of a method of configuring $g_1$ in expression 171 so that parities can be found sequentially and high error correction capability can be achieved.

One example of a method of configuring $g_1$ in expression 171, so that parities can be found sequentially and high error correction capability can be achieved, is using a parity check polynomial satisfying zero of #0; first expression of the LDPC-CC of coding rate 2/4 that uses an improved tail-biting scheme (an LDPC block code using an LDPC-CC), which serves as the basis.

Since $g_1$ is row one of the parity check matrix $H_{pro}$ for the LDPC-CC of coding rate 2/4 that uses an improved tail-biting scheme (an LDPC block code using an LDPC-CC), $g_1$ is generated from a parity check polynomial satisfying zero that is obtained by transforming a parity check polynomial satisfying zero of #0; first expression. As described above, a parity check polynomial satisfying zero of #0; first expression is expressed by either expression (172-1-1) or expression (172-1-2).

[Math. 172]

$$\begin{aligned} &\left(1+\sum_{s=1}^{R_{\#(0),1}} D^{\alpha\#(0),1,s}\right)X_1(D) + \left(\sum_{s=R_{\#(0),2}+1}^{r_{\#(0),2}} D^{\alpha\#(0),2,s}\right)X_2(D) + P_1(D) + D^{\beta\#(0),0}P_2(D) = \\ &(D^{\alpha\#(0),1,R_{\#(0),1}} + \ldots + D^{\alpha\#(0),1,1} + 1)X_1(D) + \\ &(D^{\alpha\#(0),2,r_{\#(0),2}} + \ldots + D^{\alpha\#(0),2,R_{\#(0),2}} + 1)X_2(D) + \\ &P_1(D) + D^{\beta\#(0),0}P_2(D) = 0 \end{aligned} \tag{172-1-1}$$

-continued $$\begin{aligned} &\left(1+\sum_{s=1}^{R_{\#(0),1}} D^{\alpha\#(0),1,s}\right)X_1(D) + \left(\sum_{s=R_{\#(0),2}+1}^{r_{\#(0),2}} D^{\alpha\#(0),2,s}\right)X_2(D) + P_1(D) + D^{\beta\#(0),1}P_1(D) = \\ &(D^{\alpha\#(0),1,R_{\#(0),1}} + \ldots + D^{\alpha\#(0),1,1} + 1)X_1(D) + \\ &(D^{\alpha\#(0),2,r_{\#(0),2}} + \ldots + D^{\alpha\#(0),2,R_{\#(0),2}} + 1)X_2(D) + \\ &P_1(D) + D^{\beta\#(0),1}P_1(D) = 0 \end{aligned} \tag{172-1-2}$$

As one example of a parity check polynomial satisfying zero for generating vector $g_1$ in row one of the parity check matrix $H_{pro}$ for the LDPC-CC of coding rate 2/4 that uses an improved tail-biting scheme (an LDPC block code using an LDPC-CC), a parity check polynomial satisfying zero of #0; first expression is expressed as follows, for either expression (172-1-1) or expression (172-1-2).

[Math. 173]

$$\begin{aligned} &\left(1+\sum_{s=1}^{R_{\#(0),1}} D^{\alpha\#(0),1,s}\right)X_1(D) + \left(\sum_{s=R_{\#(0),2}+1}^{r_{\#(0),2}} D^{\alpha\#(0),2,s}\right)X_2(D) + P_1(D) = \\ &(D^{\alpha\#(0),1,R_{\#(0),1}} + \ldots + D^{\alpha\#(0),1,1} + 1)X_1(D) + \\ &(D^{\alpha\#(0),2,r_{\#(0),2}} + \ldots + D^{\alpha\#(0),2,R_{\#(0),2}} + 1)X_2(D) + P_1(D) = 0 \end{aligned} \tag{173}$$

Accordingly, vector $g_1$ is a vector having one row and 4×2×m×z columns that is obtained by performing tail-biting with respect to expression 173.

Note that in the following, a parity check polynomial that satisfies zero provided by expression 173 is referred to as #0'; first expression.

Accordingly, row one of the parity check matrix $H_{pro}$ for the LDPC-CC of coding rate 2/4 that uses an improved tail-biting scheme (an LDPC block code using an LDPC-CC) can be obtained by transforming #0'; first expression of expression 173 (that is, a vector $g_1$ corresponding to one row and 4×2×m×z columns can be obtained).

A transmission sequence (encoded sequence (codeword)) $v_s$ of block s of the LDPC-CC of coding rate 2/4 that uses an improved tail-biting scheme (an LDPC block code using an LDPC-CC) is $v_s=(X_{s,1,1}, X_{s,2,1}, P^{pro}_{s,1,1}, P^{pro}_{s,2,1}, X_{s,1,2}, X_{s,2,2}, P^{pro}_{s,1,2}, P^{pro}_{s,2,2}, \ldots, X_{s,1,k}, X_{s,2,1}, P^{pro}_{s,1,k}, P^{pro}_{s,2,k}, \ldots, X_{s,1,2\times m\times z}, X_{s,2,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$, and the number of parity check polynomials satisfying zero necessary for obtaining this transmission sequence is 2×(2×m)×z.

Here, when arranging such 2×(2×m)×z number of parity check polynomials satisfying zero in order, a parity check polynomial satisfying zero appearing eth is referred to in the following as an "eth parity check polynomial satisfying zero" (where e is an integer no smaller than zero and no greater than 2×(2×m)×z−1).

As such, the parity check polynomials satisfying zero are arranged in the following order:

zeroth: zeroth parity check polynomial satisfying zero;
first: first parity check polynomial satisfying zero;
second: second parity check polynomial satisfying zero;
⋮
eth: eth parity check polynomial satisfying zero;
⋮
2×(2×m)×z−2th: 2×(2×m)×z−2th parity check polynomial satisfying zero; and 2×(2×m)×z−1th: 2×(2×m)×z−1th parity check polynomial satisfying zero.

Accordingly, the transmission sequence (encoded sequence (codeword)) $v_s$ of block s of the LDPC-CC of coding rate 2/4 that uses an improved tail-biting scheme (an LDPC block code using an LDPC-CC) is obtained. (As can be seen from description provided above, when expressing the parity check matrix $H_{pro}$ for the LDPC-CC of coding rate 2/4 that uses an improved tail-biting scheme (an LDPC block code using an LDPC-CC) as provided in expression 168, a vector composed of row e+1 of the parity check matrix $H_{pro}$ corresponds to the eth parity check polynomial satisfying zero.)

Accordingly, in the LDPC-CC of coding rate 2/4 that uses an improved tail-biting scheme (an LDPC block code using an LDPC-CC):

the 0th parity check polynomial satisfying zero is a parity check polynomial satisfying zero of #0'; first expression provided by expression 173;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 173;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

As description has been provided above, the LDPC-CC of coding rate 2/4 that uses an improved tail-biting scheme (an LDPC block code using an LDPC-CC), at the same time as achieving high error correction capability, enables finding multiple parities sequentially, and therefore, achieves an advantageous effect of reducing circuit scale of an encoder.

In the following, explanation is provided of what is meant by "finding parities sequentially".

In the example described above, since bits of information $X_1$ and information $X_2$ are pre-acquired, $P^{pro}_{s,1,1}$ can be calculated by using the 0th parity check polynomial satisfying zero of the LDPC-CC of coding rate 2/4 that uses an improved tail-biting scheme (an LDPC block code using an LDPC-CC), or that is, by using the parity check polynomial satisfying zero of #0'; first expression provided by expression 173.

Then, from the bits of information $X_1$ and information $X_2$ and $P^{pro}_{s,1,1}$, another parity (denoted as $P_{c=1}$) can be calculated by using another parity check polynomial satisfying zero.

Further, from the bits of information $X_1$ and information $X_2$ and $P_{c=1}$, another parity (denoted as $P_{c=2}$) can be calculated by using another parity check polynomial satisfying zero.

By repeating such operation, from the bits of information $X_1$ and information $X_2$ and $P_{c=h}$, another parity (denoted as $P_{c=h+1}$) can be calculated by using a given parity check polynomial satisfying zero.

This is referred to as "finding parities sequentially", and when parities can be found sequentially, multiple parities can be obtained without calculation of complex simultaneous equations, whereby an advantageous effect is achieved of reducing circuit scale (computation amount) of an encoder.

Next, explanation is provided of configurations and operations of an encoder and a decoder for the LDPC-CC of coding rate 2/4 that uses an improved tail-biting scheme (an LDPC block code using an LDPC-CC).

In the following, one example case is considered where the LDPC-CC of coding rate 2/4 that uses an improved tail-biting scheme (an LDPC block code using an LDPC-CC) is used in a communication system. When applying the LDPC-CC of coding rate 2/4 that uses an improved tail-biting scheme (an LDPC block code using an LDPC-CC) to a communication system, the encoder and the decoder for the LDPC-CC of coding rate 2/4 that uses an improved tail-biting scheme (an LDPC block code using an LDPC-CC) are characterized for each being configured and each operating based on the parity check matrix $H_{pro}$ for the LDPC-CC of coding rate 2/4 that uses an improved tail-biting scheme (an LDPC block code using an LDPC-CC) and based on the relationship $H_{pro}v_s=0$.

The following provides explanation while referring to FIG. 25, which is an overall diagram of a communication system. An encoder 2511 of a transmitting device 2501 receives an information sequence of block s ($X_{s,1,1}$, $X_{s,2,1}$, $X_{s,1,2}$, $X_{s,2,2}$, . . . , $X_{s,1,k}$, $X_{s,2,k}$, . . . , $X_{s,1,2\times m\times z}$, $X_{s,2,2\times m\times z}$) as input. The encoder 2511 performs encoding based on the parity check matrix $H_{pro}$ for the LDPC-CC of coding rate 2/4 that uses an improved tail-biting scheme (an LDPC block code using an LDPC-CC) and based on the relationship $H_{pro}v_s=0$. The encoder 2511 generates a transmission sequence (encoded sequence (codeword)) $v_s$ of block s of the LDPC-CC of coding rate 2/4 that uses an improved tail-biting scheme (an LDPC block code using an LDPC-CC), denoted as $v_s=(X_{s,1,1}, X_{s,2,1}, P^{pro}_{s,1,1}, P^{pro}_{s,2,1}, X_{s,1,2}, X_{s,2,2}, P^{pro}_{s,1,2}, P^{pro}_{s,2,2}, \ldots, X_{s,1,k}, X_{s,2,1}, P^{pro}_{s,1,k}, P^{pro}_{s,2,k}, \ldots, X_{s,1,2\times m\times z}, X_{s,2,2\times m\times z}, P^{pro}_{s,1,2\times m\times z}, P^{pro}_{s,2,2\times m\times z})^T$, and outputs the transmission sequence $v_s$. As already described above, the LDPC-CC of coding rate 2/4 that uses an improved tail-biting scheme (an LDPC block code using an LDPC-CC) is characterized for enabling parities to be found sequentially.

A decoder 2523 of a receiving device 2520 in FIG. 25 receives, as input, a log-likelihood ratio of each bit of, for example, the transmission sequence $v_s=(X_{s,1,1}, X_{s,2,1}, P^{pro}_{s,1,1}, P^{pro}_{s,2,1}, X_{s,1,2}, X_{s,2,2}, P^{pro}_{s,1,2}, P^{pro}_{s,2,2}, \ldots, X_{s,1,k}, X_{s,2,1}, P^{pro}_{s,1,k}, P^{pro}_{s,2,k}, \ldots, X_{s,1,2\times m\times z}, X_{s,2,2\times m\times z}, P^{pro}_{s,1,2\times m\times z}, P^{pro}_{s,2,2\times m\times z})^T$. The log-likelihood ratios are output from a log-likelihood ratio generator 2522. The decoder 2523 performs decoding for an LDPC code according to the parity check matrix $H_{pro}$ for the LDPC-CC of coding rate 2/4 that uses an improved tail-biting scheme (an LDPC block code using an LDPC-CC). For example, the decoding may be decoding disclosed in Non-Patent Literature 4, Non-Patent Literature 6, Non-Patent Literature 7, Non-Patent Literature 8, etc., i.e., simple BP decoding such as min-sum decoding, offset BP decoding, or Normalized BP decoding, or Belief Propagation (BP) decoding in which scheduling is performed with respect to the row operations (Horizontal operations) and the column operations (Vertical operations) such as Shuffled BP decoding or Layered BP decoding. The decoding may also be decoding such as bit-flipping decoding disclosed in Non-Patent Literature 17, for example. The decoder 2523 obtains an estimation transmission sequence (estimation encoded sequence) (reception sequence) of block s through the decoding, and outputs the estimation transmission sequence.

In the above, explanation is provided on operations of the encoder and the decoder in a communication system as one example. Alternatively, the encoder and the decoder may be used in technical fields related to storages, memories, etc.

The following describes a specific example of a configuration of a parity check matrix for the LDPC-CC of coding rate 2/4 that uses an improved tail-biting scheme (an LDPC block code using an LDPC-CC).

When denoting the parity check matrix for the LDPC-CC of coding rate 2/4 that uses an improved tail-biting scheme (an LDPC block code using an LDPC-CC) as $H_{pro}$ as described above, the number of columns of $H_{pro}$ can be expressed as 4×2×m×z (where z is a natural number). (Note that m denotes a time-varying period of the LDPC-CC of coding rate 2/4 that is based on a parity check polynomial, which serves as the basis.)

Accordingly, as already described above, a transmission sequence (encoded sequence (codeword)) $v_s$ composed of a 4×2×m×z number of bits in block s of the LDPC-CC of coding rate 2/4 that uses an improved tail-biting scheme (an LDPC block code using an LDPC-CC) can be expressed as $v_s=(X_{s,1,1}, X_{s,2,1}, P^{pro}_{s,1,1}, P^{pro}_{s,2,1}, X_{s,1,2}, X_{s,2,2}, P^{pro}_{s,1,2}, P^{pro}_{s,2,2}, \ldots, X_{s,1,k}, X_{s,2,1}, P^{pro}_{s,1,k}, P^{pro}_{s,2,k}, \ldots, X_{s,1,2\times m\times z}, X_{s,2,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$, (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}v_s$ are zeroes).

$X_{s,j,k}$ (where j is an integer no smaller than one and no greater than two) is a bit of information $X_j$, $P^{pro}_{s,1,k}$ is a bit of parity $P_1$ of the LDPC-CC of coding rate 2/4 that uses an improved tail-biting scheme (an LDPC block code using an LDPC-CC), and $P^{pro}_{s,2,k}$ is a bit of parity $P_2$ of the LDPC-CC of coding rate 2/4 that uses an improved tail-biting scheme (an LDPC block code using an LDPC-CC).

Further, $\lambda_{pro,s,k}=(X_{s,1,k}, X_{s,2,k}, P^{pro}_{s,1,k}, P^{pro}_{s,2,k})$ holds true.

In addition, the number of rows in the parity check matrix $H_{pro}$ for the LDPC-CC of coding rate 2/4 that uses an improved tail-biting scheme (an LDPC block code using an LDPC-CC) is 4×m×z.

Note that the method of configuring parity check polynomials satisfying zero for the LDPC-CC of coding rate 2/4 that uses an improved tail-biting scheme (an LDPC block code using an LDPC-CC) has already been described above.

In the above, description has been provided of a parity check matrix $H_{pro}$ for the LDPC-CC of coding rate 2/4 that uses an improved tail-biting scheme (an LDPC block code using an LDPC-CC), whose transmission sequence (encoded sequence (codeword)) $v_s$ of block s is $v_s=(X_{s,1,1}, X_{s,2,1}, P^{pro}_{s,1,1}, P^{pro}_{s,2,1}, X_{s,1,2}, X_{s,2,2}, P^{pro}_{s,1,2}, P^{pro}_{s,2,2}, \ldots, X_{s,1,k}, X_{s,2,1}, P^{pro}_{s,1,k}, P^{pro}_{s,2,k}, \ldots, X_{s,1,2\times m\times z}, X_{s,2,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ and for which $H_{pro}v_s=0$ holds true (here, $H_{pro}v_s=0$ indicates that all elements of the vector $H_{pro}v_s=0$ are zeroes). The following provides description of a configuration of a parity check matrix $H_{pro\_m}$ for the LDPC-CC of coding rate 2/4 that uses an improved tail-biting scheme (an LDPC block code using an LDPC-CC), for which $H_{pro\_m}u_s=0$ holds true (here, $H_{pro\_m}u_s=0$ indicates that all elements of the vector $H_{pro\_m}u_s$ are zeroes) when expressing a transmission sequence (encoded sequence (codeword)) $u_s$ of block s as $u_s=(X_{s,1,1}, X_{s,1,2}, \ldots, X_{s,1,2\times m\times z-1}, X_{s,1,2\times m\times z}, X_{s,2,1}, X_{s,2,2}, \ldots, X_{s,2,2\times m\times z-1}, X_{s,2,2\times m\times z}, P^{pro}_{s,1,1}, P^{pro}_{s,1,2}, \ldots, P^{pro}_{s,1,2\times m\times z-1}, P^{pro}_{s,1,2\times m\times z}, P^{pro}_{s,2,1}, P^{pro}_{s,2,2}, \ldots, P^{pro}_{s,2,2\times m\times z-1}, P^{pro}_{s,2,2\times m\times z})^T=(\Lambda_{X1,s}, \Lambda_{X2,s}, \Lambda_{pro1,s}, \Lambda_{pro2,s})^T$.

Note that $\Lambda_{Xf,s}$ (where f is an integer no smaller than one and no greater than two) satisfies $\Lambda_{Xf,s}=(X_{s,f,1}, X_{s,f,2}, X_{s,f,3}, \ldots, X_{s,f,2\times m\times z-2}, X_{s,f,2\times m\times z-1}, X_{s,f,2\times m\times z})$ ($\Lambda_{Xf,s}$ is a vector having one row and 2×m×z columns), and $\Lambda_{pro1,s}$ and $\Lambda_{pro2,s}$ satisfy $\Lambda_{pro1,s}=(P^{pro}_{s,1,1}, P^{pro}_{s,1,2}, \ldots, P^{pro}_{s,1,2\times m\times z-1}, P^{pro}_{s,1,2\times m\times z})$ and $\Lambda_{pro2,s}$ $(P^{pro}_{s,2,1}, P^{pro}_{s,2,2}, \ldots, P^{pro}_{s,2,2\times m\times z-1}, P^{pro}_{s,2,2\times m\times z})$, respectively ($\Lambda_{pro1,s}$ and $\Lambda_{pro2,s}$ are both vectors having one row and 2×m×z columns).

Figure 45:
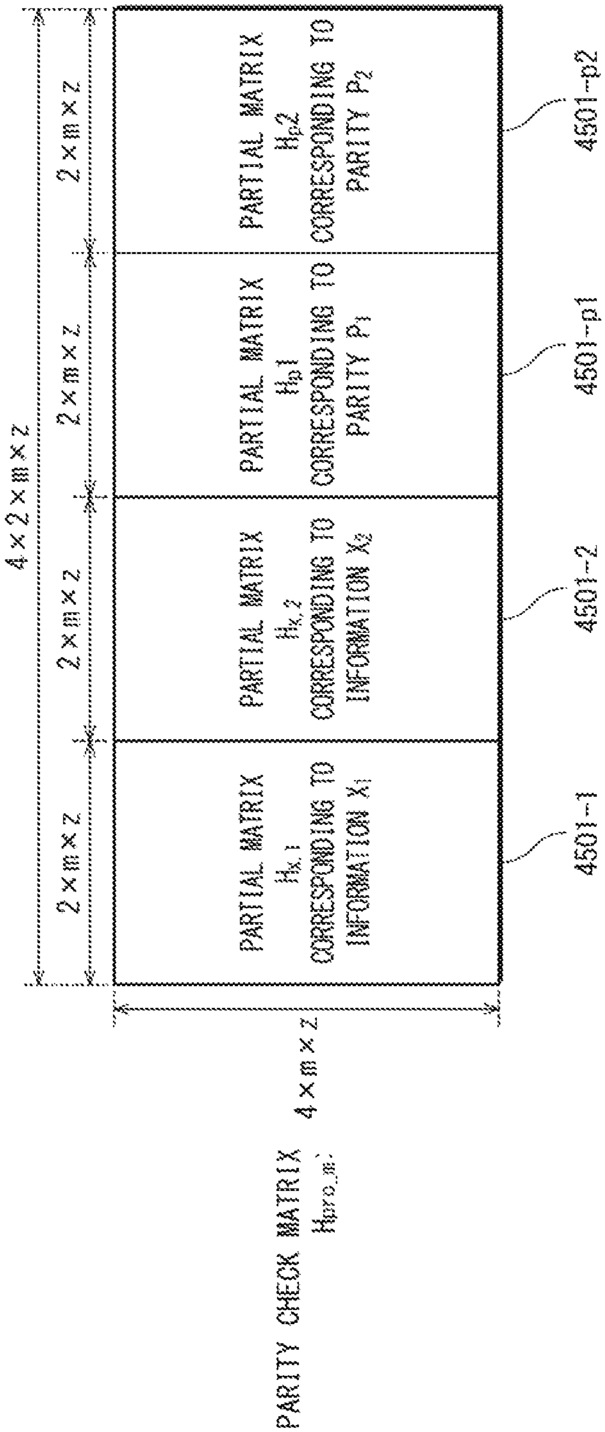
FIG. 45 shows an example of the configuration of check matrix for LDPC-CC of coding rate 2/4 when improved tail-biting is performed.

Here, the number of bits of information $X_1$ included in one block is 2×m×z, the number of bits of information $X_2$ included in one block is 2×m×z, the number of bits of parity bits $P_1$ included in one block is 2×m×z, and the number of bits of parity bits $P_2$ included in one block is 2×m×z. Accordingly, the parity check matrix $H_{pro\_m}$ for the LDPC-CC of coding rate 2/4 that uses an improved tail-biting scheme (an LDPC block code using an LDPC-CC) can be expressed as $H_{pro\_m}[H_{x,1}, H_{x,2}, H_{p1}, H_{p2}]$, as illustrated in FIG. 45. Since a transmission sequence (encoded sequence (codeword)) $u_s$ of block s is $u_s=(X_{s,1,1}, X_{s,1,2}, \ldots, X_{s,1,2\times m\times z-1}, X_{s,1,2\times m\times z}, X_{s,2,1}, X_{s,2,2}, \ldots, X_{s,2,2\times m\times z-1},$ $X_{s,2,2\times m\times z}$, $P^{pro}_{s,1,1}$, $P^{pro}_{s,1,2}$, . . . , $P^{pro}_{s,1,2\times m\times z-1}$, $P^{pro}_{s,1,2\times m\times z}$, $P^{pro}_{s,2,1}$, $P^{pro}_{s,2,2}$, . . . , $P^{pro}_{s,2,2\times m\times z-1}$, $P^{pro}_{s,2,2\times m\times z})^T=(\Lambda_{X1,s}, \Lambda_{X2,s}, \Lambda_{pro1,s}, \Lambda_{pro2,s})^T$, $H_{x,1}$ is a partial matrix related to information $X_1$, $H_{x,2}$ is a partial matrix related to information $X_2$, $H_{p1}$ is a partial matrix related to parity $P_1$, and $H_{p2}$ is a partial matrix related to parity $P_2$. As illustrated in FIG. 45, the parity check matrix $H_{pro\_m}$ has 4×m×z rows and 4×2×m×z columns, the partial matrix $H_{x,1}$ related to information $X_1$ has 4×m×z rows and 2×m×z columns, the partial matrix $H_{x,2}$ related to information $X_2$ has 4×m×z rows and 2×m×z columns, the partial matrix $H_{p1}$ related to parity $P_1$ has 4×m×z rows and 2×m×z columns, and the partial matrix $H_{p2}$ related to parity $P_2$ has 4×m×z rows and 2×m×z columns.

The transmission sequence (encoded sequence (codeword)) $u_s$ composed of a 4×2×m×z number of bits in block s of the LDPC-CC of coding rate 2/4 that uses an improved tail-biting scheme (an LDPC block code using an LDPC-CC) is $u_s=(X_{s,1,1}, X_{s,1,2}, \ldots, X_{s,1,2\times m\times z-1}, X_{s,1,2\times m\times z}, X_{s,2,1}, X_{s,2,2}, \ldots, X_{s,2,2\times m\times z-1}, X_{s,2,2\times m\times z}, P^{pro}_{s,1,1}, P^{pro}_{s,1,2}, \ldots, P^{pro}_{s,1,2\times m\times z-1}, P^{pro}_{s,1,2\times m\times z}, P^{pro}_{s,2,1}, P^{pro}_{s,2,2}, \ldots, P^{pro}_{s,2,2\times m\times z-1}, P^{pro}_{s,2,2\times m\times z})^T=(\Lambda_{X1,s}, \Lambda_{X2,s}, \Lambda_{pro1,s}, \Lambda_{pro2,s})^T$, and the number of parity check polynomials satisfying zero necessary for obtaining this transmission sequence is 4×m×z.

Here, when arranging such 2×(2×m)×z number of parity check polynomials satisfying zero in order, a parity check polynomial satisfying zero appearing eth is referred to in the following as an "eth parity check polynomial satisfying zero" (where e is an integer no smaller than zero and no greater than 2×(2×m)×z−1).

As such, the parity check polynomials satisfying zero are arranged in the following order:

zeroth: zeroth parity check polynomial satisfying zero;

first: first parity check polynomial satisfying zero;

second: second parity check polynomial satisfying zero;

⋮ eth: eth parity check polynomial satisfying zero;

⋮

2×(2×m)×z−2th: 2×(2×m)×z−2th parity check polynomial satisfying zero; and

2×(2×m)×z−1th: 2×(2×m)×z−1th parity check polynomial satisfying zero.

Accordingly, the transmission sequence (encoded sequence (codeword)) $u_s$ of block s of the LDPC-CC of coding rate 2/4 that uses an improved tail-biting scheme (an LDPC block code using an LDPC-CC) is obtained.

Accordingly, in the LDPC-CC of coding rate 2/4 that uses an improved tail-biting scheme (an LDPC block code using an LDPC-CC):

the 0th parity check polynomial satisfying zero is a parity check polynomial satisfying zero of #0'; first expression provided by expression 173;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 173;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

In the present embodiment (in fact, commonly applying to the entirety of the present disclosure), % means a modulo, and for example, α%q represents a remainder after dividing α by q (where α is an integer no smaller than zero, and q is a natural number).

The following describes details of the configuration of the parity check matrix $H_{pro\_m}$ for the LDPC-CC of coding rate 2/4 that uses an improved tail-biting scheme (an LDPC block code using an LDPC-CC) based on what has been described above.

The parity check matrix $H_{pro\_m}$ for the LDPC-CC of coding rate 2/4 that uses an improved tail-biting scheme (an LDPC block code using an LDPC-CC) has 4×m×z rows and 4×2×m×z columns.

Accordingly, the parity check matrix $H_{pro\_m}$ for the LDPC-CC of coding rate 2/4 that uses an improved tail-biting scheme (an LDPC block code using an LDPC-CC) has rows one through 4×m×z, and columns one through 4×2×m×z.

Here, the topmost row of the parity check matrix $H_{pro\_m}$ is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

Further, the leftmost column of the parity check matrix $H_{pro\_m}$ is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

In the parity check matrix $H_{pro\_m}$, the partial matrix $H_{x,1}$ related to information $X_1$ has 4×m×z rows and 2×m×z columns. In the following, an element at row u, column v of the partial matrix $H_{x,1}$ related to information $X_1$ is denoted as $H_{x,1,comp}[u][v]$ (where u is an integer no smaller than one and no greater than 4×m×z, and v is an integer no smaller than one and no greater than 2×m×z).

Similarly, in the parity check matrix $H_{pro\_m}$, the partial matrix $H_{x,2}$ related to information $X_2$ has 4×m×z rows and 2×m×z columns. In the following, an element at row u, column v of the partial matrix $H_{x,2}$ related to information $X_2$ is denoted as $H_{x,2,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{p,1}$ related to parity $P_1$ has 4×m×z rows and 2×m×z columns. In the following, an element at row u, column v of the partial matrix $H_{p,1}$ related to parity $P_1$ is denoted as $H_{p1,comp}[u][v]$ (where u is an integer no smaller than one and no greater than 4×m×z, and v is an integer no smaller than one and no greater than 2×m×z).

Similarly, in the parity check matrix $H_{pro\_m}$, the partial matrix $H_{p,2}$ related to parity $P_2$ has 4×m×z rows and 2×m×z columns. In the following, an element at row u, column v of the partial matrix $H_{p,2}$ related to parity $P_2$ is denoted as $H_{p2,comp}[u][v]$ (where u is an integer no smaller than one and no greater than 4×m×z, and v is an integer no smaller than one and no greater than 2×m×z).

The following provides detailed description of the configuration of $H_{x,1,comp}[u][v]$, $H_{x,2,comp}[u][v]$, $H_{p1,comp}[u][v]$, and $H_{p2,comp}[u][v]$.

As already described above, in the LDPC-CC of coding rate 2/4 that uses an improved tail-biting scheme (an LDPC block code using an LDPC-CC):

the 0th parity check polynomial satisfying zero is a parity check polynomial satisfying zero of #0'; first expression provided by expression 173;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 173;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

Further, a vector composed of row e+1 of the parity check matrix $H_{pro\_m}$ corresponds to the eth parity check polynomial satisfying zero.

Accordingly, a vector composed of row one of the parity check matrix $H_{pro\_m}$ is generated by using a parity check polynomial satisfying zero of #0'; first expression provided by expression 173;

a vector composed of row two of the parity check matrix $H_{pro\_m}$ is generated by using a parity check polynomial satisfying zero of #0; second expression;

a vector composed of row 2×g−1 of the parity check matrix $H_{pro\_m}$ is generated by using a parity check polynomial satisfying zero of #((g−1)%2m); first expression; and a vector composed of row 2×g of the parity check matrix $H_{pro\_m}$ is generated by using a parity check polynomial satisfying zero of #((g−1)%2m); second expression (where g is an integer no smaller than two and no greater than 2×m×z).

$H_{x,1,comp}[u][v]$, $H_{x,2,comp}[u][v]$, $H_{p1,comp}[u][v]$, and $H_{p2,comp}[u][v]$ can be expressed according to the relationship described above.

First, description is provided of the configuration of $H_{x,1,comp}$[u][v], $H_{x,2,comp}$[u][v], $H_{p1,comp}$[u][v], and $H_{p2,comp}$[u][v] for row one of the parity check matrix $H_{pro\_m}$, or that is, for u=1.

The vector composed of row one of the parity check matrix $H_{pro\_m}$ is generated by using a parity check polynomial satisfying zero of #0'; first expression provided by expression 173. Accordingly, $H_{x,1,comp}$[1][v] can be expressed as follows. In the following, w=1.

[Math. 174]

$$H_{x,1,comp}[1][1]=1 \tag{174-1}$$

When y is an integer no smaller than one and no greater than $R_{\#(0),w}$:

$$H_{x,w,comp}[1][1-\alpha_{\#(0),w,y}+(2\times m\times z)]=1 \tag{174-2}$$

For all v being an integer no smaller than one and no greater than 2×m×z satisfying {v≠1} and {$v\neq 1-\alpha_{\#(0),w,y}+(2\times m\times z)$} (where y is an integer no smaller than one and no greater than $R_{\#(0),w}$), the following holds true:

$$H_{x,1,comp}[1][v]=0 \tag{174-3}$$

Further, $H_{x,2,comp}$[1][v] can be expressed as follows. In the following, Ω=2.

[Math. 175]

When y is an integer no smaller than $R_{\#(0),\Omega}+1$ and no greater than $r_{\#(0),\Omega}$:

$$H_{x,\Omega,comp}[1][1-\alpha_{\#(0),\Omega,y}+(2\times m\times z)]=1 \tag{175-1}$$

For all v being an integer no smaller than one and no greater than 2×m×z satisfying {$v\neq 1-\alpha_{\#(0),\Omega,y}+(2\times m\times z)$} (where y is an integer no smaller than $R_{\#(0),\Omega}+1$ and no greater than $r_{\#((0),\Omega)}$), the following holds true:

$$H_{x,\Omega,comp}[1][v]=0 \tag{175-2}$$

Further, $H_{p1,comp}$[1][v] can be expressed as follows.

[Math. 176]

$$H_{p1,comp}[1][1]=1 \tag{176-1}$$

For all v being an integer no smaller than two and no greater than 2×m×z, the following holds true:

$$H_{p1,comp}[1][v]=0 \tag{176-2}$$

Further, $H_{p2,comp}$[1][v] can be expressed as follows.

[Math. 177]

For all v being an integer no smaller than one and no greater than 2×m×z, the following holds true:

$$H_{p2,comp}[1][v]=0 \tag{177}$$

The vector composed of row two of the parity check matrix $H_{pro\_m}$ is generated by using a parity check polynomial satisfying zero of #0; second expression. As described above, a parity check polynomial satisfying zero of #0; second expression is expressed by either expression (165-2-1) or expression (165-2-2).

Accordingly, $H_{x,1,comp}$[2][v] can be expressed as follows.

<1> When a parity check polynomial satisfying zero of #0; second expression is expressed as provided in expression (165-2-1):

$H_{x,1,comp}$[2][v] is expressed as follows. In the following, Ω=1.

[Math. 178]

When y is an integer no smaller than $R_{\#(0),\Omega}+1$ and no greater than $r_{\#((0),\Omega}$:

$$H_{x,\Omega,comp}[2][1-\alpha_{\#(0),\Omega,y}+(2\times m\times z)]=1 \tag{178-1}$$

For all v being an integer no smaller than one and no greater than 2×m×z satisfying {$v\neq 1-\alpha_{\#(0),\Omega,y}+(2\times m\times z)$} (where y is an integer no smaller than $R_{\#(0),\Omega}+1$ and no greater than $r_{\#((0),\Omega)}$), the following holds true:

$$H_{x,\Omega,comp}[2][v]=0 \tag{178-2}$$

Accordingly, $H_{x,2,comp}$[2][v] can be expressed as follows. In the following, w=2.

[Math. 179]

$$H_{x,w,comp}[2][1]=1 \tag{179-1}$$

When y is an integer no smaller than one and no greater than $R_{\#(0),w}$:

$$H_{x,w,comp}[2][1-\alpha_{\#(0),w,y}+(2\times m\times z)]=1 \tag{179-2}$$

For all v being an integer no smaller than one and no greater than 2×m×z satisfying {v≠1} and {$v\neq 1-\alpha_{\#(0),w,y}+(2\times m\times z)$} (where y is an integer no smaller than one and no greater than $R_{\#(0),w}$), the following holds true:

$$H_{x,w,comp}[2][v]=0 \tag{179-3}$$

Further, $H_{p1,comp}$[2][v] can be expressed as follows.

[Math. 180]

$$H_{p1,comp}[2][1-\beta_{\#(0),2}+(2\times m\times z)]=1 \tag{180-1}$$

For all v being an integer no smaller than one and no greater than 2×m×z satisfying {$v\neq 1-\beta_{\#(0),2}+(2\times m\times z)$}, the following holds true:

$$H_{p1,comp}[2][v]=0 \tag{180-2}$$

Further, $H_{p2,comp}$[2][v] can be expressed as follows.

[Math. 181]

$$H_{p2,comp}[2][1]=1 \tag{181-1}$$

For all v being an integer no smaller than two and no greater than 2×m×z, the following holds true:

$$H_{p2,comp}[2][v]=0 \tag{181-2}$$

<2> When a parity check polynomial satisfying zero of #0; second expression is expressed as provided in expression (165-2-2):

$H_{x,1,comp}$[2][v] is expressed as follows. In the following, Ω=1.

[Math. 182]

When y is an integer no smaller than $R_{\#(0),\Omega}+1$ and no greater than $r_{\#((0),\Omega}$:

$$H_{x,\Omega,comp}[2][1-\alpha_{\#(0),\Omega,y}+(2\times m\times z)]=1 \tag{182-1}$$

For all v being an integer no smaller than one and no greater than 2×m×z satisfying {$v\neq 1-\alpha_{\#(0),\Omega,y}+(2\times m\times z)$} (where y is an integer no smaller than $R_{\#(0),\Omega}+1$ and no greater than $r_{\#((0),\Omega)}$), the following holds true:

$$H_{x,\Omega,comp}[2][v]=0 \tag{182-2}$$

Accordingly, $H_{x,2,comp}$[2][v] can be expressed as follows. In the following, w=2.

[Math. 183]

$$H_{x,w,comp}[2][1]=1 \tag{183-1}$$

When y is an integer no smaller than one and no greater than $R_{\#(0),w}$:

$$H_{x,w,comp}[2][1\alpha_{\#(0),w,y}+(2\times m\times z)]=1 \tag{183-2}$$

For all v being an integer no smaller than one and no greater than 2×m×z satisfying {v≠1} and {$v\neq 1-\alpha_{\#(0),w,y}+(2\times m\times z)$} (where y is an integer no smaller than one and no greater than $R_{\#(0),w}$), the following holds true:

$$H_{x,w,comp}[2][v]=0 \tag{183-3}$$

Further, $H_{p1,comp}$[2][v] can be expressed as follows.

[Math. 184]

For all v being an integer no smaller than one and no greater than 2×m×z:

$$H_{p1,comp}[2][v]=0 \quad (184)$$

Further, $H_{p2,comp}[2][v]$ can be expressed as follows.

[Math. 185]

$$H_{p2,comp}[2][1]=1 \quad (185\text{-}1)$$

$$H_{p2,comp}[2][1-\beta_{\#(0),3}+(2\times m\times z)]=1 \quad (185\text{-}2)$$

For all v being an integer no smaller than one and no greater than 2×m×z satisfying $\{v\neq 1\}$ and $\{v\neq 1-\beta_{\#(0),3}+(2\times m\times z)\}$, the following holds true:

$$H_{p2,comp}[2][v]=0 \quad (185\text{-}3)$$

As already described above, the vector composed of row 2×g−1 of the parity check matrix $H_{pro\_m}$ is generated by using a parity check polynomial satisfying zero of #((g−1)%2m); first expression; and the vector composed of row 2×g of the parity check matrix $H_{pro\_m}$ is generated by using a parity check polynomial satisfying zero of #((g−1)%2m); second expression (where g is an integer no smaller than two and no greater than 2×m×z).

Accordingly, when g=2×f−1 (where f is an integer no smaller than two and no greater than m×z), a vector of row 2×(2×f−1)−1 of the parity check matrix $H_{pro\_m}$ for the LDPC-CC of coding rate 2/4 that uses an improved tail-biting scheme (an LDPC block code using an LDPC-CC) can be generated by using a parity check polynomial satisfying zero of #(((2×f−1)−1)%2m); first expression, or that is, by using a parity check polynomial satisfying zero provided by expression (165-1-1) or expression (165-1-2).

Further, a vector of row 2×(2×f−1) of the parity check matrix $H_{pro\_m}$ for the LDPC-CC of coding rate 2/4 that uses an improved tail-biting scheme (an LDPC block code using an LDPC-CC) can be generated by using a parity check polynomial satisfying zero of #(((2×f−1)−1)%2m); second expression, or that is, by using a parity check polynomial satisfying zero provided by expression (165-2-1) or expression (165-2-2).

Further, when g=2×f (where f is an integer no smaller than one and no greater than m×z), a vector of row 2×(2×f)−1 of the parity check matrix $H_{pro\_m}$ for the LDPC-CC of coding rate 2/4 that uses an improved tail-biting scheme (an LDPC block code using an LDPC-CC) can be generated by using a parity check polynomial satisfying zero of #(((2×f)−1)%2m); first expression, or that is, by using a parity check polynomial satisfying zero provided by expression (166-1-1) or expression (166-1-2).

Further, a vector of row 2×(2×f) of the parity check matrix $H_{pro\_m}$ for the LDPC-CC of coding rate 2/4 that uses an improved tail-biting scheme (an LDPC block code using an LDPC-CC) can be generated by using a parity check polynomial satisfying zero of #(((2×f)−1)%2m); second expression, or that is, by using a parity check polynomial satisfying zero provided by expression (166-2-1) or expression (166-2-2).

Accordingly, (1) when g=2×f−1 (where f is an integer no smaller than two and no greater than m×z), when a vector for row 2×(2×f−1)−1 of the parity check matrix $H_{pro\_m}$, which is for the LDPC-CC of coding rate 2/4 that uses an improved tail-biting scheme (an LDPC block code using an LDPC-CC), can be generated by using a parity check polynomial satisfying zero provided by expression (165-1-1), ((2×f−1)−1)%2m=2c holds true. Accordingly, a parity check polynomial satisfying zero of expression (165-1-1) where 2i=2c holds true (where c is an integer no smaller than zero and no greater than m−1).

Accordingly, components $H_{x,1,comp}[2\times g+1][v]=H_{x,1,comp}[2\times(2\times f-1)-1][v]$, $H_{x,2,comp}[2\times g-1][v]=H_{x,2,comp}[2\times(2\times f-1)-1][v]$, $H_{p1,comp}[2\times g-1][v]=H_{p1,comp}[2\times(2\times f-1)-1][v]$, and $H_{p2,comp}[2\times g-1][v]=H_{p2,comp}[2\times(2\times f-1)-1][v]$ in row 2×g−1, or that is, row 2×(2×f−1)−1 of the parity check matrix $H_{pro\_m}$, which is for the LDPC-CC of coding rate 2/4 that uses an improved tail-biting scheme (an LDPC block code using an LDPC-CC), is expressed as follows.

First, the following holds true for $H_{x,1,comp}[2\times(2\times f-1)-1][v]$. In the following, w=1.

[Math. 186]

$$H_{x,w,comp}[2\times(2\times f-1)-1][((2\times f-1)-0-1)+1]=1 \quad (186\text{-}1)$$

When y is an integer no smaller than one and no greater than $R_{\#(2c),w}$, and $(2\times f-1)-\alpha_{\#(2c),w,y}-1\geq 0$:

$$H_{x,w,comp}[2\times(2\times f-1)-1][((2\times f-1)-\alpha_{\#(2c),w,y}-1)+1]=1 \quad (186\text{-}2)$$

When $(2\times f-1)-\alpha_{\#(2c),w,y}1<0$:

$$H_{x,w,comp}[2\times(2\times f-1)-1][((2\times f-1)-\alpha_{\#(2c),w,y}-1)+1+(2\times m\times z)]=1 \quad (186\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),w,y}-1)+1\}$, and $\{v\neq((2\times f-1)-\alpha_{\#(2c),w,y})+1+(2\times m\times z)\}$ (where y is an integer no smaller than one and no greater than $R_{\#(2c),w}$), the following holds true:

$$H_{x,w,comp}[2\times(2\times f-1)-1][v]=0 \quad (186\text{-}4)$$

Further, the following holds true for $H_{x,2,comp}[2\times(2\times f-1)-1][v]$. In the following, Ω=2 and y is an integer no smaller than $R_{\#(2c),\Omega}+1$ and no greater than $r_{\#(2c),\Omega}$.

[Math. 187]

When $(2\times f-1)-\alpha_{\#(2c),\Omega,y}1\geq 0$:

$$H_{x,\Omega,comp}[2\times(2\times f-1)][((2\times f-1)-\alpha_{\#(2c),\Omega,y}-1)+1]=1 \quad (187\text{-}1)$$

When $(2\times f-1)-\alpha_{\#(2c),\Omega,y}-1<0$:

$$H_{x,\Omega,comp}[2\times(2\times f-1)-1][((2\times f-1)-\alpha_{\#(2c),\Omega,y}-1)+1+(2\times m\times z)]=1 \quad (187\text{-}2)$$

For all v being an integer no smaller than one and no greater than 2×m×z satisfying $\{v\neq(2\times f-1)-\alpha_{\#(2c),\Omega,y}-1)+1\}$ and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)-1][v]=0 \quad (187\text{-}3)$$

Further, the following holds true for $H_{p1,comp}[2\times(2\times f-1)-1][v]$.

[Math. 188]

$$H_{p1,comp}[2\times(2\times f-1)-1][((2\times f-1)-0-1)+1]=1 \quad (188\text{-}1)$$

For all v being an integer no smaller than one and no greater than 2×m×z satisfying $\{v\neq((2\times f-1)-0-1)+1\}$, the following holds true:

$$H_{p1,comp}[2\times(2\times f-1)-1][v]=0 \quad (188\text{-}2)$$

Further, the following holds true for $H_{p2,comp}[2\times(2\times f-1)-1][v]$.

[Math. 189]

When $(2\times f-1)-\beta_{\#(2c),0}-1\geq 0$:

$$H_{p2,comp}[2\times(2\times f-1)-1][((2\times f-1)-\beta_{\#(2c),0}-1)+1]=1 \quad (189\text{-}1)$$

When $(2\times f-1)-\beta_{\#(2c),0}-1<0$:

$$H_{p2,comp}[2\times(2\times f-1)-1][((2\times f-1)-\beta_{\#(2c),0}-1)+1+(2\times m\times z)]=1 \quad (189\text{-}2)$$

For all v being an integer no smaller than one and no greater than 2×m×z satisfying {v≠((2×f−1)−$\beta_{\#(2c),0}$−1)+1} and {v≠((2×f−1)−$\beta_{\#(2c),0}$−1)+1+(2×m×z)}, the following holds true:

$$H_{p2,comp}[2\times(2\times f-1)-1][v]=0 \quad (189\text{-}3)$$

Further, (2) when g=2×f−1 (where f is an integer no smaller than two and no greater than m×z), when a vector for row 2×(2×f−1)−1 of the parity check matrix $H_{pro\_m}$, which is for the LDPC-CC of coding rate 2/4 that uses an improved tail-biting scheme (an LDPC block code using an LDPC-CC), can be generated by using a parity check polynomial satisfying zero provided by expression (165-1-2), ((2×f−1)−1)%2m=2c holds true. Accordingly, a parity check polynomial satisfying zero of expression (165-1-2) where 2i=2c holds true (where c is an integer no smaller than zero and no greater than m−1).

Accordingly, components $H_{x,1,comp}$[2×g−1][v]=$H_{x,1,comp}$[2×(2×f−1)−1][v], $H_{x,2,comp}$[2×g−1][v]=$H_{x,2,comp}$[2×(2×f−1)−1][v], $H_{p1,comp}$[2×g−1][v]=$H_{p1,comp}$[2×(2×f−1)−1][v], and $H_{p2,comp}$[2×g−1][v]=$H_{p2,comp}$[2×(2×f−1)−1][v] in row 2×g−1, or that is, row 2×(2×f−1)−1 of the parity check matrix $H_{pro\_m}$, which is for the LDPC-CC of coding rate 2/4 that uses an improved tail-biting scheme (an LDPC block code using an LDPC-CC), is expressed as follows.

First, the following holds true for $H_{x,1,comp}$[2×(2×f−1)−1][v]. In the following, w=1.

[Math. 190]

$$H_{x,w,comp}[2\times(2\times f-1)-1][((2\times f-1)-0-1)+1]=1 \quad (190\text{-}1)$$

When y is an integer no smaller than one and no greater than $R_{\#(2c),w}$, and (2×f−1)−$\alpha_{\#(2c),w,y}$−1≥0:

$$H_{x,w,comp}[2\times(2\times f-1)-1][((2\times f-1)-\alpha_{\#(2c),w,y}-1)+1]=1 \quad (190\text{-}2)$$

When (2×f−1)−$\alpha_{\#(2c),w,y}$−1<0:

$$H_{x,w,comp}[2\times(2\times f-1)-1][((2\times f-1)-\alpha_{\#(2c),w,y}-1)+1+(2\times m\times z)]=1 \quad (190\text{-}3)$$

For all v being an integer no smaller than one and no greater than 2×m×z satisfying {v≠((2×f−1)−0−1)+1}, {v≠((2×f−1)−$\alpha_{\#(2c),w,y}$−1)+1}, and {v≠((2×f−1)−$\alpha_{\#(2c),w,y}$−1)+1+(2×m×z)} (where y is an integer no smaller than one and no greater than $R_{\#(2c),w}$), the following holds true:

$$H_{x,w,comp}[2\times(2\times f-1)-1][v]=0 \quad (190\text{-}4)$$

Further, the following holds true for $H_{x,2,comp}$[2×(2×f−1)−1][v]. In the following, Ω=2 and y is an integer no smaller than $R_{\#(2c),\Omega}$+1 and no greater than $r_{\#(2c),\Omega}$.

[Math. 191]

When (2×f−1)−$\alpha_{\#(2c),\Omega,y}$−1≥0:

$$H_{x,\Omega,comp}[2\times(2\times f-1)-1][((2\times f-1)-\alpha_{\#(2c),\Omega,y}-1)+1]=1 \quad (191\text{-}1)$$

When (2×f−1)−$\alpha_{\#(2c),\Omega,y}$−1<0:

$$H_{x,\Omega,comp}[2\times(2\times f-1)-1][(2\times f-1)-\alpha_{\#(2c),\Omega,y-1})+1+(2\times m\times z)]=1 \quad (191\text{-}2)$$

For all v being an integer no smaller than one and no greater than 2×m×z satisfying {v≠(2×f−1)−$\alpha_{\#(2c),\Omega,y}$−1)+1} and {v≠((2×f−1)−$\alpha_{\#(2c),\Omega,y}$−1)+1+(2×m×z)} (where y is an integer no smaller than $R_{\#(2c),\Omega}$+1 and no greater than $r_{\#(2c),\Omega}$), the following holds true:

$$H_{x,\Omega,comp}[2\times(2\times f-1)-1][v]=0 \quad (191\text{-}3)$$

Further, the following holds true for $H_{p1,comp}$[2×(2×f−1)−1][v].

[Math. 192]

$$H_{p1,comp}[2\times(2\times f-1)-1][((2\times f-1)-0-1)+1]=1 \quad (192\text{-}1)$$

When (2×f−1)−$\beta_{\#(2c),1}$−1≥0:

$$H_{p1,comp}[2\times(2\times f-1)-1][((2\times f-1)-\beta_{\#(2c),1}-1)+1]=1 \quad (192\text{-}2)$$

When (2×f−1)−$\beta_{\#(2c),1}$−1<0:

$$H_{p1,comp}[2\times(2\times f-1)-1][((2\times f-1)-\beta_{\#(2c),1}-1)+1+(2\times m\times z)]=1 \quad (192\text{-}3)$$

For all v being an integer no smaller than one and no greater than 2×m×z satisfying {v≠((2×f−1)−0−1)+1}, {v≠((2×f−1)−$\beta_{\#(2c),1}$−1)+1}, and {v≠((2×f−1)−$\beta_{\#(2c),1}$−1)+1+(2×m×z)}, the following holds true:

$$H_{p1,comp}[2\times(2\times f-1)-1][v]=0 \quad (192\text{-}4)$$

Further, the following holds true for $H_{p2,comp}$[2×(2×f−1) 1][v].

[Math. 193]

For all v being an integer no smaller than one and no greater than 2×m×z, the following holds true:

$$H_{p2,comp}[2\times(2\times f-1)-1][v]=0 \quad (193)$$

Further, (3) when g=2×f−1 (where f is an integer no smaller than two and no greater than m×z), when a vector for row 2×(2×f−1) of the parity check matrix $H_{pro\_m}$, which is for the LDPC-CC of coding rate 2/4 that uses an improved tail-biting scheme (an LDPC block code using an LDPC-CC), can be generated by using a parity check polynomial satisfying zero provided by expression (165-2-1), ((2×f−1)−1)%2m=2c holds true. Accordingly, a parity check polynomial satisfying zero of expression (165-2-1) where 2i=2c holds true (where c is an integer no smaller than zero and no greater than m−1).

Accordingly, components $H_{x,1,comp}$[2×g][v]=$H_{x,1,comp}$[2×(2×f−1)][v], $H_{x,2,comp}$[2×g][v]=$H_{x,2,comp}$[2×(2×f−1)][v], $H_{p1,comp}$[2×g][v]=$H_{p1,comp}$[2×(2×f−1)][v], and $H_{p2,comp}$[2×g][v]=$H_{p2,comp}$[2×(2×f−1)][v] in row 2×g, or that is, row 2×(2×f−1) of the parity check matrix $H_{pro\_m}$, which is for the LDPC-CC of coding rate 2/4 that uses an improved tail-biting scheme (an LDPC block code using an LDPC-CC), is expressed as follows.

First, the following holds true for $H_{x,1,comp}$[2×(2×f−1)][v]. In the following, Ω=1 and y is an integer no smaller than $R_{\#(2c),\Omega}$+1 and no greater than $r_{\#(2c),\Omega}$.

[Math. 194]

When (2×f−1)−$\alpha_{\#(2c),\Omega,y}$−1≥0:

$$H_{x,\Omega,comp}[2\times(2\times f-1)][((2\times f-1)-\alpha_{\#(2c),\Omega,y}-1)+1]=1 \quad (194\text{-}1)$$

When (2×f−1)−$\alpha_{\#(2c),\Omega,y}$−1<0:

$$H_{x,\Omega,comp}[2\times(2\times f-1)][((2\times f-1)-\alpha_{\#(2c),\Omega,y}-1)+1+(2\times m\times z)]=1 \quad (194\text{-}2)$$

For all v being an integer no smaller than one and no greater than 2×m×z satisfying {v≠((2×f−1)−$\alpha_{\#(2c),\Omega,y}$−1)+1} and {v≠((2×f−1)−$\alpha_{\#(2c),\Omega,y}$−1)+1+(2×m×z)} (where y is an integer no smaller than $R_{\#(2c),\Omega}$+1 and no greater than $r_{\#(2c),\Omega}$), the following holds true:

$$H_{x,\Omega,comp}[2\times(2\times f-1)][v]=0 \quad (194\text{-}3)$$

Further, the following holds true for $H_{x,2,comp}$[2×(2×f−1)][v]. In the following, w=2.

[Math. 195]

$$H_{x,w,comp}[2\times(2\times f-1)][((2\times f-1)-0-1)+1]=1 \quad (195\text{-}1)$$

When y is an integer no smaller than one and no greater than $R_{\#(2c),w}$, and (2×f−1)−$\alpha_{\#(2c),w,y}$−1≥0:

$$H_{x,w,comp}[2\times(2\times f-1)][((2\times f-1)-\alpha_{\#(2c),w,y}-1)+1]=1 \quad (195\text{-}2)$$

When (2×f−1)−$\alpha_{\#(2c),w,y}$1<0:

$$H_{x,w,comp}[2\times(2\times f-1)][((2\times f-1)-\alpha_{\#(2c),w,y}-1)+1+(2\times m\times z)]=1 \quad (195\text{-}3)$$

For all v being an integer no smaller than one and no greater than 2×m×z satisfying {v≠((2×f−1)−0−1)+1}, {v≠((2×f−1)−$\alpha_{\#(2c),w,y}$−1)+1}, and {v≠((2×f−1)−$\alpha_{\#(2c),w,y}$−1)+1+(2×m×z)} (where y is an integer no smaller than one and no greater than $R_{\#(2c),w}$), the following holds true:

$$H_{x,w,comp}[2\times(2\times f-1)][v]=0 \quad (195\text{-}4)$$

Further, the following holds true for $H_{p1,comp}$[2×(2×f−1)][v].

[Math. 196]

When (2×f−1)−$\beta_{\#(2c),2}$−1≥0:

$$H_{p1,comp}[2\times(2\times f-1)][((2\times f-1)-\beta_{\#(2c),2}-1)+1]=1 \quad (196\text{-}1)$$

When (2×f−1)−$\beta_{\#(2c),2}$−1<0:

$$H_{p1,comp}[2\times(2\times f-1)][((2\times f-1)-\beta_{\#(2c),2}-1)+1+(2\times m\times z)]=1 \quad (196\text{-}2)$$

For all v being an integer no smaller than one and no greater than 2×m×z satisfying {v≠((2×f−1)−$\beta_{\#(2c),2}$−1)+1} and {v≠((2×f−1)−$\beta_{\#(2c),2}$−1)+1+(2×m×z)}, the following holds true:

$$H_{p1,comp}[2\times(2\times f-1)][v]=0 \quad (196\text{-}3)$$

Further, the following holds true for $H_{p2,comp}$[2×(2×f−1)][v].

[Math. 197]

$$H_{p2,comp}[2\times(2\times f-1)][((2\times f-1)-0-1)+1]=1 \quad (197\text{-}1)$$

For all v being an integer no smaller than one and no greater than 2×m×z satisfying {v≠((2×f−1)−0−1)+1}, the following holds true:

$$H_{p2,comp}[2\times(2\times f-1)][v]=0 \quad (197\text{-}2)$$

Further, (4) when g=2×f−1 (where f is an integer no smaller than two and no greater than m×z), when a vector for row 2×(2×f−1) of the parity check matrix $H_{pro\_m}$, which is for the LDPC-CC of coding rate 2/4 that uses an improved tail-biting scheme (an LDPC block code using an LDPC-CC), can be generated by using a parity check polynomial satisfying zero provided by expression (165-2-2), ((2×f−1)−1)%2m=2c holds true. Accordingly, a parity check polynomial satisfying zero of expression (165-2-2) where 2i=2c holds true (where c is an integer no smaller than zero and no greater than m−1).

Accordingly, components $H_{x,1,comp}$[2×g][v]=$H_{x,1,comp}$[2×(2×f−1)][v], $H_{x,2,comp}$[2×g][v]=$H_{x,2,comp}$[2×(2×f−1)][v], $H_{p1,comp}$[2×g][v]=$H_{p1,comp}$[2×(2×f−1)][v], and $H_{p2,comp}$[2×g][v]=$H_{p2,comp}$[2×(2×f−1)][v] in row 2×g, or that is, row 2×(2×f−1) of the parity check matrix $H_{pro\_m}$, which is for the LDPC-CC of coding rate 2/4 that uses an improved tail-biting scheme (an LDPC block code using an LDPC-CC), is expressed as follows.

First, the following holds true for $H_{x,1,comp}$[2×(2×f−1)][v]. In the following, Ω=1 and y is an integer no smaller than $R_{\#(2c),\Omega}$+1 and no greater than $r_{\#(2c),\Omega}$.

[Math. 198]

When (2×f−1)−$\alpha_{\#(2c),\Omega,y}$−1≥0:

$$H_{x,\Omega,comp}[2\times(2\times f-1)][((2\times f-1)-\alpha_{\#(2c),\Omega,y}-1)+1]=1 \quad (198\text{-}1)$$

When (2×f−1)−$\alpha_{\#(2c),\Omega,y}$−1<0:

$$H_{x,\Omega,comp}[2\times(2\times f-1)][((2\times f-1)-\alpha_{\#(2c),\Omega,y}-1)+1+(2\times m\times z)]=1 \quad (198\text{-}2)$$

For all v being an integer no smaller than one and no greater than 2×m×z satisfying {v≠((2×f−1)−$\alpha_{\#(2c),\Omega,y}$−1)+1} and {v≠((2×f−1)−$\alpha_{\#(2c),\Omega,y}$−1)+1+(2×m×z)} (where y is an integer no smaller than $R_{\#(2c),\Omega}$+1 and no greater than $r_{\#(2c),\Omega}$), the following holds true:

$$H_{x,\Omega,comp}[2\times(2\times f-1)][v]=0 \quad (198\text{-}3)$$

Further, the following holds true for $H_{x,2,comp}$[2×(2×f−1)][v]. In the following, w=2.

[Math. 199]

$$H_{x,w,comp}[2\times(2\times f-1)][((2\times f-1)-0-1)+1]=1 \quad (199\text{-}1)$$

When y is an integer no smaller than one and no greater than $R_{\#(2c),w}$, and (2×f−1)−$\alpha_{\#(2c),w,y}$−1≥0:

$$H_{x,w,comp}[2\times(2\times f-1)][((2\times f-1)-\alpha_{\#(2c),w,y}-1)+1]=1 \quad (199\text{-}2)$$

When (2×f−1)−$\alpha_{\#(2c),w,y}$−1<0:

$$H_{x,w,comp}[2\times(2\times f-1)][((2\times f-1)-\alpha_{\#(2c),w,y}-1)+1+(2\times m\times z)]=1 \quad (199\text{-}3)$$

For all v being an integer no smaller than one and no greater than 2×m×z satisfying {v≠((2×f−1)−0−1)+1}, {v≠((2×f−1)−$\alpha_{\#(2c),w,y}$−1)+1}, and {v≠((2×f−1)−$\alpha_{\#(2c),w,y}$−1)+1+(2×m×z)} (where y is an integer no smaller than one and no greater than $R_{\#(2c),w}$), the following holds true:

$$H_{x,w,comp}[2\times(2\times f-1)][v]=0 \quad (199\text{-}4)$$

Further, the following holds true for $H_{p1,comp}$[2×(2×f−1)][v].

[Math. 200]

For all v being an integer no smaller than one and no greater than 2×m×z, the following holds true:

$$H_{p1,comp}[2\times(2\times f-1)][v]=0 \quad (200)$$

Further, the following holds true for $H_{p2,comp}$[2×(2×f−1)][v].

[Math. 201]

$$H_{p2,comp}[2\times(2\times f-1)][((2\times f-1)-0-1)+1]=1 \quad (201\text{-}1)$$

When (2×f−1)−$\beta_{\#(2c),3}$−1≥0:

$$H_{p2,comp}[2\times(2\times f-1)][((2\times f-1)-\beta_{\#(2c),3}-1)+1]=1 \quad (201\text{-}2)$$

When (2×f−1)−$\beta_{\#(2c),3}$−1<0:

$$H_{p2,comp}[2\times(2\times f-1)][((2\times f-1)-\beta_{\#(2c),3}-1)+1+(2\times m\times z)]=1 \quad (201\text{-}3)$$

For all v being an integer no smaller than one and no greater than 2×m×z satisfying {v≠((2×f−1)−0−1)+1}, {v≠((2×f−1)−$\beta_{\#(2c),3}$−1)+1}, and {v≠((2×f−1)−$\beta_{\#(2c),3}$−1)+1+(2×m×z)}, the following holds true:

$$H_{p2,comp}[2\times(2\times f-1)][v]=0 \quad (201\text{-}4)$$

Further, (5) when g=2×f (where f is an integer no smaller than one and no greater than m×z), when a vector for row 2×(2×f)−1 of the parity check matrix $H_{pro\_m}$, which is for the LDPC-CC of coding rate 2/4 that uses an improved tail-biting scheme (an LDPC block code using an LDPC-CC), can be generated by using a parity check polynomial satisfying zero provided by expression (166-1-1), ((2×f)−1)%2m=2d+1 holds true. Accordingly, a parity check polynomial satisfying zero of expression (166-1-1) where 2i+1=2d+1 holds true (where d is an integer no smaller than zero and no greater than m−1).

Accordingly, components $H_{x,1,comp}$[2×g−1][v]=$H_{x,1,comp}$[2×(2×f)−1][v], $H_{x,2,comp}$[2×g−1][v]=$H_{x,2,comp}$[2×(2×f)−1][v], $H_{p1,comp}$[2×g−1][v]=$H_{p1,comp}$[2×(2×f)−1][v], and $H_{p2,comp}$[2×g−1][v]=$H_{p2,comp}$[2×(2×f)−1][v] in row 2×g−1, or that is, row 2×(2×f)−1 of the parity check matrix $H_{pro\_m}$, which is for the LDPC-CC of coding rate 2/4 that uses an improved tail-biting scheme (an LDPC block code using an LDPC-CC), is expressed as follows.

First, the following holds true for $H_{x,1,comp}$[2×(2×f)−1][v]. In the following, Ω=1 and y is an integer no smaller than $R_{\#(2d+1),\Omega}$+1), and no greater than $r_{\#(2d+1),\Omega}$.

[Math. 202]

When $(2\times f)-\alpha_{\#(2d+1),\Omega,y}-1\geq 0$:

$$H_{x,\Omega,comp}[2\times(2\times f)-1][((2\times f)-\alpha_{\#(2d+1)\Omega,y}-1)+1]=1 \qquad (202\text{-}1)$$

When $(2\times f)-\alpha_{\#(2d+1),\Omega,y}-1<0$:

$$H_{x,\Omega,comp}[2\times(2\times f)-1][((2\times f)-\alpha_{\#(2d+1),\Omega,y}-1)+1+(2\times m\times z)]=1 \qquad (202\text{-}2)$$

For all v being an integer no smaller than one and no greater than 2×m×z satisfying $\{v\neq((2\times f)-\alpha_{\#(2d+1),\Omega,y}-1)+1\}$ and $\{v\neq((2\times f)-\alpha_{\#(2d+1),\Omega,y}-1)+1+(2\times m\times z)\}$ (where y is an integer no smaller than $R_{\#(2d+1),\Omega}+1$ and no greater than $r_{\#(2d+1),\Omega}$), the following holds true:

$$H_{x,\Omega,comp}[2\times(2\times f)-1][v]=0 \qquad (202\text{-}3)$$

Further, the following holds true for $H_{x,2,comp}[2\times(2\times f)-1][v]$. In the following, w=2.

[Math. 203]

$$H_{x,w,comp}[2\times(2\times f)-1][((2\times f)-0-1)+1]=1 \qquad (203\text{-}1)$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)-1][((2\times f)-\alpha_{\#(2d+1),w,y}-1)+1]=1 \qquad (203\text{-}2)$$

When $(2\times f)-\alpha_{\#(2d+1),w,y}-1<0$:

$$H_{x,w,comp}[2\times(2\times f)-1][((2\times f)-\alpha_{\#(2d+1),w,y}-1)+1+(2\times m\times z)]=1 \qquad (203\text{-}3)$$

For all v being an integer no smaller than one and no greater than 2×m×z satisfying $\{v\neq((2\times f)-0-1)+1\}$, $\{v\neq(2\times f)-\alpha_{\#(2d+1),w,y}-1)+1\}$, and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)-1][v]=0 \qquad (203\text{-}4)$$

Further, the following holds true for $H_{p1,comp}[2\times(2\times f)-1][v]$.

[Math. 204]

$$H_{p1,comp}[2\times(2\times f)-1][((2\times f)-0-1)+1]=1 \qquad (204\text{-}1)$$

For all v being an integer no smaller than one and no greater than 2×m×z satisfying $\{v\neq((2\times f)-0-1)+1\}$, the following holds true:

$$H_{p1,comp}[2\times(2\times f)-1][v]=0 \qquad (204\text{-}1)$$

Further, the following holds true for $H_{p2,comp}[2\times(2\times f)-1][v]$.

[Math. 205]

When $(2\times f)-\beta_{\#(2d+1),0}-1\geq 0$:

$$H_{p2,comp}[2\times(2\times f)-1][((2\times f)-\beta_{\#(2d+1),0}-1)+1]=1 \qquad (205\text{-}1)$$

When $(2-f)-\beta_{\#(2d+1),0}-1<0$:

$$H_{p2,comp}[2\times(2\times f)-1][((2\times f)-\beta_{\#(2d+1),0}-1)+1+(2\times m\times z)]=1 \qquad (205\text{-}2)$$

For all v being an integer no smaller than one and no greater than 2×m×z satisfying $\{v\neq((2\times f)-\beta_{\#(2d+1),0}-1)+1\}$ and $\{v\neq((2\times f)-\beta_{\#(2d+1),0}-1)+1+(2\times m\times z)\}$, the following holds true:

$$H_{p2,comp}[2\times(2\times f)-1][v]=0 \qquad (205\text{-}3)$$

Further, (6) when g=2×f (where f is an integer no smaller than one and no greater than m×z), when a vector for row 2×(2×f)−1 of the parity check matrix $H_{pro\_m}$, which is for the LDPC-CC of coding rate 2/4 that uses an improved tail-biting scheme (an LDPC block code using an LDPC-CC), can be generated by using a parity check polynomial satisfying zero provided by expression (166-1-2), ((2×f)−1) %2m=2d+1 holds true. Accordingly, a parity check polynomial satisfying zero of expression (166-1-2) where 2i+1=2d+1 holds true (where d is an integer no smaller than zero and no greater than m−1).

Accordingly, components $H_{x,1,comp}[2\times g-1][v]=H_{x,1,comp}[2\times(2\times f)-1][v]$, $H_{x,2,comp}[2\times g-1][v]=H_{x,2,comp}[2\times(2\times f)-1][v]$, $H_{p1,comp}[2\times g-1][v]=H_{p1,comp}[2\times(2\times f)-1][v]$, and $H_{p2,comp}[2\times g-1][v]=H_{p2,comp}[2\times(2\times f)-1][v]$ in row 2×g−1, or that is, row 2×(2×f)−1 of the parity check matrix $H_{pro\_m}$, which is for the LDPC-CC of coding rate 2/4 that uses an improved tail-biting scheme (an LDPC block code using an LDPC-CC), is expressed as follows.

First, the following holds true for $H_{x,1,comp}[2\times(2\times f)-1][v]$. In the following, Ω=1 and y is an integer no smaller than $R_{\#(2d+1),\Omega}+1$), and no greater than $r_{\#(2d+1),\Omega}$.

[Math. 206]

When $(2\times f)-\alpha_{\#(2d+1),\Omega,y}-1\geq 0$:

$$H_{x,\Omega,comp}[2\times(2\times f)-1][((2\times f)-\alpha_{\#(2d+1),\Omega,y}-1)+1]=1 \qquad (206\text{-}1)$$

When $(2\times f)-\alpha_{\#(2d+1),\Omega,y}-1<0$:

$$H_{x,\Omega,comp}[2\times(2\times f)-1][((2\times f)-\alpha_{\#(2d+1),\Omega,y}-1)+1+(2\times m\times z)]=1 \qquad (206\text{-}2)$$

For all v being an integer no smaller than one and no greater than 2×m×z satisfying $\{v\neq((2\times f)-\alpha_{\#(2d+1),\Omega,y}-1)+1\}$ and $\{v\neq((2\times f)-\alpha_{\#(2d+1),\Omega,y}-1)+1+(2\times m\times z)\}$ (where y is an integer no smaller than $R_{\#(2d+1),\Omega}+1$ and no greater than $r_{\#(2d+1),\Omega}$), the following holds true:

$$H_{x,\Omega,comp}[2\times(2\times f)-1][v]=0 \qquad (206\text{-}3)$$

Further, the following holds true for $H_{x,2,comp}[2\times(2\times f)-1][v]$. In the following, w=2.

[Math. 207]

$$H_{x,w,comp}[2\times(2\times f)-1][((2\times f)-0-1)+1]=1 \qquad (207\text{-}1)$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)-1][((2\times f)-\alpha_{\#(2d+1),w,y}-1)+1]=1 \qquad (207\text{-}2)$$

When $(2\times f)-\alpha_{\#(2d+1),w,y}-1<0$:

$$H_{x,w,comp}[2\times(2\times f)-1][((2\times f)-\alpha_{\#(2d+1),w,y}-1)+1+(2\times m\times z)]=1 \qquad (207\text{-}3)$$

For all v being an integer no smaller than one and no greater than 2×m×z satisfying $\{v\neq((2\times f)-0-1)+1\}$, $\{v\neq((2\times f)-\alpha_{\#(2d+1),w,y}-1)+1\}$, and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)-1][v]=0 \qquad (207\text{-}4)$$

Further, the following holds true for $H_{p1,comp}[2\times(2\times f)-1][v]$.

[Math. 208]

$$H_{p1,comp}[2\times(2\times f)-1][((2\times f)-0-1)+1]=1 \qquad (208\text{-}1)$$

When $(2\times f)-\beta_{\#(2d+1),1}-1\geq 0$:

$$H_{p1,comp}[2\times(2\times f)-1][((2\times f)-\beta_{\#(2d+1),1}-1)+1]=1 \qquad (208\text{-}2)$$

When $(2\times f)-\beta_{\#(2d+1),1}-1<0$:

$$H_{p1,comp}[2\times(2\times f)-1][((2\times f)-\beta_{\#(2d+1),1}-1)+1+(2\times m\times z)]=1 \qquad (208\text{-}3)$$

For all v being an integer no smaller than one and no greater than 2×m×z satisfying $\{v\neq((2\times f)-0-1)+1\}$, $\{v\neq((2\times f)-\beta_{\#(2d+1),1}-1)+1\}$, and $\{v\neq((2\times f)-\beta_{\#(2d+1),1}-1)+1+(2\times m\times z)\}$, the following holds true:

$$H_{p1,comp}[2\times(2\times f)-1][v]=0 \qquad (208\text{-}4)$$

Further, the following holds true for $H_{p2,comp}[2\times(2\times f)-1][v]$.

[Math. 209]

For all v being an integer no smaller than one and no greater than 2×m×z, the following holds true:

$$H_{p2,comp}[2\times(2\times f)-1][v]=0 \qquad (209)$$

Further, (7) when g=2×f (where f is an integer no smaller than one and no greater than m×z), when a vector for row 2×(2×f) of the parity check matrix $H_{pro\_m}$, which is for the LDPC-CC of coding rate 2/4 that uses an improved tail-biting scheme (an LDPC block code using an LDPC-CC), can be generated by using a parity check polynomial satisfying zero provided by expression (166-2-1), ((2×f)−1)%2m=2d+1 holds true. Accordingly, a parity check polynomial satisfying zero of expression (166-2-1) where 2i+1=2d+1 holds true (where d is an integer no smaller than zero and no greater than m−1).

Accordingly, components $H_{x,1,comp}[2\times g][v]=H_{x,1,comp}[2\times(2\times f)][v]$, $H_{x,2,comp}[2\times g][v]=H_{x,2,comp}[2\times(2\times f)][v]$, $H_{p1,comp}[2\times g][v]=H_{p1,comp}[2\times(2\times f)][v]$, and $H_{p2,comp}[2\times g][v]=H_{p2,comp}[2\times(2\times f)][v]$ in row 2×g, or that is, row 2×(2×f) of the parity check matrix $H_{pro\_m}$, which is for the LDPC-CC of coding rate 2/4 that uses an improved tail-biting scheme (an LDPC block code using an LDPC-CC), is expressed as follows.

The following holds true for $H_{x,1,comp}[2\times(2\times f)][v]$. In the following, w=1.

[Math. 210]

$$H_{x,w,comp}[2\times(2\times f)][((2\times f)-0-1)+1]=1 \tag{210-1}$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)][((2\times f)-\alpha_{\#(2d+1),w,y}-1)+1]=1 \tag{210-2}$$

When $(2\times f)-\alpha_{\#(2d+1),w,y}-1<0$:

$$H_{x,w,comp}[2\times(2\times f)][((2\times f)-\alpha_{\#(2d+1),w,y}-1)+1+(2\times m\times z)]=1 \tag{210-3}$$

For all v being an integer no smaller than one and no greater than 2×m×z satisfying $\{v\neq((2\times f)-0-1)+1\}$, $\{v\neq((2\times f)-\alpha_{\#(2d+1),w,y}-1)+1\}$, and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)][v]=0 \tag{210-4}$$

The following holds true for $H_{x,2,comp}[2\times(2\times f)][v]$. In the following, Ω=2 and y is an integer no smaller than $R_{\#(2d+1),\Omega}$ and no greater than $r_{\#(2d+1),\Omega}$.

[Math. 211]

When $(2\times f)-\alpha_{\#(2d+1),\Omega,y}-1\geq 0$:

$$H_{x,\Omega,comp}[2\times(2\times f)][((2\times f)-\alpha_{\#(2d+1),\Omega,y}-1)+1]=1 \tag{211-1}$$

When $(2\times f)-\alpha_{\#(2d+1),\Omega,y}-1<0$:

$$H_{x,\Omega,comp}[2\times(2\times f)][((2\times f)-\alpha_{\#(2d+1),\Omega,y}-1)+1+(2\times m\times z)]=1 \tag{211-2}$$

For all v being an integer no smaller than one and no greater than 2×m×z satisfying $\{v\neq((2\times f)-\alpha_{\#(2d+1),\Omega,y}-1)+1\}$ and $\{v\neq((2\times f)-\alpha_{\#(2d+1),\Omega,y}-1)+1+(2\times m\times z)\}$ (where y is an integer no smaller than $R_{\#(2d+1),\Omega}+1$ and no greater than $r_{\#(2d+1),\Omega}$), the following holds true:

$$H_{x,\Omega,comp}[2\times(2\times f)][v]=0 \tag{211-3}$$

Further, the following holds true for $H_{p1,comp}[2\times(2\times f)][v]$.

[Math. 212]

When $(2\times f)-\beta_{\#(2d+1),2}-1\geq 0$:

$$H_{p1,comp}[2\times(2\times f)][((2\times f)-\beta_{\#(2d+1),2}-1)+1]=1 \tag{212-1}$$

When $(2\times f)-\beta_{\#(2d+1),2}-1<0$:

$$H_{p1,comp}[2\times(2\times f)][((2\times f)-\alpha_{\#(2d+1),2}-1)+1+(2\times m\times z)]=1 \tag{212-2}$$

For all v being an integer no smaller than one and no greater than 2×m×z satisfying $\{v\neq((2\times f)-\beta_{\#(2d+1),2}-1)+1\}$ and $\{v\neq((2\times f)-\beta_{\#(2d+1),2}-1)+1+(2\times m\times z)\}$, the following holds true:

$$H_{p1,comp}[2\times(2\times f)][v]=0 \tag{212-3}$$

Further, the following holds true for $H_{p2,comp}[2\times(2\times f)][v]$.

[Math. 213]

$$H_{p2,comp}[2\times(2\times f)][((2\times f)-0-1)+1]=1 \tag{213-1}$$

For all v being an integer no smaller than one and no greater than 2×m×z satisfying $\{v\neq((2\times f)-0-1)+1\}$, the following holds true:

$$H_{p2,comp}[2\times(2\times f)][v]=0 \tag{213-2}$$

Further, (8) when g=2×f (where f is an integer no smaller than one and no greater than m×z), when a vector for row 2×(2×f) of the parity check matrix $H_{pro\_m}$, which is for the LDPC-CC of coding rate 2/4 that uses an improved tail-biting scheme (an LDPC block code using an LDPC-CC), can be generated by using a parity check polynomial satisfying zero provided by expression (166-2-2), ((2×f)−1)%2m=2d+1 holds true. Accordingly, a parity check polynomial satisfying zero of expression (166-2-2) where 2i+1=2d+1 holds true (where d is an integer no smaller than zero and no greater than m−1).

Accordingly, components $H_{x,1,comp}[2\times g][v]=H_{x,1,comp}[2\times(2\times f)][v]$, $H_{x,2,comp}[2\times g][v]=H_{x,2,comp}[2\times(2\times f)][v]$, $H_{p1,comp}[2\times g][v]=H_{p1,comp}[2\times(2\times f)][v]$, and $H_{p2,comp}[2\times g][v]=H_{p2,comp}[2\times(2\times f)][v]$ in row 2×g, or that is, row 2×(2×f) of the parity check matrix $H_{pro\_m}$, which is for the LDPC-CC of coding rate 2/4 that uses an improved tail-biting scheme (an LDPC block code using an LDPC-CC), is expressed as follows.

The following holds true for $H_{x,1,comp}[2\times(2\times f)][v]$. In the following, w=1.

[Math. 214]

$$H_{x,w,comp}[2\times(2\times f)][((2\times f)-0-1)+1]=1 \tag{214-1}$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)][((2\times f)-\alpha_{\#(2d+1),w,y}-1)+1]=1 \tag{214-2}$$

When $(2\times f)-\alpha_{\#(2d+1),w,y}-1<0$:

$$H_{x,w,comp}[2\times(2\times f)][((2\times f)-\alpha_{\#(2d+1),w,y}-1)+1+(2\times m\times z)]=1 \tag{214-3}$$

For all v being an integer no smaller than one and no greater than 2×m×z satisfying $\{v\neq((2\times f)-0-1)+1\}$, $\{v\neq((2\times f)-\alpha_{\#(2d+1),w,y}-1)+1\}$, and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)][v]=0 \tag{214-4}$$

The following holds true for $H_{x,2,comp}[2\times(2\times f)][v]$. In the following, Ω=2 and y is an integer no smaller than $R_{\#(2d+1),\Omega}+1$ and no greater than $r_{\#(2d+1),\Omega}$.

[Math. 215]

When $(2\times f)-\alpha_{\#(2d+1),\Omega,y}-1\geq 0$:

$$H_{x,\Omega,comp}[2\times(2\times f)][((2\times f)-\alpha_{\#(2d+1),\Omega,y}-1)+1]=1 \tag{215-1}$$

When $(2\times f)-\alpha_{\#(2d+1),\Omega,y}-1<0$:

$$H_{x,\Omega,comp}[2\times(2\times f)][((2\times f)-\alpha_{\#(2d+1),\Omega,y}-1)+1+(2\times m\times z)]=1 \tag{215-2}$$

For all v being an integer no smaller than one and no greater than 2×m×z satisfying $\{v\neq((2\times f)-\alpha_{\#(2d+1),\Omega,y}-1)+1\}$ and $\{v\neq((2\times f)-\alpha_{\#(2d+1),\Omega,y}-1)+1+(2\times m\times z)\}$ (where y is an integer no smaller than $R_{\#(2d+1),\Omega}+1$ and no greater than $r_{\#(2d+1),\Omega}$), the following holds true:

$$H_{x,\Omega,comp}[2\times(2\times f)][v]=0 \tag{215-3}$$

Further, the following holds true for $H_{p1,comp}[2\times(2\times f)][v]$.

[Math. 216]

For all v being an integer no smaller than one and no greater than 2×m×z, the following holds true:

$$H_{p1,comp}[2\times(2\times f)][v]=0 \quad (216)$$

Further, the following holds true for $H_{p2,comp}[2\times(2\times f)][v]$.

[Math. 217]

$$H_{p2,comp}[2\times(2\times f)][((2\times f)-0-1)+1]=1 \quad (217\text{-}1)$$

When $(2\times f)-\beta_{\#(2d+1),3}-1\geq 0$:

$$H_{p2,comp}[2\times(2\times f)][((2\times f)-\beta_{\#(2d+1),3}-1)+1]=1 \quad (217\text{-}2)$$

When $(2\times f)-\beta_{\#(2d+1),3}-1<0$:

$$H_{p2,comp}[2\times(2\times f)][((2\times f)-\beta_{\#(2d+1),3}-1)+1+(2\times m\times z)]=1 \quad (217\text{-}3)$$

For all v being an integer no smaller than one and no greater than 2×m×z satisfying $\{v\neq((2\times f)-0-1)+1\}$, $\{v\neq((2\times f)-\beta_{\#(2d+1),3}-1)+1\}$, and $\{v\neq((2\times f)-\beta_{\#(2d+1),3}-1)+1+(2\times m\times z)\}$, the following holds true:

$$H_{p2,comp}[2\times(2\times f)][v]=0 \quad (217\text{-}4)$$

An LDPC-CC of coding rate 2/4 that uses an improved tail-biting scheme (an LDPC block code using an LDPC-CC) can be generated as described above, and the code so generated achieves high error correction capability.

In the above, parity check polynomials satisfying zero for the LDPC-CC of coding rate 2/4 that uses an improved tail-biting scheme (an LDPC block code using an LDPC-CC) are set as follows:

the 0th parity check polynomial satisfying zero is a parity check polynomial satisfying zero of #0'; first expression provided by expression 173;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

Based on this, the following method is conceivable as a configuration where usage of parity check polynomials satisfying zero is limited.

In this configuration, parity check polynomials satisfying zero for the LDPC-CC of coding rate 2/4 that uses an improved tail-biting scheme (an LDPC block code using an LDPC-CC) are set as follows:

the 0th parity check polynomial satisfying zero is a parity check polynomial satisfying zero of #0'; first expression provided by expression 173;

the first parity check polynomial satisfying zero is a parity check polynomial satisfying zero of #0; second expression provided by expression (165-2-1);

the 2×i−2th parity check polynomial satisfying zero is a parity check polynomial satisfying zero of #((i−1)%2m); first expression provided by expression (165-1-1) or expression (166-1-1); and the 2×i−1th parity check polynomial satisfying zero is a parity check polynomial satisfying zero of #((i−1)%2m); second expression provided by expression (165-2-1) or expression (166-2-1) (where i is an integer no smaller than two and no greater than 2×m×z).

Accordingly, in the parity check matrix $H_{pro\_m}$ for the LDPC-CC of coding rate 2/4 that uses an improved tail-biting scheme (an LDPC block code using an LDPC-CC):

the vector composed of row one of the parity check matrix $H_{pro\_m}$ is generated by using a parity check polynomial satisfying zero of #0'; first expression provided by expression 173;

the vector composed of row two of the parity check matrix $H_{pro\_m}$ is generated by using a parity check polynomial satisfying zero of #0; second expression provided by expression (165-2-1);

the vector composed of row 2×g−1 of the parity check matrix $H_{pr}$, is generated by using a parity check polynomial satisfying zero of #((g−1)%2m); first expression provided by expression (165-1-1) or expression (166-1-1); and the vector composed of row 2×g of the parity check matrix $H_{pro\_m}$ is generated by using a parity check polynomial satisfying zero of #((g−1)%2m); second expression provided by expression (165-2-1) or expression (166-2-1) (where g is an integer no smaller than two and no greater than 2×m×z).

Note that when making such a configuration, the above-described method of configuring the parity check matrix $H_{pro}$ for the LDPC-CC of coding rate 2/4 that uses an improved tail-biting scheme (an LDPC block code using an LDPC-CC) is applicable.

Such a method also enables generating a code with high error correction capability.

Embodiment 5

In embodiment 4, description is provided of an LDPC-CC of coding rate 2/4 that uses an improved tail-biting scheme (an LDPC block code using an LDPC-CC) and a method of configuring a parity check matrix for the code.

With regards to parity check matrices for low density parity check (block) codes, one example of which is the LDPC-CC of coding rate 2/4 that uses an improved tail-biting scheme (an LDPC block code using an LDPC-CC), a parity check matrix equivalent to a parity check matrix defined for a given LDPC code can be generated by using the parity check matrix defined for the given LDPC code.

For example, a parity check matrix equivalent to the parity check matrix $H_{pro\_m}$ described in embodiment 4, which is for the LDPC-CC of coding rate 2/4 that uses an improved tail-biting scheme (an LDPC block code using an LDPC-CC), can be generated by using the parity check matrix $H_{pro\_m}$.

The following describes a method of generating a parity check matrix equivalent to a parity check matrix defined for a given LDPC by using the parity check matrix defined for the given LDPC code.

Note that the method of generating an equivalent parity check matrix described in the present embodiment is not only applicable to the LDPC-CC of coding rate 2/4 that uses an improved tail-biting scheme (an LDPC block code using an LDPC-CC) described in embodiment 4, but also is widely applicable to LDPC codes in general.

FIG. 31 illustrates the configuration of a parity check matrix H for an LDPC (block) code of coding rate (N−M)/N (N>M>0). For example, the parity check matrix of FIG. 31 has M rows and N columns. Here, to provide a general description, the parity check matrix H in FIG. 31 is considered to be a parity check matrix for defining an LDPC (block) code #A of coding rate (N−M)/N (N>M>0).

In FIG. 31, a transmission sequence (codeword) for block j is $v_j^T=(Y_{j,1}, Y_{j,2}, Y_{j,3}, \ldots, Y_{j,N-2}, Y_{j,N-1}, Y_{j,N})$ (for systematic codes, $Y_{j,k}$ (where k is an integer no smaller than one and no greater than N) is information X or parity P (parity $P_{pro}$)).

Here, $Hv_j=0$ holds true (where the zero in $Hv_j=0$ indicates that all elements of the vector $Hv_j$ are zeroes. That is, row k of the vector $Hv_j$ has a value of zero for all k (where k is an integer no smaller than one and no greater than M)).

Then, an element of row k (where k is an integer no smaller than one and no greater than N) of the transmission sequence $v_j$ of block j (in FIG. 31, an element of column k in the transpose matrix $v_j^T$ of the transmission sequence $v_j$) is $Y_{j,k}$, and a vector obtained by extracting column k of the parity check matrix H for the LDPC (block) code #A of coding rate (N−M)/N (N>M>0) can be expressed as $c_k$, as illustrated in FIG. 31. Here, the parity check matrix H is expressed as follows.

[Math. 218]

$$H=[c_1c_2c_3 \ldots c_{N-2}c_{N-1}c_N] \tag{281}$$

FIG. 32 illustrates a configuration when interleaving is applied to the transmission sequence (codeword) $v_j^T=(Y_{j,1}, Y_{j,2}, Y_{j,3}, \ldots, Y_{j,N-2}, Y_{j,N-1}, Y_{j,N})$ of block j. In FIG. 32, an encoding section 3202 receives information 3201 as input, performs encoding thereon, and outputs encoded data 3203. For example, when encoding the LDPC (block) code #A of coding rate (N−M)/N (N>M>0), the encoder 3202 receives information in block j as input, performs encoding thereon based on the parity check matrix H for the LDPC (block) code #A of coding rate (N−M)/N (N>M>0), and outputs the transmission sequence (codeword) $v_j^T=(Y_{j,1}, Y_{j,2}, Y_{j,3}, \ldots, Y_{j,N-2}, Y_{j,N-1}, Y_{j,N})$ of block j.

Then, an accumulation and reordering section (interleaving section) 3204 receives the encoded data 3203 as input, accumulates the encoded data 3203, performs reordering thereon, and outputs interleaved data 3205. Accordingly, the accumulation and reordering section (interleaving section) 3204 receives the transmission sequence $v_j=(Y_{j,1}, Y_{j,2}, Y_{j,3}, \ldots, Y_{j,N-2}, Y_{j,N-1}, Y_{j,N})^T$ of block j as input, and outputs a transmission sequence (codeword) $v'_j=(Y_{j,32}, Y_{j,99}, Y_{j,23}, \ldots, Y_{j,234}, Y_{j,3}, Y_{j,43})^T$, which is illustrated in FIG. 32, as a result of reordering being performed on the elements of the transmission sequence $v_j$ ($v'_j$ being an example). Here, as discussed above, the transmission sequence $v'_j$ is obtained by reordering the elements of the transmission sequence $v_j$ of block j. Accordingly, $v'_j$ is a vector having one row and n columns, and the N elements of $v'_j$ are such that one each of the terms $Y_{j,1}, Y_{j,2}, Y_{j,3}, \ldots, Y_{j,N-2}, Y_{j,N-1}, Y_{j,N}$ is present.

Here, an encoding section 3207 as shown in FIG. 32 having the functions of the encoding section 3202 and the accumulation and reordering section (interleaving section) 3204 is considered. Accordingly, the encoding section 3207 receives the information 3201 as input, performs encoding thereon, and outputs the encoded data 3203. For example, the encoding section 3207 receives information in block j as input, and as shown in FIG. 32, outputs the transmission sequence (codeword) $v'_j(Y_{j,32}, Y_{j,99}, Y_{j,23}, \ldots, Y_{j,234}, Y_{j,3}, Y_{j,43})^T$. In the following, explanation is provided of a parity check matrix H' for the LDPC (block) code of coding rate (N−M)/N (N>M>0) corresponding to the encoding section 3207 (i.e., a parity check matrix H' that is equivalent to the parity check matrix H for the LDPC (block) code #A of coding rate (N−M)/N (N>M>0)), while referring to FIG. 33. (Needless to say, the parity check matrix H' is a parity check matrix for the LDPC (block) code #A of coding rate (N−M)/N (N>M>0).)

FIG. 33 shows a configuration of the parity check matrix H', which is a parity check matrix equivalent to the parity check matrix H for the LDPC (block) code #A of coding rate (N−M)/N (N>M>0), when the transmission sequence (codeword) is $v'_j=(Y_{j,32}, Y_{j,99}, Y_{j,23}, \ldots, Y_{j,234}, Y_{j,3}, Y_{j,43})^T$. Here, an element of row one of the transmission sequence $v'_j$ of block j (an element of column one in the transpose matrix $v'^T_j$ of the transmission sequence $v'_j$ in FIG. 33) is $Y_{j,32}$. Accordingly, a vector obtained by extracting column one of the parity check matrix H', when using the above-described vector $c_k$ (k=1, 2, 3, . . . , N−2, N−1, N), is $c_{32}$. Similarly, an element of row two of the transmission sequence $v'_j$ of block j (an element of column two in the transpose matrix $v'^T_j$ of the transmission sequence $v'_j$ in FIG. 33) is $Y_{j,99}$. Accordingly, a vector obtained by extracting column two of the parity check matrix H' is $c_{99}$. Further, as shown in FIG. 33, a vector obtained by extracting column three of the parity check matrix H' is $c_{23}$, a vector obtained by extracting column N−2 of the parity check matrix H' is $c_{234}$, a vector obtained by extracting column N−1 of the parity check matrix H' is $c_3$, and a vector obtained by extracting column N of the parity check matrix H' is $c_{43}$.

That is, when denoting an element of row i of the transmission sequence $v'_j$ of block j (an element of column i in the transpose matrix $v'^T_j$ of the transmission sequence $v'_j$ in FIG. 33) as $Y_{j,g}$ (where g=1, 2, 3, . . . , N−1, N−1, N), then a vector obtained by extracting column i of the parity check matrix H' is $c_g$, when using the vector $c_k$ described above.

Accordingly, the parity check matrix H' for transmission sequence (codeword) $v'_j=(Y_{j,32}, Y_{j,99}, Y_{j,23}, \ldots, Y_{j,234}, Y_{j,3}, Y_{j,43})^T$ is expressed as follows.

[Math. 219]

$$H'[c_{32}c_{99}c_{23} \ldots c_{234}c_3c_{43}] \tag{219}$$

When denoting an element of row i of the transmission sequence $v'_j$ of block j (an element of column i in the transpose matrix $v'^T_j$ of the transmission sequence $v'_j$ in FIG. 33) as $Y_{j,g}$ (where g=1, 2, 3, . . . , N−1, N−1, N), a vector obtained by extracting column i of the parity check matrix H' is $c_g$, when using the vector $c_k$ described above. When the above is followed to create a parity check matrix, then a parity check matrix for the transmission sequence $v'_j$ of block j can be obtained with no limitation to the above-given example.

Accordingly, when interleaving is applied to the transmission sequence (codeword) of the LDPC (block) code #A of coding rate (N−M)/N (N>M>0), a matrix for the interleaved transmission sequence is obtained by performing reordering of columns (column permutation) as described above on the parity check matrix H for the LDPC (block) code #A of coding rate (N−M)/N (N>M>0).

As such, it naturally follows that the transmission sequence (codeword) ($v_j$) obtained by reverting the interleaved transmission sequence (codeword) ($v'_j$) to its original order is the transmission sequence (codeword) of the LDPC (block) code #A of coding rate (N−M)/N (N>M>0). Accordingly, by reverting the interleaved transmission sequence (codeword) ($v'_j$) and a parity check matrix H' corresponding to the interleaved transmission sequence (codeword) ($v'_j$) to their respective orders, the transmission sequence $v_j$ and a parity check matrix corresponding to the transmission sequence $v_j$ can be obtained, respectively. Further, the parity check matrix obtained by performing the reordering as described above is the parity check matrix H in FIG. 31, description of which has been provided above.

FIG. 34 illustrates an example of a decoding-related configuration of a receiving device, when encoding of FIG. 32 has been performed. The transmission sequence obtained when the encoding of FIG. 32 is performed undergoes processing such as mapping in accordance with a modulation scheme, frequency conversion, and modulated signal amplification, whereby a modulated signal is obtained. A transmitting device transmits the modulated signal. The receiving device then receives the modulated signal transmitted by the transmitting device to obtain a received signal. A log-likelihood ratio calculation section 3400 illustrated in FIG. 34 takes the received signal as input, calculates a log-likelihood ratio for each bit of the codeword, and outputs a log-likelihood ratio signal 3401.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ of block j. Then, the log-likelihood ratio calculation section 3400 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios.

An accumulation and reordering section (deinterleaving section) 3402 receives the log-likelihood ratio signal 3401 as input, performs accumulation and reordering thereon, and outputs a deinterleaved log-likelihood ratio signal 3403.

For example, the accumulation and reordering section (deinterleaving section) 3402 receives, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, performs reordering, and outputs the log-likelihood ratios in the order of: the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order.

A decoder 3404 receives the deinterleaved log-likelihood ratio signal 3403 as input, performs belief propagation (BP) decoding as disclosed in Non-Patent Literature 6 to 8, such as sum-product decoding, min-sum decoding, offset BP decoding, normalized BP decoding, shuffled BP decoding, and layered BP decoding in which scheduling is performed, based on the parity check matrix H for the LDPC (block) code #A of coding rate (N−M)/N (N>M>0) as illustrated in FIG. 31, and thereby obtains an estimation sequence 3405 (note that decoding schemes other than belief propagation decoding may be used).

For example, the decoder 3404 receives, as input, the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order, performs belief propagation decoding based on the parity check matrix H for the LDPC (block) code #A of coding rate (N−M)/N (N>M>0) as illustrated in FIG. 31, and obtains the estimation sequence (note that decoding schemes other than belief propagation decoding may be used).

The following describes a decoding-related configuration that differs from that described above. The decoding-related configuration described in the following differs from the decoding-related configuration described above in that the accumulation and reordering section (deinterleaving section) 3402 is not included. The operations of the log-likelihood ratio calculation section 3400 are similar to those described above, and thus, explanation thereof is omitted in the following.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ of block j. Then, the log-likelihood ratio calculation section 3400 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios (corresponding to 3406 in FIG. 34).

A decoder 3407 receives the log-likelihood ratio signal 3406 for each bit as input, performs belief propagation (BP) decoding as disclosed in Non-Patent Literature 6 to 8, such as sum-product decoding, min-sum decoding, offset BP decoding, normalized BP decoding, shuffled BP decoding, and layered BP decoding in which scheduling is performed, based on the parity check matrix H' for the LDPC (block) code #A of coding rate (N−M)/N (N>M>0) as illustrated in FIG. 33, and thereby obtains an estimation sequence 3409 (note that decoding schemes other than belief propagation decoding may be used).

For example, the decoder 3407 receives, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$ in the stated order, performs belief propagation decoding based on the parity check matrix H' for the LDPC (block) code #A of coding rate (N−M)/N (N>M>0) as illustrated in FIG. 33, and obtains the estimation sequence (note that decoding schemes other than belief propagation decoding may be used).

As explained above, even when the transmitted data is reordered due to the transmitting device interleaving the transmission sequence $v_j=(Y_{j,1}, Y_{j,2}, Y_{j,3}, \ldots, Y_{j,N-2}, Y_{j,N-1}, Y_{j,N})^T$ of block j, the receiving device is able to obtain the estimation sequence by using a parity check matrix corresponding to the reordered transmitted data.

Accordingly, when interleaving is applied to the transmission sequence (codeword) of the LDPC (block) code #A of coding rate (N−M)/N (N>M>0), a parity check matrix for the interleaved transmission sequence (codeword) is obtained by performing reordering of columns (i.e., column permutation) as described above on the parity check matrix for the LDPC (block) code #A of coding rate (N−M)/N (N>M>0). As such, the receiving device is able to perform belief propagation decoding and thereby obtain an estimation sequence without performing interleaving on the log-likelihood ratio for each acquired bit.

Note that in the above, explanation is provided of the relation between interleaving applied to a transmission sequence and a parity check matrix. In the following, explanation is provided of reordering of rows (row permutation) performed on a parity check matrix.

FIG. 35 illustrates a configuration of a parity check matrix H corresponding to a transmission sequence (codeword) $v_j^T=(Y_{j,1}, Y_{j,2}, Y_{j,3}, \ldots, Y_{j,N-2}, Y_{j,N-1}, Y_{j,N})$ of block j of the LDPC (block) code #A of coding rate (N−M)/N (N>M>0). For example, the parity check matrix H of FIG. 35 is a matrix having M rows and N columns. (for systematic codes, $Y_{j,k}$ (where k is an integer no smaller than one and no greater than N) is information X or parity P (parity $P_{pro}$), and is composed of (N−M) information bits and M parity bits). Here, $Hv_j=0$ holds true. (Here, the zero in $Hv_j=0$ indicates that all elements of the vector $Hv_j$ are zeroes. That is, row k of the vector $Hv_j$ has a value of zero for all k (where k is an integer no smaller than one and no greater than M.)

Further, a vector obtained by extracting column k (where k is an integer no smaller than one and no greater than M) of the parity check matrix H for the LDPC (block) code #A of coding rate (N−M)/N (N>M>0) as illustrated in FIG. 35 is denoted as $z_k$. Then, the parity check matrix H for the LDPC (block) code is expressed as follows.

[Math. 220]

$$H = \begin{bmatrix} z_1 \\ z_2 \\ \vdots \\ z_{M-1} \\ z_M \end{bmatrix} \quad (220)$$

Next, a parity check matrix obtained by performing reordering of rows (row permutation) on the parity check matrix H of FIG. 35 is considered.

FIG. 36 shows an example of a parity check matrix H' obtained by performing reordering of rows (row permutation) on the parity check matrix H of FIG. 35. The parity check matrix H', similar to the parity check matrix shown in FIG. 35, is a parity check matrix corresponding to the transmission sequence (codeword) $v_j^T=(Y_{j,1}, Y_{j,2}, Y_{j,3}, \ldots, Y_{j,N-2}, Y_{j,N-1}, Y_{j,N})$ of block j of the LDPC (block) code #A of coding rate (N−M)/N (N>M>0).

The parity check matrix H' of FIG. 36 is composed of vectors $z_k$ obtained by extracting row k (where k is an integer no smaller one and no greater than M) of the parity check matrix H of FIG. 35. For example, in the parity check matrix H', the first row is composed of vector $z_{130}$, the second row is composed of vector $z_{24}$, the third row is composed of vector $z_{45}, \ldots$, the (M−2)th row is composed of vector $z_{33}$, the (M−1)th row is composed of vector $z_9$, and the Mth row is composed of vector $z_3$. Note that each of the M row-vectors obtained by extracting row k (where k is an integer no smaller than one and no greater than M) of the parity check matrix H' is such that one each of $z_1, z_2, z_3, \ldots z_{M-2}, z_{M-1}$, and $z_M$ is present.

Here, the parity check matrix H' for the LDPC (block) code #A of coding rate (N−M)/N (N>M>0) is expressed as follows.

[Math. 221]

$$H' = \begin{bmatrix} z_{130} \\ z_{24} \\ \vdots \\ z_9 \\ z_3 \end{bmatrix} \quad (221)$$

Further, $H'v_j=0$ holds true. (Here, the zero in $H'v_j=0$ indicates that all elements of the vector $H'v_j$ are zeroes. That is, row k of the vector $H'v_j$ has a value of zero for all k (where k is an integer no smaller than one and no greater than M.)

That is, for the transmission sequence $v_j^T$ of block j, a vector obtained by extracting row i of the parity check matrix H' in FIG. 36 is expressed as $c_k$ (where k is an integer no smaller than one and no greater than M), and each of the M row vectors obtained by extracting row k (where k is an integer no smaller than one and no greater than M) of the parity check matrix H' in FIG. 36 is such that one each of $z_1, z_2, z_3, \ldots z_{M-2}, z_{M-1}$, and $z_M$ is present.

As described above, for the transmission sequence $v_j^T$ of block j, a vector obtained by extracting row i of the parity check matrix H' in FIG. 36 is expressed as $c_k$ (where k is an integer no smaller than one and no greater than M), and each of the M row vectors obtained by extracting row k (where k is an integer no smaller than one and no greater than M) of the parity check matrix H' in FIG. 36 is such that one each of $z_1, z_2, z_3, \ldots z_{M-2}, z_{M-1}$, and $z_M$ is present. Note that, when the above is followed to create a parity check matrix, then a parity check matrix for the transmission sequence parity $v_j$ of block j can be obtained with no limitation to the above-given example.

Accordingly, even when the LDPC (block) code #A of coding rate (N−M)/N (N>M>0) is being used, it does not necessarily follow that a transmitting device and a receiving device are using the parity check matrix H. As such, a transmitting device and a receiving device may use as a parity check matrix, for example, a matrix obtained by performing reordering of columns (column permutation) as described above on the parity check matrix H or a matrix obtained by performing reordering of rows (row permutation) on the parity check matrix H.

In addition, a matrix obtained by performing both reordering of columns (column permutation) and reordering of rows (row permutation) as described above on the parity check matrix H for the LDPC (block) code #A of coding rate (N−M)/N (N>M>0) may be used as a parity check matrix.

In such a case, a parity check matrix $H_1$ is obtained by performing reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_2$ is obtained by performing reordering of rows (row permutation) on the parity check matrix $H_1$ (i.e., through conversion from the parity check matrix shown in FIG. 35 to the parity check matrix shown in FIG. 36). A transmitting device and a receiving device may perform encoding and decoding by using the parity check matrix $H_2$ so obtained.

Also, a parity check matrix $H_{1,1}$ is obtained by performing a first reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_{2,1}$ may be obtained by performing a first reordering of rows (row permutation) on the parity check matrix $H_{1,1}$ (i.e., through conversion from the parity check matrix shown in FIG. 35 to the parity check matrix shown in FIG. 36).

Further, a parity check matrix $H_{1,2}$ may be obtained by performing a second reordering of columns (column permutation) on the parity check matrix $H_{2,1}$. Finally, a parity check matrix $H_{2,2}$ may be obtained by performing a second reordering of rows (row permutation) on the parity check matrix $H_{1,2}$.

As described above, a parity check matrix $H_{2,s}$ may be obtained by repetitively performing reordering of columns (column permutation) and reordering of rows (row permutation) for s iterations (where s is an integer no smaller than two). In such a case, a parity check matrix $H_{1,k}$ is obtained by performing a kth (where k is an integer no smaller than two and no greater than s) reordering of columns (column permutation) on a parity check matrix $H_{2,k-1}$. Then, a parity check matrix $H_{2,k}$ is obtained by performing a kth reordering of rows (row permutation) on the parity check matrix $H_{1,k}$. Note that in the first instance, a parity check matrix $H_{1,1}$ is obtained by performing a first reordering of columns (column permutation) on the parity check matrix H for the LDPC (block) code #A of coding rate (N−M)/N (N>M>0). Then, a parity check matrix $H_{2,1}$ is obtained by performing a first reordering of rows (row permutation) on the parity check matrix $H_{1,1}$.

In such a case, a transmitting device and a receiving device may perform encoding and decoding by using the parity check matrix $H_{2,s}$.

In an alternative method, a parity check matrix $H_3$ is obtained by performing reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_4$ is obtained by performing reordering of columns (column permutation) on the parity check matrix $H_3$ (i.e., through conversion from the parity check matrix shown in FIG. 31 to the parity check matrix shown in FIG. 33). In such a case, a transmitting device and a receiving device may perform encoding and decoding by using the parity check matrix $H_4$ so obtained.

Also, a parity check matrix $H_{3,1}$ is obtained by performing a first reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_{4,1}$ may be obtained by performing a first reordering of columns (column permutation) on the parity check matrix $H_{3,1}$ (i.e., through conversion from the parity check matrix shown in FIG. 31 to the parity check matrix shown in FIG. 33).

Then, a parity check matrix $H_{3,2}$ may be obtained by performing a second reordering of rows (row permutation) on the parity check matrix $H_{4,1}$. Finally, a parity check matrix $H_{4,2}$ may be obtained by performing a second reordering of columns (column permutation) on the parity check matrix $H_{3,2}$.

As described above, a parity check matrix $H_{4,s}$ may be obtained by repetitively performing reordering of rows (row permutation) and reordering of columns (column permutation) for s iterations (where s is an integer no smaller than two). In such a case, a parity check matrix $H_{3,k}$ is obtained by performing a kth (where k is an integer no smaller two and no greater than s) reordering of rows (row permutation) on a parity check matrix $H_{4,k-1}$. Then, a parity check matrix $H_{4,k}$ is obtained by performing a kth reordering of columns (column permutation) on the parity check matrix $H_{3,k}$. Note that in the first instance, a parity check matrix $H_{3,1}$ is obtained by performing a first reordering of rows (row permutation) on the parity check matrix H for the LDPC (block) code #A of coding rate (N−M)/N (N>M>0). Then, a parity check matrix $H_{4,1}$ is obtained by performing a first reordering of columns (column permutation) on the parity check matrix $H_{3,1}$.

In such a case, a transmitting device and a receiving device may perform encoding and decoding by using the parity check matrix $H_{4,s}$.

Here, note that by performing reordering of rows (row permutation) and reordering of columns (column permutation), the parity check matrix H for the LDPC (block) code #A of coding rate (N−M)/N (N>M>0) can be obtained from each of the parity check matrix $H_2$, the parity check matrix $H_{2,s}$, the parity check matrix $H_4$, and the parity check matrix $H_{4,s}$.

Similarly, a matrix obtained by performing both reordering of columns (column permutation) as described above and reordering of rows (row permutation) as described above on the parity check matrix H for the LDPC (block) code #A of coding rate (N−M)/N (N>M>0) may be used as a parity check matrix.

In such a case, a parity check matrix $H_5$ is obtained by performing reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_6$ is obtained by performing reordering of rows (row permutation) on the parity check matrix $H_5$ (i.e., through conversion from the parity check matrix shown in FIG. 35 to the parity check matrix shown in FIG. 36). A transmitting device and a receiving device may perform encoding and decoding by using the parity check matrix $H_6$ so obtained.

Also, a parity check matrix $H_{5,1}$ is obtained by performing a first reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_{6,1}$ may be obtained by performing a first reordering of rows (row permutation) on the parity check matrix $H_{5,1}$ (i.e., through conversion from the parity check matrix shown in FIG. 35 to the parity check matrix shown in FIG. 36).

Further, a parity check matrix $H_{5,2}$ may be obtained by performing a second reordering of columns (column permutation) on the parity check matrix $H_{6,1}$. Finally, a parity check matrix $H_{6,2}$ may be obtained by performing a second reordering of rows (row permutation) on the parity check matrix $H_{5,2}$.

As described above, a parity check matrix $H_{6,s}$ may be obtained by repetitively performing reordering of columns (column permutation) and reordering of rows (row permutation) for s iterations (where s is an integer no smaller than two). In such a case, a parity check matrix $H_{5,k}$ is obtained by performing a kth (where k is an integer no smaller than two and no greater than s) reordering of columns (column permutation) on a parity check matrix $H_{6,k-1}$. Then, a parity check matrix $H_{6,k}$ is obtained by performing a kth reordering of rows (row permutation) on the parity check matrix $H_{5,k}$. Note that in the first instance, a parity check matrix $H_{5,1}$ is obtained by performing a first reordering of columns (column permutation) on the parity check matrix H for the LDPC (block) code #A of coding rate (N−M)/N (N>M>0). Then, a parity check matrix $H_{6,1}$ is obtained by performing a first reordering of rows (row permutation) on the parity check matrix $H_{5,1}$.

In such a case, a transmitting device and a receiving device may perform encoding and decoding by using the parity check matrix $H_{6,s}$.

In an alternative method, a parity check matrix $H_7$ is obtained by performing reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_8$ is obtained by performing reordering of columns (column permutation) on the parity check matrix $H_7$ (i.e., through conversion from the parity check matrix shown in FIG. 31 to the parity check matrix shown in FIG. 33). In such a case, a transmitting device and a receiving device may perform encoding and decoding by using the parity check matrix $H_8$ so obtained.

Also, a parity check matrix $H_{7,1}$ is obtained by performing a first reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_{8,1}$ may be obtained by performing a first reordering of columns (column permutation) on the parity check matrix $H_{7,1}$ (i.e., through conversion from the parity check matrix shown in FIG. 31 to the parity check matrix shown in FIG. 33).

Then, a parity check matrix $H_{7,2}$ may be obtained by performing a second reordering of rows (row permutation) on the parity check matrix $H_{8,1}$. Finally, a parity check matrix $H_{8,2}$ may be obtained by performing a second reordering of columns (column permutation) on the parity check matrix $H_{7,2}$.

As described above, a parity check matrix $H_{8,s}$ may be obtained by repetitively performing reordering of rows (row permutation) and reordering of columns (column permutation) for s iterations (where s is an integer no smaller than two). In such a case, a parity check matrix $H_{7,k}$ is obtained by performing a kth (where k is an integer no smaller two and no greater than s) reordering of rows (row permutation) on a parity check matrix $H_{8,k-1}$. Then, a parity check matrix $H_{8,k}$ is obtained by performing a kth reordering of columns (column permutation) on the parity check matrix $H_{7,k}$. Note that in the first instance, a parity check matrix $H_{7,1}$ is obtained by performing a first reordering of rows (row permutation) on the parity check matrix H for the LDPC (block) code #A of coding rate (N−M)/N (N>M>0). Then, a parity check matrix $H_{8,1}$ is obtained by performing a first reordering of columns (column permutation) on the parity check matrix $H_{7,1}$.

In such a case, a transmitting device and a receiving device may perform encoding and decoding by using the parity check matrix $H_{8,s}$.

Here, note that by performing reordering of rows (row permutation) and reordering of columns (column permutation), the parity check matrix H for the LDPC (block) code #A of coding rate (N−M)/N (N>M>0) can be obtained from each of the parity check matrix $H_6$, the parity check matrix $H_{6,s}$, the parity check matrix $H_8$, and the parity check matrix $H_{8,s}$.

In the present embodiment, description is provided of a method of generating a parity check matrix equivalent to a parity check matrix H for the LDPC (block) code #A of coding rate (N−M)/N (N>M>0) by performing reordering of rows (row permutation) and/or reordering of columns (column permutation) with respect to the parity check matrix H. Further, description is provided of a method of applying the equivalent parity check matrix in, for example, a communication/broadcast system using an encoder and a decoder using the equivalent parity check matrix. Note that the error correction code described herein may be applied to various fields, including but not limited to communication/broadcast systems.

Embodiment 6

In the present embodiment, description is provided of a device that uses the LDPC-CC of coding rate 2/4 that uses an improved tail-biting scheme (an LDPC block code using an LDPC-CC), description of which is provided in embodiment 4.

As one example, description is provided of a case where the LDPC-CC of coding rate 2/4 that uses an improved tail-biting scheme (an LDPC block code using an LDPC-CC) is applied to a communication device.

FIG. 22 illustrates the structures of a transmitting device 2200 and a receiving device 2210 in the communication device pertaining to the present embodiment.

An encoder 2201 receives information to be transmitted as input, and is capable of performing various types of encoding (e.g., various coding rates and various block lengths of block codes (for example, in systematic codes, the sum of the number of information bits and the number of parity bits)). In particular, when receiving a specification to perform encoding by using the LDPC-CC of coding rate 2/4 that uses an improved tail-biting scheme (an LDPC block code using an LDPC-CC), the encoder 2201 performs encoding by using the LDPC-CC of coding rate 2/4 that uses an improved tail-biting scheme (an LDPC block code using an LDPC-CC) to calculate parities $P_1$ and $P_2$. Further, the encoder 2201 outputs the information to be transmitted and the parities $P_1$ and $P_2$ as a transmission sequence.

A modulator 2202 receives the transmission sequence, which includes the information to be transmitted and the parities P1 and P2, performs mapping based on a predetermined modulation scheme (for example, BPSK, QPSK, 16QAM, or 64QAM), and outputs a baseband signal. Further, the modulator 2202 may also receive information other than the transmission sequence, which includes the information to be transmitted and the parities $P_1$ and $P_2$, as input, perform mapping, and output a baseband signal. For example, the modulator 2202 may receive control information as input.

The transmitting device outputs a transmission signal after performing predetermined signal processing (e.g., signal processing for generation of an OFDM signal, frequency conversion, amplification) with respect to such signals (e.g., baseband signals, pilot signals). The transmitting device may transmit the transmission signal over a wireless transmission path utilizing electromagnetic waves, or over a wired transmission path utilizing a coaxial cable, a power line, an optical cable, or the like.

The transmission signal is received by the receiving device 2210 after travelling over the transmission path. A receiver 2211 receives a reception signal as input, performs predetermined signal processing (e.g., bandwidth limitation, frequency conversion, signal processing for OFDM, frequency offset estimation, signal detection, channel estimation), and outputs a baseband signal and a channel estimation signal.

A log-likelihood ratio generation section 2212 receives the baseband signal and the channel estimation signal as input (may receive other signals as input), and for example, calculates and outputs a log-likelihood ratio for each bit (may calculate and output a hard value (hard decision value)).

A decoder 2213 receives the log-likelihood ratio for each bit as input, performs belief propagation decoding (e.g., sum-product decoding, scheduled sum-product decoding (Layered BP (belief propagation) decoding), min-sum decoding, Normalized BP decoding, offset BP decoding), and outputs an estimation sequence. The decoder 2213 performs the belief propagation decoding based on the parity check matrix for the LDPC-CC of coding rate 2/4 that uses an improved tail-biting scheme (an LDPC block code using an LDPC-CC).

Although description is provided above taking an example where error correction coding is introduced to a communication device, the error correction coding described above is not limited to being introduced to a communication device, and for example, may be introduced to a storage medium (storage). When making such a modification, information that is to be stored to a storage medium (storage) is encoded by using the LDPC-CC of coding rate 2/4 that uses an improved tail-biting scheme (an LDPC block code using an LDPC-CC), and resultant information and parities are stored to the storage medium (storage).

Further, the LDPC-CC of coding rate 2/4 that uses an improved tail-biting scheme (an LDPC block code using an LDPC-CC) is applicable to any device that requires error correction coding (e.g., a memory, a hard disk).

Note that when using a block code such as the LDPC-CC of coding rate 2/4 that uses an improved tail-biting scheme (an LDPC block code using an LDPC-CC) in a device, there as cases where special processing needs to be executed.

Assume that a block length of the LDPC-CC of coding rate 2/4 that uses an improved tail-biting scheme (an LDPC block code using an LDPC-CC) used in a device is 16000 bits (8000 information bits, and 8000 parity bits).

In such a case, the number of information bits necessary for encoding one block is 8000. Meanwhile, there are cases where the number of bits of information input to an encoding section of the device does not reach 8000. For example, assume a case where only 7000 information bits are input to the encoding section.

Here, it is assumed that the encoding section, in the above-described case, adds 1000 padding bits of information to the 7000 information bits having been input, and performs encoding by using a total of 8000 bits, composed of the 7000 information bits having been input and the 1000 padding bits, to generate 8000 parity bits. Here, assume that all of the 1000 padding bits are known bits. For example, assume that each of the 1000 padding bits is "0".

A transmitting device may output the 7000 information bits having been input, the 1000 padding bits, and the 8000 parity bits. Alternatively, a transmitting device may output the 7000 information bits having been input and the 8000 parity bits.

In addition, a transmitting device may perform puncturing with respect to the 7000 information bits having been input and the 8000 parity bits, and thereby output a number of bits smaller than 15000 in total.

Note that when performing transmission in such a manner, the transmitting device is required to transmit, to a receiving device, information notifying the receiving device that transmission has been performed in such a manner.

As described above, the LDPC-CC of coding rate 2/4 that uses an improved tail-biting scheme (an LDPC block code using an LDPC-CC), description of which is provided in embodiment 4, is applicable to various devices.

Embodiment 7

In some embodiments in the present disclosure, description is provided of LDPC block codes, and encoders and decoders using the LDPC block codes. In the present embodiment, description is provided of a method of configuring a code length (block length) of an LDPC block code in a base station (or an access point or a broadcast station) of a communication device and a terminal device.

Figure 46:
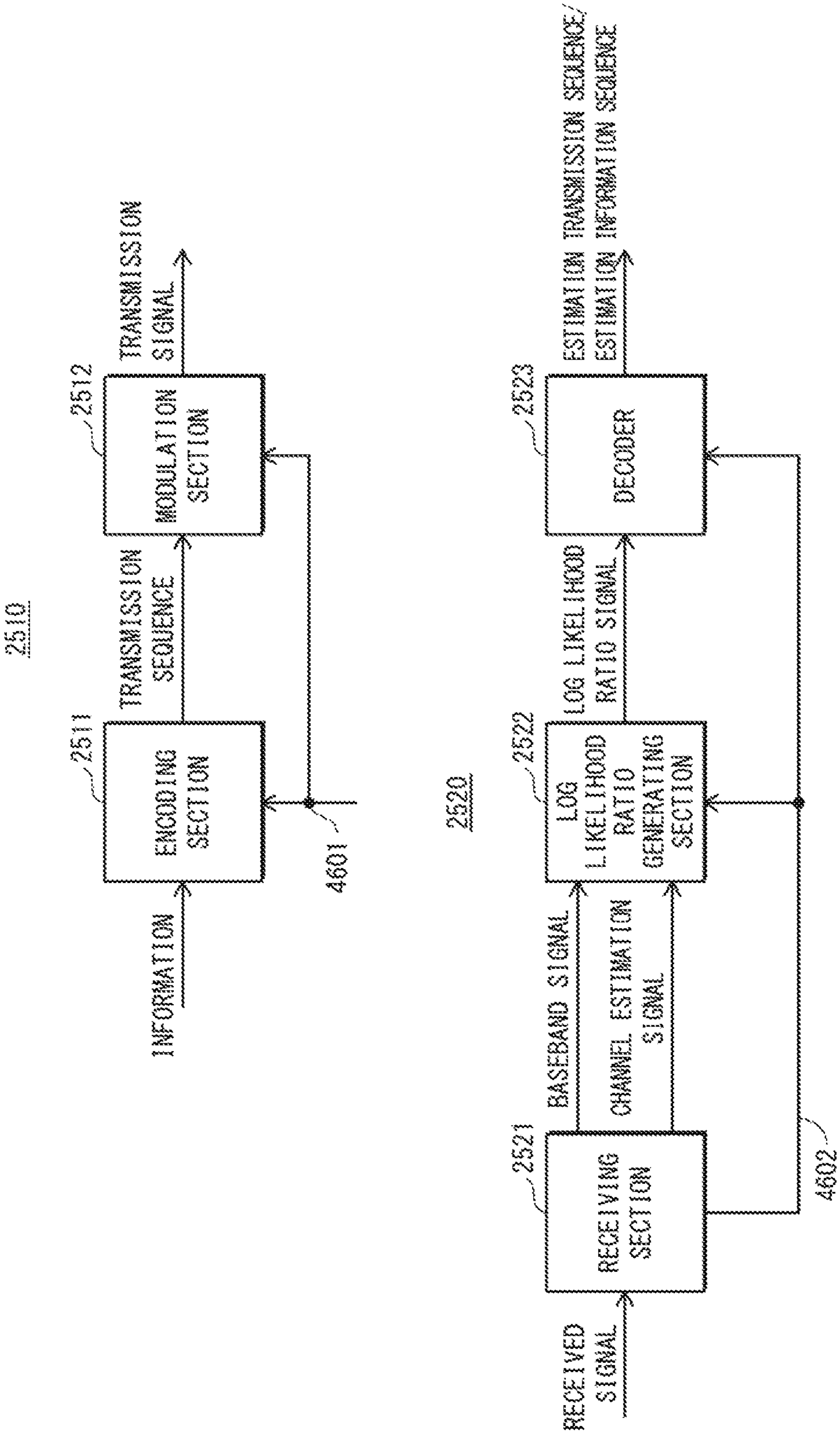
FIG. 46 is an overall diagram of a communication system.

FIG. 46 is an overall diagram of a communication system (or a broadcast system). Components that operate similarly in FIG. 46 and FIG. 25 are provided with the same reference signs.

One characteristic aspect is that an encoding section 2511 in a transmitting device 2510 receives a control signal 4601 as input, and performs encoding on information based on information included in the control signal 4601 indicating coding rate and block length.

In addition, a modulating section 2512 receives the control signal 4601 as input, and performs processing such as mapping based on information included in the control signal 4601 indicating a modulation scheme. Details of operations are described later in the present embodiment.

Note that the transmitting device 2510 needs to transmit, to a receiving device 2511, information on the coding rate and block length applied in the encoding performed by the encoding section 2511, and information on the modulation scheme applied in the mapping performed by the modulating section 2512. Accordingly, the transmitting device 2510 transmits a control information symbol 4701 and a data symbol 4702, as illustrated in FIG. 47.

Figure 47:
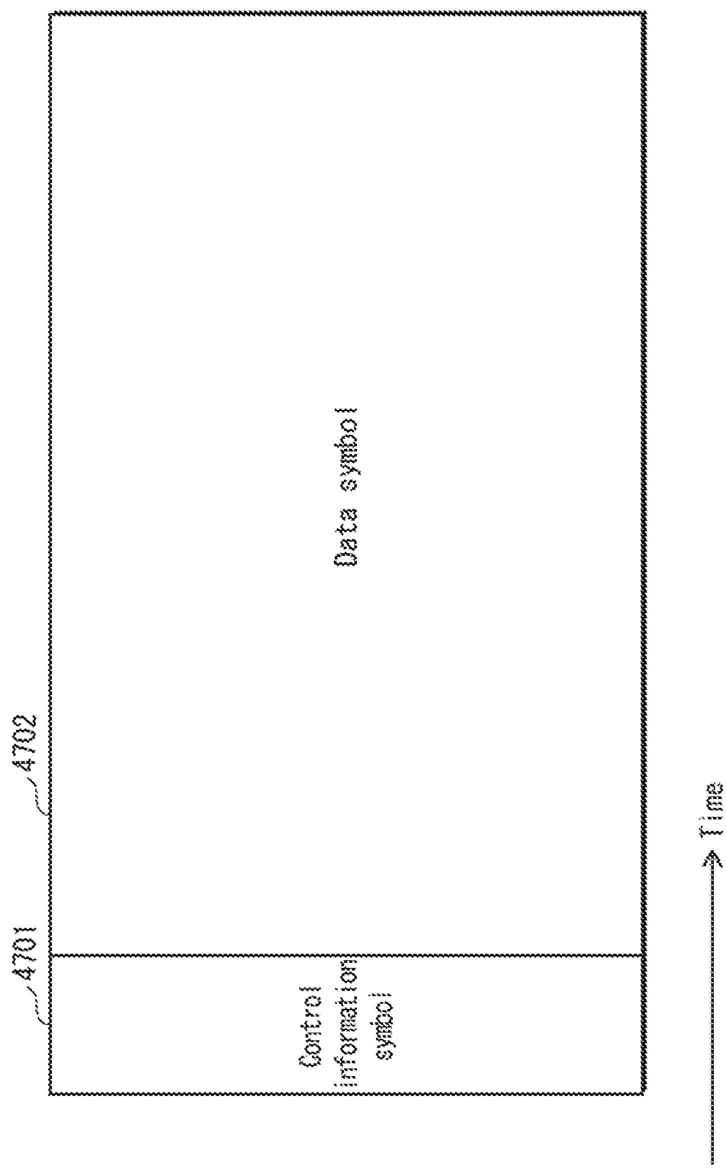
FIG. 47 shows an example of time-domain frame configuration of a transmission signal transmitted by a transmitting device.

FIG. 47 illustrates one example of a time-domain frame configuration of transmission signal transmitted by the transmitting device 2510. In FIG. 47, the horizontal axis indicates time. In FIG. 47, information that the receiving device 2520 needs in order to perform wave detection and decoding, such as the coding rate and the block length of the code used by the transmitting device 2510, and the modulation scheme and the transmission scheme used by the transmitting device 2510, is transmitted by using the control information symbol 4701. The data symbol 4702 is a symbol transmitting data. Note that data transmitted by using this symbol is encoded.

In the receiving device 2520 in FIG. 46, a receiving unit 2521 receives a reception signal as input and extracts a control information symbol included in the reception signal, whereby the receiving unit 2521 obtains control information. Further, the receiving unit 2521 outputs a control signal 4602. Accordingly, a log-likelihood ratio generation section 2522 receives as control signal 4602 as input, and calculates log-likelihood ratios based on information on modulation scheme included in the control signal 4602. Further, a decoder 2523 receives the control signal 4602 as input and performs decoding in accordance with a code (e.g., coding rate and code length) based on the control signal 4602. Note that when an LDPC code is used, the decoder 2523 performs decoding described in, for instance, Non-Patent Literature 4, Non-Patent Literature 6, Non-Patent Literature 7, and Non-Patent Literature 8, including simple BP decoding such as min-sum decoding, offset BP decoding, and normalized BP decoding, and Belief Propagation (BP) decoding in which scheduling is performed with respect to the row operations (horizontal operations) and the column operations (vertical operations) such as shuffled BP decoding, layered BP decoding, and pipeline decoding, or decoding such as bit-flipping decoding described in Non-Patent Literature 17, etc.

The following describes a specific method of configuring a code length (block length) of an LDPC block code.

Figure 48:
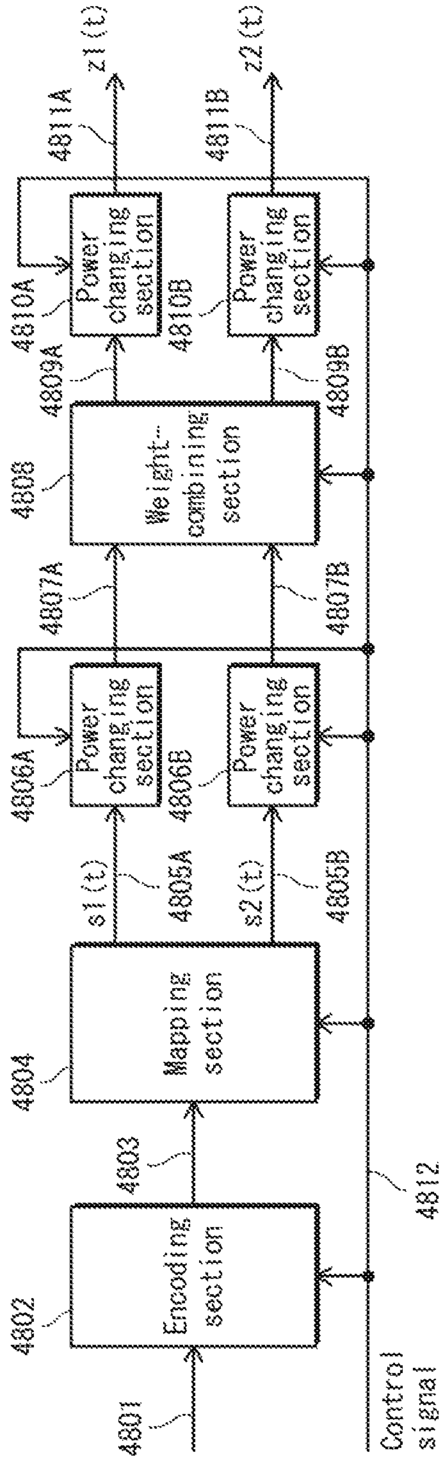
FIG. 48 shows an example of the configuration of sections generating a modulation signal in a transmitting device in a base station (broadcast station, access point, etc.,) when switching between transmission schemes is possible.

FIG. 48 illustrates one example of a configuration of a part of a transmitting device in a base station (may be a broadcast station, an access point, etc.,) that generates a modulated signal, in a configuration where switching between transmission schemes is possible.

In the present embodiment, description is provided while assuming that both a transmission scheme where a single stream is transmitted and transmission scheme where two streams are transmitted (MIMO (Multiple Input Multiple Output) scheme) are possible. When transmitting a single stream, the single stream may be transmitted by using one antenna, or by using two antennas. This is described in detail later in the present disclosure.

First, description is provided on a transmission scheme where a transmitting device in a base station (may be a broadcast station, an access point, etc.,) transmits two streams, with reference to FIG. 48.

Transmission Scheme where Two Streams are Transmitted

An encoding section 4802 in FIG. 48 receives information 4801 and a control signal 4812 as input. The encoding section 4802 performs encoding based on information included in the control signal 4812 indicating coding rate and code length (block length). The encoding section 4802 outputs encoded data 4803.

A mapping section 4804 receives the encoded data 4803 and the control signal 4812 as input. The following assumes that the control signal 4812 specifies a transmission scheme where two streams are transmitted. Further, the following assumes that the control signal 4812 specifies, as respective modulation schemes for the two streams, modulation scheme $\alpha$ and modulation scheme $\beta$. Here, modulation scheme $\alpha$ modulates x bits of data, and modulation scheme $\beta$ modulates y bits of data. (For example, when the modulation scheme is 16QAM (16 Quadrature Amplitude Modulation, 4 bits of data are modulated, and when the modulation scheme is 64QAM (64 Quadrature Amplitude Modulation), 6 bits of data are modulated.)

Based on the above, the mapping section 4804 modulates x bits of data, among x+y bits of data, according to modulation scheme $\alpha$ to generate and output a baseband signal $s_1(t)$(4805A). Further, the mapping section 4804 modulates the remaining y bits of data, among x+y bits of data, according to modulation scheme $\beta$ to generate and output a baseband signal $s_2(t)$(4805B). Note that each of $s_1(t)$ and $s_2(t)$ is expressed by a complex number (may also be expressed by a real number), and t indicates time. Note that when using a multi-carrier transmission scheme such as OFDM (Orthogonal Frequency Division Multiplexing), $s_1$ and $s_2$ may be considered as functions of frequency f (in which case $s_1$ and $s_2$ are, for example, $s_1(f)$ and $s_2(f)$, respectively), or may be considered as functions of time t and frequency f (in which case $s_1$ and $s_2$ are, for example, $s_1(t, f)$ and $s_2(t, f)$, respectively).

A power changing section 4806A receives the baseband signal $s_1(t)$(4805A) and the control signal 4812 as input. The power changing section 4806A sets a real number $P_1$ (may also be a complex number) based on the control signal 4812. The power changing section 4806A outputs $P_1 \times s_1(t)$ as a power-changed signal 4807A.

Similarly, a power changing section 4806B receives the baseband signal $s_2(t)$(4805B) and the control signal 4812 as input. The power changing section 4806B sets a real number $P_2$ (may also be a complex number) based on the control signal 4812. The power changing section 4806B outputs $P_2 \times s_2(t)$ as a power-changed signal 4807B.

A weight-combining section 4808 receives the power changed-signal 4807A, the power-changed signal 4807B, and the control signal 4812 as input. The weight-combining section 4808 sets a precoding matrix F (or F(i)) based on the control signal 4812. When denoting slot number (symbol number) as i, the weight-combining section 4808 performs the following calculation.

[Math. 222]

$$\begin{aligned}\begin{pmatrix}u_1(i)\\u_2(i)\end{pmatrix} &= F\begin{pmatrix}P_1\times s_1(i)\\P_2\times s_2(i)\end{pmatrix}\\&= \begin{pmatrix}a(i)&b(i)\\c(i)&d(i)\end{pmatrix}\begin{pmatrix}P_1\times s_1(i)\\P_2\times s_2(i)\end{pmatrix}\\&= \begin{pmatrix}a(i)&b(i)\\c(i)&d(i)\end{pmatrix}\begin{pmatrix}P_1&0\\0&P_2\end{pmatrix}\begin{pmatrix}s_1(i)\\s_2(i)\end{pmatrix}\end{aligned} \tag{A1}$$

Here, each of a(i), b(i), c(i), d(i) is expressible by using a complex number (may be expressed by using a real number), no more than two of a(i), b(i), c(i), d(i) may be "0". Further, the precoding matrix may or may not be a function of i. When the precoding matrix is a function of i, the precoding matrix switches for different slot numbers (symbol numbers).

Further, the weight-combining section 4808 outputs $u_1(i)$ in expression (A1) as a weight-combined signal 4809A, and outputs $u_2(i)$ in expression (A2) as a weight-combined signal 4809B.

A power changing section 4810A receives the weight-combined signal 4809A ($u_1(i)$) and the control signal 4812 as input. The power changing section 4810A sets a real number $Q_1$ (may also be a complex number) based on the control signal 4812. The power changing section 4810A outputs $Q_1 \times u_1(t)$ as a power-changed signal 4811A ($z_1(i)$)

Similarly, a power changing section 4810B receives the weight-combined signal 4809B ($u_2(i)$) and the control signal 4812 as input. The power changing section 4810B sets a real number $Q_2$ (may also be a complex number) based on the control signal 4812. The power changing section 4810A outputs $Q_2 \times u_2(t)$ as a power-changed signal 4811B ($z_2(i)$).

Accordingly, the following holds true.

[Math. 223]

$$\begin{aligned}\begin{pmatrix}z_1(i)\\z_2(i)\end{pmatrix} &= \begin{pmatrix}Q_1&0\\0&Q_2\end{pmatrix}F\begin{pmatrix}P_1\times s_1(i)\\P_2\times s_2(i)\end{pmatrix}\\&= \begin{pmatrix}Q_1&0\\0&Q_2\end{pmatrix}\begin{pmatrix}a(i)&b(i)\\c(i)&d(i)\end{pmatrix}\begin{pmatrix}P_1\times s_1(i)\\P_2\times s_2(i)\end{pmatrix}\\&= \begin{pmatrix}Q_1&0\\0&Q_2\end{pmatrix}\begin{pmatrix}a(i)&b(i)\\c(i)&d(i)\end{pmatrix}\begin{pmatrix}P_1&0\\0&P_2\end{pmatrix}\begin{pmatrix}s_1(i)\\s_2(i)\end{pmatrix}\end{aligned} \tag{A2}$$

Nest, description is provided on a transmission scheme where two streams are transmitted different from that explained with reference to FIG. 48, with reference to FIG. 49. Components that operate similarly in FIG. 48 and FIG. 49 are provided with the same reference signs.

A phase changing section 4901 receives the weight-combined signal 4809B, which corresponds to $u_2(i)$ in expression (A1), and the control signal 4812 as input. The phase changing section 4901 changes a phase of the weight-combined signal 4809B, which corresponds to $u_2(i)$ in expression (A1), based on the control signal 4812. A signal resulting from changing the phase of weight-combined signal 4809B, which corresponds to $u_2(i)$ in expression (A1), is expressible as $e^{j\theta(i)} \times u_2(i)$ (where j is an imaginary unit). Accordingly, the phase changing section 4901 outputs $e^{j\theta(i)} \times u_2(i)$ as a phase-changed signal 4902. Here, note that the value of the phase that is changed is a part such as $\theta(i)$ that is characterized by being a function of i.

Figure 49:
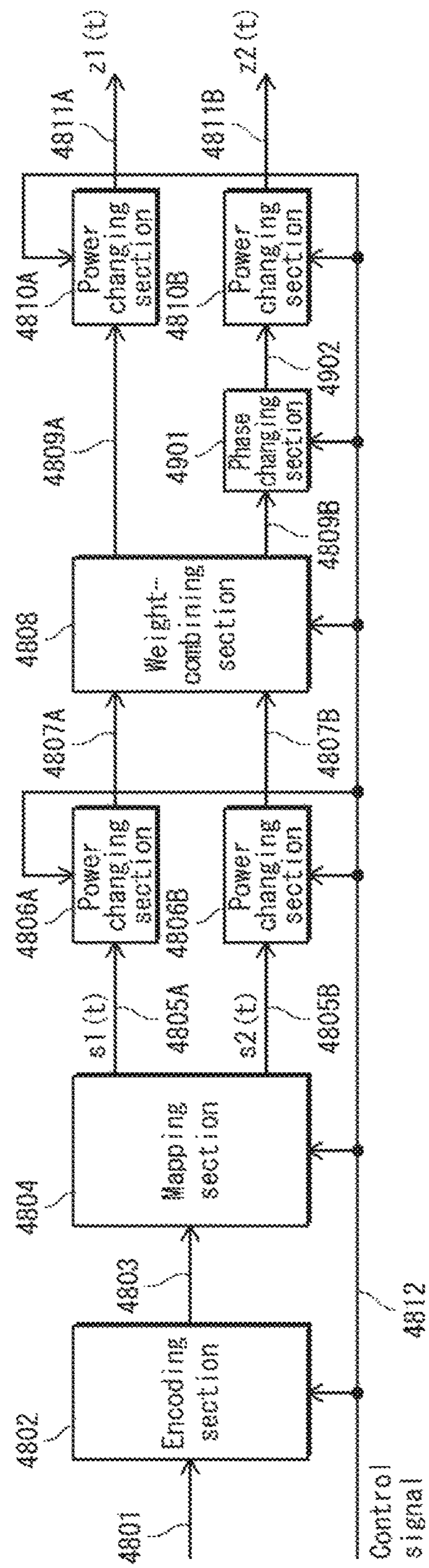
FIG. 49 is a diagram for explaining an example differing from that in FIG. 48.

Further, the power changing sections 4810A and 4810B in FIG. 49 change the power of the respective signals that are input. Accordingly, output $z_1(i)$ of the power changing section 4810A in FIG. 49 and output $z_2(i)$ of the power changing section 4810B in FIG. 49 are expressible as follows.

[Math. 224]

$$\begin{pmatrix} z_1(i) \\ z_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} F \begin{pmatrix} P_1 \times s_1(i) \\ P_2 \times s_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 \times s_1(i) \\ P_2 \times s_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(A3)}$$

Figure 50:
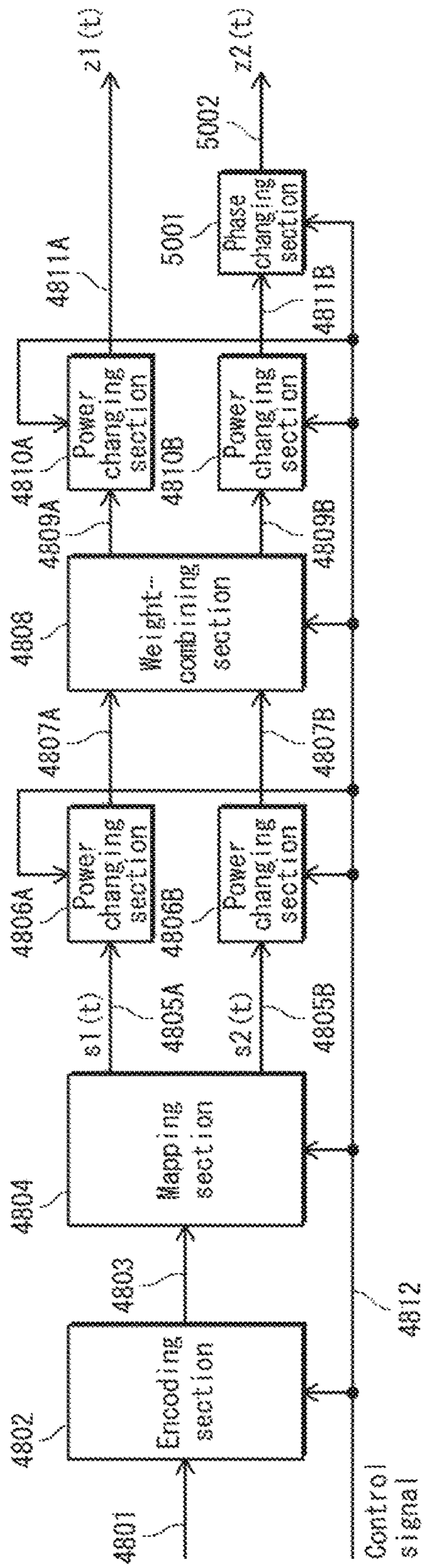
FIG. 50 is a diagram for explaining an example differing from that in FIG. 48.

FIG. 50 illustrates a configuration that realizes expression (A3) differing from that illustrated in FIG. 49. FIG. 50 differs from FIG. 49 in terms of the order in which the power changing units and the phase changing unit are arranged. (Note that the function of the power changing units of changing power and the function of the phase changing unit of changing phase remains the same in FIG. 49 and FIG. 50.) When the configuration illustrated in FIG. 50 is applied, $z_1(i)$ and $z_2(i)$ are expressible as follows.

[Math. 225]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} F \begin{pmatrix} P_1 \times s_1(i) \\ P_2 \times s_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 \times s_1(i) \\ P_2 \times s_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(A4)}$$

Note that $z_1(i)$ in expression (A3) and $z_1(i)$ in expression (A4) are equal, and $z_2(i)$ in expression (A3) and $z_2(i)$ in expression (A4) are equal.

Figure 51:
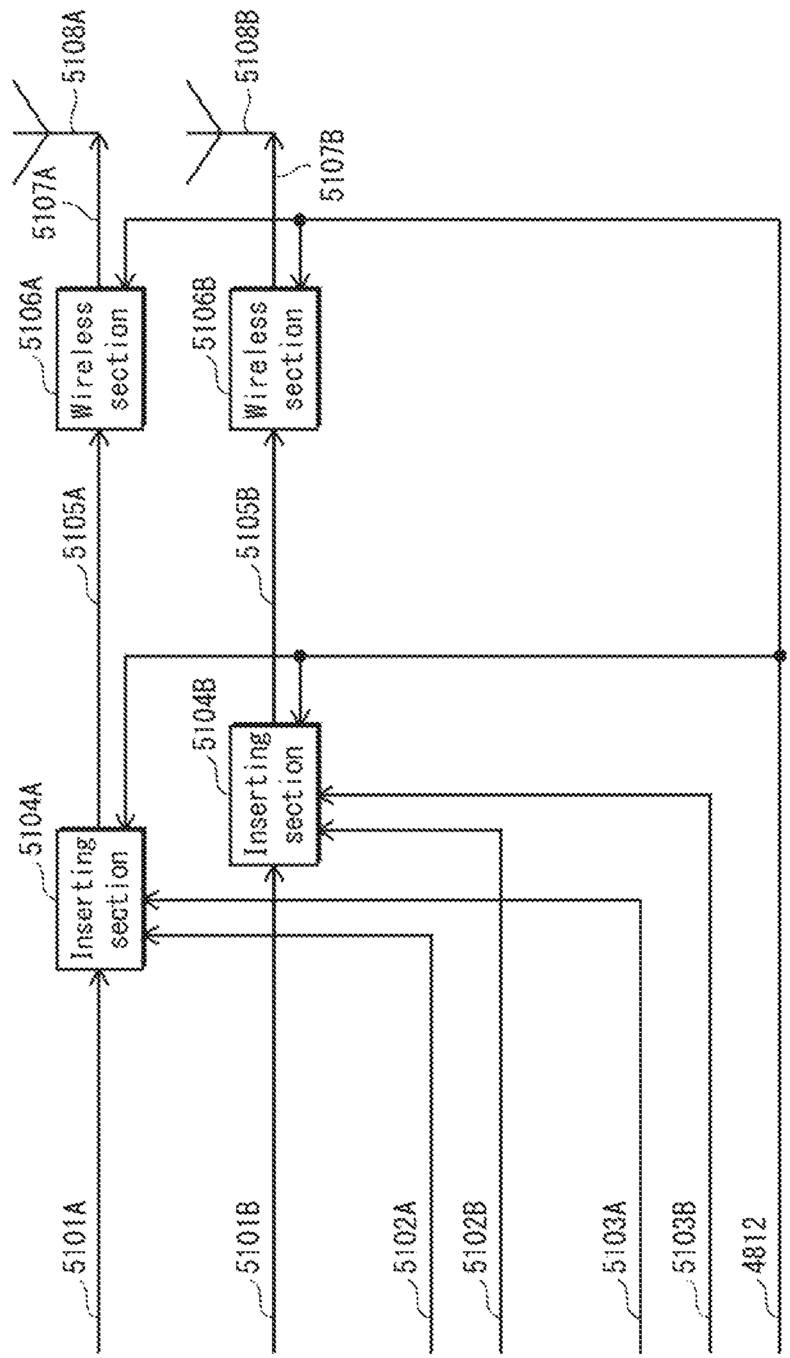
FIG. 51 shows an example of a configuration differing from FIG. 50.

FIG. 51 illustrates one example of a configuration of a signal processing section that performs signal processing on the signals $z_1(i)$ and $z_2(i)$ obtained in FIGS. 48 through 50.

An inserting section 5104A receives the signal $z_1(i)$ (5101A), a pilot symbol 5102A, a control information symbol 5103A, and the control signal 4812 as input. The inserting section 5104A inserts the pilot symbol 5102A and the control information symbol 5103A into the signal (symbol) $z_1(i)$(5101A) based on the frame configuration included in the control signal 4812. The inserting section 5104A outputs a modulated signal 5105A that is in accordance with the frame configuration included in the control signal 4812.

Note that the pilot symbol 5102A and the control information symbol 5103A are symbols modulated by using a modulation scheme such as BPSK (Binary Phase Shift Keying) or QPSK (Quadrature Phase Shift Keying) (other modulation schemes may also be used).

A wireless section 5106A receives the modulated signal 5105A and the control signal 4812 as input. The wireless section 5106A performs processing such as frequency conversion and amplification (processing such as inverse Fourier transform is performed when an OFDM scheme is being used) on the modulated signal 5105A based on the control signal 4812. The wireless section 5106A outputs a transmission signal 5107A. The transmission signal 5107A is output in the form of electric waves from an antenna 5108A.

An inserting section 5104B receives the signal $z_2(i)$ (5101B), a pilot symbol 5102B, a control information symbol 5103B, and the control signal 4812 as input. The inserting section 5104B inserts the pilot symbol 5102B and the control information symbol 5103B into the signal (symbol) $z_2(i)$(5101B) based on the frame configuration included in the control signal 4812. The inserting section 5104B outputs a modulated signal 5105B that is in accordance with the frame configuration included in the control signal 4812.

Note that the pilot symbol 5102B and the control information symbol 5103B are symbols modulated by using a modulation scheme such as BPSK (Binary Phase Shift Keying) or QPSK (Quadrature Phase Shift Keying) (other modulation schemes may also be used).

A wireless section 5106B receives the modulated signal 5105B and the control signal 4812 as input. The wireless section 5106B performs processing such as frequency conversion and amplification (processing such as inverse Fourier transform is performed when an OFDM scheme is being used) on the modulated signal 5105B based on the control signal 4812. The wireless section 5106B outputs a transmission signal 5107B. The transmission signal 5107B is output in the form of electric waves from an antenna 5108B.

Here, a signal $z_1(i)$(5101A) and a signal $z_2(i)$(5101B) for the same value of i are transmitted from different antennas on the same frequency and at the same time. (In other words, transmission of such signals is performed by using a MIMO scheme.) Further, the pilot symbols 5102A and 5102B are symbols enabling a receiving device to perform signal detection, estimation of frequency offset, gain control, channel estimation, and the like. Although the term pilot symbol is used in the present embodiment to refer to such symbols, such a symbol may be referred to by using other terms, such as a reference symbol.

Further, the control information symbol 5103A and the control information symbol 5103B are symbols for transmitting, to a receiving device, information such as information on a modulation scheme used by the transmitting device, information on a transmission scheme used by the transmitting device, information on a precoding scheme used by the transmitting device, information on an error correction coding scheme used by the transmitting device, information on coding rate of an error correction code, and information on block length (code length) of the error correction code. Note that the control information symbol may be transmitted by using only one of the control information symbol 5103A and the control information symbol 5103B.

Figure 53:
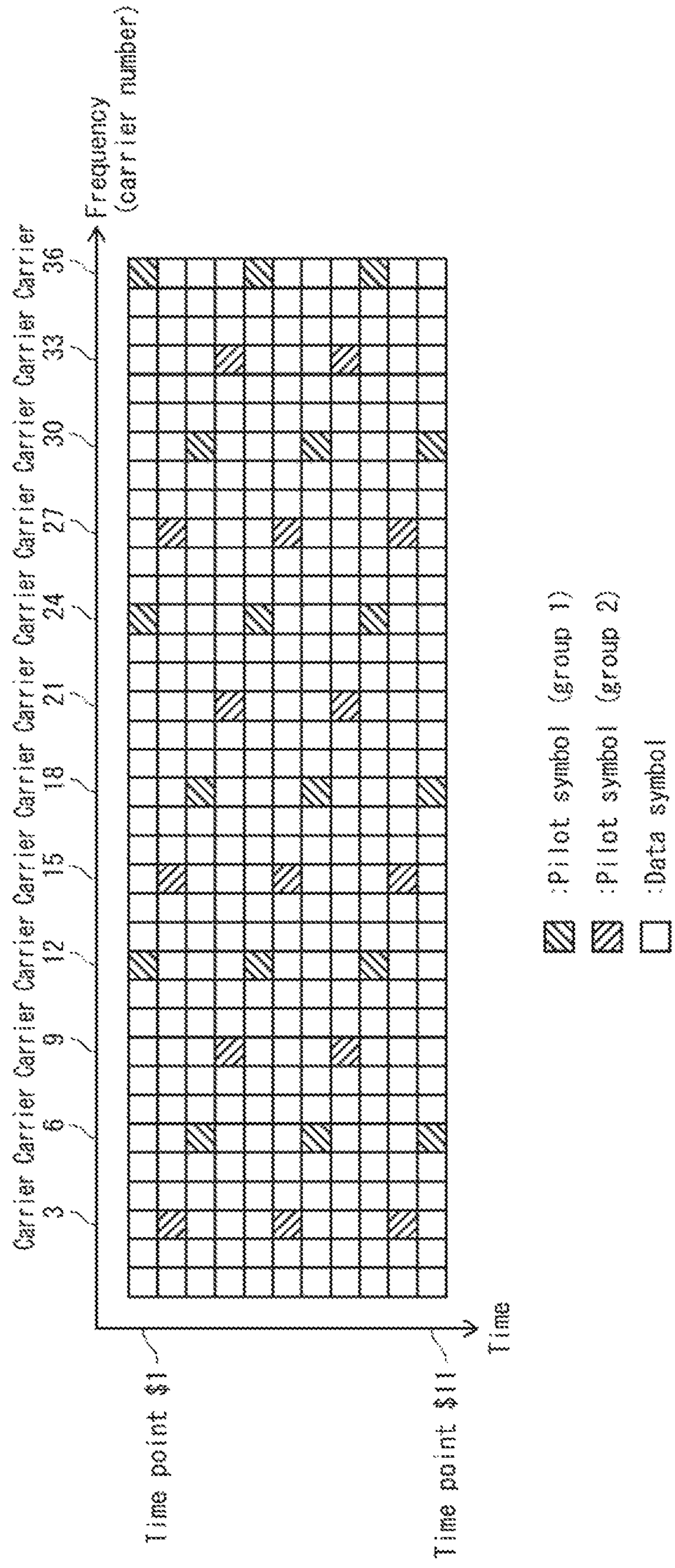
FIG. 53 shows an example of time and frequency domain frame configurations when two stream are transmitted.

FIG. 53 illustrates one example of a time and frequency domain frame configuration when two streams are transmitted. In FIG. 53, the horizontal axis indicates frequency and the vertical axis indicates time. Further, FIG. 53 illustrates, as one example, a configuration of symbols between carrier "1" and carrier "38", and between time "$1" and time "$11".

FIG. 53 also includes illustration of a frame configuration of the transmission signal transmitted from the antenna 5108A in FIG. 51 and a frame configuration of the transmission signal transmitted from the antenna 5108B in FIG. 51.

In FIG. 53, in a frame of the transmission signal transmitted from the antenna 5108A, signal (symbol) $z_1(i)$ is a data symbol. Further, the pilot symbol 5102A is a pilot symbol.

In FIG. 53, in a frame of the transmission signal transmitted from the antenna 5108B, signal (symbol) $z_2(i)$ is a data symbol. Further, the pilot symbol 5102B is a pilot symbol.

Although FIG. 53 only includes illustration of data symbols and pilot symbols, frames may include other symbols, such as a control information symbol.

Next, description is provided on a transmission scheme where a transmitting device in a base station (may be a broadcast station, an access point, etc.,) transmits a single stream, with reference to FIG. 48.

Transmission Scheme where One Stream is Transmitted

An encoding section 4802 in FIG. 48 receives information 4801 and a control signal 4812 as input. The encoding section 4802 performs encoding based on information included in the control signal 4812 indicating coding rate and code length (block length). The encoding section 4802 outputs encoded data 4803.

A mapping section 4804 receives the encoded data 4803 and the control signal 4812 as input. The following assumes that the control signal 4812 specifies a transmission scheme where a single stream is transmitted. Further, the following assumes that the control signal 4812 specifies, as the modulation scheme for the single stream, modulation scheme γ. Here, modulation scheme γ modulates z bits of data.

Based on the above, the mapping section 4804 modulates z bits of data according to modulation scheme γ to generate and output a baseband signal S(t). Further, the mapping section 4804, by utilizing $s_1(t)=s_2(t)=S(t)$, outputs a baseband signal $s_1(t)=S(t)$(4805A) and a baseband signal $s_2(t)=S(t)$(4805B).

Note that each of $s_1(t)$ and $s_2(t)$ is expressed by a complex number (may also be expressed by a real number), and t indicates time. Note that when using a multi-carrier transmission scheme such as OFDM (Orthogonal Frequency Division Multiplexing), $s_1$ and $s_2$ may be considered as functions of frequency f (in which case $s_1$ and $s_2$ are, for example, $s_1(f)$ and $s_2(f)$, respectively), or may be considered as functions of time t and frequency f (in which case $s_1$ and $s_2$ are, for example, $s_1(t,f)$ and $s_2(t,f)$, respectively).

A power changing section 4806A receives the baseband signal $s_1(t)=S(t)$(4805A) and the control signal 4812 as input. The power changing section 4806A sets a real number $P_1$ (may also be a complex number) based on the control signal 4812. The power changing section 4806A outputs $P_1\times s_1(t)$ as a power-changed signal 4807A.

Similarly, a power changing section 4806B receives the baseband signal $s_2(t)=S(t)$(4805B) and the control signal 4812 as input. The power changing section 4806B sets a real number $P_2$ (may also be a complex number) based on the control signal 4812. The power changing section 4806B outputs $P_2\times s_2(t)$ as a power-changed signal 4807B.

A weighting and combining section 4808 receives the power changed-signal 4807A, the power-changed signal 4807B, and the control signal 4812 as input. The weighting and combining section 4808 sets a precoding matrix F based on the control signal 4812. When denoting slot number (symbol number) as i, the weighting and combining section 4808 performs the following calculation.

[Math. 226]

$$\begin{aligned}\begin{pmatrix}u_1(i)\\u_2(i)\end{pmatrix} &= F\begin{pmatrix}P_1\times s_1(i)\\P_2\times s_2(i)\end{pmatrix}\\ &= F\begin{pmatrix}P_1\times S(i)\\P_2\times S(i)\end{pmatrix}\\ &= \begin{pmatrix}a & 0\\0 & a\end{pmatrix}\begin{pmatrix}P_1\times S(i)\\P_2\times S(i)\end{pmatrix}\\ &= \begin{pmatrix}a & 0\\0 & a\end{pmatrix}\begin{pmatrix}P_1 & 0\\0 & P_2\end{pmatrix}\begin{pmatrix}S(i)\\S(i)\end{pmatrix}\\ &= \begin{pmatrix}a\times P_1\times S(i)\\a\times P_2\times S(i)\end{pmatrix}\end{aligned} \tag{A5}$$

Here, a is expressible as a complex number (may also e expressible as a real number). However, a is not "0" (zero).

Further, the weight-combining section 4808 outputs $u_1(i)$ in expression (A5) as a weight-combined signal 4809A, and outputs $u_2(i)$ in expression (A5) as a weight-combined signal 4809B.

A power changing section 4810A receives the weight-combined signal 4809A ($u_1(i)$) and the control signal 4812 as input. The power changing section 4810A sets a real number $Q_1$ (may also be a complex number) based on the control signal 4812. The power changing section 4810A outputs $Q_1\times u_1(t)$ as a power-changed signal 4811A ($z_1(i)$).

Similarly, a power changing section 4810B receives the weight-combined signal 4809B ($u_2(i)$) and the control signal 4812 as input. The power changing section 4810B sets a real number $Q_2$ (may also be a complex number) based on the control signal 4812. The power changing section 4810B outputs $Q_2\times u_2(t)$ as a power-changed signal 4811B ($z_2(i)$).

Accordingly, the following holds true.

[Math. 227]

$$\begin{aligned}\begin{pmatrix}z_1(i)\\z_2(i)\end{pmatrix} &= \begin{pmatrix}Q_1 & 0\\0 & Q_2\end{pmatrix}F\begin{pmatrix}P_1\times s_1(i)\\P_2\times s_2(i)\end{pmatrix}\\ &= \begin{pmatrix}Q_1 & 0\\0 & Q_2\end{pmatrix}F\begin{pmatrix}P_1\times S(i)\\P_2\times S(i)\end{pmatrix}\\ &= \begin{pmatrix}Q_1 & 0\\0 & Q_2\end{pmatrix}\begin{pmatrix}a & 0\\0 & a\end{pmatrix}\begin{pmatrix}P_1\times S(i)\\P_2\times S(i)\end{pmatrix}\\ &= \begin{pmatrix}Q_1 & 0\\0 & Q_2\end{pmatrix}\begin{pmatrix}a & 0\\0 & a\end{pmatrix}\begin{pmatrix}P_1 & 0\\0 & P_2\end{pmatrix}\begin{pmatrix}S(i)\\S(i)\end{pmatrix}\\ &= \begin{pmatrix}Q_1\times a\times P_1\times S(i)\\Q_2\times a\times P_2\times S(i)\end{pmatrix}\end{aligned} \tag{A6}$$

Next, description is provided on a transmission scheme where a single stream is transmitted different from that explained with reference to FIG. 48, with reference to FIG. 49. Components that operate similarly in FIG. 48 and FIG. 49 are provided with the same reference signs.

A phase changing section 4901 receives the weight-combined signal 4809B, which corresponds to $u_2(i)$ in expression (A5), and the control signal 4812 as input. The phase changing section 4901 changes a phase of the weight-combined signal 4809B, which corresponds to $u_2(i)$ in expression (A5), based on the control signal 4812. A signal resulting from changing the phase of weight-combined signal 4809B, which corresponds to $u_2(i)$ in expression (A5), is expressible as $e^{j\theta(i)}\times u_2(i)$ (where j is an imaginary unit). Accordingly, the phase changing section 4901 outputs $e^{j\theta(i)}\times u_2(i)$ as a phase-changed signal 4902. Here, note that the value of the phase that is changed is a part such as θ(i) that is characterized by being a function of i.

Further, the power changing sections 4810A and 4810B in FIG. 49 change the power of the respective signals that are input. Accordingly, output $z_1(i)$ of the power changing section 4810A in FIG. 49 and output $z_2(i)$ of the power changing section 4810B in FIG. 49 are expressible as follows.

[Math. 228]

$$\begin{pmatrix} z_1(i) \\ z_2(i) \end{pmatrix} = \begin{pmatrix} Q_1 & 0 \\ 0 & Q_2 \end{pmatrix}\begin{pmatrix} 1 & 0 \\ 0 & e^{j\theta(i)} \end{pmatrix}F\begin{pmatrix} P_1 \times s_1(i) \\ P_2 \times s_2(i) \end{pmatrix} = \begin{pmatrix} Q_1 & 0 \\ 0 & Q_2 \end{pmatrix}\begin{pmatrix} 1 & 0 \\ 0 & e^{j\theta(i)} \end{pmatrix}F\begin{pmatrix} P_1 \times S(i) \\ P_2 \times S(i) \end{pmatrix} = \begin{pmatrix} Q_1 & 0 \\ 0 & Q_2 \end{pmatrix}\begin{pmatrix} 1 & 0 \\ 0 & e^{j\theta(i)} \end{pmatrix}\begin{pmatrix} a & 0 \\ 0 & a \end{pmatrix}\begin{pmatrix} P_1 \times S(i) \\ P_2 \times S(i) \end{pmatrix} = \begin{pmatrix} Q_1 & 0 \\ 0 & Q_2 \end{pmatrix}\begin{pmatrix} 1 & 0 \\ 0 & e^{j\theta(i)} \end{pmatrix}\begin{pmatrix} a & 0 \\ 0 & a \end{pmatrix}\begin{pmatrix} P_1 & 0 \\ 0 & P_2 \end{pmatrix}\begin{pmatrix} S(i) \\ S(i) \end{pmatrix} \tag{A7}$$

FIG. 50 illustrates a configuration that realizes expression (A7) differing from that illustrated in FIG. 49. FIG. 50 differs from FIG. 49 in terms of the order in which the power changing units and the phase changing unit are arranged. (Note that the function of the power changing units of changing power and the function of the phase changing unit of changing phase remains the same in FIG. 49 and FIG. 50.) When the configuration illustrated in FIG. 50 is applied, $z_1(i)$ and $z_2(i)$ are expressible as follows.

[Math. 229]

$$\begin{pmatrix} z_1(i) \\ z_2(i) \end{pmatrix} = \begin{pmatrix} 1 & 0 \\ 0 & e^{j\theta(i)} \end{pmatrix}\begin{pmatrix} Q_1 & 0 \\ 0 & Q_2 \end{pmatrix}F\begin{pmatrix} P_1 \times s_1(i) \\ P_2 \times s_2(i) \end{pmatrix} = \begin{pmatrix} 1 & 0 \\ 0 & e^{j\theta(i)} \end{pmatrix}\begin{pmatrix} Q_1 & 0 \\ 0 & Q_2 \end{pmatrix}F\begin{pmatrix} P_1 \times S(i) \\ P_2 \times S(i) \end{pmatrix} = \begin{pmatrix} 1 & 0 \\ 0 & e^{j\theta(i)} \end{pmatrix}\begin{pmatrix} Q_1 & 0 \\ 0 & Q_2 \end{pmatrix}\begin{pmatrix} a & 0 \\ 0 & a \end{pmatrix}\begin{pmatrix} P_1 \times S(i) \\ P_2 \times S(i) \end{pmatrix} = \begin{pmatrix} 1 & 0 \\ 0 & e^{j\theta(i)} \end{pmatrix}\begin{pmatrix} Q_1 & 0 \\ 0 & Q_2 \end{pmatrix}\begin{pmatrix} a & 0 \\ 0 & a \end{pmatrix}\begin{pmatrix} P_1 & 0 \\ 0 & P_2 \end{pmatrix}\begin{pmatrix} S(i) \\ S(i) \end{pmatrix} \tag{A8}$$

Note that $z_1(i)$ in expression (A7) and $z_1(i)$ in expression (A8) are equal, and $z_2(i)$ in expression (A7) and $z_2(i)$ in expression (A8) are equal.

FIG. 51 illustrates one example of a configuration of a signal processing section that performs signal processing on the signals $z_1(i)$ and $z_2(i)$ obtained in FIGS. 48 through 50.

An inserting section 5104A receives the signal $z_1(i)$ (5101A), a pilot symbol 5102A, a control information symbol 5103A, and the control signal 4812 as input. The inserting section 5104A inserts the pilot symbol 5102A and the control information symbol 5103A into the signal (symbol) $z_1(i)$(5101A) based on the frame configuration included in the control signal 4812. The inserting section 5104A outputs a modulated signal 5105A that is in accordance with the frame configuration included in the control signal 4812.

Note that the pilot symbol 5102A and the control information symbol 5103A are symbols modulated by using a modulation scheme such as BPSK (Binary Phase Shift Keying) or QPSK (Quadrature Phase Shift Keying) (other modulation schemes may also be used).

A wireless section 5106A receives the modulated signal 5105A and the control signal 4812 as input. The wireless section 5106A performs processing such as frequency conversion and amplification (processing such as inverse Fourier transform is performed when an OFDM scheme is being used) on the modulated signal 5105A based on the control signal 4812. The wireless section 5106A outputs a transmission signal 5107A. The transmission signal 5107A is output in the form of electric waves from an antenna 5108A.

An inserting section 5104B receives the signal $z_2(i)$ (5101B), a pilot symbol 5102B, a control information symbol 5103B, and the control signal 4812 as input. The inserting section 5104B inserts the pilot symbol 5102B and the control information symbol 5103B into the signal (symbol) $z_2(i)$(5101B) based on the frame configuration included in the control signal 4812. The inserting section 5104B outputs a modulated signal 5105B that is in accordance with the frame configuration included in the control signal 4812.

Note that the pilot symbol 5102B and the control information symbol 5103B are symbols modulated by using a modulation scheme such as BPSK (Binary Phase Shift Keying) or QPSK (Quadrature Phase Shift Keying) (other modulation schemes may also be used).

A wireless section 5106B receives the modulated signal 5105B and the control signal 4812 as input. The wireless section 5106B performs processing such as frequency conversion and amplification (processing such as inverse Fourier transform is performed when an OFDM scheme is being used) on the modulated signal 5105B based on the control signal 4812. The wireless section 5106B outputs a transmission signal 5107B. The transmission signal 5107B is output in the form of electric waves from an antenna 5108B.

Here, a signal $z_1(i)$(5101A) and a signal $z_2(i)$(5101B) for the same value of i are transmitted from different antennas on the same frequency and at the same time. (In other words, transmission of such signals is performed by using a MIMO scheme.)

Further, the pilot symbols 5102A and 5102B are symbols enabling a receiving device to perform signal detection, estimation of frequency offset, gain control, channel estimation, and the like. Although the term pilot symbol is used in the present embodiment to refer to such symbols, such a symbol may be referred to by using other terms, such as a reference symbol.

Further, the control information symbol 5103A and the control information symbol 5103B are symbols for transmitting, to a receiving device, information such as information on a modulation scheme used by the transmitting device, information on a transmission scheme used by the transmitting device, information on a precoding scheme used by the transmitting device, information on an error correction coding scheme used by the transmitting device, information on coding rate of an error correction code, and information on block length (code length) of the error correction code. Note that the control information symbol may be transmitted by using only one of the control information symbol 5103A and the control information symbol 5103B.

Figure 52:
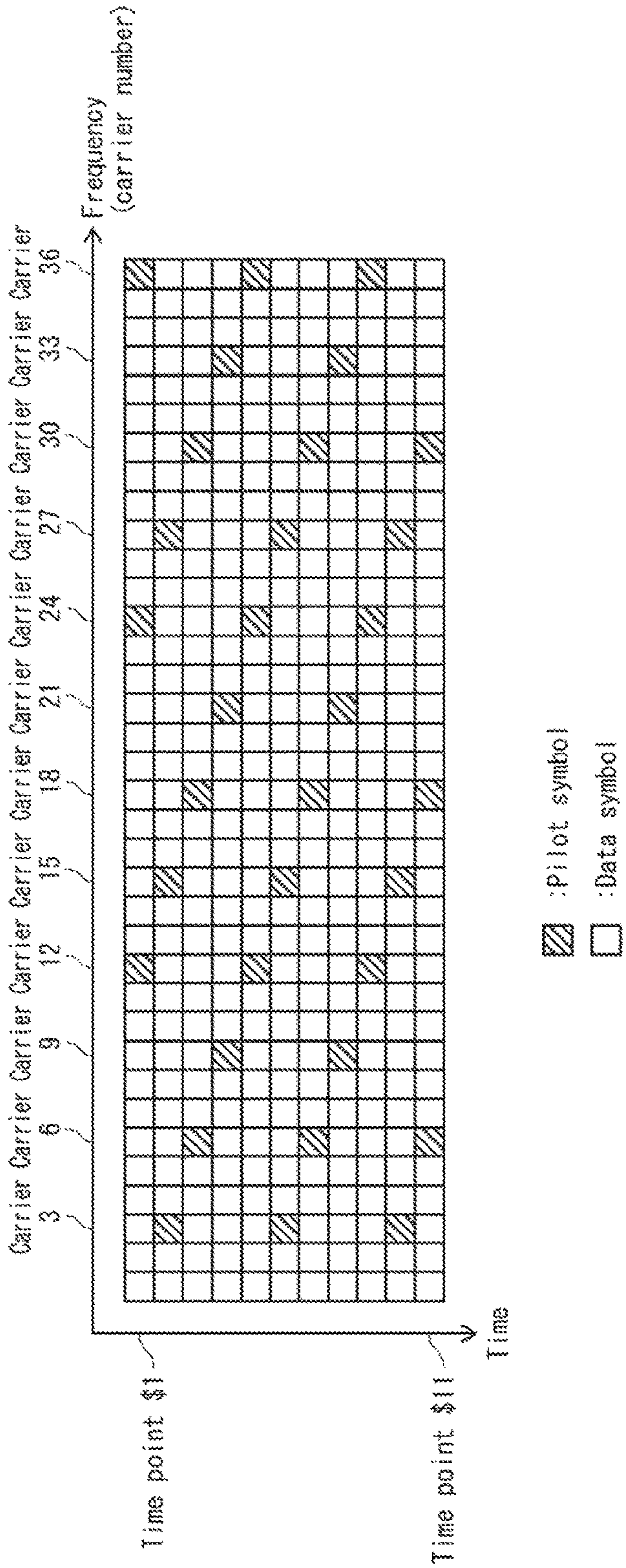
FIG. 52 shows an example of time and frequency domain frame configurations when a single stream is transmitted.

FIG. 52 illustrates one example of a time and frequency domain frame configuration when a single stream is transmitted. In FIG. 52, the horizontal axis indicates frequency and the vertical axis indicates time. Further, FIG. 53 illustrates, as one example, a configuration of symbols between carrier "1" and carrier "38", and between time "$1" and time "$11".

FIG. 52 also includes illustration of a frame configuration of the transmission signal transmitted from the antenna

5108A in FIG. 51 and a frame configuration of the transmission signal transmitted from the antenna 5108B in FIG. 51.

In FIG. 52, in a frame of the transmission signal transmitted from the antenna 5108A, signal (symbol) $z_1(i)$ is a data symbol. Further, the pilot symbol 5102A is a pilot symbol.

In FIG. 52, in a frame of the transmission signal transmitted from the antenna 5108B, signal (symbol) $z_2(i)$ is a data symbol. Further, the pilot symbol 5102B is a pilot symbol.

Although FIG. 52 only includes illustration of data symbols and pilot symbols, frames may include other symbols, such as a control information symbol.

In the description provided above, in expression (A5) through (A8), the precoding matrix F is set as follows.

[Math. 230]

$$F = \begin{bmatrix} a & 0 \\ 0 & a \end{bmatrix} \tag{A9}$$

However, in expression (A5) through (A8), the precoding matrix F may be set as follows.

[Math. 231]

$$F = \begin{bmatrix} a & 0 \\ 0 & 0 \end{bmatrix} \tag{A10}$$

Here, a is expressible by using a complex number (may also be expressed by using a real number). However, a is not "0" (zero).

$z_2(i)=0$ holds true in this case. In this case, a modulated signal need not be transmitted from the antenna 5108B. Accordingly, the inserting section 5104B need not perform insertion of the pilot symbol 5102B and the control information symbol 5103B.

Embodiment 8

The following describes the configuration of an example of a system using the encoding method and the decoding method described in the above embodiment, as an example of corresponding a transmission method and reception method.

Figure 54:
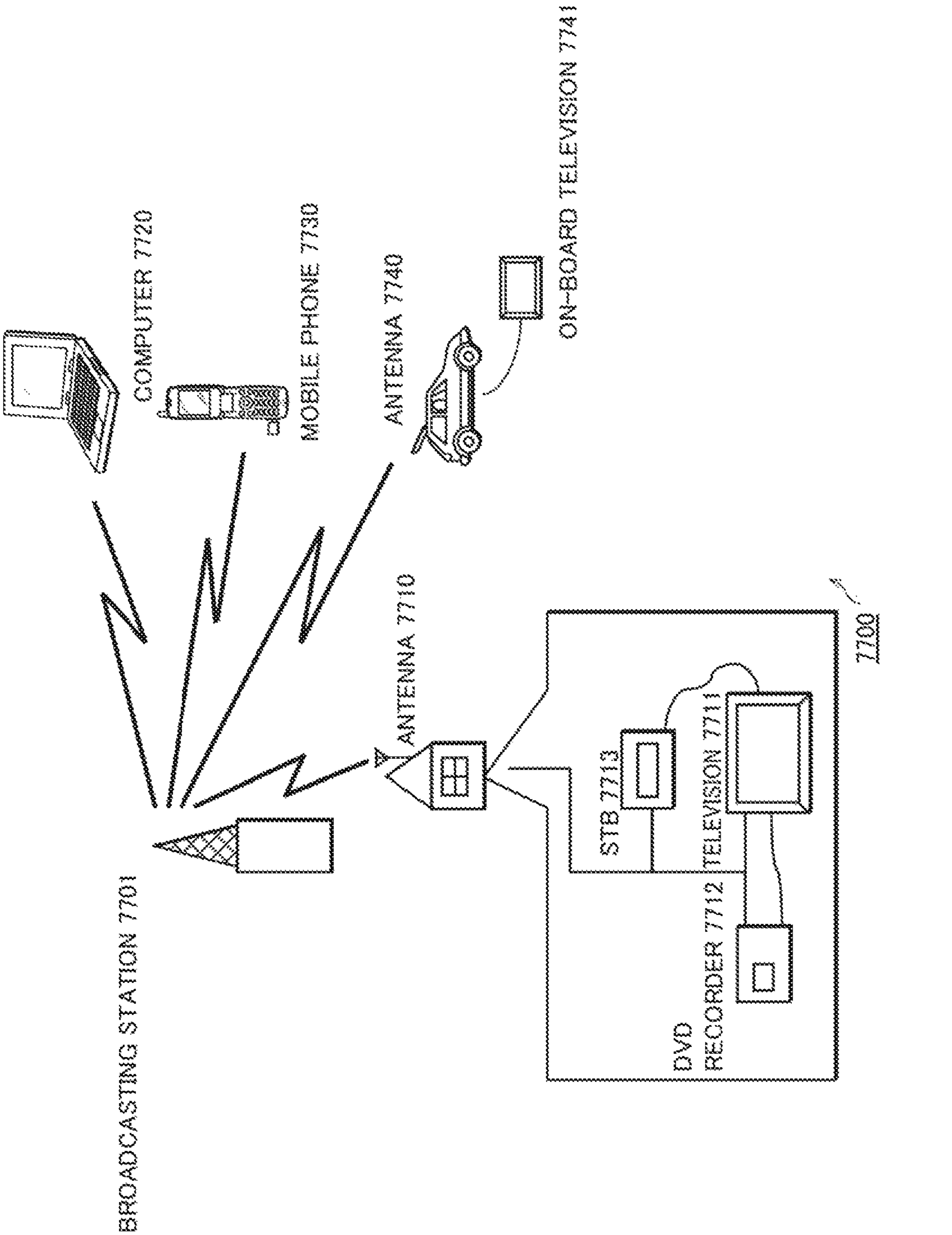
FIG. 54 is a system configuration diagram including a device executing transmission method and reception method.

FIG. 54 is a system configuration diagram including a device executing a transmission method and a reception method applying the coding and decoding methods described in the above embodiment. As shown in FIG. 54, the transmission method and the reception method are implemented by a digital broadcasting system 7700 that includes a broadcasting station 7701 and various types of receivers, such as a television 7711, a DVD recorder 7712, a set-top box (hereinafter STB) 7713, a computer 7720, an on-board television 7741, and a mobile phone 7700. Specifically, the broadcasting station 7701 transmits multiplexed data, in which video data, audio data, and so on have been multiplexed, in a predetermined transmission band using the transmission method described in the above embodiment.

The signal transmitted by the broadcasting station 7701 is received by an antenna (e.g., an antenna 7740) equipped on each of the receivers or installed externally and connected to the receivers. Each of the receivers demodulates the signal received by the antenna to acquire the multiplexed data. Accordingly, the digital broadcasting system 7700 is capable of supplying the effect described in the above embodiment of the present invention.

Here, the video data included in the multiplexed data are, for example, encoded using a video coding method conforming to a standard such as MPEG-2 (Moving Picture Experts Group), MPEG4-AVC (Advanced Video Coding), VC-1, or similar. Similarly, the audio data included in the multiplexed data are, for example, encoded using an audio coding method such as Dolby AC-3 (Audio Coding), Dolby Digital Plus, MLP (Meridian Lossless Packing), DTS (Digital Theatre Systems), DTS-HD, Linear PCM (Pulse Coding Modulation), or similar.

Figure 55:
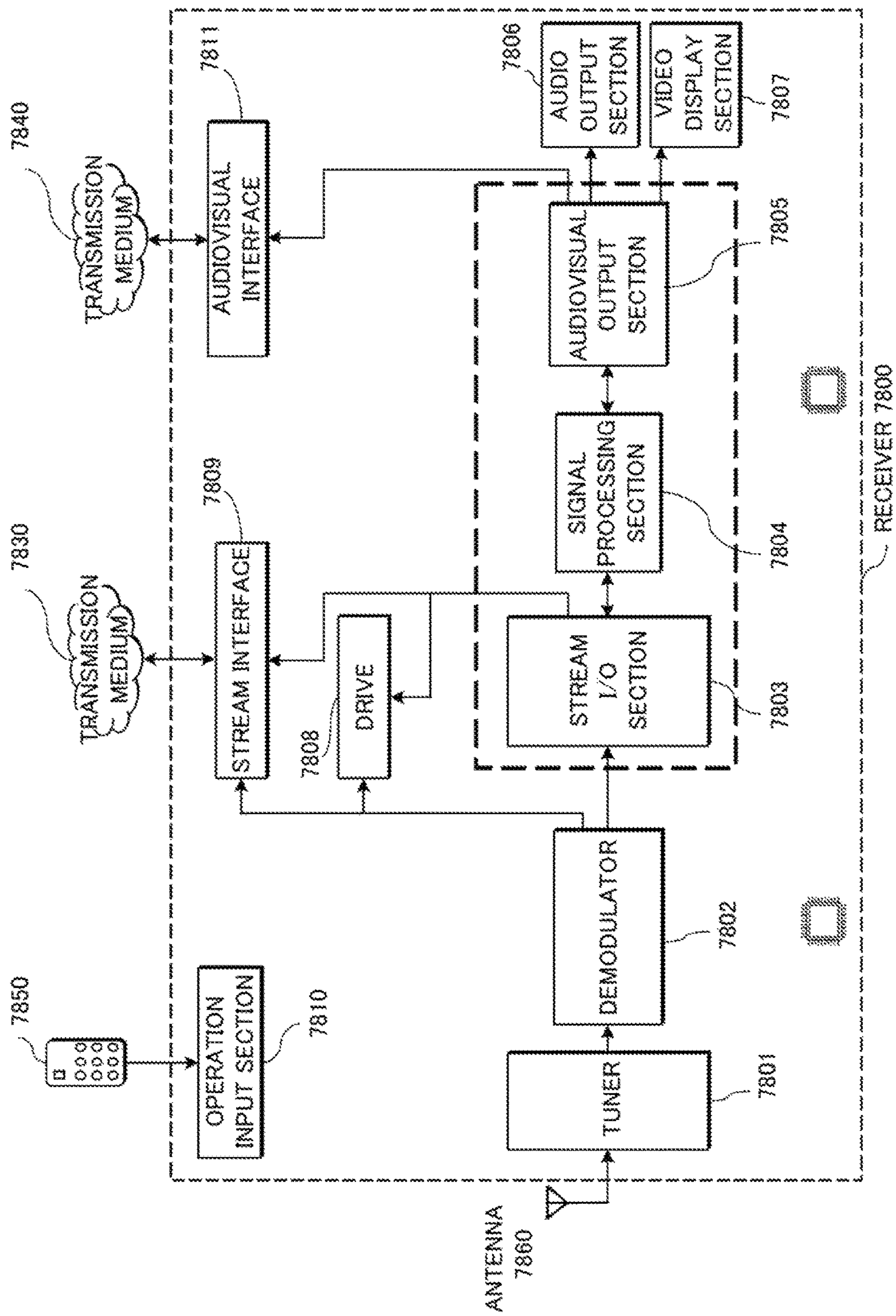
FIG. 55 illustrates a sample configuration of a reception device executing a reception method.

FIG. 55 illustrates an example of the configuration of the receiver 7800. As shown in FIG. 55, as an example configuration for a receiver 7800 a possible configuration method involves a single LSI (or chipset) forming a modem unit, and a separate single LSI (or chipset) forming a codec unit. The receiver 7800 shown in FIG. 55 corresponds to the configuration of the television 7711, the DVD recorder 7712, the set-top box 7713, the computer 7720, the on-board television 7741, and the mobile phone 7730 shown in FIG. 54. The receiver 7800 includes a tuner 7801 converting the high-frequency signal received by the antenna 7860 into a baseband signal, and a demodulator 7802 acquiring the multiplexed data by demodulating the baseband signal so converted. The reception method described in the above embodiment is implemented by the demodulator 7802, which is thus able to provide the results described in the above embodiment of the present invention.

Also, the receiver 7800 includes a stream I/O section 7803 separating the multiplexed data obtained by the demodulator 7802 into video data and audio data, a signal processing section 7804 decoding the video data into a video signal using a video decoding method corresponding to the video data so separated, and decoding the audio data into an audio signal using an audio decoding method corresponding to the audio data so separated, an audio output section 7806 outputting the decoded audio signal to speakers or the like, and a video display section 7807 displaying the decoded video signal on a display or the like.

For example, the user uses a remote control 7850 to transmit information on a selected channel (or a selected (television) program) to an operation input section 7810. Then, the receiver 7800 demodulates a signal corresponding to the selected channel using the received signal received by the antenna 7860, and performs error correction decoding and so on to obtain received data. Here, the receiver 7800 obtains control symbol information, which includes information on the transmission method included in the signal corresponding to the selected channel, and is thus able to correctly set the methods for the receiving operation, demodulating operation, error correction decoding, and so on (when a plurality of error correction decoding methods are prepared as described in the present document (e.g., a plurality of different codes are prepared, or a plurality of codes having different coding rates are prepared), the error correction decoding method corresponding to the error correction codes set from among a plurality of error correction codes are used. As such, the data included in the data symbols transmitted by the broadcasting station (base station) are made receivable. The above describes an example where the user selects a channel using the remote control 7850. However, the above-described operations are also possible using a selection key installed on the receiver 7800 for channel selection.

According to the above configuration, the user is able to view a program received by the receiver 7800 using the reception method described in the above embodiment.

Also, the receiver 7800 of the present embodiment includes a drive 7808 recording the data obtained by processing the data included in the multiplexed data obtained through demultiplexing by the demodulator 7802 and by performing error correction decoding (i.e., performing decoding using a decoding method corresponding to the error correction decoding described in the present document) (in some circumstances, error correction decoding may not be performed on the signal obtained through the demodulation by the demodulator 7802; the receiver 7800 may apply other signal processing after the error correction decoding. These variations also apply to similarly-worded portions, below), or data corresponding thereto (e.g., data obtained by compressing such data), as well as data obtained by processing video and audio onto a magnetic disc, an optical disc, a non-volatile semiconductor memory, or other recording medium. Here, the optical disc is a recording medium from which information is read and to which information is recorded using a laser, such as a DVD (Digital Versatile Disc) or BD (Blu-ray Disc). The magnetic disc is a recording medium where information is stored by magnetising a magnetic body using a magnetic flux, such as a floppy disc or hard disc. The non-volatile semi-conductor memory is a recording medium incorporating a semiconductor, such as Flash memory or ferroelectric random access memory, for example an SD card using flash memory or a Flash SSD (Solid State Drive). The examples of recording media here given are simply examples, and no limitation is intended regarding the use of recording media other than those listed for recording.

According to the above configuration, the user is able to view a program that the receiver 7800 has received through the recording method given in the above embodiment, stored, and read as data at a freely selected time after the time of broadcast.

Although the above explanation describes the receiver 7800 as recording, onto the drive 7808, the multiplexed data obtained by having the demodulator 7802 perform demodulation and then performing error correction decoding (performing decoding with a decoding method corresponding to the error correction decoding described in the present document), a portion of the data included in the multiplexed data may also be extracted for recording. For example, when data broadcasting service content or similar data other than the video data and the audio data are included in the multiplexed data that the demodulator 7802 demodulates and to which error correction decoding is applied, the drive 7808 may extract the video data and the audio data from the multiplexed data demodulated by the demodulator 7802, and multiplex these data into new multiplexed data for recording. Also, the drive 7808 may multiplex only one of the audio data and the video data included in the multiplexed data obtained through demodulation by the demodulator 7802 and performing error correction decoding into new multiplexed data for recording. The drive 7808 may also record the aforementioned data broadcasting service content included in the multiplexed data.

Furthermore, when the television, the recording device (e.g., DVD recorder, Blu-ray recorder, HDD recorder, SD card, or similar), or the mobile phone is equipped with the receiver described in the present invention, the multiplexed data obtained through demultiplexing by the demodulator 7802 and by performing error correction decoding (i.e., performing decoding using a decoding method corresponding to the error correction decoding described in the present document) may include data for correcting software bugs using the television or the recording device, or data for correcting software bugs so as to prevent leakage of personal information or recorded data. These data may be installed so as to correct software bugs in the television or the recording device. As such, when data for correcting software bugs in the receiver 7800 are included in the data, the receiver 7800 bugs are corrected thereby. Accordingly, the television, recording device, or mobile phone equipped with the receiver 7800 is able to operate in a more stable fashion.

The process of extracting a portion of data from among the data included in the multiplexed data obtained through demultiplexing by the demodulator 7802 and by performing error correction decoding (i.e., performing decoding using a decoding method corresponding to the error correction decoding described in the present document) is performed, for example, by the stream I/O section 7803. Specifically, the stream I/O section 7803 separates the multiplexed data demodulated by the demodulator 7802 into video data, audio data, data broadcasting service content, and other types of data in accordance with instructions from a control unit in a non-diagrammed CPU or similar, and multiplexes only the data designated among the separated data to generate new multiplexed data. The question of which data to extract from among the separated data may be, for example, decided by the user, or decided in advance for each type of recording medium.

According to the above configuration, the receiver 7800 is able to record only those data extracted as needed for viewing the recorded program, and is able to reduce the size of the recorded data.

Also, although the above explanation describes the drive 7808 as recording the multiplexed data obtained through demultiplexing by the demodulator 7802 and by performing error correction decoding (i.e., performing decoding using a decoding method corresponding to the error correction decoding described in the present document), the video data included in the data obtained through demultiplexing by the demodulator 7802 and by performing error correction decoding may be converted into video data encoded with a video coding method different from the video coding method originally applied to the video data, so as to decrease the size of the data or reduce the bit rate thereof, and the converted video data may be multiplexed into new multiplexed data for recording. Here, the video coding method applied to the original video data and the video coding method applied to the converted video data may conform to different standards, or may conform to the same standard but differ only in terms of parameters. Similarly, the drive 7808 may also convert the audio data included in the data obtained through demultiplexing by the demodulator 7802 and by performing error correction decoding into audio data encoded with an audio coding method different from the audio coding method originally applied to the audio data, so as to decrease the size of the data or reduce the bit rate thereof, and the converted audio data may be multiplexed into new multiplexed data for recording The process of converting the audio data and the video data from the multiplexed data obtained through demultiplexing by the demodulator 7802 and by performing error correction decoding (i.e., performing decoding using a decoding method corresponding to the error correction decoding described in the present document) into the audio data and the video data having decreased sizes and reduced bitrates is performed by the stream I/O section 7803 and the signal processing section 7804, for example. Specifically, the stream I/O section 7803 separates the data obtained through demultiplexing by the demodulator 7802 and by performing error correction decoding into video data, audio data, data broadcasting service content, and so on in accordance with instructions from a control unit in a CPU or similar. The signal processing section 7804 performs a process of converting the video data so separated into video data encoded with a video coding method different from the video coding method originally applied to the video data, and a process of converting the audio data so separated into audio data encoded with an audio coding method different from the audio coding method originally applied to the audio data, all in accordance with instructions from the control unit. The stream I/O section 7803 multiplexes the converted video data and the converted audio data to generate new multiplexed data, in accordance with the instructions from the control unit. In response to the instructions by the control unit, the signal processing section 7804 may perform the conversion process on only one of or on both of the video data and the audio data. Also, the size or bitrate of the converted audio data and the converted video data may be determined by the user, or may be determined in advance according to the type of recording medium involved.

According to the above configuration, the receiver 7800 is able to convert and record at a size recordable onto the recording medium, or at a size or bitrate of video data and audio data matching the speed at which the drive 7808 is able to record or read data. Accordingly, the drive is able to record the program when the data obtained through demultiplexing by the demodulator 7802 and by performing error correction decoding have a size recordable onto the recording medium, or are smaller than the multiplexed data, or when the size or bitrate of the data demodulated by the demodulator 7802 are lower than the speed at which the drive 7808 is able to record or read data. Thus, the user is able to view a program that has been stored and read as data at a freely selected time after the time of broadcast.

The receiver 7800 further includes a stream interface 7809 transmitting the multiplexed data demodulated by the demodulator 7802 to an external device through a transmission medium 7830. Examples of the stream interface 7809 include Wi-Fi™ (IEEE802.11a, IEEE802.11b, IEEE802.11g, IEEE802.11n, and so on), WiGiG, WirelessHD, Bluetooth™, Zigbee™, and other wireless communication methods conforming to wireless communication standards, used by a wireless communication device to transmit the demodulated multiplexed data to an external device through a wireless medium (corresponding to the transmission medium 7830). Further, the stream interface 7809 may be Ethernet™, USB (Universal Serial Bus, PLC (Power Line Communication), HDMI (High-Definition Multimedia Interface), or some other form of wired communication method conforming to wired communication standards, used by a wired communication device to transmit the demodulated multiplexed data to an external device connected to the stream interface 7809 through a wired channel (corresponding to the transmission medium 7830).

According to the above configuration, the user is able to use the external device with the multiplexed data received by the receiver 7800 using the reception method described in the above embodiment. The aforementioned use of the multiplexed data includes the user viewing the multiplexed data in real time using the external device, recording the multiplexed data with a drive provided on the external device, transferring the multiplexed data from the external device to another external device, and so on.

Although the above explanation describes the receiver 7800 as outputting, to the stream interface 7809, the multiplexed data obtained by having the demodulator 7802 perform demodulation and then performing error correction decoding (performing decoding with a decoding method corresponding to the error correction decoding described in the present document), a portion of the data included in the multiplexed data may also be extracted for recording. For example, when the multiplexed data obtained by having the demodulator 7802 perform demodulation and then performing error correction decoding include data broadcasting service content or other data other than the audio data and the video data, the stream interface 7809 may extract the video data and the audio data from the multiplexed data demodulated by the demodulator 7802, and multiplex these data into new multiplexed data for output. The stream interface 7809 may also multiplex only one of the audio data and the video data included in the multiplexed data obtained through demodulation by the demodulator 7802 and performing error correction decoding into new multiplexed data for output.

The process of extracting a portion of data from among the data included in the multiplexed data obtained through demultiplexing by the demodulator 7802 and by performing error correction decoding (i.e., performing decoding using a decoding method corresponding to the error correction decoding described in the present document) is performed, for example, by the stream I/O section 7803. Specifically, the stream I/O section 7803 separates the multiplexed data demodulated by the demodulator 7802 into video data, audio data, data broadcasting service content, and other types of data in accordance with instructions from a control unit in a non-diagrammed CPU or similar, and multiplexes only the data designated among the separated data to generate new multiplexed data. The question of which data to extract from among the separated data may be, for example, decided by the user, or decided in advance for each type of stream interface 7809.

According to the above configuration, the receiver 7800 is able to extract only those data required by the external device for output, and thus eliminate communication bands consumed by output of the multiplexed data.

Also, although the above explanation describes the stream interface 7809 as recording the multiplexed data obtained through demultiplexing by the demodulator 7802 and by performing error correction decoding (i.e., performing decoding using a decoding method corresponding to the error correction decoding described in the present document), the video data included in the data obtained through demultiplexing by the demodulator 7802 and by performing error correction decoding may be converted into video data encoded with a video coding method different from the video coding method originally applied to the video data, so as to decrease the size of the data or reduce the bit rate thereof, and the converted video data may be multiplexed into new multiplexed data for output. Here, the video coding method applied to the original video data and the video coding method applied to the converted video data may conform to different standards, or may conform to the same standard but differ only in terms of parameters. Similarly, the stream interface 7809 may also convert the audio data included in the data obtained through demultiplexing by the demodulator 7802 and by performing error correction decoding into audio data encoded with an audio coding method different from the audio coding method originally applied to the audio data, so as to decrease the size of the data or reduce the bit rate thereof, and the converted audio data may be multiplexed into new multiplexed data for output.

The process of converting the audio data and the video data from the multiplexed data obtained through demultiplexing by the demodulator 7802 and by performing error correction decoding (i.e., performing decoding using a decoding method corresponding to the error correction decoding described in the present document) into the audio data and the video data having decreased sizes and reduced bitrates is performed by the stream I/O section 7803 and the signal processing section 7804, for example. Specifically, the stream I/O section 7803 separates the data obtained through demultiplexing by the demodulator 7802 and by performing error correction decoding into video data, audio data, data broadcasting service content, and so on in accordance with instructions from the control unit.

The signal processing section 7804 performs a process of converting the video data so separated into video data encoded with a video coding method different from the video coding method originally applied to the video data, and a process of converting the audio data so separated into audio data encoded with an audio coding method different from the audio coding method originally applied to the audio data, all in accordance with instructions from the control unit. The stream I/O section 7803 multiplexes the converted video data and the converted audio data to generate new multiplexed data, in accordance with the instructions from the control unit. In response to the instructions by the control unit, the signal processing section 7804 may perform the conversion process on only one of or on both of the video data and the audio data. Also, the size or bitrate of the converted audio data and the converted video data may be determined by the user, or may be determined in advance according to the type of stream interface 7809 involved.

According to the above configuration, the receiver 7800 is able to convert the bitrate of the video data and the audio data for output according to the speed of communication with the external device. Accordingly, the multiplexed data can be output from the stream interface to the external device when the speed of communication with the external device is lower than the bitrate of the multiplexed data obtained by having the demodulator 7802 perform demodulation and then performing error correction decoding (performing decoding with a decoding method corresponding to the error correction decoding described in the present document). As such, the user is able to use the new multiplexed data with another communication device.

The receiver 7800 also includes an audiovisual interface 7811 that outputs the video signal and the audio signal decoded by the signal processing section 7804 to the external device via the transmission medium. Examples of the audiovisual interface 7811 include Wi-Fi™ (IEEE802.11a, IEEE802.11b, IEEE802.11g, IEEE802.11n, and so on), WiGiG, WirelessHD, Bluetooth™, Zigbee™, and other wireless communication methods conforming to wireless communication standards, used by a wireless communication device to transmit the audio signal and the video signal to the external device through a wireless medium. Also, the stream interface 7809 may be Ethernet™ USB (Universal Serial Bus, PLC, HDMI, or some other form of wired communication method conforming to wired communication standards, used by a wired communication device to transmit the audio signal and the video signal to an external device connected to the stream interface 7809. The stream interface 7809 may also be a terminal connected to a cable that outputs the audio signal and the video signal as-is, in analogue form.

According to the above configuration, the user is able to use the audio signal and the video signal decoded by the signal processing section 7804 with an external device.

The receiver 7800 further includes an operation input section 7810 receiving user operations as input. The receiver 7800 performs various types of switching in accordance with a control signal input by the operation input section 7810 in response to user operations, such as switching the main power ON or OFF, switching between received channels, switching between subtitle displays or audio languages, and switching the volume output by the audio output section 7806, and is also able to set the receivable channels and the like.

The receiver 7800 may also have a function to display the antenna level as an indicator of reception quality while the receiver 7800 is receiving signals. The antenna level is an indicator of signal quality calculated according to, for example, the RSSI (Received Signal Strength Indicator), the received field power, the C/N(Carrier-to-noise power ratio), the BER (Bit-Error Rate), the Packet Error Rate, the Frame Error Rate, the CSI (Channel State Information), or similar information on the signal received by the receiver 7800, and serves as a signal representing signal level and the presence of signal deterioration. In such circumstances, the demodulator 7802 has a reception quality estimation unit estimating the RSSI, the received field power, the C/N, the BER, the Packet Error Rate, the Frame Error Rate, the CSI, or similar information so received, and the receiver 7800 displays the antenna level (signal level, signal indicating signal degradation) in a user-readable format on the video display section 7807 in response to user operations.

The display format for the antenna level (signal level, signal indicating signal degradation) may be a displayed numerical value corresponding to the RSSI, the received field power, the C/N, the BER, the Packet Error Rate, the Frame Error Rate, the CSI, or similar information, or may be another type of display corresponding to the RSSI, the received field power, the C/N, the BER, the Packet Error Rate, the Frame Error Rate, the CSI, or similar information. The receiver 7800 may also display the antenna level (signal level, signal indicating signal degradation) as calculated for a plurality of streams s1, s2, and so on, into which the signal received using the reception method of the above embodiment is separated, or may display a single antenna level (signal level, signal indicating signal degradation) calculated for all of the streams s1, s2, and so on. Also, when the video data and the audio data making up the program are transmitted using a band segmented transmission method, the level of the signal (signal indicating signal degradation) may be indicated at each band.

According to this configuration, the user is able to know the antenna level (signal level, signal indicating signal degradation) in a quantitative and qualitative manner, when reception is performed using the reception method of the above-described embodiment.

Although the receiver 7800 is described above as including an audio output section 7806, a video display section 7807, a drive 7808, a stream interface 7809, and an audiovisual interface 7811, not all of these components are necessarily required. Provided that the receiver 7800 includes at least one of the above-listed components, the multiplexed data obtained through demultiplexing by the demodulator 7802 and by performing error correction decoding (i.e., performing decoding using a decoding method corresponding to the error correction decoding described in the present document) are usable thereby. In addition, the various uses of the receiver here described may be freely combined.

(Multiplexed Data)

Next, the details of an example configuration for the multiplexed data are described. The data structure used for broadcasting is, typically, an MPEG2-TS (Transport Stream). The following explanation uses MPEG2-TS as an example. However, the data structure for the multiplexed data communicated using the transmission method and the reception method given in the above embodiment is not limited to MPEG2-TS. Needless to say, the results described in each of the above embodiments are also attainable using any of a variety of other data structures.

Figure 56:
FIG. 56 illustrates a sample configuration for multiplexed data.

FIG. 56 illustrates a sample configuration for the multiplexed data. As shown in FIG. 56, the multiplexed data are obtained by multiplexing one or more elements making up a program (or an event, which is a portion of a program) currently being supplied by services. The element streams include, for example, video streams, audio streams, presentation graphics (PG) streams, interactive graphics (IG) streams, and so on. When the program being supplied with the multiplexed data is a movie, the video streams are the main video and sub-video thereof, the audio streams are the main audio and sub-audio to be mixed therewith, and the presentation graphics stream are subtitles for the movie. Here, the main video represents video that is normally displayed on the screen, while the sub-video represents video that is displayed as a smaller screen within the main video (e.g., a video of text data giving a synopsis of the movie). The interactive graphics streams represent interactive screens created by assigning GUI components to the screen.

Each of the streams included in the multiplexed data is identified by a PID, which is an identifier assigned to each of the streams. For example, the PIDs assigned to each of the streams are 0x1011 for the video stream used as the main video of the movie, 0x1100 through 0x111F for the audio streams, 0x1200 through 0x121F for the presentation graphics, 0x1400 through 0x141F for the interactive graphics streams, 0x1B00 through 0x1B1F for the video streams serving as sub-video for the movie, and 0x1A00 through 0x1A1F for the audio streams used as sub-audio to be mixed in with the main audio.

Figure 57:
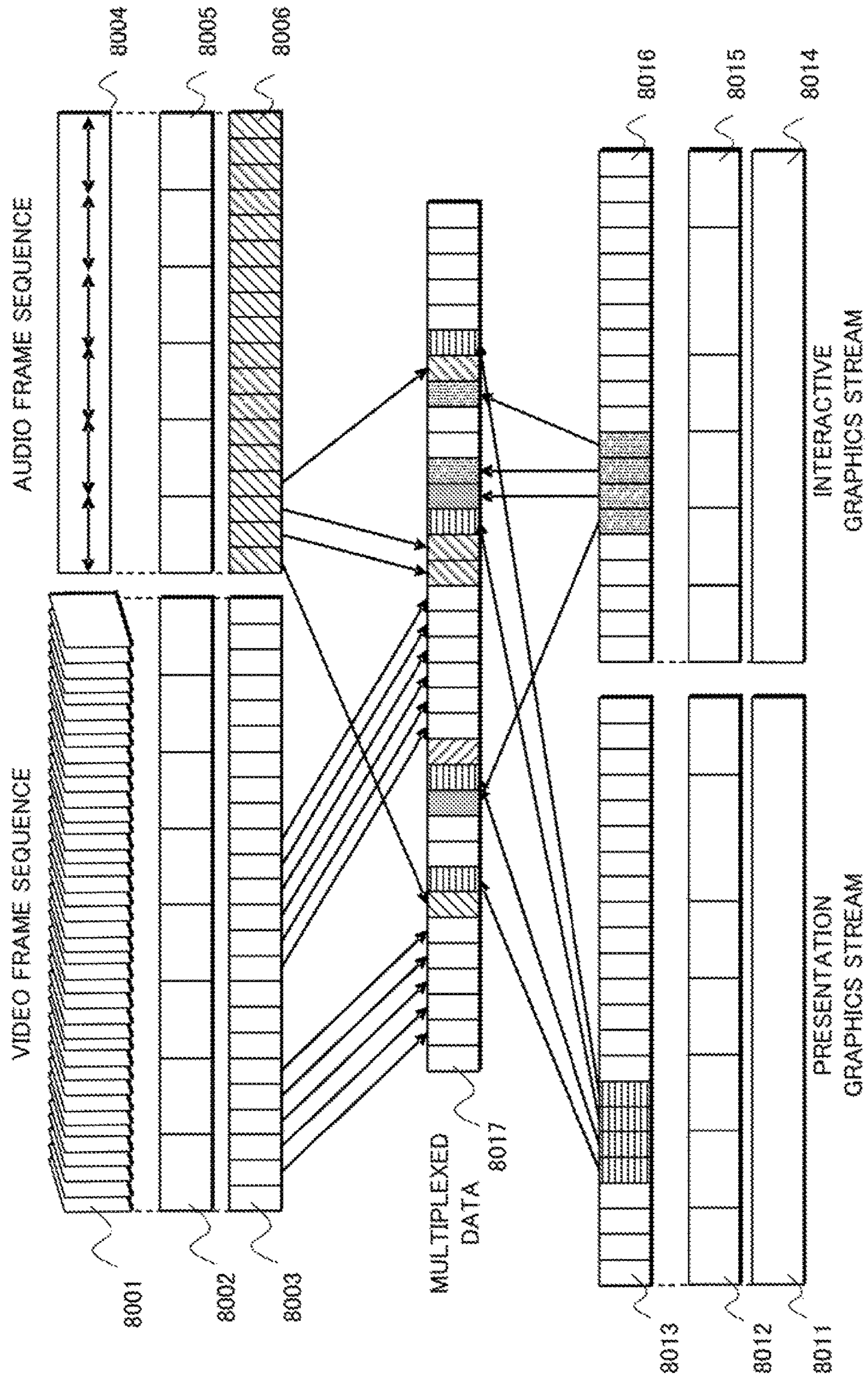
FIG. 57 is a schematic diagram illustrating an example of the manner in which the multiplexed data are multiplexed.

FIG. 57 is a schematic diagram illustrating an example of the manner in which the multiplexed data are multiplexed. First, a video stream 8001, made up of a plurality of video frames, and an audio stream 8004, made up of a plurality of audio frames, are each converted into respective PES packet sequences 8002 and 8005, which are in turn respectively converted into TS packets 8003 and 8006. Similarly, a presentation graphics stream 8011 and interactive graphics data 8014 are each converted into respective PES packet sequences 8012 and 8015, which are in turn respectively converted into TS packets 8013 and 8016. The multiplexed data 8017 are formed by multiplexing these TS packets (8003, 8006, 8013, and 8016) into a single stream.

Figure 58:
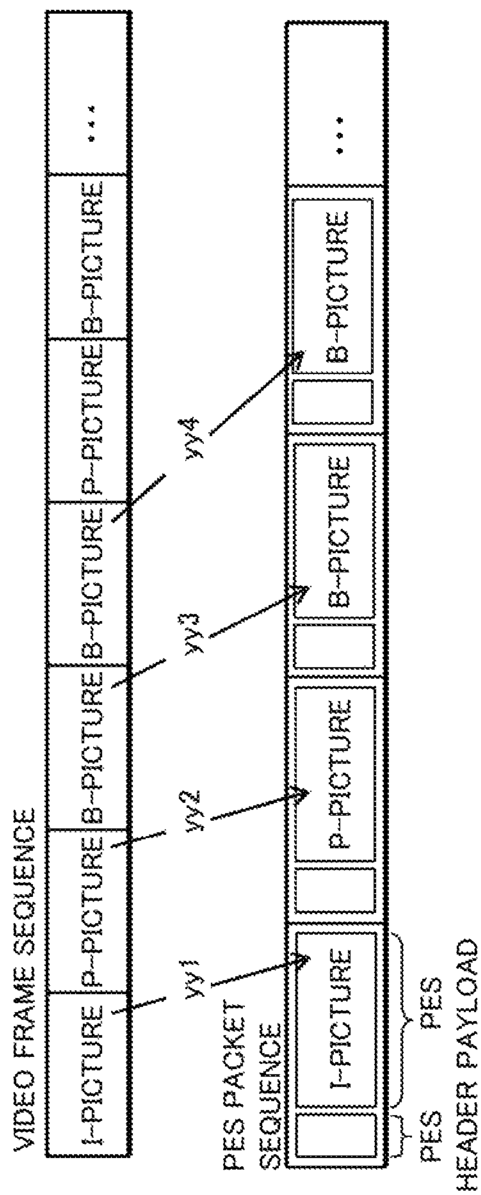
FIG. 58 illustrates an example of storage in a video stream.

FIG. 58 illustrates the details of the manner in which the video stream is stored in the PES packets. The first tier of FIG. 58 indicates a video frame sequence of the video stream. The second tier represents a PES sequence. As the arrows labeled yy1, yy2, yy3, and yy4 in FIG. 58 indicate, a plurality of video presentation units in the video stream, namely I-pictures, B-pictures, and P-pictures, are divided into individual pictures and each stored as the payload of individual PES packets. The PES packets each have a PES header. The PES header stores a PTS (Presentation Time-Stamp), which is a time-stamp for displaying the picture, and a DTS (Decoding Time-Stamp)m which is a time-stamp for decoding the picture.

Figure 59:
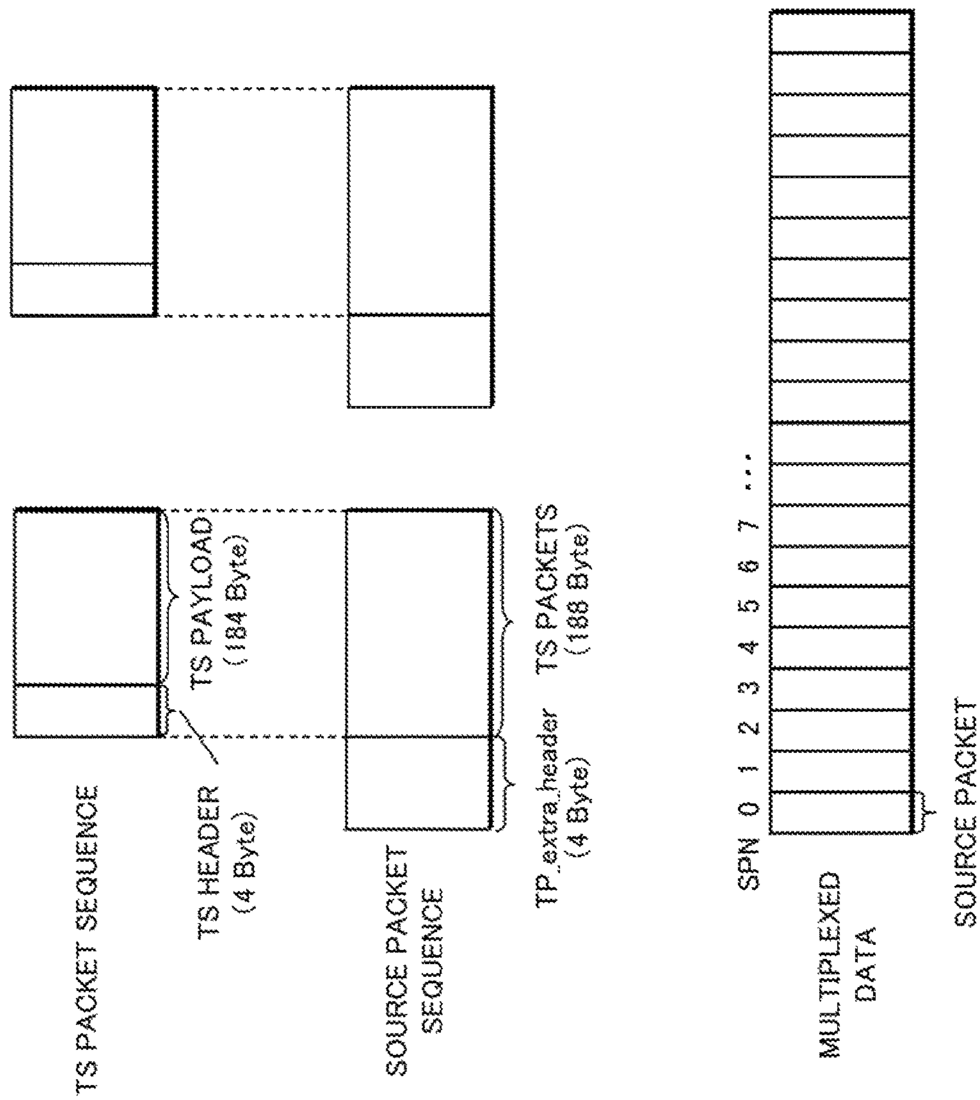
FIG. 59 illustrates the format of TS packets ultimately written into the multiplexed data.

FIG. 59 illustrates the format of TS packets ultimately written into the multiplexed data. The TS packets are 188-byte fixed-length packets, each made up of a 4-byte TS header, which has the PID and other identifying information for the stream, and a 184-byte TS payload, which stores the data. The above-described PES packets are divided and each made to store the TS payload. For a BD-ROM, the TS packets also have a 4-byte TP extra header field assigned thereto, so as to make up 192-byte source packets which are written into the multiplexed data. The TP extra header field has information such as the ATS (Arrival Time Stamp) written therein. The ATS is a time-stamp for the beginning of TS packet transfer to the PID filter of the decoder. Within the multiplexed data, the source packets are arranged as indicated in the lower tier of FIG. 59. The numbers incremented from the beginning of the multiplexed data are termed SPN (Source Packet Numbers).

The TS packets included in the multiplexed data include a PAT (Program Association Table), a PMT (Program Map Table), a PCR (Program Clock Reference) and so on, in addition to the video streams, the audio streams, the presentation graphics streams, and so on. The PAT indicates the PID of the PMT to be used in the multiplexed data, and the PAT itself has a PID of 0. The PMT has the PIDs of each video, audio, subtitle, and other stream included in the multiplexed data, as well as stream attribute information (e.g., the frame rate, the aspect ratio, and so on) for the stream corresponding to each PID. The PMT also has various descriptors pertaining to the multiplexed data. The descriptors include, for example, copy control information indicating whether or not the multiplexed data may be copied. The PCR has STC time information corresponding to the ATS transferred to the decoder with each PCR packet, so as to synchronize the ATC (Arrival Time Clock), which is the ATS time axis, and the STC (System Time Clock), which is the PTS and DTS time axis.

Figure 60:
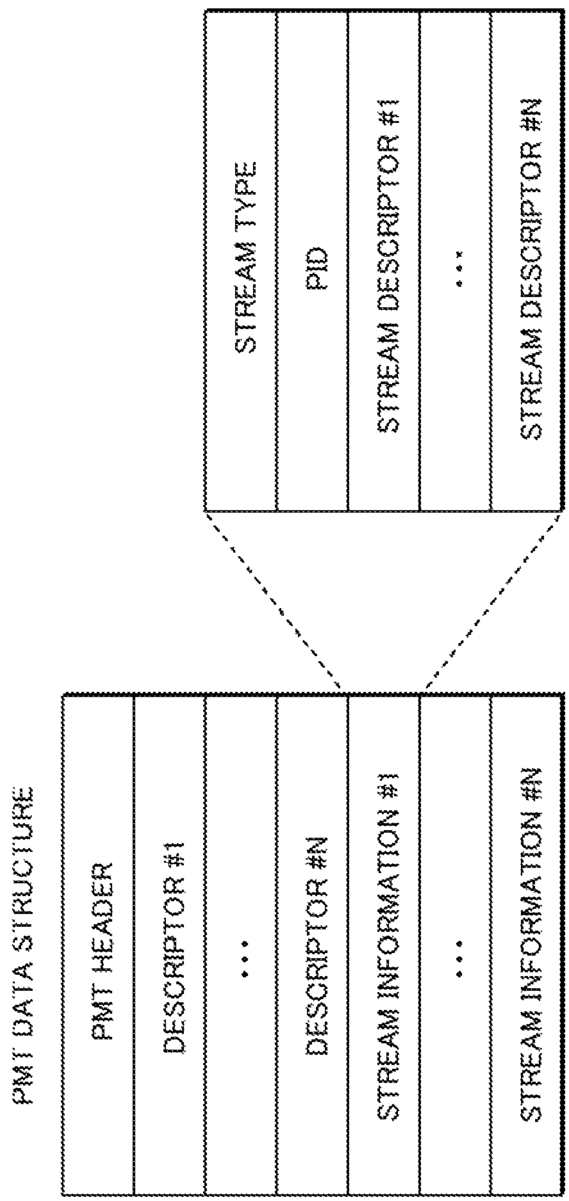
FIG. 60 describes the details of PMT data structure.

FIG. 60 describes the details of PMT data structure. A PMT header is arranged at the head of the PMT, and describes the length and so on of the data included in the PMT. Subsequently, a plurality of descriptors pertaining to the multiplexed data are arranged. The above-described copy control information and the like are written as the descriptors. After the descriptors, stream information pertaining to the streams included in the multiplexed data is arranged in plurality. The stream information is made up of stream descriptors describing the stream type, stream PID, and stream attribute information (frame rate, aspect ratio, and so on) for identifying the compression codec of each stream. The stream descriptors are equal in number to the streams in the multiplexed data.

When recorded onto a recording medium, the above-described multiplexed data are recorded along with a multiplexed data information file.

Figure 61:
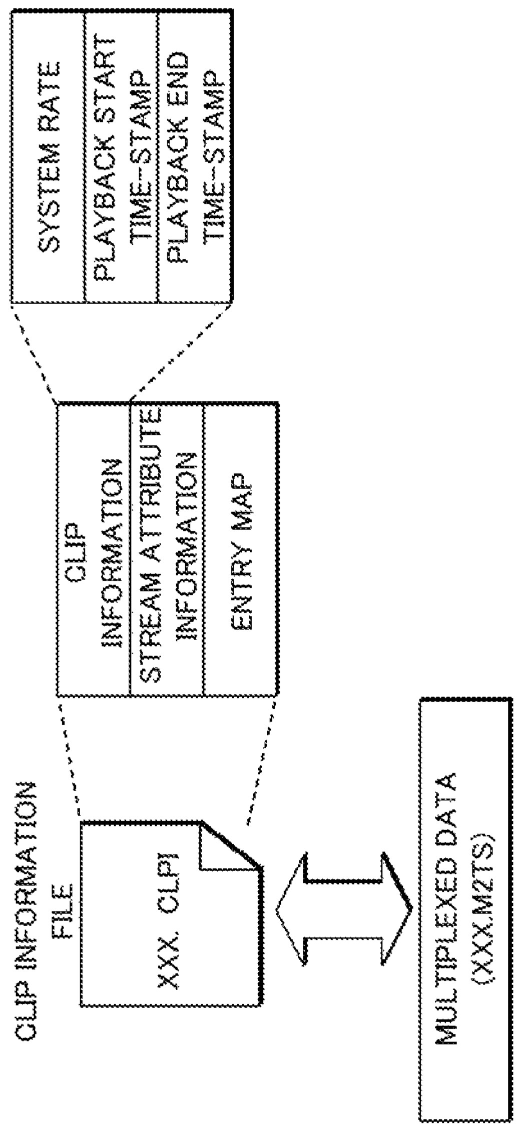
FIG. 61 illustrates the configuration of file information for the multiplexed data.

FIG. 61 illustrates the configuration of the multiplexed data information file. As shown in FIG. 61, the multiplexed data information file is management information for the multiplexed data that is in one-to-one correspondence therewith and is made up of clip information, stream attribute information, and an entry map.

As shown in FIG. 61, the clip information is made up of the system rate, the playback start time-stamp, and the playback end time-stamp. The system rate indicates the maximum transfer rate at which the multiplexed data are transferred to the PID filter of a later-described system target decoder. The interval between ATS included in the multiplexed data is set so as to be equal to or less than the system rate. The playback start time-stamp is the PTS of the leading video frame in the multiplexed data, and the playback end time-stamp is the PTS of the final video frame in the multiplexed data, with one frame of playback duration added thereto.

Figure 62:
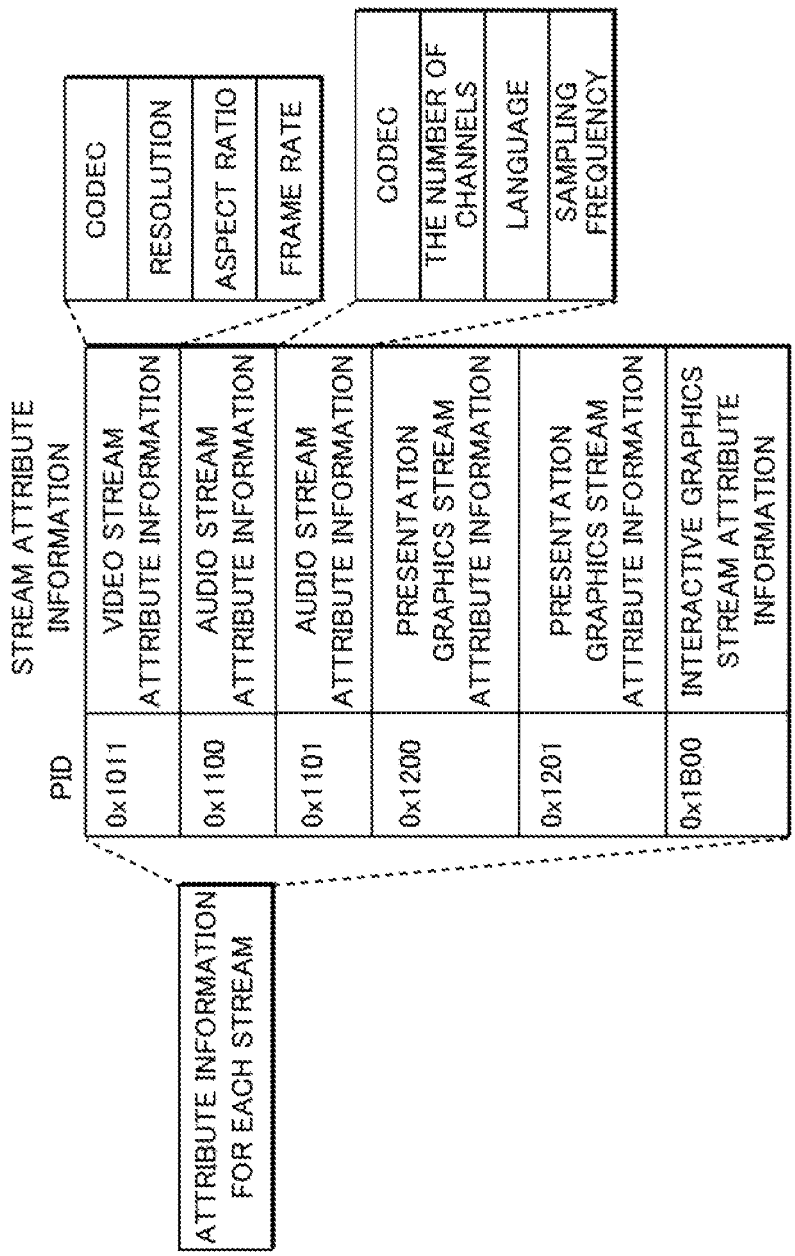
FIG. 62 illustrates the configuration of stream attribute information.

FIG. 62 illustrates the configuration of the stream attribute information included in the multiplexed data information file. As shown in FIG. 62, the stream attribute information is attribute information for each of the streams included in the multiplexed data, registered in each PID. The attribute information differs for each of the video streams, audio streams, presentation graphics streams, and interactive graphics streams. The video stream attribute information includes such information as the compression codec used to compress the video stream, the resolution of the picture data making up the video stream, the aspect ratio, the frame rate, and so on. The audio stream attribute information includes such information as the compression codec used to compress the audio stream, the number of channels included in the audio stream, the compatible languages, the sampling frequency, and so on. This information is used to initialize the decoder before the player begins playback.

In the present embodiment, the stream types included in the PMT are used, among the above-described multiplexed data. When the multiplexed data are recorded on a recording medium, the video stream attribute information included in the multiplexed data is used. Specifically, given the video coding method or device described in the above embodiments, a step or means is provided to established specific information indicating that the stream types included in the PMT or the video stream attribute information is for video data generated by the video coding method or device described in the above embodiments. According to this configuration, the video data generated by the video coding method or device described in the above embodiments is distinguished from video data conforming to some other standard.

Figure 63:
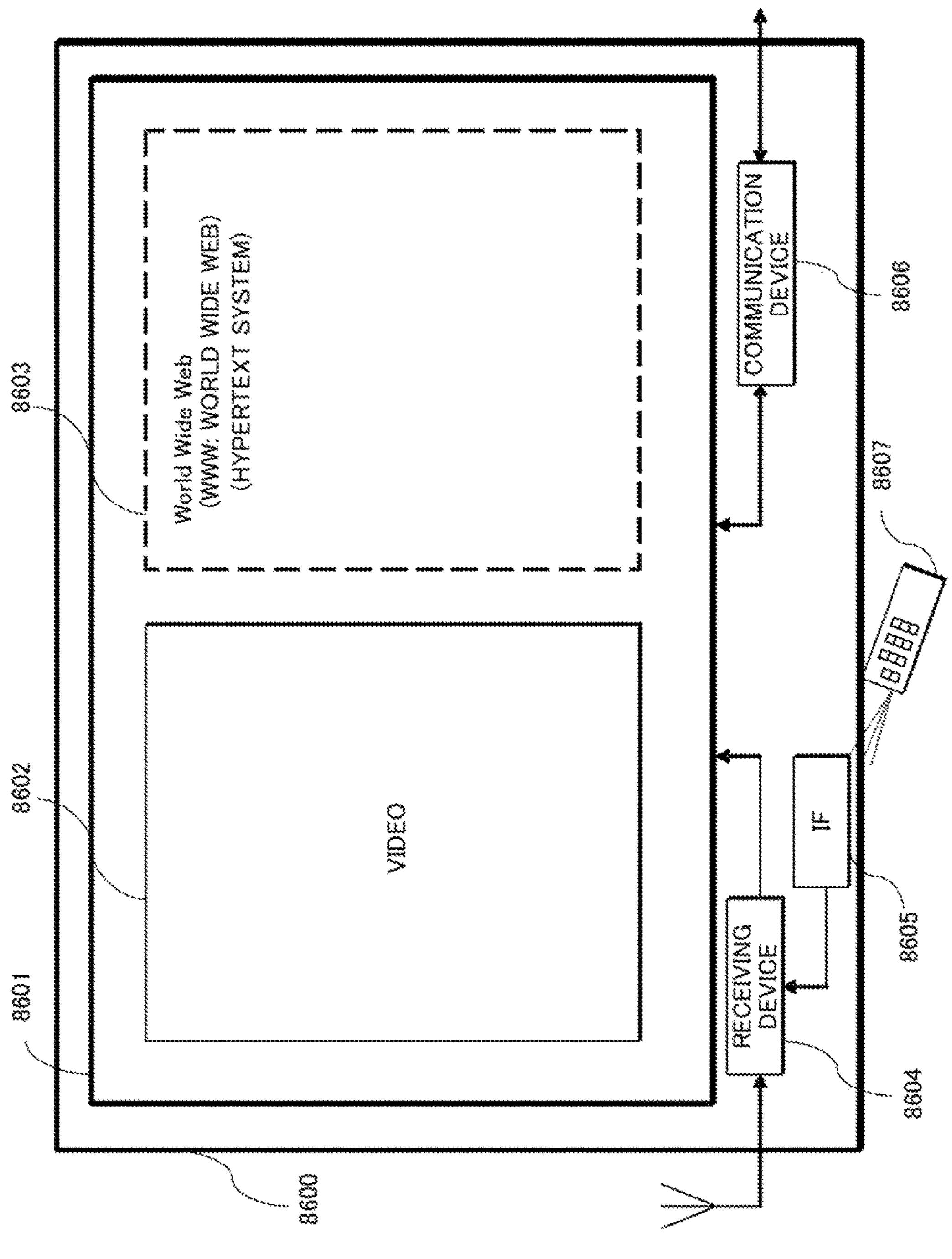
FIG. 63 illustrates the configuration of a sample audiovisual output device.

FIG. 63 illustrates an example of the configuration of an audiovisual output device 8600 that includes a receiving device 8604 receiving a modulated signal that includes audio and video data, or data for a data broadcast, transmitted by a broadcasting station (base station). The configuration of the receiving device 8604 corresponds to that of the receiver 7800 shown in FIG. 55. The audiovisual output device 8600 is equipped with, for example, an operating system (OS), and with a communication device 8606 (such as a wireless LAN (Local Area Network) or Ethernet™ communication device) for connecting to the Internet. Accordingly, a video display section 8601 is able to simultaneously display data video 8602 for the data broadcast and hypertext 8603 (shown as World Wide Web) supplied over the internet.

Then, by using a remote control (or a mobile phone or keyboard) 8607, one of the data video 8602 for the data broadcast and the hypertext 8603 supplied over the internet can be selected and modified. For example, when the hypertext 8603 supplied over the internet is selected, the website being displayed can be changed by using the remote control to perform an operation. Similarly, when the audio and video data, or the data for the data broadcast, are selected, information on the currently selected channel (or the selected (television) program, or the selected audio transmission) can be transmitted by using the remote control 8607. Thus, an interface 8605 acquires information transmitted by the remote control, and the receiving device 8604 then demodulates the signal corresponding to the selected channel, performs error correction decoding and similar processing thereon (i.e., performs decoding using a decoding method corresponding to the error correction decoding described in the present document), and thereby obtains received data.

Here, the receiving device 8604 acquires information on the control symbols included in the transmission method information included in the signal corresponding to the selected channel, thereby correctly setting the reception operations, demodulation method, error correction decoding method and so on, which enables acquisition of the data included in the data symbols transmitted by the broadcasting station (base station). The above describes an example where the user selects a channel using the remote control 8607. However, the above-described operations are also possible using a selection key installed on the audiovisual output device 8600 for channel selection.

The audiovisual output device 8600 may also be operated using the Internet. For example, a recording (storage) session is programmed into the audiovisual output device 8600 from a different terminal that is also connected to the Internet. (Accordingly, and as shown in FIG. 55, the audiovisual output device 8600 has a drive 7808.) Then, the channel is selected before recording begins, and the receiving device 8604 demodulates the signal corresponding to the selected channel and applies error correction decoding processing thereto to obtain received data. Here, the receiving device 8604 obtains control symbol information, which includes information on the transmission method included in the signal corresponding to the selected channel, and is thus able to correctly set the methods for the receiving operation, demodulating operation, error correction decoding, and so on (when a plurality of error correction decoding methods are prepared as described in the present document (e.g., a plurality of different codes are prepared, or a plurality of codes having different coding rates are prepared), the error correction decoding method corresponding to the error correction codes set from among a plurality of error correction codes are used. As such, the data included in the data symbols transmitted by the broadcasting station (base station) are made receivable.

(Other Addenda)

In the present document, the transmitting device is plausibly installed on, for example, a broadcasting station, a base station, an access point, a terminal, a mobile phone, or some other type of communication or broadcasting device. Likewise, the receiving device is plausibly installed on a television, a radio, a terminal, a personal computer, a mobile phone, an access point, a base station, or some other type of communication device. Also, the transmitting device and the receiving device of the present invention are devices with communication functionality. These devices each plausibly take the form of a television, a radio, a personal computer, a mobile phone, or some other device for executing applications connectable through some type of interface (e.g., USB).

Also, in the transmission and reception methods described above, symbols other than the data symbols that transmit data encoded in the encoding methods described in the present disclosure may be arranged in the frames, such as pilot symbols (preamble, unique word, postamble, reference symbols, and so on) or control information symbols. Although the pilot symbols and control information symbols are presently named as such, the symbols may take any name, as only the function thereof is relevant.

A pilot symbol is, for example, a known symbol modulated by the communicating device using PSK modulation (alternatively, the receiver may come to know the symbols transmitted by the transmitter by means of synchronization), such that the receiver uses the symbol to detect the signal by frequency synchronization, time synchronization, channel estimation (or CSI estimation) (for each modulated signal).

Similarly, a control information symbol is a symbol for communicating information (e.g., the modulation method, error correction coding method, coding rate for the error correction coding method, upper layer information, and so on used in communication) required for inter-party communication in order to realize non-data communication (i.e., of applications).

The present invention is not limited to the above-described embodiments. A number of variations thereon are also possible. For example, although the above embodiments describe the use of a communication device, this is not intended as a limitation. The communication method may also be performed using software.

Although the present document uses terms such as precoding, precoding weight, and precoding matrix, the terms may be freely modified (e.g., using the term code book) as the focus of the present invention is the signal processing itself.

Although the present document describes the receiving device as using ML operations, APP, Max-log APP, ZF, MMSE, and so on, and the results thereof are used to obtain soft decision results (log-likelihood and log-likelihood ratio) and hard decision results (zero or one) for each bit of the data transmitted by the transmitting device, these may be termed, in generality, wave detection, demodulation, detection, estimation, and separation.

Further, in a MIMO system transmitting a plurality of streams s1(t) and s2(t) at the same time from different antennas, the streams s1(t) and s2(t) may transport different data or may transport identical data.

Also, the transmission antenna of the transmitting device and the reception antenna of the receiving device, each drawn as a single antenna in the drawings, may also be provided as a plurality of antennas.

In the present document, the universal quantifier ∀ is used, as well as the existential quantifier ∃.

Also, in the present document, radians are used as the unit of phase in the complex plane, such as for arguments.

When using the complex plane, the polar coordinates of complex numbers are expressible in polar form. For a complex number $z=a+jb$ (where a and b are real numbers and j is the imaginary unit), a point (a, b) is expressed, in the complex plane, as the polar coordinates thereof [r, θ], by satisfying $a=r\times\cos\theta$ and $b=r\times\sin\theta$, where r is the absolute value of z ($r=|z|$) and θ is the argument. Thus, $z=a+jb$ is represented as $re^{j\theta}$.

Although the present document describes the baseband signals s1, s2, z1, and z2 as complex signals, the complex signals may also be represented as I+jQ (where j is the imaginary unit) by taking I as the in-phase signal and Q as the quadrature signal. Here, I may be zero, and Q may also be zero.

Figure 64:
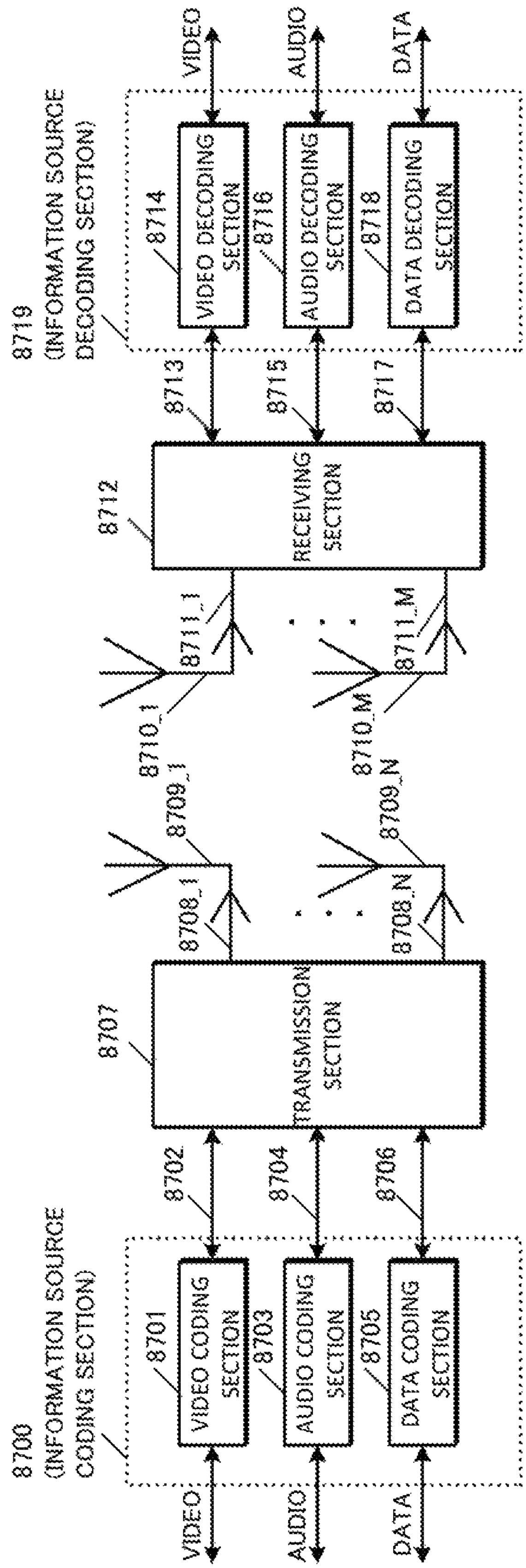
FIG. 64 illustrates a sample broadcasting system using a method of switching between precoding matrices according to a rule.

Also, FIG. 64 illustrates a sample broadcasting system using encoding and decoding methods described in the present document. As shown in FIG. 64, a video coding section 8701 takes video as input, performs video coding thereon, and outputs coded video data 8702. An audio coding section 8703 takes audio as input, performs audio coding thereon, and outputs coded audio data 8704. A data coding section 8705 takes data as input, performs data coding (e.g., data compression) thereon, and outputs coded data 8706. Taken together, these form an information source coding section 8700.

A transmission section 8707 takes the coded video data 8702, the coded audio data 8704, and the coded data 8706 as input, uses one or all of these as transmission data, applies error correction coding, modulation, precoding, and other processes (e.g., signal processing by the transmitting device) thereto, and outputs transmission signals 8708_1 through 8708_N. The transmission signals 8708_1 through 8708_N are then respectively transmitted to antennas 8709_1 through 8709_N as electrical waves.

A receiving section 8712 takes received signals 8710_1 through 8710_M received by the antennas 8711_1 through 8711_M as input, performs frequency conversion, precoding decoding, log-likelihood ratio calculation, error correction decoding, and other processing (i.e., performs decoding using a decoding method corresponding to the error correction decoding described in the present document) (e.g., processing by the receiving device) thereon, and outputs received data 8713, 8715, and 8717. An information source decoding section 871, takes the received data 8713, 8715, and 8717 as input. A video decoding section 8714 takes received data 8713 as input, performs video decoding thereon, and outputs a video signal. The video is then displayed by a television. Similarly, an audio decoding section 8716 takes received data 8715 as input. Audio decoding is performed and an audio signal is output. The audio then plays through a speaker. Also, a data decoding section 8718 takes received data 8717 as input, performs data decoding thereon, and outputs data information.

In the above-described embodiments of the present invention, the multicarrier communication scheme, such as OFDM, may use any number of encoders installed in the transmitting device. Accordingly, for example, when the transmitting device has one encoder installed, the method for distributing the output may of course be applied to a multicarrier communication scheme such as OFDM.

Also, for example, a program for executing the above-described communication method may be stored in advance in the ROM, and may then be executed through the operations of the CPU.

Further, the program for executing the above-described communication method may be recorded onto a computer-readable recording medium, the program recorded onto the recording medium may be stored in the RAM of a computer, and the computer may operate according to the program.

The components of each of the above-described embodiments may typically be realized as LSI (Large Scale Integration), a form of integrated circuit. The components of each of the embodiments may be realized as individual chips, or may be realized in whole or in part on a common chip.

Although LSI is named above, the chip may be named an IC (integrated circuit), a system LSI, a super LSI, or an ultra LSI, depending on the degree of integration. Also, the integrated circuit method is not limited to LSI. A private circuit or a general-purpose processor may also be used. After LSI manufacture, a FPGA (Field Programmable Gate Array) or reconfigurable processor may also be used.

Furthermore, future developments may lead to technology enhancing or surpassing LSI semiconductor technology. Such developments may, of course, be applied to the integration of all functional blocks. Biotechnology applications are also plausible.

Also, the coding method and decoding method may be realized as software. For example, a program for executing the above-described coding method and decoding method may be stored in advance in the ROM, and may then be executed through the operations of the CPU.

Further, the program for executing the above-described coding method and decoding method may be recorded onto a computer-readable recording medium, the program recorded onto the recording medium may be stored in the RAM of a computer, and the computer may operate according to the program.

The present invention is not limited to wireless communication, but obviously also applies to wired communication, including PLC, visible spectrum communication, and optical communication.

In the present document, the term time-varying period is used. This refers to the period as formatted for a time-varying LDPC-CC.

In the present embodiment, the symbol T in $A^T$ is used to indicate that a matrix $A^T$ is the transpose matrix of a matrix A. Accordingly, given a matrix A with m rows and n columns, the matrix $A^T$ has n rows and m columns in which the elements (row i, column j) of matrix A are inverted into elements (row j, column i).

(Application of Correction Coding and Decoding Method)

Figure 65:
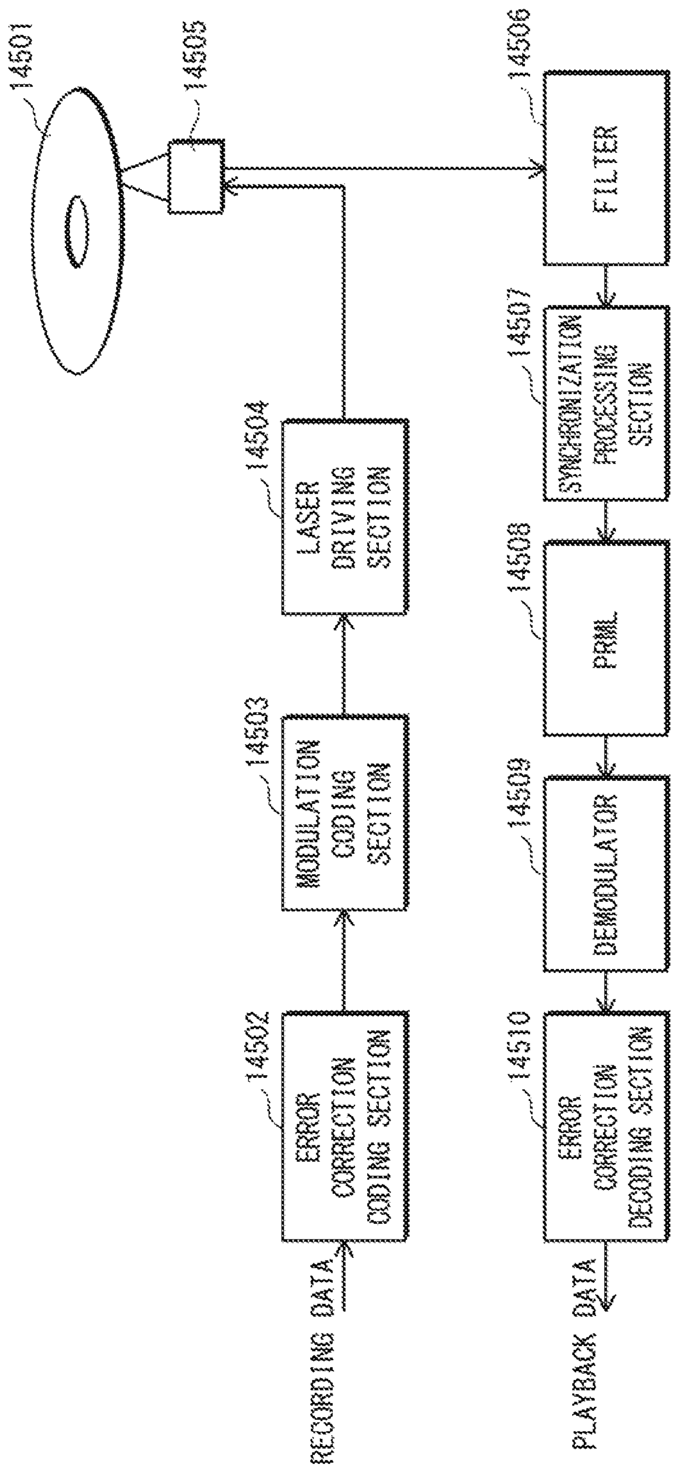
FIG. 65 illustrates an optical disc device.

FIG. 65 shows an example of the configuration of parts relating to a processing system of recording data and a processing system of playing back data in an optical disc device that records data into an optical disc such as a BD and a DVD and plays back data recorded in such an optical disc, to which the correction encoding and the decoding method described in the present disclosure are applied.

The processing system of recording data shown in FIG. 65 includes an error correction coding section 14502, a modulation coding section 14503, a laser driving section 14504, and an optical pick-up 14505. The error correction coding section 14502 performs error correction coding on data recorded in an optical disc 14501 by using the error correction code described in the present disclosure, thereby to generate error correction coded data. The modulation coding section 14503 performs modulation coding by using a modulation code such as an RLL (Run Length Limited) 17 code (e.g. Non-Patent Literature 38), thereby to generate a recording pattern. The laser driving section 14504 drives the optical pick-up 14505 to form a recording mark corresponding to the recording pattern on a track of the optical disc 14501 by using laser irradiated from the optical pick-up 14505 to the track.

Also, the processing system of playing back data shown in FIG. 65 includes the optical pick-up 14505, a filter 14506, a synchronization processing section 14507, a PRML (Partial Response Maximum Likelihood) section 14508, a demodulator 14509, and an error correction decoding section 14510. Data recorded in the optical disc 14501 is played back, by taking advantage of that an amount of light reflecting off the laser, which is irradiated on the track of the optical disc 14501 by the optical pick-up 14505, varies depending on the recording mark formed on the track. The optical pick-up 14505 outputs a playback signal corresponding to the amount of light reflecting off the laser irradiated on the track of the optical disc 14501. The filter 14506 is composed of an HPF (High-pass filter), an LPF (Low-pass filter), a BPF (Band-pass filter), and the like, and removes noise components in an unnecessary frequency band that are contained in the playback signal. For example, in the case where data recorded in the optical disc is coded by using an RLL17 code, the filter 14506 is composed of an LPF and an HPF that reduce noise components in a frequency band other than a frequency band of the RLL17 code. Specifically, according to a standard linear velocity in which one channel bit has a frequency of 66 MHz, the HPF has a cut-off frequency of 10 kHz, and the LPF has a cut-off frequency of 33 MHz, which is a Nyquist frequency of one channel bit frequency.

The synchronization processing section 14507 converts a signal output by the filter 14506 to a digital signal sampled at intervals of one channel bit. The PRML (Partial Response Maximum Likelihood) section 14508 binarizes the digital signal. PRML is an art that combines partial response (PR) and wave detection, and is a signal processing scheme according to which the most probable signal sequence is selected from a waveform of digital signals based on the assumption that a known intercede interference occurs. Specifically, partial response equalization is performed on a synchronized digital signal with use of an FIR filter or the like, such that the digital signal has predetermined frequency characteristics. Then, the digital signal is converted to a corresponding binary signal by selecting the most probable state transition sequence. The demodulator 14509 demodulates the binary signal in accordance with the RLL17 code, and outputs a demodulated bit sequence (hard decision value or soft decision value such as log-likelihood ratio). The error correction decoding section 14510 reorders the demodulated bit sequence in a predetermined procedure, and then performs, on the reordered demodulated bit sequence, error correction decoding processing in accordance with the error correction code described in the present disclosure, and outputs playback data. Through the above processing, data recorded in the optical disc 14501 can be played back.

The above description has been provided using an example where the optical disc device includes both the processing system of recording data and the processing system of playing back data. However, the optical disc device may include only one of these processing systems. Also, the optical disc 14501, which is used for playing back data, is not limited to an optical disc into which recording data is recordable by the optical disc device. Alternatively, the optical disc 14501 may be an optical disc that has recorded beforehand therein data that has been error correction coded by using the error correction code described in the present disclosure, and cannot record therein new recording data.

Also, the above description has been provided using an optical disc device as an example. However, a recording medium is not limited to an optical disc. Alternatively, it is possible to apply the error correction coding and decoding method described in the present disclosure to a recording device or a playback device that uses, as the recording medium, a magnetic disc, a non-volatile semiconductor memory, or the like other than an optical disc.

The above description has been provided using an example where the processing system of recording data of the optical disc device includes the error correction coding section 14502, the modulation coding section 14503, the laser driving section 14504, and the optical pick-up 14505, and the processing system of playing back data of the optical disc device includes the optical pick-up 14505, the filter 14506, the synchronization processing section 14507, the PRML (Partial Response Maximum Likelihood) section 14508, the demodulator 14509, and the error correction decoding section 14510. Alternatively, a recording device or a playback device, which uses an optical disc and other recording media, to which the error correction coding and decoding method described in the present disclosure is applied does not need to include all these configuration elements. The recording device only needs to include at least the error correction coding section 14502 and the configuration of recording data in a recording medium corresponding to the optical pick-up 14505 in the above description. The playback device only needs to include at least the error correction decoding section 14510 and the configuration of reading data from a recording medium corresponding to the optical pick-up 14505. With the recording device and the playback device as described above, it is possible to secure high data receiving quality corresponding to high error correction capability of the error correction coding and decoding method described in the present disclosure.

Embodiment D1

The present embodiment describes a method of configuring an LDPC-CC of coding rate 3/5 that is based on a parity check polynomial, as one example of an LDPC-CC not satisfying coding rate (n−1)/n.

Bits of information bits $X_1$, $X_2$, $X_3$ and parity bits $P_1$, $P_2$, at time point j, are expressed $X_{1,j}$, $X_{2,j}$, $X_{3,j}$ and $P_{1,j}$, $P_{2,j}$, respectively.

A vector $u_j$, at time point j, is expressed $u_j=X_{1,j}, X_{2,j}, X_{3,j}, P_{1,j}, P_{2,j})$.

Given a delay operator D, polynomial expressions of the information bits $X_1$, $X_2$, $X_3$ are $X_1(D)$, $X_2(D)$, $X_3(D)$, and polynomial expressions of the parity bits $P_1$, $P_2$ are $P_1(D)$, $P_2(D)$.

Further, consideration is given to an LDPC-CC of coding rate 3/5 and time-varying period 2m that is based on a parity check polynomial.

The following mathematical expressions are provided as parity check polynomials satisfying zero for an LDPC-CC of coding rate 3/5 and time-varying period 2m that is based on a parity check polynomial.

First, because two parities $P_1$ and $P_2$ exist, parity check polynomials satisfying zero are provided as described in the following, two for $1\times P_1(D)$ and two for $1\times P_2(D)$.

[Math. 232]

$$\begin{aligned}(D^{\alpha\#(2i),1,2}+D^{\alpha\#(2i),1,1}+1)X_1(D)+\left(\sum_{s=3}^{r_{\#(2i),2}}D^{\alpha\#(2i),2,s}\right)X_2(D)+&\\ \left(\sum_{s=3}^{r_{\#(2i),3}}D^{\alpha\#(2i),3,s}\right)X_3(D)+P_1(D)+D^{\beta\#(2i),0}P_2(D)=&\\ (D^{\alpha\#(2i),1,2}+D^{\alpha\#(2i),1,1}+1)X_1(D)+&\\ (D^{\alpha\#(2i),2,r_{\#(2i),2}}+\dots+D^{\alpha\#(2i),2,3})X_2(D)+&\\ (D^{\alpha\#(2i),3,r_{\#(2i),3}}+\dots+D^{\alpha\#(2i),3,3})X_3(D)+&\\ P_1(D)+D^{\beta\#(2i),0}P_2(D)=0&\end{aligned} \quad (97\text{-}1\text{-}1)$$

$$\begin{aligned}(D^{\alpha\#(2i),1,2}+D^{\alpha\#(2i),1,1}+1)X_1(D)+\left(\sum_{s=3}^{r_{\#(2i),2}}D^{\alpha\#(2i),2,s}\right)X_2(D)+&\\ \left(\sum_{s=3}^{r_{\#(2i),3}}D^{\alpha\#(2i),3,s}\right)X_3(D)+P_1(D)+D^{\beta\#(2i),1}P_1(D)=&\\ (D^{\alpha\#(2i),1,2}+D^{\alpha\#(2i),1,1}+1)X_1(D)+&\\ (D^{\alpha\#(2i),2,r_{\#(2i),2}}+\dots+D^{\alpha\#(2i),2,3})X_2(D)+&\\ (D^{\alpha\#(2i),3,r_{\#(2i),3}}+\dots+D^{\alpha\#(2i),3,3})X_3(D)+&\\ P_1(D)+D^{\beta\#(2i),1}P_1(D)=0&\end{aligned} \quad (97\text{-}1\text{-}2)$$

-continued $$\begin{aligned}\left(\sum_{s=3}^{r_{\#(2i),1}}D^{\alpha\#(2i),1,s}\right)X_1(D)+(D^{\alpha\#(2i),2,2}+D^{\alpha\#(2i),2,1}+1)X_2(D)+&\\ (D^{\alpha\#(2i),3,2}+D^{\alpha\#(2i),3,1}+1)X_3(D)+P_2(D)+D^{\beta\#(2i),2}P_1(D)=&\\ (D^{\alpha\#(2i),1,r_{\#(2i),1}}+\dots+D^{\alpha\#(2i),1,3})X_1(D)+&\\ (D^{\alpha\#(2i),2,2}+D^{\alpha\#(2i),2,1}+1)X_2(D)+&\\ (D^{\alpha\#(2i),3,2}+D^{\alpha\#(2i),3,1}+1)X_3(D)+&\\ P_2(D)+D^{\beta\#(2i),2}P_1(D)=0&\end{aligned} \quad (97\text{-}2\text{-}1)$$

$$\begin{aligned}\left(\sum_{s=3}^{r_{\#(2i),1}}D^{\alpha\#(2i),1,s}\right)X_1(D)+(D^{\alpha\#(2i),2,2}+D^{\alpha\#(2i),2,1}+1)X_2(D)+&\\ (D^{\alpha\#(2i),3,2}+D^{\alpha\#(2i),3,1}+1)X_3(D)+P_2(D)+D^{\beta\#(2i),3}P_2(D)=&\\ (D^{\alpha\#(2i),1,r_{\#(2i),1}}+\dots+D^{\alpha\#(2i),1,3})X_1(D)+&\\ (D^{\alpha\#(2i),2,2}+D^{\alpha\#(2i),2,1}+1)X_2(D)+&\\ (D^{\alpha\#(2i),3,2}+D^{\alpha\#(2i),3,1}+1)X_3(D)+&\\ P_2(D)+D^{\beta\#(2i),3}P_2(D)=0&\end{aligned} \quad (97\text{-}2\text{-}2)$$

In expressions (97-1-1), (97-1-2), (97-2-1), (97-2-2), i is an integer no smaller than zero and no greater than m−1 (i=0, 1, . . . , m−2, m−1).

In expressions (97-1-1), (97-1-2), (97-2-1), (97-2-2), $\alpha_{\#(2c),p,q}$ (where p is an integer no smaller than one and no greater than three, q is an integer no smaller than one and no greater than $r_{\#(2c),p}$ (where $r_{\#(2c),p}$ is a natural number)) and $\beta_{\#(2c),0}$ is a natural number, $\beta_{\#(2i),1}$ is a natural number, $\beta_{\#(2i),2}$ is an integer no smaller than zero, and $\beta_{\#(2i),3}$ is a natural number.

Further, y is an integer no smaller than one and no greater than $r_{\#(2c),p}$, z is an integer no smaller than one and no greater than $r_{\#2i,p}$, and $\alpha_{\#(2i),p,y}\neq\alpha_{\#(2i),p,z}$ holds true for $^\forall$(y, z) where y≠z. ∀ is a universal quantifier. (y is an integer no smaller than one and no greater than $r_{\#(2c),p,z}$ is an integer no smaller than one and no greater than $r_{\#2i,p}$, and $\alpha_{\#(2i),p,y}\neq\alpha_{\#(2i),p,z}$ holds true for all y and all z satisfying y≠z.)

Note that in the following, to simplify explanation, a parity check polynomial satisfying zero that is expressed by expression (97-1-1) or expression (97-1-2) is referred to as "#(2i); first expression" for realizing a time-varying period 2m, and a parity check polynomial satisfying zero that is expressed by expression (97-2-1) or expression (97-2-2) is referred to as "#(2i); second expression" for realizing a time-varying period 2m.

Thus, for each i, as #(2i); first expression for realizing a time-varying period 2m, a parity check polynomial satisfying zero expressed by either expression (97-1-1) or expression (97-1-2) is prepared.

That is, for i=0, a parity check polynomial satisfying zero provided by expression (97-1-1) where i=0, or a parity check polynomial satisfying zero provided by expression (97-1-2) where i=0 is prepared.

Similarly:

for i=1, a parity check polynomial satisfying zero provided by expression (97-1-1) where i=1, or a parity check polynomial satisfying zero provided by expression (97-1-2) where i=1 is prepared;

for i=2, a parity check polynomial satisfying zero provided by expression (97-1-1) where i=2, or a parity check polynomial satisfying zero provided by expression (97-1-2) where i=2 is prepared;

⋮ for i=z, a parity check polynomial satisfying zero provided by expression (97-1-1) where i=z, or a parity check polynomial satisfying zero provided by expression (97-1-2)

where i=z is prepared (where z is an integer no smaller than zero and no greater than m−1); and

⋮ for i=m−1, a parity check polynomial satisfying zero provided by expression (97-1-1) where i=m−1, or a parity check polynomial satisfying zero provided by expression (97-1-2) where i=m−1 is prepared.

Similarly, for each i, as #(2i); second expression for realizing a time-varying period 2m, a parity check polynomial satisfying zero expressed by either expression (97-2-1) or expression (97-2-2) is prepared.

That is, for i=0, a parity check polynomial satisfying zero provided by expression (97-2-1) where i=0, or a parity check polynomial satisfying zero provided by expression (97-2-2) where i=0 is prepared.

Similarly:

for i=1, a parity check polynomial satisfying zero provided by expression (97-2-1) where i=1, or a parity check polynomial satisfying zero provided by expression (97-2-2) where i=1 is prepared;

for i=2, a parity check polynomial satisfying zero provided by expression (97-2-1) where i=2, or a parity check polynomial satisfying zero provided by expression (97-2-2) where i=2 is prepared;

⋮ for i=z, a parity check polynomial satisfying zero provided by expression (97-2-1) where i=z, or a parity check polynomial satisfying zero provided by expression (97-2-2) where i=z is prepared (where z is an integer no smaller than zero and no greater than m−1); and

⋮ for i=m−1, a parity check polynomial satisfying zero provided by expression (97-2-1) where i=m−1, or a parity check polynomial satisfying zero provided by expression (97-2-2) where i=m−1 is prepared.

Similarly, because two parities $P_1$ and $P_2$ exist, parity check polynomials satisfying zero are provided as described in the following, two for $1\times P_1(D)$ and two for $1\times P_2(D)$.

[Math. 233]

$$\begin{aligned}&\left(\sum_{s=3}^{r_{\#(2i+1),1}} D^{\alpha\#(2i+1),1,s}\right)X_1(D)+\\&(D^{\alpha\#(2i+1),2,2}+D^{\alpha\#(2i+1),2,1}+1)X_2(D)+\\&(D^{\alpha\#(2i+1),3,2}+D^{\alpha\#(2i+1),3,1}+1)X_3(D)+\\&P_1(D)+D^{\beta\#(2i+1),0}P_2(D)=\\&(D^{\alpha\#(2i+1),1,r_{\#(2i+1),1}}+\ldots+D^{\alpha\#(2i+1),1,3})X_1(D)+\\&(D^{\alpha\#(2i+1),2,2}+D^{\alpha\#(2i+1),2,1}+1)X_2(D)+\\&(D^{\alpha\#(2i+1),3,2}+D^{\alpha\#(2i+1),3,1}+1)X_3(D)+\\&P_1(D)+D^{\beta\#(2i+1),0}P_2(D)=0\end{aligned}\tag{98-1-1}$$

$$\begin{aligned}&\left(\sum_{s=3}^{r_{\#(2i+1),1}} D^{\alpha\#(2i+1),1,s}\right)X_1(D)+\\&(D^{\alpha\#(2i+1),2,2}+D^{\alpha\#(2i+1),2,1}+1)X_2(D)+\\&(D^{\alpha\#(2i+1),3,2}+D^{\alpha\#(2i+1),3,1}+1)X_3(D)+\\&P_1(D)+D^{\beta\#(2i+1),1}P_1(D)=\\&(D^{\alpha\#(2i+1),1,r_{\#(2i+1),1}}+\ldots+D^{\alpha\#(2i+1),1,3})X_1(D)+\\&(D^{\alpha\#(2i+1),2,2}+D^{\alpha\#(2i+1),2,1}+1)X_2(D)+\\&(D^{\alpha\#(2i+1),3,2}+D^{\alpha\#(2i+1),3,1}+1)X_3(D)+\\&P_1(D)+D^{\beta\#(2i+1),1}P_1(D)=0\end{aligned}\tag{98-1-2}$$

-continued $$\begin{aligned}&(D^{\alpha\#(2i+1),1,2}+D^{\alpha\#(2i+1),1,1}+1)X_1(D)+\\&\left(\sum_{s=3}^{r_{\#(2i+1),2}} D^{\alpha\#(2i+1),2,s}\right)X_2(D)+\\&\left(\sum_{s=3}^{r_{\#(2i+1),3}} D^{\alpha\#(2i+1),3,s}\right)X_3(D)+P_2(D)+D^{\beta\#(2i+1),2}P_1(D)=\\&(D^{\alpha\#(2i+1),1,2}+D^{\alpha\#(2i+1),1,1}+1)X_1(D)+\\&(D^{\alpha\#(2i+1),2,r_{\#(2i+1),2}}+\ldots+D^{\alpha\#(2i+1),2,3})X_2(D)+\\&(D^{\alpha\#(2i+1),3,r_{\#(2i+1),3}}+\ldots+D^{\alpha\#(2i+1),3,3})X_3(D)+\\&P_2(D)+D^{\beta\#(2i+1),2}P_1(D)=0\end{aligned}\tag{98-2-1}$$

$$\begin{aligned}&(D^{\alpha\#(2i+1),1,2}+D^{\alpha\#(2i+1),1,1}+1)X_1(D)+\\&\left(\sum_{s=3}^{r_{\#(2i+1),2}} D^{\alpha\#(2i+1),2,s}\right)X_2(D)+\\&\left(\sum_{s=3}^{r_{\#(2i+1),3}} D^{\alpha\#(2i+1),3,s}\right)X_3(D)+P_2(D)+D^{\beta\#(2i+1),3}P_2(D)=\\&(D^{\alpha\#(2i+1),1,2}+D^{\alpha\#(2i+1),1,1}+1)X_1(D)+\\&(D^{\alpha\#(2i+1),2,r_{\#(2i+1),2}}+\ldots+D^{\alpha\#(2i+1),2,3})X_2(D)+\\&(D^{\alpha\#(2i+1),3,r_{\#(2i+1),3}}+\ldots+D^{\alpha\#(2i+1),3,3})X_3(D)+\\&P_2(D)+D^{\beta\#(2i+1),3}P_2(D)=0\end{aligned}\tag{98-2-2}$$

In expressions (98-1-1), (98-1-2), (98-2-1), (98-2-2), i is an integer no smaller than zero and no greater than m−1 (i=0, 1, . . . , m−2, m−1).

In expressions (98-1-1), (98-1-2), (98-2-1), (98-2-2), $\alpha_{\#(2i+1),p,q}$ (where p is an integer no smaller than one and no greater than three, q is an integer no smaller than one and no greater than $r_{\#(2i+1),p}$ (where $r_{\#(2i+1),p}$ is a natural number)) and $\beta_{\#(2i+i),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, y is an integer no smaller than one and no greater than $r_{\#(2i+1),p}$, z is an integer no smaller than one and no greater than $r_{\#(2i+1),p}$, and $\alpha_{\#(2i+1),p,y}\neq\alpha_{\#(2i+1),p,z}$ holds true for $^\forall(y, z)$ where y≠z. ∀ is a universal quantifier. (y is an integer no smaller than one and no greater than $r_{\#(2i+1),p}$, z is an integer no smaller than one and no greater than $r_{\#(2i+1),p}$, and $\alpha_{\#(2i+1),p,y}\neq\alpha_{\#(2i+1),p,z}$ holds true for all y and all z satisfying y≠z.)

Note that in the following, to simplify explanation, a parity check polynomial satisfying zero that is expressed by expression (98-1-1) or expression (98-1-2) is referred to as "#(2i+1); first expression" for realizing a time-varying period 2m, and a parity check polynomial satisfying zero that is expressed by expression (98-2-1) or expression (98-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (98-1-1) or expression (98-1-2) is prepared.

That is, for i=0, a parity check polynomial satisfying zero provided by expression (98-1-1) where i=0, or a parity check polynomial satisfying zero provided by expression (98-1-2) where i=0 is prepared.

Similarly:

for i=1, a parity check polynomial satisfying zero provided by expression (98-1-1) where i=1, or a parity check polynomial satisfying zero provided by expression (98-1-2) where i=1 is prepared;

for i=2, a parity check polynomial satisfying zero provided by expression (98-1-1) where i=2, or a parity check polynomial satisfying zero provided by expression (98-1-2) where i=2 is prepared;

⋮ for i=z, a parity check polynomial satisfying zero provided by expression (98-1-1) where i=z, or a parity check polynomial satisfying zero provided by expression (98-1-2) where i=z is prepared (where z is an integer no smaller than zero and no greater than m−1); and

⋮ for i=m−1, a parity check polynomial satisfying zero provided by expression (98-1-1) where i=m−1, or a parity check polynomial satisfying zero provided by expression (98-1-2) where i=m−1 is prepared.

Similarly, for each i, as #(2i+1); second expression for realizing a time-varying period 2m, a parity check polynomial satisfying zero expressed by either expression (98-2-1) or expression (98-2-2) is prepared.

That is, for i=0, a parity check polynomial satisfying zero provided by expression (98-2-1) where i=0, or a parity check polynomial satisfying zero provided by expression (98-2-2) where i=0 is prepared.

Similarly:

for i=1, a parity check polynomial satisfying zero provided by expression (98-2-1) where i=1, or a parity check polynomial satisfying zero provided by expression (98-2-2) where i=1 is prepared;

for i=2, a parity check polynomial satisfying zero provided by expression (98-2-1) where i=2, or a parity check polynomial satisfying zero provided by expression (98-2-2) where i=2 is prepared;

⋮ for i=z, a parity check polynomial satisfying zero provided by expression (98-2-1) where i=z, or a parity check polynomial satisfying zero provided by expression (98-2-2) where i=z is prepared (where z is an integer no smaller than zero and no greater than m−1); and

⋮ for i=m−1, a parity check polynomial satisfying zero provided by expression (98-2-1) where i=m−1, or a parity check polynomial satisfying zero provided by expression (98-2-2) where i=m−1 is prepared.

As such, an LDPC-CC of coding rate 3/5 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (97-1-1) or expression (97-1-2), parity check polynomials satisfying zero provided by expression (97-2-1) or expression (97-2-2), parity check polynomials satisfying zero provided by expression (98-1-1) or expression (98-1-2), and parity check polynomials satisfying zero provided by expression (98-2-1) or expression (98-2-2).

For example, the time varying period 2×m can be formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expressions (97-1-1), (97-1-2), (97-2-1), (97-2-2), (98-1-1), (98-1-2), (98-2-1), and (98-2-2) (where j is an integer no smaller than zero).

The following presumes that 2k=j%2m holds true. In the following, % means a modulo, and for example, α%6 represents a remainder after dividing α by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

The following describes a method of configuring a parity check matrix for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a vector $u_j$ at time point j is expressed as $u_j=(X_{1,j}, X_{2,j}, X_{3,j}, P_{1,j}, P_{2,j})$ (where j is an integer no smaller than zero). In the following, a case where u is a transmission vector is considered. Note that in the following, j is an integer no smaller than one, and thus j differs between the description having been provided above and the description provided in the following. (j is set as such to facilitate understanding of the correspondence between the column numbers and the row numbers of the parity check matrix.)

Accordingly, $u=(u_1, u_2, u_3, \ldots, u_{y-1}, u_y, u_{y+1}, \ldots)^T=(X_{1,1}, X_{2,1}, X_{3,1}, P_{1,1}, P_{2,1}, X_{1,2}, X_{2,2}, X_{3,2}, P_{1,2}, P_{2,2}, X_{1,3}, X_{2,3}, X_{3,3}, P_{1,3}, P_{2,3}, X_{1,y-1}, X_{2,y-1}, X_{3,y-1}, P_{1,y-1}, P_{2,y-1}, X_{1,y}, X_{2,y}, X_{3,y}, P_{1,y}, P_{2,y}, X_{1,y+1}, X_{2,y+1}, X_{3,y+1}, P_{1,y+1}, P_{2,y+1}, \ldots)^T$. Further, when using H to denote a parity check matrix for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, Hu=0 holds true (here, Hu=0 indicates that all elements of the vector Hu are zeroes).

FIG. 66 indicates a configuration of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the topmost row of the parity check matrix is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

As illustrated in FIG. 66:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression"; and "a vector for the (2×i)th row of the parity check matrix H can be generated from a parity check polynomial satisfying zero of #((i−1)%2m); second expression", and so on (where i is an integer no smaller than one).

Figure 67:
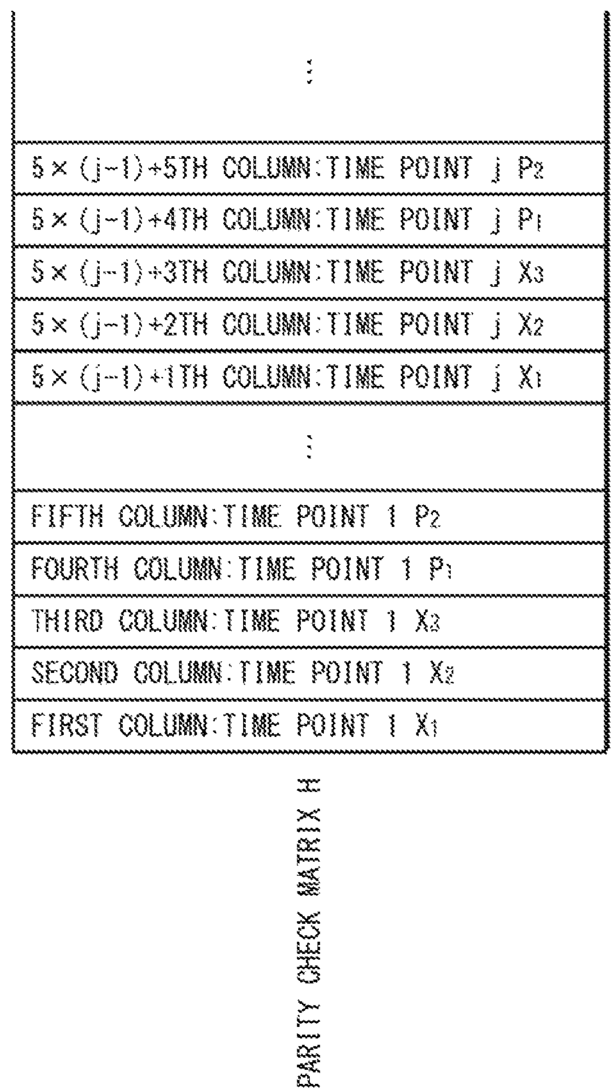
FIG. 67 shows an example of the configuration of check matrix for LDPC-CC of coding rate 3/5 and time-varying period 2×m that is based on a parity check polynomial.

FIG. 67 indicates a configuration of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the leftmost column of the parity check matrix is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

As illustrated in FIG. 67:

"a vector for the first column of the parity check matrix H is related to $X_1$ at time point 1";

"a vector for the second column of the parity check matrix H is related to $X_2$ at time point 1";

"a vector for the third column of the parity check matrix H is related to $X_3$ at time point 1";

"a vector for the fourth column of the parity check matrix H is related to $P_1$ at time point 1";

"a vector for the fifth column of the parity check matrix H is related to $P_2$ at time point 1";

⋮

"a vector for the 5×(j−1)+1th column of the parity check matrix H is related to $X_1$ at time point j";

"a vector for the 5×(j−1)+2th column of the parity check matrix H is related to $X_2$ at time point j";

"a vector for the 5×(j−1)+3th column of the parity check matrix H is related to $X_3$ at time point j";

"a vector for the 5×(j−1)+4th column of the parity check matrix H is related to $P_1$ at time point j"; and "a vector for the 5×(j−1)+5th column of the parity check matrix H is related to $P_2$ at time point j", and so on (where j is an integer no smaller than one).

Figure 68:
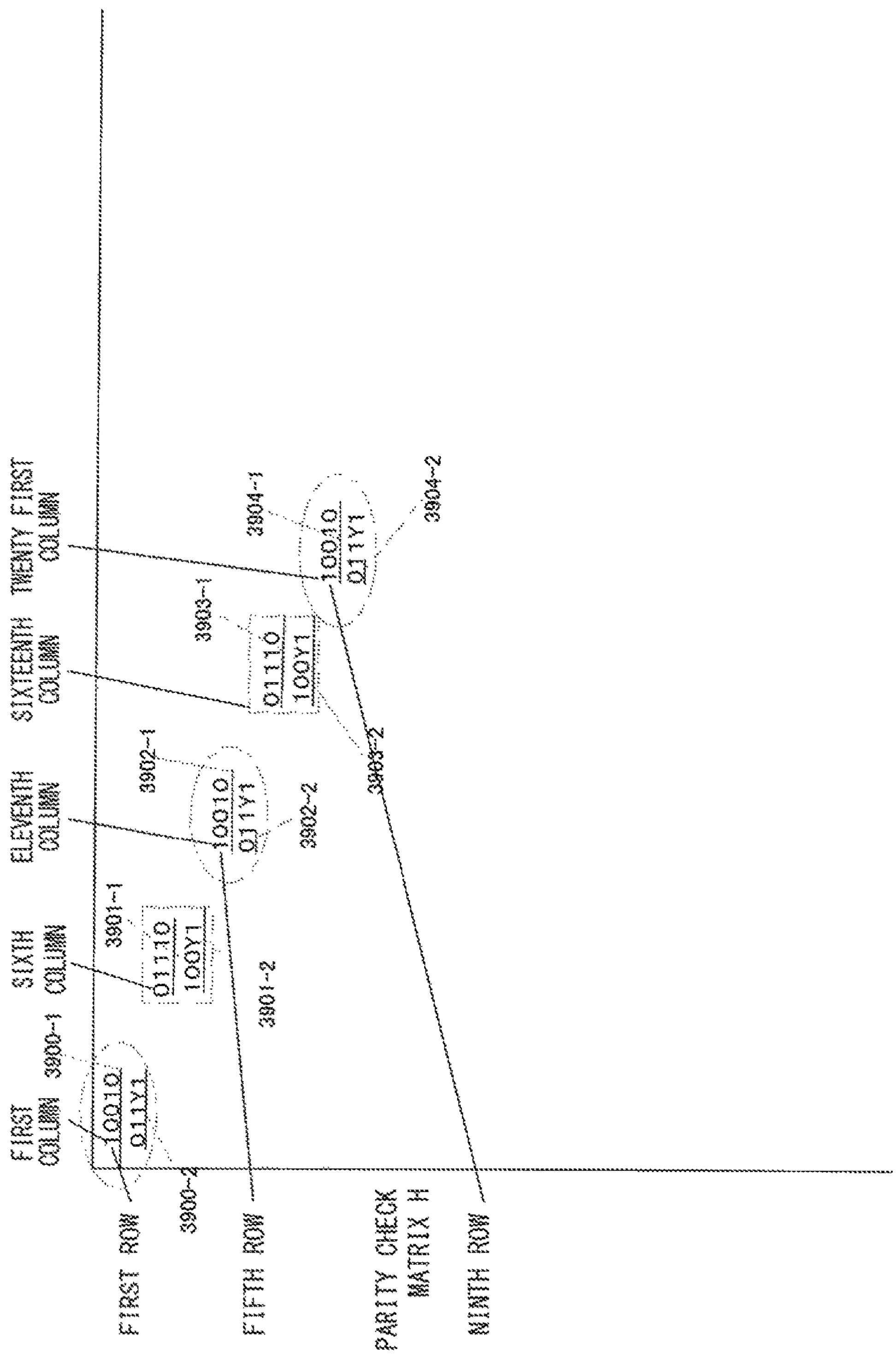
FIG. 68 shows an example of the configuration of check matrix for LDPC-CC of coding rate 3/5 and time-varying period 2×m that is based on a parity check polynomial.

FIG. 68 indicates a parity check matrix for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The following focuses on $1\times X_1(D)$, $1\times X_2(D)$, $1\times X_3(D)$, $1\times P_1(D)$, $1\times P_2(D)$ in the parity check matrix for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The parity check polynomials at time point j=1 are parity check polynomials when i=0 in expressions (97-1-1), (97-1-2), (97-2-1), (97-2-2).

A vector for the first row in FIG. 68 can be generated from a parity check polynomial when i=0 in expression (97-1-1) or expression (97-1-2) (refer to FIG. 66).

In expressions (97-1-1) and (97-1-2):

a term for $1\times X_1(D)$ exists;

terms for $1\times X_2(D)$ and $1\times X_3(D)$ do not exist; and a term for $1\times P_1(D)$ exists but a term for $1\times P_2(D)$ does not exist.

Further, the relationship between column numbers and $X_1$, $X_2$, $X_3$, $P_1$, $P_2$ is as indicated in FIG. 67. Based on the relationship indicated in FIG. 67 and the fact that a term for $1\times X_1(D)$ exists, a column related to $X_1$ in the vector for the first row in FIG. 68 is "1". Further, based on the relationship indicated in FIG. 67 and the fact that terms for $1\times X_2(D)$ and $1\times X_3(D)$ do not exist, columns related to $X_2$ and $X_3$ in the vector for the first row in FIG. 68 are "0". In addition, based on the relationship indicated in FIG. 67 and the fact that a term for $1\times P_1(D)$ exists but a term for $1\times P_2(D)$ does not exist, a column related to $P_1$ in the vector for the first row in FIG. 68 is "1", and a column related to $P_2$ in the vector for the first row in FIG. 68 is "0".

As such, the vector for the first row in FIG. 68 is "10010", as indicated by 3900-1 in FIG. 68.

A vector for the second row in FIG. 68 can be generated from a parity check polynomial when i=0 in expression (97-2-1) or expression (97-2-2) (refer to FIG. 66).

In expressions (97-2-1) and (97-2-2):

a term for $1\times X_1(D)$ does not exist;

terms for $1\times X_2(D)$ and $1\times X_3(D)$ exist; and a term for $1\times P_1(D)$ may or may not exist but a term for $1\times P_2(D)$ exists.

Further, the relationship between column numbers and $X_1$, $X_2$, $X_3$, $P_1$, $P_2$ is as indicated in FIG. 67. Based on the relationship indicated in FIG. 67 and the fact that a term for $1\times X_1(D)$ does not exist, a column related to $X_1$ in the vector for the second row in FIG. 68 is "0". Further, based on the relationship indicated in FIG. 67 and the fact that terms for $1\times X_2(D)$ and $1\times X_3(D)$ exist, columns related to $X_2$ and $X_3$ in the vector for the second row in FIG. 68 are "1". In addition, based on the relationship indicated in FIG. 67 and the fact that a term for $1\times P_1(D)$ may or may not exist but a term for $1\times P_2(D)$ exists, a column related to $P_1$ in the vector for the second row in FIG. 68 is "Y", and a column related to $P_2$ in the vector for the second row in FIG. 68 is "1", where Y is either "0" or "1".

As such, the vector for the second row in FIG. 68 is "011Y1", as indicated by 3900-2 in FIG. 68.

The parity check polynomials at time point j=2 are parity check polynomials when i=0 in expressions (98-1-1), (98-1-2), (98-2-1), (98-2-2).

A vector for the third row in FIG. 68 can be generated from a parity check polynomial when i=0 in expression (98-1-1) or expression (98-1-2) (refer to FIG. 66).

In expressions (98-1-1) and (98-1-2):

a term for $1\times X_1(D)$ does not exist;

terms for $1\times X_2(D)$ and $1\times X_3(D)$ exist; and a term for $1\times P_1(D)$ exists but a term for $1\times P_2(D)$ does not exist.

Further, the relationship between column numbers and $X_1$, $X_2$, $X_3$, $P_1$, $P_2$ is as indicated in FIG. 67. Based on the relationship indicated in FIG. 67 and the fact that a term for $1\times X_1(D)$ does not exist, a column related to $X_1$ in the vector for the third row in FIG. 68 is "0". Further, based on the relationship indicated in FIG. 67 and the fact that terms for $1\times X_2(D)$ and $1\times X_3(D)$ exist, columns related to $X_2$ and $X_3$ in the vector for the third row in FIG. 68 are "1". In addition, based on the relationship indicated in FIG. 67 and the fact that a term for $1\times P_1(D)$ exists but a term for $1\times P_2(D)$ does not exist, a column related to $P_1$ in the vector for the third row in FIG. 68 is "1", and a column related to $P_2$ in the vector for the third row in FIG. 68 is "0".

As such, the vector for the third row in FIG. 68 is "01110", as indicated by 3901-1 in FIG. 68.

A vector for the fourth row in FIG. 68 can be generated from a parity check polynomial when i=0 in expression (98-2-1) or expression (98-2-2) (refer to FIG. 66).

In expressions (98-2-1) and (98-2-2):

a term for $1\times X_1(D)$ exists;

terms for $1\times X_2(D)$ and $1\times X_3(D)$ do not exist; and a term for $1\times P_1(D)$ may or may not exist but a term for $1\times P_2(D)$ exists.

Further, the relationship between column numbers and $X_1$, $X_2$, $X_3$, $P_1$, $P_2$ is as indicated in FIG. 67. Based on the relationship indicated in FIG. 67 and the fact that a term for $1\times X_1(D)$ exists, a column related to $X_1$ in the vector for the fourth row in FIG. 68 is "1". Further, based on the relationship indicated in FIG. 67 and the fact that terms for $1\times X_2(D)$ and $1\times X_3(D)$ do not exist, columns related to $X_2$ and $X_3$ in the vector for the fourth row in FIG. 68 are "0". In addition, based on the relationship indicated in FIG. 67 and the fact that a term for $1\times P_1(D)$ may or may not exist but a term for $1\times P_2(D)$ exists, a column related to $P_1$ in the vector for the fourth row in FIG. 68 is "Y", and a column related to $P_2$ in the vector for the fourth row in FIG. 68 is "1".

As such, the vector for the fourth row in FIG. 68 is "100Y1", as indicated by 3901-2 in FIG. 68.

Because it can be considered that the above similarly applies to cases where time point j=3, 4, 5, the parity check matrix H has the configuration indicated in FIG. 68.

That is, due to the parity check polynomials of expressions (97-1-1), (97-1-2), (97-2-1), (97-2-2) being used at time point j=2k+1 (where k is an integer no smaller than zero), "10010" exists in the 2×(2k+1)−1th row of the parity check matrix H, and "011Y1" exists in the 2×(2k+1)th row of the parity check matrix H, as illustrated in FIG. 68.

Further, due to the parity check polynomials of expressions (98-1-1), (98-1-2), (98-2-1), (98-2-2) being used at time point j=2k+2 (where k is an integer no smaller than zero), "01110" exists in the 2×(2k+2)−1th row of the parity check matrix H, and "100Y1" exists in the 2×(2k+2)th row of the parity check matrix H, as illustrated in FIG. 68.

Accordingly, as illustrated in FIG. 68, when denoting a column number of a leftmost column corresponding to "1" in "10010" in a row where "10010" exists (e.g., 3900-1 in FIG. 68) as "a", "01110" (e.g., 3901-1 in FIG. 68) exists in a row that is two rows below the row where "10010" exists, starting from column "a+5".

Similarly, as illustrated in FIG. 68, when denoting a column number of a leftmost column corresponding to "1" in "011Y1" in a row where "011Y1" exists (e.g., 3900-2 in FIG. 68) as "b", "100Y1" (e.g., 3901-2 in FIG. 68) exists in a row that is two rows below the row where "011Y1" exists, starting from column "b+5".

Similarly, as illustrated in FIG. 68, when denoting a column number of a leftmost column corresponding to "1" in "01110" in a row where "01110" exists (e.g., 3901-1 in FIG. 68) as "c", "10010" (e.g., 3902-1 in FIG. 68) exists in a row that is two rows below the row where "01110" exists, starting from column "c+5".

Similarly, as illustrated in FIG. 68, when denoting a column number of a leftmost column corresponding to "1" in "100Y1" in a row where "100Y1" exists (e.g., 3901-2 in FIG. 68) as "d", "011Y1" (e.g., 3902-2 in FIG. 68) exists in a row that is two rows below the row where "100Y1" exists, starting from column "d+5".

The following describes a parity check matrix for an LDPC-CC of coding rate 3/5 and time-varying period 2×m that is based on a parity check polynomial when tail-biting is not performed, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

In the following, $H_{com}[u][v]$ (where u and v are integers no smaller than one) denotes an element at row "u" column "v" of a parity check matrix for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Based on description above provided with reference to FIG. 66:

"a vector for the 2×g−1th row of the parity check matrix H can be generated from a parity check polynomial satisfying zero of #((g−1)%2m); first expression"; and "a vector for the (2×g)th row of the parity check matrix H can be generated from a parity check polynomial satisfying zero of #((g−1)%2m); second expression" (where g is an integer no smaller than one).

Based on description above provided with reference to FIG. 67:

"a vector for the 5×(j−1)+1th column of the parity check matrix H is related to $X_1$ at time point j";

"a vector for the 5×(j−1)+2th column of the parity check matrix H is related to $X_2$ at time point j";

"a vector for the 5×(j−1)+3th column of the parity check matrix H is related to $X_3$ at time point j";

"a vector for the 5×(j−1)+4th column of the parity check matrix H is related to $P_1$ at time point j"; and "a vector for the 5×(j−1)+5th column of the parity check matrix H is related to $P_2$ at time point j" (where j is an integer no smaller than one).

Based on the above, the following describes component $H_{com}[2\times g-1][v]$ in row 2×g−1 (where g is an integer no smaller than one) and component $H_{com}[2\times g][v]$ in row 2×g of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a parity check polynomial satisfying zero of #((g−1)%2m); first expression can be used to generate a vector for row 2×g−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #((g−1)%2m); second expression can be used to generate a vector for row 2×g of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, when g=2×f−1 (where f is an integer no smaller than one), a parity check polynomial satisfying zero of #(((2×f−1)−1)%2m); first expression, or that is, a parity check polynomial satisfying zero of either expression (97-1-1) or expression (97-1-2), can be used to generate a vector for row 2×(2×f−1)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f−1)−1)%2m); second expression, or that is, a parity check polynomial satisfying zero of either expression (97-2-1) or expression (97-2-2), can be used to generate a vector for row 2×(2×f−1) of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, when g=2×f (where f is an integer no smaller than one), a parity check polynomial satisfying zero of #(((2×f)−1)%2m); first expression, or that is, a parity check polynomial satisfying zero of either expression (98-1-1) or expression (98-1-2), can be used to generate a vector for row 2×(2×f)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f)−1)%2m); second expression, or that is, a parity check polynomial satisfying zero of either expression (98-

2-1) or expression (98-2-2), can be used to generate a vector for row 2×(2×f) of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, (1) when g=2×f−1 (where f is an integer no smaller than one), when a vector for row 2×(2×f−1)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-1-1), (2×f−1)−1)%2m=2c holds true. Accordingly, a parity check polynomial satisfying zero of expression (97-1-1) where 2i=2c holds true.

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 234]

$$H_{com}[2\times(2\times f-1)-1][5\times((2\times f-1)-0-1)+1]=1 \quad (99\text{-}1)$$

When $(2\times f-1)-\alpha_{\#(2c),1,1}-1\geq 0$:

$$H_{com}[2\times(2\times f-1)-1][5\times((2\times f-1)-\alpha_{\#(2i),1,1}-1)+1]=1 \quad (99\text{-}2)$$

When $(2\times f-1)-\alpha_{\#(2c),1,2}-1\geq 0$:

$$H_{com}[2\times(2\times f-1)-1][5\times((2\times f-1)-\alpha_{\#(2c),1,2}-1)+1]=1 \quad (99\text{-}3)$$

For all u being an integer no smaller than one satisfying $\{u\neq(2\times f-1)-0,\ u\neq(2\times f-1)-\alpha_{\#(2c),1,1},\ \text{and}\ u\neq(2\times f-1)-\alpha_{\#(2i),1,2}\}$:

$$H_{com}[2\times(2\times f-1)-1][5\times(u-1)+1]=0 \quad (99\text{-}4)$$

The following holds true for $X_z$. In the following, z is an integer no smaller than two and no greater than three, and y is an integer no smaller than three and no greater than $r_{\#(2c),z}$.

[Math. 235]

When $(2\times f-1)-\alpha_{\#(2c),z,y}-1\geq 0$:

$$H_{com}[2\times(2\times f-1)-1][5\times((2\times f-1)-\alpha_{\#(2c),z,y}-1)+z]=-1 \quad (100\text{-}1)$$

For all u being an integer no smaller than one satisfying $\{u\neq(2\times f-1)-\alpha_{\#(2c),z,y}\}$ (where y is an integer no smaller than three and no smaller than $r_{\#(2c),z}$):

$$H_{com}[2\times(2\times f-1)-1][5\times(u-1)+z]=0 \quad (100\text{-}2)$$

The following holds true for $P_1$.

[Math. 236]

$$H_{com}[2\times(2\times f-1)-1][5\times((2\times f-1)-0-1)+4]=1 \quad (101\text{-}1)$$

For all u being an integer no smaller than one satisfying $\{u\neq(2\times f-1)-0\}$:

$$H_{com}[2\times(2\times f-1)-1][5\times(u-1)+4]=0 \quad (101\text{-}2)$$

The following holds true for $P_2$.

[Math. 237]

When $(2\times f-1)-\beta_{\#(2c),0}-1\geq 0$:

$$H_{com}[2\times(2\times f-1)-1][5\times((2\times f-1)-\beta_{\#(2c),0}-1)+5]=1 \quad (102\text{-}1)$$

For all u being an integer no smaller than one satisfying $\{u\neq(2\times f-1)-\beta_{\#(2c),0}\}$:

$$H_{com}[2\times(2\times f-1)-1][5\times(u-1)+5]=0 \quad (102\text{-}2)$$

Further, (2) when g=2×f−1 (where f is an integer no smaller than one), when a vector for row 2×(2×f−1)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-1-2), ((2×f−1)−1)%2m=2c holds true. Accordingly, a parity check polynomial satisfying zero of expression (97-1-2) where 2i=2c holds true.

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 238]

$$H_{com}[2\times(2\times f-1)-1][5\times((2\times f-1)-0-1)+1]=1 \quad (103\text{-}1)$$

When $(2\times f-1)-\alpha_{\#(2c),1,1}-1\geq 0$:

$$H_{com}[2\times(2\times f-1)-1][5\times((2\times f-1)-\alpha_{\#(2c),1,1}-1)+1]=1 \quad (103\text{-}2)$$

When $(2\times f-1)-\alpha_{\#(2c),1,2}-1\geq 0$:

$$H_{com}[2\times(2\times f-1)-1][5\times((2\times f-1)-\alpha_{\#(2c),1,2}-1)+1]=1 \quad (103\text{-}3)$$

For all u being an integer no smaller than one satisfying $\{u\neq(2\times f-1)-0,\ u\neq(2\times f-1)-\alpha_{\#(2c),1,1},\ \text{and}\ u\neq(2\times f-1)-\alpha_{\#(2c),1,2}\}$:

$$H_{com}[2\times(2\times f-1)-1][5\times(u-1)+1]=0 \quad (103\text{-}4)$$

The following holds true for $X_z$. In the following, z is an integer no smaller than two and no greater than three, and y is an integer no smaller than three and no greater than $r_{\#(2c),z}$.

[Math. 239]

When $(2\times f-1)-\alpha_{\#(2c),z,y}-1\geq 0$:

$$H_{com}[2\times(2\times f-1)-1][5\times((2\times f-1)-\alpha_{\#(2c),z,y}-1)+z]=1 \quad (104\text{-}1)$$

For all u being an integer no smaller than one satisfying $\{u\neq(2\times f-1)-\alpha_{\#(2c),z,y}\}$ (where y is an integer no smaller than three and no greater than $r_{\#(2c),z}$):

$$H_{com}[2\times(2\times f-1)-1][5\times(u-1)+z]=0 \quad (104\text{-}2)$$

The following holds true for $P_1$.

[Math. 240]

$$H_{com}[2\times(2\times f-1)-1][5\times((2\times f-1)-0-1)+4]=1 \quad (105\text{-}1)$$

When $(2\times f-1)-\beta_{\#(2c),1}-1\geq 0$:

$$H_{com}[2\times(2\times f-1)-1][^5\times((2\times f-1)-\beta_{\#(2c),1}-1)+4]=\mathbf{1} \quad (105\text{-}2)$$

For all u being an integer no smaller than one satisfying $\{u\neq(2\times f-1)-0$ and $u\neq(2\times f-1)-\beta_{\#(2c),1}\}$:

$$H_{com}[2\times(2\times f-1)-1][5\times(u-1)+4]=0 \quad (105\text{-}3)$$

The following holds true for $P_2$.

[Math. 241]

For all u being an integer no smaller than one:

$$H_{com}[2\times(2\times f-1)-1][5\times(u-1)+5]=0 \quad (106)$$

Further, (3) when g=2×f−1 (where f is an integer no smaller than one), when a vector for row 2×(2×f−1) of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-2-1), (2×f−1)−1)%2m=2c holds true. Accordingly, a parity check polynomial satisfying zero of expression (97-2-1) where 2i=2c holds true.

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, and y is an integer no smaller than three and no greater than $r_{\#(2c),1}$.

[Math. 242]

When $(2\times f-1)-\alpha_{\#(2c),1,y}-1\geq 0$:

$$H_{com}[2\times(2\times f-1)][5\times((2\times f-1)-\alpha_{\#(2c),1,y}-1)+1]=1 \quad (107\text{-}1)$$

For all u being an integer no smaller than one satisfying $\{u\neq(2\times f-1)-\alpha_{\#(2c),1,y}\}$ (where y is an integer no smaller than three and no greater than $r_{\#(2c),1}$):

$$H_{com}[2\times(2\times f-1)][5\times(u-1)+1]=0 \quad (107\text{-}2)$$

The following holds true for $X_w$. In the following, w is an integer no smaller than two and no greater than three.

[Math. 243]

$$H_{com}[2\times(2\times f-1)][5\times((2\times f-1)-0-1)+w]=1 \quad (108\text{-}1)$$

When $(2\times f-1)-\alpha_{\#(2c),w,1}-1\geq 0$:

$$H_{com}[2\times(2\times f-1)][5\times((2\times f-1)-\alpha_{\#(2c),w,1}-1)+w]+1 \quad (108\text{-}2)$$

When $(2\times f-1)-\alpha_{\#(2c),w,2}-1\geq 0$:

$$H_{com}[2\times(2\times f-1)][5\times((2\times f-1)-\alpha_{\#(2c),w,2}-1)+w]=1 \quad (108\text{-}3)$$

For all u being an integer no smaller than one satisfying $\{u\neq(2\times f-1)-0$, $u\neq(2\times f-1)-\alpha_{\#(2c),w,1}$, and $u\neq(2\times f-1)-\alpha_{\#(2i),w,2}\}$:

$$H_{com}[2\times(2\times f-1)][5\times(u-1)+w]=0 \quad (108\text{-}4)$$

The following holds true for $P_1$.

[Math. 244]

When $(2\times f-1)-\beta_{\#(2c),2}-1\geq 0$:

$$H_{com}[2\times(2\times f-1)][5\times((2\times f-1)-\beta_{\#(2c),2}-1)+4]=1 \quad (109\text{-}1)$$

For all u being an integer no smaller than one satisfying $\{u\neq(2\times f-1)-\beta_{\#(2c),2}\}$:

$$H_{com}[2\times(2\times f-1)][5\times(u-1)+4]=0 \quad (109\text{-}2)$$

The following holds true for $P_2$.

[Math. 245]

$$H_{com}[2\times(2\times f-1)][5\times((2\times f-1)-0-1)+5]=1 \quad (110\text{-}1)$$

For all u being an integer no smaller than one satisfying $\{u\neq(2\times f-1)-0\}$:

$$H_{com}[2\times(2\times f-1)][5\times(u-1)+5]=0 \quad (110\text{-}2)$$

Further, (4) when g=2×f−1 (where f is an integer no smaller than one), when a vector for row 2×(2×f−1) of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-2-2), (2×f−1)−1)%2m=2c holds true. Accordingly, a parity check polynomial satisfying zero of expression (97-2-2) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than three and no greater than $r_{\#(2c),1}$.

[Math. 246]

When $(2\times f-1)-\alpha_{\#(2c),1,y}-1\geq 0$:

$$H_{com}[2\times(2\times f-1)][5\times((2\times f-1)-\alpha_{\#(2c),1,y}-1)+1]=1 \quad (111\text{-}1)$$

For all u being an integer no smaller than one satisfying $\{u\neq(2\times f-1)-\alpha_{\#(2i),1,y}\}$ (where y is an integer no smaller than three and no greater than $r_{\#(2c),1}$):

$$H_{com}[2\times(2\times f-1)][5\times(u-1)+1]=0 \quad (111\text{-}2)$$

The following holds true for $X_w$. In the following, w is an integer no smaller than two and no greater than three.

[Math. 247]

$$H_{com}[2\times(2\times f-1)][5\times((2\times f-1)-0-1)+w]=1 \quad (112\text{-}1)$$

When $(2\times f-1)-\alpha_{\#(2c),w,1}-1\geq 0$:

$$H_{com}[2\times(2\times f-1)][5\times((2\times f-1)-\alpha_{\#(2c),w,1}-1)+w]=1 \quad (112\text{-}2)$$

When $(2\times f-1)-\alpha_{\#(2c),w,2}-1\geq 0$:

$$H_{com}[2\times(2\times f-1)][5\times((2\times f-1)-\alpha_{\#(2c),w,2}-1)+w]=1 \quad (112\text{-}3)$$

For all u being an integer no smaller than one satisfying $\{u\neq(2\times f-1)-0,\ u\neq(2\times f-1)-\alpha_{\#(2c),w,1},\ \text{and}\ u\neq(2\times f-1)-\alpha_{\#(2c),w,2}\}$:

$$H_{com}[2\times(2\times f-1)][5\times(u-1)+w]=0 \quad (112\text{-}4)$$

The following holds true for $P_1$.

[Math. 248]

For all u being an integer no smaller than one:

$$H_{com}[2\times(2\times f-1)][5\times(u-1)+4]=0 \quad (113)$$

The following holds true for $P_2$.

[Math. 249]

$$H_{com}[2\times(2\times f-1)][5\times((2\times f-1)-0-1)+5]=1 \quad (114\text{-}1)$$

When $(2\times f-1)-\beta_{\#(2c),3}-1\geq 0$:

$$H_{com}[2\times(2\times f-1)][5\times((2\times f-1)-\beta_{\#(2c),3}-1)+5]=1 \quad (114\text{-}2)$$

For all u being an integer no smaller than one satisfying $\{u\neq(2\times f-1)-0\ \text{and}\ u\neq(2\times f-1)-\beta_{\#(2c),3}\}$:

$$H_{com}[2\times(2\times f-1)][5\times(u-1)+5]=0 \quad (114\text{-}3)$$

Further, (5) when g=2×f (where f is an integer no smaller than one), when a vector for row 2×(2×f)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-1-1), ((2×f)−1) %2m=2d+1 holds true. Accordingly, a parity check polynomial satisfying zero of expression (98-1-1) where 2i+1=2d+1 holds true (where d is an integer no smaller than zero and no greater than m−1).

Accordingly, component $H_{com}[2\times g-1][v]=H_0[2\times(2\times f)-1][v]$ in row 2×g−1, or that is, row 2×(2×f)−1 of the parity check matrix H, which is for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than three and no greater than $r_{\#(2d+1),1}$.

[Math. 250]

When $(2\times f)-\alpha_{\#(2d+1),1,y}-1\geq 0$:

$$H_{com}[2\times(2\times f)-1][5\times((2\times f)-\alpha_{\#(2d+1),1,y}-1)+1]1 \quad (115\text{-}1)$$

For all u being an integer no smaller than one satisfying $\{u\neq(2\times f)-\alpha_{\#(2d+1),1,y}\}$ (where y is an integer no smaller than three and no greater than $r_{\#(2d+1),1}$):

$$H_{com}[2\times(2\times f)-1][5\times(u-1)+1]=0 \quad (115\text{-}2)$$

The following holds true for $X_w$. In the following, w is an integer no smaller than two and no greater than three.

[Math. 251]

$$H_{com}[2\times(2\times f)-1][5\times((2\times f)-0-1)+w]=1 \quad (116\text{-}1)$$

When $(2\times f)-\alpha_{\#(2d+1),w,1}-1\geq 0$:

$$H_{com}[2\times(2\times f)-1][5\times((2\times f)-\alpha_{\#(2d+1),w,1}-1)+w]=1 \quad (116\text{-}2)$$

When $(2\times f)-\alpha_{\#(2d+1),w,2}-1\geq 0$:

$$H_{com}[2\times(2\times f)-1][5\times((2\times f)-\alpha_{\#(2d+1),w,2}-1)+w]=1 \quad (116\text{-}3)$$

For all u being an integer no smaller than one satisfying $\{u\neq(2\times f)-0,\ u\neq(2\times f)-\alpha_{\#(2d+1),w,1},\ \text{and}\ u\neq(2\times f)-\alpha_{\#(2d+1),w,2}\}$:

$$H_{com}[2\times(2\times f)-1][5\times(u-1)+w]=0 \quad (116\text{-}4)$$

The following holds true for $P_1$.

[Math. 252]

$$H_{com}[2\times(2\times f)-1][5\times((2\times f)-0-1)+4]=1 \quad (117\text{-}1)$$

For all u being an integer no smaller than one satisfying $\{u\neq(2\times f)-0\}$:

$$H_{com}[2\times(2\times f)-1][5\times(u-1)+4]=0 \quad (117\text{-}2)$$

The following holds true for $P_2$.

[Math. 253]

When $(2\times f)-\beta_{\#(2d+1),0}-1\geq 0$:

$$H_{com}[2\times(2\times f)-1][5\times((2\times f)-\beta_{\#(2d+1),0}-1)+5]=1 \quad (118\text{-}1)$$

For all u being an integer no smaller than one satisfying $\{u\neq(2\times f)-\beta_{\#(2d+1),0}\}$:

$$H_{com}[2\times(2\times f)-1][5\times(u-1)+5]=0 \quad (118\text{-}2)$$

Further, (6) when g=2×f (where f is an integer no smaller than one), when a vector for row 2×(2×f)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-1-2), ((2×f)−1) %2m=2d+1 holds true. Accordingly, a parity check polynomial satisfying zero of expression (98-1-2) where 2i+1=2d+1 holds true (where d is an integer no smaller than zero and no greater than m−1).

Accordingly, component $H_{com}[2\times g-1][v]=H_0[2\times(2\times f)-1][v]$ in row 2×g−1, or that is, row 2×(2×f)−1 of the parity check matrix H, which is for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of

#(2i+1); first expression, and an m number of parity check polynomials satisfying zero of #(2i+1); second expression, is expressed as follows.

The following holds true for $X_1$. In the following, y is an integer no smaller than three and no greater than $r_{\#(2d+1),1}$.

[Math. 254]

When $(2\times f)-\alpha_{\#(2d+1),1,y}-1\geq 0$:

$$H_{com}[2\times(2\times f)-1][5\times((2\times f)-\alpha_{\#(2d+1),1,y}-1)+1]=1 \quad (119\text{-}1)$$

For all u being an integer no smaller than one satisfying $\{u\neq(2\times f)-\alpha_{\#(2d+1),1,y}\}$ (where y is an integer no smaller than three and no greater than $r_{\#(2d+1),1}$):

$$H_{com}[2\times(2\times f)-1][5\times(u-1)+1]=0 \quad (119\text{-}2)$$

The following holds true for $X_w$. In the following, w is an integer no smaller than two and no greater than three.

[Math. 255]

$$H_{com}[2\times(2\times f)-1][5\times((2\times f)-0-1)+w]=1 \quad (120\text{-}1)$$

When $(2\times f)-\alpha_{\#(2d+1),w,1}-1\geq 0$:

$$H_{com}[2\times(2\times f)-1][5\times((2\times f)-\alpha_{\#(2d+1),w,1}-1)+w]=1 \quad (120\text{-}2)$$

When $(2\times f)-\alpha_{\#(2d+1),w,2}-1\geq 0$:

$$H_{com}[2\times(2\times f)-1][5\times((2\times f)-\alpha_{\#(2d+1),w,2}-1)+w]=1 \quad (120\text{-}3)$$

For all u being an integer no smaller than one satisfying $\{u\neq(2\times f)-0,\ u\neq(2\times f)-\alpha_{\#(2d+1),w,1},\ \text{and}\ u\neq(2\times f)-\alpha_{\#(2d+1),w,2}\}$:

$$H_{com}[2\times(2\times f)-1][5\times(u-1)+w]=0 \quad (120\text{-}4)$$

The following holds true for $P_1$.

[Math. 256]

$$H_{com}[2\times(2\times f)-1][5\times((2\times f)-0-1)+4]=1 \quad (121\text{-}1)$$

When $(2\times f)-\beta_{\#(2d+1),1}-1\geq 0$:

$$H_{com}[2\times(2\times f)-1][5\times((2\times f)-\beta_{\#(2d+1),1}-1)+4]=1 \quad (121\text{-}2)$$

For all u being an integer no smaller than one satisfying $\{u\neq(2\times f)-0\ \text{and}\ u\neq(2\times f)-\beta_{\#(2d+1),1}\}$:

$$H_{com}[2\times(2\times f)-1][5\times(u-1)+4]=0 \quad (121\text{-}3)$$

The following holds true for $P_2$.

[Math. 257]

For all u being an integer no smaller than one:

$$H_{com}[2\times(2\times f)-1][5\times(u-1)+5]=0 \quad (122)$$

Further, (7) when g=2×f (where f is an integer no smaller than one), when a vector for row 2×(2×0 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-2-1), ((2×f)−1) %2m=2d+1 holds true. Accordingly, a parity check polynomial satisfying zero of expression (98-2-1) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 258]

$$H_{com}[2\times(2\times f)][5\times((2\times f)-0-1)+1]=1 \quad (123\text{-}1)$$

When $(2\times f)-\alpha_{\#(2d+1),1,1}-1\geq 0$:

$$H_{com}[2\times(2\times f)][5\times((2\times f)-\alpha_{\#(2d+1),1,1}-1)+1]=1 \quad (123\text{-}2)$$

When $(2\times f)-\alpha_{\#(2d+1),1,2}-1\geq 0$:

$$H_{com}[2\times(2\times f)][5\times((2\times f)-\alpha_{\#(2d+1),1,2}-1)+1]=1 \quad (123\text{-}3)$$

For all u being an integer no smaller than one satisfying $\{u\neq(2\times f)-0,\ u\neq(2\times f)-\alpha_{\#(2d+1),1,1},\ \text{and}\ u\neq(2\times f)-\alpha_{\#(2d+1),1,2}\}$:

$$H_{com}[2\times(2\times f)][5\times(u-1)+1]=0 \quad (123\text{-}4)$$

The following holds true for $X_z$. In the following, z is an integer no smaller than two and no greater than three, and y is an integer no smaller than three and no greater than $r_{\#(2d+1),z}$.

[Math. 259]

When $(2\times f)-\alpha_{\#(2d+1),z,y}-1\geq 0$:

$$H_{com}[2\times(2\times f)][5\times((2\times f)-\alpha_{\#(2d+1),z,y}-1)+z]=1 \quad (124\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)][5\times(u-1)+z]=0 \quad (124\text{-}2)$$

The following holds true for $P_1$.

[Math. 260]

When $(2\times f)-\beta_{\#(2d+1),2}-1\geq 0$:

$$H_{com}[2\times(2\times f)][5\times((2\times f)-\beta_{\#(2d+1),2}-1)+4]=1 \quad (125\text{-}1)$$

For all u being an integer no smaller than one satisfying $\{y\neq(2\times f)-\beta_{\#(2d-1),2}\}$:

$$H_{com}[2\times(2\times f)][5\times(u-1)+4]=0 \quad (125\text{-}2)$$

The following holds true for $P_2$.

[Math. 261]

$$H_{com}[2\times(2\times f)][5\times((2\times f)-0-1)+5]=1 \quad (126\text{-}1)$$

For all u being an integer no smaller than one satisfying $\{u\neq(2\times f)-0\}$:

$$H_{com}[2\times(2\times f)][5\times(11-1)+5]=0 \quad (126\text{-}2)$$

Further, (8) when g=2×f (where f is an integer no smaller than one), when a vector for row 2×(2×0 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-2-2), ((2×f)−1) %2m=2d+1 holds true. Accordingly, a parity check polynomial satisfying zero of expression (98-2-2) where $2i+1=2d+1$ holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 262]

$$H_{com}[2\times(2\times f)][5\times((2\times f)-0-1)+1]=1 \tag{127-1}$$

When $(2\times f)-\alpha_{\#(2d+1),1,1}-1\geq 0$:

$$H_{com}[2\times(2\times f)][5\times((2\times f)-\alpha_{\#(2d+1),1,1}-1)+1]=1 \tag{127-2}$$

When $(2\times f)-\alpha_{\#(2d+1),1,2}-1\geq 0$:

$$H_{com}[2\times(2\times f)][5\times((2\times f)-\alpha_{\#(2d+1),1,2}-1)+1]=1 \tag{127-3}$$

For all u being an integer no smaller than one satisfying $\{u\neq(2\times f)-0,\ u\neq(2\times f)-\alpha_{\#(2d+1),1,1},\text{ and } u\neq(2\times f)-\alpha_{\#(2d+1),1,2}\}$:

$$H_{com}[2\times(2\times f)][5\times(u-1)+1]=0 \tag{127-4}$$

The following holds true for $X_z$. In the following, z is an integer no smaller than two and no greater than three, and y is an integer no smaller than three and no greater than $r_{\#(2d+1),z}$.

[Math. 263]

When $(2\times f)-\alpha_{\#(2d+1),z,y}-1\geq 0$:

$$H_{com}[2\times(2\times f)][5\times((2\times f)-\alpha_{\#(2d+1),z,y}-1)+z]=1 \tag{128-1}$$

For all u being an integer no smaller than one satisfying $\{u\neq(2\times f)-\alpha_{\#(2d+1),z,y}\}$ (Where y is an integer no smaller than three and no greater than $r_{\#(2d+1),z}$):

$$H_{com}[2\times(2\times f)][5\times(u-1)+z]=0 \tag{128-2}$$

The following holds true for $P_1$.

[Math. 264]

For all u being an integer no smaller than one:

$$H_{com}[2\times(2\times f)][5\times(u-1)+4]=0 \tag{129}$$

The following holds true for $P_2$.

[Math. 265]

$$H_{com}[2\times(2\times f)][5\times((2\times f)-0-1)+5]=1 \tag{130-1}$$

When $(2\times f)-\beta_{\#(2d+1),3}-1\geq 0$:

$$H_{com}[2\times(2\times f)][5\times((2\times f)-\beta_{\#(2d+1),3}-1)+5]=1 \tag{130-2}$$

For all u being an integer no smaller than one satisfying $\{u\neq(2\times f)-0 \text{ and } u\neq(2\times f)-\beta_{\#(2d+1),3}\}$:

$$H_{com}[2\times(2\times f)][5\times(u-1)+5]=0 \tag{130-3}$$

As such, an LDPC-CC of coding rate 3/5 and time-varying period 2×m that is based on a parity check polynomial can be generated by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, and the code so generated achieves high error correction capability.

Embodiment D2

In the present embodiment, description is provided of a method of code configuration that is a generalization of the method described in embodiment D1 of configuring an LDPC-CC of coding rate 3/5 that is based on a parity check polynomial.

Bits of information bits $X_1$, $X_2$, $X_3$ and parity bits $P_1$, $P_2$, at time point j, are expressed $X_{1,j}$, $X_{2,j}$, $X_{3,j}$ and $P_{1,j}$, $P_{2,j}$, respectively.

A vector at time point j, is expressed $u_j=(X_{1,j}, X_{2,j}, X_{3,j}, P_{1,j}, P_{2,j})$.

Given a delay operator D, polynomial expressions of the information bits $X_1$, $X_2$, $X_3$ are $X_1(D)$, $X_2(D)$, $X_3(D)$, and polynomial expressions of the parity bits $P_1$, $P_2$ are $P_1(D)$, $P_2(D)$.

Further, consideration is given to an LDPC-CC of coding rate 3/5 and time-varying period 2m that is based on a parity check polynomial.

The following mathematical expressions are provided as parity check polynomials satisfying zero for an LDPC-CC of coding rate 3/5 and time-varying period 2m that is based on a parity check polynomial.

First, because two parities $P_1$ and $P_2$ exist, parity check polynomials satisfying zero are provided as described in the following, two for $1\times P_1(D)$ and two for $1\times P_2(D)$.

[Math. 266-1]

$$\begin{aligned}&\left(1+\sum_{s=1}^{R_{\#(2i),1}}D^{\alpha\#(2i),1,s}\right)X_1(D)+\left(\sum_{s=R_{\#(2i),2}+1}^{r_{\#(2i),2}}D^{\alpha\#(2i),2,s}\right)X_2(D)+\\&\left(\sum_{s=R_{\#(2i),3}+1}^{r_{\#(2i),3}}D^{\alpha\#(2i),3,s}\right)X_3(D)+P_1(D)+D^{\beta\#(2i),0}P_2(D)=\\&(D^{\alpha\#(2i),1,R_{\#(2i),1}}+\dots+D^{\alpha\#(2i),1,1}+1)X_1(D)+\\&(D^{\alpha\#(2i),2,r_{\#(2i),2}}+\dots+D^{\alpha\#(2i),2,R_{\#(2i),2}}+1)X_2(D)+\\&(D^{\alpha\#(2i),3,r_{\#(2i),3}}+\dots+D^{\alpha\#(2i),3,R_{\#(2i),3}}+1)X_3(D)+\\&P_1(D)+D^{\beta\#(2i),0}P_2(D)=0\end{aligned} \tag{131-1-1}$$

$$\begin{aligned}&\left(1+\sum_{s=1}^{R_{\#(2i),1}}D^{\alpha\#(2i),1,s}\right)X_1(D)+\left(\sum_{s=R_{\#(2i),2}+1}^{r_{\#(2i),2}}D^{\alpha\#(2i),2,s}\right)X_2(D)+\\&\left(\sum_{s=R_{\#(2i),3}+1}^{r_{\#(2i),3}}D^{\alpha\#(2i),3,s}\right)X_3(D)+P_1(D)+D^{\beta\#(2i),1}P_1(D)=\\&(D^{\alpha\#(2i),1,R_{\#(2i),1}}+\dots+D^{\alpha\#(2i),1,1}+1)X_1(D)+\\&(D^{\alpha\#(2i),2,r_{\#(2i),2}}+\dots+D^{\alpha\#(2i),2,R_{\#(2i),2}}+1)X_2(D)+\\&(D^{\alpha\#(2i),3,r_{\#(2i),3}}+\dots+D^{\alpha\#(2i),3,R_{\#(2i),3}}+1)X_3(D)+\\&P_1(D)+D^{\beta\#(2i),1}P_1(D)=0\end{aligned} \tag{131-1-2}$$

-continued

[Math. 266-2]

$$\left(\sum_{s=R_{\#(2i),1}+1}^{r_{\#(2i),1}} D^{\alpha\#(2i),1,s}\right)X_1(D) + \left(1+\sum_{s=1}^{R_{\#(2i),2}} D^{\alpha\#(2i),2,s}\right)X_2(D) + \left(1+\sum_{s=1}^{R_{\#(2i),3}} D^{\alpha\#(2i),3,s}\right)X_3(D) + P_2(D) + D^{\beta\#(2i),2}P_1(D) =$$
$$(D^{\alpha\#(2i),1,}r_{\#(2i),1} + \dots + D^{\alpha\#(2i),1}R_{\#(2i),1} + 1)X_1(D) + (D^{\alpha\#(2i),2,}R_{\#(2i),2} + \dots + D^{\alpha\#(2i),2,1} + 1)X_2(D) + (D^{\alpha\#(2i),3,}R_{\#(2i),3} + \dots + D^{\alpha\#(2i),3,1} + 1)X_3(D) + P_2(D) + D^{\beta\#(2i),2}P_1(D) = 0 \quad (131\text{-}2\text{-}1)$$

$$\left(\sum_{s=R_{\#(2i),1}+1}^{r_{\#(2i),1}} D^{\alpha\#(2i),1,s}\right)X_1(D) + \left(1+\sum_{s=1}^{R_{\#(2i),2}} D^{\alpha\#(2i),2,s}\right)X_2(D) + \left(1+\sum_{s=1}^{R_{\#(2i),3}} D^{\alpha\#(2i),3,s}\right)X_3(D) + P_2(D) + D^{\beta\#(2i),3}P_2(D) =$$
$$(D^{\alpha\#(2i),1,}r_{\#(2i),1} + \dots + D^{\alpha\#(2i),1,}R_{\#(2i),1} + 1)X_1(D) + (D^{\alpha\#(2i),2,}R_{\#(2i),2} + \dots + D^{\alpha\#(2i),2,1} + 1)X_2(D) + (D^{\alpha\#(2i),3,}R_{\#(2i),3} + \dots + D^{\alpha\#(2i),3,1} + 1)X_3(D) + P_2(D) + D^{\beta\#(2i),3}P_2(D) = 0 \quad (131\text{-}2\text{-}2)$$

In expressions (131-1-1), (131-1-2), (131-2-1), (131-2-2), i is an integer no smaller than zero and no greater than m−1 (i=0, 1, . . . , m−2, m−1).

In expressions (131-1-1), (131-1-2), (131-2-1), (131-2-2), $\alpha_{\#(2i),p,q}$ (where p is an integer no smaller than one and no greater than three, q is an integer no smaller than one and no greater than $r_{\#(2c),p}$ (where $r_{\#(2c),p}$ is a natural number)) and $\beta_{\#(2c),0}$ is a natural number, $\beta_{\#(2i),1}$ is a natural number, $\beta_{\#(2i),2}$ is an integer no smaller than zero, and $\beta_{\#(2i),3}$ is a natural number.

Further, $R_{\#(2c),p}$ is a natural number satisfying $1 \le R_{\#(2i),p} < r_{\#(2i),p}$.

Further, y is an integer no smaller than one and no greater than $r_{\#(2i),p}$, z is an integer no smaller than one and no greater than $r_{\#2i,p}$, and $\alpha_{\#(2c),p,y} \ne \alpha_{\#(2i),p,z}$ holds true for $\forall$(y, z) where y≠z. ∀ is a universal quantifier. (y is an integer no smaller than one and no greater than $r_{\#(2c),p,z}$ is an integer no smaller than one and no greater than $r_{\#2i,p}$, and $\alpha_{\#(2i),p,y} \ne \alpha_{\#(2c),p,z}$ holds true for all y and all z satisfying y≠z.)

Note that in the following, to simplify explanation, a parity check polynomial satisfying zero that is expressed by expression (131-1-1) or expression (131-1-2) is referred to as "#(2i); first expression" for realizing a time-varying period 2m, and a parity check polynomial satisfying zero that is expressed by expression (131-2-1) or expression (131-2-2) is referred to as "#(2i); second expression" for realizing a time-varying period 2m.

Thus, for each i, as #(2i); first expression for realizing a time-varying period 2m, a parity check polynomial satisfying zero expressed by either expression (131-1-1) or expression (131-1-2) is prepared.

That is, for i=0, a parity check polynomial satisfying zero provided by expression (131-1-1) where i=0, or a parity check polynomial satisfying zero provided by expression (131-1-2) where i=0 is prepared.

Similarly:

for i=1, a parity check polynomial satisfying zero provided by expression (131-1-1) where i=1, or a parity check polynomial satisfying zero provided by expression (131-1-2) where i=1 is prepared;

for i=2, a parity check polynomial satisfying zero provided by expression (131-1-1) where i=2, or a parity check polynomial satisfying zero provided by expression (131-1-2) where i=2 is prepared;

⋮ for i=z, a parity check polynomial satisfying zero provided by expression (131-1-1) where i=z, or a parity check polynomial satisfying zero provided by expression (131-1-2) where i=z is prepared (where z is an integer no smaller than zero and no greater than m−1); and

⋮ for i=m−1, a parity check polynomial satisfying zero provided by expression (131-1-1) where i=m−1, or a parity check polynomial satisfying zero provided by expression (131-1-2) where i=m−1 is prepared.

Similarly, for each i, as #(2i); second expression for realizing a time-varying period 2m, a parity check polynomial satisfying zero expressed by either expression (131-2-1) or expression (131-2-2) is prepared.

That is, for i=0, a parity check polynomial satisfying zero provided by expression (131-2-1) where i=0, or a parity check polynomial satisfying zero provided by expression (131-2-2) where i=0 is prepared.

Similarly:

for i=1, a parity check polynomial satisfying zero provided by expression (131-2-1) where i=1, or a parity check polynomial satisfying zero provided by expression (131-2-2) where i=1 is prepared;

for i=2, a parity check polynomial satisfying zero provided by expression (131-2-1) where i=2, or a parity check polynomial satisfying zero provided by expression (131-2-2) where i=2 is prepared;

⋮ for i=z, a parity check polynomial satisfying zero provided by expression (131-2-1) where i=z, or a parity check polynomial satisfying zero provided by expression (131-2-2) where i=z is prepared (where z is an integer no smaller than zero and no greater than m−1); and

⋮ for i=m−1, a parity check polynomial satisfying zero provided by expression (131-2-1) where i=m−1, or a parity check polynomial satisfying zero provided by expression (131-2-2) where i=m−1 is prepared.

Similarly, because two parities $P_1$ and $P_2$ exist, parity check polynomials satisfying zero are provided as described in the following, two for $1 \times P_1(D)$ and two for $1 \times P_2(D)$.

[Math. 267-1]

$$\left(\sum_{s=R_{\#(2i+1),1}+1}^{r_{\#(2i+1),1}} D^{\alpha\#(2i+1),1,s}\right)X_1(D) + \left(1+\sum_{s=1}^{R_{\#(2i+1),2}} D^{\alpha\#(2i+1),2,s}\right)X_2(D) + \left(1+\sum_{s=1}^{R_{\#(2i+1),3}} D^{\alpha\#(2i+1),3,s}\right)X_3(D) + P_1(D) + D^{\beta\#(2i+1),0}P_2(D) =$$
$$(D^{\alpha\#(2i+1),1,}r_{\#(2i+1),1} + \dots + D^{\alpha\#(2i+1),1}R_{\#(2i+1),1} + 1)X_1(D) + (D^{\alpha\#(2i+1),2,}R_{\#(2i+1),2} + \dots + D^{\alpha\#(2i+1),2,1} + 1)X_2(D) + (D^{\alpha\#(2i+1),3,}R_{\#(2i+1),3} + \dots + D^{\alpha\#(2i+1),3,1} + 1)X_3(D) + P_1(D) + D^{\beta\#(2i+1),0}P_2(D) = 0 \quad (132\text{-}1\text{-}1)$$

-continued $$\left(\sum_{s=R_{\#(2i+1),1}+1}^{r_{\#(2i+1),1}} D^{\alpha\#(2i+1),1,s}\right)X_1(D) + \left(1 + \sum_{s=1}^{R_{\#(2i+1),2}} D^{\alpha\#(2i+1),2,s}\right)X_2(D) + \left(1 + \sum_{s=1}^{R_{\#(2i+1),3}} D^{\alpha\#(2i+1),3,s}\right)X_3(D) + P_1(D) + D^{\beta\#(2i+1),1}P_1(D) = (D^{\alpha\#(2i+1),1,r_{\#(2i+1),1}} + \ldots + D^{\alpha\#(2i+1),1R_{\#(2i+1),1}} + 1)X_1(D) + (D^{\alpha\#(2i+1),2,R_{\#(2i+1),2}} + \ldots + D^{\alpha\#(2i+1),2,1} + 1)X_2(D) + (D^{\alpha\#(2i+1),3,R_{\#(2i+1),3}} + \ldots + D^{\alpha\#(2i+1),3,1} + 1)X_3(D) + P_1(D) + D^{\beta\#(2i+1),1}P_1(D) = 0 \quad (132\text{-}1\text{-}2)$$

[Math. 267-2]

$$\left(1 + \sum_{s=1}^{R_{\#(2i+1),1}} D^{\alpha\#(2i+1),1,s}\right)X_1(D) + \left(\sum_{s=R_{\#(2i+1),2}+1}^{r_{\#(2i+1),2}} D^{\alpha\#(2i+1),2,s}\right)X_2(D) + \left(\sum_{s=R_{\#(2i+1),3}+1}^{r_{\#(2i+1),3}} D^{\alpha\#(2i+1),3,s}\right)X_3(D) + P_2(D) + D^{\beta\#(2i+1),2}P_1(D) = (D^{\alpha\#(2i+1),1,R_{\#(2i+1),1}} + \ldots + D^{\alpha\#(2i+1),1,1})X_1(D) + (D^{\alpha\#(2i+1),2,r_{\#(2i+1),2}} + \ldots + D^{\alpha\#(2i+1),2,R_{\#(2i+1),2}} + 1) X_2(D) + (D^{\alpha\#(2i+1),3,r_{\#(2i+1),3}} + \ldots + D^{\alpha\#(2i+1),3,R_{\#(2i+1),3}} + 1) X_3(D) + P_2(D) + D^{\beta\#(2i+1),2}P_1(D) = 0 \quad (132\text{-}2\text{-}1)$$

$$\left(1 + \sum_{s=1}^{R_{\#(2i+1),1}} D^{\alpha\#(2i+1),1,s}\right)X_1(D) + \left(\sum_{s=R_{\#(2i+1),2}+1}^{r_{\#(2i+1),2}} D^{\alpha\#(2i+1),2,s}\right)X_2(D) + \left(\sum_{s=R_{\#(2i+1),3}+1}^{r_{\#(2i+1),3}} D^{\alpha\#(2i+1),3,s}\right)X_3(D) + P_2(D) + D^{\beta\#(2i+1),3}P_2(D) = (D^{\alpha\#(2i+1),1,R_{\#(2i+1),1}} + \ldots + D^{\alpha\#(2i+1),1,1} + 1)X_1(D) + (D^{\alpha\#(2i+1),2,r_{\#(2i+1),2}} + \ldots + D^{\alpha\#(2i+1),2,R_{\#(2i+1),2}} + 1) X_2(D) + (D^{\alpha\#(2i+1),3,r_{\#(2i+1),3}} + \ldots + D^{\alpha\#(2i+1),3,R_{\#(2i+1),3}} + 1) X_3(D) + P_2(D) + D^{\beta\#(2i+1),3}P_2(D) = 0 \quad (132\text{-}2\text{-}2)$$

In expressions (132-1-1), (132-1-2), (132-2-1), (132-2-2), i is an integer no smaller than zero and no greater than m−1 (i=0, 1, . . . , m−2, m−1).

In expressions (132-1-1), (132-1-2), (132-2-1), (132-2-2), $\alpha_{\#(2i+1),p,q}$ (where p is an integer no smaller than one and no greater than three, q is an integer no smaller than one and no greater than $r_{\#(2i+1),p}$ (where $r_{\#(2i+1),p}$ is a natural number)) and $\beta_{\#(2i+1),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, $R_{\#(2i+1),p}$ is a natural number satisfying $1 \leq R_{\#(2i+1),p} < r_{\#(2i+1),p}$.

Further, y is an integer no smaller than one and no greater than $r_{\#(2i+1),p}$, z is an integer no smaller than one and no greater than $r_{\#(2i+1),p}$, and $\alpha_{\#(2i+1),p,y} \neq \alpha_{\#(2i+1),p,z}$ holds true for $\forall$(y, z) where y≠z. $\forall$ is a universal quantifier. (y is an integer no smaller than one and no greater than $r_{\#(2i+1),p,z}$ is an integer no smaller than one and no greater than $r_{\#(2i+1),p}$, and $\alpha_{\#(2i+1),p,y} \neq \alpha_{\#(2i+1),p,z}$ holds true for all y and all z satisfying y≠z.)

Note that in the following, to simplify explanation, a parity check polynomial satisfying zero that is expressed by expression (132-1-1) or expression (132-1-2) is referred to as "#(2i+1); first expression" for realizing a time-varying period 2m, and a parity check polynomial satisfying zero that is expressed by expression (132-2-1) or expression (132-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (132-1-1) or expression (132-1-2) is prepared.

That is, for i=0, a parity check polynomial satisfying zero provided by expression (132-1-1) where i=0, or a parity check polynomial satisfying zero provided by expression (132-1-2) where i=0 is prepared.

Similarly:

for i=1, a parity check polynomial satisfying zero provided by expression (132-1-1) where i=1, or a parity check polynomial satisfying zero provided by expression (132-1-2) where i=1 is prepared;

for i=2, a parity check polynomial satisfying zero provided by expression (132-1-1) where i=2, or a parity check polynomial satisfying zero provided by expression (132-1-2) where i=2 is prepared;

⋮ for i=z, a parity check polynomial satisfying zero provided by expression (132-1-1) where i=z, or a parity check polynomial satisfying zero provided by expression (132-1-2) where i=z is prepared (where z is an integer no smaller than zero and no greater than m−1); and

⋮ for i=m−1, a parity check polynomial satisfying zero provided by expression (132-1-1) where i=m−1, or a parity check polynomial satisfying zero provided by expression (132-1-2) where i=m−1 is prepared.

Similarly, for each i, as #(2i+1); second expression for realizing a time-varying period 2m, a parity check polynomial satisfying zero expressed by either expression (132-2-1) or expression (132-2-2) is prepared.

That is, for i=0, a parity check polynomial satisfying zero provided by expression (132-2-1) where i=0, or a parity check polynomial satisfying zero provided by expression (132-2-2) where i=0 is prepared.

Similarly:

for i=1, a parity check polynomial satisfying zero provided by expression (132-2-1) where i=1, or a parity check polynomial satisfying zero provided by expression (132-2-2) where i=1 is prepared;

for i=2, a parity check polynomial satisfying zero provided by expression (132-2-1) where i=2, or a parity check polynomial satisfying zero provided by expression (132-2-2) where i=2 is prepared;

⋮ for i=z, a parity check polynomial satisfying zero provided by expression (132-2-1) where i=z, or a parity check polynomial satisfying zero provided by expression (132-2-

2) where i=z is prepared (where z is an integer no smaller than zero and no greater than m−1); and

⋮ for i=m−1, a parity check polynomial satisfying zero provided by expression (132-2-1) where i=m−1, or a parity check polynomial satisfying zero provided by expression (132-2-2) where i=m−1 is prepared.

As such, an LDPC-CC of coding rate 3/5 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (131-1-1) or expression (131-1-2), parity check polynomials satisfying zero provided by expression (131-2-1) or expression (131-2-2), parity check polynomials satisfying zero provided by expression (132-1-1) or expression (132-1-2), and parity check polynomials satisfying zero provided by expression (132-2-1) or expression (132-2-2).

For example, the time varying period 2×m can be formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expressions (131-1-1), (131-1-2), (131-2-1), (131-2-2), (132-1-1), (132-1-2), (132-2-1), and (132-2-2) (where j is an integer no smaller than zero).

The following presumes that 2k=j%2m holds true. In the following, % means a modulo, and for example, α%6 represents a remainder after dividing α by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

The following describes a method of configuring a parity check matrix for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a vector $u_j$ at time point j is expressed as $u_j=(X_{1,j}, X_{2,j}, X_{3,j}, P_{1,j}, P_{2,j})$ (where j is an integer no smaller than zero). In the following, a case where u is a transmission vector is considered. Note that in the following, j is an integer no smaller than one, and thus j differs between the description having been provided above and the description provided in the following. (j is set as such to facilitate understanding of the correspondence between the column numbers and the row numbers of the parity check matrix.)

Accordingly, $u=(u_1, u_2, u_3, \ldots, u_{y-1}, u_y, u_{y+1}, \ldots)^T=(X_{1,1}, X_{2,1}, X_{1,2}, X_{2,2}, X_{3,2}, P_{1,2}, P_{2,2}, X_{1,3}, X_{2,3}, X_{3,3}, P_{1,3}, P_{2,3}, \ldots, X_{1,y-1}, X_{2,y-1}, X_{3,y-1}, P_{1,y-1}, P_{2,y-1}, X_{1,y}, X_{2,y}, X_{3,y}, P_{1,y}, P_{2,y}, X_{1,y+1}, X_{2,y+1}, X_{3,y+1}, P_{1,y+1}, P_{2,y+1}, \ldots)^T$. Further, when using H to denote a parity check matrix for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, Hu=0 holds true (here, Hu=0 indicates that all elements of the vector Hu are zeroes).

FIG. 66 indicates a configuration of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the topmost row of the parity check matrix is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

As illustrated in FIG. 66:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression"; and "a vector for the (2×i)th row of the parity check matrix H can be generated from a parity check polynomial satisfying zero of #((i−1)%2m); second expression", and so on (where i is an integer no smaller than one).

FIG. 67 indicates a configuration of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the leftmost column of the parity check matrix $H_{pro\_m}$ is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

As illustrated in FIG. 67:

"a vector for the first column of the parity check matrix H is related to $X_1$ at time point 1";

"a vector for the second column of the parity check matrix H is related to $X_2$ at time point 1";

"a vector for the third column of the parity check matrix H is related to $X_3$ at time point 1";

"a vector for the fourth column of the parity check matrix H is related to $P_1$ at time point 1";

"a vector for the fifth column of the parity check matrix H is related to $P_2$ at time point 1";

⋮

"a vector for the 5×(j−1)+1th column of the parity check matrix H is related to $X_1$ at time point j";

"a vector for the 5×(j−1)+2th column of the parity check matrix H is related to $X_2$ at time point j";

"a vector for the 5×(j−1)+3th column of the parity check matrix H is related to $X_3$ at time point j";

"a vector for the 5×(j−1)+4th column of the parity check matrix H is related to $P_1$ at time point j"; and "a vector for the 5×(j−1)+5th column of the parity check matrix H is related to $P_2$ at time point j", and so on (where j is an integer no smaller than one).

FIG. 68 indicates a parity check matrix for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The following focuses on $1×X_1(D)$, $1×X_2(D)$, $1×X_3(D)$, $1×P_1(D)$, $1×P_2(D)$ in the parity check matrix for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The parity check polynomials at time point j=1 are parity check polynomials when i=0 in expressions (131-1-1), (131-1-2), (131-2-1), (131-2-2).

A vector for the first row in FIG. 68 can be generated from a parity check polynomial when i=0 in expression (131-1-1) or expression (131-1-2) (refer to FIG. 66).

In expressions (131-1-1) and (131-1-2):

a term for $1×X_1(D)$ exists;

terms for $1×X_2(D)$ and $1×X_3(D)$ do not exist; and a term for $1×P_1(D)$ exists but a term for $1×P_2(D)$ does not exist.

Further, the relationship between column numbers and $X_1$, $X_2$, $X_3$, $P_1$, $P_2$ is as indicated in FIG. 67. Based on the relationship indicated in FIG. 67 and the fact that a term for $1×X_1(D)$ exists, a column related to $X_1$ in the vector for the first row in FIG. 68 is "1". Further, based on the relationship indicated in FIG. 67 and the fact that terms for $1×X_2(D)$ and $1×X_3(D)$ do not exist, columns related to $X_2$ and $X_3$ in the vector for the first row in FIG. 68 are "0". In addition, based on the relationship indicated in FIG. 67 and the fact that a term for $1×P_1(D)$ exists but a term for $1×P_2(D)$ does not exist, a column related to $P_1$ in the vector for the first row in FIG. 68 is "1", and a column related to $P_2$ in the vector for the first row in FIG. 68 is "0".

As such, the vector for the first row in FIG. 68 is "10010", as indicated by 3900-1 in FIG. 68.

A vector for the second row in FIG. 68 can be generated from a parity check polynomial when i=0 in expression (131-2-1) or expression (131-2-2) (refer to FIG. 66).

In expressions (131-2-1) and (131-2-2):

a term for $1×X_1(D)$ does not exist;

terms for $1×X_2(D)$ and $1×X_3(D)$ exist; and a term for $1×P_1(D)$ may or may not exist but a term for $1×P_2(D)$ exists.

Further, the relationship between column numbers and $X_1$, $X_2$, $X_3$, $P_1$, $P_2$ is as indicated in FIG. 67. Based on the relationship indicated in FIG. 67 and the fact that a term for $1×X_1(D)$ does not exist, a column related to $X_1$ in the vector for the second row in FIG. 68 is "0". Further, based on the relationship indicated in FIG. 67 and the fact that terms for $1×X_2(D)$ and $1×X_3(D)$ exist, columns related to $X_2$ and $X_3$ in the vector for the second row in FIG. 68 are "1". In addition, based on the relationship indicated in FIG. 67 and the fact that a term for $1×P_1(D)$ may or may not exist but a term for $1×P_2(D)$ exists, a column related to $P_1$ in the vector for the second row in FIG. 68 is "Y", and a column related to $P_2$ in the vector for the second row in FIG. 68 is "1", where Y is either "0" or "1".

As such, the vector for the second row in FIG. 68 is "011Y1", as indicated by 3900-2 in FIG. 68.

The parity check polynomials at time point j=2 are parity check polynomials when i=0 in expressions (132-1-1), (132-1-2), (132-2-1), (132-2-2).

A vector for the third row in FIG. 68 can be generated from a parity check polynomial when i=0 in expression (132-1-1) or expression (132-1-2) (refer to FIG. 66).

In expressions (132-1-1) and (132-1-2):

a term for $1\times X_1(D)$ does not exist;

terms for $1\times X_2(D)$ and $1\times X_3(D)$ exist; and a term for $1\times P_1(D)$ exists but a term for $1\times P_2(D)$ does not exist.

Further, the relationship between column numbers and $X_1$, $X_2$, $X_3$, $P_1$, $P_2$ is as indicated in FIG. 67. Based on the relationship indicated in FIG. 67 and the fact that a term for $1\times X_1(D)$ does not exist, a column related to $X_1$ in the vector for the third row in FIG. 68 is "0". Further, based on the relationship indicated in FIG. 67 and the fact that terms for $1\times X_2(D)$ and $1\times X_3(D)$ exist, columns related to $X_2$ and $X_3$ in the vector for the third row in FIG. 68 are "1". In addition, based on the relationship indicated in FIG. 67 and the fact that a term for $1\times P_1(D)$ exists but a term for $1\times P_2(D)$ does not exist, a column related to $P_1$ in the vector for the third row in FIG. 68 is "1", and a column related to $P_2$ in the vector for the third row in FIG. 68 is "0".

As such, the vector for the third row in FIG. 68 is "01110", as indicated by 3901-1 in FIG. 68.

A vector for the fourth row in FIG. 68 can be generated from a parity check polynomial when i=0 in expression (132-2-1) or expression (132-2-2) (refer to FIG. 66).

In expressions (132-2-1) and (132-2-2):

a term for $1\times X_1(D)$ exists;

terms for $1\times X_2(D)$ and $1\times X_3(D)$ do not exist; and a term for $1\times P_1(D)$ may or may not exist but a term for $1\times P_2(D)$ exists.

Further, the relationship between column numbers and $X_1$, $X_2$, $X_3$, $P_1$, $P_2$ is as indicated in FIG. 67. Based on the relationship indicated in FIG. 67 and the fact that a term for $1\times X_1(D)$ exists, a column related to $X_1$ in the vector for the fourth row in FIG. 68 is "1". Further, based on the relationship indicated in FIG. 67 and the fact that terms for $1\times X_2(D)$ and $1\times X_3(D)$ do not exist, columns related to $X_2$ and $X_3$ in the vector for the fourth row in FIG. 68 are "0". In addition, based on the relationship indicated in FIG. 67 and the fact that a term for $1\times P_1(D)$ may or may not exist but a term for $1\times P_2(D)$ exists, a column related to $P_1$ in the vector for the fourth row in FIG. 68 is "Y", and a column related to $P_2$ in the vector for the fourth row in FIG. 68 is "1".

As such, the vector for the fourth row in FIG. 68 is "100Y1", as indicated by 3901-2 in FIG. 68.

Because it can be considered that the above similarly applies to cases where time point j=3, 4, 5, the parity check matrix H has the configuration indicated in FIG. 68.

That is, due to the parity check polynomials of expressions (131-1-1), (131-1-2), (131-2-1), (131-2-2) being used at time point j=2k+1 (where k is an integer no smaller than zero), "10010" exists in the 2×(2k+1)−1th row of the parity check matrix H, and "011Y1" exists in the 2×(2k+1)th row of the parity check matrix H, as illustrated in FIG. 68.

Further, due to the parity check polynomials of expressions (132-1-1), (132-1-2), (132-2-1), (132-2-2) being used at time point j=2k+2 (where k is an integer no smaller than zero), "01110" exists in the 2×(2k+2)−1th row of the parity check matrix H, and "100Y1" exists in the 2×(2k+2)th row of the parity check matrix H, as illustrated in FIG. 68.

Accordingly, as illustrated in FIG. 68, when denoting a column number of a leftmost column corresponding to "1" in "10010" in a row where "10010" exists (e.g., 3900-1 in FIG. 68) as "a", "01110" (e.g., 3901-1 in FIG. 68) exists in a row that is two rows below the row where "10010" exists, starting from column "a+5".

Similarly, as illustrated in FIG. 68, when denoting a column number of a leftmost column corresponding to "1" in "011Y1" in a row where "011Y1" exists (e.g., 3900-2 in FIG. 68) as "b", "100Y1" (e.g., 3901-2 in FIG. 68) exists in a row that is two rows below the row where "011Y1" exists, starting from column "b+5".

Similarly, as illustrated in FIG. 68, when denoting a column number of a leftmost column corresponding to "1" in "01110" in a row where "01110" exists (e.g., 3901-1 in FIG. 68) as "c", "10010" (e.g., 3902-1 in FIG. 68) exists in a row that is two rows below the row where "01110" exists, starting from column "c+5".

Similarly, as illustrated in FIG. 68, when denoting a column number of a leftmost column corresponding to "1" in "100Y1" in a row where "100Y1" exists (e.g., 3901-2 in FIG. 68) as "d", "011Y1" (e.g., 3902-2 in FIG. 68) exists in a row that is two rows below the row where "100Y1" exists, starting from column "d+5".

The following describes a parity check matrix for an LDPC-CC of coding rate 3/5 and time-varying period 2×m that is based on a parity check polynomial when tail-biting is not performed, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

In the following, $H_{com}[u][v]$ (where u and v are integers no smaller than one) denotes an element at row "u" column "v" of a parity check matrix for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Based on description above provided with reference to FIG. 66:

"a vector for the 2×g−1th row of the parity check matrix H can be generated from a parity check polynomial satisfying zero of #((g−1)%2m); first expression"; and "a vector for the (2×g)th row of the parity check matrix H can be generated from a parity check polynomial satisfying zero of #((g−1)%2m); second expression" (where g is an integer no smaller than one).

Based on description above provided with reference to FIG. 67:

"a vector for the 5×(j−1)+1th column of the parity check matrix H is related to $X_1$ at time point j";

"a vector for the 5×(j−1)+2th column of the parity check matrix H is related to $X_2$ at time point j";

"a vector for the 5×(j−1)+3th column of the parity check matrix H is related to $X_3$ at time point j";

"a vector for the 5×(j−1)+4th column of the parity check matrix H is related to $P_1$ at time point j"; and "a vector for the 5×(j−1)+5th column of the parity check matrix H is related to $P_2$ at time point j" (where j is an integer no smaller than one).

Based on the above, the following describes component $H_{com}$[2×g−1][v] in row 2×g−1 (where g is an integer no smaller than one) and component $H_{com}$[2×g][v] in row 2×g of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a parity check polynomial satisfying zero of #((g−1)%2m); first expression can be used to generate a vector for row 2×g−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #((g−1)%2m); second expression can be used to generate a vector for row 2×g of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, when g=2×f−1 (where f is an integer no smaller than one), a parity check polynomial satisfying zero of #(((2×f−1)−1)%2m); first expression, or that is, a parity check polynomial satisfying zero of either expression (131-1-1) or expression (131-1-2), can be used to generate a vector for row 2×(2×f−1)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f−1)−1)%2m); second expression, or that is, a parity check polynomial satisfying zero of either expression (131-2-1) or expression (131-2-2), can be used to generate a vector for row 2×(2×f−1) of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, when g=2×f (where f is an integer no smaller than one), a parity check polynomial satisfying zero of #(((2×f)−1)%2m); first expression, or that is, a parity check polynomial satisfying zero of either expression (132-1-1) or expression (132-1-2), can be used to generate a vector for row 2×(2×f)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f)−1)%2m); second expression, or that is, a parity check polynomial satisfying zero of either expression (132-2-1) or expression (132-2-2), can be used to generate a vector for row 2×(2×f) of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, (1) when g=2×f−1 (where f is an integer no smaller than one), when a vector for row 2×(2×f−1)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (131-1-1), (2×f−1)−1)%2m=2c holds true. Accordingly, a parity check polynomial satisfying zero of expression (131-1-1) where 2i=2c holds true (where c is an integer no smaller than zero and no greater than m−1).

Accordingly, component $H_{com}$[2×g−1][v]=$H_{com}$[2×(2×f−1)−1][v] in row 2×g−1, or that is, row 2×(2×f−1)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 268]

$$H_{com}[2\times(2\times f-1)-1][5\times((2\times f-1)-0-1)+w]=1 \quad (133\text{-}1)$$

When y is an integer no smaller than one and no greater than $R_{\#(2c),1}$, and $(2\times f-1)-\alpha_{\#(2c),1,y}-1\geq 0$:

$$H_{com}[2\times(2\times f-1)-1][5\times((2\times f-1)-\alpha_{\#(2c),1,y}-1)+1]=1 \quad (133\text{-}2)$$

For all u being an integer no smaller than one satisfying $\{u\neq(2\times f-1)-0$, and $u\neq(2\times f-1)-\alpha_{\#(2c),1,y}\}$ (where y is an integer no smaller than one and no greater than $R_{\#(2c),1}$);

$$H_{com}[2\times(2\times f-1)-1][5\times(u-1)+w]=0 \quad (133\text{-}3)$$

The following holds true for $X_z$. In the following, z is an integer no smaller than two and no greater than three, and y is an integer no smaller than $R_{\#(2c),z}+1$ and no greater than $r_{\#(2c),z}$.

[Math. 269]

When $(2\times f-1)-\alpha_{\#(2c),z,y}-1\geq 0$:

$$H_{com}[2\times(2\times f-1)-1][5\times((2\times f-1)-\alpha_{\#(2c),z,y}-1)+z]=1 \quad (134\text{-}1)$$

For all u being an integer no smaller than one satisfying $\{u\neq(2\times f-1)-\alpha_{\#(2c),z,y}\}$ (where y is an integer no smaller than $R_{\#(2c),z}+1$ and no smaller than $r_{\#(2c),z}$);

$$H_{com}[2\times(2\times f-1)-1][5\times(u-1)+z]=0 \quad (134\text{-}2)$$

The following holds true for $P_1$.

[Math. 270]

$$H_{com}[2\times(2\times f-1)-1][5\times((2\times f-1)-0-1)+4]=1 \quad (135\text{-}1)$$

For all u being an integer no smaller than one satisfying $\{u\neq(2\times f-1)-0\}$;

$$H_{com}[2\times(2\times f-1)-1][5\times(u-1)+4]=0 \quad (135\text{-}2)$$

The following holds true for $P_2$.

[Math. 271]

When $(2\times f-1)-\beta_{\#(2c),0}-1\geq 0$:

$$H_{com}[2\times(2\times f-1)-1][5\times((2\times f-1)-\beta_{\#(2c),0}-1)+5]=1 \quad (136\text{-}1)$$

For all u being an integer no smaller than one satisfying $\{u\neq(2\times f-1)-\beta_{\#(2c),0}\}$;

$$H_{com}[2\times(2\times f-1)-1][5\times(u-1)+5]=0 \quad (136\text{-}2)$$

Further, (2) when g=2×f−1 (where f is an integer no smaller than one), when a vector for row 2×(2×f−1)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (131-1-2), ((2×f−1)−1)%2m=2c holds true. Accordingly, a parity check polynomial satisfying zero of expression (131-1-2) where 2i=2c holds true (where c is an integer no smaller than zero and no greater than m−1).

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 272]

$$H_{com}[2\times(2\times f-1)-1][5\times((2\times f-1)-0-1)+1]=1 \quad (137\text{-}1)$$

When y is an integer no smaller than one and no greater than $R_{\#(2c),1}$, and $(2\times f-1)-\alpha_{\#(2c),1,y}-1\geq 0$:

$$H_{com}[2\times(2\times f-1)-1][5\times((2\times f)-\alpha_{\#(2c),1,y}-1)+1]=1 \quad (137\text{-}2)$$

For all u being an integer no smaller than one satisfying $\{u\neq(2\times f-1)-0$ and $u\neq(2\times f-1)-\alpha_{\#(2c),1,y}\}$ (where y is an integer no smaller than one and no greater than $R_{\#(2c),1}$);

$$H_{com}[2\times(2\times f-1)-1][5\times(u-1)+1]=0 \quad (137\text{-}3)$$

The following holds true for $X_z$. In the following, z is an integer no smaller than two and no greater than three, and y is an integer no smaller than $R_{\#(2c),z}+1$ and no greater than $r_{\#(2c),z}$.

[Math. 273]

When $(2\times f-1)-\alpha_{\#(2c),z,y}-1\geq 0$:

$$H_{com}[2\times(2\times f-1)-1][5\times((2\times f-1)-\alpha_{\#(2c),z,y}-1)+z]=1 \quad (138\text{-}1)$$

For all u being an integer no smaller than one satisfying $\{u\neq(2\times f-1)-\alpha_{\#(2c),z,y}\}$ (where is an integer no smaller than $R_{\#(2c),z}+1$ and no greater than $r_{\#(2c),z}$);

$$H_{com}[2\times(2\times f-1)-1][5\times(u-1)+z]=0 \quad (138\text{-}2)$$

The following holds true for $P_1$.

[Math. 274]

$$H_{com}[2\times(2\times f-1)-1][5\times((2\times f-1)-0-1)+4]=1 \quad (139\text{-}1)$$

When $(2\times f-1)-\beta_{\#(2c),1}-1\geq 0$:

$$H_{com}[2\times(2\times f-1)-1][5\times((2\times f-1)-\beta_{\#(2c),1}-1)+4]=1 \quad (139\text{-}2)$$

For all u being an integer no smaller than one satisfying $\{u\neq(2\times f-1)-0$ and $u\neq(2\times f-1)-\beta_{\#(2c),1}\}$;

$$H_{com}[2\times(2\times f-1)-1][5\times(u-1)+4]=0 \quad (139\text{-}3)$$

The following holds true for $P_2$.

[Math. 275]

For all u being an integer no smaller than one;

$$H_{com}[2\times(2\times f-1)-1][5\times(u-1)+5]=0 \quad (140)$$

Further, (3) when g=2×f−1 (where f is an integer no smaller than one), when a vector for row 2×(2×f−1) of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (131-2-1), (2×f−1)−1)%2m=2c holds true. Accordingly, a parity check polynomial satisfying zero of expression (131-2-1) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, and y is an integer no smaller than $R_{\#(2c),z}+1$ and no greater than $r_{\#(2c),1}$.

[Math. 276]

When $(2\times f-1)-\alpha_{\#(2c),1,y}-1\geq 0$:

$$H_{com}[2\times(2\times f-1)][5\times((2\times f-1)-\alpha_{\#(2c),1,y}-1)+1]=1 \tag{141-1}$$

For all u being an integer no smaller than one satisfying $\{u\neq(2\times f-1)-\alpha_{\#(2c),1,y}\}$ (where y is an integer no smaller than $R_{\#(2c),1}+1$ and no greater than $r_{\#(2c),1}$);

$$H_{com}[2\times(2\times f-1)][5\times(u-1)+1]=0 \tag{141-2}$$

The following holds true for $X_w$. In the following, w is an integer no smaller than two and no greater than three.

[Math. 277]

$$H_{com}[2\times(2\times f-1)][5\times((2\times f-1)-0-1)+w]=1 \tag{142-1}$$

When y is an integer no smaller than one and no greater than $R_{\#(2c),w}$, and $(2\times f-1)-\alpha_{\#(2i),w,y}-1\geq 0$:

$$H_{com}[2\times(2\times f-1)][5\times((2\times f-1)-\alpha_{\#(2c),w,y}-1)+w]=1 \tag{142-2}$$

For all u being an integer no smaller than one satisfying $\{u\neq(2\times f-1)-0$ and $u\neq(2\times f-1)-\alpha_{\#(2c),w,y}\}$ (where y is an integer no smaller than one and no greater than $R_{\#(2c),w}$);

$$H_{com}[2\times(2\times f-1)][5\times(u-1)+w]=0 \tag{142-3}$$

The following holds true for $P_1$.

[Math. 278]

When $(2\times f-1)-\beta_{\#(2c),2}-1\geq 0$:

$$H_{com}[2\times(2\times f-1)][5\times((2\times f-1)-\beta_{\#(2c),2}-1)+4]=1 \tag{143-1}$$

For all u being an integer no smaller than one satisfying $\{u\neq(2\times f-1)-\beta_{\#(2c),2}\}$;

$$H_{com}[2\times(2\times f-1)][5\times(u-1)+4]=0 \tag{143-2}$$

The following holds true for $P_2$.

[Math. 279]

$$H_{com}[2\times(2\times f-1)][5\times((2\times f-1)-0-1)+5]=1 \tag{144-1}$$

For all u being an integer no smaller than one satisfying $\{u\neq(2\times f-1)-0\}$;

$$H_{com}[2\times(2\times f-1)][5\times(u-1)+5]=0 \tag{144-2}$$

Further, (4) when g=2×f−1 (where f is an integer no smaller than one), when a vector for row 2×(2×f−1) of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (131-2-2), (2×f−1)−1)%2m=2c holds true. Accordingly, a parity check polynomial satisfying zero of expression (131-2-2) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than $R_{\#(2c),1}+1$ and no greater than $r_{\#(2c),1}$.

[Math. 280]

When $(2\times f-1)-\alpha_{\#(2c),1,y}-1\geq 0$:

$$H_{com}[2\times(2\times f-1)][5\times((2\times f-1)-\alpha_{\#(2c),1,y}-1)+1]=1 \tag{145-1}$$

For all u being an integer no smaller than one satisfying $\{u\neq(2\times f-1)-\alpha_{\#(2c),1,y}\}$ (where y is an integer no smaller than $R_{\#(2c),1}+1$ and no greater than $r_{\#(2c),1}$);

$$H_{com}[2\times(2\times f-1)][5\times(u-1)+z]=0 \tag{145-2}$$

The following holds true for $X_w$. In the following, w is an integer no smaller than two and no greater than three.

[Math. 281]

$$H_{com}[2\times(2\times f-1)][5\times((2\times f-1)-0-1)+w]=1 \tag{146-1}$$

When y is an integer no smaller than one and no greater than $R_{\#(2c),w}$, and $(2\times f)-\alpha_{\#(2c),w,y}-1\geq 0$;

$$H_{com}[2\times(2\times f-1)][5\times((2\times f-1)-\alpha_{\#(2c),w,y}-1)+w]=1 \tag{146-2}$$

For all u being an integer no smaller than one satisfying $\{u\neq(2\times f-1)-0\}$ and $u\neq(2\times f-1)-\alpha_{\#(2c),w,y}\}$ (where y is an integer no smaller than one and no greater than $R_{\#(2c),w}$);

$$H_{com}[2\times(2\times f-1)][5\times(u-1)+w]=0 \tag{146-3}$$

The following holds true for $P_1$.

[Math. 282]

For all u being an integer no smaller than one;

$$H_{com}[2\times(2\times f-1)][5\times(u-1)+4]=0 \tag{147}$$

The following holds true for $P_2$.

[Math. 283]

$$H_{com}[2\times(2\times f-1)][5\times((2\times f-1)-0-1)+5]=1 \tag{148-1}$$

When $(2\times f-1)-\beta_{\#(2c),3}-1\geq 0$:

$$H_{com}[2\times(2\times f-1)][5\times((2\times f-1)-\beta_{\#(2c),3}-1)+5]=1 \tag{148-2}$$

For all u being an integer no smaller than one satisfying $\{u\neq(2\times f-1)-0$ and $u\neq(2\times f-1)-\beta_{\#(2c),3}\}$;

$$H_{com}[2\times(2\times f-1)][5\times(u-1)+5]=0 \tag{148-3}$$

Further, (5) when g=2×f (where f is an integer no smaller than one), when a vector for row 2×(2×f)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (132-1-1), ((2×f)−1) %2m=2d+1 holds true. Accordingly, a parity check polynomial satisfying zero of expression (132-1-1) where 2i+1=2d+1 holds true (where d is an integer no smaller than zero and no greater than m−1).

Accordingly, component $H_{com}[2\times g-1][v]=H_0[2\times(2\times f)-1][v]$ in row 2×g−1, or that is, row 2×(2×f)−1 of the parity check matrix H, which is for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than $R_{\#(2d+1),1}+1$ and no greater than $r_{\#(2d+1),1}$.

[Math. 284]

When $(2\times f)-\alpha_{\#(2d+1),1,y}-1\geq 0$:

$$H_{com}[2\times(2\times f)-1][5\times((2\times f)-\alpha_{\#(2d+1),1,y}-1)+1]=1 \quad (149\text{-}1)$$

For all u being an integer no smaller than one satisfying $\{u\neq(2\times f)-\alpha_{\#(2d+1),1,y}\}$ (where y is an integer no smaller than $R_{\#(2d+1),1}+1$ and no greater than $r_{\#(2d+1),1}$);

$$H_{com}[2\times(2\times f)-1][5\times(u-1)+1]=0 \quad (149\text{-}2)$$

The following holds true for $X_w$. In the following, w is an integer no smaller than two and no greater than three.

[Math. 285]

$$H_{com}[2\times(2\times f)-1][5\times((2\times f)-0-1)+w]=1 \quad (150\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)-1][5\times((2\times f)-\alpha_{\#(2d+1),w,y}-1)+w]=1 \quad (150\text{-}2)$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$);

$$H_{com}[2\times(2\times f)-1][5\times(u-1)+w]=0 \quad (150\text{-}3)$$

The following holds true for $P_1$.

[Math. 286]

$$H_{com}[2\times(2\times f)-1][5\times((2\times f)-0-1)+4]=1 \quad (151\text{-}1)$$

For all u being an integer no smaller than one satisfying $\{u\neq(2\times f)-0\}$;

$$H_{com}[2\times(2\times f)-1][5\times(u-1)+4]=0 \quad (151\text{-}2)$$

The following holds true for $P_2$.

[Math. 287]

When $(2\times f)-\beta_{\#(2d+1),0}-1\geq 0$:

$$H_{com}[2\times(2\times f)-1][5\times((2\times f)-\beta_{\#(2d+1),0}-1)+5]=1 \quad (152\text{-}1)$$

For all u being an integer no smaller than one satisfying $\{u\neq(2\times f)-\beta_{\#(2d+1),0}\}$;

$$H_{com}[2\times(2\times f)-1][5\times(u-1)+5]=0 \quad (152\text{-}2)$$

Further, (6) when g=2×f (where f is an integer no smaller than one), when a vector for row 2×(2×f)−1 of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (132-1-2), ((2×f)−1) %2m=2d+1 holds true. Accordingly, a parity check polynomial satisfying zero of expression (132-1-2) where 2i+1=2d+1 holds true (where d is an integer no smaller than zero and no greater than m−1).

Accordingly, component $H_{com}[2\times g-1][v]=H_0[2\times(2\times f)-1][v]$ in row 2×g−1, or that is, row 2×(2×f)−1 of the parity check matrix H, which is for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than $R_{\#(2d+1),1}+1$ and no greater than $r_{\#(2d+1),1}$.

[Math. 288]

When $(2\times f)-\alpha_{\#(2d+1),1,y}-1\geq 0$;

$$H_{com}[2\times(2\times f)-1][5\times((2\times f)-\alpha_{\#(2d+1),1,y}-1)+1]=1 \quad (153\text{-}1)$$

For all u being an integer no smaller than one satisfying $\{u\neq(2\times f)-\alpha_{\#(2d+1),1,y}\}$ (where y is an integer no smaller than $R_{\#(2d+1),1}+1$ and no greater than $r_{\#(2d+1),1}$);

$$H_{com}[2\times(2\times f)-1][5\times(u-1)+1]=0 \quad (153\text{-}2)$$

The following holds true for $X_w$. In the following, w is an integer no smaller than two and no greater than three.

[Math. 289]

$$H_{com}[2\times(2\times f)-1][5\times((2\times f)-0-1)+w]=1 \quad (154\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)-1][5\times((2\times f)-\alpha_{\#(2d+1),w,1}-1)+w]=1 \quad (154\text{-}2)$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$);

$$H_{com}[2\times(2\times f)-1][5\times(u-1)+w]=0 \quad (154\text{-}3)$$

The following holds true for $P_1$.

[Math. 290]

$$H_{com}[2\times(2\times f)-1][5\times((2\times f)-0-1)+4]=1 \quad (155\text{-}1)$$

When $(2\times f)-\beta_{\#(2d+1),1}-1\geq 0$:

$$H_{com}[2\times(2\times f)-1][5\times((2\times f)-\beta_{\#(2d+1),1}-1)+4]-1 \quad (155\text{-}2)$$

For all u being an integer no smaller than one satisfying $\{u\neq(2\times f)-0$ and $u\neq(2\times f)-\beta_{\#(2d+1),1}\}$;

$$H_{com}[2\times(2\times f)-1][5\times(u-1)+4]=0 \quad (155\text{-}3)$$

The following holds true for $P_2$.

[Math. 291]

For all u being an integer no smaller than one;

$$H_{com}[2\times(2\times f)-1][5\times(u-1)+5]=0 \quad (156)$$

Further, (7) when g=2×f (where f is an integer no smaller than one), when a vector for row 2×(2×f) of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (132-2-1), ((2×f)−1) %2m=2d+1 holds true. Accordingly, a parity check polynomial satisfying zero of expression (132-2-1) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 292]

$$H_{com}[2\times(2\times f)][5\times((2\times f)-0-1)+1]=1 \quad (157\text{-}1)$$

When y is an integer no smaller than one and no greater than $R_{\#(2d+1),1}$, and $(2\times f)-\alpha_{\#(2d+1),1,y}-1\geq 0$:

$$H_{com}[2\times(2\times f)][5\times((2\times f)-\alpha_{\#(2d+1),1,y}-1)+1]=1 \quad (157\text{-}2)$$

For all u being an integer no smaller than one satisfying $\{u\neq(2\times f)-0\}$ and $\{u\neq(2\times f)-\alpha_{\#(2d+1),1,y}\}$ (where y is an integer no smaller than one and no greater than $R_{\#(2d+1),1}$);

$$H_{com}[2\times(2\times f)][5\times(u-1)+w]=0 \quad (157\text{-}3)$$

The following holds true for $X_z$. In the following, z is an integer no smaller than two and no greater than three, and y is an integer no smaller than $R_{\#(2d+1),z}+1$ and no greater than $r_{\#(2d+1),z}$.

[Math. 293]

When $(2\times f)-\alpha_{\#(2d+1),z,y}-1\geq 0$:

$$H_{com}[2\times(2\times f)][5\times((2\times f)-\alpha_{\#(2d+1),z,y}-1)+Z]=1 \quad (158\text{-}1)$$

For all u being an integer no smaller than one satisfying $\{u\neq(2\times f)-\alpha_{\#(2d+1),z,y}\}$ (where y is an integer no smaller than $R_{\#(2d+1),z}+1$ and no greater than $r_{\#(2d+1),z}$);

$$H_{com}[2\times(2\times f)][5\times(u-1)+z]=0 \quad (158\text{-}2)$$

The following holds true for $P_1$.

[Math. 294]

When $(2\times f)-\beta_{\#(2d+1),2}-1\geq 0$:

$$H_{com}[2\times(2\times f)][5\times((2\times f)-\beta_{\#(2d+1),2}-1)+4]=1 \quad (159\text{-}1)$$

For all u being an integer no smaller than one satisfying $\{u\neq(2\times f)-\beta_{\#(2d+1),2}\}$;

$$H_{com}[2\times(2\times f)][5\times(u-1)+4]=0 \quad (159\text{-}2)$$

The following holds true for $P_2$.

[Math. 295]

$$H_{com}[2\times(2\times f)][5\times((2\times f)-0-1)+5]=1 \quad (160\text{-}1)$$

For all u being an integer no smaller than one satisfying $\{u\neq(2\times f)-0\}$;

$$H_{com}[2\times(2\times f)][5\times(u-1)+5]=0 \quad (160\text{-}2)$$

Further, (8) when g=2×f (where f is an integer no smaller than one), when a vector for row 2×(2×f) of the parity check matrix H, which is for an LDPC-CC of coding rate 3/5 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (132-2-2), ((2×f)−1) %2m=2d+1 holds true. Accordingly, a parity check polynomial satisfying zero of expression (132-2-2) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 3/5 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 296]

$$H_{com}[2\times(2\times f)][5\times((2\times f)-0-1)+1]=1 \quad (161\text{-}1)$$

When y is an integer no smaller than one and no greater than $R_{\#(2d+1),1}$, and $(2\times f)-\alpha_{\#(2d+1),1,y}-1\geq 0$;

$$H_{com}[2\times(2\times f)][5\times((2\times f)-\alpha_{\#(2d+1),1,y}-1)+1]=1 \quad (161\text{-}2)$$

For all u being an integer no smaller than one satisfying $\{u\neq(2\times f)-0\}$ and $\{u\neq(2\times f)-\alpha_{\#(2d+1),1,y}\}$ (where y is an integer no smaller than one and no greater than $R_{\#(2d+1),1}$);

$$H_{com}[2\times(2\times f)][5\times(u-1)+1]=0 \quad (161\text{-}3)$$

The following holds true for $X_z$. In the following, z is an integer no smaller than two and no greater than three, and y is an integer no smaller than $R_{\#(2d+1),z}+1$ and no greater than $r_{\#(2d+1),z}$.

[Math. 297]

When $(2\times f)-\alpha_{\#(2d+1),z,y}-1\geq 0$:

$$H_{com}[2\times(2\times f)][5\times((2\times f)-\alpha_{\#(2d+1),z,y}-1)+z]=1 \quad (162\text{-}1)$$

For all u being an integer no smaller than one satisfying $\{u \neq (2\times f)-\alpha_{\#(2d+1),z,y}\}$ (Where y is an integer no smaller than $R_{\#(2d+1),z}+1$ and no greater than $r_{\#(2d+1),z}$);

$$H_{com}[2\times(2\times f)][5\times(u-1)+z]=0 \quad (162\text{-}2)$$

The following holds true for $P_1$.

[Math. 298]

For all u being an integer no smaller than one;

$$H_{com}[2\times(2\times f)][5\times(u-1)+4]=0 \quad (163)$$

The following holds true for $P_2$.

[Math. 299]

$$H_{com}[2\times(2\times f)][5\times((2\times f)-0-1)+5]=1 \quad (164\text{-}1)$$

When $(2\times f)-\beta_{\#(2d+1),3}-1\geq 0$:

$$H_{com}[2\times(2\times f)][5\times((2\times f)-\beta_{\#(2d+1),3}-1)+5]=1 \quad (164\text{-}2)$$

For all u being an integer no smaller than one satisfying $\{u\neq(2\times f)-0 \text{ and } u\neq(2\times f)-\beta_{\#(2d+1),3}\}$;

$$H_{com}[2\times(2\times f)][5\times(u-1)+5]=0 \quad (164\text{-}3)$$

As such, an LDPC-CC of coding rate 3/5 and time-varying period 2×m that is based on a parity check polynomial can be generated by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, and the code so generated achieves high error correction capability.

Embodiment D3

In the present embodiment, description is provided of a device that uses the LDPC-CC of coding rate 3/5 that is based on a parity check polynomial, description of which has been provided in embodiments D1 and D2.

As one example, description is provided of a case where the LDPC-CC of coding rate 3/5 that is based on a parity check polynomial, description of which has been provided in embodiments D1 and D2, is applied to a communication device.

FIG. 22 illustrates the structures of a transmitting device 2200 and a receiving device 2210 in the communication device pertaining to the present embodiment.

An encoder 2201 receives information to be transmitted as input, and is capable of performing various types of encoding. In particular, when receiving a specification to perform encoding by using the LDPC-CC of coding rate 3/5 that is based on a parity check polynomial, description of which has been provided in embodiments D1 and D2, the encoder 2201 performs encoding by using the LDPC-CC of coding rate 3/5 that is based on a parity check polynomial, description of which has been provided in embodiments D1 and D2, to calculate parities $P_1$ and $P_2$. Further, the encoder 2201 outputs the information to be transmitted and the parities $P_1$ and $P_2$ as a transmission sequence.

A modulator 2202 receives the transmission sequence, which includes the information to be transmitted and the parities $P_1$ and $P_2$, performs mapping based on a predetermined modulation scheme (e.g., BPSK, QPSK, 16QAM, 64QAM), and outputs a baseband signal. Further, the modulator 2202 may also receive information other than the transmission sequence, which includes the information to be transmitted and the parities $P_1$ and $P_2$, as input, perform mapping, and output a baseband signal. For example, the modulator 2202 may receive control information as input.

The transmitting device outputs a transmission signal after performing predetermined signal processing (e.g., signal processing for generation of an OFDM signal, frequency conversion, amplification) with respect to such signals (e.g., baseband signals, pilot signals). The transmitting device may transmit the transmission signal over a wireless transmission path utilizing electromagnetic waves, or over a wired transmission path utilizing a coaxial cable, a power line, an optical cable, or the like.

The transmission signal is received by the receiving device 2210 after travelling over the transmission path. A receiver 2211 receives a reception signal as input, performs predetermined signal processing (e.g., bandwidth limitation, frequency conversion, signal processing for OFDM, frequency offset estimation, signal detection, channel estimation), and outputs a baseband signal and a channel estimation signal.

A log-likelihood ratio generation section 2212 receives the baseband signal and the channel estimation signal as input (may receive other signals as input), and for example, calculates and outputs a log-likelihood ratio for each bit (may calculate and output a hard value (hard decision value)).

A decoder 2213 receives the log-likelihood ratio for each bit as input, performs belief propagation decoding (e.g., sum-product decoding, scheduled sum-product decoding (Layered BP (belief propagation) decoding), min-sum decoding, Normalized BP decoding, offset BP decoding), and outputs an estimation sequence. The decoder 2213 performs the belief propagation decoding based on the parity check matrix for the LDPC-CC of coding rate 3/5 that is based on a parity check polynomial, description of which has been provided in embodiments D1 and D2.

Figure 69:
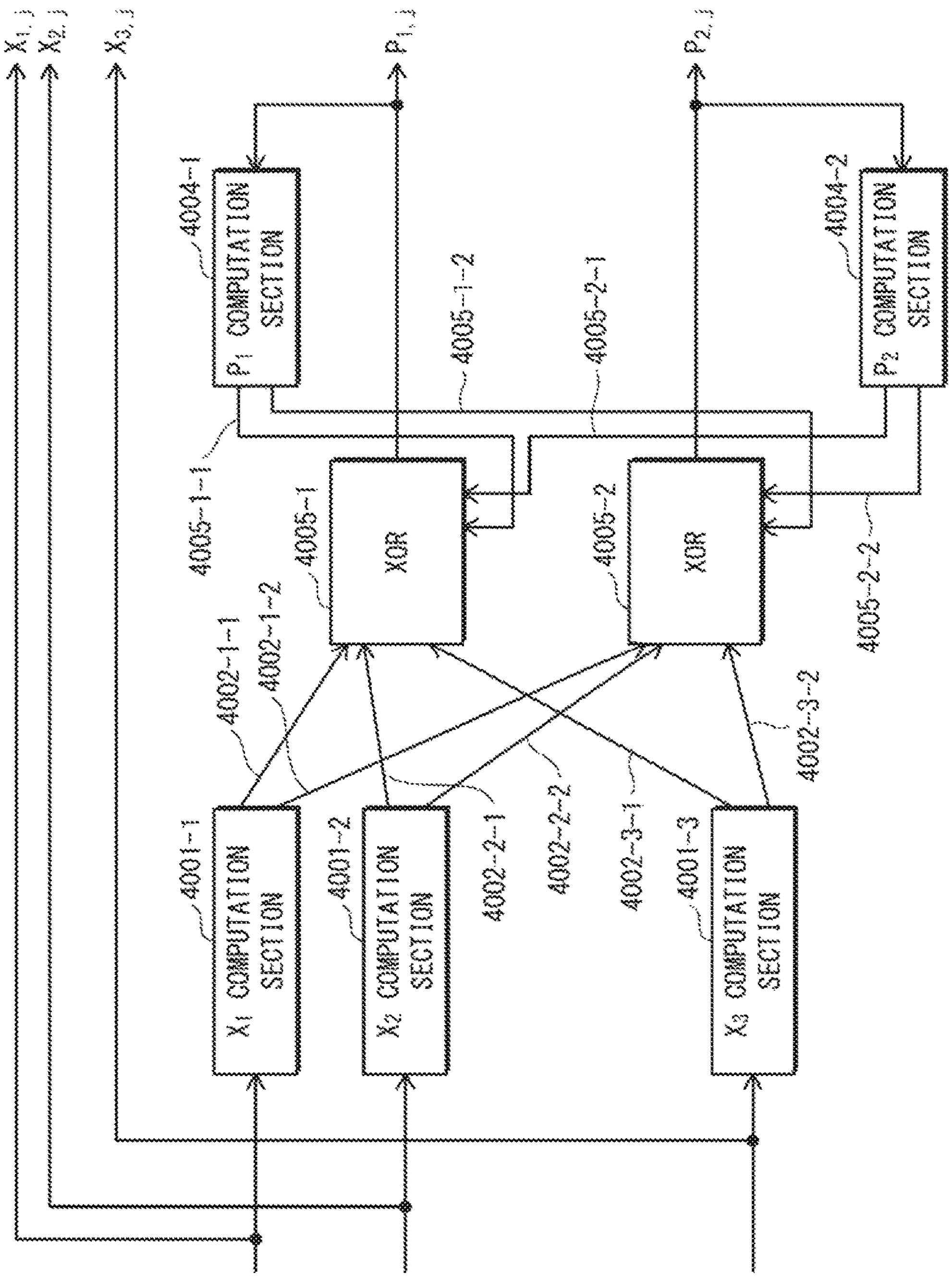
FIG. 69 shows an example of the configuration of an encoder for LDPC-CC of coding rate 3/5 that is based on a parity check polynomial.

FIG. 69 illustrates one example of the structure of an encoder for the LDPC-CC of coding rate 3/5 that is based on a parity check polynomial, description of which has been provided in embodiments D1 and D2. Description on such an encoder has been provided with reference to the encoder 2201 in FIG. 22.

In FIG. 69, an $X_z$ computation section 4001-*z* (where z is an integer no smaller than one and no greater than three) includes a plurality of shift registers that are connected in series and a calculator that performs XOR calculation on bits collected from some of the shift registers (refer to FIGS. 2 and 22).

The $X_z$ computation section 4001-*z* receives an information bit $X_{z,j}$ at time point j as input, performs the XOR calculation, and outputs bits 4002-*z*-1 and 4002-*z*-2, which are acquired through the $X_z$ calculation.

A $P_1$ computation section 4004-1 includes a plurality of shift registers that are connected in series and a calculator that that performs XOR calculation on bits collected from some of the shift registers (refer to FIGS. 2 and 22).

The $P_1$ computation section 4004-1 receives a bit $P_{1,j}$ of parity $P_1$ at time point j as input, performs the XOR calculation, and outputs bits 4005-1-1 and 4005-1-2, which are acquired through the $P_1$ calculation.

A $P_2$ computation section 4004-2 includes a plurality of shift registers that are connected in series and a calculator that that performs XOR calculation on bits collected from some of the shift registers (refer to FIGS. 2 and 22).

The $P_2$ computation section 4004-2 receives a bit $P_{2,j}$ of parity $P_2$ at time point j as input, performs the XOR calculation, and outputs bits 4005-2-1 and 4005-2-2, which are acquired through the $P_2$ calculation.

An XOR (calculator) 4005-1 receives the bits 4002-1-1 through 4002-3-1 acquired by $X_1$ calculation through $X_3$ calculation, respectively, the bit 4005-1-1 acquired by $P_1$ calculation, and the bit 4005-2-1 acquired by the $P_2$ calculation as input, performs XOR calculation, and outputs a bit $P_{1,j}$ of parity $P_1$ at time point j.

An XOR (calculator) 4005-2 receives the bits 4002-1-2 through 4002-3-2 acquired by $X_1$ calculation through $X_3$ calculation, respectively, the bit 4005-1-2 acquired by $P_1$ calculation, and the bit 4005-2-2 acquired by the $P_2$ calculation as input, performs XOR calculation, and outputs a bit $P_{2,j}$ of parity $P_2$ at time point j.

It is preferable that initial values of the shift registers of the $X_z$ computation section 4001-*z*, the $P_1$ computation section 4004-1, and the $P_2$ computation section 4004-2 illustrated in FIG. 69 be set to "0" (zero). By making such a configuration, it becomes unnecessary to transmit to the receiving device parities $P_1$ and $P_2$ before the setting of initial values.

The following describes a method of information-zero termination.

Figure 70:
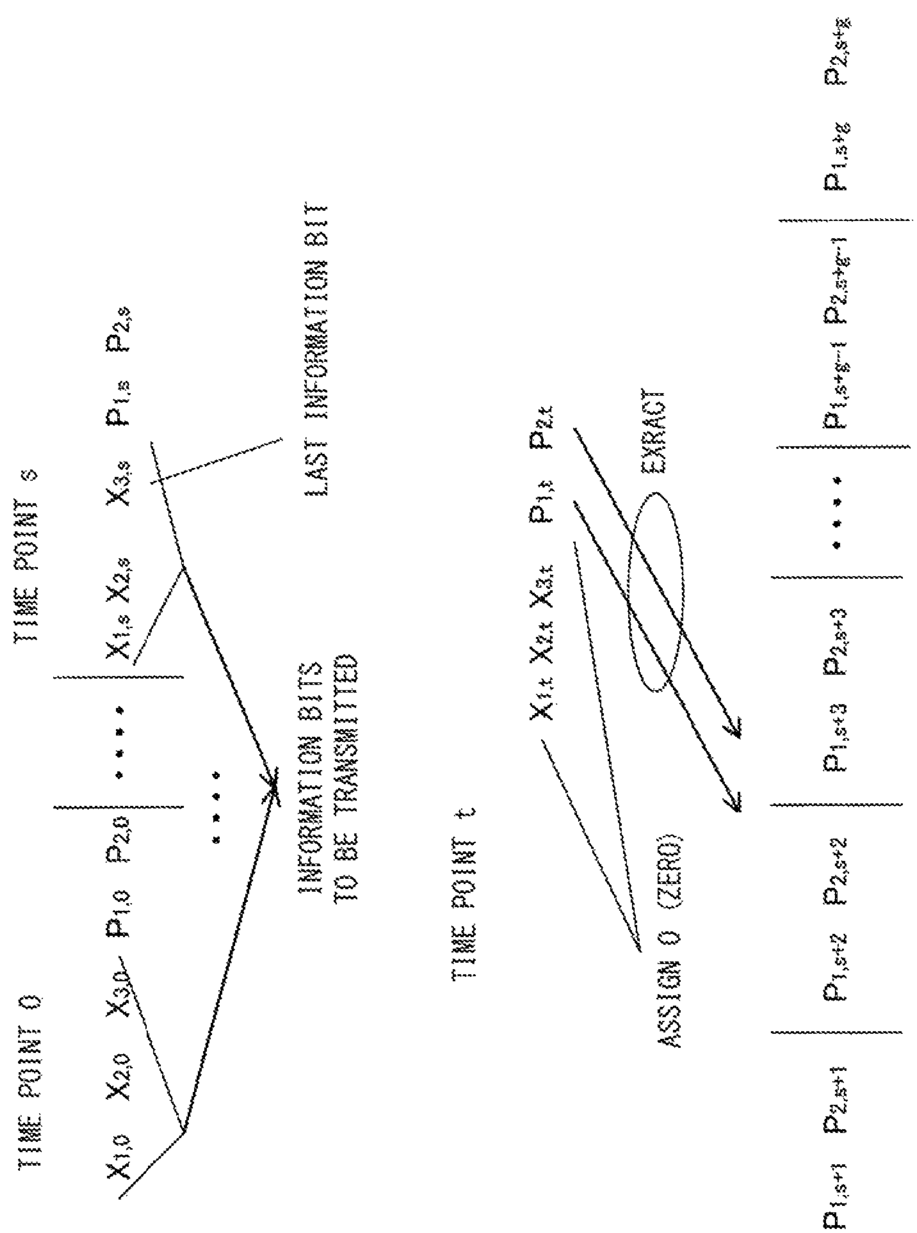
FIG. 70 is a diagram for explaining a zero-termination method.

Suppose that in FIG. 70, information $X_1$ through $X_3$ exist from time point 0, and information $X_3$ at time point s (where s is an integer no smaller than zero) is the last information bit. That is, suppose that the information to be transmitted from the transmitting device to the receiving device is information $X_{1,j}$ through $X_{3,j}$, being information $X_1$ through $X_3$ at time point j, respectively, where j is an integer no smaller than zero and no greater than s.

In such a case, the transmitting device transmits information $X_1$ through $X_3$, parity $P_1$, and parity $P_2$ from time point 0 to time point s, or that is, transmits $X_{1,j}$, $X_{2,j}$, $X_{3,j}$, $P_{1,j}$, $P_{2,j}$, where j is an integer no smaller than zero and no greater than s. (Note that $P_{1,j}$ and $P_{2,j}$ denote parity $P_1$ and parity $P_2$ at time point j, respectively.)

Further, suppose that information $X_1$ through $X_3$ from time point s+1 to time point s+g (where g is an integer no smaller than one) is "0", or that is, when denoting information $X_1$ through $X_3$ at time point t as $X_{1,t}$, $X_{2,t}$, $X_{3,t}$, respectively, $X_{1,t}=0$, $X_{2,t}=0$, $X_{3,t}=0$ hold true for t being an integer no smaller than s+1 and no greater than s+g. The transmitting device, by performing encoding, acquires parities $P_{1,t}$ and $P_{2,t}$ for t being an integer no smaller than s+1 and no greater than s+g. The transmitting device, in addition to the information and parities described above, transmits parities $P_{1,t}$ and $P_{2,t}$ for t being an integer no smaller than s+1 and no greater than s+g.

Meanwhile, the receiving device performs decoding by using log-likelihood ratios for the information and the parities transmitted by the transmitting device, and log-likelihood ratios corresponding to $X_{1,t}=0$, $X_{2,t}=0$, $X_{3,t}=0$, for t being an integer no smaller than s+1 and no greater than s+g, and thereby acquires an estimation sequence of information.

Figure 71:
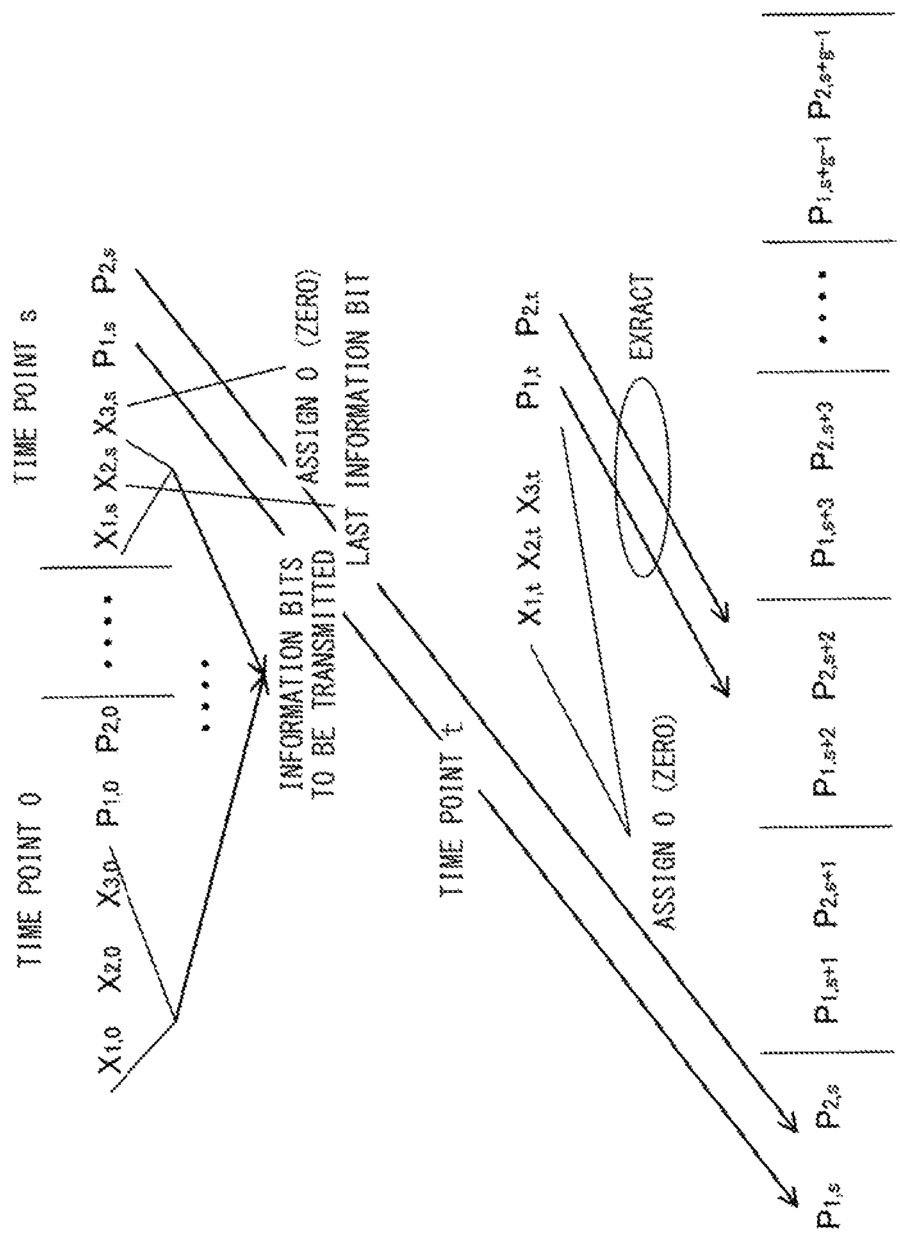
FIG. 71 is a diagram for explaining a zero-termination method.

FIG. 71 illustrates an example differing from that illustrated in FIG. 70. Suppose that information $X_1$ through $X_3$ exist from time point 0, and information $X_f$ for time point s (where s is an integer no smaller than zero) is the last information bit. Here, f is an integer no smaller than one and no greater than two. In FIG. 70, f equals 2, for example. That is, suppose that the information to be transmitted from the transmitting device to the receiving device is information $X_{i,s}$, where i is an integer no smaller than one and no greater than f, and information $X_{1,j}$, information $X_{2,j}$, and information $X_{3,j}$, being information $X_1$ through $X_3$ at time point j, respectively, where j is an integer no smaller than zero and no greater than s−1.

In such a case, the transmitting device transmits information $X_1$ through $X_3$, parity $P_1$, and parity $P_2$ from time point 0 to time point s−1, or that is, transmits $X_{1,j}$, $X_{2,j}$, $X_{3,j}$, $P_{1,j}$, $P_{2,j}$, where j is an integer no smaller than zero and no greater than s−1. (Note that $P_{1,j}$ and $P_{2,j}$ denote parity $P_1$ and parity $P_2$ at time point j, respectively.)

Further, suppose that at time point s, information $X_{i,s}$ when i is an integer no smaller than one and no greater than f, is information that the transmitting device is to transmit, and suppose that $X_{k,s}$, when k is an integer so smaller than f+1 and no greater than three, equals "0" (zero).

Further, suppose that information $X_1$ through $X_3$ from time point s+1 to time point s+g−1 (where g is an integer no smaller than two) is "0", or that is, when denoting information $X_1$ through $X_3$ at time point t as $X_{1,t}$, $X_{2,t}$, $X_{3,t}$, respectively, $X_{1,t}=0$, $X_{2,t}=0$, $X_{3,t}=0$ hold true when t is an integer no smaller than s+1 and no greater than s+g−1. The transmitting device, by performing encoding from time point s to time point s+g−1, acquires parities $P_{1,u}$ and $P_{2,u}$ for u being an integer no smaller than s and no greater than s+g−1. The transmitting device, in addition to the information and parities described above, transmits $X_{i,s}$ for i being an integer no smaller than one and no greater than f, and parities $P_{1,u}$ and $P_{2,u}$ for u being an integer no smaller than s and no greater than s+g−1.

Meanwhile, the receiving device performs decoding by using log-likelihood ratios for the information and the parities transmitted by the transmitting device, log-likelihood ratios corresponding to $X_{k,s}=0$ (where k is an integer no smaller than f+1 and no greater than three) and log-likelihood ratios corresponding to $X_{1,t}=0$, $X_{2,t}=0$, $X_{3,t}=0$ for t being an integer no smaller than s+1 and no greater than s+g−1, and thereby acquires an estimation sequence of information.

Although description is provided above taking an example where error correction coding is introduced to a communication device, the error correction coding described above is not limited to being introduced to a communication device, and for example, may be introduced to a storage medium (storage). When making such a modification, information that is to be stored to a storage medium (storage) is encoded by using the LDPC-CC of coding rate 3/5 that is based on a parity check polynomial, description of which has been provided in embodiments D1 and D2, and resultant information and parities are stored to the storage medium (storage). When making such a modification, it is preferable that information-zero termination be introduced as described above and that a data sequence as described above corresponding to a data sequence (information and parities) transmitted by the transmitting device when information-zero termination is applied be stored to the storage medium (storage).

Further, the LDPC-CC of coding rate 3/5 that is based on a parity check polynomial, description of which has been provided in embodiments D1 and D2, is applicable to any device that requires error correction coding (e.g., a memory, a hard disk).

Embodiment D4

In the present embodiment, description is provided of a method of configuring an LDPC-CC of coding rate 3/5 that uses an improved tail-biting scheme (an LDPC block code using an LDPC-CC). The LDPC-CC of coding rate 3/5 that uses an improved tail-biting scheme described in the present embodiment is based on the LDPC-CC of coding rate 3/5 that is based on a parity check polynomial, description of which has been provided in embodiments D1 and D2.

Patent Literature 2 includes explanation regarding an LDPC-CC of coding rate (n−1)/n (where n is an integer no smaller than two) that uses an improved tail-biting scheme (an LDPC block code using an LDPC-CC). However, Patent Literature 2 poses a problem for not disclosing an LDPC-CC of a coding rate not satisfying (n−1)/n that uses an improved tail-biting scheme (an LDPC block code using an LDPC-CC).

In the present embodiment, as one example of an LDPC-CC of a coding rate not satisfying (n−1)/n that uses an improved tail-biting scheme (an LDPC block code using an LDPC-CC), description is provided of a method of configuring an LDPC-CC of coding rate 3/5 that uses an improved tail-biting scheme (an LDPC block code using an LDPC-CC).

[Periodic Time-Varying LDPC-CC of Coding Rate 3/5 Using Improved Tail-Biting Scheme and Based on Parity Check Polynomial]

The following describes a periodic time-varying LDPC-CC of coding rate 3/5 that uses an improved tail-biting scheme and is based on a parity check polynomial, based on the configuration of the LDPC-CC of coding rate 3/5 and time-varying period 2m that is based on a parity check polynomial, description of which has been provided in embodiments D1 and D2.

The following describes a method of configuring an LDPC-CC of coding rate 3/5 and time-varying period 2m that is based on a parity check polynomial. Such method has already been described in embodiment D2.

First, the following parity check polynomials satisfying zero are prepared.

[Math. 300-1]

$$\left(1+\sum_{s=1}^{R_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+\left(\sum_{s=R_{\#(2i),3}+1}^{r_{\#(2i),3}} D^{\alpha\#(2i),3,s}\right)X_3(D)+P_1(D)+D^{\beta\#(2i),0}P_2(D)=$$
$$(D^{\alpha\#(2i),1,R_{\#(2i),1}}+\dots+D^{\alpha\#(2i),1,1}+1)+X_1(D)+(D^{\alpha\#(2i),2,r_{\#(2i),2}}+\dots+D^{\alpha\#(2i),2,R_{\#(2i),2}}+1)X_2(D)+(D^{\alpha\#(2i),3,r_{\#(2i),3}}+\dots+D^{\alpha\#(2i),3,R_{\#(2i),3}}+1)X_3(D)+P_1(D)+D^{\beta\#(2i),0}P_2(D)=0 \quad (165\text{-}1\text{-}1)$$

$$\left(1+\sum_{s=1}^{R_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+\left(\sum_{s=R_{\#(2i),3}+1}^{r_{\#(2i),3}} D^{\alpha\#(2i),3,s}\right)X_3(D)+P_1(D)+D^{\beta\#(2i),1}P_1(D)=$$
$$(D^{\alpha\#(2i),1}R_{\#(2i),1}+\dots+D^{\alpha\#(2i),1,1}+1)X_1(D)+(D^{\alpha\#(2i),2,r_{\#(2i),2}}+\dots+D^{\alpha\#(2i),2,R_{\#(2i),2}}+1)X_2(D)+(D^{\alpha\#(2i),3,r_{\#(2i),3}}+\dots+D^{\alpha\#(2i),3,R_{\#(2i),3}}+1)X_3(D)+P_1(D)+D^{\beta\#(2i),1}P_1(D)=0 \quad (165\text{-}1\text{-}2)$$

-continued

[Math. 300-2]

$$\left(\sum_{s=R_{\#(2i),1}+1}^{r_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(1+\sum_{s=1}^{R_{\#(2i),3}} D^{\alpha\#(2i),3,s}\right)X_3(D)+P_2(D)+D^{\beta\#(2i),2}P_1(D)=$$
$$(D^{\alpha\#(2i),1,r_{\#(2i),1}}+\dots+D^{\alpha\#(2i),1,R_{\#(2i),1}}+1)X_1(D)+(D^{\alpha\#(2i),2,R_{\#(2i),2}}+\dots+D^{\alpha\#(2i),2,1}+1)X_2(D)+(D^{\alpha\#(2i),3,R_{\#(2i),3}}+\dots+D^{\alpha\#(2i),3,1}+1)X_3(D)+P_2(D)+D^{\beta\#(2i),2}P_1(D)=0 \quad (165\text{-}2\text{-}1)$$

$$\left(\sum_{s=R_{\#(2i),1}+1}^{r_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(1+\sum_{s=1}^{R_{\#(2i),3}} D^{\alpha\#(2i),3,s}\right)X_3(D)+P_2(D)+D^{\beta\#(2i),3}P_2(D)=$$
$$(D^{\alpha\#(2i),1,r_{\#(2i),1}}+\dots+D^{\alpha\#(2i),1,R_{\#(2i),1}}+1)X_1(D)+(D^{\alpha\#(2i),2}R_{\#(2i),2}+\dots+D^{\alpha\#(2i),2,1}+1)X_2(D)+(D^{\alpha\#(2i),3,R_{\#(2i),3}}+\dots+D^{\alpha\#(2i),3,1}+1)X_3(D)+P_2(D)+D^{\beta\#(2i),3}P_2(D)=0 \quad (165\text{-}2\text{-}2)$$

In expressions (165-1-1), (165-1-2), (165-2-1), (165-2-2), i is an integer no smaller than zero and no greater than m−1 (i=0, 1, . . . , m−2, m−1).

In expressions (165-1-1), (165-1-2), (165-2-1), (165-2-2), $\alpha_{\#(2i),p,q}$ (where p is an integer no smaller than one and no greater than three, q is an integer no smaller than one and no greater than $r_{\#(2i),p}$ (where $r_{\#(2i),p}$ is a natural number)) and $\beta_{\#(2i),0}$ is a natural number, $\beta_{\#(2i),1}$ is a natural number, $\beta_{\#(2i),2}$ is an integer no smaller than zero, and $\beta_{\#(2i),3}$ is a natural number.

Further, $R_{\#(2i),p}$ is a natural number satisfying $1 \le R_{\#(2i),p} < r_{\#(2i),p}$.

Further, y is an integer no smaller than one and no greater than $r_{\#(2i),p}$, z is an integer no smaller than one and no greater than $r_{\#2i,p}$, and $\alpha_{\#(2i),p,y} \neq \alpha_{\#(2i),p,z}$ holds true for $\forall$(y, z) where y≠z. $\forall$ is a universal quantifier. (y is an integer no smaller than one and no greater than $r_{\#(2c),p,z}$ is an integer no smaller than one and no greater than $r_{\#2i,p}$, and $\alpha_{\#(2i),p,y} \neq \alpha_{\#(2i),p,z}$ holds true for all y and all z satisfying y≠z.)

Note that in the following, to simplify explanation, a parity check polynomial satisfying zero that is expressed by expression (165-1-1) or expression (165-1-2) is referred to as "#(2i); first expression" for realizing a time-varying period 2m, and a parity check polynomial satisfying zero that is expressed by expression (165-2-1) or expression (165-2-2) is referred to as "#(2i); second expression" for realizing a time-varying period 2m.

Thus, for each i, as #(2i); first expression for realizing a time-varying period 2m, a parity check polynomial satisfying zero expressed by either expression (165-1-1) or expression (165-1-2) is prepared.

That is, for i=0, a parity check polynomial satisfying zero provided by expression (165-1-1) where i=0, or a parity check polynomial satisfying zero provided by expression (165-1-2) where i=0 is prepared.

Similarly:

for i=1, a parity check polynomial satisfying zero provided by expression (165-1-1) where i=1, or a parity check polynomial satisfying zero provided by expression (165-1-2) where i=1 is prepared;

for i=2, a parity check polynomial satisfying zero provided by expression (165-1-1) where i=2, or a parity check polynomial satisfying zero provided by expression (165-1-2) where i=2 is prepared;

⋮ for i=z, a parity check polynomial satisfying zero provided by expression (165-1-1) where i=z, or a parity check polynomial satisfying zero provided by expression (165-1-2) where i=z is prepared (where z is an integer no smaller than zero and no greater than m−1); and

⋮ for i=m−1, a parity check polynomial satisfying zero provided by expression (165-1-1) where i=m−1, or a parity check polynomial satisfying zero provided by expression (165-1-2) where i=m−1 is prepared.

Similarly, for each i, as #(2i); second expression for realizing a time-varying period 2m, a parity check polynomial satisfying zero expressed by either expression (165-2-1) or expression (165-2-2) is prepared.

That is, for i=0, a parity check polynomial satisfying zero provided by expression (165-2-1) where i=0, or a parity check polynomial satisfying zero provided by expression (165-2-2) where i=0 is prepared.

Similarly:

for i=1, a parity check polynomial satisfying zero provided by expression (165-2-1) where i=1, or a parity check polynomial satisfying zero provided by expression (165-2-2) where i=1 is prepared;

for i=2, a parity check polynomial satisfying zero provided by expression (165-2-1) where i=2, or a parity check polynomial satisfying zero provided by expression (165-2-2) where i=2 is prepared;

⋮ for i=z, a parity check polynomial satisfying zero provided by expression (165-2-1) where i=z, or a parity check polynomial satisfying zero provided by expression (165-2-2) where i=z is prepared (where z is an integer no smaller than zero and no greater than m−1); and

⋮ for i=m−1, a parity check polynomial satisfying zero provided by expression (165-2-1) where i=m−1, or a parity check polynomial satisfying zero provided by expression (165-2-2) where i=m−1 is prepared.

Similarly, the following parity check polynomials satisfying zero are provided.

[Math. 301-1]

$$\begin{aligned}&\left(\sum_{s=R_{\#(2i+1),1}+1}^{r_{\#(2i+1),1}} D^{\alpha\#(2i+1),1,s}\right)X_1(D)+\left(1+\sum_{s=1}^{R_{\#(2i+1),2}} D^{\alpha\#(2i+1),2,s}\right)X_2(D)+\left(1+\sum_{s=1}^{R_{\#(2i+1),3}} D^{\alpha\#(2i+1),3,s}\right)X_3(D)+\\&P_1(D)+D^{\beta\#(2i+1),0}P_2(D)=\\&(D^{\alpha\#(2i+1),1,r_{\#(2i+1),1}}+\dots+D^{\alpha\#(2i+1),1,R_{\#(2i+1),1}}+1)X_1(D)+\\&(D^{\alpha\#(2i+1),2,R_{\#(2i+1),2}}+\dots+D^{\alpha\#(2i+1),2,1}+1)X_2(D)+\\&(D^{\alpha\#(2i+1),3,R_{\#(2i+1),3}}+\dots+D^{\alpha\#(2i+1),3,1}+1)X_3(D)+\\&P_1(D)+D^{\beta\#(2i+1),0}P_2(D)=0\end{aligned}\tag{166-1-1}$$

-continued $$\begin{aligned}&\left(\sum_{s=R_{\#(2i+1),1}+1}^{r_{\#(2i+1),1}} D^{\alpha\#(2i+1),1,s}\right)X_1(D)+\left(1+\sum_{s=1}^{R_{\#(2i+1),2}} D^{\alpha\#(2i+1),2,s}\right)X_2(D)+\left(1+\sum_{s=1}^{R_{\#(2i+1),3}} D^{\alpha\#(2i+1),3,s}\right)X_3(D)+\\&P_1(D)+D^{\beta\#(2i+1),1}P_1(D)=\\&(D^{\alpha\#(2i+1),1,r_{\#(2i+1),1}}+\dots+D^{\alpha\#(2i+1),1,R_{\#(2i+1),1}}+1)X_1(D)+\\&(D^{\alpha\#(2i+1),2,R_{\#(2i+1),2}}+\dots+D^{\alpha\#(2i+1),2,1}+1)X_2(D)+\\&(D^{\alpha\#(2i+1),3,R_{\#(2i+1),3}}+\dots+D^{\alpha\#(2i+1),3,1}+1)X_3(D)+\\&P_1(D)+D^{\beta\#(2i+1),1}P_1(D)=0\end{aligned}\tag{166-1-2}$$

[Math. 301-2]

$$\begin{aligned}&\left(1+\sum_{s=1}^{R_{\#(2i+1),1}} D^{\alpha\#(2i+1),1,s}\right)X_1(D)+\left(\sum_{s=R_{\#(2i+1),2}+1}^{r_{\#(2i+1),2}} D^{\alpha\#(2i+1),2,s}\right)X_2(D)+\left(\sum_{s=R_{\#(2i+1),3}+1}^{r_{\#(2i+1),3}} D^{\alpha\#(2i+1),3,s}\right)X_3(D)+\\&P_2(D)+D^{\beta\#(2i+1),2}P_1(D)=\\&(D^{\alpha\#(2i+1),1,R_{\#(2i+1),1}}+\dots+D^{\alpha\#(2i+1),1,1}+1)X_1(D)+\\&(D^{\alpha\#(2i+1),2,r_{\#(2i+1),2}}+\dots+D^{\alpha\#(2i+1),2,R_{\#(2i+1),2}}+1)\\&X_2(D)+\\&(D^{\alpha\#(2i+1),3,r_{\#(2i+1),3}}+\dots+D^{\alpha\#(2i+1),3,R_{\#(2i+1),3}}+1)\\&X_3(D)+P_2(D)+D^{\beta\#(2i+1),2}P_1(D)=0\end{aligned}\tag{166-2-1}$$

$$\begin{aligned}&\left(1+\sum_{s=1}^{R_{\#(2i+1),1}} D^{\alpha\#(2i+1),1,s}\right)X_1(D)+\left(\sum_{s=R_{\#(2i+1),2}+1}^{r_{\#(2i+1),2}} D^{\alpha\#(2i+1),2,s}\right)X_2(D)+\left(\sum_{s=R_{\#(2i+1),3}+1}^{r_{\#(2i+1),3}} D^{\alpha\#(2i+1),3,s}\right)X_3(D)+\\&P_2(D)+D^{\beta\#(2i+1),3}P_2(D)=\\&(D^{\alpha\#(2i+1),1,R_{\#(2i+1),1}}+\dots+D^{\alpha\#(2i+1),1,1}+1)X_1(D)+\\&(D^{\alpha\#(2i+1),2,r_{\#(2i+1),2}}+\dots+D^{\alpha\#(2i+1),2,R_{\#(2i+1),2}}+1)\\&X_2(D)+\\&(D^{\alpha\#(2i+1),3,r_{\#(2i+1),3}}+\dots+D^{\alpha\#(2i+1),3,R_{\#(2i+1),3}}+1)\\&X_3(D)+P_2(D)+D^{\beta\#(2i+1),3}P_2(D)=0\end{aligned}\tag{166-2-2}$$

In expressions (166-1-1), (166-1-2), (166-2-1), (166-2-2), i is an integer no smaller than zero and no greater than m−1 (i=0, 1, . . . , m−2, m−1).

In expressions (166-1-1), (166-1-2), (166-2-1), (166-2-2), $\alpha_{\#(2i+1),p,q}$ (where p is an integer no smaller than one and no greater than three, q is an integer no smaller than one and no greater than $r_{\#(2i+1),p}$ (where $r_{\#(2i+1),p}$ is a natural number)) and $\beta_{\#(2i+1),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, $R_{\#(2i+1),p}$ is a natural number satisfying $1 \le R_{\#(2i+1),p} < r_{\#(2i+1),p}$.

Further, y is an integer no smaller than one and no greater than $r_{\#(2i+1),p}$, z is an integer no smaller than one and no greater than $r_{\#(2i+1),p}$, and $\alpha_{\#(2i+1),p,y} \neq \alpha_{\#(2i+1),p,z}$ holds true for $^\forall(y, z)$ where $\forall$ is a universal quantifier. (y is an integer no smaller than one and no greater than $r_{\#(2i+1),p}$, z is an integer no smaller than one and no greater than $r_{\#(2i+1),p}$, and $\alpha_{\#(2i+1),p,y} \neq \alpha_{\#(2i+1),p,z}$ holds true for all y and all z satisfying y≠z.)

Note that in the following, to simplify explanation, a parity check polynomial satisfying zero that is expressed by expression (166-1-1) or expression (166-1-2) is referred to as "#(2i+1); first expression" for realizing a time-varying period 2m, and a parity check polynomial satisfying zero that is expressed by expression (166-2-1) or expression (166-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (166-1-1) or expression (166-1-2) is prepared.

That is, for i=0, a parity check polynomial satisfying zero provided by expression (166-1-1) where i=0, or a parity check polynomial satisfying zero provided by expression (166-1-2) where i=0 is prepared.

Similarly:

for i=1, a parity check polynomial satisfying zero provided by expression (166-1-1) where i=1, or a parity check polynomial satisfying zero provided by expression (166-1-2) where i=1 is prepared;

for i=2, a parity check polynomial satisfying zero provided by expression (166-1-1) where i=2, or a parity check polynomial satisfying zero provided by expression (166-1-2) where i=2 is prepared;

⋮ for i=z, a parity check polynomial satisfying zero provided by expression (166-1-1) where i=z, or a parity check polynomial satisfying zero provided by expression (166-1-2) where i=z is prepared (where z is an integer no smaller than zero and no greater than m−1); and

⋮ for i=m−1, a parity check polynomial satisfying zero provided by expression (166-1-1) where i=m−1, or a parity check polynomial satisfying zero provided by expression (166-1-2) where i=m−1 is prepared.

Similarly, for each i, as #(2i+1); second expression for realizing a time-varying period 2m, a parity check polynomial satisfying zero expressed by either expression (166-2-1) or expression (166-2-2) is prepared.

That is, for i=0, a parity check polynomial satisfying zero provided by expression (166-2-1) where i=0, or a parity check polynomial satisfying zero provided by expression (166-2-2) where i=0 is prepared.

Similarly:

for i=1, a parity check polynomial satisfying zero provided by expression (166-2-1) where i=1, or a parity check polynomial satisfying zero provided by expression (166-2-2) where i=1 is prepared;

for i=2, a parity check polynomial satisfying zero provided by expression (166-2-1) where i=2, or a parity check polynomial satisfying zero provided by expression (166-2-2) where i=2 is prepared;

⋮ for i=z, a parity check polynomial satisfying zero provided by expression (166-2-1) where i=z, or a parity check polynomial satisfying zero provided by expression (166-2-2) where i=z is prepared (where z is an integer no smaller than zero and no greater than m−1); and

⋮ for i=m−1, a parity check polynomial satisfying zero provided by expression (166-2-1) where i=m−1, or a parity check polynomial satisfying zero provided by expression (166-2-2) where i=m−1 is prepared.

As such, an LDPC-CC of coding rate 3/5 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (165-1-1) or expression (165-1-2), parity check polynomials satisfying zero provided by expression (165-2-1) or expression (165-2-2), parity check polynomials satisfying zero provided by expression (166-1-1) or expression (166-1-2), and parity check polynomials satisfying zero provided by expression (166-2-1) or expression (166-2-2).

For example, the time varying period 2×m is formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expressions (165-1-1), (165-1-2), (165-2-1), (165-2-2), (166-1-1), (166-1-2), (166-2-1), and (166-2-2) (where j is an integer no smaller than zero).

The following presumes that 2k=j%2m holds true. In the following, % means a modulo, and for example, α%6 represents a remainder after dividing α by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

Note that in the parity check polynomials satisfying zero of expressions (165-1-1), (165-1-2), (165-2-1), (165-2-2), (166-1-1), (166-1-2), (166-2-1), and (166-2-2), a sum of the number of terms of $P_1(D)$ and the number of terms of $P_2(D)$ equals two. This realizes sequentially finding parities $P_1$ and $P_2$ when applying an improved tail-biting scheme, and thus, is a significant factor realizing a reduction in computation amount (circuit scale).

The following describes the relationship between the time-varying period of the parity check polynomials satisfying zero for the LDPC-CC of coding rate 3/5 and time-varying period 2m that is based on a parity check polynomial, description of which has been provided in embodiments D1 and D2 and on which the LDPC-CC of coding rate 3/5 that uses an improved tail-biting scheme (an LDPC block code using an LDPC-CC) is based, and block size in the LDPC-CC of coding rate 3/5 that uses an improved tail-biting scheme (an LDPC block code using an LDPC-CC) proposed in the present embodiment.

Regarding this point, in order to achieve error correction capability of even higher level, a configuration is preferable where a Tanner graph formed by the LDPC-CC of coding rate 3/5 and time-varying period 2m that is based on a parity check polynomial, description of which has been provided in embodiments D1 and D2 and on which the LDPC-CC of coding rate 3/5 that uses an improved tail-biting scheme (an LDPC block code using an LDPC-CC) is based, resembles a Tanner graph of the LDPC-CC of coding rate 3/5 that uses an improved tail-biting scheme (an LDPC block code using an LDPC-CC). Thus, the following conditions are significant.

<Condition #N1>

The number of rows in a parity check matrix for the LDPC-CC of coding rate 3/5 that uses an improved tail-biting scheme (an LDPC block code using an LDPC-CC) is a multiple of 4×m.

Accordingly, the number of columns in the parity check matrix for the LDPC-CC of coding rate 3/5 that uses an improved tail-biting scheme (an LDPC block code using an LDPC-CC) is a multiple of 5×2×m. According to this condition, (for example) a log-likelihood ratio that is necessary in decoding is a log-likelihood ratio of the number of columns in the parity check matrix for the LDPC-CC of coding rate 3/5 that uses an improved tail-biting scheme (an LDPC block code using an LDPC-CC).

Note that the relationship between the LDPC-CC of coding rate 3/5 that uses an improved tail-biting scheme (an LDPC block code using an LDPC-CC) and the LDPC-CC of coding rate 3/5 and time-varying period 2m that is based on a parity check polynomial, description of which has been provided in embodiments D1 and D2 and on which the LDPC-CC of coding rate 3/5 that uses an improved tail-biting scheme (an LDPC block code using an LDPC-CC) is based, is described in detail later in the present disclosure.

Thus, when denoting the parity check matrix for the LDPC-CC of coding rate 3/5 that uses an improved tail-biting scheme (an LDPC block code using an LDPC-CC) as $H_{pro}$, the number of columns of $H_{pro}$ can be expressed as 5×2×m×z (where z is a natural number).

Accordingly, a transmission sequence (encoded sequence (codeword)) $v_s$ of block s of the LDPC-CC of coding rate 3/5 that uses an improved tail-biting scheme (an LDPC block code using an LDPC-CC) can be expressed as $v_s=(X_{s,1,1}, X_{s,2,1}, X_{s,3,1}, P^{pro}_{s,1,1}, P^{pro}_{s,2,1}, X_{s,1,2}, X_{s,2,2}, X_{s,3,2}, P^{pro}_{s,1,2}, P^{pro}_{s,2,2}, \ldots, X_{s,1,k}, X_{s,2,k}, X_{s,3,k}, P^{pro}_{s,1,k}, P^{pro}_{s,2,k}, \ldots, X_{s,1,2\times m\times z}, X_{s,2,2\times m\times z}, X_{s,3,2\times m\times z}, P^{pro}_{s,1,2\times m\times z}, P^{pro}_{s,2,2\times m\times z})^T=(\lambda_{pro,s,1}, X_{pro,s,2}, \ldots, \lambda_{pro,s,2\times m\times z-1}, \lambda_{pro,s,2\times m\times z})$ (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}v_s$ are zeroes).

$X_{s,j,k}$ (where j is an integer no smaller than one and no greater than three) is a bit of information $X_j$, $P^{pro}_{s,1,k}$ is a bit of parity $P_1$ of the LDPC-CC of coding rate 3/5 that uses an improved tail-biting scheme (an LDPC block code using an LDPC-CC), and $P^{pro}_{s,2,k}$ is a bit of parity $P_2$ of the LDPC-CC of coding rate 3/5 that uses an improved tail-biting scheme (an LDPC block code using an LDPC-CC).

Further, $\lambda_{pro,s,k}=(X_{s,1,k}, X_{s,2,k}, X_{s,3,k}, P^{pro}_{s,1,k}, P^{pro}_{s,2,k})$ holds true.

In addition, the number of rows in the parity check matrix $H_{pro}$ for the LDPC-CC of coding rate 3/5 that uses an improved tail-biting scheme (an LDPC block code using an LDPC-CC) is 4×m×z.

It has been indicated above that the LDPC-CC of coding rate 3/5 that uses an improved tail-biting scheme (an LDPC block code using an LDPC-CC) is based on the LDPC-CC of coding rate 3/5 and time-varying period 2m that is based on a parity check polynomial, description of which has been provided in embodiments D1 and D2. This is explained in the following.

First, consideration is made of a parity check matrix when configuring a periodic time-varying LDPC-CC using tail-biting by using only parity check polynomials satisfying zero for the LDPC-CC of coding rate 3/5 and time-varying period 2m that is based on a parity check polynomial, description of which has been provided in embodiments D1 and D2.

Figure 72:
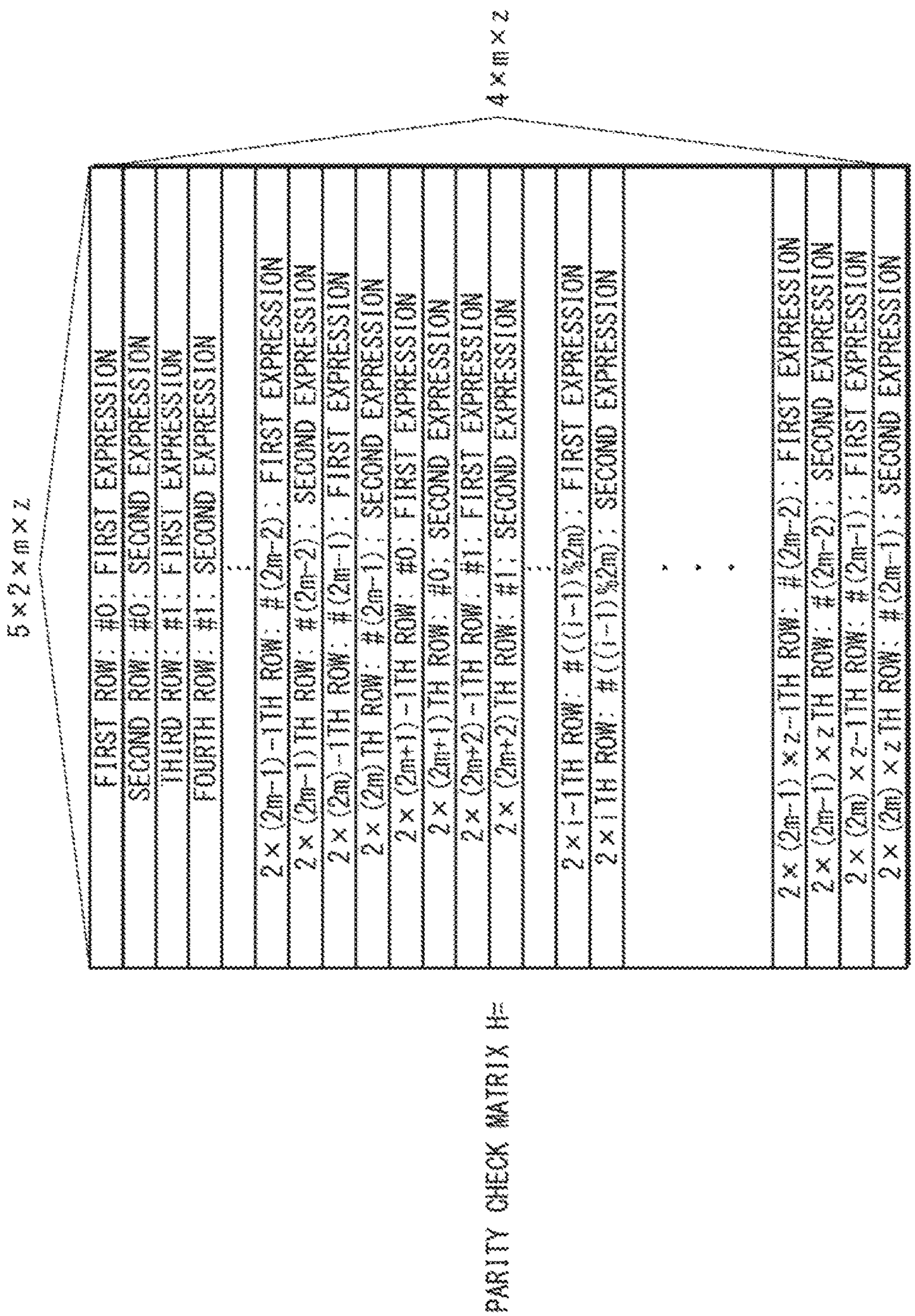
FIG. 72 shows an example of the configuration of check matrix for LDPC-CC of coding rate 3/5 when tail-biting is performed.

FIG. 72 illustrates a configuration of a parity check matrix H when configuring a periodic time-varying LDPC-CC using tail-biting by performing tail-biting by using only parity check polynomials satisfying zero for an LDPC-CC of coding rate 3/5 and time-varying period 2m.

Since Condition #N1 is satisfied in FIG. 72, the number of rows of the parity check matrix is m×z and the number of columns of the parity check matrix is 5×2×m×z.

As illustrated in FIG. 72:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression";

"a vector for the (2×i)th row of the parity check matrix H can be generated from a parity check polynomial satisfying zero of #((i−1)%2m); second expression" (where i is an integer no smaller than one and no greater than 2×m×z);

⋮

"a vector for the 2×(2m−1)×z−1th row of the parity check matrix H can be generated from a parity check polynomial satisfying zero of #(2m−2); first expression";

"a vector for the 2×(2m−1)×zth row of the parity check matrix H can be generated from a parity check polynomial satisfying zero of #(2m−2); second expression";

"a vector for the 2×(2m)×z−1th row of the parity check matrix H can be generated from a parity check polynomial satisfying zero of #(2m−1); first expression"; and "a vector for the 2×(2m)×zth row of the parity check matrix H can be generated from a parity check polynomial satisfying zero of #(2m−1); second expression".

To prepare for the explanation to be provided in the following, a mathematical expression is provided of the parity check matrix H in FIG. 72, which is a parity check matrix when configuring a periodic time-varying LDPC-CC by performing tail-biting by using only parity check polynomials satisfying zero for the LDPC-CC of coding rate 3/5 and time-varying period 2m that is based on a parity check polynomial, description of which is provided in embodiments D1 and D2. When denoting a vector having one row and 5×2×m×z columns in row k of the parity check matrix H as $h_k$, the parity check matrix H in FIG. 72 is expressed as follows.

[Math. 302]

$$H = \begin{pmatrix} h_1 \\ h_2 \\ \vdots \\ h_{2\times(2m)\times z-1} \\ h_{2\times(2m)\times z} \end{pmatrix} \quad (167)$$

The following describes a parity check matrix for the LDPC-CC of coding rate 3/5 that uses an improved tail-biting scheme (an LDPC block code using an LDPC-CC).

Figure 73:
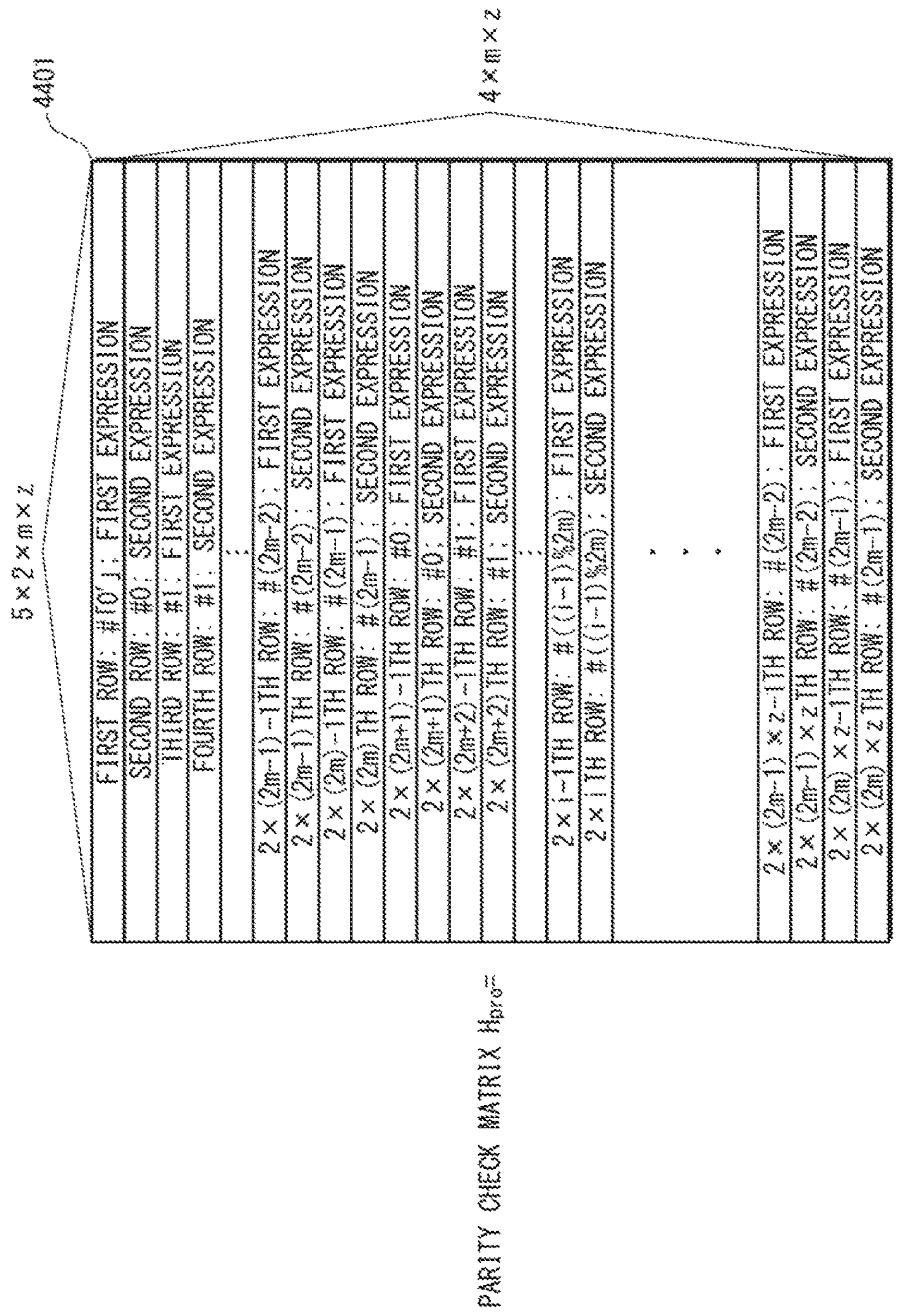
FIG. 73 shows an example of the configuration of check matrix for LDPC-CC of coding rate 3/5 when improved tail-biting is performed.

FIG. 73 illustrates one example of a configuration of a parity check matrix $H_{pro}$ for the LDPC-CC of coding rate 3/5 that uses an improved tail-biting scheme (an LDPC block code using an LDPC-CC).

The parity check matrix $H_{pro}$ for the LDPC-CC of coding rate 3/5 that uses an improved tail-biting scheme (an LDPC block code using an LDPC-CC) satisfies Condition #N1.

When denoting a vector having one row and 5×2×m×z columns in row k of the parity check matrix $H_{pro}$ in FIG. 73, which is for the LDPC-CC of coding rate 3/5 that uses an improved tail-biting scheme (an LDPC block code using an LDPC-CC), as $g_k$, the parity check matrix $H_{pro}$ in FIG. 73 is expressed as follows.

[Math. 303]

$$H_{pro} = \begin{pmatrix} g_1 \\ g_2 \\ \vdots \\ g_{2\times(2m)\times z-1} \\ g_{2\times(2m)\times z} \end{pmatrix} \quad (168)$$

A transmission sequence (encoded sequence (codeword)) $v_s$ of block s of the LDPC-CC of coding rate 3/5 that uses an improved tail-biting scheme (an LDPC block code using an LDPC-CC) can be expressed as $v_s=(X_{s,1,1}, X_{s,2,1}, X_{s,3,1}, P^{pro}_{s,1,1}, P^{pro}_{s,2,1}, X_{s,1,2}, X_{s,2,2}, X_{s,3,2}, P^{pro}_{s,1,2}, P^{pro}_{s,2,2}, \ldots, X_{s,1,k}, X_{s,2,k}, X_{s,3,k}, P^{pro}_{s,1,k}, P^{pro}_{s,2,k}, \ldots, X_{s,1,2\times m\times z}, X_{s,2,2\times m\times z}, X_{s,3,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}v_s$ are zeroes).

$X_{s,j,k}$ (where j is an integer no smaller than one and no greater than three) is a bit of information $X_j$, $P^{pro}_{s,1,k}$ is a bit of parity $P_1$ of the LDPC-CC of coding rate 3/5 that uses an improved tail-biting scheme (an LDPC block code using an LDPC-CC), and $P^{pro}_{s,2,k}$ is a bit of parity $P_2$ of the LDPC-CC of coding rate 3/5 that uses an improved tail-biting scheme (an LDPC block code using an LDPC-CC).

In the parity check matrix $H_{pro}$ in FIG. 73, which illustrates one example of a configuration of a parity check matrix $H_{pro}$ for the LDPC-CC of coding rate 3/5 that uses an improved tail-biting scheme (an LDPC block code using an LDPC-CC), rows other than row one, or that is, rows between row two to row 2×(2×m)×z in the parity check matrix $H_{pro}$ in FIG. 73, have the same configuration as rows between row two and row 2×(2×m)×z in the parity check matrix H in FIG. 72 (refer to FIGS. 72 and 73). Accordingly, FIG. 73 includes an indication of #0'; first expression at 4401 in the first row. (This point is explained later in the present disclosure.) Accordingly, the following relational expression holds true based on expressions 167 and 168.

[Math. 304]

For all i no smaller than two and no greater than 2×(2×m)×z, the following holds true:

$$g_i=h_i \quad (169)$$

Further, the following holds true when i=1.

[Math. 305]

$$g_1 \neq h_1 \quad (170)$$

Accordingly, the parity check matrix $H_{pro}$ for the LDPC-CC of coding rate 3/5 that uses an improved tail-biting scheme (an LDPC block code using an LDPC-CC) can be expressed as follows.

[Math. 306]

$$H_{pro} = \begin{pmatrix} g_1 \\ h_2 \\ \vdots \\ h_{2\times(2m)\times z-1} \\ h_{2\times(2m)\times z} \end{pmatrix} \quad (171)$$

In expression 171, expression 170 holds true.

Next, explanation is provided of a method of configuring $g_1$ in expression 171 so that parities can be found sequentially and high error correction capability can be achieved.

One example of a method of configuring $g_1$ in expression 171, so that parities can be found sequentially and high error correction capability can be achieved, is using a parity check polynomial satisfying zero of #0; first expression of the LDPC-CC of coding rate 3/5 that uses an improved tail-biting scheme (an LDPC block code using an LDPC-CC), which serves as the basis.

Since $g_1$ is row one of the parity check matrix $H_{pro}$ for the LDPC-CC of coding rate 3/5 that uses an improved tail-biting scheme (an LDPC block code using an LDPC-CC), $g_1$ is generated from a parity check polynomial satisfying zero that is obtained by transforming a parity check polynomial satisfying zero of #0; first expression. As described above, a parity check polynomial satisfying zero of #0; first expression is expressed by either expression (172-1-1) or expression (172-1-2).

[Math. 307]

$$\left(1+\sum_{s=1}^{R_{\#(0),1}} D^{\alpha\#(0),1,s}\right)X_1(D)+\left(\sum_{s=R_{\#(0),2}+1}^{r_{\#(0),2}} D^{\alpha\#(0),2,s}\right)X_2(D)+\left(\sum_{s=R_{\#(0),3}+1}^{r_{\#(0),3}} D^{\alpha\#(0),3,s}\right)X_3(D)+P_1(D)+D^{\beta\#(0),0}P_2(D)=$$
$$(D^{\alpha\#(0),1,R_{\#(0),1}}+\dots+D^{\alpha\#(0),1,1}+1)X_1(D)+(D^{\alpha\#(0),2,r_{\#(0),2}}+\dots+D^{\alpha\#(0),2,R_{\#(0),2}}+1)X_2(D)+(D^{\alpha\#(0),3,r_{\#(0),3}}+\dots+D^{\alpha\#(0),3,R_{\#(0),3}}+1)X_3(D)+P_1(D)+D^{\beta\#(0),0}P_2(D)=0 \tag{172-1-1}$$

$$\left(1+\sum_{s=1}^{R_{\#(0),1}} D^{\alpha\#(0),1,s}\right)X_1(D)+\left(\sum_{s=R_{\#(0),2}+1}^{r_{\#(0),2}} D^{\alpha\#(0),2,s}\right)X_2(D)+\left(\sum_{s=R_{\#(0),3}+1}^{r_{\#(0),3}} D^{\alpha\#(0),3,s}\right)X_3(D)+P_1(D)+D^{\beta\#(0),1}P_1(D)=$$
$$(D^{\alpha\#(0),1,R_{\#(0),1}}+\dots+D^{\alpha\#(0),1,1}+1)X_1(D)+(D^{\alpha\#(0),2,r_{\#(0),2}}+\dots+D^{\alpha\#(0),2,R_{\#(0),2}}+1)X_2(D)+(D^{\alpha\#(0),3,r_{\#(0),3}}+\dots+D^{\alpha\#(0),3,R_{\#(0),3}}+1)X_3(D)+P_1(D)+D^{\beta\#(0),1}P_1(D)=0 \tag{172-1-2}$$

As one example of a parity check polynomial satisfying zero for generating vector $g_1$ in row one of the parity check matrix $H_{pro}$ for the LDPC-CC of coding rate 3/5 that uses an improved tail-biting scheme (an LDPC block code using an LDPC-CC), a parity check polynomial satisfying zero of #0; first expression is expressed as follows, for either expression (172-1-1) or expression (172-1-2).

[Math. 308]

$$\left(1+\sum_{s=1}^{R_{\#(0),1}} D^{\alpha\#(0),1,s}\right)X_1(D)+\left(\sum_{s=R_{\#(0),2}+1}^{r_{\#(0),2}} D^{\alpha\#(0),2,s}\right)X_2(D)+\left(\sum_{s=R_{\#(0),3}+1}^{r_{\#(0),3}} D^{\alpha\#(0),3,s}\right)X_3(D)+P_1(D)=$$
-continued
$$(D^{\alpha\#(0),1,R_{\#(0),1}}+\dots+D^{\alpha\#(0),1,1}+1)X_1(D)+(D^{\alpha\#(0),2,r_{\#(0),2}}+\dots+D^{\alpha\#(0),2,R_{\#(0),2}}+1)X_2(D)+(D^{\alpha\#(0),3,r_{\#(0),3}}+\dots+D^{\alpha\#(0),3,R_{\#(0),3}}+1)X_3(D)+P_1(D)=0 \tag{173}$$

Accordingly, vector $g_1$ is a vector having one row and 5×2×m×z columns that is obtained by performing tail-biting with respect to expression 173.

Note that in the following, a parity check polynomial that satisfies zero provided by expression 173 is referred to as #0'; first expression.

Accordingly, row one of the parity check matrix $H_{pro}$ for the LDPC-CC of coding rate 3/5 that uses an improved tail-biting scheme (an LDPC block code using an LDPC-CC) can be obtained by transforming #0'; first expression of expression 173 (that is, a vector $g_1$ corresponding to one row and 5×2×m×z columns can be obtained).

A transmission sequence (encoded sequence (codeword)) $v_s$ of block s of the LDPC-CC of coding rate 3/5 that uses an improved tail-biting scheme (an LDPC block code using an LDPC-CC) is $v_s=(X_{s,1,1}, X_{s,2,1}, X_{s,3,1}, P^{pro}_{s,1,1}, P^{pro}_{s,2,1}, X_{s,1,2}, X_{s,2,2}, X_{s,3,2}, P^{pro}_{s,1,2}, P^{pro}_{s,2,2}, \dots, X_{s,1,k}, X_{s,2,k}, X_{s,3,k}, P^{pro}_{s,1,k}, P^{pro}_{s,2,k}, \dots, X_{s,1,2\times m\times z}, X_{s,2,2\times m\times z}, X_{s,3,2\times m\times z}, P^{pro}_{s,1,2\times m\times z}, P^{pro}_{s,2,2\times m\times z})^T=(\lambda_{pro,s,1}, \lambda_{pro,s,2}, \dots, \lambda_{pro,s,2\times m\times z-1}, \lambda_{pro,s,2\times m\times z})^T$, and the number of parity check polynomials satisfying zero necessary for obtaining this transmission sequence is 2×(2×m)×z.

Here, when arranging such 2×(2×m)×z number of parity check polynomials satisfying zero in order, a parity check polynomial satisfying zero appearing eth is referred to in the following as an "eth parity check polynomial satisfying zero" (where e is an integer no smaller than zero and no greater than 2×(2×m)×z−1).

As such, the parity check polynomials satisfying zero are arranged in the following order:

zeroth: zeroth parity check polynomial satisfying zero;
first: first parity check polynomial satisfying zero;
second: second parity check polynomial satisfying zero;
⋮
eth: eth parity check polynomial satisfying zero;
⋮
2×(2×m)×z−2th: 2×(2×m)×z−2th parity check polynomial satisfying zero; and
2×(2×m)×z−1th: 2×(2×m)×z−1th parity check polynomial satisfying zero.

Accordingly, the transmission sequence (encoded sequence (codeword)) $v_s$ of block s of the LDPC-CC of coding rate 3/5 that uses an improved tail-biting scheme (an LDPC block code using an LDPC-CC) is obtained. (As can be seen from description provided above, when expressing the parity check matrix $H_{pro}$ for the LDPC-CC of coding rate 3/5 that uses an improved tail-biting scheme (an LDPC block code using an LDPC-CC) as provided in expression 168, a vector composed of row e+1 of the parity check matrix $H_{pro}$ corresponds to the eth parity check polynomial satisfying zero.)

Accordingly, in the LDPC-CC of coding rate 3/5 that uses an improved tail-biting scheme (an LDPC block code using an LDPC-CC):

the 0th parity check polynomial satisfying zero is a parity check polynomial satisfying zero of #0'; first expression provided by expression 173;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 173;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

As description has been provided above, the LDPC-CC of coding rate 3/5 that uses an improved tail-biting scheme (an LDPC block code using an LDPC-CC), at the same time as achieving high error correction capability, enables finding multiple parities sequentially, and therefore, achieves an advantageous effect of reducing circuit scale of an encoder.

In the following, explanation is provided of what is meant by "finding parities sequentially".

In the example described above, since bits of information $X_1$ through $X_3$ are pre-acquired, $P^{pro}_{s,1,1}$ can be calculated by using the 0th parity check polynomial satisfying zero of the LDPC-CC of coding rate 3/5 that uses an improved tail-biting scheme (an LDPC block code using an LDPC-CC), or that is, by using the parity check polynomial satisfying zero of #0'; first expression provided by expression 173.

Then, from the bits of information $X_1$ through $X_3$ and $P^{pro}_{s,1,1}$, another parity (denoted as $P_{c=1}$) can be calculated by using another parity check polynomial satisfying zero.

Further, from the bits of information $X_1$ through $X_3$ and $P_{c=1}$, another parity (denoted as $P_{c=2}$) can be calculated by using another parity check polynomial satisfying zero.

By repeating such operation, from the bits of information $X_1$ through $X_3$ and $P_{c=h}$, another parity (denoted as $P_{c=h+1}$) can be calculated by using a given parity check polynomial satisfying zero.

This is referred to as "finding parities sequentially", and when parities can be found sequentially, multiple parities can be obtained without calculation of complex simultaneous equations, whereby an advantageous effect is achieved of reducing circuit scale (computation amount) of an encoder.

Next, explanation is provided of configurations and operations of an encoder and a decoder for the LDPC-CC of coding rate 3/5 that uses an improved tail-biting scheme (an LDPC block code using an LDPC-CC).

In the following, one example case is considered where the LDPC-CC of coding rate 3/5 that uses an improved tail-biting scheme (an LDPC block code using an LDPC-CC) is used in a communication system. When applying the LDPC-CC of coding rate 3/5 that uses an improved tail-biting scheme (an LDPC block code using an LDPC-CC) to a communication system, the encoder and the decoder for the LDPC-CC of coding rate 3/5 that uses an improved tail-biting scheme (an LDPC block code using an LDPC-CC) are characterized for each being configured and each operating based on the parity check matrix $H_{pro}$ for the LDPC-CC of coding rate 3/5 that uses an improved tail-biting scheme (an LDPC block code using an LDPC-CC) and based on the relationship $H_{pro}v_s=0$.

The following provides explanation while referring to FIG. 25, which is an overall diagram of a communication system. An encoder 2511 of a transmitting device 2501 receives an information sequence of block s ($X_{s,1,1}$, $X_{s,2,1}$, $X_{s,3,1}$, $X_{s,1,2}$, $X_{s,2,2}$, $X_{s,3,2}$, . . . , $X_{s,1,k}$, $X_{s,2,k}$, $X_{s,3,k}$, . . . , $X_{s,1,2\times m\times z}$, $X_{s,2,2\times m\times z}$, $X_{s,3,2\times m\times z}$) as input. The encoder 2511 performs encoding based on the parity check matrix $H_{pro}$ for the LDPC-CC of coding rate 3/5 that uses an improved tail-biting scheme (an LDPC block code using an LDPC-CC) and based on the relationship $H_{pro}v_s=0$. The encoder 2511 generates a transmission sequence (encoded sequence (codeword)) $v_s$ of block s of the LDPC-CC of coding rate 3/5 that uses an improved tail-biting scheme (an LDPC block code using an LDPC-CC), denoted as $v_s=(X_{s,1,1}, X_{s,2,1}, X_{s,3,1}, P^{pro}_{s,1,1}, P^{pro}_{s,2,1}, X_{s,1,2}, X_{s,2,2}, X_{s,3,2}, P^{pro}_{s,1,2}, P^{pro}_{s,2,2}, \ldots, X_{s,1,k}, X_{s,2,k}, X_{s,3,k}, P^{pro}_{s,1,k}, P^{pro}_{s,2,k}, \ldots, X_{s,1,2\times m\times z}, X_{s,2,2\times m\times z}, X_{s,3,2\times m\times z}, P^{pro}_{s,1,2\times m\times z}, P^{pro}_{s,2,2\times m\times z})^T$, and outputs the transmission sequence $v_s$. As already described above, the LDPC-CC of coding rate 3/5 that uses an improved tail-biting scheme (an LDPC block code using an LDPC-CC) is characterized for enabling parities to be found sequentially.

A decoder 2523 of a receiving device 2520 in FIG. 25 receives, as input, a log-likelihood ratio of each bit of, for example, the transmission sequence $v_s=(X_{s,1,1}, X_{s,2,1}, X_{s,3,1}, P^{pro}_{s,1,1}, P^{pro}_{s,2,1}, X_{s,1,2}, X_{s,2,2}, X_{s,3,2}, P^{pro}_{s,1,2}, P^{pro}_{s,2,2}, \ldots, X_{s,1,k}, X_{s,2,k}, X_{s,3,k}, P^{pro}_{s,1,k}, P^{pro}_{s,2,k}, \ldots, X_{s,1,2\times m\times z}, X_{s,2,2\times m\times z}, X_{s,3,2\times m\times z}, P^{pro}_{s,1,2\times m\times z},$ $P^{pro}_{s,2,2\times m\times z})^T$. The log-likelihood ratios are output from a log-likelihood ratio generator 2522. The decoder 2523 performs decoding for an LDPC code according to the parity check matrix $H_{pro}$ for the LDPC-CC of coding rate 3/5 that uses an improved tail-biting scheme (an LDPC block code using an LDPC-CC). For example, the decoding may be decoding disclosed in Non-Patent Literature 4, Non-Patent Literature 6, Non-Patent Literature 7, Non-Patent Literature 8, etc., i.e., simple BP decoding such as min-sum decoding, offset BP decoding, or Normalized BP decoding, or Belief Propagation (BP) decoding in which scheduling is performed with respect to the row operations (Horizontal operations) and the column operations (Vertical operations) such as Shuffled BP decoding or Layered BP decoding. The decoding may also be decoding such as bit-flipping decoding disclosed in Non-Patent Literature 17, for example. The decoder 2523 obtains an estimation transmission sequence (estimation encoded sequence) (reception sequence) of block s through the decoding, and outputs the estimation transmission sequence.

In the above, explanation is provided on operations of the encoder and the decoder in a communication system as one example. Alternatively, the encoder and the decoder may be used in technical fields related to storages, memories, etc.

The following describes a specific example of a configuration of a parity check matrix for the LDPC-CC of coding rate 3/5 that uses an improved tail-biting scheme (an LDPC block code using an LDPC-CC).

When denoting the parity check matrix for the LDPC-CC of coding rate 3/5 that uses an improved tail-biting scheme (an LDPC block code using an LDPC-CC) as $H_{pro}$ as described above, the number of columns of $H_{pro}$ can be expressed as 5×2×m×z (where z is a natural number). (Note that m denotes a time-varying period of the LDPC-CC of coding rate 3/5 that is based on a parity check polynomial, which serves as the basis.)

Accordingly, as already described above, a transmission sequence (encoded sequence (codeword)) $v_s$ composed of a 5×2×m×z number of bits in block s of the LDPC-CC of coding rate 3/5 that uses an improved tail-biting scheme (an LDPC block code using an LDPC-CC) can be expressed as $v_s=(X_{s,1,1}, X_{s,2,1}, X_{s,3,1}, P^{pro}_{s,1,1}, P^{pro}_{s,2,1}, X_{s,1,2}, X_{s,2,2}, X_{s,3,2}, P^{pro}_{s,1,2}, P^{pro}_{s,2,2}, \ldots, X_{s,1,k}, X_{s,2,k}, X_{s,3,k}, P^{pro}_{s,1,k}, P^{pro}_{s,2,k}, \ldots, X_{s,1,2\times m\times z}, X_{s,2,2\times m\times z}, X_{s,3,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}v_s$ are zeroes).

$X_{s,j,k}$ (where j is an integer no smaller than one and no greater than three) is a bit of information $X_j$, $P^{pro}_{s,1,k}$ is a bit of parity $P_1$ of the LDPC-CC of coding rate 3/5 that uses an improved tail-biting scheme (an LDPC block code using an LDPC-CC), and $P^{pro}_{s,2,k}$ is a bit of parity $P_2$ of the LDPC-CC of coding rate 3/5 that uses an improved tail-biting scheme (an LDPC block code using an LDPC-CC).

Further, $\lambda_{pro,s,k}=(X_{s,1,k}, X_{s,2,k}, X_{s,3,k}, P^{pro}_{s,1,k}, P^{pro}_{s,2,k})$ holds true.

In addition, the number of rows in the parity check matrix $H_{pro}$ for the LDPC-CC of coding rate 3/5 that uses an improved tail-biting scheme (an LDPC block code using an LDPC-CC) is 4×m×z.

Note that the method of configuring parity check polynomials satisfying zero for the LDPC-CC of coding rate 3/5 that uses an improved tail-biting scheme (an LDPC block code using an LDPC-CC) has already been described above.

In the above, description has been provided of a parity check matrix $H_{pro}$ for the LDPC-CC of coding rate 3/5 that uses an improved tail-biting scheme (an LDPC block code using an LDPC-CC), whose transmission sequence (encoded sequence (codeword)) $v_s$ of block s is $v_s=(X_{s,1,1}, X_{s,2,1}, X_{s,3,1}, P^{pro}_{s,1,1}, P^{pro}_{s,2,1}, X_{s,1,2}, X_{s,2,2}, X_{s,3,2}, P^{pro}_{s,1,2}, P^{pro}_{s,2,2}, \ldots, X_{s,1,k}, X_{s,2,k}, X_{s,3,k}, P^{pro}_{s,1,k}, P^{pro}_{s,2,k}, \ldots, X_{s,1,2\times m\times z}, X_{s,2,2\times m\times z}, X_{s,3,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ and for which $H_{pro}v_s=0$ holds true (here, $H_{pro}v_s=0$ indicates that all elements of the vector $H_{pro}v_s$ are zeroes). The following provides description of a configuration of a parity check matrix $H_{pro\_m}$ for the LDPC-CC of coding rate 3/5 that uses an improved tail-biting scheme (an LDPC block code using an LDPC-CC), for which $H_{pro\_m}u_s=0$ holds true (here, $H_{pro\_m}u_s=0$ indicates that all elements of the vector $H_{pro\_m}u_s$ are zeroes) when expressing a transmission sequence (encoded sequence (codeword)) $u_s$ of block s as $u_s=(X_{s,1,1}, X_{s,1,2}, \ldots, X_{s,1,2\times m\times z-1}, X_{s,1,2\times m\times z}, X_{s,2,1}, X_{s,2,2}, \ldots, X_{s,2,2\times m\times z-1}, X_{s,2,2\times m\times z}, X_{s,3,1}, X_{s,3,2}, \ldots, X_{s,3,2\times m\times z-1}, X_{s,3,2\times m\times z}, P^{pro}_{s,1,1}, P^{pro}_{s,1,2}, \ldots, P^{pro}_{s,1,2\times m\times z-1}, P^{pro}_{s,1,2\times m\times z}, P^{pro}_{s,2,1}, P^{pro}_{s,2,2}, \ldots, P^{pro}_{s,2,2\times m\times z-1}, P^{pro}_{s,2,2\times m\times z})^T(\Lambda_{X1,s}, \Lambda_{X2,s}, \Lambda_{X3,s}, \Lambda_{pro1,s}, \Lambda_{pro2,s})^T$.

Note that $\Lambda_{Xf,s}$ (where f is an integer no smaller than one and no greater than three) satisfies $\Lambda_{Xf,s}=(X_{s,f,1}, X_{s,f,2}, X_{s,f,3}, \ldots, X_{s,f,2\times m\times z-2}, X_{s,f,2\times m\times z-1}, X_{s,f,2\times m\times z})$ ($\Lambda_{Xf,s}$ is a vector having one row and 2×m×z columns), and $\Lambda_{pro1,s}$ and $\Lambda_{pro2,s}$ satisfy $\Lambda_{pro1,s}=(P^{pro}_{s,1,1}, P^{pro}_{s,1,2}, \ldots, P^{pro}_{s,1,2\times m\times z-1}, P^{pro}_{s,1,2\times m\times z})$, and $\Lambda_{pro2,s}=(P^{pro}_{s,2,1}, P^{pro}_{s,2,2}, \ldots, P^{pro}_{s,2,2\times m\times z-1}, P^{pro}_{s,2,2\times m\times z})$, respectively ($\Lambda_{pro1,s}$ and $\Lambda_{pro2,s}$ are both vectors having one row and 2×m×z columns).

Figure 74:
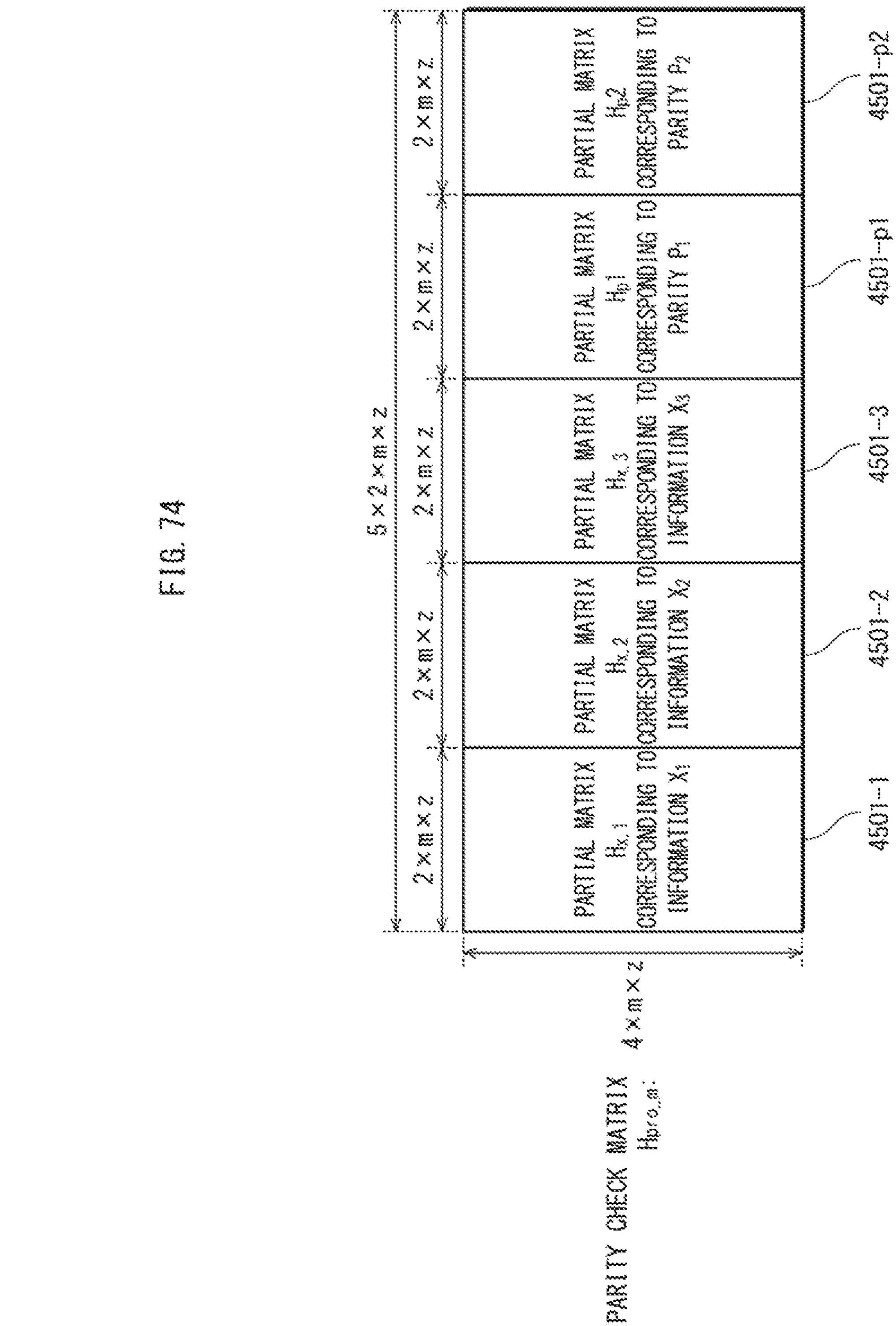
FIG. 74 shows an example of the configuration of check matrix for LDPC-CC of coding rate 3/5 when improved tail-biting is performed.

Here, the number of bits of information $X_1$ included in one block is 2×m×z, the number of bits of information $X_2$ included in one block is 2×m×z, the number of bits of information $X_3$ included in one block is 2×m×z, the number of bits of parity bits $P_1$ included in one block is 2×m×z, and the number of bits of parity bits $P_2$ included in one block is 2×m×z. Accordingly, the parity check matrix $H_{pro\_m}$ for the LDPC-CC of coding rate 3/5 that uses an improved tail-biting scheme (an LDPC block code using an LDPC-CC) can be expressed as $H_{pro\_m}[H_{x,1}, H_{x,2}, H_{x,3}, H_{p1}, H_{p2}]$, as illustrated in FIG. 74. Since a transmission sequence (encoded sequence (codeword)) $u_s$ of block s is $u_s=(X_{s,1,1}, X_{s,1,2}, \ldots, X_{s,1,2\times m\times z-1}, X_{s,1,2\times m\times z}, X_{s,2,1}, X_{s,2,2}, \ldots, X_{s,2,2\times m\times z-1}, X_{s,2,2\times m\times z}, X_{s,3,1}, X_{s,3,2}, \ldots, X_{s,3,2\times m\times z-1}, X_{s,3,2\times m\times z}, P^{pro}_{s,1,1}, P^{pro}_{s,1,2}, \ldots, P^{pro}_{s,1,2\times m\times z-1}, P^{pro}_{s,1,2\times m\times z}, P^{pro}_{s,2,1}, P^{pro}_{s,2,2}, \ldots, P^{pro}_{s,2,2\times m\times z-1}, P^{pro}_{s,2,2\times m\times z})^T(\Lambda_{X1,s}, \Lambda_{X2,s}, \Lambda_{X3,s}, \Lambda_{pro1,s}, \Lambda_{pro2,s})^T$, $H_{x,1}$ is a partial matrix related to information $X_1$, $H_{x,2}$ is a partial matrix related to information $X_2$, $H_{x,3}$ is a partial matrix related to information $X_3$, $H_{p1}$ is a partial matrix related to parity $P_1$, and $H_{p2}$ is a partial matrix related to parity $P_2$. As illustrated in FIG. 74, the parity check matrix $H_{pro\_m}$ has 4×m×z rows and 5×2×m×z columns, the partial matrix $H_{x,1}$ related to information $X_1$ has 4×m×z rows and 2×m×z columns, the partial matrix $H_{x,2}$ related to information $X_2$ has 4×m×z rows and 2×m×z columns, the partial matrix $H_{x,3}$ related to information $X_3$ has 4×m×z rows and 2×m×z columns, the partial matrix $H_{p1}$ related to parity $P_1$ has 4×m×z rows and 2×m×z columns, and the partial matrix $H_{p2}$ related to parity $P_2$ has 4×m×z rows and 2×m×z columns.

The transmission sequence (encoded sequence (codeword)) $u_s$ composed of a 5×2×m×z number of bits in block s of the LDPC-CC of coding rate 3/5 that uses an improved tail-biting scheme (an LDPC block code using an LDPC-CC) is $u_s=(X_{s,1,1}, X_{s,1,2}, \ldots, X_{s,1,2\times m\times z-1}, X_{s,1,2\times m\times z}, X_{s,2,1}, X_{s,2,2}, \ldots, X_{s,2,2\times m\times z-1}, X_{s,2,2\times m\times z}, X_{s,3,1}, X_{s,3,2}, \ldots,$ $X_{s,3,2\times m\times z-1}$, $X_{s,3,2\times m\times z}$, $P^{pro}{}_{s,1,1}$, $P^{pro}{}_{s,1,2}$, . . . , $P^{pro}{}_{s,1,2\times m\times z-1}$, $P^{pro}{}_{s,1,2\times m\times z}$, $P^{pro}{}_{s,2,1}$, $P^{pro}{}_{s,2,2}$, . . . , $P^{pro}{}_{s,2,2\times m\times z-1}$, $P^{pro}{}_{s,2,2\times m\times z})^T(\Lambda_{X1,s}$, $\Lambda_{X2,s}$, $\Lambda_{X3,s}$, $\Lambda_{pro1,s}$, $\Lambda_{pro2,s})^T$, and the number of parity check polynomials satisfying zero necessary for obtaining this transmission sequence is 4×m×z.

Here, when arranging such 2×(2×m)×z number of parity check polynomials satisfying zero in order, a parity check polynomial satisfying zero appearing eth is referred to in the following as an "eth parity check polynomial satisfying zero" (where e is an integer no smaller than zero and no greater than 2×(2×m)×z−1).

As such, the parity check polynomials satisfying zero are arranged in the following order:

zeroth: zeroth parity check polynomial satisfying zero;

first: first parity check polynomial satisfying zero;

second: second parity check polynomial satisfying zero;

⋮ eth: eth parity check polynomial satisfying zero;

⋮

2×(2×m)×z−2th: 2×(2×m)×z−2th parity check polynomial satisfying zero; and

2×(2×m)×z−1th: 2×(2×m)×z−1th parity check polynomial satisfying zero.

Accordingly, the transmission sequence (encoded sequence (codeword)) $u_s$ of block s of the LDPC-CC of coding rate 3/5 that uses an improved tail-biting scheme (an LDPC block code using an LDPC-CC) is obtained.

Accordingly, in the LDPC-CC of coding rate 3/5 that uses an improved tail-biting scheme (an LDPC block code using an LDPC-CC):

the 0th parity check polynomial satisfying zero is a parity check polynomial satisfying zero of #0'; first expression provided by expression 173;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 173;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

In the present embodiment (in fact, commonly applying to the entirety of the present disclosure), % means a modulo, and for example, α%q represents a remainder after dividing α by q (where α is an integer no smaller than zero, and q is a natural number).

The following describes details of the configuration of the parity check matrix $H_{pro\_m}$ for the LDPC-CC of coding rate 3/5 that uses an improved tail-biting scheme (an LDPC block code using an LDPC-CC) based on what has been described above.

The parity check matrix $H_{pro\_m}$ for the LDPC-CC of coding rate 3/5 that uses an improved tail-biting scheme (an LDPC block code using an LDPC-CC) has 4×m×z rows and 5×2×m×z columns.

Accordingly, the parity check matrix $H_{pro\_m}$ for the LDPC-CC of coding rate 3/5 that uses an improved tail-biting scheme (an LDPC block code using an LDPC-CC) has rows one through 4×m×z, and columns one through 5×2×m×z.

Here, the topmost row of the parity check matrix $H_{pro\_m}$ is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

Further, the leftmost column of the parity check matrix $H_{pro\_m}$ is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

In the parity check matrix $H_{pro\_m}$, the partial matrix $H_{x,1}$ related to information $X_1$ has 4×m×z rows and 2×m×z columns. In the following, an element at row u, column v of the partial matrix $H_{x,1}$ related to information $X_1$ is denoted as $H_{x,1,comp}[u][v]$ (where u is an integer no smaller than one and no greater than 4×m×z, and v is an integer no smaller than one and no greater than 2×m×z).

Similarly, in the parity check matrix $H_{pro\_m}$, the partial matrix $H_{x,2}$ related to information $X_2$ has 4×m×z rows and 2×m×z columns. In the following, an element at row u, column v of the partial matrix $H_{x,2}$ related to information $X_2$ is denoted as $H_{x,2,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,3}$ related to information $X_3$ has 4×m×z rows and 2×m×z columns. In the following, an element at row u, column v of the partial matrix $H_{x,3}$ related to information $X_3$ is denoted as $H_{x,3,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{p,1}$ related to parity $P_1$ has 4×m×z rows and 2×m×z columns. In the following, an element at row u, column v of the partial matrix $H_{p,1}$ related to parity $P_1$ is denoted as $H_{p1,comp}[u][v]$ (where u is an integer no smaller than one and no greater than 4×m×z, and v is an integer no smaller than one and no greater than 2×m×z).

Similarly, in the parity check matrix $H_{pro\_m}$, the partial matrix $H_{p,2}$ related to parity $P_2$ has 4×m×z rows and 2×m×z columns. In the following, an element at row u, column v of the partial matrix $H_{p,2}$ related to parity $P_2$ is denoted as $H_{p2,comp}[u][v]$ (where u is an integer no smaller than one and no greater than 4×m×z, and v is an integer no smaller than one and no greater than 2×m×z).

The following provides detailed description of the configuration of $H_{x,1,comp}[u][v]$, $H_{x,2,comp}[u][v]$, $H_{x,3,comp}[u][v]$, $H_{p1,comp}[u][v]$, and $H_{p2,comp}[u][v]$.

As already described above, in the LDPC-CC of coding rate 3/5 that uses an improved tail-biting scheme (an LDPC block code using an LDPC-CC):

the 0th parity check polynomial satisfying zero is a parity check polynomial satisfying zero of #0'; first expression provided by expression 173;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 173;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

Further, a vector composed of row e+1 of the parity check matrix $H_{pro\_m}$ corresponds to the eth parity check polynomial satisfying zero.

Accordingly, a vector composed of row one of the parity check matrix $H_{pro\_m}$ is generated by using a parity check polynomial satisfying zero of #0'; first expression provided by expression 173;

a vector composed of row two of the parity check matrix $H_{pro\_m}$ is generated by using a parity check polynomial satisfying zero of #0; second expression;

a vector composed of row 2×g−1 of the parity check matrix $H_{pro\_m}$ is generated by using a parity check polynomial satisfying zero of #((g−1)%2m); first expression; and a vector composed of row 2×g of the parity check matrix $H_{pro\_m}$ is generated by using a parity check polynomial satisfying zero of #((g−1)%2m); second expression (where g is an integer no smaller than two and no greater than 2×m×z).

$H_{x,1,comp}[u][v]$, $H_{x,2,comp}[u][v]$, $H_{x,3,comp}[u][v]$, $H_{p1,comp}[u][v]$, and $H_{p2,comp}[u][v]$ can be expressed according to the relationship described above.

First, description is provided of the configuration of $H_{x,1,comp}[u][v]$, $H_{x,2,comp}[u][v]$, $H_{x,3,comp}[u][v]$, $H_{p1,comp}[u][v]$, and $H_{p2,comp}[u][v]$ for row one of the parity check matrix $H_{pro\_m}$, or that is, for u=1.

The vector composed of row one of the parity check matrix $H_{pro\_m}$ is generated by using a parity check polynomial satisfying zero of #0'; first expression provided by expression 173. Accordingly, $H_{x,1,comp}[1][v]$ can be expressed as follows.

[Math. 309]

$$H_{x,1,comp}[1][1]=1 \tag{174-1}$$

When y is an integer no smaller than one and no greater than $R_{\#(0),1}$:

$$H_{x,1,comp}[1][1-\alpha_{\#(0),1,y}+(2\times m\times z)]=1 \tag{174-2}$$

For all v being an integer no smaller than one and no greater than 2×m×z satisfying {v≠1} and {v≠1−$\alpha_{\#(0),1,y}$+(2×m×z)} (where y is an integer no smaller than one and no greater than $R_{\#(0),1}$), the following holds true:

$$H_{x,1,comp}[1][v]=0 \quad (174\text{-}3)$$

The following holds true for $H_{x,\Omega,comp}[1][v]$, where Ω is an integer no smaller than two and no greater than three.

[Math. 310]

When y is an integer no smaller than $R_{\#(0),\Omega}$+1 and no greater than $r_{\#((0),\Omega}$:

$$H_{x,\Omega,comp}[1][1-\alpha_{\#(0),\Omega,y}+(2\times m\times z)]=1 \quad (175\text{-}1)$$

For all v being an integer no smaller than one and no greater than 2×m×z satisfying {v≠1−$\alpha_{\#(0),\Omega,y}$+(2×m×z)} (where y is an integer no smaller than $R_{\#(0),\Omega}$+1 and no greater than $r_{\#((0),\Omega}$), the following holds true:

$$H_{x,\Omega,comp}[1][v]=0 \quad (175\text{-}2)$$

Further, $H_{p1,comp}[1][v]$ can be expressed as follows.

[Math. 311]

$$H_{p1,comp}[1][1]=1 \quad (176\text{-}1)$$

For all v being an integer no smaller than two and no greater than 2×m×z, the following holds true:

$$H_{p1,comp}[1][v]=0 \quad (176\text{-}2)$$

Further, $H_{p2,comp}[1][v]$ can be expressed as follows.

[Math. 312]

For all v being an integer no smaller than one and no greater than 2×m×z, the following holds true:

$$H_{p2,comp}[1][v]=0 \quad (177)$$

The vector composed of row two of the parity check matrix $H_{pro\_m}$ is generated by using a parity check polynomial satisfying zero of #0; second expression. As described above, a parity check polynomial satisfying zero of #0; second expression is expressed by either expression (165-2-1) or expression (165-2-2).

Accordingly, $H_{x,1,comp}[2][v]$ can be expressed as follows.

<1> When a parity check polynomial satisfying zero of #0; second expression is expressed as provided in expression (165-2-1):

$H_{x,1,comp}[2][v]$ is expressed as follows.

[Math. 313]

When y is an integer no smaller than $R_{\#(0),1}$+1 and no greater than $r_{\#(0),1}$:

$$H_{x,1,comp}[2][1-\alpha_{\#(0),1,y}+(2\times m\times z)]=1 \quad (178\text{-}1)$$

For all v being an integer no smaller than one and no greater than 2×m×z satisfying {v≠1−$\alpha_{\#(0),1,y}$+(2×m×z)} (where y is an integer no smaller than $R_{\#(0),1}$+1 and no greater than $r_{\#((0),1}$), the following holds true:

$$H_{x,1,comp}[2][v]=0 \quad (178\text{-}2)$$

The following holds true for $H_{x,w,comp}[2][v]$, where w is an integer no smaller than two and no greater than three.

[Math. 314]

$$H_{x,w,comp}[2][1]=1 \quad (179\text{-}1)$$

When y is an integer no smaller than one and no greater than $R_{\#(0),w}$:

$$H_{x,w,comp}[2][1\alpha_{\#(0),w,y}+(2\times m\times z)]=1 \quad (179\text{-}2)$$

For all v being an integer no smaller than one and no greater than 2×m×z satisfying {v≠1} and {v≠1−$\alpha_{\#(0),w,y}$+(2×m×z)} (where y is an integer no smaller than one and no greater than $R_{\#(0),w}$), the following holds true:

$$H_{x,w,comp}[2][v]=0 \quad (179\text{-}3)$$

Further, $H_{p1,comp}[2][v]$ can be expressed as follows.

[Math. 315]

$$H_{p1,comp}[2][1-\beta_{\#(0),2}+(2\times m\times z)]=1 \quad (180\text{-}1)$$

For all v being an integer no smaller than one and no greater than 2×m×z satisfying {v≠1−$\beta_{\#(0),2}$+(2×m×z)}, the following holds true:

$$H_{p1,comp}[2][v]=0 \quad (180\text{-}2)$$

Further, $H_{p2,comp}[2][v]$ can be expressed as follows.

[Math. 316]

$$H_{p2,comp}[2][1]=1 \quad (181\text{-}1)$$

For all v being an integer no smaller than two and no greater than 2×m×z, the following holds true:

$$H_{p2,comp}[2][v]=0 \quad (181\text{-}2)$$

<2> When a parity check polynomial satisfying zero of #0; second expression is expressed as provided in expression (165-2-2):

$H_{x,1,comp}[2][v]$ is expressed as follows.

[Math. 317]

When y is an integer no smaller than $R_{\#(0),1}$+1 and no greater than $r_{\#((0),1}$:

$$H_{x,1,comp}[2][1-\alpha_{\#(0),1,y}+(2\times m\times z)]=1 \quad (182\text{-}1)$$

For all v being an integer no smaller than one and no greater than 2×m×z satisfying {v≠1-$\alpha_{\#(0),1,y}$+(2×m×z)} (where y is an integer no smaller than $R_{\#(0),1}$+1 and no greater than $r_{\#((0),1}$), the following holds true:

$$H_{x,1,comp}[2][v]=0 \quad (182\text{-}2)$$

The following holds true for $H_{x,w,comp}[2][v]$, where w is an integer no smaller than two and no greater than three.

[Math. 318]

$$H_{x,w,comp}[2][1]=1 \quad (183\text{-}1)$$

When y is an integer no smaller than one and no greater than $R_{\#(0),w}$:

$$H_{x,w,comp}[2][1-\alpha_{\#(0),w,y}+(2\times m\times z)]=1 \quad (183\text{-}2)$$

For all v being an integer no smaller than one and no greater than 2×m×z satisfying {v≠1} and {v≠1−$\alpha_{\#(0),w,y}$+(2×m×z)} (where y is an integer no smaller than one and no greater than $R_{\#(0),w}$), the following holds true:

$$H_{x,w,comp}[2][v]=0 \quad (183\text{-}3)$$

Further, $H_{p1,comp}[2][v]$ can be expressed as follows.

[Math. 319]

For all v being an integer no smaller than one and no greater than 2×m×z:

$$H_{p1,comp}[2][v]=0 \quad (184)$$

Further, $H_{p2,comp}[2][v]$ can be expressed as follows.

[Math. 320]

$$H_{p2,comp}[2][1]=1 \quad (185\text{-}1)$$

$$H_{p2,comp}[2][1-\beta_{\#(0),3}+(2\times m\times z)]=1 \quad (185\text{-}2)$$

For all v being an integer no smaller than one and no greater than 2×m×z satisfying {v≠1} and {v≠1−$\beta_{\#(0),3}$+(2×m×z)}, the following holds true:

$$H_{p2,comp}[2][v]=0 \quad (185\text{-}3)$$

As already described above, the vector composed of row 2×g−1 of the parity check matrix $H_{pro\_m}$ is generated by using a parity check polynomial satisfying zero of #((g−1)%2m); first expression; and the vector composed of row 2×g of the parity check matrix $H_{pro\_m}$ is generated by using a parity check polynomial satisfying zero of #((g−1)%2m); second expression (where g is an integer no smaller than two and no greater than 2×m×z).

Accordingly, when g=2×f−1 (where f is an integer no smaller than two and no greater than m×z), a vector of row 2×(2×f−1)−1 of the parity check matrix $H_{pro\_m}$ for the LDPC-CC of coding rate 3/5 that uses an improved tail-biting scheme (an LDPC block code using an LDPC-CC) can be generated by using a parity check polynomial satisfying zero of #(((2×f−1)−1)%2m); first expression, or that is, by using a parity check polynomial satisfying zero provided by expression (165-1-1) or expression (165-1-2).

Further, a vector of row 2×(2×f−1) of the parity check matrix $H_{pro\_m}$ for the LDPC-CC of coding rate 3/5 that uses an improved tail-biting scheme (an LDPC block code using an LDPC-CC) can be generated by using a parity check polynomial satisfying zero of #(((2×f−1)−1)%2m); second expression, or that is, by using a parity check polynomial satisfying zero provided by expression (165-2-1) or expression (165-2-2).

Further, when g=2×f (where f is an integer no smaller than one and no greater than m×z), a vector of row 2×(2×f)−1 of the parity check matrix $H_{pro\_m}$ for the LDPC-CC of coding rate 3/5 that uses an improved tail-biting scheme (an LDPC block code using an LDPC-CC) can be generated by using a parity check polynomial satisfying zero of #(((2×f)−1)%2m); first expression, or that is, by using a parity check polynomial satisfying zero provided by expression (166-1-1) or expression (166-1-2).

Further, a vector of row 2×(2×f) of the parity check matrix $H_{pro\_m}$ for the LDPC-CC of coding rate 3/5 that uses an improved tail-biting scheme (an LDPC block code using an LDPC-CC) can be generated by using a parity check polynomial satisfying zero of #(((2×f)−1)%2m); second expression, or that is, by using a parity check polynomial satisfying zero provided by expression (166-2-1) or expression (166-2-2).

Accordingly, (1) when g=2×f−1 (where f is an integer no smaller than two and no greater than m×z), when a vector for row 2×(2×f−1)−1 of the parity check matrix $H_{pro\_m}$, which is for the LDPC-CC of coding rate 3/5 that uses an improved tail-biting scheme (an LDPC block code using an LDPC-CC), can be generated by using a parity check polynomial satisfying zero provided by expression (165-1-1), ((2×f−1)−1)%2m=2c holds true. Accordingly, a parity check polynomial satisfying zero of expression (165-1-1) where 2i=2c holds true (where c is an integer no smaller than zero and no greater than m−1).

Accordingly, components $H_{x,1,comp}[2\times g-1][v]=H_{x,1,comp}[2\times(2\times f-1)-1][v]$, $H_{x,2,comp}[2\times g-1][v]=H_{x,2,comp}[2\times(2\times f-1)-1][v]$, $H_{x,3,comp}[2\times g-1][v]=H_{x,3,comp}[2\times(2\times f-1)-1][v]$, $H_{p1,comp}[2\times g-1][v]=H_{p1,comp}[2\times(2\times f-1)-1][v]$, and $H_{p2,comp}[2\times g-1][v]=H_{p2,comp}[2\times(2\times f-1)-1][v]$ in row 2×g−1, or that is, row 2×(2×f−1)−1 of the parity check matrix $H_{pro\_m}$, which is for the LDPC-CC of coding rate 3/5 that uses an improved tail-biting scheme (an LDPC block code using an LDPC-CC), is expressed as follows.

First, the following holds true for $H_{x,1,comp}[2\times(2\times f-1)-1][v]$.

[Math. 321]

$$H_{x,1,comp}[2\times(2\times f-1)-1][((2\times f-1)-0-1)+1]=1 \tag{186-1}$$

When y is an integer no smaller than one and no greater than $R_{\#(2c),1}$, and $(2\times f-1)-\alpha_{\#(2c),1,y}-1\geq 0$:

$$H_{x,1,comp}[2\times(2\times f-1)-1][((2\times f-1)-\alpha_{\#(2c),1,y}-1)+1]=1 \tag{186-2}$$

When $(2\times f-1)-\alpha_{\#(2c),1,y}-1<0$:

$$H_{x,1,comp}[2\times(2\times f-1)-1][((2\times f-1)-\alpha_{\#(2c),1,y}-1)+1+(2\times m\times z)]=1 \tag{186-3}$$

For all v being an integer no smaller than one and no greater than 2×m×z satisfying {v≠((2×f−1)−0−1)+1}, $\{v\neq((2\times f-1)-\alpha_{\#(2c),1,y}-1)+1\}$, and $\{v\neq((2\times f-1)-\alpha_{\#(2c),1,y}-1)+1+(2\times m\times z)\}$ (where y is an integer no smaller than one and no greater than $R_{\#(2c),1}$), the following holds true:

$$H_{x,1,comp}[2\times(2\times f-1)-1][v]=0 \tag{186-4}$$

The following holds true for $H_{x,\Omega,comp}[2\times(2\times f-1)-1][v]$. In the following, Ω is an integer no smaller than two and no greater than three, and y is an integer no smaller than $R_{\#(2c),\Omega}+1$ and no greater than $r_{\#(2c),\Omega}$.

[Math. 322]

When $(2\times f-1)-\alpha_{\#(2c),\Omega,y}-1\geq 0$:

$$H_{x,\Omega,comp}[2\times(2\times f-1)-1][((2\times f-1)-\alpha_{\#(2c),\Omega,y}-1)+1]=1 \tag{187-1}$$

When $(2\times f-1)-\alpha_{\#(2c),\Omega,y}-1<0$:

$$H_{x,\Omega,comp}[2\times(2\times f-1)-1][((2\times f-1)-\alpha_{\#(2c),\Omega,y}-1)+1+(2\times m\times z)]=1 \tag{187-2}$$

For all v being an integer no smaller than one and no greater than 2×m×z satisfying $\{v\neq(2\times f-1)-\alpha_{\#(2c),\Omega,y}-1)+1\}$ and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)-1][v]=0 \tag{187-3}$$

Further, the following holds true for $H_{p1,comp}[2\times(2\times f-1)1][v]$.

[Math. 323]

$$H_{p1,comp}[2\times(2\times f-1)-1][((2\times f-1)-0-1)+1]=1 \tag{188-1}$$

For all v being an integer no smaller than one and no greater than 2×m×z satisfying {v≠((2×f−1)−0−1)+1}, the following holds true:

$$H_{p1,comp}[2\times(2\times f-1)-1][v]=0 \tag{188-2}$$

Further, the following holds true for $H_{p2,comp}[2\times(2\times f-1)-1][v]$.

[Math. 324]

When $(2\times f-1)-\beta_{\#(2c),0}-1\geq 0$:

$$H_{p2,comp}[2\times(2\times f-1)-1][((2\times f-1)-\beta_{\#(2c),0}-1)+1]=1 \tag{189-1}$$

When $(2\times f-1)-\beta_{\#(2c),0}-1<0$:

$$H_{p2,comp}[2\times(2\times f-1)-1][((2\times f-1)-\beta_{\#(2c),0}-1)+1+(2\times m\times z)]=1 \tag{189-2}$$

For all v being an integer no smaller than one and no greater than 2×m×z satisfying $\{v\neq((2\times f-1)-\beta_{\#(2c),0}-1)+1\}$ and $\{v\neq((2\times f-1)-\beta_{\#(2c),0}-1)+1+(2\times m\times z)\}$, the following holds true:

$$H_{p2,comp}[2\times(2\times f-1)-1][v]=0 \tag{189-3}$$

Further, (2) when g=2×f−1 (where f is an integer no smaller than two and no greater than m×z), when a vector for row 2×(2×f−1)−1 of the parity check matrix $H_{pro\_m}$, which is for the LDPC-CC of coding rate 3/5 that uses an improved tail-biting scheme (an LDPC block code using an LDPC-CC), can be generated by using a parity check polynomial satisfying zero provided by expression (165-1-2), ((2×f−1)−1)%2m=2c holds true. Accordingly, a parity check polynomial satisfying zero of expression (165-1-2) where 2i=2c holds true (where c is an integer no smaller than zero and no greater than m−1).

Accordingly, components $H_{x,1,comp}[2\times g-1][v]=H_{x,1,comp}[2\times(2\times f-1)-1][v]$, $H_{x,2,comp}[2\times g-1][v]=H_{x,2,comp}[2\times(2\times f-1)-1][v]$, $H_{x,3,comp}[2\times g-1][v]=H_{x,3,comp}[2\times(2\times f-1)-1][v]$, $H_{p1,comp}[2\times g-1][v]=H_{p1,comp}[2\times(2\times f-1)-1][v]$, and $H_{p2,comp}[2\times g-1][v]=H_{p2,comp}[2\times(2\times f-1)-1][v]$ in row 2×g−1, or that is, row 2×(2×f−1)−1 of the parity check matrix $H_{pro\_m}$, which is for the LDPC-CC of coding rate 3/5 that uses an improved tail-biting scheme (an LDPC block code using an LDPC-CC), is expressed as follows.

First, the following holds true for $H_{x,1,comp}[2\times(2\times f-1)-1][v]$

[Math. 325]

$$H_{x,1,comp}[2\times(2\times f-1)-1][((2\times f-1)-0-1)+1]=1 \quad (190\text{-}1)$$

When y is an integer no smaller than one and no greater than $R_{\#(2c),1}$, and $(2\times f-1)-\alpha_{\#(2c),1,y}-1\geq 0$:

$$H_{x,1,comp}[2\times(2\times f-1)-1][((2\times f-1)-\alpha_{\#(2c),1,y}-1)+1]=1 \quad (190\text{-}2)$$

When $(2\times f-1)-\alpha_{\#(2c),1,y}-1<0$:

$$H_{x,1,comp}[2\times(2\times f-1)-1][((2\times f-1)-\alpha_{\#(2c),1,y}-1)+1+(2\times m\times z)]=1 \quad (190\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),1,y}-1)+1\}$, and $\{v\neq((2\times f-1)-\alpha_{\#(2c),1,y}-1)+1+(2\times m\times z)\}$ (where y is an integer no smaller than one and no greater than $R_{\#(2c),1}$), the following holds true:

$$H_{x,1,comp}[2\times(2\times f-1)-1][v]=0 \quad (190\text{-}4)$$

Further, the following holds true for $H_{x,\Omega,comp}[2\times(2\times f-1)-1][v]$. In the following, Ω is an integer no smaller than two and no greater than three, and y is an integer no smaller than $R_{\#(2c),\Omega}+1$ and no greater than $r_{\#(2c),\Omega}$.

[Math. 326]

When $(2\times f-1)-\alpha_{\#(2c),\Omega,y}-1\geq 0$:

$$H_{x,\Omega,comp}[2\times(2\times f-1)-1][((2\times f-1)-\alpha_{\#(2c),\Omega,y}-1)+1]=1 \quad (191\text{-}1)$$

When $(2\times f-1)-\alpha_{\#(2c),\Omega,y}-1<0$:

$$H_{x,\Omega,comp}[2\times(2\times f-1)-1][((2\times f-1)-\alpha_{\#(2c),\Omega,y}-1)+1+(2\times m\times z)]=1 \quad (191\text{-}2)$$

For all v being an integer no smaller than one and no greater than 2×m×z satisfying $\{v\neq(2\times f-1)-\alpha_{\#(2c),\Omega,y}-1)+1\}$ and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)-1][v]=0 \quad (191\text{-}3)$$

Further, the following holds true for $H_{p1,comp}[2\times(2\times f)1][v]$.

[Math. 327]

$$H_{p1,comp}[2\times(2\times f-1)-1][((2\times f-1)-0-1)+1]=1 \quad (192\text{-}1)$$

When $(2\times f-1)-\beta_{\#(2c),1}-1\geq 0$:

$$H_{p1,comp}[2\times(2\times f-1)-1][((2\times f-1)-\beta_{\#(2c),1}-1)+1]=1 \quad (192\text{-}2)$$

When $(2\times f-1)-\beta_{\#(2c),1}-1\geq 0$:

$$H_{p1,comp}[2\times(2\times f-1)-1][((2\times f-1)-\beta_{\#(2c),1}-1)+1+(2\times m\times z)]=1 \quad (192\text{-}3)$$

For all v being an integer no smaller than one and no greater than 2×m×z satisfying $\{v\neq((2\times f-1)-0-1)+1\}$, $\{v\neq((2\times f-1)-\beta_{\#(2c),1}-1)+1\}$, and $\{v\neq((2\times f-1)-\beta_{\#(2c),1}-1)+1+(2\times m\times z)\}$, the following holds true:

$$H_{p1,comp}[2\times(2\times f-1)-1][v]=0 \quad (192\text{-}4)$$

Further, the following holds true for $H_{p2,comp}[2\times(2\times f-1)-1][v]$.

[Math. 328]

For all v being an integer no smaller than one and no greater than 2×m×z, the following holds true:

$$H_{p2,comp}[2\times(2\times f-1)-1][v]=0 \quad (193)$$

Further, (3) when g=2×f−1 (where f is an integer no smaller than two and no greater than m×z), when a vector for row 2×(2×f−1) of the parity check matrix $H_{pro\_m}$, which is for the LDPC-CC of coding rate 3/5 that uses an improved tail-biting scheme (an LDPC block code using an LDPC-CC), can be generated by using a parity check polynomial satisfying zero provided by expression (165-2-1), ((2×f−1)−1)%2m=2c holds true. Accordingly, a parity check polynomial satisfying zero of expression (165-2-1) where 2i=2c holds true (where c is an integer no smaller than zero and no greater than m−1).

Accordingly, components $H_{x,1,comp}[2\times g][1]H_{x,1,comp}[2\times(2\times f-1)][v]$, $H_{x,2,comp}[2\times g][v]=H_{x,2,comp}[2\times(2\times f-1)][v]$, $H_{x,3,comp}[2\times g][v]H_{x,3,comp}[2\times(2\times f-1)][v]$, $H_{p1,comp}[2\times g][v]=H_{p1,comp}[2\times(2\times f-1)][v]$, and $H_{p2,comp}[2\times g][v]=H_{p2,comp}[2\times(2\times f-1)][v]$ in row 2×g, or that is, row 2×(2×f−1) of the parity check matrix $H_{pro\_m}$, which is for the LDPC-CC of coding rate 3/5 that uses an improved tail-biting scheme (an LDPC block code using an LDPC-CC), is expressed as follows.

First, the following holds true for $H_{x,1,comp}[2\times(2\times f-1)][v]$. In the following, y is an integer no smaller than $R_{\#(2c),1}+1$ and no greater than $r_{\#(2c),1}$.

[Math. 329]

When $(2\times f-1)-\alpha_{\#(2c),1,y}-1\geq 0$:

$$H_{x,1,comp}[2\times(2\times f-1)][((2\times f-1)-\alpha_{\#(2c),1,y}-1)+1]=1 \quad (194\text{-}1)$$

When $(2\times f-1)-\alpha_{\#(2c),1,y}-1<0$:

$$H_{x,1,comp}[2\times(2\times f-1)][((2\times f-1)-\alpha_{\#(2c),1,y}-1)+1+(2\times m\times z)]=1 \quad (194\text{-}2)$$

For all v being an integer no smaller than one and no greater than 2×m×z satisfying $\{v\neq((2\times f-1)-\alpha_{\#(2c),1,y}-1)+1\}$ and $\{v\neq((2\times f-1)-\alpha_{\#(2c),1,y}-1)+1+(2\times m\times z)\}$ (where y is an integer no smaller than $R_{\#(2c),1}+1$ and no greater than $r_{\#(2c),1}$), the following holds true:

$$H_{x,1,comp}[2\times(2\times f-1)][v]=0 \quad (194\text{-}3)$$

Considered in a similar manner, the following holds true for $H_{x,w,comp}[2\times(2\times f-1)][v]$. In the following, w is an integer no smaller than two and no greater than three.

[Math. 330]

$$H_{x,w,comp}[2\times(2\times f-1)][((2\times f-1)-0-1)+1]=1 \quad (195\text{-}1)$$

When y is an integer no smaller than one and no greater than $R_{\#(2c),w}$, and $(2\times f-1)-\alpha_{\#(2c),w,y}-1\geq 0$:

$$H_{x,w,comp}[2\times(2\times f-1)][((2\times f-1)-\alpha_{\#(2c),w,y}-1)+1]=1 \quad (195\text{-}2)$$

When $(2\times f-1)-\alpha_{\#(2c),w,y}-1<0$:

$$H_{x,w,comp}[2\times(2\times f-1)][((2\times f-1)-\alpha_{\#(2c),w,y}-1)+1+(2\times m\times z)]=1 \quad (195\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),w,y}-1\}$, and $\{v\neq((2\times f-1)-\alpha_{\#(2c),w,y}-1)+1+(2\times m\times z)\}$ (where y is an integer no smaller than one and no greater than $R_{\#(2c),w}$), the following holds true:

$$H_{x,w,comp}[2\times(2\times f-1)][v]=0 \quad (195\text{-}4)$$

Further, the following holds true for $H_{p1,comp}[2\times(2\times f-1)][v]$.

[Math. 331]

When $(2\times f-1)-\beta_{\#(2c),2}-1\geq 0$:

$$H_{p1,comp}[2\times(2\times f-1)][((2\times f-1)-\beta_{\#(2c),2}-1)+1]=1 \quad (196\text{-}1)$$

When $(2\times f-1)-\beta_{\#(2c),2}-1<0$:

$$H_{p1,comp}[2\times(2\times f-1)][((2\times f-1)-\beta_{\#(2c),2}-1)+1+(2\times m\times z)]=1 \quad (196\text{-}2)$$

For all v being an integer no smaller than one and no greater than 2×m×z satisfying $\{v\neq((2\times f-1)-\beta_{\#(2c),2}-1)+1\}$ and $\{v\neq((2\times f-1)-\beta_{\#(2c),2}-1)+1+(2\times m\times z)\}$, the following holds true:

$$H_{p1,comp}[2\times(2\times f-1)][v]=0 \quad (196\text{-}3)$$

Further, the following holds true for $H_{p2,comp}[2\times(2\times f-1)][v]$.

[Math. 332]

$$H_{p2,comp}[2\times(2\times f-1)][((2\times f-1)-0-1)+1]=1 \quad (197\text{-}1)$$

For all v being an integer no smaller than one and no greater than 2×m×z satisfying $\{v\neq((2\times f-1)-0-1)+1\}$, the following holds true:

$$H_{p2,comp}[2\times(2\times f-1)][v]=0 \quad (197\text{-}2)$$

Further, (4) when g=2×f−1 (where f is an integer no smaller than two and no greater than m×z), when a vector for row 2×(2×f−1) of the parity check matrix $H_{pro\_m}$, which is for the LDPC-CC of coding rate 3/5 that uses an improved tail-biting scheme (an LDPC block code using an LDPC-CC), can be generated by using a parity check polynomial satisfying zero provided by expression (165-2-2), ((2×f−1)−1)%2m=2c holds true. Accordingly, a parity check polynomial satisfying zero of expression (165-2-2) where 2i=2c holds true (where c is an integer no smaller than zero and no greater than m−1).

Accordingly, components $H_{x,1,comp}[2\times g][v]$ $H_{x,1,comp}[2\times(2\times f-1)][v]$, $H_{x,2,comp}[2\times g][v]=H_{x,2,comp}[2\times f-1)][v]$, $H_{x,3,comp}[2\times g][v]=H_{x,3,comp}[2\times(2\times f-1)][v]H_{p1,comp}[2\times g][v]=H_{p1,comp}[2\times(2\times f-1)][v]$, and $H_{p2,comp}[2\times g][v]=H_{p2,comp}[2\times(2\times f-1)][v]$ in row 2×g, or that is, row 2×(2×f−1) of the parity check matrix $H_{pro\_m}$, which is for the LDPC-CC of coding rate 3/5 that uses an improved tail-biting scheme (an LDPC block code using an LDPC-CC), is expressed as follows.

First, the following holds true for $H_{x,1,comp}[2\times(2\times f-1)][v]$. In the following, y is an integer no smaller than $R_{\#(2c),1}+1$ and no greater than $r_{\#(2c),1}$.

[Math. 333]

When $(2\times f-1)-\alpha_{\#(2c),1,y}-1\geq 0$:

$$H_{x,1,comp}[2\times(2\times f-1)][((2\times f-1)-\alpha_{\#(2c),1,y}-1)+1]=1 \quad (198\text{-}1)$$

When $(2\times f-1)-\alpha_{\#(2c),1,y}-1<0$:

$$H_{x,1,comp}[2\times(2\times f-1)][((2\times f-1)-\alpha_{\#(2c),1,y}-1)+1+(2\times m\times z)]=1 \quad (198\text{-}2)$$

For all v being an integer no smaller than one and no greater than 2×m×z satisfying $\{v\neq((2\times f-1)-\alpha_{\#(2c),1,y}-1)+1\}$ and $\{v\neq((2\times f-1)-\alpha_{\#(2c),1,y}-1)+1+(2\times m\times z)\}$ (where y is an integer no smaller than $R_{\#(2c),1}+1$ and no greater than $r_{\#(2c),1}$), the following holds true:

$$H_{x,1,comp}[2\times(2\times f-1)][v]=0 \quad (198\text{-}3)$$

Further, the following holds true for $H_{x,w,comp}[2\times(2\times f-1)][v]$. In the following, w is an integer no smaller than two and no greater than three.

[Math. 334]

$$H_{x,w,comp}[2\times(2\times f-1)][((2\times f-1)-0-1)+1]=1 \quad (199\text{-}1)$$

When y is an integer no smaller than one and no greater than $R_{\#(2c),w}$, and $(2\times f-1)-\alpha_{\#(2c),w,y}-1\geq 0$:

$$H_{x,w,comp}[2\times(2\times f-1)][((2\times f-1)-\alpha_{\#(2c),w,y}-1)+1]=1 \quad (199\text{-}2)$$

When $(2\times f-1)-\alpha_{\#(2c),w,y}-1<0$:

$$H_{x,w,comp}[2\times(2\times f-1)][((2\times f-1)-\alpha_{\#(2c),w,y}-1)+1+(2\times m\times z)]=1 \quad (199\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),w,y}-1)+1\}$, and $\{v\neq((2\times f-1)-\alpha_{\#(2c),w,y}-1)+1+(2\times m\times z)\}$ (where y is an integer no smaller than one and no greater than $R_{\#(2c),w}$), the following holds true:

$$H_{x,w,comp}[2\times(2\times f-1)][v]=0 \quad (199\text{-}4)$$

Further, the following holds true for $H_{p1,comp}[2\times(2\times f-1)][v]$.

[Math. 335]

For all v being an integer no smaller than one and no greater than 2×m×z, the following holds true:

$$H_{p1,comp}[2\times(2\times f-1)][v]=0 \quad (200)$$

Further, the following holds true for $H_{p2,comp}[2\times(2\times f-1)][v]$.

[Math. 336]

$$H_{p2,comp}[2\times(2\times f-1)][((2\times f-1)-0-1)+1]=1 \quad (201\text{-}1)$$

When $(2\times f-1)-\beta_{\#(2c),3}-1\geq 0$:

$$H_{p2,comp}[2\times(2\times f-1)][((2\times f-1)-\beta_{\#(2c),3}-1)+1]=1 \quad (201\text{-}2)$$

When $(2\times f-1)-\beta_{\#(2c),3}-1<0$:

$$H_{p2,comp}[2\times(2\times f-1)][((2\times f-1)-\beta_{\#(2c),3}-1)+1+(2\times m\times z)]=1 \quad (201\text{-}3)$$

For all v being an integer no smaller than one and no greater than 2×m×z satisfying $\{v\neq((2\times f-1)-0-1)+1\}$, $\{v\neq((2\times f-1)-\beta_{\#(2c),3}-1)+1\}$, and $\{v\neq((2\times f-1)-\beta_{\#(2c),3}-1)+1+(2\times m\times z)\}$, the following holds true:

$$H_{p2,comp}[2\times(2\times f-1)][v]=0 \quad (201\text{-}4)$$

Further, (5) when g=2×f (where f is an integer no smaller than one and no greater than m×z), when a vector for row 2×(2×f)−1 of the parity check matrix $H_{pro\_m}$, which is for the LDPC-CC of coding rate 3/5 that uses an improved tail-biting scheme (an LDPC block code using an LDPC-CC), can be generated by using a parity check polynomial satisfying zero provided by expression (166-1-1), ((2×f)−1)%2m=2d+1 holds true. Accordingly, a parity check polynomial satisfying zero of expression (166-1-1) where 2i+1=2d+1 holds true (where d is an integer no smaller than zero and no greater than m−1).

Accordingly, components $H_{x,1,comp}[2\times g-1][v]=H_{x,1,comp}[2\times(2\times f)-1][v]$, $H_{x,2,comp}[2\times g-1][v]=H_{x,2,comp}[2\times(2\times f)-1][v]$, $H_{x,3,comp}[2\times g-1][v]=H_{x,3,comp}[2\times(2\times f)-1][v]$, $H_{p1,comp}[2\times g-1][v]=H_{p1,comp}[2\times(2\times f)-1][v]$, and $H_{p2,comp}[2\times g-1][v]=H_{p2,comp}[2\times(2\times f)-1][v]$ in row 2×g−1, or that is, row 2×(2×f)−1 of the parity check matrix $H_{pro\_m}$, which is for the LDPC-CC of coding rate 3/5 that uses an improved tail-biting scheme (an LDPC block code using an LDPC-CC), is expressed as follows.

First, the following holds true for $H_{x,1,comp}[2\times(2\times f)-1][v]$. In the following, y is an integer no smaller than $R_{\#(2d+1),1}+1$ and no greater than $r_{\#(2d+1),1}$.

[Math. 337]

When $(2\times f)-\alpha_{\#(2d+1),1,y}-1\geq 0$:

$$H_{x,1,comp}[2\times(2\times f)-1][((2\times f)-\alpha_{\#(2d+1),1,y}-1)+1]=1 \quad (202\text{-}1)$$

When $(2\times f)-\alpha_{\#(2d+1),1,y}-1\geq 0$:

$$H_{x,1,comp}[2\times(2\times f)-1][((2\times f)-\alpha_{\#(2d+1),1,y}-1)+1+(2\times m\times z)]=1 \quad (202\text{-}2)$$

For all v being an integer no smaller than one and no greater than 2×m×z satisfying $\{v\neq((2\times f)-\alpha_{\#(2d+1),1,y}-1)+1\}$ and $\{v\neq((2\times f)-\alpha_{\#(2d+1),1,y}-1)+1+(2\times m\times z)\}$ (where y is an integer no smaller than $R_{\#(2d+1),1}+1$ and no greater than $r_{\#(2d+1),1}$), the following holds true:

$$H_{x,1,comp}[2\times(2\times f)-1][v]=0 \quad (202\text{-}3)$$

Further, the following holds true for $H_{x,w,comp}[2\times(2\times f)-1][v]$. In the following, w is an integer no smaller than two and no greater than three.

[Math. 338]

$$H_{x,w,comp}[2\times(2\times f)-1][((2\times f)-0-1)+1]=1 \quad (203\text{-}1)$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)-1][((2\times f)-\alpha_{\#(2d+1),w,y}-1)+1]=1 \quad (203\text{-}2)$$

When $(2\times f)-\alpha_{\#(2d+1),w,y}-1<0$:

$$H_{x,w,comp}[2\times(2\times f)-1][((2\times f)-\alpha_{\#(2d+1),w,y}-1)+1+(2\times m\times z)]=1 \quad (203\text{-}3)$$

For all v being an integer no smaller than one and no greater than 2×m×z satisfying $\{v\neq((2\times f)-0-1)+1\}$, $\{v\neq((2\times f)-\alpha_{\#(2d+1),w,y}-1)+\}$, and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)-1][v]=0 \quad (203\text{-}4)$$

Further, the following holds true for $H_{p1,comp}[2\times(2\times f)-1][v]$.

[Math. 339]

$$H_{p1,comp}[2\times(2\times f)-1][((2\times f)-0-1)+1]=1 \quad (204\text{-}1)$$

For all v being an integer no smaller than one and no greater than 2×m×z satisfying $\{v\neq((2\times f)-0-1)+1\}$, the following holds true:

$$H_{p1,comp}[2\times(2\times f)-1][v]=0 \quad (204\text{-}2)$$

Further, the following holds true for $H_{p2,comp}[2\times(2\times f)-1][v]$.

[Math. 340]

When $(2\times f)-\beta_{\#(2d+1),0}-1\geq 0$:

$$H_{p2,comp}[2\times(2\times f)-1][((2\times f)-\beta_{\#(2d+1),0}-1)+1]=1 \quad (205\text{-}1)$$

When $(2\times f)-\beta_{\#(2d+1),0}-1<0$:

$$H_{p2,comp}[2\times(2\times f)-1][((2\times f)-\beta_{\#(2d+1),0}-1)+1+(2\times m\times z)]=1 \quad (205\text{-}2)$$

For all v being an integer no smaller than one and no greater than 2×m×z satisfying $\{v\neq((2\times f)-\beta_{\#(2d+1),0}-1)+1\}$ and $\{v\neq((2\times f)-\beta_{\#(2d+1),0}-1)+1+(2\times m\times z)\}$, the following holds true:

$$H_{p2,comp}[2\times(2\times f)-1][v]=0 \quad (205\text{-}3)$$

Further, (6) when g=2×f (where f is an integer no smaller than one and no greater than m×z), when a vector for row 2×(2×f)−1 of the parity check matrix $H_{pro\_m}$, which is for the LDPC-CC of coding rate 3/5 that uses an improved tail-biting scheme (an LDPC block code using an LDPC-CC), can be generated by using a parity check polynomial satisfying zero provided by expression (166-1-2), ((2×f)−1)%2m=2d+1 holds true. Accordingly, a parity check polynomial satisfying zero of expression (166-1-2) where 2i+1=2d+1 holds true (where d is an integer no smaller than zero and no greater than m−1).

Accordingly, components $H_{x,1,comp}[2\times g-1][v]=H_{x,1,comp}[2\times(2\times f)-1][v]$, $H_{x,2,comp}[2\times g-1][v]=H_{x,2,comp}[2\times(2\times f)-1][v]$, $H_{x,3,comp}[2\times g-1][v]=H_{x,3,comp}[2\times(2\times f)-1][v]$, $H_{p1,comp}[2\times g-1][v]=H_{p1,comp}[2\times(2\times f)-1][v]$, and $H_{p2,comp}[2\times g-1][v]=H_{p2,comp}[2\times(2\times f)-1][v]$ in row 2×g−1, or that is, row 2×(2×f)−1 of the parity check matrix $H_{pro\_m}$, which is for the LDPC-CC of coding rate 3/5 that uses an improved tail-biting scheme (an LDPC block code using an LDPC-CC), is expressed as follows.

First, the following holds true for $H_{x,1,comp}[2\times(2\times f)-1][v]$. In the following, y is an integer no smaller than $R_{\#(2d+1),1}+1$ and no greater than $r_{\#(2d+1),1}$.

[Math. 341]

When $(2\times f)-\alpha_{\#(2d+1),1,y}-1\geq 0$:

$$H_{x,1,comp}[2\times(2\times f)-1][((2\times f)-\alpha_{\#(2d+1),1,y}-1)+1]=1 \quad (206\text{-}1)$$

When $(2\times f)-\alpha_{\#(2d+1),1,y}-1<0$:

$$H_{x,1,comp}[2\times(2\times f)-1][((2\times f)-\alpha_{\#(2d+1),1,y}-1)+1+(2\times m\times z)]=1 \quad (206\text{-}2)$$

For all v being an integer no smaller than one and no greater than 2×m×z satisfying $\{v\neq((2\times f)-\alpha_{\#(2d+1),1,y}-1)+1\}$ and $\{v\neq(2\times f)-\alpha_{\#(2d+1),1,y}-1)+1+(2\times m\times z)\}$ (where y is an integer no smaller than $R_{\#(2d+1),1}+1$ and no greater than $r_{\#(2d+1),1}$), the following holds true:

$$H_{x,1,comp}[2\times(2\times f)-1][v]=0 \quad (206\text{-}3)$$

Further, the following holds true for $H_{x,w,comp}[2\times(2\times f)-1][v]$. In the following, w is an integer no smaller than two and no greater than three.

[Math. 342]

$$H_{x,w,comp}[2\times(2\times f)-1][((2\times f)-0-1)+1]=1 \quad (207\text{-}1)$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)-1][((2\times f)-\alpha_{\#(2d+1),w,y}-1)+1]=1 \quad (207\text{-}2)$$

When $(2\times f)-\alpha_{\#(2d+1),w,y}-1<0$:

$$H_{x,w,comp}[2\times(2\times f)-1][((2\times f)-\alpha_{\#(2d+1),w,y}-1)+1+(2\times m\times z)]=1 \quad (207\text{-}3)$$

For all v being an integer no smaller than one and no greater than 2×m×z satisfying $\{v\neq((2\times f)-0-1)+1\}$, $\{v\neq((2\times f)-\alpha_{\#(2d+1),w,y}-1)+1\}$ and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)-1][v]=0 \quad (207\text{-}4)$$

Further, the following holds true for $H_{p1,comp}[2\times(2\times f)-1][v]$.

[Math. 343]

$$H_{p1,comp}[2\times(2\times f)-1][((2\times f)-0-1)+1]=1 \quad (208\text{-}1)$$

When $(2\times f)-\beta_{\#(2d+1),1}-1\geq 0$:

$$H_{p1,comp}[2\times(2\times f)-1][((2\times f)-\beta_{\#(2d+1),1}-1)+1]=1 \quad (208\text{-}2)$$

When $(2\times f)-\beta_{\#(2d+1),1}-1<0$:

$$H_{p1,comp}[2\times(2\times f)-1][((2\times f)-\beta_{\#(2d+1),1}-1)+1+(2\times m\times z)]=1 \quad (208\text{-}3)$$

For all v being an integer no smaller than one and no greater than 2×m×z satisfying $\{v\neq((2\times f)-0-1)+1\}$, $\{v\neq((2\times f)-\beta_{\#(2d+1),1}-1)+1\}$, and $\{v\neq((2\times f)-\beta_{\#(2d+1),1}-1)+1+(2\times m\times z)\}$, the following holds true:

$$H_{p1,comp}[2\times(2\times f)-1][v]=0 \quad (208\text{-}4)$$

Further, the following holds true for $H_{p2,comp}[2\times(2\times f)-1][v]$.

[Math. 344]

For all v being an integer no smaller than one and no greater than 2×m×z, the following holds true:

$$H_{p2,comp}[2\times(2\times f)-1][v]=0 \quad (209)$$

Further, (7) when g=2×f (where f is an integer no smaller than one and no greater than m×z), when a vector for row 2×(2×f) of the parity check matrix $H_{pro\_m}$, which is for the LDPC-CC of coding rate 3/5 that uses an improved tail-biting scheme (an LDPC block code using an LDPC-CC), can be generated by using a parity check polynomial satisfying zero provided by expression (166-2-1), ((2×f)−1)%2m=2d+1 holds true. Accordingly, a parity check polynomial satisfying zero of expression (166-2-1) where 2i+1=2d+1 holds true (where d is an integer no smaller than zero and no greater than m−1).

Accordingly, components $H_{x,1,comp}[2\times g][v]=H_{x,1,comp}[2\times(2\times f)][v]$, $H_{x,2,comp}[2\times g][v]=H_{x,2,comp}[2\times(2\times f)][v]$, $H_{x,3,comp}[2\times g][v]=H_{x,3,comp}[2\times(2\times f)][v]$, $H_{p1,comp}[2\times g][v]H_{p1,comp}[2\times(2\times f)][v]$, and $H_{p2,comp}[2\times g][v]=H_{p2,comp}[2\times(2\times f)][v]$ in row 2×g, or that is, row 2×(2×f) of the parity check matrix $H_{pro\_m}$, which is for the LDPC-CC of coding rate 3/5 that uses an improved tail-biting scheme (an LDPC block code using an LDPC-CC), is expressed as follows.

The following holds true for $H_{x,1,comp}[2\times(2\times f)][v]$.

[Math. 345]

$$H_{x,1,comp}[2\times(2\times f)][((2\times f)-0-1)+1]=1 \tag{210-1}$$

When y is an integer no smaller than one and no greater than $R_{\#(2d+1),1}$, and $(2\times f)-\alpha_{\#(2d+1),1,y}-1\geq 0$:

$$H_{x,1,comp}[2\times(2\times f)][((2\times f)-\alpha_{\#(2d+1),1,y}-1)+1]=1 \tag{210-2}$$

When $(2\times f)-\alpha_{\#(2d+1),1,y}-1<0$:

$$H_{x,1,comp}[2\times(2\times f)][((2\times f)-\alpha_{\#(2d+1),1,y}-1)+1+(2\times m\times z)]=1 \tag{210-3}$$

For all v being an integer no smaller than one and no greater than 2×m×z satisfying $\{v\neq((2\times f)-0-1)+1\}$, $\{v\neq((2\times f)-\alpha_{\#(2d+1),1,y}-1)+1\}$, and $\{v\neq((2\times f)-\alpha_{\#(2d+1),1,y}-1)+1+(2\times m\times z)\}$ (where y is an integer no smaller than one and no greater than $R_{\#(2d+1),1}$), the following holds true:

$$H_{x,1,comp}[2\times(2\times f)][v]=0 \tag{210-4}$$

The following holds true for $H_{x,\Omega,comp}[2\times(2\times f)][v]$. In the following, Ω is an integer no smaller than two and no greater than three, and y is an integer no smaller than $R_{\#(2d+1),\Omega}+1$ and no greater than $r_{\#(2d+1),\Omega}$.

[Math. 346]

When $(2\times f)-\alpha_{\#(2d+1),\Omega,y}-1\geq 0$:

$$H_{x,\Omega,comp}[2\times(2\times f)][((2\times f)-\alpha_{\#(2d+1),\Omega,y}-1)+1]=1 \tag{211-1}$$

When $(2\times f)-\alpha_{\#(2d+1),\Omega,y}-1<0$:

$$H_{x,\Omega,comp}[2\times(2\times f)][(2\times f)-\alpha_{\#(2d+1),\Omega,y}-1)+1+(2\times m\times z)]=1 \tag{211-2}$$

For all v being an integer no smaller than one and no greater than 2×m×z satisfying $\{v\neq((2\times f)-\alpha_{\#(2d+1),\Omega,y}-1)+1\}$ and $\{v\neq((2\times f)-\alpha_{\#(2d+1),\Omega,y}-1)+1+(2\times m\times z)\}$ (where y is an integer no smaller than $R_{\#(2d+1),\Omega}+1$ and no greater than $r_{\#(2d+1),\Omega}$), the following holds true:

$$H_{x,\Omega,comp}[2\times(2\times f)][v]=0 \tag{211-3}$$

Further, the following holds true for $H_{p1,comp}[2\times(2\times f)][v]$.

[Math. 347]

When $(2\times f)-\beta_{\#(2d+1),2}-1\geq 0$:

$$H_{p1,comp}[2\times(2\times f)][((2\times f)-\beta_{\#(2d+1),2}-1)+1]=1 \tag{212-1}$$

When $(2\times f)-\beta_{\#(2d+1),2}-1<0$:

$$H_{p1,comp}[2\times(2\times f)][((2\times f)-\beta_{\#(2d+1),2}-1)+1+(2\times m\times z)]=1 \tag{212-2}$$

For all v being an integer no smaller than one and no greater than 2×m×z satisfying $\{v\neq(2\times f)-\beta_{\#(2d+1),2}-1)+1\}$ and $\{v\neq((2\times f)-\beta_{\#(2d+1),2}-1)+1+(2\times m\times z)\}$, the following holds true:

$$H_{p1,comp}[2\times(2\times f)][v]=0 \tag{212-3}$$

Further, the following holds true for $H_{p2,comp}[2\times(2\times f)][v]$.

[Math. 348]

$$H_{p2,comp}[2\times(2\times f)][((2\times f)-0-1)+1]=1 \tag{213-1}$$

For all v being an integer no smaller than one and no greater than 2×m×z satisfying $\{v\neq((2\times f)-0-1)+1\}$, the following holds true:

$$H_{p2,comp}[2\times(2\times f)][v]=0 \tag{213-2}$$

Further, (8) when g=2×f (where f is an integer no smaller than one and no greater than m×z), when a vector for row 2×(2×f) of the parity check matrix $H_{pro\_m}$, which is for the LDPC-CC of coding rate 3/5 that uses an improved tail-biting scheme (an LDPC block code using an LDPC-CC), can be generated by using a parity check polynomial satisfying zero provided by expression (166-2-2), ((2×f)−1)%2m=2d+1 holds true. Accordingly, a parity check polynomial satisfying zero of expression (166-2-2) where 2i+1=2d+1 holds true (where d is an integer no smaller than zero and no greater than m−1).

Accordingly, components $H_{x,1,comp}[2\times g][v]=H_{x,1,comp}[2\times(2\times f)][v]$, $H_{x,2,comp}[2\times g][v]=H_{x,2,comp}[2\times(2\times f)][v]$ $H_{x,3,comp}[2\times g][v]=H_{x,3,comp}[2\times(2\times f)][v]$, $H_{p1,comp}[2\times g][v]=H_{p1,comp}[2\times(2\times f)][v]$, and $H_{p2,comp}[2\times g][v]=H_{p2,comp}[2\times(2\times f)][v]$ in row 2×g, or that is, row 2×(2×f) of the parity check matrix $H_{pro\_m}$, which is for the LDPC-CC of coding rate 3/5 that uses an improved tail-biting scheme (an LDPC block code using an LDPC-CC), is expressed as follows.

The following holds true for $H_{x,1,comp}[2\times(2\times f)][v]$.

[Math. 349]

$$H_{x,1,comp}[2\times(2\times f)][((2\times f)-0-1)+1]=1 \tag{214-1}$$

When y is an integer no smaller than one and no greater than $R_{\#(2d+1),1}$, and $(2\times f)-\alpha_{\#(2d+1),1,y}-1\geq 0$:

$$H_{x,1,comp}[2\times(2\times f)][((2\times f)-\alpha_{\#(2d+1),1,y}-1)+1]=1 \tag{214-2}$$

When $(2\times f)-\alpha_{\#(2d+1),1,y}-1<0$:

$$H_{x,1,comp}[2\times(2\times f)][((2\times f)-\alpha_{\#(2d+1),1,y}-1)+1+(2\times m\times z)]=1 \tag{214-3}$$

For all v being an integer no smaller than one and no greater than 2×m×z satisfying $\{v\neq((2\times f)-0-1)+1\}$, $\{v\neq((2\times f)-\alpha_{\#(2d+1),1,y}-1)+1\}$, and $\{v\neq((2\times f)-\alpha_{\#(2d+1),1,y}-1)+1+(2\times m\times z)\}$ (where y is an integer no smaller than one and no greater than $R_{\#(2d+1),1}$), the following holds true:

$$H_{x,1,comp}[2\times(2\times f)][v]=0 \tag{214-4}$$

The following holds true for $H_{x,2,comp}[2\times(2\times f)][v]$. In the following, Ω is an integer no smaller than two and no greater than three, and y is an integer no smaller than $R_{\#(2d+1),\Omega}+1$ and no greater than $r_{\#(2d+1),\Omega}$.

[Math. 350]

When $(2\times f)-\alpha_{\#(2d+1),\Omega,y}-1\geq 0$:

$$H_{x,\Omega,comp}[2\times(2\times f)][((2\times f)-\alpha_{\#(2d+1),\Omega,1}-1)+1]=1 \tag{215-1}$$

When $(2\times f)-\alpha_{\#(2d+1),\Omega,y}-1<0$:

$$H_{x,\Omega,comp}[2\times(2\times f)][((2\times f)\_\alpha_{\#(2d+1),\Omega,y}-1)+1+(2\times m\times z)]=1 \tag{215-2}$$

For all v being an integer no smaller than one and no greater than 2×m×z satisfying $\{v\neq((2\times f)-\alpha_{\#(2d+1),\Omega,y}-1)+1\}$ and $\{v\neq((2\times f)-\alpha_{\#(2d+1),\Omega,y}-1)+1+(2\times m\times z)\}$ (where y is an integer no smaller than $R_{\#(2d+1),\Omega}+1$ and no greater than $r_{\#(2d+1),\Omega}$), the following holds true:

$$H_{x,\Omega,comp}[2\times(2\times f)][v]=0 \tag{215-3}$$

Further, the following holds true for $H_{p1,comp}[2\times(2\times f)][v]$.

[Math. 351]

For all v being an integer no smaller than one and no greater than 2×m×z, the following holds true:

$$H_{p1,comp}[2\times(2\times f)][v]=0 \tag{216}$$

Further, the following holds true for $H_{p2,comp}[2\times(2\times f)][v]$.

[Math. 352]

$$H_{p2,comp}[2\times(2\times f)][((2\times f)-0-1)+1]=1 \tag{217-1}$$

When $(2\times f)-\beta_{\#(2d+1),3}-1\geq 0$:

$$H_{p2,comp}[2\times(2\times f)][((2\times f)-\beta_{\#(2d+1),3}-1)+1]=1 \quad (217\text{-}2)$$

When $(2\times f)-\beta_{\#(2d+1),3}-1<0$:

$$H_{p2,comp}[2\times(2\times f)][((2\times f)-\beta_{\#(2d+1),3}-1)+1+(2\times m\times z)]=1 \quad (217\text{-}3)$$

For all v being an integer no smaller than one and no greater than 2×m×z satisfying $\{v\neq(2\times f)-0-1)+1\}$, $\{v\neq(2\times f)-\beta_{\#(2d+1),3}-1)+1\}$, and $\{v\neq(2\times f)-\beta_{\#(2d+1),3}-1)+1+(2\times m\times z)\}$, the following holds true:

$$H_{p2,comp}[2\times(2\times f)][v]=0 \quad (217\text{-}4)$$

An LDPC-CC of coding rate 3/5 that uses an improved tail-biting scheme (an LDPC block code using an LDPC-CC) can be generated as described above, and the code so generated achieves high error correction capability.

In the above, parity check polynomials satisfying zero for the LDPC-CC of coding rate 3/5 that uses an improved tail-biting scheme (an LDPC block code using an LDPC-CC) are set as follows:

the 0th parity check polynomial satisfying zero is a parity check polynomial satisfying zero of #0'; first expression provided by expression 173;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

Based on this, the following method is conceivable as a configuration where usage of parity check polynomials satisfying zero is limited.

In this configuration, parity check polynomials satisfying zero for the LDPC-CC of coding rate 3/5 that uses an improved tail-biting scheme (an LDPC block code using an LDPC-CC) are set as follows:

the 0th parity check polynomial satisfying zero is a parity check polynomial satisfying zero of #0'; first expression provided by expression 173;

the first parity check polynomial satisfying zero is a parity check polynomial satisfying zero of #0; second expression provided by expression (165-2-1);

the 2×i−2th parity check polynomial satisfying zero is a parity check polynomial satisfying zero of #((i−1)%2m); first expression provided by expression (165-1-1) or expression (166-1-1); and the 2×i−1th parity check polynomial satisfying zero is a parity check polynomial satisfying zero of #((i−1)%2m); second expression provided by expression (165-2-1) or expression (166-2-1) (where i is an integer no smaller than two and no greater than 2×m×z).

Accordingly, in the parity check matrix $H_{pro\_m}$ for the LDPC-CC of coding rate 3/5 that uses an improved tail-biting scheme (an LDPC block code using an LDPC-CC):

the vector composed of row one of the parity check matrix $H_{pro\_m}$ is generated by using a parity check polynomial satisfying zero of #0'; first expression provided by expression 173;

the vector composed of row two of the parity check matrix $H_{pro\_m}$ is generated by using a parity check polynomial satisfying zero of #0; second expression provided by expression (165-2-1);

the vector composed of row 2×g−1 of the parity check matrix $H_{pro\_m}$ is generated by using a parity check polynomial satisfying zero of #((g−1)%2m); first expression provided by expression (165-1-1) or expression (166-1-1); and the vector composed of row 2×g of the parity check matrix $H_{pro\_m}$ is generated by using a parity check polynomial satisfying zero of #((g−1)%2m); second expression provided by expression (165-2-1) or expression (166-2-1) (where g is an integer no smaller than two and no greater than 2×m×z).

Note that when making such a configuration, the above-described method of configuring the parity check matrix $H_{pro}$ for the LDPC-CC of coding rate 3/5 that uses an improved tail-biting scheme (an LDPC block code using an LDPC-CC) is applicable.

Such a method also enables generating a code with high error correction capability.

Embodiment D5

In embodiment D4, description is provided of an LDPC-CC of coding rate 3/5 that uses an improved tail-biting scheme (an LDPC block code using an LDPC-CC) and a method of configuring a parity check matrix for the code.

With regards to parity check matrices for low density parity check (block) codes, one example of which is the LDPC-CC of coding rate 3/5 that uses an improved tail-biting scheme (an LDPC block code using an LDPC-CC), a parity check matrix equivalent to a parity check matrix defined for a given LDPC code can be generated by using the parity check matrix defined for the given LDPC code.

For example, a parity check matrix equivalent to the parity check matrix $H_{pro\_m}$ described in embodiment D4, which is for the LDPC-CC of coding rate 3/5 that uses an improved tail-biting scheme (an LDPC block code using an LDPC-CC), can be generated by using the parity check matrix $H_{pro\_m}$.

The following describes a method of generating a parity check matrix equivalent to a parity check matrix defined for a given LDPC by using the parity check matrix defined for the given LDPC code.

Note that the method of generating an equivalent parity check matrix described in the present embodiment is not only applicable to the LDPC-CC of coding rate 3/5 that uses an improved tail-biting scheme (an LDPC block code using an LDPC-CC) described in embodiment D4, but also is widely applicable to LDPC codes in general.

FIG. 31 illustrates the configuration of a parity check matrix H for an LDPC (block) code of coding rate (N−M)/N (N>M>0). For example, the parity check matrix of FIG. 31 has M rows and N columns. Here, to provide a general description, the parity check matrix H in FIG. 31 is considered to be a parity check matrix for defining an LDPC (block) code #A of coding rate (N−M)/N (N>M>0).

In FIG. 31, a transmission sequence (codeword) for block j is $v_j^T=(Y_{j,1}, Y_{j,2}, Y_{j,3}, \ldots, Y_{j,N-2}, Y_{j,N-1}, Y_{j,N})$ (for systematic codes, $Y_{j,k}$ (where k is an integer no smaller than one and no greater than N) is information X or parity P (parity $P_{pro}$)).

Here, $Hv_j=0$ holds true (where the zero in $Hv_j=0$ indicates that all elements of the vector $Hv_j$ are zeroes. That is, row k of the vector $Hv_j$ has a value of zero for all k (where k is an integer no smaller than one and no greater than M)).

Then, an element of row k (where k is an integer no smaller than one and no greater than N) of the transmission sequence $v_j$ of block j (in FIG. 31, an element of column k in the transpose matrix $v_j^T$ of the transmission sequence $v_j$) is $Y_{j,k}$, and a vector obtained by extracting column k of the parity check matrix H for the LDPC (block) code #A of coding rate (N−M)/N (N>M>0) can be expressed as $c_k$, as illustrated in FIG. 31. Here, the parity check matrix H is expressed as follows.

[Math. 353]

$$H=[c_1c_2c_3 \ldots c_{N-2}c_{N-1}c_N] \quad (218)$$

FIG. 32 illustrates a configuration when interleaving is applied to the transmission sequence (codeword) $v_j^T=(Y_{j,1}, Y_{j,2}, Y_{j,3}, \ldots, Y_{j,N-2}, Y_{j,N-1}, Y_{j,N})$ of block j. In FIG. 32, an encoding section 3202 receives information 3201 as input, performs encoding thereon, and outputs encoded data 3203. For example, when encoding the LDPC (block) code #A of coding rate (N−M)/N (N>M>0), the encoder 3202 receives information in block j as input, performs encoding thereon based on the parity check matrix H for the LDPC (block) code #A of coding rate (N−M)/N (N>M>0), and outputs the transmission sequence (codeword) $v_j^T=(Y_{j,1}, Y_{j,2}, Y_{j,3}, \ldots, Y_{j,N-2}, Y_{j,N-1}, Y_{j,N})$ of block j.

Then, an accumulation and reordering section (interleaving section) 3204 receives the encoded data 3203 as input, accumulates the encoded data 3203, performs reordering thereon, and outputs interleaved data 3205. Accordingly, the accumulation and reordering section (interleaving section) 3204 receives the transmission sequence $v_j=(Y_{j,1}, Y_{j,2}, Y_{j,3}, \ldots, Y_{j,N-2}, Y_{j,N-1}, Y_{j,N})^T$ of block j as input, and outputs a transmission sequence (codeword) $v'_j=(Y_{j,32}, Y_{j,99}, Y_{j,23}, \ldots, Y_{j,234}, Y_{j,3}, Y_{j,43})^T$, which is illustrated in FIG. 32, as a result of reordering being performed on the elements of the transmission sequence $v_j$ ($v'_j$, being an example). Here, as discussed above, the transmission sequence $v'_j$ is obtained by reordering the elements of the transmission sequence $v_j$ of block j. Accordingly, $v'_j$ is a vector having one row and n columns, and the N elements of $v'_j$ are such that one each of the terms $Y_{j,1}, Y_{j,2}, Y_{j,3}, \ldots, Y_{j,N-2}, Y_{j,N-1}, Y_{j,N}$ is present.

Here, an encoding section 3207 as shown in FIG. 32 having the functions of the encoding section 3202 and the accumulation and reordering section (interleaving section) 3204 is considered. Accordingly, the encoding section 3207 receives the information 3201 as input, performs encoding thereon, and outputs the encoded data 3203. For example, the encoding section 3207 receives information in block j as input, and as shown in FIG. 32, outputs the transmission sequence (codeword) $V'_j(Y_{j,32}, Y_{j,99}, Y_{j,23}, \ldots, Y_{j,234}, Y_{j,3}, Y_{j,43})^T$. In the following, explanation is provided of a parity check matrix H' for the LDPC (block) code of coding rate (N−M)/N (N>M>0) corresponding to the encoding section 3207 (i.e., a parity check matrix H' that is equivalent to the parity check matrix H for the LDPC (block) code #A of coding rate (N−M)/N (N>M>0)), while referring to FIG. 33. (Needless to say, the parity check matrix H' is a parity check matrix for the LDPC (block) code #A of coding rate (N−M)/N (N>M>0).)

FIG. 33 shows a configuration of the parity check matrix H', which is a parity check matrix equivalent to the parity check matrix H for the LDPC (block) code #A of coding rate (N−M)/N (N>M>0), when the transmission sequence (codeword) is $v'_j=(Y_{j,32}, Y_{j,99}, Y_{j,23}, \ldots, Y_{j,234}, Y_{j,3}, Y_{j,43})^T$. Here, an element of row one of the transmission sequence $v'_j$ of block j (an element of column one in the transpose matrix $v'^T_j$ of the transmission sequence $v'_j$ in FIG. 33) is $Y_{j,32}$. Accordingly, a vector obtained by extracting column one of the parity check matrix H', when using the above-described vector $c_k$ (k=1, 2, 3, . . . , N−2, N−1, N), is $c_{32}$. Similarly, an element of row two of the transmission sequence $v'_j$ of block j (an element of column two in the transpose matrix $v'^T_j$ of the transmission sequence $v'_j$ in FIG. 33) is $Y_{j,99}$. Accordingly, a vector obtained by extracting column two of the parity check matrix H' is $c_{99}$. Further, as shown in FIG. 33, a vector obtained by extracting column three of the parity check matrix H' is $c_{23}$, a vector obtained by extracting column N−2 of the parity check matrix H' is $c_{234}$, a vector obtained by extracting column N−1 of the parity check matrix H' is $c_3$, and a vector obtained by extracting column N of the parity check matrix H' is $c_{43}$.

That is, when denoting an element of row i of the transmission sequence $v'_j$ of block j (an element of column i in the transpose matrix $v'^T_j$ of the transmission sequence $v'_j$ in FIG. 33) as $Y_{j,g}$ (where g=1, 2, 3, . . . , N−1, N−1, N), then a vector obtained by extracting column i of the parity check matrix H' is $c_g$, when using the vector $c_k$ described above.

Accordingly, the parity check matrix H' for transmission sequence (codeword) $v'_j=(Y_{j,32}, Y_{j,99}, Y_{j,23}, \ldots, Y_{j,234}, Y_{j,3}, Y_{j,43})^T$ is expressed as follows.

[Math. 354]

$$H'=[c_{32}c_{99}c_{23} \ldots c_{234}c_3c_{43}] \quad (219)$$

When denoting an element of row i of the transmission sequence $v'_j$ of block j (an element of column i in the transpose matrix $v'^T_j$ of the transmission sequence $v'_j$ in FIG. 33) as $Y_{j,g}$ (where g=1, 2, 3, . . . , N−1, N−1, N), a vector obtained by extracting column i of the parity check matrix H' is $c_g$, when using the vector $c_k$ described above. When the above is followed to create a parity check matrix, then a parity check matrix for the transmission sequence $v'_j$ of block j can be obtained with no limitation to the above-given example.

Accordingly, when interleaving is applied to the transmission sequence (codeword) of the LDPC (block) code #A of coding rate (N−M)/N (N>M>0), a matrix for the interleaved transmission sequence is obtained by performing reordering of columns (column permutation) as described above on the parity check matrix H for the LDPC (block) code #A of coding rate (N−M)/N (N>M>0).

As such, it naturally follows that the transmission sequence (codeword) ($v_j$) obtained by reverting the interleaved transmission sequence (codeword) ($v'_j$) to its original order is the transmission sequence (codeword) of the LDPC (block) code #A of coding rate (N−M)/N (N>M>0). Accordingly, by reverting the interleaved transmission sequence (codeword) ($v'_j$) and a parity check matrix H' corresponding to the interleaved transmission sequence (codeword) ($v'_j$) to their respective orders, the transmission sequence $v_j$ and a parity check matrix corresponding to the transmission sequence $v_j$ can be obtained, respectively. Further, the parity check matrix obtained by performing the reordering as described above is the parity check matrix H in FIG. 31, description of which has been provided above.

FIG. 34 illustrates an example of a decoding-related configuration of a receiving device, when encoding of FIG. 32 has been performed. The transmission sequence obtained when the encoding of FIG. 32 is performed undergoes processing such as mapping in accordance with a modulation scheme, frequency conversion, and modulated signal amplification, whereby a modulated signal is obtained. A transmitting device transmits the modulated signal. The receiving device then receives the modulated signal transmitted by the transmitting device to obtain a received signal. A log-likelihood ratio calculation section 3400 illustrated in FIG. 34 takes the received signal as input, calculates a log-likelihood ratio for each bit of the codeword, and outputs a log-likelihood ratio signal 3401.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ of block j. Then, the log-likelihood ratio calculation section 3400 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios.

An accumulation and reordering section (deinterleaving section) 3402 receives the log-likelihood ratio signal 3401 as input, performs accumulation and reordering thereon, and outputs a deinterleaved log-likelihood ratio signal 3403.

For example, the accumulation and reordering section (deinterleaving section) 3402 receives, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, performs reordering, and outputs the log-likelihood ratios in the order of: the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order.

A decoder 3404 receives the deinterleaved log-likelihood ratio signal 3403 as input, performs belief propagation (BP) decoding as disclosed in Non-Patent Literature 6 to 8, such as sum-product decoding, min-sum decoding, offset BP decoding, normalized BP decoding, shuffled BP decoding, and layered BP decoding in which scheduling is performed, based on the parity check matrix H for the LDPC (block) code #A of coding rate (N−M)/N (N>M>0) as illustrated in FIG. 31, and thereby obtains an estimation sequence 3405 (note that decoding schemes other than belief propagation decoding may be used).

For example, the decoder 3404 receives, as input, the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order, performs belief propagation decoding based on the parity check matrix H for the LDPC (block) code #A of coding rate (N−M)/N (N>M>0) as illustrated in FIG. 31, and obtains the estimation sequence (note that decoding schemes other than belief propagation decoding may be used).

The following describes a decoding-related configuration that differs from that described above. The decoding-related configuration described in the following differs from the decoding-related configuration described above in that the accumulation and reordering section (deinterleaving section) 3402 is not included. The operations of the log-likelihood ratio calculation section 3400 are similar to those described above, and thus, explanation thereof is omitted in the following.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ of block j. Then, the log-likelihood ratio calculation section 3400 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios (corresponding to 3406 in FIG. 34).

A decoder 3407 receives the log-likelihood ratio signal 3406 for each bit as input, performs belief propagation (BP) decoding as disclosed in Non-Patent Literature 6 to 8, such as sum-product decoding, min-sum decoding, offset BP decoding, normalized BP decoding, shuffled BP decoding, and layered BP decoding in which scheduling is performed, based on the parity check matrix H' for the LDPC (block) code #A of coding rate (N−M)/N (N>M>0) as illustrated in FIG. 33, and thereby obtains an estimation sequence 3409 (note that decoding schemes other than belief propagation decoding may be used).

For example, the decoder 3407 receives, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$ in the stated order, performs belief propagation decoding based on the parity check matrix H' for the LDPC (block) code #A of coding rate (N−M)/N (N>M>0) as illustrated in FIG. 33, and obtains the estimation sequence (note that decoding schemes other than belief propagation decoding may be used).

As explained above, even when the transmitted data is reordered due to the transmitting device interleaving the transmission sequence $v_j=(Y_{j,1}, Y_{j,2}, Y_{j,3}, \ldots, Y_{j,N-2}, Y_{j,N-1}, Y_{j,N})^T$ of block j, the receiving device is able to obtain the estimation sequence by using a parity check matrix corresponding to the reordered transmitted data.

Accordingly, when interleaving is applied to the transmission sequence (codeword) of the LDPC (block) code #A of coding rate (N−M)/N (N>M>0), a parity check matrix for the interleaved transmission sequence (codeword) is obtained by performing reordering of columns (i.e., column permutation) as described above on the parity check matrix for the LDPC (block) code #A of coding rate (N−M)/N (N>M>0). As such, the receiving device is able to perform belief propagation decoding and thereby obtain an estimation sequence without performing interleaving on the log-likelihood ratio for each acquired bit.

Note that in the above, explanation is provided of the relation between interleaving applied to a transmission sequence and a parity check matrix. In the following, explanation is provided of reordering of rows (row permutation) performed on a parity check matrix.

FIG. 35 illustrates a configuration of a parity check matrix H corresponding to a transmission sequence (codeword) $v_j^T=(Y_{j,1}, Y_{j,2}, Y_{j,3}, \ldots, Y_{j,N-2}, Y_{j,N-1}, Y_{j,N})$ of block j of the LDPC (block) code #A of coding rate (N−M)/N (N>M>0). For example, the parity check matrix H of FIG. 35 is a matrix having M rows and N columns. (for systematic codes, $Y_{j,k}$ (where k is an integer no smaller than one and no greater than N) is information X or parity P (parity $P_{pro}$), and is composed of (N−M) information bits and M parity bits). Here, $Hv_j=0$ holds true. (Here, the zero in $Hv_j=0$ indicates that all elements of the vector $Hv_j$ are zeroes. That is, row k of the vector $Hv_j$ has a value of zero for all k (where k is an integer no smaller than one and no greater than M.)

Further, a vector obtained by extracting column k (where k is an integer no smaller than one and no greater than M) of the parity check matrix H for the LDPC (block) code #A of coding rate (N−M)/N (N>M>0) as illustrated in FIG. 35 is denoted as $z_k$. Then, the parity check matrix H for the LDPC (block) code is expressed as follows.

[Math. 355]

$$H=\begin{bmatrix} z_1 \\ z_2 \\ \vdots \\ z_{M-1} \\ z_M \end{bmatrix} \tag{220}$$

Next, a parity check matrix obtained by performing reordering of rows (row permutation) on the parity check matrix H of FIG. 35 is considered.

FIG. 36 shows an example of a parity check matrix H' obtained by performing reordering of rows (row permutation) on the parity check matrix H of FIG. 35. The parity check matrix H', similar to the parity check matrix shown in FIG. 35, is a parity check matrix corresponding to the transmission sequence (codeword) $v_j^T=(Y_{j,1}, Y_{j,2}, Y_{j,3}, \ldots, Y_{j,N-2}, Y_{j,N-1}, Y_{j,N})$ of block j of the LDPC (block) code #A of coding rate (N−M)/N (N>M>0).

The parity check matrix H' of FIG. 36 is composed of vectors $z_k$ obtained by extracting row k (where k is an integer no smaller one and no greater than M) of the parity check matrix H of FIG. 35. For example, in the parity check matrix H', the first row is composed of vector $z_{130}$, the second row is composed of vector $z_{24}$, the third row is composed of vector $z_{45}$, . . . , the (M−2)th row is composed of vector $z_{33}$, the (M−1)th row is composed of vector $z_9$, and the Mth row is composed of vector $z_3$. Note that each of the M row-vectors obtained by extracting row k (where k is an integer no smaller than one and no greater than M) of the parity check matrix H' is such that one each of $z_1, z_2, z_3, \ldots z_{M-2}, z_{M-1}$, and $z_M$ is present.

Here, the parity check matrix H' for the LDPC (block) code #A of coding rate (N−M)/N (N>M>0) is expressed as follows.

[Math. 356]

$$H' = \begin{bmatrix} z_{130} \\ z_{24} \\ \vdots \\ z_9 \\ z_3 \end{bmatrix} \tag{221}$$

Further, $H'v_j=0$ holds true. (Here, the zero in $H'v_j=0$ indicates that all elements of the vector $H'v_j$ are zeroes. That is, row k of the vector $H'v_j$ has a value of zero for all k (where k is an integer no smaller than one and no greater than M.)

That is, for the transmission sequence $v_j^T$ of block j, a vector obtained by extracting row i of the parity check matrix H' in FIG. 36 is expressed as $c_k$ (where k is an integer no smaller than one and no greater than M), and each of the M row vectors obtained by extracting row k (where k is an integer no smaller than one and no greater than M) of the parity check matrix H' in FIG. 36 is such that one each of $z_1, z_2, z_3, \ldots z_{M-2}, z_{M-1}$, and $z_M$ is present.

As described above, for the transmission sequence $v_j^T$ of block j, a vector obtained by extracting row i of the parity check matrix H' in FIG. 36 is expressed as $c_k$ (where k is an integer no smaller than one and no greater than M), and each of the M row vectors obtained by extracting row k (where k is an integer no smaller than one and no greater than M) of the parity check matrix H' in FIG. 36 is such that one each of $z_1, z_2, z_3, \ldots z_{M-2}, z_{M-1}$, and $z_M$ is present. Note that, when the above is followed to create a parity check matrix, then a parity check matrix for the transmission sequence parity $v_j$ of block j can be obtained with no limitation to the above-given example.

Accordingly, even when the LDPC (block) code #A of coding rate (N−M)/N (N>M>0) is being used, it does not necessarily follow that a transmitting device and a receiving device are using the parity check matrix H. As such, a transmitting device and a receiving device may use as a parity check matrix, for example, a matrix obtained by performing reordering of columns (column permutation) as described above on the parity check matrix H or a matrix obtained by performing reordering of rows (row permutation) on the parity check matrix H.

In addition, a matrix obtained by performing both reordering of columns (column permutation) and reordering of rows (row permutation) as described above on the parity check matrix H for the LDPC (block) code #A of coding rate (N−M)/N (N>M>0) may be used as a parity check matrix.

In such a case, a parity check matrix $H_1$ is obtained by performing reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_2$ is obtained by performing reordering of rows (row permutation) on the parity check matrix $H_1$ (i.e., through conversion from the parity check matrix shown in FIG. 35 to the parity check matrix shown in FIG. 36). A transmitting device and a receiving device may perform encoding and decoding by using the parity check matrix $H_2$ so obtained.

Also, a parity check matrix $H_{1,1}$ is obtained by performing a first reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_{2,1}$ may be obtained by performing a first reordering of rows (row permutation) on the parity check matrix $H_{1,1}$ (i.e., through conversion from the parity check matrix shown in FIG. 35 to the parity check matrix shown in FIG. 36).

Further, a parity check matrix $H_{1,2}$ may be obtained by performing a second reordering of columns (column permutation) on the parity check matrix $H_{2,1}$. Finally, a parity check matrix $H_{2,2}$ may be obtained by performing a second reordering of rows (row permutation) on the parity check matrix $H_{1,2}$.

As described above, a parity check matrix $H_{2,s}$ may be obtained by repetitively performing reordering of columns (column permutation) and reordering of rows (row permutation) for s iterations (where s is an integer no smaller than two). In such a case, a parity check matrix $H_{1,k}$ is obtained by performing a kth (where k is an integer no smaller than two and no greater than s) reordering of columns (column permutation) on a parity check matrix $H_{2,k-1}$. Then, a parity check matrix $H_{2,k}$ is obtained by performing a kth reordering of rows (row permutation) on the parity check matrix $H_{1,k}$. Note that in the first instance, a parity check matrix $H_{1,1}$ is obtained by performing a first reordering of columns (column permutation) on the parity check matrix H for the LDPC (block) code #A of coding rate (N−M)/N (N>M>0). Then, a parity check matrix $H_{2,1}$ is obtained by performing a first reordering of rows (row permutation) on the parity check matrix $H_{1,1}$.

In such a case, a transmitting device and a receiving device may perform encoding and decoding by using the parity check matrix $H_{2,s}$.

In an alternative method, a parity check matrix $H_3$ is obtained by performing reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_4$ is obtained by performing reordering of columns (column permutation) on the parity check matrix $H_3$ (i.e., through conversion from the parity check matrix shown in FIG. 31 to the parity check matrix shown in FIG. 33). In such a case, a transmitting device and a receiving device may perform encoding and decoding by using the parity check matrix $H_4$ so obtained.

Also, a parity check matrix $H_{3,1}$ is obtained by performing a first reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_{4,1}$ may be obtained by performing a first reordering of columns (column permutation) on the parity check matrix $H_{3,1}$ (i.e., through conversion from the parity check matrix shown in FIG. 31 to the parity check matrix shown in FIG. 33).

Then, a parity check matrix $H_{3,2}$ may be obtained by performing a second reordering of rows (row permutation) on the parity check matrix $H_{4,1}$. Finally, a parity check matrix $H_{4,2}$ may be obtained by performing a second reordering of columns (column permutation) on the parity check matrix $H_{3,2}$.

As described above, a parity check matrix $H_{4,s}$ may be obtained by repetitively performing reordering of rows (row permutation) and reordering of columns (column permutation) for s iterations (where s is an integer no smaller than two). In such a case, a parity check matrix $H_{3,k}$ is obtained by performing a kth (where k is an integer no smaller two and no greater than s) reordering of rows (row permutation) on a parity check matrix $H_{4,k-1}$. Then, a parity check matrix $H_{4,k}$ is obtained by performing a kth reordering of columns (column permutation) on the parity check matrix $H_{3,k}$. Note that in the first instance, a parity check matrix $H_{3,1}$ is obtained by performing a first reordering of rows (row permutation) on the parity check matrix H for the LDPC (block) code #A of coding rate (N−M)/N (N>M>0). Then, a parity check matrix $H_{4,1}$ is obtained by performing a first reordering of columns (column permutation) on the parity check matrix $H_{3,1}$.

In such a case, a transmitting device and a receiving device may perform encoding and decoding by using the parity check matrix $H_{4,s}$.

Here, note that by performing reordering of rows (row permutation) and reordering of columns (column permutation), the parity check matrix H for the LDPC (block) code #A of coding rate (N−M)/N (N>M>0) can be obtained from each of the parity check matrix $H_2$, the parity check matrix $H_{2,s}$, the parity check matrix $H_4$, and the parity check matrix $H_{4,s}$.

Similarly, a matrix obtained by performing both reordering of columns (column permutation) as described above and reordering of rows (row permutation) as described above on the parity check matrix H for the LDPC (block) code #A of coding rate (N−M)/N (N>M>0) may be used as a parity check matrix.

In such a case, a parity check matrix $H_5$ is obtained by performing reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_6$ is obtained by performing reordering of rows (row permutation) on the parity check matrix $H_5$ (i.e., through conversion from the parity check matrix shown in FIG. 35 to the parity check matrix shown in FIG. 36). A transmitting device and a receiving device may perform encoding and decoding by using the parity check matrix $H_6$ so obtained.

Also, a parity check matrix $H_{5,1}$ is obtained by performing a first reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_{6,1}$ may be obtained by performing a first reordering of rows (row permutation) on the parity check matrix $H_{5,1}$ (i.e., through conversion from the parity check matrix shown in FIG. 35 to the parity check matrix shown in FIG. 36).

Further, a parity check matrix $H_{5,2}$ may be obtained by performing a second reordering of columns (column permutation) on the parity check matrix $H_{6,1}$. Finally, a parity check matrix $H_{6,2}$ may be obtained by performing a second reordering of rows (row permutation) on the parity check matrix $H_{5,2}$.

As described above, a parity check matrix $H_{6,s}$ may be obtained by repetitively performing reordering of columns (column permutation) and reordering of rows (row permutation) for s iterations (where s is an integer no smaller than two). In such a case, a parity check matrix $H_{5,k}$ is obtained by performing a kth (where k is an integer no smaller than two and no greater than s) reordering of columns (column permutation) on a parity check matrix $H_{6,k-1}$. Then, a parity check matrix $H_{6,k}$ is obtained by performing a kth reordering of rows (row permutation) on the parity check matrix $H_{5,k}$. Note that in the first instance, a parity check matrix $H_{5,1}$ is obtained by performing a first reordering of columns (column permutation) on the parity check matrix H for the LDPC (block) code #A of coding rate (N−M)/N (N>M>0). Then, a parity check matrix $H_{6,1}$ is obtained by performing a first reordering of rows (row permutation) on the parity check matrix $H_{5,1}$.

In such a case, a transmitting device and a receiving device may perform encoding and decoding by using the parity check matrix $H_{6,s}$.

In an alternative method, a parity check matrix $H_7$ is obtained by performing reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_8$ is obtained by performing reordering of columns (column permutation) on the parity check matrix $H_7$ (i.e., through conversion from the parity check matrix shown in FIG. 31 to the parity check matrix shown in FIG. 33). In such a case, a transmitting device and a receiving device may perform encoding and decoding by using the parity check matrix $H_8$ so obtained.

Also, a parity check matrix $H_{7,1}$ is obtained by performing a first reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_{8,1}$ may be obtained by performing a first reordering of columns (column permutation) on the parity check matrix $H_{7,1}$ (i.e., through conversion from the parity check matrix shown in FIG. 31 to the parity check matrix shown in FIG. 33).

Then, a parity check matrix $H_{7,2}$ may be obtained by performing a second reordering of rows (row permutation) on the parity check matrix $H_{8,1}$. Finally, a parity check matrix $H_{8,2}$ may be obtained by performing a second reordering of columns (column permutation) on the parity check matrix $H_{7,2}$.

As described above, a parity check matrix $H_{8,s}$ may be obtained by repetitively performing reordering of rows (row permutation) and reordering of columns (column permutation) for s iterations (where s is an integer no smaller than two). In such a case, a parity check matrix $H_{7,k}$ is obtained by performing a kth (where k is an integer no smaller two and no greater than s) reordering of rows (row permutation) on a parity check matrix $H_{8,k-1}$. Then, a parity check matrix $H_{8,k}$ is obtained by performing a kth reordering of columns (column permutation) on the parity check matrix $H_{7,k}$. Note that in the first instance, a parity check matrix $H_{7,1}$ is obtained by performing a first reordering of rows (row permutation) on the parity check matrix H for the LDPC (block) code #A of coding rate (N−M)/N (N>M>0). Then, a parity check matrix $H_{8,1}$ is obtained by performing a first reordering of columns (column permutation) on the parity check matrix $H_{7,1}$.

In such a case, a transmitting device and a receiving device may perform encoding and decoding by using the parity check matrix $H_{8,s}$.

Here, note that by performing reordering of rows (row permutation) and reordering of columns (column permutation), the parity check matrix H for the LDPC (block) code #A of coding rate (N−M)/N (N>M>0) can be obtained from each of the parity check matrix $H_6$, the parity check matrix $H_{6,s}$, the parity check matrix $H_8$, and the parity check matrix $H_{8,s}$.

In the present embodiment, description is provided of a method of generating a parity check matrix equivalent to a parity check matrix H for the LDPC (block) code #A of coding rate (N−M)/N (N>M>0) by performing reordering of rows (row permutation) and/or reordering of columns (column permutation) with respect to the parity check matrix H. Further, description is provided of a method of applying the equivalent parity check matrix in, for example, a communication/broadcast system using an encoder and a decoder using the equivalent parity check matrix. Note that the error correction code described herein may be applied to various fields, including but not limited to communication/broadcast systems.

Embodiment D6

In the present embodiment, description is provided of a device that uses the LDPC-CC of coding rate 3/5 that uses an improved tail-biting scheme (an LDPC block code using an LDPC-CC), description of which is provided in embodiment D4.

As one example, description is provided of a case where the LDPC-CC of coding rate 3/5 that uses an improved tail-biting scheme (an LDPC block code using an LDPC-CC) is applied to a communication device.

FIG. 22 illustrates the structures of a transmitting device 2200 and a receiving device 2210 in the communication device pertaining to the present embodiment.

An encoder 2201 receives information to be transmitted as input, and is capable of performing various types of encoding (e.g., various coding rates and various block lengths of block codes (for example, in systematic codes, the sum of the number of information bits and the number of parity bits)). In particular, when receiving a specification to perform encoding by using the LDPC-CC of coding rate 3/5 that uses an improved tail-biting scheme (an LDPC block code using an LDPC-CC), the encoder 2201 performs encoding by using the LDPC-CC of coding rate 3/5 that uses an improved tail-biting scheme (an LDPC block code using an LDPC-CC) to calculate parities $P_1$ and $P_2$. Further, the encoder 2201 outputs the information to be transmitted and the parities $P_1$ and $P_2$ as a transmission sequence.

A modulator 2202 receives the transmission sequence, which includes the information to be transmitted and the parities P1 and P2, performs mapping based on a predetermined modulation scheme (for example, BPSK, QPSK, 16QAM, or 64QAM), and outputs a baseband signal. Further, the modulator 2202 may also receive information other than the transmission sequence, which includes the information to be transmitted and the parities $P_1$ and $P_2$, as input, perform mapping, and output a baseband signal. For example, the modulator 2202 may receive control information as input.

The transmitting device outputs a transmission signal after performing predetermined signal processing (e.g., signal processing for generation of an OFDM signal, frequency conversion, amplification) with respect to such signals (e.g., baseband signals, pilot signals). The transmitting device may transmit the transmission signal over a wireless transmission path utilizing electromagnetic waves, or over a wired transmission path utilizing a coaxial cable, a power line, an optical cable, or the like.

The transmission signal is received by the receiving device 2210 after travelling over the transmission path. A receiver 2211 receives a reception signal as input, performs predetermined signal processing (e.g., bandwidth limitation, frequency conversion, signal processing for OFDM, frequency offset estimation, signal detection, channel estimation), and outputs a baseband signal and a channel estimation signal.

A log-likelihood ratio generation section 2212 receives the baseband signal and the channel estimation signal as input (may receive other signals as input), and for example, calculates and outputs a log-likelihood ratio for each bit (may calculate and output a hard value (hard decision value)).

A decoder 2213 receives the log-likelihood ratio for each bit as input, performs belief propagation decoding (e.g., sum-product decoding, scheduled sum-product decoding (Layered BP (belief propagation) decoding), min-sum decoding, Normalized BP decoding, offset BP decoding), and outputs an estimation sequence. The decoder 2213 performs the belief propagation decoding based on the parity check matrix for the LDPC-CC of coding rate 3/5 that uses an improved tail-biting scheme (an LDPC block code using an LDPC-CC).

Although description is provided above taking an example where error correction coding is introduced to a communication device, the error correction coding described above is not limited to being introduced to a communication device, and for example, may be introduced to a storage medium (storage). When making such a modification, information that is to be stored to a storage medium (storage) is encoded by using the LDPC-CC of coding rate 3/5 that uses an improved tail-biting scheme (an LDPC block code using an LDPC-CC), and resultant information and parities are stored to the storage medium (storage).

Further, the LDPC-CC of coding rate 3/5 that uses an improved tail-biting scheme (an LDPC block code using an LDPC-CC) is applicable to any device that requires error correction coding (e.g., a memory, a hard disk).

Note that when using a block code such as the LDPC-CC of coding rate 3/5 that uses an improved tail-biting scheme (an LDPC block code using an LDPC-CC) in a device, there as cases where special processing needs to be executed.

Assume that a block length of the LDPC-CC of coding rate 3/5 that uses an improved tail-biting scheme (an LDPC block code using an LDPC-CC) used in a device is 10000 bits (6000 information bits, and 4000 parity bits).

In such a case, the number of information bits necessary for encoding one block is 6000. Meanwhile, there are cases where the number of bits of information input to an encoding section of the device does not reach 6000. For example, assume a case where only 5000 information bits are input to the encoding section.

Here, it is assumed that the encoding section, in the above-described case, adds 1000 padding bits of information to the 5000 information bits having been input, and performs encoding by using a total of 6000 bits, composed of the 5000 information bits having been input and the 1000 padding bits, to generate 4000 parity bits. Here, assume that all of the 1000 padding bits are known bits. For example, assume that each of the 1000 padding bits is "0".

A transmitting device may output the 5000 information bits having been input, the 1000 padding bits, and the 4000 parity bits. Alternatively, a transmitting device may output the 5000 information bits having been input and the 4000 parity bits.

In addition, a transmitting device may perform puncturing with respect to the 5000 information bits having been input and the 4000 parity bits, and thereby output a number of bits smaller than 10000 in total.

Note that when performing transmission in such a manner, the transmitting device is required to transmit, to a receiving device, information notifying the receiving device that transmission has been performed in such a manner.

As described above, the LDPC-CC of coding rate 3/5 that uses an improved tail-biting scheme (an LDPC block code using an LDPC-CC), description of which is provided in embodiment D4, is applicable to various devices.

Embodiment E1

The present embodiment describes a method of configuring an LDPC-CC of coding rate 5/7 that is based on a parity check polynomial, as one example of an LDPC-CC not satisfying coding rate (n−1)/n.

Bits of information bits $X_1$, $X_2$, $X_3$, $X_4$, $X_5$ and parity bits $P_1$, $P_2$, at time point j, are expressed $X_{1,j}$, $X_{2,j}$, $X_{3,j}$, $X_{4,j}$, $X_{5,j}$ and $P_{1,j}$, $P_{2,j}$, respectively.

A vector $u_j$, at time point j, is expressed $u_j=(X_{1,j}, X_{2,j}, X_{3,j}, X_{4,j}, X_{5,j}, P_{1,j}, P_{2,j})$.

Given a delay operator D, polynomial expressions of the information bits $X_1$, $X_2$, $X_3$, $X_4$, $X_5$ are $X_1(D)$, $X_2(D)$, $X_3(D)$, $X_4(D)$, $X_5(D)$, and polynomial expressions of the parity bits $P_1$, $P_2$ are $P_1(D)$, $P_2(D)$.

Further, consideration is given to an LDPC-CC of coding rate 5/7 and time-varying period 2m that is based on a parity check polynomial.

The following mathematical expressions are provided as parity check polynomials satisfying zero for an LDPC-CC of coding rate 5/7 and time-varying period 2m that is based on a parity check polynomial.

First, because two parities $P_1$ and $P_2$ exist, parity check polynomials satisfying zero are provided as described in the following, two for $1\times P_1(D)$ and two for $1\times P_2(D)$.

[Math. 357-1]

$$\begin{aligned}
&(D^{\alpha\#(2i)1,2}+D^{\alpha\#(2i),1,1}+1)X_1(D)+(D^{\alpha\#(2i)2,2}+D^{\alpha\#(2i),2,1}+1)X_2(D)+\\
&\left(\sum_{s=3}^{r\#(2i),3}D^{\alpha\#(2i),3,s}\right)X_3(D)+\left(\sum_{s=3}^{r\#(2i),4}D^{\alpha\#(2i),4,s}\right)X_4(D)+\\
&\left(\sum_{s=3}^{r\#(2i),5}D^{\alpha\#(2i),5,s}\right)X_5(D)+P_1(D)D^{\beta\#(2i),0}P_2(D)=\\
&(D^{\alpha\#(2i),1,2}+D^{\alpha\#(2i),1,1}+1)X_1(D)+(D^{\alpha\#(2i),2,2}+D^{\alpha\#(2i),2,1}+1)X_2(D)+\\
&(D^{\alpha\#(2i),3,r\#(2i),3}+\dots+D^{\alpha\#(2i),3,3})X_3(D)+\\
&(D^{\alpha\#(2i),4,r\#(2i),4}+\dots+D^{\alpha\#(2i),4,3})X_4(D)+\\
&(D^{\alpha\#(2i),5,r\#(2i),5}+\dots+D^{\alpha\#(2i),5,3})X_5(D)+\\
&P_1(D)+D^{\beta\#(2i),0}P_2(D)=0
\end{aligned}\tag{97-1-1}$$

$$\begin{aligned}
&(D^{\alpha\#(2i)1,2}+D^{\alpha\#(2i),1,1}+1)X_1(D)+(D^{\alpha\#(2i)2,2}+D^{\alpha\#(2i),2,1}+1)X_2(D)+\\
&\left(\sum_{s=3}^{r\#(2i),3}D^{\alpha\#(2i),3,s}\right)X_3(D)+\left(\sum_{s=3}^{r\#(2i),4}D^{\alpha\#(2i),4,s}\right)X_4(D)+\\
&\left(\sum_{s=3}^{r\#(2i),5}D^{\alpha\#(2i),5,s}\right)X_5(D)+P_1(D)D^{\beta\#(2i),1}P_1(D)=\\
&(D^{\alpha\#(2i),1,2}+D^{\alpha\#(2i),1,1}+1)X_1(D)+(D^{\alpha\#(2i),2,2}+D^{\alpha\#(2i),2,1}+1)X_2(D)+\\
&(D^{\alpha\#(2i),3,r\#(2i),3}+\dots+D^{\alpha\#(2i),3,3})X_3(D)+\\
&(D^{\alpha\#(2i),4,r\#(2i),4}+\dots+D^{\alpha\#(2i),4,3})X_4(D)+\\
&(D^{\alpha\#(2i),5,r\#(2i),5}+\dots+D^{\alpha\#(2i),5,3})X_5(D)+\\
&P_1(D)+D^{\beta\#(2i),1}P_1(D)=0
\end{aligned}\tag{97-1-2}$$

[Math. 357-2]

$$\begin{aligned}
&\left(\sum_{s=3}^{r\#(2i),1}D^{\alpha\#(2i),1,s}\right)X_1(D)+\left(\sum_{s=3}^{r\#(2i),2}D^{\alpha\#(2i),2,s}\right)X_2(D)+\\
&(D^{\alpha\#(2i),3,2}+D^{\alpha\#(2i),3,1}+1)X_3(D)+(D^{\alpha\#(2i),4,2}+D^{\alpha\#(2i),4,1}+1)X_4(D)+\\
&(D^{\alpha\#(2i),5,2}+D^{\alpha\#(2i),5,1}+1)X_5(D)+P_2(D)+D^{\beta\#(2i),2}P_1(D)=\\
&(D^{\alpha\#(2i),1,r\#(2i),1}+\dots+D^{\alpha\#(2i),1,3})X_1(D)+\\
&(D^{\alpha\#(2i),2,r\#(2i),2}+\dots+D^{\alpha\#(2i),2,3})X_2(D)+\\
&(D^{\alpha\#(2i),3,2}+D^{\alpha\#(2i),3,1}+1)X_3(D)+\\
&(D^{\alpha\#(2i),4,2}+D^{\alpha\#(2i),4,1}+1)X_4(D)+\\
&(D^{\alpha\#(2i),5,2}+D^{\alpha\#(2i),5,1}+1)X_5(D)+\\
&P_2(D)+D^{\beta\#(2i),2}P_1(D)=0
\end{aligned}\tag{97-2-1}$$

$$\begin{aligned}
&\left(\sum_{s=3}^{r\#(2i),1}D^{\alpha\#(2i),1,s}\right)X_1(D)+\left(\sum_{s=3}^{r\#(2i),2}D^{\alpha\#(2i),2,s}\right)X_2(D)+\\
&(D^{\alpha\#(2i),3,2}+D^{\alpha\#(2i),3,1}+1)X_3(D)+(D^{\alpha\#(2i),4,2}+D^{\alpha\#(2i),4,1}+1)X_4(D)+\\
&(D^{\alpha\#(2i),5,2}+D^{\alpha\#(2i),5,1}+1)X_5(D)+P_2(D)+D^{\beta\#(2i),3}P_2(D)=\\
&(D^{\alpha\#(2i),1,r\#(2i),1}+\dots+D^{\alpha\#(2i),1,3})X_1(D)+\\
&(D^{\alpha\#(2i),2,r\#(2i),2}+\dots+D^{\alpha\#(2i),2,3})X_2(D)+\\
&(D^{\alpha\#(2i),3,2}+D^{\alpha\#(2i),3,1}+1)X_3(D)+\\
&(D^{\alpha\#(2i),4,2}+D^{\alpha\#(2i),4,1}+1)X_4(D)+\\
&(D^{\alpha\#(2i),5,2}+D^{\alpha\#(2i),5,1}+1)X_5(D)+\\
&P_2(D)+D^{\beta\#(2i),3}P_2(D)=0
\end{aligned}\tag{97-2-2}$$

In expressions (97-1-1), (97-1-2), (97-2-1), (97-2-2), i is an integer no smaller than zero and no greater than m−1 (i=0, 1, . . . , m−2, m−1).

In expressions (97-1-1), (97-1-2), (97-2-1), (97-2-2), $\alpha_{\#(2i),p,q}$ (where p is an integer no smaller than one and no greater than five, q is an integer no smaller than one and no greater than $r_{\#(2i),p}$ (where $r_{\#(2i),p}$ is a natural number)) and $\beta_{\#(2i),0}$ is a natural number, $\beta_{\#(2i),1}$ is a natural number, $\beta_{\#(2i),2}$ is an integer no smaller than zero, and $\beta_{\#(2i),3}$ is a natural number.

Further, y is an integer no smaller than one and no greater than $r_{\#(2i),p}$, z is an integer no smaller than one and no greater than $r_{\#2i,p}$, and $\alpha_{\#(2i),p,y} \neq \alpha_{\#(2i),p,z}$ holds true for $\forall$(y, z) where y≠z. ∀ is a universal quantifier. (y is an integer no smaller than one and no greater than $r_{\#(2i),p}$, z is an integer no smaller than one and no greater than $r_{\#2i,p}$, and $\alpha_{\#(2i),p,y} \neq \alpha_{\#(2i),p,z}$ holds true for all y and all z satisfying y≠z.)

Note that in the following, to simplify explanation, a parity check polynomial satisfying zero that is expressed by expression (97-1-1) or expression (97-1-2) is referred to as "#(2i); first expression" for realizing a time-varying period 2m, and a parity check polynomial satisfying zero that is expressed by expression (97-2-1) or expression (97-2-2) is referred to as "#(2i); second expression" for realizing a time-varying period 2m.

Thus, for each i, as #(2i); first expression for realizing a time-varying period 2m, a parity check polynomial satisfying zero expressed by either expression (97-1-1) or expression (97-1-2) is prepared.

That is, for i=0, a parity check polynomial satisfying zero provided by expression (97-1-1) where i=0, or a parity check polynomial satisfying zero provided by expression (97-1-2) where i=0 is prepared.

Similarly:

for i=1, a parity check polynomial satisfying zero provided by expression (97-1-1) where i=1, or a parity check polynomial satisfying zero provided by expression (97-1-2) where i=1 is prepared;

for i=2, a parity check polynomial satisfying zero provided by expression (97-1-1) where i=2, or a parity check polynomial satisfying zero provided by expression (97-1-2) where i=2 is prepared;

⋮ for i=z, a parity check polynomial satisfying zero provided by expression (97-1-1) where i=z, or a parity check polynomial satisfying zero provided by expression (97-1-2) where i=z is prepared (where z is an integer no smaller than zero and no greater than m−1); and

⋮ for i=m−1, a parity check polynomial satisfying zero provided by expression (97-1-1) where i=m−1, or a parity check polynomial satisfying zero provided by expression (97-1-2) where i=m−1 is prepared.

Similarly, for each i, as #(2i); second expression for realizing a time-varying period 2m, a parity check polynomial satisfying zero expressed by either expression (97-2-1) or expression (97-2-2) is prepared.

That is, for i=0, a parity check polynomial satisfying zero provided by expression (97-2-1) where i=0, or a parity check polynomial satisfying zero provided by expression (97-2-2) where i=0 is prepared.

Similarly:

for i=1, a parity check polynomial satisfying zero provided by expression (97-2-1) where i=1, or a parity check polynomial satisfying zero provided by expression (97-2-2) where i=1 is prepared;

for i=2, a parity check polynomial satisfying zero provided by expression (97-2-1) where i=2, or a parity check polynomial satisfying zero provided by expression (97-2-2) where i=2 is prepared;

⋮ for i=z, a parity check polynomial satisfying zero provided by expression (97-2-1) where i=z, or a parity check polynomial satisfying zero provided by expression (97-2-2) where i=z is prepared (where z is an integer no smaller than zero and no greater than m−1); and

⋮ for i=m−1, a parity check polynomial satisfying zero provided by expression (97-2-1) where i=m−1, or a parity check polynomial satisfying zero provided by expression (97-2-2) where i=m−1 is prepared.

Similarly, because two parities $P_1$ and $P_2$ exist, parity check polynomials satisfying zero are provided as described in the following, two for $1\times P_1(D)$ and two for $1\times P_2(D)$.

[Math. 358-1]

$$\left(\sum_{s=3}^{r_{\#(2i+1),1}} D^{\alpha\#(2i+1),1,s}\right)X_1(D) + \left(\sum_{s=3}^{r_{\#(2i+1),2}} D^{\alpha\#(2i+1),2,s}\right)X_2(D) + (D^{\alpha\#(2i+1),3,2} + D^{\alpha\#(2i+1),3,1} + 1)X_3(D) + (D^{\alpha\#(2i+1),4,2} + D^{\alpha\#(2i+1),4,1} + 1)X_4(D) + (D^{\alpha\#(2i+1),5,2} + D^{\alpha\#(2i+1),5,1} + 1)X_5(D) + P_1(D) + D^{\beta\#(2i+1),0}P_2(D) = (D^{\alpha\#(2i+1),1,r_{\#(2i+1),1}} + \ldots + D^{\alpha\#(2i+1),1,3})X_1(D) + (D^{\alpha\#(2i+1),2,r_{\#(2i+1),2}} + \ldots + D^{\alpha\#(2i+1),2,3})X_2(D) + (D^{\alpha\#(2i+1),3,2} + D^{\alpha\#(2i+1),3,1} + 1)X_3(D) + (D^{\alpha\#(2i+1),4,2} + D^{\alpha\#(2i+1),4,1} + 1)X_4(D) + (D^{\alpha\#(2i+1),5,2} + D^{\alpha\#(2i+1),5,1} + 1)X_5(D) + P_1(D) + D^{\beta\#(2i+1),0}P_2(D) = 0 \quad (98\text{-}1\text{-}1)$$

$$\left(\sum_{s=3}^{r_{\#(2i+1),1}} D^{\alpha\#(2i+1),1,s}\right)X_1(D) + \left(\sum_{s=3}^{r_{\#(2i+1),2}} D^{\alpha\#(2i+1),2,s}\right)X_2(D) + (D^{\alpha\#(2i+1),3,2} + D^{\alpha\#(2i+1),3,1} + 1)X_3(D) + (D^{\alpha\#(2i+1),4,2} + D^{\alpha\#(2i+1),4,1} + 1)X_4(D) + (D^{\alpha\#(2i+1),5,2} + D^{\alpha\#(2i+1),5,1} + 1)X_5(D) + P_1(D) + D^{\beta\#(2i+1),1}P_1(D) = (D^{\alpha\#(2i+1),1,r_{\#(2i+1),1}} + \ldots + D^{\alpha\#(2i+1),1,3})X_1(D) + (D^{\alpha\#(2i+1),2,r_{\#(2i+1),2}} + \ldots + D^{\alpha\#(2i+1),2,3})X_2(D) + (D^{\alpha\#(2i+1),3,2} + D^{\alpha\#(2i+1),3,1} + 1)X_3(D) + (D^{\alpha\#(2i+1),4,2} + D^{\alpha\#(2i+1),4,1} + 1)X_4(D) + (D^{\alpha\#(2i+1),5,2} + D^{\alpha\#(2i+1),5,1} + 1)X_5(D) + P_1(D) + D^{\beta\#(2i+1),1}P_1(D) = 0 \quad (98\text{-}1\text{-}2)$$

[Math. 358-2]

$$(D^{\alpha\#(2i+1)1,2} + D^{\alpha\#(2i+1),1,1} + 1)X_1(D) + (D^{\alpha\#(2i+1)2,2} + D^{\alpha\#(2i+1),2,1} + 1)X_2(D) + \left(\sum_{s=3}^{r_{\#(2i+1),3}} D^{\alpha\#(2i+1),3,s}\right)X_3(D) + \left(\sum_{s=3}^{r_{\#(2i+1),4}} D^{\alpha\#(2i+1),4,s}\right)X_4(D) + \left(\sum_{s=3}^{r_{\#(2i+1),5}} D^{\alpha\#(2i+1),5,s}\right)X_5(D) + P_2(D)D^{\beta\#(2i+1),2}P_1(D) = (D^{\alpha\#(2i+1),1,2} + D^{\alpha\#(2i+1),1,1} + 1)X_1(D) + (D^{\alpha\#(2i+1),2,2} + D^{\alpha\#(2i+1),2,1} + 1)X_2(D) + (D^{\alpha\#(2i+1),3,r_{\#(2i+1),3}} + \ldots + D^{\alpha\#(2i+1),3,3})X_3(D) + (D^{\alpha\#(2i+1),4,r_{\#(2i+1),4}} + \ldots + D^{\alpha\#(2i+1),4,3})X_4(D) + (D^{\alpha\#(2i+1),5,r_{\#(2i+1),5}} + \ldots + D^{\alpha\#(2i+1),5,3})X_5(D) + P_2(D) + D^{\beta\#(2i+1),2}P_1(D) = 0 \quad (98\text{-}2\text{-}1)$$

-continued $$(D^{\alpha\#(2i+1)1,2} + D^{\alpha\#(2i+1),1,1} + 1)X_1(D) + (D^{\alpha\#(2i+1)2,2} + D^{\alpha\#(2i+1),2,1} + 1)X_2(D) + \left(\sum_{s=3}^{r_{\#(2i+1),3}} D^{\alpha\#(2i+1),3,s}\right)X_3(D) + \left(\sum_{s=3}^{r_{\#(2i+1),4}} D^{\alpha\#(2i+1),4,s}\right)X_4(D) + \left(\sum_{s=3}^{r_{\#(2i+1),5}} D^{\alpha\#(2i+1),5,s}\right)X_5(D) + P_2(D)D^{\beta\#(2i+1),3}P_2(D) = (D^{\alpha\#(2i+1),1,2} + D^{\alpha\#(2i+1),1,1} + 1)X_1(D) + (D^{\alpha\#(2i+1),2,2} + D^{\alpha\#(2i+1),2,1} + 1)X_2(D) + (D^{\alpha\#(2i+1),3,r_{\#(2i+1),3}} + \dots + D^{\alpha\#(2i+1),3,3})X_3(D) + (D^{\alpha\#(2i+1),4,r_{\#(2i+1),4}} + \dots + D^{\alpha\#(2i+1),4,3})X_4(D) + (D^{\alpha\#(2i+1),5,r_{\#(2i+1),5}} + \dots + D^{\alpha\#(2i+1),5,3})X_5(D) + P_2(D) + D^{\beta\#(2i+1),3}P_2(D) = 0 \quad (98\text{-}2\text{-}2)$$

In expressions (98-1-1), (98-1-2), (98-2-1), (98-2-2), i is an integer no smaller than zero and no greater than m−1 (i=0, 1, . . . , m−2, m−1).

In expressions (98-1-1), (98-1-2), (98-2-1), (98-2-2), $\alpha_{\#(2i+1),p,q}$ (where p is an integer no smaller than one and no greater than five, q is an integer no smaller than one and no greater than $r_{\#(2i+1),p}$ (where $r_{\#(2i+1),p}$ is a natural number)) and $\beta_{\#(2i+1),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, y is an integer no smaller than one and no greater than $r_{\#(2i+1),p}$, z is an integer no smaller than one and no greater than $r_{\#(2i+1),p}$, and $\alpha_{\#(2i+1)p,y} \neq \alpha_{\#(2i+1),p,z}$ holds true for $^\forall$(y, z) where y≠z. ∀ is a universal quantifier. (y is an integer no smaller than one and no greater than $r_{\#(2i+1),p}$, z is an integer no smaller than one and no greater than $r_{\#(2i+1),p}$, and $\alpha_{\#(2i+1),p,y} \neq \alpha_{\#(2i+1),p,z}$ holds true for all y and all z satisfying y≠z.)

Note that in the following, to simplify explanation, a parity check polynomial satisfying zero that is expressed by expression (98-1-1) or expression (98-1-2) is referred to as "#(2i+1); first expression" for realizing a time-varying period 2m, and a parity check polynomial satisfying zero that is expressed by expression (98-2-1) or expression (98-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (98-1-1) or expression (98-1-2) is prepared.

That is, for i=0, a parity check polynomial satisfying zero provided by expression (98-1-1) where i=0, or a parity check polynomial satisfying zero provided by expression (98-1-2) where i=0 is prepared.

Similarly:

for i=1, a parity check polynomial satisfying zero provided by expression (98-1-1) where i=1, or a parity check polynomial satisfying zero provided by expression (98-1-2) where i=1 is prepared;

for i=2, a parity check polynomial satisfying zero provided by expression (98-1-1) where i=2, or a parity check polynomial satisfying zero provided by expression (98-1-2) where i=2 is prepared;

⋮ for i=z, a parity check polynomial satisfying zero provided by expression (98-1-1) where i=z, or a parity check polynomial satisfying zero provided by expression (98-1-2) where i=z is prepared (where z is an integer no smaller than zero and no greater than m−1); and

⋮ for i=m−1, a parity check polynomial satisfying zero provided by expression (98-1-1) where i=m−1, or a parity check polynomial satisfying zero provided by expression (98-1-2) where i=m−1 is prepared.

Similarly, for each i, as #(2i+1); second expression for realizing a time-varying period 2m, a parity check polynomial satisfying zero expressed by either expression (98-2-1) or expression (98-2-2) is prepared.

That is, for i=0, a parity check polynomial satisfying zero provided by expression (98-2-1) where i=0, or a parity check polynomial satisfying zero provided by expression (98-2-2) where i=0 is prepared.

Similarly:

for i=1, a parity check polynomial satisfying zero provided by expression (98-2-1) where i=1, or a parity check polynomial satisfying zero provided by expression (98-2-2) where i=1 is prepared;

for i=2, a parity check polynomial satisfying zero provided by expression (98-2-1) where i=2, or a parity check polynomial satisfying zero provided by expression (98-2-2) where i=2 is prepared;

⋮ for i=z, a parity check polynomial satisfying zero provided by expression (98-2-1) where i=z, or a parity check polynomial satisfying zero provided by expression (98-2-2) where i=z is prepared (where z is an integer no smaller than zero and no greater than m−1); and

⋮ for i=m−1, a parity check polynomial satisfying zero provided by expression (98-2-1) where i=m−1, or a parity check polynomial satisfying zero provided by expression (98-2-2) where i=m−1 is prepared.

As such, an LDPC-CC of coding rate 5/7 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (97-1-1) or expression (97-1-2), parity check polynomials satisfying zero provided by expression (97-2-1) or expression (97-2-2), parity check polynomials satisfying zero provided by expression (98-1-1) or expression (98-1-2), and parity check polynomials satisfying zero provided by expression (98-2-1) or expression (98-2-2).

For example, the time varying period 2×m can be formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expressions (97-1-1), (97-1-2), (97-2-1), (97-2-

2), (98-1-1), (98-1-2), (98-2-1), and (98-2-2) (where j is an integer no smaller than zero).

The following presumes that 2k=j%2m holds true. In the following, % means a modulo, and for example, α%6 represents a remainder after dividing α by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

The following describes a method of configuring a parity check matrix for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a vector $u_j$ at time point j is expressed as $u_j=(X_{1,j}, X_{2,j}, X_{3,j}, X_{4,j}, X_{5,j}, P_{1,j}, P_{2,j})$ (where j is an integer no smaller than zero). In the following, a case where u is a transmission vector is considered. Note that in the following, j is an integer no smaller than one, and thus j differs between the description having been provided above and the description provided in the following. (j is set as such to facilitate understanding of the correspondence between the column numbers and the row numbers of the parity check matrix.)

Accordingly, $U(u_1, u_2, u_3, \ldots, u_{y-1}, u_y, u_{y+1}, \ldots)^T=(X_{1,1}, X_{2,1}, X_{3,1}, X_{4,1}, X_{5,1}, P_{1,1}, P_{2,1}, X_{1,2}, X_{2,2}, X_{3,2}, X_{4,2}, X_{5,2}, P_{1,2}, P_{2,2}, X_{1,3}, X_{2,3}, X_{3,3}, X_{4,3}, X_{5,3}, P_{1,3}, P_{2,3}, \ldots, X_{1,y-1}, X_{2,y-1}, X_{3,y-1}, X_{4,y-1}, X_{5,y-1}, P_{1,y-1}, P_{2,y-1}, X_{1,y}, X_{2,y}, X_{3,y}, X_{4,y}, X_{5,y}, P_{1,y}, P_{2,y}, X_{1,y+1}, X_{2,y+1}, X_{3,y+1}, X_{4,y+1}, X_{5,y+1}, P_{1,y+1}, P_{2,y+1}, \ldots)^T$. Further, when using H to denote a parity check matrix for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, Hu=0 holds true (here, Hu=0 indicates that all elements of the vector Hu are zeroes).

FIG. 75 indicates a configuration of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the topmost row of the parity check matrix is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

As illustrated in FIG. 75:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression"; and "a vector for the (2×i)th row of the parity check matrix H can be generated from a parity check polynomial satisfying zero of #((i−1)%2m); second expression", and so on (where i is an integer no smaller than one).

Figure 76:
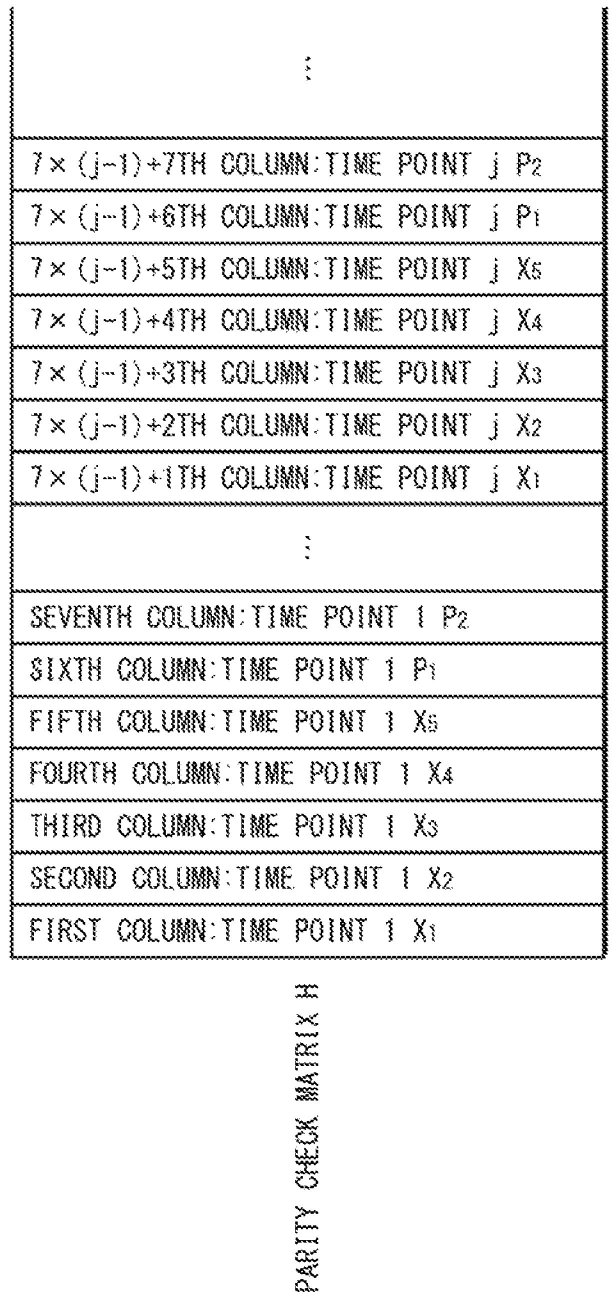
FIG. 76 shows an example of the configuration of check matrix for LDPC-CC of coding rate 5/7 and time-varying period 2×m that is based on a parity check polynomial.

FIG. 76 indicates a configuration of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the leftmost column of the parity check matrix is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

As illustrated in FIG. 76:

"a vector for the first column of the parity check matrix H is related to $X_1$ at time point 1";

"a vector for the second column of the parity check matrix H is related to $X_2$ at time point 1";

"a vector for the third column of the parity check matrix H is related to $X_3$ at time point 1";

"a vector for the fourth column of the parity check matrix H is related to $X_4$ at time point 1";

"a vector for the fifth column of the parity check matrix H is related to $X_5$ at time point 1";

"a vector for the sixth column of the parity check matrix H is related to $P_1$ at time point 1";

"a vector for the seventh column of the parity check matrix H is related to $P_2$ at time point 1";

⋮

"a vector for the 7×(j−1)+1th column of the parity check matrix H is related to $X_1$ at time point j";

"a vector for the 7×(j−1)+2th column of the parity check matrix H is related to $X_2$ at time point j";

"a vector for the 7×(j−1)+3th column of the parity check matrix H is related to $X_3$ at time point j";

"a vector for the 7×(j−1)+4th column of the parity check matrix H is related to $X_4$ at time point j";

"a vector for the 7×(j−1)+5th column of the parity check matrix H is related to $X_5$ at time point j";

"a vector for the 7×(j−1)+6th column of the parity check matrix H is related to $P_1$ at time point j"; and "a vector for the 7×(j−1)+7th column of the parity check matrix H is related to $P_2$ at time point j"; and so on (where j is an integer no smaller than one).

Figure 77:
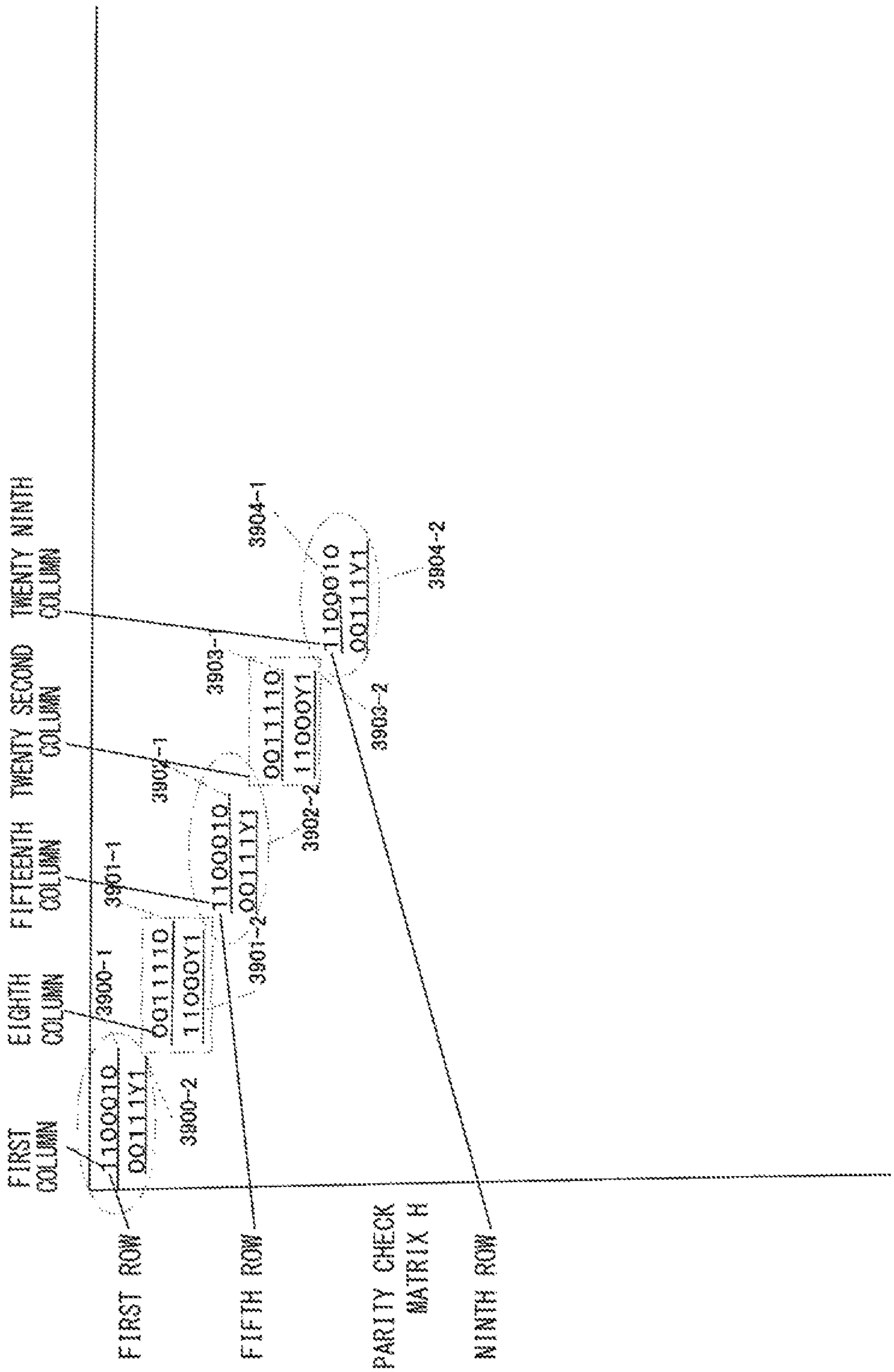
FIG. 77 shows an example of the configuration of check matrix for LDPC-CC of coding rate 5/7 and time-varying period 2×m that is based on a parity check polynomial.

FIG. 77 indicates a parity check matrix for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The following focuses on $1\times X_1(D)$, $1\times X_2(D)$, $1\times X_3(D)$, $1\times X_4(D)$, $1\times X_5(D)$, $1\times P_1(D)$, $1\times P_2(D)$ in the parity check matrix for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The parity check polynomials at time point j=1 are parity check polynomials when i=0 in expressions (97-1-1), (97-1-2), (97-2-1), (97-2-2).

A vector for the first row in FIG. 77 can be generated from a parity check polynomial when i=0 in expression (97-1-1) or expression (97-1-2) (refer to FIG. 75).

In expressions (97-1-1) and (97-1-2):

terms for $1\times X_1(D)$ and $1\times X_2(D)$ exist;

terms for $1\times X_3(D)$, $1\times X_4(D)$, and $1\times X_5(D)$ do not exist; and a term for $1\times P_1(D)$ exists but a term for $1\times P_2(D)$ does not exist.

Further, the relationship between column numbers and $X_1$, $X_2$, $X_3$, $X_4$, $X_5$, $P_1$, $P_2$ is as indicated in FIG. 76. Based on the relationship indicated in FIG. 76 and the fact that terms for $1\times X_1(D)$ and $1\times X_2(D)$ exist, columns related to $X_1$ and $X_2$ in the vector for the first row in FIG. 77 are "1". Further, based on the relationship indicated in FIG. 76 and the fact that terms for $1\times X_3(D)$, $1\times X_4(D)$, and $1\times X_5(D)$ do not exist, columns related to $X_3$, $X_4$, $X_5$ in the vector for the first row in FIG. 77 are "0". In addition, based on the relationship indicated in FIG. 76 and the fact that a term for $1\times P_1(D)$ exists but a term for $1\times P_2(D)$ does not exist, a column related to $P_1$ in the vector for the first row in FIG. 77 is "1", and a column related to $P_2$ in the vector for the first row in FIG. 77 is "0".

As such, the vector for the first row in FIG. 77 is "1100010", as indicated by 3900-1 in FIG. 77.

A vector for the second row in FIG. 77 can be generated from a parity check polynomial when i=0 in expression (97-2-1) or expression (97-2-2) (refer to FIG. 75).

In expressions (97-2-1) and (97-2-2):

terms for $1\times X_1(D)$ and $1\times X_2(D)$ do not exist;

terms for $1\times X_3(D)$, $1\times X_4(D)$, and $1\times X_5(D)$ exist; and a term for $1\times P_1(D)$ may or may not exist but a term for $1\times P_2(D)$ exists.

Further, the relationship between column numbers and $X_1$, $X_2$, $X_3$, $X_4$, $X_5$, $P_1$, $P_2$ is as indicated in FIG. 76. Based on the relationship indicated in FIG. 76 and the fact that terms for $1\times X_1(D)$ and $1\times X_2(D)$ do not exist, columns related to $X_1$ and $X_2$ in the vector for the second row in FIG. 77 are "0". Further, based on the relationship indicated in FIG. 76 and the fact that terms for $1\times X_3(D)$, $1\times X_4(D)$, and $1\times X_5(D)$ exist, columns related to $X_3$, $X_4$, $X_5$ in the vector for the second row in FIG. 77 are "1". In addition, based on the relationship indicated in FIG. 76 and the fact that a term for $1\times P_1(D)$ may or may not exist but a term for $1\times P_2(D)$ exists, a column related to $P_1$ in the vector for the second row in FIG. 77 is "Y", and a column related to $P_2$ in the vector for the second row in FIG. 77 is "1", where Y is either "0" or "1".

As such, the vector for the second row in FIG. 77 is "00111Y1", as indicated by 3900-2 in FIG. 77.

The parity check polynomials at time point j=2 are parity check polynomials when i=0 in expressions (98-1-1), (98-1-2), (98-2-1), (98-2-2).

A vector for the third row in FIG. 77 can be generated from a parity check polynomial when i=0 in expression (98-1-1) or expression (98-1-2) (refer to FIG. 75).

In expressions (98-1-1) and (98-1-2):

terms for $1\times X_1(D)$ and $1\times X_2(D)$ do not exist;

terms for $1\times X_3(D)$, $1\times X_4(D)$, and $1\times X_5(D)$ exist; and a term for $1\times P_1(D)$ exists but a term for $1\times P_2(D)$ does not exist.

Further, the relationship between column numbers and $X_1$, $X_2$, $X_3$, $P_1$, $P_2$ is as indicated in FIG. 76. Based on the relationship indicated in FIG. 76 and the fact that terms for $1\times X_1(D)$ and $1\times X_2(D)$ do not exist, columns related to $X_1$ and $X_2$ in the vector for the third row in FIG. 77 are "0". Further, based on the relationship indicated in FIG. 76 and the fact that terms for $1\times X_3(D)$, $1\times X_4(D)$, and $1\times X_5(D)$ exist, columns related to $X_3$, $X_4$, $X_5$ in the vector for the third row in FIG. 77 are "1". In addition, based on the relationship indicated in FIG. 76 and the fact that a term for $1\times P_1(D)$ exists but a term for $1\times P_2(D)$ does not exist, a column related to $P_1$ in the vector for the third row in FIG. 77 is "1", and a column related to $P_2$ in the vector for the third row in FIG. 77 is "0".

As such, the vector for the third row in FIG. 77 is "0011110", as indicated by 3901-1 in FIG. 77.

A vector for the fourth row in FIG. 77 can be generated from a parity check polynomial when i=0 in expression (98-2-1) or expression (98-2-2) (refer to FIG. 75).

In expressions (98-2-1) and (98-2-2):

terms for $1\times X_1(D)$ and $1\times X_2(D)$ exist;

terms for $1\times X_3(D)$, $1\times X_4(D)$, and $1\times X_5(D)$ do not exist; and a term for $1\times P_1(D)$ may or may not exist but a term for $1\times P_2(D)$ exists.

Further, the relationship between column numbers and $X_1$, $X_2$, $X_3$, $P_1$, $P_2$ is as indicated in FIG. 76. Based on the relationship indicated in FIG. 76 and the fact that terms for $1\times X_1(D)$ and $1\times X_2(D)$ exist, columns related to $X_1$ and $X_2$ in the vector for the fourth row in FIG. 77 are "1". Further, based on the relationship indicated in FIG. 76 and the fact that terms for $1\times X_3(D)$, $1\times X_4(D)$, and $1\times X_5(D)$ do not exist, columns related to $X_3$, $X_4$, $X_5$ in the vector for the fourth row in FIG. 77 are "0". In addition, based on the relationship indicated in FIG. 76 and the fact that a term for $1\times P_1(D)$ may or may not exist but a term for $1\times P_2(D)$ exists, a column related to $P_1$ in the vector for the fourth row in FIG. 77 is "Y", and a column related to $P_2$ in the vector for the fourth row in FIG. 77 is "1".

As such, the vector for the fourth row in FIG. 77 is "11000Y1", as indicated by 3901-2 in FIG. 77.

Because it can be considered that the above similarly applies to cases where time point j=3, 4, 5, the parity check matrix H has the configuration indicated in FIG. 77.

That is, due to the parity check polynomials of expressions (97-1-1), (97-1-2), (97-2-1), (97-2-2) being used at time point j=2k+1 (where k is an integer no smaller than zero), "1100010" exists in the 2×(2k+1)−1th row of the parity check matrix H, and "00111Y1" exists in the 2×(2k+1)th row of the parity check matrix H, as illustrated in FIG. 77.

Further, due to the parity check polynomials of expressions (98-1-1), (98-1-2), (98-2-1), (98-2-2) being used at time point j=2k+2 (where k is an integer no smaller than zero), "0011110" exists in the 2×(2k+2)−1th row of the parity check matrix H, and "11000Y1" exists in the 2×(2k+2)th row of the parity check matrix H, as illustrated in FIG. 77.

Accordingly, as illustrated in FIG. 77, when denoting a column number of a leftmost column corresponding to "1" in "1100010" in a row where "1100010" exists (e.g., 3900-1 in FIG. 77) as "a", "0011110" (e.g., 3901-1 in FIG. 77) exists in a row that is two rows below the row where "1100010" exists, starting from column "a+7".

Similarly, as illustrated in FIG. 77, when denoting a column number of a leftmost column corresponding to "1" in "00111Y1" in a row where "00111Y1" exists (e.g., 3900-2 in FIG. 77) as "b", "11000Y1" (e.g., 3901-2 in FIG. 77) exists in a row that is two rows below the row where "00111Y1" exists, starting from column "b+7".

Similarly, as illustrated in FIG. 77, when denoting a column number of a leftmost column corresponding to "1" in "0011110" in a row where "0011110" exists (e.g., 3901-1 in FIG. 77) as "c", "1100010" (e.g., 3902-1 in FIG. 77) exists in a row that is two rows below the row where "0011110" exists, starting from column "c+7".

Similarly, as illustrated in FIG. 77, when denoting a column number of a leftmost column corresponding to "1" in "11000Y1" in a row where "11000Y1" exists (e.g., 3901-2 in FIG. 77) as "d", "00111Y1" (e.g., 3902-2 in FIG. 77) exists in a row that is two rows below the row where "11000Y1" exists, starting from column "d+7".

The following describes a parity check matrix for an LDPC-CC of coding rate 5/7 and time-varying period 2×m that is based on a parity check polynomial when tail-biting is not performed, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

In the following, $H_{com}[u][v]$ (where u and v are integers no smaller than one) denotes an element at row "u" column "v" of a parity check matrix for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Based on description above provided with reference to FIG. 75:

"a vector for the 2×g−1th row of the parity check matrix H can be generated from a parity check polynomial satisfying zero of #((g−1)%2m); first expression"; and "a vector for the (2×g)th row of the parity check matrix H can be generated from a parity check polynomial satisfying zero of #((g−1)%2m); second expression" (where g is an integer no smaller than one).

Based on description above provided with reference to FIG. 76:

"a vector for the 7×(j−1)+1th column of the parity check matrix H is related to $X_1$ at time point j";

"a vector for the 7×(j−1)+2th column of the parity check matrix H is related to $X_2$ at time point j";

"a vector for the 7×(j−1)+3th column of the parity check matrix H is related to $X_3$ at time point j";

"a vector for the 7×(j−1)+4th column of the parity check matrix H is related to $X_4$ at time point j";

"a vector for the 7×(j−1)+5th column of the parity check matrix H is related to $X_5$ at time point j";

"a vector for the 7×(j−1)+6th column of the parity check matrix H is related to $P_1$ at time point j"; and "a vector for the 7×(j−1)+7th column of the parity check matrix H is related to $P_2$ at time point j"; (where j is an integer no smaller than one).

Based on the above, the following describes component $H_{com}[2\times g-1][v]$ in row 2×g−1 (where g is an integer no smaller than one) and component $H_{com}[2\times g][v]$ in row 2×g of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a parity check polynomial satisfying zero of #((g−1)%2m); first expression can be used to generate a vector for row 2×g−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #((g−1)%2m); second expression can be used to generate a vector for row 2×g of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, when g=2×f−1 (where f is an integer no smaller than one), a parity check polynomial satisfying zero of #(((2×f−1)−1)%2m); first expression, or that is, a parity check polynomial satisfying zero of either expression (97-1-1) or expression (97-1-2), can be used to generate a vector for row 2×(2×f−1)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f−1)−1)%2m); second expression, or that is, a parity check polynomial satisfying zero of either expression (97-2-1) or expression (97-2-2), can be used to generate a vector for row 2×(2×f−1) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, when g=2×f (where f is an integer no smaller than one), a parity check polynomial satisfying zero of #(((2×f)−1)%2m); first expression, or that is, a parity check polynomial satisfying zero of either expression (98-1-1) or expression (98-1-2), can be used to generate a vector for row 2×(2×f)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f)−1)%2m); second expression, or that is, a parity check polynomial satisfying zero of either expression (98-2-1) or expression (98-2-2), can be used to generate a vector for row 2×(2×f) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, (1) when g=2×f−1 (where f is an integer no smaller than one), when a vector for row 2×(2×f−1)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-1-1), (2×f−1)−1)%2m=2c holds true. Accordingly, a parity check polynomial satisfying zero of expression (97-1-1) where 2i=2c holds true (where c is an integer no smaller than zero and no greater than m−1).

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 359]

$$H_{com}[2\times(2\times f-1)-1][7\times((2\times f-1)-0-1)+1]=1 \tag{99-1}$$

When $(2\times f-1)-\alpha_{\#(2c),1,1}-1\geq 0$:

$$H_{com}[2\times(2\times f-1)-1][7\times((2\times f-1)-\alpha_{\#(2c),1,1}-1)+1]=1 \tag{99-2}$$

When $(2\times f-1)-\alpha_{\#(2c),1,2}-1\geq 0$:

$$H_{com}[2\times(2\times f-1)-1][7\times((2\times f-1)-\alpha_{\#(2c),1,2}-1)+1]=1 \tag{99-3}$$

For all u being an integer no smaller than one satisfying $\{u\neq(2\times f-1)-0,\ u\neq(2\times f-1)-\alpha_{\#(2c),1,1},$ and $u\neq(2\times f-1)-\alpha_{\#(2c),1,2}\}$:

$$H_{com}[2\times(2\times f-1)-1][7\times(u-1)+1]=0 \tag{99-4}$$

Considered in a similar manner, the following holds true for $X_w$. In the following, w is an integer no smaller than one and no greater than two.

[Math. 360]

$$H_{com}[2\times(2\times f-1)-1][7\times((2\times f-1)-0-1)+w]=1 \tag{100-1}$$

When $(2\times f-1)-\alpha_{\#(2c),w,1}-1\geq 0$:

$$H_{com}[2\times(2\times f-1)-1][7\times((2\times f-1)-\alpha_{\#(2c),w,1}-1)+w]=1 \tag{100-2}$$

When $(2\times f-1)-\alpha_{\#(2c),w,2}-1\geq 0$:

$$H_{com}[2\times(2\times f-1)-1][7\times((2\times f-1)-\alpha_{\#(2c),w,2}-1)+w]=1 \tag{100-3}$$

For all u being an integer no smaller than one satisfying $\{u\neq(2\times f-1)-0,\ u\neq 2\times f-1)-\alpha_{\#(2c),w,1},$ and $u\neq(2\times f-1)-\alpha_{\#(2c),w,2}\}$:

$$H_{com}[2\times(2\times f-1)-1][7\times(u-1)+w]=0 \tag{100-4}$$

Further, the following holds true for $X_3$. In the following, y is an integer no smaller than three and no greater than $r_{\#(2c),3}$.

[Math. 361]

When $(2\times f-1)-\alpha_{\#(2c),3,y}-1\geq 0$:

$$H_{com}[2\times(2\times f-1)-1][7\times((2\times f-1)-\alpha_{\#(2c),3,y}-1)+3]=1 \tag{101-1}$$

For all u being an integer no smaller than one satisfying $\{u\neq(2\times f-1)-\alpha_{\#(2c),3,y}\}$ (where y is an integer no smaller than three and no greater than $r_{\#(2c),3}$):

$$H_{com}[2\times(2\times f-1)-1][7\times(u-1)+3]=0 \tag{101-2}$$

Considered in a similar manner, the following holds true for $X_z$. In the following, z is an integer no smaller than three and no greater than five, and y is an integer no smaller than three and no greater than $r_{\#(2c),z}$.

[Math. 362]

When $(2\times f-1)-\alpha_{\#(2c),z,y}-1\geq 0$:

$$H_{com}[2\times(2\times f-1)-1][7\times((2\times f-1)-\alpha_{\#(2c),z,y}-1)+z]=1 \tag{102-1}$$

For all u being an integer no smaller than one satisfying $\{u\neq(2\times f-1)-\alpha_{\#(2c),z,y}\}$ (where y is an integer no smaller than three and no greater than $r_{\#(2c),z}$):

$$H_{com}[2\times(2\times f-1)-1][7\times(u-1)+z]=0 \tag{102-2}$$

The following holds true for $P_1$.

[Math. 363]

$$H_{com}[2\times(2\times f-1)-1][7\times((2\times f-1)-0-1)+6]=1 \tag{103-1}$$

For all u being an integer no smaller than one satisfying $\{u\neq(2\times f-1)-0\}$:

$$H_{com}[2\times(2\times f-1)-1][7\times(u-1)+6]=0 \tag{103-2}$$

The following holds true for $P_2$.

[Math. 364]

When $(2\times f-1)-\beta_{\#(2c),0}-1\geq 0$:

$$H_{com}[2\times(2\times f-1)-1][7\times((2\times f-1)-\beta_{\#(2c),0}-1)+7]=1 \tag{104-1}$$

For all u being an integer no smaller than one satisfying $\{u\neq(2\times f-1)-\beta_{\#(2c),0}\}$:

$$H_{com}[2\times(2\times f-1)-1][7\times(u-1)+7]=0 \tag{104-2}$$

Further, (2) when g=2×f−1 (where f is an integer no smaller than one), when a vector for row 2×(2×f−1)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-1-2), ((2×f−1)−1)%2m=2c holds true. Accordingly, a parity check polynomial satisfying zero of expression (97-1-2) where 2i=2c holds true (where c is an integer no smaller than zero and no greater than m−1).

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 365]

$$H_{com}[2\times(2\times f-1)-1][7\times((2\times f-1)-0-1)+1]=1 \tag{105-1}$$

When $(2\times f-1)-\alpha_{\#(2c),1,1}-1\geq 0$:

$$H_{com}[2\times(2\times f-1)-1][7\times((2\times f-1)-\alpha_{\#(2c),1,1}-1)+1]=1 \tag{105-2}$$

When $(2\times f-1)-\alpha_{\#(2c),1,2}-1\geq 0$:

$$H_{com}[2\times(2\times f-1)-1][7\times((2\times f-1)-\alpha_{\#(2c),1,2}-1)+1]=1 \tag{105-3}$$

For all u being an integer no smaller than one satisfying $\{u\neq(2\times f-1)-0,\ u\neq(2\times f-1)-\alpha_{\#(2c),1,1},$ and $u\neq(2\times f-1)-\alpha_{\#(2c),1,2}\}$:

$$H_{com}[2\times(2\times f-1)-1][7\times(u-1)+1]=0 \tag{105-4}$$

Considered in a similar manner, the following holds true for $X_w$. In the following, w is an integer no smaller than one and no greater than two.

[Math. 366]

$$H_{com}[2\times(2\times f-1)-1][7\times((2\times f-1)-0-1)+w]=1 \tag{106-1}$$

When $(2\times f-1)-\alpha_{\#(2c),w,1}-1\geq 0$:

$$H_{com}[2\times(2\times f-1)-1][7\times((2\times f-1)-\alpha_{\#(2c),w,1}-1)+w]=1 \tag{106-2}$$

When $(2\times f-1)-\alpha_{\#(2c),w,2}-1\geq 0$:

$$H_{com}[2\times(2\times f-1)-1][7\times((2\times f-1)-\alpha_{\#(2c),w,2}-1)+w]=1 \tag{106-3}$$

For all u being an integer no smaller than one satisfying $\{u\neq(2\times f-1)-0,\ u\neq(2\times f-1)-\alpha_{\#(2c),w,1},$ and $u\neq(2\times f-1)-\alpha_{\#(2c),w,2}\}$:

$$H_{com}[2\times(2\times f-1)-1][7\times(u-1)+w]=0 \tag{106-4}$$

Further, the following holds true for $X_3$. In the following, y is an integer no smaller than three and no greater than $r_{\#(2c),3}$.

[Math. 367]

When $(2\times f-1)-\alpha_{\#(2c),3,y}-1\geq 0$:

$$H_{com}[2\times(2\times f-1)-1][7\times((2\times f-1)-\alpha_{\#(2c),3,y}-1)+3]=1 \tag{107-1}$$

For all u being an integer no smaller than one satisfying $\{u\neq(2\times f-1)-\alpha_{\#(2c),3,y}\}$ (where y is an integer no smaller than three and no greater than $r_{\#(2c),3}$):

$$H_{com}[2\times(2\times f-1)-1][7\times(u-1)+3]=0 \tag{107-2}$$

Considered in a similar manner, the following holds true for $X_z$. In the following, z is an integer no smaller than three and no greater than five, and y is an integer no smaller than three and no greater than $r_{\#(2c),z}$.

[Math. 368]

When $(2\times f-1)-\alpha_{\#(2c),z,y}-1\geq 0$:

$$H_{com}[2\times(2\times f-1)-1][7\times((2\times f-1)-\alpha_{\#(2c),z,y}-1)+z]=1 \quad (108\text{-}1)$$

For all u being an integer no smaller than one satisfying $\{u\neq(2\times f-1)-\alpha_{\#(2c),z,y}\}$ (where y is an integer no smaller than three and no greater than $r_{\#(2c),z}$):

$$H_{com}[2\times(2\times f-1)-1][7\times(u-1)+z]=0 \quad (108\text{-}2)$$

The following holds true for $P_1$.

[Math. 369]

$$H_{com}[2\times(2\times f-1)-1][7\times((2\times f-1)-0-1)+6]=1 \quad (109\text{-}1)$$

When $(2\times f-1)-\beta_{\#(2c),1}-1\geq 0$:

$$H_{com}[2\times(2\times f-1)-1][7\times((2\times f-1)-\beta_{\#(2c),1}-1)+6]=1 \quad (109\text{-}2)$$

For all u being an integer no smaller than one satisfying $\{u\neq(2\times f-1)-0 \text{ and } u\neq(2\times f-1)-\beta_{\#(2c),1}\}$:

$$H_{com}[2\times(2\times f-1)-1][7\times(u-1)+6]=0 \quad (109\text{-}3)$$

The following holds true for $P_2$.

[Math. 370]

For all u being an integer no smaller than one:

$$H_{com}[2\times(2\times f-1)-1][7\times(u-1)+7]=0 \quad (110)$$

Further, (3) when g=2×f−1 (where f is an integer no smaller than one), when a vector for row 2×(2×f−1) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-2-1), (2×f−1)−1)%2m=2c holds true. Accordingly, a parity check polynomial satisfying zero of expression (97-2-1) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, and y is an integer no smaller than three and no greater than $r_{\#(2c),1}$.

[Math. 371]

When $(2\times f-1)-\alpha_{\#(2c),1,y}-1\geq 0$:

$$H_{com},[2\times(2\times f-1)][7\times((2\times f-1)-\alpha_{\#(2c),1,y}-1)+1]=1 \quad (111\text{-}1)$$

For all u being an integer no smaller than one satisfying $\{u\neq(2\times f-1)-\alpha_{\#(2c),1,y}\}$ (where y is an integer no smaller than three and no greater than $r_{\#(2c),1}$):

$$H_{com}[2\times(2\times f-1)][7\times(u-1)+1]=0 \quad (111\text{-}2)$$

Considered in a similar manner, the following holds true for $X_z$. In the following, z is an integer no smaller than one and no greater than two, and y is an integer no smaller than three and no greater than $r_{\#(2c),z}$.

[Math. 372]

When $(2\times f-1)-\alpha_{\#(2c),z,y}-1\geq 0$:

$$H_{com}[2\times(2\times f-1)][7\times((2\times f-1)-\alpha_{\#(2c),z,y}-1)+z]=1 \quad (112\text{-}1)$$

For all u being an integer no smaller than and satisfying $\{u\neq(2\times f-1)-\alpha_{\#(2c),z,y}\}$ (where y is an integer no smaller than three and no greater than $r_{\#(2c),z}$):

$$H_{com}[2\times(2\times f-1)][7\times(u-1)+z]=0 \quad (112\text{-}2)$$

Further, the following holds true for $X_3$.

[Math. 373]

$$H_{com}[2\times(2\times f-1)][7\times((2\times f-1)-0-1)+3]=1 \quad (113\text{-}1)$$

When $(2\times f-1)-\alpha_{\#(2c),3,1}-1\geq 0$:

$$H_{com}[2\times(2\times f-1)][7\times((2\times f-1)-\alpha_{\#(2c),3,1}-1)+3]=1 \quad (113\text{-}2)$$

When $(2\times f-1)-\alpha_{\#(2c),3,2}-1\geq 0$:

$$H_{com}[2\times(2\times f-1)][7\times((2\times f-1)-\alpha_{\#(2c),3,2}-1)+3]=1 \quad (113\text{-}3)$$

For all u being an integer no smaller than one satisfying $\{u\neq(2\times f-1)-0,\ u\neq(2\times f-1)-\alpha_{\#(2c),3,1},\text{ and } u\neq(2\times f-1)-\alpha_{\#(2c),3,2}\}$:

$$H_{com}[2\times(2\times f-1)][7\times(u-1)+3]=0 \quad (113\text{-}4)$$

Considered in a similar manner, the following holds true for $X_w$. In the following, w is an integer no smaller than three and no greater than five.

[Math. 374]

$$H_{com}[2\times(2\times f-1)][7\times((2\times f-1)-0-1)+w]=1 \quad (114\text{-}1)$$

When $(2\times f-1)-\alpha_{\#(2c),w,1}-1\geq 0$:

$$H_{com}[2\times(2\times f-1)][7\times((2\times f-1)-\alpha_{\#(2c),w,1}-1)+w]=1 \quad (114\text{-}2)$$

When $(2\times f-1)-\alpha_{\#(2c),w,2}-1\geq 0$:

$$H_{com}[2\times(2\times f-1)][7\times((2\times f-1)-\alpha_{\#(2c),w,2}-1)+w]=1 \quad (114\text{-}3)$$

For all u being an integer no smaller than one satisfying $\{u\neq(2\times f-1)-0,\ u\neq(2\times f-1)-\alpha_{\#(2c),w,1},\text{ and } u\neq(2\times f-1)-\alpha_{\#(2c),w,2}\}$:

$$H_{com}[2\times(2\times f-1)][7\times(u-1)+w]=0 \quad (114\text{-}4)$$

The following holds true for $P_1$.

[Math. 375]

When $(2\times f-1)-\beta_{\#(2c),2}-1\geq 0$:

$$H_{com}[2\times(2\times f-1)][7\times((2\times f-1)-\beta_{\#(2c),2}-1)+6]=1 \quad (115\text{-}1)$$

For all u being an integer no smaller than one satisfying $\{u\neq(2\times f-1)-\beta_{\#(2c),2}\}$:

$$H_{com}[2\times(2\times f-1)][7\times(u-1)+6]=0 \quad (115\text{-}2)$$

The following holds true for $P_2$.

[Math. 376]

$$H_{com}[2\times(2\times f-1)][7\times((2\times f-1)-0-1)+7]=1 \quad (116\text{-}1)$$

For all u being an integer no smaller than one satisfying $\{u\neq(2\times f-1)-0\}$:

$$H_{com}[2\times(2\times f-1)][7\times(u-1)+7]=0 \quad (116\text{-}2)$$

Further, (4) when g=2×f−1 (where f is an integer no smaller than one), when a vector for row 2×(2×f−1) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-2-2), (2×f−1)−1)%2m=2c holds true. Accordingly, a parity check polynomial satisfying zero of expression (97-2-2) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than three and no greater than $r_{\#(2c),1}$.

[Math. 377]

When $(2\times f-1)-\alpha_{\#(2c),1,y}-1\geq 0$:

$$H_{com}[2\times(2\times f-1)][7\times((2\times f-1)-\alpha_{\#(2c),1,y}-1)+1]=1 \quad (117\text{-}1)$$

For all u being an integer no smaller than one satisfying $\{u\neq(2\times f-1)-\alpha_{\#(2c),1,y}\}$ (where y is an integer no smaller than three and no greater than $r_{\#(2c),1}$):

$$H_{com},[2\times(2\times f-1)][7\times(u-1)+1]=0 \quad (117\text{-}2)$$

Considered in a similar manner, the following holds true for $X_z$. In the following, z is an integer no smaller than one and no greater than two, and y is an integer no smaller than three and no greater than $r_{\#(2c),z}$.

[Math. 378]

When $(2\times f-1)-\alpha_{\#(2c),z,y}-1\geq 0$:

$$H_{com}[2\times(2\times f-1)][7\times((2\times f-1)-\alpha_{\#(2c),z,y}-1)+z]-1 \quad (118\text{-}1)$$

For all u being an integer no smaller than one satisfying $\{u\neq(2\times f-1)-\alpha_{\#(2c),z,y}\}$ (where y is an integer no smaller than three and no greater than $r_{\#(2c),z}$):

$$H_{com}[2\times(2\times f-1)][7\times(u-1)+z]=0 \quad (118\text{-}2)$$

Further, the following holds true for $X_3$.

[Math. 379]

$$H_{com}[2\times(2\times f-1)][7\times((2\times f-1)-0-1)+3]=1 \quad (119\text{-}1)$$

When $(2\times f-1)-\alpha_{\#(2c),3,1}-1\geq 0$:

$$H_{com}[2\times(2\times f-1)][7\times((2\times f-1)-\alpha_{\#(2c),3,1}-1)+3]=1 \quad (119\text{-}2)$$

When $(2\times f-1)-\alpha_{\#(2c),3,2}-1\geq 0$:

$$H_{com}[2\times(2\times f-1)][7\times((2\times f-1)-\alpha_{\#(2c),3,2}-1)+3]=1 \quad (119\text{-}3)$$

For all u being an integer no smaller than one satisfying $\{u\neq(2\times f-1)-0,\ u\neq(2\times f-1)-\alpha_{\#(2c),3,1},\ \text{and}\ u\neq(2\times f-1)-\alpha_{\#(2c),3,2}\}$:

$$H_{com}[2\times(2\times f-1)][7\times(u-1)+3]=0 \quad (119\text{-}4)$$

Considered in a similar manner, the following holds true for $X_w$. In the following, w is an integer no smaller than three and no greater than five.

[Math. 380]

$$H_{com}[2\times(2\times f-1)][7\times((2\times f-1)-0-1)+w]=1 \quad (120\text{-}1)$$

When $(2\times f-1)-\alpha_{\#(2c),w,1}-1\geq 0$:

$$H_{com}[2\times(2\times f-1)][7\times((2\times f-1)-\alpha_{\#(2c),w,1}-1)+w]=1 \quad (120\text{-}2)$$

When $(2\times f-1)-\alpha_{\#(2c),w,2}-1\geq 0$:

$$H_{com}[2\times(2\times f-1)][7\times((2\times f-1)-\alpha_{\#(2c),w,2}-1)+w]=1 \quad (120\text{-}3)$$

For all u being an integer no smaller than one satisfying $\{u\neq(2\times f-1)-0,\ u\neq(2\times f-1)-\alpha_{\#(2c),w,1},\ \text{and}\ u\neq(2\times f-1)-\alpha_{\#(2c),w,2}\}$:

$$H_{com}[2\times(2\times f-1)][7\times(u-1)+w]=0 \quad (120\text{-}4)$$

The following holds true for $P_1$.

[Math. 381]

For all u being an integer no smaller than one:

$$H_{com}[2\times(2\times f-1)][7\times(u-1)+6]=0 \quad (121)$$

The following holds true for $P_2$.

[Math. 382]

$$H_{com}[2\times(2\times f-1)][7\times((2\times f-1)-0-1)+7]=1 \quad (122\text{-}1)$$

When $(2\times f-1)-\beta_{\#(2c),3}-1\geq 0$:

$$H_{com}[2\times(2\times f-1)][7\times((2\times f-1)-\beta_{\#(2c),3}-1)+7]=1 \quad (122\text{-}2)$$

For all u being an integer no smaller than one satisfying $\{u\neq(2\times f-1)-0\ \text{and}\ u\neq(2\times f-1)-\beta_{\#(2c),3}\}$:

$$H_{com}[2\times(2\times f-1)][7\times(u-1)+7]=0 \quad (122\text{-}3)$$

Further, (5) when g=2×f (where f is an integer no smaller than one), when a vector for row 2×(2×f)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-1-1), ((2×f)−1) %2m=2d+1 holds true. Accordingly, a parity check polynomial satisfying zero of expression (98-1-1) where 2i+1=2d+1 holds true (where d is an integer no smaller than zero and no greater than m−1).

Accordingly, component $H_{com}[2\times g-1][v]=H_0[2\times(2\times f)-1][v]$ in row 2×g−1, or that is, row 2×(2×f)−1 of the parity check matrix H, which is for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than three and no greater than $r_{\#(2d+1),1}$.

[Math. 383]

When $(2\times f)-\alpha_{\#(2d+1),1,y}-1\geq 0$:

$$H_{com}[2\times(2\times f)-1][7\times((2\times f)-\alpha_{\#(2d+1),1,y}-1)+1]=1 \quad (123\text{-}1)$$

For all u being an integer no smaller than one satisfying $\{u\neq(2\times f)-\alpha_{\#(2d+1),1,y}\}$ (where y is an integer no smaller than three and no greater than $r_{\#(2d+1),1}$):

$$H_{com}[2\times(2\times f)-1][7\times(u-1)+1]=0 \quad (123\text{-}2)$$

Considered in a similar manner, the following holds true for $X_z$. In the following, z is an integer no smaller than one and no greater than two, and y is an integer no smaller than three and no greater than $r_{\#(2d+1),z}$.

[Math. 384]

When $(2\times f)-\alpha_{\#(2d+1),z,y}-1\geq 0$:

$$H_{com}[2\times(2\times f)-1][7\times((2\times f)-\alpha_{\#(2d+1),z,y}-1)+z]=1 \quad (124\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)-1][7\times(u-1)+z]=0 \quad (124\text{-}2)$$

Further, the following holds true for $X_3$.

[Math. 385]

$$H_{com}[2\times(2\times f)-1][7\times((2\times f)-0-1)+3]=1 \quad (125\text{-}1)$$

When $(2\times f)-\alpha_{\#(2d+1),3,1}-1\geq 0$:

$$H_{com}[2\times(2\times f)-1][7\times((2\times f)-\alpha_{\#(2d+1),3,1}-1)+3]=1 \quad (125\text{-}2)$$

When $(2\times f)-\alpha_{\#(2d+1),3,2}-1\geq 0$:

$$H_{com}[2\times(2\times f)-1][7\times((2\times f)-\alpha_{\#(2d+1),3,2}-1)+3]-1 \quad (125\text{-}3)$$

For all u being an integer no smaller than one satisfying $\{u\neq(2\times f-1)-0,\ u\neq(2\times f-1)-\alpha_{\#(2d+1),3,1},\ \text{and}\ u\neq(2\times f-1)-\alpha_{\#(2d+1),3,2}\}$:

$$H_{com}[2\times(2\times f)-1][7\times(u-1)+3]=0 \quad (125\text{-}4)$$

Considered in a similar manner, the following holds true for $X_w$. In the following, w is an integer no smaller than three and no greater than five.

[Math. 386]

$$H_{com}[2\times(2\times f-1)][7\times((2\times f)-0-1)+w]=1 \quad (126\text{-}1)$$

When $(2\times f-1)-\alpha_{\#(2d+1),w,1}-1\geq 0$:

$$H_{com}[2\times(2\times f-1)][7\times((2\times f)-a-\alpha_{\#(2d+1),w,1}-1)+w]=1 \quad (126\text{-}2)$$

When $(2\times f-1)-\alpha_{\#(2d+1),w,2}-1\geq 0$:

$$H_{com}[2\times(2\times f-1)][7\times((2\times f)-\alpha_{\#(2d+1),w,2}-1)+w]=1 \quad (126\text{-}3)$$

For all u being an integer no smaller than one satisfying $\{u\neq(2\times f)-0,\ u\neq 2\times f)-\alpha_{\#(2d+1),w,1},\ \text{and}\ u\neq(2\times f)-\alpha_{\#(2d+1),w,2}\}$:

$$H_{com}[2\times(2\times f)-1][7\times(u-1)+w]=0 \quad (126\text{-}4)$$

The following holds true for $P_1$.

[Math. 387]

$$H_{com}[2\times(2\times f)-1][7\times((2\times f)-0-1)+6]=1 \quad (127\text{-}1)$$

For all u being an integer no smaller than one satisfying $\{u\neq(2\times f)-0\}$:

$$H_{com}[2\times(2\times f)-1][7\times(u-1)+6]=0 \quad (127\text{-}2)$$

The following holds true for $P_2$.

[Math. 388]

When $(2\times f)-\beta_{\#(2d+1),0}-1\geq 0$:

$$H_{com}[2\times(2\times f)-1][7\times((2\times f)-\beta_{\#(2d+1),0}-1)+7]=1 \quad (128\text{-}1)$$

For all u being an integer no smaller than one satisfying $\{u\neq(2\times f)-\beta_{\#(2d+1),0}\}$:

$$H_{com}[2\times(2\times f)-1][7\times(u-1)+7]=0 \quad (128\text{-}2)$$

Further, (6) when g=2×f (where f is an integer no smaller than one), when a vector for row 2×(2×f)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-1-2), ((2×f)−1)%2m=2d+1 holds true. Accordingly, a parity check polynomial satisfying zero of expression (98-1-2) where 2i+1=2d+1 holds true (where d is an integer no smaller than zero and no greater than m−1).

Accordingly, component $H_{com}[2\times g-1][v]=H_{com}[2\times(2\times f)-1][v]$ in row 2×g−1, or that is, row 2×(2×f)−1 of the parity check matrix H, which is for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than three and no greater than $r_{\#(2d+1),1}$.

[Math. 389]

When $(2\times f)-\alpha_{\#(2d+1),1,y}1\geq 0$:

$$H_{com}[2\times(2\times f)-1][7\times((2\times f)-\alpha_{\#(2d+1),1,y}-1)+1]=1 \quad (129\text{-}1)$$

For all u being an integer no smaller than one satisfying $\{u\neq(2\times f)-\alpha_{\#(2d+1),i,y}\}$ (where y is an integer no smaller than three and no greater than $r_{\#(2d+1),1}$):

$$H_{com}[2\times(2\times f)-1][7\times(u-1)+1]=0 \quad (129\text{-}2)$$

Considered in a similar manner, the following holds true for $X_z$. In the following, z is an integer no smaller than one and no greater than two, and y is an integer no smaller than three and no greater than $r_{\#(2d+1),z}$.

[Math. 390]

When $(2\times f)-\alpha_{\#(2d+1),z,y}-1\geq 0$:

$$H_{com}[2\times(2\times f)-1][7\times((2\times f)-\alpha_{\#(2d+1),z,y}-1)+z]=1 \quad (130\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)-1][7\times(u-1)+z]=0 \quad (130\text{-}2)$$

Further, the following holds true for $X_3$.

[Math. 391]

$$H_{com}[2\times(2\times f)-1][7\times((2\times f)-0-1)+3]=1 \quad (131\text{-}1)$$

When $(2\times f)-\alpha_{\#(2d+1),3,1}-1\geq 0$:

$$H_{com},[2\times(2\times f)-1][7\times(2\times f)-\alpha_{\#(2d+1),3,1}-1)+3]=1 \quad (131\text{-}2)$$

When $(2\times f)-\alpha_{\#(2d+1),3,2}-1\geq 0$:

$$H_{com}[2\times(2\times f)-1][7\times(2\times f)-\alpha_{\#(2d+1),3,2}-1)+3]=1 \quad (131\text{-}3)$$

For all u being an integer no smaller than one satisfying $\{u\neq(2\times f-1)-0,\ u\neq(2\times f-1)-\alpha_{\#(2d+1),3,1},\ \text{and}\ u\neq(2\times f-1)-\alpha_{\#(2d+1),3,2}\}$:

$$H_{com}[2\times(2\times f)-1][7\times(u-1)+3]=0 \quad (131\text{-}4)$$

Considered in a similar manner, the following holds true for $X_w$. In the following, w is an integer no smaller than three and no greater than five.

[Math. 392]

$$H_{com}[2\times(2\times f-1)][7\times((2\times f)-0-1)+w]=1 \quad (132\text{-}1)$$

When $(2\times f-1)-\alpha_{\#(2d+1),w,1}-1\geq 0$:

$$H_{com}[2\times(2\times f-1)][7\times(2\times f)-\alpha_{\#(2d+1),w,1}-1)+w]=1 \quad (132\text{-}2)$$

When $(2\times f-1)-\alpha_{\#(2d+1),w,2}-1\geq 0$:

$$H_{com}[2\times(2\times f-1)][7\times(2\times f)+\alpha_{\#(2d+1),w,2}-1)+w]=1 \quad (132\text{-}3)$$

For all u being an integer no smaller than one satisfying $\{u\neq(2\times f)-0,\ u\neq(2\times f)-\alpha_{\#(2d+1),w,1},$ and $u\neq(2\times f)-\alpha_{\#(2d+1),w,2}\}$:

$$H_{com}[2\times(2\times f)-1][7\times(u-1)+w]=0 \quad (132\text{-}4)$$

The following holds true for $P_1$.
[Math. 393]

$$H_{com}[2\times(2\times f)-1][7\times((2\times f)-0-1)+6]=1 \quad (133\text{-}1)$$

When $(2\times f)-\beta_{\#(2d+1),1}-1\geq 0$:

$$H_{com}[2\times(2\times f)-1][7\times((2\times f)-\beta_{\#(2d+1),1}-1)+6]-1 \quad (133\text{-}2)$$

For all u being an integer no smaller than one satisfying $\{u\neq(2\times f)-0$ and $u\neq(2\times f)-\beta_{\#(2d+1),1}\}$:

$$H_{com}[2\times(2\times f)-1][7\times(u-1)+6]=0 \quad (133\text{-}3)$$

The following holds true for $P_2$.
[Math. 394]
For all u being an integer no smaller than one:

$$H_{com}[2\times(2\times f)-1][7\times(u-1)+7]=0 \quad (134)$$

Further, (7) when g=2×f (where f is an integer no smaller than one), when a vector for row 2×(2×f) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-2-1), ((2×f)−1)%2m=2d+1 holds true. Accordingly, a parity check polynomial satisfying zero of expression (98-2-1) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.
[Math. 395]

$$H_{com}[2\times(2\times f)][7\times((2\times f)-0-1)+1]=1 \quad (135\text{-}1)$$

When $(2\times f)-\alpha_{\#(2d+1),1,1}-1\geq 0$:

$$H_{com},[2\times(2\times f)][7\times((2\times f)-\alpha_{\#(2d+1),1,1}-1)+1]=1 \quad (135\text{-}2)$$

When $(2\times f)-\alpha_{\#(2d+1),1,2}-1\geq 0$:

$$H_{com},[2\times(2\times f)][7\times((2\times f)-\alpha_{\#(2d+1),1,2}-1)+1]-1 \quad (135\text{-}3)$$

For all u being an integer no smaller than one satisfying $\{u\neq(2\times f)-0,\ u\neq(2\times f)-\alpha_{\#(2d+1),1,1},$ and $u\neq(2\times f)-\alpha_{\#(2d+1),1,2}\}$:

$$H_{com}[2\times(2\times f)][7\times(u-1)+1]=0 \quad (135\text{-}4)$$

Considered in a similar manner, the following holds true for $X_w$. In the following, w is an integer no smaller than one and no greater than two.
[Math. 396]

$$H_{com}[2\times(2\times f)][7\times((2\times f)-0-1)+w]=1 \quad (136\text{-}1)$$

When $(2\times f)-\alpha_{\#(2d+1),w,1}-1\geq 0$:

$$H_{com}[2\times(2\times f)][7\times((2\times f)-\alpha_{\#(2d+1),w,1}-1)+w]=1 \quad (136\text{-}2)$$

When $(2\times f)-\alpha_{\#(2d+1),w,2}-1\geq 0$:

$$H_{com}[2\times(2\times f)][7\times((2\times f)-\alpha_{\#(2d+1),w,2}-1)+w]=1 \quad (136\text{-}3)$$

For all u being an integer no smaller than one satisfying $\{u\neq(2\times f)-0,\ u\neq(2\times f)-\alpha_{\#(2d+1),w,1},$ and $u\neq(2\times f)-\alpha_{\#(2d+1),w,2}\}$:

$$H_{com}[2\times(2\times f)][7\times(u-1)+w]=0 \quad (136\text{-}4)$$

Further, the following holds true for $X_3$. In the following, y is an integer no smaller than three and no greater than $r_{\#(2d+1),3}$.
[Math. 397]
When $(2\times f)-\alpha_{\#(2d+1),3,y}-1\geq 0$:

$$H_{com}[2\times(2\times f)][7\times((2\times f)-\alpha_{\#(2d+1),3,y}-1)+3]=1 \quad (137\text{-}1)$$

For all u being an integer no smaller than one satisfying $\{u\neq(2\times f)-\alpha_{\#(2d+1),3,y}\}$ (where y is an integer no smaller than three and no greater than $r_{\#(2d+1),3}$):

$$H_{com}[2\times(2\times f)][7\times(u-1)+3]=0 \quad (137\text{-}2)$$

Considered in a similar manner, the following holds true for $X_z$. In the following, z is an integer no smaller than three and no greater than five, and y is an integer no smaller than three and no greater than $r_{\#(2d+1),z}$.
[Math. 398]
When $(2\times f)-\alpha_{\#(2d+1),z,y}-1\geq 0$:

$$H_{com}[2\times(2\times f)][7\times((2\times f)-\alpha_{\#(2d+1),z,y}-1)+Z]=1 \quad (138\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)][7\times(u-1)+z]=0 \quad (138\text{-}2)$$

The following holds true for $P_1$.
[Math. 399]
When $(2\times f)-\beta_{\#(2d+1),2}-1\geq 0$:

$$H_{com}[2\times(2\times f)][7\times((2\times f)-\alpha_{\#(2d+1),2}-1)+6]=1 \quad (139\text{-}1)$$

For all u being an integer no smaller than one satisfying $\{u\neq(2\times f)-\beta_{\#(2d+1),2}\}$:

$$H_{com}[2\times(2\times f)][7\times(u-1)+6]=0 \quad (139\text{-}2)$$

The following holds true for $P_2$.
[Math. 400]

$$H_{com}[2\times(2\times f)][7\times((2\times f)-0-1)+7]=1 \quad (140\text{-}1)$$

For all u being an integer no smaller than one satisfying $\{u\neq(2\times f)-0\}$:

$$H_{com}[2\times(2\times f)][7\times(u-1)+7]=0 \quad (140\text{-}2)$$

Further, (8) when g=2×f (where f is an integer no smaller than one), when a vector for row 2×(2×f) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-2-2), ((2×f)−1)%2m=2d+1 holds true. Accordingly, a parity check polynomial satisfying zero of expression (98-2-2) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 401]

$$H_{com}[2\times(2\times f)][7\times((2\times f)-0-1)+1]=1 \tag{141-1}$$

When $(2\times f)-\alpha_{\#(2d+1),1,1}-1\geq 0$:

$$H_{com}[2\times(2\times f)][7\times((2\times f)-\alpha_{\#(2d+1),1,1}-1)+1]=1 \tag{141-2}$$

When $(2\times f)-\alpha_{\#(2d+1)},1,2-1\geq 0$:

$$H_{com}[2\times(2\times f)][7\times(2\times f)-\alpha_{\#(2d+1),1,2}-1)+1]=1 \tag{141-3}$$

For all u being an integer no smaller than one satisfying $\{u\neq(2\times f)-0,\ u\neq(2\times f)-\alpha_{\#(2d+1),1,1},\text{ and } u\neq(2\times f)-\alpha_{\#(2d+1),1,2}\}$:

$$H_{com}[2\times(2\times f)][7\times(u-1)+1]=0 \tag{141-4}$$

Considered in a similar manner, the following holds true for $X_w$. In the following, w is an integer no smaller than one and no greater than two.

[Math. 402]

$$H_{com}[2\times(2\times f)][7\times((2\times f)-0-1)+w]=1 \tag{142-1}$$

When $(2\times f)-\alpha_{\#(2d+1),w,1}-1\geq 0$:

$$H_{com}[2\times(2\times f)][7\times((2\times f)-\alpha_{\#(2d+1),w,1}-1)+w]=1 \tag{142-2}$$

When $(2\times f)-\alpha_{\#(2d+1),w,2}-1\geq 0$:

$$H_{com}[2\times(2\times f)][7\times((2\times f)-\alpha_{\#(2d+1),w,2}-1)+w]=1 \tag{142-3}$$

For all u being an integer no smaller than one satisfying $\{u\neq(2\times f)-0,\ u\neq(2\times f)-\alpha_{\#(2d+1),w,1},\text{ and } u\neq(2\times f)-\alpha_{\#(2d+1),w,2}\}$:

$$H_{com}[2\times(2\times f)][7\times(u-1)+w]=0 \tag{142-3}$$

Further, the following holds true for $X_3$. In the following, y is an integer no smaller than three and no greater than $r_{\#(2d+1),3}$.

[Math. 403]

When $(2\times f)-\alpha_{\#(2d+1),3,y}-1\geq 0$:

$$H_{com}[2\times(2\times f)][7\times((2\times f)-\alpha_{\#(2d+1),3,y}-1)+3]=1 \tag{143-1}$$

For all u being an integer no smaller than one satisfying $\{u\neq(2\times f)-\alpha_{\#(2d+1),3,y}\}$ (where y is an integer no smaller than three and no greater than $r_{\#(2d+1),3}$):

$$H_{com}[2\times(2\times f)][7\times(u-1)+3]=0 \tag{143-2}$$

Considered in a similar manner, the following holds true for $X_z$. In the following, z is an integer no smaller than three and no greater than five, and y is an integer no smaller than three and no greater than $r_{\#(2d+1),z}$.

[Math. 404]

When $(2\times f)--\alpha_{\#(2d+1),z,y}-1\geq 0$:

$$H_{com}[2\times(2\times f)][7\times((2\times f)-\alpha_{\#(2d+1),z,y}-1)+Z]=1 \tag{144-1}$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)][7\times(u-1)+z]=0 \tag{144-2}$$

The following holds true for $P_1$.

[Math. 405]

For all u being an integer no smaller than one:

$$H_{com}[2\times(2\times f)][7\times(u-1)+6]=0 \tag{145}$$

The following holds true for $P_2$.

[Math. 406]

$$H_{com}[2\times(2\times f)][7\times((2\times f)-0-1)+7]=1 \tag{146-1}$$

When $(2\times f)-\beta_{\#(2d+1),3}-1\geq 0$:

$$H_{com}[2\times(2\times f)][7\times((2\times f)-\beta_{\#(2d+1),3}-1)+7]=1 \tag{146-2}$$

For all u being an integer no smaller than one satisfying $\{u\neq(2\times f)-0 \text{ and } u\neq(2\times f)-\beta_{\#(2d+1),3}\}$:

$$H_{com}[2\times(2\times f)][7\times(u-1)+7]=0 \tag{146-3}$$

As such, an LDPC-CC of coding rate 5/7 and time-varying period 2×m that is based on a parity check polynomial can be generated by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, and the code so generated achieves high error correction capability.

Embodiment E2

In the present embodiment, description is provided of a method of code configuration that is a generalization of the method described in embodiment E1 of configuring an LDPC-CC of coding rate 5/7 that is based on a parity check polynomial.

Bits of information bits $X_1$, $X_2$, $X_3$, $X_4$, $X_5$ and parity bits $P_1$, $P_2$, at time point j, are expressed $X_{1,j}$, $X_{2,j}$, $X_{3,j}$, $X_{4,j}$, $X_{5,j}$ and $P_{1,j}$, $P_{2,j}$, respectively.

A vector $u_j$, at time point j, is expressed $u_j=(X_{1,j}, X_{2,j}, X_{3,j}, X_{4,j}\ X_{5,j}, P_{1,j}, P_{2,j})$.

Given a delay operator D, polynomial expressions of the information bits $X_1$, $X_2$, $X_3$, $X_4$, $X_5$ are $X_1(D)$, $X_2(D)$, $X_3(D)$, $X_4(D)$, $X_5(D)$, and polynomial expressions of the parity bits $P_1$, $P_2$ are $P_1(D)$, $P_2(D)$.

Further, consideration is given to an LDPC-CC of coding rate 5/7 and time-varying period 2m that is based on a parity check polynomial.

The following mathematical expressions are provided as parity check polynomials satisfying zero for an LDPC-CC of coding rate 5/7 and time-varying period 2m that is based on a parity check polynomial.

First, because two parities $P_1$ and $P_2$ exist, parity check polynomials satisfying zero are provided as described in the following, two for $1\times P_1(D)$ and two for $1\times P_2(D)$.

[Math. 407-1]

$$\left(1+\sum_{s=1}^{R_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(\sum_{s=R_{\#(2i),3}+1}^{r_{\#(2i),3}} D^{\alpha\#(2i),3,s}\right)X_3(D)+\left(\sum_{s=R_{\#(2i),4}+1}^{r_{\#(2i),4}} D^{\alpha\#(2i),4,s}\right)X_4(D)+\left(\sum_{s=R_{\#(2i),5}+1}^{r_{\#(2i),5}} D^{\alpha\#(2i),5,s}\right)X_5(D)+P_1(D)+D^{\beta\#(2i),0}P_2(D)=$$
$$(D^{\alpha\#(2i),1,R_{\#(2i),1}}+\ldots+D^{\alpha\#(2i),1,1}+1)X_1(D)+(D^{\alpha\#(2i),2,R_{\#(2i),2}}+\ldots+D^{\alpha\#(2i),2,1}+1)X_2(D)+(D^{\alpha\#(2i),3,r_{\#(2i),3}}+\ldots+D^{\alpha\#(2i),3,R_{\#(2i),3}}+1)X_3(D)+(D^{\alpha\#(2i),4,r_{\#(2i),4}}+\ldots+D^{\alpha\#(2i),4,R_{\#(2i),4}}+1)X_4(D)+(D^{\alpha\#(2i),5,r_{\#(2i),5}}+\ldots+D^{\alpha\#(2i),5,R_{\#(2i),5}}+1)X_5(D)+P_1(D)+D^{\beta\#(2i),0}P_2(D)=0 \tag{147-1-1}$$

$$\left(1+\sum_{s=1}^{R_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(\sum_{s=R_{\#(2i),3}+1}^{r_{\#(2i),3}} D^{\alpha\#(2i),3,s}\right)X_3(D)+\left(\sum_{s=R_{\#(2i),4}+1}^{r_{\#(2i),4}} D^{\alpha\#(2i),4,s}\right)X_4(D)+\left(\sum_{s=R_{\#(2i),5}+1}^{r_{\#(2i),5}} D^{\alpha\#(2i),5,s}\right)X_5(D)+P_1(D)+D^{\beta\#(2i),1}P_1(D)=$$
$$(D^{\alpha\#(2i),1,R_{\#(2i),1}}+\ldots+D^{\alpha\#(2i),1,1}+1)X_1(D)+(D^{\alpha\#(2i),2,R_{\#(2i),2}}+\ldots+D^{\alpha\#(2i),2,1}+1)X_2(D)+(D^{\alpha\#(2i),3,r_{\#(2i),3}}+\ldots+D^{\alpha\#(2i),3,R_{\#(2i),3}}+1)X_3(D)+(D^{\alpha\#(2i),4,r_{\#(2i),4}}+\ldots+D^{\alpha\#(2i),4,R_{\#(2i),4}}+1)X_4(D)+(D^{\alpha\#(2i),5,r_{\#(2i),5}}+\ldots+D^{\alpha\#(2i),5,R_{\#(2i),5}}+1)X_5(D)+P_1(D)+D^{\beta\#(2i),1}P_1(D)=0 \tag{147-1-2}$$

[Math. 407-2]

$$\left(\sum_{s=R_{\#(2i),1}+1}^{r_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+\left(1+\sum_{s=1}^{R_{\#(2i),3}} D^{\alpha\#(2i),3,s}\right)X_3(D)+\left(1+\sum_{s=1}^{R_{\#(2i),4}} D^{\alpha\#(2i),4,s}\right)X_4(D)+\left(1+\sum_{s=1}^{R_{\#(2i),5}} D^{\alpha\#(2i),5,s}\right)X_5(D)+P_2(D)+D^{\beta\#(2i),2}P_1(D)=$$
$$(D^{\alpha\#(2i),1,r_{\#(2i),1}}+\ldots+D^{\alpha\#(2i),1,R_{\#(2i),1}}+1)X_1(D)+(D^{\alpha\#(2i),2,r_{\#(2i),2}}+\ldots+D^{\alpha\#(2i),2,R_{\#(2i),2}}+1)X_2(D)+(D^{\alpha\#(2i),3,R_{\#(2i),3}}+\ldots+D^{\alpha\#(2i),3,1}+1)X_3(D)+(D^{\alpha\#(2i),4,R_{\#(2i),4}}+\ldots+D^{\alpha\#(2i),4,1}+1)X_4(D)+(D^{\alpha\#(2i),5,R_{\#(2i),5}}+\ldots+D^{\alpha\#(2i),5,1}+1)X_5(D)+P_2(D)+D^{\beta\#(2i),2}P_1(D)=0 \tag{147-2-1}$$

-continued $$\left(\sum_{s=R_{\#(2i),1}+1}^{r_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+\left(1+\sum_{s=1}^{R_{\#(2i),3}} D^{\alpha\#(2i),3,s}\right)X_3(D)+\left(1+\sum_{s=1}^{R_{\#(2i),4}} D^{\alpha\#(2i),4,s}\right)X_4(D)+\left(1+\sum_{s=1}^{R_{\#(2i),5}} D^{\alpha\#(2i),5,s}\right)X_5(D)+P_2(D)+D^{\beta\#(2i),3}P_2(D)=$$
$$(D^{\alpha\#(2i),1,r_{\#(2i),1}}+\ldots+D^{\alpha\#(2i),1,R_{\#(2i),1}}+1)X_1(D)+(D^{\alpha\#(2i),2,r_{\#(2i),2}}+\ldots+D^{\alpha\#(2i),2,R_{\#(2i),2}}+1)X_2(D)+(D^{\alpha\#(2i),3,R_{\#(2i),3}}+\ldots+D^{\alpha\#(2i),3,1}+1)X_3(D)+(D^{\alpha\#(2i),4,R_{\#(2i),4}}+\ldots+D^{\alpha\#(2i),4,1}+1)X_4(D)+(D^{\alpha\#(2i),5,R_{\#(2i),5}}+\ldots+D^{\alpha\#(2i),5,1}+1)X_5(D)+P_2(D)+D^{\beta\#(2i),3}P_2(D)=0 \tag{147-2-2}$$

In expressions (147-1-1), (147-1-2), (147-2-1), (147-2-2), i is an integer no smaller than zero and no greater than m−1 (i=0, 1, . . . , m−2, m−1).

In expressions (147-1-1), (147-1-2), (147-2-1), (147-2-2), $\alpha_{\#(2i),p,q)}$ (where p is an integer no smaller than one and no greater than five, q is an integer no smaller than one and no greater than $r_{\#(2i),p}$ (where $r_{\#(2i),p}$ is a natural number)) and $\beta_{\#(2i),0}$ is a natural number, $\beta_{\#(2i),1}$ is a natural number, $\beta_{\#(2i),2}$ is an integer no smaller than zero, and $\beta_{\#(2i),3}$ is a natural number.

Further, $R_{\#(2i),p}$ is a natural number satisfying $1 \le R_{\#(2i),p} < r_{\#(2i),p}$.

Further, y is an integer no smaller than one and no greater than $r_{\#(2i),p}$, z is an integer no smaller than one and no greater than $r_{\#2i,p}$, and $\alpha_{\#(2i),p,y} \neq \alpha_{\#(2i),p,z}$ holds true for $\forall$(y, z) where y≠z. ∀ is a universal quantifier. (y is an integer no smaller than one and no greater than $r_{\#(2i),p}$, z is an integer no smaller than one and no greater than $r_{\#2i,p}$, and $\alpha_{\#(2i),p,y} \neq \alpha_{\#(2i),p,z}$ holds true for all y and all z satisfying y≠z.)

Note that in the following, to simplify explanation, a parity check polynomial satisfying zero that is expressed by expression (147-1-1) or expression (147-1-2) is referred to as "#(2i); first expression" for realizing a time-varying period 2m, and a parity check polynomial satisfying zero that is expressed by expression (147-2-1) or expression (147-2-2) is referred to as "#(2i); second expression" for realizing a time-varying period 2m.

Thus, for each i, as #(2i); first expression for realizing a time-varying period 2m, a parity check polynomial satisfying zero expressed by either expression (147-1-1) or expression (147-1-2) is prepared.

That is, for i=0, a parity check polynomial satisfying zero provided by expression (147-1-1) where i=0, or a parity check polynomial satisfying zero provided by expression (147-1-2) where i=0 is prepared.

Similarly:

for i=1, a parity check polynomial satisfying zero provided by expression (147-1-1) where i=1, or a parity check polynomial satisfying zero provided by expression (147-1-2) where i=1 is prepared;

for i=2, a parity check polynomial satisfying zero provided by expression (147-1-1) where i=2, or a parity check polynomial satisfying zero provided by expression (147-1-2) where i=2 is prepared;

⋮ for i=z, a parity check polynomial satisfying zero provided by expression (147-1-1) where i=z, or a parity check polynomial satisfying zero provided by expression (147-1-2) where i=z is prepared (where z is an integer no smaller than zero and no greater than m−1); and

⋮ for i=m−1, a parity check polynomial satisfying zero provided by expression (147-1-1) where i=m−1, or a parity check polynomial satisfying zero provided by expression (147-1-2) where i=m−1 is prepared.

Similarly, for each i, as #(2i); second expression for realizing a time-varying period 2m, a parity check polynomial satisfying zero expressed by either expression (147-2-1) or expression (147-2-2) is prepared.

That is, for i=0, a parity check polynomial satisfying zero provided by expression (147-2-1) where i=0, or a parity check polynomial satisfying zero provided by expression (147-2-2) where i=0 is prepared.

Similarly:

for i=1, a parity check polynomial satisfying zero provided by expression (147-2-1) where i=1, or a parity check polynomial satisfying zero provided by expression (147-2-2) where i=1 is prepared;

for i=2, a parity check polynomial satisfying zero provided by expression (147-2-1) where i=2, or a parity check polynomial satisfying zero provided by expression (147-2-2) where i=2 is prepared;

⋮ for i=z, a parity check polynomial satisfying zero provided by expression (147-2-1) where i=z, or a parity check polynomial satisfying zero provided by expression (147-2-2) where i=z is prepared (where z is an integer no smaller than zero and no greater than m−1); and

⋮ for i=m−1, a parity check polynomial satisfying zero provided by expression (147-2-1) where i=m−1, or a parity check polynomial satisfying zero provided by expression (147-2-2) where i=m−1 is prepared.

Similarly, because two parities $P_1$ and $P_2$ exist, parity check polynomials satisfying zero are provided as described in the following, two for $1\times P_1(D)$ and two for $1\times P_2(D)$.

[Math. 408-1]

$$\left(\sum_{s=R_{\#(2i+1),1}+1}^{r_{\#(2i+1),1}} D^{\alpha\#(2i+1),1,s}\right)X_1(D)+\left(\sum_{s=R_{\#(2i+1),1}+2}^{r_{\#(2i+1),2}} D^{\alpha\#(2i+1),2,s}\right)X_2(D)+\left(1+\sum_{s=1}^{R_{\#(2i+1),3}} D^{\alpha\#(2i+1),3,s}\right)X_3(D)+\left(1+\sum_{s=1}^{R_{\#(2i+1),4}} D^{\alpha\#(2i+1),4,s}\right)X_4(D)+\left(1+\sum_{s=1}^{R_{\#(2i+1),5}} D^{\alpha\#(2i+1),5,s}\right)X_5(D)+ \tag{148-1-1}$$

-continued $$P_1(D)+D^{\beta\#(2i+1),0}P_2(D)=(D^{\alpha\#(2i+1),1,r_{\#(2i+1),1}}+\ldots+D^{\alpha\#(2i+1),1,R_{\#(2i+1),1}}+1)X_1(D)+(D^{\alpha\#(2i+1),2,r_{\#(2i+1),2}}+\ldots+D^{\alpha\#(2i+1),2,R_{\#(2i+1),2}}+1)X_2(D)+(D^{\alpha\#(2i+1),3,R_{\#(2i+1),3}}+\ldots+D^{\alpha\#(2i+1),3,1}+1)X_3(D)+(D^{\alpha\#(2i+1),4,R_{\#(2i+1),4}}+\ldots+D^{\alpha\#(2i+1),4,1}+1)X_4(D)+(D^{\alpha\#(2i+1),5,R_{\#(2i+1),5}}+\ldots+D^{\alpha\#(2i+1),5,1}+1)X_5(D)+P_1(D)+D^{\beta\#(2i+1),0}P_2(D)=0$$

$$\left(\sum_{s=R_{\#(2i+1),1}+1}^{r_{\#(2i+1),1}} D^{\alpha\#(2i+1),1,s}\right)X_1(D)+\left(\sum_{s=R_{\#(2i+1),1}+2}^{r_{\#(2i+1),2}} D^{\alpha\#(2i+1),2,s}\right)X_2(D)+\left(1+\sum_{s=1}^{R_{\#(2i+1),3}} D^{\alpha\#(2i+1),3,s}\right)X_3(D)+\left(1+\sum_{s=1}^{R_{\#(2i+1),4}} D^{\alpha\#(2i+1),4,s}\right)X_4(D)+\left(1+\sum_{s=1}^{R_{\#(2i+1),5}} D^{\alpha\#(2i+1),5,s}\right)X_5(D)+ \tag{148-1-2}$$

$$P_1(D)+D^{\beta\#(2i+1),1}P_1(D)=(D^{\alpha\#(2i+1),1,r_{\#(2i+1),1}}+\ldots+D^{\alpha\#(2i+1),1,R_{\#(2i+1),1}}+1)X_1(D)+(D^{\alpha\#(2i+1),2,r_{\#(2i+1),2}}+\ldots+D^{\alpha\#(2i+1),2,R_{\#(2i+1),2}}+1)X_2(D)+(D^{\alpha\#(2i+1),3,R_{\#(2i+1),3}}+\ldots+D^{\alpha\#(2i+1),3,1}+1)X_3(D)+(D^{\alpha\#(2i+1),4,R_{\#(2i+1),4}}+\ldots+D^{\alpha\#(2i+1),4,1}+1)X_4(D)+(D^{\alpha\#(2i+1),5,R_{\#(2i+1),5}}+\ldots+D^{\alpha\#(2i+1),5,1}+1)X_5(D)+P_1(D)+D^{\beta\#(2i+1),1}P_1(D)=0$$

[Math. 402-2]

$$\left(1+\sum_{s=1}^{R_{\#(2i+1),1}} D^{\alpha\#(2i+1),1,s}\right)X_1(D)+\left(1+\sum_{s=1}^{R_{\#(2i+1),2}} D^{\alpha\#(2i+1),2,s}\right)X_2(D)+\left(\sum_{s=R_{\#(2i+1),3}+1}^{r_{\#(2i+1),3}} D^{\alpha\#(2i+1),3,s}\right)X_3(D)+\left(\sum_{s=R_{\#(2i+1),4}+1}^{r_{\#(2i+1),4}} D^{\alpha\#(2i+1),4,s}\right)X_4(D)+\left(\sum_{s=R_{\#(2i+1),5}+1}^{r_{\#(2i+1),5}} D^{\alpha\#(2i+1),5,s}\right)X_5(D)+ \tag{148-2-1}$$

$$P_2(D)+D^{\beta\#(2i+1),2}P_1(D)=(D^{\alpha\#(2i+1),1,R_{\#(2i+1),1}}+\ldots+D^{\alpha\#(2i+1),1,1}+1)X_1(D)+(D^{\alpha\#(2i+1),2,R_{\#(2i+1),2}}+\ldots+D^{\alpha\#(2i+1),2,1}+1)X_2(D)+(D^{\alpha\#(2i+1),3,r_{\#(2i+1),3}}+\ldots+D^{\alpha\#(2i+1),3,R_{\#(2i+1),3}}+1)X_3(D)+(D^{\alpha\#(2i+1),4,r_{\#(2i+1),4}}+\ldots+D^{\alpha\#(2i+1),4,R_{\#(2i+1),4}}+1)X_4(D)+(D^{\alpha\#(2i+1),5,r_{\#(2i+1),5}}+\ldots+D^{\alpha\#(2i+1),5,R_{\#(2i+1),5}}+1)X_5(D)+P_2(D)+D^{\beta\#(2i+1),2}P_1(D)=0$$

-continued $$\left(1+\sum_{s=1}^{R_{\#(2i+1),1}} D^{\alpha\#(2i+1),1,s}\right)X_1(D)+\left(1+\sum_{s=1}^{R_{\#(2i+1),2}} D^{\alpha\#(2i+1),2,s}\right)X_2(D)+\left(\sum_{s=R_{\#(2i+1),3}+1}^{r_{\#(2i+1),3}} D^{\alpha\#(2i+1),3,s}\right)X_3(D)+\left(\sum_{s=R_{\#(2i+1),4}+1}^{r_{\#(2i+1),4}} D^{\alpha\#(2i+1),4,s}\right)X_4(D)+\left(\sum_{s=R_{\#(2i+1),5}+1}^{r_{\#(2i+1),5}} D^{\alpha\#(2i+1),5,s}\right)X_5(D)+$$

$$P_2(D)+D^{\beta\#(2i+1),3}P_2(D)=(D^{\alpha\#(2i+1),1,R_{\#(2i+1),1}}+\ldots+D^{\alpha\#(2i+1),1,1}+1)X_1(D)+(D^{\alpha\#(2i+1),2,R_{\#(2i+1),2}}+\ldots+D^{\alpha\#(2i+1),2,1}+1)X_2(D)+(D^{\alpha\#(2i+1),3,r_{\#(2i+1),3}}+\ldots+D^{\alpha\#(2i+1),3,R_{\#(2i+1),3}}+1)X_3(D)+(D^{\alpha\#(2i+1),4,r_{\#(2i+1),4}}+\ldots+D^{\alpha\#(2i+1),4,R_{\#(2i+1),4}}+1)X_4(D)+(D^{\alpha\#(2i+1),5,r_{\#(2i+1),5}}+\ldots+D^{\alpha\#(2i+1),5,R_{\#(2i+1),5}}+1)X_5(D)+P_2(D)+D^{\beta\#(2i+1),3}P_2(D)=0 \quad (148\text{-}2\text{-}2)$$

In expressions (148-1-1), (148-1-2), (148-2-1), (148-2-2), i is an integer no smaller than zero and no greater than m−1 (i=0, 1, . . . , m−2, m−1).

In expressions (148-1-1), (148-1-2), (148-2-1), (148-2-2), $\alpha_{\#(2i+1),p,q}$ (where p is an integer no smaller than one and no greater than five, q is an integer no smaller than one and no greater than $r_{\#(2i+1),p}$ (where $r_{\#(2i+1),p}$ is a natural number)) and $\beta_{\#(2i+1),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, $R_{\#(2i),p}$ is a natural number satisfying $1\leq R_{\#(2i+1),p}<r_{\#(2i+1),p}$.

Further, y is an integer no smaller than one and no greater than $r_{\#(2i+1),p}$, z is an integer no smaller than one and no greater than $r_{\#(2i+1),p}$, and $\alpha_{\#(2i+1),p,y}\neq\alpha_{\#(2i+1),p,z}$ holds true for ∀(y, z) where y≠z. ∀ is a universal quantifier. (y is an integer no smaller than one and no greater than $r_{\#(2i+1),p}$, z is an integer no smaller than one and no greater than $r_{\#(2i+1),p}$, and $\alpha_{\#(2i+1),p,y}\neq\alpha_{\#(2i+1),p,z}$ holds true for all y and all z satisfying y≠z.)

Note that in the following, to simplify explanation, a parity check polynomial satisfying zero that is expressed by expression (148-1-1) or expression (148-1-2) is referred to as "#(2i+1); first expression" for realizing a time-varying period 2m, and a parity check polynomial satisfying zero that is expressed by expression (148-2-1) or expression (148-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (148-1-1) or expression (148-1-2) is prepared.

That is, for i=0, a parity check polynomial satisfying zero provided by expression (148-1-1) where i=0, or a parity check polynomial satisfying zero provided by expression (148-1-2) where i=0 is prepared.

Similarly:

for i=1, a parity check polynomial satisfying zero provided by expression (148-1-1) where i=1, or a parity check polynomial satisfying zero provided by expression (148-1-2) where i=1 is prepared;

for i=2, a parity check polynomial satisfying zero provided by expression (148-1-1) where i=2, or a parity check polynomial satisfying zero provided by expression (148-1-2) where i=2 is prepared;

⋮ for i=z, a parity check polynomial satisfying zero provided by expression (148-1-1) where i=z, or a parity check polynomial satisfying zero provided by expression (148-1-2) where i=z is prepared (where z is an integer no smaller than zero and no greater than m−1); and

⋮ for i=m−1, a parity check polynomial satisfying zero provided by expression (148-1-1) where i=m−1, or a parity check polynomial satisfying zero provided by expression (148-1-2) where i=m−1 is prepared.

Similarly, for each i, as #(2i+1); second expression for realizing a time-varying period 2m, a parity check polynomial satisfying zero expressed by either expression (148-2-1) or expression (148-2-2) is prepared.

That is, for i=0, a parity check polynomial satisfying zero provided by expression (148-2-1) where i=0, or a parity check polynomial satisfying zero provided by expression (148-2-2) where i=0 is prepared.

Similarly:

for i=1, a parity check polynomial satisfying zero provided by expression (148-2-1) where i=1, or a parity check polynomial satisfying zero provided by expression (148-2-2) where i=1 is prepared;

for i=2, a parity check polynomial satisfying zero provided by expression (148-2-1) where i=2, or a parity check polynomial satisfying zero provided by expression (148-2-2) where i=2 is prepared;

⋮ for i=z, a parity check polynomial satisfying zero provided by expression (148-2-1) where i=z, or a parity check polynomial satisfying zero provided by expression (148-2-2) where i=z is prepared (where z is an integer no smaller than zero and no greater than m−1); and

⋮ for i=m−1, a parity check polynomial satisfying zero provided by expression (148-2-1) where i=m−1, or a parity check polynomial satisfying zero provided by expression (148-2-2) where i=m−1 is prepared.

As such, an LDPC-CC of coding rate 5/7 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (147-1-1) or expression (147-1-2), parity check polynomials satisfying zero provided by expression (147-2-1) or expression (147-2-2), parity check polynomials satisfying zero provided by expression (148-1-1) or expression (148-1-2), and parity check polynomials satisfying zero provided by expression (148-2-1) or expression (148-2-2).

For example, the time varying period 2×m can be formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expressions (147-1-1), (147-1-2), (147-2-1), (147-2-2), (148-1-1), (148-1-2), (148-2-1), and (148-2-2) (where j is an integer no smaller than zero).

The following presumes that 2k=j%2m holds true. In the following, % means a modulo, and for example, α%6 represents a remainder after dividing α by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

The following describes a method of configuring a parity check matrix for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a vector $u_j$ at time point j is expressed as $u_j=(X_{1,j}, X_{2,j}, X_{3,j}, X_{4,j}, X_{5,j}, P_{1,j}, P_{2,j})$ (where j is an integer no smaller than zero). In the following, a case where u is a transmission vector is considered. Note that in the following, j is an integer no smaller than one, and thus j differs between the description having been provided above and the description provided in the following. (j is set as such to facilitate understanding of the correspondence between the column numbers and the row numbers of the parity check matrix.)

Accordingly, $u=(u_1, u_2, u_3, \ldots, u_{y-1}, u_y, u_{y+1}, \ldots)^T=(X_{1,1}, X_{2,1}, X_{3,1}, X_{4,1}, X_{5,1}, P_{1,1}, P_{2,1}, X_{1,2}, X_{2,2}, X_{3,2}, X_{4,2}, X_{5,2}, P_{1,2}, P_{2,2}, X_{1,3}, X_{2,3}, X_{3,3}, X_{4,3}, X_{5,3}, P_{1,3}, P_{2,3}, \ldots, X_{1,y-1}, X_{2,y-1}, X_{3,y-1}, X_{4,y-1}, X_{5,y-1}, P_{1,y-1}, P_{2,y-1}, X_{1,y}, X_{2,y}, X_{3,y}, X_{4,y}, X_{5,y}, P_{1,y}, P_{2,y}, X_{1,y+1}, X_{2,y+1}, X_{3,y+1}, X_{4,y+1}, X_{5,y+1}, P_{1,y+1}, P_{2,y+1}, \ldots)^T$. Further, when using H to denote a parity check matrix for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, Hu=0 holds true (here, Hu=0 indicates that all elements of the vector Hu are zeroes).

FIG. 75 indicates a configuration of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the topmost row of the parity check matrix is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

As illustrated in FIG. 75:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression"; and "a vector for the (2×i)th row of the parity check matrix H can be generated from a parity check polynomial satisfying zero of #((i−1)%2m); second expression", and so on (where i is an integer no smaller than one).

FIG. 76 indicates a configuration of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the leftmost column of the parity check matrix $H_{pro\_m}$ is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

As illustrated in FIG. 76:

"a vector for the first column of the parity check matrix H is related to $X_1$ at time point 1";

"a vector for the second column of the parity check matrix H is related to $X_2$ at time point 1";

"a vector for the third column of the parity check matrix H is related to $X_3$ at time point 1";

"a vector for the fourth column of the parity check matrix H is related to $X_4$ at time point 1";

"a vector for the fifth column of the parity check matrix H is related to $X_5$ at time point 1";

"a vector for the sixth column of the parity check matrix H is related to $P_1$ at time point 1";

"a vector for the seventh column of the parity check matrix H is related to $P_2$ at time point 1";

⋮

"a vector for the 7×(j−1)+1th column of the parity check matrix H is related to $X_1$ at time point j";

"a vector for the 7×(j−1)+2th column of the parity check matrix H is related to $X_2$ at time point j";

"a vector for the 7×(j−1)+3th column of the parity check matrix H is related to $X_3$ at time point j";

"a vector for the 7×(j−1)+4th column of the parity check matrix H is related to $X_4$ at time point j";

"a vector for the 7×(j−1)+5th column of the parity check matrix H is related to $X_5$ at time point j";

"a vector for the 7×(j−1)+6th column of the parity check matrix H is related to $P_1$ at time point j"; and "a vector for the 7×(j−1)+7th column of the parity check matrix H is related to $P_2$ at time point j"; and so on (where j is an integer no smaller than one).

FIG. 77 indicates a parity check matrix for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The following focuses on $1\times X_1(D)$, $1\times X_2(D)$, $1\times X_3(D)$, $1\times X_4(D)$, $1\times X_5(D)$, $1\times P_1(D)$, $1\times P_2(D)$ in the parity check matrix for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The parity check polynomials at time point j=1 are parity check polynomials when i=0 in expressions (147-1-1), (147-1-2), (147-2-1), (147-2-2).

A vector for the first row in FIG. 77 can be generated from a parity check polynomial when i=0 in expression (147-1-1) or expression (147-1-2) (refer to FIG. 75).

In expressions (147-1-1) and (147-1-2):

terms for $1\times X_1(D)$ and $1\times X_2(D)$ exist;

terms for $1\times X_3(D)$, $1\times X_4(D)$, and $1\times X_5(D)$ do not exist; and a term for $1\times P_1(D)$ exists but a term for $1\times P_2(D)$ does not exist.

Further, the relationship between column numbers and $X_1$, $X_2$, $X_3$, $X_4$, $X_5$, $P_1$, $P_2$ is as indicated in FIG. 76. Based on the relationship indicated in FIG. 76 and the fact that terms for $1\times X_1(D)$ and $1\times X_2(D)$ exist, columns related to $X_1$ and $X_2$ in the vector for the first row in FIG. 77 are "1". Further, based on the relationship indicated in FIG. 76 and the fact that terms for $1\times X_3(D)$, $1\times X_4(D)$, and $1\times X_5(D)$ do not exist, columns related to $X_3$, $X_4$, $X_5$ in the vector for the first row in FIG. 77 are "0". In addition, based on the relationship indicated in FIG. 76 and the fact that a term for $1\times P_1(D)$ exists but a term for $1\times P_2(D)$ does not exist, a column related to $P_1$ in the vector for the first row in FIG. 77 is "1", and a column related to $P_2$ in the vector for the first row in FIG. 77 is "0".

As such, the vector for the first row in FIG. 77 is "1100010", as indicated by 3900-1 in FIG. 77.

A vector for the second row in FIG. 77 can be generated from a parity check polynomial when i=0 in expression (147-2-1) or expression (147-2-2) (refer to FIG. 75).

In expressions (147-2-1) and (147-2-2):

terms for $1\times X_1(D)$ and $1\times X_2(D)$ do not exist;

terms for $1\times X_3(D)$, $1\times X_4(D)$, and $1\times X_5(D)$ exist; and a term for $1\times P_1(D)$ may or may not exist but a term for $1\times P_2(D)$ exists.

Further, the relationship between column numbers and $X_1$, $X_2$, $X_3$, $X_4$, $X_5$, $P_1$, $P_2$ is as indicated in FIG. 76. Based on the relationship indicated in FIG. 76 and the fact that terms for $1\times X_1(D)$ and $1\times X_2(D)$ do not exist, columns related to $X_1$ and $X_2$ in the vector for the second row in FIG. 77 are "0". Further, based on the relationship indicated in FIG. 76 and the fact that terms for $1\times X_3(D)$, $1\times X_4(D)$, and $1\times X_5(D)$ exist, columns related to $X_3$, $X_4$, $X_5$ in the vector for the second row in FIG. 77 are "1". In addition, based on the relationship indicated in FIG. 76 and the fact that a term for $1\times P_1(D)$ may or may not exist but a term for $1\times P_2(D)$ exists, a column related to $P_1$ in the vector for the second row in FIG. 77 is "Y", and a column related to $P_2$ in the vector for the second row in FIG. 77 is "1", where Y is either "0" or "1".

As such, the vector for the second row in FIG. 77 is "00111Y1", as indicated by 3900-2 in FIG. 77.

The parity check polynomials at time point j=2 are parity check polynomials when i=0 in expressions (148-1-1), (148-1-2), (148-2-1), (148-2-2).

A vector for the third row in FIG. 77 can be generated from a parity check polynomial when i=0 in expression (148-1-1) or expression (148-1-2) (refer to FIG. 75).

In expressions (148-1-1) and (148-1-2):

terms for $1\times X_1(D)$ and $1\times X_2(D)$ do not exist;

terms for $1\times X_3(D)$, $1\times X_4(D)$, and $1\times X_5(D)$ exist; and a term for $1\times P_1(D)$ exists but a term for $1\times P_2(D)$ does not exist.

Further, the relationship between column numbers and $X_1$, $X_2$, $X_3$, $P_1$, $P_2$ is as indicated in FIG. 76. Based on the relationship indicated in FIG. 76 and the fact that terms for $1\times X_1(D)$ and $1\times X_2(D)$ do not exist, columns related to $X_1$ and $X_2$ in the vector for the third row in FIG. 77 are "0". Further, based on the relationship indicated in FIG. 76 and the fact that terms for $1\times X_3(D)$, $1\times X_4(D)$, and $1\times X_5(D)$ exist, columns related to $X_3$, $X_4$, $X_5$ in the vector for the third row in FIG. 77 are "1". In addition, based on the relationship indicated in FIG. 76 and the fact that a term for $1\times P_1(D)$ exists but a term for $1\times P_2(D)$ does not exist, a column related to $P_1$ in the vector for the third row in FIG. 77 is "1", and a column related to $P_2$ in the vector for the third row in FIG. 77 is "0".

As such, the vector for the third row in FIG. 77 is "0011110", as indicated by 3901-1 in FIG. 77.

A vector for the fourth row in FIG. 77 can be generated from a parity check polynomial when i=0 in expression (148-2-1) or expression (148-2-2) (refer to FIG. 75).

In expressions (148-2-1) and (148-2-2):

terms for $1\times X_1(D)$ and $1\times X_2(D)$ exist;

terms for $1\times X_3(D)$, $1\times X_4(D)$, and $1\times X_5(D)$ do not exist; and a term for $1\times P_1(D)$ may or may not exist but a term for $1\times P_2(D)$ exists.

Further, the relationship between column numbers and $X_1$, $X_2$, $X_3$, $P_1$, $P_2$ is as indicated in FIG. 76. Based on the relationship indicated in FIG. 76 and the fact that terms for $1\times X_1(D)$ and $1\times X_2(D)$ exist, columns related to $X_1$ and $X_2$ in the vector for the fourth row in FIG. 77 are "1". Further, based on the relationship indicated in FIG. 76 and the fact that terms for $1\times X_3(D)$, $1\times X_4(D)$, and $1\times X_5(D)$ do not exist, columns related to $X_3$, $X_4$, $X_5$ in the vector for the fourth row in FIG. 77 are "0". In addition, based on the relationship indicated in FIG. 76 and the fact that a term for $1\times P_1(D)$ may or may not exist but a term for $1\times P_2(D)$ exists, a column related to $P_1$ in the vector for the fourth row in FIG. 77 is "Y", and a column related to $P_2$ in the vector for the fourth row in FIG. 77 is "1".

As such, the vector for the fourth row in FIG. 77 is "11000Y1", as indicated by 3901-2 in FIG. 77.

Because it can be considered that the above similarly applies to cases where time point j=3, 4, 5, the parity check matrix H has the configuration indicated in FIG. 77.

That is, due to the parity check polynomials of expressions (147-1-1), (147-1-2), (147-2-1), (147-2-2) being used at time point j=2k+1 (where k is an integer no smaller than zero), "1100010" exists in the 2×(2k+1)−1th row of the parity check matrix H, and "00111Y1" exists in the 2×(2k+1)th row of the parity check matrix H, as illustrated in FIG. 77.

Further, due to the parity check polynomials of expressions (148-1-1), (148-1-2), (148-2-1), (148-2-2) being used at time point j=2k+2 (where k is an integer no smaller than zero), "0011110" exists in the 2×(2k+2)−1th row of the parity check matrix H, and "11000Y1" exists in the 2×(2k+2)th row of the parity check matrix H, as illustrated in FIG. 77.

Accordingly, as illustrated in FIG. 77, when denoting a column number of a leftmost column corresponding to "1" in "1100010" in a row where "1100010" exists (e.g., 3900-1 in FIG. 77) as "a", "0011110" (e.g., 3901-1 in FIG. 77) exists in a row that is two rows below the row where "1100010" exists, starting from column "a+7".

Similarly, as illustrated in FIG. 77, when denoting a column number of a leftmost column corresponding to "1" in "00111Y1" in a row where "00111Y1" exists (e.g., 3900-2 in FIG. 77) as "b", "11000Y1" (e.g., 3901-2 in FIG. 77) exists in a row that is two rows below the row where "00111Y1" exists, starting from column "b+7".

Similarly, as illustrated in FIG. 77, when denoting a column number of a leftmost column corresponding to "1" in "0011110" in a row where "0011110" exists (e.g., 3901-1 in FIG. 77) as "c", "1100010" (e.g., 3902-1 in FIG. 77) exists in a row that is two rows below the row where "0011110" exists, starting from column "c+7".

Similarly, as illustrated in FIG. 77, when denoting a column number of a leftmost column corresponding to "1" in "11000Y1" in a row where "11000Y1" exists (e.g., 3901-2 in FIG. 77) as "d", "00111Y1" (e.g., 3902-2 in FIG. 77) exists in a row that is two rows below the row where "11000Y1" exists, starting from column "d+7".

The following describes a parity check matrix for an LDPC-CC of coding rate 5/7 and time-varying period 2×m that is based on a parity check polynomial when tail-biting is not performed, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

In the following, $H_{com}[u][v]$ (where u and v are integers no smaller than one) denotes an element at row "u" column "v" of a parity check matrix for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Based on description above provided with reference to FIG. 75:

"a vector for the 2×g−1th row of the parity check matrix H can be generated from a parity check polynomial satisfying zero of #((g−1)%2m); first expression"; and "a vector for the (2×g)th row of the parity check matrix H can be generated from a parity check polynomial satisfying zero of #((g−1)%2m); second expression" (where g is an integer no smaller than one).

Based on description above provided with reference to FIG. 76:

"a vector for the 7×(j−1)+1th column of the parity check matrix H is related to $X_1$ at time point j";

"a vector for the 7×(j−1)+2th column of the parity check matrix H is related to $X_2$ at time point j";

"a vector for the 7×(j−1)+3th column of the parity check matrix H is related to $X_3$ at time point j";

"a vector for the 7×(j−1)+4th column of the parity check matrix H is related to $X_4$ at time point j";

"a vector for the 7×(j−1)+5th column of the parity check matrix H is related to $P_5$ at time point j";

"a vector for the 7×(j−1)+6th column of the parity check matrix H is related to $P_1$ at time point j"; and "a vector for the 7×(j−1)+7th column of the parity check matrix H is related to $P_2$ at time point j"; (where j is an integer no smaller than one).

Based on the above, the following describes component $H_{com}[2\times g-1][v]$ in row 2×g−1 (where g is an integer no smaller than one) and component $H_{com}[2\times g][v]$ in row 2×g of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a parity check polynomial satisfying zero of #((g−1)%2m); first expression can be used to generate a vector for row 2×g−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #((g−1)%2m); second expression can be used to generate a vector for row 2×g of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, when g=2×f−1 (where f is an integer no smaller than one), a parity check polynomial satisfying zero of #(((2×f−1)−1)%2m); first expression, or that is, a parity check polynomial satisfying zero of either expression (147-1-1) or expression (147-1-2), can be used to generate a vector for row 2×(2×f−1)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f−1)−1)%2m); second expression, or that is, a parity check polynomial satisfying zero of either expression (147-2-1) or expression (147-2-2), can be used to generate a vector for row 2×(2×f−1) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, when g=2×f (where f is an integer no smaller than one), a parity check polynomial satisfying zero of #(((2×f)−1)%2m); first expression, or that is, a parity check polynomial satisfying zero of either expression (148-1-1) or expression (148-1-2), can be used to generate a vector for row 2×(2×f)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f)−1)%2m); second expression, or that is, a parity check polynomial satisfying zero of either expression (148-2-1) or expression (148-2-2), can be used to generate a vector for row 2×(2×f) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, (1) when g=2×f−1 (where f is an integer no smaller than one), when a vector for row 2×(2×f−1)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (147-1-1), (2×f−1)−1)%2m=2c holds true. Accordingly, a parity check polynomial satisfying zero of expression (147-1-1) where 2i=2c holds true (where c is an integer no smaller than zero and no greater than m−1).

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 409]

$$H_{com}[2\times(2\times f-1)-1][7\times((2\times f-1)-0-1)+1]=1 \quad (149\text{-}1)$$

When y is an integer no smaller than one and no greater than $R_{\#(2c),1}$, and $(2\times f-1)-\alpha_{\#(2c),1,y}-1\geq 0$:

$$H_{com}[2\times(2\times f-1)-1][7\times((2\times f-1)-\alpha_{\#(2c),1,y}-1)+1]=1 \quad (149\text{-}2)$$

For all u being an integer no smaller than one satisfying $\{u\neq(2\times f-1)-0\}$ and $\{u\neq(2\times f-1)-\alpha_{\#(2c),1,y}\}$ (where y is an integer no smaller than one and no greater than $R_{\#(2c),1}$):

$$H_{com}[2\times(2\times f-1)-1][7\times(u-1)+1]=0 \quad (149\text{-}3)$$

Considered in a similar manner, the following holds true for $X_w$. In the following, w is an integer no smaller than one and no greater than two.

[Math. 410]

$$H_{com}[2\times(2\times f-1)-1][7\times((2\times f-1)-0-1)+w]=1 \quad (150\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)-1][7\times((2\times f-1)-\alpha_{\#(2c),w,y}-1)+w]=1 \quad (150\text{-}2)$$

For all u being an integer no smaller than one satisfying $\{u\neq(2\times f-1)-0\}$ and $\{u\neq 2\times f-1)-\alpha_{\#(2c),w,y}\}$ (where y is an integer no smaller than one and no greater than $R_{\#(2c),w}$):

$$H_{com}[2\times(2\times f-1)-1][7\times(u-1)+w]=0 \quad (150\text{-}3)$$

Further, the following holds true for $X_3$. In the following, y is an integer no smaller than $R_{\#(2c),3}+1$ and no greater than $r_{\#(2c),3}$.

[Math. 411]

When $(2\times f-1)-\alpha_{\#(2c),3,y}-1\geq 0$:

$$H_{com}[2\times(2\times f-1)-1][7\times((2\times f-1)-\alpha_{\#(2c),3,y}-1)+3]=1 \quad (151\text{-}1)$$

For all u being an integer no smaller than one satisfying $\{u\neq(2\times f-1)-\alpha_{\#(2c),3,y}\}$ (where y is an integer no smaller than $R_{\#(2c),3}+1$ and no greater than $r_{\#(2c),3}$):

$$H_{com}[2\times(2\times f-1)-1][7\times(u-1)+3]=0 \quad (151\text{-}2)$$

Considered in a similar manner, the following holds true for $X_z$. In the following, z is an integer no smaller than three and no greater than five, and y is an integer no smaller than $R_{\#(2c),z}+1$ and no greater than $r_{\#(2c),z}$.

[Math. 412]

When $(2\times f-1)-\alpha_{\#(2c),z,y}-1\geq 0$:

$$H_{com}[2\times(2\times f-1)-1][7\times((2\times f-1)-\alpha_{\#(2c),z,y}-1)+z]=1 \quad (152\text{-}1)$$

For all u being an integer no smaller than one satisfying $\{u\neq(2\times f-1)-\alpha_{\#(2c),z,y}\}$ (where y is an integer no smaller than $R_{\#(2c),z}+1$ and no greater than $r_{\#(2c),z}$):

$$H_{com}[2\times(2\times f-1)-1][7\times(u-1)+z]=0 \quad (152\text{-}2)$$

The following holds true for $P_1$.

[Math. 413]

$$H_{com}[2\times(2\times f-1)-1][7\times((2\times f-1)-0-1)+6]=1 \quad (153\text{-}1)$$

For all u being an integer no smaller than one satisfying $\{u\neq(2\times f-1)-0\}$:

$$H_{com}[2\times(2\times f-1)-1][7\times(u-1)+6]=0 \quad (153\text{-}2)$$

The following holds true for $P_2$.

[Math. 414]

When $(2\times f-1)-\beta_{\#(2c),0}-1\geq 0$:

$$H_{com}[2\times(2\times f-1)-1][7\times((2\times f-1)-\beta_{\#(2c),0}-1)+7]=1 \quad (154\text{-}1)$$

For all u being an integer no smaller than one satisfying $\{u\neq(2\times f-1)-\beta_{\#(2c),0}\}$:

$$H_{com}[2\times(2\times f-1)-1][7\times(u-1)+7]=0 \quad (154\text{-}2)$$

Further, (2) when g=2×f−1 (where f is an integer no smaller than one), when a vector for row 2×(2×f−1)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (147-1-2), ((2×f−1)−1)%2m=2c holds true. Accordingly, a parity check polynomial satisfying zero of expression (147-1-2) where 2i=2c holds true (where c is an integer no smaller than zero and no greater than m−1).

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 415]

$$H_{com}[2\times(2\times f-1)-1][7\times((2\times f-1)-0-1)+1]=1 \quad (155\text{-}1)$$

When y is an integer no smaller than one and no greater than $R_{\#(2c),1}$, and $(2\times f-1)-\alpha_{\#(2c),1,y}-1\geq 0$:

$$H_{com}[2\times(2\times f-1)-1][7\times((2\times f-1)-\alpha_{\#(2c),1,y}-1)+1]=1 \quad (155\text{-}2)$$

For all u being an integer no smaller than one satisfying $\{u\neq(2\times f-1)-0\}$ and $\{(2\times f-1)-\alpha_{\#(2c),1,y}\}$ (where y is an integer no smaller than one and no greater than $R_{\#(2c),1}$):

$$H_{com}[2\times(2\times f-1)-1][7\times(u-1)+1]=0 \quad (155\text{-}3)$$

Considered in a similar manner, the following holds true for $X_w$. In the following, w is an integer no smaller than one and no greater than two.

[Math. 416]

$$H_{com}[2\times(2\times f-1)-1][7\times((2\times f-1)-0-1)+w]=1 \quad (156\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)-1][7\times((2\times f-1)-\alpha_{\#(2c),w,y}-1)+w]=1 \quad (156\text{-}2)$$

For all u being an integer no smaller than one satisfying $\{u\neq(2\times f-1)-0\}$ and $\{u\neq 2\times f-1)-\alpha_{\#(2c),w,y}\}$ (where y is an integer no smaller than one and no greater than $R_{\#(2c),w}$):

$$H_{com}[2\times(2\times f-1)-1][7\times(u-1)+w]=0 \quad (156\text{-}3)$$

Further, the following holds true for $X_3$. In the following, y is an integer no smaller than $R_{\#(2c),3}+1$ and no greater than $r_{\#(2c),3}$.

[Math. 417]

When $(2\times f-1)-\alpha_{\#(2c),3,y}-1\geq 0$:

$$H_{com}[2\times(2\times f-1)-1][7\times((2\times f-1)-\alpha_{\#(2c),3,y}-1)+3]=1 \quad (157\text{-}1)$$

For all u being an integer no smaller than one satisfying $\{u \neq (2\times f-1)-\alpha_{\#(2c),3,y}\}$ (where y is an integer no smaller than $R_{\#(2c),3}+1$ and no greater than $r_{\#(2c),3}$):

$$H_{com}[2\times(2\times f-1)-1][7\times(u-1)+3]=0 \quad (157\text{-}2)$$

Considered in a similar manner, the following holds true for $X_z$. In the following, z is an integer no smaller than three and no greater than five, and y is an integer no smaller than $R_{\#(2c),z}+1$ and no greater than $r_{\#(2c),z}$.

[Math. 418]

When $(2\times f-1)-\alpha_{\#(2c),z,y}-1\geq 0$:

$$H_{com}[2\times(2\times f-1)-1][7\times((2\times f-1)-\alpha_{\#(2c),z,y}-1)+z]=1 \quad (158\text{-}1)$$

For all u being an integer no smaller than one satisfying $\{u \neq (2\times f-1)-\alpha_{\#(2c),z,y}\}$ (where y is an integer no smaller than $R_{\#(2c),z}+1$ and no greater than $r_{\#(2c),z}$):

$$H_{com}[2\times(2\times f-1)-1][7\times(u-1)+z]=0 \quad (158\text{-}2)$$

The following holds true for $P_1$.

[Math. 419]

$$H_{com}[2\times(2\times f-1)-1][7\times((2\times f-1)-0-1)+6]=1 \quad (159\text{-}1)$$

When $(2\times f-1)-\beta_{\#(2c),1}-1\geq 0$:

$$H_{com}[2\times(2\times f-1)-1][7\times((2\times f-1)-\beta_{\#(2c),1}-1)+6]=1 \quad (159\text{-}2)$$

For all u being an integer no smaller than one satisfying $\{u \neq (2\times f-1)-0 \text{ and } u \neq (2\times f-1)-\beta_{\#(2c),1}\}$:

$$H_{com}[2\times(2\times f-1)-1][7\times(u-1)+6]=0 \quad (159\text{-}3)$$

The following holds true for $P_2$.

[Math. 420]

For all u being an integer no smaller than one:

$$H_{com}[2\times(2\times f-1)-1][7\times(u-1)+7]=0 \quad (160)$$

Further, (3) when g=2×f−1 (where f is an integer no smaller than one), when a vector for row 2×(2×f−1) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (147-2-1), (2×f−1)−1)%2m=2c holds true. Accordingly, a parity check polynomial satisfying zero of expression (147-2-1) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, and y is an integer no smaller than $R_{\#(2c),1}+1$ and no greater than $r_{\#(2c),1}$.

[Math. 421]

When $(2\times f-1)-\alpha_{\#(2c),1,y}-1\geq 0$:

$$H_{com}[2\times(2\times f-1)][7\times((2\times f-1)-\alpha_{\#(2c),1,y}-1)+1]=1 \quad (161\text{-}1)$$

For all u being an integer no smaller than one satisfying $\{u \neq (2\times f-1)-\alpha_{\#(2c),1,y}\}$ (where y is an integer no smaller than $R_{\#(2c),1}+1$ and no greater than $r_{\#(2c),1}$):

$$H_{com}[2\times(2\times f-1)][7\times(u-1)+1]=0 \quad (161\text{-}2)$$

Considered in a similar manner, the following holds true for $X_z$. In the following, z is an integer no smaller than one and no greater than two, and y is an integer no smaller than $R_{\#(2c),z}+1$ and no greater than $r_{\#(2c),z}$.

[Math. 422]

When $(2\times f-1)-\alpha_{\#(2c),z,y}-1\geq 0$:

$$H_{com}[2\times(2\times f-1)][7\times((2\times f-1)-\alpha_{\#(2c),z,y}-1)+z]=1 \quad (162\text{-}1)$$

For all u being an integer no smaller than one satisfying $\{u \neq (2\times f-1)-\alpha_{\#(2c),z,y}\}$ (where y is an integer no smaller than $R_{\#(2c),z}+1$ and no greater than $r_{\#(2c),z}$):

$$H_{com}[2\times(2\times f-1)][7\times(u-1)+z]=0 \quad (162\text{-}2)$$

Further, the following holds true for $X_3$.

[Math. 423]

$$H_{com}[2\times(2\times f-1)][7\times((2\times f-1)-0-1)+3]=1 \quad (163\text{-}1)$$

When y is an integer no smaller than one and no greater than $R_{\#(2c),3}$, and $(2\times f-1)-\alpha_{\#(2c),3,y}-1\geq 0$:

$$H_{com}[2\times(2\times f-1)][7\times((2\times f-1)-\alpha_{\#(2c),3,y}-1)+3]=1 \quad (163\text{-}2)$$

For all u being an integer no smaller than one satisfying $\{u \neq (2\times f-1)-0\}$ and $\{u \neq (2\times f-1)-\alpha_{\#(2c),3,y}\}$ (where y is an integer no smaller than one and no greater than $R_{\#(2c),3}$):

$$H_{com}[2\times(2\times f-1)][7\times(u-1)+3]=0 \quad (163\text{-}3)$$

Considered in a similar manner, the following holds true for $X_w$. In the following, w is an integer no smaller than three and no greater than five.

[Math. 424]

$$H_{com}[2\times(2\times f-1)][7\times((2\times f-1)-0-1)+w]=1 \quad (164\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)][7\times((2\times f-1)-\alpha_{\#(2c),w,y}-1)+w]=1 \quad (164\text{-}2)$$

For all u being an integer no smaller than one satisfying $\{u \neq (2\times f-1)-0\}$ and $\{u \neq (2\times f-1)-\alpha_{\#(2c),w,y}\}$ (where y is an integer no smaller than one and no greater than $R_{\#(2c),w}$):

$$H_{com}[2\times(2\times f-1)][7\times(u-1)+w]=0 \quad (164\text{-}3)$$

The following holds true for $P_1$.

[Math. 425]

When $(2\times f-1)-\beta_{\#(2c),2}-1\geq 0$:

$$H_{com}[2\times(2\times f-1)][7\times((2\times f-1)-\beta_{\#(2c),2}-1)+6]=1 \quad (165\text{-}1)$$

For all u being an integer no smaller than one satisfying $\{u \neq (2\times f-1)-\beta_{\#(2c),2}\}$:

$$H_{com}[2\times(2\times f-1)][7\times(u-1)+6]=0 \quad (165\text{-}2)$$

The following holds true for $P_2$.

[Math. 426]

$$H_{com}[2\times(2\times f-1)][7\times((2\times f-1)-0-1)+7]=1 \quad (166\text{-}1)$$

For all u being an integer no smaller than one satisfying $\{u \neq (2\times f-1)-0\}$:

$$H_{com}[2\times(2\times f-1)][7\times(u-1)+7]=0 \quad (166\text{-}2)$$

Further, (4) when g=2×f−1 (where f is an integer no smaller than one), when a vector for row 2×(2×f−1) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (147-2-2), (2×f−1)−1)%2m=2c holds true. Accordingly, a parity check polynomial satisfying zero of expression (147-2-2) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than $R_{\#(2c),1}+1$ and no greater than $r_{\#(2c),1}$.

[Math. 427]

When $(2\times f-1)-\alpha_{\#(2c),1,y}-1\geq 0$:

$$H_{com}[2\times(2\times f-1)][7\times((2\times f-1)-\alpha_{\#(2c),1,y}-1)+1]=1 \quad (167\text{-}1)$$

For all u being an integer no smaller than one satisfying $\{u\neq 2\times f-1)-\alpha_{\#(2c),1,y}\}$ (where y is an integer no smaller than $R_{\#(2c),1}+1$ and no greater than $r_{\#(2c),1}$):

$$H_{com}[2\times(2\times f-1)][7\times(u-1)+1]=0 \quad (167\text{-}2)$$

Considered in a similar manner, the following holds true for $X_z$. In the following, z is an integer no smaller than one and no greater than two, and y is an integer no smaller than $R_{\#(2c),z}+1$ and no greater than $r_{\#(2c),z}$.

[Math. 428]

When $(2\times f-1)-\alpha_{\#(2c),z,y}-1\geq 0$:

$$H_{com}[2\times(2\times f-1)][7\times((2\times f-1)-\alpha_{\#(2c),z,y}-1)+z]=1 \quad (168\text{-}1)$$

For all u being an integer no smaller than one satisfying $\{u\neq(2\times f-1)-\alpha_{\#(2c),z,y}\}$ (where y is an integer no smaller than $R_{\#(2c),z}+1$ and no greater than $r_{\#(2c),z}$):

$$H_{com}[2\times(2\times f-1)][7\times(u-1)+z]=0 \quad (168\text{-}2)$$

Further, the following holds true for $X_3$.

[Math. 429]

$$H_{com}[2\times(2\times f-1)][7\times((2\times f-1)-0-1)+3]=1 \quad (169\text{-}1)$$

When y is an integer no smaller than one and no greater than $R_{\#(2c),3}$, and $(2\times f-1)-\alpha_{\#(2c),3,y}-1\geq 0$:

$$H_{com}[2\times(2\times f-1)][7\times((2\times f-1)-\alpha_{\#(2c),3,y}-1)+3]=1 \quad (169\text{-}2)$$

For all u being an integer no smaller than one satisfying $\{u\neq(2\times f-1)-0\}$ and $\{u\neq 2\times f-1)-\alpha_{\#(2c),3,y}\}$ (where y is an integer no smaller than one and no greater than $R_{\#(2c),3}$):

$$H_{com}[2\times(2\times f-1)][7\times(u-1)+3]=0 \quad (169\text{-}3)$$

Considered in a similar manner, the following holds true for $X_w$. In the following, w is an integer no smaller than three and no greater than five.

[Math. 430]

$$H_{com}[2\times(2\times f-1)][7\times((2\times f-1)-0-1)+w]=1 \quad (170\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)][7\times((2\times f-1)-\alpha_{\#(2c),w,y}-1)+w]=1 \quad (170\text{-}2)$$

For all u being an integer no smaller than one satisfying $\{u\neq(2\times f-1)-0\}$ and $\{u\neq(2\times f-1)-\alpha_{\#(2c),w,y}\}$ (where y is an integer no smaller than one and no greater than $R_{\#(2c),w}$):

$$H_{com}[2\times(2\times f-1)][7\times(u-1)+w]=0 \quad (170\text{-}3)$$

The following holds true for $P_1$.

[Math. 431]

For all u being an integer no smaller than one:

$$H_{com}[2\times(2\times f-1)][7\times(u-1)+6]=0 \quad (171)$$

The following holds true for $P_2$.

[Math. 432]

$$H_{com}[2\times(2\times f-1)][7\times((2\times f-1)-0-1)+7]=1 \quad (172\text{-}1)$$

When $(2\times f-1)-\beta_{\#(2c),3}-1\geq 0$:

$$H_{com}[2\times(2\times f-1)][7\times((2\times f-1)-\beta_{\#(2c),3}-1)+7]=1 \quad (172\text{-}2)$$

For all u being an integer no smaller than one satisfying $\{u\neq(2\times f-1)-0$ and $u\neq(2\times f-1)-\beta_{\#(2c),3}\}$:

$$H_{com}[2\times(2\times f-1)][7\times(u-1)+7]=0 \quad (172\text{-}3)$$

Further, (5) when g=2×f (where f is an integer no smaller than one), when a vector for row 2×(2×f)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (148-1-1), ((2×f)−1) %2m=2d+1 holds true. Accordingly, a parity check polynomial satisfying zero of expression (148-1-1) where 2i+1=2d+1 holds true (where d is an integer no smaller than zero and no greater than m−1).

Accordingly, component $H_{com}[2\times g-1][v]=H_{com}[2\times(2\times f)-1][v]$ in row 2×g−1, or that is, row 2×(2×f)−1 of the parity check matrix H, which is for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than $R_{\#(2d+1),1}+1$ and no greater than $r_{\#(2d+1),1}$.

[Math. 433]

When $(2\times f)-\alpha_{\#(2d+1),1,y}-1\geq 0$:

$$H_{com}[2\times(2\times f)-1][7\times((2\times f)-\alpha_{\#(2d+1),1,y}-1)+1]=1 \quad (173\text{-}1)$$

For all u being an integer no smaller than one satisfying $\{u \neq (2\times f)-\alpha_{\#(2d+1),1,y}\}$ (where y is an integer no smaller than $R_{\#(2d+1),1}+1$ and no greater than $r_{\#(2d+1),1}$):

$$H_{com}[2\times(2\times f)-1][7\times(u-1)+1]=0 \quad (173\text{-}2)$$

Considered in a similar manner, the following holds true for $X_z$. In the following, z is an integer no smaller than one and no greater than two, and y is an integer no smaller than $R_{\#(2d+1),z}+1$ and no greater than $r_{\#(2d+1),z}$.

[Math. 434]

When $(2\times f)-\alpha_{\#(2d+1),z,y}-1\geq 0$:

$$H_{com}[2\times(2\times f)-1][7\times((2\times f)-\alpha_{\#(2d+1),z,y}-1)+z]=1 \quad (174\text{-}1)$$

For all u being an integer no smaller than one satisfying $\{u \neq (2\times f)-\alpha_{\#(2d+1),z,y}\}$ (where y is an integer no smaller than $R_{\#(2d+1),z}+1$ and no greater than $r_{\#(2d+1),z}$):

$$H_{com}[2\times(2\times f)-1][7\times(u-1)+z]=0 \quad (174\text{-}2)$$

Further, the following holds true for $X_3$.

[Math. 435]

$$H_{com}[2\times(2\times f)-1][7\times((2\times f)-0-1)+3]=1 \quad (175\text{-}1)$$

When y is an integer no smaller than one and no greater than $R_{\#(2d+1),3}$ and $(2\times f)-\alpha_{\#(2d+1),3,y}-1\geq 0$:

$$H_{com}[2\times(2\times f)-1][7\times((2\times f)-\alpha_{\#(2d+1),3,y}-1)+3]=1 \quad (175\text{-}2)$$

For all u being an integer no smaller than one satisfying $\{u \neq (2\times f)-0\}$ and $\{u \neq (2\times f)-\alpha_{\#(2d+1),3,y}\}$ (where y is an integer no smaller than one and no greater than $R_{\#(2d+1),3}$):

$$H_{com}[2\times(2\times f)-1][7\times(u-1)+3]=0 \quad (175\text{-}3)$$

Considered in a similar manner, the following holds true for $X_w$. In the following, w is an integer no smaller than three and no greater than five.

[Math. 436]

$$H_{com}[2\times(2\times f)-1][7\times((2\times f)-0-1)+w]=1 \quad (176\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)-1][7\times((2\times f)-\alpha_{\#(2d+1),w,y}-1)+w]=1 \quad (176\text{-}2)$$

For all u being an integer no smaller than one satisfying $\{u \neq (2\times f)-0\}$ and $\{u \neq (2\times f)-\alpha_{\#(2d+1),w,y}\}$ (where y is an integer no smaller than one and no greater than $R_{\#(2d+1),w}$):

$$H_{com}[2\times(2\times f)-1][7\times(u-1)+w]=0 \quad (176\text{-}3)$$

The following holds true for $P_1$.

[Math. 437]

$$H_{com}[2\times(2\times f)-1][7\times((2\times f)-0-1)+6]=1 \quad (177\text{-}1)$$

For all u being an integer no smaller than one satisfying $\{u \neq (2\times f)-0\}$:

$$H_{com}[2\times(2\times f)-1][7\times(u-1)+6]=0 \quad (177\text{-}2)$$

The following holds true for $P_2$.

[Math. 438]

When $(2\times f)-\beta_{\#(2d+1),0}-1\geq 0$:

$$H_{com}[2\times(2\times f)-1][7\times((2\times f)--\beta_{\#(2d+1),0}-1)+7]=1 \quad (178\text{-}1)$$

For all u being an integer no smaller than one satisfying $\{u \neq (2\times f)-\beta_{\#(2d+1),0}\}$:

$$H_{com}[2\times(2\times f)-1][7\times(u-1)+7]=0 \quad (178\text{-}2)$$

Further, (6) when g=2×f (where f is an integer no smaller than one), when a vector for row 2×(2×f)−1 of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (148-1-2), ((2×f)−1) %2m=2d+1 holds true.

Accordingly, a parity check polynomial satisfying zero of expression (148-1-2) where 2i+1=2d+1 holds true (where d is an integer no smaller than zero and no greater than m−1).

Accordingly, component $H_{com}[2\times g-1][v]=H_{com}[2\times(2\times f)-1][v]$ in row 2×g−1, or that is, row 2×(2×f)−1 of the parity check matrix H, which is for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than $R_{\#(2d+1),1}+1$ and no greater than $r_{\#(2d+1),1}$.

[Math. 439]

When $(2\times f)-\alpha_{\#(2d+1),1,y}-1\geq 0$:

$$H_{com}[2\times(2\times f)-1][7\times((2\times f)-\alpha_{\#(2d+1),1,y}-1)+1]=1 \quad (179\text{-}1)$$

For all u being an integer no smaller than one satisfying $\{u \neq 2\times f)-\alpha_{\#(2d+1),1,y}\}$ (where y is an integer no smaller than $R_{\#(2d+1),1}+1$ and no greater than $r_{\#(2d+1),1}$):

$$H_{com}[2\times(2\times f)-1][7\times(u-1)+1]=0 \quad (179\text{-}2)$$

Considered in a similar manner, the following holds true for $X_z$. In the following, z is an integer no smaller than one and no greater than two, and y is an integer no smaller than $R_{\#(2d+1),z}+1$ and no greater than $r_{\#(2d+1),z}$.

[Math. 440]

When $(2\times f)-\alpha_{\#(2d+1),z,y}-1\geq 0$:

$$H_{com}[2\times(2\times f)-1][7\times((2\times f)-\alpha_{\#(2d+1),z,y}-1)+z]=1 \quad (180\text{-}1)$$

For all u being an integer no smaller than one satisfying $\{u \neq (2\times f)-\alpha_{\#(2d+1),z,y}\}$ (where y is an integer no smaller than $R_{\#(2d+1),z}+1$ and no greater than $r_{\#(2d+1),z}$):

$$H_{com}[2\times(2\times f)-1][7\times(u-1)+z]=0 \quad (180\text{-}2)$$

Further, the following holds true for $X_3$.

[Math. 441]

$$H_{com}[2\times(2\times f)-1][7\times((2\times f)-0-1)+3]=1 \quad (181\text{-}1)$$

When y is an integer no smaller than one and no greater than $R_{\#(2d+1),3}$, and $(2\times f)-\alpha_{\#(2d+1),3,y}-1\geq 0$:

$$H_{com}[2\times(2\times f)-1][7\times((2\times f)-\alpha_{\#(2d+1),3,y}-1)+3]=1 \quad (181\text{-}2)$$

For all u being an integer no smaller than one satisfying $\{u \neq (2\times f)-0\}$ and $\{u \neq (2\times f)-\alpha_{\#(2d+1),3,y}\}$ (where y is an integer no smaller than one and no greater than $R_{\#(2d+1),3}$):

$$H_{com}[2\times(2\times f)-1][7\times(u-1)+3]=0 \quad (181\text{-}3)$$

Considered in a similar manner, the following holds true for $X_w$. In the following, w is an integer no smaller than three and no greater than five.

[Math. 442]

$$H_{com}[2\times(2\times f)-1][7\times((2\times f)-0-1)+w]=1 \quad (182\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)-1][7\times((2\times f)-\alpha_{\#(2d+1),w,y}-1)+w]=1 \quad (182\text{-}2)$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$):

$$H_{com}[2\times(2\times f)-1][7\times(u-1)+w]=0 \quad (182\text{-}3)$$

The following holds true for $P_1$.

[Math. 443]

$$H_{com}[2\times(2\times f)-1][7\times((2\times f)-0-1)+6]=1 \quad (183\text{-}1)$$

When $(2\times f)-\beta_{\#(2d+1),1}-1\geq 0$:

$$H_{com}[2\times(2\times f)-1][7\times((2\times f)-\beta_{\#(2d+1),1}-1)+6]=1 \quad (183\text{-}2)$$

For all u being an integer no smaller than one satisfying $\{u\neq(2\times f)-0 \text{ and } u\neq(2\times f)-\beta_{\#(2d+1),1}\}$:

$$H_{com}[2\times(2\times f)-1][7\times(u-1)+6]=0 \quad (183\text{-}3)$$

The following holds true for $P_2$.

[Math. 444]

For all u being an integer no smaller than one:

$$H_{com}[2\times(2\times f)-1][7\times(u-1)+7]=0 \quad (184)$$

Further, (7) when g=2×f (where f is an integer no smaller than one), when a vector for row 2×(2×f) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (148-2-1), ((2×f)−1) %2m=2d+1 holds true. Accordingly, a parity check polynomial satisfying zero of expression (148-2-1) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 445]

$$H_{com}[2\times(2\times f)][7\times((2\times f)-0-1)+1]=1 \quad (185\text{-}1)$$

When y is an integer no smaller than one and no greater than $R_{\#(2d+1),1}$, and $(2\times f)-\alpha_{\#(2d+1),1,y}-1\geq 0$:

$$H_{com}[2\times(2\times f)][7\times((2\times f)-\alpha_{\#(2d+1),1,y}-1)+1]=1 \quad (185\text{-}2)$$

For all u being an integer no smaller than one satisfying $\{u\neq(2\times f)-0\}$ and $\{u\neq(2\times f)-\alpha_{\#(2d+1),1,y}\}$ (where y is an integer no smaller than one and no greater than $R_{\#(2d+1),1}$):

$$H_{com}[2\times(2\times f)][7\times(u-1)+1]=0 \quad (185\text{-}3)$$

Considered in a similar manner, the following holds true for $X_w$. In the following, w is an integer no smaller than one and no greater than two.

[Math. 446]

$$H_{com}[2\times(2\times f)][7\times((2\times f)-0-1)+w]=1 \quad (186\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)][7\times((2\times f)-\alpha_{\#(2d+1),w,y}-1)+w]=1 \quad (186\text{-}2)$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$):

$$H_{com}[2\times(2\times f)][7\times(u-1)+w]=0 \quad (186\text{-}3)$$

Further, the following holds true for $X_3$. In the following, y is an integer no smaller than $R_{\#(2d+1),3}+1$ and no greater than $r_{\#(2d+1),3}$.

[Math. 447]

When $(2\times f)-\alpha_{\#(2d+1),3,y}-1\geq 0$:

$$H_{com}[2\times(2\times f)][7\times((2\times f)-\alpha_{\#(2d+1),3,y}-1)+3]=1 \quad (187\text{-}1)$$

For all u being an integer no smaller than one satisfying $\{u\neq(2\times f)-\alpha_{\#(2d+1),3,y}\}$ (where y is an integer no smaller than $R_{\#(2d+1),3}+1$ and no greater than $r_{\#(2d+1),3}$):

$$H_{com}[2\times(2\times f)][7\times(u-1)+3]=0 \quad (187\text{-}2)$$

Considered in a similar manner, the following holds true for $X_z$. In the following, z is an integer no smaller than three and no greater than five, and y is an integer no smaller than $R_{\#(2d+1),3}+1$ and no greater than $r_{\#(2d+1),z}$.

[Math. 448]

When $(2\times f)-\alpha_{\#(2d+1),z,y}-1\geq 0$:

$$H_{com}[2\times(2\times f)][7\times((2\times f)-\beta_{\#(2d+1),z,y}-1)+z]=1 \quad (188\text{-}1)$$

For all u being an integer no smaller than one satisfying $\{u\neq(2\times f)-\alpha_{\#(2d+1),z,y}\}$ (where y is an integer no smaller than $R_{\#(2d+1),z}+1$ and no greater than $r_{\#(2d+1),z}$):

$$H_{com}[2\times(2\times f)][7\times(u-1)+z]=0 \quad (188\text{-}2)$$

The following holds true for $P_1$.

[Math. 449]

When $(2\times f)-\beta_{\#(2d+1),2}-1\geq 0$:

$$H_{com}[2\times(2\times f)][7\times(2\times f)-\beta_{\#(2d+1),2}-1)+6]=0 \quad (189\text{-}1)$$

For all u being an integer no smaller than one satisfying $\{u\neq(2\times f)-\beta_{\#(2d+1),2}\}$:

$$H_{com}[2\times(2\times f)][7\times(u-1)+6]=0 \quad (189\text{-}2)$$

The following holds true for $P_2$.

[Math. 450]

$$H_{com}[2\times(2\times f)][7\times((2\times f)-0-1)+7]=1 \quad (190\text{-}1)$$

For all u being an integer no smaller than one satisfying $\{u\neq(2\times f)-0\}$:

$$H_{com}[2\times(2\times f)][7\times(u-1)+7]=0 \quad (190\text{-}2)$$

Further, (8) when g=2×f (where f is an integer no smaller than one), when a vector for row 2×(2×f) of the parity check matrix H, which is for an LDPC-CC of coding rate 5/7 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (148-2-2), $((2\times f)-1)\%2m=2d+1$ holds true. Accordingly, a parity check polynomial satisfying zero of expression (148-2-2) where $2i+1=2d+1$ holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 5/7 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 451]

$$H_{com}[2\times(2\times f)][7\times((2\times f)-0-1)+1]=1 \quad (191\text{-}1)$$

When y is an integer no smaller than one and no greater than $R_{\#(2d+1),1}$, and $(2\times f)-\alpha_{\#(2d+1),1,y}-1\geq 0$:

$$H_{com}[2\times(2\times f)][7\times((2\times f)-\alpha_{\#(2d+1),1,y}-1)+1]=1 \quad (191\text{-}2)$$

For all u being an integer no smaller than one satisfying $\{u\neq(2\times f)-0\}$ and $\{u\neq(2\times f)-\alpha_{\#(2d+1),1,y}\}$ (where y is an integer no smaller than one and no greater than $R_{\#(2d+1),1}$):

$$H_{com}[2\times(2\times f)][7\times(u-1)+1]=0 \quad (191\text{-}3)$$

Considered in a similar manner, the following holds true for $X_w$. In the following, w is an integer no smaller than one and no greater than two.

[Math. 452]

$$H_{com}[2\times(2\times f)][7\times((2\times f)-0-1)+w]=1 \quad (192\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)][7\times((2\times f)-\alpha_{\#(2d+1),w,y}-1)+w]=1 \quad (192\text{-}2)$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$):

$$H_{com}[2\times(2\times f)][7\times(u-1)+w]=0 \quad (192\text{-}3)$$

Further, the following holds true for $X_3$. In the following, y is an integer no smaller than $R_{\#(2d+1),3}+1$ and no greater than $r_{\#(2d+1),3}$.

[Math. 453]

When $(2\times f)-\alpha_{\#(2d+1),3,y}-1\geq 0$:

$$H_{com}[2\times(2\times f)][7\times((2\times f)-\alpha_{\#(2d+1),3,y}+1)+3]=1 \quad (193\text{-}1)$$

For all u being an integer no smaller than one satisfying $\{u\neq(2\times f)-\alpha_{\#(2d+1),3,y}\}$ (where y is an integer no smaller than $R_{\#(2d+1),3}+1$ and no greater than $r_{\#(2d+1),3}$):

$$H_{com}[2\times(2\times f)][7\times(u-1)+3]=0 \quad (193\text{-}2)$$

Considered in a similar manner, the following holds true for $X_z$. In the following, z is an integer no smaller than three and no greater than five, and y is an integer no smaller than $R_{\#(2d+1),z}+1$ and no greater than $r_{\#(2d+1),z}$.

[Math. 454]

When $(2\times f)-\alpha_{\#(2d+1),z,y}-1\geq 0$:

$$H_{com}[2\times(2\times f)][7\times((2\times f)-\alpha_{\#(2d+1),z,y}-1)+z]=1 \quad (194\text{-}1)$$

For all u being an integer no smaller than one satisfying $\{u\neq(2\times f)-\alpha_{\#(2d+1),z,y}\}$ (where y is an integer no smaller than $R_{\#(2d+1),z}+1$ and no greater than $r_{\#(2d+1),z}$):

$$H_{com}[2\times(2\times f)][7\times(u-1)+z]=0 \quad (194\text{-}2)$$

The following holds true for $P_1$.

[Math. 455]

For all u being an integer no smaller than one:

$$H_{com}[2\times(2\times f)][7\times(u-1)+6]=0 \quad (195)$$

The following holds true for $P_2$.

[Math. 456]

$$H_{com}[2\times(2\times f)][7\times((2\times f)-0-1)+7]=1 \quad (196\text{-}1)$$

When $(2\times f)-\beta_{\#(2d+1),3}-1\geq 0$:

$$H_{com}[2\times(2\times f)][7\times((2\times f)-\beta_{\#(2d+1),3}-1)+7]=1 \quad (196\text{-}2)$$

For all u being an integer no smaller than one satisfying $\{u\neq(2\times f)-0$ and $u\neq(2\times f)-\beta_{\#(2d+1),3}\}$:

$$H_{com}[2\times(2\times f)][7\times(u-1)+7]=0 \quad (196\text{-}3)$$

As such, an LDPC-CC of coding rate 5/7 and time-varying period 2×m that is based on a parity check polynomial can be generated by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, and the code so generated achieves high error correction capability.

Embodiment E3

In the present embodiment, description is provided of a device that uses the LDPC-CC of coding rate 5/7 that is based on a parity check polynomial, description of which has been provided in embodiments E1 and E2.

As one example, description is provided of a case where the LDPC-CC of coding rate 5/7 that is based on a parity check polynomial, description of which has been provided in embodiments E1 and E2, is applied to a communication device.

FIG. 22 illustrates the structures of a transmitting device 2200 and a receiving device 2210 in the communication device pertaining to the present embodiment.

An encoder 2201 receives information to be transmitted as input, and is capable of performing various types of encoding. In particular, when receiving a specification to perform encoding by using the LDPC-CC of coding rate 5/7 that is based on a parity check polynomial, description of which has been provided in embodiments E1 and E2, the encoder 2201 performs encoding by using the LDPC-CC of coding rate 5/7 that is based on a parity check polynomial, description of which has been provided in embodiments E1 and E2, to calculate parities $P_1$ and $P_2$. Further, the encoder 2201 outputs the information to be transmitted and the parities $P_1$ and $P_2$ as a transmission sequence.

A modulator 2202 receives the transmission sequence, which includes the information to be transmitted and the parities $P_1$ and $P_2$, performs mapping based on a predetermined modulation scheme (e.g., BPSK, QPSK, 16QAM, 64QAM), and outputs a baseband signal. Further, the modulator 2202 may also receive information other than the transmission sequence, which includes the information to be transmitted and the parities $P_1$ and $P_2$, as input, perform mapping, and output a baseband signal. For example, the modulator 2202 may receive control information as input.

The transmitting device outputs a transmission signal after performing predetermined signal processing (e.g., signal processing for generation of an OFDM signal, frequency conversion, amplification) with respect to such signals (e.g., baseband signals, pilot signals). The transmitting device may transmit the transmission signal over a wireless transmission path utilizing electromagnetic waves, or over a wired transmission path utilizing a coaxial cable, a power line, an optical cable, or the like.

The transmission signal is received by the receiving device 2210 after travelling over the transmission path. A receiver 2211 receives a reception signal as input, performs predetermined signal processing (e.g., bandwidth limitation, frequency conversion, signal processing for OFDM, frequency offset estimation, signal detection, channel estimation), and outputs a baseband signal and a channel estimation signal.

A log-likelihood ratio generation section 2212 receives the baseband signal and the channel estimation signal as input (may receive other signals as input), and for example, calculates and outputs a log-likelihood ratio for each bit (may calculate and output a hard value (hard decision value)).

A decoder 2213 receives the log-likelihood ratio for each bit as input, performs belief propagation decoding (e.g., sum-product decoding, scheduled sum-product decoding (Layered BP (belief propagation) decoding), min-sum decoding, Normalized BP decoding, offset BP decoding), and outputs an estimation sequence. The decoder 2213 performs the belief propagation decoding based on the parity check matrix for the LDPC-CC of coding rate 5/7 that is based on a parity check polynomial, description of which has been provided in embodiments E1 and E2.

Figure 78:
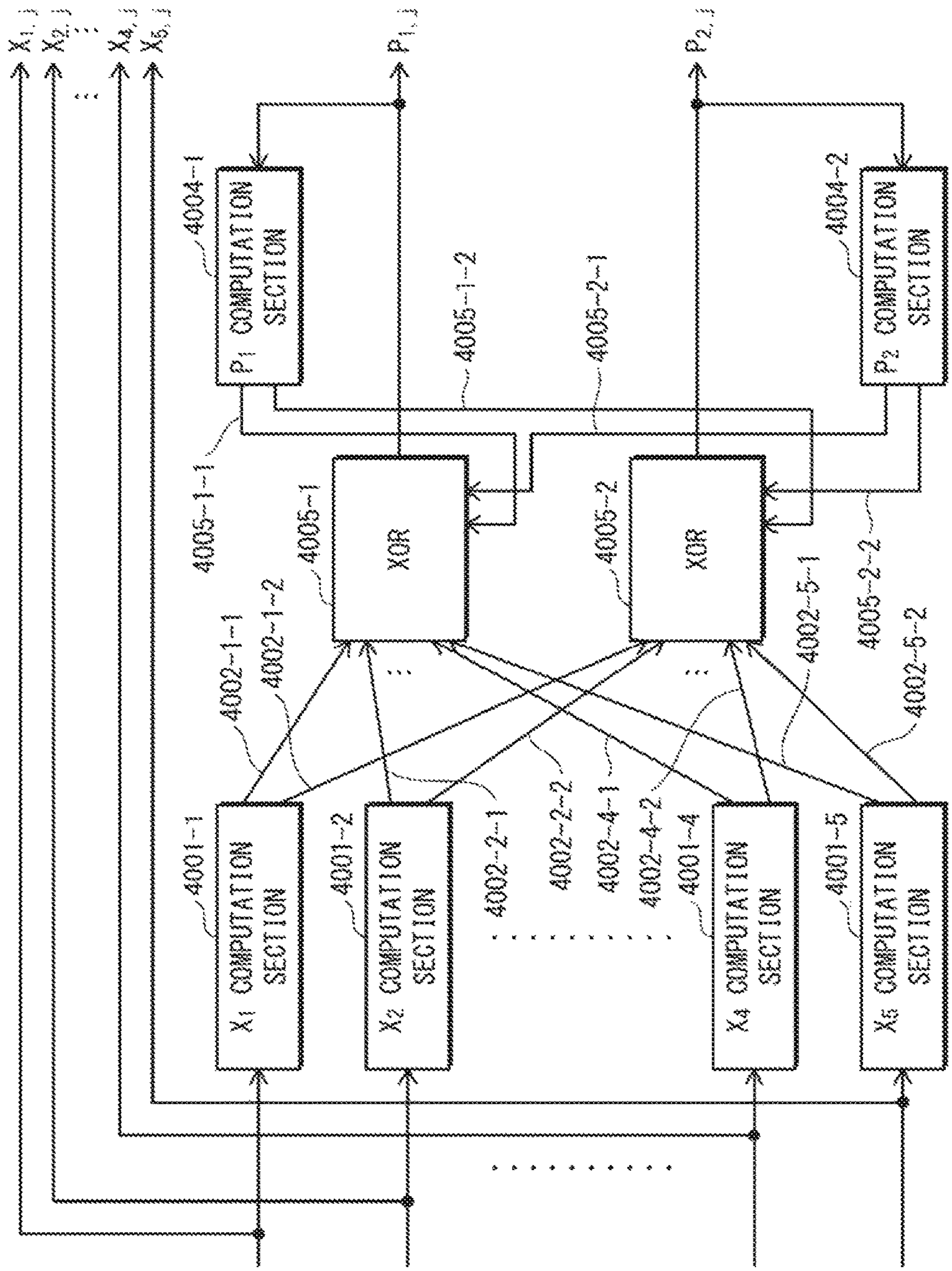
FIG. 78 shows an example of the configuration of an encoder for LDPC-CC of coding rate 5/7 that is based on a parity check polynomial.

FIG. 78 illustrates one example of the structure of an encoder for the LDPC-CC of coding rate 5/7 that is based on a parity check polynomial, description of which has been provided in embodiments E1 and E2. Description on such an encoder has been provided with reference to the encoder 2201 in FIG. 22.

In FIG. 78, an $X_z$ computation section 4001-*z* (where z is an integer no smaller than one and no greater than five) includes a plurality of shift registers that are connected in series and a calculator that performs XOR calculation on bits collected from some of the shift registers (refer to FIGS. 2 and 22).

The $X_z$ computation section 4001-*z* receives an information bit $X_{z,j}$ at time point j as input, performs the XOR calculation, and outputs bits 4002-*z*−1 and 4002-*z*−2, which are acquired through the $X_z$ calculation.

A $P_1$ computation section 4004-1 includes a plurality of shift registers that are connected in series and a calculator that that performs XOR calculation on bits collected from some of the shift registers (refer to FIGS. 2 and 22).

The $P_1$ computation section 4004-1 receives a bit $P_{1,j}$ of parity $P_1$ at time point j as input, performs the XOR calculation, and outputs bits 4005-1-1 and 4005-1-2, which are acquired through the $P_1$ calculation.

A $P_2$ computation section 4004-2 includes a plurality of shift registers that are connected in series and a calculator that that performs XOR calculation on bits collected from some of the shift registers (refer to FIGS. 2 and 22).

The $P_2$ computation section 4004-2 receives a bit $P_{2,j}$ of parity $P_2$ at time point j as input, performs the XOR calculation, and outputs bits 4005-2-1 and 4005-2-2, which are acquired through the $P_2$ calculation.

An XOR (calculator) 4005-1 receives the bits 4002-1-1 through 4002-5-1 acquired by $X_1$ calculation through $X_5$ calculation, respectively, the bit 4005-1-1 acquired by $P_1$ calculation, and the bit 4005-2-1 acquired by the $P_2$ calculation as input, performs XOR calculation, and outputs a bit $P_{1,j}$ of parity $P_1$ at time point j.

An XOR (calculator) 4005-2 receives the bits 4002-1-2 through 4002-5-2 acquired by $X_1$ calculation through $X_5$ calculation, respectively, the bit 4005-1-2 acquired by $P_1$ calculation, and the bit 4005-2-2 acquired by the $P_2$ calculation as input, performs XOR calculation, and outputs a bit $P_{2,j}$ of parity $P_2$ at time point j.

It is preferable that initial values of the shift registers of the $X_z$ computation section 4001-*z*, the $P_1$ computation section 4004-1, and the $P_2$ computation section 4004-2 illustrated in FIG. 78 be set to "0" (zero). By making such a configuration, it becomes unnecessary to transmit to the receiving device parities $P_1$ and $P_2$ before the setting of initial values.

The following describes a method of information-zero termination.

Figure 79:
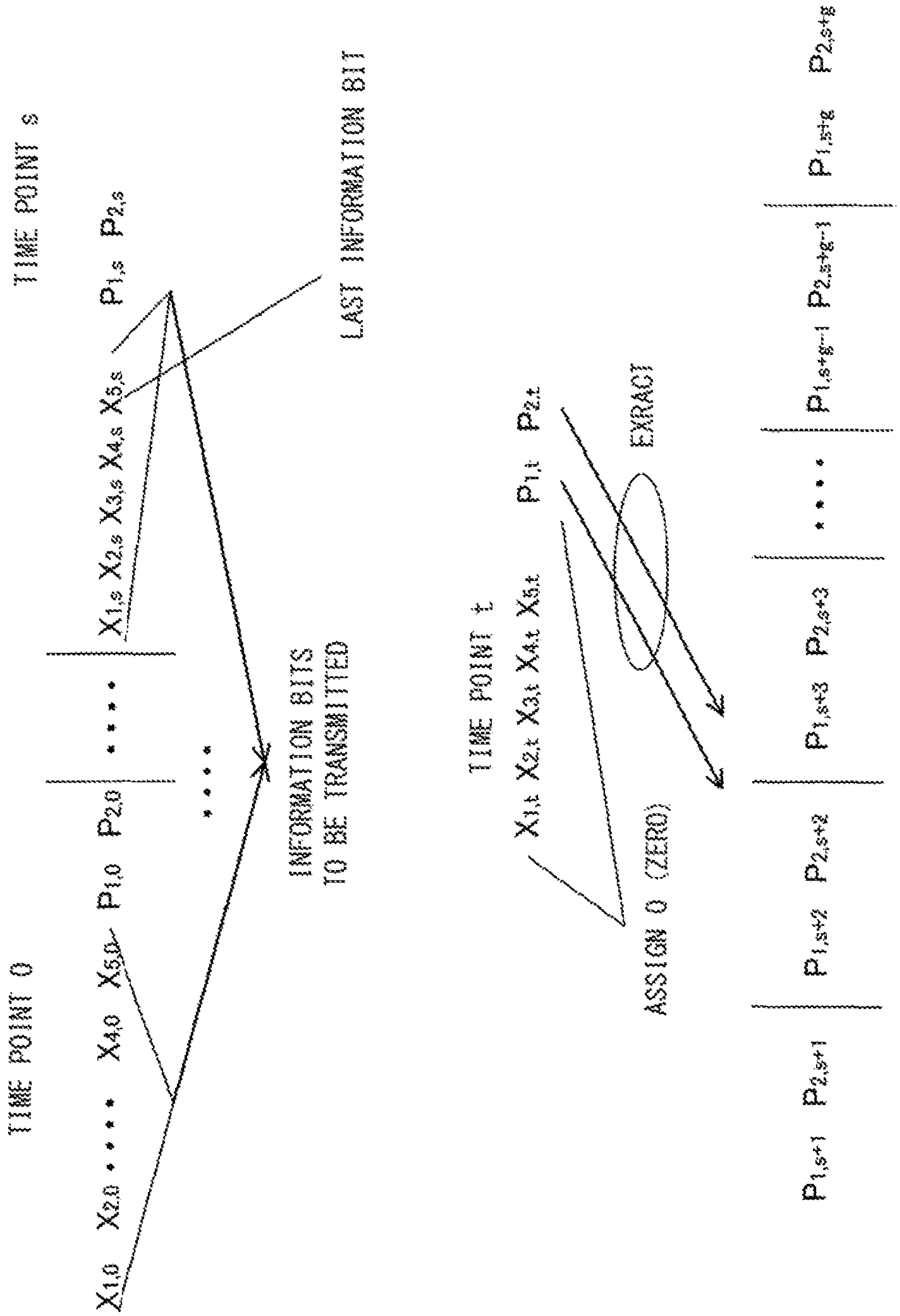
FIG. 79 is a diagram for explaining a zero-termination method.

Suppose that in FIG. 79, information $X_1$ through $X_5$ exist from time point 0, and information $X_5$ at time point s (where s is an integer no smaller than zero) is the last information bit. That is, suppose that the information to be transmitted from the transmitting device to the receiving device is information $X_{1,j}$ through $X_{5,j}$, being information $X_1$ through $X_5$ at time point j, respectively, where j is an integer no smaller than zero and no greater than s.

In such a case, the transmitting device transmits information $X_1$ through $X_5$, parity $P_1$, and parity $P_2$ from time point 0 to time point s, or that is, transmits $X_{1,j}$, $X_{2,j}$ $X_{3,j}$, $X_{4,j}$, $X_{5,j}$, $P_{1,j}$, $P_{2,j}$, where j is an integer no smaller than zero and no greater than s. (Note that $P_{1,j}$ and $P_{2,j}$ denote parity $P_1$ and parity $P_2$ at time point j, respectively.)

Further, suppose that information $X_1$ through $X_5$ from time point s+1 to time point s+g (where g is an integer no smaller than one) is "0", or that is, when denoting information $X_1$ through $X_5$ at time point t as $X_{1,t}$, $X_{2,t}$, $X_{3,t}$, $X_{4,t}$, $X_{5,t}$, respectively, $X_{1,t}=0$, $X_{2,t}=0$, $X_{3,t}=0$, $X_{4,t}=0$, $X_{5,t}=0$ hold true for t being an integer no smaller than s+1 and no greater than s+g. The transmitting device, by performing encoding, acquires parities $P_{1,t}$ and $P_{2,t}$ for t being an integer no smaller than s+1 and no greater than s+g. The transmitting device, in addition to the information and parities described above, transmits parities $P_{1,t}$ and $P_{2,t}$ for t being an integer no smaller than s+1 and no greater than s+g.

Meanwhile, the receiving device performs decoding by using log-likelihood ratios for the information and the parities transmitted by the transmitting device, and log-likelihood ratios corresponding to $X_{1,t}=0$, $X_{2,t}=0$, $X_{3,t}=0$, $X_{4,t}=0$, $X_{5,t}=0$, for t being an integer no smaller than s+1 and no greater than s+g, and thereby acquires an estimation sequence of information.

Figure 80:
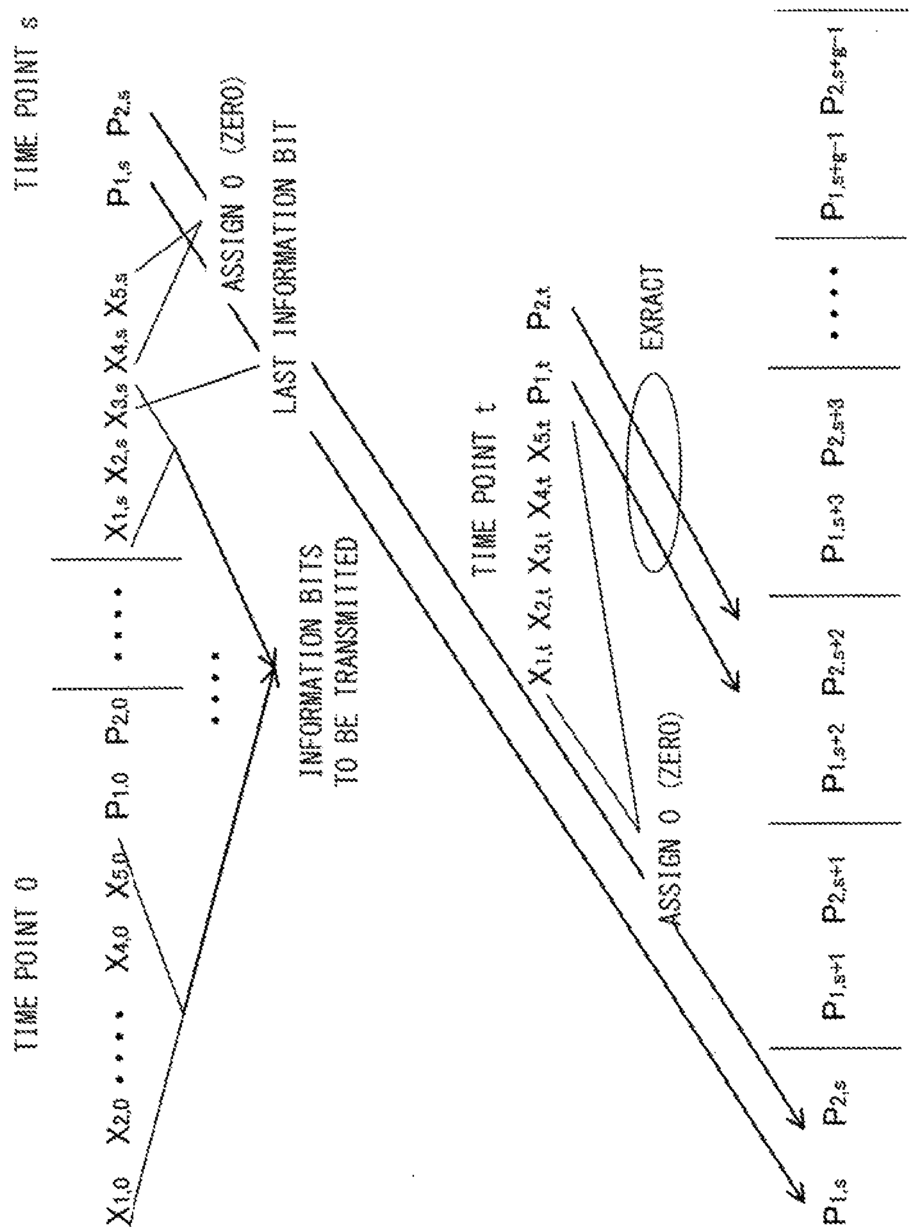
FIG. 80 is a diagram for explaining a zero-termination method.

FIG. 80 illustrates an example differing from that illustrated in FIG. 79. Suppose that information $X_1$ through $X_5$ exist from time point 0, and information $X_f$ for time point s (where s is an integer no smaller than zero) is the last information bit. Here, f is an integer no smaller than one and no greater than four. In FIG. 79, f equals 3, for example. That is, suppose that the information to be transmitted from the transmitting device to the receiving device is information $X_{i,s}$, where i is an integer no smaller than one and no greater than f, and information $X_{1,j}$, information $X_{2,j}$, information $X_{3,j}$, information $X_{4,j}$, and information $X_{5,j}$, being information $X_1$ through $X_5$ at time point j, respectively, where j is an integer no smaller than zero and no greater than s−1.

In such a case, the transmitting device transmits information $X_1$ through $X_5$, parity $P_1$, and parity $P_2$ from time point 0 to time point s−1, or that is, transmits $X_{1,j}$, $X_{2,j}$, $X_{3,j}$, $X_{4,j}$, $X_{5,j}$, $P_{1,j}$, $P_{2,j}$, where j is an integer no smaller than zero and no greater than s−1. (Note that $P_{1,j}$ and $P_{2,j}$ denote parity $P_1$ and parity $P_2$ at time point j, respectively.)

Further, suppose that at time point s, information $X_{i,s}$, when i is an integer no smaller than one and no greater than f, is information that the transmitting device is to transmit, and suppose that $X_{k,s}$, when k is an integer so smaller than f+1 and no greater than five, equals "0" (zero).

Further, suppose that information $X_1$ through $X_5$ from time point s+1 to time point s+g−1 (where g is an integer no smaller than two) is "0", or that is, when denoting information $X_1$ through $X_5$ at time point t as $X_{1,t}$, $X_{2,t}$, $X_{3,t}$, $X_{4,t}$, $X_{5,t}$, respectively, $X_{1,t}=0$, $X_{2,t}=0$, $X_{3,t}=0$, $X_{4,t}=0$, $X_{5,t}=0$ hold true when t is an integer no smaller than s+1 and no greater than s+g−1. The transmitting device, by performing encoding from time point s to time point s+g−1, acquires parities $P_{1,u}$ and $P_{2,u}$ for u being an integer no smaller than s and no greater than s+g−1. The transmitting device, in addition to the information and parities described above, transmits $X_{i,s}$ for i being an integer no smaller than one and no greater than f, and parities $P_{1,u}$ and $P_{2,u}$ for u being an integer no smaller than s and no greater than s+g−1.

Meanwhile, the receiving device performs decoding by using log-likelihood ratios for the information and the parities transmitted by the transmitting device, log-likelihood ratios corresponding to $X_{k,s}=0$ (where k is an integer no smaller than f+1 and no greater than five) and log-likelihood ratios corresponding to $X_{1,t}=0$, $X_{2,t}=0$, $X_{3,t}=0$, $X_{4,t}=0$, $X_{5,t}=0$ for t being an integer no smaller than s+1 and no greater than s+g−1, and thereby acquires an estimation sequence of information.

Although description is provided above taking an example where error correction coding is introduced to a communication device, the error correction coding described above is not limited to being introduced to a communication device, and for example, may be introduced to a storage medium (storage). When making such a modification, information that is to be stored to a storage medium (storage) is encoded by using the LDPC-CC of coding rate 5/7 that is based on a parity check polynomial, description of which has been provided in embodiments E1 and E2, and resultant information and parities are stored to the storage medium (storage). When making such a modification, it is preferable that information-zero termination be introduced as described above and that a data sequence as described above corresponding to a data sequence (information and parities) transmitted by the transmitting device when information-zero termination is applied be stored to the storage medium (storage).

Further, the LDPC-CC of coding rate 5/7 that is based on a parity check polynomial, description of which has been provided in embodiments E1 and E2, is applicable to any device that requires error correction coding (e.g., a memory, a hard disk).

Embodiment E4

In the present embodiment, description is provided of a method of configuring an LDPC-CC of coding rate 5/7 that uses an improved tail-biting scheme (an LDPC block code using an LDPC-CC). The LDPC-CC of coding rate 5/7 that uses an improved tail-biting scheme described in the present embodiment is based on the LDPC-CC of coding rate 5/7 that is based on a parity check polynomial, description of which has been provided in embodiments E1 and E2.

Patent Literature 2 includes explanation regarding an LDPC-CC of coding rate (n−1)/n (where n is an integer no smaller than two) that uses an improved tail-biting scheme (an LDPC block code using an LDPC-CC). However, Patent Literature 2 poses a problem for not disclosing an LDPC-CC of a coding rate not satisfying (n−1)/n that uses an improved tail-biting scheme (an LDPC block code using an LDPC-CC).

In the present embodiment, as one example of an LDPC-CC of a coding rate not satisfying (n−1)/n that uses an improved tail-biting scheme (an LDPC block code using an LDPC-CC), description is provided of a method of configuring an LDPC-CC of coding rate 5/7 that uses an improved tail-biting scheme (an LDPC block code using an LDPC-CC).

[Periodic Time-Varying LDPC-CC of Coding Rate 5/7 Using Improved Tail-Biting Scheme and Based on Parity Check Polynomial]

The following describes a periodic time-varying LDPC-CC of coding rate 5/7 that uses an improved tail-biting scheme and is based on a parity check polynomial, based on the configuration of the LDPC-CC of coding rate 5/7 and time-varying period 2m that is based on a parity check polynomial, description of which has been provided in embodiments E1 and E2.

The following describes a method of configuring an LDPC-CC of coding rate 5/7 and time-varying period 2m that is based on a parity check polynomial. Such method has already been described in embodiment E2.

First, the following parity check polynomials satisfying zero are prepared.

[Math. 457-1]

$$\left(1+\sum_{s=1}^{R_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(\sum_{s=R_{\#(2i),3}+1}^{r_{\#(2i),3}} D^{\alpha\#(2i),3,s}\right)X_3(D)+\left(\sum_{s=R_{\#(2i),4}+1}^{r_{\#(2i),4}} D^{\alpha\#(2i),4,s}\right)X_4(D)+\left(\sum_{s=R_{\#(2i),5}+1}^{r_{\#(2i),5}} D^{\alpha\#(2i),5,s}\right)X_5(D)+P_1(D)+D^{\beta\#(2i),0}P_2(D)=$$
$$(D^{\alpha\#(2i),1,R_{\#(2i),1}}+\dots+D^{\alpha\#(2i),1,1}+1)X_1(D)+(D^{\alpha\#(2i),2,R_{\#(2i),2}}+\dots+D^{\alpha\#(2i),2,1}+1)X_2(D)+(D^{\alpha\#(2i),3,r_{\#(2i),3}}+\dots+D^{\alpha\#(2i),3,R_{\#(2i),3}}+1)X_3(D)+(D^{\alpha\#(2i),4,r_{\#(2i),4}}+\dots+D^{\alpha\#(2i),4,R_{\#(2i),4}}+1)X_4(D)+(D^{\alpha\#(2i),5,r_{\#(2i),5}}+\dots+D^{\alpha\#(2i),5,R_{\#(2i),5}}+1)X_5(D)+P_1(D)+D^{\beta\#(2i),0}P_2(D)=0 \quad (197\text{-}1\text{-}1)$$

-continued $$\left(1+\sum_{s=1}^{R_{\#(2i),1}} D^{\alpha_{\#(2i),1,s}}\right)X_1(D)+\left(1+\sum_{s=1}^{R_{\#(2i),2}} D^{\alpha_{\#(2i),2,s}}\right)X_2(D)+\left(\sum_{s=R_{\#(2i),3}+1}^{r_{\#(2i),3}} D^{\alpha_{\#(2i),3,s}}\right)X_3(D)+\left(\sum_{s=R_{\#(2i),4}+1}^{r_{\#(2i),4}} D^{\alpha_{\#(2i),4,s}}\right)X_4(D)+\left(\sum_{s=R_{\#(2i),5}+1}^{r_{\#(2i),5}} D^{\alpha_{\#(2i),5,s}}\right)X_5(D)+P_1(D)+D^{\beta_{\#(2i),1}}P_1(D)=$$
$$(D^{\alpha_{\#(2i),1,R_{\#(2i),1}}}+\dots+D^{\alpha_{\#(2i),1,1}}+1)X_1(D)+(D^{\alpha_{\#(2i),2,R_{\#(2i),2}}}+\dots+D^{\alpha_{\#(2i),2,1}}+1)X_2(D)+(D^{\alpha_{\#(2i),3,r_{\#(2i),3}}}+\dots+D^{\alpha_{\#(2i),3,R_{\#(2i),3}}}+1)X_3(D)+(D^{\alpha_{\#(2i),4,r_{\#(2i),4}}}+\dots+D^{\alpha_{\#(2i),4,R_{\#(2i),4}}}+1)X_4(D)+(D^{\alpha_{\#(2i),5,r_{\#(2i),5}}}+\dots+D^{\alpha_{\#(2i),5,R_{\#(2i),5}}}+1)X_5(D)+P_1(D)+D^{\beta_{\#(2i),1}}P_1(D)=0 \quad (197\text{-}1\text{-}2)$$

[Math. 457-2]

$$\left(\sum_{s=R_{\#(2i),1}+1}^{r_{\#(2i),1}} D^{\alpha_{\#(2i),1,s}}\right)X_1(D)+\left(\sum_{s=R_{\#(2i),2}+1}^{r_{\#(2i),2}} D^{\alpha_{\#(2i),2,s}}\right)X_2(D)+\left(1+\sum_{s=1}^{R_{\#(2i),3}} D^{\alpha_{\#(2i),3,s}}\right)X_3(D)+\left(1+\sum_{s=1}^{R_{\#(2i),4}} D^{\alpha_{\#(2i),4,s}}\right)X_4(D)+\left(1+\sum_{s=1}^{R_{\#(2i),5}} D^{\alpha_{\#(2i),5,s}}\right)X_5(D)+P_2(D)+D^{\beta_{\#(2i),2}}P_1(D)=$$
$$(D^{\alpha_{\#(2i),1,r_{\#(2i),1}}}+\dots+D^{\alpha_{\#(2i),1,R_{\#(2i),1}}}+1)X_1(D)+(D^{\alpha_{\#(2i),2,r_{\#(2i),2}}}+\dots+D^{\alpha_{\#(2i),2,R_{\#(2i),2}}}+1)X_2(D)+(D^{\alpha_{\#(2i),3,R_{\#(2i),3}}}+\dots+D^{\alpha_{\#(2i),3,1}}+1)X_3(D)+(D^{\alpha_{\#(2i),4,R_{\#(2i),4}}}+\dots+D^{\alpha_{\#(2i),4,1}}+1)X_4(D)+(D^{\alpha_{\#(2i),5,R_{\#(2i),5}}}+\dots+D^{\alpha_{\#(2i),5,1}}+1)X_5(D)+P_2(D)+D^{\beta_{\#(2i),2}}P_1(D)=0 \quad (197\text{-}2\text{-}1)$$

$$\left(\sum_{s=R_{\#(2i),1}+1}^{r_{\#(2i),1}} D^{\alpha_{\#(2i),1,s}}\right)X_1(D)+\left(\sum_{s=R_{\#(2i),2}+1}^{r_{\#(2i),2}} D^{\alpha_{\#(2i),2,s}}\right)X_2(D)+\left(1+\sum_{s=1}^{R_{\#(2i),3}} D^{\alpha_{\#(2i),3,s}}\right)X_3(D)+\left(1+\sum_{s=1}^{R_{\#(2i),4}} D^{\alpha_{\#(2i),4,s}}\right)X_4(D)+\left(1+\sum_{s=1}^{R_{\#(2i),5}} D^{\alpha_{\#(2i),5,s}}\right)X_5(D)+P_2(D)+D^{\beta_{\#(2i),3}}P_2(D)=$$
$$(D^{\alpha_{\#(2i),1,r_{\#(2i),1}}}+\dots+D^{\alpha_{\#(2i),1,R_{\#(2i),1}}}+1)X_1(D)+(D^{\alpha_{\#(2i),2,r_{\#(2i),2}}}+\dots+D^{\alpha_{\#(2i),2,R_{\#(2i),2}}}+1)X_2(D)+(D^{\alpha_{\#(2i),3,R_{\#(2i),3}}}+\dots+D^{\alpha_{\#(2i),3,1,}}+1)X_3(D)+(D^{\alpha_{\#(2i),4,R_{\#(2i),4}}}+\dots+D^{\alpha_{\#(2i),4,1}}+1)X_4(D)+(D^{\alpha_{\#(2i),5,R_{\#(2i),5}}}+\dots+D^{\alpha_{\#(2i),5,1}}+1)X_5(D)+P_2(D)+D^{\beta_{\#(2i),3}}P_2(D)=0 \quad (197\text{-}2\text{-}2)$$

In expressions (197-1-1), (197-1-2), (197-2-1), (197-2-2), i is an integer no smaller than zero and no greater than m−1 (i=0, 1, . . . , m−2, m−1).

In expressions (197-1-1), (197-1-2), (197-2-1), (197-2-2), $\alpha_{\#(2i),p,q}$ (where p is an integer no smaller than one and no greater than five, q is an integer no smaller than one and no greater than $r_{\#(2i),p}$ (where $r_{\#(2i),p}$ is a natural number)) and $\beta_{\#(2i),0}$ is a natural number, $\beta_{\#(2i),1}$ is a natural number, $\beta_{\#(2i),2}$ is an integer no smaller than zero, and $\beta_{\#(2i),3}$ is a natural number.

Further, $R_{\#(2i),p}$ is a natural number satisfying $1\le R_{\#(2i),p}<r_{\#(2i),p}$.

Further, y is an integer no smaller than one and no greater than $r_{\#(2i),p}$, z is an integer no smaller than one and no greater than $r_{\#2i,p}$, and $\alpha_{\#(2i),p,y}\neq\alpha_{\#(2i),p,z}$ holds true for $\forall$(y, z) where y≠z. $\forall$ is a universal quantifier. (y is an integer no smaller than one and no greater than $r_{\#(2i),p}$, z is an integer no smaller than one and no greater than $r_{\#2i,p}$, and $\alpha_{\#(2i),p,y}\neq\alpha_{\#(2i),p,z}$ holds true for all y and all z satisfying y≠z.)

Note that in the following, to simplify explanation, a parity check polynomial satisfying zero that is expressed by expression (197-1-1) or expression (197-1-2) is referred to as "#(2i); first expression" for realizing a time-varying period 2m, and a parity check polynomial satisfying zero that is expressed by expression (197-2-1) or expression (197-2-2) is referred to as "#(2i); second expression" for realizing a time-varying period 2m.

Thus, for each i, as #(2i); first expression for realizing a time-varying period 2m, a parity check polynomial satisfying zero expressed by either expression (197-1-1) or expression (197-1-2) is prepared.

That is, for i=0, a parity check polynomial satisfying zero provided by expression (197-1-1) where i=0, or a parity check polynomial satisfying zero provided by expression (197-1-2) where i=0 is prepared.

Similarly:

for i=1, a parity check polynomial satisfying zero provided by expression (197-1-1) where i=1, or a parity check polynomial satisfying zero provided by expression (197-1-2) where i=1 is prepared;

for i=2, a parity check polynomial satisfying zero provided by expression (197-1-1) where i=2, or a parity check polynomial satisfying zero provided by expression (197-1-2) where i=2 is prepared;

⋮ for i=z, a parity check polynomial satisfying zero provided by expression (197-1-1) where i=z, or a parity check polynomial satisfying zero provided by expression (197-1-2) where i=z is prepared (where z is an integer no smaller than zero and no greater than m−1); and

⋮ for i=m−1, a parity check polynomial satisfying zero provided by expression (197-1-1) where i=m−1, or a parity check polynomial satisfying zero provided by expression (197-1-2) where i=m−1 is prepared.

Similarly, for each i, as #(2i); second expression for realizing a time-varying period 2m, a parity check polynomial satisfying zero expressed by either expression (197-2-1) or expression (197-2-2) is prepared.

That is, for i=0, a parity check polynomial satisfying zero provided by expression (197-2-1) where i=0, or a parity check polynomial satisfying zero provided by expression (197-2-2) where i=0 is prepared.

Similarly:

for i=1, a parity check polynomial satisfying zero provided by expression (197-2-1) where i=1, or a parity check polynomial satisfying zero provided by expression (197-2-2) where i=1 is prepared;

for i=2, a parity check polynomial satisfying zero provided by expression (197-2-1) where i=2, or a parity check polynomial satisfying zero provided by expression (197-2-2) where i=2 is prepared;

⋮ for i=z, a parity check polynomial satisfying zero provided by expression (197-2-1) where i=z, or a parity check polynomial satisfying zero provided by expression (197-2-2) where i=z is prepared (where z is an integer no smaller than zero and no greater than m−1); and

⋮ for i=m−1, a parity check polynomial satisfying zero provided by expression (197-2-1) where i=m−1, or a parity check polynomial satisfying zero provided by expression (197-2-2) where i=m−1 is prepared.

Similarly, the following parity check polynomials satisfying zero are provided.

[Math. 458-1]

$$\begin{aligned}&\left(\sum_{s=R_{\#(2i+1),1}+1}^{r_{\#(2i+1),1}} D^{\alpha\#(2i+1),1,s}\right)X_1(D)+\left(\sum_{s=R_{\#(2i+1),1}+2}^{r_{\#(2i+1),2}} D^{\alpha\#(2i+1),2,s}\right)X_2(D)+\left(1+\sum_{s=1}^{R_{\#(2i+1),3}} D^{\alpha\#(2i+1),3,s}\right)X_3(D)+\\&\left(1+\sum_{s=1}^{R_{\#(2i+1),4}} D^{\alpha\#(2i+1),4,s}\right)X_4(D)+\left(1+\sum_{s=1}^{R_{\#(2i+1),5}} D^{\alpha\#(2i+1),5,s}\right)X_5(D)+P_1(D)+D^{\beta\#(2i+1),0}P_2(D)=\\&(D^{\alpha\#(2i+1),1,}r_{\#(2i+1),1}+\dots+D^{\alpha\#(2i+1),1,}R_{\#(2i+1),1}+1)X_1(D)+(D^{\alpha\#(2i+1),2,}r_{\#(2i+1),2}+\dots+D^{\alpha\#(2i+1),2,}R_{\#(2i+1),2}+1)X_2(D)+\\&(D^{\alpha\#(2i+1),3,}R_{\#(2i+1),3}+\dots+D^{\alpha\#(2i+1),3,1}+1)X_3(D)+(D^{\alpha\#(2i+1),4,}R_{\#(2i+1),4}+\dots+D^{\alpha\#(2i+1),4,1}+1)X_4(D)+\\&(D^{\alpha\#(2i+1),5,}R_{\#(2i+1),5}+\dots+D^{\alpha\#(2i+1),5,1}+1)X_5(D)+P_1(D)+D^{\beta\#(2i+1),0}P_2(D)=0\end{aligned}\tag{198-1-1}$$

$$\begin{aligned}&\left(\sum_{s=R_{\#(2i+1),1}+1}^{r_{\#(2i+1),1}} D^{\alpha\#(2i+1),1,s}\right)X_1(D)+\left(\sum_{s=R_{\#(2i+1),1}+2}^{r_{\#(2i+1),2}} D^{\alpha\#(2i+1),2,s}\right)X_2(D)+\left(1+\sum_{s=1}^{R_{\#(2i+1),3}} D^{\alpha\#(2i+1),3,s}\right)X_3(D)+\\&\left(1+\sum_{s=1}^{R_{\#(2i+1),4}} D^{\alpha\#(2i+1),4,s}\right)X_4(D)+\left(1+\sum_{s=1}^{R_{\#(2i+1),5}} D^{\alpha\#(2i+1),5,s}\right)X_5(D)+\end{aligned}\tag{198-1-2}$$

-continued $$\begin{aligned}&P_1(D)+D^{\beta\#(2i+1),1}P_1(D)=\\&(D^{\alpha\#(2i+1),1,}r_{\#(2i+1),1}+\dots+D^{\alpha\#(2i+1),1,}R_{\#(2i+1),1}+1)X_1(D)+(D^{\alpha\#(2i+1),2,}r_{\#(2i+1),2}+\dots+D^{\alpha\#(2i+1),2,}R_{\#(2i+1),2}+1)X_2(D)+\\&(D^{\alpha\#(2i+1),3,}R_{\#(2i+1),3}+\dots+D^{\alpha\#(2i+1),3,1}+1)X_3(D)+(D^{\alpha\#(2i+1),4,}R_{\#(2i+1),4}+\dots+D^{\alpha\#(2i+1),4,1}+1)X_4(D)+\\&(D^{\alpha\#(2i+1),5,}R_{\#(2i+1),5}+\dots+D^{\alpha\#(2i+1),5,1}+1)X_5(D)+P_1(D)+D^{\beta\#(2i+1),1}P_1(D)=0\end{aligned}$$

[Math. 458-2]

$$\begin{aligned}&\left(1+\sum_{s=1}^{R_{\#(2i+1),1}} D^{\alpha\#(2i+1),1,s}\right)X_1(D)+\left(1+\sum_{s=1}^{R_{\#(2i+1),2}} D^{\alpha\#(2i+1),2,s}\right)X_2(D)+\left(\sum_{s=R_{\#(2i+1),3}+1}^{r_{\#(2i+1),3}} D^{\alpha\#(2i+1),3,s}\right)X_3(D)+\\&\left(\sum_{s=R_{\#(2i+1),4}+1}^{r_{\#(2i+1),4}} D^{\alpha\#(2i+1),4,s}\right)X_4(D)+\left(\sum_{s=R_{\#(2i+1),5}+1}^{r_{\#(2i+1),5}} D^{\alpha\#(2i+1),5,s}\right)X_5(D)+P_2(D)+D^{\beta\#(2i+1),2}P_1(D)=\\&(D^{\alpha\#(2i+1),1,}R_{\#(2i+1),1}+\dots+D^{\alpha\#(2i+1),1,1}+1)X_1(D)+(D^{\alpha\#(2i+1),2,}R_{\#(2i+1),2}+\dots+D^{\alpha\#(2i+1),2,1}+1)X_2(D)+\\&(D^{\alpha\#(2i+1),3,}r_{\#(2i+1),3}+\dots+D^{\alpha\#(2i+1),3,}R_{\#(2i+1),3}+1)X_3(D)+(D^{\alpha\#(2i+1),4,}r_{\#(2i+1),4}+\dots+D^{\alpha\#(2i+1),4,}R_{\#(2i+1),4}+1)X_4(D)+\\&(D^{\alpha\#(2i+1),5,}r_{\#(2i+1),5}+\dots+D^{\alpha\#(2i+1),5,}R_{\#(2i+1),5}+1)X_5(D)+P_2(D)+D^{\beta\#(2i+1),2}P_1(D)=0\end{aligned}\tag{198-2-1}$$

$$\begin{aligned}&\left(1+\sum_{s=1}^{R_{\#(2i+1),1}} D^{\alpha\#(2i+1),1,s}\right)X_1(D)+\left(1+\sum_{s=1}^{R_{\#(2i+1),2}} D^{\alpha\#(2i+1),2,s}\right)X_2(D)+\left(\sum_{s=R_{\#(2i+1),3}+1}^{r_{\#(2i+1),3}} D^{\alpha\#(2i+1),3,s}\right)X_3(D)+\\&\left(\sum_{s=R_{\#(2i+1),4}+1}^{r_{\#(2i+1),4}} D^{\alpha\#(2i+1),4,s}\right)X_4(D)+\left(\sum_{s=R_{\#(2i+1),5}+1}^{r_{\#(2i+1),5}} D^{\alpha\#(2i+1),5,s}\right)X_5(D)+P_2(D)+D^{\beta\#(2i+1),3}P_2(D)=\\&(D^{\alpha\#(2i+1),1,}R_{\#(2i+1),1}+\dots+D^{\alpha\#(2i+1),1,1}+1)X_1(D)+(D^{\alpha\#(2i+1),2,}R_{\#(2i+1),2}+\dots+D^{\alpha\#(2i+1),2,1}+1)X_2(D)+\\&(D^{\alpha\#(2i+1),3,}r_{\#(2i+1),3}+\dots+D^{\alpha\#(2i+1),3,}R_{\#(2i+1),3}+1)X_3(D)+(D^{\alpha\#(2i+1),4,}r_{\#(2i+1),4}+\dots+D^{\alpha\#(2i+1),4,}R_{\#(2i+1),4}+1)X_4(D)+\\&(D^{\alpha\#(2i+1),5,}r_{\#(2i+1),5}+\dots+D^{\alpha\#(2i+1),5,}R_{\#(2i+1),5}+1)X_5(D)+P_2(D)+D^{\beta\#(2i+1),3}P_2(D)=0\end{aligned}\tag{198-2-2}$$

In expressions (198-1-1), (198-1-2), (198-2-1), (198-2-2), i is an integer no smaller than zero and no greater than m−1 (i=0, 1, . . . , m−2, m−1).

In expressions (198-1-1), (198-1-2), (198-2-1), (198-2-2), $\alpha_{\#(2i+1),p,q}$ (where p is an integer no smaller than one and no greater than five, q is an integer no smaller than one and no greater than $r_{\#(2i+1),p}$ (where $r_{\#(2i+1),p}$ is a natural number)) and $\beta_{\#(2i+1),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, $R_{\#(2i+1),p}$ is a natural number satisfying $1 \leq R_{\#(2i+1),p} < r_{\#(2i+1),p}$.

Further, y is an integer no smaller than one and no greater than $r_{\#(2i+1),p}$, z is an integer no smaller than one and no greater than $r_{\#(2i+1),p}$, and $\alpha_{\#(2i+1),p,y} \neq \alpha_{\#(2i+1),p,z}$ holds true for $^{\forall}$(y, z) where y≠z. ∀ is a universal quantifier. (y is an integer no smaller than one and no greater than $r_{\#(2i+1),p}$, z is an integer no smaller than one and no greater than $r_{\#(2i+1),p}$, and $\alpha_{\#(2i+1),p,y} \neq \alpha_{\#(2i+1),p,z}$ holds true for all y and all z satisfying y≠z.)

Note that in the following, to simplify explanation, a parity check polynomial satisfying zero that is expressed by expression (198-1-1) or expression (198-1-2) is referred to as "#(2i+1); first expression" for realizing a time-varying period 2m, and a parity check polynomial satisfying zero that is expressed by expression (198-2-1) or expression (198-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (198-1-1) or expression (198-1-2) is prepared.

That is, for i=0, a parity check polynomial satisfying zero provided by expression (198-1-1) where i=0, or a parity check polynomial satisfying zero provided by expression (198-1-2) where i=0 is prepared.

Similarly:

for i=1, a parity check polynomial satisfying zero provided by expression (198-1-1) where i=1, or a parity check polynomial satisfying zero provided by expression (198-1-2) where i=1 is prepared;

for i=2, a parity check polynomial satisfying zero provided by expression (198-1-1) where i=2, or a parity check polynomial satisfying zero provided by expression (198-1-2) where i=2 is prepared;

⋮ for i=z, a parity check polynomial satisfying zero provided by expression (198-1-1) where i=z, or a parity check polynomial satisfying zero provided by expression (198-1-2) where i=z is prepared (where z is an integer no smaller than zero and no greater than m−1); and

⋮ for i=m−1, a parity check polynomial satisfying zero provided by expression (198-1-1) where i=m−1, or a parity check polynomial satisfying zero provided by expression (198-1-2) where i=m−1 is prepared.

Similarly, for each i, as #(2i+1); second expression for realizing a time-varying period 2m, a parity check polynomial satisfying zero expressed by either expression (198-2-1) or expression (198-2-2) is prepared.

That is, for i=0, a parity check polynomial satisfying zero provided by expression (198-2-1) where i=0, or a parity check polynomial satisfying zero provided by expression (198-2-2) where i=0 is prepared.

Similarly:

for i=1, a parity check polynomial satisfying zero provided by expression (198-2-1) where i=1, or a parity check polynomial satisfying zero provided by expression (198-2-2) where i=1 is prepared;

for i=2, a parity check polynomial satisfying zero provided by expression (198-2-1) where i=2, or a parity check polynomial satisfying zero provided by expression (198-2-2) where i=2 is prepared;

⋮ for i=z, a parity check polynomial satisfying zero provided by expression (198-2-1) where i=z, or a parity check polynomial satisfying zero provided by expression (198-2-2) where i=z is prepared (where z is an integer no smaller than zero and no greater than m−1); and

⋮ for i=m−1, a parity check polynomial satisfying zero provided by expression (198-2-1) where i=m−1, or a parity check polynomial satisfying zero provided by expression (198-2-2) where i=m−1 is prepared.

As such, an LDPC-CC of coding rate 5/7 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (197-1-1) or expression (197-1-2), parity check polynomials satisfying zero provided by expression (197-2-1) or expression (197-2-2), parity check polynomials satisfying zero provided by expression (198-1-1) or expression (198-1-2), and parity check polynomials satisfying zero provided by expression (198-2-1) or expression (198-2-2).

For example, the time varying period 2×m is formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expressions (197-1-1), (197-1-2), (197-2-1), (197-2-2), (198-1-1), (198-1-2), (198-2-1), and (198-2-2) (where j is an integer no smaller than zero).

The following presumes that 2k=j%2m holds true. In the following, % means a modulo, and for example, α%6 represents a remainder after dividing α by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

Note that in the parity check polynomials satisfying zero of expressions (197-1-1), (197-1-2), (197-2-1), (197-2-2), (198-1-1), (198-1-2), (198-2-1), and (198-2-2), a sum of the number of terms of $P_1(D)$ and the number of terms of $P_2(D)$ equals two. This realizes sequentially finding parities $P_1$ and $P_2$ when applying an improved tail-biting scheme, and thus, is a significant factor realizing a reduction in computation amount (circuit scale).

The following describes the relationship between the time-varying period of the parity check polynomials satisfying zero for the LDPC-CC of coding rate 5/7 and time-varying period 2m that is based on a parity check polynomial, description of which has been provided in embodiments E1 and E2 and on which the LDPC-CC of coding rate 5/7 that uses an improved tail-biting scheme (an LDPC block code using an LDPC-CC) is based, and block size in the LDPC-CC of coding rate 5/7 that uses an improved tail-biting scheme (an LDPC block code using an LDPC-CC) proposed in the present embodiment.

Regarding this point, in order to achieve error correction capability of even higher level, a configuration is preferable where a Tanner graph formed by the LDPC-CC of coding rate 5/7 and time-varying period 2m that is based on a parity check polynomial, description of which has been provided in embodiments E1 and E2 and on which the LDPC-CC of coding rate 5/7 that uses an improved tail-biting scheme (an LDPC block code using an LDPC-CC) is based, resembles a Tanner graph of the LDPC-CC of coding rate 5/7 that uses an improved tail-biting scheme (an LDPC block code using an LDPC-CC). Thus, the following conditions are significant.

<Condition #N1>

The number of rows in a parity check matrix for the LDPC-CC of coding rate 5/7 that uses an improved tail-biting scheme (an LDPC block code using an LDPC-CC) is a multiple of 4×m.

Accordingly, the number of columns in the parity check matrix for the LDPC-CC of coding rate 5/7 that uses an improved tail-biting scheme (an LDPC block code using an LDPC-CC) is a multiple of 7×2×m. According to this condition, (for example) a log-likelihood ratio that is necessary in decoding is a log-likelihood ratio of the number of columns in the parity check matrix for the LDPC-CC of coding rate 5/7 that uses an improved tail-biting scheme (an LDPC block code using an LDPC-CC).

Note that the relationship between the LDPC-CC of coding rate 5/7 that uses an improved tail-biting scheme (an LDPC block code using an LDPC-CC) and the LDPC-CC of coding rate 5/7 and time-varying period 2m that is based on a parity check polynomial, description of which has been provided in embodiments E1 and E2 and on which the LDPC-CC of coding rate 5/7 that uses an improved tail-biting scheme (an LDPC block code using an LDPC-CC) is based, is described in detail later in the present disclosure.

Thus, when denoting the parity check matrix for the LDPC-CC of coding rate 5/7 that uses an improved tail-biting scheme (an LDPC block code using an LDPC-CC) as $H_{pro}$, the number of columns of $H_{pro}$ can be expressed as 7×2×m×z (where z is a natural number).

Accordingly, a transmission sequence (encoded sequence (codeword)) $v_s$ of block s of the LDPC-CC of coding rate 5/7 that uses an improved tail-biting scheme (an LDPC block code using an LDPC-CC) can be expressed as $v_s=(X_{s,1,1}, X_{s,2,1}, \ldots, X_{s,5,1}, P^{pro}_{s,1,1}, P^{pro}_{s,2,1}, X_{s,1,2}, X_{s,2,2}, \ldots, X_{s,5,2}, P^{pro}_{s,1,2}, P^{pro}_{s,2,2}, \ldots, X_{s,1,k}, X_{s,2,k}, \ldots, X_{s,5,k}, P^{pro}_{s,1,k}, P^{pro}_{s,2,k}, \ldots, X_{s,1,2\times m\times z}, X_{s,2,2\times m\times z}, \ldots, X_{s,5,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}v_s$ are zeroes).

$X_{s,j,k}$ (where j is an integer no smaller than one and no greater than five) is a bit of information $X_j$, $P^{pro}_{s,1,k}$ is a bit of parity $P_1$ of the LDPC-CC of coding rate 5/7 that uses an improved tail-biting scheme (an LDPC block code using an LDPC-CC), and $P^{pro}_{s,2,k}$ is a bit of parity $P_2$ of the LDPC-CC of coding rate 5/7 that uses an improved tail-biting scheme (an LDPC block code using an LDPC-CC).

Further, $\lambda_{pro,s,k}=(X_{s,1,k}, X_{s,2,k}, X_{s,3,k}, X_{s,4,k}, X_{s,5,k}, P^{pro}_{s,1,k}, P^{pro}_{s,2,k})$ holds true.

In addition, the number of rows in the parity check matrix $H_{pro}$ for the LDPC-CC of coding rate 5/7 that uses an improved tail-biting scheme (an LDPC block code using an LDPC-CC) is 4×m×z.

It has been indicated above that the LDPC-CC of coding rate 5/7 that uses an improved tail-biting scheme (an LDPC block code using an LDPC-CC) is based on the LDPC-CC of coding rate 5/7 and time-varying period 2m that is based on a parity check polynomial, description of which has been provided in embodiments E1 and E2. This is explained in the following.

First, consideration is made of a parity check matrix when configuring a periodic time-varying LDPC-CC using tail-biting by using only parity check polynomials satisfying zero for the LDPC-CC of coding rate 5/7 and time-varying period 2m that is based on a parity check polynomial, description of which has been provided in embodiments E1 and E2.

Figure 81:
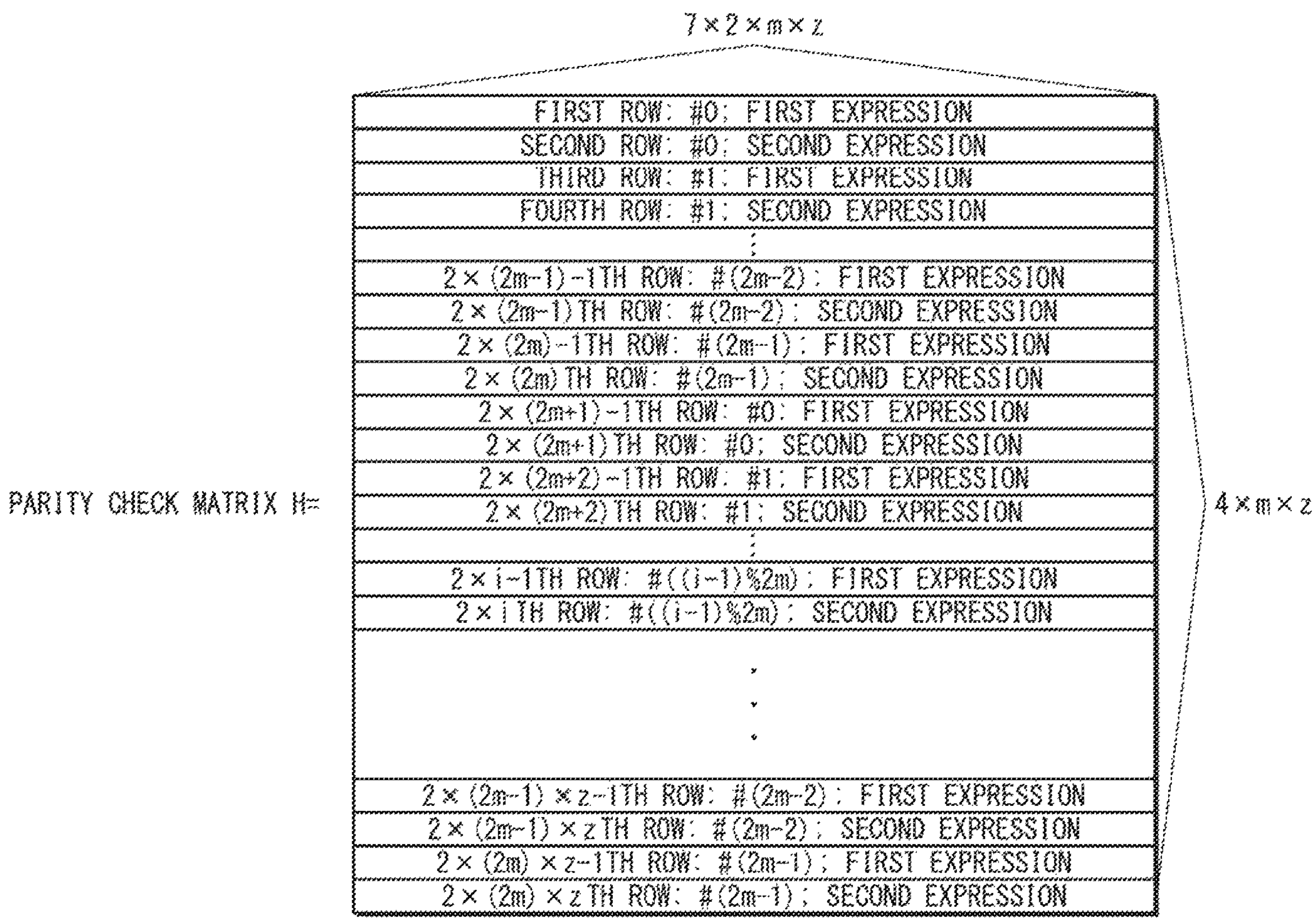
FIG. 81 shows an example of the configuration of check matrix for LDPC-CC of coding rate 5/7 when tail-biting is performed.

FIG. 81 illustrates a configuration of a parity check matrix H when configuring a periodic time-varying LDPC-CC using tail-biting by performing tail-biting by using only parity check polynomials satisfying zero for an LDPC-CC of coding rate 5/7 and time-varying period 2m.

Since Condition #N1 is satisfied in FIG. 81, the number of rows of the parity check matrix is m×z and the number of columns of the parity check matrix is 7×2×m×z.

As illustrated in FIG. 81:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression";

"a vector for the (2×i)th row of the parity check matrix H can be generated from a parity check polynomial satisfying zero of #((i−1)%2m); second expression" (where i is an integer no smaller than one and no greater than 2×m×z);

⋮

"a vector for the 2×(2m−1)×z−1th row of the parity check matrix H can be generated from a parity check polynomial satisfying zero of #(2m−2); first expression";

"a vector for the 2×(2m−1)×zth row of the parity check matrix H can be generated from a parity check polynomial satisfying zero of #(2m−2); second expression";

"a vector for the 2×(2m)×z−1th row of the parity check matrix H can be generated from a parity check polynomial satisfying zero of #(2m−1); first expression"; and "a vector for the 2×(2m)×zth row of the parity check matrix H can be generated from a parity check polynomial satisfying zero of #(2m−1); second expression".

To prepare for the explanation to be provided in the following, a mathematical expression is provided of the parity check matrix H in FIG. 81, which is a parity check matrix when configuring a periodic time-varying LDPC-CC by performing tail-biting by using only parity check polynomials satisfying zero for the LDPC-CC of coding rate 5/7 and time-varying period 2m that is based on a parity check polynomial, description of which is provided in embodiments E1 and E2. When denoting a vector having one row and 7×2×m×z columns in row k of the parity check matrix H as $h_k$, the parity check matrix H in FIG. 81 is expressed as follows.

[Math. 459]

$$H=\begin{pmatrix} h_1 \\ h_2 \\ \vdots \\ h_{2\times(2m)\times z-1} \\ h_{2\times(2m)\times z} \end{pmatrix} \tag{199}$$

The following describes a parity check matrix for the LDPC-CC of coding rate 5/7 that uses an improved tail-biting scheme (an LDPC block code using an LDPC-CC).

Figure 82:
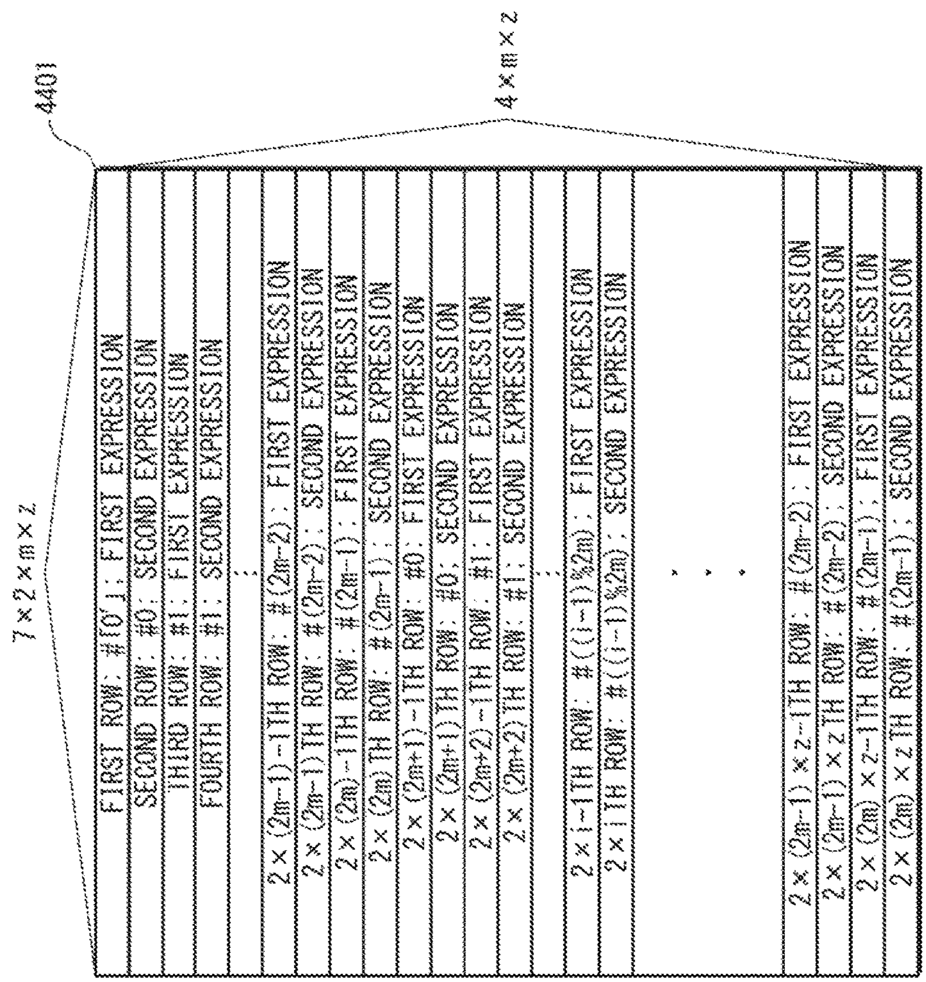
FIG. 82 shows an example of the configuration of check matrix for LDPC-CC of coding rate 5/7 when improved tail-biting is performed.

FIG. 82 illustrates one example of a configuration of a parity check matrix $H_{pro}$ for the LDPC-CC of coding rate 5/7 that uses an improved tail-biting scheme (an LDPC block code using an LDPC-CC).

The parity check matrix $H_{pro}$ for the LDPC-CC of coding rate 5/7 that uses an improved tail-biting scheme (an LDPC block code using an LDPC-CC) satisfies Condition #N1.

When denoting a vector having one row and 7×2×m×z columns in row k of the parity check matrix $H_{pro}$ in FIG. 82, which is for the LDPC-CC of coding rate 5/7 that uses an improved tail-biting scheme (an LDPC block code using an LDPC-CC), as $g_k$, the parity check matrix $H_{pro}$ in FIG. 82 is expressed as follows.

[Math. 460]

$$H_{pro}=\begin{pmatrix} g_1 \\ g_2 \\ \vdots \\ g_{2\times(2m)\times z-1} \\ g_{2\times(2m)\times z} \end{pmatrix} \tag{200}$$

A transmission sequence (encoded sequence (codeword)) $v_s$ of block s of the LDPC-CC of coding rate 5/7 that uses an improved tail-biting scheme (an LDPC block code using an LDPC-CC) can be expressed as $v_s=(X_{s,1,1}, X_{s,2,1}, \ldots, X_{s,5,1}, P^{pro}_{s,1,1}, P^{pro}_{s,2,1}, X_{s,1,2}, X_{s,2,2}, \ldots, X_{s,5,2}, P^{pro}_{s,1,2}, P^{pro}_{s,2,2}, \ldots, X_{s,1,k}, X_{s,2,k}, \ldots, X_{s,5,k}, P^{pro}_{s,1,k}, P^{pro}_{s,2,k}, \ldots, X_{s,1,2\times m\times z}, X_{s,2,2\times m\times z}, \ldots, X_{s,5,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}v_s$ are zeroes).

$X_{s,j,k}$ (where j is an integer no smaller than one and no greater than five) is a bit of information $X_j$, $P^{pro}_{s,1,k}$ is a bit of parity $P_1$ of the LDPC-CC of coding rate 5/7 that uses an improved tail-biting scheme (an LDPC block code using an LDPC-CC), and $P^{pro}_{s,2,k}$ is a bit of parity $P_2$ of the LDPC-CC of coding rate 5/7 that uses an improved tail-biting scheme (an LDPC block code using an LDPC-CC).

In the parity check matrix $H_{pro}$ in FIG. 82, which illustrates one example of a configuration of a parity check matrix $H_{pro}$ for the LDPC-CC of coding rate 5/7 that uses an improved tail-biting scheme (an LDPC block code using an LDPC-CC), rows other than row one, or that is, rows between row two to row 2×(2×m)×z in the parity check matrix $H_{pro}$ in FIG. 82, have the same configuration as rows between row two and row 2×(2×m)×z in the parity check matrix H in FIG. 81 (refer to FIGS. 81 and 82). Accordingly, FIG. 82 includes an indication of #0'; first expression at 4401 in the first row. (This point is explained later in the present disclosure.) Accordingly, the following relational expression holds true based on expressions 199 and 200.

[Math. 461]

For all i no smaller than two and no greater than 2×(2×m)×z, the following holds true:

$$g_i=h_i \tag{201}$$

Further, the following holds true when i=1.

[Math. 462]

$$g_1\neq h_1 \tag{202}$$

Accordingly, the parity check matrix $H_{pro}$ for the LDPC-CC of coding rate 5/7 that uses an improved tail-biting scheme (an LDPC block code using an LDPC-CC) can be expressed as follows.

[Math. 463]

$$H_{pro} = \begin{pmatrix} g_1 \\ h_2 \\ \vdots \\ h_{2\times(2m)\times z-1} \\ h_{2\times(2m)\times z} \end{pmatrix} \quad (203)$$

In expression 203, expression 202 holds true.

Next, explanation is provided of a method of configuring $g_1$ in expression 203 so that parities can be found sequentially and high error correction capability can be achieved.

One example of a method of configuring $g_1$ in expression 203, so that parities can be found sequentially and high error correction capability can be achieved, is using a parity check polynomial satisfying zero of #0; first expression of the LDPC-CC of coding rate 5/7 that uses an improved tail-biting scheme (an LDPC block code using an LDPC-CC), which serves as the basis.

Since $g_1$ is row one of the parity check matrix $H_{pro}$ for the LDPC-CC of coding rate 5/7 that uses an improved tail-biting scheme (an LDPC block code using an LDPC-CC), $g_1$ is generated from a parity check polynomial satisfying zero that is obtained by transforming a parity check polynomial satisfying zero of #0; first expression. As described above, a parity check polynomial satisfying zero of #0; first expression is expressed by either expression (204-1-1) or expression (204-1-2).

[Math. 464]

$$\left(1+\sum_{s=1}^{R_{\#(0),1}} D^{\alpha\#(0),1,s}\right)X_1(D)+\left(1+\sum_{s=1}^{R_{\#(0),2}} D^{\alpha\#(0),2,s}\right)X_2(D)+\left(\sum_{s=R_{\#(0),3}+1}^{r_{\#(0),3}} D^{\alpha\#(0),3,s}\right)X_3(D)+\left(\sum_{s=R_{\#(0),4}+1}^{r_{\#(0),4}} D^{\alpha\#(0),4,s}\right)X_4(D)+\left(\sum_{s=R_{\#(0),5}+1}^{r_{\#(0),5}} D^{\alpha\#(0),5,s}\right)X_5(D)+P_1(D)+D^{\beta\#(0),0}P_2(D)=$$
$$(D^{\alpha\#(0),1,R_{\#(0),1}}+\dots+D^{\alpha\#(0),1,1}+1)X_1(D)+(D^{\alpha\#(0),2,R_{\#(0),2}}+\dots+D^{\alpha\#(0),2,1}+1)X_2(D)+(D^{\alpha\#(0),3,r_{\#(0),3}}+\dots+D^{\alpha\#(0),3,R_{\#(0),3}}+1)X_3(D)+(D^{\alpha\#(0),4,r_{\#(0),4}}+\dots+D^{\alpha\#(0),4,R_{\#(0),4}}+1)X_4(D)+(D^{\alpha\#(0),5,r_{\#(0),5}}+\dots+D^{\alpha\#(0),5,R_{\#(0),5}}+1)X_5(D)+P_1(D)+D^{\beta\#(0),0}P_2(D)=0 \quad (204\text{-}1\text{-}1)$$

$$\left(1+\sum_{s=1}^{R_{\#(0),1}} D^{\alpha\#(0),1,s}\right)X_1(D)+\left(1+\sum_{s=1}^{R_{\#(0),2}} D^{\alpha\#(0),2,s}\right)X_2(D)+\left(\sum_{s=R_{\#(0),3}+1}^{r_{\#(0),3}} D^{\alpha\#(0),3,s}\right)X_3(D)+\left(\sum_{s=R_{\#(0),4}+1}^{r_{\#(0),4}} D^{\alpha\#(0),4,s}\right)X_4(D)+\left(\sum_{s=R_{\#(0),5}+1}^{r_{\#(0),5}} D^{\alpha\#(0),5,s}\right)X_5(D)+P_1(D)+D^{\beta\#(0),1}P_1(D)=$$
$$(D^{\alpha\#(0),1,R_{\#(0),1}}+\dots+D^{\alpha\#(0),1,1}+1)X_1(D)+(D^{\alpha\#(0),2,R_{\#(0),2}}+\dots+D^{\alpha\#(0),2,1}+1)X_2(D)+(D^{\alpha\#(0),3,r_{\#(0),3}}+\dots+D^{\alpha\#(0),3,R_{\#(0),3}}+1)X_3(D)+(D^{\alpha\#(0),4,r_{\#(0),4}}+\dots+D^{\alpha\#(0),4,R_{\#(0),4}}+1)X_4(D)+(D^{\alpha\#(0),5,r_{\#(0),5}}+\dots+D^{\alpha\#(0),5,R_{\#(0),5}}+1)X_5(D)+P_1(D)+D^{\beta\#(0),1}P_1(D)=0 \quad (204\text{-}1\text{-}2)$$

As one example of a parity check polynomial satisfying zero for generating vector $g_1$ in row one of the parity check matrix $H_{pro}$ for the LDPC-CC of coding rate 5/7 that uses an improved tail-biting scheme (an LDPC block code using an LDPC-CC), a parity check polynomial satisfying zero of #0; first expression is expressed as follows, for either expression (204-1-1) or expression (204-1-2).

[Math. 465]

$$\left(1+\sum_{s=1}^{R_{\#(0),1}} D^{\alpha\#(0),1,s}\right)X_1(D)+\left(1+\sum_{s=1}^{R_{\#(0),2}} D^{\alpha\#(0),2,s}\right)X_2(D)+\left(\sum_{s=R_{\#(0),3}+1}^{r_{\#(0),3}} D^{\alpha\#(0),3,s}\right)X_3(D)+\left(\sum_{s=R_{\#(0),4}+1}^{r_{\#(0),4}} D^{\alpha\#(0),4,s}\right)X_4(D)+\left(\sum_{s=R_{\#(0),5}+1}^{r_{\#(0),5}} D^{\alpha\#(0),5,s}\right)X_5(D)+P_1(D)=$$
$$(D^{\alpha\#(0),1,R_{\#(0),1}}+\dots+D^{\alpha\#(0),1,1}+1)X_1(D)+(D^{\alpha\#(0),2,R_{\#(0),2}}+\dots+D^{\alpha\#(0),2,1}+1)X_2(D)+(D^{\alpha\#(0),3,r_{\#(0),3}}+\dots+D^{\alpha\#(0),3,R_{\#(0),3}}+1)X_3(D)+(D^{\alpha\#(0),4,r_{\#(0),4}}+\dots+D^{\alpha\#(0),4,R_{\#(0),4}}+1)X_4(D)+(D^{\alpha\#(0),5,r_{\#(0),5}}+\dots+D^{\alpha\#(0),5,R_{\#(0),5}}+1)X_5(D)+P_1(D)=0 \quad (205)$$

Accordingly, vector $g_1$ is a vector having one row and 7×2×m×z columns that is obtained by performing tail-biting with respect to expression 205.

Note that in the following, a parity check polynomial that satisfies zero provided by expression 205 is referred to as #0'; first expression.

Accordingly, row one of the parity check matrix $H_{pro}$ for the LDPC-CC of coding rate 5/7 that uses an improved tail-biting scheme (an LDPC block code using an LDPC-CC) can be obtained by transforming #0'; first expression of expression 205 (that is, a vector $g_1$ corresponding to one row and 7×2×m×z columns can be obtained).

A transmission sequence (encoded sequence (codeword)) $v_s$ of block s of the LDPC-CC of coding rate 5/7 that uses an improved tail-biting scheme (an LDPC block code using an LDPC-CC) is $v_s=(X_{s,1,1}, X_{s,2,1}, \dots, X_{s,5,1}, P^{pro}_{s,1,1}, P^{pro}_{s,2,1}, X_{s,1,2}, X_{s,2,2}, \dots, X_{s,5,2}, P^{pro}_{s,1,2}, P^{pro}_{s,2,2}, \dots, X_{s,1,k}, X_{s,2,k}, \dots, X_{s,5,k}, P^{pro}_{s,1,k}, P^{pro}_{s,2,k}, \dots, X_{s,1,2\times m\times z}, X_{s,2,2\times m\times z}, \dots, X_{s,5,2\times m\times z}, P_{s,1,2\times m\times z}, P^{pro}_{s,2\times m\times z})^T=(\lambda_{pro,s,1}, \lambda_{pro,s,2}, \dots, \lambda_{pro,s,2\times m\times z}, \lambda_{pro,s,2\times m\times z-1}, \lambda_{pro,s,2\times m\times z})^T$, and the number of parity check polynomials satisfying zero necessary for obtaining this transmission sequence is 2×(2×m)×z.

Here, when arranging such 2×(2×m)×z number of parity check polynomials satisfying zero in order, a parity check polynomial satisfying zero appearing eth is referred to in the following as an "eth parity check polynomial satisfying zero" (where e is an integer no smaller than zero and no greater than 2×(2×m)×z−1).

As such, the parity check polynomials satisfying zero are arranged in the following order:

zeroth: zeroth parity check polynomial satisfying zero;

first: first parity check polynomial satisfying zero;

second: second parity check polynomial satisfying zero;

⋮ eth: eth parity check polynomial satisfying zero;

⋮

2×(2×m)×z−2th: 2×(2×m)×z−2th parity check polynomial satisfying zero; and

2×(2×m)×z−1th: 2×(2×m)×z−1th parity check polynomial satisfying zero.

Accordingly, the transmission sequence (encoded sequence (codeword)) $v_s$ of block s of the LDPC-CC of coding rate 5/7 that uses an improved tail-biting scheme (an LDPC block code using an LDPC-CC) is obtained. (As can be seen from description provided above, when expressing the parity check matrix $H_{pro}$ for the LDPC-CC of coding rate 5/7 that uses an improved tail-biting scheme (an LDPC block code using an LDPC-CC) as provided in expression 200, a vector composed of row e+1 of the parity check matrix $H_{pro}$ corresponds to the eth parity check polynomial satisfying zero.)

Accordingly, in the LDPC-CC of coding rate 5/7 that uses an improved tail-biting scheme (an LDPC block code using an LDPC-CC):

the 0th parity check polynomial satisfying zero is a parity check polynomial satisfying zero of #0'; first expression provided by expression 205;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 205;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

As description has been provided above, the LDPC-CC of coding rate 5/7 that uses an improved tail-biting scheme (an LDPC block code using an LDPC-CC), at the same time as achieving high error correction capability, enables finding multiple parities sequentially, and therefore, achieves an advantageous effect of reducing circuit scale of an encoder.

In the following, explanation is provided of what is meant by "finding parities sequentially".

In the example described above, since bits of information $X_1$ through $X_5$ are pre-acquired, $P^{pro}_{s,1,1}$ can be calculated by using the 0th parity check polynomial satisfying zero of the LDPC-CC of coding rate 5/7 that uses an improved tail-biting scheme (an LDPC block code using an LDPC-CC), or that is, by using the parity check polynomial satisfying zero of #0'; first expression provided by expression 205.

Then, from the bits of information $X_1$ through $X_5$ and $P^{pro}_{s,1,1}$, another parity (denoted as $P_{c=1}$) can be calculated by using another parity check polynomial satisfying zero.

Further, from the bits of information $X_1$ through $X_5$ and $P_{c=1}$, another parity (denoted as $P_{c=2}$) can be calculated by using another parity check polynomial satisfying zero.

By repeating such operation, from the bits of information $X_1$ through $X_5$ and $P_{c=h}$, another parity (denoted as $P_{c=h+1}$) can be calculated by using a given parity check polynomial satisfying zero.

This is referred to as "finding parities sequentially", and when parities can be found sequentially, multiple parities can be obtained without calculation of complex simultaneous equations, whereby an advantageous effect is achieved of reducing circuit scale (computation amount) of an encoder.

Next, explanation is provided of configurations and operations of an encoder and a decoder for the LDPC-CC of coding rate 5/7 that uses an improved tail-biting scheme (an LDPC block code using an LDPC-CC).

In the following, one example case is considered where the LDPC-CC of coding rate 5/7 that uses an improved tail-biting scheme (an LDPC block code using an LDPC-CC) is used in a communication system. When applying the LDPC-CC of coding rate 5/7 that uses an improved tail-biting scheme (an LDPC block code using an LDPC-CC) to a communication system, the encoder and the decoder for the LDPC-CC of coding rate 5/7 that uses an improved tail-biting scheme (an LDPC block code using an LDPC-CC) are characterized for each being configured and each operating based on the parity check matrix $H_{pro}$ for the LDPC-CC of coding rate 5/7 that uses an improved tail-biting scheme (an LDPC block code using an LDPC-CC) and based on the relationship $H_{pro}v_s=0$.

The following provides explanation while referring to FIG. 25, which is an overall diagram of a communication system. An encoder 2511 of a transmitting device 2501 receives an information sequence of block s ($X_{s,1,1}, X_{s,2,1}, \ldots, X_{s,5,1}, X_{s,1,2}, X_{s,2,2}, \ldots, X_{s,5,2}, \ldots, X_{s,1,k}, X_{s,2,k}, \ldots, X_{s,5,k}, \ldots, X_{s,1,2\times m\times z}, X_{s,2,2\times m\times z}, \ldots, X_{s,5,2\times m\times z}$) as input. The encoder 2511 performs encoding based on the parity check matrix $H_{pro}$ for the LDPC-CC of coding rate 5/7 that uses an improved tail-biting scheme (an LDPC block code using an LDPC-CC) and based on the relationship $H_{pro}v_s=0$. The encoder 2511 generates a transmission sequence (encoded sequence (codeword)) $v_s$ of block s of the LDPC-CC of coding rate 5/7 that uses an improved tail-biting scheme (an LDPC block code using an LDPC-CC), denoted as $v_s=(X_{s,1,1}, X_{s,2,1}, \ldots, X_{s,5,1}, P^{pro}_{s,1,1}, P^{pro}_{s,2,1}, X_{s,1,2}, X_{s,2,2}, \ldots, X_{s,5,2}, P^{pro}_{s,1,2}, P^{pro}_{s,2,2}, \ldots, X_{s,1,k}, X_{s,2,k}, \ldots, X_{s,5,k}, P^{pro}_{s,1,k}, P^{pro}_{s,2,k}, \ldots, X_{s,1,2\times m\times z}, X_{s,2,2\times m\times z}, \ldots, X_{s,5,2\times m\times z}, P^{pro}_{s,1,2\times m\times z}, P^{pro}_{s,2,2\times m\times z})^T$, and outputs the transmission sequence $v_s$. As already described above, the LDPC-CC of coding rate 5/7 that uses an improved tail-biting scheme (an LDPC block code using an LDPC-CC) is characterized for enabling parities to be found sequentially.

A decoder 2523 of a receiving device 2520 in FIG. 25 receives, as input, a log-likelihood ratio of each bit of, for example, the transmission sequence $v_s=(X_{s,1,1}, X_{s,2,1}, \ldots, X_{s,5,1}, P^{pro}_{s,1,1}, P^{pro}_{s,2,1}, X_{s,1,2}, X_{s,2,2}, \ldots, X_{s,5,2}, P^{pro}_{s,1,2}, P^{pro}_{s,2,2}, \ldots, X_{s,1,k}, X_{s,2,k}, \ldots, X_{s,5,k}, P^{pro}_{s,1,k}, P^{pro}_{s,2,k}, \ldots, X_{s,1,2\times m\times z}, X_{s,2,2\times m\times z}, \ldots, X_{s,5,2\times m\times z}, P^{pro}_{s,1,2\times m\times z}, P^{pro}_{s,2,2\times m\times z})^T$. The log-likelihood ratios are output from a log-likelihood ratio generator 2522. The decoder 2523 performs decoding for an LDPC code according to the parity check matrix $H_{pro}$ for the LDPC-CC of coding rate 5/7 that uses an improved tail-biting scheme (an LDPC block code using an LDPC-CC). For example, the decoding may be decoding disclosed in Non-Patent Literature 4, Non-Patent Literature 6, Non-Patent Literature 7, Non-Patent Literature 8, etc., i.e., simple BP decoding such as min-sum decoding, offset BP decoding, or Normalized BP decoding, or Belief Propagation (BP) decoding in which scheduling is performed with respect to the row operations (Horizontal operations) and the column operations (Vertical operations) such as Shuffled BP decoding or Layered BP decoding. The decoding may also be decoding such as bit-flipping decoding disclosed in Non-Patent Literature 17, for example. The decoder 2523 obtains an estimation transmission sequence (estimation encoded sequence) (reception sequence) of block s through the decoding, and outputs the estimation transmission sequence.

In the above, explanation is provided on operations of the encoder and the decoder in a communication system as one example. Alternatively, the encoder and the decoder may be used in technical fields related to storages, memories, etc.

The following describes a specific example of a configuration of a parity check matrix for the LDPC-CC of coding rate 5/7 that uses an improved tail-biting scheme (an LDPC block code using an LDPC-CC).

When denoting the parity check matrix for the LDPC-CC of coding rate 5/7 that uses an improved tail-biting scheme (an LDPC block code using an LDPC-CC) as $H_{pro}$ as described above, the number of columns of $H_{pro}$ can be expressed as 7×2×m×z (where z is a natural number). (Note that m denotes a time-varying period of the LDPC-CC of coding rate 5/7 that is based on a parity check polynomial, which serves as the basis.)

Accordingly, as already described above, a transmission sequence (encoded sequence (codeword)) $v_s$ composed of a 7×2×m×z number of bits in block s of the LDPC-CC of coding rate 5/7 that uses an improved tail-biting scheme (an LDPC block code using an LDPC-CC) can be expressed as $v_s=(X_{s,1,1}, X_{s,2,1}, \ldots, X_{s,5,1}, P^{pro}_{s,1,1}, P^{pro}_{s,2,1}, X_{s,1,2}, X_{s,2,2}, \ldots, X_{s,5,2}, P^{pro}_{s,1,2}, P^{pro}_{s,2,2}, \ldots, X_{s,1,k}, X_{s,2,k}, \ldots, X_{s,5,k}, P^{pro}_{s,1,k}, P^{pro}_{s,2,k}, \ldots, X_{s,1,2\times m\times z}, X_{s,2,2\times m\times z}, \ldots, X_{s,5,2\times m\times z}, P_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}v_s$ are zeroes).

$X_{s,j,k}$ (where j is an integer no smaller than one and no greater than five) is a bit of information $X_j$, $P^{pro}_{s,1,k}$ is a bit of parity $P_1$ of the LDPC-CC of coding rate 5/7 that uses an improved tail-biting scheme (an LDPC block code using an LDPC-CC), and $P^{pro}_{s,2,k}$ is a bit of parity $P_2$ of the LDPC-CC of coding rate 5/7 that uses an improved tail-biting scheme (an LDPC block code using an LDPC-CC).

Further, $\lambda_{pro,s,k}=(X_{s,1,k}, X_{s,2,k}, X_{s,3,k}, X_{s,4,k}, X_{s,5,k}, P^{pro}_{s,1,k}, P^{pro}_{s,2,k})$ holds true.

In addition, the number of rows in the parity check matrix $H_{pro}$ for the LDPC-CC of coding rate 5/7 that uses an improved tail-biting scheme (an LDPC block code using an LDPC-CC) is 4×m×z.

Note that the method of configuring parity check polynomials satisfying zero for the LDPC-CC of coding rate 5/7 that uses an improved tail-biting scheme (an LDPC block code using an LDPC-CC) has already been described above.

In the above, description has been provided of a parity check matrix $H_{pro}$ for the LDPC-CC of coding rate 5/7 that uses an improved tail-biting scheme (an LDPC block code using an LDPC-CC), whose transmission sequence (encoded sequence (codeword)) $v_s$ of block s is $v_s=(X_{s,1,1}, X_{s,2,1}, \ldots, X_{s,5,1}, P^{pro}_{s,1,1}, P^{pro}_{s,2,1}, X_{s,1,2}, X_{s,2,2}, \ldots, X_{s,5,2}, P^{pro}_{s,1,2}, P^{pro}_{s,2,2}, \ldots, X_{s,1,k}, X_{s,2,k}, \ldots, X_{s,5,k}, P^{pro}_{s,1,k}, P^{pro}_{s,2,k}, \ldots, X_{s,1,2\times m\times z}, X_{s,2,2\times m\times z}, \ldots, X_{s,5,2\times m\times z}, P^{pro}_{s,1,2\times m\times z}, P^{pro}_{s,2,2\times m\times z})^T=(\lambda_{pro,s,1}, X_{pro,s,2}, \ldots, X_{pro,s,2\times m\times z-1}, X_{pro,s,2\times m\times z})^T$ and for which $H_{pro}v_s=0$ holds true (here, $H_{pro}v_s=0$ indicates that all elements of the vector $H_{pro}v_s$ are zeroes). The following provides description of a configuration of a parity check matrix $H_{pro\_m}$ for the LDPC-CC of coding rate 5/7 that uses an improved tail-biting scheme (an LDPC block code using an LDPC-CC), for which $H_{pro\_m}u_s=0$ holds true (here, $H_{pro\_m}u_s=0$ indicates that all elements of the vector $H_{pro\_m}u_s$ are zeroes) when expressing a transmission sequence (encoded sequence (codeword)) $u_s$ of block s as $u_s=(X_{s,1,1}, X_{s,1,2}, \ldots, X_{s,1,2\times m\times z-1}, X_{s,1,2\times m\times z}, X_{s,2,1}, X_{s,2,2}, \ldots, X_{s,2,2\times m\times z-1}, X_{s,2,2\times m\times z}, \ldots, X_{s,3,2}, \ldots, X_{s,3,2\times m\times z-1}, X_{s,3,2\times m\times z}, X_{s,4,1}, X_{s,4,2}, \ldots, X_{s,4,2\times m\times z-1}, X_{s,4,2\times m\times z}, X_{s,5,1}, X_{s,5,2}, \ldots, X_{s,5,2\times m\times z-1}, X_{s,5,2\times m\times z}, P^{pro}_{s,1,1}, P^{pro}_{s,1,2}, \ldots, P^{pro}_{s,1,2\times m\times z}, P^{pro}_{s,1,2\times m\times z}, P^{pro}_{s,2,1}, P^{pro}_{s,2,2}, \ldots, P^{pro}_{s,2,2\times m\times z-1}, P^{pro}_{s,2,2\times m\times z})^T=(\Lambda_{X1,s}, \Lambda_{X2,s}, \Lambda_{X3,s}, \Lambda_{X4,s}, \Lambda_{X5,s}, \Lambda_{pro1,s}, \Lambda_{pro2,s})^T$.

Note that $\Lambda_{Xf,s}$ (where f is an integer no smaller than one and no greater than five) satisfies $\Lambda_{Xf,s}=(X_{s,f,1}, X_{s,f,2}, X_{s,f,3}, \ldots, X_{s,f,2\times m\times z-2}, X_{s,f,2\times m\times z-1}, X_{s,f,2\times m\times z})$ ($\Lambda_{Xf,s}$ is a vector having one row and 2×m×z columns), and $\Lambda_{pro1,s}$ and $\Lambda_{pro2,s}$ satisfy $\Lambda_{pro1,s}=(P^{pro}_{s,1,1}, P^{pro}_{s,1,2}, \ldots, P^{pro}_{s,1,2\times m\times z-1}, P^{pro}_{s,1,2\times m\times z})$ and $\Lambda_{pro2,s}=(P^{pro}_{s,2,1}, P^{pro}_{s,2,2}, \ldots, P^{pro}_{s,2,2\times m\times z-1}, P^{pro}_{s,2,2\times m\times z})$, respectively ($\Lambda_{pro1,s}$ and $\Lambda_{pro2,s}$ are both vectors having one row and 2×m×z columns).

Figure 83:
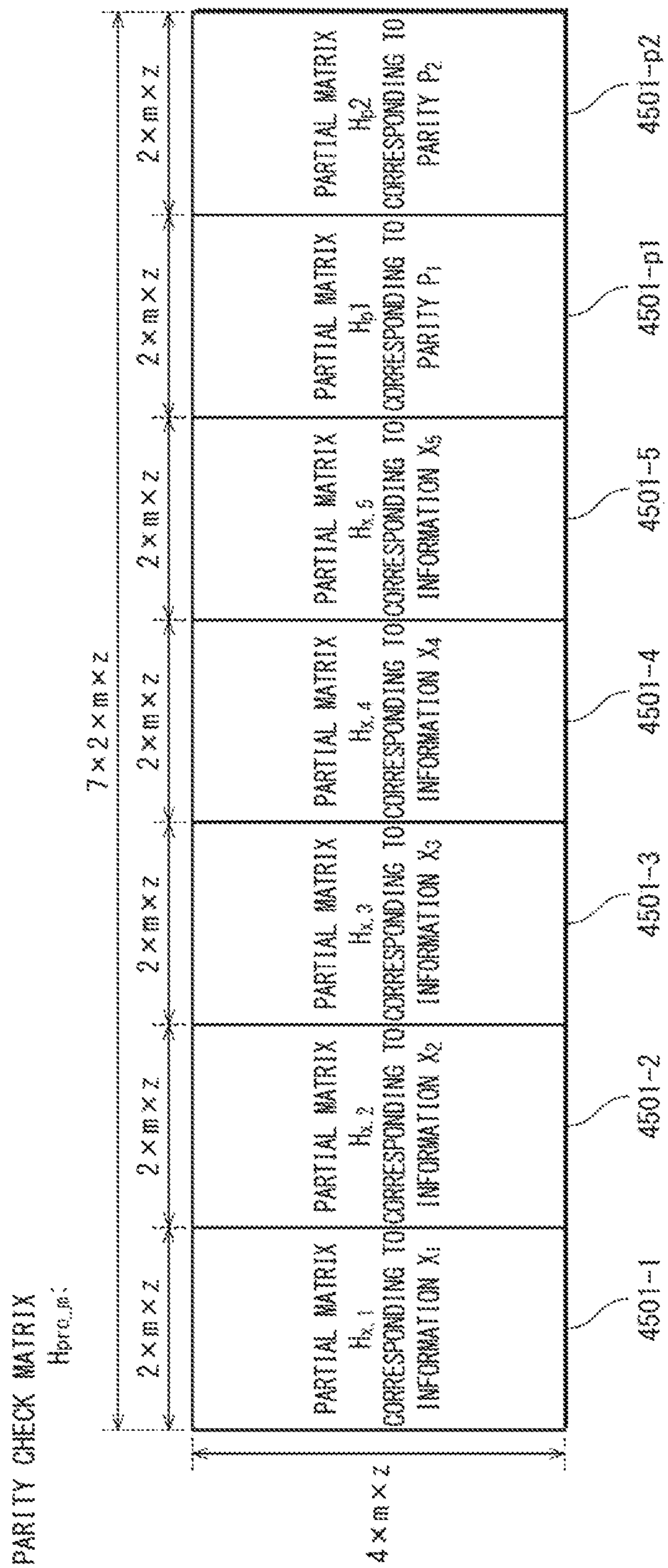
FIG. 83 shows an example of the configuration of check matrix for LDPC-CC of coding rate 5/7 when improved tail-biting is performed.

Here, the number of bits of information $X_1$ included in one block is 2×m×z, the number of bits of information $X_2$ included in one block is 2×m×z, the number of bits of information $X_3$ included in one block is 2×m×z, the number of bits of information $X_4$ included in one block is 2×m×z, the number of bits of information $X_5$ included in one block is 2×m×z, the number of bits of parity bits $P_1$ included in one block is 2×m×z, and the number of bits of parity bits $P_2$ included in one block is 2×m×z. Accordingly, the parity check matrix $H_{pro\_m}$ for the LDPC-CC of coding rate 5/7 that uses an improved tail-biting scheme (an LDPC block code using an LDPC-CC) can be expressed as $H_{pro\_m}=[H_{x,1}, H_{x,2}, H_{x,3}, H_{x,4}, H_{x,5}, H_{p1}, H_{p2}]$, as illustrated in FIG. 83. Since a transmission sequence (encoded sequence (codeword)) $u_s$ of block s is $u_s=(X_{s,1,1}, X_{s,1,2}, \ldots, X_{s,1,2\times m\times z-1}, X_{s,1,2\times m\times z}, X_{s,2,1}, X_{s,2,2}, \ldots, X_{s,2,2\times m\times z-1}, X_{s,2,2\times m\times z}, X_{s,3,1}, X_{s,3,2}, \ldots, X_{s,3,2\times m\times z-1}, X_{s,3,2\times m\times z}, X_{s,4,1}, X_{s,4,2}, \ldots, X_{s,4,2\times m\times z-1}, X_{s,4,2\times m\times z}, X_{s,5,1}, X_{s,5,2}, \ldots, X_{s,5,2\times m\times z-1}, X_{s,5,2\times m\times z}, P^{pro}_{s,1,1}, P^{pro}_{s,1,2}, \ldots, P^{pro}_{s,1,2\times m\times z-1}, P^{pro}_{s,1,2\times m\times z}, P^{pro}_{s,2,1}, P^{pro}_{s,2,2}, P^{pro}_{s,2,2\times m\times z-1}, P^{pro}_{s,2,2\times m\times z})^T=(\Lambda_{X1,s}, \Lambda_{X2,s}, \Lambda_{X3,s}, \Lambda_{X4,s}, \Lambda_{X5,s}, \Lambda_{pro1,s}, \Lambda_{pro2,s})$, $H_{x,1}$ is a partial matrix related to information $X_1$, $H_{x,2}$ is a partial matrix related to information $X_2$, $H_{x,3}$ is a partial matrix related to information $X_3$, $H_{x,4}$ is a partial matrix related to information $X_4$, $H_{x,5}$ is a partial matrix related to information $X_5$, $H_{p1}$ is a partial matrix related to parity $P_1$, and $H_{p2}$ is a partial matrix related to parity $P_2$. As illustrated in FIG. 83, the parity check matrix $H_{pro\_m}$, has 4×m×z rows and 7×2×m×z columns, the partial matrix $H_{x,1}$ related to information $X_1$ has 4×m×z rows and 2×m×z columns, the partial matrix $H_{x,2}$ related to information $X_2$ has 4×m×z rows and 2×m×z columns, the partial matrix $H_{x,3}$ related to information $X_3$ has 4×m×z rows and 2×m×z columns, the partial matrix $H_{x,4}$ related to information $X_4$ has 4×m×z rows and 2×m×z columns, the partial matrix $H_{x,5}$ related to information $X_5$ has 4×m×z rows and 2×m×z columns, the partial matrix $H_{p1}$ related to parity $P_1$ has 4×m×z rows and 2×m×z columns, and the partial matrix $H_{p2}$ related to parity $P_2$ has 4×m×z rows and 2×m×z columns.

The transmission sequence (encoded sequence (codeword)) $u_s$ composed of a 7×2×m×z number of bits in block s of the LDPC-CC of coding rate 5/7 that uses an improved tail-biting scheme (an LDPC block code using an LDPC-CC) is $u_s=(X_{s,1,1}, X_{s,1,2}, \ldots, X_{s,1,2\times m\times z-1}, X_{s,1,2\times m\times z}, X_{s,2,1}, X_{s,2,2}, \ldots, X_{s,2,2\times m\times z-1}, X_{s,2,2\times m\times z}, X_{s,3,1}, X_{s,3,2}, \ldots, X_{s,3,2\times m\times z-1}, X_{s,3,2\times m\times z}, X_{s,4,1}, X_{s,4,2}, \ldots, X_{s,4,2\times m\times z-1}, X_{s,4,2\times m\times z}, X_{s,5,1}, X_{s,5,2}, \ldots, X_{s,5,2\times m\times z-1}, X_{s,5,2\times m\times z}, P^{pro}_{s,1,1}, P^{pro}_{s,1,2}, \ldots, P^{pro}_{s,1,2\times m\times z-1}, P^{pro}_{s,1,2\times m\times z}, P^{pro}_{s,2,1}, P^{pro}_{s,2,2}, \ldots, P^{pro}_{s,2,2\times m\times z-1}, P^{pro}_{s,2,2\times m\times z})^T=(\Lambda_{X1,s}, \Lambda_{X2,s}, \Lambda_{X3,s}, \Lambda_{X4,s}, \Lambda_{X5,s}, \Lambda_{pro1,s}, \Lambda_{pro2,s})^T$, and the number of parity check polynomials satisfying zero necessary for obtaining this transmission sequence is 4×m×z.

Here, when arranging such 2×(2×m)×z number of parity check polynomials satisfying zero in order, a parity check polynomial satisfying zero appearing eth is referred to in the following as an "eth parity check polynomial satisfying zero" (where e is an integer no smaller than zero and no greater than 2×(2×m)×z−1).

As such, the parity check polynomials satisfying zero are arranged in the following order:

zeroth: zeroth parity check polynomial satisfying zero;

first: first parity check polynomial satisfying zero;

second: second parity check polynomial satisfying zero;

⋮ eth: eth parity check polynomial satisfying zero;

⋮

2×(2×m)×z−2th: 2×(2×m)×z−2th parity check polynomial satisfying zero; and

2×(2×m)×z−1th: 2×(2×m)×z−1th parity check polynomial satisfying zero.

Accordingly, the transmission sequence (encoded sequence (codeword)) $u_s$ of block s of the LDPC-CC of coding rate 5/7 that uses an improved tail-biting scheme (an LDPC block code using an LDPC-CC) is obtained.

Accordingly, in the LDPC-CC of coding rate 5/7 that uses an improved tail-biting scheme (an LDPC block code using an LDPC-CC):

the 0th parity check polynomial satisfying zero is a parity check polynomial satisfying zero of #0'; first expression provided by expression 205;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 205;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

In the present embodiment (in fact, commonly applying to the entirety of the present disclosure), % means a modulo, and for example, α%q represents a remainder after dividing α by q (where α is an integer no smaller than zero, and q is a natural number).

The following describes details of the configuration of the parity check matrix $H_{pro\_m}$ for the LDPC-CC of coding rate 5/7 that uses an improved tail-biting scheme (an LDPC block code using an LDPC-CC) based on what has been described above.

The parity check matrix $H_{pro\_m}$ for the LDPC-CC of coding rate 5/7 that uses an improved tail-biting scheme (an LDPC block code using an LDPC-CC) has 4×m×z rows and 7×2×m×z columns.

Accordingly, the parity check matrix $H_{pro\_m}$ for the LDPC-CC of coding rate 5/7 that uses an improved tail-biting scheme (an LDPC block code using an LDPC-CC) has rows one through 4×m×z, and columns one through 7×2×m×z.

Here, the topmost row of the parity check matrix $H_{pro\_m}$ is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

Further, the leftmost column of the parity check matrix $H_{pro\_m}$ is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

In the parity check matrix $H_{pro\_m}$, the partial matrix $H_{x,1}$ related to information $X_1$ has 4×m×z rows and 2×m×z columns. In the following, an element at row u, column v of the partial matrix $H_{x,1}$ related to information $X_1$ is denoted as $H_{x,1,comp}[u][v]$ (where u is an integer no smaller than one and no greater than 4×m×z, and v is an integer no smaller than one and no greater than 2×m×z).

Similarly, in the parity check matrix $H_{pro\_m}$, the partial matrix $H_{x,2}$ related to information $X_2$ has 4×m×z rows and 2×m×z columns. In the following, an element at row u, column v of the partial matrix $H_{x,2}$ related to information $X_2$ is denoted as $H_{x,2,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,3}$ related to information $X_3$ has 4×m×z rows and 2×m×z columns. In the following, an element at row u, column v of the partial matrix $H_{x,3}$ related to information $X_3$ is denoted as $H_{x,3,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,4}$ related to information $X_4$ has 4×m×z rows and 2×m×z columns. In the following, an element at row u, column v of the partial matrix $H_{x,4}$ related to information $X_4$ is denoted as $H_{x,4,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,5}$ related to information $X_5$ has 4×m×z rows and 2×m×z columns. In the following, an element at row u, column v of the partial matrix $H_{x,5}$ related to information $X_5$ is denoted as $H_{x,5,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{p,1}$ related to parity $P_1$ has 4×m×z rows and 2×m×z columns. In the following, an element at row u, column v of the partial matrix $H_{p,1}$ related to parity $P_1$ is denoted as $H_{p1,comp}[u][v]$ (where u is an integer no smaller than one and no greater than 4×m×z, and v is an integer no smaller than one and no greater than 2×m×z).

Similarly, in the parity check matrix $H_{pro\_m}$, the partial matrix $H_{p,2}$ related to parity $P_2$ has 4×m×z rows and 2×m×z columns. In the following, an element at row u, column v of the partial matrix $H_{p,2}$ related to parity $P_2$ is denoted as $H_{p2,comp}[u][v]$ (where u is an integer no smaller than one and no greater than 4×m×z, and v is an integer no smaller than one and no greater than 2×m×z).

The following provides detailed description of the configuration of $H_{x,1,comp}[u][v]$, $H_{x,2,comp}[u][v]$, $H_{x,3,comp}[u][v]$, $H_{x,4,comp}[u][v]$, $H_{x,5,comp}[u][v]$, $H_{p1,comp}[u][v]$, and $H_{p2,comp}[u][v]$.

As already described above, in the LDPC-CC of coding rate 5/7 that uses an improved tail-biting scheme (an LDPC block code using an LDPC-CC):

the 0th parity check polynomial satisfying zero is a parity check polynomial satisfying zero of #0'; first expression provided by expression 205;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 205;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

Further, a vector composed of row e+1 of the parity check matrix $H_{pro\_m}$ corresponds to the eth parity check polynomial satisfying zero.

Accordingly, a vector composed of row one of the parity check matrix $H_{pro\_m}$ is generated by using a parity check polynomial satisfying zero of #0'; first expression provided by expression 205;

a vector composed of row two of the parity check matrix $H_{pro\_m}$ is generated by using a parity check polynomial satisfying zero of #0; second expression;

a vector composed of row 2×g−1 of the parity check matrix $H_{pro\_m}$ is generated by using a parity check polynomial satisfying zero of #((g−1)%2m); first expression; and a vector composed of row 2×g of the parity check matrix $H_{pro\_m}$ is generated by using a parity check polynomial satisfying zero of #((g−1)%2m); second expression (where g is an integer no smaller than two and no greater than 2×m×z).

$H_{x,1,comp}[u][v]$, $H_{x,2,comp}[u][v]$, $H_{x,3,comp}[u][v]$, $H_{x,4,comp}[u][v]$, $H_{x,5,comp}[u][v]$, $H_{p1,comp}[u][v]$, and $H_{p2,comp}[u][v]$ can be expressed according to the relationship described above.

First, description is provided of the configuration of $H_{x,1,comp}[u][v]$, $H_{x,2,comp}[u][v]$, $H_{x,3,comp}[u][v]$, $H_{x,4,comp}[u][v]$, $H_{x,5,comp}[u][v]$, $H_{p1,comp}[u][v]$, and $H_{p2,comp}[u][v]$ for row one of the parity check matrix $H_{pro\_m}$, or that is, for u=1.

The vector composed of row one of the parity check matrix $H_{pro\_m}$ is generated by using a parity check polynomial satisfying zero of #0'; first expression provided by expression 205. Accordingly, $H_{x,1,comp}[1][v]$ can be expressed as follows.

[Math. 466]

$$H_{x,w,comp}[1][1]=1 \quad (206\text{-}1)$$

When y is an integer no smaller than one and no greater than $R_{\#(0),1}$:

$$H_{x,1,comp}[1][1-\alpha_{\#(0),1,y}+(2\times m\times z)]=1 \quad (206\text{-}2)$$

For all v being an integer no smaller than one and no greater than 2×m×z satisfying {v≠1} and $\{v\neq 1-\alpha_{\#(0),i,y}+(2\times m\times z)\}$ (where y is an integer no smaller than one and no greater than $R_{\#(0),1}$), the following holds true:

$$H_{x,1,comp}[1][v]=0 \quad (206\text{-}3)$$

Considered in a similar manner, the following holds true for $H_{x,w,comp}[1][v]$, where w is an integer no smaller than one and no greater than two.

[Math. 467]

$$H_{x,w,comp}[1][1]=1 \quad (207\text{-}1)$$

When y is an integer no smaller than one and no greater than $R_{\#(0),w}$:

$$H_{x,w,comp}[1][1-\alpha_{\#(0),w,y}+(2\times m\times z)]=1 \quad (207\text{-}2)$$

For all v being an integer no smaller than one and no greater than 2×m×z satisfying {v≠1} and $\{v\neq 1-\alpha_{\#(0),w,y}+(2\times m\times z)\}$ (where y is an integer no smaller than one and no greater than $R_{\#(0),w}$), the following holds true:

$$H_{x,w,comp}[1][v]=0 \quad (207\text{-}3)$$

Further, $H_{x,3,comp}[1][v]$ can be expressed as follows.

[Math. 468]

When y is an integer no smaller than $R_{\#(0),3}+1$ and no greater than $r_{\#(0),3}$:

$$H_{x,3,comp}[1][1-\alpha_{\#(0),3,y}+(2\times m\times z)]=1 \quad (208\text{-}1)$$

For all v being an integer no smaller than one and no greater than 2×m×z satisfying $\{v\neq 1-\alpha_{\#(0),3,y}+(2\times m\times z)\}$ (where y is an integer no smaller than $R_{\#(0),3}+1$ and no greater than $r_{\#(0),3}$), the following holds true:

$$H_{x,3,comp}[1][v]=0 \quad (208\text{-}2)$$

Considered in a similar manner, the following holds true for $H_{x\Omega,comp}[1][v]$. In the following, Ω is an integer no smaller than three and no greater than five.

[Math. 469]

When y is an integer no smaller than $R_{\#(0),\Omega}+1$ and no greater than $r_{\#(0),\Omega}$:

$$H_{x,\Omega,comp}[1][1-\alpha_{\#(0),\Omega,y}+(2\times m\times z)]=1 \quad (209\text{-}1)$$

For all v being an integer no smaller than one and no greater than 2×m×z satisfying $\{v\neq 1-\alpha_{\#(0),\Omega,y}+(2\times m\times z)\}$ (where y is an integer no smaller than $R_{\#(0),\Omega}+1$ and no greater than $r_{\#((0),\Omega)}$), the following holds true:

$$H_{x,\Omega,comp}[1][v]=0 \quad (209\text{-}2)$$

Further, $H_{p1,comp}[1][v]$ can be expressed as follows.

[Math. 470]

$$H_{p1,comp}[1][1]=1 \quad (210\text{-}1)$$

For all v being an integer no smaller than two and no greater than 2×m×z, the following holds true:

$$H_{p1,comp}[1][v]=0 \quad (210\text{-}2)$$

Further, $H_{p2,comp}[1][v]$ can be expressed as follows.

[Math. 471]

For all v being an integer no smaller than one and no greater than 2×m×z, the following holds true:

$$H_{p2,comp}[1][v]=0 \quad (211)$$

The vector composed of row two of the parity check matrix $H_{pro\_m}$ is generated by using a parity check polynomial satisfying zero of #0; second expression. As described above, a parity check polynomial satisfying zero of #0;

second expression is expressed by either expression (197-2-1) or expression (197-2-2).

Accordingly, $H_{x,1,comp}[2][v]$ can be expressed as follows.

<1> When a parity check polynomial satisfying zero of #0; second expression is expressed as provided in expression (197-2-1):

$H_{x,1,comp}[2][v]$ is expressed as follows.

[Math. 472]

When y is an integer no smaller than $R_{\#(0),1}+1$ and no greater than $r_{\#(0),1}$:

$$H_{x,1,comp}[2][1-\alpha_{\#(0),1,y}+(2\times m\times z)]=1 \tag{212-1}$$

For all v being an integer no smaller than one and no greater than 2×m×z satisfying $\{v\neq 1-\alpha_{\#(0),1,y}+(2\times m\times z)\}$ (where y is an integer no smaller than $R_{\#(0),1}+1$ and no greater than $r_{\#((0),1)}$), the following holds true:

$$H_{x,1,comp}[2][v]=0 \tag{212-2}$$

Considered in a similar manner, the following holds true for $H_{x,\Omega,comp}[2][v]$, where Ω is an integer no smaller than one and no greater than two.

[Math. 473]

When y is an integer no smaller than $R_{\#(0),\Omega}+1$ and no greater than $r_{\#((0),\Omega)}$:

$$H_{x,\Omega,comp}[2][1-\alpha_{\#(0),\Omega,y}+(2\times m\times z)]=1 \tag{213-1}$$

For all v being an integer no smaller than one and no greater than 2×m×z satisfying $\{v\neq 1\}$ and $\{v\neq 1-\alpha_{\#(0),\Omega,y}+(2\times m\times z)\}$ (where y is an integer no smaller than $R_{\#(0),\Omega}+1$ and no greater than $r_{\#((0),\Omega)}$), the following holds true:

$$H_{x,\Omega,comp}[2][v]=0 \tag{213-2}$$

Further, $H_{x,3,comp}[2][v]$ is expressed as follows.

[Math. 474]

$$H_{x,3,comp}[2][1]=1 \tag{214-1}$$

When y is an integer no smaller than one and no greater than $R_{\#(0),3}$:

$$H_{x,3,comp}[2][1-\alpha_{\#(0),3,y}+(2\times m\times z)]=1 \tag{214-2}$$

For all v being an integer no smaller than one and no greater than 2×m×z satisfying $\{v\neq 1\}$ and $\{v\neq 1-\alpha_{\#(0),3,y}+(2\times m\times z)\}$ (where y is an integer no smaller than one and no greater than $R_{\#(0),3}$), the following holds true:

$$H_{x,3,comp}[2][v]=0 \tag{214-3}$$

Considered in a similar manner, the following holds true for $H_{x,w,comp}[2][v]$, where w is an integer no smaller than three and no greater than five.

[Math. 475]

$$H_{x,w,comp}[2][1]=1 \tag{215-1}$$

When y is an integer no smaller than one and no greater than $R_{\#(0),w}$:

$$H_{x,w,comp}[2][1-\alpha_{\#(0),w,y}+(2\times m\times z)]=1 \tag{215-2}$$

For all v being an integer no smaller than one and no greater than 2×m×z satisfying $\{v\neq 1\}$ and $\{v\neq 1-\alpha_{\#(0),w,y}+(2\times m\times z)\}$ (where y is an integer no smaller than one and no greater than $R_{\#(0),w}$), the following holds true:

$$H_{x,w,comp}[2][v]=0 \tag{215-3}$$

Further, $H_{p1,comp}[2][v]$ can be expressed as follows.

[Math. 476]

$$H_{p1,comp}[2][1-\beta_{\#(0),2}+(2\times m\times z)]=1 \tag{216-1}$$

For all v being an integer no smaller than one and no greater than 2×m×z satisfying $\{v\neq 1-\beta_{\#(0),2}+(2\times m\times z)\}$, the following holds true:

$$H_{p1,comp}[2][v]=0 \tag{216-2}$$

Further, $H_{p2,comp}[2][v]$ can be expressed as follows.

[Math. 477]

$$H_{p2,comp}[2][1]=1 \tag{217-1}$$

For all v being an integer no smaller than two and no greater than 2×m×z, the following holds true:

$$H_{p2,comp}[2][v]=0 \tag{217-2}$$

<2> When a parity check polynomial satisfying zero of #0; second expression is expressed as provided in expression (197-2-2):

$H_{x,1,comp}[^{2}][v]$ is expressed as follows.

[Math. 478]

When y is an integer no smaller than $R_{\#(0),1}+1$ and no greater than $r_{\#(0),1}$:

$$H_{x,1,comp}[2][1-\alpha_{\#(0),1,y}+(2\times m\times z)]=1 \tag{218-1}$$

For all v being an integer no smaller than one and no greater than 2×m×z satisfying $\{v\neq 1-\alpha_{\#(0),1,y}+(2\times m\times z)\}$ (where y is an integer no smaller than $R_{\#(0),1}+1$ and no greater than $r_{\#(0),1}$), the following holds true:

$$H_{x,1,comp}[2][v]=0 \tag{218-2}$$

Considered in a similar manner, the following holds true for $H_{x,\Omega,comp}[2][v]$, where Ω is an integer no smaller than one and no greater than two.

[Math. 479]

When y is an integer no smaller than $R_{\#(0),\Omega}+1$ and no greater than $r_{\#((0),\Omega)}$:

$$H_{x,\Omega,comp}[2][1-\alpha_{\#(0),\Omega,y}+(2\times m\times z)]=1 \tag{219-1}$$

For all v being an integer no smaller than one and no greater than 2×m×z satisfying $\{v\neq 1\}$ and $\{v\neq 1-\alpha_{\#(0),\Omega,y}+(2\times m\times z)\}$ (where y is an integer no smaller than $R_{\#(0),\Omega}+1$ and no greater than $r_{\#((0),\Omega)}$), the following holds true:

$$H_{x,\Omega,comp}[2][v]=0 \tag{219-2}$$

Further, $H_{x,3,comp}[2][v]$ is expressed as follows.

[Math. 480]

$$H_{x,3,comp}[2][1]=1 \tag{220-1}$$

When y is an integer no smaller than one and no greater than $R_{\#(0),3}$:

$$H_{x,3,comp}[2][1-\alpha_{\#(0),3,y}+(2\times m\times z)]=1 \tag{220-2}$$

For all v being an integer no smaller than one and no greater than 2×m×z satisfying $\{v\neq 1\}$ and $\{v\neq 1-\alpha_{\#(0),3,y}+(2\times m\times z)\}$ (where y is an integer no smaller than one and no greater than $R_{\#(0),3}$), the following holds true:

$$H_{x,3,comp}[2][v]=0 \tag{220-3}$$

Considered in a similar manner, the following holds true for $H_{x,w,comp}[2][v]$, where w is an integer no smaller than three and no greater than five.

[Math. 481]

$$H_{x,w,comp}[2][1]=1 \tag{221-1}$$

When y is an integer no smaller than one and no greater than $R_{\#(0),w}$:

$$H_{x,w,comp}[2][1-\alpha_{\#(0),w,y}+(2\times m\times z)]=1 \tag{221-2}$$

For all v being an integer no smaller than one and no greater than 2×m×z satisfying $\{v\neq 1\}$ and $\{v\neq 1-\alpha_{\#(0),w,y}+(2\times m\times z)\}$ (where y is an integer no smaller than one and no greater than $R_{\#(0),w}$), the following holds true:

$$H_{x,w,comp}[2][v]=0 \tag{221-3}$$

Further, $H_{p1,comp}[2][v]$ can be expressed as follows.

[Math. 482]

For all v being an integer no smaller than one and no greater than 2×m×z, the following holds true:

$$H_{p1,comp}[2][v]=0 \quad (222)$$

Further, $H_{p2,comp}[2][v]$ can be expressed as follows.

[Math. 483]

$$H_{p2,comp}[2][1]=1 \quad (223\text{-}1)$$

$$H_{p2,comp}[2][1-\beta_{\#(0),3}+(2\times m\times z)]=1 \quad (223\text{-}2)$$

For all v being an integer no smaller than one and no greater than 2×m×z satisfying {v≠1} and {v≠1−$\beta_{\#(0),3}$+(2×m×z)}, the following holds true:

$$H_{p2,comp}[^{2}][v]=0 \quad (223\text{-}3)$$

As already described above, the vector composed of row 2×g−1 of the parity check matrix $H_{pro\_m}$ is generated by using a parity check polynomial satisfying zero of #((g−1)%2m); first expression; and the vector composed of row 2×g of the parity check matrix $H_{pro\_m}$ is generated by using a parity check polynomial satisfying zero of #((g−1)%2m); second expression (where g is an integer no smaller than two and no greater than 2×m×z).

Accordingly, when g=2×f−1 (where f is an integer no smaller than two and no greater than m×z), a vector of row 2×(2×f−1)−1 of the parity check matrix $H_{pro\_m}$ for the LDPC-CC of coding rate 5/7 that uses an improved tail-biting scheme (an LDPC block code using an LDPC-CC) can be generated by using a parity check polynomial satisfying zero of #(((2×f−1)−1)%2m); first expression, or that is, by using a parity check polynomial satisfying zero provided by expression (197-1-1) or expression (197-1-2).

Further, a vector of row 2×(2×f−1) of the parity check matrix $H_{pro\_m}$ for the LDPC-CC of coding rate 5/7 that uses an improved tail-biting scheme (an LDPC block code using an LDPC-CC) can be generated by using a parity check polynomial satisfying zero of #(((2×f−1)−1)%2m); second expression, or that is, by using a parity check polynomial satisfying zero provided by expression (197-2-1) or expression (197-2-2).

Further, when g=2×f (where f is an integer no smaller than one and no greater than m×z), a vector of row 2×(2×f)−1 of the parity check matrix $H_{pro\_m}$ for the LDPC-CC of coding rate 5/7 that uses an improved tail-biting scheme (an LDPC block code using an LDPC-CC) can be generated by using a parity check polynomial satisfying zero of #(((2×f)−1)%2m); first expression, or that is, by using a parity check polynomial satisfying zero provided by expression (198-1-1) or expression (198-1-2).

Further, a vector of row 2×(2×f) of the parity check matrix $H_{pro\_m}$ for the LDPC-CC of coding rate 5/7 that uses an improved tail-biting scheme (an LDPC block code using an LDPC-CC) can be generated by using a parity check polynomial satisfying zero of #(((2×f)−1)%2m); second expression, or that is, by using a parity check polynomial satisfying zero provided by expression (198-2-1) or expression (198-2-2).

Accordingly, (1) when g=2×f−1 (where f is an integer no smaller than two and no greater than m×z), when a vector for row 2×(2×f−1)−1 of the parity check matrix $H_{pro\_m}$, which is for the LDPC-CC of coding rate 5/7 that uses an improved tail-biting scheme (an LDPC block code using an LDPC-CC), can be generated by using a parity check polynomial satisfying zero provided by expression (197-1-1), ((2×f−1)−1)%2m=2c holds true. Accordingly, a parity check polynomial satisfying zero of expression (197-1-1) where 2i=2c holds true (where c is an integer no smaller than zero and no greater than m−1).

Accordingly, components $H_{x,1,comp}$[2×g−1][v]=$H_{x,1,comp}$[2×(2×f−1)−1][v], $H_{x,2,comp}$[2×g−1][v]=$H_{x,2,comp}$[2×(2×f−1)−1][v], $H_{x,3,comp}$[2×g−1][v]=$H_{x,3,comp}$[2×(2×f−1)−1][v], $H_{x,4,comp}$[2×g−1][v]=$H_{x,4,comp}$[2×(2×f−1)−1][v], $H_{x,5,comp}$[2×g−1][v]=$H_{x,5,comp}$[2×(2×f−1)−1][v], $H_{p1,comp}$[2×g−1][v]= $H_{p1,comp}$[2×(2×f−1)−1][v], and $H_{p2,comp}$[2×g−1][v]= $H_{p2,comp}$[2×(2×f−1)−1][v] in row 2×g−1, or that is, row 2×(2×f−1)−1 of the parity check matrix $H_{pro\_m}$, which is for the LDPC-CC of coding rate 5/7 that uses an improved tail-biting scheme (an LDPC block code using an LDPC-CC), is expressed as follows.

First, the following holds true for $H_{x,1,comp}$[2×(2×f−1)−1][v].

[Math. 484]

$$H_{x,1,comp}[2\times(2\times f-1)-1][((2\times f-1)-0-1)+1]=1 \quad (224\text{-}1)$$

When y is an integer no smaller than one and no greater than $R_{\#(2c),1}$, and (2×f−1)−$\alpha_{\#(2c),1,y}$−1≥0:

$$H_{x,1,comp}[2\times(2\times f-1)-1][((2\times f-1)-\alpha_{\#(2c),1,y}-1)+1]=1 \quad (224\text{-}2)$$

When (2×f−1)−$\alpha_{\#(2c),1,y}$−1<0:

$$H_{x,1,comp}[2\times(2\times f-1)-1][((2\times f-1)-\alpha_{\#(2c),1,y}-1)+1+(2\times m\times z)]=1 \quad (224\text{-}3)$$

For all v being an integer no smaller than one and no greater than 2×m×z satisfying {v≠((2×f−1)−0−1)+1}, {v≠((2×f−1)−$\alpha_{\#(2c),1,y}$−1)+1}, and {v≠((2×f−1)−$\alpha_{\#(2c),1,y}$−1)+1+(2×m×z)} (where y is an integer no smaller than one and no greater than $R_{\#(2c),1}$), the following holds true:

$$H_{x,1,comp}[2\times(2\times f-1)-1][v]=0 \quad (224\text{-}4)$$

Considered in a similar manner, the following holds true for $H_{x,w,comp}$[2×(2×f−1)−1][v]. In the following, w is an integer no smaller than one and no greater than two.

[Math. 485]

$$H_{x,w,comp}[2\times(2\times f-1)-1][((2\times f-1)-0-1)+1]=1 \quad (225\text{-}1)$$

When y is an integer no smaller than one and no greater than $R_{\#(2c),w}$, and (2×f−1)−$\alpha_{\#(2c),w,y}$−1≥0:

$$H_{x,w,comp}[2\times(2\times f-1)-1][((2\times f-1)-\alpha_{\#(2c),w,y}-1)+1]=1 \quad (225\text{-}2)$$

When (2×f−1)−$\alpha_{\#(2c),w,y}$−1<0:

$$H_{x,w,comp}[2\times(2\times f-1)-1][((2\times f-1)-\alpha_{\#(2c),w,y}-1)+1+(2\times m\times z)]=1 \quad (225\text{-}3)$$

For all v being an integer no smaller than one and no greater than 2×m×z satisfying {v≠((2×f−1)−0−1)+1}, {v≠((2×f−1)−$\alpha_{\#(2c),w,y}$−1)+1}, and {v≠((2×f−1)−$\alpha_{\#(2c),w,y}$−1)+1+(2×m×z)} (where y is an integer no smaller than one and no greater than $R_{\#(2c),w}$), the following holds true:

$$H_{x,w,comp}[2\times(2\times f-1)-1][v]=0 \quad (225\text{-}4)$$

Further, the following holds true for $H_{x,3,comp}$[2×(2×f−1)−1][v]. In the following, y is an integer no smaller than $R_{\#(2c),3}$+1 and no greater than $r_{\#(2c),3}$.

[Math. 486]

When (2×f−1)−$\alpha_{\#(2c),3,y}$−1≥0:

$$H_{x,3,comp}[2\times(2\times f-1)-1][((2\times f-1)-\alpha_{\#(2c),3,3}-1)+1]=1 \quad (226\text{-}1)$$

When (2×f−1)−$\alpha_{\#(2c),3,y}$−1≥0:

$$H_{x,3,comp}[2\times(2\times f-1)-1][((2\times f-1)-\alpha_{\#(2c),3,y}-1)+1+(2\times m\times z)]=1 \quad (226\text{-}2)$$

For all v being an integer no smaller than one and no greater than 2×m×z satisfying {v≠((2×f−1)−$\alpha_{\#(2c),3,y}$−1)+1}, and $\{v \neq ((2\times f-1)-\alpha_{\#(2c),3,y}-1)+1+(2\times m\times z)\}$ (where y is an integer no smaller than $R_{\#(2c),3}+1$ and no greater than $r_{\#(2c),3}$), the following holds true:

$$H_{x,3,comp}[2\times(2\times f-1)-1][v]=0 \quad (226\text{-}3)$$

Considered in a similar manner, the following holds true for $H_{x,\Omega,comp}[2\times(2\times f-1)-1][v]$. In the following, Ω is an integer no smaller than three and no greater than five, and y is an integer no smaller than $R_{\#(2c),\Omega}+1$ and no greater than $r_{\#(2c),\Omega}$.

[Math. 487]

When $(2\times f-1)-\alpha_{\#(2c),\Omega,y}-1\geq 0$:

$$H_{x,\Omega,comp}[2\times(2\times f-1)-1][((2\times f-1)-\alpha_{\#(2c),\Omega,y}-1)+1]=1 \quad (227\text{-}1)$$

When $(2\times f-1)-\alpha_{\#(2c),\Omega,y}-1<0$:

$$H_{x,\Omega,comp}[2\times(2\times f-1)-1][((2\times f-1)-\alpha_{\#(2c),\Omega,y}-1)+1+(2\times m\times z)]=1 \quad (227\text{-}2)$$

For all v being an integer no smaller than one and no greater than 2×m×z satisfying $\{v\neq(2\times f-1)-\alpha_{\#(2c),\Omega,y}-1)+1\}$ and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)-1][v]=0 \quad (227\text{-}3)$$

Further, the following holds true for $H_{p1,comp}[2\times(2\times f-1)-1][v]$.

[Math. 488]

$$H_{p1,comp}[2\times(2\times f-1)-1][((2\times f-1)-0-1)+1]=1 \quad (228\text{-}1)$$

For all v being an integer no smaller than one and no greater than 2×m×z satisfying $\{v\neq((2\times f-1)-0-1)+1\}$, the following holds true:

$$H_{p1,comp}[2\times(2\times f-1)-1][v]=0 \quad (228\text{-}2)$$

Further, the following holds true for $H_{p2,comp}[2\times(2\times f-1)-1][v]$.

[Math. 489]

When $(2\times f-1)-\beta_{\#(2c),0}-1\geq 0$:

$$H_{p2,comp}[2\times(2\times f-1)-1][((2\times f-1)-\beta_{\#(2c),0}-1)+1+(2\times m\times z)]=1 \quad (229\text{-}1)$$

When $(2\times f-1)-\beta_{\#(2c),0}-1\geq 0$:

$$H_{p2,comp}[2\times(2\times f-1)-1][((2\times f-1)-\beta_{\#(2c),0}-1)+1+(2\times m\times z)]=1 \quad (229\text{-}2)$$

For all v being an integer no smaller than one and no greater than 2×m×z satisfying $\{v\neq((2\times f-1)-\beta_{\#(2c),0}-1)+1\}$ and $\{v\neq((2f-1)-\beta_{\#(2c),0}-1)+1+(2\times m\times z)\}$, the following holds true:

$$H_{p2,comp}[2\times(2\times f-1)-1][v]=0 \quad (229\text{-}3)$$

Further, (2) when g=2×f−1 (where f is an integer no smaller than two and no greater than m×z), when a vector for row 2×(2×f−1)−1 of the parity check matrix $H_{pro\_m}$, which is for the LDPC-CC of coding rate 5/7 that uses an improved tail-biting scheme (an LDPC block code using an LDPC-CC), can be generated by using a parity check polynomial satisfying zero provided by expression (197-1-2), ((2×f−1)−1)%2m=2c holds true. Accordingly, a parity check polynomial satisfying zero of expression (197-1-2) where 2i=2c holds true (where c is an integer no smaller than zero and no greater than m−1).

Accordingly, components $H_{x,1,comp}[2\times g-1][v]=H_{x,1,comp}[2\times(2\times f-1)-1][v]$, $H_{x,2,comp}[2\times g-1][v]=H_{x,2,comp}[2\times(2\times f-1)-1][v]$, $H_{x,3,comp}[2\times g-1][v]=H_{x,3,comp}[2\times(2\times f-1)-1][v]$, $H_{x,4,comp}[2\times g-1][v]=H_{x,4,comp}[2\times(2\times f-1)-1][v]$, $H_{x,5,comp}[2\times g-1][v]=H_{x,5,comp}[2\times(2\times f-1)-1][v]$, $H_{p1,comp}[2\times g-1][v]=H_{p1,comp}[2\times(2\times f-1)-1][v]$, and $H_{p2,comp}[2\times g-1][v]=H_{p2,comp}[2\times(2\times f-1)-1][v]$ in row 2×g−1, or that is, row 2×(2×f−1)−1 of the parity check matrix $H_{pro\_m}$, which is for the LDPC-CC of coding rate 5/7 that uses an improved tail-biting scheme (an LDPC block code using an LDPC-CC), is expressed as follows.

First, the following holds true for $H_{x,1,comp}[2\times(2\times f-1)-1][v]$

[Math. 490]

$$H_{x,1,comp}[2\times(2\times f-1)-1][((2\times f-1)-0-1)+1]=1 \quad (230\text{-}1)$$

When y is an integer no smaller than one and no greater than $R_{\#(2c),1}$, and $(2\times f-1)-\alpha_{\#(2c),1,y}-1\geq 0$:

$$H_{x,1,comp}[2\times(2\times f-1)-1][((2\times f-1)-\alpha_{\#(2c),1,y}-1)+1]=1 \quad (230\text{-}2)$$

When $(2\times f-1)-\alpha_{\#(2c),1,y}-1<0$:

$$H_{x,1,comp}[2\times(2\times f-1)-1][((2\times f-1)-\alpha_{\#(2c),1,y}-1)+1+(2\times m\times z)]=1 \quad (230\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),1,y}-1)+1\}$, and $\{v\neq((2\times f-1)-\alpha_{\#(2c),1,y}-1)+1+(2\times m\times z)\}$ (where y is an integer no smaller than one and no greater than $R_{\#(2c),1}$), the following holds true:

$$H_{x,1,comp}[2\times(2\times f-1)-1][v]=0 \quad (230\text{-}4)$$

Considered in a similar manner, the following holds true for $H_{x,w,comp}[2\times(2\times f-1)-1][v]$. In the following, w is an integer no smaller than one and no greater than two.

[Math. 491]

$$H_{x,w,comp}[2\times(2\times f-1)-1][((2\times f-1)-0-1)+1]=1 \quad (231\text{-}1)$$

When y is an integer no smaller than one and no greater than $R_{\#(2c),w}$, and $(2\times f-1)-\alpha_{\#(2c),w,y}-1\geq 0$:

$$H_{x,w,comp}[2\times(2\times f-1)-1][((2\times f-1)-\alpha_{\#(2c),w,y}-1)+1]=1 \quad (231\text{-}2)$$

When $(2\times f-1)-\alpha_{\#(2c),w,y}-1<0$:

$$H_{x,w,comp}[2\times(2\times f-1)-1][((2\times f-1)-\alpha_{\#(2c),w,y}-1)+1+(2\times m\times z)]=1 \quad (231\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),w,y}-1)+1\}$, and $\{v\neq((2\times f-1)-\alpha_{\#(2c),w,y}-1)+1+(2\times m\times z)\}$ (where y is an integer no smaller than one and no greater than $R_{\#(2c),w}$), the following holds true:

$$H_{x,w,comp}[2\times(2\times f-1)-1][v]=0 \quad (231\text{-}4)$$

Further, the following holds true for $H_{x,3,comp}[2\times(2\times f-1)-1][v]$. In the following, y is an integer no smaller than $R_{\#(2c),3}+1$ and no greater than $r_{\#(2c),3}$.

[Math. 492]

When $(2\times f-1)-\alpha_{\#(2c),3,y}-1\geq 0$:

$$H_{x,3,comp}[2\times(2\times f-1)-1][((2\times f-1)-\alpha_{\#(2c),3,y}-1)+1]=1 \quad (232\text{-}1)$$

When $(2\times f-1)-\alpha_{\#(2c),3,y}-1\geq 0$:

$$H_{x,3,comp}[2\times(2\times f-1)-1][((2\times f-1)-\alpha_{\#(2c),3,y}-1)+1+(2\times m\times z)]=1 \quad (232\text{-}2)$$

For all v being an integer no smaller than one and no greater than 2×m×z satisfying $\{v\neq((2\times f-1)-\alpha_{\#(2c),3,y}-1)+1\}$, and $\{v\neq((2\times f-1)-\alpha_{\#(2c),3,y}-1)+1+(2\times m\times z)\}$ (where y is an integer no smaller than $R_{\#(2c),3}+1$ and no greater than $r_{\#(2c),3}$), the following holds true:

$$H_{x,3,comp}[2\times(2\times f-1)-1][v]=0 \quad (232\text{-}3)$$

Considered in a similar manner, the following holds true for $H_{x,\Omega,comp}[2\times(2\times f-1)-1][v]$. In the following, Ω is an integer no smaller than three and no greater than five, and y is an integer no smaller than $R_{\#(2c),\Omega}+1$ and no greater than $r_{\#(2c),\Omega}$.

[Math. 493]

When $(2\times f-1)-\alpha_{\#(2c),\Omega,y}-1\geq 0$:

$$H_{x,\Omega,comp}[2\times(2\times f-1)-1][((2\times f-1)-\alpha_{\#(2c),\Omega,y}-1)+1]=1 \tag{233-1}$$

When $(2\times f-1)-\alpha_{\#(2c),\Omega,y}-1<0$:

$$H_{x,\Omega,comp}[2\times(2\times f-1)-1][((2\times f-1)-\alpha_{\#(2c),\Omega,y}-1)+1+(2\times m\times z)]=1 \tag{233-2}$$

For all v being an integer no smaller than one and no greater than 2×m×z satisfying $\{v\neq(2\times f-1)-\alpha_{\#(2c),\Omega,y}-1)+1\}$ and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)-1][v]=0 \tag{233-3}$$

Further, the following holds true for $H_{p1,comp}[2\times(2\times f-1)-1][v]$.

[Math. 494]

$$H_{p1,comp}[2\times(2\times f-1)-1][((2\times f-1)-\beta_{\#(2c),1}-1)+1]=1 \tag{234-1}$$

When $(2\times f-1)-\beta_{\#(2c),1}-1\geq 0$:

$$H_{p1,comp}[2\times(2\times f-1)-1][((2\times f-1)-\beta_{\#(2c),1}-1)+1]=1 \tag{234-2}$$

When $(2\times f-1)-\beta_{\#(2c),1}-1<0$:

$$H_{p1,comp}[2\times(2\times f-1)-1][((2\times f-1)-\beta_{\#(2c),1}-1)+1+(2\times m\times z)]=1 \tag{234-3}$$

For all v being an integer no smaller than one and no greater than 2×m×z satisfying $\{v\neq((2\times f-1)-0-1)+1\}$, $\{v\neq((2\times f-1)-\beta_{\#(2c),1}-1)+1\}$, and $\{v\neq((2\times f-1)-\beta_{\#(2c),1}-1)+1+(2\times m\times z)\}$, the following holds true:

$$H_{p1,comp}[2\times(2\times f-1)-1][v]=0 \tag{234-4}$$

Further, the following holds true for $H_{p2,comp}[2\times(2\times f-1)\ 1][v]$.

[Math. 495]

For all v being an integer no smaller than one and no greater than 2×m×z, the following holds true:

$$H_{p2,comp}[2\times(2\times f-1)-1][v]=0 \tag{235}$$

Further, (3) when g=2×f−1 (where f is an integer no smaller than two and no greater than m×z), when a vector for row 2×(2×f−1) of the parity check matrix $H_{pro\_m}$, which is for the LDPC-CC of coding rate 5/7 that uses an improved tail-biting scheme (an LDPC block code using an LDPC-CC), can be generated by using a parity check polynomial satisfying zero provided by expression (197-2-1), ((2×f−1)−1)%2m=2c holds true. Accordingly, a parity check polynomial satisfying zero of expression (197-2-1) where 2i=2c holds true (where c is an integer no smaller than zero and no greater than m−1).

Accordingly, components $H_{x,1,comp}[2\times g][v]=H_{x,1,comp}[2\times(2\times f-1)][v]$, $H_{x,2,comp}[2\times g][v]=H_{x,2,comp}[2\times(2\times f-1)][v]$, $H_{x,3,comp}[2\times g][v]=H_{x,3,comp}[2\times(2\times f-1)][v]$, $H_{x,4,comp}[2\times g][v]=H_{x,4,comp}[2\times(2\times f-1)][v]$, $H_{x,5,comp}[2\times g][v]=H_{x,5,comp}[2\times(2\times f-1)][v]$, $H_{p1,comp}[2\times g][v]=H_{p1,comp}[2\times(2\times f-1)][v]$, and $H_{p2,comp}[2\times g][v]=H_{p2,comp}[2\times(2\times f-1)][v]$ in row 2×g, or that is, row 2×(2×f−1) of the parity check matrix $H_{pro\_m}$, which is for the LDPC-CC of coding rate 5/7 that uses an improved tail-biting scheme (an LDPC block code using an LDPC-CC), is expressed as follows.

First, the following holds true for $H_{x,1,comp}[2\times(2\times f-1)][v]$. In the following, y is an integer no smaller than $R_{\#(2c),1}+1$ and no greater than $r_{\#(2c),1}$.

[Math. 496]

When $(2\times f-1)-\alpha_{\#(2c),1,y}-1\geq 0$:

$$H_{x,1,comp}[2\times(2\times f-1)][((2\times f-1)-\alpha_{\#(2c),1,y}-1)+1]=1 \tag{236-1}$$

When $(2\times f-1)-\alpha_{\#(2c),1,y}-1<0$:

$$H_{x,1,comp}[2\times(2\times f-1)][((2\times f-1)-\alpha_{\#(2c),1,y}-1)+1+(2\times m\times z)]=1 \tag{236-2}$$

For all v being an integer no smaller than one and no greater than 2×m×z satisfying $\{v\neq((2\times f-1)-\alpha_{\#(2c),1,y}-1)+1\}$ and $\{v\neq((2\times f-1)-\alpha_{\#(2c),1,y}-1)+1+(2\times m\times z)\}$ (where y is an integer no smaller than $R_{\#(2c),1}+1$ and no greater than $r_{\#(2c),1}$), the following holds true:

$$H_{x,1,comp}[2\times(2\times f-1)][v]=0 \tag{236-3}$$

Considered in a similar manner, the following holds true for $H_{x,\Omega,comp}[2\times(2\times f-1)][v]$. In the following, Ω is an integer no smaller than one and no greater than two, and y is an integer no smaller than $R_{\#(2c),\Omega}+1$ and no greater than $r_{\#(2c),\Omega}$.

[Math. 497]

When $(2\times f-1)-\alpha_{\#(2c),\Omega,y}-1\geq 0$:

$$H_{x,\Omega,comp}[2\times(2\times f-1)][((2\times f-1)-\alpha_{\#(2c),\Omega,y}-1)+1]=1 \tag{237-1}$$

When $(2\times f-1)-\alpha_{\#(2c),\Omega,y}-1<0$:

$$H_{x,\Omega,comp}[2\times(2\times f-1)][((2\times f-1)-\alpha_{\#(2c),\Omega,y}-1)+1+(2\times m\times z)]=1 \tag{237-2}$$

For all v being an integer no smaller than one and no greater than 2×m×z satisfying $\{v\neq((2\times f-1)-\alpha_{\#(2c),\Omega,y}-1)+1\}$, and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)][v]=0 \tag{237-3}$$

Further, the following holds true for $H_{x,3,comp}[2\times(2\times f-1)][v]$.

[Math. 498]

$$H_{x,3,comp}[2\times(2\times f-1)][((2\times f-1)-0-1)+1]=1 \tag{238-1}$$

When y is an integer no smaller than one and no greater than $R_{\#(2c),3}$, and $(2\times f-1)-\alpha_{\#(2c),3,y}-1\geq 0$:

$$H_{x,3,comp}[2\times(2\times f-1)][((2\times f-1)-\alpha_{\#(2c),3,y}-1)+1]=1 \tag{238-2}$$

When $(2\times f-1)-\alpha_{\#(2c),3,y}-1<0$:

$$H_{x,3,comp}[2\times(2\times f-1)][((2\times f-1)-\alpha_{\#(2c),3,y}-1)+1+(2\times m\times z)]=1 \tag{238-3}$$

For all v being an integer no smaller than one and no greater than 2×m×z satisfying $\{v\neq((2\times f-1)-0-1)+1\}$, $\{v\neq((2\times f-1)-\alpha_{\#(2c),3,y}-1)+1\}$, and $\{v\neq((2\times f-1)-\alpha_{\#(2c),3,y}-1)+1+(2\times m\times z)\}$ (where y is an integer no smaller than one and no greater than $R_{\#(2c),3}$), the following holds true:

$$H_{x,3,comp}[2\times(2\times f-1)][v]=0 \tag{238-4}$$

Considered in a similar manner, the following holds true for $H_{x,w,comp}[2\times(2\times f-1)][v]$. In the following, w is an integer no smaller than three and no greater than five.

[Math. 499]

$$H_{x,w,comp}[2\times(2\times f-1)][((2\times f-1)-0-1)+1]=1 \tag{239-1}$$

When y is an integer no smaller than one and no greater than $R_{\#(2c),w}$, and $(2\times f-1)-\alpha_{\#(2c),w,y}-1\geq 0$:

$$H_{x,w,comp}[2\times(2\times f-1)][((2\times f-1)-\alpha_{\#(2c),w,y}-1)+1]=1 \tag{239-2}$$

When $(2\times f-1)-\alpha_{\#(2c),w,y}-1<0$:

$$H_{x,w,comp}[2\times(2\times f-1)][((2\times f-1)-\alpha_{\#(2c),w,y}-1)+1+(2\times m\times z)]=1 \tag{239-3}$$

For all v being an integer no smaller than one and no greater than 2×m×z satisfying $\{v\neq((2\times f-1)-0-1)+1\}$, $\{v\neq((2\times f-1)-\alpha_{\#(2c),w,y}-1)+1\}$, and $\{v\neq((2\times f-1)-\alpha_{\#(2c),w,y}-1)+1+(2\times m\times z)\}$ (where y is an integer no smaller than one and no greater than $R_{\#(2c),w}$), the following holds true:

$$H_{x,w,comp}[2\times(2\times f-1)][v]=0 \tag{239-4}$$

Further, the following holds true for $H_{p1,comp}[2\times(2\times f-1)][v]$.

[Math. 500]

When $(2\times f-1)-\beta_{\#(2c),2}-1\geq 0$:

$$H_{p1,comp}[2\times(2\times f-1)][((2\times f-1)-\beta_{\#(2c),2}-1)+1]=1 \quad (240\text{-}1)$$

When $(2\times f-1)-\beta_{\#(2c),2}-1<0$:

$$H_{p1,comp}[2\times(2\times f-1)][((2\times f-1)-\beta_{\#(2c),2}-1)+1+(2\times m\times z)]=1 \quad (240\text{-}2)$$

For all v being an integer no smaller than one and no greater than 2×m×z satisfying $\{v\neq((2\times f-1)-\beta_{\#(2c),2}-1)+1\}$ and $\{v\neq((2\times f-1)-\beta_{\#(2c),2}-1)+1+(2\times m\times z)\}$, the following holds true:

$$H_{p1,comp}[2\times(2\times f-1)][v]=0 \quad (240\text{-}3)$$

Further, the following holds true for $H_{p2,comp}[2\times(2\times f-1)][v]$.

[Math. 501]

$$H_{p2,comp}[2\times(2\times f-1)][((2\times f-1)-0-1)+1]=1 \quad (241\text{-}1)$$

For all v being an integer no smaller than one and no greater than 2×m×z satisfying $\{v\neq((2\times f-1)-0-1)+1\}$, the following holds true:

$$H_{p2,comp}[2\times(2\times f-1)][v]=0 \quad (241\text{-}2)$$

Further, (4) when g=2×f−1 (where f is an integer no smaller than two and no greater than m×z), when a vector for row 2×(2×f−1) of the parity check matrix $H_{pro\_m}$, which is for the LDPC-CC of coding rate 5/7 that uses an improved tail-biting scheme (an LDPC block code using an LDPC-CC), can be generated by using a parity check polynomial satisfying zero provided by expression (197-2-2), ((2×f−1)−1)%2m=2c holds true. Accordingly, a parity check polynomial satisfying zero of expression (197-2-2) where 2i=2c holds true (where c is an integer no smaller than zero and no greater than m−1).

Accordingly, components $H_{x,1,comp}[2\times g][v]$ $H_{x,1,comp}[2\times(2\times f-1)][v]$, $H_{x,2,comp}[2\times g][v]=H_{x,2,comp}[2\times(2\times f-1)][v]$, $H_{x,3,comp}[2\times g][v]=H_{x,3,comp}[2\times(2\times f-1)][v]$, $H_{x,4,comp}[2\times g][v]=H_{x,4,comp}[2\times(2\times f-1)][v]$, $H_{x,5,comp}[2\times g][v]=H_{x,5,comp}[2\times(2\times f-1)][v]$, $H_{p1,comp}[2\times g][v]=H_{p1,comp}[2\times(2\times f-1)][v]$, and $H_{p2,comp}[2\times g][v]=H_{p2,comp}[2\times(2\times f-1)_{][v]\ in\ row}$ 2×g, or that is, row 2×(2×f−1) of the parity check matrix $H_{pro\_m}$, which is for the LDPC-CC of coding rate 5/7 that uses an improved tail-biting scheme (an LDPC block code using an LDPC-CC), is expressed as follows.

First, the following holds true for $H_{x,1,comp}[2\times(2\times f-1)][v]$. In the following, y is an integer no smaller than $R_{\#(2c),1}+1$ and no greater than $r_{\#(2c),1}$.

[Math. 502]

When $(2\times f-1)-\alpha_{\#(2c),1,y}-1\geq 0$:

$$H_{x,1,comp}[2\times(2\times f-1)][((2\times f-1)-\alpha_{\#(2c),1,y}-1)+1]=1 \quad (242\text{-}1)$$

When $(2\times f-1)-\alpha_{\#(2c),1,y}-1<0$:

$$H_{x,1,comp}[2\times(2\times f-1)][((2\times f-1)-\alpha_{\#(2c),1,y}-1)+1+(2\times m\times z)]=1 \quad (242\text{-}2)$$

For all v being an integer no smaller than one and no greater than 2×m×z satisfying $\{v\neq((2\times f-1)-\alpha_{\#(2c),1,y}-1)+1\}$ and $\{v\neq((2\times f-1)-\alpha_{\#(2c),1,y}-1)+1+(2\times m\times z)\}$ (where y is an integer no smaller than $R_{\#(2c),1}+1$ and no greater than $r_{\#(2c),1}$), the following holds true:

$$H_{x,1,comp}[2\times(2\times f-1)][v]=0 \quad (242\text{-}3)$$

Considered in a similar manner, the following holds true for $H_{x,\Omega,comp}[2\times(2\times f-1)][v]$. In the following, Ω is an integer no smaller than one and no greater than two, and y is an integer no smaller than $R_{\#(2c),\Omega}+1$ and no greater than $r_{\#(2c),\Omega}$.

[Math. 503]

When $(2\times f-1)-\alpha_{\#(2c),\Omega,y}-1\geq 0$:

$$H_{x,\Omega,comp}[2\times(2\times f-1)][((2\times f-1)-\alpha_{\#(2c),\Omega,y}-1)+1]=1 \quad (243\text{-}1)$$

When $(2\times f-1)-\alpha_{\#(2c),\Omega,y}-1<0$:

$$H_{x,\Omega,comp}[2\times(2\times f-1)][((2\times f-1)-\alpha_{\#(2c),\Omega,y}-1)+1+(2\times m\times z)]=1 \quad (243\text{-}2)$$

For all v being an integer no smaller than one and no greater than 2×m×z satisfying $\{v\neq((2\times f-1)-\alpha_{\#(2c),\Omega,y}-1)+1\}$, and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)][v]=0 \quad (243\text{-}3)$$

Further, the following holds true for $H_{x,3,comp}[2\times(2\times f-1)][v]$.

[Math. 504]

$$H_{x,3,comp}[2\times(2\times f-1)][((2\times f-1)-0-1)+1]=1 \quad (244\text{-}1)$$

When y is an integer no smaller than one and no greater than $R_{\#(2c),3}$, and $(2\times f-1)-\alpha_{\#(2c),3,y}-1\geq 0$:

$$H_{x,3,comp}[2\times(2\times f-1)][((2\times f-1)-\alpha_{\#(2c),3,y}-1)+1]=1 \quad (244\text{-}2)$$

When $(2\times f-1)-\alpha_{\#(2c),3,y}-1<0$:

$$H_{x,3,comp}[2\times(2\times f-1)][((2\times f-1)-\alpha_{\#(2c),3,y}-1)+1+(2\times m\times z)]=1 \quad (244\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),3,y}-1)+1\}$, and $\{v\neq((2\times f-1)-\alpha_{\#(2c),3,y}-1)+1+(2\times m\times z)\}$ (where y is an integer no smaller than one and no greater than $R_{\#(2c),3}$), the following holds true:

$$H_{x,3,comp}[2\times(2\times f-1)][v]=0 \quad (244\text{-}4)$$

Considered in a similar manner, the following holds true for $H_{x,w,comp}[2\times(2\times f-1)][v]$. In the following, w is an integer no smaller than three and no greater than five.

[Math. 505]

$$H_{x,w,comp}[2\times(2\times f-1)][((2\times f-1)-0-1)+1]=1 \quad (245\text{-}1)$$

When y is an integer no smaller than one and no greater than $R_{\#(2c),w}$, and $(2\times f-1)-\alpha_{\#(2c),w,y}-1\geq 0$:

$$H_{x,w,comp}[2\times(2\times f-1)][((2\times f-1)-\alpha_{\#(2c),w,y}-1)+1]=1 \quad (245\text{-}2)$$

When $(2\times f-1)-\alpha_{\#(2c),w,y}-1<0$:

$$H_{x,w,comp}[2\times(2\times f-1)][((2\times f-1)-\alpha_{\#(2c),w,y}-1)+1+(2\times m\times z)]=1 \quad (245\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),w,y}-1)+1\}$, and $\{v\neq((2\times f-1)-\alpha_{\#(2c),w,y}-1)+1+(2\times m\times z)\}$ (where y is an integer no smaller than one and no greater than $R_{\#(2c),w}$), the following holds true:

$$H_{x,w,comp}[2\times(2\times f-1)][v]=0 \quad (245\text{-}4)$$

Further, the following holds true for $H_{p1,comp}[2\times(2\times f-1)][v]$.

[Math. 506]

For all v being an integer no smaller than one and no greater than 2×m×z, the following holds true:

$$H_{p1,comp}[2\times(2\times f-1)][v]=0 \quad (246)$$

Further, the following holds true for $H_{p2,comp}[2\times(2\times f-1)][v]$.

[Math. 507]

$$H_{p2,comp}[2\times(2\times f-1)][((2\times f-1)-0-1)+1]=1 \quad (247\text{-}1)$$

When $(2\times f-1)-\beta_{\#(2c),3}-1\geq 0$:

$$H_{p2,comp}[2\times(2\times f-1)][((2\times f-1)-\beta_{\#(2c),3}-1)+1]=1 \quad (247\text{-}2)$$

When $(2\times f-1)-\beta_{\#(2c),3}-1<0$:

$$H_{p2,comp}[2\times(2\times f-1)][((2\times f-1)-\beta_{\#(2c),3}-1)+1+(2\times m\times z)]=1 \quad (247\text{-}3)$$

For all v being an integer no smaller than one and no greater than 2×m×z satisfying $\{v\neq((2\times f-1)-0-1)+1\}$, $\{v\neq((2\times f-1)-\beta_{\#(2c),3}-1)+1\}$, and $\{v\neq((2\times f-1)-\beta_{\#(2c),3}-1)+1+(2\times m\times z)\}$, the following holds true:

$$H_{p2,comp}[2\times(2\times f-1)][v]=0 \quad (247\text{-}4)$$

Further, (5) when g=2×f (where f is an integer no smaller than one and no greater than m×z), when a vector for row 2×(2×f)−1 of the parity check matrix $H_{pro\_m}$, which is for the LDPC-CC of coding rate 5/7 that uses an improved tail-biting scheme (an LDPC block code using an LDPC-CC), can be generated by using a parity check polynomial satisfying zero provided by expression (198-1-1), ((2×f)−1) %2m=2d+1 holds true. Accordingly, a parity check polynomial satisfying zero of expression (198-1-1) where 2i+1=2d+1 holds true (where d is an integer no smaller than zero and no greater than m−1).

Accordingly, components $H_{x,1,comp}[2\times g-1][v]=H_{x,1,comp}[2\times(2\times f)-1][v]$, $H_{x,2,comp}[2\times g-1][v]=H_{x,2,comp}[2\times(2\times f)-1][v]$, $H_{x,3,comp}[2\times g-1][v]=H_{x,3,comp}[2\times(2\times f)-1][v]$, $H_{x,4,comp}[2\times g-1][v]=H_{x,4,comp}[2\times(2\times f)-1][v]$, $H_{x,5,comp}[2\times g-1][v]=H_{x,5,comp}[2\times(2\times f)-1][v]$, $H_{p1,comp}[2\times g-1][v]=H_{p1,comp}[2\times(2\times f)-1][v]$, and $H_{p2,comp}[2\times g-1][v]=H_{p2,comp}[2\times(2\times f)-1][v]$ in row 2×g−1, or that is, row 2×(2×f)−1 of the parity check matrix $H_{pro\_m}$, which is for the LDPC-CC of coding rate 5/7 that uses an improved tail-biting scheme (an LDPC block code using an LDPC-CC), is expressed as follows.

First, the following holds true for $H_{x,1,comp}[2\times(2\times f)-1][v]$. In the following, y is an integer no smaller than $R_{\#(2d+1),1}+1$ and no greater than $r_{\#(2d+1),1}$.

[Math. 508]

When $(2\times f)-\alpha_{\#(2d+1),1,y}-1\geq 0$:

$$H_{x,1,comp}[2\times(2\times f)-1][((2\times f)-\alpha_{\#(2d+1),1,y}-1)+1]=1 \quad (248\text{-}1)$$

When $(2\times f)-\alpha_{\#(2d+1),1,y}-1<0$:

$$H_{x,1,comp}[2\times(2\times f)-1][((2\times f)-\alpha_{\#(2d+1),1,y}-1)+1+(2\times m\times z)]=1 \quad (248\text{-}2)$$

For all v being an integer no smaller than one and no greater than 2×m×z satisfying $\{v\neq((2\times f)-\alpha_{\#(2d+1),1,y}-1)+1\}$ and $\{v\neq((2\times f)-\alpha_{\#(2d+1),1,y}-1)+1+(2\times m\times z)\}$ (where y is an integer no smaller than $R_{\#(2d+1),1}+1$ and no greater than $r_{\#(2d+1),1}$), the following holds true:

$$H_{x,1,comp}[2\times(2\times f)-1][v]=0 \quad (248\text{-}3)$$

Considered in a similar manner, the following holds true for $H_{x,\Omega,comp}[2\times(2\times f)-1)][v]$. In the following, Ω is an integer no smaller than one and no greater than two, and y is an integer no smaller than $R_{\#(2d+1),\Omega}+1$ and no greater than $r_{\#(2d+1),\Omega}$.

[Math. 509]

When $(2\times f)-\alpha_{\#(2d+1),\Omega,y}\geq 0$:

$$H_{x,\Omega,comp}[2\times(2\times f)-1][((2\times f)-\alpha_{\#(2d+1),\Omega,y}-1)+1]=1 \quad (249\text{-}1)$$

When $(2\times f)-\alpha_{\#(2d+1),\Omega,y}-1<0$:

$$H_{x,\Omega,comp}[2\times(2\times f)-1][((2\times f)-\alpha_{\#(2d+1),\Omega,y}-1)+1+(2\times m\times z)]=1 \quad (249\text{-}2)$$

For all v being an integer no smaller than one and no greater than 2×m×z satisfying $\{v\neq((2\times f)-\alpha_{\#(2d+1),\Omega,y}-1)+1\}$, and $\{v\neq((2\times f)-\alpha_{\#(2d+1),\Omega,y}-1)+1+(2\times m\times z)\}$ (where y is an integer no smaller than $R_{\#(2d+1),\Omega}+1$ and no greater than $r_{\#(2d+1),\Omega}$), the following holds true:

$$H_{x,\Omega,comp}[2\times(2\times f)-1][v]=0 \quad (249\text{-}3)$$

Further, the following holds true for $H_{x,3,comp}[2\times(2\times f)-1][v]$.

[Math. 510]

$$H_{x,3,comp}[2\times(2\times f)-1][((2\times f)-0-1)+1]=1 \quad (250\text{-}1)$$

When y is an integer no smaller than one and no greater than $R_{\#(2d+1),3}$ and $(2\times f)-\alpha_{\#(2d+1),3,y}-1\geq 0$:

$$H_{x,3,comp}[2\times(2\times f)-1][((2\times f)-\alpha_{\#(2d+1),3,y}-1)+1]=1 \quad (250\text{-}2)$$

When $(2\times f)-\alpha_{\#(2d+1),3,y}-1<0$:

$$H_{x,3,comp}[2\times(2\times f)-1][((2\times f)+1+(2\times m\times z)]=1 \quad (250\text{-}3)$$

For all v being an integer no smaller than one and no greater than 2×m×z satisfying $\{v\neq((2\times f)-0-1)+1\}$, $\{v\neq((2\times f)-\alpha_{\#(2d+1),3,y})+1\}$, and $\{v\neq((2\times f)-\alpha_{\#(2d+1),3,y}-1)+1+(2\times m\times z)\}$ (where y is an integer no smaller than one and no greater than $R_{\#(2d+1),3}$), the following holds true:

$$H_{x,3,comp}[2\times(2\times f)-1][v]=0 \quad (250\text{-}4)$$

Considered in a similar manner, the following holds true for $H_{x,w,comp}[2\times(2\times f)-1][v]$. In the following, w is an integer no smaller than three and no greater than five.

[Math. 511]

$$H_{x,w,comp}[2\times(2\times f)-1][((2\times f)-0-1)+1]=1 \quad (251\text{-}1)$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)-1][((2\times f)-\alpha_{\#(2d+1),w,y}-1)+1]=1 \quad (251\text{-}2)$$

When $(2\times f)-\alpha_{\#(2d+1),w,y}-1<0$:

$$H_{x,w,comp}[2\times(2\times f)-1][((2\times f)-\alpha_{\#(2d+1),w,y}-1)+1+(2\times m\times z)]=1 \quad (251\text{-}3)$$

For all v being an integer no smaller than one and no greater than 2×m×z satisfying $\{v\neq((2\times f)-0-1)+1\}$, $\{v\neq((2\times f)-\alpha_{\#(2d+1),w,y}-1)+1\}$, and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)-1][v]=0 \quad (251\text{-}4)$$

Further, the following holds true for $H_{p1,comp}[2\times(2\times f)-1][v]$.

[Math. 512]

$$H_{p1,comp}[2\times(2\times f)-1][((2\times f)-0-1)+1]=1 \quad (252\text{-}1)$$

For all v being an integer no smaller than one and no greater than 2×m×z satisfying $\{v\neq((2\times f)-0-1)+1\}$, the following holds true:

$$H_{p1,comp}[2\times(2\times f)-1][v]=0 \quad (252\text{-}2)$$

Further, the following holds true for $H_{p2,comp}[2\times(2\times f)-1][v]$.

[Math. 513]

When $(2\times f)-\beta_{\#(2d+1),0}-1\geq 0$:

$$H_{p2,comp}[2\times(2\times f)-1][((2\times f)-\beta_{\#(2d+1),0}-1)+1]=1 \quad (253\text{-}1)$$

When $(2\times f)-\beta_{\#(2d+1),0}-1<0$:

$$H_{p2,comp}[2\times(2\times f)-1][((2\times f)-\beta_{\#(2d+1),0}-1)+1+(2\times m\times z)]=1 \quad (253\text{-}2)$$

For all v being an integer no smaller than one and no greater than 2×m×z satisfying $\{v\neq((2\times f)-\beta_{\#(2d+1),0}-1)+1\}$ and $\{v\neq((2\times f)-\beta_{\#(2d+1),0}-1)+1+(2\times m\times z)\}$, the following holds true:

$$H_{p2,comp}[2\times(2\times f)-1][v]=0 \quad (253\text{-}3)$$

Further, (6) when g=2×f (where f is an integer no smaller than one and no greater than m×z), when a vector for row 2×(2×f)−1 of the parity check matrix $H_{pro\_m}$, which is for the LDPC-CC of coding rate 5/7 that uses an improved tail-biting scheme (an LDPC block code using an LDPC-CC), can be generated by using a parity check polynomial satisfying zero provided by expression (198-1-2), ((2×f)−1) %2m=2d+1 holds true. Accordingly, a parity check polynomial satisfying zero of expression (198-1-2) where 2i+1=2d+1 holds true (where d is an integer no smaller than zero and no greater than m−1).

Accordingly, components $H_{x,1,comp}[2\times g-1][v]=H_{x,1,comp}[2\times(2\times f)-1][v]$, $H_{x,2,comp}[2\times g-1][v]=H_{x,2,comp}[2\times(2\times f)-1][v]$, $H_{x,3,comp}[2\times g-1][v]=H_{x,3,comp}[2\times(2\times f)-1][v]$, $H_{x,4,comp}[2\times g-1][v]=H_{x,4,comp}[2\times(2\times f)-1][v]$, $H_{x,5,comp}[2\times g-1][v]=H_{x,5,comp}[2\times(2\times f)-1][v]$, $H_{p1,comp}[2\times g-1][v]=H_{p1,comp}[2\times(2\times f)-1][v]$, and $H_{p2,comp}[2\times g-1][v]=H_{p2,comp}[2\times(2\times f)-1][v]$ in row 2×g−1, or that is, row 2×(2×f)−1 of the parity check matrix $H_{pro\_m}$, which is for the LDPC-CC of coding rate 5/7 that uses an improved tail-biting scheme (an LDPC block code using an LDPC-CC), is expressed as follows.

First, the following holds true for $H_{x,1,comp}[2\times(2\times f)-1][v]$. In the following, y is an integer no smaller than $R_{\#(2d+1),1}+1$ and no greater than $r_{\#(2d+1),1}$.

[Math. 514]

When $(2\times f)-\alpha_{\#(2d+1),1,y}-1\geq 0$:

$$H_{x,1,comp}[2\times(2\times f)-1][((2\times f)-\alpha_{\#(2d+1),1,y}-1)+1]=1 \tag{254-1}$$

When $(2\times f)-\alpha_{\#(2d+1),1,y}-1<0$:

$$H_{x,1,comp}[2\times(2\times f)-1][((2\times f)-\alpha_{\#(2d+1),1,y}-1)+1+(2\times m\times z)]=1 \tag{254-2}$$

For all v being an integer no smaller than one and no greater than 2×m×z satisfying $\{v\neq((2\times f)-\alpha_{\#(2d+1),1,y}-1)+1\}$ and $\{v\neq(2\times f)-\alpha_{\#(2d+1),1,y}-1)+1+(2\times m\times z)\}$ (where y is an integer no smaller than $R_{\#(2d+1),1}+1$ and no greater than $r_{\#(2d+1),1}$), the following holds true:

$$H_{x,1,comp}[2\times(2\times f)-1][v]=0 \tag{254-3}$$

Considered in a similar manner, the following holds true for $H_{x,\Omega,comp}[2\times(2\times f)-1)][v]$. In the following, Ω is an integer no smaller than one and no greater than two, and y is an integer no smaller than $R_{\#(2d+1),\Omega}+1$ and no greater than $r_{\#(2d+1),\Omega}$.

[Math. 515]

When $(2\times f)-\alpha_{\#(2d+1),y}-1\geq 0$:

$$H_{x,\Omega,comp}[2\times(2\times f)-1][((2\times f)-\alpha_{\#(2d+1),\Omega,y}-1)+1]=1 \tag{255-1}$$

When $(2\times f)-\alpha_{\#(2d+1),\Omega,y}-1<0$:

$$H_{x,\Omega,comp}[2\times(2\times f)-1][((2\times f)-\alpha_{\#(2d+1),\Omega,y}-1)+1+(2\times m\times z)]=1 \tag{255-2}$$

For all v being an integer no smaller than one and no greater than 2×m×z satisfying $\{v\neq((2\times f)-\alpha_{\#(2d+1),\Omega,y}-1)\}$, and $\{v\neq((2\times f)-\alpha_{\#(2d+1),\Omega,y}-1)+1+(2\times m\times z)\}$ (where y is an integer no smaller than $R_{\#(2d+1),\Omega}+1$ and no greater than $r_{\#(2d+),\Omega}$), the following holds true:

$$H_{x,\Omega,comp}[2\times(2\times f)-1][v]=0 \tag{255-3}$$

Further, the following holds true for $H_{x,3,comp}[2\times(2\times f)-1][v]$.

[Math. 516]

$$H_{x,3,comp}[2\times(2\times f)-1][((2\times f)-0-1)+1]=1 \tag{256-1}$$

When y is an integer no smaller than one and no greater than $R_{\#(2d+1),3}$ and $(2\times f)-\alpha_{\#(2d+1),3,y}-1\geq 0$:

$$H_{x,3,comp}[2\times(2\times f)-1][((2\times f)-\alpha_{\#(2d+1),3,y}-1)+1]=1 \tag{256-2}$$

When $(2\times f)-\alpha_{\#(2d+1),3,y}-1<0$:

$$H_{x,3,comp}[2\times(2\times f)-1][((2\times f)-\alpha_{\#(2d+1),3,y}-1)+1+(2\times m\times z)]=1 \tag{256-3}$$

For all v being an integer no smaller than one and no greater than 2×m×z satisfying $\{v\neq((2\times f)-0-1)+1\}$, $\{v\neq((2\times f)-\alpha_{\#(2d+1),3,y}-1)\}$, and $\{v\neq((2\times f)-\alpha_{\#(2d+1),3,y}-1)+1+(2\times m\times z)\}$ (where y is an integer no smaller than one and no greater than $R_{\#(2d+1),3}$), the following holds true:

$$H_{x,3,comp}[2\times(2\times f)-1][v]=0 \tag{256-4}$$

Considered in a similar manner, the following holds true for $H_{x,w,comp}[2\times(2\times f)-1][v]$. In the following, w is an integer no smaller than three and no greater than five.

[Math. 517]

$$H_{x,w,comp}[2\times(2\times f)-1][((2\times f)-0-1)+1]=1 \tag{257-1}$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)-1][((2\times f)-\alpha_{\#(2d+1),w,y}-1)+1]=1 \tag{257-2}$$

When $(2\times f)-\alpha_{\#(2d+1),w,y}-1<0$:

$$H_{x,w,comp}[2\times(2\times f)-1][((2\times f)-\alpha_{\#(2d+1),w,y}-1)+1+(2\times m\times z)]=1 \tag{257-3}$$

For all v being an integer no smaller than one and no greater than 2×m×z satisfying $\{v\neq((2\times f)-0-1)+1\}$, $\{v\neq(2\times f)-\alpha_{\#(2d+1),w,y}-1)+1\}$, and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)-1][v]=0 \tag{257-4}$$

Further, the following holds true for $H_{p1,comp}[2\times(2\times f)-1][v]$.

[Math. 518]

$$H_{p1,comp}[2\times(2\times f)-1][((2\times f)-0-1)+1]=1 \tag{258-1}$$

When $(2\times f)-\beta_{\#(2d+1),1}-1\geq 0$:

$$H_{p1,comp}[2\times(2\times f)-1][((2\times f)-\beta_{\#(2d+1),1}-1)+1]=1 \tag{258-2}$$

When $(2\times f)-\beta_{\#(2d+1),1}-1<0$:

$$H_{p1,comp}[2\times(2\times f)-1][((2\times f)-\beta_{\#(2d+1),1}-1)+1+(2\times m\times z)]=1 \tag{258-3}$$

For all v being an integer no smaller than one and no greater than 2×m×z satisfying $\{v\neq((2\times f)-0-1)+1\}$, $\{v\neq((2\times f)-\beta_{\#(2d+0,1}-1)+1\}$, and $\{v\neq((2\times f)-\beta_{\#(2d+1),1}-1)+1+(2\times m\times z)\}$, the following holds true:

$$H_{p1,comp}[2\times(2\times f)-1][v]=0 \tag{258-4}$$

Further, the following holds true for $H_{p2,comp}[2\times(2\times f)-1][v]$.

[Math. 519]

For all v being an integer no smaller than one and no greater than 2×m×z, the following holds true:

$$H_{p2,comp}[2\times(2\times f)-1][v]=0 \tag{259}$$

Further, (7) when g=2×f (where f is an integer no smaller than one and no greater than m×z), when a vector for row 2×(2×f) of the parity check matrix $H_{pro\_m}$, which is for the LDPC-CC of coding rate 5/7 that uses an improved tail-biting scheme (an LDPC block code using an LDPC-CC), can be generated by using a parity check polynomial satisfying zero provided by expression (198-2-1), ((2×f)−1) %2m=2d+1 holds true. Accordingly, a parity check polynomial satisfying zero of expression (198-2-1) where 2i+1=2d+1 holds true (where d is an integer no smaller than zero and no greater than m−1).

Accordingly, components $H_{x,1,comp}[2\times g][v]=H_{x,1,comp}[2\times(2\times f)][v]$, $H_{x,2,comp}[2\times g][v]=H_{x,2,comp}[2\times(2\times f)][v]$, $H_{x,3,comp}[2\times g][v]=H_{x,3,comp}[2\times(2\times f)][v]$, $H_{x,4,comp}[2\times g][v]=H_{x,4,comp}[2\times(2\times f)][v]$, $H_{x,5,comp}[2\times g][v]=H_{x,5,comp}[2\times(2\times f)][v]$, $H_{p1,comp}[2\times g][v]=H_{p1,comp}[2\times(2\times f)][v]$, and $H_{p2,comp}[2\times g]$ $[v]=H_{p2,comp}[2\times(2\times f)_{][v]\ in\ row}\ 2\times g$, or that is, row 2×(2×f) of the parity check matrix $H_{pro\_m}$, which is for the LDPC-CC of coding rate 5/7 that uses an improved tail-biting scheme (an LDPC block code using an LDPC-CC), is expressed as follows.

The following holds true for $H_{x,1,comp}[2\times(2\times f)][v]$.

[Math. 520]

$$H_{x,1,comp}[2\times(2\times f)][((2\times f)-0-1)+1]=1 \quad (260\text{-}1)$$

When y is an integer no smaller than one and no greater than $R_{\#(2d+1),1}$, and $(2\times f)-\alpha_{\#(2d+1),1,y}-1\geq 0$:

$$H_{x,1,comp}[2\times(2\times f)][((2\times f)-\alpha_{\#(2d+1),1,y}-1)+1]=1 \quad (260\text{-}2)$$

When $(2\times f)-\alpha_{\#(2d+1),1,y}--1<0$:

$$H_{x,1,comp}[2\times(2\times f)][((2\times f)-\alpha_{\#(2d+1),1,y}-1)+1+(2\times m\times z)]=1 \quad (260\text{-}3)$$

For all v being an integer no smaller than one and no greater than 2×m×z satisfying $\{v\neq((2\times f)-0-1)+1\}$, $\{v\neq((2\times f)-\alpha_{\#(2d+1),1,y}-1)+1\}$, and $\{v\neq((2\times f)-\alpha_{\#(2d+1),1,y}-1)+1+(2\times m\times z)\}$ (where y is an integer no smaller than one and no greater than $R_{\#(2d+1),1}$), the following holds true:

$$H_{x,1,comp}[2\times(2\times f)][v]=0 \quad (260\text{-}4)$$

Considered in a similar manner, the following holds true for $H_{x,w,comp}[2\times(2\times f)][v]$. In the following, w is an integer no smaller than one and no greater than two.

[Math. 521]

$$H_{x,w,comp}[2\times(2\times f)][((2\times f)-0-1)+1]=1 \quad (261\text{-}1)$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)][((2\times f)-\alpha_{\#(2d+1),w,y}-1)+1]=1 \quad (261\text{-}2)$$

When $(2\times f)-\alpha_{\#(2d+1),w,y}-1<0$:

$$H_{x,w,comp}[2\times(2\times f)][((2\times f)-\alpha_{\#(2d+1),w,y}-1)+1+(2\times m\times z)]=1 \quad (261\text{-}3)$$

For all v being an integer no smaller than one and no greater than 2×m×z satisfying $\{v\neq((2\times f)-0-1)+1\}$, $\{v\neq((2\times f)-\alpha_{\#(2d+1),w,y}-1)+1\}$, and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)][v]=0 \quad (261\text{-}4)$$

Further, the following holds true for $H_{x,3,comp}[2\times(2\times f)][v]$. In the following, y is an integer no smaller than $R_{\#(2d+1),3}+1$ and no greater than $r_{\#(2d+1),3}$.

[Math. 522]

When $(2\times f)-\alpha_{\#(2d+1),3,y}-1\geq 0$:

$$H_{x,3,comp}[2\times(2\times f)][((2\times f)-\alpha_{\#(2d+1),3,y}-1)+1]=1 \quad (262\text{-}1)$$

When $(2\times f)-\alpha_{\#(2d+1),3,y}-1<0$:

$$H_{x,3,comp}[2\times(2\times f)][((2\times f)-\alpha_{\#(2d+1),3,y}-1)+1+(2\times m\times z)]=1 \quad (262\text{-}2)$$

For all v being an integer no smaller than one and no greater than 2×m×z satisfying $\{v\neq((2\times f)-\alpha_{\#(2d+1),3,y}-1)+1\}$, and $\{v\neq((2\times f)-\alpha_{\#(2d+1),3,y}-1)+1+(2\times m\times z)\}$ (where y is an integer no smaller than $R_{\#(2d+1),3}+1$ and no greater than $r_{\#(2d+1),3}$), the following holds true:

$$H_{x,3,comp}[2\times(2\times f)][v]=0 \quad (262\text{-}3)$$

Considered in a similar manner, the following holds true for $H_{x,\Omega,comp}[2\times(2\times f)][v]$. In the following, Ω is an integer no smaller than three and no greater than five, and y is an integer no smaller than $R_{\#(2d+1),\Omega}+1$ and no greater than $r_{\#(2d+1),\Omega}$.

[Math. 523]

When $(2\times f)-\alpha_{\#(2d+1),\Omega,y}-1\geq 0$:

$$H_{x,\Omega,comp}[2\times(2\times f)][((2\times f)-\alpha_{\#(2d+1),\Omega,y}-1)+1]=1 \quad (263\text{-}1)$$

When $(2\times f)-\alpha_{\#(2d+1),\Omega,y}-1\geq 0$:

$$H_{x,\Omega,comp}[2\times(2\times f)][((2\times f)-\alpha_{\#(2d+1),\Omega,y}-1)+1+(2\times m\times z)]=1 \quad (263\text{-}2)$$

For all v being an integer no smaller than one and no greater than 2×m×z satisfying $\{v\neq(2\times f)-\alpha_{\#(2d+1),\Omega,y}-1)+1\}$ and $\{v\neq((2\times f)-\alpha_{\#(2d+1),\Omega,y}1)+1+(2\times m\times z)\}$ (where y is an integer no smaller than $R_{\#(2d+1),\Omega}+1$ and no greater than $r_{\#(2d+1),\Omega}$), the following holds true:

$$H_{x,\Omega,comp}[2\times(2\times f)][v]=0 \quad (263\text{-}3)$$

Further, the following holds true for $H_{p1,comp}[2\times(2\times f)][v]$.

[Math. 524]

When $(2\times f)-\beta_{\#(2d+1),2}-1\geq 0$:

$$H_{p1,comp}[2\times(2\times f)][((2\times f)-\beta_{\#(2d+1),2}-1)+1]=1 \quad (264\text{-}1)$$

When $(2\times f)-\beta_{\#(2d+1),2}-1<0$:

$$H_{p1,comp}[2\times(2\times f)][((2\times f)-\beta_{\#(2d+1),2}-1)+1+(2\times m\times z)]=1 \quad (264\text{-}2)$$

For all v being an integer no smaller than one and no greater than 2×m×z satisfying $\{v\neq((2\times f)-\beta_{\#(2d+1),2}-1)+1\}$ and $\{v\neq((2\times f)-\beta_{\#(2d+1),2}-1)+1+(2\times m\times z)\}$, the following holds true:

$$H_{p1,comp}[2\times(2\times f)][v]=0 \quad (264\text{-}3)$$

Further, the following holds true for $H_{p2,comp}[2\times(2\times f)][v]$.

[Math. 525]

$$H_{p2,comp}[2\times(2\times f)][((2\times f)-0-1)+1]=1 \quad (265\text{-}1)$$

For all v being an integer no smaller than one and no greater than 2×m×z satisfying $\{v\neq((2\times f)-0-1)+1\}$, the following holds true:

$$H_{p2,comp}[2\times(2\times f)][v]=0 \quad (265\text{-}2)$$

Further, (8) when g=2×f (where f is an integer no smaller than one and no greater than m×z), when a vector for row 2×(2×f) of the parity check matrix $H_{pro\_m}$, which is for the LDPC-CC of coding rate 5/7 that uses an improved tail-biting scheme (an LDPC block code using an LDPC-CC), can be generated by using a parity check polynomial satisfying zero provided by expression (198-2-2), ((2×f)−1) %2m=2d+1 holds true. Accordingly, a parity check polynomial satisfying zero of expression (198-2-2) where 2i+1=2d+1 holds true (where d is an integer no smaller than zero and no greater than m−1).

Accordingly, components $H_{x,1,comp}[2\times g][v]=H_{x,1,comp}[2\times(2\times f)][v]$, $H_{x,2,comp}[2\times g][v]=H_{x,2,comp}[2\times(2\times f)][v]$, $H_{x,3,comp}[2\times g][v]=H_{x,3,comp}[2\times(2\times f)][v]$, $H_{x,4,comp}[2\times g][v]=H_{x,4,comp}[2\times(2\times f)][v]$, $H_{x,5,comp}[2\times g][v]=H_{x,5,comp}[2\times(2\times f)][v]$, $H_{p1,comp}[2\times g][v]=H_{p1,comp}[2\times(2\times f)][v]$, and $H_{p2,comp}[2\times g][v]=H_{p2,comp}[2\times(2\times f)][v]$ in row 2×g, or that is, row 2×(2×f) of the parity check matrix $H_{pro\_m}$, which is for the LDPC-CC of coding rate 5/7 that uses an improved tail-biting scheme (an LDPC block code using an LDPC-CC), is expressed as follows.

The following holds true for $H_{x,1,comp}[2\times(2\times f)][v]$.

[Math. 526]

$$H_{x,1,comp}[2\times(2\times f)][((2\times f)-0-1)+1]=1 \quad (266\text{-}1)$$

When y is an integer no smaller than one and no greater than $R_{\#(2d+1),1}$, and $(2\times f)-\alpha_{\#(2d+1),1,y}-1<0$:

$$H_{x,1,comp}[2\times(2\times f)][((2\times f)-\alpha_{\#(2d+1),1,y}-1)+1]=1 \quad (266\text{-}2)$$

When $(2\times f)-\alpha_{\#(2d+1),1,y}-1<0$:

$$H_{x,1,comp}[2\times(2\times f)][((2\times f)-\alpha_{\#(2d+1),1,y}-1)+1+(2\times m\times z)]=1 \quad (266\text{-}3)$$

For all v being an integer no smaller than one and no greater than 2×m×z satisfying {v≠((2×f)−0−1)+1}, {v≠((2×f)−$\alpha_{\#(2d+1),1,y}$−1)+1}, and {v≠((2×f)−$\alpha_{\#(2d+1),1,y}$−1)+1+(2×m×z)} (where y is an integer no smaller than one and no greater than $R_{\#(2d+1),1}$), the following holds true:

$$H_{x,1,comp}[2\times(2\times f)][v]=0 \tag{266-4}$$

Considered in a similar manner, the following holds true for $H_{x,w,comp}$[2×(2×f)][v]. In the following, w is an integer no smaller than one and no greater than two.

[Math. 527]

$$H_{x,w,comp}[2\times(2\times f)][((2\times f)-0-1)+1]=1 \tag{267-1}$$

When y is an integer no smaller than one and no greater than $R_{\#(2d+1),w}$, and (2×f)−$\alpha_{\#(2d+1),w,y}$−1≥0:

$$H_{x,w,comp}[2\times(2\times f)][((2\times f)-\alpha_{\#(2d+1),w,y}-1)+1]=1 \tag{267-2}$$

When (2×f)−$\alpha_{\#(2d+1),w,y}$−1<0:

$$H_{x,w,comp}[2\times(2\times f)][((2\times f)-\alpha_{\#(2d+1),w,y}-1)+1+(2\times m\times z)]=1 \tag{267-3}$$

For all v being an integer no smaller than one and no greater than 2×m×z satisfying {v≠((2×f)−0−1)+1}, {v≠((2×f)−$\alpha_{\#(2d+1),w,y}$−1)+1} and {v≠((2×f)−$\alpha_{\#(2d+1),w,y}$−1)+1+(2×m×z)} (where y is an integer no smaller than one and no greater than $R_{\#(2d+1),w}$), the following holds true:

$$H_{x,w,comp}[2\times(2\times f)][v]=0 \tag{267-4}$$

Further, the following holds true for $H_{x,3,comp}$[2×(2×f)][v]. In the following, y is an integer no smaller than $R_{\#(2d+1),3}$+1 and no greater than $r_{\#(2d+1),3}$.

[Math. 528]

When (2×f)−$\alpha_{\#(2d+1),3,y}$−1≥0:

$$H_{x,3,comp}[2\times(2\times f)][((2\times f)-\alpha_{\#(2d+1),3,y}-1)+1]=1 \tag{268-1}$$

When (2×f)−$\alpha_{\#(2d+1),3,y}$−1<0:

$$H_{x,3,comp}[2\times(2\times f)][((2\times f)-\alpha_{\#(2d+1),3,y}-1)+1+(2\times m\times z)]=1 \tag{268-2}$$

For all v being an integer no smaller than one and no greater than 2×m×z satisfying {v≠((2×f)−$\alpha_{\#(2d+1),3,y}$−1)+1}, and {v≠((2×f)−$\alpha_{\#(2d+1),3,y}$−1)+1+(2×m×z)} (where y is an integer no smaller than $R_{\#(2d+1),3}$+1 and no greater than $r_{\#(2d+1),3}$), the following holds true:

$$H_{x,3,comp}[2\times(2\times f)][v]=0 \tag{268-3}$$

Considered in a similar manner, the following holds true for $H_{x,\Omega,comp}$[2×(2×f)][v]. In the following, Ω is an integer no smaller than three and no greater than five, and y is an integer no smaller than $R_{\#(2d+1),\Omega}$+1 and no greater than $r_{\#(2d+1),\Omega}$.

[Math. 529]

When (2×f)−$\alpha_{\#(2d+1),\Omega,y}$−1≥0:

$$H_{x,\Omega,comp}[2\times(2\times f)][((2\times f)-\alpha_{\#(2d+1),\Omega,y}-1)+1]=1 \tag{269-1}$$

When (2×f)−$\alpha_{\#(2d+1,\Omega,y}$−1<0:

$$H_{x,\Omega,comp}[2\times(2\times f)][((2\times f)-\alpha_{\#(2d+1),\Omega,y}-1)+1+(2\times m\times z)]=1 \tag{269-2}$$

For all v being an integer no smaller than one and no greater than 2×m×z satisfying {v≠(2×f)−$\alpha_{\#(2d+1),\Omega,y}$−1)+1} and {v≠(2×f)−$\alpha_{\#(2d+1),\Omega,y}$−1)+1+(2×m×z)} (where y is an integer no smaller than $R_{\#(2d+1),\Omega}$+1 and no greater than $r_{\#(2d+1),\Omega}$), the following holds true:

$$H_{x,\Omega,comp}[2\times(2\times f)][v]=0 \tag{269-3}$$

Further, the following holds true for $H_{p1,comp}$[2×(2×f)][v].

[Math. 530]

For all v being an integer no smaller than one and no greater than 2×m×z, the following holds true:

$$H_{p1,comp}[2\times(2\times f)][v]=0 \tag{270}$$

Further, the following holds true for $H_{p2,comp}$[2×(2×f)][v].

[Math. 531]

$$H_{p2,comp}[2\times(2\times f)][((2\times f)-0-1)+1]=1 \tag{271-1}$$

When (2×f)−$\beta_{\#(2d+1),3}$−1≥0:

$$H_{p2,comp}[2\times(2\times f)][((2\times f)-\beta_{\#(2d+1),3}-1)+1]=1 \tag{271-2}$$

When (2×f)−$\beta_{\#(2d+1),3}$−1<0:

$$H_{p2,comp}[2\times(2\times f)-\beta_{\#(2d+1),3}-1)+1+(2\times m\times z)]=1 \tag{271-3}$$

For all v being an integer no smaller than one and no greater than 2×m×z satisfying {v≠((2×f)−0−1)+1}, {v≠((2×f)−$\beta_{\#(2d+1),3}$−1)+1}, and {v≠((2×f)−$\beta_{\#(2d+1),3}$−1)+1+(2×m×z)} the following holds true:

$$H_{p2,comp}[2\times(2\times f)][v]=0 \tag{271-4}$$

An LDPC-CC of coding rate 5/7 that uses an improved tail-biting scheme (an LDPC block code using an LDPC-CC) can be generated as described above, and the code so generated achieves high error correction capability.

In the above, parity check polynomials satisfying zero for the LDPC-CC of coding rate 5/7 that uses an improved tail-biting scheme (an LDPC block code using an LDPC-CC) are set as follows:

the 0th parity check polynomial satisfying zero is a parity check polynomial satisfying zero of #0'; first expression provided by expression 205;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

Based on this, the following method is conceivable as a configuration where usage of parity check polynomials satisfying zero is limited.

In this configuration, parity check polynomials satisfying zero for the LDPC-CC of coding rate 5/7 that uses an improved tail-biting scheme (an LDPC block code using an LDPC-CC) are set as follows:

the 0th parity check polynomial satisfying zero is a parity check polynomial satisfying zero of #0'; first expression provided by expression 205;

the first parity check polynomial satisfying zero is a parity check polynomial satisfying zero of #0; second expression provided by expression (197-2-1);

the 2×i−2th parity check polynomial satisfying zero is a parity check polynomial satisfying zero of #((i−1)%2m); first expression provided by expression (197-1-1) or expression (198-1-1); and the 2×i−1th parity check polynomial satisfying zero is a parity check polynomial satisfying zero of #((i−1)%2m); second expression provided by expression (197-2-1) or expression (198-2-1) (where i is an integer no smaller than two and no greater than 2×m×z).

Accordingly, in the parity check matrix $H_{pro\_m}$ for the LDPC-CC of coding rate 5/7 that uses an improved tail-biting scheme (an LDPC block code using an LDPC-CC):

the vector composed of row one of the parity check matrix $H_{pro\_m}$ is generated by using a parity check polynomial satisfying zero of #0'; first expression provided by expression 205;

the vector composed of row two of the parity check matrix $H_{pro\_m}$ is generated by using a parity check polynomial satisfying zero of #0; second expression provided by expression (197-2-1);

the vector composed of row 2×g−1 of the parity check matrix $H_{pro\_m}$ is generated by using a parity check polynomial satisfying zero of #((g−1)%2m); first expression provided by expression (197-1-1) or expression (198-1-1); and the vector composed of row 2×g of the parity check matrix $H_{pro\_m}$ is generated by using a parity check polynomial satisfying zero of #((g−1)%2m); second expression provided by expression (197-2-1) or expression (198-2-1) (where g is an integer no smaller than two and no greater than 2×m×z).

Note that when making such a configuration, the above-described method of configuring the parity check matrix $H_{pro}$ for the LDPC-CC of coding rate 5/7 that uses an improved tail-biting scheme (an LDPC block code using an LDPC-CC) is applicable.

Such a method also enables generating a code with high error correction capability.

Embodiment E5

In embodiment E4, description is provided of an LDPC-CC of coding rate 5/7 that uses an improved tail-biting scheme (an LDPC block code using an LDPC-CC) and a method of configuring a parity check matrix for the code.

With regards to parity check matrices for low density parity check (block) codes, one example of which is the LDPC-CC of coding rate 5/7 that uses an improved tail-biting scheme (an LDPC block code using an LDPC-CC), a parity check matrix equivalent to a parity check matrix defined for a given LDPC code can be generated by using the parity check matrix defined for the given LDPC code.

For example, a parity check matrix equivalent to the parity check matrix $H_{pro\_m}$ described in embodiment E4, which is for the LDPC-CC of coding rate 5/7 that uses an improved tail-biting scheme (an LDPC block code using an LDPC-CC), can be generated by using the parity check matrix $H_{pro\_m}$.

The following describes a method of generating a parity check matrix equivalent to a parity check matrix defined for a given LDPC by using the parity check matrix defined for the given LDPC code.

Note that the method of generating an equivalent parity check matrix described in the present embodiment is not only applicable to the LDPC-CC of coding rate 5/7 that uses an improved tail-biting scheme (an LDPC block code using an LDPC-CC) described in embodiment E4, but also is widely applicable to LDPC codes in general.

FIG. 31 illustrates the configuration of a parity check matrix H for an LDPC (block) code of coding rate (N−M)/N (N>M>0). For example, the parity check matrix of FIG. 31 has M rows and N columns. Here, to provide a general description, the parity check matrix H in FIG. 31 is considered to be a parity check matrix for defining an LDPC (block) code #A of coding rate (N−M)/N (N>M>0).

In FIG. 31, a transmission sequence (codeword) for block j is $v_j^T=(Y_{j,1}, y_{j,2}, Y_{j,3}, \ldots, Y_{j,N-2}, Y_{j,N-1}, Y_{j,N})$ (for systematic codes, $Y_{j,k}$ (where k is an integer no smaller than one and no greater than N) is information X or parity P (parity $P_{pro}$)).

Here, $Hv_j=0$ holds true (where the zero in $Hv_j=0$ indicates that all elements of the vector $Hv_j$ are zeroes. That is, row k of the vector $Hv_j$ has a value of zero for all k (where k is an integer no smaller than one and no greater than M)).

Then, an element of row k (where k is an integer no smaller than one and no greater than N) of the transmission sequence $v_j$ of block j (in FIG. 31, an element of column k in the transpose matrix $v_j^T$ of the transmission sequence $v_j$) is $Y_{j,k}$, and a vector obtained by extracting column k of the parity check matrix H for the LDPC (block) code #A of coding rate (N−M)/N (N>M>0) can be expressed as $c_k$, as illustrated in FIG. 31. Here, the parity check matrix H is expressed as follows.

[Math. 532]

$$H=[c_1 c_2 c_3 \ldots c_{N-2} c_{N-1} c_N] \tag{272}$$

FIG. 32 illustrates a configuration when interleaving is applied to the transmission sequence (codeword) $v_j^T=Y_{j,1}, Y_{j,2}, Y_{j,3}, \ldots, Y_{j,N-2}, Y_{j,N-1}, Y_{j,N})$ of block j. In FIG. 32, an encoding section 3202 receives information 3201 as input, performs encoding thereon, and outputs encoded data 3203. For example, when encoding the LDPC (block) code #A of coding rate (N−M)/N (N>M>0), the encoder 3202 receives information in block j as input, performs encoding thereon based on the parity check matrix H for the LDPC (block) code #A of coding rate (N−M)/N (N>M>0), and outputs the transmission sequence (codeword) $v_j^T=Y_{j,1}, Y_{j,2}, y_{j,3}, \ldots, Y_{j,N-1} Y_{j,N-2}, Y_{j,N})$ of block j.

Then, an accumulation and reordering section (interleaving section) 3204 receives the encoded data 3203 as input, accumulates the encoded data 3203, performs reordering thereon, and outputs interleaved data 3205. Accordingly, the accumulation and reordering section (interleaving section) 3204 receives the transmission sequence $v_j=(Y_{j,1}, Y_{j,2}, Y_{j,3}, \ldots, Y_{j,N-2}, Y_{j,N-1}, Y_{j,N})^T$ of block j as input, and outputs a transmission sequence (codeword) $v'_j=(Y_{j,32}, Y_{j,99}, Y_{j,23}, \ldots, Y_{j,234}, Y_{j,3}, Y_{j,43})^T$, which is illustrated in FIG. 32, as a result of reordering being performed on the elements of the transmission sequence $v_j$ ($v'_j$, being an example). Here, as discussed above, the transmission sequence $v'_j$ is obtained by reordering the elements of the transmission sequence $v_j$ of block j. Accordingly, $v'_j$ is a vector having one row and n columns, and the N elements of $v'_j$ are such that one each of the terms $Y_{j,1}, Y_{j,2}, Y_{j,3}, \ldots, Y_{j,N-2}, Y_{j,N-1}, Y_{j,N}$ is present.

Here, an encoding section 3207 as shown in FIG. 32 having the functions of the encoding section 3202 and the accumulation and reordering section (interleaving section) 3204 is considered. Accordingly, the encoding section 3207 receives the information 3201 as input, performs encoding thereon, and outputs the encoded data 3203. For example, the encoding section 3207 receives information in block j as input, and as shown in FIG. 32, outputs the transmission sequence (codeword) $V'_j(Y_{j,32}, Y_{j,99}, Y_{j,23}, \ldots, Y_{j,234}, Y_{j,3}, Y_{j,43})^T$. In the following, explanation is provided of a parity check matrix H' for the LDPC (block) code of coding rate (N−M)/N (N>M>0) corresponding to the encoding section 3207 (i.e., a parity check matrix H' that is equivalent to the parity check matrix H for the LDPC (block) code #A of coding rate (N−M)/N (N>M>0)), while referring to FIG. 33. (Needless to say, the parity check matrix H' is a parity check matrix for the LDPC (block) code #A of coding rate (N−M)/N (N>M>0).) FIG. 33 shows a configuration of the parity check matrix H', which is a parity check matrix equivalent to the parity check matrix H for the LDPC (block) code #A of coding rate (N−M)/N (N>M>0), when the transmission sequence (codeword) is $v'_j(Y_{j,32}, y_{j,99},$ $Y_{j,23}, \ldots, Y_{j,234}, Y_{j,3}, Y_{j,43})^T$. Here, an element of row one of the transmission sequence $v'_j$ of block j (an element of column one in the transpose matrix $v'^T_j$ of the transmission sequence $v'_j$ in FIG. 33) is $Y_{j,32}$. Accordingly, a vector obtained by extracting column one of the parity check matrix H', when using the above-described vector $c_k$ (k=1, 2, 3, . . . , N−2, N−1, N), is $c_{32}$. Similarly, an element of row two of the transmission sequence $v'_j$ of block j (an element of column two in the transpose matrix $v'^T_j$ of the transmission sequence $v'_j$ in FIG. 33) is $Y_{j,99}$. Accordingly, a vector obtained by extracting column two of the parity check matrix H' is $c_{99}$. Further, as shown in FIG. 33, a vector obtained by extracting column three of the parity check matrix H' is $c_{23}$, a vector obtained by extracting column N−2 of the parity check matrix H' is $c_{234}$, a vector obtained by extracting column N−1 of the parity check matrix H' is $c_3$, and a vector obtained by extracting column N of the parity check matrix H' is $c_{43}$.

That is, when denoting an element of row i of the transmission sequence $v'_j$ of block j (an element of column i in the transpose matrix $v'^T_j$ of the transmission sequence $v'_j$ in FIG. 33) as $Y_{j,g}$ (where g=1, 2, 3, . . . , N−1, N−1, N), then a vector obtained by extracting column i of the parity check matrix H' is $c_g$, when using the vector $c_k$ described above.

Accordingly, the parity check matrix H' for transmission sequence (codeword) $v'_j=(Y_{j,32}, Y_{j,99}, Y_{j,23}, y_{j,234}, Y_{j,3}, Y_{j,43})^T$ is expressed as follows.

[Math. 533]

$$H'=[c_{32}c_{99}c_{23} \ldots c_{234}c_3c_{43}] \quad (273)$$

When denoting an element of row i of the transmission sequence $v'_j$ of block j (an element of column i in the transpose matrix $v'^T_j$ of the transmission sequence $v'_j$ in FIG. 33) as $Y_{j,g}$ (where g=1, 2, 3, . . . , N−1, N−1, N), a vector obtained by extracting column i of the parity check matrix H' is $c_g$, when using the vector $c_k$ described above. When the above is followed to create a parity check matrix, then a parity check matrix for the transmission sequence $v'_j$ of block j can be obtained with no limitation to the above-given example.

Accordingly, when interleaving is applied to the transmission sequence (codeword) of the LDPC (block) code #A of coding rate (N−M)/N (N>M>0), a matrix for the interleaved transmission sequence is obtained by performing reordering of columns (column permutation) as described above on the parity check matrix H for the LDPC (block) code #A of coding rate (N−M)/N (N>M>0).

As such, it naturally follows that the transmission sequence (codeword) ($v_j$) obtained by reverting the interleaved transmission sequence (codeword) ($v'_j$) to its original order is the transmission sequence (codeword) of the LDPC (block) code #A of coding rate (N−M)/N (N>M>0). Accordingly, by reverting the interleaved transmission sequence (codeword) ($v'_j$) and a parity check matrix H' corresponding to the interleaved transmission sequence (codeword) ($v'_j$) to their respective orders, the transmission sequence $v_j$ and a parity check matrix corresponding to the transmission sequence $v_j$ can be obtained, respectively. Further, the parity check matrix obtained by performing the reordering as described above is the parity check matrix H in FIG. 31, description of which has been provided above.

FIG. 34 illustrates an example of a decoding-related configuration of a receiving device, when encoding of FIG. 32 has been performed. The transmission sequence obtained when the encoding of FIG. 32 is performed undergoes processing such as mapping in accordance with a modulation scheme, frequency conversion, and modulated signal amplification, whereby a modulated signal is obtained. A transmitting device transmits the modulated signal. The receiving device then receives the modulated signal transmitted by the transmitting device to obtain a received signal. A log-likelihood ratio calculation section 3400 illustrated in FIG. 34 takes the received signal as input, calculates a log-likelihood ratio for each bit of the codeword, and outputs a log-likelihood ratio signal 3401.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ of block j. Then, the log-likelihood ratio calculation section 3400 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios.

An accumulation and reordering section (deinterleaving section) 3402 receives the log-likelihood ratio signal 3401 as input, performs accumulation and reordering thereon, and outputs a deinterleaved log-likelihood ratio signal 3403.

For example, the accumulation and reordering section (deinterleaving section) 3402 receives, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, performs reordering, and outputs the log-likelihood ratios in the order of: the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order.

A decoder 3404 receives the deinterleaved log-likelihood ratio signal 3403 as input, performs belief propagation (BP) decoding as disclosed in Non-Patent Literature 6 to 8, such as sum-product decoding, min-sum decoding, offset BP decoding, normalized BP decoding, shuffled BP decoding, and layered BP decoding in which scheduling is performed, based on the parity check matrix H for the LDPC (block) code #A of coding rate (N−M)/N (N>M>0) as illustrated in FIG. 31, and thereby obtains an estimation sequence 3405 (note that decoding schemes other than belief propagation decoding may be used).

For example, the decoder 3404 receives, as input, the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order, performs belief propagation decoding based on the parity check matrix H for the LDPC (block) code #A of coding rate (N−M)/N (N>M>0) as illustrated in FIG. 31, and obtains the estimation sequence (note that decoding schemes other than belief propagation decoding may be used).

The following describes a decoding-related configuration that differs from that described above. The decoding-related configuration described in the following differs from the decoding-related configuration described above in that the accumulation and reordering section (deinterleaving section) 3402 is not included. The operations of the log-likelihood ratio calculation section 3400 are similar to those described above, and thus, explanation thereof is omitted in the following.

For example, assume that the transmitting device transmits a transmission sequence (codeword) $v'_j=(Y_{j,32}, Y_{j,99}, Y_{j,23}, \ldots, Y_{j,234}, Y_{j,39}, Y_{j,43})^T$ of block j. Then, the log-likelihood ratio calculation section 3400 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios (corresponding to 3406 in FIG. 34).

A decoder 3407 receives the log-likelihood ratio signal 3406 for each bit as input, performs belief propagation (BP) decoding as disclosed in Non-Patent Literature 6 to 8, such as sum-product decoding, min-sum decoding, offset BP decoding, normalized BP decoding, shuffled BP decoding, and layered BP decoding in which scheduling is performed, based on the parity check matrix H' for the LDPC (block) code #A of coding rate (N−M)/N (N>M>0) as illustrated in FIG. 33, and thereby obtains an estimation sequence 3409 (note that decoding schemes other than belief propagation decoding may be used).

For example, the decoder 3407 receives, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$ in the stated order, performs belief propagation decoding based on the parity check matrix H' for the LDPC (block) code #A of coding rate (N−M)/N (N>M>0) as illustrated in FIG. 33, and obtains the estimation sequence (note that decoding schemes other than belief propagation decoding may be used).

As explained above, even when the transmitted data is reordered due to the transmitting device interleaving the transmission sequence $v_j=(Y_{j,1}, Y_{j,2}, Y_{j,3}, \ldots, Y_{j,N-2}, Y_{j,N-1}, Y_{j,N})^T$ of block j, the receiving device is able to obtain the estimation sequence by using a parity check matrix corresponding to the reordered transmitted data.

Accordingly, when interleaving is applied to the transmission sequence (codeword) of the LDPC (block) code #A of coding rate (N−M)/N (N>M>0), a parity check matrix for the interleaved transmission sequence (codeword) is obtained by performing reordering of columns (i.e., column permutation) as described above on the parity check matrix for the LDPC (block) code #A of coding rate (N−M)/N (N>M>0). As such, the receiving device is able to perform belief propagation decoding and thereby obtain an estimation sequence without performing interleaving on the log-likelihood ratio for each acquired bit.

Note that in the above, explanation is provided of the relation between interleaving applied to a transmission sequence and a parity check matrix. In the following, explanation is provided of reordering of rows (row permutation) performed on a parity check matrix.

FIG. 35 illustrates a configuration of a parity check matrix H corresponding to a transmission sequence (codeword) $v_j^T=(Y_{j,1}, y_{j,2}, y_{j,3}, \ldots, Y_{j,N-2}, Y_{j,N-1}, Y_{j,N})$ of block j of the LDPC (block) code #A of coding rate (N−M)/N (N>M>0). For example, the parity check matrix H of FIG. 35 is a matrix having M rows and N columns. (for systematic codes, $Y_{j,k}$ (where k is an integer no smaller than one and no greater than N) is information X or parity P (parity $P_{pro}$), and is composed of (N−M) information bits and M parity bits). Here, $Hv_j=0$ holds true. (Here, the zero in $Hv_j=0$ indicates that all elements of the vector $Hv_j$ are zeroes. That is, row k of the vector $Hv_j$ has a value of zero for all k (where k is an integer no smaller than one and no greater than M.) Further, a vector obtained by extracting column k (where k is an integer no smaller than one and no greater than M) of the parity check matrix H for the LDPC (block) code #A of coding rate (N−M)/N (N>M>0) as illustrated in FIG. 35 is denoted as $z_k$. Then, the parity check matrix H for the LDPC (block) code is expressed as follows.

[Math. 534]

$$H=\begin{pmatrix} z_1 \\ z_2 \\ \vdots \\ z_{M-1} \\ z_M \end{pmatrix} \tag{274}$$

Next, a parity check matrix obtained by performing reordering of rows (row permutation) on the parity check matrix H of FIG. 35 is considered.

FIG. 36 shows an example of a parity check matrix H' obtained by performing reordering of rows (row permutation) on the parity check matrix H of FIG. 35. The parity check matrix H', similar to the parity check matrix shown in FIG. 35, is a parity check matrix corresponding to the transmission sequence (codeword) $v_j^T=(Y_{j,1}, y_{j,29}\ Y_{j,3}, Y_{j,N-2}, Y_{j,N-1}, Y_{j,N})$ of block j of the LDPC (block) code #A of coding rate (N−M)/N (N>M>0).

The parity check matrix H' of FIG. 36 is composed of vectors $z_k$ obtained by extracting row k (where k is an integer no smaller one and no greater than M) of the parity check matrix H of FIG. 35. For example, in the parity check matrix H', the first row is composed of vector $z_{130}$, the second row is composed of vector $z_{24}$, the third row is composed of vector $z_{45}$, . . . , the (M−2)th row is composed of vector $z_{33}$, the (M−1)th row is composed of vector $z_9$, and the Mth row is composed of vector $z_3$. Note that each of the M row-vectors obtained by extracting row k (where k is an integer no smaller than one and no greater than M) of the parity check matrix H' is such that one each of $z_1, z_2, z_3, \ldots z_{M-2}, z_{M-1}$, and $z_M$ is present.

Here, the parity check matrix H' for the LDPC (block) code #A of coding rate (N−M)/N (N>M>0) is expressed as follows.

[Math. 535]

$$H'=\begin{pmatrix} z_{130} \\ z_{24} \\ \vdots \\ z_9 \\ z_3 \end{pmatrix} \tag{275}$$

Further, $H'v_j=0$ holds true. (Here, the zero in $H'v_j=0$ indicates that all elements of the vector $H'v_j$ are zeroes. That is, row k of the vector $H'v_j$ has a value of zero for all k (where k is an integer no smaller than one and no greater than M.)

That is, for the transmission sequence $v_j^T$ of block j, a vector obtained by extracting row i of the parity check matrix H' in FIG. 36 is expressed as $c_k$ (where k is an integer no smaller than one and no greater than M), and each of the M row vectors obtained by extracting row k (where k is an integer no smaller than one and no greater than M) of the parity check matrix H' in FIG. 36 is such that one each of $z_1, z_2, z_3, \ldots, z_{M-2}, z_{M-1}$, and $z_M$ is present.

As described above, for the transmission sequence $v_j^T$ of block j, a vector obtained by extracting row i of the parity check matrix H' in FIG. 36 is expressed as $c_k$ (where k is an integer no smaller than one and no greater than M), and each of the M row vectors obtained by extracting row k (where k is an integer no smaller than one and no greater than M) of the parity check matrix H' in FIG. 36 is such that one each of $z_1$, $z_2$, $z_3$, . . . , $z_{M-2}$, $z_{M-1}$, and $z_M$ is present. Note that, when the above is followed to create a parity check matrix, then a parity check matrix for the transmission sequence parity $v_j$ of block j can be obtained with no limitation to the above-given example.

Accordingly, even when the LDPC (block) code #A of coding rate (N−M)/N (N>M>0) is being used, it does not necessarily follow that a transmitting device and a receiving device are using the parity check matrix H. As such, a transmitting device and a receiving device may use as a parity check matrix, for example, a matrix obtained by performing reordering of columns (column permutation) as described above on the parity check matrix H or a matrix obtained by performing reordering of rows (row permutation) on the parity check matrix H.

In addition, a matrix obtained by performing both reordering of columns (column permutation) and reordering of rows (row permutation) as described above on the parity check matrix H for the LDPC (block) code #A of coding rate (N−M)/N (N>M>0) may be used as a parity check matrix.

In such a case, a parity check matrix $H_1$ is obtained by performing reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_2$ is obtained by performing reordering of rows (row permutation) on the parity check matrix $H_1$ (i.e., through conversion from the parity check matrix shown in FIG. 35 to the parity check matrix shown in FIG. 36). A transmitting device and a receiving device may perform encoding and decoding by using the parity check matrix $H_2$ so obtained.

Also, a parity check matrix $H_{1,1}$ is obtained by performing a first reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_{2,1}$ may be obtained by performing a first reordering of rows (row permutation) on the parity check matrix $H_{1,1}$ (i.e., through conversion from the parity check matrix shown in FIG. 35 to the parity check matrix shown in FIG. 36).

Further, a parity check matrix $H_{1,2}$ may be obtained by performing a second reordering of columns (column permutation) on the parity check matrix $H_{2,1}$. Finally, a parity check matrix $H_{2,2}$ may be obtained by performing a second reordering of rows (row permutation) on the parity check matrix $H_{1,2}$.

As described above, a parity check matrix $H_{2,s}$ may be obtained by repetitively performing reordering of columns (column permutation) and reordering of rows (row permutation) for s iterations (where s is an integer no smaller than two). In such a case, a parity check matrix $H_{1,k}$ is obtained by performing a kth (where k is an integer no smaller than two and no greater than s) reordering of columns (column permutation) on a parity check matrix $H_{2,k\ 1}$. Then, a parity check matrix $H_{2,k}$ is obtained by performing a kth reordering of rows (row permutation) on the parity check matrix $H_{1,k}$. Note that in the first instance, a parity check matrix $H_{1,1}$ is obtained by performing a first reordering of columns (column permutation) on the parity check matrix H for the LDPC (block) code #A of coding rate (N−M)/N (N>M>0). Then, a parity check matrix $H_{2,1}$ is obtained by performing a first reordering of rows (row permutation) on the parity check matrix $H_{1,1}$.

In such a case, a transmitting device and a receiving device may perform encoding and decoding by using the parity check matrix $H_{2,s}$.

In an alternative method, a parity check matrix $H_3$ is obtained by performing reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_4$ is obtained by performing reordering of columns (column permutation) on the parity check matrix $H_3$ (i.e., through conversion from the parity check matrix shown in FIG. 31 to the parity check matrix shown in FIG. 33). In such a case, a transmitting device and a receiving device may perform encoding and decoding by using the parity check matrix $H_4$ so obtained.

Also, a parity check matrix $H_{3,1}$ is obtained by performing a first reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_{4,1}$ may be obtained by performing a first reordering of columns (column permutation) on the parity check matrix $H_{3,1}$ (i.e., through conversion from the parity check matrix shown in FIG. 31 to the parity check matrix shown in FIG. 33).

Then, a parity check matrix $H_{3,2}$ may be obtained by performing a second reordering of rows (row permutation) on the parity check matrix $H_{4,1}$. Finally, a parity check matrix $H_{4,2}$ may be obtained by performing a second reordering of columns (column permutation) on the parity check matrix $H_{3,2}$.

As described above, a parity check matrix $H_{4,s}$ may be obtained by repetitively performing reordering of rows (row permutation) and reordering of columns (column permutation) for s iterations (where s is an integer no smaller than two). In such a case, a parity check matrix $H_{3,k}$ is obtained by performing a kth (where k is an integer no smaller two and no greater than s) reordering of rows (row permutation) on a parity check matrix $H_{4,k-1}$. Then, a parity check matrix $H_{4,k}$ is obtained by performing a kth reordering of columns (column permutation) on the parity check matrix $H_{3,k}$. Note that in the first instance, a parity check matrix $H_{3,1}$ is obtained by performing a first reordering of rows (row permutation) on the parity check matrix H for the LDPC (block) code #A of coding rate (N−M)/N (N>M>0). Then, a parity check matrix $H_{4,1}$ is obtained by performing a first reordering of columns (column permutation) on the parity check matrix $H_{3,1}$.

In such a case, a transmitting device and a receiving device may perform encoding and decoding by using the parity check matrix $H_{4,s}$.

Here, note that by performing reordering of rows (row permutation) and reordering of columns (column permutation), the parity check matrix H for the LDPC (block) code #A of coding rate (N−M)/N (N>M>0) can be obtained from each of the parity check matrix $H_2$, the parity check matrix $H_{2,s}$, the parity check matrix $H_4$, and the parity check matrix $H_{4,s}$.

Similarly, a matrix obtained by performing both reordering of columns (column permutation) as described above and reordering of rows (row permutation) as described above on the parity check matrix H for the LDPC (block) code #A of coding rate (N−M)/N (N>M>0) may be used as a parity check matrix.

In such a case, a parity check matrix $H_5$ is obtained by performing reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_6$ is obtained by performing reordering of rows (row permutation) on the parity check matrix $H_5$ (i.e., through conversion from the parity check matrix shown in FIG. 35 to the parity check matrix shown in FIG. 36). A transmitting device and a receiving device may perform encoding and decoding by using the parity check matrix $H_6$ so obtained.

Also, a parity check matrix $H_{5,1}$ is obtained by performing a first reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_{6,1}$ may be obtained by performing a first reordering of rows (row permutation) on the parity check matrix $H_{5,1}$ (i.e., through conversion from the parity check matrix shown in FIG. 35 to the parity check matrix shown in FIG. 36).

Further, a parity check matrix $H_{5,2}$ may be obtained by performing a second reordering of columns (column permutation) on the parity check matrix $H_{6,1}$. Finally, a parity check matrix $H_{6,2}$ may be obtained by performing a second reordering of rows (row permutation) on the parity check matrix $H_{5,2}$.

As described above, a parity check matrix $H_{6,s}$ may be obtained by repetitively performing reordering of columns (column permutation) and reordering of rows (row permutation) for s iterations (where s is an integer no smaller than two). In such a case, a parity check matrix $H_{5,k}$ is obtained by performing a kth (where k is an integer no smaller than two and no greater than s) reordering of columns (column permutation) on a parity check matrix $H_{6,k-1}$. Then, a parity check matrix $H_{6,k}$ is obtained by performing a kth reordering of rows (row permutation) on the parity check matrix $H_{5,k}$. Note that in the first instance, a parity check matrix $H_{5,1}$ is obtained by performing a first reordering of columns (column permutation) on the parity check matrix H for the LDPC (block) code #A of coding rate (N−M)/N (N>M>0). Then, a parity check matrix $H_{6,1}$ is obtained by performing a first reordering of rows (row permutation) on the parity check matrix $H_{5,1}$.

In such a case, a transmitting device and a receiving device may perform encoding and decoding by using the parity check matrix $H_{6,s}$.

In an alternative method, a parity check matrix $H_7$ is obtained by performing reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_8$ is obtained by performing reordering of columns (column permutation) on the parity check matrix $H_7$ (i.e., through conversion from the parity check matrix shown in FIG. 31 to the parity check matrix shown in FIG. 33). In such a case, a transmitting device and a receiving device may perform encoding and decoding by using the parity check matrix $H_8$ so obtained.

Also, a parity check matrix $H_{7,1}$ is obtained by performing a first reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_{8,1}$ may be obtained by performing a first reordering of columns (column permutation) on the parity check matrix $H_{7,1}$ (i.e., through conversion from the parity check matrix shown in FIG. 31 to the parity check matrix shown in FIG. 33).

Then, a parity check matrix $H_{7,2}$ may be obtained by performing a second reordering of rows (row permutation) on the parity check matrix $H_{8,1}$. Finally, a parity check matrix $H_{8,2}$ may be obtained by performing a second reordering of columns (column permutation) on the parity check matrix $H_{7,2}$.

As described above, a parity check matrix $H_{8,s}$ may be obtained by repetitively performing reordering of rows (row permutation) and reordering of columns (column permutation) for s iterations (where s is an integer no smaller than two). In such a case, a parity check matrix $H_{7,k}$ is obtained by performing a kth (where k is an integer no smaller two and no greater than s) reordering of rows (row permutation) on a parity check matrix $H_{8,k\ 1}$. Then, a parity check matrix $H_{8,k}$ is obtained by performing a kth reordering of columns (column permutation) on the parity check matrix $H_{7,k}$. Note that in the first instance, a parity check matrix $H_{7,1}$ is obtained by performing a first reordering of rows (row permutation) on the parity check matrix H for the LDPC (block) code #A of coding rate (N−M)/N (N>M>0). Then, a parity check matrix $H_{8,1}$ is obtained by performing a first reordering of columns (column permutation) on the parity check matrix $H_{7,1}$.

In such a case, a transmitting device and a receiving device may perform encoding and decoding by using the parity check matrix $H_{8,s}$.

Here, note that by performing reordering of rows (row permutation) and reordering of columns (column permutation), the parity check matrix H for the LDPC (block) code #A of coding rate (N−M)/N (N>M>0) can be obtained from each of the parity check matrix $H_6$, the parity check matrix $H_{6,s}$, the parity check matrix $H_8$, and the parity check matrix $H_{8,s}$.

In the present embodiment, description is provided of a method of generating a parity check matrix equivalent to a parity check matrix H for the LDPC (block) code #A of coding rate (N−M)/N (N>M>0) by performing reordering of rows (row permutation) and/or reordering of columns (column permutation) with respect to the parity check matrix H. Further, description is provided of a method of applying the equivalent parity check matrix in, for example, a communication/broadcast system using an encoder and a decoder using the equivalent parity check matrix. Note that the error correction code described herein may be applied to various fields, including but not limited to communication/broadcast systems.

Embodiment E6

In the present embodiment, description is provided of a device that uses the LDPC-CC of coding rate 5/7 that uses an improved tail-biting scheme (an LDPC block code using an LDPC-CC), description of which is provided in embodiment E4.

As one example, description is provided of a case where the LDPC-CC of coding rate 5/7 that uses an improved tail-biting scheme (an LDPC block code using an LDPC-CC) is applied to a communication device.

FIG. 22 illustrates the structures of a transmitting device 2200 and a receiving device 2210 in the communication device pertaining to the present embodiment.

An encoder 2201 receives information to be transmitted as input, and is capable of performing various types of encoding (e.g., various coding rates and various block lengths of block codes (for example, in systematic codes, the sum of the number of information bits and the number of parity bits)). In particular, when receiving a specification to perform encoding by using the LDPC-CC of coding rate 5/7 that uses an improved tail-biting scheme (an LDPC block code using an LDPC-CC), the encoder 2201 performs encoding by using the LDPC-CC of coding rate 5/7 that uses an improved tail-biting scheme (an LDPC block code using an LDPC-CC) to calculate parities $P_1$ and $P_2$. Further, the encoder 2201 outputs the information to be transmitted and the parities $P_1$ and $P_2$ as a transmission sequence.

A modulator 2202 receives the transmission sequence, which includes the information to be transmitted and the parities P1 and P2, performs mapping based on a predetermined modulation scheme (for example, BPSK, QPSK, 16QAM, or 64QAM), and outputs a baseband signal. Further, the modulator 2202 may also receive information other than the transmission sequence, which includes the information to be transmitted and the parities $P_1$ and $P_2$, as input, perform mapping, and output a baseband signal. For example, the modulator 2202 may receive control information as input.

The transmitting device outputs a transmission signal after performing predetermined signal processing (e.g., signal processing for generation of an OFDM signal, frequency conversion, amplification) with respect to such signals (e.g., baseband signals, pilot signals). The transmitting device may transmit the transmission signal over a wireless transmission path utilizing electromagnetic waves, or over a wired transmission path utilizing a coaxial cable, a power line, an optical cable, or the like.

The transmission signal is received by the receiving device 2210 after travelling over the transmission path. A receiver 2211 receives a reception signal as input, performs predetermined signal processing (e.g., bandwidth limitation, frequency conversion, signal processing for OFDM, frequency offset estimation, signal detection, channel estimation), and outputs a baseband signal and a channel estimation signal.

A log-likelihood ratio generation section 2212 receives the baseband signal and the channel estimation signal as input (may receive other signals as input), and for example, calculates and outputs a log-likelihood ratio for each bit (may calculate and output a hard value (hard decision value)).

A decoder 2213 receives the log-likelihood ratio for each bit as input, performs belief propagation decoding (e.g., sum-product decoding, scheduled sum-product decoding (Layered BP (belief propagation) decoding), min-sum decoding, Normalized BP decoding, offset BP decoding), and outputs an estimation sequence. The decoder 2213 performs the belief propagation decoding based on the parity check matrix for the LDPC-CC of coding rate 5/7 that uses an improved tail-biting scheme (an LDPC block code using an LDPC-CC).

Although description is provided above taking an example where error correction coding is introduced to a communication device, the error correction coding described above is not limited to being introduced to a communication device, and for example, may be introduced to a storage medium (storage). When making such a modification, information that is to be stored to a storage medium (storage) is encoded by using the LDPC-CC of coding rate 5/7 that uses an improved tail-biting scheme (an LDPC block code using an LDPC-CC), and resultant information and parities are stored to the storage medium (storage).

Further, the LDPC-CC of coding rate 5/7 that uses an improved tail-biting scheme (an LDPC block code using an LDPC-CC) is applicable to any device that requires error correction coding (e.g., a memory, a hard disk).

Note that when using a block code such as the LDPC-CC of coding rate 5/7 that uses an improved tail-biting scheme (an LDPC block code using an LDPC-CC) in a device, there as cases where special processing needs to be executed.

Assume that a block length of the LDPC-CC of coding rate 5/7 that uses an improved tail-biting scheme (an LDPC block code using an LDPC-CC) used in a device is 14000 bits (10000 information bits, and 4000 parity bits).

In such a case, the number of information bits necessary for encoding one block is 10000. Meanwhile, there are cases where the number of bits of information input to an encoding section of the device does not reach 10000. For example, assume a case where only 9000 information bits are input to the encoding section.

Here, it is assumed that the encoding section, in the above-described case, adds 1000 padding bits of information to the 9000 information bits having been input, and performs encoding by using a total of 10000 bits, composed of the 9000 information bits having been input and the 1000 padding bits, to generate 4000 parity bits. Here, assume that all of the 1000 padding bits are known bits. For example, assume that each of the 1000 padding bits is "0".

A transmitting device may output the 9000 information bits having been input, the 1000 padding bits, and the 4000 parity bits. Alternatively, a transmitting device may output the 9000 information bits having been input and the 4000 parity bits.

In addition, a transmitting device may perform puncturing with respect to the 9000 information bits having been input and the 4000 parity bits, and thereby output a number of bits smaller than 13000 in total.

Note that when performing transmission in such a manner, the transmitting device is required to transmit, to a receiving device, information notifying the receiving device that transmission has been performed in such a manner.

As described above, the LDPC-CC of coding rate 5/7 that uses an improved tail-biting scheme (an LDPC block code using an LDPC-CC), description of which is provided in embodiment E4, is applicable to various devices.

Embodiment F1

The present embodiment describes a method of configuring an LDPC-CC of coding rate 7/9 that is based on a parity check polynomial, as one example of an LDPC-CC not satisfying coding rate (n−1)/n.

Bits of information bits $X_1, X_2, X_3, X_4, X_5, X_6, X_7$ and parity bits $P_1, P_2$, at time point j, are expressed $X_{1,j}, X_{2,j}, X_{3,j}, X_{4,j}, X_{5,j}, X_{6,j}, X_{7,j}$; and $P_{1,j}, P_{2,j}$, respectively.

A vector $u_j$, at time point j, is expressed $u_j=X_{1,j}, X_{2,j}, X_{3,j}, X_{4,j}, X_{5,j}, X_{6,j}, X_{7,j}, P_{1,j}, P_{2,j})$.

Given a delay operator D, polynomial expressions of the information bits $X_1, X_2, X_3, X_4, X_5, X_6, X_7$ are $X_1(D)$, $X_2(D)$, $X_3(D)$, $X_4(D)$, $X_5(D)$, $X_6(D)$, $X_7(D)$, and polynomial expressions of the parity bits $P_1, P_2$ are $P_1(D)$, $P_2(D)$.

Further, consideration is given to an LDPC-CC of coding rate 7/9 and time-varying period 2m that is based on a parity check polynomial.

The following mathematical expressions are provided as parity check polynomials satisfying zero for an LDPC-CC of coding rate 7/9 and time-varying period 2m that is based on a parity check polynomial.

First, because two parities $P_1$ and $P_2$ exist, parity check polynomials satisfying zero are provided as described in the following, two for $1\times P_1(D)$ and two for $1\times P_2(D)$.

[Math. 536-1]

$$
\begin{aligned}
&(D^{\alpha\#(2i),1,2}+D^{\alpha\#(2i),1,1}+1)X_1(D)+(D^{\alpha\#(2i),2,2}+D^{\alpha\#(2i),2,1}+1)X_2(D)+\\
&(D^{\alpha\#(2i),3,2}+D^{\alpha\#(2i),3,1}+1)X_3(D)+\left(\sum_{s=3}^{r_{\#(2i),4}}D^{\alpha\#(2i),4,s}\right)X_4(D)+\\
&\left(\sum_{s=3}^{r_{\#(2i),5}}D^{\alpha\#(2i),5,s}\right)X_5(D)+\left(\sum_{s=3}^{r_{\#(2i),6}}D^{\alpha\#(2i),6,s}\right)X_6(D)+\\
&\left(\sum_{s=3}^{r_{\#(2i),7}}D^{\alpha\#(2i),7,s}\right)X_7(D)+P_1(D)+D^{\beta\#(2i),0}P_2(D)=\\
&(D^{\alpha\#(2i),1,2}+D^{\alpha\#(2i),1,1}+1)X_1(D)+\\
&(D^{\alpha\#(2i),2,2}+D^{\alpha\#(2i),2,1}+1)X_2(D)+\\
&(D^{\alpha\#(2i),3,2}+D^{\alpha\#(2i),3,1}+1)X_3(D)+\\
&(D^{\alpha\#(2i),4,r_{\#(2i),4}}+\dots+D^{\alpha\#(2i),4,3})X_4(D)+\\
&(D^{\alpha\#(2i),5,r_{\#(2i),5}}+\dots+D^{\alpha\#(2i),5,3})X_5(D)+\\
&(D^{\alpha\#(2i),6,r_{\#(2i),6}}+\dots+D^{\alpha\#(2i),6,3})X_6(D)+\\
&(D^{\alpha\#(2i),7,r_{\#(2i),7}}+\dots+D^{\alpha\#(2i),7,3})X_7(D)+\\
&P_1(D)+D^{\beta\#(2i),0}P_1(D)=0
\end{aligned}
\tag{97-1-1}
$$

$$
\begin{aligned}
&(D^{\alpha\#(2i),1,2}+D^{\alpha\#(2i),1,1}+1)X_1(D)+(D^{\alpha\#(2i),2,2}+D^{\alpha\#(2i),2,1}+1)X_2(D)+\\
&(D^{\alpha\#(2i),3,2}+D^{\alpha\#(2i),3,1}+1)X_3(D)+\left(\sum_{s=3}^{r_{\#(2i),4}}D^{\alpha\#(2i),4,s}\right)X_4(D)+\\
&\left(\sum_{s=3}^{r_{\#(2i),5}}D^{\alpha\#(2i),5,s}\right)X_5(D)+\left(\sum_{s=3}^{r_{\#(2i),6}}D^{\alpha\#(2i),6,s}\right)X_6(D)+\\
&\left(\sum_{s=3}^{r_{\#(2i),7}}D^{\alpha\#(2i),7,s}\right)X_7(D)+P_1(D)+D^{\beta\#(2i),1}P_1(D)=\\
&(D^{\alpha\#(2i),1,2}+D^{\alpha\#(2i),1,1}+1)X_1(D)+\\
&(D^{\alpha\#(2i),2,2}+D^{\alpha\#(2i),2,1}+1)X_2(D)+\\
&(D^{\alpha\#(2i),3,2}+D^{\alpha\#(2i),3,1}+1)X_3(D)+\\
&(D^{\alpha\#(2i),4,r_{\#(2i),4}}+\dots+D^{\alpha\#(2i),4,3})X_4(D)+\\
&(D^{\alpha\#(2i),5,r_{\#(2i),5}}+\dots+D^{\alpha\#(2i),5,3})X_5(D)+\\
&(D^{\alpha\#(2i),6,r_{\#(2i),6}}+\dots+D^{\alpha\#(2i),6,3})X_6(D)+\\
&(D^{\alpha\#(2i),7,r_{\#(2i),7}}+\dots+D^{\alpha\#(2i),7,3})X_7(D)+\\
&P_1(D)+D^{\beta\#(2i),1}P_1(D)=0
\end{aligned}
\tag{97-1-2}
$$

[Math. 536-2]

$$
\begin{aligned}
&\left(\sum_{s=3}^{r_{\#(2i),1}}D^{\alpha\#(2i),1,s}\right)X_1(D)+\left(\sum_{s=3}^{r_{\#(2i),2}}D^{\alpha\#(2i),2,s}\right)X_2(D)+\\
&\left(\sum_{s=3}^{r_{\#(2i),3}}D^{\alpha\#(2i),3,s}\right)X_3(D)+(D^{\alpha\#(2i),4,2}+D^{\alpha\#(2i),4,1}+1)X_4(D)+\\
&(D^{\alpha\#(2i),5,2}+D^{\alpha\#(2i),5,1}+1)X_5(D)+\\
&(D^{\alpha\#(2i),6,2}+D^{\alpha\#(2i),6,1}+1)X_6(D)+\\
&(D^{\alpha\#(2i),7,2}+D^{\alpha\#(2i),7,1}+1)X_7(D)+P_2(D)+D^{\beta\#(2i),2}P_2(D)=\\
&(D^{\alpha\#(2i),1,r_{\#(2i),1}}+\dots+D^{\alpha\#(2i),1,3})X_1(D)+\\
&(D^{\alpha\#(2i),2,r_{\#(2i),2}}+\dots+D^{\alpha\#(2i),2,3})X_2(D)+\\
&(D^{\alpha\#(2i),3,r_{\#(2i),3}}+\dots+D^{\alpha\#(2i),3,3})X_3(D)+\\
&(D^{\alpha\#(2i),4,2}+D^{\alpha\#(2i),4,1}+1)X_4(D)+\\
&(D^{\alpha\#(2i),5,2}+D^{\alpha\#(2i),5,1}+1)X_5(D)+\\
&(D^{\alpha\#(2i),6,2}+D^{\alpha\#(2i),6,1}+1)X_6(D)+\\
&(D^{\alpha\#(2i),7,2}+D^{\alpha\#(2i),7,1}+1)X_7(D)+\\
&P_2(D)+D^{\beta\#(2i),2}P_1(D)=0
\end{aligned}
\tag{97-2-1}
$$

$$
\begin{aligned}
&\left(\sum_{s=3}^{r_{\#(2i),1}}D^{\alpha\#(2i),1,s}\right)X_1(D)+\left(\sum_{s=3}^{r_{\#(2i),2}}D^{\alpha\#(2i),2,s}\right)X_2(D)+\\
&\left(\sum_{s=3}^{r_{\#(2i),3}}D^{\alpha\#(2i),3,s}\right)X_3(D)+(D^{\alpha\#(2i),4,2}+D^{\alpha\#(2i),4,1}+1)X_4(D)+\\
&(D^{\alpha\#(2i),5,2}+D^{\alpha\#(2i),5,1}+1)X_5(D)+\\
&(D^{\alpha\#(2i),6,2}+D^{\alpha\#(2i),6,1}+1)X_6(D)+\\
&(D^{\alpha\#(2i),7,2}+D^{\alpha\#(2i),7,1}+1)X_7(D)+P_2(D)+D^{\beta\#(2i),3}P_1(D)=\\
&(D^{\alpha\#(2i),1,r_{\#(2i),1}}+\dots+D^{\alpha\#(2i),1,3})X_1(D)+\\
&(D^{\alpha\#(2i),2,r_{\#(2i),2}}+\dots+D^{\alpha\#(2i),2,3})X_2(D)+\\
&(D^{\alpha\#(2i),3,r_{\#(2i),3}}+\dots+D^{\alpha\#(2i),3,3})X_3(D)+\\
&(D^{\alpha\#(2i),4,2}+D^{\alpha\#(2i),4,1}+1)X_4(D)+\\
&(D^{\alpha\#(2i),5,2}+D^{\alpha\#(2i),5,1}+1)X_5(D)+\\
&(D^{\alpha\#(2i),6,2}+D^{\alpha\#(2i),6,1}+1)X_6(D)+\\
&(D^{\alpha\#(2i),7,2}+D^{\alpha\#(2i),7,1}+1)X_7(D)+\\
&P_2(D)+D^{\beta\#(2i),3}P_1(D)=0
\end{aligned}
\tag{97-2-2}
$$

In expressions (97-1-1), (97-1-2), (97-2-1), (97-2-2), i is an integer no smaller than zero and no greater than m−1 (i=0, 1, . . . , m−2, m−1).

In expressions (97-1-1), (97-1-2), (97-2-1), (97-2-2), $\alpha_{\#(2c),p,q}$ (where p is an integer no smaller than one and no greater than seven, q is an integer no smaller than one and no greater than $r_{\#(2c),p}$ (where $r_{\#(2c),p}$ is a natural number)) and $\beta_{\#(2c),0}$ is a natural number, $\beta_{\#(2i),1}$ is a natural number, $\beta_{\#(2c),2}$ is an integer no smaller than zero, and $\beta_{\#(2c),3}$ is a natural number.

Further, y is an integer no smaller than one and no greater than $r_{\#(2c),p}$, z is an integer no smaller than one and no greater than $r_{\#2i,p}$, and $\alpha_{\#(2c),p,y}\alpha_{\#(2c),p,z}$ holds true for $\forall(y, z)$ where y≠z. ∀ is a universal quantifier. (y is an integer no smaller than one and no greater than $r_{\#(2i),p}$, z is an integer no smaller than one and no greater than $r_{\#2i,p}$, and $\alpha_{\#(2c),p,y}\neq\alpha_{\#(2c),p,z}$ holds true for all y and all z satisfying y≠z.)

Note that in the following, to simplify explanation, a parity check polynomial satisfying zero that is expressed by expression (97-1-1) or expression (97-1-2) is referred to as "#(2i); first expression" for realizing a time-varying period 2m, and a parity check polynomial satisfying zero that is expressed by expression (97-2-1) or expression (97-2-2) is referred to as "#(2i); second expression" for realizing a time-varying period 2m.

Thus, for each i, as #(2i); first expression for realizing a time-varying period 2m, a parity check polynomial satisfying zero expressed by either expression (97-1-1) or expression (97-1-2) is prepared.

That is, for i=0, a parity check polynomial satisfying zero provided by expression (97-1-1) where i=0, or a parity check polynomial satisfying zero provided by expression (97-1-2) where i=0 is prepared.

Similarly:

for i=1, a parity check polynomial satisfying zero provided by expression (97-1-1) where i=1, or a parity check polynomial satisfying zero provided by expression (97-1-2) where i=1 is prepared;

for i=2, a parity check polynomial satisfying zero provided by expression (97-1-1) where i=2, or a parity check polynomial satisfying zero provided by expression (97-1-2) where i=2 is prepared;

⋮ for i=z, a parity check polynomial satisfying zero provided by expression (97-1-1) where i=z, or a parity check polynomial satisfying zero provided by expression (97-1-2) where i=z is prepared (where z is an integer no smaller than zero and no greater than m−1); and

⋮ for i=m−1, a parity check polynomial satisfying zero provided by expression (97-1-1) where i=m−1, or a parity check polynomial satisfying zero provided by expression (97-1-2) where i=m−1 is prepared.

Similarly, for each i, as #(2i); second expression for realizing a time-varying period 2m, a parity check polynomial satisfying zero expressed by either expression (97-2-1) or expression (97-2-2) is prepared.

That is, for i=0, a parity check polynomial satisfying zero provided by expression (97-2-1) where i=0, or a parity check polynomial satisfying zero provided by expression (97-2-2) where i=0 is prepared.

Similarly:

for i=1, a parity check polynomial satisfying zero provided by expression (97-2-1) where i=1, or a parity check polynomial satisfying zero provided by expression (97-2-2) where i=1 is prepared;

for i=2, a parity check polynomial satisfying zero provided by expression (97-2-1) where i=2, or a parity check polynomial satisfying zero provided by expression (97-2-2) where i=2 is prepared;

⋮ for i=z, a parity check polynomial satisfying zero provided by expression (97-2-1) where i=z, or a parity check polynomial satisfying zero provided by expression (97-2-2) where i=z is prepared (where z is an integer no smaller than zero and no greater than m−1); and

⋮ for i=m−1, a parity check polynomial satisfying zero provided by expression (97-2-1) where i=m−1, or a parity check polynomial satisfying zero provided by expression (97-2-2) where i=m−1 is prepared.

Similarly, because two parities $P_1$ and $P_2$ exist, parity check polynomials satisfying zero are provided as described in the following, two for $1\times P_1(D)$ and two for $1\times P_2(D)$.

[Math. 537-1]

$$\left(\sum_{s=3}^{r_{\#(2i+1),1}} D^{\alpha\#(2i+1),1,s}\right)X_1(D) + \left(\sum_{s=3}^{r_{\#(2i+1),2}} D^{\alpha\#(2i+1),2,s}\right)X_2(D) + \left(\sum_{s=3}^{r_{\#(2i+1),3}} D^{\alpha\#(2i+1),3,s}\right)X_3(D) + (D^{\alpha\#(2i+1),4,2} + D^{\alpha\#(2i+1),4,1} + 1)X_4(D) + (D^{\alpha\#(2i+1),5,2} + D^{\alpha\#(2i+1),5,1} + 1)X_5(D) + (D^{\alpha\#(2i+1),6,2} + D^{\alpha\#(2i+1),6,1} + 1)X_6(D) + (D^{\alpha\#(2i+1),7,2} + D^{\alpha\#(2i+1),7,1} + 1)X_7(D) + P_1(D) + D^{\beta\#(2i+1),0}P_2(D) = \tag{98-1-1}$$

-continued $$(D^{\alpha\#(2i+1),1,r_{\#(2i+1),1}} + \dots + D^{\alpha\#(2i+1),1,3})X_1(D) + (D^{\alpha\#(2i+1),2,r_{\#(2i+1),2}} + \dots + D^{\alpha\#(2i+1),2,3})X_2(D) + (D^{\alpha\#(2i+1),3,r_{\#(2i+1),3}} + \dots + D^{\alpha\#(2i+1),3,3})X_3(D) + (D^{\alpha\#(2i+1),4,2} + D^{\alpha\#(2i+1),4,1} + 1)X_4(D) + (D^{\alpha\#(2i+1),5,2} + D^{\alpha\#(2i+1),5,1} + 1)X_5(D) + (D^{\alpha\#(2i+1),6,2} + D^{\alpha\#(2i+1),6,1} + 1)X_6(D) + (D^{\alpha\#(2i+1),7,2} + D^{\alpha\#(2i+1),7,1} + 1)X_7(D) + P_1(D) + D^{\beta\#(2i+1),0}P_2(D) = 0$$

$$\left(\sum_{s=3}^{r_{\#(2i+1),1}} D^{\alpha\#(2i+1),1,s}\right)X_1(D) + \left(\sum_{s=3}^{r_{\#(2i+1),2}} D^{\alpha\#(2i+1),2,s}\right)X_2(D) + \left(\sum_{s=3}^{r_{\#(2i+1),3}} D^{\alpha\#(2i+1),3,s}\right)X_3(D) + (D^{\alpha\#(2i+1),4,2} + D^{\alpha\#(2i+1),4,1} + 1)X_4(D) + (D^{\alpha\#(2i+1),5,2} + D^{\alpha\#(2i+1),5,1} + 1)X_5(D) + (D^{\alpha\#(2i+1),6,2} + D^{\alpha\#(2i+1),6,1} + 1)X_6(D) + (D^{\alpha\#(2i+1),7,2} + D^{\alpha\#(2i+1),7,1} + 1)X_7(D) + P_1(D) + D^{\beta\#(2i+1),1}P_1(D) = \tag{98-1-2}$$

$$(D^{\alpha\#(2i+1),1,r_{\#(2i+1),1}} + \dots + D^{\alpha\#(2i+1),1,3})X_1(D) + (D^{\alpha\#(2i+1),2,r_{\#(2i+1),2}} + \dots + D^{\alpha\#(2i+1),2,3})X_2(D) + (D^{\alpha\#(2i+1),3,r_{\#(2i+1),3}} + \dots + D^{\alpha\#(2i+1),3,3})X_3(D) + (D^{\alpha\#(2i+1),4,2} + D^{\alpha\#(2i+1),4,1} + 1)X_4(D) + (D^{\alpha\#(2i+1),5,2} + D^{\alpha\#(2i+1),5,1} + 1)X_5(D) + (D^{\alpha\#(2i+1),6,2} + D^{\alpha\#(2i+1),6,1} + 1)X_6(D) + (D^{\alpha\#(2i+1),7,2} + D^{\alpha\#(2i+1),7,1} + 1)X_7(D) + P_1(D) + D^{\beta\#(2i+1),1}P_1(D) = 0$$

[Math. 537-2]

$$(D^{\alpha\#(2i+1),1,2} + D^{\alpha\#(2i+1),1,1} + 1)X_1(D) + (D^{\alpha\#(2i+1),2,2} + D^{\alpha\#(2i+1),2,1} + 1)X_2(D) + (D^{\alpha\#(2i+1),3,2} + D^{\alpha\#(2i+1),3,1} + 1)X_3(D) + \left(\sum_{s=3}^{r_{\#(2i+1),4}} D^{\alpha\#(2i+1),4,s}\right)X_4(D) + \left(\sum_{s=3}^{r_{\#(2i+1),5}} D^{\alpha\#(2i+1),5,s}\right)X_5(D) + \left(\sum_{s=3}^{r_{\#(2i+1),6}} D^{\alpha\#(2i+1),6,s}\right)X_6(D) + \left(\sum_{s=3}^{r_{\#(2i+1),7}} D^{\alpha\#(2i+1),7,s}\right)X_7(D) + P_2(D) + D^{\beta\#(2i+1),2}P_1(D) = \tag{98-2-1}$$

$$(D^{\alpha\#(2i+1),1,2} + D^{\alpha\#(2i+1),1,1} + 1)X_1(D) + (D^{\alpha\#(2i+1),2,2} + D^{\alpha\#(2i+1),2,1} + 1)X_2(D) + (D^{\alpha\#(2i+1),3,2} + D^{\alpha\#(2i+1),3,1} + 1)X_3(D) + (D^{\alpha\#(2i+1),4,r_{\#(2i+1),4}} + \dots + D^{\alpha\#(2i+1),4,3})X_4(D) + (D^{\alpha\#(2i+1),5,r_{\#(2i+1),5}} + \dots + D^{\alpha\#(2i+1),5,3})X_5(D) + (D^{\alpha\#(2i+1),6,r_{\#(2i+1),6}} + \dots + D^{\alpha\#(2i+1),6,3}) + X_6(D) + (D^{\alpha\#(2i+1),7,r_{\#(2i+1),7}} + \dots + D^{\alpha\#(2i+1),7,3}) + X_7(D) + P_2(D) + D^{\beta\#(2i+1),2}P_1(D) = 0$$

-continued $$(D^{\alpha\#(2i+1),1,2}+D^{\alpha\#(2i+1),1,1}+1)X_1(D)+(D^{\alpha\#(2i+1),2,2}+D^{\alpha\#(2i+1),2,1}+1)X_2(D)+(D^{\alpha\#(2i+1),3,2}+D^{\alpha\#(2i+1),3,1}+1)X_3(D)+\left(\sum_{s=3}^{r_{\#(2i+1),4}} D^{\alpha\#(2i+1),4,s}\right)X_4(D)+\left(\sum_{s=3}^{r_{\#(2i+1),5}} D^{\alpha\#(2i+1),5,s}\right)X_5(D)+\left(\sum_{s=3}^{r_{\#(2i+1),6}} D^{\alpha\#(2i+1),6,s}\right)X_6(D)+\left(\sum_{s=3}^{r_{\#(2i+1),7}} D^{\alpha\#(2i+1),7,s}\right)X_7(D)+P_2(D)+D^{\beta\#(2i+1),3}P_2(D)=(D^{\alpha\#(2i+1),1,2}+D^{\alpha\#(2i+1),1,1}+1)X_1(D)+(D^{\alpha\#(2i+1),2,2}+D^{\alpha\#(2i+1),2,1}+1)X_2(D)+(D^{\alpha\#(2i+1),3,2}+D^{\alpha\#(2i+1),3,1}+1)X_3(D)+(D^{\alpha\#(2i+1),4,r_{\#(2i+1),4}}+\dots+D^{\alpha\#(2i+1),4,3})X_4(D)+(D^{\alpha\#(2i+1),5,r_{\#(2i+1),5}}+\dots+D^{\alpha\#(2i+1),5,3})X_5(D)+(D^{\alpha\#(2i+1),6,r_{\#(2i+1),6}}+\dots+D^{\alpha\#(2i+1),6,3})+X_6(D)+(D^{\alpha\#(2i+1),7,r_{\#(2i+1),7}}+\dots+D^{\alpha\#(2i+1),7,3})+X_7(D)+P_2(D)+D^{\beta\#(2i+1),3}P_2(D)=0 \quad (98\text{-}2\text{-}2)$$

In expressions (98-1-1), (98-1-2), (98-2-1), (98-2-2), i is an integer no smaller than zero and no greater than m−1 (i=0, 1, . . . , m−2, m−1).

In expressions (98-1-1), (98-1-2), (98-2-1), (98-2-2), $\alpha_{\#(2i+1),p,q}$ (where p is an integer no smaller than one and no greater than seven, q is an integer no smaller than one and no greater than $r_{\#(2i+14}$ (where $r_{\#(2i+1),p}$ is a natural number)) and $\beta_{\#(2i+1),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, y is an integer no smaller than one and no greater than $r_{\#(2i+1),p}$, z is an integer no smaller than one and no greater than $r_{\#(2i+1),p}$, and $\alpha_{\#(2i+1),p,z}$ holds true for $^\forall$(y, z) where ∀ is a universal quantifier. (y is an integer no smaller than one and no greater than $r_{\#(2i+1),p}$, z is an integer no smaller than one and no greater than $r_{\#(2i+1),p}$, and $\alpha_{\#(2i+1),p,z}$ holds true for all y and all z satisfying y≠z.)

Note that in the following, to simplify explanation, a parity check polynomial satisfying zero that is expressed by expression (98-1-1) or expression (98-1-2) is referred to as "#(2i+1); first expression" for realizing a time-varying period 2m, and a parity check polynomial satisfying zero that is expressed by expression (98-2-1) or expression (98-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (98-1-1) or expression (98-1-2) is prepared.

That is, for i=0, a parity check polynomial satisfying zero provided by expression (98-1-1) where i=0, or a parity check polynomial satisfying zero provided by expression (98-1-2) where i=0 is prepared.

Similarly:

for i=1, a parity check polynomial satisfying zero provided by expression (98-1-1) where i=1, or a parity check polynomial satisfying zero provided by expression (98-1-2) where i=1 is prepared;

for i=2, a parity check polynomial satisfying zero provided by expression (98-1-1) where i=2, or a parity check polynomial satisfying zero provided by expression (98-1-2) where i=2 is prepared;

⋮ for i=z, a parity check polynomial satisfying zero provided by expression (98-1-1) where i=z, or a parity check polynomial satisfying zero provided by expression (98-1-2) where i=z is prepared (where z is an integer no smaller than zero and no greater than m−1); and

⋮ for i=m−1, a parity check polynomial satisfying zero provided by expression (98-1-1) where i=m−1, or a parity check polynomial satisfying zero provided by expression (98-1-2) where i=m−1 is prepared.

Similarly, for each i, as #(2i+1); second expression for realizing a time-varying period 2m, a parity check polynomial satisfying zero expressed by either expression (98-2-1) or expression (98-2-2) is prepared.

That is, for i=0, a parity check polynomial satisfying zero provided by expression (98-2-1) where i=0, or a parity check polynomial satisfying zero provided by expression (98-2-2) where i=0 is prepared.

Similarly:

for i=1, a parity check polynomial satisfying zero provided by expression (98-2-1) where i=1, or a parity check polynomial satisfying zero provided by expression (98-2-2) where i=1 is prepared;

for i=2, a parity check polynomial satisfying zero provided by expression (98-2-1) where i=2, or a parity check polynomial satisfying zero provided by expression (98-2-2) where i=2 is prepared;

⋮ for i=z, a parity check polynomial satisfying zero provided by expression (98-2-1) where i=z, or a parity check polynomial satisfying zero provided by expression (98-2-2) where i=z is prepared (where z is an integer no smaller than zero and no greater than m−1); and

⋮ for i=m−1, a parity check polynomial satisfying zero provided by expression (98-2-1) where i=m−1, or a parity check polynomial satisfying zero provided by expression (98-2-2) where i=m−1 is prepared.

As such, an LDPC-CC of coding rate 7/9 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (97-1-1) or expression (97-1-2), parity check polynomials satisfying zero provided by expression (97-2-1) or expression (97-2-2), parity check polynomials satisfying zero provided by expression (98-1-1) or expression (98-1-2), and parity check polynomials satisfying zero provided by expression (98-2-1) or expression (98-2-2).

For example, the time varying period 2×m can be formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expressions (97-1-1), (97-1-2), (97-2-1), (97-2-2), (98-1-1), (98-1-2), (98-2-1), and (98-2-2) (where j is an integer no smaller than zero).

The following presumes that 2k=j%2m holds true. In the following, % means a modulo, and for example, α%6 represents a remainder after dividing α by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

The following describes a method of configuring a parity check matrix for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a vector $u_j$ at time point j is expressed as $u_j=(X_{1,j}, X_{2,j}, X_{3,j}, X_{4,j}, X_{5,j}, X_{6,j}, X_{7,j}, P_{1,j}, P_{2,j})$ (where j is an integer no smaller than zero). In the following, a case where u is a transmission vector is considered. Note that in the following, j is an integer no smaller than one, and thus j differs between the description having been provided above and the description provided in the following. (j is set as such to facilitate understanding of the correspondence between the column numbers and the row numbers of the parity check matrix.)

Accordingly, $u=(u_1, u_2, u_3, \ldots, u_{y-1}, u_y, u_{y+1}, \ldots)^T=X_{1,1}, X_{2,1}, X_{3,1}, X_{4,1}, X_{5,1}, X_{6,1}, X_{7,1}, P_{1,1}, P_{2,1}, X_{1,2}, X_{2,2}, X_{3,2}, X_{4,2}, X_{5,2}, X_{6,2}, X_{7,2}, P_{1,2}, P_{2,2}, X_{1,3}, X_{2,3}, X_{3,3}, X_{4,3}, X_{5,3}, X_{6,3}, X_{7,3}, P_{1,3}, P_{2,3}, \ldots, X_{1,y-1}, X_{2,y-1}, X_{3,y-1}, X_{4,y-1}, X_{5,y-1}, X_{6,y-1}, X_{7,y-1}, P_{1,y-1}, P_{2,y-1}, X_{1,y}, X_{2,y}, X_{3,y}, X_{4,y}, X_{5,y}, X_{6,y}, X_{7,y}, P_{1,y}, P_{2,y}, X_{1,y+1}, X_{2,y+1}, X_{3,y+1}, X_{4,y+1}, X_{5,y+1}, X_{6,y+1}, X_{7,y+1}, P_{1,y+1}, P_{2,y+1}, \ldots)^T$. Further, when using H to denote a parity check matrix for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, Hu=0 holds true (here, Hu=0 indicates that all elements of the vector Hu are zeroes).

FIG. 84 indicates a configuration of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the topmost row of the parity check matrix is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

As illustrated in FIG. 84:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression"; and "a vector for the (2×i)th row of the parity check matrix H can be generated from a parity check polynomial satisfying zero of #((i−1)%2m); second expression", and so on (where i is an integer no smaller than one).

FIG. 85 indicates a configuration of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of

#(2i+1); first expression, and an m number of parity check polynomials satisfying zero of #(2i+1); second expression. Accordingly, the leftmost column of the parity check matrix is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

As illustrated in FIG. 85:

"a vector for the first column of the parity check matrix H is related to $X_1$ at time point 1";

"a vector for the second column of the parity check matrix H is related to $X_2$ at time point 1";

"a vector for the third column of the parity check matrix H is related to $X_3$ at time point 1";

"a vector for the fourth column of the parity check matrix H is related to $X_4$ at time point 1";

"a vector for the fifth column of the parity check matrix H is related to $X_5$ at time point 1";

"a vector for the sixth column of the parity check matrix H is related to $X_6$ at time point 1";

"a vector for the seventh column of the parity check matrix H is related to $X_7$ at time point 1";

"a vector for the eighth column of the parity check matrix H is related to $P_1$ at time point 1";

"a vector for the ninth column of the parity check matrix H is related to $P_2$ at time point 1";

⋮

"a vector for the 9×(j−1)+1th column of the parity check matrix H is related to $X_1$ at time point j";

"a vector for the 9×(j−1)+2th column of the parity check matrix H is related to $X_2$ at time point j";

"a vector for the 9×(j−1)+3th column of the parity check matrix H is related to $X_3$ at time point j";

"a vector for the 9×(j−1)+4th column of the parity check matrix H is related to $X_4$ at time point j";

"a vector for the 9×(j−1)+5th column of the parity check matrix H is related to $X_5$ at time point j";

"a vector for the 9×(j−1)+6th column of the parity check matrix H is related to $X_6$ at time point j";

"a vector for the 9×(j−1)+7th column of the parity check matrix H is related to $X_7$ at time point j";

"a vector for the 9×(j−1)+8th column of the parity check matrix H is related to $P_1$ at time point j";

"a vector for the 9×(j−1)+9th column of the parity check matrix H is related to $P_1$ at time point j" and so on (where j is an integer no smaller than one).

Figure 86:
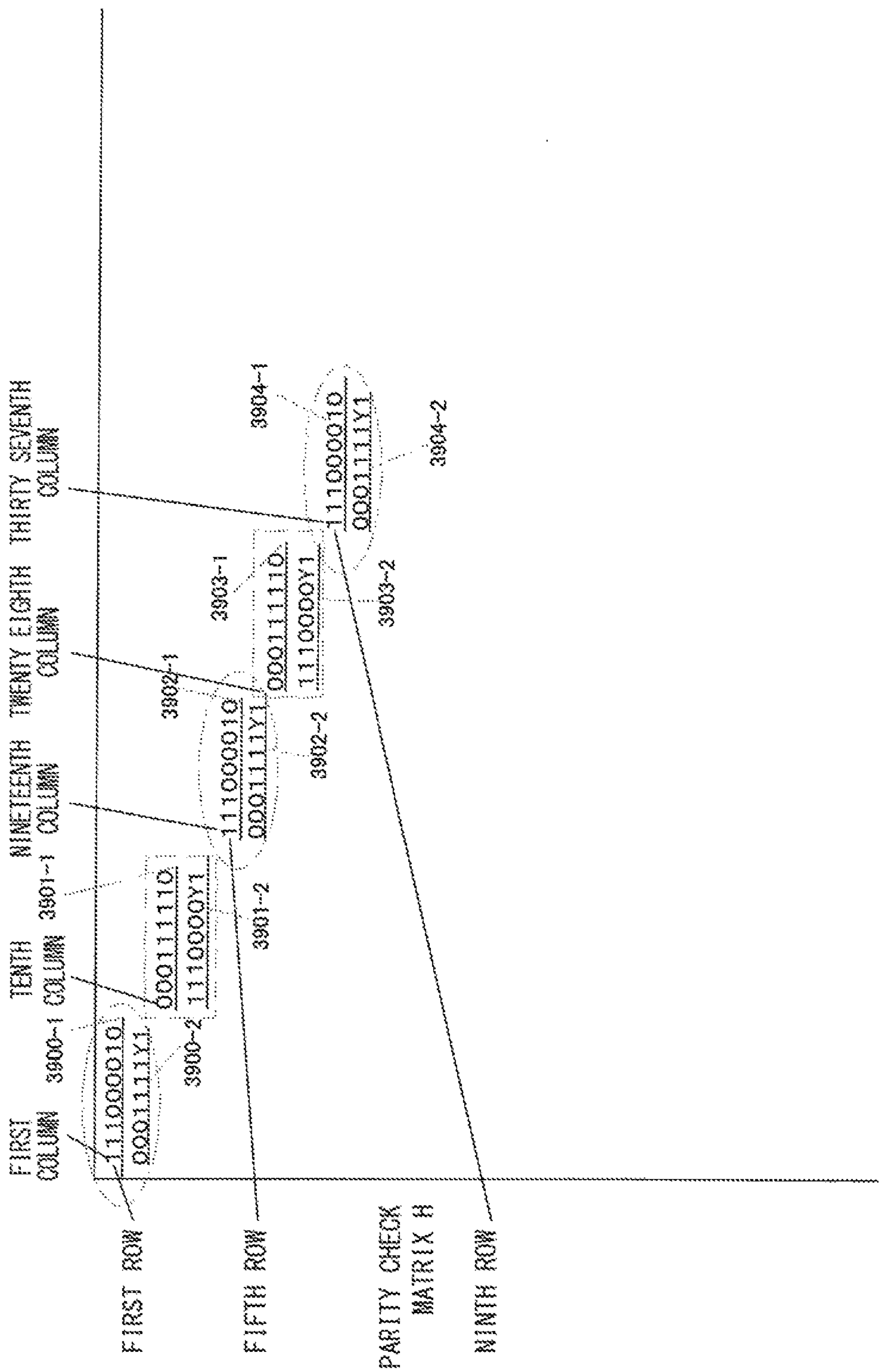
FIG. 86 shows an example of the configuration of check matrix for LDPC-CC of coding rate 7/9 and time-varying period 2×m that is based on a parity check polynomial.

FIG. 86 indicates a parity check matrix for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The following focuses on $1\times X_1(D)$, $1\times X_2(D)$, $1\times X_3(D)$, $1\times X_4(D)$, $1\times X_5(D)$, $1\times X_6(D)$, $1\times X_7(D)$, $1\times P_1(D)$, $1\times P_2(D)$ in the parity check matrix for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The parity check polynomials at time point j=1 are parity check polynomials when i=0 in expressions (97-1-1), (97-1-2), (97-2-1), (97-2-2).

A vector for the first row in FIG. 86 can be generated from a parity check polynomial when i=0 in expression (97-1-1) or expression (97-1-2) (refer to FIG. 84).

In expressions (97-1-1) and (97-1-2):

terms for $1\times X_1(D)$, $1\times X_2(D)$, $1\times X_3(D)$ exist;

terms for $1\times X_4(D)$, $1\times X_5(D)$, $1\times X_6(D)$, $1\times X_7(D)$ do not exist; and a term for $1\times P_1(D)$ exists but a term for $1\times P_2(D)$ does not exist.

Further, the relationship between column numbers and $X_1$, $X_2$, $X_3$, $X_4$, $X_5$, $X_6$, $X_7$, $P_1$, $P_2$ is as indicated in FIG. 85. Based on the relationship indicated in FIG. 85 and the fact that terms for $1\times X_1(D)$, $1\times X_2(D)$, $1\times X_3(D)$ exist, columns related to $X_1$, $X_2$, $X_3$ in the vector for the first row in FIG. 86 are "1". Further, based on the relationship indicated in FIG. 85 and the fact that terms for $1\times X_4(D)$, $1\times X_5(D)$, $1\times X_6(D)$, $1\times X_7(D)$ do not exist, columns related to $X_4$, $X_5$, $X_6$, $X_7$ in the vector for the first row in FIG. 86 are "0". In addition, based on the relationship indicated in FIG. 85 and the fact that a term for $1\times P_1(D)$ exists but a term for $1\times P_2(D)$ does not exist, a column related to $P_1$ in the vector for the first row in FIG. 86 is "1", and a column related to $P_2$ in the vector for the first row in FIG. 86 is "0".

As such, the vector for the first row in FIG. 86 is "111000010", as indicated by 3900-1 in FIG. 86.

A vector for the second row in FIG. 86 can be generated from a parity check polynomial when i=0 in expression (97-2-1) or expression (97-2-2) (refer to FIG. 84).

In expressions (97-2-1) and (97-2-2):

terms for $1\times X_1(D)$, $1\times X_2(D)$, $1\times X_3(D)$ do not exist;

terms for $1\times X_4(D)$, $1\times X_5(D)$, $1\times X_6(D)$, $1\times X_7(D)$ exist; and a term for $1\times P_1(D)$ may or may not exist but a term for $1\times P_2(D)$ exists.

Further, the relationship between column numbers and $X_1$, $X_2$, $X_3$, $X_4$, $X_5$, $X_6$, $X_7$, $P_1$, $P_2$ is as indicated in FIG. 85. Based on the relationship indicated in FIG. 85 and the fact that terms for $1\times X_1(D)$, $1\times X_2(D)$, $1\times X_3(D)$ do not exist, columns related to $X_1$, $X_2$, $X_3$ in the vector for the second row in FIG. 86 are "0". Further, based on the relationship indicated in FIG. 85 and the fact that terms for $1\times X_4(D)$, $1\times X_5(D)$, $1\times X_6(D)$, $1\times X_7(D)$ exist, columns related to $X_4$, $X_5$, $X_6$, $X_7$ in the vector for the second row in FIG. 86 are "1". In addition, based on the relationship indicated in FIG. 85 and the fact that a term for $1\times P_1(D)$ may or may not exist but a term for $1\times P_2(D)$ exists, a column related to $P_1$ in the vector for the second row in FIG. 86 is "Y", and a column related to $P_2$ in the vector for the second row in FIG. 86 is "1", where Y is either "0" or "1".

As such, the vector for the second row in FIG. 86 is "0001111Y1", as indicated by 3900-2 in FIG. 86.

The parity check polynomials at time point j=2 are parity check polynomials when i=0 in expressions (98-1-1), (98-1-2), (98-2-1), (98-2-2).

A vector for the third row in FIG. 86 can be generated from a parity check polynomial when i=0 in expression (98-1-1) or expression (98-1-2) (refer to FIG. 84).

In expressions (98-1-1) and (98-1-2):

terms for $1\times X_1(D)$, $1\times X_2(D)$, $1\times X_3(D)$ do not exist;

terms for $1\times X_4(D)$, $1\times X_5(D)$, $1\times X_6(D)$, $1\times X_7(D)$ exist; and a term for $1\times P_1(D)$ exists but a term for $1\times P_2(D)$ does not exist.

Further, the relationship between column numbers and $X_1$, $X_2$, $X_3$, $X_4$, $X_5$, $X_6$, $X_7$, $P_1$, $P_2$ is as indicated in FIG. 85. Based on the relationship indicated in FIG. 85 and the fact that terms for $1\times X_1(D)$, $1\times X_2(D)$, $1\times X_3(D)$ do not exist, columns related to $X_1$, $X_2$, $X_3$ in the vector for the third row in FIG. 86 are "0". Further, based on the relationship indicated in FIG. 85 and the fact that terms for $1\times X_4(D)$, $1\times X_5(D)$, $1\times X_6(D)$, $1\times X_7(D)$ exist, columns related to $X_4$, $X_5$, $X_6$, $X_7$ in the vector for the third row in FIG. 86 are "1". In addition, based on the relationship indicated in FIG. 85 and the fact that a term for $1\times P_1(D)$ exists but a term for $1\times P_2(D)$ does not exist, a column related to $P_1$ in the vector for the third row in FIG. 86 is "1", and a column related to $P_2$ in the vector for the third row in FIG. 86 is "0".

As such, the vector for the third row in FIG. 86 is "000111110", as indicated by 3901-1 in FIG. 86.

A vector for the fourth row in FIG. 86 can be generated from a parity check polynomial when i=0 in expression (98-2-1) or expression (98-2-2) (refer to FIG. 84).

In expressions (98-2-1) and (98-2-2):

terms for $1\times X_1(D)$, $1\times X_2(D)$, $1\times X_3(D)$ exist;

terms for $1\times X_4(D)$, $1\times X_5(D)$, $1\times X_6(D)$, $1\times X_7(D)$ do not exist; and a term for $1\times P_1(D)$ may or may not exist but a term for $1\times P_2(D)$ exists.

Further, the relationship between column numbers and $X_1$, $X_2$, $X_3$, $X_4$, $X_5$, $X_6$, $X_7$, $P_1$, $P_2$ is as indicated in FIG. 85. Based on the relationship indicated in FIG. 85 and the fact that terms for $1\times X_1(D)$, $1\times X_2(D)$, $1\times X_3(D)$ exist, columns related to $X_1$, $X_2$, $X_3$ in the vector for the fourth row in FIG. 86 are "1". Further, based on the relationship indicated in FIG. 85 and the fact that terms for $1\times X_4(D)$, $1\times X_5(D)$, $1\times X_6(D)$, $1\times X_7(D)$ do not exist, columns related to $X_4$, $X_5$, $X_6$, $X_7$ in the vector for the fourth row in FIG. 86 are "0". In addition, based on the relationship indicated in FIG. 85 and the fact that a term for $1\times P_1(D)$ may or may not exist but a term for $1\times P_2(D)$ exists, a column related to $P_1$ in the vector for the fourth row in FIG. 86 is "Y", and a column related to $P_2$ in the vector for the fourth row in FIG. 86 is "1".

As such, the vector for the fourth row in FIG. 86 is "1110000Y1", as indicated by 3901-2 in FIG. 86.

Because it can be considered that the above similarly applies to cases where time point j=3, 4, 5, the parity check matrix H has the configuration indicated in FIG. 86.

That is, due to the parity check polynomials of expressions (97-1-1), (97-1-2), (97-2-1), (97-2-2) being used at time point j=2k+1 (where k is an integer no smaller than zero), "111000010" exists in the 2×(2k+1)−1th row of the parity check matrix H, and "0001111Y1" exists in the 2×(2k+1)th row of the parity check matrix H, as illustrated in FIG. 86.

Further, due to the parity check polynomials of expressions (98-1-1), (98-1-2), (98-2-1), (98-2-2) being used at time point j=2k+2 (where k is an integer no smaller than zero), "000111110" exists in the 2×(2k+2)−1th row of the parity check matrix H, and "1110000Y1" exists in the 2×(2k+2)th row of the parity check matrix H, as illustrated in FIG. 86.

Accordingly, as illustrated in FIG. 86, when denoting a column number of a leftmost column corresponding to "1" in "111000010" in a row where "111000010" exists (e.g., 3900-1 in FIG. 86) as "a", "000111110" (e.g., 3901-1 in FIG. 86) exists in a row that is two rows below the row where "111000010" exists, starting from column "a+9".

Similarly, as illustrated in FIG. 86, when denoting a column number of a leftmost column corresponding to "1" in "0001111Y1" in a row where "0001111Y1" exists (e.g., 3900-2 in FIG. 86) as "b", "1110000Y1" (e.g., 3901-2 in FIG. 86) exists in a row that is two rows below the row where "0001111Y1" exists, starting from column "b+9".

Similarly, as illustrated in FIG. 86, when denoting a column number of a leftmost column corresponding to "1" in "000111110" in a row where "000111110" exists (e.g., 3901-1 in FIG. 86) as "c", "111000010" (e.g., 3902-1 in FIG. 86) exists in a row that is two rows below the row where "000111110" exists, starting from column "c+9".

Similarly, as illustrated in FIG. 86, when denoting a column number of a leftmost column corresponding to "1" in "1110000Y1" in a row where "1110000Y1" exists (e.g., 3901-2 in FIG. 86) as "d", "0001111Y1" (e.g., 3902-2 in FIG. 86) exists in a row that is two rows below the row where "1110000Y1" exists, starting from column "d+9".

The following describes a parity check matrix for an LDPC-CC of coding rate 7/9 and time-varying period 2×m that is based on a parity check polynomial when tail-biting is not performed, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

In the following, $H_{com}[u][v]$ (where u and v are integers no smaller than one) denotes an element at row "u" column "v" of a parity check matrix for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Based on description above provided with reference to FIG. 84:

"a vector for the 2×g−1th row of the parity check matrix H can be generated from a parity check polynomial satisfying zero of #((g−1)%2m); first expression"; and "a vector for the (2×g)th row of the parity check matrix H can be generated from a parity check polynomial satisfying zero of #((g−1)%2m); second expression" (where g is an integer no smaller than one).

Based on description above provided with reference to FIG. 85:

"a vector for the 9×(j−1)+1th column of the parity check matrix H is related to $X_1$ at time point j";

"a vector for the 9×(j−1)+2th column of the parity check matrix H is related to $X_2$ at time point j";

"a vector for the 9×(j−1)+3th column of the parity check matrix H is related to $X_3$ at time point j";

"a vector for the 9×(j−1)+4th column of the parity check matrix H is related to $X_4$ at time point j";

"a vector for the 9×(j−1)+5th column of the parity check matrix H is related to $X_5$ at time point j";

"a vector for the 9×(j−1)+6th column of the parity check matrix H is related to $X_6$ at time point j";

"a vector for the 9×(j−1)+7th column of the parity check matrix H is related to $X_7$ at time point j";

"a vector for the 9×(j−1)+8th column of the parity check matrix H is related to $P_1$ at time point j";

"a vector for the 9×(j−1)+9th column of the parity check matrix H is related to $P_2$ at time point j"; (where j is an integer no smaller than one).

Based on the above, the following describes component $H_{com}$[2×g−1][v] in row 2×g−1 (where g is an integer no smaller than one) and component $H_{com}$[2×g][v] in row 2×g of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a parity check polynomial satisfying zero of #((g−1)%2m); first expression can be used to generate a vector for row 2×g−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #((g−1)%2m); second expression can be used to generate a vector for row 2×g of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, when g=2×f−1 (where f is an integer no smaller than one), a parity check polynomial satisfying zero of #(((2×f−1)−1)%2m); first expression, or that is, a parity check polynomial satisfying zero of either expression (97-1-1) or expression (97-1-2), can be used to generate a vector for row 2×(2×f−1)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f−1)−1)%2m); second expression, or that is, a parity check polynomial satisfying zero of either expression (97-2-1) or expression (97-2-2), can be used to generate a vector for row 2×(2×f−1) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, when g=2×f (where f is an integer no smaller than one), a parity check polynomial satisfying zero of #(((2×f)−1)%2m); first expression, or that is, a parity check polynomial satisfying zero of either expression (98-1-1) or expression (98-1-2), can be used to generate a vector for row 2×(2×f)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f)−1)%2m); second expression, or that is, a parity check polynomial satisfying zero of either expression (98-2-1) or expression (98-2-2), can be used to generate a vector for row 2×(2×f) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, (1) when g=2×f−1 (where f is an integer no smaller than one), when a vector for row 2×(2×f−1)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-1-1), (2×f−1)−1)%2m=2c holds true. Accordingly, a parity check polynomial satisfying zero of expression (97-1-1) where 2i=2c holds true (where c is an integer no smaller than zero and no greater than m−1).

Accordingly, component $H_{com}$[2×g−1][v]=$H_{com}$[2×(2×f−1)−1][v] in row 2×g−1, or that is, row 2×(2×f−1)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 538]

$$H_{com}[2\times(2\times f-1)-1][9\times((2\times f-1)-0-1)+1]=1 \quad (99\text{-}1)$$

When $(2\times f-1)-\alpha_{\#(2c),1,1}-1\geq 0$:

$$H_{com}[2\times(2\times f-1)-1][9\times((2\times f-1)-\alpha_{\#(2c),1,1}-1)+1]=1 \quad (99\text{-}2)$$

When $(2\times f-1)-\alpha_{\#(2c),1,2}-1\geq 0$:

$$H_{com}[2\times(2\times f--1)-1][9\times((2\times f-1)-\alpha_{\#(2c),1,2}-1)+1]=1 \quad (99\text{-}3)$$

For all u being an integer no smaller than one satisfying $\{u\neq(2\times f-1)-0,\ u\neq(2\times f-1)-\alpha_{\#(2c),1,1},\ \text{and}\ u\neq(2\times f-1)-\alpha_{\#(2c),1,2}\}$:

$$H_{com}[2\times(2\times f-1)-1][9\times(u-1)+1]=0 \quad (99\text{-}4)$$

Considered in a similar manner, the following holds true for $X_w$. In the following, w is an integer no smaller than one and no greater than three.

[Math. 539]

$$H_{com}[2\times(2\times f-1)-1][9\times((2\times f-1)-0-1)+w]=1 \quad (100\text{-}1)$$

When $(2\times f-1)-\alpha_{\#(2c),w,1}-1\geq 0$:

$$H_{com}[2\times(2\times f-1)-1][9\times((2\times f-1)-\alpha_{\#(2c),w,1}-1)+w]=1 \quad (100\text{-}2)$$

When $(2\times f-1)-\alpha_{\#(2c),w,2}-1\geq 0$:

$$H_{com}[2\times(2\times f-1)-1][9\times((2\times f-1)-\alpha_{\#(2c),w,2}-1)+w]=1 \quad (100\text{-}3)$$

For all u being an integer no smaller than one satisfying $\{u\neq(2\times f-1)-0,\ u\neq(2\times f-1)-\alpha_{\#(2c),w,1},\ \text{and}\ u\neq(2\times f-1)-\alpha_{\#(2c),w,2}\}$:

$$H_{com}[2\times(2\times f-1)-1][9\times(u-1)+w]=0 \quad (100\text{-}4)$$

Further, the following holds true for $X_4$. In the following, y is an integer no smaller than three and no greater than $r_{\#(2c),4}$.

[Math. 540]

When $(2\times f-1)-\alpha_{\#(2c),4,y}-1\geq 0$:

$$H_{com}[2\times(2\times f-1)-1][9\times((2\times f-1)-\alpha_{\#(2c),4,y}-1)+4]=1 \quad (101\text{-}1)$$

For all u being an integer no smaller than one satisfying $\{u\neq(2\times f-1)-\alpha_{\#(2c),4,y}\}$ (where y is an integer no smaller than three and no greater than $r_{\#(2c),4}$):

$$H_{com}[2\times(2\times f-1)-1][9\times(u-1)+4]=0 \quad (101\text{-}2)$$

Considered in a similar manner, the following holds true for $X_z$. In the following, z is an integer no smaller than four and no greater than seven, and y is an integer no smaller than three and no greater than $r_{\#(2c),z}$.

[Math. 541]

When $(2\times f-1)-\alpha_{\#(2c),z,y}-1\geq 0$:

$$H_{com}[2\times(2\times f-1)-1][9\times((2\times f-1)-\alpha_{\#(2c),z,y}-1)+z]=1 \quad (102\text{-}1)$$

For all u being an integer no smaller than one satisfying $\{u\neq(2\times f-1)-\alpha_{\#(2c),z,y}\}$ (where y is an integer no smaller than three and no greater than $r_{\#(2c),z}$):

$$H_{com}[2\times(2\times f-1)-1][9\times(u-1)+z]=0 \quad (102\text{-}2)$$

The following holds true for $P_1$.

[Math. 542]

$$H_{com}[2\times(2\times f-1)-1][9\times((2\times f-1)-0-1)+8]=1 \quad (103\text{-}1)$$

For all u being an integer no smaller than one satisfying $\{u\neq(2\times f-1)-0\}$:

$$H_{com}[2\times(2\times f-1)-1][9\times(u-1)+8]=0 \quad (103\text{-}2)$$

The following holds true for $P_2$.

[Math. 543]

When $(2\times f-1)-\beta_{\#(2c),0}-1\geq 0$:

$$H_{com}[2\times(2\times f-1)-1][9\times((2\times f-1)-\beta_{\#(2c),0}-1)+9]=1 \quad (104\text{-}1)$$

For all u being an integer no smaller than one satisfying $\{u\neq(2\times f-1)-\beta_{\#(2c),0}\}$:

$$H_{com}[2\times(2\times f-1)-1][9\times(u-1)+9]=0 \quad (104\text{-}2)$$

Further, (2) when g=2×f−1 (where f is an integer no smaller than one), when a vector for row 2×(2×f−1)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-1-2), ((2×f−1)−1)%2m=2c holds true. Accordingly, a parity check polynomial satisfying zero of expression (97-1-2) where 2i=2c holds true (where c is an integer no smaller than zero and no greater than m−1).

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 544]

$$H_{com}[2\times(2\times f-1)-1][9\times((2\times f-1)-0-1)+1]=1 \quad (105\text{-}1)$$

When $(2\times f-1)-\alpha_{\#(2c),1,1}-1\geq 0$:

$$H_{com}[2\times(2\times f-1)-1][9\times((2\times f-1)-\alpha_{\#(2c),1,1}-1)+1]=1 \quad (105\text{-}2)$$

When $(2\times f-1)-\alpha_{\#(2c),1,2}-1\geq 0$:

$$H_{com}[2\times(2\times f-1)-1][9\times((2\times f-1)-\alpha_{\#(2c),1,2}-1)+1]=1 \quad (105\text{-}3)$$

For all u being an integer no smaller than one satisfying $\{u\neq(2\times f-1)-0,\ u\neq(2\times f-1)-\alpha_{\#(2c),1,1},\ \text{and}\ u\neq(2\times f-1)-\alpha_{\#(2c),1,2}\}$:

$$H_{com}[2\times(2\times f-1)-1][9\times(u-1)+1]=0 \quad (105\text{-}4)$$

Considered in a similar manner, the following holds true for $X_w$. In the following, w is an integer no smaller than one and no greater than three.

[Math. 545]

$$H_{com}[2\times(2\times f-1)-1][9\times((2\times f-1)-0-1)+w]=1 \quad (106\text{-}1)$$

When $(2\times f-1)-\alpha_{\#(2c),w,1}-1\geq 0$:

$$H_{com}[2\times(2\times f-1)-1][9\times((2\times f-1)-\alpha_{\#(2c),w,1}-1)+w]=1 \quad (106\text{-}2)$$

When $(2\times f-1)-\alpha_{\#(2c),w,2}-1\geq 0$:

$$H_{com}[2\times(2\times f-1)-1][9\times((2\times f-1)-\alpha_{\#(2c),w,2}-1)+w]=1 \quad (106\text{-}3)$$

For all u being an integer no smaller than one satisfying $\{u\neq(2\times f-1)-0,\ u\neq(2\times f-1)-\alpha_{\#(2c),w,1},\text{ and } u\neq(2\times f-1)-\alpha_{\#(2c),w,2}\}$:

$$H_{com}[2\times(2\times f-1)-1][9\times(u-1)+w]=0 \quad (106\text{-}4)$$

Further, the following holds true for $X_4$. In the following, y is an integer no smaller than three and no greater than $r_{\#(2c),4}$.

[Math. 546]

When $(2\times f-1)-\alpha_{\#(2c),4,y}-1\geq 0$:

$$H_{com}[2\times(2\times f-1)-1][9\times((2\times f-1)-\alpha_{\#(2c),4,y}-1)+4]=1 \quad (107\text{-}1)$$

For all u being an integer no smaller than one satisfying $\{u\neq(2\times f-1)-\alpha_{\#(2c),4,y}\}$ (where y is an integer no smaller than three and no greater than $r_{\#(2c),4}$):

$$H_{com}[2\times(2\times f-1)-1][9\times(u-1)+4]=0 \quad (107\text{-}2)$$

Considered in a similar manner, the following holds true for $X_z$. In the following, z is an integer no smaller than four and no greater than seven, and y is an integer no smaller than three and no greater than $r_{\#(2c),z}$.

[Math. 547]

When $(2\times f-1)-\alpha_{\#(2c),z,y}-1\geq 0$:

$$H_{com}[2\times(2\times f-1)-1][9\times((2\times f-1)-\alpha_{\#(2c),z,y}-1)+z]=1 \quad (108\text{-}1)$$

For all u being an integer no smaller than one satisfying $\{u\neq(2\times f-1)-\alpha_{\#(2c),z,y}\}$ (where y is an integer no smaller than three and no greater than $r_{\#(2c),z}$):

$$H_{com}[2\times(2\times f-1)-1][9\times(u-1)+z]=0 \quad (108\text{-}2)$$

The following holds true for $P_1$.

[Math. 548]

$$H_{com}[2\times(2\times f-1)-1][9\times((2\times f-1)-0-1)+8]=1 \quad (109\text{-}1)$$

When $(2\times f-1)-\beta_{\#(2c),1}-1\geq 0$:

$$H_{com}[2\times(2\times f-1)-1][9\times((2\times f-1)-\beta_{\#(2c),1}-1)+8]=1 \quad (109\text{-}2)$$

For all u being an integer no smaller than one satisfying $\{u\neq(2\times f-1)-0 \text{ and } u\neq(2\times f-1)-\beta_{\#(2c),1}\}$:

$$H_{com}[2\times(2\times f-1)-1][9\times(u-1)+8]=0 \quad (109\text{-}3)$$

The following holds true for $P_2$.

[Math. 549]

For all u being an integer no smaller than one:

$$H_{com}[2\times(2\times f-1)-1][9\times(u-1)+9]=0 \quad (110)$$

Further, (3) when g=2×f−1 (where f is an integer no smaller than one), when a vector for row 2×(2×f−1) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-2-1), (2×f−1)−1)%2m=2c holds true. Accordingly, a parity check polynomial satisfying zero of expression (97-2-1) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, and y is an integer no smaller than three and no greater than $r_{\#(2c),1}$.

[Math. 550]

When $(2\times f-1)-\alpha_{\#(2c),1,y}-1\geq 0$:

$$H_{com}[2\times(2\times f-1)][9\times((2\times f-1)-\alpha_{\#(2c),1,y}-1)+1]=1 \quad (111\text{-}1)$$

For all u being an integer no smaller than one satisfying $\{u\neq(2\times f-1)-\alpha_{\#(2c),1,y}\}$ (where y is an integer no smaller than three and no greater than $r_{\#(2c),1}$):

$$H_{com}[2\times(2\times f-1)][9\times(u-1)+1]=0 \quad (111\text{-}2)$$

Considered in a similar manner, the following holds true for $X_z$. In the following, z is an integer no smaller than one and no greater than three, and y is an integer no smaller than three and no greater than $r_{\#(2c),z}$.

[Math. 551]

When $(2\times f-1)-\alpha_{\#(2c),z,y}-1\geq 0$:

$$H_{com}[2\times(2\times f-1)][9\times((2\times f-1)-\alpha_{\#(2c),z,y}-1)+z]=1 \quad (112\text{-}1)$$

For all u being an integer no smaller than and satisfying $\{u\neq(2\times f-1)-\alpha_{\#(2c),z,y}\}$ (where y is an integer no smaller than three and no greater than $r_{\#(2c),z}$):

$$H_{com}[2\times(2\times f-1)][9\times(u-1)+z]=0 \quad (112\text{-}2)$$

Further, the following holds true for $X_4$.

[Math. 552]

$$H_{com}[2\times(2\times f-1)][9\times((2\times f-1)-0-1)+4]=1 \quad (113\text{-}1)$$

When $(2\times f-1)-\alpha_{\#(2c),4,1}-1\geq 0$:

$$H_{com}[2\times(2\times f-1)][9\times((2\times f-1)-\alpha_{\#(2c),4,1}-1)+4]=1 \quad (113\text{-}2)$$

When $(2\times f-1)-\alpha_{\#(2c),4,2}-1\geq 0$:

$$H_{com}[2\times(2\times f-1)][9\times((2\times f-1)-\alpha_{\#(2c),4,2}-1)+4]=1 \quad (113\text{-}3)$$

For all u being an integer no smaller than one satisfying $\{u\neq(2\times f-1)-0,\ u\neq(2\times f-1)-\alpha_{\#(2c),4,1},\text{ and } u\neq(2\times f-1)-\alpha_{\#(2c),4,2}\}$:

$$H_{com}[2\times(2\times f-1)][9\times(u-1)+4]=0 \quad (113\text{-}4)$$

Considered in a similar manner, the following holds true for $X_w$. In the following, w is an integer no smaller than four and no greater than seven.

[Math. 553]

$$H_{com}[2\times(2\times f-1)][9\times((2\times f-1)-0-1)+w]=1 \quad (114\text{-}1)$$

When $(2\times f-1)-\alpha_{\#(2c),w,1}-1\geq 0$:

$$H_{com}[2\times(2\times f-1)][9\times((2\times f-1)-\alpha_{\#(2c),w,1}-1)+w]=1 \quad (114\text{-}2)$$

When $(2\times f-1)-\alpha_{\#(2c),w,2}-1\geq 0$:

$$H_{com}[2\times(2\times f-1)][9\times((2\times f-1)-\alpha_{\#(2c),w,2}-1)+w]=1 \quad (114\text{-}3)$$

For all u being an integer no smaller than one satisfying $\{u\neq(2\times f-1)-0,\ u\neq(2\times f-1)-\alpha_{\#(2c),w,1},\text{ and } u\neq(2\times f-1)-\alpha_{\#(2c),w,2}\}$:

$$H_{com}[2\times(2\times f-1)][9\times(u-1)+w]=0 \quad (114\text{-}4)$$

The following holds true for $P_1$.

[Math. 554]

When $(2\times f-1)-\beta_{\#(2c),2}-1\geq 0$:

$$H_{com}[2\times(2\times f-1)][9\times((2\times f-1)-\beta_{\#(2c),2}-1)+8]=1 \quad (115\text{-}1)$$

For all u being an integer no smaller than one satisfying $\{u\neq(2\times f-1)-\beta_{\#(2c),2}\}$:

$$H_{com}[2\times(2\times f-1)][9\times(u-1)+8]=0 \quad (115\text{-}2)$$

The following holds true for $P_2$.

[Math. 555]

$$H_{com}[2\times(2\times f-1)][9\times((2\times f-1)-0-1)+9]=1 \quad (116\text{-}1)$$

For all u being an integer no smaller than one satisfying $\{u\neq(2\times f-1)-0\}$:

$$H_{com}[2\times(2\times f-1)][9\times(u-1)+9]=0 \quad (116\text{-}2)$$

Further, (4) when g=2×f−1 (where f is an integer no smaller than one), when a vector for row 2×(2×f−1) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-2-2), (2×f−1)−1)%2m=2c holds true. Accordingly, a parity check polynomial satisfying zero of expression (97-2-2) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than three and no greater than $r_{\#(2c),1}$.

[Math. 556]

When $(2\times f-1)-\alpha_{\#(2c),1,y}-1\geq 0$:

$$H_{com}[2\times(2\times f-1)][9\times((2\times f-1)-\alpha_{\#(2c),1,y}-1)+1]=1 \quad (117\text{-}1)$$

For all u being an integer no smaller than one satisfying $\{u\neq(2\times f-1)-\alpha_{\#(2c),1,y}\}$ (where y is an integer no smaller than three and no greater than $r_{\#(2c),1}$):

$$H_{com}[2\times(2\times f-1)][9\times(u-1)+1]=0 \quad (117\text{-}2)$$

Considered in a similar manner, the following holds true for $X_z$. In the following, z is an integer no smaller than one and no greater than three, and y is an integer no smaller than three and no greater than $r_{\#(2c),z}$.

[Math. 557]

When $(2\times f-1)-\alpha_{\#(2c),z,y}-1\geq 0$:

$$H_{com}[2\times(2\times f-1)][9\times((2\times f-1)-\alpha_{\#(2c),z,y}-1)+z]=1 \quad (118\text{-}1)$$

For all u being an integer no smaller than one satisfying $\{u\neq(2\times f-1)-\alpha_{\#(2c),z,y}\}$ (where y is an integer no smaller than three and no greater than $r_{\#(2c),z}$:

$$H_{com}[2\times(2\times f-1)][9\times(u-1)+z]=0 \quad (118\text{-}2)$$

Further, the following holds true for $X_4$.

[Math. 558]

$$H_{com}[2\times(2\times f-1)][9\times((2\times f-1)-0-1)+4]=1 \quad (119\text{-}1)$$

When $(2\times f-1)-\alpha_{\#(2c),4,1}-1\geq 0$:

$$H_{com}[2\times(2\times f-1)][9\times((2\times f-1)-\alpha_{\#(2c),4,1}-1)+4]=1 \quad (119\text{-}2)$$

When $(2\times f-1)-\alpha_{\#(2c),4,2}-1\geq 0$:

$$H_{com}[2\times(2\times f-1)][9\times((2\times f-1)-\alpha_{\#(2c),4,2}-1)+4]=1 \quad (119\text{-}3)$$

For all u being an integer no smaller than one satisfying $\{u\neq(2\times f-1)-0,\ u\neq(2\times f-1)-\alpha_{\#(2c),4,1},\text{ and }u\neq(2\times f-1)-\alpha_{\#(2c),4,2}\}$:

$$H_{com}[2\times(2\times f-1)][9\times(u-1)+4]=0 \quad (119\text{-}4)$$

Considered in a similar manner, the following holds true for $X_w$. In the following, w is an integer no smaller than four and no greater than seven.

[Math. 559]

$$H_{com}[2\times(2\times f-1)][9\times((2\times f-1)-0-1)+w]=1 \quad (120\text{-}1)$$

When $(2\times f-1)-\alpha_{\#(2c),w,1}-1\geq 0$:

$$H_{com}[2\times(2\times f-1)][9\times((2\times f-1)-\alpha_{\#(2c),w,1}-1)+w]=1 \quad (120\text{-}2)$$

When $(2\times f-1)-\alpha_{\#(2c),w,2}-1\geq 0$:

$$H_{com}[2\times(2\times f-1)][9\times((2\times f-1)-\alpha_{\#(2c),w,2}-1)+w]=1 \quad (120\text{-}3)$$

For all u being an integer no smaller than one satisfying $\{u\neq(2\times f-1)-0,\ u\neq(2\times f-1)-\alpha_{\#(2c),w,1},\text{ and }u\neq(2\times f-1)-\alpha_{\#(2c),w,2}\}$:

$$H_{com}[2\times(2\times f-1)][9\times(u-1)+w]=0 \quad (120\text{-}4)$$

The following holds true for $P_1$.

[Math. 560]

For all u being an integer no smaller than one:

$$H_{com}[2\times(2\times f-1)][9\times(u-1)+8]=0 \quad (121)$$

The following holds true for $P_2$.

[Math. 561]

$$H_{com}[2\times(2\times f-1)][9\times((2\times f-1)-0-1)+9]=1 \quad (122\text{-}1)$$

When $(2\times f-1)-\beta_{\#(2c),3}-1\geq 0$:

$$H_{com}[2\times(2\times f-1)][9\times((2\times f-1)-\beta_{\#(2c),3}-1)+9]=1 \quad (122\text{-}2)$$

For all u being an integer no smaller than one satisfying $\{u\neq(2\times f-1)-0\text{ and }u\neq(2\times f-1)-\beta_{\#(2c),3}\}$:

$$H_{com}[2\times(2\times f-1)][9\times(u-1)+9]=0 \quad (122\text{-}3)$$

Further, (5) when g=2×f (where f is an integer no smaller than one), when a vector for row 2×(2×f)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-1-1), ((2×f)−1) %2m=2d+1 holds true. Accordingly, a parity check polynomial satisfying zero of expression (98-1-1) where 2i+1=2d+1 holds true (where d is an integer no smaller than zero and no greater than m−1).

Accordingly, component $H_{com}[2\times g-1][v]=H_{com}[2\times(2\times f)-1][v]$ in row 2×g−1, or that is, row 2×(2×f)−1 of the parity check matrix H, which is for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than three and no greater than $r_{\#(2d+1),1}$.

[Math. 562]

When $(2\times f)-\alpha_{\#(2d+1),1,y}-1\geq 0$:

$$H_{com}[2\times(2\times f)-1][9\times((2\times f)-\alpha_{\#(2d+1),1,y}-1)+1]=1 \quad (123\text{-}1)$$

For all u being an integer no smaller than one satisfying $\{u\neq(2\times f)-\alpha_{\#(2d+1),1,y}\}$ (where y is an integer no smaller than three and no greater than $r_{\#(2d+1),1}$):

$$H_{com}[2\times(2\times f)-1][9\times(u-1)+1]=0 \quad (123\text{-}2)$$

Considered in a similar manner, the following holds true for $X_z$. In the following, z is an integer no smaller than one and no greater than three, and y is an integer no smaller than three and no greater than $r_{\#(2d+1),z}$.

[Math. 563]

When $(2\times f)-\alpha_{\#(2d+1),z,y}-1\geq 0$:

$$H_{com}[2\times(2\times f)-1][9\times((2\times f)-\alpha_{\#(2d+1),z,y}-1)+z]=1 \quad (124\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)-1][9\times(u-1)+z]=0 \quad (124\text{-}2)$$

Further, the following holds true for $X_4$.

[Math. 564]

$$H_{com}[2\times(2\times f)-1][9\times((2\times f)-0-1)+4]=1 \quad (125\text{-}1)$$

When $(2\times f)-\alpha_{\#(2d+1),4,1}-1\geq 0$:

$$H_{com}[2\times(2\times f)-1][9\times((2\times f)-\alpha_{\#(2d+1),4,2}-1)+4]=1 \quad (125\text{-}2)$$

When $(2\times f)-\alpha_{\#(2d+1),4,2}-1\geq 0$:

$$H_{com}[2\times(2\times f)-1][9\times((2\times f)-\alpha_{\#(2d+1),4,2}-1)+4]=1 \quad (125\text{-}3)$$

For all u being an integer no smaller than one satisfying $\{u\neq(2\times f-1)-0,\ u\neq(2\times f-1)-\alpha_{\#(2d+1),4,11},\ \text{and}\ u\neq(2\times f-1)-\alpha_{\#(2d+1),4,2}\}$:

$$H_{com}[2\times(2\times f)-1][9\times(u-1)+4]=0 \quad (125\text{-}4)$$

Considered in a similar manner, the following holds true for $X_w$. In the following, w is an integer no smaller than four and no greater than seven.

[Math. 565]

$$H_{com}[2\times(2\times f-1)][9\times((2\times f)-0-1)+w]=1 \quad (126\text{-}1)$$

When $(2\times f-1)-\alpha_{\#(2d+1),w,1}-1\geq 0$:

$$H_{com}[2\times(2\times f-1)][9\times((2\times f)-\alpha_{\#(2d+1),w,1}-1)+w]=1 \quad (126\text{-}2)$$

When $(2\times f-1)-\alpha_{\#(2d+1),w,2}-1\geq 0$:

$$H_{com}[2\times(2\times f-1)][9\times((2\times f)-\alpha_{\#(2d+1),w,2}-1)+w]=1 \quad (126\text{-}3)$$

For all u being an integer no smaller than one satisfying $\{u\neq(2\times f)-0,\ u\neq(2\times f)-\alpha_{\#(2d+1),w,1},\ \text{and}\ u\neq(2\times f)-\alpha_{\#(2d+1),w,2}\}$:

$$H_{com}[2\times(2\times f)-1][9\times(u-1)+w]=0 \quad (126\text{-}4)$$

The following holds true for $P_1$.

[Math. 566]

$$H_{com}[2\times(2\times f)-1][9\times((2\times f)-0-1)+8]=1 \quad (127\text{-}1)$$

For all u being an integer no smaller than one satisfying $\{u\neq(2\times f)-0\}$:

$$H_{com}[2\times(2\times f)-1][9\times(u-1)+8]=0 \quad (127\text{-}2)$$

The following holds true for $P_2$.

[Math. 567]

When $(2\times f)-\beta_{\#(2d+1),0}-1\geq 0$:

$$H_{com}[2\times(2\times f)-1][9\times((2\times f)-\beta_{\#(2d+1),0}-1)+9]=1 \quad (128\text{-}1)$$

For all u being an integer no smaller than one satisfying $\{u\neq(2\times f)-\beta_{\#(2d+1),0}\}$:

$$H_{com}[2\times(2\times f)-1][9\times(u-1)+9]=0 \quad (128\text{-}2)$$

Further, (6) when g=2×f (where f is an integer no smaller than one), when a vector for row 2×(2×f)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-1-2), ((2×f)−1) %2m=2d+1 holds true. Accordingly, a parity check polynomial satisfying zero of expression (98-1-2) where 2i+1=2d+1 holds true (where d is an integer no smaller than zero and no greater than m−1).

Accordingly, component $H_{com}[2\times g-1][v]=H_{com}[2\times(2\times f)-1][v]$ in row 2×g−1, or that is, row 2×(2×f)−1 of the parity check matrix H, which is for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than three and no greater than $r_{\#(2d+1),1}$.

[Math. 568]

When $(2\times f)-\alpha_{\#(2d+1),1,y}-1\geq 0$:

$$H_{com}[2\times(2\times f)-1][9\times((2\times f)-\alpha_{\#(2d+1),1,y}-1)+1]=1 \quad (129\text{-}1)$$

For all u being an integer no smaller than one satisfying $\{u\neq(2\times f)-\alpha_{\#(2d+1),1,y}\}$ (where y is an integer no smaller than three and no greater than $r_{\#(2d+1),1}$):

$$H_{com}[2\times(2\times f)-1][9\times(u-1)+1]=0 \quad (129\text{-}2)$$

Considered in a similar manner, the following holds true for $X_z$. In the following, z is an integer no smaller than one and no greater than three, and y is an integer no smaller than three and no greater than $r_{\#(2d+1),z}$.

[Math. 569]

When $(2\times f)-\alpha_{\#(2d+1),z,y}1\geq 0$:

$$H_{com}[2\times(2\times f)-1][9\times((2\times f)-\alpha_{\#(2d+1),z,y}-1)+z]=1 \quad (130\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)-1][9\times(u-1)+z]=0 \quad (130\text{-}2)$$

Further, the following holds true for $X_4$.

[Math. 570]

$$H_{com}[2\times(2\times f)-1][9\times((2\times f)-0-1)+4]=1 \quad (131\text{-}1)$$

When $(2\times f)-\alpha_{\#(2d+1),4,1}-1\geq 0$:

$$H_{com}[2\times(2\times f)-1][9\times((2\times f)-\alpha_{\#(2d+1),4,1}-1)+4]=1 \quad (131\text{-}2)$$

When $(2\times f)-\alpha_{\#(2d+1),4,2}-1\geq 0$:

$$H_{com}[2\times(2\times f)-1][9\times((2\times f)-\alpha_{\#(2d+1),4,2}-1)+4]=1 \quad (131\text{-}3)$$

For all u being an integer no smaller than one satisfying $\{u\neq(2\times f-1)-0,\ u\neq(2\times f-1)-\alpha_{\#(2d+1),4,1},$ and $u\neq(2\times f-1)-\alpha_{\#(2d+1),4,2}\}$:

$$H_{com}[2\times(2\times f)-1][9\times(u-1)+4]=0 \quad (131\text{-}4)$$

Considered in a similar manner, the following holds true for $X_w$. In the following, w is an integer no smaller than four and no greater than seven.

[Math. 571]

$$H_{com}[2\times(2\times f-1)][9\times((2\times f)-0-1)+w]=1 \quad (132\text{-}1)$$

When $(2\times f-1)-\alpha_{\#(2d+1),w,1}-1\geq 0$:

$$H_{com}[2\times(2\times f-1)][9\times((2\times f)-\alpha_{\#(2d+1),w,1}-1)+w]=1 \quad (132\text{-}2)$$

When $(2\times f-1)-\alpha_{\#(2d+1),w,2}-1\geq 0$:

$$H_{com}[2\times(2\times f-1)][9\times((2\times f)-\alpha_{\#(2d+1),w,2}-1)+w]=1 \quad (132\text{-}3)$$

For all u being an integer no smaller than one satisfying $\{u\neq(2\times f)-0,\ u\neq(2\times f)-\alpha_{\#(2d+1),w,1},$ and $u\neq(2\times f)-\alpha_{\#(2d+1),w,2}\}$:

$$H_{com}[2\times(2\times f)-1][9\times(u-1)+w]=0 \quad (132\text{-}4)$$

The following holds true for $P_1$.

[Math. 572]

$$H_{com}[2\times(2\times f)-1][9\times((2\times f)-0-1)+8]=1 \quad (133\text{-}1)$$

When $(2\times f)-\beta_{\#(2d+1),1}-1\geq 0$:

$$H_{com}[2\times(2\times f)-1][9\times((2\times f)-\beta_{\#(2d+1),1}-1)+8]=1 \quad (133\text{-}2)$$

For all u being an integer no smaller than one satisfying $\{u\neq(2\times f)-0$ and $u\neq(2\times f)=\beta_{\#(2d+1),1}\}$:

$$H_{com}[2\times(2\times f)-1][9\times(u-1)+8]=0 \quad (133\text{-}3)$$

The following holds true for $P_2$.

[Math. 573]

For all u being an integer no smaller than one:

$$H_{com}[2\times(2\times f)-1][9\times(u-1)+9]=0 \quad (134)$$

Further, (7) when g=2×f (where f is an integer no smaller than one), when a vector for row 2×(2×f) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-2-1), ((2×f)−1)%2m=2d+1 holds true. Accordingly, a parity check polynomial satisfying zero of expression (98-2-1) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 574]

$$H_{com}[2\times(2\times f)][9\times((2\times f)-0-1)+1]=1 \quad (135\text{-}1)$$

When $(2\times f)-\alpha_{\#(2d+1),1,1}-1\geq 0$:

$$H_{com}[2\times(2\times f)][9\times((2\times f)-\alpha_{\#(2d+1),1,1}-1)+1]=1 \quad (135\text{-}2)$$

When $(2\times f)-\alpha_{\#(2d+1),1,2}-1\geq 0$:

$$H_{com}[2\times(2\times f)][9\times((2\times f)-\alpha_{\#(2d+1),1,2}-1)+1]=1 \quad (135\text{-}3)$$

For all u being an integer no smaller than one satisfying $\{u\neq(2\times f)-0,\ u\neq(2\times f)-\alpha_{\#(2d+1),1,1},$ and $u\neq(2\times f)-\alpha_{\#(2d+1),1,2}\}$:

$$H_{com}[2\times(2\times f)][9\times(u-1)+1]=0 \quad (135\text{-}4)$$

Considered in a similar manner, the following holds true for $X_w$. In the following, w is an integer no smaller than one and no greater than three.

[Math. 575]

$$H_{com}[2\times(2\times f)][9\times((2\times f)-0-1)+w]=1 \quad (136\text{-}1)$$

When $(2\times f)-\alpha_{\#(2d+1),w,1}-1\geq 0$:

$$H_{com}[2\times(2\times f)][9\times((2\times f)-\alpha_{\#(2d+1),w,1}-1)+w]=1 \quad (136\text{-}2)$$

When $(2\times f)-\alpha_{\#(2d+1),w,2}-1\geq 0$:

$$H_{com}[2\times(2\times f)][9\times((2\times f)-\alpha_{\#(2d+1),w,2}-1)+w]=1 \quad (136\text{-}3)$$

For all u being an integer no smaller than one satisfying $\{u\neq(2\times f)-0,\ u\neq(2\times f)-\alpha_{\#(2d+1),w,1},$ and $u\neq(2\times f)-\alpha_{\#(2d+1),w,2}\}$:

$$H_{com}[2\times(2\times f)][9\times(u-1)+w]=0 \quad (136\text{-}4)$$

Further, the following holds true for $X_4$. In the following, y is an integer no smaller than three and no greater than $r_{\#(2d+1),4}$.

[Math. 576]

When $(2\times f)-\alpha_{\#(2d+1),4,y}-1\geq 0$:

$$H_{com}[2\times(2\times f)][9\times((2\times f)-\alpha_{\#(2d+1),4,y}-1)+4]=1 \quad (137\text{-}1)$$

For all u being an integer no smaller than one satisfying $\{u\neq(2\times f)-\alpha_{\#(2d+1),4,y}\}$ (where y is an integer no smaller than three and no greater than $r_{\#(2d+1),4}$):

$$H_{com}[2\times(2\times f)][9\times(u-1)+4]=0 \quad (137\text{-}2)$$

Considered in a similar manner, the following holds true for $X_z$. In the following, z is an integer no smaller than four and no greater than seven, and y is an integer no smaller than three and no greater than $r_{\#(2d+1),z}$.

[Math. 577]

When $(2\times f)-\alpha_{\#(2d+1),z,y}-1\geq 0$:

$$H_{com}[2\times(2\times f)][9\times((2\times f)-\alpha_{\#(2d+1),z,y}-1)+z]=1 \quad (138\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)][9\times(u-1)+z]=0 \quad (138\text{-}2)$$

The following holds true for $P_1$.

[Math. 578]

When $(2\times f)-\beta_{\#(2d+1),2}-1\geq 0$:

$$H_{com}[2\times(2\times f)][9\times((2\times f)-\beta_{\#(2d+1),2}-1)+8]=1 \quad (139\text{-}1)$$

For all u being an integer no smaller than one satisfying $\{u\neq(2\times f)-\beta_{\#(2d+1),2}\}$:

$$H_{com}[2\times(2\times f)][9\times(u-1)+8]=0 \quad (139\text{-}2)$$

The following holds true for $P_2$.

[Math. 579]

$$H_{com}[2\times(2\times f)][9\times((2\times f)-0-1)+9]=1 \quad (140\text{-}1)$$

For all u being an integer no smaller than one satisfying $\{u\neq(2\times f)-0\}$:

$$H_{com}[2\times(2\times f)][9\times(u-1)+9]=0 \quad (140\text{-}2)$$

Further, (8) when g=2×f (where f is an integer no smaller than one), when a vector for row 2×(2×f) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-2-2), ((2×f)−1) %2m=2d+1 holds true. Accordingly, a parity check polynomial satisfying zero of expression (98-2-2) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 580]

$$H_{com}[2\times(2\times f)][9\times((2\times f)-0-1)+1]=1 \quad (141\text{-}1)$$

When $(2\times f)-\alpha_{\#(2d+1),1,1}-1\geq 0$:

$$H_{com}[2\times(2\times f)][9\times((2\times f)-\alpha_{\#(2d+1),1,1}-1)+1]=1 \quad (141\text{-}2)$$

When $(2\times f)-\alpha_{\#(2d+1),1,2}-1\geq 0$:

$$H_{com}[2\times(2\times f)][9\times((2\times f)-\alpha_{\#(2d+1),1,2}-1)+1]=1 \quad (141\text{-}3)$$

For all u being an integer no smaller than one satisfying $\{u\neq(2\times f)-0,\ u\neq(2\times f)-\alpha_{\#(2d+1),1,1},\text{ and } u\neq(2\times f)-\alpha_{\#(2d+1),1,2}\}$:

$$H_{com}[2\times(2\times f)][9\times(u-1)+1]=0 \quad (141\text{-}4)$$

Considered in a similar manner, the following holds true for $X_w$. In the following, w is an integer no smaller than one and no greater than three.

[Math. 581]

$$H_{com}[2\times(2\times f)][9\times((2\times f)-0-1)+w]=1 \quad (142\text{-}1)$$

When $(2\times f)-\alpha_{\#(2d+1),w,1}-1\geq 0$:

$$H_{com}[2\times(2\times f)][9\times((2\times f)-\alpha_{\#(2d+1),w,1}-1)+w]=1 \quad (142\text{-}2)$$

When $(2\times f)-\alpha_{\#(2d+1),w,2}-1\geq 0$:

$$H_{com}[2\times(2\times f)][9\times((2\times f)-\alpha_{\#(2d+1),w,2}-1)+w]=1 \quad (142\text{-}3)$$

For all u being an integer no smaller than one satisfying $\{u\neq(2\times f)-0,\ u\neq(2\times f)-\alpha_{\#(2d+1),w,1},\text{ and } u\neq(2\times f)-\alpha_{\#(2d+1),w,2}\}$:

$$H_{com}[2\times(2\times f)][9\times(u-1)+w]=0 \quad (142\text{-}4)$$

Further, the following holds true for $X_4$. In the following, y is an integer no smaller than three and no greater than $r_{\#(2d+1),4}$.

[Math. 582]

When $(2\times f)-\alpha_{\#(2d+1),4,y}-1\geq 0$:

$$H_{com}[2\times(2\times f)][9\times((2\times f)-\alpha_{\#(2d+1),4,y}-1)+4]=1 \quad (143\text{-}1)$$

For all u being an integer no smaller than one satisfying $\{u\neq(2\times f)-\alpha_{\#(2d+1),4,y}\}$ (where y is an integer no smaller than three and no greater than $r_{\#(2d+1),4}$).

$$H_{com}[2\times(2\times f)][9\times(u-1)+4]=0 \quad (143\text{-}2)$$

Considered in a similar manner, the following holds true for $X_z$. In the following, z is an integer no smaller than four and no greater than seven, and y is an integer no smaller than three and no greater than $r_{\#(2d+1),z}$.

[Math. 583]

When $(2\times f)-\alpha_{\#(2d+1),z,y}-1\geq 0$:

$$H_{com}[2\times(2\times f)][9\times((2\times f)-\alpha_{\#(2d+1),z,y}-1)+z]=1 \quad (144\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$);

$$H_{com}[2\times(2\times f)][9\times(u-1)+z]=0 \quad (144\text{-}2)$$

The following holds true for $P_1$.

[Math. 584]

For all u being an integer no smaller than one:

$$H_{com}[2\times(2\times f)][9\times(u-1)+8]=0 \quad (145)$$

The following holds true for $P_2$.

[Math. 585]

$$H_{com}[2\times(2\times f)][9\times((2\times f)-0-1)+9]=1 \quad (146\text{-}1)$$

When $(2\times f)-\beta_{\#(2d+1),3}-1\geq 0$:

$$H_{com}[2\times(2\times f)][9\times((2\times f)-\beta_{\#(2d+1),3}-1)+9]=1 \quad (146\text{-}2)$$

For all u being an integer no smaller than one satisfying $\{u\neq(2\times f)-0\text{ and } u\neq(2\times f)-\beta_{\#(2d+1),3}\}$:

$$H_{com}[2\times(2\times f)][9\times(u-1)+9]=0 \quad (146\text{-}3)$$

As such, an LDPC-CC of coding rate 7/9 and time-varying period 2×m that is based on a parity check polynomial can be generated by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, and the code so generated achieves high error correction capability.

Embodiment F2

In the present embodiment, description is provided of a method of code configuration that is a generalization of the method described in embodiment F1 of configuring an LDPC-CC of coding rate 7/9 that is based on a parity check polynomial.

Bits of information bits $X_1$, $X_2$, $X_3$, $X_4$, $X_5$, $X_6$, $X_7$ and parity bits $P_1$, $P_2$, at time point j, are expressed $X_{1,j}$, $X_{2,j}$, $X_{3,j}$, $X_{4,j}$, $X_{5,j}$, $X_{6,j}$, $X_{7,j}$ and $P_{1,j}$, $P_{2,j}$, respectively.

A vector $u_j$, at time point j, is expressed $u_j=(X_{1,j}, X_{2,j}, X_{3,j}, X_{4,j}, X_{5,j}, X_{6,j}, X_{7,j}, P_{1,j}, P_{2,j})$.

Given a delay operator D, polynomial expressions of the information bits $X_1$, $X_2$, $X_3$, $X_4$, $X_5$, $X_6$, $X_7$ are $X_1(D)$, $X_2(D)$, $X_3(D)$, $X_4(D)$, $X_5(D)$, $X_6(D)$, $X_7(D)$, and polynomial expressions of the parity bits $P_1$, $P_2$ are $P_1(D)$, $P_2(D)$.

Further, consideration is given to an LDPC-CC of coding rate 7/9 and time-varying period 2m that is based on a parity check polynomial.

The following mathematical expressions are provided as parity check polynomials satisfying zero for an LDPC-CC of coding rate 7/9 and time-varying period 2m that is based on a parity check polynomial.

First, because two parities $P_1$ and $P_2$ exist, parity check polynomials satisfying zero are provided as described in the following, two for $1\times P_1(D)$ and two for $1\times P_2(D)$.

[Math. 586-1]

$$\left(1+\sum_{s=1}^{R_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(1+\sum_{s=1}^{R_{\#(2i),3}} D^{\alpha\#(2i),3,s}\right)X_3(D)+\left(\sum_{s=R_{\#(2i),4}+1}^{r_{\#(2i),4}} D^{\alpha\#(2i),4,s}\right)X_4(D)+\left(\sum_{s=R_{\#(2i),5}+1}^{r_{\#(2i),5}} D^{\alpha\#(2i),5,s}\right)X_5(D)+\left(\sum_{s=R_{\#(2i),6}+1}^{r_{\#(2i),6}} D^{\alpha\#(2i),6,s}\right)X_6(D)+\left(\sum_{s=R_{\#(2i),7}+1}^{r_{\#(2i),7}} D^{\alpha\#(2i),7,s}\right)X_7(D)+P_1(D)+D^{\beta\#(2i),0}P_2(D)=$$
$$(D^{\alpha\#(2i),1,R_{\#(2i),1}}+\ldots+D^{\alpha\#(2i),1,1}+1)X_1(D)+(D^{\alpha\#(2i),2,R_{\#(2i),2}}+\ldots+D^{\alpha\#(2i),2,1}+1)X_2(D)+(D^{\alpha\#(2i),3,R_{\#(2i),3}}+\ldots+D^{\alpha\#(2i),3,1}+1)X_3(D)+(D^{\alpha\#(2i),4,r_{\#(2i),4}}+\ldots+D^{\alpha\#(2i),4,R_{\#(2i),4}+1})X_4(D)+(D^{\alpha\#(2i),5,r_{\#(2i),5}}+\ldots+D^{\alpha\#(2i),5,R_{\#(2i),5}+1})X_5(D)+(D^{\alpha\#(2i),6,r_{\#(2i),6}}+\ldots+D^{\alpha\#(2i),6,R_{\#(2i),6}+1})X_6(D)+(D^{\alpha\#(2i),7,r_{\#(2i),7}}+\ldots+D^{\alpha\#(2i),7,R_{\#(2i),7}+1})X_7(D)+P_1(D)+D^{\beta\#(2i),0}P_2(D)=0 \tag{147-1-1}$$

$$\left(1+\sum_{s=1}^{R_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(1+\sum_{s=1}^{R_{\#(2i),3}} D^{\alpha\#(2i),3,s}\right)X_3(D)+\left(\sum_{s=R_{\#(2i),4}+1}^{r_{\#(2i),4}} D^{\alpha\#(2i),4,s}\right)X_4(D)+\left(\sum_{s=R_{\#(2i),5}+1}^{r_{\#(2i),5}} D^{\alpha\#(2i),5,s}\right)X_5(D)+\left(\sum_{s=R_{\#(2i),6}+1}^{r_{\#(2i),6}} D^{\alpha\#(2i),6,s}\right)X_6(D)+\left(\sum_{s=R_{\#(2i),7}+1}^{r_{\#(2i),7}} D^{\alpha\#(2i),7,s}\right)X_7(D)+P_1(D)+D^{\beta\#(2i),1}P_1(D)= \tag{147-2-1}$$

-continued $$(D^{\alpha\#(2i),1,R_{\#(2i),1}}+\ldots+D^{\alpha\#(2i),1,1}+1)X_1(D)+(D^{\alpha\#(2i),2,R_{\#(2i),2}}+\ldots+D^{\alpha\#(2i),2,1}+1)X_2(D)+(D^{\alpha\#(2i),3,R_{\#(2i),3}}+\ldots+D^{\alpha\#(2i),3,1}+1)X_3(D)+(D^{\alpha\#(2i),4,r_{\#(2i),4}}+\ldots+D^{\alpha\#(2i),4,R_{\#(2i),4}+1})X_4(D)+(D^{\alpha\#(2i),5,r_{\#(2i),5}}+\ldots+D^{\alpha\#(2i),5,R_{\#(2i),5}+1})X_5(D)+(D^{\alpha\#(2i),6,r_{\#(2i),6}}+\ldots+D^{\alpha\#(2i),6,R_{\#(2i),6}+1})X_6(D)+(D^{\alpha\#(2i),7,r_{\#(2i),7}}+\ldots+D^{\alpha\#(2i),7,R_{\#(2i),7}+1})X_7(D)+P_1(D)+D^{\beta\#(2i),1}P_1(D)=0$$

[Math. 586-2]

$$\left(\sum_{s=R_{\#(2i),1}+1}^{r_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+\left(\sum_{s=R_{\#(2i),3}+1}^{r_{\#(2i),3}} D^{\alpha\#(2i),3,s}\right)X_3(D)+\left(1+\sum_{s=1}^{R_{\#(2i),4}} D^{\alpha\#(2i),4,s}\right)X_4(D)+\left(1+\sum_{s=1}^{R_{\#(2i),5}} D^{\alpha\#(2i),5,s}\right)X_5(D)+\left(1+\sum_{s=1}^{R_{\#(2i),6}} D^{\alpha\#(2i),6,s}\right)X_6(D)+\left(1+\sum_{s=1}^{R_{\#(2i),7}} D^{\alpha\#(2i),7,s}\right)X_7(D)+P_2(D)+\beta^{\#(2i+1),2}P_1(D)=$$
$$(D^{\alpha\#(2i),1,r_{\#(2i),1}}+\ldots+D^{\alpha\#(2i),1,R_{\#(2i),1}+1})X_1(D)+(D^{\alpha\#(2i),2,r_{\#(2i),2}}+\ldots+D^{\alpha\#(2i),2,R_{\#(2i),2}+1})X_2(D)+(D^{\alpha\#(2i),3,r_{\#(2i),3}}+\ldots+D^{\alpha\#(2i),3,R_{\#(2i),3}+1})X_3(D)+(D^{\alpha\#(2i),4,R_{\#(2i),4}}+\ldots+D^{\alpha\#(2i),4,1}+1)X_4(D)+(D^{\alpha\#(2i),5,R_{\#(2i),5}}+\ldots+D^{\alpha\#(2i),5,1}+1)X_5(D)+(D^{\alpha\#(2i),6,R_{\#(2i),6}}+\ldots+D^{\alpha\#(2i),6,1}+1)X_6(D)+(D^{\alpha\#(2i),7,R_{\#(2i),7}}+\ldots+D^{\alpha\#(2i),7,1}+1)X_7(D)+P_2(D)+D^{\beta\#(2i),2}P_1(D)=0 \tag{147-2-1}$$

$$\left(\sum_{s=R_{\#(2i),1}+1}^{r_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+\left(\sum_{s=R_{\#(2i),3}+1}^{r_{\#(2i),3}} D^{\alpha\#(2i),3,s}\right)X_3(D)+\left(1+\sum_{s=1}^{R_{\#(2i),4}} D^{\alpha\#(2i),4,s}\right)X_4(D)+\left(1+\sum_{s=1}^{R_{\#(2i),5}} D^{\alpha\#(2i),5,s}\right)X_5(D)+\left(1+\sum_{s=1}^{R_{\#(2i),6}} D^{\alpha\#(2i),6,s}\right)X_6(D)+\left(1+\sum_{s=1}^{R_{\#(2i),7}} D^{\alpha\#(2i),7,s}\right)X_7(D)+P_2(D)+\beta^{\#(2i),3}P_2(D)=$$
$$(D^{\alpha\#(2i),1,r_{\#(2i),1}}+\ldots+D^{\alpha\#(2i),1,R_{\#(2i),1}+1})X_1(D)+(D^{\alpha\#(2i),2,r_{\#(2i),2}}+\ldots+D^{\alpha\#(2i),2,R_{\#(2i),2}+1})X_2(D)+(D^{\alpha\#(2i),3,r_{\#(2i),3}}+\ldots+D^{\alpha\#(2i),3,R_{\#(2i),3}+1})X_3(D)+(D^{\alpha\#(2i),4,R_{\#(2i),4}}+\ldots+D^{\alpha\#(2i),4,1}+1)X_4(D)+(D^{\alpha\#(2i),5,R_{\#(2i),5}}+\ldots+D^{\alpha\#(2i),5,1}+1)X_5(D)+(D^{\alpha\#(2i),6,R_{\#(2i),6}}+\ldots+D^{\alpha\#(2i),6,1}+1)X_6(D)+(D^{\alpha\#(2i),7,R_{\#(2i),7}}+\ldots+D^{\alpha\#(2i),7,1}+1)X_7(D)+P_2(D)+D^{\beta\#(2i),3}P_2(D)=0 \tag{147-2-2}$$

In expressions (147-1-1), (147-1-2), (147-2-1), (147-2-2), i is an integer no smaller than zero and no greater than m−1 (i=0, 1, . . . , m−2, m−1).

In expressions (147-1-1), (147-1-2), (147-2-1), (147-2-2), $\alpha_{\#(2i),p,q}$ (where p is an integer no smaller than one and no greater than seven, q is an integer no smaller than one and no greater than $r_{\#(2i),p}$ (where $r_{\#(2i),p}$ is a natural number))

and $\beta_{\#(2i),0}$ is a natural number, $\beta_{\#(2i),1}$ is a natural number, $\beta_{\#(2i),2}$ is an integer no smaller than zero, and $\beta_{\#(2i),3}$ is a natural number.

Further, $R_{\#(2i),p}$ is a natural number satisfying $1 \leq R_{\#(2i),p} < r_{\#(2i),p}$.

Further, y is an integer no smaller than one and no greater than $r_{\#(2i),p}$, z is an integer no smaller than one and no greater than $r_{\#2i,p}$, and $\alpha_{\#(2i),p,y} \neq \alpha_{\#(2i),p,z}$ holds true for $^{\forall}$(y, z) where y≠z. ∀ is a universal quantifier. (y is an integer no smaller than one and no greater than $r_{\#(2i),p}$, z is an integer no smaller than one and no greater than $r_{\#2i,p}$, and $\alpha_{\#(2i),p,y} \neq \alpha_{\#(2i),p,z}$ holds true for all y and all z satisfying y≠z.)

Note that in the following, to simplify explanation, a parity check polynomial satisfying zero that is expressed by expression (147-1-1) or expression (147-1-2) is referred to as "#(2i); first expression" for realizing a time-varying period 2m, and a parity check polynomial satisfying zero that is expressed by expression (147-2-1) or expression (147-2-2) is referred to as "#(2i); second expression" for realizing a time-varying period 2m.

Thus, for each i, as #(2i); first expression for realizing a time-varying period 2m, a parity check polynomial satisfying zero expressed by either expression (147-1-1) or expression (147-1-2) is prepared.

That is, for i=0, a parity check polynomial satisfying zero provided by expression (147-1-1) where i=0, or a parity check polynomial satisfying zero provided by expression (147-1-2) where i=0 is prepared.

Similarly:

for i=1, a parity check polynomial satisfying zero provided by expression (147-1-1) where i=1, or a parity check polynomial satisfying zero provided by expression (147-1-2) where i=1 is prepared;

for i=2, a parity check polynomial satisfying zero provided by expression (147-1-1) where i=2, or a parity check polynomial satisfying zero provided by expression (147-1-2) where i=2 is prepared;

⋮ for i=z, a parity check polynomial satisfying zero provided by expression (147-1-1) where i=z, or a parity check polynomial satisfying zero provided by expression (147-1-2) where i=z is prepared (where z is an integer no smaller than zero and no greater than m−1); and

⋮ for i=m−1, a parity check polynomial satisfying zero provided by expression (147-1-1) where i=m−1, or a parity check polynomial satisfying zero provided by expression (147-1-2) where i=m−1 is prepared.

Similarly, for each i, as #(2i); second expression for realizing a time-varying period 2m, a parity check polynomial satisfying zero expressed by either expression (147-2-1) or expression (147-2-2) is prepared.

That is, for i=0, a parity check polynomial satisfying zero provided by expression (147-2-1) where i=0, or a parity check polynomial satisfying zero provided by expression (147-2-2) where i=0 is prepared.

Similarly:

for i=1, a parity check polynomial satisfying zero provided by expression (147-2-1) where i=1, or a parity check polynomial satisfying zero provided by expression (147-2-2) where i=1 is prepared;

for i=2, a parity check polynomial satisfying zero provided by expression (147-2-1) where i=2, or a parity check polynomial satisfying zero provided by expression (147-2-2) where i=2 is prepared;

⋮ for i=z, a parity check polynomial satisfying zero provided by expression (147-2-1) where i=z, or a parity check polynomial satisfying zero provided by expression (147-2-2) where i=z is prepared (where z is an integer no smaller than zero and no greater than m−1); and

⋮ for i=m−1, a parity check polynomial satisfying zero provided by expression (147-2-1) where i=m−1, or a parity check polynomial satisfying zero provided by expression (147-2-2) where i=m−1 is prepared.

Similarly, because two parities $P_1$ and $P_2$ exist, parity check polynomials satisfying zero are provided as described in the following, two for $1\times P_1(D)$ and two for $1\times P_2(D)$.

[Math. 587-1]

$$\left(\sum_{s=R_{\#(2i+1),1}+1}^{r_{\#(2i+1),1}} D^{\alpha_{\#(2i+1),1,s}}\right)X_1(D) + \left(\sum_{s=R_{\#(2i+1),1}+2}^{r_{\#(2i+1),2}} D^{\alpha_{\#(2i+1),2,s}}\right)X_2(D) + \left(\sum_{s=R_{\#(2i+1),1}+3}^{r_{\#(2i+1),3}} D^{\alpha_{\#(2i+1),3,s}}\right)X_3(D) + \left(1+\sum_{s=1}^{R_{\#(2i+1),4}} D^{\alpha_{\#(2i+1),4,s}}\right)X_4(D) + \left(1+\sum_{s=1}^{R_{\#(2i+1),5}} D^{\alpha_{\#(2i+1),5,s}}\right)X_5(D) + \left(1+\sum_{s=1}^{R_{\#(2i+1),6}} D^{\alpha_{\#(2i+1),6,s}}\right)X_6(D) + \left(1+\sum_{s=1}^{R_{\#(2i+1),7}} D^{\alpha_{\#(2i+1),7,s}}\right)X_7(D) + \tag{148-1-1}$$

$$P_1(D) + D^{\beta_{\#(2i+1),0}}P_2(D) = (D^{\alpha_{\#(2i+1),1,r_{\#(2i+1),1}}} + \ldots + D^{\alpha_{\#(2i+1),1,R_{\#(2i+1),1}}} + 1)X_1(D) + (D^{\alpha_{\#(2i+1),2,r_{\#(2i+1),2}}} + \ldots + D^{\alpha_{\#(2i+1),2,R_{\#(2i+1),2}}} + 1) X_2(D) + (D^{\alpha_{\#(2i+1),3,r_{\#(2i+1),3}}} + \ldots + D^{\alpha_{\#(2i+1),3,R_{\#(2i+1),3}}} + 1)X_3(D) + (D^{\alpha_{\#(2i+1),4,R_{\#(2i+1),4}}} + \ldots + D^{\alpha_{\#(2i+1),4,1}} + 1)X_4(D) + (D^{\alpha_{\#(2i+1),5,R_{\#(2i+1),5}}} + \ldots + D^{\alpha_{\#(2i+1),5,1}} + 1)X_5(D) + (D^{\alpha_{\#(2i+1),6,R_{\#(2i+1),6}}} + \ldots + D^{\alpha_{\#(2i+1),6,1}} + 1)X_6(D) + (D^{\alpha_{\#(2i+1),7,R_{\#(2i+1),7}}} + \ldots + D^{\alpha_{\#(2i+1),7,1}} + 1)X_7(D) + P_1(D) + D^{\beta_{\#(2i+1),0}}P_2(D) = 0$$

-continued $$\left(\sum_{s=R_{\#(2i+1),1}+1}^{r_{\#(2i+1),1}} D^{\alpha\#(2i+1),1,s}\right)X_1(D) + \tag{148-1-2}$$

$$\left(\sum_{s=R_{\#(2i+1),1}+2}^{r_{\#(2i+1),2}} D^{\alpha\#(2i+1),2,s}\right)X_2(D) +$$

$$\left(\sum_{s=R_{\#(2i+1),1}+3}^{r_{\#(2i+1),3}} D^{\alpha\#(2i+1),3,s}\right)X_3(D) +$$

$$\left(1 + \sum_{s=1}^{R_{\#(2i+1),4}} D^{\alpha\#(2i+1),4,s}\right)X_4(D) +$$

$$\left(1 + \sum_{s=1}^{R_{\#(2i+1),5}} D^{\alpha\#(2i+1),5,s}\right)X_5(D) +$$

$$\left(1 + \sum_{s=1}^{R_{\#(2i+1),6}} D^{\alpha\#(2i+1),6,s}\right)X_6(D) +$$

$$\left(1 + \sum_{s=1}^{R_{\#(2i+1),7}} D^{\alpha\#(2i+1),7,s}\right)X_7(D) +$$

$$P_1(D) + D^{\beta\#(2i+1),1}P_1(D) =$$

$$(D^{\alpha\#(2i+1),1,r_{\#(2i+1),1}} + \dots + D^{\alpha\#(2i+1),1,R_{\#(2i+1),1}} + 1)X_1(D) +$$
$$(D^{\alpha\#(2i+1),2,r_{\#(2i+1),2}} + \dots + D^{\alpha\#(2i+1),2,R_{\#(2i+1),2}} + 1)$$
$$X_2(D) + (D^{\alpha\#(2i+1),3,r_{\#(2i+1),3}} + \dots +$$
$$D^{\alpha\#(2i+1),3,R_{\#(2i+1),3}} + 1)X_3(D) +$$
$$(D^{\alpha\#(2i+1),4,R_{\#(2i+1),4}} + \dots + D^{\alpha\#(2i+1),4,1} + 1)X_4(D) +$$
$$(D^{\alpha\#(2i+1),5,R_{\#(2i+1),5}} + \dots + D^{\alpha\#(2i+1),5,1} + 1)X_5(D) +$$
$$(D^{\alpha\#(2i+1),6,R_{\#(2i+1),6}} + \dots + D^{\alpha\#(2i+1),6,1} + 1)X_6(D) +$$
$$(D^{\alpha\#(2i+1),7,R_{\#(2i+1),7}} + \dots + D^{\alpha\#(2i+1),7,1} + 1)X_7(D) +$$
$$P_1(D) + D^{\beta\#(2i+1),1}P_1(D) = 0$$

[Math. 587-2]

$$\left(1 + \sum_{s=1}^{R_{\#(2i+1),1}} D^{\alpha\#(2i+1),1,s}\right)X_1(D) + \tag{148-2-1}$$

$$\left(1 + \sum_{s=1}^{R_{\#(2i+1),2}} D^{\alpha\#(2i+1),2,s}\right)X_2(D) +$$

$$\left(1 + \sum_{s=1}^{R_{\#(2i+1),3}} D^{\alpha\#(2i+1),3,s}\right)X_3(D) +$$

$$\left(\sum_{s=R_{\#(2i+1),4}+1}^{r_{\#(2i+1),4}} D^{\alpha\#(2i+1),4,s}\right)X_4(D) +$$

$$\left(\sum_{s=R_{\#(2i+1),5}+1}^{r_{\#(2i+1),5}} D^{\alpha\#(2i+1),5,s}\right)X_5(D) +$$

$$\left(\sum_{s=R_{\#(2i+1),6}+1}^{r_{\#(2i+1),6}} D^{\alpha\#(2i+1),6,s}\right)X_6(D) +$$

$$\left(\sum_{s=R_{\#(2i+1),7}+1}^{r_{\#(2i+1),7}} D^{\alpha\#(2i+1),7,s}\right)X_7(D) + P_2(D) + \beta^{\#(2i+1),2}P_1(D) =$$

-continued $$(D^{\alpha\#(2i+1),1,R_{\#(2i+1),1}} + \dots + D^{\alpha\#(2i+1),1,1} + 1)X_1(D) +$$
$$(D^{\alpha\#(2i+1),2,R_{\#(2i+1),2}} + \dots + D^{\alpha\#(2i+1),2,1} + 1)X_2(D) +$$
$$(D^{\alpha\#(2i+1),3,R_{\#(2i+1),3}} + \dots + D^{\alpha\#(2i+1),3,1} + 1)X_3(D) +$$
$$(D^{\alpha\#(2i+1),4,r_{\#(2i+1),4}} + \dots + D^{\alpha\#(2i+1),4,R_{\#(2i+1),4}} + 1)X_4(D) +$$
$$(D^{\alpha\#(2i+1),5,r_{\#(2i+1),5}} + \dots + D^{\alpha\#(2i+1),5,R_{\#(2i+1),5}} + 1)X_5(D) +$$
$$(D^{\alpha\#(2i+1),6,r_{\#(2i+1),6}} + \dots + D^{\alpha\#(2i+1),6,R_{\#(2i+1),6}} + 1)X_6(D) +$$
$$(D^{\alpha\#(2i+1),7,r_{\#(2i+1),7}} + \dots + D^{\alpha\#(2i+1),7,R_{\#(2i+1),7}} + 1)X_7(D) +$$
$$P_2(D) + D^{\beta\#(2i+1),2}P_1(D) = 0$$

$$\left(1 + \sum_{s=1}^{R_{\#(2i+1),1}} D^{\alpha\#(2i+1),1,s}\right)X_1(D) + \tag{148-2-2}$$

$$\left(1 + \sum_{s=1}^{R_{\#(2i+1),2}} D^{\alpha\#(2i+1),2,s}\right)X_2(D) +$$

$$\left(1 + \sum_{s=1}^{R_{\#(2i+1),3}} D^{\alpha\#(2i+1),3,s}\right)X_3(D) +$$

$$\left(\sum_{s=R_{\#(2i+1),4}+1}^{r_{\#(2i+1),4}} D^{\alpha\#(2i+1),4,s}\right)X_4(D) +$$

$$\left(\sum_{s=R_{\#(2i+1),5}+1}^{r_{\#(2i+1),5}} D^{\alpha\#(2i+1),5,s}\right)X_5(D) +$$

$$\left(\sum_{s=R_{\#(2i+1),6}+1}^{r_{\#(2i+1),6}} D^{\alpha\#(2i+1),6,s}\right)X_6(D) +$$

$$\left(\sum_{s=R_{\#(2i+1),7}+1}^{r_{\#(2i+1),7}} D^{\alpha\#(2i+1),7,s}\right)X_7(D) + P_2(D) + \beta^{\#(2i+1),3}P_2(D) =$$

$$(D^{\alpha\#(2i+1),1,R_{\#(2i+1),1}} + \dots + D^{\alpha\#(2i+1),1,1} + 1)X_1(D) +$$
$$(D^{\alpha\#(2i+1),2,R_{\#(2i+1),2}} + \dots + D^{\alpha\#(2i+1),2,1} + 1)X_2(D) +$$
$$(D^{\alpha\#(2i+1),3,R_{\#(2i+1),3}} + \dots + D^{\alpha\#(2i+1),3,1} + 1)X_3(D) +$$
$$(D^{\alpha\#(2i+1),4,r_{\#(2i+1),4}} + \dots + D^{\alpha\#(2i+1),4,R_{\#(2i+1),4}} + 1)X_4(D) +$$
$$(D^{\alpha\#(2i+1),5,r_{\#(2i+1),5}} + \dots + D^{\alpha\#(2i+1),5,R_{\#(2i+1),5}} + 1)X_5(D) +$$
$$(D^{\alpha\#(2i+1),6,r_{\#(2i+1),6}} + \dots + D^{\alpha\#(2i+1),6,R_{\#(2i+1),6}} + 1)X_6(D) +$$
$$(D^{\alpha\#(2i+1),7,r_{\#(2i+1),7}} + \dots + D^{\alpha\#(2i+1),7,R_{\#(2i+1),7}} + 1)X_7(D) +$$
$$P_2(D) + D^{\beta\#(2i+1),3}P_2(D) = 0$$

In expressions (148-1-1), (148-1-2), (148-2-1), (148-2-2), i is an integer no smaller than zero and no greater than m−1 (i=0, 1, . . . , m−2, m−1).

In expressions (148-1-1), (148-1-2), (148-2-1), (148-2-2), $\alpha_{\#(2i+1),p,q}$ (where p is an integer no smaller than one and no greater than seven, q is an integer no smaller than one and no greater than $r_{\#(2i+1),p}$ (where $r_{\#(2i+1),p}$ is a natural number)) and $\beta_{\#(2i+1),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, $R_{\#(2i),p}$ is a natural number satisfying $1 \le R_{\#(2i+1),p} < r_{\#(2i+1),p}$.

Further, y is an integer no smaller than one and no greater than $r_{\#(2i+1),p}$, z is an integer no smaller than one and no greater than $r_{\#(2i+1),p}$, and $\alpha_{\#(2i+1),p,y} \neq \alpha_{\#(2i+1),p,z}$ holds true for $^{\forall}(y, z)$ where y≠z. ∀ is a universal quantifier. (y is an integer no smaller than one and no greater than $r_{\#(2i+1),p}$, z is an integer no smaller than one and no greater than $r_{\#(2i+1),p}$, and $\alpha_{\#(2i+1),p,y} \neq \alpha_{\#(2i+1),p,z}$ holds true for all y and all z satisfying y≠z.)

Note that in the following, to simplify explanation, a parity check polynomial satisfying zero that is expressed by expression (148-1-1) or expression (148-1-2) is referred to as "#(2i+1); first expression" for realizing a time-varying period 2m, and a parity check polynomial satisfying zero that is expressed by expression (148-2-1) or expression (148-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (148-1-1) or expression (148-1-2) is prepared.

That is, for i=0, a parity check polynomial satisfying zero provided by expression (148-1-1) where i=0, or a parity check polynomial satisfying zero provided by expression (148-1-2) where i=0 is prepared.

Similarly:

for i=1, a parity check polynomial satisfying zero provided by expression (148-1-1) where i=1, or a parity check polynomial satisfying zero provided by expression (148-1-2) where i=1 is prepared;

for i=2, a parity check polynomial satisfying zero provided by expression (148-1-1) where i=2, or a parity check polynomial satisfying zero provided by expression (148-1-2) where i=2 is prepared;

⋮ for i=z, a parity check polynomial satisfying zero provided by expression (148-1-1) where i=z, or a parity check polynomial satisfying zero provided by expression (148-1-2) where i=z is prepared (where z is an integer no smaller than zero and no greater than m−1); and

⋮ for i=m−1, a parity check polynomial satisfying zero provided by expression (148-1-1) where i=m−1, or a parity check polynomial satisfying zero provided by expression (148-1-2) where i=m−1 is prepared.

Similarly, for each i, as #(2i+1); second expression for realizing a time-varying period 2m, a parity check polynomial satisfying zero expressed by either expression (148-2-1) or expression (148-2-2) is prepared.

That is, for i=0, a parity check polynomial satisfying zero provided by expression (148-2-1) where i=0, or a parity check polynomial satisfying zero provided by expression (148-2-2) where i=0 is prepared.

Similarly:

for i=1, a parity check polynomial satisfying zero provided by expression (148-2-1) where i=1, or a parity check polynomial satisfying zero provided by expression (148-2-2) where i=1 is prepared;

for i=2, a parity check polynomial satisfying zero provided by expression (148-2-1) where i=2, or a parity check polynomial satisfying zero provided by expression (148-2-2) where i=2 is prepared;

⋮ for i=z, a parity check polynomial satisfying zero provided by expression (148-2-1) where i=z, or a parity check polynomial satisfying zero provided by expression (148-2-2) where i=z is prepared (where z is an integer no smaller than zero and no greater than m−1); and

⋮ for i=m−1, a parity check polynomial satisfying zero provided by expression (148-2-1) where i=m−1, or a parity check polynomial satisfying zero provided by expression (148-2-2) where i=m−1 is prepared.

As such, an LDPC-CC of coding rate 7/9 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (147-1-1) or expression (147-1-2), parity check polynomials satisfying zero provided by expression (147-2-1) or expression (147-2-2), parity check polynomials satisfying zero provided by expression (148-1-1) or expression (148-1-2), and parity check polynomials satisfying zero provided by expression (148-2-1) or expression (148-2-2).

For example, the time varying period 2×m can be formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expressions (147-1-1), (147-1-2), (147-2-1), (147-2-2), (148-1-1), (148-1-2), (148-2-1), and (148-2-2) (where j is an integer no smaller than zero).

The following presumes that 2k=j%2m holds true. In the following, % means a modulo, and for example, α%6 represents a remainder after dividing α by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

The following describes a method of configuring a parity check matrix for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a vector $u_j$ at time point j is expressed as $u_j=(X_{1,j}, X_{2,j}, X_{3,j}, X_{4,j}, X_{5,j}, X_{6,j}, X_{7,j}, P_{1,j}, P_{2,j})$ (where j is an integer no smaller than zero). In the following, a case where u is a transmission vector is considered. Note that in the following, j is an integer no smaller than one, and thus j differs between the description having been provided above and the description provided in the following. (j is set as such to facilitate understanding of the correspondence between the column numbers and the row numbers of the parity check matrix.)

Accordingly, $u=(u_1, u_2, u_3, \ldots, u_{y-1}, u_y, u_{y+1}, \ldots)^T=(X_{1,1}, X_{2,1}, X_{3,1}, X_{4,1}, X_{5,1}, X_{6,1}, X_{7,1}, P_{1,1}, P_{2,1},$ $X_{1,2}$, $X_{2,2}$, $X_{3,2}$, $X_{4,2}$, $X_{5,2}$, $X_{6,2}$, $X_{7,2}$, $P_{1,2}$, $P_{2,2}$, $X_{1,3}$, $X_{2,3}$, $X_{3,3}$, $X_{4,3}$, $X_{5,3}$, $X_{6,3}$, $X_{7,3}$, $P_{1,3}$, $P_{2,3}$, . . . , $X_{1,y-1}$, $X_{2,y-1}$, $X_{3,y-1}$, $X_{4,y-1}$, $X_{5,y-1}$, $X_{6,y-1}$, $X_{7,y-1}$, $P_{1,y-1}$, $P_{2,y-1}$, $X_{1,y}$, $X_{2,y}$, $X_{3,y}$, $X_{4,y}$, $X_{5,y}$, $X_{6,y}$, $X_{7,y}$, $P_{1,y}$, $P_{2,y}$, $X_{1,y+1}$, $X_{2,y+1}$, $X_{3,y+1}$, $X_{4,y+1}$, $X_{5,y+1}$, $X_{6,y+1}$, $X_{7,y+1}$, $P_{1,y+1}$, $P_{2,y+1}$, . . . $)^T$. Further, when using H to denote a parity check matrix for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, Hu=0 holds true (here, Hu=0 indicates that all elements of the vector Hu are zeroes).

FIG. 84 indicates a configuration of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the topmost row of the parity check matrix is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

As illustrated in FIG. 84:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression"; and "a vector for the (2×i)th row of the parity check matrix H can be generated from a parity check polynomial satisfying zero of #((i−1)%2m); second expression", and so on (where i is an integer no smaller than one).

FIG. 85 indicates a configuration of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the leftmost column of the parity check matrix $H_{pro\_m}$ is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

As illustrated in FIG. 85:

"a vector for the first column of the parity check matrix H is related to $X_1$ at time point 1";

"a vector for the second column of the parity check matrix H is related to $X_2$ at time point 1";

"a vector for the third column of the parity check matrix H is related to $X_3$ at time point 1";

"a vector for the fourth column of the parity check matrix H is related to $X_4$ at time point 1";

"a vector for the fifth column of the parity check matrix H is related to $X_5$ at time point 1";

"a vector for the sixth column of the parity check matrix H is related to $X_6$ at time point 1";

"a vector for the seventh column of the parity check matrix H is related to $X_7$ at time point 1";

"a vector for the eighth column of the parity check matrix H is related to $P_1$ at time point 1";

"a vector for the ninth column of the parity check matrix H is related to $P_2$ at time point 1";

⋮

"a vector for the 9×(j−1)+1th column of the parity check matrix H is related to $X_1$ at time point j";

"a vector for the 9×(j−1)+2th column of the parity check matrix H is related to $X_2$ at time point j";

"a vector for the 9×(j−1)+3th column of the parity check matrix H is related to $X_3$ at time point j";

"a vector for the 9×(j−1)+4th column of the parity check matrix H is related to $X_4$ at time point j";

"a vector for the 9×(j−1)+5th column of the parity check matrix H is related to $X_5$ at time point j";

"a vector for the 9×(j−1)+6th column of the parity check matrix H is related to $X_6$ at time point j";

"a vector for the 9×(j−1)+7th column of the parity check matrix H is related to $X_7$ at time point j";

"a vector for the 9×(j−1)+8th column of the parity check matrix H is related to $P_1$ at time point j";

"a vector for the 9×(j−1)+9th column of the parity check matrix H is related to $P_1$ at time point j" and so on (where j is an integer no smaller than one).

FIG. 86 indicates a parity check matrix for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The following focuses on $1\times X_1(D)$, $1\times X_2(D)$, $1\times X_3(D)$, $1\times X_4(D)$, $1\times X_5(D)$, $1\times X_6(D)$, $1\times X_7(D)$, $1\times P_1(D)$, $1\times P_2(D)$ in the parity check matrix for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The parity check polynomials at time point j=1 are parity check polynomials when i=0 in expressions (147-1-1), (147-1-2), (147-2-1), (147-2-2).

A vector for the first row in FIG. 86 can be generated from a parity check polynomial when i=0 in expression (147-1-1) or expression (147-1-2) (refer to FIG. 84).

In expressions (147-1-1) and (147-1-2):

terms for $1\times X_1(D)$, $1\times X_2(D)$, $1\times X_3(D)$ exist;

terms for $1\times X_4(D)$, $1\times X_5(D)$, $1\times X_6(D)$, $1\times X_7(D)$ do not exist; and a term for $1\times P_1(D)$ exists but a term for $1\times P_2(D)$ does not exist.

Further, the relationship between column numbers and $X_1$, $X_2$, $X_3$, $X_4$, $X_5$, $X_6$, $X_7$, $P_1$, $P_2$ is as indicated in FIG. 85. Based on the relationship indicated in FIG. 85 and the fact that terms for $1\times X_1(D)$, $1\times X_2(D)$, $1\times X_3(D)$ exist, columns related to $X_1$, $X_2$, $X_3$ in the vector for the first row in FIG. 86 are "1". Further, based on the relationship indicated in FIG. 85 and the fact that terms for $1\times X_4(D)$, $1\times X_5(D)$, $1\times X_6(D)$, $1\times X_7(D)$ do not exist, columns related to $X_4$, $X_5$, $X_6$, $X_7$ in the vector for the first row in FIG. 86 are "0". In addition, based on the relationship indicated in FIG. 85 and the fact that a term for $1\times P_1(D)$ exists but a term for $1\times P_2(D)$ does not exist, a column related to $P_1$ in the vector for the first row in FIG. 86 is "1", and a column related to $P_2$ in the vector for the first row in FIG. 86 is "0".

As such, the vector for the first row in FIG. 86 is "111000010", as indicated by 3900-1 in FIG. 86.

A vector for the second row in FIG. 86 can be generated from a parity check polynomial when i=0 in expression (147-2-1) or expression (147-2-2) (refer to FIG. 84).

In expressions (147-2-1) and (147-2-2):

terms for $1\times X_1(D)$, $1\times X_2(D)$, $1\times X_3(D)$ do not exist;

terms for $1\times X_4(D)$, $1\times X_5(D)$, $1\times X_6(D)$, $1\times X_7(D)$ exist; and a term for $1\times P_1(D)$ may or may not exist but a term for $1\times P_2(D)$ exists.

Further, the relationship between column numbers and $X_1$, $X_2$, $X_3$, $X_4$, $X_5$, $X_6$, $X_7$, $P_1$, $P_2$ is as indicated in FIG. 85. Based on the relationship indicated in FIG. 85 and the fact that terms for $1\times X_1(D)$, $1\times X_2(D)$, $1\times X_3(D)$ do not exist, columns related to $X_1$, $X_2$, $X_3$ in the vector for the second row in FIG. 86 are "0". Further, based on the relationship indicated in FIG. 85 and the fact that terms for $1\times X_4(D)$, $1\times X_5(D)$, $1\times X_6(D)$, $1\times X_7(D)$ exist, columns related to $X_4$, $X_5$, $X_6$, $X_7$ in the vector for the second row in FIG. 86 are "1". In addition, based on the relationship indicated in FIG. 85 and the fact that a term for $1\times P_1(D)$ may or may not exist but a term for $1\times P_2(D)$ exists, a column related to $P_1$ in the vector for the second row in FIG. 86 is "Y", and a column related to $P_2$ in the vector for the second row in FIG. 86 is "1", where Y is either "0" or "1".

As such, the vector for the second row in FIG. 86 is "0001111Y1", as indicated by 3900-2 in FIG. 86.

The parity check polynomials at time point j=2 are parity check polynomials when i=0 in expressions (148-1-1), (148-1-2), (148-2-1), (148-2-2).

A vector for the third row in FIG. 86 can be generated from a parity check polynomial when i=0 in expression (148-1-1) or expression (148-1-2) (refer to FIG. 84).

In expressions (148-1-1) and (148-1-2):

terms for $1\times X_1(D)$, $1\times X_2(D)$, $1\times X_3(D)$ do not exist;

terms for $1\times X_4(D)$, $1\times X_5(D)$, $1\times X_6(D)$, $1\times X_7(D)$ exist; and a term for $1\times P_1(D)$ exists but a term for $1\times P_2(D)$ does not exist.

Further, the relationship between column numbers and $X_1$, $X_2$, $X_3$, $X_4$, $X_5$, $X_6$, $X_7$, $P_1$, $P_2$ is as indicated in FIG. 85. Based on the relationship indicated in FIG. 85 and the fact that terms for $1\times X_1(D)$, $1\times X_2(D)$, $1\times X_3(D)$ do not exist, columns related to $X_1$, $X_2$, $X_3$ in the vector for the third row in FIG. 86 are "0". Further, based on the relationship indicated in FIG. 85 and the fact that terms for $1\times X_4(D)$, $1\times X_5(D)$, $1\times X_6(D)$, $1\times X_7(D)$ exist, columns related to $X_4$, $X_5$, $X_6$, $X_7$ in the vector for the third row in FIG. 86 are "1". In addition, based on the relationship indicated in FIG. 85 and the fact that a term for $1\times P_1(D)$ exists but a term for $1\times P_2(D)$ does not exist, a column related to $P_1$ in the vector for the third row in FIG. 86 is "1", and a column related to $P_2$ in the vector for the third row in FIG. 86 is "0".

As such, the vector for the third row in FIG. 86 is "000111110", as indicated by 3901-1 in FIG. 86.

A vector for the fourth row in FIG. 86 can be generated from a parity check polynomial when i=0 in expression (148-2-1) or expression (148-2-2) (refer to FIG. 84).

In expressions (148-2-1) and (148-2-2):

terms for $1\times X_1(D)$, $1\times X_2(D)$, $1\times X_3(D)$ exist;

terms for $1\times X_4(D)$, $1\times X_5(D)$, $1\times X_6(D)$, $1\times X_7(D)$ do not exist; and a term for $1\times P_1(D)$ may or may not exist but a term for $1\times P_2(D)$ exists.

Further, the relationship between column numbers and $X_1$, $X_2$, $X_3$, $X_4$, $X_5$, $X_6$, $X_7$, $P_1$, $P_2$ is as indicated in FIG. 85. Based on the relationship indicated in FIG. 85 and the fact that terms for $1\times X_1(D)$, $1\times X_2(D)$, $1\times X_3(D)$ exist, columns related to $X_1$, $X_2$, $X_3$ in the vector for the fourth row in FIG. 86 are "1". Further, based on the relationship indicated in FIG. 85 and the fact that terms for $1\times X_4(D)$, $1\times X_5(D)$, $1\times X_6(D)$, $1\times X_7(D)$ do not exist, columns related to $X_4$, $X_5$, $X_6$, $X_7$ in the vector for the fourth row in FIG. 86 are "0".

In addition, based on the relationship indicated in FIG. 85 and the fact that a term for $1\times P_1(D)$ may or may not exist but a term for $1\times P_2(D)$ exists, a column related to $P_1$ in the vector for the fourth row in FIG. 86 is "Y", and a column related to $P_2$ in the vector for the fourth row in FIG. 86 is "1".

As such, the vector for the fourth row in FIG. 86 is "1110000Y1", as indicated by 3901-2 in FIG. 86.

Because it can be considered that the above similarly applies to cases where time point j=3, 4, 5, the parity check matrix H has the configuration indicated in FIG. 86.

That is, due to the parity check polynomials of expressions (147-1-1), (147-1-2), (147-2-1), (147-2-2) being used at time point j=2k+1 (where k is an integer no smaller than zero), "111000010" exists in the 2×(2k+1)−1th row of the parity check matrix H, and "0001111Y1" exists in the 2×(2k+1)th row of the parity check matrix H, as illustrated in FIG. 86.

Further, due to the parity check polynomials of expressions (148-1-1), (148-1-2), (148-2-1), (148-2-2) being used at time point j=2k+2 (where k is an integer no smaller than zero), "000111110" exists in the 2×(2k+2)−1th row of the parity check matrix H, and "1110000Y1" exists in the 2×(2k+2)th row of the parity check matrix H, as illustrated in FIG. 86.

Accordingly, as illustrated in FIG. 86, when denoting a column number of a leftmost column corresponding to "1" in "111000010" in a row where "111000010" exists (e.g., 3900-1 in FIG. 86) as "a", "000111110" (e.g., 3901-1 in FIG. 86) exists in a row that is two rows below the row where "111000010" exists, starting from column "a+9".

Similarly, as illustrated in FIG. 86, when denoting a column number of a leftmost column corresponding to "1" in "0001111Y1" in a row where "0001111Y1" exists (e.g., 3900-2 in FIG. 86) as "b", "1110000Y1" (e.g., 3901-2 in FIG. 86) exists in a row that is two rows below the row where "0001111Y1" exists, starting from column "b+9".

Similarly, as illustrated in FIG. 86, when denoting a column number of a leftmost column corresponding to "1" in "000111110" in a row where "000111110" exists (e.g., 3901-1 in FIG. 86) as "c", "111000010" (e.g., 3902-1 in FIG. 86) exists in a row that is two rows below the row where "000111110" exists, starting from column "c+9".

Similarly, as illustrated in FIG. 86, when denoting a column number of a leftmost column corresponding to "1" in "1110000Y1" in a row where "1110000Y1" exists (e.g., 3901-2 in FIG. 86) as "d", "0001111Y1" (e.g., 3902-2 in FIG. 86) exists in a row that is two rows below the row where "1110000Y1" exists, starting from column "d+9".

The following describes a parity check matrix for an LDPC-CC of coding rate 7/9 and time-varying period 2×m that is based on a parity check polynomial when tail-biting is not performed, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

In the following, $H_{com}[u][v]$ (where u and v are integers no smaller than one) denotes an element at row "u" column "v" of a parity check matrix for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Based on description above provided with reference to FIG. 84:

"a vector for the 2×g−1th row of the parity check matrix H can be generated from a parity check polynomial satisfying zero of #((g−1)%2m); first expression"; and "a vector for the (2×g)th row of the parity check matrix H can be generated from a parity check polynomial satisfying zero of #((g−1)%2m); second expression" (where g is an integer no smaller than one).

Based on description above provided with reference to FIG. 85:

"a vector for the 9×(j−1)+1th column of the parity check matrix H is related to $X_1$ at time point j";

"a vector for the 9×(j−1)+2th column of the parity check matrix H is related to $X_2$ at time point j";

"a vector for the 9×(j−1)+3th column of the parity check matrix H is related to $X_3$ at time point j";

"a vector for the 9×(j−1)+4th column of the parity check matrix H is related to $X_4$ at time point j";

"a vector for the 9×(j−1)+5th column of the parity check matrix H is related to $X_5$ at time point j";

"a vector for the 9×(j−1)+6th column of the parity check matrix H is related to $X_6$ at time point j";

"a vector for the 9×(j−1)+7th column of the parity check matrix H is related to $X_7$ at time point j";

"a vector for the 9×(j−1)+8th column of the parity check matrix H is related to $P_1$ at time point j";

"a vector for the 9×(j−1)+9th column of the parity check matrix H is related to $P_2$ at time point j"; (where j is an integer no smaller than one).

Based on the above, the following describes component $H_{com}[2\times g-1][v]$ in row 2×g−1 (where g is an integer no smaller than one) and component $H_{com}[2\times g][v]$ in row 2×g of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a parity check polynomial satisfying zero of #((g−1)%2m); first expression can be used to generate a vector for row 2×g−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #((g−1)%2m); second expression can be used to generate a vector for row 2×g of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, when g=2×f−1 (where f is an integer no smaller than one), a parity check polynomial satisfying zero of #(((2×f−1)−1)%2m); first expression, or that is, a parity check polynomial satisfying zero of either expression (147-1-1) or expression (147-1-2), can be used to generate a vector for row 2×(2×f−1)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f−1)−1)%2m); second expression, or that is, a parity check polynomial satisfying zero of either expression (147-2-1) or expression (147-2-2), can be used to generate a vector for row 2×(2×f−1) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, when g=2×f (where f is an integer no smaller than one), a parity check polynomial satisfying zero of #(((2×f)−1)%2m); first expression, or that is, a parity check polynomial satisfying zero of either expression (148-1-1) or expression (148-1-2), can be used to generate a vector for row 2×(2×f)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f)−1)%2m); second expression, or that is, a parity check polynomial satisfying zero of either expression (148-2-1) or expression (148-2-2), can be used to generate a vector for row 2×(2×f) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, (1) when g=2×f−1 (where f is an integer no smaller than one), when a vector for row 2×(2×f−1)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (147-1-1), (2×f−1)−1)%2m=2c holds true. Accordingly, a parity check polynomial satisfying zero of expression (147-1-1) where 2i=2c holds true (where c is an integer no smaller than zero and no greater than m−1).

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 588]

$$H_{com}[2\times(2\times f-1)-1][9\times((2\times f-1)-0-1)+1]=1 \quad (149\text{-}1)$$

When y is an integer no smaller than one and no greater than $R_{\#(2c),1}$, and $(2\times f-1)-\alpha_{\#(2c),1,y}-1\geq 0$:

$$H_{com}[2\times(2\times f-1)-1][9\times((2\times f-1)-\alpha_{\#(2c),1,y}-1)+1]=1 \quad (149\text{-}2)$$

For all u being an integer no smaller than one satisfying $\{u\neq(2\times f-1)-0\}$ and $\{(2\times f-1)-\alpha_{\#(2c),1,y}\}$ (where y is an integer no smaller than one and no greater than $R_{\#(2c),1}$):

$$H_{com}[2\times(2\times f-1)-1][9\times(u-1)+1]=0 \quad (149\text{-}3)$$

Considered in a similar manner, the following holds true for $X_w$. In the following, w is an integer no smaller than one and no greater than three.

[Math. 589]

$$H_{com}[2\times(2\times f-1)-1][15\times((2\times f-1)-0-1)+w]=1 \quad (150\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)-1][15\times((2\times f-1)-\alpha_{\#(2c),w,y}-1)+w]=1 \quad (150\text{-}2)$$

For all u being an integer no smaller than one satisfying $\{u\neq(2\times f-1)-0\}$ and $\{u\neq(2\times f-1)-\alpha_{\#(2c),w,y}\}$ (where y is an integer no smaller than one and no greater than $R_{\#(2c),w}$):

$$H_{com}[2\times(2\times f-1)-1][15\times(u-1)+w]=0 \quad (150\text{-}3)$$

Further, the following holds true for $X_4$. In the following, y is an integer no smaller than $R_{\#(2c),4}+1$ and no greater than $r_{\#(2c),4}$.

[Math. 590]

When $(2\times f-1)-\alpha_{\#(2c),4,y}-1\geq 0$:

$$H_{com}[2\times(2\times f-1)-1][9\times((2\times f-1)-\alpha_{\#(2c),4,y}-1)+4]=1 \quad (151\text{-}1)$$

For all u being an integer no smaller than one satisfying $\{u\neq(2\times f-1)-\alpha_{\#(2c),4,y}\}$ (where y is an integer no smaller than $R_{\#(2c),4}+1$ and no greater than $r_{\#(2c),4}$):

$$H_{com}[2\times(2\times f-1)-1][9\times(u-1)+4]=0 \quad (151\text{-}2)$$

Considered in a similar manner, the following holds true for $X_z$. In the following, z is an integer no smaller than four and no greater than seven, and y is an integer no smaller than $R_{\#(2c),z}+1$ and no greater than $r_{\#(2c),z}$.

[Math. 591]

When $(2\times f-1)-\alpha_{\#(2c),z,y}-1\geq 0$:

$$H_{com}[2\times(2\times f-1)-1][9\times((2\times f-1)-\alpha_{\#(2c),z,y}-1)+z]-1 \quad (152\text{-}1)$$

For all u being an integer no smaller than one satisfying $\{u\neq(2\times f-1)-\alpha_{\#(2c),z,y}\}$ (where y is an integer no smaller than $R_{\#(2c),z}+1$ and no greater than $r_{\#(2c),z}$):

$$H_{com}[2\times(2\times f-1)-1][9\times(u-1)+z]=0 \quad (152\text{-}2)$$

The following holds true for $P_1$.

[Math. 592]

$$H_{com}[2\times(2\times f-1)-1][9\times((2\times f-1)-0-1)+8]=1 \quad (153\text{-}1)$$

For all u being an integer no smaller than one satisfying $\{u\neq(2\times f-1)-0\}$:

$$H_{com}[2\times(2\times f-1)-1][9\times(u-1)+8]=0 \quad (153\text{-}2)$$

The following holds true for $P_2$.

[Math. 593]

When $(2\times f-1)-\beta_{\#(2c),0}-1\geq 0$:

$$H_{com}[2\times(2\times f-1)-1][9\times((2\times f-1)-\beta_{\#(2c),0}-1)+9]=1 \quad (154\text{-}1)$$

For all u being an integer no smaller than one satisfying $\{u\neq(2\times f-1)-\beta_{\#(2c),0}\}$:

$$H_{com}[2\times(2\times f-1)-1][9\times(u-1)+9]=0 \quad (154\text{-}2)$$

Further, (2) when g=2×f−1 (where f is an integer no smaller than one), when a vector for row 2×(2×f−1)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (147-1-2), ((2×f−1)−1)%2m=2c holds true. Accordingly, a parity check polynomial satisfying zero of expression (147-1-2) where 2i=2c holds true (where c is an integer no smaller than zero and no greater than m−1).

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 594]

$$H_{com}[2\times(2\times f-1)-1][9\times((2\times f-1)-0-1)+1]=1 \quad (155\text{-}1)$$

When y is an integer no smaller than one and no greater than $R_{\#(2c),1}$, and $(2\times f-1)-\alpha_{\#(2c),1,y}-1\geq 0$:

$$H_{com}[2\times(2\times f-1)-1][9\times((2\times f-1)-\alpha_{\#(2c),1,y}-1)+1]=1 \quad (155\text{-}2)$$

For all u being an integer no smaller than one satisfying $\{u\neq(2\times f-1)-0\}$ and $\{(2\times f-1)-\alpha_{\#(2c),1,y}\}$ (where y is an integer no smaller than one and no greater than $R_{\#(2c),1}$):

$$H_{com}[2\times(2\times f-1)-1][9\times(u-1)+1]=0 \quad (155\text{-}3)$$

Considered in a similar manner, the following holds true for $X_w$. In the following, w is an integer no smaller than one and no greater than three.

[Math. 595]

$$H_{com}[2\times(2\times f-1)-1][9\times((2\times f-1)-0-1)+w]=1 \quad (156\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)-1][9\times((2\times f-1)-\alpha_{\#(2c),w,y}-1)+w]=1 \quad (156\text{-}2)$$

For all u being an integer no smaller than one satisfying $\{u\neq(2\times f-1)-0\}$ and $\{u\neq(2\times f-1)-\alpha_{\#(2c),w,y}\}$ (where y is an integer no smaller than one and no greater than $R_{\#(2c),w}$):

$$H_{com}[2\times(2\times f-1)-1][9\times(u-1)+w]=0 \quad (156\text{-}3)$$

Further, the following holds true for $X_4$. In the following, y is an integer no smaller than $R_{\#(2c),4}+1$ and no greater than $r_{\#(2c),4}$.

[Math. 596]

When $(2\times f-1)-\alpha_{\#(2c),4,y}-1\geq 0$:

$$H_{com}[2\times(2\times f-1)-1][9\times((2\times f-1)-\alpha_{\#(2c),4,y}-1)+4]=1 \quad (157\text{-}1)$$

For all u being an integer no smaller than one satisfying $\{u\neq(2\times f-1)-\alpha_{\#(2c),4,y}\}$ (where y is an integer no smaller than $R_{\#(2c),4}+1$ and no greater than $r_{\#(2c),4}$):

$$H_{com}[2\times(2\times f-1)-1][9\times(u-1)+4]=0 \quad (157\text{-}2)$$

Considered in a similar manner, the following holds true for $X_z$. In the following, z is an integer no smaller than four and no greater than seven, and y is an integer no smaller than $R_{\#(2c),z}+1$ and no greater than $r_{\#(2c),z}$.

[Math. 597]

When $(2\times f-1)-\alpha_{\#(2c),z,y}-1\geq 0$:

$$H_{com}[2\times(2\times f-1)-1][9\times((2\times f-1)-\alpha_{\#(2c),z,y}-1)+z]=1 \quad (158\text{-}1)$$

For all u being an integer no smaller than one satisfying $\{u\neq(2\times f-1)-\alpha_{\#(2c),z,y}\}$ (where y is an integer no smaller than $R_{\#(2c),z}+1$ and no greater than $r_{\#(2c),z}$):

$$H_{com}[2\times(2\times f-1)-1][9\times(u-1)+z]=0 \quad (158\text{-}2)$$

The following holds true for $P_1$.

[Math. 598]

$$H_{com}[2\times(2\times f-1)-1][9\times((2\times f-1)-0-1)+8]=1 \quad (159\text{-}1)$$

When $(2\times f-1)-\beta_{\#(2c),1}-1\geq 0$:

$$H_{com}[2\times(2\times f-1)-1][9\times((2\times f-1)-\beta_{\#(2c),1}-1)+8]=1 \quad (159\text{-}2)$$

For all u being an integer no smaller than one satisfying $\{u\neq(2\times f-1)-0$ and $u\neq(2\times f-1)-\beta_{\#(2c),1}1\}$:

$$H_{com}[2\times(2\times f-1)-1][9\times(u-1)+8]=0 \quad (159\text{-}3)$$

The following holds true for $P_2$.

[Math. 599]

For all u being an integer no smaller than one:

$$H_{com}[2\times(2\times f-1)-1][9\times(u-1)+9]=0 \quad (160)$$

Further, (3) when g=2×f−1 (where f is an integer no smaller than one), when a vector for row 2×(2×f−1) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (147-2-1), (2×f−1)−1)%2m=2c holds true. Accordingly, a parity check polynomial satisfying zero of expression (147-2-1) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, and y is an integer no smaller than $R_{\#(2c),1}+1$ and no greater than $r_{\#(2c),1}$.

[Math. 600]

When $(2\times f-1)-\alpha_{\#(2c),1,y}1\geq 0$:

$$H_{com}[2\times(2\times f-1)][9\times((2\times f-1)-\alpha_{\#(2c),1,y}-1)+1]=1 \quad (161\text{-}1)$$

For all u being an integer no smaller than one satisfying $\{u\neq(2\times f-1)-\alpha_{\#(2c),1,y}\}$ (where y is an integer no smaller than $R_{\#(2c),1}+1$ and no greater than $r_{\#(2c),1}$):

$$H_{com}[2\times(2\times f-1)][9\times(u-1)+1]=0 \quad (161\text{-}2)$$

Considered in a similar manner, the following holds true for $X_z$. In the following, z is an integer no smaller than one and no greater than three, and y is an integer no smaller than $R_{\#(2c),z}+1$ and no greater than $r_{\#(2c),z}$.

[Math. 601]

When $(2\times f-1)-\alpha_{\#(2c),z,y}-1\geq 0$:

$$H_{com}[2\times(2\times f-1)][9\times((2\times f-1)-\alpha_{\#(2c),z,y}-1)+z]=1 \quad (162\text{-}1)$$

For all u being an integer no smaller than one satisfying $\{u\neq(2\times f-1)-\alpha_{\#(2c),z,y}\}$ (where y is an integer no smaller than $R_{\#(2c),z}+1$ and no greater than $r_{\#(2c),z}$):

$$H_{com}[2\times(2\times f-1)][9\times(u-1)+z]=0 \quad (162\text{-}2)$$

Further, the following holds true for $X_4$.

[Math. 602]

$$H_{com}[2\times(2\times f-1)][9\times((2\times f-1)-0-1)+4]=1 \quad (163\text{-}1)$$

When y is an integer no smaller than one and no greater than $R_{\#(2c),4}$, and $(2\times f-1)-\alpha_{\#(2c),4,y}-1\geq 0$:

$$H_{com}[2\times(2\times f-1)][9\times((2\times f-1)-\alpha_{\#(2c),4,y}-1)+4]=1 \quad (163\text{-}2)$$

For all u being an integer no smaller than one satisfying $\{u\neq(2\times f-1)-0\}$ and $\{u\neq(2\times f-1)-\alpha_{\#(2c),4,y}\}$ (where y is an integer no smaller than one and no greater than $R_{\#(2c),4}$):

$$H_{com}[2\times(2\times f-1)][9\times(u-1)+4]=0 \quad (163\text{-}3)$$

Considered in a similar manner, the following holds true for $X_w$. In the following, w is an integer no smaller than four and no greater than seven.

[Math. 603]

$$H_{com}[2\times(2\times f-1)][9\times((2\times f-1)-0-1)+w]=1 \quad (164\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)][9\times((2\times f-1)-\alpha_{\#(2c),w,y}-1)+w]=1 \quad (164\text{-}2)$$

For all u being an integer no smaller than one satisfying $\{u\neq(2\times f-1)-0\}$ and $\{u\neq(2\times f-1)-\alpha_{\#(2c),w,y}\}$ (where y is an integer no smaller than one and no greater than $R_{\#(2c),w}$):

$$H_{com}[2\times(2\times f-1)][9\times(u-1)+w]=0 \quad (164\text{-}3)$$

The following holds true for $P_1$.

[Math. 604]

When $(2\times f-1)-\beta_{\#(2c),2}-1\geq 0$:

$$H_{com}[2\times(2\times f-1)][9\times((2\times f-1)-\beta_{\#(2c),2}-1)+8]=1 \quad (165\text{-}1)$$

For all u being an integer no smaller than one satisfying $\{u\neq(2\times f-1)-\beta_{\#(2c),2}\}$:

$$H_{com}[2\times(2\times f-1)][9\times(u-1)+8]=0 \quad (165\text{-}2)$$

The following holds true for $P_2$.

[Math. 605]

$$H_{com}[2\times(2\times f-1)][9\times((2\times f-1)-0-1)+9]=1 \quad (166\text{-}1)$$

For all u being an integer no smaller than one satisfying $\{u\neq(2\times f-1)-0\}$:

$$H_{com}[2\times(2\times f-1)][9\times(u-1)+9]=0 \quad (166\text{-}2)$$

Further, (4) when g=2×f−1 (where f is an integer no smaller than one), when a vector for row 2×(2×f−1) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (147-2-2), (2×f−1)−1)%2m=2c holds true. Accordingly, a parity check polynomial satisfying zero of expression (147-2-2) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than $R_{\#(2c),1}+1$ and no greater than $r_{\#(2c),1}$.

[Math. 606]

When $(2\times f-1)-\alpha_{\#(2c),1,y}-1\geq 0$:

$$H_{com}[2\times(2\times f-1)][9\times((2\times f-1)-\alpha_{\#(2c),1,y}-1)+1]=1 \quad (167\text{-}1)$$

For all u being an integer no smaller than one satisfying $\{u\neq(2\times f-1)-\alpha_{\#(2c),1,y}\}$ (where y is an integer no smaller than $R_{\#(2c),1}+1$ and no greater than $r_{\#(2c),1}$):

$$H_{com}[2\times(2\times f-1)][9\times(u-1)+1]=0 \quad (167\text{-}2)$$

Considered in a similar manner, the following holds true for $X_z$. In the following, z is an integer no smaller than one and no greater than three, and y is an integer no smaller than $R_{\#(2c),z}+1$ and no greater than $r_{\#(2c),z}$.

[Math. 607]

When $(2\times f-1)-\alpha_{\#(2c),z,y}-1\geq 0$:

$$H_{com}[2\times(2\times f-1)][9\times((2\times f-1)-\alpha_{\#(2c),z,y}-1)+z]=1 \quad (168\text{-}1)$$

For all u being an integer no smaller than one satisfying $\{u\neq(2\times f-1)-\alpha_{\#(2c),z,y}\}$ (where y is an integer no smaller than $R_{\#(2c),z}+1$ and no greater than $r_{\#(2c),z}$):

$$H_{com}[2\times(2\times f-1)][9\times(u-1)+z]=0 \quad (168\text{-}2)$$

Further, the following holds true for $X_4$.

[Math. 608]

$$H_{com}[2\times(2\times f-1)][9\times((2\times f-1)-0-1)+4]=1 \quad (169\text{-}1)$$

When y is an integer no smaller than one and no greater than $R_{\#(2c),4}$, and $(2\times f-1)-\alpha_{\#(2c),4,y}-1\geq 0$:

$$H_{com}[2\times(2\times f-1)][9\times((2\times f-1)-\alpha_{\#(2c),4,y}-1)+4]=1 \quad (169\text{-}2)$$

For all u being an integer no smaller than one satisfying $\{u\neq(2\times f-1)-0\}$ and $\{u\neq(2\times f-1)-\alpha_{\#(2c),4,y}\}$ (where y is an integer no smaller than one and no greater than $R_{\#(2c),4}$):

$$H_{com}[2\times(2\times f-1)][9\times(u-1)+4]=0 \quad (169\text{-}3)$$

Considered in a similar manner, the following holds true for $X_w$. In the following, w is an integer no smaller than four and no greater than seven.

[Math. 609]

$$H_{com}[2\times(2\times f-1)][9\times((2\times f-1)-0-1)+w]=1 \quad (170\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)][9\times((2\times f-1)-\alpha_{\#(2c),w,y}-1)+w]=1 \quad (170\text{-}2)$$

For all u being an integer no smaller than one satisfying $\{u\neq(2\times f-1)-0\}$ and $\{u\neq(2\times f-1)-\alpha_{\#(2c),w,y}\}$ (where y is an integer no smaller than one and no greater than $R_{\#(2c),w}$):

$$H_{com}[2\times(2\times f-1)][9\times(u-1)+w]=0 \quad (170\text{-}3)$$

The following holds true for $P_1$.

[Math. 610]

For all u being an integer no smaller than one:

$$H_{com}[2\times(2\times f-1)][9\times(u-1)+8]=0 \quad (171)$$

The following holds true for $P_2$.

[Math. 611]

$$H_{com}[2\times(2\times f-1)][9\times((2\times f-1)-0-1)+9]=1 \quad (172\text{-}1)$$

When $(2\times f-1)-\beta_{\#(2c),3}-1\geq 0$:

$$H_{com}[2\times(2\times f-1)][9\times((2\times f-1)-\beta_{\#(2c),3}-1)+9]=1 \quad (172\text{-}2)$$

For all u being an integer no smaller than one satisfying $\{u\neq(2\times f-1)-0$ and $u\neq(2\times f-1)-\beta_{\#(2c),3}\}$:

$$H_{com}[2\times(2\times f-1)][9\times(u-1)+9]=0 \quad (172\text{-}3)$$

Further, (5) when g=2×f (where f is an integer no smaller than one), when a vector for row 2×(2×f)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (148-1-1), ((2×f)−1)%2m=2d+1 holds true. Accordingly, a parity check polynomial satisfying zero of expression (148-1-1) where 2i+1=2d+1 holds true (where d is an integer no smaller than zero and no greater than m−1).

Accordingly, component $H_{com}[2\times g-1][v]=H_{com}[2\times(2\times f)-1][v]$ in row 2×g−1, or that is, row 2×(2×f)−1 of the parity check matrix H, which is for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than $R_{\#(2d+1),1}+1$ and no greater than $r_{\#(2d+1),1}$.

[Math. 612]

When $(2\times f)-\alpha_{\#(2d+1),1,y}-1\geq 0$:

$$H_{com}[2\times(2\times f)-1][9\times((2\times f)-\alpha_{\#(2d+1),1,y}-1)+1]=1 \quad (173\text{-}1)$$

For all u being an integer no smaller than one satisfying $\{u\neq(2\times f)-\alpha_{\#(2d+1),1,y}\}$ (where y is an integer no smaller than $R_{\#(2d+1),1}+1$ and no greater than $r_{\#(2d+1),1}$):

$$H_{com}[2\times(2\times f)-1][9\times(u-1)+1]=0 \quad (173\text{-}2)$$

Considered in a similar manner, the following holds true for $X_z$. In the following, z is an integer no smaller than one and no greater than three, and y is an integer no smaller than $R_{\#(2d+1),z}+1$ and no greater than $r_{\#(2d+1),z}$.

[Math. 613]

When $(2\times f)-\alpha_{\#(2d+1),z,y}-1\geq 0$:

$$H_{com}[2\times(2\times f)-1][9\times((2\times f)-\alpha_{\#(2d+1),z,y}-1)+z]=1 \quad (174\text{-}1)$$

For all u being an integer no smaller than one satisfying $\{u\neq(2\times f)-\alpha_{\#(2d+1),z,y}\}$ (where y is an integer no smaller than $R_{\#(2d+1),z}+1$ and no greater than $r_{\#(2d+1),z}$):

$$H_{com}[2\times(2\times f)-1][9\times(u-1)+z]=0 \quad (174\text{-}2)$$

Further, the following holds true for $X_4$.

[Math. 614]

$$H_{com}[2\times(2\times f)-1][9\times((2\times f)-0-1)+4]=1 \quad (175\text{-}1)$$

When y is an integer no smaller than one and no greater than $R_{\#(2d+1),4}$, and $(2\times f)-\alpha_{\#(2d+1),4,y}-1\geq 0$:

$$H_{com}[2\times(2\times f)-1][9\times((2\times f)-\alpha_{\#(2d+1),4,y}-1)+4]=1 \quad (175\text{-}2)$$

For all u being an integer no smaller than one satisfying $\{u\neq(2\times f)-0\}$ and $\{u\neq(2\times f)-\alpha_{\#(2d+1),4,y}\}$ (where y is an integer no smaller than one and no greater than $R_{\#(2d+1),4}$):

$$H_{com}[2\times(2\times f)-1][9\times(u-1)+4]=0 \quad (175\text{-}3)$$

Considered in a similar manner, the following holds true for $X_w$. In the following, w is an integer no smaller than four and no greater than seven.

[Math. 615]

$$H_{com}[2\times(2\times f)-1][9\times((2\times f)-0-1)+w]=1 \quad (176\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)-1][9\times((2\times f)-\alpha_{\#(2d+1),w,y}-1)+w]=1 \quad (176\text{-}2)$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$):

$$H_{com}[2\times(2\times f)-1][9\times(u-1)+w]=0 \quad (176\text{-}3)$$

The following holds true for $P_1$.

[Math. 616]

$$H_{com}[2\times(2\times f)-1][9\times((2\times f)-0-1)+8]=1 \quad (177\text{-}1)$$

For all u being an integer no smaller than one satisfying $\{u\neq(2\times f)-0\}$:

$$H_{com}[2\times(2\times f)-1][9\times(u-1)+8]=0 \quad (177\text{-}2)$$

The following holds true for $P_2$.

[Math. 617]

When $(2\times f)-\beta_{\#(2d+1),0}-1\geq 0$:

$$H_{com}[2\times(2\times f)-1][9\times((2\times f)-\beta_{\#(2d+1),0}-1)+9]=1 \quad (178\text{-}1)$$

For all u being an integer no smaller than one satisfying $\{u\neq(2\times f)-\beta_{\#(2d+1),0}\}$:

$$H_{com}[2\times(2\times f)-1][9\times(u-1)+9]=0 \quad (178\text{-}2)$$

Further, (6) when g=2×f (where f is an integer no smaller than one), when a vector for row 2×(2×f)−1 of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (148-1-2), ((2×f)−1) %2m=2d+1 holds true. Accordingly, a parity check polynomial satisfying zero of expression (148-1-2) where 2i+1=2d+1 holds true (where d is an integer no smaller than zero and no greater than m−1).

Accordingly, component $H_{com}[2\times g-1][v]=H_{com}[2\times(2\times f)-1][v]$ in row 2×g−1, or that is, row 2×(2×f)−1 of the parity check matrix H, which is for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than $R_{\#(2d+1),1}+1$ and no greater than $r_{\#(2d+1),1}$.

[Math. 618]

When $(2\times f)-\alpha_{\#(2d+1),1,y}-1\geq 0$:

$$H_{com}[2\times(2\times f)-1][9\times((2\times f)-\alpha_{\#(2d+1),1,y}-1)+1]=1 \quad (179\text{-}1)$$

For all u being an integer no smaller than one satisfying $\{u\neq(2\times f)-\alpha_{\#(2d+1),1,y}\}$ (where y is an integer no smaller than $R_{\#(2d+1),1}+1$ and no greater than $r_{\#(2d+1),1}$):

$$H_{com}[2\times(2\times f)-1][9\times(u-1)+1]=0 \quad (179\text{-}2)$$

Considered in a similar manner, the following holds true for $X_z$. In the following, z is an integer no smaller than one and no greater than three, and y is an integer no smaller than $R_{\#(2d+1),z}+1$ and no greater than $r_{\#(2d+1),z}$.

[Math. 619]

When $(2\times f)-\alpha_{\#(2d+1),z,y}-1\geq 0$:

$$H_{com}[2\times(2\times f)-1][9\times((2\times f)-\alpha_{\#(2d+1),z,y}-1)+z]=1 \quad (180\text{-}1)$$

For all u being an integer no smaller than one satisfying $\{u\neq(2\times f)-\alpha_{\#(2d+1),z,y}\}$ (where y is an integer no smaller than $R_{\#(2d+1),z}+1$ and no greater than $r_{\#(2d+1),z}$):

$$H_{com}[2\times(2\times f)-1][9\times(u-1)+z]=0 \quad (180\text{-}2)$$

Further, the following holds true for $X_4$.

[Math. 620]

$$H_{com}[2\times(2\times f)-1][9\times((2\times f)-0-1)+4]=1 \quad (181\text{-}1)$$

When y is an integer no smaller than one and no greater than $R_{\#(2d+1),4}$, and $(2\times f)-\alpha_{\#(2d+1),4,y}-1\geq 0$:

$$H_{com}[2\times(2\times f)-1][9\times((2\times f)-\alpha_{\#(2d+1),4,y}-1)+4]=1 \quad (181\text{-}2)$$

For all u being an integer no smaller than one satisfying $\{u\neq(2\times f)-0\}$ and $\{u\neq(2\times f)-\alpha_{\#(2d+1),4,y}\}$ (where y is an integer no smaller than one and no greater than $R_{\#(2d+1),4}$):

$$H_{com}[2\times(2\times f)-1][9\times(u-1)+4]=0 \quad (181\text{-}3)$$

Considered in a similar manner, the following holds true for $X_w$. In the following, w is an integer no smaller than four and no greater than seven.

[Math. 621]

$$H_{com}[2\times(2\times f)-1][9\times((2\times f)-0-1)+w]=1 \quad (182\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)-1][9\times((2\times f)-\alpha_{\#(2d+1),w,y}-1)+w]=1 \quad (182\text{-}2)$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$):

$$H_{com}[2\times(2\times f)-1][9\times(u-1)+w]=0 \quad (182\text{-}3)$$

The following holds true for $P_1$.

[Math. 622]

$$H_{com}[2\times(2\times f)-1][9\times((2\times f)-0-1)+8]=1 \quad (183\text{-}1)$$

When $(2\times f)-\beta_{\#(2d+1),1}-1\geq 0$:

$$H_{com}[2\times(2\times f)-1][9\times((2\times f)-\beta_{\#(2d+1),1}-1)+8]=1 \quad (183\text{-}2)$$

For all u being an integer no smaller than one satisfying $\{u\neq(2\times f)-0 \text{ and } u\neq(2\times f)-\beta_{\#(2d+1),1}\}$:

$$H_{com}[2\times(2\times f)-1][9\times(u-1)+8]=0 \quad (183\text{-}3)$$

The following holds true for $P_2$.

[Math. 623]

For all u being an integer no smaller than one:

$$H_{com}[2\times(2\times f)-1][9\times(u-1)+9]=0 \quad (184)$$

Further, (7) when g=2×f (where f is an integer no smaller than one), when a vector for row 2×(2×f) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (148-2-1), ((2×f)−1) %2m=2d+1 holds true. Accordingly, a parity check polynomial satisfying zero of expression (148-2-1) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 624]

$$H_{com}[2\times(2\times f)][9\times((2\times f)-0-1)+1]=1 \quad (185\text{-}1)$$

When y is an integer no smaller than one and no greater than $R_{\#(2d+1),1}$, and $(2\times f)-\alpha_{\#(2d+1),1,y}-1\geq 0$:

$$H_{com}[2\times(2\times f)][9\times((2\times f)-\alpha_{\#(2d+1),1,y}-1)+1]=1 \quad (185\text{-}2)$$

For all u being an integer no smaller than one satisfying $\{u\neq(2\times f)-0\}$ and $\{u\neq(2\times f)-\alpha_{\#(2d+1),1,y}\}$ (where y is an integer no smaller than one and no greater than $R_{\#(2d+1),1}$):

$$H_{com}[2\times(2\times f)][9\times(u-1)+1]=0 \quad (185\text{-}3)$$

Considered in a similar manner, the following holds true for $X_w$. In the following, w is an integer no smaller than one and no greater than three.

[Math. 625]

$$H_{com}[2\times(2\times f)][9\times((2\times f)-0-1)+w]=1 \quad (186\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)][9\times((2\times f)-\alpha_{\#(2d+1),w,y}-1)+w]=1 \quad (186\text{-}2)$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$):

$$H_{com}[2\times(2\times f)][9\times(u-1)+w]=0 \quad (186\text{-}3)$$

Further, the following holds true for $X_4$. In the following, y is an integer no smaller than $R_{\#(2d+1),4}+1$ and no greater than $r_{\#(2d+1),4}$.

[Math. 626]

When $(2\times f)-\alpha_{\#(2d+1),4,y}-1\geq 0$:

$$H_{com}[2\times(2\times f)][9\times((2\times f)-\alpha_{\#(2d+1),4,y}-1)+4]=1 \quad (187\text{-}1)$$

For all u being an integer no smaller than one satisfying $\{u\neq(2\times f)-\alpha_{\#(2d+1),4,y}\}$ (where y is an integer no smaller than $R_{\#(2d+1),4}+1$ and no greater than $r_{\#(2d+1),4}$):

$$H_{com}[2\times(2\times f)][9\times(u-1)+4]=0 \quad (187\text{-}2)$$

Considered in a similar manner, the following holds true for $X_z$. In the following, z is an integer no smaller than four and no greater than seven, and y is an integer no smaller than $R_{\#(2d+1),z}+1$ and no greater than $r_{\#(2d+1),z}$.

[Math. 627]

When $(2\times f)-\alpha_{\#(2d+1),z,y}1\geq 0$:

$$H_{com}[2\times(2\times f)][9\times((2\times f)-\alpha_{\#(2d+1),z,y}-1)+z]=1 \quad (188\text{-}1)$$

For all u being an integer no smaller than one satisfying $\{u\neq(2\times f)-\alpha_{\#(2d+1),z,y}\}$ (where y is an integer no smaller than $R_{\#(2d+1),z}+1$ and no greater than $r_{\#(2d+1),z}$):

$$H_{com}[2\times(2\times f)][9\times(u-1)+z]=0 \quad (188\text{-}2)$$

The following holds true for $P_1$.

[Math. 628]

When $(2\times f)-\beta_{\#(2d+1),2}-1\geq 0$:

$$H_{com}[2\times(2\times f)][9\times((2\times f)-\beta_{\#(2d+1),2}-1)+8]=1 \quad (189\text{-}1)$$

For all u being an integer no smaller than one satisfying $\{u\neq(2\times f)-\beta_{\#(2d+1),2}\}$:

$$H_{com}[2\times(2\times f)][9\times(u-1)+8]=0 \quad (189\text{-}2)$$

The following holds true for $P_2$.

[Math. 629]

$$H_{com}[2\times(2\times f)][9\times((2\times f)-0-1)+9]=1 \quad (190\text{-}1)$$

For all u being an integer no smaller than one satisfying $\{u\neq(2\times f)-0\}$:

$$H_{com}[2\times(2\times f)][9\times(u-1)+9]=0 \quad (190\text{-}2)$$

Further, (8) when g=2×f (where f is an integer no smaller than one), when a vector for row 2×(2×f) of the parity check matrix H, which is for an LDPC-CC of coding rate 7/9 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (148-2-2), ((2×f)−1) %2m=2d+1 holds true. Accordingly, a parity check polynomial satisfying zero of expression (148-2-2) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 7/9 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 630]

$$H_{com}[2\times(2\times f)][9\times((2\times f)-0-1)+1]=1 \quad (191\text{-}1)$$

When y is an integer no smaller than one and no greater than $R_{\#(2d+1),1}$, and $(2\times f)-\alpha_{\#(2d+1),1,y}-1\geq 0$:

$$H_{com}[2\times(2\times f)][9\times((2\times f)-\alpha_{\#(2d+1),1,y}-1)+1]=1 \quad (191\text{-}2)$$

For all u being an integer no smaller than one satisfying $\{u \neq (2\times f)-0\}$ and $\{u \neq (2\times f)-\alpha_{\#(2d+1),1,y}\}$ (where y is an integer no smaller than one and no greater than $R_{\#(2d+1),1}$):

$$H_{com}[2\times(2\times f)][9\times(u-1)+1]=0 \quad (191\text{-}3)$$

Considered in a similar manner, the following holds true for $X_w$. In the following, w is an integer no smaller than one and no greater than three.

[Math. 631]

$$H_{com}[2\times(2\times f)][9\times((2\times f)-0-1)+w]=1 \quad (192\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)][9\times((2\times f)-\alpha_{\#(2d+1),w,y}-1)+w]=1 \quad (192\text{-}2)$$

For all u being an integer no smaller than one satisfying $\{u \neq (2\times f)-0\}$ and $\{u \neq (2\times f)-\alpha_{\#(2d+1),w,y}\}$ (where y is an integer no smaller than one and no greater than $R_{\#(2d+1),w}$):

$$H_{com}[2\times(2\times f)][9\times(u-1)+w]=0 \quad (192\text{-}3)$$

Further, the following holds true for $X_4$. In the following, y is an integer no smaller than $R_{\#(2d+1),4}+1$ and no greater than $r_{\#(2d+1),4}$.

[Math. 632]

When $(2\times f)-\alpha_{\#(2d+1),4,y}-1\geq 0$:

$$H_{com}[2\times(2\times f)][9\times((2\times f)-\alpha_{\#(2d+1),4,y}-1)+4]=1 \quad (193\text{-}1)$$

For all u being an integer no smaller than one satisfying $\{u \neq (2\times f)-\alpha_{\#(2d+1),4,y}\}$ (where y is an integer no smaller than $R_{\#(2d+1),4}+1$ and no greater than $r_{\#(2d+1),4}$):

$$H_{com}[2\times(2\times f)][9\times(u-1)+4]=0 \quad (193\text{-}2)$$

Considered in a similar manner, the following holds true for $X_z$. In the following, z is an integer no smaller than four and no greater than seven, and y is an integer no smaller than $R_{\#(2d+1),z}+1$ and no greater than $r_{\#(2d+1),z}$.

[Math. 633]

When $(2\times f)-\alpha_{\#(2d+1),z,y}-1\geq 0$:

$$H_{com}[2\times(2\times f)][9\times((2\times f)-\alpha_{\#(2d+1),z,y}-1)+z]=1 \quad (194\text{-}1)$$

For all u being an integer no smaller than one satisfying $\{u \neq (2\times f)-\alpha_{\#(2d+1),z,y}\}$ (where y is an integer no smaller than $R_{\#(2d+1),z}+1$ and no greater than $r_{\#(2d+1),z}$):

$$H_{com}[2\times(2\times f)][9\times(u-1)+z]=0 \quad (194\text{-}2)$$

The following holds true for $P_1$.

[Math. 634]

For all u being an integer no smaller than one:

$$H_{com}[2\times(2\times f)][9\times(u-1)+8]=0 \quad (195)$$

The following holds true for $P_2$.

[Math. 635]

$$H_{com}[2\times(2\times f)][9\times((2\times f)-0-1)+9]=1 \quad (196\text{-}1)$$

When $(2\times f)-\beta_{\#(2d+1),3}-1\geq 0$:

$$H_{com}[2\times(2\times f)][9\times((2\times f)-\beta_{\#(2d+1),3}-1)+9]=1 \quad (196\text{-}2)$$

For all u being an integer no smaller than one satisfying $\{u \neq (2\times f)-0 \text{ and } u \neq (2\times f)-\beta_{\#(2d+1),3}\}$:

$$H_{com}[2\times(2\times f)][9\times(u-1)+9]=0 \quad (196\text{-}3)$$

As such, an LDPC-CC of coding rate 7/9 and time-varying period 2×m that is based on a parity check polynomial can be generated by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, and the code so generated achieves high error correction capability.

Embodiment F3

In the present embodiment, description is provided of a device that uses the LDPC-CC of coding rate 7/9 that is based on a parity check polynomial, description of which has been provided in embodiments F1 and F2.

As one example, description is provided of a case where the LDPC-CC of coding rate 7/9 that is based on a parity check polynomial, description of which has been provided in embodiments F1 and F2, is applied to a communication device.

FIG. 22 illustrates the structures of a transmitting device 2200 and a receiving device 2210 in the communication device pertaining to the present embodiment.

An encoder 2201 receives information to be transmitted as input, and is capable of performing various types of encoding. In particular, when receiving a specification to perform encoding by using the LDPC-CC of coding rate 7/9 that is based on a parity check polynomial, description of which has been provided in embodiments F1 and F2, the encoder 2201 performs encoding by using the LDPC-CC of coding rate 7/9 that is based on a parity check polynomial, description of which has been provided in embodiments F1 and F2, to calculate parities $P_1$ and $P_2$. Further, the encoder 2201 outputs the information to be transmitted and the parities $P_1$ and $P_2$ as a transmission sequence.

A modulator 2202 receives the transmission sequence, which includes the information to be transmitted and the parities $P_1$ and $P_2$, performs mapping based on a predetermined modulation scheme (e.g., BPSK, QPSK, 16QAM, 64QAM), and outputs a baseband signal. Further, the modulator 2202 may also receive information other than the transmission sequence, which includes the information to be transmitted and the parities $P_1$ and $P_2$, as input, perform mapping, and output a baseband signal. For example, the modulator 2202 may receive control information as input.

The transmitting device outputs a transmission signal after performing predetermined signal processing (e.g., signal processing for generation of an OFDM signal, frequency conversion, amplification) with respect to such signals (e.g., baseband signals, pilot signals). The transmitting device may transmit the transmission signal over a wireless transmission path utilizing electromagnetic waves, or over a wired transmission path utilizing a coaxial cable, a power line, an optical cable, or the like.

The transmission signal is received by the receiving device 2210 after travelling over the transmission path. A receiver 2211 receives a reception signal as input, performs predetermined signal processing (e.g., bandwidth limitation, frequency conversion, signal processing for OFDM, frequency offset estimation, signal detection, channel estimation), and outputs a baseband signal and a channel estimation signal.

A log-likelihood ratio generation section 2212 receives the baseband signal and the channel estimation signal as input (may receive other signals as input), and for example, calculates and outputs a log-likelihood ratio for each bit (may calculate and output a hard value (hard decision value)).

A decoder 2213 receives the log-likelihood ratio for each bit as input, performs belief propagation decoding (e.g., sum-product decoding, scheduled sum-product decoding (Layered BP (belief propagation) decoding), min-sum decoding, Normalized BP decoding, offset BP decoding), and outputs an estimation sequence. The decoder 2213 performs the belief propagation decoding based on the parity check matrix for the LDPC-CC of coding rate 7/9 that is based on a parity check polynomial, description of which has been provided in embodiments F1 and F2.

Figure 87:
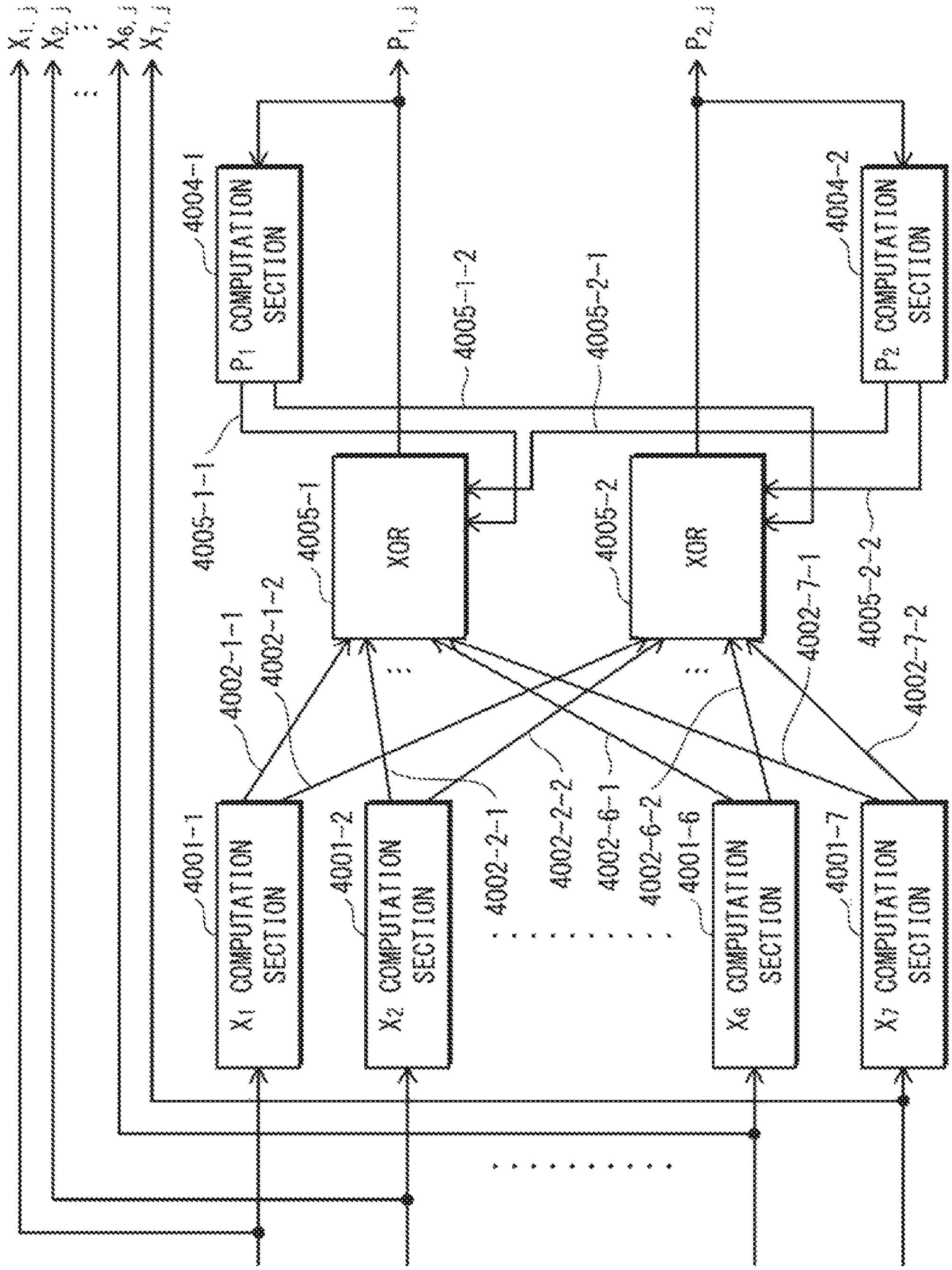
FIG. 87 shows an example of the configuration of an encoder for LDPC-CC of coding rate 7/9 that is based on a parity check polynomial.

FIG. 87 illustrates one example of the structure of an encoder for the LDPC-CC of coding rate 7/9 that is based on a parity check polynomial, description of which has been provided in embodiments F1 and F2. Description on such an encoder has been provided with reference to the encoder 2201 in FIG. 22.

In FIG. 87, an $X_z$ computation section 4001-*z* (where z is an integer no smaller than one and no greater than seven) includes a plurality of shift registers that are connected in series and a calculator that performs XOR calculation on bits collected from some of the shift registers (refer to FIGS. 2 and 22).

The $X_z$ computation section 4001-*z* receives an information bit $X_{z,j}$ at time point j as input, performs the XOR calculation, and outputs bits 4002-*z*−1 and 4002-*z*−2, which are acquired through the $X_z$ calculation.

A $P_1$ computation section 4004-1 includes a plurality of shift registers that are connected in series and a calculator that that performs XOR calculation on bits collected from some of the shift registers (refer to FIGS. 2 and 22).

The $P_1$ computation section 4004-1 receives a bit $P_{1,j}$ of parity $P_1$ at time point j as input, performs the XOR calculation, and outputs bits 4005-1-1 and 4005-1-2, which are acquired through the $P_1$ calculation.

A $P_2$ computation section 4004-2 includes a plurality of shift registers that are connected in series and a calculator that that performs XOR calculation on bits collected from some of the shift registers (refer to FIGS. 2 and 22).

The $P_2$ computation section 4004-2 receives a bit $P_{2,j}$ of parity $P_2$ at time point j as input, performs the XOR calculation, and outputs bits 4005-2-1 and 4005-2-2, which are acquired through the $P_2$ calculation.

An XOR (calculator) 4005-1 receives the bits 4002-1-1 through 4002-7-1 acquired by $X_1$ calculation through $X_7$ calculation, respectively, the bit 4005-1-1 acquired by $P_1$ calculation, and the bit 4005-2-1 acquired by the $P_2$ calculation as input, performs XOR calculation, and outputs a bit $P_{1,j}$ of parity $P_1$ at time point j.

An XOR (calculator) 4005-2 receives the bits 4002-1-2 through 4002-7-2 acquired by $X_1$ calculation through $X_7$ calculation, respectively, the bit 4005-1-2 acquired by $P_1$ calculation, and the bit 4005-2-2 acquired by the $P_2$ calculation as input, performs XOR calculation, and outputs a bit $P_{2,j}$ of parity $P_2$ at time point j.

It is preferable that initial values of the shift registers of the $X_z$ computation section 4001-*z*, the $P_1$ computation section 4004-1, and the $P_2$ computation section 4004-2 illustrated in FIG. 87 be set to "0" (zero). By making such a configuration, it becomes unnecessary to transmit to the receiving device parities $P_1$ and $P_2$ before the setting of initial values.

The following describes a method of information-zero termination.

Figure 88:
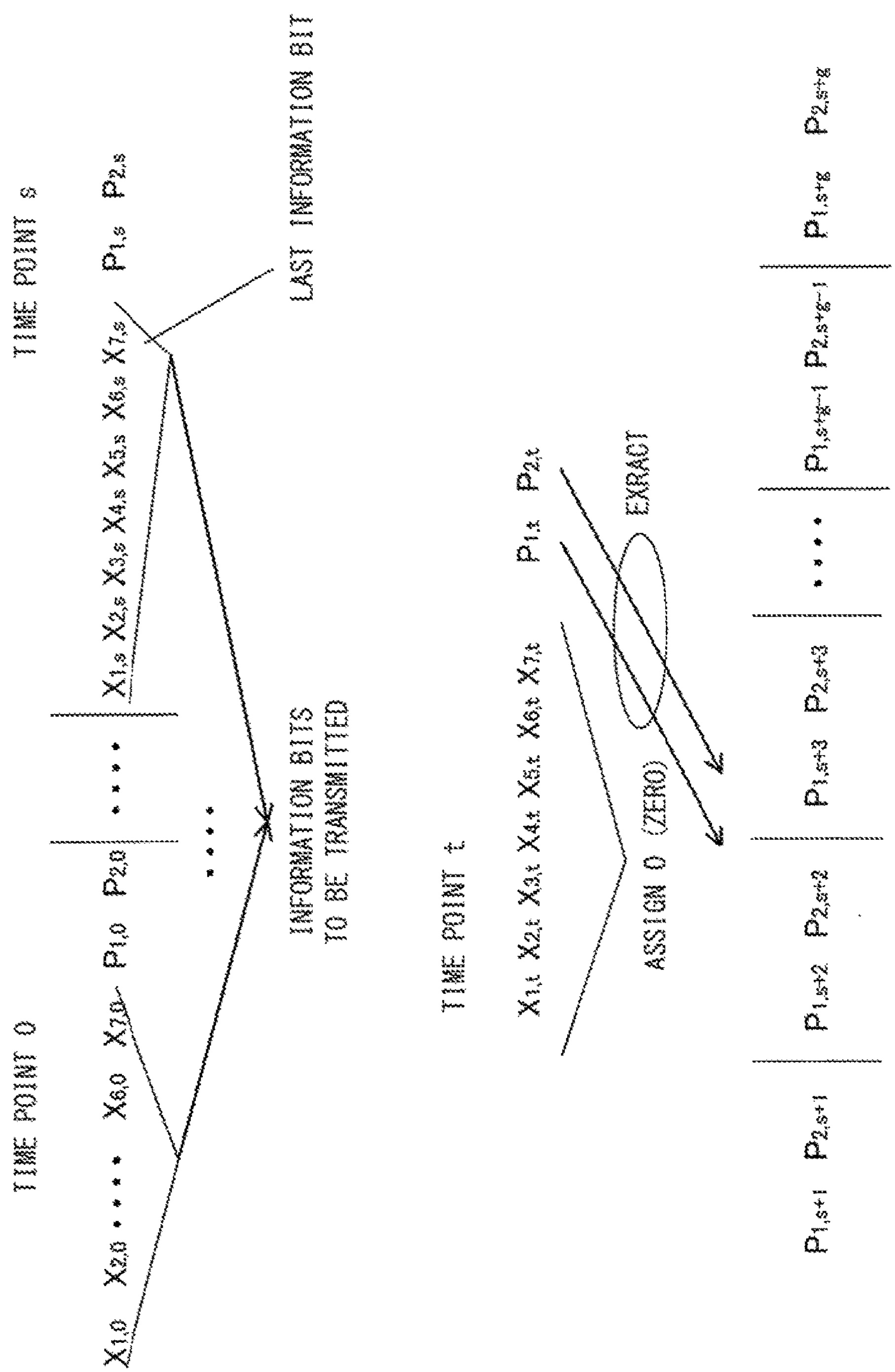
FIG. 88 is a diagram for explaining a zero-termination method.

Suppose that in FIG. 88, information $X_1$ through $X_7$ exist from time point 0, and information $X_7$ at time point s (where s is an integer no smaller than zero) is the last information bit. That is, suppose that the information to be transmitted from the transmitting device to the receiving device is information $X_{1,j}$ through $X_{7,j}$, being information $X_1$ through $X_7$ at time point j, respectively, where j is an integer no smaller than zero and no greater than s.

In such a case, the transmitting device transmits information $X_1$ through $X_7$, parity $P_1$, and parity $P_2$ from time point 0 to time point s, or that is, transmits $X_{1,j}$, $X_{2,j}$, $X_{3,j}$, $X_{4,j}$, $X_{5,j}$, $X_{6,j}$, $X_{7,j}$, $P_{1,j}$, $P_{2,j}$, where j is an integer no smaller than zero and no greater than s. (Note that $P_{1,j}$ and $P_{2,j}$ denote parity $P_1$ and parity $P_2$ at time point j, respectively.)

Further, suppose that information $X_1$ through $X_7$ from time point s+1 to time point s+g (where g is an integer no smaller than one) is "0", or that is, when denoting information $X_1$ through $X_7$ at time point t as $X_{1,t}$, $X_{2,t}$, $X_{3,t}$, $X_{4,t}$, $X_{5,t}$, $X_{6,t}$, $X_{7,t}$, respectively, $X_{1,t}=0$, $X_{2,t}=0$, $X_{3,t}=0$, $X_{4,t}=0$, $X_{5,t}=0$, $X_{6,t}=0$, $X_{7,t}=0$ hold true for t being an integer no smaller than s+1 and no greater than s+g. The transmitting device, by performing encoding, acquires parities $P_{1,t}$ and $P_{2,t}$ for t being an integer no smaller than s+1 and no greater than s+g. The transmitting device, in addition to the information and parities described above, transmits parities $P_{1,t}$ and $P_{2,t}$ for t being an integer no smaller than s+1 and no greater than s+g.

Meanwhile, the receiving device performs decoding by using log-likelihood ratios for the information and the parities transmitted by the transmitting device, and log-likelihood ratios corresponding to $X_{1,t}=0$, $X_{2,t}=0$, $X_{3,t}=0$, $X_{4,t}=0$, $X_{5,t}=0$, $X_{6,t}=0$, $X_{7,t}=0$ for t being an integer no smaller than s+1 and no greater than s+g, and thereby acquires an estimation sequence of information.

Figure 89:
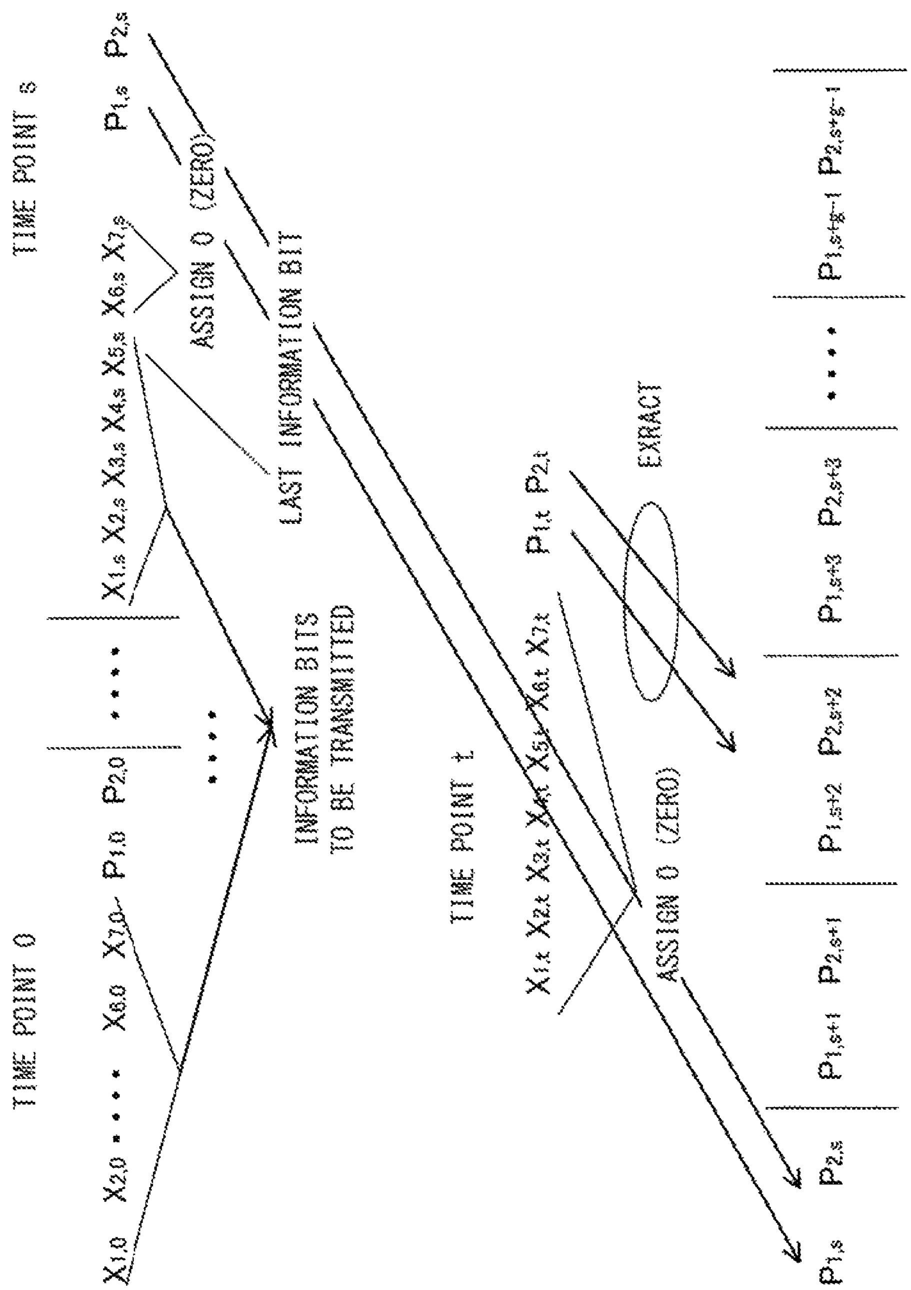
FIG. 89 is a diagram for explaining a zero-termination method.

FIG. 89 illustrates an example differing from that illustrated in FIG. 88. Suppose that information $X_1$ through $X_7$ exist from time point 0, and information $X_f$ for time point s (where s is an integer no smaller than zero) is the last information bit. Here, f is an integer no smaller than one and no greater than six. In FIG. 88, f equals 5, for example. That is, suppose that the information to be transmitted from the transmitting device to the receiving device is information $X_{i,s}$, where i is an integer no smaller than one and no greater than f, and information $X_{1,j}$, information $X_{2,j}$, information $X_{3,j}$, information $X_{4,j}$, information $X_{5,j}$, information $X_{6,j}$, information $X_{7,j}$, being information $X_1$ through $X_7$ at time point j, respectively, where j is an integer no smaller than zero and no greater than s−1.

In such a case, the transmitting device transmits information $X_1$ through $X_7$, parity $P_1$, and parity $P_2$ from time point 0 to time point s−1, or that is, transmits $X_{1,j}$, $X_{2,j}$, $X_{3,j}$, $X_{4,j}$, $X_{5,j}$, $X_{6,j}$, $X_{7,j}$, $P_{1,j}$, $P_{2,j}$, where j is an integer no smaller than zero and no greater than s−1. (Note that $P_{1,j}$ and $P_{2,j}$ denote parity $P_1$ and parity $P_2$ at time point j, respectively.)

Further, suppose that at time point s, information $X_{i,s}$, when i is an integer no smaller than one and no greater than f, is information that the transmitting device is to transmit, and suppose that $X_{k,s}$, when k is an integer so smaller than f+1 and no greater than seven, equals "0" (zero).

Further, suppose that information $X_1$ through $X_7$ from time point s+1 to time point s+g−1 (where g is an integer no smaller than two) is "0", or that is, when denoting information $X_1$ through $X_7$ at time point t as $X_{1,t}$, $X_{2,t}$, $X_{3,t}$, $X_{4,t}$, $X_{5,t}$, $X_{6,t}$, $X_{7,t}$, respectively, $X_{1,t}=0$, $X_{2,t}=0$, $X_{3,t}=0$, $X_{4,t}=0$, $X_{5,t}=0$, $X_{6,t}=0$, $X_{7,t}=0$ hold true when t is an integer no smaller than s+1 and no greater than s+g−1. The transmitting device, by performing encoding from time point s to time point s+g−1, acquires parities $P_{1,u}$ and $P_{2,u}$ for u being an integer no smaller than s and no greater than s+g−1. The transmitting device, in addition to the information and parities described above, transmits $X_{i,s}$ for i being an integer no smaller than one and no greater than f, and parities $P_{1,u}$ and $P_{2,u}$ for u being an integer no smaller than s and no greater than s+g−1.

Meanwhile, the receiving device performs decoding by using log-likelihood ratios for the information and the parities transmitted by the transmitting device, log-likelihood ratios corresponding to $X_{k,s}=0$ (where k is an integer no smaller than f+1 and no greater than seven) and log-likelihood ratios corresponding to $X_{1,t}=0$, $X_{2,t}=0$, $X_{3,t}=0$, $X_{4,t}=0$, $X_{5,t}=0$, $X_{6,t}=0$, $X_{7,t}=0$ for t being an integer no smaller than s+1 and no greater than s+g−1, and thereby acquires an estimation sequence of information.

Although description is provided above taking an example where error correction coding is introduced to a communication device, the error correction coding described above is not limited to being introduced to a communication device, and for example, may be introduced to a storage medium (storage). When making such a modification, information that is to be stored to a storage medium (storage) is encoded by using the LDPC-CC of coding rate 7/9 that is based on a parity check polynomial, description of which has been provided in embodiments F1 and F2, and resultant information and parities are stored to the storage medium (storage). When making such a modification, it is preferable that information-zero termination be introduced as described above and that a data sequence as described above corresponding to a data sequence (information and parities) transmitted by the transmitting device when information-zero termination is applied be stored to the storage medium (storage).

Further, the LDPC-CC of coding rate 7/9 that is based on a parity check polynomial, description of which has been provided in embodiments F1 and F2, is applicable to any device that requires error correction coding (e.g., a memory, a hard disk).

Embodiment F4

In the present embodiment, description is provided of a method of configuring an LDPC-CC of coding rate 7/9 that uses an improved tail-biting scheme (an LDPC block code using an LDPC-CC). The LDPC-CC of coding rate 7/9 that uses an improved tail-biting scheme described in the present embodiment is based on the LDPC-CC of coding rate 7/9 that is based on a parity check polynomial, description of which has been provided in embodiments F1 and F2.

Patent Literature 2 includes explanation regarding an LDPC-CC of coding rate (n−1)/n (where n is an integer no smaller than two) that uses an improved tail-biting scheme (an LDPC block code using an LDPC-CC). However, Patent Literature 2 poses a problem for not disclosing an LDPC-CC of a coding rate not satisfying (n−1)/n that uses an improved tail-biting scheme (an LDPC block code using an LDPC-CC).

In the present embodiment, as one example of an LDPC-CC of a coding rate not satisfying (n−1)/n that uses an improved tail-biting scheme (an LDPC block code using an LDPC-CC), description is provided of a method of configuring an LDPC-CC of coding rate 7/9 that uses an improved tail-biting scheme (an LDPC block code using an LDPC-CC).

[Periodic Time-Varying LDPC-CC of Coding Rate 7/9 Using Improved Tail-Biting Scheme and Based on Parity Check Polynomial]

The following describes a periodic time-varying LDPC-CC of coding rate 7/9 that uses an improved tail-biting scheme and is based on a parity check polynomial, based on the configuration of the LDPC-CC of coding rate 7/9 and time-varying period 2m that is based on a parity check polynomial, description of which has been provided in embodiments F1 and F2.

The following describes a method of configuring an LDPC-CC of coding rate 7/9 and time-varying period 2m that is based on a parity check polynomial. Such method has already been described in embodiment F2.

First, the following parity check polynomials satisfying zero are prepared.

[Math. 636-1]

$$\left(1+\sum_{s=1}^{R_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(\sum_{s=3}^{R_{\#(2i),3}} D^{\alpha\#(2i),3,s}\right)X_3(D)+\left(\sum_{s=R_{\#(2i),4}+1}^{r_{\#(2i),4}} D^{\alpha\#(2i),4,s}\right)X_4(D)+\left(\sum_{s=R_{\#(2i),5}+1}^{r_{\#(2i),5}} D^{\alpha\#(2i),5,s}\right)X_5(D)+\left(\sum_{s=R_{\#(2i),6}+1}^{r_{\#(2i),6}} D^{\alpha\#(2i),6,s}\right)X_6(D)+\left(\sum_{s=R_{\#(2i),7}+1}^{r_{\#(2i),7}} D^{\alpha\#(2i),7,s}\right)X_7(D)+P_1(D)+D^{\beta\#(2i),0}P_2(D)= \tag{197-1-1}$$

$$\begin{aligned}&(D^{\alpha\#(2i),1,}R_{\#(2i),1}+\ldots+D^{\alpha\#(2i),1,1}+1)X_1(D)+\\&(D^{\alpha\#(2i),2,}R_{\#(2i),2}+\ldots+D^{\alpha\#(2i),2,1}+1)X_2(D)+\\&(D^{\alpha\#(2i),3,}R_{\#(2i),3}+\ldots+D^{\alpha\#(2i),3,1}+1)X_3(D)+\\&(D^{\alpha\#(2i),4,}r_{\#(2i),4}+\ldots+D^{\alpha\#(2i),4,}R_{\#(2i),4}+1)X_4(D)+\\&(D^{\alpha\#(2i),5,}r_{\#(2i),5}+\ldots+D^{\alpha\#(2i),5,}R_{\#(2i),5}+1)X_5(D)+\\&(D^{\alpha\#(2i),6,}r_{\#(2i),6}+\ldots+D^{\alpha\#(2i),6,}R_{\#(2i),6}+1)X_6(D)+\\&(D^{\alpha\#(2i),7,}r_{\#(2i),7}+\ldots+D^{\alpha\#(2i),7,}R_{\#(2i),7}+1)X_7(D)+\\&P_1(D)+D^{\beta\#(2i),0}P_2(D)=0\end{aligned}$$

$$\left(1+\sum_{s=1}^{R_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(\sum_{s=3}^{R_{\#(2i),3}} D^{\alpha\#(2i),3,s}\right)X_3(D)+\left(\sum_{s=R_{\#(2i),4}+1}^{r_{\#(2i),4}} D^{\alpha\#(2i),4,s}\right)X_4(D)+\left(\sum_{s=R_{\#(2i),5}+1}^{r_{\#(2i),5}} D^{\alpha\#(2i),5,s}\right)X_5(D)+\left(\sum_{s=R_{\#(2i),6}+1}^{r_{\#(2i),6}} D^{\alpha\#(2i),6,s}\right)X_6(D)+\left(\sum_{s=R_{\#(2i),7}+1}^{r_{\#(2i),7}} D^{\alpha\#(2i),7,s}\right)X_7(D)+P_1(D)+D^{\beta\#(2i),1}P_1(D)= \tag{197-1-2}$$

$$\begin{aligned}&(D^{\alpha\#(2i),1,}R_{\#(2i),1}+\ldots+D^{\alpha\#(2i),1,1}+1)X_1(D)+\\&(D^{\alpha\#(2i),2,}R_{\#(2i),2}+\ldots+D^{\alpha\#(2i),2,1}+1)X_2(D)+\\&(D^{\alpha\#(2i),3,}R_{\#(2i),3}+\ldots+D^{\alpha\#(2i),3,1}+1)X_3(D)+\\&(D^{\alpha\#(2i),4,}r_{\#(2i),4}+\ldots+D^{\alpha\#(2i),4,}R_{\#(2i),4}+1)X_4(D)+\\&(D^{\alpha\#(2i),5,}r_{\#(2i),5}+\ldots+D^{\alpha\#(2i),5,}R_{\#(2i),5}+1)X_5(D)+\\&(D^{\alpha\#(2i),6,}r_{\#(2i),6}+\ldots+D^{\alpha\#(2i),6,}R_{\#(2i),6}+1)X_6(D)+\\&(D^{\alpha\#(2i),7,}r_{\#(2i),7}+\ldots+D^{\alpha\#(2i),7,}R_{\#(2i),7}+1)X_7(D)+\\&P_1(D)+D^{\beta\#(2i),1}P_1(D)=0\end{aligned}$$

-continued

[Math. 636-2]

$$\left(\sum_{s=R_{\#(2i),1}+1}^{r_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+\left(\sum_{s=R_{\#(2i),3}+1}^{r_{\#(2i),3}} D^{\alpha\#(2i),3,s}\right)X_3(D)+\left(1+\sum_{s=1}^{R_{\#(2i),4}} D^{\alpha\#(2i),4,s}\right)X_4(D)+\left(1+\sum_{s=1}^{R_{\#(2i),5}} D^{\alpha\#(2i),5,s}\right)X_5(D)+\left(1+\sum_{s=1}^{R_{\#(2i),6}} D^{\alpha\#(2i),6,s}\right)X_6(D)+\left(1+\sum_{s=1}^{R_{\#(2i),7}} D^{\alpha\#(2i),7,s}\right)X_7(D)+P_2(D)+D^{\beta\#(2i),2}P_1(D)=$$

$$(D^{\alpha\#(2i),1,r\#(2i),1}+\dots+D^{\alpha\#(2i),1,R\#(2i),1}+1)X_1(D)+(D^{\alpha\#(2i),2,r\#(2i),2}+\dots+D^{\alpha\#(2i),2,R\#(2i),2}+1)X_2(D)+(D^{\alpha\#(2i),3,r\#(2i),3}+\dots+D^{\alpha\#(2i),3,R\#(2i),3}+1)X_3(D)+(D^{\alpha\#(2i),4,R\#(2i),4}+\dots+D^{\alpha\#(2i),4,1}+1)X_4(D)+(D^{\alpha\#(2i),5,R\#(2i),5}+\dots+D^{\alpha\#(2i),5,1}+1)X_5(D)+(D^{\alpha\#(2i),6,R\#(2i),6}+\dots+D^{\alpha\#(2i),6,1}+1)X_6(D)+(D^{\alpha\#(2i),7,R\#(2i),7}+\dots+D^{\alpha\#(2i),7,1}+1)X_7(D)+P_2(D)+D^{\beta\#(2i),2}P_1(D)=0 \quad (197\text{-}2\text{-}1)$$

$$\left(\sum_{s=R_{\#(2i),1}+1}^{r_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+\left(\sum_{s=R_{\#(2i),3}+1}^{r_{\#(2i),3}} D^{\alpha\#(2i),3,s}\right)X_3(D)+\left(1+\sum_{s=1}^{R_{\#(2i),4}} D^{\alpha\#(2i),4,s}\right)X_4(D)+\left(1+\sum_{s=1}^{R_{\#(2i),5}} D^{\alpha\#(2i),5,s}\right)X_5(D)+\left(1+\sum_{s=1}^{R_{\#(2i),6}} D^{\alpha\#(2i),6,s}\right)X_6(D)+\left(1+\sum_{s=1}^{R_{\#(2i),7}} D^{\alpha\#(2i),7,s}\right)X_7(D)+P_2(D)+D^{\beta\#(2i),3}P_2(D)=$$

$$(D^{\alpha\#(2i),1,r\#(2i),1}+\dots+D^{\alpha\#(2i),1,R\#(2i),1}+1)X_1(D)+(D^{\alpha\#(2i),2,r\#(2i),2}+\dots+D^{\alpha\#(2i),2,R\#(2i),2}+1)X_2(D)+(D^{\alpha\#(2i),3,r\#(2i),3}+\dots+D^{\alpha\#(2i),3,R\#(2i),3}+1)X_3(D)+(D^{\alpha\#(2i),4,R\#(2i),4}+\dots+D^{\alpha\#(2i),4,1}+1)X_4(D)+(D^{\alpha\#(2i),5,R\#(2i),5}+\dots+D^{\alpha\#(2i),5,1}+1)X_5(D)+(D^{\alpha\#(2i),6,R\#(2i),6}+\dots+D^{\alpha\#(2i),6,1}+1)X_6(D)+(D^{\alpha\#(2i),7,R\#(2i),7}+\dots+D^{\alpha\#(2i),7,1}+1)X_7(D)+P_2(D)+D^{\beta\#(2i),3}P_2(D)=0 \quad (197\text{-}2\text{-}2)$$

In expressions (197-1-1), (197-1-2), (197-2-1), (197-2-2), i is an integer no smaller than zero and no greater than m−1 (i=0, 1, . . . , m−2, m−1).

In expressions (197-1-1), (197-1-2), (197-2-1), (197-2-2), $\alpha_{\#(2i),p,q}$ (where p is an integer no smaller than one and no greater than seven, q is an integer no smaller than one and no greater than $r_{\#(2i),p}$ (where $r_{\#(2i),p}$ is a natural number)) and $\beta_{\#(2i),0}$ is a natural number, $\beta_{\#(2i),1}$ is a natural number, $\beta_{\#(2i),2}$ is an integer no smaller than zero, and $\beta_{\#(2i),3}$ is a natural number.

Further, $R_{\#(2i),p}$ is a natural number satisfying $1 \le R_{\#(2i),p} < r_{\#(2i),p}$.

Further, y is an integer no smaller than one and no greater than $r_{\#(2i),p}$, z is an integer no smaller than one and no greater than $r_{\#2i,p}$, and $\alpha_{\#(2i),p,y} \cdot \alpha_{\#(2i),p,z}$ holds true for $\forall$(y, z) where y≠z. ∀ is a universal quantifier. (y is an integer no smaller than one and no greater than $r_{\#(2i),p}$, z is an integer no smaller than one and no greater than $r_{\#2i,p}$, and $\alpha_{\#(2i),p,y} \neq \alpha_{\#(2i),p,z}$ holds true for all y and all z satisfying y≠z.)

Note that in the following, to simplify explanation, a parity check polynomial satisfying zero that is expressed by expression (197-1-1) or expression (197-1-2) is referred to as "#(2i); first expression" for realizing a time-varying period 2m, and a parity check polynomial satisfying zero that is expressed by expression (197-2-1) or expression (197-2-2) is referred to as "#(2i); second expression" for realizing a time-varying period 2m.

Thus, for each i, as #(2i); first expression for realizing a time-varying period 2m, a parity check polynomial satisfying zero expressed by either expression (197-1-1) or expression (197-1-2) is prepared.

That is, for i=0, a parity check polynomial satisfying zero provided by expression (197-1-1) where i=0, or a parity check polynomial satisfying zero provided by expression (197-1-2) where i=0 is prepared.

Similarly:

for i=1, a parity check polynomial satisfying zero provided by expression (197-1-1) where i=1, or a parity check polynomial satisfying zero provided by expression (197-1-2) where i=1 is prepared;

for i=2, a parity check polynomial satisfying zero provided by expression (197-1-1) where i=2, or a parity check polynomial satisfying zero provided by expression (197-1-2) where i=2 is prepared;

⋮ for i=z, a parity check polynomial satisfying zero provided by expression (197-1-1) where i=z, or a parity check polynomial satisfying zero provided by expression (197-1-2) where i=z is prepared (where z is an integer no smaller than zero and no greater than m−1); and

⋮ for i=m−1, a parity check polynomial satisfying zero provided by expression (197-1-1) where i=m−1, or a parity check polynomial satisfying zero provided by expression (197-1-2) where i=m−1 is prepared.

Similarly, for each i, as #(2i); second expression for realizing a time-varying period 2m, a parity check polynomial satisfying zero expressed by either expression (197-2-1) or expression (197-2-2) is prepared.

That is, for i=0, a parity check polynomial satisfying zero provided by expression (197-2-1) where i=0, or a parity check polynomial satisfying zero provided by expression (197-2-2) where i=0 is prepared.

Similarly:

for i=1, a parity check polynomial satisfying zero provided by expression (197-2-1) where i=1, or a parity check polynomial satisfying zero provided by expression (197-2-2) where i=1 is prepared;

for i=2, a parity check polynomial satisfying zero provided by expression (197-2-1) where i=2, or a parity check polynomial satisfying zero provided by expression (197-2-2) where i=2 is prepared;

⋮ for i=z, a parity check polynomial satisfying zero provided by expression (197-2-1) where i=z, or a parity check polynomial satisfying zero provided by expression (197-2-2) where i=z is prepared (where z is an integer no smaller than zero and no greater than m−1); and

⋮ for i=m−1, a parity check polynomial satisfying zero provided by expression (197-2-1) where i=m−1, or a parity check polynomial satisfying zero provided by expression (197-2-2) where i=m−1 is prepared.

Similarly, the following parity check polynomials satisfying zero are provided.

[Math. 637-1]

$$\left(\sum_{s=R_{\#(2i+1),1}+1}^{r_{\#(2i+1),1}} D^{\alpha\#(2i+1),1,s}\right)X_1(D) + \left(\sum_{s=R_{\#(2i+1),1}+2}^{r_{\#(2i+1),2}} D^{\alpha\#(2i+1),2,s}\right)X_2(D) + \left(\sum_{s=R_{\#(2i+1),1}+3}^{r_{\#(2i+1),3}} D^{\alpha\#(2i+1),3,s}\right)X_3(D) + \left(1+\sum_{s=1}^{R_{\#(2i+1),4}} D^{\alpha\#(2i+1),4,s}\right)X_4(D) + \left(1+\sum_{s=1}^{R_{\#(2i+1),5}} D^{\alpha\#(2i+1),5,s}\right)X_5(D) + \left(1+\sum_{s=1}^{R_{\#(2i+1),6}} D^{\alpha\#(2i+1),6,s}\right)X_6(D) + \left(1+\sum_{s=1}^{R_{\#(2i+1),7}} D^{\alpha\#(2i+1),7,s}\right)X_7(D) + P_1(D) + D^{\beta\#(2i+1),0}P_2(D) = (D^{\alpha\#(2i+1),1,r_{\#(2i+1),1}} + \ldots + D^{\alpha\#(2i+1),1,R_{\#(2i+1),1}+1})X_1(D) + (D^{\alpha\#(2i+1),2,r_{\#(2i+1),2}} + \ldots + D^{\alpha\#(2i+1),2,R_{\#(2i+1),2}+1})X_2(D) + (D^{\alpha\#(2i+1),3,r_{\#(2i+1),3}} + \ldots + D^{\alpha\#(2i+1),3,R_{\#(2i+1),3}+1})X_3(D) + (D^{\alpha\#(2i+1),4,R_{\#(2i+1),4}} + \ldots + D^{\alpha\#(2i+1),4,1} + 1)X_4(D) + (D^{\alpha\#(2i+1),5,R_{\#(2i+1),5}} + \ldots + D^{\alpha\#(2i+1),5,1} + 1)X_5(D) + (D^{\alpha\#(2i+1),6,R_{\#(2i+1),6}} + \ldots + D^{\alpha\#(2i+1),6,1} + 1)X_6(D) + (D^{\alpha\#(2i+1),7,R_{\#(2i+1),7}} + \ldots + D^{\alpha\#(2i+1),7,1} + 1)X_7(D) + P_1(D) + D^{\beta\#(2i+1),2}P_2(D) = 0 \quad (198\text{-}1\text{-}1)$$

$$\left(\sum_{s=R_{\#(2i+1),1}+1}^{r_{\#(2i+1),1}} D^{\alpha\#(2i+1),1,s}\right)X_1(D) + \left(\sum_{s=R_{\#(2i+1),1}+2}^{r_{\#(2i+1),2}} D^{\alpha\#(2i+1),2,s}\right)X_2(D) + \left(\sum_{s=R_{\#(2i+1),1}+3}^{r_{\#(2i+1),3}} D^{\alpha\#(2i+1),3,s}\right)X_3(D) + \left(1+\sum_{s=1}^{R_{\#(2i+1),4}} D^{\alpha\#(2i+1),4,s}\right)X_4(D) + \left(1+\sum_{s=1}^{R_{\#(2i+1),5}} D^{\alpha\#(2i+1),5,s}\right)X_5(D) + \left(1+\sum_{s=1}^{R_{\#(2i+1),6}} D^{\alpha\#(2i+1),6,s}\right)X_6(D) + \left(1+\sum_{s=1}^{R_{\#(2i+1),7}} D^{\alpha\#(2i+1),7,s}\right)X_7(D) + P_1(D) + D^{\beta\#(2i+1),1}P_1(D) = (D^{\alpha\#(2i+1),1,r_{\#(2i+1),1}} + \ldots + D^{\alpha\#(2i+1),1,R_{\#(2i+1),1}+1})X_1(D) + (D^{\alpha\#(2i+1),2,r_{\#(2i+1),2}} + \ldots + D^{\alpha\#(2i+1),2,R_{\#(2i+1),2}+1})X_2(D) + (D^{\alpha\#(2i+1),3,r_{\#(2i+1),3}} + \ldots + D^{\alpha\#(2i+1),3,R_{\#(2i+1),3}+1})X_3(D) + (D^{\alpha\#(2i+1),4,R_{\#(2i+1),4}} + \ldots + D^{\alpha\#(2i+1),4,1} + 1)X_4(D) + (D^{\alpha\#(2i+1),5,R_{\#(2i+1),5}} + \ldots + D^{\alpha\#(2i+1),5,1} + 1)X_5(D) + (D^{\alpha\#(2i+1),6,R_{\#(2i+1),6}} + \ldots + D^{\alpha\#(2i+1),6,1} + 1)X_6(D) + (D^{\alpha\#(2i+1),7,R_{\#(2i+1),7}} + \ldots + D^{\alpha\#(2i+1),7,1} + 1)X_7(D) + P_1(D) + D^{\beta\#(2i+1),1}P_1(D) = 0 \quad (198\text{-}1\text{-}2)$$

[Math. 637-2]

$$\left(1+\sum_{s=1}^{R_{\#(2i+1),1}} D^{\alpha\#(2i+1),1,s}\right)X_1(D) + \left(1+\sum_{s=1}^{R_{\#(2i+1),2}} D^{\alpha\#(2i+1),2,s}\right)X_2(D) + \left(1+\sum_{s=1}^{R_{\#(2i+1),3}} D^{\alpha\#(2i+1),3,s}\right)X_3(D) + \left(\sum_{s=R_{\#(2i+1),4}+1}^{r_{\#(2i+1),4}} D^{\alpha\#(2i+1),4,s}\right)X_4(D) + \left(\sum_{s=R_{\#(2i+1),5}+1}^{r_{\#(2i+1),5}} D^{\alpha\#(2i+1),5,s}\right)X_5(D) + \left(\sum_{s=R_{\#(2i+1),6}+1}^{r_{\#(2i+1),6}} D^{\alpha\#(2i+1),6,s}\right)X_6(D) + \left(\sum_{s=R_{\#(2i+1),7}+1}^{r_{\#(2i+1),7}} D^{\alpha\#(2i+1),7,s}\right)X_7(D) + P_2(D) + D^{\beta\#(2i+1),2}P_1(D) = (D^{\alpha\#(2i+1),1,R_{\#(2i+1),1}} + \ldots + D^{\alpha\#(2i+1),1,1} + 1)X_1(D) + (D^{\alpha\#(2i+1),2,R_{\#(2i+1),2}} + \ldots + D^{\alpha\#(2i+1),2,1} + 1)X_2(D) + (D^{\alpha\#(2i+1),3,R_{\#(2i+1),3}} + \ldots + D^{\alpha\#(2i+1),3,1} + 1)X_3(D) + (D^{\alpha\#(2i+1),4,r_{\#(2i+1),4}} + \ldots + D^{\alpha\#(2i+1),4,R_{\#(2i+1),4}+1})X_4(D) + (D^{\alpha\#(2i+1),5,r_{\#(2i+1),5}} + \ldots + D^{\alpha\#(2i+1),5,R_{\#(2i+1),5}+1})X_5(D) + (D^{\alpha\#(2i+1),6,r_{\#(2i+1),6}} + \ldots + D^{\alpha\#(2i+1),6,R_{\#(2i+1),6}+1})X_6(D) + (D^{\alpha\#(2i+1),7,r_{\#(2i+1),7}} + \ldots + D^{\alpha\#(2i+1),7,R_{\#(2i+1),7}+1})X_7(D) + P_2(D) + D^{\beta\#(2i+1),2}P_1(D) = 0 \quad (198\text{-}2\text{-}1)$$

$$\left(1+\sum_{s=1}^{R_{\#(2i+1),1}} D^{\alpha\#(2i+1),1,s}\right)X_1(D) + \left(1+\sum_{s=1}^{R_{\#(2i+1),2}} D^{\alpha\#(2i+1),2,s}\right)X_2(D) + \left(1+\sum_{s=1}^{R_{\#(2i+1),3}} D^{\alpha\#(2i+1),3,s}\right)X_3(D) + \quad (198\text{-}2\text{-}2)$$

-continued $$\left(\sum_{s=R_{\#(2i+1),4}+1}^{r_{\#(2i+1),4}} D^{\alpha\#(2i+1),4,s}\right)X_4(D) + \left(\sum_{s=R_{\#(2i+1),5}+1}^{r_{\#(2i+1),5}} D^{\alpha\#(2i+1),5,s}\right)X_5(D) + \left(\sum_{s=R_{\#(2i+1),6}+1}^{r_{\#(2i+1),6}} D^{\alpha\#(2i+1),6,s}\right)X_6(D) + \left(\sum_{s=R_{\#(2i+1),7}+1}^{r_{\#(2i+1),7}} D^{\alpha\#(2i+1),7,s}\right)X_7(D) + P_2(D) + D^{\beta\#(2i+1),3}P_2(D) =$$

$$(D^{\alpha\#(2i+1),1,R_{\#(2i+1),1}} + \ldots + D^{\alpha\#(2i+1),1,1} + 1)X_1(D) + (D^{\alpha\#(2i+1),2,R_{\#(2i+1),2}} + \ldots + D^{\alpha\#(2i+1),2,1} + 1)X_2(D) + (D^{\alpha\#(2i+1),3,R_{\#(2i+1),3}} + \ldots + D^{\alpha\#(2i+1),3,1} + 1)X_3(D) + (D^{\alpha\#(2i+1),4,r_{\#(2i+1),4}} + \ldots + D^{\alpha\#(2i+1),4,R_{\#(2i+1),4}} + 1)X_4(D) + (D^{\alpha\#(2i+1),5,r_{\#(2i+1),5}} + \ldots + D^{\alpha\#(2i+1),5,R_{\#(2i+1),5}} + 1)X_5(D) + (D^{\alpha\#(2i+1),6,r_{\#(2i+1),6}} + \ldots + D^{\alpha\#(2i+1),6,R_{\#(2i+1),6}} + 1)X_6(D) + (D^{\alpha\#(2i+1),7,r_{\#(2i+1),7}} + \ldots + D^{\alpha\#(2i+1),7,R_{\#(2i+1),7}} + 1)X_7(D) + P_2(D) + D^{\beta\#(2i+1),3}P_2(D) = 0$$

In expressions (198-1-1), (198-1-2), (198-2-1), (198-2-2), i is an integer no smaller than zero and no greater than m−1 (i=0, 1, . . . , m−2, m−1).

In expressions (198-1-1), (198-1-2), (198-2-1), (198-2-2), $\alpha_{\#(2i+1),p,q}$ (where p is an integer no smaller than one and no greater than seven, q is an integer no smaller than one and no greater than $r_{\#(2i+1),p}$ (where $r_{\#(2i+1),p}$ is a natural number)) and $\beta_{\#(2i+1),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, $R_{\#(2i+1),p}$ is a natural number satisfying $1 \le R_{\#(2i+1),p} < r_{\#(2i+1),p}$.

Further, y is an integer no smaller than one and no greater than $r_{\#(2i+1),p}$, z is an integer no smaller than one and no greater than $r_{\#(2i+1),p}$, and $\alpha_{\#(2i+1),p,y} \neq \alpha_{\#(2i+1),p,z}$ holds true for $^\forall$(y, z) where y≠z. ∀ is a universal quantifier. (y is an integer no smaller than one and no greater than $r_{\#(2i+1),p}$, z is an integer no smaller than one and no greater than $r_{\#(2i+1),p}$, and $\alpha_{\#(2i+1),p,y} \neq \alpha_{\#(2i+1),p,z}$ holds true for all y and all z satisfying y≠z.)

Note that in the following, to simplify explanation, a parity check polynomial satisfying zero that is expressed by expression (198-1-1) or expression (198-1-2) is referred to as "#(2i+1); first expression" for realizing a time-varying period 2m, and a parity check polynomial satisfying zero that is expressed by expression (198-2-1) or expression (198-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (198-1-1) or expression (198-1-2) is prepared.

That is, for i=0, a parity check polynomial satisfying zero provided by expression (198-1-1) where i=0, or a parity check polynomial satisfying zero provided by expression (198-1-2) where i=0 is prepared.

Similarly:

for i=1, a parity check polynomial satisfying zero provided by expression (198-1-1) where i=1, or a parity check polynomial satisfying zero provided by expression (198-1-2) where i=1 is prepared;

for i=2, a parity check polynomial satisfying zero provided by expression (198-1-1) where i=2, or a parity check polynomial satisfying zero provided by expression (198-1-2) where i=2 is prepared;

⋮ for i=z, a parity check polynomial satisfying zero provided by expression (198-1-1) where i=z, or a parity check polynomial satisfying zero provided by expression (198-1-2) where i=z is prepared (where z is an integer no smaller than zero and no greater than m−1); and

⋮ for i=m−1, a parity check polynomial satisfying zero provided by expression (198-1-1) where i=m−1, or a parity check polynomial satisfying zero provided by expression (198-1-2) where i=m−1 is prepared.

Similarly, for each i, as #(2i+1); second expression for realizing a time-varying period 2m, a parity check polynomial satisfying zero expressed by either expression (198-2-1) or expression (198-2-2) is prepared.

That is, for i=0, a parity check polynomial satisfying zero provided by expression (198-2-1) where i=0, or a parity check polynomial satisfying zero provided by expression (198-2-2) where i=0 is prepared.

Similarly:

for i=1, a parity check polynomial satisfying zero provided by expression (198-2-1) where i=1, or a parity check polynomial satisfying zero provided by expression (198-2-2) where i=1 is prepared;

for i=2, a parity check polynomial satisfying zero provided by expression (198-2-1) where i=2, or a parity check polynomial satisfying zero provided by expression (198-2-2) where i=2 is prepared;

⋮ for i=z, a parity check polynomial satisfying zero provided by expression (198-2-1) where i=z, or a parity check polynomial satisfying zero provided by expression (198-2-2) where i=z is prepared (where z is an integer no smaller than zero and no greater than m−1); and

⋮ for i=m−1, a parity check polynomial satisfying zero provided by expression (198-2-1) where i=m−1, or a parity check polynomial satisfying zero provided by expression (198-2-2) where i=m−1 is prepared.

As such, an LDPC-CC of coding rate 7/9 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (197-1-1) or expression (197-1-2), parity check polynomials satisfying zero provided by expression (197-2-1) or expression (197-2-2), parity check polynomials satisfying zero provided by expression (198-1-1) or expression (198-1-2), and parity check polynomials satisfying zero provided by expression (198-2-1) or expression (198-2-2).

For example, the time varying period 2×m is formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expressions (197-1-1), (197-1-2), (197-2-1), (197-2-2), (198-1-1), (198-1-2), (198-2-1), and (198-2-2) (where j is an integer no smaller than zero).

The following presumes that 2k=j%2m holds true. In the following, % means a modulo, and for example, α%6 represents a remainder after dividing α by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

Note that in the parity check polynomials satisfying zero of expressions (197-1-1), (197-1-2), (197-2-1), (197-2-2), (198-1-1), (198-1-2), (198-2-1), and (198-2-2), a sum of the number of terms of $P_1(D)$ and the number of terms of $P_2(D)$ equals two. This realizes sequentially finding parities $P_1$ and $P_2$ when applying an improved tail-biting scheme, and thus, is a significant factor realizing a reduction in computation amount (circuit scale).

The following describes the relationship between the time-varying period of the parity check polynomials satisfying zero for the LDPC-CC of coding rate 7/9 and time-varying period 2m that is based on a parity check polynomial, description of which has been provided in embodiments F1 and F2 and on which the LDPC-CC of coding rate 7/9 that uses an improved tail-biting scheme (an LDPC block code using an LDPC-CC) is based, and block size in the LDPC-CC of coding rate 7/9 that uses an improved tail-biting scheme (an LDPC block code using an LDPC-CC) proposed in the present embodiment.

Regarding this point, in order to achieve error correction capability of even higher level, a configuration is preferable where a Tanner graph formed by the LDPC-CC of coding rate 7/9 and time-varying period 2m that is based on a parity check polynomial, description of which has been provided in embodiments F1 and F2 and on which the LDPC-CC of coding rate 7/9 that uses an improved tail-biting scheme (an LDPC block code using an LDPC-CC) is based, resembles a Tanner graph of the LDPC-CC of coding rate 7/9 that uses an improved tail-biting scheme (an LDPC block code using an LDPC-CC). Thus, the following conditions are significant.

<Condition #N1>

The number of rows in a parity check matrix for the LDPC-CC of coding rate 7/9 that uses an improved tail-biting scheme (an LDPC block code using an LDPC-CC) is a multiple of 4×m.

Accordingly, the number of columns in the parity check matrix for the LDPC-CC of coding rate 7/9 that uses an improved tail-biting scheme (an LDPC block code using an LDPC-CC) is a multiple of 9×2×m. According to this condition, (for example) a log-likelihood ratio that is necessary in decoding is a log-likelihood ratio of the number of columns in the parity check matrix for the LDPC-CC of coding rate 7/9 that uses an improved tail-biting scheme (an LDPC block code using an LDPC-CC).

Note that the relationship between the LDPC-CC of coding rate 7/9 that uses an improved tail-biting scheme (an LDPC block code using an LDPC-CC) and the LDPC-CC of coding rate 7/9 and time-varying period 2m that is based on a parity check polynomial, description of which has been provided in embodiments F1 and F2 and on which the LDPC-CC of coding rate 7/9 that uses an improved tail-biting scheme (an LDPC block code using an LDPC-CC) is based, is described in detail later in the present disclosure.

Thus, when denoting the parity check matrix for the LDPC-CC of coding rate 7/9 that uses an improved tail-biting scheme (an LDPC block code using an LDPC-CC) as $H_{pro}$, the number of columns of $H_{pro}$ can be expressed as 9×2×m×z (where z is a natural number).

Accordingly, a transmission sequence (encoded sequence (codeword)) $v_s$ of block s of the LDPC-CC of coding rate 7/9 that uses an improved tail-biting scheme (an LDPC block code using an LDPC-CC) can be expressed as $v_s=(X_{s,1,1}, X_{s,2,1}, \ldots, X_{s,7,1}, P^{pro}_{s,1,1}, P^{pro}_{s,2,1}, X_{s,1,2}, X_{s,2,2}, \ldots, X_{s,7,2}, P^{pro}_{s,1,2}, P^{pro}_{s,2,2}, \ldots, X_{s,1,k}, X_{s,2,k}, \ldots, X_{s,7,k}, P^{pro}_{s,1,k}, P^{pro}_{s,2,k}, \ldots, X_{s,1,2\times m\times z}, X_{s,2,2\times m\times z}, \ldots, X_{s,7,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}v_s$ are zeroes).

$X_{s,j,k}$ (where j is an integer no smaller than one and no greater than seven) is a bit of information $X_j$, $P^{pro}_{s,1,k}$ is a bit of parity $P_1$ of the LDPC-CC of coding rate 7/9 that uses an improved tail-biting scheme (an LDPC block code using an LDPC-CC), and $P^{pro}_{s,2,k}$ is a bit of parity $P_2$ of the LDPC-CC of coding rate 7/9 that uses an improved tail-biting scheme (an LDPC block code using an LDPC-CC).

Further, $\lambda_{pro,s,k}=(X_{s,1,k}, X_{s,2,k}, X_{s,3,k}, X_{s,4,k}, X_{s,5,k}, X_{s,6,k}, X_{s,7,k}, P^{pro}_{s,1,k}, P^{pro}_{s,2,k})$ holds true.

In addition, the number of rows in the parity check matrix $H_{pro}$ for the LDPC-CC of coding rate 7/9 that uses an improved tail-biting scheme (an LDPC block code using an LDPC-CC) is 4×m×z.

It has been indicated above that the LDPC-CC of coding rate 7/9 that uses an improved tail-biting scheme (an LDPC block code using an LDPC-CC) is based on the LDPC-CC of coding rate 7/9 and time-varying period 2m that is based on a parity check polynomial, description of which has been provided in embodiments F1 and F2. This is explained in the following.

First, consideration is made of a parity check matrix when configuring a periodic time-varying LDPC-CC using tail-biting by using only parity check polynomials satisfying zero for the LDPC-CC of coding rate 7/9 and time-varying period 2m that is based on a parity check polynomial, description of which has been provided in embodiments F1 and F2.

Figure 90:
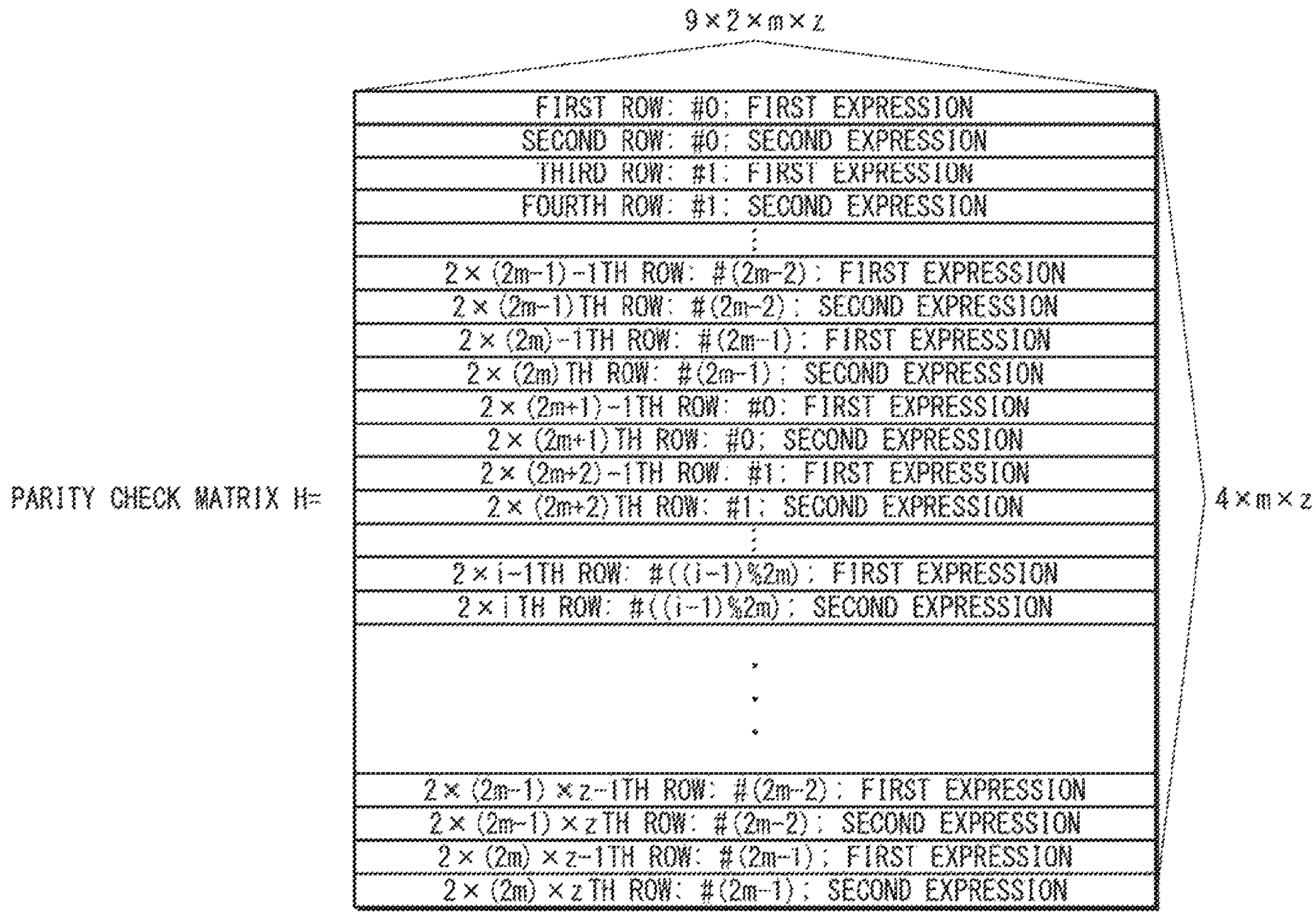
FIG. 90 shows an example of the configuration of check matrix for LDPC-CC of coding rate 7/9 when tail-biting is performed.

FIG. 90 illustrates a configuration of a parity check matrix H when configuring a periodic time-varying LDPC-CC using tail-biting by performing tail-biting by using only parity check polynomials satisfying zero for an LDPC-CC of coding rate 7/9 and time-varying period 2m.

Since Condition #N1 is satisfied in FIG. 90, the number of rows of the parity check matrix is m×z and the number of columns of the parity check matrix is 9×2×m×z.

As illustrated in FIG. 90:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression";

"a vector for the (2×i)th row of the parity check matrix H can be generated from a parity check polynomial satisfying zero of #((i−1)%2m); second expression" (where i is an integer no smaller than one and no greater than 2×m×z);

⋮

"a vector for the 2×(2m−1)×z−1th row of the parity check matrix H can be generated from a parity check polynomial satisfying zero of #(2m−2); first expression";

"a vector for the 2×(2m−1)×zth row of the parity check matrix H can be generated from a parity check polynomial satisfying zero of #(2m−2); second expression";

"a vector for the 2×(2m)×z−1th row of the parity check matrix H can be generated from a parity check polynomial satisfying zero of #(2m−1); first expression"; and "a vector for the 2×(2m)×zth row of the parity check matrix H can be generated from a parity check polynomial satisfying zero of #(2m−1); second expression".

To prepare for the explanation to be provided in the following, a mathematical expression is provided of the parity check matrix H in FIG. 90, which is a parity check matrix when configuring a periodic time-varying LDPC-CC by performing tail-biting by using only parity check polynomials satisfying zero for the LDPC-CC of coding rate 7/9 and time-varying period 2m that is based on a parity check polynomial, description of which is provided in embodiments F1 and F2. When denoting a vector having one row and 9×2×m×z columns in row k of the parity check matrix H as $h_k$, the parity check matrix H in FIG. 90 is expressed as follows.

[Math. 638]

$$H=\begin{pmatrix} h_1 \\ h_2 \\ \vdots \\ h_{2\times(2m)\times z-1} \\ h_{2\times(2m)\times z} \end{pmatrix} \tag{199}$$

The following describes a parity check matrix for the LDPC-CC of coding rate 7/9 that uses an improved tail-biting scheme (an LDPC block code using an LDPC-CC).

Figure 91:
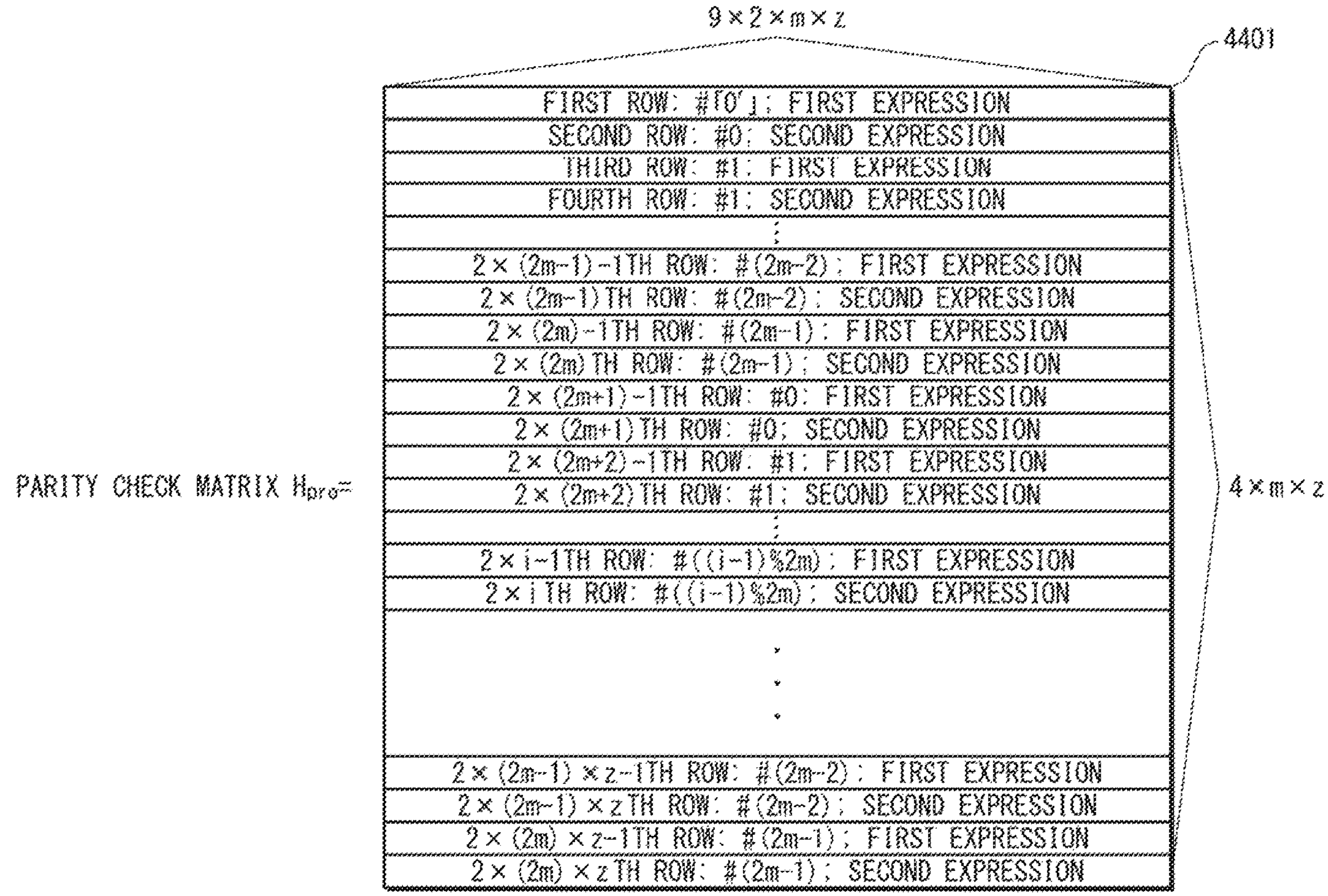
FIG. 91 shows an example of the configuration of check matrix for LDPC-CC of coding rate 7/9 when improved tail-biting is performed.

FIG. 91 illustrates one example of a configuration of a parity check matrix $H_{pro}$ for the LDPC-CC of coding rate 7/9 that uses an improved tail-biting scheme (an LDPC block code using an LDPC-CC).

The parity check matrix $H_{pro}$ for the LDPC-CC of coding rate 7/9 that uses an improved tail-biting scheme (an LDPC block code using an LDPC-CC) satisfies Condition #N1.

When denoting a vector having one row and 9×2×m×z columns in row k of the parity check matrix $H_{pro}$ in FIG. 91, which is for the LDPC-CC of coding rate 7/9 that uses an improved tail-biting scheme (an LDPC block code using an LDPC-CC), as $g_k$, the parity check matrix $H_{pro}$ in FIG. 91 is expressed as follows.

[Math. 639]

$$H_{pro}=\begin{pmatrix} g_1 \\ g_2 \\ \vdots \\ g_{2\times(2m)\times z-1} \\ g_{2\times(2m)\times z} \end{pmatrix} \tag{200}$$

A transmission sequence (encoded sequence (codeword)) $v_s$ of block s of the LDPC-CC of coding rate 7/9 that uses an improved tail-biting scheme (an LDPC block code using an LDPC-CC) can be expressed as $v_s=(X_{s,1,1}, X_{s,2,1}, \ldots, X_{s,7,1}, P^{pro}_{s,1,1}, P^{pro}_{s,2,1}, X_{s,1,2}, X_{s,2,2}, \ldots, X_{s,7,2}, P^{pro}_{s,1,2}, P^{pro}_{s,2,2}, \ldots, X_{s,1,k}, X_{s,2,k}, \ldots, X_{s,7,k}, P^{pro}_{s,1,k}, P^{pro}_{s,2,k}, \ldots, X_{s,1,2\times m\times z}, X_{s,2,2\times m\times z}, \ldots, X_{s,7,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}v_s$ are zeroes).

$X_{s,j,k}$ (where j is an integer no smaller than one and no greater than seven) is a bit of information $X_j$, $P^{pro}_{s,1,k}$ is a bit of parity $P_1$ of the LDPC-CC of coding rate 7/9 that uses an improved tail-biting scheme (an LDPC block code using an LDPC-CC), and $P^{pro}_{s,2,k}$ is a bit of parity $P_2$ of the LDPC-CC of coding rate 7/9 that uses an improved tail-biting scheme (an LDPC block code using an LDPC-CC).

In the parity check matrix $H_{pro}$ in FIG. 91, which illustrates one example of a configuration of a parity check matrix $H_{pro}$ for the LDPC-CC of coding rate 7/9 that uses an improved tail-biting scheme (an LDPC block code using an LDPC-CC), rows other than row one, or that is, rows between row two to row 2×(2×m)×z in the parity check matrix $H_{pro}$ in FIG. 91, have the same configuration as rows between row two and row 2×(2×m)×z in the parity check matrix H in FIG. 90 (refer to FIGS. 90 and 91). Accordingly, FIG. 91 includes an indication of #0'; first expression at 4401 in the first row. (This point is explained later in the present disclosure.) Accordingly, the following relational expression holds true based on expressions 199 and 200.

[Math. 640]

For all i no smaller than two and no greater than 2×(2×m)×z, the following holds true:

$$g_i = h_i \tag{201}$$

Further, the following holds true when i=1.

[Math. 641]

$$g_1 \neq h_1 \tag{202}$$

Accordingly, the parity check matrix $H_{pro}$ for the LDPC-CC of coding rate 7/9 that uses an improved tail-biting scheme (an LDPC block code using an LDPC-CC) can be expressed as follows.

[Math. 642]

$$H_{pro} = \begin{pmatrix} g_1 \\ h_2 \\ \vdots \\ h_{2\times(2m)\times z-1} \\ h_{2\times(2m)\times z} \end{pmatrix} \tag{203}$$

In expression 203, expression 202 holds true.

Next, explanation is provided of a method of configuring $g_1$ in expression 203 so that parities can be found sequentially and high error correction capability can be achieved.

One example of a method of configuring $g_1$ in expression 203, so that parities can be found sequentially and high error correction capability can be achieved, is using a parity check polynomial satisfying zero of #0; first expression of the LDPC-CC of coding rate 7/9 that uses an improved tail-biting scheme (an LDPC block code using an LDPC-CC), which serves as the basis.

Since $g_1$ is row one of the parity check matrix $H_{pro}$ for the LDPC-CC of coding rate 7/9 that uses an improved tail-biting scheme (an LDPC block code using an LDPC-CC), $g_1$ is generated from a parity check polynomial satisfying zero that is obtained by transforming a parity check polynomial satisfying zero of #0; first expression. As described above, a parity check polynomial satisfying zero of #0; first expression is expressed by either expression (204-1-1) or expression (204-1-2).

[Math. 643]

$$\begin{aligned}
&\left(1+\sum_{s=1}^{R_{\#(0),1}} D^{\alpha\#(0),1,s}\right)X_1(D) + \left(1+\sum_{s=1}^{R_{\#(0),2}} D^{\alpha\#(0),2,s}\right)X_2(D) + \\
&\left(1+\sum_{s=1}^{R_{\#(0),3}} D^{\alpha\#(0),3,s}\right)X_3(D)\left(\sum_{s=R_{\#(0),4}+1}^{r_{\#(0),4}} D^{\alpha\#(0),4,s}\right)X_4(D) + \\
&\left(\sum_{s=R_{\#(0),5}+1}^{r_{\#(0),5}} D^{\alpha\#(0),5,s}\right)X_5(D) + \left(\sum_{s=R_{\#(0),6}+1}^{r_{\#(0),6}} D^{\alpha\#(0),6,s}\right)X_6(D) + \\
&\left(\sum_{s=R_{\#(0),7}+1}^{r_{\#(0),7}} D^{\alpha\#(0),7,s}\right)X_7(D) + P_1(D) + D^{\beta\#(0),0}P_2(D) = \\
&(D^{\alpha\#(0),1,R_{\#(0),1}} + \dots + D^{\alpha\#(0),1,1} + 1)X_1(D) + \\
&(D^{\alpha\#(0),2,R_{\#(0),2}} + \dots + D^{\alpha\#(0),2,1} + 1)X_2(D) + \\
&(D^{\alpha\#(0),3,R_{\#(0),3}} + \dots + D^{\alpha\#(0),3,1} + 1)X_3(D) + \\
&(D^{\alpha\#(0),4,r_{\#(0),4}} + \dots + D^{\alpha\#(0),4,R_{\#(0),4}} + 1)X_4(D) + \\
&(D^{\alpha\#(0),5,r_{\#(0),5}} + \dots + D^{\alpha\#(0),5,R_{\#(0),5}} + 1)X_5(D) + \\
&(D^{\alpha\#(0),6,r_{\#(0),6}} + \dots + D^{\alpha\#(0),6,R_{\#(0),6}} + 1)X_6(D) + \\
&(D^{\alpha\#(0),7,r_{\#(0),7}} + \dots + D^{\alpha\#(0),7,R_{\#(0),7}} + 1)X_7(D) + \\
&P_1(D) + D^{\beta\#(0),0}P_2(D) = 0
\end{aligned} \tag{204-1-1}$$

$$\begin{aligned}
&\left(1+\sum_{s=1}^{R_{\#(0),1}} D^{\alpha\#(0),1,s}\right)X_1(D) + \left(1+\sum_{s=1}^{R_{\#(0),2}} D^{\alpha\#(0),2,s}\right)X_2(D) + \\
&\left(1+\sum_{s=1}^{R_{\#(0),3}} D^{\alpha\#(0),3,s}\right)X_3(D)\left(\sum_{s=R_{\#(0),4}+1}^{r_{\#(0),4}} D^{\alpha\#(0),4,s}\right)X_4(D) + \\
&\left(\sum_{s=R_{\#(0),5}+1}^{r_{\#(0),5}} D^{\alpha\#(0),5,s}\right)X_5(D) + \left(\sum_{s=R_{\#(0),6}+1}^{r_{\#(0),6}} D^{\alpha\#(0),6,s}\right)X_6(D) + \\
&\left(\sum_{s=R_{\#(0),7}+1}^{r_{\#(0),7}} D^{\alpha\#(0),7,s}\right)X_7(D) + P_1(D) + D^{\beta\#(0),1}P_1(D) = \\
&(D^{\alpha\#(0),1,R_{\#(0),1}} + \dots + D^{\alpha\#(0),1,1} + 1)X_1(D) + \\
&(D^{\alpha\#(0),2,R_{\#(0),2}} + \dots + D^{\alpha\#(0),2,1} + 1)X_2(D) + \\
&(D^{\alpha\#(0),3,R_{\#(0),3}} + \dots + D^{\alpha\#(0),3,1} + 1)X_3(D) + \\
&(D^{\alpha\#(0),4,r_{\#(0),4}} + \dots + D^{\alpha\#(0),4,R_{\#(0),4}} + 1)X_4(D) + \\
&(D^{\alpha\#(0),5,r_{\#(0),5}} + \dots + D^{\alpha\#(0),5,R_{\#(0),5}} + 1)X_5(D) + \\
&(D^{\alpha\#(0),6,r_{\#(0),6}} + \dots + D^{\alpha\#(0),6,R_{\#(0),6}} + 1)X_6(D) + \\
&(D^{\alpha\#(0),7,r_{\#(0),7}} + \dots + D^{\alpha\#(0),7,R_{\#(0),7}} + 1)X_7(D) + \\
&P_1(D) + D^{\beta\#(0),1}P_1(D) = 0
\end{aligned} \tag{204-1-2}$$

As one example of a parity check polynomial satisfying zero for generating vector $g_1$ in row one of the parity check matrix $H_{pro}$ for the LDPC-CC of coding rate 7/9 that uses an improved tail-biting scheme (an LDPC block code using an LDPC-CC), a parity check polynomial satisfying zero of #0; first expression is expressed as follows, for either expression (204-1-1) or expression (204-1-2).

[Math. 644]

$$\left(1+\sum_{s=1}^{R_{\#(0),1}} D^{\alpha\#(0),1,s}\right)X_1(D)+\left(1+\sum_{s=1}^{R_{\#(0),2}} D^{\alpha\#(0),2,s}\right)X_2(D)+\left(1+\sum_{s=1}^{R_{\#(0),3}} D^{\alpha\#(0),3,s}\right)X_3(D)+\left(1+\sum_{s=R_{\#(0),4}+1}^{r_{\#(0),4}} D^{\alpha\#(0),4,s}\right)X_4(D)+\left(1+\sum_{s=R_{\#(0),5}+1}^{r_{\#(0),5}} D^{\alpha\#(0),5,s}\right)X_5(D)+\left(1+\sum_{s=R_{\#(0),6}+1}^{r_{\#(0),6}} D^{\alpha\#(0),6,s}\right)X_6(D)+\left(1+\sum_{s=R_{\#(0),7}+1}^{r_{\#(0),7}} D^{\alpha\#(0),7,s}\right)X_7(D)+P_1(D)= \tag{205}$$

$$\begin{aligned}&(D^{\alpha\#(0),1,R_{\#(0),1}}+\cdots+D^{\alpha\#(0),1,1}+1)X_1(D)+\\&(D^{\alpha\#(0),2,R_{\#(0),2}}+\cdots+D^{\alpha\#(0),2,1}+1)X_2(D)+\\&(D^{\alpha\#(0),3,R_{\#(0),3}}+\cdots+D^{\alpha\#(0),3,1}+1)X_3(D)+\\&(D^{\alpha\#(0),4,r_{\#(0),4}}+\cdots+D^{\alpha\#(0),4,R_{\#(0),4}}+1)X_4(D)+\\&(D^{\alpha\#(0),5,r_{\#(0),5}}+\cdots+D^{\alpha\#(0),5,R_{\#(0),5}}+1)X_5(D)+\\&(D^{\alpha\#(0),6,r_{\#(0),6}}+\cdots+D^{\alpha\#(0),6,R_{\#(0),6}}+1)X_6(D)+\\&(D^{\alpha\#(0),7,r_{\#(0),7}}+\cdots+D^{\alpha\#(0),7,R_{\#(0),7}}+1)X_7(D)+P_1(D)=0\end{aligned}$$

Accordingly, vector $g_1$ is a vector having one row and 9×2×m×z columns that is obtained by performing tail-biting with respect to expression 205.

Note that in the following, a parity check polynomial that satisfies zero provided by expression 205 is referred to as #0'; first expression.

Accordingly, row one of the parity check matrix $H_{pro}$ for the LDPC-CC of coding rate 7/9 that uses an improved tail-biting scheme (an LDPC block code using an LDPC-CC) can be obtained by transforming #0'; first expression of expression 205 (that is, a vector $g_1$ corresponding to one row and 9×2×m×z columns can be obtained).

A transmission sequence (encoded sequence (codeword)) $v_s$ of block s of the LDPC-CC of coding rate 7/9 that uses an improved tail-biting scheme (an LDPC block code using an LDPC-CC) is $v_s=(X_{s,1,1}, X_{s,2,1}, \ldots, X_{s,7,1}, P^{pro}_{s,1,1}, P^{pro}_{s,2,1}, X_{s,1,2}, X_{s,2,2}, \ldots, X_{s,7,2}, P^{pro}_{s,1,2}, P^{pro}_{s,2,2}, \ldots, X_{s,1,k}, X_{s,2,k}, \ldots, X_{s,7,k}, P^{pro}_{s,1,k}, P^{pro}_{s,2,k}, \ldots, X_{s,1,2\times m\times z}, X_{s,2,2\times m\times z}, \ldots, X_{s,7,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$, and the number of parity check polynomials satisfying zero necessary for obtaining this transmission sequence is 2×(2×m)×z.

Here, when arranging such 2×(2×m)×z number of parity check polynomials satisfying zero in order, a parity check polynomial satisfying zero appearing eth is referred to in the following as an "eth parity check polynomial satisfying zero" (where e is an integer no smaller than zero and no greater than 2×(2×m)×z−1).

As such, the parity check polynomials satisfying zero are arranged in the following order:

zeroth: zeroth parity check polynomial satisfying zero;

first: first parity check polynomial satisfying zero;

second: second parity check polynomial satisfying zero;

⋮ eth: eth parity check polynomial satisfying zero;

⋮

2×(2×m)×z−2th: 2×(2×m)×z−2th parity check polynomial satisfying zero; and

2×(2×m)×z−1th: 2×(2×m)×z−1th parity check polynomial satisfying zero.

Accordingly, the transmission sequence (encoded sequence (codeword)) $v_s$ of block s of the LDPC-CC of coding rate 7/9 that uses an improved tail-biting scheme (an LDPC block code using an LDPC-CC) is obtained. (As can be seen from description provided above, when expressing the parity check matrix $H_{pro}$ for the LDPC-CC of coding rate 7/9 that uses an improved tail-biting scheme (an LDPC block code using an LDPC-CC) as provided in expression 200, a vector composed of row e+1 of the parity check matrix $H_{pro}$ corresponds to the eth parity check polynomial satisfying zero.)

Accordingly, in the LDPC-CC of coding rate 7/9 that uses an improved tail-biting scheme (an LDPC block code using an LDPC-CC):

the 0th parity check polynomial satisfying zero is a parity check polynomial satisfying zero of #0'; first expression provided by expression 205;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 205;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

As description has been provided above, the LDPC-CC of coding rate 7/9 that uses an improved tail-biting scheme (an LDPC block code using an LDPC-CC), at the same time as achieving high error correction capability, enables finding multiple parities sequentially, and therefore, achieves an advantageous effect of reducing circuit scale of an encoder.

In the following, explanation is provided of what is meant by "finding parities sequentially".

In the example described above, since bits of information $X_1$ through $X_7$ are pre-acquired, $P^{pro}_{s,1,1}$ can be calculated by using the 0th parity check polynomial satisfying zero of the LDPC-CC of coding rate 7/9 that uses an improved tail-biting scheme (an LDPC block code using an LDPC-CC), or that is, by using the parity check polynomial satisfying zero of #0'; first expression provided by expression 205.

Then, from the bits of information $X_1$ through $X_7$ and $P^{pro}_{s,1,1}$, another parity (denoted as $P_{c=1}$) can be calculated by using another parity check polynomial satisfying zero.

Further, from the bits of information $X_1$ through $X_7$ and $P_{c=1}$, another parity (denoted as $P_{c=2}$) can be calculated by using another parity check polynomial satisfying zero.

By repeating such operation, from the bits of information $X_1$ through $X_7$ and $P_{c=h}$, another parity (denoted as $P_{c=h+1}$) can be calculated by using a given parity check polynomial satisfying zero.

This is referred to as "finding parities sequentially", and when parities can be found sequentially, multiple parities can be obtained without calculation of complex simultaneous equations, whereby an advantageous effect is achieved of reducing circuit scale (computation amount) of an encoder.

Next, explanation is provided of configurations and operations of an encoder and a decoder for the LDPC-CC of coding rate 7/9 that uses an improved tail-biting scheme (an LDPC block code using an LDPC-CC).

In the following, one example case is considered where the LDPC-CC of coding rate 7/9 that uses an improved tail-biting scheme (an LDPC block code using an LDPC-CC) is used in a communication system. When applying the LDPC-CC of coding rate 7/9 that uses an improved tail-biting scheme (an LDPC block code using an LDPC-CC) to a communication system, the encoder and the decoder for the LDPC-CC of coding rate 7/9 that uses an improved tail-biting scheme (an LDPC block code using an LDPC-CC) are characterized for each being configured and each operating based on the parity check matrix $H_{pro}$ for the LDPC-CC of coding rate 7/9 that uses an improved tail-biting scheme (an LDPC block code using an LDPC-CC) and based on the relationship $H_{pro}v_s=0$.

The following provides explanation while referring to FIG. 25, which is an overall diagram of a communication system. An encoder 2511 of a transmitting device 2501 receives an information sequence of block s ($X_{s,1,1}$, $X_{s,2,1}$, . . . , $X_{s,7,1}$, $X_{s,1,2}$, $X_{s,2,2}$, . . . , $X_{s,7,2}$, . . . , $X_{s,1,k}$, $X_{s,2,k}$, . . . , $X_{s,7,k}$, . . . , $X_{s,1,2\times m\times z}$, $X_{s,2,2\times m\times z}$, . . . , $X_{s,7,2\times m\times z}$) as input. The encoder 2511 performs encoding based on the parity check matrix $H_{pro}$ for the LDPC-CC of coding rate 7/9 that uses an improved tail-biting scheme (an LDPC block code using an LDPC-CC) and based on the relationship $H_{pro}v_s=0$. The encoder 2511 generates a transmission sequence (encoded sequence (codeword)) $v_s$ of block s of the LDPC-CC of coding rate 7/9 that uses an improved tail-biting scheme (an LDPC block code using an LDPC-CC), denoted as $v_s=(X_{s,1,1}, X_{s,2,1}, \ldots, X_{s,7,1}, P^{pro}_{s,1,1}, P^{pro}_{s,2,1}, X_{s,1,2}, X_{s,2,2}, \ldots, X_{s,7,2}, P^{pro}_{s,1,2}, P^{pro}_{s,2,2}, \ldots, X_{s,1,k}, X_{s,2,k}, \ldots, X_{s,7,k}, P^{pro}_{s,1,k}, P^{pro}_{s,2,k}, \ldots, X_{s,1,2\times m\times z}, X_{s,2,2\times m\times z}, \ldots, X_{s,7,2\times m\times z}, P^{pro}_{s,1,2\times m\times z}, P^{pro}_{s,2,2\times m\times z})^T$, and outputs the transmission sequence $v_s$. As already described above, the LDPC-CC of coding rate 7/9 that uses an improved tail-biting scheme (an LDPC block code using an LDPC-CC) is characterized for enabling parities to be found sequentially.

A decoder 2523 of a receiving device 2520 in FIG. 25 receives, as input, a log-likelihood ratio of each bit of, for example, the transmission sequence $v_s=(X_{s,1,1}, X_{s,2,1}, \ldots, X_{s,7,1}, P^{pro}_{s,1,1}, P^{pro}_{s,2,1}, X_{s,1,2}, X_{s,2,2}, \ldots, X_{s,7,2}, P^{pro}_{s,1,2}, P^{pro}_{s,2,2}, \ldots, X_{s,1,k}, X_{s,2,k}, \ldots, X_{s,7,k}, P^{pro}_{s,1,k}, P^{pro}_{s,2,k}, \ldots, X_{s,1,2\times m\times z}, X_{s,2,2\times m\times z}, \ldots, X_{s,7,2\times m\times z}, P^{pro}_{s,1,2\times m\times z}, P^{pro}_{s,2,2\times m\times z})^T$. The log-likelihood ratios are output from a log-likelihood ratio generator 2522. The decoder 2523 performs decoding for an LDPC code according to the parity check matrix $H_{pro}$ for the LDPC-CC of coding rate 7/9 that uses an improved tail-biting scheme (an LDPC block code using an LDPC-CC). For example, the decoding may be decoding disclosed in Non-Patent Literature 4, Non-Patent Literature 6, Non-Patent Literature 7, Non-Patent Literature 8, etc., i.e., simple BP decoding such as min-sum decoding, offset BP decoding, or Normalized BP decoding, or Belief Propagation (BP) decoding in which scheduling is performed with respect to the row operations (Horizontal operations) and the column operations (Vertical operations) such as Shuffled BP decoding or Layered BP decoding. The decoding may also be decoding such as bit-flipping decoding disclosed in Non-Patent Literature 17, for example. The decoder 2523 obtains an estimation transmission sequence (estimation encoded sequence) (reception sequence) of block s through the decoding, and outputs the estimation transmission sequence.

In the above, explanation is provided on operations of the encoder and the decoder in a communication system as one example. Alternatively, the encoder and the decoder may be used in technical fields related to storages, memories, etc.

The following describes a specific example of a configuration of a parity check matrix for the LDPC-CC of coding rate 7/9 that uses an improved tail-biting scheme (an LDPC block code using an LDPC-CC).

When denoting the parity check matrix for the LDPC-CC of coding rate 7/9 that uses an improved tail-biting scheme (an LDPC block code using an LDPC-CC) as $H_{pro}$ as described above, the number of columns of $H_{pro}$ can be expressed as 9×2×m×z (where z is a natural number). (Note that m denotes a time-varying period of the LDPC-CC of coding rate 7/9 that is based on a parity check polynomial, which serves as the basis.)

Accordingly, as already described above, a transmission sequence (encoded sequence (codeword)) $v_s$ composed of a 7×2×m×z number of bits in block s of the LDPC-CC of coding rate 7/9 that uses an improved tail-biting scheme (an LDPC block code using an LDPC-CC) can be expressed as $v_s=(X_{s,1,1}, X_{s,2,1}, \ldots, X_{s,7,1}, P^{pro}_{s,1,1}, P^{pro}_{s,2,1}, X_{s,1,2}, X_{s,2,2}, \ldots, X_{s,7,2}, P^{pro}_{s,1,2}, P^{pro}_{s,2,2}, \ldots, X_{s,1,k},$ $X_{s,2,k}, \ldots, X_{s,7,k}, P^{pro}_{s,1,k}, P^{pro}_{s,2,k}, \ldots, X_{s,1,2\times m\times z}, X_{s,2,2\times m\times z}, \ldots, X_{s,7,2\times m\times z}, P^{pro}_{s,1,2\times m\times z}, P^{pro}_{s,2,2\times m\times z})^T = (\lambda_{pro,s,1}, \lambda_{pro,s,2}, \ldots, \lambda_{pro,s,2\times m\times z-1}, \lambda_{pro,s,2\times m\times z})^T$ (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}v_s$ are zeroes).

$X_{s,j,k}$ (where j is an integer no smaller than one and no greater than seven) is a bit of information $X_j$, $P^{pro}_{s,1,k}$ is a bit of parity $P_1$ of the LDPC-CC of coding rate 7/9 that uses an improved tail-biting scheme (an LDPC block code using an LDPC-CC), and $P^{pro}_{s,2,k}$ is a bit of parity $P_2$ of the LDPC-CC of coding rate 7/9 that uses an improved tail-biting scheme (an LDPC block code using an LDPC-CC).

Further, $\lambda_{pro,s,k}=(X_{s,1,k}, X_{s,2,k}, X_{s,3,k}, X_{s,4,k}, X_{s,5,k}, X_{s,6,k}, X_{s,7,k}, P^{pro}_{s,1,k}, P^{pro}_{s,2,k})$ holds true.

In addition, the number of rows in the parity check matrix $H_{pro}$ for the LDPC-CC of coding rate 7/9 that uses an improved tail-biting scheme (an LDPC block code using an LDPC-CC) is 4×m×z.

Note that the method of configuring parity check polynomials satisfying zero for the LDPC-CC of coding rate 7/9 that uses an improved tail-biting scheme (an LDPC block code using an LDPC-CC) has already been described above.

In the above, description has been provided of a parity check matrix $H_{pro}$ for the LDPC-CC of coding rate 7/9 that uses an improved tail-biting scheme (an LDPC block code using an LDPC-CC), whose transmission sequence (encoded sequence (codeword)) $v_s$ of block s is $v_s=(X_{s,1,1}, X_{s,2,1}, \ldots, X_{s,7,1}, P^{pro}_{s,1,1}, P^{pro}_{s,2,1}, X_{s,1,2}, X_{s,2,2}, \ldots, X_{s,7,2}, P^{pro}_{s,1,2}, P^{pro}_{s,2,2}, \ldots, X_{s,1,k}, X_{s,2,k}, \ldots, X_{s,7,k}, P^{pro}_{s,1,k}, P^{pro}_{s,2,k}, \ldots, X_{s,1,2\times m\times z}, X_{s,2,2\times m\times z}, \ldots, X_{s,7,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ and for which $H_{pro}v_s=0$ holds true (here, $H_{pro}v_s=0$ indicates that all elements of the vector $H_{pro}v_s$ are zeroes). The following provides description of a configuration of a parity check matrix $H_{pro\_m}$ for the LDPC-CC of coding rate 7/9 that uses an improved tail-biting scheme (an LDPC block code using an LDPC-CC), for which $H_{pro\_m}u_s=0$ holds true (here, $H_{pro\_m}u_s=0$ indicates that all elements of the vector $H_{pro\_m}u_s$ are zeroes) when expressing a transmission sequence (encoded sequence (codeword)) $u_s$ of block s as $u_s=(X_{s,1,1}, X_{s,1,2}, \ldots, X_{s,1,2\times m\times z-1}, X_{s,1,2\times m\times z}, X_{s,2,1}, X_{s,2,2}, \ldots, X_{s,2,2\times m\times z-1}, X_{s,2,2\times m\times z}, X_{s,3,1}, X_{s,3,2}, \ldots, X_{s,3,2\times m\times z-1}, X_{s,3,2\times m\times z}, X_{s,4,1}, X_{s,4,2}, \ldots, X_{s,4,2\times m\times z-1}, X_{s,4,2\times m\times z}, X_{s,5,1}, X_{s,5,2}, \ldots, X_{s,5,2\times m\times z-1}, X_{s,5,2\times m\times z}, X_{s,6,1}, X_{s,6,2}, \ldots, X_{s,6,2\times m\times z-1}, X_{s,6,2\times m\times z}, X_{s,7,1}, X_{s,7,2}, \ldots, X_{s,7,2\times m\times z-1}, X_{s,7,2\times m\times z}, P^{pro}_{s,1,1}, P^{pro}_{s,1,2}, \ldots, P^{pro}_{s,1,2\times m\times z-1}, P^{pro}_{s,1,2\times m\times z}, P^{pro}_{s,2,1}, P^{pro}_{s,2,2}, \ldots, P^{pro}_{s,2,2\times m\times z-1}, P^{pro}_{s,2,2\times m\times z})^T=(\Lambda_{X1,s}, \Lambda_{X2,s}, \Lambda_{X3,s}, \Lambda_{X4,s}, \Lambda_{X5,s}, \Lambda_{X6,s}, \Lambda_{X7,s}, \Lambda_{pro1,s}, \Lambda_{pro2,s})$ Note that $\Lambda_{Xf,s}$ (where f is an integer no smaller than one and no greater than seven) satisfies $\Lambda_{Xf,s}=(X_{s,f,1}, X_{s,f,2}, X_{s,f,3}, \ldots, X_{s,f,2\times m\times z-2}, X_{s,f,2\times m\times z-1}, X_{s,f,2\times m\times z})$ ($\Lambda_{Xf,s}$ is a vector having one row and 2×m×z columns), and $\Lambda_{pro1,s}$ and $\Lambda_{pro2,s}$ satisfy $\Lambda_{pro1,s}=(P^{pro}_{s,1,1}, P^{pro}_{s,1,2}, \ldots, P^{pro}_{s,1,2\times m\times z-1}, P^{pro}_{s,1,2\times m\times z})$ and $\Lambda_{pro2,s}=(P^{pro}_{s,2,1}, P^{pro}_{s,2,2}, \ldots, P^{pro}_{s,2,2\times m\times z-1}, P^{pro}_{s,2,2\times m\times z})$, respectively ($\Lambda_{pro1,s}$ and $\Lambda_{pro2,s}$ are both vectors having one row and 2×m×z columns).

Figure 92:
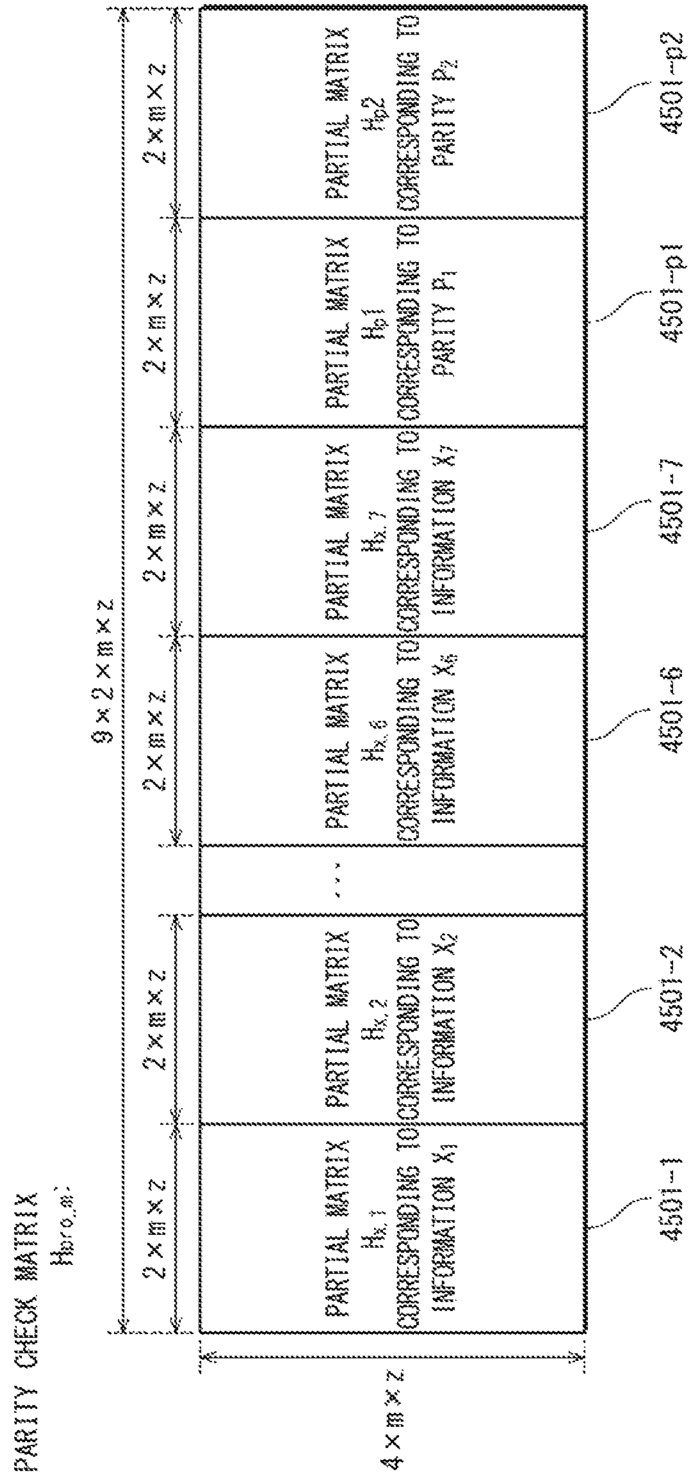
FIG. 92 shows an example of the configuration of check matrix for LDPC-CC of coding rate 7/9 when improved tail-biting is performed.

Here, the number of bits of information $X_1$ included in one block is 2×m×z, the number of bits of information $X_2$ included in one block is 2×m×z, the number of bits of information $X_3$ included in one block is 2×m×z, the number of bits of information $X_4$ included in one block is 2×m×z, the number of bits of information $X_5$ included in one block is 2×m×z, the number of bits of information $X_6$ included in one block is 2×m×z, the number of bits of information $X_7$ included in one block is 2×m×z, the number of bits of parity bits $P_1$ included in one block is 2×m×z, and the number of bits of parity bits $P_2$ included in one block is 2×m×z. Accordingly, the parity check matrix $H_{pro\_m}$ for the LDPC-CC of coding rate 7/9 that uses an improved tail-biting scheme (an LDPC block code using an LDPC-CC) can be expressed as $H_{pro\_m}=[H_{x,1}, H_{x,2}, H_{x,3}, H_{x,4}, H_{x,5}, H_{x,6}, H_{x,7}, H_{p1}, H_{p2}]$, as illustrated in FIG. 92. Since a transmission sequence (encoded sequence (codeword)) $u_s$ of block s is $u_s=(X_{s,1,1}, X_{s,1,2}, \ldots, X_{s,1,2\times m\times z-1}, X_{s,1,2\times m\times z}, X_{s,2,1}, X_{s,2,2}, \ldots, X_{s,2,2\times m\times z-1}, X_{s,2,2\times m\times z}, X_{s,3,1}, X_{s,3,2}, \ldots, X_{s,3,2\times m\times z-1}, X_{s,3,2\times m\times z}, X_{s,4,1}, X_{s,4,2}, \ldots, X_{s,4,2\times m\times z-1}, X_{s,4,2\times m\times z}, X_{s,5,1}, X_{s,5,2}, \ldots, X_{s,5,2\times m\times z-1}, X_{s,5,2\times m\times z}, X_{s,6,1}, X_{s,6,2}, \ldots, X_{s,6,2\times m\times z-1}, X_{s,6,2\times m\times z}, X_{s,7,1}, X_{s,7,2}, \ldots, X_{s,7,2\times m\times z-1}, X_{s,7,2\times m\times z}, P^{pro}_{s,1,1}, P^{pro}_{s,1,2}, \ldots, P^{pro}_{s,1,2\times m\times z-1}, P^{pro}_{s,1,2\times m\times z}, P^{pro}_{s,2,1}, P^{pro}_{s,2,2}, \ldots, P^{pro}_{s,2,2\times m\times z-1}, P^{pro}_{s,2,2\times m\times z})^T=(\Lambda_{X1,s}, \Lambda_{X2,s}, \Lambda_{X3,s}, \Lambda_{X4,s}, \Lambda_{X5,s}, \Lambda_{X6,s}, \Lambda_{X7,s}, \Lambda_{pro1,s}, \Lambda_{pro2,s})^T$, $H_{x,1}$ is a partial matrix related to information $X_1$, $H_{x,2}$ is a partial matrix related to information $X_2$, $H_{x,3}$ is a partial matrix related to information $X_3$, $H_{x,4}$ is a partial matrix related to information $X_4$, $H_{x,5}$ is a partial matrix related to information $X_5$, $H_{x,6}$ is a partial matrix related to information $X_6$, $H_{x,7}$ is a partial matrix related to information $X_7$, $H_{p1}$ is a partial matrix related to parity $P_1$, and $H_{p2}$ is a partial matrix related to parity $P_2$. As illustrated in FIG. 92, the parity check matrix $H_{pro\_m}$ has 4×m×z rows and 9×2×m×z columns, the partial matrix $H_{x,1}$ related to information $X_1$ has 4×m×z rows and 2×m×z columns, the partial matrix $H_{x,2}$ related to information $X_2$ has 4×m×z rows and 2×m×z columns, the partial matrix $H_{x,3}$ related to information $X_3$ has 4×m×z rows and 2×m×z columns, the partial matrix $H_{x,4}$ related to information $X_4$ has 4×m×z rows and 2×m×z columns, the partial matrix $H_{x,5}$ related to information $X_5$ has 4×m×z rows and 2×m×z columns, the partial matrix $H_{x,6}$ related to information $X_6$ has 4×m×z rows and 2×m×z columns, the partial matrix $H_{x,7}$ related to information $X_7$ has 4×m×z rows and 2×m×z columns, the partial matrix $H_{p1}$ related to parity $P_1$ has 4×m×z rows and 2×m×z columns, and the partial matrix $H_{p2}$ related to parity $P_2$ has 4×m×z rows and 2×m×z columns.

The transmission sequence (encoded sequence (codeword)) $u_s$ composed of a 9×2×m×z number of bits in block s of the LDPC-CC of coding rate 7/9 that uses an improved tail-biting scheme (an LDPC block code using an LDPC-CC) is $u_s=(X_{s,1,1}, X_{s,1,2}, \ldots, X_{s,1,2\times m\times z-1}, X_{s,1,2\times m\times z}, X_{s,2,1}, X_{s,2,2}, \ldots, X_{s,2,2\times m\times z-1}, X_{s,2,2\times m\times z}, X_{s,3,1}, X_{s,3,2}, \ldots, X_{s,3,2\times m\times z-1}, X_{s,3,2\times m\times z}, X_{s,4,1}, X_{s,4,2}, \ldots, X_{s,4,2\times m\times z-1}, X_{s,4,2\times m\times z}, X_{s,5,1}, X_{s,5,2}, \ldots, X_{s,5,2\times m\times z-1}, X_{s,5,2\times m\times z}, X_{s,6,1}, X_{s,6,2}, \ldots, X_{s,6,2\times m\times z-1}, X_{s,6,2\times m\times z}, X_{s,7,1}, X_{s,7,2}, \ldots, X_{s,7,2\times m\times z-1}, X_{s,7,2\times m\times z}, P^{pro}_{s,1,1}, P^{pro}_{s,1,2}, \ldots, P^{pro}_{s,1,2\times m\times z-1}, P^{pro}_{s,1,2\times m\times z}, P^{pro}_{s,2,1}, P^{pro}_{s,2,2}, \ldots, P^{pro}_{s,2,2\times m\times z-1}, P^{pro}_{s,2,2\times m\times z})^T=(\Lambda_{X1,s}, \Lambda_{X2,s}, \Lambda_{X3,s}, \Lambda_{X4,s}, \Lambda_{X5,s}, \Lambda_{X6,s}, \Lambda_{X7,s}, \Lambda_{pro1,s}, \Lambda_{pro2,s})^T$, and the number of parity check polynomials satisfying zero necessary for obtaining this transmission sequence is 4×m×z.

Here, when arranging such 2×(2×m)×z number of parity check polynomials satisfying zero in order, a parity check polynomial satisfying zero appearing eth is referred to in the following as an "eth parity check polynomial satisfying zero" (where e is an integer no smaller than zero and no greater than 2×(2×m)×z−1).

As such, the parity check polynomials satisfying zero are arranged in the following order:

zeroth: zeroth parity check polynomial satisfying zero;

first: first parity check polynomial satisfying zero;

second: second parity check polynomial satisfying zero;

⋮ eth: eth parity check polynomial satisfying zero;

⋮

2×(2×m)×z−2th: 2×(2×m)×z−2th parity check polynomial satisfying zero; and

2×(2×m)×z−1th: 2×(2×m)×z−1th parity check polynomial satisfying zero.

Accordingly, the transmission sequence (encoded sequence (codeword)) $u_s$ of block s of the LDPC-CC of coding rate 7/9 that uses an improved tail-biting scheme (an LDPC block code using an LDPC-CC) is obtained.

Accordingly, in the LDPC-CC of coding rate 7/9 that uses an improved tail-biting scheme (an LDPC block code using an LDPC-CC):

the 0th parity check polynomial satisfying zero is a parity check polynomial satisfying zero of #0'; first expression provided by expression 205;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 205;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

In the present embodiment (in fact, commonly applying to the entirety of the present disclosure), % means a modulo, and for example, α%q represents a remainder after dividing α by q (where a is an integer no smaller than zero, and q is a natural number).

The following describes details of the configuration of the parity check matrix $H_{pro\_m}$ for the LDPC-CC of coding rate 7/9 that uses an improved tail-biting scheme (an LDPC block code using an LDPC-CC) based on what has been described above.

The parity check matrix $H_{pro\_m}$ for the LDPC-CC of coding rate 7/9 that uses an improved tail-biting scheme (an LDPC block code using an LDPC-CC) has 4×m×z rows and 9×2×m×z columns.

Accordingly, the parity check matrix $H_{pro\_m}$ for the LDPC-CC of coding rate 7/9 that uses an improved tail-biting scheme (an LDPC block code using an LDPC-CC) has rows one through 4×m×z, and columns one through 9×2×m×z.

Here, the topmost row of the parity check matrix $H_{pro\_m}$ is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

Further, the leftmost column of the parity check matrix $H_{pro\_m}$ is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

In the parity check matrix $H_{pro\_m}$, the partial matrix $H_{x,1}$ related to information $X_1$ has 4×m×z rows and 2×m×z columns. In the following, an element at row u, column v of the partial matrix $H_{x,1}$ related to information $X_1$ is denoted as $H_{x,1,comp}[u][v]$ (where u is an integer no smaller than one and no greater than 4×m×z, and v is an integer no smaller than one and no greater than 2×m×z).

Similarly, in the parity check matrix $H_{pro\_m}$, the partial matrix $H_{x,2}$ related to information $X_2$ has 4×m×z rows and 2×m×z columns. In the following, an element at row u, column v of the partial matrix $H_{x,2}$ related to information $X_2$ is denoted as $H_{x,2,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,3}$ related to information $X_3$ has 4×m×z rows and 2×m×z columns. In the following, an element at row u, column v of the partial matrix $H_{x,3}$ related to information $X_3$ is denoted as $H_{x,3,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,4}$ related to information $X_4$ has 4×m×z rows and 2×m×z columns. In the following, an element at row u, column v of the partial matrix $H_{x,4}$ related to information $X_4$ is denoted as $H_{x,4,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,5}$ related to information $X_5$ has 4×m×z rows and 2×m×z columns. In the following, an element at row u, column v of the partial matrix $H_{x,5}$ related to information $X_5$ is denoted as $H_{x,5,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,6}$ related to information $X_6$ has 4×m×z rows and 2×m×z columns. In the following, an element at row u, column v of the partial matrix $H_{x,6}$ related to information $X_6$ is denoted as $H_{x,6,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,7}$ related to information $X_7$ has 4×m×z rows and 2×m×z columns. In the following, an element at row u, column v of the partial matrix $H_{x,7}$ related to information $X_7$ is denoted as $H_{x,7,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{p,1}$ related to parity $P_1$ has 4×m×z rows and 2×m×z columns. In the following, an element at row u, column v of the partial matrix $H_{p,1}$ related to parity $P_1$ is denoted as $H_{p1,comp}[u][v]$ (where u is an integer no smaller than one and no greater than 4×m×z, and v is an integer no smaller than one and no greater than 2×m×z).

Similarly, in the parity check matrix $H_{pro\_m}$, the partial matrix $H_{p,2}$ related to parity $P_2$ has 4×m×z rows and 2×m×z columns. In the following, an element at row u, column v of the partial matrix $H_{p,2}$ related to parity $P_2$ is denoted as $H_{p2,comp}[u][v]$ (where u is an integer no smaller than one and no greater than 4×m×z, and v is an integer no smaller than one and no greater than 2×m×z).

The following provides detailed description of the configuration of $H_{x,1,comp}[u][v]$, $H_{x,2,comp}[u][v]$, $H_{x,3,comp}[u][v]$, $H_{x,4,comp}[u][v]$, $H_{x,5,comp}[u][v]$, $H_{x,6,comp}[u][v]$, $H_{x,7,comp}[u][v]$, $H_{p1,comp}[u][v]$, and $H_{p2,comp}[u][v]$.

As already described above, in the LDPC-CC of coding rate 7/9 that uses an improved tail-biting scheme (an LDPC block code using an LDPC-CC):

the 0th parity check polynomial satisfying zero is a parity check polynomial satisfying zero of #0'; first expression provided by expression 205;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 205;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

Further, a vector composed of row e+1 of the parity check matrix $H_{pro\_m}$ corresponds to the eth parity check polynomial satisfying zero.

Accordingly, a vector composed of row one of the parity check matrix $H_{pro\_m}$ is generated by using a parity check polynomial satisfying zero of #0'; first expression provided by expression 205;

a vector composed of row two of the parity check matrix $H_{pro\_m}$ is generated by using a parity check polynomial satisfying zero of #0; second expression;

a vector composed of row 2×g−1 of the parity check matrix $H_{pro\_m}$ is generated by using a parity check polynomial satisfying zero of #((g−1)%2m); first expression; and a vector composed of row 2×g of the parity check matrix $H_{pro\_m}$ is generated by using a parity check polynomial satisfying zero of #((g−1)%2m); second expression (where g is an integer no smaller than two and no greater than 2×m×z).

$H_{x,1,comp}[u][v]$, $H_{x,2,comp}[u][v]$, $H_{x,3,comp}[u][v]$, $H_{x,4,comp}[u][v]$, $H_{x,5,comp}[u][v]$, $H_{x,6,comp}[u][v]$, $H_{x,7,comp}[u][v]$, $H_{p1,comp}[u][v]$, and $H_{p2,comp}[u][v]$ can be expressed according to the relationship described above.

First, description is provided of the configuration of $H_{x,1,comp}[u][v]$, $H_{x,2,comp}[u][v]$, $H_{x,3,comp}[u][v]$, $H_{x,4,comp}[u][v]$, $H_{x,5,comp}[u][v]$, $H_{x,6,comp}[u][v]$, $H_{x,7,comp}[u][v]$, $H_{p1,comp}[u][v]$, and $H_{p2,comp}[u][v]$ for row one of the parity check matrix $H_{pro\_m}$, or that is, for u=1.

The vector composed of row one of the parity check matrix $H_{pro\_m}$ is generated by using a parity check polynomial satisfying zero of #0'; first expression provided by expression 205. Accordingly, $H_{x,1,comp}[1][v]$ can be expressed as follows.

[Math. 645]

$$H_{x,w,comp}[1][1]=1 \quad (206\text{-}1)$$

When y is an integer no smaller than one and no greater than $R_{\#(0),1}$:

$$H_{x,1,comp}[1][1-\alpha_{\#(0),1,y}+(2\times m\times z)]=1 \quad (206\text{-}2)$$

For all v being an integer no smaller than one and no greater than 2×m×z satisfying {v≠1} and $\{v\neq 1-\alpha_{\#(0),1,y}+(2\times m\times z)\}$ (where y is an integer no smaller than one and no greater than $R_{\#(0),1}$), the following holds true:

$$H_{x,1,comp}[1][v]=0 \quad (206\text{-}3)$$

Considered in a similar manner, the following holds true for $H_{x,w,comp}[1][v]$, where w is an integer no smaller than one and no greater than three.

[Math. 646]

$$H_{x,w,comp}[1][1]=1 \quad (207\text{-}1)$$

When y is an integer no smaller than one and no greater than $R_{\#(0),w}$:

$$H_{x,w,comp}[1][1-\alpha_{\#(0),w,y}+(2\times m\times z)]=1 \quad (207\text{-}2)$$

For all v being an integer no smaller than one and no greater than 2×m×z satisfying {v≠1} and $\{v\neq 1-\alpha_{\#(0),w,y}+(2\times m\times z)\}$ (where y is an integer no smaller than one and no greater than $R_{\#(0),w}$), the following holds true:

$$H_{x,w,comp}[1][v]=0 \quad (207\text{-}3)$$

Further, $H_{x,4,comp}[1][v]$ can be expressed as follows.

[Math. 647]

When y is an integer no smaller than $R_{\#(0),4}+1$ and no greater than $r_{\#((0),4}$:

$$H_{x,4,comp}[1][1-\alpha_{\#(0),4,y}+(2\times m\times z)]=1 \quad (208\text{-}1)$$

For all v being an integer no smaller than one and no greater than 2×m×z satisfying $\{v\neq 1-\alpha_{\#(0),4,y}+(2\times m\times z)\}$ (where y is an integer no smaller than $R_{\#(0),4}+1$ and no greater than $r_{\#((0),4)}$), the following holds true:

$$H_{x,4,comp}[1][v]=0 \quad (208\text{-}2)$$

Considered in a similar manner, the following holds true for $H_{x\Omega,comp}[1][v]$. In the following, Ω is an integer no smaller than four and no greater than seven.

[Math. 648]

When y is an integer no smaller than $R_{\#(0),\Omega}+1$ and no greater than $r_{\#(0),\Omega}$:

$$H_{x,\Omega,comp}[1][1-\alpha_{\#(0),\Omega,y}+(2\times m\times z)]=1 \quad (209\text{-}1)$$

For all v being an integer no smaller than one and no greater than 2×m×z satisfying $\{v\neq 1-\alpha_{\#(0),\Omega,y}+(2\times m\times z)\}$ (where y is an integer no smaller than $R_{\#(0),\Omega}+1$ and no greater than $r_{\#((0),\Omega)}$), the following holds true:

$$H_{x,\Omega,comp}[1][v]=0 \quad (209\text{-}2)$$

Further, $H_{p1,comp}[1][v]$ can be expressed as follows.

[Math. 649]

$$H_{p1,comp}[1][1]=1 \quad (210\text{-}1)$$

For all v being an integer no smaller than two and no greater than 2×m×z, the following holds true:

$$H_{p1,comp}[1][v]=0 \quad (210\text{-}2)$$

Further, $H_{p2,comp}[1][v]$ can be expressed as follows.

[Math. 650]

For all v being an integer no smaller than one and no greater than 2×m×z, the following holds true:

$$H_{p2,comp}[1][v]=0 \quad (211)$$

The vector composed of row two of the parity check matrix $H_{pro\_m}$ is generated by using a parity check polynomial satisfying zero of #0; second expression. As described above, a parity check polynomial satisfying zero of #0; second expression is expressed by either expression (197-2-1) or expression (197-2-2).

Accordingly, $H_{x,1,comp}[2][v]$ can be expressed as follows.

<1> When a parity check polynomial satisfying zero of #0; second expression is expressed as provided in expression (197-2-1):

$H_{x,1,comp}[2][v]$ is expressed as follows.

[Math. 651]

When y is an integer no smaller than $R_{\#(0),1}+1$ and no greater than $r_{\#(0),1}$:

$$H_{x,1,comp}[2][1-\alpha_{\#(0),1,y}+(2\times m\times z)]=1 \quad (212\text{-}1)$$

For all v being an integer no smaller than one and no greater than 2×m×z satisfying $\{v\neq 1-\alpha_{\#(0),1,y}+(2\times m\times z)\}$ (where y is an integer no smaller than $R_{\#(0),1}+1$ and no greater than $r_{\#((0),1)}$), the following holds true:

$$H_{x,1,comp}[2][v]=0 \quad (212\text{-}2)$$

Considered in a similar manner, the following holds true for $H_{x,\Omega,comp}[2][v]$, where Ω is an integer no smaller than one and no greater than three.

[Math. 652]

When y is an integer no smaller than $R_{\#(0),\Omega}+1$ and no greater than $r_{\#(0),\Omega}$:

$$H_{x,\Omega,comp}[2][1-\alpha_{\#(0),\Omega,y}+(2\times m\times z)]=1 \quad (213\text{-}1)$$

For all v being an integer no smaller than one and no greater than 2×m×z satisfying {v≠1} and $\{v\neq 1-\alpha_{\#(0),\Omega,y}+(2\times m\times z)\}$ (where y is an integer no smaller than $R_{\#(0),\Omega}+1$ and no greater than $r_{\#((0),\Omega)}$), the following holds true:

$$H_{x,\Omega,comp}[2][v]=0 \quad (213\text{-}2)$$

Further, $H_{x,4,comp}[2][v]$ is expressed as follows.

[Math. 653]

$$H_{x,4,comp}[2][1]=1 \quad (214\text{-}1)$$

When y is an integer no smaller than one and no greater than $R_{\#(0),4}$:

$$H_{x,4,comp}[2][1-\alpha_{\#(0),4,y}+(2\times m\times z)]=1 \quad (214\text{-}2)$$

For all v being an integer no smaller than one and no greater than 2×m×z satisfying {v≠1} and $\{v\neq 1-\alpha_{\#(0),4,y}+(2\times m\times z)\}$ (where y is an integer no smaller than one and no greater than $R_{\#(0),4}$), the following holds true:

$$H_{x,4,comp}[2][v]=0 \quad (214\text{-}3)$$

Considered in a similar manner, the following holds true for $H_{x,w,comp}[2][v]$, where w is an integer no smaller than four and no greater than seven.

[Math. 654]

$$H_{x,w,comp}[2][1]=1 \quad (215\text{-}1)$$

When y is an integer no smaller than one and no greater than $R_{\#(0),w}$:

$$H_{x,w,comp}[2][1-\alpha_{\#(0),w,y}+(2\times m\times z)]=1 \quad (215\text{-}2)$$

For all v being an integer no smaller than one and no greater than 2×m×z satisfying {v≠1} and $\{v \neq 1-\alpha_{\#(0),w,y}+(2\times m\times z)\}$ (where y is an integer no smaller than one and no greater than $R_{\#(0),w}$), the following holds true:

$$H_{x,w,comp}[2][v]=0 \quad (215\text{-}3)$$

Further, $H_{p1,comp}[2][v]$ can be expressed as follows.

[Math. 655]

$$H_{p1,comp}[2][1-\beta_{\#(0),2}+(2\times m\times z)]=1 \quad (216\text{-}1)$$

For all v being an integer no smaller than one and no greater than 2×m×z satisfying $\{v\neq 1-\beta_{\#(0),2}+(2\times m\times z)\}$, the following holds true:

$$H_{p1,comp}[2][v]=0 \quad (216\text{-}2)$$

Further, $H_{p2,comp}[2][v]$ can be expressed as follows.

[Math. 656]

$$H_{p2,comp}[2][1]=1 \quad (217\text{-}1)$$

For all v being an integer no smaller than two and no greater than 2×m×z, the following holds true:

$$H_{p2,comp}[2][v]=0 \quad (217\text{-}2)$$

<2> When a parity check polynomial satisfying zero of #0; second expression is expressed as provided in expression (197-2-2):

$H_{x,1,comp}[2][v]$ is expressed as follows.

[Math. 657]

When y is an integer no smaller than $R_{\#(0),1}+1$ and no greater than $r_{\#(0),1}$:

$$H_{x,1,comp}[2][1-\alpha_{\#(0),1,y}+(2\times m\times z)]=1 \quad (218\text{-}1)$$

For all v being an integer no smaller than one and no greater than 2×m×z satisfying $\{v\neq 1-\alpha_{\#(0),1,y}+(2\times m\times z)\}$ (where y is an integer no smaller than $R_{\#(0),1}+1$ and no greater than $r_{\#((0),1)}$), the following holds true:

$$H_{x,1,comp}[2][v]=0 \quad (218\text{-}2)$$

Considered in a similar manner, the following holds true for $H_{x,\Omega,comp}[2][v]$, where Ω is an integer no smaller than one and no greater than three.

[Math. 658]

When y is an integer no smaller than $R_{\#(0),\Omega}+1$ and no greater than $r_{\#(0),\Omega}$:

$$H_{x,\Omega,comp}[2][1-\alpha_{\#(0),\Omega,y}+(2\times m\times z)]=1 \quad (219\text{-}1)$$

For all v being an integer no smaller than one and no greater than 2×m×z satisfying {v≠1} and $\{v\neq 1-\alpha_{\#(0),\Omega,y}+(2\times m\times z)\}$ (where y is an integer no smaller than $R_{\#(0),\Omega}+1$ and no greater than $r_{\#((0),\Omega)}$), the following holds true:

$$H_{x,\Omega,comp}[2][v]=0 \quad (219\text{-}2)$$

Further, $H_{x,4,comp}[2][v]$ is expressed as follows.

[Math. 659]

$$H_{x,4,comp}[2][1]=1 \quad (220\text{-}1)$$

When y is an integer no smaller than one and no greater than $R_{\#(0),4}$:

$$H_{x,4,comp}[2][1-\alpha_{\#(0),4,y}+(2\times m\times z)]=1 \quad (220\text{-}2)$$

For all v being an integer no smaller than one and no greater than 2×m×z satisfying {v≠1} and $\{v\neq 1-\alpha_{\#(0),4,y}+(2\times m\times z)\}$ (where y is an integer no smaller than one and no greater than $R_{\#(0),4}$), the following holds true:

$$H_{x,4,comp}[2][v]=0 \quad (220\text{-}3)$$

Considered in a similar manner, the following holds true for $H_{x,w,comp}[2][v]$, where w is an integer no smaller than four and no greater than seven.

[Math. 660]

$$H_{x,w,comp}[2][1]=1 \quad (221\text{-}1)$$

When y is an integer no smaller than one and no greater than $R_{\#(0),w}$:

$$H_{x,w,comp}[2][1-\alpha_{\#(0),w,y}+(2\times m\times z)]=1 \quad (221\text{-}2)$$

For all v being an integer no smaller than one and no greater than 2×m×z satisfying {v≠1} and $\{v\neq 1-\alpha_{\#(0),w,y}+(2\times m\times z)\}$ (where y is an integer no smaller than one and no greater than $R_{\#(0),w}$), the following holds true:

$$H_{x,w,comp}[2][v]=0 \quad (221\text{-}3)$$

Further, $H_{p1,comp}[2][v]$ can be expressed as follows.

[Math. 661]

For all v being an integer no smaller than one and no greater than 2×m×z, the following holds true:

$$H_{p1,comp}[2][v]=0 \quad (222)$$

Further, $H_{p2,comp}[2][v]$ can be expressed as follows.

[Math. 662]

$$H_{p2,comp}[2][1]=1 \quad (223\text{-}1)$$

$$H_{p2,comp}[2][1-\beta_{\#(0),3}+(2\times m\times z)]=1 \quad (223\text{-}2)$$

For all v being an integer no smaller than one and no greater than 2×m×z satisfying {v≠1} and $\{v\neq 1-\beta_{\#(0),3}+(2\times m\times z)\}$, the following holds true:

$$H_{p2,comp}[2][v]=0 \quad (223\text{-}3)$$

As already described above, the vector composed of row 2×g−1 of the parity check matrix $H_{pro\_m}$ is generated by using a parity check polynomial satisfying zero of #((g−1)%2m); first expression; and the vector composed of row 2×g of the parity check matrix $H_{pro\_m}$ is generated by using a parity check polynomial satisfying zero of #((g−1)%2m); second expression (where g is an integer no smaller than two and no greater than 2×m×z).

Accordingly, when g=2×f−1 (where f is an integer no smaller than two and no greater than m×z), a vector of row 2×(2×f−1)−1 of the parity check matrix $H_{pro\_m}$ for the LDPC-CC of coding rate 7/9 that uses an improved tail-biting scheme (an LDPC block code using an LDPC-CC) can be generated by using a parity check polynomial satisfying zero of #(((2×f−1)−1)%2m); first expression, or that is, by using a parity check polynomial satisfying zero provided by expression (197-1-1) or expression (197-1-2).

Further, a vector of row 2×(2×f−1) of the parity check matrix $H_{pro\_m}$ for the LDPC-CC of coding rate 7/9 that uses an improved tail-biting scheme (an LDPC block code using an LDPC-CC) can be generated by using a parity check polynomial satisfying zero of #(((2×f−1)−1)%2m); second expression, or that is, by using a parity check polynomial satisfying zero provided by expression (197-2-1) or expression (197-2-2).

Further, when g=2×f (where f is an integer no smaller than one and no greater than m×z), a vector of row 2×(2×f)−1 of the parity check matrix $H_{pro\_m}$ for the LDPC-CC of coding rate 7/9 that uses an improved tail-biting scheme (an LDPC block code using an LDPC-CC) can be generated by using a parity check polynomial satisfying zero of #(((2×f)−1)%2m); first expression, or that is, by using a parity check polynomial satisfying zero provided by expression (198-1-1) or expression (198-1-2).

Further, a vector of row 2×(2×f) of the parity check matrix $H_{pro\_m}$ for the LDPC-CC of coding rate 7/9 that uses an improved tail-biting scheme (an LDPC block code using an LDPC-CC) can be generated by using a parity check polynomial satisfying zero of #(((2×f)−1)%2m); second expression, or that is, by using a parity check polynomial satisfying zero provided by expression (198-2-1) or expression (198-2-2).

Accordingly, (1) when g=2×f−1 (where f is an integer no smaller than two and no greater than m×z), when a vector for row 2×(2×f−1)−1 of the parity check matrix $H_{pro\_m}$, which is for the LDPC-CC of coding rate 7/9 that uses an improved tail-biting scheme (an LDPC block code using an LDPC-CC), can be generated by using a parity check polynomial satisfying zero provided by expression (197-1-1), ((2×f−1)−1)%2m=2c holds true. Accordingly, a parity check polynomial satisfying zero of expression (197-1-1) where 2i=2c holds true (where c is an integer no smaller than zero and no greater than m−1).

Accordingly, components $H_{x,1,comp}[2\times g-1][v]=H_{x,1,comp}[2\times(2\times f-1)-1][v]$, $H_{x,2,comp}[2\times g-1][v]=H_{x,2,comp}[2\times(2\times f-1)-1][v]$, $H_{x,3,comp}[2\times g-1][v]=H_{x,3,comp}[2\times(2\times f-1)-1][v]$, $H_{x,4,comp}[2\times g-1][v]=H_{x,4,comp}[2\times(2\times f-1)-1][v]$, $H_{x,5,comp}[2\times g-1][v]=H_{x,5,comp}[2\times(2\times f-1)-1][v]$, $H_{x,6,comp}[2\times g-1][v]=H_{x,6,comp}[2\times(2\times f-1)-1][v]$, $H_{x,7,comp}[2\times g-1][v]=H_{x,7,comp}[2\times(2\times f-1)-1][v]$, $H_{p1,comp}[2\times g-1][v]=H_{p1,comp}[2\times(2\times f-1)-1][v]$, and $H_{p2,comp}[2\times g-1][v]=H_{p2,comp}[2\times(2\times f-1)-1][v]$ in row 2×g−1, or that is, row 2×(2×f−1)−1 of the parity check matrix $H_{pro\_m}$, which is for the LDPC-CC of coding rate 7/9 that uses an improved tail-biting scheme (an LDPC block code using an LDPC-CC), is expressed as follows.

First, the following holds true for $H_{x,1,comp}[2\times(2\times f-1)-1][v]$.

[Math. 663]

$$H_{x,1,comp}[2\times(2\times f-1)-1][((2\times f-1)-0-1)+1]=1 \quad (224\text{-}1)$$

When y is an integer no smaller than one and no greater than $R_{\#(2c),1}$, and $(2\times f-1)-\alpha_{\#(2c),1,y}-1\geq 0$:

$$H_{x,1,comp}[2\times(2\times f-1)-1][((2\times f-1)-\alpha_{\#(2c),1,y}-1)+1]=1 \quad (224\text{-}2)$$

When $(2\times f-1)-\alpha_{\#(2c),1,y}-1<0$:

$$H_{x,1,comp}[2\times(2\times f-1)-1][((2\times f-1)-\alpha_{\#(2c),1,y}-1)+1+(2\times m\times z)]=1 \quad (224\text{-}3)$$

For all v being an integer no smaller than one and no greater than 2×m×z satisfying {v≠((2×f−1)−0−1)+1}, $\{v\neq((2\times f-1)-\alpha_{\#(2c),1,y}-1)+1\}$, and $\{v\neq((2\times f-1)-\alpha_{\#(2c),1,y}-1)+1+(2\times m\times z)\}$ (where y is an integer no smaller than one and no greater than $R_{\#(2i),1}$), the following holds true:

$$H_{x,1,comp}[2\times(2\times f-1)-1][v]=0 \quad (224\text{-}4)$$

Considered in a similar manner, the following holds true for $H_{x,w,comp}[2\times(2\times f-1)-1][v]$. In the following, w is an integer no smaller than one and no greater than three.

[Math. 664]

$$H_{x,w,comp}[2\times(2\times f-1)-1][((2\times f-1)-0-1)+1]=1 \quad (225\text{-}1)$$

When y is an integer no smaller than one and no greater than $R_{\#(2c),w}$, and $(2\times f-1)-\alpha_{\#(2c),w,y}-1\geq 0$:

$$H_{x,w,comp}[2\times(2\times f-1)][((2\times f-1)-\alpha_{\#(2c),w,y}-1)+1]=1 \quad (225\text{-}2)$$

When $(2\times f-1)-\alpha_{\#(2c),w,y}-1<0$:

$$H_{x,w,comp}[2\times(2\times f-1)-1][((2\times f-1)-\alpha_{\#(2c),w,y}-1)+1+(2\times m\times z)]=1 \quad (225\text{-}3)$$

For all v being an integer no smaller than one and no greater than 2×m×z satisfying {v≠((2×f−1)−0−1)+1}, $\{v\neq((2\times f-1)-\alpha_{\#(2c),w,y}-1)+1\}$, and $\{v\neq((2\times f-1)-\alpha_{\#(2c),w,y}-1)+1+(2\times m\times z)\}$ (where y is an integer no smaller than one and no greater than $R_{\#(2c),w}$), the following holds true:

$$H_{x,w,comp}[2\times(2\times f-1)-1][v]=0 \quad (225\text{-}4)$$

Further, the following holds true for $H_{x,4,comp}[2\times(2\times f-1)-1][v]$. In the following, y is an integer no smaller than $R_{\#(2c),4}+1$ and no greater than $r_{\#(2c),4}$.

[Math. 665]

When $(2\times f-1)-\alpha_{\#(2c),4,y}-1\geq 0$:

$$H_{x,4,comp}[2\times(2\times f-1)-1][((2\times f-1)-\alpha_{\#(2c),4,y}-1)+1]=1 \quad (226\text{-}1)$$

When $(2\times f-1)-a_{\#(2c),4,y}-1<0$:

$$H_{x,4,comp}[2\times(2\times f-1)-1][((2\times f-1)-\alpha_{\#(2c),4,y}-1)+1+(2\times m\times z)]=1 \quad (226\text{-}2)$$

For all v being an integer no smaller than one and no greater than 2×m×z satisfying $\{v\neq((2\times f-1)-\alpha_{\#(2c),4,y}-1)+1\}$,and $\{v\neq((2\times f-1)-\alpha_{\#(2c),4,y}-1)+1+(2\times m\times z)\}$ (where y is an integer no smaller than $R_{\#(2c),4}+1$ and no greater than $r_{\#(2c),4}$), the following holds true:

$$H_{x,4,comp}[2\times(2\times f-1)-1][v]=0 \quad (226\text{-}3)$$

Considered in a similar manner, the following holds true for $H_{x,\Omega,comp}[2\times(2\times f-1)-1][v]$. In the following, Ω is an integer no smaller than four and no greater than seven, and y is an integer no smaller than $R_{\#(2c),\Omega}+1$ and no greater than $r_{\#(2c),\Omega}$.

[Math. 666]

When $(2\times f-1)-\alpha_{\#(2c),\Omega,y}-1\geq 0$:

$$H_{x,\Omega,comp}[2\times(2\times f-1)-1][((2\times f-1)-\alpha_{\#(2c),\Omega,y}-1)+1]=1 \quad (227\text{-}1)$$

When $(2\times f-1)-\alpha_{\#(2c),\Omega,y}-1<0$:

$$H_{x,\Omega,comp}[2\times(2\times f-1)-1][((2\times f-1)-\alpha_{\#(2c),\Omega,y}-1)+1+(2\times m\times z)]=1 \quad (227\text{-}2)$$

For all v being an integer no smaller than one and no greater than 2×m×z satisfying $\{v\neq(2\times f-1)-\alpha_{\#(2c),\Omega,y}-1)+1\}$ and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)-1][v]=0 \quad (227\text{-}3)$$

Further, the following holds true for $H_{p1,comp}[2\times(2\times f-1)-1][v]$.

[Math. 667]

$$H_{p1,comp}[2\times(2\times f-1)-1][((2\times f-1)-0-1)+1]=1 \quad (228\text{-}1)$$

For all v being an integer no smaller than one and no greater than 2×m×z satisfying {v≠((2×f−1)−0−1)+1}, the following holds true:

$$H_{p1,comp}[2\times(2\times f-1)-1][v]=0 \quad (228\text{-}2)$$

Further, the following holds true for $H_{p2,comp}[2\times(2\times f-1)-1][v]$.

[Math. 668]

When $(2\times f-1)-\beta_{\#(2c),0}-1\geq 0$:

$$H_{p2,comp}[2\times(2\times f-1)-1][((2\times f-1)-\beta_{\#(2c),0}-1)+1]=1 \quad (229\text{-}1)$$

When $(2\times f-1)-\beta_{\#(2c),0}-1<0$:

$$H_{p2,comp}[2\times(2\times f-1)-1][((2\times f-1)-\beta_{\#(2c),0}-1)+1+(2\times m\times z)]=1 \quad (229\text{-}2)$$

For all v being an integer no smaller than one and no greater than 2×m×z satisfying $\{v\neq((2\times f-1)-\beta_{\#(2c),0}-1)+1\}$ and $\{v\neq((2\times f-1)-\beta_{\#(2c),0}-1+(2\times m\times z)\}$, the following holds true:

$$H_{p2,comp}[2\times(2\times f-1)-1][v]=0 \quad (229\text{-}3)$$

Further, (2) when g=2×f−1 (where f is an integer no smaller than two and no greater than m×z), when a vector for row 2×(2×f−1)−1 of the parity check matrix $H_{pro\_m}$, which is for the LDPC-CC of coding rate 7/9 that uses an improved tail-biting scheme (an LDPC block code using an LDPC-CC), can be generated by using a parity check polynomial satisfying zero provided by expression (197-1-2), ((2×f−1)−1)%2m=2c holds true. Accordingly, a parity check polynomial satisfying zero of expression (197-1-2) where 2i=2c holds true (where c is an integer no smaller than zero and no greater than m−1).

Accordingly, components $H_{x,1,comp}[2\times g-1][v]=H_{x,1,comp}[2\times(2\times f-1)-1][v]$, $H_{x,2,comp}[2\times g-1][v]=H_{x,2,comp}[2\times(2\times f-1)-1][v]$, $H_{x,3,comp}[2\times g-1][v]=H_{x,3,comp}[2\times(2\times f-1)-1][v]$, $H_{x,4,comp}[2\times g-1][v]=H_{x,4,comp}[2\times(2\times f-1)-1][v]$, $H_{x,5,comp}[2\times g-1][v]=H_{x,5,comp}[2\times(2\times f-1)-1][v]$, $H_{x,6,comp}[2\times g-1][v]=H_{x,6,comp}[2\times(2\times f-1)-1][v]$, $H_{x,7,comp}[2\times g-1][v]=H_{x,7,comp}[2\times(2\times f-1)-1][v]$, $H_{p1,comp}[2\times g-1][v]=H_{p1,comp}[2\times(2\times f-1)-1][v]$, and $H_{p2,comp}[2\times g-1][v]=H_{p2,comp}[2\times(2\times f-1)-1][v]$ in row 2×g−1, or that is, row 2×(2×f−1)−1 of the parity check matrix $H_{pro\_m}$, which is for the LDPC-CC of coding rate 7/9 that uses an improved tail-biting scheme (an LDPC block code using an LDPC-CC), is expressed as follows.

First, the following holds true for $H_{x,1,comp}[2\times(2\times f-1)-1][v]$

[Math. 669]

$$H_{x,1,comp}[2\times(2\times f-1)-1][((2\times f-1)-0-1)+1]=1 \quad (230\text{-}1)$$

When y is an integer no smaller than one and no greater than $R_{\#(2c),1}$, and $(2\times f-1)-\alpha_{\#(2c),1,y}-1\geq 0$:

$$H_{x,1,comp}[2\times(2\times f-1)-1][((2\times f-1)-\alpha_{\#(2c),1,y}-1)+1]=1 \quad (230\text{-}2)$$

When $(2\times f-1)-\alpha_{\#(2c),1,y}-1<0$:

$$H_{x,1,comp}[2\times(2\times f-1)-1][((2\times f-1)-\alpha_{\#(2c),1,y}-1)+1+(2\times m\times z)]=1 \quad (230\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),1,y}-1)+1\}$, and $\{v\neq((2\times f-1)-\alpha_{\#(2c),1,y}-1)+1+(2\times m\times z)\}$ (where y is an integer no smaller than one and no greater than $R_{\#(2c),1}$), the following holds true:

$$H_{x,1,comp}[2\times(2\times f-1)-1][v]=0 \quad (230\text{-}4)$$

Considered in a similar manner, the following holds true for $H_{x,w,comp}[2\times(2\times f-1)-1][v]$. In the following, w is an integer no smaller than one and no greater than three.

[Math. 670]

$$H_{x,w,comp}[2\times(2\times f-1)-1][((2\times f-1)-0-1)+1]=1 \quad (231\text{-}1)$$

When y is an integer no smaller than one and no greater than $R_{\#(2c),w}$, and $(2\times f-1)-\alpha_{\#(2c),w,y}-1\geq 0$:

$$H_{x,w,comp}[2\times(2\times f-1)-1][((2\times f-1)-\alpha_{\#(2c),w,y}-1)+1]=1 \quad (231\text{-}2)$$

When $(2\times f-1)-\alpha_{\#(2c),w,y}1<0$:

$$H_{x,w,comp}[2\times(2\times f-1)-1][((2\times f-1)-\alpha_{\#(2c),w,y}-1)+1+(2\times m\times z)]=1 \quad (231\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),w,y}-1)+1\}$, and $\{v\neq((2\times f-1)-\alpha_{\#(2c),w,y}-1)+1+(2\times m\times z)\}$ (where y is an integer no smaller than one and no greater than $R_{\#(2c),w}$), the following holds true:

$$H_{x,w,comp}[2\times(2\times f-1)-1][v]=0 \quad (231\text{-}4)$$

Further, the following holds true for $H_{x,4,comp}[2\times(2\times f-1)-1][v]$. In the following, y is an integer no smaller than $R_{\#(2c),4}+1$ and no greater than $r_{\#(2c),4}$.

[Math. 671]

When $(2\times f-1)-\alpha_{\#(2c),4,y}-1\geq 0$:

$$H_{x,4,comp}[2\times(2\times f-1)-1][((2\times f-1)-\alpha_{\#(2c),4,y}-1)+1]=1 \quad (232\text{-}1)$$

When $(2\times f-1)-\alpha_{\#(2c),4,y}-1\geq 0$:

$$H_{x,4,comp}[2\times(2\times f-1)-1][((2\times f-1)-\alpha_{\#(2c),4,y}-1)+1+(2\times m\times z)]=1 \quad (232\text{-}2)$$

For all v being an integer no smaller than one and no greater than 2×m×z satisfying $\{v\neq((2\times f-1)-\alpha_{\#(2c),4,y}-1)+1\}$, and $\{v\neq((2\times f-1)-\alpha_{\#(2c),4,y}-1)+1+(2\times m\times z)\}$ (where y is an integer no smaller than $R_{\#(2c),4}+1$ and no greater than $r_{\#(2c),4}$), the following holds true:

$$H_{x,4,comp}[2\times(2\times f-1)-1][v]=0 \quad (232\text{-}3)$$

Considered in a similar manner, the following holds true for $H_{x,\Omega,comp}[2\times(2\times f-1)-1][v]$. In the following, Ω is an integer no smaller than four and no greater than seven, and y is an integer no smaller than $R_{\#(2c),\Omega}+1$ and no greater than $r_{\#(2c),\Omega}$.

[Math. 672]

When $(2\times f-1)-\alpha_{\#(2c),\Omega,y}-1\geq 0$:

$$H_{x,\Omega,comp}[2\times(2\times f-1)-1][((2\times f-1)-\alpha_{\#(2c),\Omega,y}-1)+1]=1 \quad (233\text{-}1)$$

When $(2\times f-1)-\alpha_{\#(2c),\Omega,y}-1<0$:

$$H_{x,\Omega,comp}[2\times(2\times f-1)-1][((2\times f-1)-\alpha_{\#(2c),\Omega,y}-1)+1+(2\times m\times z)]=1 \quad (233\text{-}2)$$

For all v being an integer no smaller than one and no greater than 2×m×z satisfying $\{v\neq(2\times f-1)-\alpha_{\#(2c),\Omega,y}-1)+1\}$ and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)-1][v]=0 \quad (233\text{-}3)$$

Further, the following holds true for $H_{p1,comp}[2\times(2\times f-1)-1][v]$.

[Math. 673]

$$H_{p1,comp}[2\times(2\times f-1)-1][((2\times f-1)-0-1)+1]=1 \quad (234\text{-}1)$$

When $(2\times f-1)-\beta_{\#(2c),1}-1\geq 0$:

$$H_{p1,comp}[2\times(2\times f-1)-1][((2\times f-1)-\beta_{\#(2c),1}-1)+1]=1 \quad (234\text{-}2)$$

When $(2\times f-1)-\beta_{\#(2c),1}-1<0$:

$$H_{p1,comp}[2\times(2\times f-1)-1][((2\times f-1)-\beta_{\#(2c),1}-1)+1+(2\times m\times z)]=1 \quad (234\text{-}3)$$

For all v being an integer no smaller than one and no greater than 2×m×z satisfying $\{v\neq((2\times f-1)-0-1)+1\}$, $\{v\neq((2\times f-1)-\beta_{\#(2c),1}-1)+1\}$, and $\{v\neq((2\times f-1)-\beta_{\#(2c),1}-1)+1+(2\times m\times z)\}$, the following holds true:

$$H_{p1,comp}[2\times(2\times f-1)-1][v]=0 \quad (234\text{-}4)$$

Further, the following holds true for $H_{p2,comp}[2\times(2\times f-1)-1][v]$.

[Math. 674]

For all v being an integer no smaller than one and no greater than 2×m×z, the following holds true:

$$H_{p2,comp}[2\times(2\times f-1)-1][v]=0 \quad (235)$$

Further, (3) when g=2×f−1 (where f is an integer no smaller than two and no greater than m×z), when a vector for row 2×(2×f−1) of the parity check matrix $H_{pro\_m}$, which is for the LDPC-CC of coding rate 7/9 that uses an improved tail-biting scheme (an LDPC block code using an LDPC-CC), can be generated by using a parity check polynomial satisfying zero provided by expression (197-2-1), ((2×f−1)−1)%2m=2c holds true. Accordingly, a parity check polynomial satisfying zero of expression (197-2-1) where 2i=2c holds true (where c is an integer no smaller than zero and no greater than m−1).

Accordingly, components $H_{x,1,comp}[2\times g][v]=H_{x,1,comp}[2\times(2\times f-1)][v]$, $H_{x,2,comp}[2\times g][v]=H_{x,2,comp}[2\times(2\times f-1)][v]$, $H_{x,3,comp}[2\times g][v]=H_{x,3,comp}[2\times(2\times f-1)][v]$, $H_{x,4,comp}[2\times g][v]=H_{x,4,comp}[2\times(2\times f-1)][v]$, $H_{x,5,comp}[2\times g][v]=H_{x,5,comp}

[2×(2×f−1)][v], $H_{x,6,comp}$[2×g][v]=$H_{x,6,comp}$[2×(2×f−1)][v], $H_{x,7,comp}$[2×g][v]=$H_{x,7,comp}$[2×(2×f−1)][v], $H_{p1,comp}$[2×g][v]=$H_{p1,comp}$[2×(2×f−1)][v], and $H_{p2,comp}$[2×g][v]=$H_{p2,comp}$[2×(2×f−1)][v] in row 2×g, or that is, row 2×(2×f−1) of the parity check matrix $H_{pro\_m}$, which is for the LDPC-CC of coding rate 7/9 that uses an improved tail-biting scheme (an LDPC block code using an LDPC-CC), is expressed as follows.

First, the following holds true for $H_{x,1,comp}$[2×(2×f−1)][v]. In the following, y is an integer no smaller than $R_{\#(2c),1}+1$ and no greater than $r_{\#(2c),1}$.

[Math. 675]

When $(2\times f-1)-\alpha_{\#(2c),1,y}-1\geq 0$:

$$H_{x,1,comp}[2\times(2\times f-1)][((2\times f-1)-\alpha_{\#(2c),1,y}-1)+1]=1 \tag{236-1}$$

When $(2\times f-1)-\alpha_{\#(2c),1,y}-1<0$:

$$H_{x,1,comp}[2\times(2\times f-1)][((2\times f-1)-\alpha_{\#(2c),1,y}-1)+1+(2\times m\times z)]=1 \tag{236-2}$$

For all v being an integer no smaller than one and no greater than 2×m×z satisfying $\{v\neq((2\times f-1)-\alpha_{\#(2c),1,y}-1)+1\}$ and $\{v\neq((2\times f-1)-\alpha_{\#(2c),1,y}-1)+1+(2\times m\times z)\}$ (where y is an integer no smaller than $R_{\#(2c),1}+1$ and no greater than $r_{\#(2c),1}$), the following holds true:

$$H_{x,1,comp}[2\times(2\times f-1)][v]=0 \tag{236-3}$$

Considered in a similar manner, the following holds true for $H_{x,\Omega,comp}$[2×(2×f−1)][v]. In the following, Ω is an integer no smaller than one and no greater than three, and y is an integer no smaller than $R_{\#(2c),\Omega}+1$ and no greater than $r_{\#(2c),\Omega}$.

[Math. 676]

When $(2\times f-1)-\alpha_{\#(2c),\Omega,y}-1\geq 0$:

$$H_{x,\Omega,comp}[2\times(2\times f-1)][((2\times f-1)-\alpha_{\#(2c),\Omega,y}-1)+1]=1 \tag{237-1}$$

When $(2\times f-1)-\alpha_{\#(2c),\Omega,y}-1<0$:

$$H_{x,\Omega,comp}[2\times(2\times f-1)][((2\times f-1)-\alpha_{\#(2c),\Omega,y}-1)+1+(2\times m\times z)]=1 \tag{237-2}$$

For all v being an integer no smaller than one and no greater than 2×m×z satisfying $\{v\neq((2\times f-1)-\alpha_{\#(2c),\Omega,y}-1)+1\}$, and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)][v]=0 \tag{237-3}$$

Further, the following holds true for $H_{x,4,comp}$[2×(2×f−1)][v].

[Math. 677]

$$H_{x,4,comp}[2\times(2\times f-1)][((2\times f-1)-0-1)+1]=1 \tag{238-1}$$

When y is an integer no smaller than one and no greater than $R_{\#(2c),4}$, and $(2\times f-1)-\alpha_{\#(2c),4,y}-1\geq 0$:

$$H_{x,4,comp}[2\times(2\times f-1)][((2\times f-1)-\alpha_{\#(2c),4,y}-1)+1]=1 \tag{238-2}$$

When $(2\times f-1)-\alpha_{\#(2c),4,y}-1<0$:

$$H_{x,4,comp}[2\times(2\times f-1)][((2\times f-1)-\alpha_{\#(2c),4,y}-1)+1+(2\times m\times z)]=1 \tag{238-3}$$

For all v being an integer no smaller than one and no greater than 2×m×z satisfying $\{v\neq((2\times f-1)-0-1)+1\}$, $\{v\neq((2\times f-1)-\alpha_{\#(2c),4,y}-1)+1\}$, and $\{v\neq((2\times f-1)-\alpha_{\#(2c),4,y}-1)+1+(2\times m\times z)\}$ (where y is an integer no smaller than one and no greater than $R_{\#(2c),4}$), the following holds true:

$$H_{x,4,comp}[2\times(2\times f-1)][v]=0 \tag{238-4}$$

Considered in a similar manner, the following holds true for $H_{x,w,comp}$[2×(2×f−1)][v]. In the following, w is an integer no smaller than four and no greater than seven.

[Math. 678]

$$H_{x,w,comp}[2\times(2\times f-1)][((2\times f-1)-0-1)+1]=1 \tag{239-1}$$

When y is an integer no smaller than one and no greater than $R_{\#(2c),w}$, and $(2\times f-1)-\alpha_{\#(2c),w,y}-1\geq 0$:

$$H_{x,w,comp}[2\times(2\times f-1)][((2\times f-1)-\alpha_{\#(2c),w,y}-1)+1]=1 \tag{239-2}$$

When $(2\times f-1)-\alpha_{\#(2c),w,y}-1<0$:

$$H_{x,w,comp}[2\times(2\times f-1)][((2\times f-1)-\alpha_{\#(2c),w,y}-1)+1+(2\times m\times z)]=1 \tag{239-3}$$

For all v being an integer no smaller than one and no greater than 2×m×z satisfying $\{v\neq((2\times f-1)-0-1)+1\}$, $\{v\neq((2\times f-1)-\alpha_{\#(2c),w,y}-1)+1\}$, and $\{v\neq((2\times f-1)-\alpha_{\#(2c),w,y}-1)+1+(2\times m\times z)\}$ (where y is an integer no smaller than one and no greater than $R_{\#(2c),w}$), the following holds true:

$$H_{x,w,comp}[2\times(2\times f-1)][v]=0 \tag{239-4}$$

Further, the following holds true for $H_{p1,comp}$[2×(2×f−1)][v].

[Math. 679]

When $(2\times f-1)-\beta_{\#(2c),2}-1\geq 0$:

$$H_{p1,comp}[2\times(2\times f-1)][((2\times f-1)-\beta_{\#(2c),2}-1)+1]=1 \tag{240-1}$$

When $(2\times f-1)-\beta_{\#(2c),2}-1<0$:

$$H_{p1,comp}[2\times(2\times f-1)][((2\times f-1)-\beta_{\#(2c),2}-1)+1+(2\times m\times z)]=1 \tag{240-2}$$

For all v being an integer no smaller than one and no greater than 2×m×z satisfying $\{v\neq((2\times f-1)-\beta_{\#(2c),2}-1)+1\}$ and $\{v\neq((2\times f-1)-\beta_{\#(2c),2}-1)+1+(2\times m\times z)\}$, the following holds true:

$$H_{p1,comp}[2\times(2\times f-1)][v]=0 \tag{240-3}$$

Further, the following holds true for $H_{p2,comp}$[2×(2×f−1)][v].

[Math. 680]

$$H_{p2,comp}[2\times(2\times f-1)][((2\times f-1)-0-1)+1]=1 \tag{241-1}$$

For all v being an integer no smaller than one and no greater than 2×m×z satisfying $\{v\neq((2\times f-1)-0-1)+1\}$, the following holds true:

$$H_{p2,comp}[2\times(2\times f-1)][v]=0 \tag{241-2}$$

Further, (4) when g=2×f−1 (where f is an integer no smaller than two and no greater than m×z), when a vector for row 2×(2×f−1) of the parity check matrix $H_{pro\_m}$, which is for the LDPC-CC of coding rate 7/9 that uses an improved tail-biting scheme (an LDPC block code using an LDPC-CC), can be generated by using a parity check polynomial satisfying zero provided by expression (197-2-2), ((2×f−1)−1)%2m=2c holds true. Accordingly, a parity check polynomial satisfying zero of expression (197-2-2) where 2i=2c holds true (where c is an integer no smaller than zero and no greater than m−1).

Accordingly, components $H_{x,1,comp}$[2×g][v]=$H_{x,1,comp}$[2×(2×f−1)][v], $H_{x,2,comp}$[2×g][v]=$H_{x,2,comp}$[2×(2×f−1)][v], $H_{x,3,comp}$[2×g][v]=$H_{x,3,comp}$[2×(2×f−1)][v], $H_{x,4,comp}$[2×g][v]=$H_{x,4,comp}$[2×(2×f−1)][v], $H_{x,5,comp}$[2×g][v]=$H_{x,5,comp}$[2×(2×f−1)][v], $H_{x,6,comp}$[2×g][v]=$H_{x,6,comp}$[2×(2×f−1)][v], $H_{x,7,comp}$[2×g][v]=$H_{x,7,comp}$[2×(2×f−1)][v], $H_{p1,comp}$[2×g][v]=$H_{p1,comp}$[2×(2×f−1)][v], and $H_{p2,comp}$[2×g][v]=$H_{p2,comp}$[2×(2×f−1)][v] in row 2×g, or that is, row 2×(2×f−1) of the parity check matrix $H_{pro\_m}$, which is for the LDPC-CC of coding rate 7/9 that uses an improved tail-biting scheme (an LDPC block code using an LDPC-CC), is expressed as follows.

First, the following holds true for $H_{x,1,comp}$[2×(2×f−1)][v]. In the following, y is an integer no smaller than $R_{\#(2c),1}+1$ and no greater than $r_{\#(2c),1}$.

[Math. 681]

When $(2\times f-1)-\alpha_{\#(2c),1,y}-1\geq 0$:

$$H_{x,1,comp}[2\times(2\times f-1)][((2\times f-1)-\alpha_{\#(2c),1,y}-1)+1]=1 \quad (242\text{-}1)$$

When $(2\times f-1)-\alpha_{\#(2c),1,y}-1<0$:

$$H_{x,1,comp}[2\times(2\times f-1)][((2\times f-1)-\alpha_{\#(2c),1,y}-1)+1+(2\times m\times z)]=1 \quad (242\text{-}2)$$

For all v being an integer no smaller than one and no greater than 2×m×z satisfying $\{v\neq((2\times f-1)-\alpha_{\#(2c),1,y}-1)+1\}$ and $\{v\neq((2\times f-1)-\alpha_{\#(2c),1,y}-1)+1+(2\times m\times z)\}$ (where y is an integer no smaller than $R_{\#(2c),1}+1$ and no greater than $r_{\#(2c),1}$), the following holds true:

$$H_{x,1,comp}[2\times(2\times f-1)][v]=0 \quad (242\text{-}3)$$

Considered in a similar manner, the following holds true for $H_{x,\Omega,comp}[2\times(2\times f-1)][v]$. In the following, Ω is an integer no smaller than one and no greater than three, and y is an integer no smaller than $R_{\#(2c),\Omega}+1$ and no greater than $r_{\#(2c),\Omega}$.

[Math. 682]

When $(2\times f-1)-\alpha_{\#(2c),\Omega,y}-1\geq 0$:

$$H_{x,\Omega,comp}[2\times(2\times f-1)][((2\times f-1)-\alpha_{\#(2c),\Omega,y}-1)+1]=1 \quad (243\text{-}1)$$

When $(2\times f-1)-\alpha_{\#(2c),\Omega,y}-1<0$:

$$H_{x,\Omega,comp}[2\times(2\times f-1)][((2\times f-1)-\alpha_{\#(2c),\Omega,y}-1)+1+(2\times m\times z)]=1 \quad (243\text{-}2)$$

For all v being an integer no smaller than one and no greater than 2×m×z satisfying $\{v\neq((2\times f-1)-\alpha_{\#(2c),\Omega,y}-1)+1\}$, and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)][v]=0 \quad (243\text{-}3)$$

Further, the following holds true for $H_{x,4,comp}[2\times(2\times f-1)][v]$.

[Math. 683]

$$H_{x,4,comp}[2\times(2\times f-1)][((2\times f-1)-0-1)+1]=1 \quad (244\text{-}1)$$

When y is an integer no smaller than one and no greater than $R_{\#(2c),4}$, and $(2\times f-1)-\alpha_{\#(2c),4,y}-1\geq 0$:

$$H_{x,4,comp}[2\times(2\times f-1)][((2\times f-1)-\alpha_{\#(2c),4,y}-1)+1]=1 \quad (244\text{-}2)$$

When $(2\times f-1)-\alpha_{\#(2c),4,y}-1<0$:

$$H_{x,3,comp}[2\times(2\times f-1)][((2\times f-1)-\alpha_{\#(2c),4,y}-1)+1+(2\times m\times z)]=1 \quad (244\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),4,y}-1)+1\}$, and $\{v\neq((2\times f-1)-\alpha_{\#(2c),4,y}-1)+1+(2\times m\times z)\}$ (where y is an integer no smaller than one and no greater than $R_{\#(2c),4}$), the following holds true:

$$H_{x,4,comp}[2\times(2\times f-1)][v]=0 \quad (244\text{-}4)$$

Considered in a similar manner, the following holds true for $H_{x,w,comp}[2\times(2\times f-1)][v]$. In the following, w is an integer no smaller than four and no greater than seven.

[Math. 684]

$$H_{x,w,comp}[2\times(2\times f-1)][((2\times f-1)-0-1)+1]=1 \quad (245\text{-}1)$$

When y is an integer no smaller than one and no greater than $R_{\#(2c),w}$, and $(2\times f-1)-\alpha_{\#(2c),w,y}-1\geq 0$:

$$H_{x,w,comp}[2\times(2\times f-1)][((2\times f)-\alpha_{\#(2c),w,y}-1)+1]=1 \quad (245\text{-}2)$$

When $(2\times f-1)-\alpha_{\#(2c),w,y}-1<0$:

$$H_{x,w,comp}[2\times(2\times f-1)][((2\times f-1)-\alpha_{\#(2c),w,y}-1)+1+(2\times m\times z)]=1 \quad (245\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),w,y}-1)+1\}$, and $\{v\neq((2\times f-1)-\alpha_{\#(2c),w,y}-1)+1+(2\times m\times z)\}$ (where y is an integer no smaller than one and no greater than $R_{\#(2c),w}$), the following holds true:

$$H_{x,w,comp}[2\times(2\times f-1)][v]=0 \quad (245\text{-}4)$$

Further, the following holds true for $H_{p1,comp}[2\times(2\times f-1)][v]$.

[Math. 685]

For all v being an integer no smaller than one and no greater than 2×m×z, the following holds true:

$$H_{p1,comp}[2\times(2\times f-1)][v]=0 \quad (246)$$

Further, the following holds true for $H_{p2,comp}[2\times(2\times f-1)][v]$.

[Math. 686]

$$H_{p2,comp}[2\times(2\times f-1)][((2\times f-1)-0-1)+1]=1 \quad (247\text{-}1)$$

When $(2\times f-1)-\beta_{\#(2c),3}-1\geq 0$:

$$H_{p2,comp}[2\times(2\times f-1)][((2\times f-1)-\beta_{\#(2c),3}-1)+1]=1 \quad (247\text{-}2)$$

When $(2\times f-1)-\beta_{\#(2c),3}-1<0$:

$$H_{p2,comp}[2\times(2\times f-1)][((2\times f-1)-\beta_{\#(2c),3}-1)+1+(2\times m\times z)]=1 \quad (247\text{-}3)$$

For all v being an integer no smaller than one and no greater than 2×m×z satisfying $\{v\neq((2\times f-1)-0-1)+1\}$, $\{v\neq((2\times f-1)-\beta_{\#(2c),3}-1)+1\}$, and $\{v\neq((2\times f-1)-\beta_{\#(2c),3}-1)+1+(2\times m\times z)\}$, the following holds true:

$$H_{p2,comp}[2\times(2\times f-1)][v]=0 \quad (247\text{-}4)$$

Further, (5) when g=2×f (where f is an integer no smaller than one and no greater than m×z), when a vector for row 2×(2×f)−1 of the parity check matrix $H_{pro\_m}$, which is for the LDPC-CC of coding rate 7/9 that uses an improved tail-biting scheme (an LDPC block code using an LDPC-CC), can be generated by using a parity check polynomial satisfying zero provided by expression (198-1-1), ((2×f)−1) %2m=2d+1 holds true. Accordingly, a parity check polynomial satisfying zero of expression (198-1-1) where 2i+1=2d+1 holds true (where d is an integer no smaller than zero and no greater than m−1).

Accordingly, components $H_{x,1,comp}[2\times g-1][v]=H_{x,1,comp}[2\times(2\times f)-1][v]$, $H_{x,2,comp}[2\times g-1][v]=H_{x,2,comp}[2\times(2\times f)-1][v]$, $H_{x,3,comp}[2\times g-1][v]=H_{x,3,comp}[2\times(2\times f)-1][v]$, $H_{x,4,comp}[2\times g-1][v]=H_{x,4,comp}[2\times(2\times f)-1][v]$, $H_{x,5,comp}[2\times g-1][v]=H_{x,5,comp}[2\times(2\times f)-1][v]$, $H_{x,6,comp}[2\times g-1][v]=H_{x,6,comp}[2\times(2\times f)-1][v]$, $H_{x,7,comp}[2\times g-1][v]=H_{x,7,comp}[2\times(2\times f)-1][v]$, $H_{p1,comp}[2\times g-1][v]=H_{p1,comp}[2\times(2\times f)-1][v]$, and $H_{p2,comp}[2\times g-1][v]=H_{p2,comp}[2\times(2\times f)-1][v]$ in row 2×g−1, or that is, row 2×(2×f)−1 of the parity check matrix $H_{pro\_m}$, which is for the LDPC-CC of coding rate 7/9 that uses an improved tail-biting scheme (an LDPC block code using an LDPC-CC), is expressed as follows.

First, the following holds true for $H_{x,1,comp}[2\times(2\times f)-1][v]$. In the following, y is an integer no smaller than $R_{\#(2d+1),1}+1$ and no greater than $r_{\#(2d+1),1}$.

[Math. 687]

When $(2\times f)-\alpha_{\#(2d+1),1,y}-1\geq 0$:

$$H_{x,1,comp}[2\times(2\times f)-1][((2\times f)-\alpha_{\#(2d+1),1,y}-1)+1]=1 \quad (248\text{-}1)$$

When $(2\times f)-\alpha_{\#(2d+1),1,y}-1<0$:

$$H_{x,1,comp}[2\times(2\times f)-1][((2\times f)-\alpha_{\#(2d+1),1,y}-1)+1+(2\times m\times z)]=1 \quad (248\text{-}2)$$

For all v being an integer no smaller than one and no greater than 2×m×z satisfying $\{v\neq((2\times f)-\alpha_{\#(2d+1),1,y}-1)+1\}$ and $\{v\neq((2\times f)+\alpha_{\#(2d+1),1,y}-1)+1+(2\times m\times z)\}$ (where y is an integer no smaller than $R_{\#(2d+1),1}+1$ and no greater than $r_{\#(2d+1),1}$), the following holds true:

$$H_{x,1,comp}[2\times(2\times f)-1][v]=0 \quad (248\text{-}3)$$

Considered in a similar manner, the following holds true for $H_{x,\Omega,comp}[2\times(2\times f)-1)][v]$. In the following, Ω is an integer no smaller than one and no greater than three, and y is an integer no smaller than $R_{\#(2d+1),\Omega}+1$ and no greater than $r_{\#(2d+1),\Omega}$.

[Math. 688]

When $(2\times f)-\alpha_{\#(2d+1),\Omega,y}-1\geq 0$:

$$H_{x,\Omega,comp}[2\times(2\times f)-1][((2\times f)-\alpha_{\#(2d+1),\Omega,y}-1)+1]=1 \quad (249\text{-}1)$$

When $(2\times f)-\alpha_{\#(2d+1),\Omega,y}-1<0$:

$$H_{x,\Omega,comp}[2\times(2\times f)-1][((2\times f)-\alpha_{\#(2d+1),\Omega,y}-1)+1+(2\times m\times z)]=1 \quad (249\text{-}2)$$

For all v being an integer no smaller than one and no greater than 2×m×z satisfying $\{v\neq((2\times f)-\alpha_{\#(2d+1),\Omega,y}-1)+1\}$ and $\{v\neq((2\times f)-\alpha_{\#(2d+1),\Omega,y}-1)+1+(2\times m\times z)\}$ (where y is an integer no smaller than $R_{\#(2d+1),\Omega}+1$ and no greater than $r_{\#(2d+1),\Omega}$), the following holds true:

$$H_{x,\Omega,comp}[2\times(2\times f)-1][v]=0 \quad (249\text{-}3)$$

Further, the following holds true for $H_{x,4,comp}[2\times(2\times f)-1][v]$.

[Math. 689]

$$H_{x,4,comp}[2\times(2\times f)-1][((2\times f)-0-1)+1]=1 \quad (250\text{-}1)$$

When y is an integer no smaller than one and no greater than $R_{\#(2d+1),4}$, and $(2\times f)-\alpha_{\#(2d+1),4,y}-1\geq 0$:

$$H_{x,4,comp}[2\times(2\times f)-1][((2\times f)+\alpha_{\#(2d+1),4,y}-1)+1]=1 \quad (250\text{-}2)$$

When $(2\times f)-\alpha_{\#(2d+1),4,y}-1<0$:

$$H_{x,4,comp}[2\times(2\times f)-1][((2\times f)-\alpha_{\#(2d+1),4,y}-1)+1+(2\times m\times z)]=1 \quad (250\text{-}3)$$

For all v being an integer no smaller than one and no greater than 2×m×z satisfying $\{v\neq((2\times f)-0-1)+1\}$, $\{v\neq((2\times f)-\alpha_{\#(2d+1),4,y}-1)+1\}$, and $\{v\neq((2\times f)-\alpha_{\#(2d+1),4,y}-1)+1+(2\times m\times z)\}$ (where y is an integer no smaller than one and no greater than $R_{\#(2d+1),4}$), the following holds true:

$$H_{x,4,comp}[2\times(2\times f)-1][v]=0 \quad (250\text{-}4)$$

Considered in a similar manner, the following holds true for $H_{x,w,comp}[2\times(2\times f)-1][v]$. In the following, w is an integer no smaller than four and no greater than seven.

[Math. 690]

$$H_{x,w,comp}[2\times(2\times f)-1][((2\times f)-0-1)+1]=1 \quad (251\text{-}1)$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)-1][((2\times f)-\alpha_{\#(2d+1),w,y}-1)+1]=1 \quad (251\text{-}2)$$

When $(2\times f)-\alpha_{\#(2d+1),w,y}-1<0$:

$$H_{x,w,comp}[2\times(2\times f)-1][((2\times f)-\alpha_{\#(2d+1),w,y}-1)+1+(2\times m\times z)]=1 \quad (251\text{-}3)$$

For all v being an integer no smaller than one and no greater than 2×m×z satisfying $\{v\neq((2\times f)-0-1)+1\}$, $\{v\neq((2\times f)+\alpha_{\#(2d+1),w,y}-1)+1\}$, and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)-1][v]=0 \quad (251\text{-}4)$$

Further, the following holds true for $H_{p1,comp}[2\times(2\times f)-1][v]$.

[Math. 691]

$$H_{p1,comp}[2\times(2\times f)-1][((2\times f)-0-1)+1]=1 \quad (252\text{-}1)$$

For all v being an integer no smaller than one and no greater than 2×m×z satisfying $\{v\neq((2\times f)-0-1)+1\}$, the following holds true:

$$H_{p1,comp}[2\times(2\times f)-1][v]=0 \quad (252\text{-}2)$$

Further, the following holds true for $H_{p2,comp}[2\times(2\times f)-1][v]$.

[Math. 692]

When $(2\times f)-\beta_{\#(2d+1),0}-1\geq 0$:

$$H_{p2,comp}[2\times(2\times f)-1][((2\times f)-\beta_{\#(2d+1),0}-1)+1]1 \quad (253\text{-}1)$$

When $(2\times f)-\beta_{\#(2d+1),0}-1<0$:

$$H_{p2,comp}[2\times(2\times f)-1][((2\times f)-\beta_{\#(2d+1),0}-1)+1+(2\times m\times z)]=1 \quad (253\text{-}2)$$

For all v being an integer no smaller than one and no greater than 2×m×z satisfying $\{v\neq((2\times f)-\beta_{\#(2d+1),0}-1)+1\}$ and $\{v\neq((2\times f)-\beta_{\#(2d+1),0}1)+1+(2\times m\times z)\}$, the following holds true:

$$H_{p2,comp}[2\times(2\times f)-1][v]=0 \quad (253\text{-}3)$$

Further, (6) when g=2×f (where f is an integer no smaller than one and no greater than m×z), when a vector for row 2×(2×f)−1 of the parity check matrix $H_{pro\_m}$, which is for the LDPC-CC of coding rate 7/9 that uses an improved tail-biting scheme (an LDPC block code using an LDPC-CC), can be generated by using a parity check polynomial satisfying zero provided by expression (198-1-2), ((2×f)−1) %2m=2d+1 holds true. Accordingly, a parity check polynomial satisfying zero of expression (198-1-2) where 2i+1=2d+1 holds true (where d is an integer no smaller than zero and no greater than m−1).

Accordingly, components $H_{x,1,comp}[2\times g-1][v]=H_{x,1,comp}[2\times(2\times f)-1][v]$, $H_{x,2,comp}[2\times g-1][v]=H_{x,2,comp}[2\times(2\times f)-1][v]$, $H_{x,3,comp}[2\times g-1][v]=H_{x,3,comp}[2\times(2\times f)-1][v]$, $H_{x,4,comp}[2\times g-1][v]=H_{x,4,comp}[2\times(2\times f)-1][v]$, $H_{x,5,comp}[2\ g-1][v]=H_{x,5,comp}[2\times(2\times f)-1][v]$, $H_{x,6,comp}[2\times g-1][v]=H_{x,6,comp}[2\times(2\times f)-1][v]$, $H_{x,7,comp}[2\ g-1][v]=H_{x,7,comp}[2\times(2\times f)-1][v]$, $H_{p1,comp}[2\ g-1][v]=H_{p1,comp}[2\times(2\times f)-1][v]$, and $H_{p2,comp}[2\times g-1][v]=H_{p2,comp}[2\times(2\times f)-1][v]$ in row 2×g−1, or that is, row 2×(2×f)−1 of the parity check matrix $H_{pro\_m}$, which is for the LDPC-CC of coding rate 7/9 that uses an improved tail-biting scheme (an LDPC block code using an LDPC-CC), is expressed as follows.

First, the following holds true for $H_{x,1,comp}[2\times(2\times f)-1][v]$. In the following, y is an integer no smaller than $R_{\#(2d+1),1}+1$ and no greater than $r_{\#(2d+1),1}$.

[Math. 693]

When $(2\times f)-\alpha_{\#(2d+1),1,y}-1\geq 0$:

$$H_{x,1,comp}[2\times(2\times f)-1][((2\times f)-\alpha_{\#(2d+1),1,y}-1)+1]=1 \quad (254\text{-}1)$$

When $(2\times f)-\alpha_{\#(2d+1),1,y}-1<0$:

$$H_{x,1,comp}[2\times(2\times f)-1][((2\times f)-\alpha_{\#(2d+1),1,y}-1)+1+(2\times m\times z)]=1 \quad (254\text{-}2)$$

For all v being an integer no smaller than one and no greater than 2×m×z satisfying $\{v\neq((2\times f)-\alpha_{\#(2d+1),1,y}-1)+1\}$ and $\{v\neq((2\times f)-\alpha_{\#(2d+1),1,y}-1)+1+(2\times m\times z)\}$ (where y is an integer no smaller than $R_{\#(2d+1),\ 1}+1$ and no greater than $r_{\#(2d+1),1}$), the following holds true:

$$H_{x,1,comp}[2\times(2\times f)-1][v]=0 \quad (254\text{-}3)$$

Considered in a similar manner, the following holds true for $H_{x,\Omega,comp}[2\times(2\times f)-1)][v]$. In the following, Ω is an integer no smaller than one and no greater than three, and y is an integer no smaller than $R_{\#(2d+1),\Omega}+1$ and no greater than $r_{\#(2d+1),\Omega}$.

[Math. 694]

When $(2\times f)-\alpha_{\#(2d+1),\Omega,y}-1\geq 0$:

$$H_{x,\Omega,comp}[2\times(2\times f)-1][((2\times f)-\alpha_{\#(2d+1),\Omega,y}-1)+1]=1 \tag{255-1}$$

When $(2\times f)-\alpha_{\#(2d+1),\Omega,y}-1<0$:

$$H_{x,\Omega,comp}[2\times(2\times f)-1][((2\times f)-\alpha_{\#(2d+1),\Omega,y}-1)+1+(2\times m\times z)]=1 \tag{255-2}$$

For all v being an integer no smaller than one and no greater than $2\times m\times z$ satisfying $\{v\neq((2\times f)-\alpha_{\#(2d+1),\Omega,y}-1)+1\}$, and $\{v\neq((2\times f)-\alpha_{\#(2d+1),\Omega,y}-1)+1+(2\times m\times z)\}$ (where y is an integer no smaller than $R_{\#(2d\ q),\Omega}+1$ and no greater than $r_{\#(2d\ q),\Omega}$), the following holds true:

$$H_{x,\Omega,comp}[2\times(2\times f)-1][v]=0 \tag{255-3}$$

Further, the following holds true for $H_{x,4,comp}[2\times(2\times f)-1][v]$.

[Math. 695]

$$H_{x,4,comp}[2\times(2\times f)-1][((2\times f)-0-1)+1]=1 \tag{256-1}$$

When y is an integer no smaller than one and no greater than $R_{\#(2d+1),4}$, and $(2\times f)-\alpha_{\#(2d+1),4,y}-1\geq 0$:

$$H_{x,4,comp}[2\times(2\times f)-1][((2\times f)-\alpha_{\#(2d-1),4,y}-1)+1]=1 \tag{256-2}$$

When $(2\times f)-\alpha_{\#(2d+1),4,y}-1<0$:

$$H_{x,4,comp}[2\times(2\times f)-1][((2\times f)-\alpha_{\#(2d\ q),4,y}-1)+1+(2\times m\times z)]=1 \tag{256-3}$$

For all v being an integer no smaller than one and no greater than $2\times m\times z$ satisfying $\{v\neq((2\times f)-0-1)+1\}$, $\{v\neq((2\times f)-\alpha_{\#(2d+1),4,y}-1)+1\}$, and $\{v\neq(2\times f)-\alpha_{\#(2d+1),4,y}-1)+1+(2\times m\times z)\}$ (where y is an integer no smaller than one and no greater than $R_{\#(2d+1),4}$), the following holds true:

$$H_{x,4,comp}[2\times(2\times f)-1][v]=0 \tag{256-4}$$

Considered in a similar manner, the following holds true for $H_{x,w,comp}[2\times(2\times f)-1][v]$. In the following, w is an integer no smaller than four and no greater than seven.

[Math. 696]

$$H_{x,w,comp}[2\times(2\times f)-1][((2\times f)-0-1)+1]=1 \tag{257-1}$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)-1][((2\times f)-\alpha_{\#(2d+1),w,y}-1)+1]=1 \tag{257-2}$$

When $(2\times f)-\alpha_{\#(2d+1),w,y}-1<0$:

$$H_{x,w,comp}[2\times(2\times f)-1][((2\times f)-\alpha_{\#(2d+1),w,y}-1)+1+(2\times m\times z)]=1 \tag{257-3}$$

For all v being an integer no smaller than one and no greater than $2\times m\times z$ satisfying $\{v\neq((2\times f)-0-1)+1\}$, $\{v\neq((2\times f)-\alpha_{\#(2d+1),w,y}-1)+1\}$, and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)-1][v]=0 \tag{257-4}$$

Further, the following holds true for $H_{p1,comp}[2\times(2\times f)-1][v]$.

[Math. 697]

$$H_{p1,comp}[2\times(2\times f)-1][((2\times f)-0-1)+1]=1 \tag{258-1}$$

When $(2\times f)-\beta_{\#(2d+1),1}-1\geq 0$:

$$H_{p1,comp}[2\times(2\times f)-1][((2\times f)-\beta_{\#(2d+1),1}-1)+1]=1 \tag{258-2}$$

When $(2\times f)-\beta_{\#(2d+1),1}-1<0$:

$$H_{p1,comp}[2\times(2\times f)-1][((2\times f)-\beta_{\#(2d+1),1}-1)+1+(2\times m\times z)]=1 \tag{258-3}$$

For all v being an integer no smaller than one and no greater than $2\times m\times z$ satisfying $\{v\neq((2\times f)-0-1)+1\}$, $\{v\neq((2\times f)-\beta_{\#(2d+1),1}-1)+1\}$, and $\{v\neq((2\times f)-\beta_{\#(2d+1),1}-1)+1+(2\times m\times z)\}$, the following holds true:

$$H_{p1,comp}[2\times(2\times f)-1][v]=0 \tag{258-4}$$

Further, the following holds true for $H_{p2,comp}[2\times(2\times f)-1][v]$.

[Math. 698]

For all v being an integer no smaller than one and no greater than $2\times m\times z$, the following holds true:

$$H_{p2,comp}[2\times(2\times f)-1][v]=0 \tag{259}$$

Further, (7) when g=2×f (where f is an integer no smaller than one and no greater than m×z), when a vector for row 2×(2×f) of the parity check matrix $H_{pro\_m}$, which is for the LDPC-CC of coding rate 7/9 that uses an improved tail-biting scheme (an LDPC block code using an LDPC-CC), can be generated by using a parity check polynomial satisfying zero provided by expression (198-2-1), ((2×f)−1) %2m=2d+1 holds true. Accordingly, a parity check polynomial satisfying zero of expression (198-2-1) where 2i+1=2d+1 holds true (where d is an integer no smaller than zero and no greater than m−1).

Accordingly, components $H_{x,1,comp}[2\times g][v]=H_{x,1,comp}[2\times(2\times f)][v]$, $H_{x,2,comp}[2\times g][v]=H_{x,2,comp}[2\times(2\times f)][v]$, $H_{x,3,comp}[2\times g][v]=H_{x,3,comp}[2\times(2\times f)][v]$, $H_{x,4,comp}[2\times g][v]=H_{x,4,comp}[2\times(2\times f)][v]$, $H_{x,5,comp}[2\times g][v]=H_{x,5,comp}[2\times(2\times f)][v]$, $H_{x,6,comp}[2\times g][v]=H_{x,6,comp}[2\times(2\times f)][v]$, $H_{x,7,comp}[2\times g][v]=H_{x,7,comp}[2\times(2\times f)][v]$, $H_{p1,comp}[2\times g][v]H_{p1,comp}[2\times(2\times f)][v]$, and $H_{p2,comp}[2\times g][v]=H_{p2,comp}[2\times(2\times f)][v]$ in row 2×g, or that is, row 2×(2×f) of the parity check matrix $H_{pro\_m}$, which is for the LDPC-CC of coding rate 7/9 that uses an improved tail-biting scheme (an LDPC block code using an LDPC-CC), is expressed as follows.

The following holds true for $H_{x,1,comp}[2\times(2\times f)][v]$.

[Math. 699]

$$H_{x,1,comp}[2\times(2\times f)][((2\times f)-0-1)+1]=1 \tag{260-1}$$

When y is an integer no smaller than one and no greater than $R_{\#(2d+1),1}$, and $(2\times f)-\alpha_{\#(2d+1),1,y}-1\geq 0$:

$$H_{x,1,comp}[2\times(2\times f)][((2\times f)-\alpha_{\#(2d+1),1,y}-1)+1]=1 \tag{260-2}$$

When $(2\times f)-\alpha_{\#(2d+1),1,y}-1<0$:

$$H_{x,1,comp}[2\times(2\times f)-1][((2\times f)-\alpha_{\#(2d+1),1,y}-1)+1+(2\times m\times z)]=1 \tag{260-3}$$

For all v being an integer no smaller than one and no greater than $2\times m\times z$ satisfying $\{v\neq((2\times f)-0-1)+1\}$, $\{v\neq((2\times f)-\alpha_{\#(2d+1),1,y}-1)+1\}$, and $\{v\neq((2\times f)-\alpha_{\#(2d+1),1,y}-1)+1+(2\times m\times z)\}$ (where y is an integer no smaller than one and no greater than $R_{\#(2d+1),i}$), the following holds true:

$$H_{x,1,comp}[2\times(2\times f)][v]=0 \tag{260-4}$$

Considered in a similar manner, the following holds true for $H_{x,w,comp}[2\times(2\times f)][v]$. In the following, w is an integer no smaller than one and no greater than three.

[Math. 700]

$$H_{x,w,comp}[2\times(2\times f)][((2\times f)-0-1)+1]=1 \tag{261-1}$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)][((2\times f)-\alpha_{\#(2d+1),w,y}-1)+1]=1 \tag{261-2}$$

When $(2\times f)-\alpha_{\#(2d+1),w,y}-1<0$:

$$H_{x,w,comp}[2\times(2\times f)][((2\times f)-\alpha_{\#(2d+1),1,y}-1)+1+(2\times m\times z)]=1 \tag{261-3}$$

For all v being an integer no smaller than one and no greater than $2\times m\times z$ satisfying $\{v\neq((2\times f)-0-1)+1\}$, $\{v\neq((2\times f)-\alpha_{\#(2d+1),w,y}-1)+1\}$, and $\{v\neq((2\times f)-\alpha_{\#(2d+1),1,y}-1)+1+(2\times m\times z)\}$ (where y is an integer no smaller than one and no greater than $R_{\#(2d+1),w}$), the following holds true:

$$H_{x,w,comp}[2\times(2\times f)][v]=0 \tag{261-4}$$

Further, the following holds true for $H_{x,4,comp}[2\times(2\times f)][v]$. In the following, y is an integer no smaller than $R_{\#(2d+1),4}+1$ and no greater than $r_{\#(2d+1),4}$.

[Math. 701]

When $(2\times f)-\alpha_{\#(2d+1),4,y}-1\geq 0$:

$$H_{x,4,comp}[2\times(2\times f)][((2\times f)-\alpha_{\#(2d+1),4,y}-1)+1]=1 \quad (262\text{-}1)$$

When $(2\times f)-\alpha_{\#(2d+1),4,y}-1<0$:

$$H_{x,4,comp}[2\times(2\times f)][((2\times f)-\alpha_{\#(2d+1),4,y}-1)+1+(2\times m\times z)]=1 \quad (262\text{-}2)$$

For all v being an integer no smaller than one and no greater than 2×m×z satisfying $\{v\neq((2\times f)-\alpha_{\#(2d+1),4,y}-1)+1\}$, and $\{v\neq((2\times f)-\alpha_{\#(2d+1),4,y}-1)+1+(2\times m\times z)\}$ (where y is an integer no smaller than $R_{\#(2d+1),4}+1$ and no greater than $r_{\#(2d+1),4}$), the following holds true:

$$H_{x,4,comp}[2\times(2\times f)][v]=0 \quad (262\text{-}3)$$

Considered in a similar manner, the following holds true for $H_{x,\Omega,comp}[2\times(2\times f)][v]$. In the following, Ω is an integer no smaller than four and no greater than seven, and y is an integer no smaller than $R_{\#(2d+1),\Omega}+1$ and no greater than $r_{\#(2d+1),\Omega}$.

[Math. 702]

When $(2\times f)-\alpha_{\#(2d+1),\Omega,y}-1\geq 0$:

$$H_{x,\Omega,comp}[2\times(2\times f)][((2\times f)-\alpha_{\#(2d+1),\Omega,y}-1)+1]=1 \quad (263\text{-}1)$$

When $(2\times f)-\alpha_{\#(2d+1),\Omega,y}-1<0$:

$$H_{x,\Omega,comp}[2\times(2\times f)][((2\times f)-\alpha_{\#(2d+1),\Omega,y}-1)+1+(2\times m\times z)]=1 \quad (263\text{-}2)$$

For all v being an integer no smaller than one and no greater than 2×m×z satisfying $\{v\neq(2\times f)-\alpha_{\#(2d+1),\Omega,y}-1)+1\}$ and $\{v\neq((2\times f)-\alpha_{\#(2d+1),\Omega,y}-1)+1+(2\times m\times z)\}$ (where y is an integer no smaller than $R_{\#(2d+1),\Omega}+1$ and no greater than $r_{\#(2d+1),\Omega}$), the following holds true:

$$H_{x,\Omega,comp}[2\times(2\times f)][v]=0 \quad (263\text{-}3)$$

Further, the following holds true for $H_{p1,comp}[2\times(2\times f)][v]$.

[Math. 703]

When $(2\times f)-\beta_{\#(2d+1),2}-1\geq 0$:

$$H_{p1,comp}[2\times(2\times f)][(2\times f)-\beta_{\#(2d+1),2}-1)+1]=1 \quad (264\text{-}1)$$

When $(2\times f)-\beta_{\#(2d+1),2}-1<0$:

$$H_{p1,comp}[2\times(2\times f)][((2\times f)-\beta_{\#(2d+1),2}-1)+1+(2\times m\times z)]=1 \quad (264\text{-}2)$$

For all v being an integer no smaller than one and no greater than 2×m×z satisfying $\{v\neq((2\times f)-\beta_{\#(2d+1),2}-1)+1\}$ and $\{v\neq((2\times f)-\beta_{\#(2d+1),2}-1)+1+(2\times m\times z)\}$, the following holds true:

$$H_{p1,comp}[2\times(2\times f)][v]=0 \quad (264\text{-}3)$$

Further, the following holds true for $H_{p2,comp}[2\times(2\times f)][v]$.

[Math. 704]

$$H_{p2,comp}[2\times(2\times f)][((2\times f)-0-1)+1]=1 \quad (265\text{-}1)$$

For all v being an integer no smaller than one and no greater than 2×m×z satisfying $\{v\neq((2\times f)-0-1)+1\}$, the following holds true:

$$H_{p2,comp}[2\times(2\times f)][v]=0 \quad (265\text{-}2)$$

Further, (8) when g=2×f (where f is an integer no smaller than one and no greater than m×z), when a vector for row 2×(2×f) of the parity check matrix $H_{pro\_m}$, which is for the LDPC-CC of coding rate 7/9 that uses an improved tail-biting scheme (an LDPC block code using an LDPC-CC), can be generated by using a parity check polynomial satisfying zero provided by expression (198-2-2), ((2×f)−1)%2m=2d+1 holds true. Accordingly, a parity check polynomial satisfying zero of expression (198-2-2) where 2i+1=2d+1 holds true (where d is an integer no smaller than zero and no greater than m−1).

Accordingly, components $H_{x,1,comp}[2\times g][v]=H_{x,1,comp}[2\times(2\times f)][v]$, $H_{x,2,comp}[2\times g][v]=H_{x,2,comp}[2\times(2\times f)][v]$, $H_{x,3,comp}[2\times g][v]=H_{x,3,comp}[2\times(2\times f)][v]$, $H_{x,4,comp}[2\times g][v]=H_{x,4,comp}[2\times(2\times f)][v]$, $H_{x,5,comp}[2\times g][v]=H_{x,5,comp}[2\times(2\times f)][v]$, $H_{x,6,comp}[2\times g][v]=H_{x,6,comp}[2\times(2\times f)][v]$, $H_{x,7,comp}[2\times g][v]=H_{x,7,comp}[2\times(2\times f)][v]$, $H_{p1,comp}[2\times g][v]=H_{p1,comp}[2\times(2\times f)][v]$, and $H_{p2,comp}[2\times g][v]=H_{p2,comp}[2\times(2\times f)][v]$ in row 2×g, or that is, row 2×(2×f) of the parity check matrix $H_{pro\_m}$, which is for the LDPC-CC of coding rate 7/9 that uses an improved tail-biting scheme (an LDPC block code using an LDPC-CC), is expressed as follows.

The following holds true for $H_{x,1,comp}[2\times(2\times f)][v]$.

[Math. 705]

$$H_{x,1,comp}[2\times(2\times f)][((2\times f)-0-1)+1]=1 \quad (266\text{-}1)$$

When y is an integer no smaller than one and no greater than $R_{\#(2d+1),1}$, and $(2\times f)-\alpha_{\#(2d+1),1,y}-1\geq 0$:

$$H_{x,1,comp}[2\times(2\times f)][((2\times f)-\alpha_{\#(2d+1),1,y}-1)+1]=1 \quad (266\text{-}2)$$

When $(2\times f)-\alpha_{\#(2d+1),1,y}-1<0$:

$$H_{x,1,comp}[2\times(2\times f)][((2\times f)-\alpha_{\#(2d+1),1,y}-1)+1+(2\times m\times z)]=1 \quad (266\text{-}3)$$

For all v being an integer no smaller than one and no greater than 2×m×z satisfying $\{v\neq((2\times f)-0-1)+1\}$, $\{v\neq((2\times f)-\alpha_{\#(2d+1),1,y}-1)+1\}$, and $\{v\neq((2\times f)-\alpha_{\#(2d+1),1,y}-1)+1+(2\times m\times z)\}$ (where y is an integer no smaller than one and no greater than $R_{\#(2d+1),1}$), the following holds true:

$$H_{x,1,comp}[2\times(2\times f)][v]=0 \quad (266\text{-}4)$$

Considered in a similar manner, the following holds true for $H_{x,w,comp}[2\times(2\times f)][v]$. In the following, w is an integer no smaller than one and no greater than three.

[Math. 706]

$$H_{x,w,comp}[2\times(2\times f)][((2\times f)-0-1)+1]=1 \quad (267\text{-}1)$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)][((2\times f)-\alpha_{\#(2d+1),w,y}-1)+1]=1 \quad (267\text{-}2)$$

When $(2\times f)-\alpha_{\#(2d+1),w,y}-1<0$:

$$H_{x,w,comp}[2\times(2\times f)][((2\times f)-\alpha_{\#(2d+1),w,y}-1)+1+(2\times m\times z)]=1 \quad (267\text{-}3)$$

For all v being an integer no smaller than one and no greater than 2×m×z satisfying $\{v\neq((2\times f)-0-1)+1\}$, $\{v\neq((2\times f)-\alpha_{\#(2d+1),w,y}-1)+1\}$, and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)][v]=0 \quad (267\text{-}4)$$

Further, the following holds true for $H_{x,4,comp}[2\times(2\times f)][v]$. In the following, y is an integer no smaller than $R_{\#(2d+1),4}+1$ and no greater than $r_{\#(2d+1),4}$.

[Math. 707]

When $(2\times f)-\alpha_{\#(2d+1),4,y}-1\geq 0$:

$$H_{x,4,comp}[2\times(2\times f)][((2\times f)-\alpha_{\#(2d+1),4,y}-1)+1]=1 \quad (268\text{-}1)$$

When $(2\times f)-\alpha_{\#(2d+1),4,y}-1<0$:

$$H_{x,4,comp}[2\times(2\times f)][((2\times f)-\alpha_{\#(2d+1),4,y}-1)+1+(2\times m\times z)]=1 \quad (268\text{-}2)$$

For all v being an integer no smaller than one and no greater than 2×m×z satisfying $\{v\neq((2\times f)-\alpha_{\#(2d+1),4,y}-1)+1\}$, and $\{v\neq((2\times f)-\alpha_{\#(2d+1),4,y}-1)+1+(2\times m\times z)\}$ (where y is an integer no smaller than $R_{\#(2d+1),4}+1$ and no greater than $r_{\#(2d+1),4}$), the following holds true:

$$H_{x,4,comp}[2\times(2\times f)][v]=0 \quad (268\text{-}3)$$

Considered in a similar manner, the following holds true for $H_{x,\Omega,comp}[2\times(2\times f)][v]$. In the following, Ω is an integer no smaller than four and no greater than seven, and y is an integer no smaller than $R_{\#(2d+1),\Omega}+1$ and no greater than $r_{\#(2d+1),\Omega}$.

[Math. 708]

When $(2\times f)-\alpha_{\#(2d+1),\Omega,y}-1\geq 0$:

$$H_{x,\Omega,comp}[2\times(2\times f)][((2\times f)-\alpha_{\#(2d+1),\Omega,y}-1)+1]=1 \quad (269\text{-}1)$$

When $(2\times f)-\alpha_{\#(2d+1),\Omega,y}-1<0$:

$$H_{x,\Omega,comp}[2\times(2\times f)][((2\times f)\_\alpha_{\#(2d+1),\Omega,y}-1)+1+(2\times m\times z)]=1 \quad (269\text{-}2)$$

For all v being an integer no smaller than one and no greater than 2×m×z satisfying $\{v\neq(2\times f)-\alpha_{\#(2d+1),\Omega,y}-1)+1\}$ and $\{v\neq((2\times f)\_\alpha_{\#(2d+1),\Omega,y}-1)+1+(2\times m\times z)\}$ (where y is an integer no smaller than $R_{190\ (2d+1),\Omega}+1$ and no greater than $r_{\#(2d+1),\Omega}$), the following holds true:

$$H_{x,\Omega,comp}[2\times(2\times f)][v]=0 \quad (269\text{-}3)$$

Further, the following holds true for $H_{p1,comp}[2\times(2\times f)][v]$.

[Math. 709]

For all v being an integer no smaller than one and no greater than 2×m×z, the following holds true:

$$H_{p1,comp}[2\times(2\times f)][v]=0 \quad (270)$$

Further, the following holds true for $H_{p2,comp}[2\times(2\times f)][v]$.

[Math. 710]

$$H_{p2,comp}[2\times(2\times f)][((2\times f)-0-1)+1]=1 \quad (271\text{-}1)$$

When $(2\times f)-\beta_{\#(2d+1),3}-1\geq 0$:

$$H_{p2,comp}[2\times(2\times f)][((2\times f)-\beta_{\#(2d+1),3}-1)+1]-1 \quad (271\text{-}2)$$

When $(2\times f)-\beta_{\#(2d+1),3}-1<0$:

$$H_{p2,comp}[2\times(2\times f)][((2\times\beta_{\#(2d+1),3}-1)+1+(2\times m\times z)]=1 \quad (271\text{-}3)$$

For all v being an integer no smaller than one and no greater than 2×m×z satisfying $\{v\neq(2\times f)-0-1)+1\}$, $\{v\neq(2\times f)-\beta_{\#(2d+1),3}-1)+1\}$, and $\{v\neq(2\times f)-\beta_{\#(2d+1),3}-1)+1+(2\times m\times z)\}$, the following holds true:

$$H_{p2,comp}[2\times(2\times f)][v]=0 \quad (271\text{-}4)$$

An LDPC-CC of coding rate 7/9 that uses an improved tail-biting scheme (an LDPC block code using an LDPC-CC) can be generated as described above, and the code so generated achieves high error correction capability.

In the above, parity check polynomials satisfying zero for the LDPC-CC of coding rate 7/9 that uses an improved tail-biting scheme (an LDPC block code using an LDPC-CC) are set as follows:

the 0th parity check polynomial satisfying zero is a parity check polynomial satisfying zero of #0'; first expression provided by expression 205;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

Based on this, the following method is conceivable as a configuration where usage of parity check polynomials satisfying zero is limited.

In this configuration, parity check polynomials satisfying zero for the LDPC-CC of coding rate 7/9 that uses an improved tail-biting scheme (an LDPC block code using an LDPC-CC) are set as follows:

the 0th parity check polynomial satisfying zero is a parity check polynomial satisfying zero of #0'; first expression provided by expression 205;

the first parity check polynomial satisfying zero is a parity check polynomial satisfying zero of #0; second expression provided by expression (197-2-1);

the 2×i−2th parity check polynomial satisfying zero is a parity check polynomial satisfying zero of #((i−1)%2m); first expression provided by expression (197-1-1) or expression (198-1-1); and the 2×i−1th parity check polynomial satisfying zero is a parity check polynomial satisfying zero of #((i−1)%2m); second expression provided by expression (197-2-1) or expression (198-2-1) (where i is an integer no smaller than two and no greater than 2×m×z).

Accordingly, in the parity check matrix $H_{pro\_m}$ for the LDPC-CC of coding rate 7/9 that uses an improved tail-biting scheme (an LDPC block code using an LDPC-CC):

the vector composed of row one of the parity check matrix $H_{pro\_m}$ is generated by using a parity check polynomial satisfying zero of #0'; first expression provided by expression 205;

the vector composed of row two of the parity check matrix $H_{pro\_m}$ is generated by using a parity check polynomial satisfying zero of #0; second expression provided by expression (197-2-1);

the vector composed of row 2×g−1 of the parity check matrix $H_{pro\_m}$ is generated by using a parity check polynomial satisfying zero of #((g−1)%2m); first expression provided by expression (197-1-1) or expression (198-1-1); and the vector composed of row 2×g of the parity check matrix $H_{pro\_m}$ is generated by using a parity check polynomial satisfying zero of #((g−1)%2m); second expression provided by expression (197-2-1) or expression (198-2-1) (where g is an integer no smaller than two and no greater than 2×m×z).

Note that when making such a configuration, the above-described method of configuring the parity check matrix $H_{pro}$ for the LDPC-CC of coding rate 7/9 that uses an improved tail-biting scheme (an LDPC block code using an LDPC-CC) is applicable.

Such a method also enables generating a code with high error correction capability.

Embodiment F5

In embodiment F4, description is provided of an LDPC-CC of coding rate 7/9 that uses an improved tail-biting scheme (an LDPC block code using an LDPC-CC) and a method of configuring a parity check matrix for the code.

With regards to parity check matrices for low density parity check (block) codes, one example of which is the LDPC-CC of coding rate 7/9 that uses an improved tail-biting scheme (an LDPC block code using an LDPC-CC), a parity check matrix equivalent to a parity check matrix defined for a given LDPC code can be generated by using the parity check matrix defined for the given LDPC code.

For example, a parity check matrix equivalent to the parity check matrix $H_{pro\_m}$ described in embodiment F4, which is for the LDPC-CC of coding rate 7/9 that uses an improved tail-biting scheme (an LDPC block code using an LDPC-CC), can be generated by using the parity check matrix $H_{pro\_m}$.

The following describes a method of generating a parity check matrix equivalent to a parity check matrix defined for a given LDPC by using the parity check matrix defined for the given LDPC code.

Note that the method of generating an equivalent parity check matrix described in the present embodiment is not only applicable to the LDPC-CC of coding rate 7/9 that uses an improved tail-biting scheme (an LDPC block code using an LDPC-CC) described in embodiment F4, but also is widely applicable to LDPC codes in general.

FIG. 31 illustrates the configuration of a parity check matrix H for an LDPC (block) code of coding rate (N−M)/N (N>M>0). For example, the parity check matrix of FIG. 31 has M rows and N columns. Here, to provide a general description, the parity check matrix H in FIG. 31 is considered to be a parity check matrix for defining an LDPC (block) code #A of coding rate (N−M)/N (N>M>0).

In FIG. 31, a transmission sequence (codeword) for block j is $v_j^T=(Y_{j,1}, Y_{j,2}, Y_{j,3}, \ldots, Y_{j,N-2}, Y_{j,N-1}, Y_{j,N})$ (for systematic codes, $Y_{j,k}$ (where k is an integer no smaller than one and no greater than N) is information X or parity P (parity $P_{pro}$)).

Here, $Hv_j=0$ holds true (where the zero in $Hv_j=0$ indicates that all elements of the vector $Hv_j$ are zeroes. That is, row k of the vector $Hv_j$ has a value of zero for all k (where k is an integer no smaller than one and no greater than M)).

Then, an element of row k (where k is an integer no smaller than one and no greater than N) of the transmission sequence $v_j$ of block j (in FIG. 31, an element of column k in the transpose matrix $v_j^T$ of the transmission sequence is $Y_{j,k}$, and a vector obtained by extracting column k of the parity check matrix H for the LDPC (block) code #A of coding rate (N−M)/N (N>M>0) can be expressed as $c_k$, as illustrated in FIG. 31. Here, the parity check matrix H is expressed as follows.

[Math. 711]

$$H=[c_1 c_2 c_3 \ldots c_{N-2} c_{N-1} c_N] \quad (272)$$

FIG. 32 illustrates a configuration when interleaving is applied to the transmission sequence (codeword) $v_j^T=(Y_{j,1}, Y_{j,2}, Y_{j,3}, \ldots, Y_{j,N-2}, Y_{j,N-1}, Y_{j,N})$ of block j. In FIG. 32, an encoding section 3202 receives information 3201 as input, performs encoding thereon, and outputs encoded data 3203. For example, when encoding the LDPC (block) code #A of coding rate (N−M)/N (N>M>0), the encoder 3202 receives information in block j as input, performs encoding thereon based on the parity check matrix H for the LDPC (block) code #A of coding rate (N−M)/N (N>M>0), and outputs the transmission sequence (codeword) $v_j^T=(Y_{j,1}, Y_{j,2}, Y_{j,3}, \ldots, Y_{j,N-2}, Y_{j,N-1}, Y_{j,N})$ of block j.

Then, an accumulation and reordering section (interleaving section) 3204 receives the encoded data 3203 as input, accumulates the encoded data 3203, performs reordering thereon, and outputs interleaved data 3205. Accordingly, the accumulation and reordering section (interleaving section) 3204 receives the transmission sequence $v_j=(Y_{j,1}, Y_{j,2}, Y_{j,3}, \ldots, Y_{j,N-2}, Y_{j,N-1}, Y_{j,N})^T$ of block j as input, and outputs a transmission sequence (codeword) $v_j=(Y_{j,32}, Y_{j,99}, Y_{j,23}, \ldots, Y_{j,234}, Y_{j,3}, Y_{j,43})^T$, which is illustrated in FIG. 32, as a result of reordering being performed on the elements of the transmission sequence $v_j$ ($v'_j$, being an example). Here, as discussed above, the transmission sequence $v'_j$ is obtained by reordering the elements of the transmission sequence $v_j$ of block j. Accordingly, $v'_j$ is a vector having one row and n columns, and the N elements of $v'_j$ are such that one each of the terms $Y_{j,1}, Y_{j,2}, Y_{j,3}, \ldots, Y_{j,N-2}, Y_{j,N-1}, Y_{j,N}$ is present.

Here, an encoding section 3207 as shown in FIG. 32 having the functions of the encoding section 3202 and the accumulation and reordering section (interleaving section) 3204 is considered. Accordingly, the encoding section 3207 receives the information 3201 as input, performs encoding thereon, and outputs the encoded data 3203. For example, the encoding section 3207 receives information in block j as input, and as shown in FIG. 32, outputs the transmission sequence (codeword) $v'_j=(Y_{j,32}, Y_{j,99}, Y_{j,23}, \ldots, Y_{j,234}, Y_{j,3}, Y_{j,43})^T$. In the following, explanation is provided of a parity check matrix H' for the LDPC (block) code of coding rate (N−M)/N (N>M>0) corresponding to the encoding section 3207 (i.e., a parity check matrix H' that is equivalent to the parity check matrix H for the LDPC (block) code #A of coding rate (N−M)/N (N>M>0)), while referring to FIG. 33. (Needless to say, the parity check matrix H' is a parity check matrix for the LDPC (block) code #A of coding rate (N−M)/N (N>M>0).)

FIG. 33 shows a configuration of the parity check matrix H', which is a parity check matrix equivalent to the parity check matrix H for the LDPC (block) code #A of coding rate (N−M)/N (N>M>0), when the transmission sequence (codeword) is $v'_j(Y_{j,32}, Y_{j,99}, Y_{j,23}, \ldots, Y_{j,234}, Y_{j,3}, Y_{j,43})^T$. Here, an element of row one of the transmission sequence $v'_j$ of block j (an element of column one in the transpose matrix $v'^T_j$ of the transmission sequence $v'_j$ in FIG. 33) is $Y_{j,32}$. Accordingly, a vector obtained by extracting column one of the parity check matrix H', when using the above-described vector $c_k$ (k=1, 2, 3, . . . , N−2, N−1, N), is $c_{32}$. Similarly, an element of row two of the transmission sequence $v'_j$ of block j (an element of column two in the transpose matrix $v'^T_j$ of the transmission sequence $v'_j$ in FIG. 33) is $Y_{j,99}$. Accordingly, a vector obtained by extracting column two of the parity check matrix H' is $c_{99}$. Further, as shown in FIG. 33, a vector obtained by extracting column three of the parity check matrix H' is $c_{23}$, a vector obtained by extracting column N−2 of the parity check matrix H' is $c_{234}$, a vector obtained by extracting column N−1 of the parity check matrix H' is $c_3$, and a vector obtained by extracting column N of the parity check matrix H' is $c_{43}$.

That is, when denoting an element of row i of the transmission sequence $v'_j$ of block j (an element of column i in the transpose matrix $v'^T_j$ of the transmission sequence $v'_j$ in FIG. 33) as $Y_{j,g}$ (where g=1, 2, 3, . . . , N−1, N−1, N), then a vector obtained by extracting column i of the parity check matrix H' is $c_g$, when using the vector $c_k$ described above.

Accordingly, the parity check matrix H' for transmission sequence (codeword) $v'_j=(Y_{j,32}, Y_{j,99}, Y_{j,23}, \ldots, Y_{j,234}, Y_{j,3}, Y_{j,43})^T$ is expressed as follows.

[Math. 712]

$$H'[c_{32} c_{99} c_{23} \ldots c_{234} c_3 c_{43}] \quad (273)$$

When denoting an element of row i of the transmission sequence $v'_j$ of block j (an element of column i in the transpose matrix $v'^T_j$ of the transmission sequence $v'_j$ in FIG. 33) as $Y_{j,g}$ (where g=1, 2, 3, . . . , N−1, N−1, N), a vector obtained by extracting column i of the parity check matrix H' is $c_g$, when using the vector $c_k$ described above. When the above is followed to create a parity check matrix, then a parity check matrix for the transmission sequence $v'_j$ of block j can be obtained with no limitation to the above-given example.

Accordingly, when interleaving is applied to the transmission sequence (codeword) of the LDPC (block) code #A of coding rate (N−M)/N (N>M>0), a matrix for the interleaved transmission sequence is obtained by performing reordering of columns (column permutation) as described above on the parity check matrix H for the LDPC (block) code #A of coding rate (N−M)/N (N>M>0).

As such, it naturally follows that the transmission sequence (codeword) ($v_j$) obtained by reverting the interleaved transmission sequence (codeword) ($v'_j$) to its original order is the transmission sequence (codeword) of the LDPC (block) code #A of coding rate (N−M)/N (N>M>0). Accordingly, by reverting the interleaved transmission sequence (codeword) ($v'_j$) and a parity check matrix H' corresponding to the interleaved transmission sequence (codeword) ($v'_j$) to their respective orders, the transmission sequence $v_j$ and a parity check matrix corresponding to the transmission sequence $v_j$ can be obtained, respectively. Further, the parity check matrix obtained by performing the reordering as described above is the parity check matrix H in FIG. 31, description of which has been provided above.

FIG. 34 illustrates an example of a decoding-related configuration of a receiving device, when encoding of FIG. 32 has been performed. The transmission sequence obtained when the encoding of FIG. 32 is performed undergoes processing such as mapping in accordance with a modulation scheme, frequency conversion, and modulated signal amplification, whereby a modulated signal is obtained. A transmitting device transmits the modulated signal. The receiving device then receives the modulated signal transmitted by the transmitting device to obtain a received signal. A log-likelihood ratio calculation section 3400 illustrated in FIG. 34 takes the received signal as input, calculates a log-likelihood ratio for each bit of the codeword, and outputs a log-likelihood ratio signal 3401.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ of block j. Then, the log-likelihood ratio calculation section 3400 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios.

An accumulation and reordering section (deinterleaving section) 3402 receives the log-likelihood ratio signal 3401 as input, performs accumulation and reordering thereon, and outputs a deinterleaved log-likelihood ratio signal 3403.

For example, the accumulation and reordering section (deinterleaving section) 3402 receives, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, performs reordering, and outputs the log-likelihood ratios in the order of: the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order.

A decoder 3404 receives the deinterleaved log-likelihood ratio signal 3403 as input, performs belief propagation (BP) decoding as disclosed in Non-Patent Literature 6 to 8, such as sum-product decoding, min-sum decoding, offset BP decoding, normalized BP decoding, shuffled BP decoding, and layered BP decoding in which scheduling is performed, based on the parity check matrix H for the LDPC (block) code #A of coding rate (N−M)/N (N>M>0) as illustrated in FIG. 31, and thereby obtains an estimation sequence 3405 (note that decoding schemes other than belief propagation decoding may be used).

For example, the decoder 3404 receives, as input, the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order, performs belief propagation decoding based on the parity check matrix H for the LDPC (block) code #A of coding rate (N−M)/N (N>M>0) as illustrated in FIG. 31, and obtains the estimation sequence (note that decoding schemes other than belief propagation decoding may be used).

The following describes a decoding-related configuration that differs from that described above. The decoding-related configuration described in the following differs from the decoding-related configuration described above in that the accumulation and reordering section (deinterleaving section) 3402 is not included. The operations of the log-likelihood ratio calculation section 3400 are similar to those described above, and thus, explanation thereof is omitted in the following.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ of block j. Then, the log-likelihood ratio calculation section 3400 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios (corresponding to 3406 in FIG. 34).

A decoder 3407 receives the log-likelihood ratio signal 3406 for each bit as input, performs belief propagation (BP) decoding as disclosed in Non-Patent Literature 6 to 8, such as sum-product decoding, min-sum decoding, offset BP decoding, normalized BP decoding, shuffled BP decoding, and layered BP decoding in which scheduling is performed, based on the parity check matrix H' for the LDPC (block) code #A of coding rate (N−M)/N (N>M>0) as illustrated in FIG. 33, and thereby obtains an estimation sequence 3409 (note that decoding schemes other than belief propagation decoding may be used).

For example, the decoder 3407 receives, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$ in the stated order, performs belief propagation decoding based on the parity check matrix H' for the LDPC (block) code #A of coding rate (N−M)/N (N>M>0) as illustrated in FIG. 33, and obtains the estimation sequence (note that decoding schemes other than belief propagation decoding may be used).

As explained above, even when the transmitted data is reordered due to the transmitting device interleaving the transmission sequence $v_j(Y_{j,1}, Y_{j,2}, Y_{j,3}, \ldots, Y_{j,N-2}, Y_{j,N-1}, Y_{j,N})^T$ of block j, the receiving device is able to obtain the estimation sequence by using a parity check matrix corresponding to the reordered transmitted data.

Accordingly, when interleaving is applied to the transmission sequence (codeword) of the LDPC (block) code #A of coding rate (N−M)/N (N>M>0), a parity check matrix for the interleaved transmission sequence (codeword) is obtained by performing reordering of columns (i.e., column permutation) as described above on the parity check matrix for the LDPC (block) code #A of coding rate (N−M)/N (N>M>0). As such, the receiving device is able to perform belief propagation decoding and thereby obtain an estimation sequence without performing interleaving on the log-likelihood ratio for each acquired bit.

Note that in the above, explanation is provided of the relation between interleaving applied to a transmission sequence and a parity check matrix. In the following, explanation is provided of reordering of rows (row permutation) performed on a parity check matrix.

FIG. 35 illustrates a configuration of a parity check matrix H corresponding to a transmission sequence (codeword) $v_j^T=(Y_{j,1}, Y_{j,2}, Y_{j,3}, \ldots, Y_{j,N-2}, Y_{j,N-1}, Y_{j,N})$ of block j of the LDPC (block) code #A of coding rate (N−M)/N (N>M>0). For example, the parity check matrix H of FIG. 35 is a matrix having M rows and N columns. (for systematic codes, $Y_{j,k}$ (where k is an integer no smaller than one and no greater than N) is information X or parity P (parity $P_{pro}$), and is composed of (N−M) information bits and M parity bits). Here, $Hv_j=0$ holds true. (Here, the zero in $Hv_j=0$ indicates that all elements of the vector $Hv_j$ are zeroes. That is, row k of the vector $Hv_j$ has a value of zero for all k (where k is an integer no smaller than one and no greater than M.)

Further, a vector obtained by extracting column k (where k is an integer no smaller than one and no greater than M) of the parity check matrix H for the LDPC (block) code #A of coding rate (N−M)/N (N>M>0) as illustrated in FIG. 35 is denoted as $z_k$. Then, the parity check matrix H for the LDPC (block) code is expressed as follows.

[Math. 713]

$$H = \begin{bmatrix} z_1 \\ z_2 \\ \vdots \\ z_{M-1} \\ z_M \end{bmatrix} \tag{274}$$

Next, a parity check matrix obtained by performing reordering of rows (row permutation) on the parity check matrix H of FIG. 35 is considered.

FIG. 36 shows an example of a parity check matrix H' obtained by performing reordering of rows (row permutation) on the parity check matrix H of FIG. 35. The parity check matrix H', similar to the parity check matrix shown in FIG. 35, is a parity check matrix corresponding to the transmission sequence (codeword) $v_j^T=(Y_{j,1}, Y_{j,2}, Y_{j,3}, \ldots, Y_{j,N-2}, Y_{j,N-1}, Y_{j,N})$ of block j of the LDPC (block) code #A of coding rate (N−M)/N (N>M>0).

The parity check matrix H' of FIG. 36 is composed of vectors $z_k$ obtained by extracting row k (where k is an integer no smaller one and no greater than M) of the parity check matrix H of FIG. 35. For example, in the parity check matrix H', the first row is composed of vector $z_{130}$, the second row is composed of vector $z_{24}$, the third row is composed of vector $z_{45}, \ldots$, the (M−2)th row is composed of vector $z_{33}$, the (M−1)th row is composed of vector $z_9$, and the Mth row is composed of vector $z_3$. Note that each of the M row-vectors obtained by extracting row k (where k is an integer no smaller than one and no greater than M) of the parity check matrix H' is such that one each of $z_1, z_2, z_3, \ldots z_{M-2}, z_{M-1}$, and $z_M$ is present.

Here, the parity check matrix H' for the LDPC (block) code #A of coding rate (N−M)/N (N>M>0) is expressed as follows.

[Math. 714]

$$H' = \begin{bmatrix} z_{130} \\ z_{24} \\ \vdots \\ z_9 \\ z_3 \end{bmatrix} \tag{275}$$

Further, $H'v_j=0$ holds true. (Here, the zero in $H'v_j=0$ indicates that all elements of the vector $H'v_j$ are zeroes. That is, row k of the vector $H'v_j$ has a value of zero for all k (where k is an integer no smaller than one and no greater than M.)

That is, for the transmission sequence $v_j^T$ of block j, a vector obtained by extracting row i of the parity check matrix H' in FIG. 36 is expressed as $c_k$ (where k is an integer no smaller than one and no greater than M), and each of the M row vectors obtained by extracting row k (where k is an integer no smaller than one and no greater than M) of the parity check matrix H' in FIG. 36 is such that one each of $z_1, z_2, z_3, \ldots z_{M-2}, z_{M-1}$, and $z_M$ is present.

As described above, for the transmission sequence $v_j^T$ of block j, a vector obtained by extracting row i of the parity check matrix H' in FIG. 36 is expressed as $c_k$ (where k is an integer no smaller than one and no greater than M), and each of the M row vectors obtained by extracting row k (where k is an integer no smaller than one and no greater than M) of the parity check matrix H' in FIG. 36 is such that one each of $z_1, z_2, z_3, \ldots z_{M-2}, z_{M-1}$, and $z_M$ is present. Note that, when the above is followed to create a parity check matrix, then a parity check matrix for the transmission sequence parity $v_j$ of block j can be obtained with no limitation to the above-given example.

Accordingly, even when the LDPC (block) code #A of coding rate (N−M)/N (N>M>0) is being used, it does not necessarily follow that a transmitting device and a receiving device are using the parity check matrix H. As such, a transmitting device and a receiving device may use as a parity check matrix, for example, a matrix obtained by performing reordering of columns (column permutation) as described above on the parity check matrix H or a matrix obtained by performing reordering of rows (row permutation) on the parity check matrix H.

In addition, a matrix obtained by performing both reordering of columns (column permutation) and reordering of rows (row permutation) as described above on the parity check matrix H for the LDPC (block) code #A of coding rate (N−M)/N (N>M>0) may be used as a parity check matrix.

In such a case, a parity check matrix $H_1$ is obtained by performing reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_2$ is obtained by performing reordering of rows (row permutation) on the parity check matrix $H_1$ (i.e., through conversion from the parity check matrix shown in FIG. 35 to the parity check matrix shown in FIG. 36). A transmitting device and a receiving device may perform encoding and decoding by using the parity check matrix $H_2$ so obtained.

Also, a parity check matrix $H_{1,1}$ is obtained by performing a first reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_{2,1}$ may be obtained by performing a first reordering of rows (row permutation) on the parity check matrix $H_{1,1}$ (i.e., through conversion from the parity check matrix shown in FIG. 35 to the parity check matrix shown in FIG. 36).

Further, a parity check matrix $H_{1,2}$ may be obtained by performing a second reordering of columns (column permutation) on the parity check matrix $H_{2,1}$. Finally, a parity check matrix $H_{2,2}$ may be obtained by performing a second reordering of rows (row permutation) on the parity check matrix $H_{1,2}$.

As described above, a parity check matrix $H_{2,s}$ may be obtained by repetitively performing reordering of columns (column permutation) and reordering of rows (row permutation) for s iterations (where s is an integer no smaller than two). In such a case, a parity check matrix $H_{1,k}$ is obtained by performing a kth (where k is an integer no smaller than two and no greater than s) reordering of columns (column permutation) on a parity check matrix $H_{2,k-1}$. Then, a parity check matrix $H_{2,k}$ is obtained by performing a kth reordering of rows (row permutation) on the parity check matrix $H_{1,k}$. Note that in the first instance, a parity check matrix $H_{1,1}$ is obtained by performing a first reordering of columns (column permutation) on the parity check matrix H for the LDPC (block) code #A of coding rate (N−M)/N (N>M>0). Then, a parity check matrix $H_{2,1}$ is obtained by performing a first reordering of rows (row permutation) on the parity check matrix $H_{1,1}$.

In such a case, a transmitting device and a receiving device may perform encoding and decoding by using the parity check matrix $H_{2,s}$.

In an alternative method, a parity check matrix $H_3$ is obtained by performing reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_4$ is obtained by performing reordering of columns (column permutation) on the parity check matrix $H_3$ (i.e., through conversion from the parity check matrix shown in FIG. 31 to the parity check matrix shown in FIG. 33). In such a case, a transmitting device and a receiving device may perform encoding and decoding by using the parity check matrix $H_4$ so obtained.

Also, a parity check matrix $H_{3,1}$ is obtained by performing a first reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_{4,1}$ may be obtained by performing a first reordering of columns (column permutation) on the parity check matrix $H_{3,1}$ (i.e., through conversion from the parity check matrix shown in FIG. 31 to the parity check matrix shown in FIG. 33).

Then, a parity check matrix $H_{3,2}$ may be obtained by performing a second reordering of rows (row permutation) on the parity check matrix $H_{4,1}$. Finally, a parity check matrix $H_{4,2}$ may be obtained by performing a second reordering of columns (column permutation) on the parity check matrix $H_{3,2}$.

As described above, a parity check matrix $H_{4,s}$ may be obtained by repetitively performing reordering of rows (row permutation) and reordering of columns (column permutation) for s iterations (where s is an integer no smaller than two). In such a case, a parity check matrix $H_{3,k}$ is obtained by performing a kth (where k is an integer no smaller two and no greater than s) reordering of rows (row permutation) on a parity check matrix $H_{4,k-1}$. Then, a parity check matrix $H_{4,k}$ is obtained by performing a kth reordering of columns (column permutation) on the parity check matrix $H_{3,k}$. Note that in the first instance, a parity check matrix $H_{3,1}$ is obtained by performing a first reordering of rows (row permutation) on the parity check matrix H for the LDPC (block) code #A of coding rate (N−M)/N (N>M>0). Then, a parity check matrix $H_{4,1}$ is obtained by performing a first reordering of columns (column permutation) on the parity check matrix $H_{3,1}$.

In such a case, a transmitting device and a receiving device may perform encoding and decoding by using the parity check matrix $H_{4,s}$.

Here, note that by performing reordering of rows (row permutation) and reordering of columns (column permutation), the parity check matrix H for the LDPC (block) code #A of coding rate (N−M)/N (N>M>0) can be obtained from each of the parity check matrix $H_2$, the parity check matrix $H_{2,s}$, the parity check matrix $H_4$, and the parity check matrix $H_{4,s}$.

Similarly, a matrix obtained by performing both reordering of columns (column permutation) as described above and reordering of rows (row permutation) as described above on the parity check matrix H for the LDPC (block) code #A of coding rate (N−M)/N (N>M>0) may be used as a parity check matrix.

In such a case, a parity check matrix $H_5$ is obtained by performing reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_6$ is obtained by performing reordering of rows (row permutation) on the parity check matrix $H_5$ (i.e., through conversion from the parity check matrix shown in FIG. 35 to the parity check matrix shown in FIG. 36). A transmitting device and a receiving device may perform encoding and decoding by using the parity check matrix $H_6$ so obtained.

Also, a parity check matrix $H_{5,1}$ is obtained by performing a first reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_{6,1}$ may be obtained by performing a first reordering of rows (row permutation) on the parity check matrix $H_{5,1}$ (i.e., through conversion from the parity check matrix shown in FIG. 35 to the parity check matrix shown in FIG. 36).

Further, a parity check matrix $H_{5,2}$ may be obtained by performing a second reordering of columns (column permutation) on the parity check matrix $H_{6,1}$. Finally, a parity check matrix $H_{6,2}$ may be obtained by performing a second reordering of rows (row permutation) on the parity check matrix $H_{5,2}$.

As described above, a parity check matrix $H_{6,s}$ may be obtained by repetitively performing reordering of columns (column permutation) and reordering of rows (row permutation) for s iterations (where s is an integer no smaller than two). In such a case, a parity check matrix $H_{5,k}$ is obtained by performing a kth (where k is an integer no smaller than two and no greater than s) reordering of columns (column permutation) on a parity check matrix $H_{6,k-1}$. Then, a parity check matrix $H_{6,k}$ is obtained by performing a kth reordering of rows (row permutation) on the parity check matrix $H_{5,k}$.

Note that in the first instance, a parity check matrix $H_{5,1}$ is obtained by performing a first reordering of columns (column permutation) on the parity check matrix H for the LDPC (block) code #A of coding rate (N−M)/N (N>M>0). Then, a parity check matrix $H_{6,1}$ is obtained by performing a first reordering of rows (row permutation) on the parity check matrix $H_{5,1}$.

In such a case, a transmitting device and a receiving device may perform encoding and decoding by using the parity check matrix $H_{6,s}$.

In an alternative method, a parity check matrix $H_7$ is obtained by performing reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_8$ is obtained by performing reordering of columns (column permutation) on the parity check matrix $H_7$ (i.e., through conversion from the parity check matrix shown in FIG. 31 to the parity check matrix shown in FIG. 33). In such a case, a transmitting device and a receiving device may perform encoding and decoding by using the parity check matrix $H_8$ so obtained.

Also, a parity check matrix $H_{7,1}$ is obtained by performing a first reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_{8,1}$ may be obtained by performing a first reordering of columns (column permutation) on the parity check matrix $H_{7,1}$ (i.e., through conversion from the parity check matrix shown in FIG. 31 to the parity check matrix shown in FIG. 33).

Then, a parity check matrix $H_{7,2}$ may be obtained by performing a second reordering of rows (row permutation) on the parity check matrix $H_{8,1}$. Finally, a parity check matrix $H_{8,2}$ may be obtained by performing a second reordering of columns (column permutation) on the parity check matrix $H_{7,2}$.

As described above, a parity check matrix $H_{8,s}$ may be obtained by repetitively performing reordering of rows (row permutation) and reordering of columns (column permutation) for s iterations (where s is an integer no smaller than two). In such a case, a parity check matrix $H_{7,k}$ is obtained by performing a kth (where k is an integer no smaller two and no greater than s) reordering of rows (row permutation) on a parity check matrix $H_{8,k-1}$. Then, a parity check matrix $H_{8,k}$ is obtained by performing a kth reordering of columns (column permutation) on the parity check matrix $H_{7,k}$. Note that in the first instance, a parity check matrix $H_{7,1}$ is obtained by performing a first reordering of rows (row permutation) on the parity check matrix H for the LDPC (block) code #A of coding rate (N−M)/N (N>M>0). Then, a parity check matrix $H_{8,1}$ is obtained by performing a first reordering of columns (column permutation) on the parity check matrix $H_{7,1}$.

In such a case, a transmitting device and a receiving device may perform encoding and decoding by using the parity check matrix $H_{8,s}$.

Here, note that by performing reordering of rows (row permutation) and reordering of columns (column permutation), the parity check matrix H for the LDPC (block) code #A of coding rate (N−M)/N (N>M>0) can be obtained from each of the parity check matrix $H_6$, the parity check matrix $H_{6,s}$, the parity check matrix $H_8$, and the parity check matrix $H_{8,s}$.

In the present embodiment, description is provided of a method of generating a parity check matrix equivalent to a parity check matrix H for the LDPC (block) code #A of coding rate (N−M)/N (N>M>0) by performing reordering of rows (row permutation) and/or reordering of columns (column permutation) with respect to the parity check matrix H. Further, description is provided of a method of applying the equivalent parity check matrix in, for example, a communication/broadcast system using an encoder and a decoder using the equivalent parity check matrix. Note that the error correction code described herein may be applied to various fields, including but not limited to communication/broadcast systems.

Embodiment F6

In the present embodiment, description is provided of a device that uses the LDPC-CC of coding rate 7/9 that uses an improved tail-biting scheme (an LDPC block code using an LDPC-CC), description of which is provided in embodiment F4.

As one example, description is provided of a case where the LDPC-CC of coding rate 7/9 that uses an improved tail-biting scheme (an LDPC block code using an LDPC-CC) is applied to a communication device.

FIG. 22 illustrates the structures of a transmitting device 2200 and a receiving device 2210 in the communication device pertaining to the present embodiment.

An encoder 2201 receives information to be transmitted as input, and is capable of performing various types of encoding (e.g., various coding rates and various block lengths of block codes (for example, in systematic codes, the sum of the number of information bits and the number of parity bits)). In particular, when receiving a specification to perform encoding by using the LDPC-CC of coding rate 7/9 that uses an improved tail-biting scheme (an LDPC block code using an LDPC-CC), the encoder 2201 performs encoding by using the LDPC-CC of coding rate 7/9 that uses an improved tail-biting scheme (an LDPC block code using an LDPC-CC) to calculate parities $P_1$ and $P_2$. Further, the encoder 2201 outputs the information to be transmitted and the parities $P_1$ and $P_2$ as a transmission sequence.

A modulator 2202 receives the transmission sequence, which includes the information to be transmitted and the parities P1 and P2, performs mapping based on a predetermined modulation scheme (for example, BPSK, QPSK, 16QAM, or 64QAM), and outputs a baseband signal. Further, the modulator 2202 may also receive information other than the transmission sequence, which includes the information to be transmitted and the parities $P_1$ and $P_2$, as input, perform mapping, and output a baseband signal. For example, the modulator 2202 may receive control information as input.

The transmitting device outputs a transmission signal after performing predetermined signal processing (e.g., signal processing for generation of an OFDM signal, frequency conversion, amplification) with respect to such signals (e.g., baseband signals, pilot signals). The transmitting device may transmit the transmission signal over a wireless transmission path utilizing electromagnetic waves, or over a wired transmission path utilizing a coaxial cable, a power line, an optical cable, or the like.

The transmission signal is received by the receiving device 2210 after travelling over the transmission path. A receiver 2211 receives a reception signal as input, performs predetermined signal processing (e.g., bandwidth limitation, frequency conversion, signal processing for OFDM, frequency offset estimation, signal detection, channel estimation), and outputs a baseband signal and a channel estimation signal.

A log-likelihood ratio generation section 2212 receives the baseband signal and the channel estimation signal as input (may receive other signals as input), and for example, calculates and outputs a log-likelihood ratio for each bit (may calculate and output a hard value (hard decision value)).

A decoder 2213 receives the log-likelihood ratio for each bit as input, performs belief propagation decoding (e.g., sum-product decoding, scheduled sum-product decoding (Layered BP (belief propagation) decoding), min-sum decoding, Normalized BP decoding, offset BP decoding), and outputs an estimation sequence. The decoder 2213 performs the belief propagation decoding based on the parity check matrix for the LDPC-CC of coding rate 7/9 that uses an improved tail-biting scheme (an LDPC block code using an LDPC-CC).

Although description is provided above taking an example where error correction coding is introduced to a communication device, the error correction coding described above is not limited to being introduced to a communication device, and for example, may be introduced to a storage medium (storage). When making such a modification, information that is to be stored to a storage medium (storage) is encoded by using the LDPC-CC of coding rate 7/9 that uses an improved tail-biting scheme (an LDPC block code using an LDPC-CC), and resultant information and parities are stored to the storage medium (storage).

Further, the LDPC-CC of coding rate 7/9 that uses an improved tail-biting scheme (an LDPC block code using an LDPC-CC) is applicable to any device that requires error correction coding (e.g., a memory, a hard disk).

Note that when using a block code such as the LDPC-CC of coding rate 7/9 that uses an improved tail-biting scheme (an LDPC block code using an LDPC-CC) in a device, there as cases where special processing needs to be executed.

Assume that a block length of the LDPC-CC of coding rate 7/9 that uses an improved tail-biting scheme (an LDPC block code using an LDPC-CC) used in a device is 18000 bits (14000 information bits, and 4000 parity bits).

In such a case, the number of information bits necessary for encoding one block is 14000. Meanwhile, there are cases where the number of bits of information input to an encoding section of the device does not reach 14000. For example, assume a case where only 12000 information bits are input to the encoding section.

Here, it is assumed that the encoding section, in the above-described case, adds 2000 padding bits of information to the 12000 information bits having been input, and performs encoding by using a total of 14000 bits, composed of the 12000 information bits having been input and the 2000 padding bits, to generate 4000 parity bits. Here, assume that all of the 2000 padding bits are known bits. For example, assume that each of the 2000 padding bits is "0".

A transmitting device may output the 12000 information bits having been input, the 2000 padding bits, and the 4000 parity bits. Alternatively, a transmitting device may output the 12000 information bits having been input and the 4000 parity bits.

In addition, a transmitting device may perform puncturing with respect to the 5000 information bits having been input and the 4000 parity bits, and thereby output a number of bits smaller than 10000 in total.

Note that when performing transmission in such a manner, the transmitting device is required to transmit, to a receiving device, information notifying the receiving device that transmission has been performed in such a manner.

As described above, the LDPC-CC of coding rate 7/9 that uses an improved tail-biting scheme (an LDPC block code using an LDPC-CC), description of which is provided in embodiment F4, is applicable to various devices.

Embodiment G1

The present embodiment describes a method of configuring an LDPC-CC of coding rate 13/15 that is based on a parity check polynomial, as one example of an LDPC-CC not satisfying coding rate (n−1)/n.

Bits of information bits $X_1, X_2, X_3, X_4, X_5, X_6, X_7, X_8, X_9, X_{10}, X_{11}, X_{12}, X_{13}$ and parity bits $P_1, P_2$, at time point j, are expressed $X_{1,j}, X_{2,j}, X_{3,j}, X_{4,j}, X_{5,j}, X_{6,j}, X_{7,j}, X_{8,j}, X_{9,j}, X_{10,j}, X_{11,j}, X_{12,j}, X_{13,j}$ and $P_{1,j}, P_{2,j}$, respectively.

A vector $u_j$, at time point j, is expressed $u_j=(X_{1,j}, X_{2,j}, X_{3,j}, X_{4,j}, X_{5,j}, X_{6,j}, X_{7,j}, X_{8,j}, X_{9,j}, X_{10,j}, X_{11,j}, X_{12,j}, X_{13,j}, P_{1,j}, P_{2,j})$.

Given a delay operator D, polynomial expressions of the information bits $X_1, X_2, X_3, X_4, X_5, X_6, X_7, X_8, X_9, X_{10}, X_{11}, X_{12}, X_{13}$ are $X_1(D), X_2(D), X_3(D), X_4(D), X_5(D), X_6(D), X_7(D), X_8(D), X_9(D), X_{10}(D), X_{11}(D), X_{12}(D), X_{13}(D)$, and polynomial expressions of the parity bits $P_1, P_2$ are $P_1(D), P_2(D)$.

Further, consideration is given to an LDPC-CC of coding rate 13/15 and time-varying period 2m that is based on a parity check polynomial.

The following mathematical expressions are provided as parity check polynomials satisfying zero for an LDPC-CC of coding rate 13/15 and time-varying period 2m that is based on a parity check polynomial.

First, because two parities $P_1$ and $P_2$ exist, parity check polynomials satisfying zero are provided as described in the following, two for $1\times P_1(D)$ and two for $1\times P_2(D)$.

[Math. 715-1]

$$\begin{aligned}&(D^{\alpha\#(2i),1,2}+D^{\alpha\#(2i),1,1}+1)X_1(D)+(D^{\alpha\#(2i),2,2}+D^{\alpha\#(2i),2,1}+1)X_2(D)+(D^{\alpha\#(2i),3,2}+D^{\alpha\#(2i),3,1}+1)X_3(D)+\\&(D^{\alpha\#(2i),4,2}+D^{\alpha\#(2i),4,1}+1)X_4(D)+(D^{\alpha\#(2i),5,2}+D^{\alpha\#(2i),5,1}+1)X_5(D)+(D^{\alpha\#(2i),6,2}+D^{\alpha\#(2i),6,1}+1)X_6(D)+\\&\left(\sum_{s=3}^{r\#(2i),7}D^{\alpha\#(2i),7,s}\right)X_7(D)+\left(\sum_{s=3}^{r\#(2i),8}D^{\alpha\#(2i),8,s}\right)X_8(D)+\left(\sum_{s=3}^{r\#(2i),9}D^{\alpha\#(2i),9,s}\right)X_9(D)+\left(\sum_{s=3}^{r\#(2i),10}D^{\alpha\#(2i),10,s}\right)X_{10}(D)+\\&\left(\sum_{s=3}^{r\#(2i),11}D^{\alpha\#(2i),11,s}\right)X_{11}(D)+\left(\sum_{s=3}^{r\#(2i),12}D^{\alpha\#(2i),12,s}\right)X_{12}(D)+\left(\sum_{s=3}^{r\#(2i),13}D^{\alpha\#(2i),13,s}\right)X_{13}(D)+P_1(D)+D^{\beta\#(2i),0}P_2(D)=\\&(D^{\alpha\#(2i),1,2}+D^{\alpha\#(2i),1,1}+1)X_1(D)+(D^{\alpha\#(2i),2,2}+D^{\alpha\#(2i),2,1}+1)X_2(D)+(D^{\alpha\#(2i),3,2}+D^{\alpha\#(2i),3,1}+1)X_3(D)+\\&(D^{\alpha\#(2i),4,2}+D^{\alpha\#(2i),4,1}+1)X_4(D)+(D^{\alpha\#(2i),5,2}+D^{\alpha\#(2i),5,1}+1)X_5(D)+(D^{\alpha\#(2i),6,2}+D^{\alpha\#(2i),6,1}+1)X_6(D)+\end{aligned}\quad(97\text{-}1\text{-}1)$$

-continued $$
\begin{aligned}
&(D^{\alpha\#(2i),7,r\#(2i),7}+\ldots+D^{\alpha\#(2i),7,3})X_7(D)+\\
&(D^{\alpha\#(2i),8,r\#(2i),8}+\ldots+D^{\alpha\#(2i),8,3})X_8(D)+\\
&(D^{\alpha\#(2i),9,r\#(2i),9}+\ldots+D^{\alpha\#(2i),9,3})X_9(D)+\\
&(D^{\alpha\#(2i),10,r\#(2i),10}+\ldots+D^{\alpha\#(2i),10,3})X_{10}(D)+\\
&(D^{\alpha\#(2i),11,r\#(2i),11}+\ldots+D^{\alpha\#(2i),11,3})X_{11}(D)+\\
&(D^{\alpha\#(2i),12,r\#(2i),12}+\ldots+D^{\alpha\#(2i),12,3})X_{12}(D)+\\
&(D^{\alpha\#(2i),13,r\#(2i),13}+\ldots+D^{\alpha\#(2i),13,3})X_{13}(D)+\\
&P_1+D^{\beta\#(2i),0}P_2(D)=0
\end{aligned}
$$

[Math. 715-2]

$$
\begin{aligned}
&(D^{\alpha\#(2i),1,2}+D^{\alpha\#(2i),1,1}+1)X_1(D)+\\
&(D^{\alpha\#(2i),2,2}+D^{\alpha\#(2i),2,1}+1)X_2(D)+\\
&(D^{\alpha\#(2i),3,2}+D^{\alpha\#(2i),3,1}+1)X_3(D)+\\
&(D^{\alpha\#(2i),4,2}+D^{\alpha\#(2i),4,1}+1)X_4(D)+\\
&(D^{\alpha\#(2i),5,2}+D^{\alpha\#(2i),5,1}+1)X_5(D)+\\
&(D^{\alpha\#(2i),6,2}+D^{\alpha\#(2i),6,1}+1)X_6(D)+\\
&\left(\sum_{s=3}^{r\#(2i),7}D^{\alpha\#(2i),7,s}\right)X_7(D)+\left(\sum_{s=3}^{r\#(2i),8}D^{\alpha\#(2i),8,s}\right)X_8(D)+\\
&\left(\sum_{s=3}^{r\#(2i),9}D^{\alpha\#(2i),9,s}\right)X_9(D)+\left(\sum_{s=3}^{r\#(2i),10}D^{\alpha\#(2i),10,s}\right)X_{10}(D)+\\
&\left(\sum_{s=3}^{r\#(2i),11}D^{\alpha\#(2i),11,s}\right)X_{11}(D)+\left(\sum_{s=3}^{r\#(2i),12}D^{\alpha\#(2i),12,s}\right)X_{12}(D)+\\
&\left(\sum_{s=3}^{r\#(2i),13}D^{\alpha\#(2i),13,s}\right)X_{13}(D)+P_1(D)+D^{\beta\#(2i),1}P_1(D)=\\
&(D^{\alpha\#(2i),1,2}+D^{\alpha\#(2i),1,1}+1)X_1(D)+\\
&(D^{\alpha\#(2i),2,2}+D^{\alpha\#(2i),2,1}+1)X_2(D)+\\
&(D^{\alpha\#(2i),3,2}+D^{\alpha\#(2i),3,1}+1)X_3(D)+\\
&(D^{\alpha\#(2i),4,2}+D^{\alpha\#(2i),4,1}+1)X_4(D)+\\
&(D^{\alpha\#(2i),5,2}+D^{\alpha\#(2i),5,1}+1)X_5(D)+\\
&(D^{\alpha\#(2i),6,2}+D^{\alpha\#(2i),6,1}+1)X_6(D)+\\
&(D^{\alpha\#(2i),7,r\#(2i),7}+\ldots+D^{\alpha\#(2i),7,3})X_7(D)+\\
&(D^{\alpha\#(2i),8,r\#(2i),8}+\ldots+D^{\alpha\#(2i),8,3})X_8(D)+\\
&(D^{\alpha\#(2i),9,r\#(2i),9}+\ldots+D^{\alpha\#(2i),9,3})X_9(D)+\\
&(D^{\alpha\#(2i),10,r\#(2i),10}+\ldots+D^{\alpha\#(2i),10,3})X_{10}(D)+\\
&(D^{\alpha\#(2i),11,r\#(2i),11}+\ldots+D^{\alpha\#(2i),11,3})X_{11}(D)+\\
&(D^{\alpha\#(2i),12,r\#(2i),12}+\ldots+D^{\alpha\#(2i),12,3})X_{12}(D)+\\
&(D^{\alpha\#(2i),13,r\#(2i),13}+\ldots+D^{\alpha\#(2i),13,3})X_{13}(D)+\\
&P_1+D^{\beta\#(2i),1}P_1(D)=0
\end{aligned}
\tag{97-1-2}
$$

[Math. 715-3]

$$
\begin{aligned}
&\left(\sum_{s=3}^{r\#(2i),1}D^{\alpha\#(2i),1,s}\right)X_1(D)+\left(\sum_{s=3}^{r\#(2i),2}D^{\alpha\#(2i),2,s}\right)X_2(D)+\\
&\left(\sum_{s=3}^{r\#(2i),3}D^{\alpha\#(2i),3,s}\right)X_3(D)+\left(\sum_{s=3}^{r\#(2i),4}D^{\alpha\#(2i),4,s}\right)X_4(D)+\\
&\left(\sum_{s=3}^{r\#(2i),5}D^{\alpha\#(2i),5,s}\right)X_5(D)+\left(\sum_{s=3}^{r\#(2i),6}D^{\alpha\#(2i),6,s}\right)X_6(D)+\\
&(D^{\alpha\#(2i),7,2}+D^{\alpha\#(2i),7,1}+1)X_7(D)+\\
&(D^{\alpha\#(2i),8,2}+D^{\alpha\#(2i),8,1}+1)X_8(D)+\\
&(D^{\alpha\#(2i),9,2}+D^{\alpha\#(2i),9,1}+1)X_9(D)+\\
&(D^{\alpha\#(2i),10,2}+D^{\alpha\#(2i),10,1}+1)X_{10}(D)+\\
&(D^{\alpha\#(2i),11,2}+D^{\alpha\#(2i),11,1}+1)X_{11}(D)+\\
&(D^{\alpha\#(2i),12,2}+D^{\alpha\#(2i),12,1}+1)X_{12}(D)+\\
&(D^{\alpha\#(2i),13,2}+D^{\alpha\#(2i),13,1}+1)X_{13}(D)+\\
&P_2(D)+D^{\beta\#(2i),2}P_1(D)=\\
&(D^{\alpha\#(2i),1,r\#(2i),1}+\ldots+D^{\alpha\#(2i),1,3})X_1(D)+\\
&(D^{\alpha\#(2i),2,r\#(2i),2}+\ldots+D^{\alpha\#(2i),2,3})X_2(D)+\\
&(D^{\alpha\#(2i),3,r\#(2i),3}+\ldots+D^{\alpha\#(2i),3,3})X_3(D)+\\
&(D^{\alpha\#(2i),4,r\#(2i),4}+\ldots+D^{\alpha\#(2i),4,3})X_4(D)+\\
&(D^{\alpha\#(2i),5,r\#(2i),5}+\ldots+D^{\alpha\#(2i),5,3})X_5(D)+\\
&(D^{\alpha\#(2i),6,r\#(2i),6}+\ldots+D^{\alpha\#(2i),6,3})X_6(D)+\\
&(D^{\alpha\#(2i),7,2}+D^{\alpha\#(2i),7,1}+1)X_7(D)+\\
&(D^{\alpha\#(2i),8,2}+D^{\alpha\#(2i),8,1}+1)X_8(D)+\\
&(D^{\alpha\#(2i),9,2}+D^{\alpha\#(2i),9,1}+1)X_9(D)+\\
&(D^{\alpha\#(2i),10,2}+D^{\alpha\#(2i),10,1}+1)X_{10}(D)+\\
&(D^{\alpha\#(2i),11,2}+D^{\alpha\#(2i),11,1}+1)X_{11}(D)+\\
&(D^{\alpha\#(2i),12,2}+D^{\alpha\#(2i),12,1}+1)X_{12}(D)+\\
&(D^{\alpha\#(2i),13,2}+D^{\alpha\#(2i),13,1}+1)X_{13}(D)+\\
&P_2(D)+D^{\beta\#(2i),2}P_1(D)=0
\end{aligned}
\tag{97-2-1}
$$

[Math. 715-4]

$$
\begin{aligned}
&\left(\sum_{s=3}^{r\#(2i),1}D^{\alpha\#(2i),1,s}\right)X_1(D)+\left(\sum_{s=3}^{r\#(2i),2}D^{\alpha\#(2i),2,s}\right)X_2(D)+\\
&\left(\sum_{s=3}^{r\#(2i),3}D^{\alpha\#(2i),3,s}\right)X_3(D)+\left(\sum_{s=3}^{r\#(2i),4}D^{\alpha\#(2i),4,s}\right)X_4(D)+\\
&\left(\sum_{s=3}^{r\#(2i),5}D^{\alpha\#(2i),5,s}\right)X_5(D)+\left(\sum_{s=3}^{r\#(2i),6}D^{\alpha\#(2i),6,s}\right)X_6(D)+\\
&(D^{\alpha\#(2i),7,2}+D^{\alpha\#(2i),7,1}+1)X_7(D)+\\
&(D^{\alpha\#(2i),8,2}+D^{\alpha\#(2i),8,1}+1)X_8(D)+\\
&(D^{\alpha\#(2i),9,2}+D^{\alpha\#(2i),9,1}+1)X_9(D)+\\
&(D^{\alpha\#(2i),10,2}+D^{\alpha\#(2i),10,1}+1)X_{10}(D)+\\
&(D^{\alpha\#(2i),11,2}+D^{\alpha\#(2i),11,1}+1)X_{11}(D)+\\
&(D^{\alpha\#(2i),12,2}+D^{\alpha\#(2i),12,1}+1)X_{12}(D)+\\
&(D^{\alpha\#(2i),13,2}+D^{\alpha\#(2i),13,1}+1)X_{13}(D)+\\
&P_2(D)+D^{\beta\#(2i),3}P_2(D)=\\
&(D^{\alpha\#(2i),1,r\#(2i),1}+\ldots+D^{\alpha\#(2i),1,3})X_1(D)+\\
&(D^{\alpha\#(2i),2,r\#(2i),2}+\ldots+D^{\alpha\#(2i),2,3})X_2(D)+\\
&(D^{\alpha\#(2i),3,r\#(2i),3}+\ldots+D^{\alpha\#(2i),3,3})X_3(D)+\\
&(D^{\alpha\#(2i),4,r\#(2i),4}+\ldots+D^{\alpha\#(2i),4,3})X_4(D)+\\
&(D^{\alpha\#(2i),5,r\#(2i),5}+\ldots+D^{\alpha\#(2i),5,3})X_5(D)+\\
&(D^{\alpha\#(2i),6,r\#(2i),6}+\ldots+D^{\alpha\#(2i),6,3})X_6(D)+\\
&(D^{\alpha\#(2i),7,2}+D^{\alpha\#(2i),7,1}+1)X_7(D)+\\
&(D^{\alpha\#(2i),8,2}+D^{\alpha\#(2i),8,1}+1)X_8(D)+\\
&(D^{\alpha\#(2i),9,2}+D^{\alpha\#(2i),9,1}+1)X_9(D)+\\
&(D^{\alpha\#(2i),10,2}+D^{\alpha\#(2i),10,1}+1)X_{10}(D)+\\
&(D^{\alpha\#(2i),11,2}+D^{\alpha\#(2i),11,1}+1)X_{11}(D)+\\
&(D^{\alpha\#(2i),12,2}+D^{\alpha\#(2i),12,1}+1)X_{12}(D)+\\
&(D^{\alpha\#(2i),13,2}+D^{\alpha\#(2i),13,1}+1)X_{13}(D)+\\
&P_2(D)+D^{\beta\#(2i),3}P_2(D)=0
\end{aligned}
\tag{97-2-2}
$$

In expressions (97-1-1), (97-1-2), (97-2-1), (97-2-2), i is an integer no smaller than zero and no greater than m−1 (i=0, 1, . . . , m−2, m−1).

In expressions (97-1-1), (97-1-2), (97-2-1), (97-2-2), $\alpha_{\#(2i),p,q}$ (where p is an integer no smaller than one and no greater than thirteen, q is an integer no smaller than one and no greater than $r_{\#(2i),p}$ (where $r_{\#(2i),p}$ is a natural number)) and $\beta_{\#(2i),0}$ is a natural number, $\beta_{\#(2i),1}$ is a natural number, $\beta_{\#(2i),2}$ is an integer no smaller than zero, and $\beta_{\#(2i),3}$ is a natural number.

Further, y is an integer no smaller than one and no greater than $r_{\#(2i),p}$, z is an integer no smaller than one and no greater than $r_{\#2i,p}$, and $\alpha_{\#(2i),p,y}\neq\alpha_{\#(2i),p,z}$ holds true for $\forall(y, z)$ where y≠z. ∀ is a universal quantifier. (y is an integer no smaller than one and no greater than $r_{\#(2i),p,z}$ is an integer no smaller than one and no greater than $r_{\#2i,p}$, and $\alpha_{\#(2i),p,y} \neq \alpha_{\#(2i),p,z}$ holds true for all y and all z satisfying y≠z.)

Note that in the following, to simplify explanation, a parity check polynomial satisfying zero that is expressed by expression (97-1-1) or expression (97-1-2) is referred to as "#(2i); first expression" for realizing a time-varying period 2m, and a parity check polynomial satisfying zero that is expressed by expression (97-2-1) or expression (97-2-2) is referred to as "#(2i); second expression" for realizing a time-varying period 2m.

Thus, for each i, as #(2i); first expression for realizing a time-varying period 2m, a parity check polynomial satisfying zero expressed by either expression (97-1-1) or expression (97-1-2) is prepared.

That is, for i=0, a parity check polynomial satisfying zero provided by expression (97-1-1) where i=0, or a parity check polynomial satisfying zero provided by expression (97-1-2) where i=0 is prepared.

Similarly:

for i=1, a parity check polynomial satisfying zero provided by expression (97-1-1) where i=1, or a parity check polynomial satisfying zero provided by expression (97-1-2) where i=1 is prepared;

for i=2, a parity check polynomial satisfying zero provided by expression (97-1-1) where i=2, or a parity check polynomial satisfying zero provided by expression (97-1-2) where i=2 is prepared;

⋮ for i=z, a parity check polynomial satisfying zero provided by expression (97-1-1) where i=z, or a parity check polynomial satisfying zero provided by expression (97-1-2) where i=z is prepared (where z is an integer no smaller than zero and no greater than m−1); and

⋮ for i=m−1, a parity check polynomial satisfying zero provided by expression (97-1-1) where i=m−1, or a parity check polynomial satisfying zero provided by expression (97-1-2) where i=m−1 is prepared.

Similarly, for each i, as #(2i); second expression for realizing a time-varying period 2m, a parity check polynomial satisfying zero expressed by either expression (97-2-1) or expression (97-2-2) is prepared.

That is, for i=0, a parity check polynomial satisfying zero provided by expression (97-2-1) where i=0, or a parity check polynomial satisfying zero provided by expression (97-2-2) where i=0 is prepared.

Similarly:

for i=1, a parity check polynomial satisfying zero provided by expression (97-2-1) where i=1, or a parity check polynomial satisfying zero provided by expression (97-2-2) where i=1 is prepared;

for i=2, a parity check polynomial satisfying zero provided by expression (97-2-1) where i=2, or a parity check polynomial satisfying zero provided by expression (97-2-2) where i=2 is prepared;

⋮ for i=z, a parity check polynomial satisfying zero provided by expression (97-2-1) where i=z, or a parity check polynomial satisfying zero provided by expression (97-2-2) where i=z is prepared (where z is an integer no smaller than zero and no greater than m−1); and

⋮ for i=m−1, a parity check polynomial satisfying zero provided by expression (97-2-1) where i=m−1, or a parity check polynomial satisfying zero provided by expression (97-2-2) where i=m−1 is prepared.

Similarly, because two parities $P_1$ and $P_2$ exist, parity check polynomials satisfying zero are provided as described in the following, two for $1 \times P_1(D)$ and two for $1 \times P_2(D)$.

[Math. 716-1]

$$\begin{aligned}
&\left(\sum_{s=3}^{r\#(2i+1),1} D^{\alpha\#(2i+1),1,s}\right)X_1(D) + \left(\sum_{s=3}^{r\#(2i+1),2} D^{\alpha\#(2i+1),2,s}\right)X_2(D) + \\
&\left(\sum_{s=3}^{r\#(2i+1),3} D^{\alpha\#(2i+1),3,s}\right)X_3(D) + \left(\sum_{s=3}^{r\#(2i+1),4} D^{\alpha\#(2i+1),4,s}\right)X_4(D) + \\
&\left(\sum_{s=3}^{r\#(2i+1),5} D^{\alpha\#(2i+1),5,s}\right)X_5(D) + \left(\sum_{s=3}^{r\#(2i+1),6} D^{\alpha\#(2i+1),6,s}\right)X_6(D) + \\
&(D^{\alpha\#(2i+1),7,2} + D^{\alpha\#(2i+1),7,1} + 1)X_7(D) + \\
&(D^{\alpha\#(2i+1),8,2} + D^{\alpha\#(2i+1),8,1} + 1)X_8(D) + \\
&(D^{\alpha\#(2i+1),9,2} + D^{\alpha\#(2i+1),9,1} + 1)X_9(D) + \\
&(D^{\alpha\#(2i+1),10,2} + D^{\alpha\#(2i+1),10,1} + 1)X_{10}(D) + \\
&(D^{\alpha\#(2i+1),11,2} + D^{\alpha\#(2i+1),11,1} + 1)X_{11}(D) + \\
&(D^{\alpha\#(2i+1),12,2} + D^{\alpha\#(2i+1),12,1} + 1)X_{12}(D) + \\
&(D^{\alpha\#(2i+1),13,2} + D^{\alpha\#(2i+1),13,1} + 1)X_{13}(D) + \\
&P_1(D) + D^{\beta\#(2i+1),0}P_2(D) = \\
&(D^{\alpha\#(2i+1),1}r\#(2i+1),1 + \ldots + D^{\alpha\#(2i+1),1,3})X_1(D) + \\
&(D^{\alpha\#(2i+1),2,}r\#(2i+1),2 + \ldots + D^{\alpha\#(2i+1),2,3})X_2(D) + \\
&(D^{\alpha\#(2i+1),3}r\#(2i+1),3 + \ldots + D^{\alpha\#(2i+1),3,3})X_3(D) + \\
&(D^{\alpha\#(2i+1),4,}r\#(2i+1),4 + \ldots + D^{\alpha\#(2i+1),4,3})X_4(D) + \\
&(D^{\alpha\#(2i+1),5}r\#(2i+1),5 + \ldots + D^{\alpha\#(2i+1),5,3})X_5(D) + \\
&(D^{\alpha\#(2i+1),6,}r\#(2i+1),6 + \ldots + D^{\alpha\#(2i+1),6,3})X_6(D) + \\
&(D^{\alpha\#(2i+1),7,2} + D^{\alpha\#(2i+1),7,1} + 1)X_7(D) + \\
&(D^{\alpha\#(2i+1),8,2} + D^{\alpha\#(2i+1),8,1} + 1)X_8(D) + \\
&(D^{\alpha\#(2i+1),9,2} + D^{\alpha\#(2i+1),9,1} + 1)X_9(D) + \\
&(D^{\alpha\#(2i+1),10,2} + D^{\alpha\#(2i+1),10,1} + 1)X_{10}(D) + \\
&(D^{\alpha\#(2i+1),11,2} + D^{\alpha\#(2i+1),11,1} + 1)X_{11}(D) + \\
&(D^{\alpha\#(2i+1),12,2} + D^{\alpha\#(2i+1),12,1} + 1)X_{12}(D) + \\
&(D^{\alpha\#(2i+1),13,2} + D^{\alpha\#(2i+1),13,1} + 1)X_{13}(D) + \\
&P_1(D) + D^{\beta\#(2i+1),0}P_2(D) = 0
\end{aligned} \tag{98-1-1}$$

[Math. 716-2]

$$\begin{aligned}
&\left(\sum_{s=3}^{r\#(2i+1),1} D^{\alpha\#(2i+1),1,s}\right)X_1(D) + \left(\sum_{s=3}^{r\#(2i+1),2} D^{\alpha\#(2i+1),2,s}\right)X_2(D) + \\
&\left(\sum_{s=3}^{r\#(2i+1),3} D^{\alpha\#(2i+1),3,s}\right)X_3(D) + \left(\sum_{s=3}^{r\#(2i+1),4} D^{\alpha\#(2i+1),4,s}\right)X_4(D) + \\
&\left(\sum_{s=3}^{r\#(2i+1),5} D^{\alpha\#(2i+1),5,s}\right)X_5(D) + \left(\sum_{s=3}^{r\#(2i+1),6} D^{\alpha\#(2i+1),6,s}\right)X_6(D) + \\
&(D^{\alpha\#(2i+1),7,2} + D^{\alpha\#(2i+1),7,1} + 1)X_7(D) + \\
&(D^{\alpha\#(2i+1),8,2} + D^{\alpha\#(2i+1),8,1} + 1)X_8(D) + \\
&(D^{\alpha\#(2i+1),9,2} + D^{\alpha\#(2i+1),9,1} + 1)X_9(D) + \\
&(D^{\alpha\#(2i+1),10,2} + D^{\alpha\#(2i+1),10,1} + 1)X_{10}(D) + \\
&(D^{\alpha\#(2i+1),11,2} + D^{\alpha\#(2i+1),11,1} + 1)X_{11}(D) + \\
&(D^{\alpha\#(2i+1),12,2} + D^{\alpha\#(2i+1),12,1} + 1)X_{12}(D) + \\
&(D^{\alpha\#(2i+1),13,2} + D^{\alpha\#(2i+1),13,1} + 1)X_{13}(D) + \\
&P_1(D) + D^{\beta\#(2i+1),1}P_1(D) = \\
&(D^{\alpha\#(2i+1),1}r\#(2i+1),1 + \ldots + D^{\alpha\#(2i+1),1,3})X_1(D) + \\
&(D^{\alpha\#(2i+1),2,}r\#(2i+1),2 + \ldots + D^{\alpha\#(2i+1),2,3})X_2(D) + \\
&(D^{\alpha\#(2i+1),3}r\#(2i+1),3 + \ldots + D^{\alpha\#(2i+1),3,3})X_3(D) + \\
&(D^{\alpha\#(2i+1),4,}r\#(2i+1),4 + \ldots + D^{\alpha\#(2i+1),4,3})X_4(D) + \\
&(D^{\alpha\#(2i+1),5}r\#(2i+1),5 + \ldots + D^{\alpha\#(2i+1),5,3})X_5(D) + \\
&(D^{\alpha\#(2i+1),6,}r\#(2i+1),6 + \ldots + D^{\alpha\#(2i+1),6,3})X_6(D) +
\end{aligned} \tag{98-1-2}$$

-continued $$(D^{\alpha\#(2i+1),7,2}+D^{\alpha\#(2i+1),7,1}+1)X_7(D)+$$
$$(D^{\alpha\#(2i+1),8,2}+D^{\alpha\#(2i+1),8,1}+1)X_8(D)+$$
$$(D^{\alpha\#(2i+1),9,2}+D^{\alpha\#(2i+1),9,1}+1)X_9(D)+$$
$$(D^{\alpha\#(2i+1),10,2}+D^{\alpha\#(2i+1),10,1}+1)X_{10}(D)+$$
$$(D^{\alpha\#(2i+1),11,2}+D^{\alpha\#(2i+1),11,1}+1)X_{11}(D)+$$
$$(D^{\alpha\#(2i+1),12,2}+D^{\alpha\#(2i+1),12,1}+1)X_{12}(D)+$$
$$(D^{\alpha\#(2i+1),13,2}+D^{\alpha\#(2i+1),13,1}+1)X_{13}(D)+$$
$$P_1(D)+D^{\beta\#(2i+1),1}P_1(D)=0$$

[Math. 716-3]

$$(D^{\alpha\#(2i+1),1,2}+D^{\alpha\#(2i+1),1,1}+1)X_1(D)+ \qquad (98\text{-}2\text{-}1)$$
$$(D^{\alpha\#(2i+1),2,2}+D^{\alpha\#(2i+1),2,1}+1)X_2(D)+$$
$$(D^{\alpha\#(2i+1),3,2}+D^{\alpha\#(2i+1),3,1}+1)X_3(D)+$$
$$(D^{\alpha\#(2i+1),4,2}+D^{\alpha\#(2i+1),4,1}+1)X_4(D)+$$
$$(D^{\alpha\#(2i+1),5,2}+D^{\alpha\#(2i+1),5,1}+1)X_5(D)+$$
$$(D^{\alpha\#(2i+1),6,2}+D^{\alpha\#(2i+1),6,1}+1)X_6(D)+$$
$$\left(\sum_{s=3}^{r\#(2i+1),7}D^{\alpha\#(2i+1),7,s}\right)X_7(D)+$$
$$\left(\sum_{s=3}^{r\#(2i+1),8}D^{\alpha\#(2i+1),8,s}\right)X_8(D)+$$
$$\left(\sum_{s=3}^{r\#(2i+1),9}D^{\alpha\#(2i+1),9,s}\right)X_9(D)+\left(\sum_{s=3}^{r\#(2i+1),10}D^{\alpha\#(2i+1),10,s}\right)X_{10}(D)+$$
$$\left(\sum_{s=3}^{r\#(2i+1),11}D^{\alpha\#(2i+1),11,s}\right)X_{11}(D)+$$
$$\left(\sum_{s=3}^{r\#(2i+1),12}D^{\alpha\#(2i+1),12,s}\right)X_{12}(D)+$$
$$\left(\sum_{s=3}^{r\#(2i+1),13}D^{\alpha\#(2i+1),13,s}\right)X_{13}(D)+P_2(D)+D^{\beta\#(2i+1),2}P_1(D)=$$

$$(D^{\alpha\#(2i+1),1,2}+D^{\alpha\#(2i+1),1,1}+1)X_1(D)+$$
$$(D^{\alpha\#(2i+1),2,2}+D^{\alpha\#(2i+1),2,1}+1)X_2(D)+$$
$$(D^{\alpha\#(2i+1),3,2}+D^{\alpha\#(2i+1),3,1}+1)X_3(D)+$$
$$(D^{\alpha\#(2i+1),4,2}+D^{\alpha\#(2i+1),4,1}+1)X_4(D)+$$
$$(D^{\alpha\#(2i+1),5,2}+D^{\alpha\#(2i+1),5,1}+1)X_5(D)+$$
$$(D^{\alpha\#(2i+1),6,2}+D^{\alpha\#(2i+1),6,1}+1)X_6(D)+$$

$$(D^{\alpha\#(2i+1),7,}r\#(2i+1),7+\dots+D^{\alpha\#(2i+1),7,3})X_7(D)+$$
$$(D^{\alpha\#(2i+1),8,}r\#(2i+1),8+\dots+D^{\alpha\#(2i+1),8,3})X_8(D)+$$
$$(D^{\alpha\#(2i+1),9,}r\#(2i+1),9+\dots+D^{\alpha\#(2i+1),9,3})X_9(D)+$$
$$(D^{\alpha\#(2i+1),10,}r\#(2i+1),10+\dots+D^{\alpha\#(2i+1),10,3})X_{10}(D)+$$
$$(D^{\alpha\#(2i+1),11,}r\#(2i+1),11+\dots+D^{\alpha\#(2i+1),11,3})X_{11}(D)+$$
$$(D^{\alpha\#(2i+1),12,}r\#(2i+1),12+\dots+D^{\alpha\#(2i+1),12,3})X_{12}(D)+$$
$$(D^{\alpha\#(2i+1),13,}r\#(2i+1),13+\dots+D^{\alpha\#(2i+1),13,3})X_{13}(D)+$$
$$P_2(D)+D^{\beta\#(2i+1),2}P_1(D)=0$$

[Math. 716-4]

$$(D^{\alpha\#(2i+1),1,2}+D^{\alpha\#(2i+1),1,1}+1)X_1(D)+ \qquad (98\text{-}2\text{-}2)$$
$$(D^{\alpha\#(2i+1),2,2}+D^{\alpha\#(2i+1),2,1}+1)X_2(D)+$$
$$(D^{\alpha\#(2i+1),3,2}+D^{\alpha\#(2i+1),3,1}+1)X_3(D)+$$
$$(D^{\alpha\#(2i+1),4,2}+D^{\alpha\#(2i+1),4,1}+1)X_4(D)+$$
$$(D^{\alpha\#(2i+1),5,2}+D^{\alpha\#(2i+1),5,1}+1)X_5(D)+$$
$$(D^{\alpha\#(2i+1),6,2}+D^{\alpha\#(2i+1),6,1}+1)X_6(D)+$$
$$\left(\sum_{s=3}^{r\#(2i+1),7}D^{\alpha\#(2i+1),7,s}\right)X_7(D)+$$

-continued $$\left(\sum_{s=3}^{r\#(2i+1),8}D^{\alpha\#(2i+1),8,s}\right)X_8(D)+$$
$$\left(\sum_{s=3}^{r\#(2i+1),9}D^{\alpha\#(2i+1),9,s}\right)X_9(D)+\left(\sum_{s=3}^{r\#(2i+1),10}D^{\alpha\#(2i+1),10,s}\right)X_{10}(D)+$$
$$\left(\sum_{s=3}^{r\#(2i+1),11}D^{\alpha\#(2i+1),11,s}\right)X_{11}(D)+$$
$$\left(\sum_{s=3}^{r\#(2i+1),12}D^{\alpha\#(2i+1),12,s}\right)X_{12}(D)+$$
$$\left(\sum_{s=3}^{r\#(2i+1),13}D^{\alpha\#(2i+1),13,s}\right)X_{13}(D)+P_2(D)+D^{\beta\#(2i+1),3}P_2(D)=$$

$$(D^{\alpha\#(2i+1),1,2}+D^{\alpha\#(2i+1),1,1}+1)X_1(D)+$$
$$(D^{\alpha\#(2i+1),2,2}+D^{\alpha\#(2i+1),2,1}+1)X_2(D)+$$
$$(D^{\alpha\#(2i+1),3,2}+D^{\alpha\#(2i+1),3,1}+1)X_3(D)+$$
$$(D^{\alpha\#(2i+1),4,2}+D^{\alpha\#(2i+1),4,1}+1)X_4(D)+$$
$$(D^{\alpha\#(2i+1),5,2}+D^{\alpha\#(2i+1),5,1}+1)X_5(D)+$$
$$(D^{\alpha\#(2i+1),6,2}+D^{\alpha\#(2i+1),6,1}+1)X_6(D)+$$

$$(D^{\alpha\#(2i+1),7,}r\#(2i+1),7+\dots+D^{\alpha\#(2i+1),7,3})X_7(D)+$$
$$(D^{\alpha\#(2i+1),8,}r\#(2i+1),8+\dots+D^{\alpha\#(2i+1),8,3})X_8(D)+$$
$$(D^{\alpha\#(2i+1),9,}r\#(2i+1),9+\dots+D^{\alpha\#(2i+1),9,3})X_9(D)+$$
$$(D^{\alpha\#(2i+1),10,}r\#(2i+1),10+\dots+D^{\alpha\#(2i+1),10,3})X_{10}(D)+$$
$$(D^{\alpha\#(2i+1),11,}r\#(2i+1),11+\dots+D^{\alpha\#(2i+1),11,3})X_{11}(D)+$$
$$(D^{\alpha\#(2i+1),12,}r\#(2i+1),12+\dots+D^{\alpha\#(2i+1),12,3})X_{12}(D)+$$
$$(D^{\alpha\#(2i+1),13,}r\#(2i+1),13+\dots+D^{\alpha\#(2i+1),13,3})X_{13}(D)+$$
$$P_2(D)+D^{\beta\#(2i+1),3}P_2(D)=0$$

In expressions (98-1-1), (98-1-2), (98-2-1), (98-2-2), i is an integer no smaller than zero and no greater than m−1 (i=0, 1, . . . , m−2, m−1).

In expressions (98-1-1), (98-1-2), (98-2-1), (98-2-2), $\alpha_{\#(2i+1),p,q}$ (where p is an integer no smaller than one and no greater than thirteen, q is an integer no smaller than one and no greater than $r_{\#(2i+14}$ (where $r_{\#(2i+14}$ is a natural number)) and $\beta_{\#(2i+1),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, y is an integer no smaller than one and no greater than $r_{\#(2i+i),p}$, z is an integer no smaller than one and no greater than $r_{\#(2i+1),p}$, and $\alpha_{\#(2i),p,y}\neq\alpha_{\#(2i),p,z}$ holds true for $\forall$(y, z) where y≠z. $\forall$ is a universal quantifier. (y is an integer no smaller than one and no greater than $r_{\#(2i+1),p}$, z is an integer no smaller than one and no greater than $r_{\#(2i+1),p}$, and $\alpha_{\#(2i+1),p,y}\neq\alpha_{\#(2i+1),p,z}$ holds true for all y and all z satisfying y≠z.)

Note that in the following, to simplify explanation, a parity check polynomial satisfying zero that is expressed by expression (98-1-1) or expression (98-1-2) is referred to as "#(2i+1); first expression" for realizing a time-varying period 2m, and a parity check polynomial satisfying zero that is expressed by expression (98-2-1) or expression (98-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (98-1-1) or expression (98-1-2) is prepared.

That is, for i=0, a parity check polynomial satisfying zero provided by expression (98-1-1) where i=0, or a parity check polynomial satisfying zero provided by expression (98-1-2) where i=0 is prepared.

Similarly:

for i=1, a parity check polynomial satisfying zero provided by expression (98-1-1) where i=1, or a parity check polynomial satisfying zero provided by expression (98-1-2) where i=1 is prepared;

for i=2, a parity check polynomial satisfying zero provided by expression (98-1-1) where i=2, or a parity check polynomial satisfying zero provided by expression (98-1-2) where i=2 is prepared;

⋮ for i=z, a parity check polynomial satisfying zero provided by expression (98-1-1) where i=z, or a parity check polynomial satisfying zero provided by expression (98-1-2) where i=z is prepared (where z is an integer no smaller than zero and no greater than m−1); and

⋮ for i=m−1, a parity check polynomial satisfying zero provided by expression (98-1-1) where i=m−1, or a parity check polynomial satisfying zero provided by expression (98-1-2) where i=m−1 is prepared.

Similarly, for each i, as #(2i+1); second expression for realizing a time-varying period 2m, a parity check polynomial satisfying zero expressed by either expression (98-2-1) or expression (98-2-2) is prepared.

That is, for i=0, a parity check polynomial satisfying zero provided by expression (98-2-1) where i=0, or a parity check polynomial satisfying zero provided by expression (98-2-2) where i=0 is prepared.

Similarly:

for i=1, a parity check polynomial satisfying zero provided by expression (98-2-1) where i=1, or a parity check polynomial satisfying zero provided by expression (98-2-2) where i=1 is prepared;

for i=2, a parity check polynomial satisfying zero provided by expression (98-2-1) where i=2, or a parity check polynomial satisfying zero provided by expression (98-2-2) where i=2 is prepared;

⋮ for i=z, a parity check polynomial satisfying zero provided by expression (98-2-1) where i=z, or a parity check polynomial satisfying zero provided by expression (98-2-2) where i=z is prepared (where z is an integer no smaller than zero and no greater than m−1); and

⋮ for i=m−1, a parity check polynomial satisfying zero provided by expression (98-2-1) where i=m−1, or a parity check polynomial satisfying zero provided by expression (98-2-2) where i=m−1 is prepared.

As such, an LDPC-CC of coding rate 13/15 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (97-1-1) or expression (97-1-2), parity check polynomials satisfying zero provided by expression (97-2-1) or expression (97-2-2), parity check polynomials satisfying zero provided by expression (98-1-1) or expression (98-1-2), and parity check polynomials satisfying zero provided by expression (98-2-1) or expression (98-2-2).

For example, the time varying period 2×m can be formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expressions (97-1-1), (97-1-2), (97-2-1), (97-2-2), (98-1-1), (98-1-2), (98-2-1), and (98-2-2) (where j is an integer no smaller than zero).

The following presumes that 2k=j%2m holds true. In the following, % means a modulo, and for example, $\alpha\%6$ represents a remainder after dividing $\alpha$ by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

The following describes a method of configuring a parity check matrix for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a vector $u_j$ at time point j is expressed as $u_j=(X_{1,j}, X_{2,j}, X_{3,j}, X_{4,j}, X_{5,j}, X_{6,j}, X_{7,j}, X_{8,j}, X_{9,j}, X_{10,j}, X_{11,j}, X_{12,j}, X_{13,j}, P_{1,j}, P_{2,j})$ (where j is an integer no smaller than zero). In the following, a case where u is a transmission vector is considered. Note that in the following, j is an integer no smaller than one, and thus j differs between the description having been provided above and the description provided in the following. (j is set as such to facilitate understanding of the correspondence between the column numbers and the row numbers of the parity check matrix.)

Accordingly, $u=(u_1, u_2, u_3, \ldots, u_{y-1}, u_y, u_{y+1}, \ldots)^T=(X_{1,1}, X_{2,1}, X_{3,1}, X_{4,1}, X_{5,1}, X_{6,1}, X_{7,1}, X_{8,1}, X_{9,1}, X_{10,1}, X_{11,1}, X_{12,1}, X_{13,1}, P_{1,1}, P_{2,1}, X_{1,2}, X_{2,2}, X_{3,2}, X_{4,2}, X_{5,2}, X_{6,2}, X_{7,2}, X_{8,2}, X_{9,2}, X_{10,2}, X_{11,2}, X_{12,2}, X_{13,2}, P_{1,2}, P_{2,2}, X_{1,3}, X_{2,3}, X_{3,3}, X_{4,3}, X_{5,3}, X_{6,3}, X_{7,3}, X_{8,3}, X_{9,3}, X_{10,3}, X_{11,3}, X_{12,3}, X_{13,3}, P_{1,3}, P_{2,3}, \ldots, X_{1,y-1}, X_{2,y-1}, X_{3,y-1}, X_{4,y-1}, X_{5,y-1}, X_{6,y-1}, X_{7,y-1}, X_{8,y-1}, X_{9,y-1}, X_{10,y-1}, X_{11,y-1}, X_{12,y-1}, X_{13,y-1}, P_{1,y-1}, P_{2,y-1}, X_{1,y}, X_{2,y}, X_{3,y}, X_{4,y}, X_{5,y}, X_{6,y}, X_{7,y}, X_{8,y}, X_{9,y}, X_{10,y}, X_{11,y}, X_{12,y}, X_{13,y}, P_{1,y}, P_{2,y}, X_{1,y+1}, X_{2,y+1}, X_{3,y+1}, X_{4,y+1}, X_{5,y+1}, X_{6,y+1}, X_{7,y+1}, X_{8,y+1}, X_{9,y+1}, X_{10,y+1}, X_{11,y+1}, X_{12,y+1}, X_{13,y+1}, P_{1,y+1}, P_{2,y+1}, \ldots)^T$. Further, when using H to denote a parity check matrix for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i);

first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, Hu=0 holds true (here, Hu=0 indicates that all elements of the vector Hu are zeroes).

FIG. 93 indicates a configuration of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the topmost row of the parity check matrix is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

As illustrated in FIG. 93:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression"; and "a vector for the (2×i)th row of the parity check matrix H can be generated from a parity check polynomial satisfying zero of #((i−1)%2m); second expression", and so on (where i is an integer no smaller than one).

FIG. 94 indicates a configuration of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the leftmost column of the parity check matrix is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

As illustrated in FIG. 94:

"a vector for the first column of the parity check matrix H is related to $X_1$ at time point 1";

"a vector for the second column of the parity check matrix H is related to $X_2$ at time point 1";

"a vector for the third column of the parity check matrix H is related to $X_3$ at time point 1";

"a vector for the fourth column of the parity check matrix H is related to $X_4$ at time point 1";

"a vector for the fifth column of the parity check matrix H is related to $X_5$ at time point 1";

"a vector for the sixth column of the parity check matrix H is related to $X_6$ at time point 1";

"a vector for the seventh column of the parity check matrix H is related to $X_7$ at time point 1";

"a vector for the eighth column of the parity check matrix H is related to $X_8$ at time point 1";

"a vector for the ninth column of the parity check matrix H is related to $X_9$ at time point 1";

"a vector for the tenth column of the parity check matrix H is related to $X_{10}$ at time point 1";

"a vector for the eleventh column of the parity check matrix H is related to $X_{11}$ at time point 1";

"a vector for the twelfth column of the parity check matrix H is related to $X_{12}$ at time point 1";

"a vector for the thirteenth column of the parity check matrix H is related to $X_{13}$ at time point 1";

"a vector for the fourteenth column of the parity check matrix H is related to $P_1$ at time point 1";

"a vector for the fifteenth column of the parity check matrix H is related to $P_2$ at time point 1";

⋮

"a vector for the 15×(j−1)+1th column of the parity check matrix H is related to $X_1$ at time point j";

"a vector for the 15×(j−1)+2th column of the parity check matrix H is related to $X_2$ at time point j";

"a vector for the 15×(j−1)+3th column of the parity check matrix H is related to $X_3$ at time point j";

"a vector for the 15×(j−1)+4th column of the parity check matrix H is related to $X_4$ at time point j";

"a vector for the 15×(j−1)+5th column of the parity check matrix H is related to $X_5$ at time point j";

"a vector for the 15×(j−1)+6th column of the parity check matrix H is related to $X_6$ at time point j";

"a vector for the 15×(j−1)+7th column of the parity check matrix H is related to $X_7$ at time point j";

"a vector for the 15×(j−1)+8th column of the parity check matrix H is related to $X_8$ at time point j";

"a vector for the 15×(j−1)+9th column of the parity check matrix H is related to $X_9$ at time point j";

"a vector for the 15×(j−1)+10th column of the parity check matrix H is related to $X_{10}$ at time point j";

"a vector for the 15×(j−1)+11h column of the parity check matrix H is related to $X_{11}$ at time point j";

"a vector for the 15×(j−1)+12th column of the parity check matrix H is related to $X_{12}$ at time point j";

"a vector for the 15×(j−1)+13th column of the parity check matrix H is related to $X_{13}$ at time point j";

"a vector for the 15×(j−1)+14th column of the parity check matrix H is related to $P_1$ at time point j";

"a vector for the 15×(j−1)+15th column of the parity check matrix H is related to $P_2$ at time point j"; and so on (where j is an integer no smaller than one).

Figure 95:
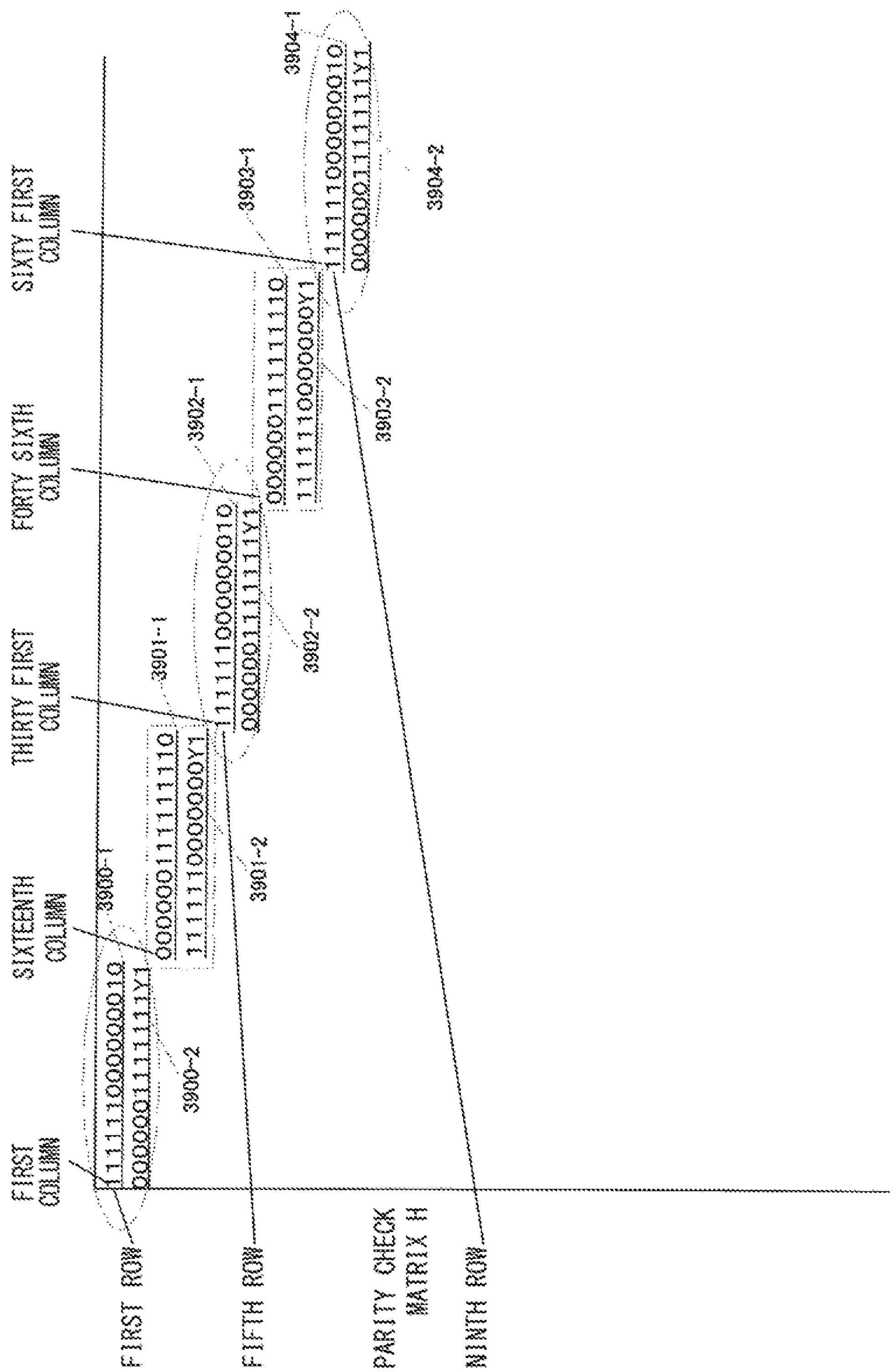
FIG. 95 shows an example of the configuration of check matrix for LDPC-CC of coding rate 13/15 and time-varying period 2×m that is based on a parity check polynomial.

FIG. 95 indicates a parity check matrix for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The following focuses on $1\times X_1(D)$, $1\times X_2(D)$, $1\times X_3(D)$, $1\times X_4(D)$, $1\times X_5(D)$, $1\times X_6(D)$, $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$, $1\times P_1(D)$, $1\times P_2(D)$ in the parity check matrix for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The parity check polynomials at time point j=1 are parity check polynomials when i=0 in expressions (97-1-1), (97-1-2), (97-2-1), (97-2-2).

A vector for the first row in FIG. 95 can be generated from a parity check polynomial when i=0 in expression (97-1-1) or expression (97-1-2) (refer to FIG. 93).

In expressions (97-1-1) and (97-1-2):

- terms for $1\times X_1(D)$, $1\times X_2(D)$, $1\times X_3(D)$, $1\times X_4(D)$, $1\times X_5(D)$, $1\times X_6(D)$ exist;
- terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ do not exist; and
- a term for $1\times P_1(D)$ exists but a term for $1\times P_2(D)$ does not exist.

Further, the relationship between column numbers and $X_1$, $X_2$, $X_3$, $X_4$, $X_5$, $X_6$, $X_7$, $X_8$, $X_9$, $X_{10}$, $X_{11}$, $X_{12}$, $X_{13}$, $P_1$, $P_2$ is as indicated in FIG. 94. Based on the relationship indicated in FIG. 94 and the fact that terms for $1\times X_1(D)$, $1\times X_2(D)$, $1\times X_3(D)$, $1\times X_4(D)$, $1\times X_5(D)$, $1\times X_6(D)$ exist, columns related to $X_1$, $X_2$, $X_3$, $X_4$, $X_5$, $X_6$ in the vector for the first row in FIG. 95 are "1". Further, based on the relationship indicated in FIG. 94 and the fact that terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ do not exist, columns related to $X_7$, $X_8$, $X_9$, $X_{10}$, $X_{11}$, $X_{12}$, $X_{13}$ in the vector for the first row in FIG. 95 are "0". In addition, based on the relationship indicated in FIG. 94 and the fact that a term for $1\times P_1(D)$ exists but a term for $1\times P_2(D)$ does not exist, a column related to $P_1$ in the vector for the first row in FIG. 95 is "1", and a column related to $P_2$ in the vector for the first row in FIG. 95 is "0".

As such, the vector for the first row in FIG. 95 is "111111000000010", as indicated by 3900-1 in FIG. 95.

A vector for the second row in FIG. 95 can be generated from a parity check polynomial when i=0 in expression (97-2-1) or expression (97-2-2) (refer to FIG. 93).

In expressions (97-2-1) and (97-2-2):

- terms for $1\times X_1(D)$, $1\times X_2(D)$, $1\times X_3(D)$, $1\times X_4(D)$, $1\times X_5(D)$, $1\times X_6(D)$ do not exist;
- terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ exist; and
- a term for $1\times P_1(D)$ may or may not exist but a term for $1\times P_2(D)$ exists.

Further, the relationship between column numbers and $X_1$, $X_2$, $X_3$, $X_4$, $X_5$, $X_6$, $X_7$, $X_8$, $X_9$, $X_{10}$, $X_{11}$, $X_{12}$, $X_{13}$, $P_1$, $P_2$ is as indicated in FIG. 94. Based on the relationship indicated in FIG. 94 and the fact that terms for $1\times X_1(D)$, $1\times X_2(D)$, $1\times X_3(D)$, $1\times X_4(D)$, $1\times X_5(D)$, $1\times X_6(D)$ do not exist, columns related to $X_1$, $X_2$, $X_3$, $X_4$, $X_5$, $X_6$ in the vector for the second row in FIG. 95 are "0". Further, based on the relationship indicated in FIG. 94 and the fact that terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ exist, columns related to $X_7$, $X_8$, $X_9$, $X_{10}$, $X_{11}$, $X_{12}$, $X_{13}$ in the vector for the second row in FIG. 95 are "1". In addition, based on the relationship indicated in FIG. 94 and the fact that a term for $1\times P_1(D)$ may or may not exist but a term for $1\times P_2(D)$ exists, a column related to $P_1$ in the vector for the second row in FIG. 95 is "Y", and a column related to $P_2$ in the vector for the second row in FIG. 95 is "1", where Y is either "0" or "1".

As such, the vector for the second row in FIG. 95 is "0000001111111Y1", as indicated by 3900-2 in FIG. 95.

The parity check polynomials at time point j=2 are parity check polynomials when i=0 in expressions (98-1-1), (98-1-2), (98-2-1), (98-2-2).

A vector for the third row in FIG. 95 can be generated from a parity check polynomial when i=0 in expression (98-1-1) or expression (98-1-2) (refer to FIG. 93).

In expressions (98-1-1) and (98-1-2):

- terms for $1\times X_1(D)$, $1\times X_2(D)$, $1\times X_3(D)$, $1\times X_4(D)$, $1\times X_5(D)$, $1\times X_6(D)$ do not exist;
- terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ exist; and
- a term for $1\times P_1(D)$ exists but a term for $1\times P_2(D)$ does not exist.

Further, the relationship between column numbers and $X_1$, $X_2$, $X_3$, $X_4$, $X_5$, $X_6$, $X_7$, $X_8$, $X_9$, $X_{10}$, $X_{11}$, $X_{12}$, $X_{13}$, $P_1$, $P_2$ is as indicated in FIG. 94. Based on the relationship indicated in FIG. 94 and the fact that terms for $1\times X_1(D)$, $1\times X_2(D)$, $1\times X_3(D)$, $1\times X_4(D)$, $1\times X_5(D)$, $1\times X_6(D)$ do not exist, columns related to $X_1$, $X_2$, $X_3$, $X_4$, $X_5$, $X_6$ in the vector for the third row in FIG. 95 are "0". Further, based on the relationship indicated in FIG. 94 and the fact that terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ exist, columns related to $X_7$, $X_8$, $X_9$, $X_{10}$, $X_{11}$, $X_{12}$, $X_{13}$ in the vector for the third row in FIG. 95 are "1". In addition, based on the relationship indicated in FIG. 94 and the fact that a term for $1\times P_1(D)$ exists but a term for $1\times P_2(D)$ does not exist, a column related to $P_1$ in the vector for the third row in FIG. 95 is "1", and a column related to $P_2$ in the vector for the third row in FIG. 95 is "0".

As such, the vector for the third row in FIG. 95 is "000000111111110", as indicated by 3901-1 in FIG. 95.

A vector for the fourth row in FIG. 95 can be generated from a parity check polynomial when i=0 in expression (98-2-1) or expression (98-2-2) (refer to FIG. 93).

In expressions (98-2-1) and (98-2-2):

terms for $1\times X_1(D)$, $1\times X_2(D)$, $1\times X_3(D)$, $1\times X_4(D)$, $1\times X_5(D)$, $1\times X_6(D)$ exist;

terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ do not exist; and a term for $1\times P_1(D)$ may or may not exist but a term for $1\times P_2(D)$ exists.

Further, the relationship between column numbers and $X_1$, $X_2$, $X_3$, $X_4$, $X_5$, $X_6$, $X_7$, $X_8$, $X_9$, $X_{10}$, $X_{11}$, $X_{12}$, $X_{13}$, $P_1$, $P_2$ is as indicated in FIG. 94. Based on the relationship indicated in FIG. 94 and the fact that terms for $1\times X_1(D)$, $1\times X_2(D)$, $1\times X_3(D)$, $1\times X_4(D)$, $1\times X_5(D)$, $1\times X_6(D)$ exist, columns related to $X_1$, $X_2$, $X_3$, $X_4$, $X_5$, $X_6$ in the vector for the fourth row in FIG. 95 are "1". Further, based on the relationship indicated in FIG. 94 and the fact that terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ do not exist, columns related to $X_7$, $X_8$, $X_9$, $X_{10}$, $X_{11}$, $X_{12}$, $X_{13}$ in the vector for the fourth row in FIG. 95 are "0". In addition, based on the relationship indicated in FIG. 94 and the fact that a term for $1\times P_1(D)$ may or may not exist but a term for $1\times P_2(D)$ exists, a column related to $P_1$ in the vector for the fourth row in FIG. 95 is "Y", and a column related to $P_2$ in the vector for the fourth row in FIG. 95 is "1".

As such, the vector for the fourth row in FIG. 95 is "1111110000000Y1", as indicated by 3901-2 in FIG. 95.

Because it can be considered that the above similarly applies to cases where time point j=3, 4, 5, the parity check matrix H has the configuration indicated in FIG. 95.

That is, due to the parity check polynomials of expressions (97-1-1), (97-1-2), (97-2-1), (97-2-2) being used at time point j=2k+1 (where k is an integer no smaller than zero), "111111000000010" exists in the 2×(2k+1)−1th row of the parity check matrix H, and "0000001111111Y1" exists in the 2×(2k+1)th row of the parity check matrix H, as illustrated in FIG. 95.

Further, due to the parity check polynomials of expressions (98-1-1), (98-1-2), (98-2-1), (98-2-2) being used at time point j=2k+2 (where k is an integer no smaller than zero), "000000111111110" exists in the 2×(2k+2)−1th row of the parity check matrix H, and "1111110000000Y1" exists in the 2×(2k+2)th row of the parity check matrix H, as illustrated in FIG. 95.

Accordingly, as illustrated in FIG. 95, when denoting a column number of a leftmost column corresponding to "1" in "111111000000010" in a row where "111111000000010" exists (e.g., 3900-1 in FIG. 95) as "a", "000000111111110" (e.g., 3901-1 in FIG. 95) exists in a row that is two rows below the row where "111111000000010" exists, starting from column "a+9".

Similarly, as illustrated in FIG. 95, when denoting a column number of a leftmost column corresponding to "1" in "0000001111111Y1" in a row where "0000001111111Y1" exists (e.g., 3900-2 in FIG. 95) as "b", "1111110000000Y1" (e.g., 3901-2 in FIG. 95) exists in a row that is two rows below the row where "0000001111111Y1" exists, starting from column "b+9".

Similarly, as illustrated in FIG. 95, when denoting a column number of a leftmost column corresponding to "1" in "000000111111110" in a row where "000000111111110" exists (e.g., 3901-1 in FIG. 95) as "c", "111111000000010" (e.g., 3902-1 in FIG. 95) exists in a row that is two rows below the row where "000000111111110" exists, starting from column "c+9".

Similarly, as illustrated in FIG. 95, when denoting a column number of a leftmost column corresponding to "1" in "1111110000000Y1" in a row where "1111110000000Y1" exists (e.g., 3901-2 in FIG. 95) as "d", "0000001111111Y1" (e.g., 3902-2 in FIG. 95) exists in a row that is two rows below the row where "1111110000000Y1" exists, starting from column "d+9".

The following describes a parity check matrix for an LDPC-CC of coding rate 13/15 and time-varying period 2×m that is based on a parity check polynomial when tail-biting is not performed, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

In the following, $H_{com}[u][v]$ (where u and v are integers no smaller than one) denotes an element at row "u" column "v" of a parity check matrix for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Based on description above provided with reference to FIG. 93:

"a vector for the 2×g−1th row of the parity check matrix H can be generated from a parity check polynomial satisfying zero of #((g−1)%2m); first expression"; and "a vector for the (2×g)th row of the parity check matrix H can be generated from a parity check polynomial satisfying zero of #((g−1)%2m); second expression" (where g is an integer no smaller than one).

Based on description above provided with reference to FIG. 94:

"a vector for the 15×(j−1)+1th column of the parity check matrix H is related to $X_1$ at time point j";

"a vector for the 15×(j−1)+2th column of the parity check matrix H is related to $X_2$ at time point j";

"a vector for the 15×(j−1)+3th column of the parity check matrix H is related to $X_3$ at time point j";

"a vector for the 15×(j−1)+4th column of the parity check matrix H is related to $X_4$ at time point j";

"a vector for the 15×(j−1)+5th column of the parity check matrix H is related to $X_5$ at time point j";

"a vector for the 15×(j−1)+6th column of the parity check matrix H is related to $X_6$ at time point j";

"a vector for the 15×(j−1)+7th column of the parity check matrix H is related to $X_7$ at time point j";

"a vector for the 15×(j−1)+8th column of the parity check matrix H is related to $X_8$ at time point j";

"a vector for the 15×(j−1)+9th column of the parity check matrix H is related to $X_9$ at time point j";

"a vector for the 15×(j−1)+10th column of the parity check matrix H is related to $X_{10}$ at time point j";

"a vector for the 15×(j−1)+11h column of the parity check matrix H is related to $X_{11}$ at time point j";

"a vector for the 15×(j−1)+12th column of the parity check matrix H is related to $X_{12}$ at time point j";

"a vector for the 15×(j−1)+13th column of the parity check matrix H is related to $X_{13}$ at time point j";

"a vector for the 15×(j−1)+14th column of the parity check matrix H is related to $P_1$ at time point j"; and "a vector for the 15×(j−1)+15th column of the parity check matrix H is related to $P_2$ at time point j"; (where j is an integer no smaller than one).

Based on the above, the following describes component $H_{com}$[2×g−1][v] in row 2×g−1 (where g is an integer no smaller than one) and component $H_{com}$[2×g][v] in row 2×g of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a parity check polynomial satisfying zero of #((g−1)%2m); first expression can be used to generate a vector for row 2×g−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #((g−1)%2m); second expression can be used to generate a vector for row 2×g of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, when g=2×f−1 (where f is an integer no smaller than one), a parity check polynomial satisfying zero of #(((2×f−1)−1)%2m); first expression, or that is, a parity check polynomial satisfying zero of either expression (97-1-1) or expression (97-1-2), can be used to generate a vector for row 2×(2×f−1)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f−1)−1)%2m); second expression, or that is, a parity check polynomial satisfying zero of either expression (97-2-1) or expression (97-2-2), can be used to generate a vector for row 2×(2×f−1) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, when g=2×f (where f is an integer no smaller than one), a parity check polynomial satisfying zero of #(((2×f)−1)%2m); first expression, or that is, a parity check polynomial satisfying zero of either expression (98-1-1) or expression (98-1-2), can be used to generate a vector for row 2×(2×f)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f)−1)%2m); second expression, or that is, a parity check polynomial satisfying zero of either expression (98-2-1) or expression (98-2-2), can be used to generate a vector for row 2×(2×f) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, (1) when g=2×f−1 (where f is an integer no smaller than one), when a vector for row 2×(2×f−1)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-1-1), (2×f−1)−1)%2m=2c holds true. Accordingly, a parity check polynomial satisfying zero of expression (97-1-1) where 2i=2c holds true (where c is an integer no smaller than zero and no greater than m−1).

Accordingly, component $H_{com}$[2×g−1][v]=$H_{com}$[2×(2×f−1)−1][v] in row 2×g−1, or that is, row 2×(2×f−1)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 717]

$$H_{com}[2\times(2\times f-1)-1][15\times((2\times f-1)-0-1)+1]=1 \quad (99\text{-}1)$$

When $(2\times f-1)-\alpha_{\#(2c),1,1}-1\geq 0$:

$$H_{com}[2\times(2\times f-1)-1][15\times((2\times f-1)-\alpha_{\#(2c),1,1}-1)+1]=1 \quad (99\text{-}2)$$

When $(2\times f-1)-\alpha_{\#(2c),1,2}-1\geq 0$:

$$H_{com}[2\times(2\times f-1)-1][15\times((2\times f-1)-\alpha_{\#(2c),1,2}-1)+1]=1 \quad (99\text{-}3)$$

For all u being an integer no smaller than one satisfying $\{u\neq(2\times f-1)-0,\ u\neq(2\times(2\times f-1)-\alpha_{\#(2c),1,1},\ \text{and}\ u\neq(2\times f-1)-\alpha_{\#(2c),1,2}\}$:

$$H_{com}[2\times(2\times f-1)-1][15\times(u-1)+1]=0 \quad (99\text{-}4)$$

Considered in a similar manner, the following holds true for $X_w$. In the following, w is an integer no smaller than one and no greater than six.

[Math. 718]

$$H_{com}[2\times(2\times f-1)-1][15\times((2\times f-1)-0-1)+w]=1 \quad (100\text{-}1)$$

When $(2\times f-1)-\alpha_{\#(2c),w,1}-1\geq 0$:

$$H_{com}[2\times(2\times f-1)-1][15\times((2\times f-1)-\alpha_{\#(2c),w,1}-1)+w]=1 \quad (100\text{-}2)$$

When $(2\times f-1)-\alpha_{\#(2c),w,2}-1\geq 0$:

$$H_{com}[2\times(2\times f-1)-1][15\times((2\times f-1)-\alpha_{\#(2c),w,2}-1)+w]=1 \quad (100\text{-}3)$$

Further, the following holds true for $X_7$. In the following, y is an integer no smaller than three and no greater than $r_{\#(2c),7}$.

[Math. 719]

When $(2\times f-1)-\alpha_{\#(2c),7,y}-1\geq 0$:

$$H_{com}[2\times(2\times f-1)-1][15\times((2\times f-1)-\alpha_{\#(2c),7,y}-1)+7]=1 \quad (101\text{-}1)$$

For all u being an integer no smaller than one satisfying $\{u\neq(2\times f-1)-\alpha_{\#(2c),7,y}\}$ (where y is an integer no smaller than three and no greater than $r_{\#(2c),7}$):

$$H_{com}[2\times(2\times f-1)-1][15\times(u-1)+7]=0 \quad (102\text{-}1)$$

Considered in a similar manner, the following holds true for $X_z$. In the following, z is an integer no smaller than seven and no greater than thirteen, and y is an integer no smaller than three and no greater than $r_{\#(2c),z}$.

[Math. 720]

When $(2\times f-1)-\alpha_{\#(2c),z,y}-1\geq 0$:

$$H_{com}[2\times(2\times f-1)-1][15\times((2\times f-1)-\alpha_{\#(2c),z,y}-1)+z]=1 \quad (102\text{-}1)$$

For all u being an integer no smaller than one satisfying $\{u\neq(2\times f-1)-\alpha_{\#(2c),z,y}\}$ (where y is an integer no smaller than three and no greater than $r_{\#(2c),z}$):

$$H_{com}[2\times(2\times f-1)-1][15\times(u-1)+z]=0 \quad (102\text{-}2)$$

The following holds true for $P_1$.

[Math. 721]

$$H_{com}[2\times(2\times f-1)-1][15\times((2\times f-1)-0-1)+14]=1 \quad (103\text{-}1)$$

For all u being an integer no smaller than one satisfying $\{u\neq(2\times f-1)-0\}$:

$$H_{com}[2\times(2\times f-1)-1][15\times(u-1)+14]=0 \quad (103\text{-}2)$$

The following holds true for $P_2$.

[Math. 722]

When $(2\times f-1)-\beta_{\#(2c),0}-1\geq 0$:

$$H_{com}[2\times(2\times f-1)-1][15\times((2\times f-1)-\beta_{\#(2c),0}-1)+15]=1 \quad (104\text{-}1)$$

For all u being an integer no smaller than one satisfying $\{u\neq(2\times f-1)-\beta_{\#(2c),0}\}$:

$$H_{com}[2\times(2\times f-1)-1][15\times(u-1)+15]=0 \quad (104\text{-}2)$$

Further, (2) when g=2×f−1 (where f is an integer no smaller than one), when a vector for row 2×(2×f−1)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-1-2), ((2×f−1)−1)%2m=2c holds true. Accordingly, a parity check polynomial satisfying zero of expression (97-1-2) where 2i=2c holds true (where c is an integer no smaller than zero and no greater than m−1).

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 723]

$$H_{com}[2\times(2\times f-1)-1][15\times((2\times f-1)-0-1)+1]=1 \quad (105\text{-}1)$$

When $(2\times f-1)+\alpha_{\#(2c),1,1}-1\geq 0$:

$$H_{com}[2\times(2\times f-1)-1][15\times((2\times f-1)-\alpha_{\#(2c),1,1}-1)+1]=1 \quad (105\text{-}2)$$

When $(2\times f-1)-\alpha_{\#(2c),1,2}-1\geq 0$:

$$H_{com}[2\times(2\times f-1)-1][15\times((2\times f-1)-\alpha_{\#(2c),1,2}-1)+1]=1 \quad (105\text{-}3)$$

For all u being an integer no smaller than one satisfying $\{u\neq(2\times f-1)-0,\ u\neq(2\times f-1)-\alpha_{\#(2c),1,1},\ \text{and}\ u\neq(2\times f-1)-\alpha_{\#(2c),1,2}\}$:

$$H_{com}[2\times(2\times f-1)-1][15\times(u-1)+1]=0 \quad (105\text{-}4)$$

Considered in a similar manner, the following holds true for $X_w$. In the following, w is an integer no smaller than one and no greater than six.

[Math. 724]

$$H_{com}[2\times(2\times f-1)-1][15\times((2\times f-1)-0-1)+w]=1 \quad (106\text{-}1)$$

When $(2\times f-1)-\alpha_{\#(2c),1,1}-1\geq 0$:

$$H_{com}[2\times(2\times f)-1)-1][15\times((2\times f-1)-\alpha_{\#(2c),w,1}-1)+w]=1 \quad (106\text{-}2)$$

When $(2\times f-1)-\alpha_{\#(2c),w,2}-1\geq 0$:

$$H_{com}[2\times(2\times f-1)-1][15\times((2\times f-1)-\alpha_{\#(2c),w,2}-1)+w]=1 \quad (106\text{-}3)$$

For all u being an integer no smaller than one satisfying $\{u \neq (2\times f-1)-0,\ u \neq (2\times f-1)-\alpha_{\#(2c),w,1},$ and $u \neq (2\times f-1)-\alpha_{\#(2c),w,2}\}$:

$$H_{com}[2\times(2\times f-1)-1][15\times(u-1)+w]=0 \tag{106-4}$$

Further, the following holds true for $X_7$. In the following, y is an integer no smaller than three and no greater than $r_{\#(2c),7}$.

[Math. 725]

When $(2\times f-1)-\alpha_{\#(2c),6,y}-1\geq 0$:

$$H_{com}[2\times(2\times f-1)-1][15\times((2\times f-1)-\alpha_{\#(2c),7,y}-1)+7]=1 \tag{107-1}$$

For all u being an integer no smaller than one satisfying $\{u\neq(2\times f-1)-\alpha_{\#(2c),7,y}\}$ (where y is an integer no smaller than three and no greater than $r_{\#(2c),7}$):

$$H_{com}[2\times(2\times f-1)-1][15\times(u-1)+7]=0 \tag{107-2}$$

Considered in a similar manner, the following holds true for $X_z$. In the following, z is an integer no smaller than seven and no greater than thirteen, and y is an integer no smaller than three and no greater than $r_{\#(2c),z}$.

[Math. 726]

When $(2\times f-1)-\alpha_{\#(2c),z,y}-1\geq 0$:

$$H_{com}[2\times(2\times f-1)-1][15\times((2\times f-1)-\alpha_{\#(2c),z,y}-1)+z]=1 \tag{108-1}$$

For all u being an integer no smaller than one satisfying $\{u\neq(2\times f-1)-\alpha_{\#(2c),z,y}\}$ (where y is an integer no smaller than three and no greater than $r_{\#(2c),z}$):

$$H_{com}[2\times(2\times f-1)-1][15\times(u-1)+z]=0 \tag{108-2}$$

The following holds true for $P_1$.

[Math. 727]

$$H_{com}[2\times(2\times f-1)-1][15\times((2\times f-1)-0-1)+14]=1 \tag{109-1}$$

When $(2\times f-1)-\beta_{\#(2c),1}-1\geq 0$:

$$H_{com}[2\times(2\times f-1)-1][15\times((2\times f-1)-\beta_{\#(2c),1}-1)+14]=1 \tag{109-2}$$

For all u being an integer no smaller than one satisfying $\{u\neq(2\times f-1)-0$ and $u\neq(2\times f-1)-\beta_{\#(2c),1}\}$:

$$H_{com}[2\times(2\times f-1)-1][15\times(u-1)+14]=0 \tag{109-3}$$

The following holds true for $P_2$.

[Math. 728]

For all u being an integer no smaller than one:

$$H_{com}[2\times(2\times f-1)-1][15\times(u-1)+15]=0 \tag{110}$$

Further, (3) when g=2×f−1 (where f is an integer no smaller than one), when a vector for row 2×(2×f−1) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-2-1), (2×f−1)−1)%2m=2c holds true. Accordingly, a parity check polynomial satisfying zero of expression (97-2-1) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, and y is an integer no smaller than three and no greater than $r_{\#(2c),1}$.

[Math. 729]

When $(2\times f-1)-\alpha_{\#(2c),1,3}-1\geq 0$:

$$H_{com}[2\times(2\times f-1)][15\times((2\times f-1)-\alpha_{\#(2c),1,y}-1)+1]=1 \tag{111-1}$$

For all u being an integer no smaller than one satisfying $\{u\neq(2\times f-1)-\alpha_{\#(2c),1,y}\}$ (where y is an integer no smaller than three and no greater than $r_{\#(2c),1}$):

$$H_{com}[2\times(2\times f-1)][15\times(u-1)+1]=0 \tag{111-2}$$

Considered in a similar manner, the following holds true for $X_z$. In the following, z is an integer no smaller than one and no greater than six, and y is an integer no smaller than three and no greater than $r_{\#(2c),z}$.

[Math. 730]

When $(2\times f-1)-\alpha_{\#(2c),z,y}-1\geq 0$:

$$H_{com}[2\times(2\times f-1)][15\times((2\times f-1)-\alpha_{\#(2c),z,y}-1)+z]=1 \tag{112-1}$$

For all u being an integer no smaller than and satisfying $\{u\neq(2\times f-1)-\alpha_{\#(2c),z,y}\}$ (where y is an integer no smaller than three and no greater than $r_{\#(2c),z}$):

$$H_{com}[2\times(2\times f-1)][15\times(u-1)+z]=0 \tag{112-2}$$

Further, the following holds true for $X_7$.

[Math. 731]

$$H_{com}[2\times(2\times f-1)][15\times((2\times f-1)-0-1)+7]=1 \tag{113-1}$$

When $(2\times f-1)-\alpha_{\#(2c),7,1}-1\geq 0$:

$$H_{com}[2\times(2\times f-1)][15\times((2\times f-1)-\alpha_{\#(2c),7,1}-1)+7]=1 \tag{113-2}$$

When $(2\times f-1)-\alpha_{\#(2c),7,2}-1\geq 0$:

$$H_{com}[2\times(2\times f-1)][15\times((2\times f-1)-\alpha_{\#(2c),7,2}-1)+7]=1 \tag{113-3}$$

For all u being an integer no smaller than one satisfying $\{u\neq(2\times f-1)-0,\ u\neq(2\times f-1)-\alpha_{\#(2c),7,1},$ and $u\neq(2\times f-1)-\alpha_{\#(2c),7,2}\}$:

$$H_{com}[2\times(2\times f-1)][15\times(u-1)+7]=0 \tag{113-4}$$

Considered in a similar manner, the following holds true for $X_w$. In the following, w is an integer no smaller than seven and no greater than thirteen.

[Math. 732]

$$H_{com}[2\times(2\times f-1)][15\times((2\times f-1)-0-1)+w]=1 \tag{114-1}$$

When $(2\times f-1)-\alpha_{\#(2c),w,1}\geq 0$:

$$H_{com}[2\times(2\times f-1)][15\times((2\times f-1)-\alpha_{\#(2c),w,1}-1)+w]=1 \tag{114-2}$$

When $(2\times f-1)-\alpha_{\#(2c),w,2}-1\geq 0$:

$$H_{com}[2\times(2\times f-1)][15\times((2\times f-1)-\alpha_{\#(2c),w,2}-1)+w]=1 \tag{114-3}$$

For all u being an integer no smaller than one satisfying $\{u\neq(2\times f-1)-0,\ u\neq(2\times f-1)-\alpha_{\#(2c),w,1},$ and $u\neq(2\times f-1)-\alpha_{\#(2c),w,2}\}$:

$$H_{com}[2\times(2\times f-1)][15\times(u-1)+w]=0 \tag{114-4}$$

The following holds true for $P_1$.

[Math. 733]

When $(2\times f-1)-\beta_{\#(2c),2}-1\geq 0$:

$$H_{com}[2\times(2\times f-1)][15\times((2\times f-1)-\beta_{\#(2c),2}-1)+14]=1 \tag{115-1}$$

For all u being an integer no smaller than one satisfying $\{u \neq (2\times f-1)-\beta_{\#(2c),2}\}$:

$$H_{com}[2\times(2\times f-1)][15\times(u-1)+14]=0 \quad (115\text{-}2)$$

The following holds true for $P_2$.

[Math. 734]

$$H_{com}[2\times(2\times f-1)][15\times((2\times f-1)-0-1)+15]=1 \quad (116\text{-}1)$$

For all u being an integer no smaller than one satisfying $\{u \neq (2\times f-1)-0\}$:

$$H_{com}[2\times(2\times f-1)][15\times(u-1)+15]=0 \quad (116\text{-}2)$$

Further, (4) when g=2×f−1 (where f is an integer no smaller than one), when a vector for row 2×(2×f−1) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (97-2-2), (2×f−1)−1)%2m=2c holds true. Accordingly, a parity check polynomial satisfying zero of expression (97-2-2) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than three and no greater than $r_{\#(2c),1}$.

[Math. 735]

When $(2\times f-1)-\alpha_{\#(2c),1,y}-1\geq 0$:

$$H_{com}[2\times(2\times f-1)][15\times((2\times f-1)-\alpha_{\#(2c),1,y}-1)+1]=1 \quad (117\text{-}1)$$

For all u being an integer no smaller than one satisfying $\{u \neq (2\times f-1)-\alpha_{\#(2c),1,y}\}$ (where y is an integer no smaller than three and no greater than $r_{\#(2c),1}$):

$$H_{com}[2\times(2\times f-1)][15\times(u-1)+1]=0 \quad (117\text{-}2)$$

Considered in a similar manner, the following holds true for $X_z$. In the following, z is an integer no smaller than one and no greater than six, and y is an integer no smaller than three and no greater than $r_{\#(2c),z}$.

[Math. 736]

When $(2\times f-1)-\alpha_{\#(2c),z,y}-1\geq 0$:

$$H_{com}[2\times(2\times f-1)][15\times((2\times f-1)-\alpha_{\#(2c),z,y}-1)+z]=1 \quad (118\text{-}1)$$

For all u being an integer no smaller than one satisfying $\{u \neq (2\times f-1)-\alpha_{\#(2c),z,y}\}$ (where y is an integer no smaller than three and no greater than $r_{\#(2c),z}$):

$$H_{com}[2\times(2\times f-1)][15\times(u-1)+z]=0 \quad (118\text{-}2)$$

Further, the following holds true for $X_7$.

[Math. 737]

$$H_{com}[2\times(2\times f-1)][15\times((2\times f-1)-0-1)+7]=1 \quad (119\text{-}1)$$

When $(2\times f-1)-\alpha_{\#(2c),7,1}-1\geq 0$:

$$H_{com}[2\times(2\times f-1)][15\times((2\times f-1)-\alpha_{\#(2c),7,1}-1)+7]=1 \quad (119\text{-}2)$$

When $(2\times f-1)-\alpha_{\#(2c),7,2}-1\geq 0$:

$$H_{com}[2\times(2\times f\times 1)][15\times((2\times f-1)-\alpha_{\#(2c),7,2}-1)+7]=1 \quad (119\text{-}3)$$

For all u being an integer no smaller than one satisfying $\{u \neq (2\times f-1)-0,\ u \neq (2\times f-1)-\alpha_{\#(2c),7,1},\ \text{and}\ u \neq (2\times f-1)-\alpha_{\#(2c),7,2}\}$:

$$H_{com}[2\times(2\times f-1)][15\times(u-1)+7]=0 \quad (119\text{-}4)$$

Considered in a similar manner, the following holds true for $X_w$. In the following, w is an integer no smaller than seven and no greater than thirteen.

[Math. 738]

$$H_{com}[2\times(2\times f-1)][15\times((2\times f-1)-0-1)+w]=1 \quad (120\text{-}1)$$

When $(2\times f-1)-\alpha_{\#(2c),w,1}-1\geq 0$:

$$H_{com}[2\times(2\times f-1)][15\times((2\times f-1)-\alpha_{\#(2c),w,1}-1)+w]=1 \quad (120\text{-}2)$$

When $(2\times f-1)-\alpha_{\#(2c),w,2}-1\geq 0$:

$$H_{com}[2\times(2\times f-1)][15\times((2\times f-1)-\alpha_{\#(2c),w,2}-1)+w]=1 \quad (120\text{-}3)$$

For all u being an integer no smaller than one satisfying $\{u \neq (2\times f-1)-0,\ u \neq (2\times f-1)-\alpha_{\#(2c),w,1},\ \text{and}\ u \neq (2\times f-1)-\alpha_{\#(2c),w,2}\}$:

$$H_{com}[2\times(2\times f-1)][15\times(u-1)+w]=0 \quad (120\text{-}4)$$

The following holds true for $P_1$.

[Math. 739]

For all u being an integer no smaller than one:

$$H_{com}[2\times(2\times f-1)][15\times(u-1)+14]=0 \quad (121)$$

The following holds true for $P_2$.

[Math. 740]

$$H_{com}[2\times(2\times f-1)][15\times((2\times f-1)-0-1)+15]=1 \quad (122\text{-}1)$$

When $(2\times f-1)-\beta_{\#(2c),3}-1\geq 0$:

$$H_{com}[2\times(2\times f-1)][15\times((2\times f-1)-\beta_{\#(2c),3}-1)+15]=1 \quad (122\text{-}2)$$

For all u being an integer no smaller than one satisfying $\{u \neq (2\times f-1)-0 \text{ and } u \neq (2\times f-1)-\beta_{\#(2c),3}\}$:

$$H_{com}[2\times(2\times f-1)][15\times(u-1)+15]=0 \quad (122\text{-}3)$$

Further, (5) when g=2×f (where f is an integer no smaller than one), when a vector for row 2×(2×f)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-1-1), ((2×f)−1)%2m=2d+1 holds true. Accordingly, a parity check polynomial satisfying zero of expression (98-1-1) where 2i+1=2d+1 holds true (where d is an integer no smaller than zero and no greater than m−1).

Accordingly, component $H_{com}[2\times g-1][v]=H_{com}[2\times(2\times f)-1][v]$ in row 2×g−1, or that is, row 2×(2×f)−1 of the parity check matrix H, which is for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than three and no greater than $r_{\#(2d+1),1}$.

[Math. 741]

When $(2\times f)-\alpha_{\#(2d+1),1,y}-1\geq 0$:

$$H_{com}[2\times(2\times f)-1][15\times((2\times f)-\alpha_{\#(2d+1),1,y}-1)+1]=1 \quad (123\text{-}1)$$

For all u being an integer no smaller than one satisfying $\{u\neq(2\times f-1)-\alpha_{\#(2d+1),1,y}\}$ (where y is an integer no smaller than three and no greater than $r_{\#(2d+1),1}$):

$$H_{com}[2\times(2\times f)-1][15\times(u-1)+1]=0 \quad (123\text{-}2)$$

Considered in a similar manner, the following holds true for $X_z$. In the following, z is an integer no smaller than one and no greater than six, and y is an integer no smaller than three and no greater than $r_{\#(2d+1),z}$.

[Math. 742]

When $(2\times f)-\alpha_{\#(2d+1),z,y}-1\geq 0$:

$$H_{com}[2\times(2\times f)-1][15\times((2\times f)-\alpha_{\#(2d+1),z,y}-1)+z]=1 \quad (124\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)-1][15\times(u-1)+z]=0 \quad (124\text{-}2)$$

Further, the following holds true for $X_7$.

[Math. 743]

$$H_{com}[2\times(2\times f)-1][15\times((2\times f)-0-1)+7]=1 \quad (125\text{-}1)$$

When $(2\times f)-\alpha_{\#(2d+1),7,1}-1\geq 0$:

$$H_{com}[2\times(2\times f)-1][15\times((2\times f)-\alpha_{\#(2d+1),7,1}-1)+7]=1 \quad (125\text{-}2)$$

When $(2\times f)-\alpha_{\#(2d+1),7,2}-1\geq 0$:

$$H_{com}[2\times(2\times f)-1][15\times((2\times f)-\alpha_{\#(2d+1),7,2}-1)+7]=1 \quad (125\text{-}3)$$

For all u being an integer no smaller than one satisfying $\{u\neq(2\times f-1)-0,\ u\neq(2\times f-1)-\alpha_{\#(2d+1),7,1},\ \text{and}\ u\neq(2\times f-1)-\alpha_{\#(2d+1),7,2}\}$:

$$H_{com}[2\times(2\times f)-1][15\times(u-1)+7]=0 \quad (125\text{-}4)$$

Considered in a similar manner, the following holds true for $X_w$. In the following, w is an integer no smaller than seven and no greater than thirteen.

[Math. 744]

$$H_{com}[2\times(2\times f-1)][15\times((2\times f)-0-1)+w]=1 \quad (126\text{-}1)$$

When $(2\times f-1)-\alpha_{\#(2d+1),w,1}-1\geq 0$:

$$H_{com}[2\times(2\times f-1)][15\times((2\times f)-\alpha_{\#(2d+1),w,1}-1)+w]=1 \quad (126\text{-}2)$$

When $(2\times f-1)-\alpha_{\#(2d+1),w,2}-1\geq 0$:

$$H_{com}[2\times(2\times f-1)][15\times((2\times f)-\alpha_{\#(2d+1),w,2}-1)+w]=1 \quad (126\text{-}3)$$

For all u being an integer no smaller than one satisfying $\{u\neq(2\times f)-0,\ u\neq(2\times f)-\alpha_{\#(2d+1),w,1}\ \text{and}\ u\neq(2\times f)-\alpha_{\#(2d+1),w,2}\}$:

$$H_{com}[2\times(2\times f)-1][15\times(u-1)+w]=0 \quad (126\text{-}4)$$

The following holds true for $P_1$.

[Math. 745]

$$H_{com}[2\times(2\times f)-1][15\times((2\times f)-0-1)+14]=1 \quad (127\text{-}1)$$

For all u being an integer no smaller than one satisfying $\{u\neq(2\times f)-0\}$:

$$H_{com}[2\times(2\times f)-1][15\times(u-1)+14]=0 \quad (127\text{-}2)$$

The following holds true for $P_2$.

[Math. 746]

When $(2\times f)-\beta_{\#(2d+1),0}-1\geq 0$:

$$H_{com}[2\times(2\times f)-1][15\times((2\times f)-\beta_{\#(2d+1),0}-1)+15]=1 \quad (128\text{-}1)$$

For all u being an integer no smaller than one satisfying $\{u\neq(2\times f)-\beta_{\#(2d+1),0}\}$:

$$H_{com}[2\times(2\times f)-1][15\times(u-1)+15]=0 \quad (128\text{-}2)$$

Further, (6) when g=2×f (where f is an integer no smaller than one), when a vector for row 2×(2×f)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-1-2), ((2×f)−1)%2m=2d+1 holds true. Accordingly, a parity check polynomial satisfying zero of expression (98-1-2) where 2i+1=2d+1 holds true (where d is an integer no smaller than zero and no greater than m−1).

Accordingly, component $H_{com}[2\times g-1][v]=H_{com}[2\times(2\times f)-1][v]$ in row 2×g−1, or that is, row 2×(2×f)−1 of the parity check matrix H, which is for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than three and no greater than $r_{\#(2d+1),1}$.

[Math. 747]

When $(2\times f)-\alpha_{\#(2d+1),1,y}-1\geq 0$:

$$H_{com}[2\times(2\times f)-1][15\times((2\times f)-\alpha_{\#(2d+1),1,y}-1)+1]=1 \quad (129\text{-}1)$$

For all u being an integer no smaller than one satisfying $\{u\neq(2\times f)-\alpha_{\#(2d+1),1,y}\}$ (where y is an integer no smaller than three and no greater than $r_{\#(2d+1),1}$):

$$H_{com}[2\times(2\times f)-1][15\times(u-1)+1]=0 \quad (129\text{-}2)$$

Considered in a similar manner, the following holds true for $X_z$. In the following, z is an integer no smaller than one and no greater than six, and y is an integer no smaller than three and no greater than $r_{\#(2d+1),z}$.

[Math. 748]

When $(2\times f)-\alpha_{\#(2d+1),z,y}-1\geq 0$:

$$H_{com}[2\times(2\times f)-1][15\times((2\times f)-\alpha_{\#(2d+1),z,y}-1)+z]=1 \quad (130\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)-1][15\times(u-1)+z]=0 \quad (130\text{-}2)$$

Further, the following holds true for $X_7$.

[Math. 749]

$$H_{com}[2\times(2\times f)-1][15\times((2\times f)-0-1)+7]=1 \quad (131\text{-}1)$$

When $(2\times f)-\alpha_{\#(2d+1),7,1}-1\geq 0$:

$$H_{com}[2\times(2\times f)-1][15\times((2\times f)-\alpha_{\#(2d+1),7,1}-1)+7]=1 \quad (131\text{-}2)$$

When $(2\times f)-\alpha_{\#(2d+1),7,2}-1\geq 0$:

$$H_{com}[2\times(2\times f)-1][15\times((2\times f)-\alpha_{\#(2d+1),7,2}-1)+7]=1 \quad (131\text{-}3)$$

For all u being an integer no smaller than one satisfying $\{u\neq(2\times f-1)-0,\ u\neq(2\times f-1)-\alpha_{\#(2d+1),7,1},$ and $u\neq(2\times f-1)-\alpha_{\#(2d+1),7,2}\}$:

$$H_{com}[2\times(2\times f)-1][15\times(u-1)+7]=0 \quad (131\text{-}4)$$

Considered in a similar manner, the following holds true for $X_w$. In the following, w is an integer no smaller than seven and no greater than thirteen.

[Math. 750]

$$H_{com}[2\times(2\times f-1)][15\times((2\times f)-0-1)+w]=1 \quad (132\text{-}1)$$

When $(2\times f-1)-\alpha_{\#(2d+1),w,1}-1\geq 0$:

$$H_{com}[2\times(2\times f-1)][15\times((2\times f)-\alpha_{\#(2d+1),w,1}-1)+w]=1 \quad (132\text{-}2)$$

When $(2\times f-1)-\alpha_{\#(2d+1),w,2}-1\geq 0$:

$$H_{com}[2\times(2\times f-1)][15\times((2\times f)-\alpha_{\#(2d+1),w,2}-1)+w]=1 \quad (132\text{-}3)$$

For all u being an integer no smaller than one satisfying $\{u\neq(2\times f)-0,\ u\neq(2\times f)-\alpha_{\#(2d+1),w,1},$ and $u\neq(2\times f)-\alpha_{\#(2d+1),w,2}\}$:

$$H_{com}2=[2\times(2\times f)-1][15\times(u-1)+w]=0 \quad (132\text{-}4)$$

The following holds true for $P_1$.

[Math. 751]

$$H_{com}[2\times(2\times f)-1][15\times((2\times f)-0-1)+14]=1 \quad (133\text{-}1)$$

When $(2\times f)-\beta_{\#(2d+1),1}-1\geq 0$:

$$H_{com}[2\times(2\times f)-1][15\times((2\times f)-\beta_{\#(2d+1),1}-1)+14]=1 \quad (133\text{-}2)$$

For all u being an integer no smaller than one satisfying $\{u\neq(2\times f)-0$ and $u\neq(2\times f)-\beta_{\#(2d+1),1}\}$:

$$H_{com}[2\times(2\times f)-1][15\times(u-1)+14]=0 \quad (133\text{-}3)$$

The following holds true for $P_2$.

[Math. 752]

For all u being an integer no smaller than one:

$$H_{com}[2\times(2\times f)-1][15\times(u-1)+15]=0 \quad (134)$$

Further, (7) when g=2×f (where f is an integer no smaller than one), when a vector for row 2×(2×f) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-2-1), ((2×f)−1) %2m=2d+1 holds true. Accordingly, a parity check polynomial satisfying zero of expression (98-2-1) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 753]

$$H_{com}[2\times(2\times f)][15\times((2\times f)-0-1)+1]=1 \quad (135\text{-}1)$$

When $(2\times f)-\alpha_{\#(2d+1),1,1}-1\geq 0$:

$$H_{com}[2\times(2\times f)][15\times((2\times f)-\alpha_{\#(2d+1),1,1}-1)+1]=1 \quad (135\text{-}2)$$

When $(2\times f)-\alpha_{\#(2d+1),1,2}-1\geq 0$:

$$H_{com}[2\times(2\times f)][15\times((2\times f)-\alpha_{\#(2d+1),1,2}-1)+1]=1 \quad (135\text{-}3)$$

For all u being an integer no smaller than one satisfying $\{u\neq(2\times f)-0,\ u\neq(2\times f)-\alpha_{\#(2d+1),1,1},$ and $u\neq(2\times f)-\alpha_{\#(2d+1),1,2}\}$:

$$H_{com}[2\times(2\times f)][15\times(u-1)+1]=0 \quad (135\text{-}4)$$

Considered in a similar manner, the following holds true for $X_w$. In the following, w is an integer no smaller than one and no greater than six.

[Math. 754]

$$H_{com}[2\times(2\times f)][15\times((2\times f)-0-1)+w]=1 \quad (136\text{-}1)$$

When $(2\times f)-\alpha_{\#(2d+1),w,1}-1\geq 0$:

$$H_{com}[2\times(2\times f)][15\times((2\times f)-\alpha_{\#(2d+1),w,1}-1)+w]=1 \quad (136\text{-}2)$$

When $(2\times f)-\alpha_{\#(2d+1),w,2}-1\geq 0$:

$$H_{com}[2\times(2\times f)][15\times((2\times f)-\alpha_{\#(2d+1),w,2}-1)+W]=1 \quad (136\text{-}3)$$

For all u being an integer no smaller than one satisfying $\{u\neq(2\times f)-0,\ u\neq(2\times f)-\alpha_{\#(2d+1),w,1},$ and $u\neq(2\times f)-\alpha_{\#(2d+1),w,2}\}$:

$$H_{com}[2\times(2\times f)][15\times(u-1)+w]=0 \quad (136\text{-}4)$$

Further, the following holds true for $X_7$. In the following, y is an integer no smaller than three and no greater than $r_{\#(2d+1),7}$.

[Math. 755]

When $(2\times f)-\alpha_{\#(2d+1),7,y}-1\geq 0$:

$$H_{com}[2\times(2\times f)][15\times((2\times f)-\alpha_{\#(2d+1),4,y}-1)+7]=1 \quad (137\text{-}1)$$

For all u being an integer no smaller than one satisfying $\{u\neq(2\times f)-\alpha_{\#(2d+1),7,y}\}$ (where y is an integer no smaller than three and no greater than $r_{\#(2d+1),7}$):

$$H_{com}[2\times(2\times f)][15\times(u-1)+7]=0 \quad (137\text{-}2)$$

Considered in a similar manner, the following holds true for $X_z$. In the following, z is an integer no smaller than seven and no greater than thirteen, and y is an integer no smaller than three and no greater than $r_{\#(2d+1),z}$.

[Math. 756]

When $(2\times f)-\alpha_{\#(2d+1),z,y}-1\geq 0$:

$$H_{com}[2\times(2\times f)][15\times((2\times f)-\alpha_{\#(2d+1),z,y}-1)+z]=1 \quad (138\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)][15\times(u-1)+z]=0 \quad (138\text{-}2)$$

The following holds true for $P_1$.

[Math. 757]

When $(2\times f)-\beta_{\#(2d+1),2}-1\geq 0$:

$$H_{com}[2\times(2\times f)][15\times((2\times f)-\alpha_{\#(2d+1),2}-1)+14]=1 \quad (139\text{-}1)$$

For all u being an integer no smaller than one satisfying $\{u\neq(2\times f)-\beta_{\#(2d+1),2}\}$:

$$H_{com}[2\times(2\times f)][15\times(u-1)+14]=0 \quad (139\text{-}2)$$

The following holds true for $P_2$.

[Math. 758]

$$H_{com}[2\times(2\times f)][15\times((2\times f)-0-1)+15]=1 \quad (140\text{-}1)$$

For all u being an integer no smaller than one satisfying $\{u\neq(2\times f)-0\}$:

$$H_{com}[2\times(2\times f)][15\times(u-1)+15]=0 \quad (140\text{-}2)$$

Further, (8) when g=2×f (where f is an integer no smaller than one), when a vector for row 2×(2×f) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (98-2-2), ((2×f)−1) %2m=2d+1 holds true. Accordingly, a parity check polynomial satisfying zero of expression (98-2-2) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 759]

$$H_{com}[2\times(2\times f)][15\times((2\times f)-0-1)+1]=1 \quad (141\text{-}1)$$

When $(2\times f)-\alpha_{\#(2d+1),1,1}-1\geq 0$:

$$H_{com}[2\times(2\times f)][15\times((2\times f)-\alpha_{\#(2d+1),1,1}-1)+1]=1 \quad (141\text{-}2)$$

When $(2\times f)-\alpha_{\#(2d+1),1,2}-1\geq 0$:

$$H_{com}[2\times(2\times f)][15\times((2\times f)-\alpha_{\#(2d+1),1,2}-1)+1]=1 \quad (141\text{-}3)$$

For all u being an integer no smaller than one satisfying $\{u\neq(2\times f)-0,\ u\neq(2\times f)-\alpha_{\#(2d+1),1,1},\text{ and } u\neq(2\times f)-\alpha_{\#(2d+1),1,2}\}$:

$$H_{com}[2\times(2\times f)][15\times(u-1)+1]=0 \quad (141\text{-}4)$$

Considered in a similar manner, the following holds true for $X_w$. In the following, w is an integer no smaller than one and no greater than six.

[Math. 760]

$$H_{com}[2\times(2\times f)][15\times((2\times f)-0-1)+w]=1 \quad (142\text{-}1)$$

When $(2\times f)-\alpha_{\#(2d+1),w,1}-1\geq 0$:

$$H_{com}[2\times(2\times f)][15\times((2\times f)-\alpha_{\#(2d+1),w,1}-1)+w]=1 \quad (142\text{-}2)$$

When $(2\times f)-\alpha_{\#(2d+1),w,2}-1\geq 0$:

$$H_{com}[2\times(2\times f)][15\times((2\times f)-\alpha_{\#(2d+1),w,2}-1)+W]=1 \quad (142\text{-}3)$$

For all u being an integer no smaller than one satisfying $\{u\neq(2\times f)-0,\ u\neq(2\times f)-\alpha_{\#(2d+1),w,1},\text{ and } u\neq(2\times f)-\alpha_{\#(2d+1),w,2}\}$:

$$H_{com}[2\times(2\times f)][15\times(u-1)+w]=0 \quad (142\text{-}4)$$

Further, the following holds true for $X_7$. In the following, y is an integer no smaller than three and no greater than $r_{\#(2d+1),7}$.

[Math. 761]

When $(2\times f)-\alpha_{\#(2d+1),7,y}-1\geq 0$:

$$H_{com}[2\times(2\times f)][15\times((2\times f)-\alpha_{\#(2d+1),7,y}-1)+7]=1 \quad (143\text{-}1)$$

For all u being an integer no smaller than one satisfying $\{u\neq(2\times f)-\alpha_{\#(2d+1),7,y}\}$ (where y is an integer no smaller than three and no greater than $r_{\#(2d+1),7}$):

$$H_{com}[2\times(2\times f)][15\times(u-1)+7]=0 \quad (143\text{-}2)$$

Considered in a similar manner, the following holds true for $X_z$. In the following, z is an integer no smaller than seven and no greater than thirteen, and y is an integer no smaller than three and no greater than $r_{\#(2d+1),z}$.

[Math. 762]

When $(2\times f)-\alpha_{\#(2d+1),z,y}-1\geq 0$:

$$H_{com}[2\times(2\times f)][15\times((2\times f)-\alpha_{\#(2d+1),z,y}-1)+z]=0 \quad (144\text{-}1)$$

For all u being an integer no smaller than one satisfying $\{u\neq(2\times f)-\alpha_{\#(2d+1),z,y}\}$ (where y is an integer no smaller than three and no greater than $r_{\#(2d+1),z}$):

$$H_{com}[2\times(2\times f)][15\times(u-1)+z]=0 \quad (144\text{-}2)$$

The following holds true for $P_1$.

[Math. 763]

For all u being an integer no smaller than one:

$$H_{com}[2\times(2\times f)][15\times(u-1)+14]=0 \quad (145)$$

The following holds true for $P_2$.

[Math. 764]

$$H_{com}[2\times(2\times f)][15\times((2\times f)-0-1)+15]=1 \quad (146\text{-}1)$$

When $(2\times f)-\beta_{\#(2d+1),3}-1\geq 0$:

$$H_{com}[2\times(2\times f)][15\times((2\times f)-\beta_{\#(2d+1),3}-1)+15]-1 \quad (146\text{-}2)$$

For all u being an integer no smaller than one satisfying $\{u\neq(2\times f)-0\text{ and } u\neq(2\times f)-\beta_{\#(2d+1),3}\}$:

$$H_{com}[2\times(2\times f)][15\times(u-1)+15]=0 \quad (146\text{-}3)$$

As such, an LDPC-CC of coding rate 13/15 and time-varying period 2×m that is based on a parity check polynomial can be generated by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, and the code so generated achieves high error correction capability.

Embodiment G2

In the present embodiment, description is provided of a method of code configuration that is a generalization of the method described in embodiment F1 of configuring an LDPC-CC of coding rate 13/15 that is based on a parity check polynomial.

Bits of information bits $X_1$, $X_2$, $X_3$, $X_4$, $X_5$, $X_6$, $X_7$, $X_8$, $X_9$, $X_{10}$, $X_{11}$, $X_{12}$, $X_{13}$ and parity bits $P_1$, $P_2$, at time point j, are expressed $X_{1,j}$, $X_{2,j}$, $X_{3,j}$, $X_{4,j}$, $X_{5,j}$, $X_{6,j}$, $X_{7,j}$, $X_{8,j}$, $X_{9,j}$, $X_{10,j}$, $X_{11,j}$, $X_{12,j}$, $X_{13,j}$, and $P_{1,j}$, $P_{2,j}$, respectively.

A vector at time point j, is expressed $u_j=(X_{1,j}, X_{2,j}, X_{3,j}, X_{4,j}, X_{5,j}, X_{6,j}, X_{7,j}, X_{8,j}, X_{9,j}, X_{10,j}, X_{11,j}, X_{12,j}, X_{13,j}, P_{1,j}, P_{2,j})$ Given a delay operator D, polynomial expressions of the information bits $X_1$, $X_2$, $X_3$, $X_4$, $X_5$, $X_6$, $X_7$, $X_8$, $X_9$, $X_{10}$, $X_{11}$, $X_{12}$, $X_{13}$ are $X_1(D)$, $X_2(D)$, $X_3(D)$, $X_4(D)$, $X_5(D)$, $X_6(D)$, $X_7(D)$, $X_8(D)$, $X_9(D)$, $X_{10}(D)$, $X_{11}(D)$, $X_{12}(D)$, $X_{13}(D)$, and polynomial expressions of the parity bits $P_1$, $P_2$ are $P_1(D)$, $P_2(D)$.

Further, consideration is given to an LDPC-CC of coding rate 13/15 and time-varying period 2m that is based on a parity check polynomial.

The following mathematical expressions are provided as parity check polynomials satisfying zero for an LDPC-CC of coding rate 13/15 and time-varying period 2m that is based on a parity check polynomial.

First, because two parities $P_1$ and $P_2$ exist, parity check polynomials satisfying zero are provided as described in the following, two for $1\times P_1(D)$ and two for $1\times P_2(D)$.

[Math. 765-1]

$$\begin{aligned}
&\left(1+\sum_{s=1}^{R_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(1+\sum_{s=1}^{R_{\#(2i),3}} D^{\alpha\#(2i),3,s}\right)X_3(D)+\left(1+\sum_{s=1}^{R_{\#(2i),4}} D^{\alpha\#(2i),4,s}\right)X_4(D)+\\
&\left(1+\sum_{s=1}^{R_{\#(2i),5}} D^{\alpha\#(2i),5,s}\right)X_5(D)+\left(1+\sum_{s=1}^{R_{\#(2i),6}} D^{\alpha\#(2i),6,s}\right)X_6(D)+\left(\sum_{s=R_{\#(2i),7}+1}^{r_{\#(2i),7}} D^{\alpha\#(2i),7,s}\right)X_7(D)+\left(\sum_{s=R_{\#(2i),8}+1}^{r_{\#(2i),8}} D^{\alpha\#(2i),8,s}\right)X_8(D)+\\
&\left(\sum_{s=R_{\#(2i),9}+1}^{r_{\#(2i),9}} D^{\alpha\#(2i),9,s}\right)X_9(D)+\left(\sum_{s=R_{\#(2i),10}+1}^{r_{\#(2i),10}} D^{\alpha\#(2i),10,s}\right)X_{10}(D)+\left(\sum_{s=R_{\#(2i),11}+1}^{r_{\#(2i),11}} D^{\alpha\#(2i),11,s}\right)X_{11}(D)+\left(\sum_{s=R_{\#(2i),12}+1}^{r_{\#(2i),12}} D^{\alpha\#(2i),12,s}\right)X_{12}(D)+\\
&\left(\sum_{s=R_{\#(2i),13}+1}^{r_{\#(2i),13}} D^{\alpha\#(2i),13,s}\right)X_{13}(D)+P_1(D)+D^{\beta\#(2i),0}P_2(D)=
\end{aligned} \tag{147-1-1}$$

-continued $$\begin{aligned}
&(D^{\alpha\#(2i),1,R_{\#(2i),1}}+\ldots+D^{\alpha\#(2i),1,1}+1)X_1(D)+(D^{\alpha\#(2i),2,R_{\#(2i),2}}+\ldots+D^{\alpha\#(2i),2,1}+1)X_2(D)+\\
&(D^{\alpha\#(2i),3,R_{\#(2i),3}}+\ldots+D^{\alpha\#(2i),3,1}+1)X_3(D)+(D^{\alpha\#(2i),4,R_{\#(2i),4}}+\ldots+D^{\alpha\#(2i),4,1}+1)X_4(D)+\\
&(D^{\alpha\#(2i),5,R_{\#(2i),5}}+\ldots+D^{\alpha\#(2i),5,1}+1)X_5(D)+(D^{\alpha\#(2i),6,R_{\#(2i),6}}+\ldots+D^{\alpha\#(2i),6,1}+1)X_6(D)+\\
&(D^{\alpha\#(2i),7,r_{\#(2i),7}}+\ldots+D^{\alpha\#(2i),7,R_{\#(2i),7}+1})X_7(D)+(D^{\alpha\#(2i),8,r_{\#(2i),8}}+\ldots+D^{\alpha\#(2i),8,R_{\#(2i),8}+1})X_8(D)+\\
&(D^{\alpha\#(2i),9,r_{\#(2i),9}}+\ldots+D^{\alpha\#(2i),9,R_{\#(2i),9}+1})X_9(D)+(D^{\alpha\#(2i),10,r_{\#(2i),10}}+\ldots+D^{\alpha\#(2i),10,R_{\#(2i),10}+1})X_{10}(D)+\\
&(D^{\alpha\#(2i),11,r_{\#(2i),11}}+\ldots+D^{\alpha\#(2i),11,R_{\#(2i),11}+1})X_{11}(D)+(D^{\alpha\#(2i),12,r_{\#(2i),12}}+\ldots+D^{\alpha\#(2i),12,R_{\#(2i),12}+1})X_{12}(D)+\\
&(D^{\alpha\#(2i),13,r_{\#(2i),13}}+\ldots+D^{\alpha\#(2i),13,R_{\#(2i),13}+1})X_{13}(D)+P_1(D)+D^{\beta\#(2i),0}P_2(D)=0
\end{aligned}$$

[Math. 765-2]

$$\begin{aligned}
&\left(1+\sum_{s=1}^{R_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(1+\sum_{s=1}^{R_{\#(2i),3}} D^{\alpha\#(2i),3,s}\right)X_3(D)+\left(1+\sum_{s=1}^{R_{\#(2i),4}} D^{\alpha\#(2i),4,s}\right)X_4(D)+\\
&\left(1+\sum_{s=1}^{R_{\#(2i),5}} D^{\alpha\#(2i),5,s}\right)X_5(D)+\left(1+\sum_{s=1}^{R_{\#(2i),6}} D^{\alpha\#(2i),6,s}\right)X_6(D)+\left(\sum_{s=R_{\#(2i),7}+1}^{r_{\#(2i),7}} D^{\alpha\#(2i),7,s}\right)X_7(D)+\left(\sum_{s=R_{\#(2i),8}+1}^{r_{\#(2i),8}} D^{\alpha\#(2i),8,s}\right)X_8(D)+\\
&\left(\sum_{s=R_{\#(2i),9}+1}^{r_{\#(2i),9}} D^{\alpha\#(2i),9,s}\right)X_9(D)+\left(\sum_{s=R_{\#(2i),10}+1}^{r_{\#(2i),10}} D^{\alpha\#(2i),10,s}\right)X_{10}(D)+\left(\sum_{s=R_{\#(2i),11}+1}^{r_{\#(2i),11}} D^{\alpha\#(2i),11,s}\right)X_{11}(D)+\left(\sum_{s=R_{\#(2i),12}+1}^{r_{\#(2i),12}} D^{\alpha\#(2i),12,s}\right)X_{12}(D)+\\
&\left(\sum_{s=R_{\#(2i),13}+1}^{r_{\#(2i),13}} D^{\alpha\#(2i),13,s}\right)X_{13}(D)+P_1(D)+D^{\beta\#(2i),1}P_1(D)=
\end{aligned} \tag{147-1-2}$$

$$\begin{aligned}
&(D^{\alpha\#(2i),1,R_{\#(2i),1}}+\ldots+D^{\alpha\#(2i),1,1}+1)X_1(D)+(D^{\alpha\#(2i),2,R_{\#(2i),2}}+\ldots+D^{\alpha\#(2i),2,1}+1)X_2(D)+\\
&(D^{\alpha\#(2i),3,R_{\#(2i),3}}+\ldots+D^{\alpha\#(2i),3,1}+1)X_3(D)+(D^{\alpha\#(2i),4,R_{\#(2i),4}}+\ldots+D^{\alpha\#(2i),4,1}+1)X_4(D)+\\
&(D^{\alpha\#(2i),5,R_{\#(2i),5}}+\ldots+D^{\alpha\#(2i),5,1}+1)X_5(D)+(D^{\alpha\#(2i),6,R_{\#(2i),6}}+\ldots+D^{\alpha\#(2i),6,1}+1)X_6(D)+\\
&(D^{\alpha\#(2i),7,r_{\#(2i),7}}+\ldots+D^{\alpha\#(2i),7,R_{\#(2i),7}+1})X_7(D)+(D^{\alpha\#(2i),8,r_{\#(2i),8}}+\ldots+D^{\alpha\#(2i),8,R_{\#(2i),8}+1})X_8(D)+\\
&(D^{\alpha\#(2i),9,r_{\#(2i),9}}+\ldots+D^{\alpha\#(2i),9,R_{\#(2i),9}+1})X_9(D)+(D^{\alpha\#(2i),10,r_{\#(2i),10}}+\ldots+D^{\alpha\#(2i),10,R_{\#(2i),10}+1})X_{10}(D)+\\
&(D^{\alpha\#(2i),11,r_{\#(2i),11}}+\ldots+D^{\alpha\#(2i),11,R_{\#(2i),11}+1})X_{11}(D)+(D^{\alpha\#(2i),12,r_{\#(2i),12}}+\ldots+D^{\alpha\#(2i),12,R_{\#(2i),12}+1})X_{12}(D)+\\
&(D^{\alpha\#(2i),13,r_{\#(2i),13}}+\ldots+D^{\alpha\#(2i),13,R_{\#(2i),13}+1})X_{13}(D)+P_1(D)+D^{\beta\#(2i),1}P_1(D)=0
\end{aligned}$$

-continued

[Math. 765-3]

$$\left(\sum_{s=R_{\#(2i),1}+1}^{r_{\#(2i),1}} D^{\alpha\#(2i),1,s}\right)X_1(D) + \left(\sum_{s=R_{\#(2i),2}+1}^{r_{\#(2i),2}} D^{\alpha\#(2i),2,s}\right)X_2(D) + \left(\sum_{s=R_{\#(2i),3}+1}^{r_{\#(2i),3}} D^{\alpha\#(2i),3,s}\right)X_3(D) + \left(\sum_{s=R_{\#(2i),4}+1}^{r_{\#(2i),4}} D^{\alpha\#(2i),4,s}\right)X_4(i) + \left(\sum_{s=R_{\#(2i),5}+1}^{r_{\#(2i),5}} D^{\alpha\#(2i),5,s}\right)X_5(D) + \left(\sum_{s=R_{\#(2i),6}+1}^{r_{\#(2i),6}} D^{\alpha\#(2i),6,s}\right)X_6(D) + \left(1+\sum_{s=1}^{R_{\#(2i),7}} D^{\alpha\#(2i),7,s}\right)X_7(D) + \left(1+\sum_{s=1}^{R_{\#(2i),8}} D^{\alpha\#(2i),8,s}\right)X_8(D) += \left(1+\sum_{s=1}^{R_{\#(2i),8}} D^{\alpha\#(2i),8,s}\right)X_8(D) + \left(1+\sum_{s=1}^{R_{\#(2i),10}} D^{\alpha\#(2i),10,s}\right)X_{10}(D) + \left(1+\sum_{s=1}^{R_{\#(2i),11}} D^{\alpha\#(2i),11,s}\right)X_{11}(D) + \left(1+\sum_{s=1}^{R_{\#(2i),12}} D^{\alpha\#(2i),12,s}\right)X_{12}(D) + \left(1+\sum_{s=1}^{R_{\#(2i),13}} D^{\alpha\#(2i),13,s}\right)X_{13}(D) + P_2(D) + D^{\beta\#(2i),2}P_1(D) \tag{147-2-1}$$

$$\begin{aligned}
&(D^{\alpha\#(2i),1,r_{\#(2i),1}} + \dots + D^{\alpha\#(2i),1,R_{\#(2i),1}+1})X_1(D) + (D^{\alpha\#(2i),2,r_{\#(2i),2}} + \dots + D^{\alpha\#(2i),2,R_{\#(2i),2}+1})X_2(D) + \\
&(D^{\alpha\#(2i),3,r_{\#(2i),3}} + \dots + D^{\alpha\#(2i),3,R_{\#(2i),3}+1})X_3(D) + (D^{\alpha\#(2i),4,r_{\#(2i),4}} + \dots + D^{\alpha\#(2i),4,R_{\#(2i),4}+1})X_4(D) + \\
&(D^{\alpha\#(2i),5,r_{\#(2i),5}} + \dots + D^{\alpha\#(2i),5,R_{\#(2i),5}+1})X_5(D) + (D^{\alpha\#(2i),6,r_{\#(2i),6}} + \dots + D^{\alpha\#(2i),6,R_{\#(2i),6}+1})X_6(D) + \\
&(D^{\alpha\#(2i),7,R_{\#(2i),7}} + \dots + D^{\alpha\#(2i),7,1} + 1)X_7(D) + (D^{\alpha\#(2i),8,R_{\#(2i),8}} + \dots + D^{\alpha\#(2i),8,1} + 1)X_8(D) + \\
&(D^{\alpha\#(2i),9,R_{\#(2i),9}} + \dots + D^{\alpha\#(2i),9,1} + 1)X_9(D) + (D^{\alpha\#(2i),10,R_{\#(2i),10}} + \dots + D^{\alpha\#(2i),10,1} + 1)X_{10}(D) + \\
&(D^{\alpha\#(2i),11,R_{\#(2i),11}} + \dots + D^{\alpha\#(2i),11,1} + 1)X_{11}(D) + (D^{\alpha\#(2i),12,R_{\#(2i),12}} + \dots + D^{\alpha\#(2i),12,1} + 1)X_{12}(D) + \\
&(D^{\alpha\#(2i),13,R_{\#(2i),13}} + \dots + D^{\alpha\#(2i),13,1} + 1)X_{13}(D) + P_2(D) + D^{\beta\#(2i),2}P_1(D) = 0
\end{aligned}$$

-continued

[Math. 765-4]

$$\left(\sum_{s=R_{\#(2i),1}+1}^{r_{\#(2i),1}} D^{\alpha\#(2i),1,s}\right)X_1(D) + \left(\sum_{s=R_{\#(2i),2}+1}^{r_{\#(2i),2}} D^{\alpha\#(2i),2,s}\right)X_2(D) + \left(\sum_{s=R_{\#(2i),3}+1}^{r_{\#(2i),3}} D^{\alpha\#(2i),3,s}\right)X_3(D) + \left(\sum_{s=R_{\#(2i),4}+1}^{r_{\#(2i),4}} D^{\alpha\#(2i),4,s}\right)X_4(D) + \left(\sum_{s=R_{\#(2i),5}+1}^{r_{\#(2i),5}} D^{\alpha\#(2i),5,s}\right)X_5(D) + \left(\sum_{s=R_{\#(2i),6}+1}^{r_{\#(2i),6}} D^{\alpha\#(2i),6,s}\right)X_6(D) + \left(1+\sum_{s=1}^{R_{\#(2i),7}} D^{\alpha\#(2i),7,s}\right)X_7(D) + \left(1+\sum_{s=1}^{R_{\#(2i),8}} D^{\alpha\#(2i),8,s}\right)X_8(D) + \left(1+\sum_{s=1}^{R_{\#(2i),8}} D^{\alpha\#(2i),8,s}\right)X_8(D) + \left(1+\sum_{s=1}^{R_{\#(2i),10}} D^{\alpha\#(2i),10,s}\right)X_{10}(D) + \left(1+\sum_{s=1}^{R_{\#(2i),11}} D^{\alpha\#(2i),11,s}\right)X_{11}(D) + \left(1+\sum_{s=1}^{R_{\#(2i),12}} D^{\alpha\#(2i),12,s}\right)X_{12}(D) + \left(1+\sum_{s=1}^{R_{\#(2i),13}} D^{\alpha\#(2i),13,s}\right)X_{13}(D) + P_2(D) + D^{\beta\#(2i),3}P_2(D) = \tag{147-2-2}$$

$$\begin{aligned}
&(D^{\alpha\#(2i),1,r_{\#(2i),1}} + \dots + D^{\alpha\#(2i),1,R_{\#(2i),1}+1})X_1(D) + (D^{\alpha\#(2i),2,r_{\#(2i),2}} + \dots + D^{\alpha\#(2i),2,R_{\#(2i),2}+1})X_2(D) + \\
&(D^{\alpha\#(2i),3,r_{\#(2i),3}} + \dots + D^{\alpha\#(2i),3,R_{\#(2i),3}+1})X_3(D) + (D^{\alpha\#(2i),4,r_{\#(2i),4}} + \dots + D^{\alpha\#(2i),4,R_{\#(2i),4}+1})X_4(D) + \\
&(D^{\alpha\#(2i),5,r_{\#(2i),5}} + \dots + D^{\alpha\#(2i),5,R_{\#(2i),5}+1})X_5(D) + (D^{\alpha\#(2i),6,r_{\#(2i),6}} + \dots + D^{\alpha\#(2i),6,R_{\#(2i),6}+1})X_6(D) + \\
&(D^{\alpha\#(2i),7,R_{\#(2i),7}} + \dots + D^{\alpha\#(2i),7,1} + 1)X_7(D) + (D^{\alpha\#(2i),8,R_{\#(2i),8}} + \dots + D^{\alpha\#(2i),8,1} + 1)X_8(D) + \\
&(D^{\alpha\#(2i),9,R_{\#(2i),9}} + \dots + D^{\alpha\#(2i),9,1} + 1)X_9(D) + (D^{\alpha\#(2i),10,R_{\#(2i),10}} + \dots + D^{\alpha\#(2i),10,1} + 1)X_{10}(D) + \\
&(D^{\alpha\#(2i),11,R_{\#(2i),11}} + \dots + D^{\alpha\#(2i),11,1} + 1)X_{11}(D) + (D^{\alpha\#(2i),12,R_{\#(2i),12}} + \dots + D^{\alpha\#(2i),12,1} + 1)X_{12}(D) + \\
&(D^{\alpha\#(2i),13,R_{\#(2i),13}} + \dots + D^{\alpha\#(2i),13,1} + 1)X_{13}(D) + P_2(D) + D^{\beta\#(2i),3}P_2(D) = 0
\end{aligned}$$

In expressions (147-1-1), (147-1-2), (147-2-1), (147-2-2), i is an integer no smaller than zero and no greater than m−1 (i=0, 1, . . . , m−2, m−1).

In expressions (147-1-1), (147-1-2), (147-2-1), (147-2-2), $\alpha_{\#(2i),p,q}$ (where p is an integer no smaller than one and no greater than thirteen, q is an integer no smaller than one and no greater than $r_{\#(2i),p}$ (where $r_{\#(2i),p}$ is a natural number)) and $\beta_{\#(2i),0}$ is a natural number, $\beta_{\#(2i),1}$ is a natural number, $\beta_{\#(2i),2}$ is an integer no smaller than zero, and $\beta_{\#(2i),3}$ is a natural number.

Further, $R_{\#(2i),p}$ is a natural number satisfying $1 \le R_{\#(2i),p} < r_{\#(2i),p}$.

Further, y is an integer no smaller than one and no greater than $r_{\#(2i),p,z}$ is an integer no smaller than one and no greater than $r_{\#2i,p}$, and $\alpha_{\#(2i),p,y} \neq \alpha_{\#(2i),p,z}$ holds true for $\forall$(y, z) where y≠z. ∀ is a universal quantifier. (y is an integer no smaller than one and no greater than $r_{\#(2i),p,z}$ is an integer no smaller than one and no greater than $r_{\#2i,p}$, and $\alpha_{\#(2i),p,y} \neq \alpha_{\#(2i),p,z}$ holds true for all y and all z satisfying y≠z.)

Note that in the following, to simplify explanation, a parity check polynomial satisfying zero that is expressed by expression (147-1-1) or expression (147-1-2) is referred to as "#(2i); first expression" for realizing a time-varying period 2m, and a parity check polynomial satisfying zero that is expressed by expression (147-2-1) or expression (147-2-2) is referred to as "#(2i); second expression" for realizing a time-varying period 2m.

Thus, for each i, as #(2i); first expression for realizing a time-varying period 2m, a parity check polynomial satisfying zero expressed by either expression (147-1-1) or expression (147-1-2) is prepared.

That is, for i=0, a parity check polynomial satisfying zero provided by expression (147-1-1) where i=0, or a parity check polynomial satisfying zero provided by expression (147-1-2) where i=0 is prepared.

Similarly:

for i=1, a parity check polynomial satisfying zero provided by expression (147-1-1) where i=1, or a parity check polynomial satisfying zero provided by expression (147-1-2) where i=1 is prepared;

for i=2, a parity check polynomial satisfying zero provided by expression (147-1-1) where i=2, or a parity check polynomial satisfying zero provided by expression (147-1-2) where i=2 is prepared;

⋮ for i=z, a parity check polynomial satisfying zero provided by expression (147-1-1) where i=z, or a parity check polynomial satisfying zero provided by expression (147-1-2) where i=z is prepared (where z is an integer no smaller than zero and no greater than m−1); and

⋮ for i=m−1, a parity check polynomial satisfying zero provided by expression (147-1-1) where i=m−1, or a parity check polynomial satisfying zero provided by expression (147-1-2) where i=m−1 is prepared.

Similarly, for each i, as #(2i); second expression for realizing a time-varying period 2m, a parity check polynomial satisfying zero expressed by either expression (147-2-1) or expression (147-2-2) is prepared.

That is, for i=0, a parity check polynomial satisfying zero provided by expression (147-2-1) where i=0, or a parity check polynomial satisfying zero provided by expression (147-2-2) where i=0 is prepared.

Similarly:

for i=1, a parity check polynomial satisfying zero provided by expression (147-2-1) where i=1, or a parity check polynomial satisfying zero provided by expression (147-2-2) where i=1 is prepared;

for i=2, a parity check polynomial satisfying zero provided by expression (147-2-1) where i=2, or a parity check polynomial satisfying zero provided by expression (147-2-2) where i=2 is prepared;

⋮ for i=z, a parity check polynomial satisfying zero provided by expression (147-2-1) where i=z, or a parity check polynomial satisfying zero provided by expression (147-2-2) where i=z is prepared (where z is an integer no smaller than zero and no greater than m−1); and

⋮ for i=m−1, a parity check polynomial satisfying zero provided by expression (147-2-1) where i=m−1, or a parity check polynomial satisfying zero provided by expression (147-2-2) where i=m−1 is prepared.

Similarly, because two parities $P_1$ and $P_2$ exist, parity check polynomials satisfying zero are provided as described in the following, two for $1 \times P_1(D)$ and two for $1 \times P_2(D)$.

[Math. 766-1]

$$
\begin{aligned}
&\left(\sum_{s=R_{\#(2i+1),1}+1}^{r_{\#(2i+1),1}} D^{\alpha_{\#(2i+1),1,s}}\right)X_1(D) + \left(\sum_{s=R_{\#(2i+1),1}+2}^{r_{\#(2i+1),2}} D^{\alpha_{\#(2i+1),2,s}}\right)X_2(D) + \left(\sum_{s=R_{\#(2i+1),1}+3}^{r_{\#(2i+1),3}} D^{\alpha_{\#(2i+1),3,s}}\right)X_3(D) + \\
&\left(\sum_{s=R_{\#(2i+1),1}+4}^{r_{\#(2i+1),4}} D^{\alpha_{\#(2i+1),4,s}}\right)X_4(D) + \left(\sum_{s=R_{\#(2i+1),1}+5}^{r_{\#(2i+1),5}} D^{\alpha_{\#(2i+1),5,s}}\right)X_5(D) + \left(\sum_{s=R_{\#(2i+1),1}+6}^{r_{\#(2i+1),6}} D^{\alpha_{\#(2i+1),6,s}}\right)X_6(D) + \\
&\left(1+\sum_{s=1}^{R_{\#(2i+1),7}} D^{\alpha_{\#(2i+1),7,s}}\right)X_7(D) + \left(1+\sum_{s=1}^{R_{\#(2i+1),8}} D^{\alpha_{\#(2i+1),8,s}}\right)X_8(D) + \left(1+\sum_{s=1}^{R_{\#(2i+1),9}} D^{\alpha_{\#(2i+1),9,s}}\right)X_9(D) + \\
&\left(1+\sum_{s=1}^{R_{\#(2i+1),10}} D^{\alpha_{\#(2i+1),10,s}}\right)X_{10}(D) + \left(1+\sum_{s=1}^{R_{\#(2i+1),11}} D^{\alpha_{\#(2i+1),11,s}}\right)X_{11}(D) + \left(1+\sum_{s=1}^{R_{\#(2i+1),12}} D^{\alpha_{\#(2i+1),12,s}}\right)X_{12}(D) + \\
&\left(1+\sum_{s=1}^{R_{\#(2i+1),13}} D^{\alpha_{\#(2i+1),13,s}}\right)X_{13}(D) + \\
&P_1(D) + D^{\beta_{\#(2i+1),0}}P_2(D) = \\
&(D^{\alpha_{\#(2i+1),1,r_{\#(2i+1),1}}} + \ldots + D^{\alpha_{\#(2i+1),1,R_{\#(2i+1),1}}} + 1)X_1(D) + \\
&(D^{\alpha_{\#(2i+1),2,r_{\#(2i+1),2}}} + \ldots + D^{\alpha_{\#(2i+1),2,R_{\#(2i+1),2}}} + 1)X_2(D) + \\
&(D^{\alpha_{\#(2i+1),3,r_{\#(2i+1),3}}} + \ldots + D^{\alpha_{\#(2i+1),3,R_{\#(2i+1),3}}} + 1)X_3(D) + \\
&(D^{\alpha_{\#(2i+1),4,r_{\#(2i+1),4}}} + \ldots + D^{\alpha_{\#(2i+1),4,R_{\#(2i+1),4}}} + 1)X_4(D) + \\
&(D^{\alpha_{\#(2i+1),5,r_{\#(2i+1),5}}} + \ldots + D^{\alpha_{\#(2i+1),5,R_{\#(2i+1),5}}} + 1)X_5(D) + \\
&(D^{\alpha_{\#(2i+1),6,r_{\#(2i+1),6}}} + \ldots + D^{\alpha_{\#(2i+1),6,R_{\#(2i+1),6}}} + 1)X_6(D) + \\
&(D^{\alpha_{\#(2i+1),7,R_{\#(2i+1),7}}} + \ldots + D^{\alpha_{\#(2i+1),7,1}} + 1)X_7(D) + \\
&(D^{\alpha_{\#(2i+1),8,R_{\#(2i+1),8}}} + \ldots + D^{\alpha_{\#(2i+1),8,1}} + 1)X_8(D) + \\
&(D^{\alpha_{\#(2i+1),9,R_{\#(2i+1),9}}} + \ldots + D^{\alpha_{\#(2i+1),9,1}} + 1)X_9(D) + \\
&(D^{\alpha_{\#(2i+1),10,R_{\#(2i+1),10}}} + \ldots + D^{\alpha_{\#(2i+1),10,1}} + 1)X_{10}(D) + \\
&(D^{\alpha_{\#(2i+1),11,R_{\#(2i+1),11}}} + \ldots + D^{\alpha_{\#(2i+1),11,1}} + 1)X_{11}(D) + \\
&(D^{\alpha_{\#(2i+1),12,R_{\#(2i+1),12}}} + \ldots + D^{\alpha_{\#(2i+1),12,1}} + 1)X_{12}(D) + \\
&(D^{\alpha_{\#(2i+1),13,R_{\#(2i+1),13}}} + \ldots + D^{\alpha_{\#(2i+1),13,1}} + 1)X_{13}(D) + \\
&P_1(D) + D^{\beta_{\#(2i+1),0}}P_2(D) = 0
\end{aligned}
\tag{148-1-1}
$$

-continued

[Math. 766-2]

$$\left(\sum_{s=R_{\#(2i+1),1}+1}^{r_{\#(2i+1),1}} D^{\alpha\#(2i+1),1,s}\right)X_1(D) + \left(\sum_{s=R_{\#(2i+1),1}+2}^{r_{\#(2i+1),2}} D^{\alpha\#(2i+1),2,s}\right)X_2(D) + \left(\sum_{s=R_{\#(2i+1),1}+3}^{r_{\#(2i+1),3}} D^{\alpha\#(2i+1),3,s}\right)X_3(D) + \left(\sum_{s=R_{\#(2i+1),1}+4}^{r_{\#(2i+1),4}} D^{\alpha\#(2i+1),4,s}\right)X_4(D) + \left(\sum_{s=R_{\#(2i+1),1}+5}^{r_{\#(2i+1),5}} D^{\alpha\#(2i+1),5,s}\right)X_5(D) + \left(\sum_{s=R_{\#(2i+1),1}+6}^{r_{\#(2i+1),6}} D^{\alpha\#(2i+1),6,s}\right)X_6(D) + \left(1+\sum_{s=1}^{R_{\#(2i+1),7}} D^{\alpha\#(2i+1),7,s}\right)X_7(D) + \left(1+\sum_{s=1}^{R_{\#(2i+1),8}} D^{\alpha\#(2i+1),8,s}\right)X_8(D) + \left(1+\sum_{s=1}^{R_{\#(2i+1),9}} D^{\alpha\#(2i+1),9,s}\right)X_9(D) + \left(1+\sum_{s=1}^{R_{\#(2i+1),10}} D^{\alpha\#(2i+1),10,s}\right)X_{10}(D) + \left(1+\sum_{s=1}^{R_{\#(2i+1),11}} D^{\alpha\#(2i+1),11,s}\right)X_{11}(D) + \left(1+\sum_{s=1}^{R_{\#(2i+1),12}} D^{\alpha\#(2i+1),12,s}\right)X_{12}(D) + \left(1+\sum_{s=1}^{R_{\#(2i+1),13}} D^{\alpha\#(2i+1),13,s}\right)X_{13}(D) + P_1(D) + D^{\beta\#(2i+1),1}P_1(D) = \tag{148-1-2}$$

$$(D^{\alpha\#(2i+1),1,r_{\#(2i+1),1}} + \ldots + D^{\alpha\#(2i+1),1,R_{\#(2i+1),1}} + 1)X_1(D) + (D^{\alpha\#(2i+1),2,r_{\#(2i+1),2}} + \ldots + D^{\alpha\#(2i+1),2,R_{\#(2i+1),2}} + 1)X_2(D) + (D^{\alpha\#(2i+1),3,r_{\#(2i+1),3}} + \ldots + D^{\alpha\#(2i+1),3,R_{\#(2i+1),3}} + 1)X_3(D) + (D^{\alpha\#(2i+1),4,r_{\#(2i+1),4}} + \ldots + D^{\alpha\#(2i+1),4,R_{\#(2i+1),4}} + 1)X_4(D) + (D^{\alpha\#(2i+1),5,r_{\#(2i+1),5}} + \ldots + D^{\alpha\#(2i+1),5,R_{\#(2i+1),5}} + 1)X_5(D) + (D^{\alpha\#(2i+1),6,r_{\#(2i+1),6}} + \ldots + D^{\alpha\#(2i+1),6,R_{\#(2i+1),6}} + 1)$$

$$X_6(D) + (D^{\alpha\#(2i+1),7,R_{\#(2i+1),7}} + \ldots + D^{\alpha\#(2i+1),7,1} + 1)X_7(D) + (D^{\alpha\#(2i+1),8,R_{\#(2i+1),8}} + \ldots + D^{\alpha\#(2i+1),8,1} + 1)X_8(D) + (D^{\alpha\#(2i+1),9,R_{\#(2i+1),9}} + \ldots + D^{\alpha\#(2i+1),9,1} + 1)X_9(D) + (D^{\alpha\#(2i+1),10,R_{\#(2i+1),10}} + \ldots + D^{\alpha\#(2i+1),10,1} + 1)X_{10}(D) + (D^{\alpha\#(2i+1),11,R_{\#(2i+1),11}} + \ldots + D^{\alpha\#(2i+1),11,1} + 1)X_{11}(D) + (D^{\alpha\#(2i+1),12,R_{\#(2i+1),12}} + \ldots + D^{\alpha\#(2i+1),12,1} + 1)X_{12}(D) + (D^{\alpha\#(2i+1),13,R_{\#(2i+1),13}} + \ldots + D^{\alpha\#(2i+1),13,1} + 1)X_{13}(D) + P_1(D) + D^{\beta\#(2i+1),1}P_1(D) = 0$$

-continued

[Math. 766-3]

$$\left(1+\sum_{s=1}^{R_{\#(2i+1),1}} D^{\alpha\#(2i+1),1,s}\right)X_1(D) + \left(1+\sum_{s=1}^{R_{\#(2i+1),2}} D^{\alpha\#(2i+1),2,s}\right)X_2(D) + \left(1+\sum_{s=1}^{R_{\#(2i+1),3}} D^{\alpha\#(2i+1),3,s}\right)X_3(D) + \left(1+\sum_{s=1}^{R_{\#(2i+1),4}} D^{\alpha\#(2i+1),4,s}\right)X_4(D) + \left(1+\sum_{s=1}^{R_{\#(2i+1),5}} D^{\alpha\#(2i+1),5,s}\right)X_5(D) + \left(1+\sum_{s=1}^{R_{\#(2i+1),6}} D^{\alpha\#(2i+1),6,s}\right)X_6(D) + \left(\sum_{s=R_{\#(2i+1),7}+1}^{r_{\#(2i+1),7}} D^{\alpha\#(2i+1),7,s}\right)X_7(D) + \left(\sum_{s=R_{\#(2i+1),8}+1}^{r_{\#(2i+1),8}} D^{\alpha\#(2i+1),8,s}\right)X_8(D) + \left(\sum_{s=R_{\#(2i+1),9}+1}^{r_{\#(2i+1),9}} D^{\alpha\#(2i+1),9,s}\right)X_9(D) + \left(\sum_{s=R_{\#(2i+1),10}+1}^{r_{\#(2i+1),10}} D^{\alpha\#(2i+1),10,s}\right)X_{10}(D) + \left(\sum_{s=R_{\#(2i+1),11}+1}^{r_{\#(2i+1),11}} D^{\alpha\#(2i+1),11,s}\right)X_{11}(D) + \left(\sum_{s=R_{\#(2i+1),12}+1}^{r_{\#(2i+1),12}} D^{\alpha\#(2i+1),12,s}\right)X_{12}(D) + \left(\sum_{s=R_{\#(2i+1),13}+1}^{r_{\#(2i+1),13}} D^{\alpha\#(2i+1),13,s}\right)X_{13}(D) + \tag{148-2-1}$$

$$P_2(D) + D^{\beta\#(2i+1),2}P_1(D) = (D^{\alpha\#(2i+1),1,R_{\#(2i+1),1}} + \ldots + D^{\alpha\#(2i+1),1,1} + 1)X_1(D) + (D^{\alpha\#(2i+1),2,R_{\#(2i+1),2}} + \ldots + D^{\alpha\#(2i+1),2,1} + 1)X_2(D) + (D^{\alpha\#(2i+1),3,R_{\#(2i+1),3}} + \ldots + D^{\alpha\#(2i+1),3,1} + 1)X_3(D) + (D^{\alpha\#(2i+1),4,R_{\#(2i+1),4}} + \ldots + D^{\alpha\#(2i+1),4,1} + 1)X_4(D) + (D^{\alpha\#(2i+1),5,R_{\#(2i+1),5}} + \ldots + D^{\alpha\#(2i+1),5,1} + 1)X_5(D) + (D^{\alpha\#(2i+1),6,R_{\#(2i+1),6}} + \ldots + D^{\alpha\#(2i+1),6,1} + 1)X_6(D) +$$

-continued $$(D^{\alpha\#(2i+1),7,r_{\#(2i+1),7}} + \ldots + D^{\alpha\#(2i+1),7,R_{\#(2i+1),7}} + 1)X_7(D) +$$
$$(D^{\alpha\#(2i+1),8,r_{\#(2i+1),8}} + \ldots + D^{\alpha\#(2i+1),8,R_{\#(2i+1),8}} + 1)X_8(D) +$$
$$(D^{\alpha\#(2i+1),9,r_{\#(2i+1),9}} + \ldots + D^{\alpha\#(2i+1),9,R_{\#(2i+1),9}} + 1)X_9(D) +$$
$$(D^{\alpha\#(2i+1),10,r_{\#(2i+1),10}} + \ldots + D^{\alpha\#(2i+1),10,R_{\#(2i+1),10}} + 1)X_{10}(D) +$$
$$(D^{\alpha\#(2i+1),11,r_{\#(2i+1),11}} + \ldots + D^{\alpha\#(2i+1),11,R_{\#(2i+1),11}} + 1)X_{11}(D) +$$
$$(D^{\alpha\#(2i+1),12,r_{\#(2i+1),12}} + \ldots + D^{\alpha\#(2i+1),12,R_{\#(2i+1),12}} + 1)X_{12}(D) +$$
$$(D^{\alpha\#(2i+1),13,r_{\#(2i+1),13}} + \ldots + D^{\alpha\#(2i+1),13,R_{\#(2i+1),13}} + 1)X_{13}(D) + P_2(D) + D^{\beta\#(2i+1),2}P_1(D) = 0$$

[Math. 766-4]

$$\left(1+\sum_{s=1}^{R_{\#(2i+1),1}} D^{\alpha\#(2i+1),1,s}\right)X_1(D) + \left(1+\sum_{s=1}^{R_{\#(2i+1),2}} D^{\alpha\#(2i+1),2,s}\right)X_2(D) + \left(1+\sum_{s=1}^{R_{\#(2i+1),3}} D^{\alpha\#(2i+1),3,s}\right)X_3(D) + \left(1+\sum_{s=1}^{R_{\#(2i+1),4}} D^{\alpha\#(2i+1),4,s}\right)X_4(D) + \left(1+\sum_{s=1}^{R_{\#(2i+1),5}} D^{\alpha\#(2i+1),5,s}\right)X_5(D) + \left(1+\sum_{s=1}^{R_{\#(2i+1),6}} D^{\alpha\#(2i+1),6,s}\right)X_6(D) + \left(\sum_{s=R_{\#(2i+1),7}+1}^{r_{\#(2i+1),7}} D^{\alpha\#(2i+1),7,s}\right)X_7(D) + \left(\sum_{s=R_{\#(2i+1),8}+1}^{r_{\#(2i+1),8}} D^{\alpha\#(2i+1),8,s}\right)X_8(D) + \left(\sum_{s=R_{\#(2i+1),9}+1}^{r_{\#(2i+1),9}} D^{\alpha\#(2i+1),9,s}\right)X_9(D) + \left(\sum_{s=R_{\#(2i+1),10}+1}^{r_{\#(2i+1),10}} D^{\alpha\#(2i+1),10,s}\right)X_{10}(D) + \left(\sum_{s=R_{\#(2i+1),11}+1}^{r_{\#(2i+1),11}} D^{\alpha\#(2i+1),11,s}\right)X_{11}(D) + \left(\sum_{s=R_{\#(2i+1),12}+1}^{r_{\#(2i+1),12}} D^{\alpha\#(2i+1),12,s}\right)X_{12}(D) + \left(\sum_{s=R_{\#(2i+1),13}+1}^{r_{\#(2i+1),13}} D^{\alpha\#(2i+1),13,s}\right)X_{13}(D) + \tag{148-2-2}$$

-continued $$P_2(D) + D^{\beta\#(2i+1),3}P_2(D) =$$
$$(D^{\alpha\#(2i+1),1,R_{\#(2i+1),1}} + \ldots + D^{\alpha\#(2i+1),1,1} + 1)X_1(D) +$$
$$(D^{\alpha\#(2i+1),2,R_{\#(2i+1),2}} + \ldots + D^{\alpha\#(2i+1),2,1} + 1)X_2(D) +$$
$$(D^{\alpha\#(2i+1),3,R_{\#(2i+1),3}} + \ldots + D^{\alpha\#(2i+1),3,1} + 1)X_3(D) +$$
$$(D^{\alpha\#(2i+1),4,R_{\#(2i+1),4}} + \ldots + D^{\alpha\#(2i+1),4,1} + 1)X_4(D) +$$
$$(D^{\alpha\#(2i+1),5,R_{\#(2i+1),5}} + \ldots + D^{\alpha\#(2i+1),5,1} + 1)X_5(D) +$$
$$(D^{\alpha\#(2i+1),6,R_{\#(2i+1),6}} + \ldots + D^{\alpha\#(2i+1),6,1} + 1)X_6(D) +$$

$$(D^{\alpha\#(2i+1),7,r_{\#(2i+1),7}} + \ldots + D^{\alpha\#(2i+1),7,R_{\#(2i+1),7}} + 1)X_7(D) +$$
$$(D^{\alpha\#(2i+1),8,r_{\#(2i+1),8}} + \ldots + D^{\alpha\#(2i+1),8,R_{\#(2i+1),8}} + 1)X_8(D) +$$
$$(D^{\alpha\#(2i+1),9,r_{\#(2i+1),9}} + \ldots + D^{\alpha\#(2i+1),9,R_{\#(2i+1),9}} + 1)X_9(D) +$$
$$(D^{\alpha\#(2i+1),10,r_{\#(2i+1),10}} + \ldots + D^{\alpha\#(2i+1),10,R_{\#(2i+1),10}} + 1)X_{10}(D) +$$
$$(D^{\alpha\#(2i+1),11,r_{\#(2i+1),11}} + \ldots + D^{\alpha\#(2i+1),11,R_{\#(2i+1),11}} + 1)X_{11}(D) +$$
$$(D^{\alpha\#(2i+1),12,r_{\#(2i+1),12}} + \ldots + D^{\alpha\#(2i+1),12,R_{\#(2i+1),12}} + 1)X_{12}(D) +$$
$$(D^{\alpha\#(2i+1),13,r_{\#(2i+1),13}} + \ldots + D^{\alpha\#(2i+1),13,R_{\#(2i+1),13}} + 1)X_{13}(D) + P_2(D) + D^{\beta\#(2i+1),3}P_2(D) = 0$$

In expressions (148-1-1), (148-1-2), (148-2-1), (148-2-2), i is an integer no smaller than zero and no greater than m−1 (i=0, 1, . . . , m−2, m−1).

In expressions (148-1-1), (148-1-2), (148-2-1), (148-2-2), $\alpha_{\#(2i+1),p,q}$ (where p is an integer no smaller than one and no greater than thirteen, q is an integer no smaller than one and no greater than $r_{\#(2i+1),p}$ (where $r_{\#(2i+1),p}$ is a natural number)) and $\beta_{\#(2i+1),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, $R_{\#(2i),p}$ is a natural number satisfying $1 \le R_{\#(2i+1),p} < r_{\#(2i+1),p}$.

Further, y is an integer no smaller than one and no greater than $r_{\#(2i+1),p}$, z is an integer no smaller than one and no greater than $r_{\#(2i+1),p}$, and $\alpha_{\#(2i+1)p,y} \neq \alpha_{\#(2i+1),p,z}$ holds true for $^\forall$(y, z) where y≠z. ∀ is a universal quantifier. (y is an integer no smaller than one and no greater than $r_{\#(2i+1),p,z}$ is an integer no smaller than one and no greater than $r_{\#(2i+1),p}$, and $\alpha_{\#(2i+i),p,y} \neq \alpha_{\#(2i+1)p,z}$ holds true for all y and all z satisfying y≠z.)

Note that in the following, to simplify explanation, a parity check polynomial satisfying zero that is expressed by expression (148-1-1) or expression (148-1-2) is referred to as "#(2i+1); first expression" for realizing a time-varying period 2m, and a parity check polynomial satisfying zero that is expressed by expression (148-2-1) or expression (148-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (148-1-1) or expression (148-1-2) is prepared.

That is, for i=0, a parity check polynomial satisfying zero provided by expression (148-1-1) where i=0, or a parity check polynomial satisfying zero provided by expression (148-1-2) where i=0 is prepared.

Similarly:

for i=1, a parity check polynomial satisfying zero provided by expression (148-1-1) where i=1, or a parity check polynomial satisfying zero provided by expression (148-1-2) where i=1 is prepared;

for i=2, a parity check polynomial satisfying zero provided by expression (148-1-1) where i=2, or a parity check polynomial satisfying zero provided by expression (148-1-2) where i=2 is prepared;

⋮ for i=z, a parity check polynomial satisfying zero provided by expression (148-1-1) where i=z, or a parity check polynomial satisfying zero provided by expression (148-1-2) where i=z is prepared (where z is an integer no smaller than zero and no greater than m−1); and

⋮ for i=m−1, a parity check polynomial satisfying zero provided by expression (148-1-1) where i=m−1, or a parity check polynomial satisfying zero provided by expression (148-1-2) where i=m−1 is prepared.

Similarly, for each i, as #(2i+1); second expression for realizing a time-varying period 2m, a parity check polynomial satisfying zero expressed by either expression (148-2-1) or expression (148-2-2) is prepared.

That is, for i=0, a parity check polynomial satisfying zero provided by expression (148-2-1) where i=0, or a parity check polynomial satisfying zero provided by expression (148-2-2) where i=0 is prepared.

Similarly:

for i=1, a parity check polynomial satisfying zero provided by expression (148-2-1) where i=1, or a parity check polynomial satisfying zero provided by expression (148-2-2) where i=1 is prepared;

for 2, a parity check polynomial satisfying zero provided by expression (148-2-1) where 2, or a parity check polynomial satisfying zero provided by expression (148-2-2) where i=2 is prepared;

⋮ for i=z, a parity check polynomial satisfying zero provided by expression (148-2-1) where i=z, or a parity check polynomial satisfying zero provided by expression (148-2-2) where i=z is prepared (where z is an integer no smaller than zero and no greater than m−1); and

⋮ for i=m−1, a parity check polynomial satisfying zero provided by expression (148-2-1) where i=m−1, or a parity check polynomial satisfying zero provided by expression (148-2-2) where i=m−1 is prepared.

As such, an LDPC-CC of coding rate 13/15 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (147-1-1) or expression (147-1-2), parity check polynomials satisfying zero provided by expression (147-2-1) or expression (147-2-2), parity check polynomials satisfying zero provided by expression (148-1-1) or expression (148-1-2), and parity check polynomials satisfying zero provided by expression (148-2-1) or expression (148-2-2).

For example, the time varying period 2×m can be formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expressions (147-1-1), (147-1-2), (147-2-1), (147-2-2), (148-1-1), (148-1-2), (148-2-1), and (148-2-2) (where j is an integer no smaller than zero).

The following presumes that 2k=j%2m holds true. In the following, % means a modulo, and for example, α%6 represents a remainder after dividing α by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

The following describes a method of configuring a parity check matrix for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a vector u; at time point j is expressed as $u_j=(X_{1,j}, X_{2,j}, X_{3,j}, X_{4,j}, X_{5,j}, X_{6,j}, X_{7,j}, X_{8,j}, X_{9,j}, X_{10,j}, X_{11,j}, P_{1,j}, P_{2,j})$ (where j is an integer no smaller than zero). In the following, a case where u is a transmission vector is considered. Note that in the following, j is an integer no smaller than one, and thus j differs between the description having been provided above and the description provided in the following. (j is set as such to facilitate understanding of the correspondence between the column numbers and the row numbers of the parity check matrix.)

Accordingly, $u=(u_1, u_2, u_3, \ldots, u_{y-1}, u_y, u_{y+1}, \ldots)^T=X_{1,1}, X_{2,1}, X_{3,1}, X_{4,1}, X_{5,1}, X_{6,1}, X_{7,1}, X_{8,1}, X_{9,1}, X_{10,1}, X_{11,1}, X_{12,1}, X_{13,1}, P_{1,1}, P_{2,1}, X_{1,2}, X_{2,2}, X_{3,2}, X_{4,2}, X_{5,2}, X_{6,2}, X_{7,2}, X_{8,2}, X_{9,2}, X_{10,2}, X_{11,2}, X_{12,2}, X_{13,2}, P_{1,2}, P_{2,2}, X_{1,3}, X_{2,3}, X_{3,3}, X_{4,3}, X_{5,3}, X_{6,3}, X_{7,3}, X_{8,3}, X_{9,3}, X_{10,9}, X_{11,3}, X_{12,3}, X_{13,3}, P_{1,3}, P_{2,3}, \ldots, X_{1,y-1}, X_{2,y-1}, X_{3,y-1}, X_{4,y-1}, X_{5,y-1}, X_{6,y-1}, X_{7,y-1}, X_{8,y-1}, X_{9,y-1}, X_{10,y-1}, X_{11,y-1}, X_{12,y-1}, X_{13,y-1}, P_{1,y-1}, P_{2,y-1}, X_{1,y}, X_{2,y}, X_{3,y}, X_{4,y}, X_{5,y}, X_{6,y}, X_{7,y}, X_{8,y}, X_{9,y}, X_{10,y}, X_{11,y}, X_{12,y}, X_{13,y}, P_{1,y}, P_{2,y}, X_{1,y+1}, X_{2,y+1}, X_{3,y+1}, X_{4,y+1}, X_{5,y+1}, X_{6,y+1}, X_{7,y+1}, X_{8,y+1}, X_{9,y+1}, X_{10,y+1}, X_{11,y+1}, X_{12,y+1}, X_{13,y+1}, P_{1,y+1}, P_{2,y+1}, \ldots)^T$. Further, when using H to denote a parity check matrix for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, Hu=0 holds true (here, Hu=0 indicates that all elements of the vector Hu are zeroes).

FIG. 93 indicates a configuration of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the topmost row of the parity check matrix is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

As illustrated in FIG. 93:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression"; and "a vector for the (2×i)th row of the parity check matrix H can be generated from a parity check polynomial satisfying zero of #((i−1)%2m); second expression", and so on (where i is an integer no smaller than one).

FIG. 94 indicates a configuration of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression. Accordingly, the leftmost column of the parity check matrix $H_{pro\_m}$ is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

As illustrated in FIG. 94:

"a vector for the first column of the parity check matrix H is related to $X_1$ at time point 1";

"a vector for the second column of the parity check matrix H is related to $X_2$ at time point 1";

"a vector for the third column of the parity check matrix H is related to $X_3$ at time point 1";

"a vector for the fourth column of the parity check matrix H is related to $X_4$ at time point 1";

"a vector for the fifth column of the parity check matrix H is related to $X_5$ at time point 1";

"a vector for the sixth column of the parity check matrix H is related to $X_6$ at time point 1";

"a vector for the seventh column of the parity check matrix H is related to $X_7$ at time point 1";

"a vector for the eighth column of the parity check matrix H is related to $X_8$ at time point 1";

"a vector for the ninth column of the parity check matrix H is related to $X_9$ at time point 1";

"a vector for the tenth column of the parity check matrix H is related to $X_{10}$ at time point 1";

"a vector for the eleventh column of the parity check matrix H is related to $X_{11}$ at time point 1";

"a vector for the twelfth column of the parity check matrix H is related to $X_{12}$ at time point 1";

"a vector for the thirteenth column of the parity check matrix H is related to $X_{13}$ at time point 1";

"a vector for the fourteenth column of the parity check matrix H is related to $P_1$ at time point 1";

"a vector for the fifteenth column of the parity check matrix H is related to $P_2$ at time point 1";

⋮

"a vector for the 15×(j−1)+1th column of the parity check matrix H is related to $X_1$ at time point j";

"a vector for the 15×(j−1)+2th column of the parity check matrix H is related to $X_2$ at time point j";

"a vector for the 15×(j−1)+3th column of the parity check matrix H is related to $X_3$ at time point j";

"a vector for the 15×(j−1)+4th column of the parity check matrix H is related to $X_4$ at time point j";

"a vector for the 15×(j−1)+5th column of the parity check matrix H is related to $X_5$ at time point j";

"a vector for the 15×(j−1)+6th column of the parity check matrix H is related to $X_6$ at time point j";

"a vector for the 15×(j−1)+7th column of the parity check matrix H is related to $X_7$ at time point j";

"a vector for the 15×(j−1)+8th column of the parity check matrix H is related to $X_8$ at time point j";

"a vector for the 15×(j−1)+9th column of the parity check matrix H is related to $X_9$ at time point j";

"a vector for the 15×(j−1)+10th column of the parity check matrix H is related to $X_{10}$ at time point j";

"a vector for the 15×(j−1)+11h column of the parity check matrix H is related to $X_{11}$ at time point j";

"a vector for the 15×(j−1)+12th column of the parity check matrix H is related to $X_{12}$ at time point j";

"a vector for the 15×(j−1)+13th column of the parity check matrix H is related to $X_{13}$ at time point j";

"a vector for the 15×(j−1)+14th column of the parity check matrix H is related to $P_1$ at time point j";

"a vector for the 15×(j−1)+15th column of the parity check matrix H is related to $P_2$ at time point j"; and so on (where j is an integer no smaller than one).

FIG. 95 indicates a parity check matrix for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The following focuses on $1\times X_1(D)$, $1\times X_2(D)$, $1\times X_3(D)$, $1\times X_4(D)$, $1\times X_5(D)$, $1\times X_6(D)$, $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$, $1\times P_1(D)$, $1\times P_2(D)$ in the parity check matrix for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

The parity check polynomials at time point j=1 are parity check polynomials when i=0 in expressions (147-1-1), (147-1-2), (147-2-1), (147-2-2).

A vector for the first row in FIG. 95 can be generated from a parity check polynomial when i=0 in expression (147-1-1) or expression (147-1-2) (refer to FIG. 93).

In expressions (147-1-1) and (147-1-2):

terms for $1\times X_1(D)$, $1\times X_2(D)$, $1\times X_3(D)$, $1\times X_4(D)$, $1\times X_5(D)$, $1\times X_6(D)$ exist;

terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ do not exist; and a term for $1\times P_1(D)$ exists but a term for $1\times P_2(D)$ does not exist.

Further, the relationship between column numbers and $X_1$, $X_2$, $X_3$, $X_4$, $X_5$, $X_6$, $X_7$, $X_8$, $X_9$, $X_{10}$, $X_{11}$, $X_{12}$, $X_{13}$, $P_1$, $P_2$ is as indicated in FIG. 94. Based on the relationship indicated in FIG. 94 and the fact that terms for $1\times X_1(D)$, $1\times X_2(D)$, $1\times X_3(D)$, $1\times X_4(D)$, $1\times X_5(D)$, $1\times X_6(D)$ exist, columns related to $X_1$, $X_2$, $X_3$, $X_4$, $X_5$, $X_6$ in the vector for the first row in FIG. 95 are "1". Further, based on the relationship indicated in FIG. 94 and the fact that terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ do not exist, columns related to $X_7$, $X_8$, $X_9$, $X_{10}$, $X_{11}$, $X_{12}$, $X_{13}$ in the vector for the first row in FIG. 95 are "0". In addition, based on the relationship indicated in FIG. 94 and the fact that a term for $1\times P_1(D)$ exists but a term for $1\times P_2(D)$ does not exist, a column related to $P_1$ in the vector for the first row in FIG. 95 is "1", and a column related to $P_2$ in the vector for the first row in FIG. 95 is "0".

As such, the vector for the first row in FIG. 95 is "111111000000010", as indicated by 3900-1 in FIG. 95.

A vector for the second row in FIG. 95 can be generated from a parity check polynomial when i=0 in expression (147-2-1) or expression (147-2-2) (refer to FIG. 93).

In expressions (147-2-1) and (147-2-2):

terms for $1\times X_1(D)$, $1\times X_2(D)$, $1\times X_3(D)$, $1\times X_4(D)$, $1\times X_5(D)$, $1\times X_6(D)$ do not exist;

terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ exist; and a term for $1\times P_1(D)$ may or may not exist but a term for $1\times P_2(D)$ exists.

Further, the relationship between column numbers and $X_1$, $X_2$, $X_3$, $X_4$, $X_5$, $X_6$, $X_7$, $X_8$, $X_9$, $X_{10}$, $X_{11}$, $X_{12}$, $X_{13}$, $P_1$, $P_2$ is as indicated in FIG. 94. Based on the relationship indicated in FIG. 94 and the fact that terms for $1\times X_1(D)$, $1\times X_2(D)$, $1\times X_3(D)$, $1\times X_4(D)$, $1\times X_5(D)$, $1\times X_6(D)$ do not exist, columns related to $X_1$, $X_2$, $X_3$, $X_4$, $X_5$, $X_6$ in the vector for the second row in FIG. 95 are "0". Further, based on the relationship indicated in FIG. 94 and the fact that terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ exist, columns related to $X_7$, $X_8$, $X_9$, $X_{10}$, $X_{11}$, $X_{12}$, $X_{13}$ in the vector for the second row in FIG. 95 are "1". In addition, based on the relationship indicated in FIG. 94 and the fact that a term for $1\times P_1(D)$ may or may not exist but a term for $1\times P_2(D)$ exists, a column related to $P_1$ in the vector for the second row in FIG. 95 is "Y", and a column related to $P_2$ in the vector for the second row in FIG. 95 is "1", where Y is either "0" or "1".

As such, the vector for the second row in FIG. 95 is "0000001111111Y1", as indicated by 3900-2 in FIG. 95.

The parity check polynomials at time point j=2 are parity check polynomials when i=0 in expressions (148-1-1), (148-1-2), (148-2-1), (148-2-2).

A vector for the third row in FIG. 95 can be generated from a parity check polynomial when i=0 in expression (148-1-1) or expression (148-1-2) (refer to FIG. 93).

In expressions (148-1-1) and (148-1-2):

terms for $1\times X_1(D)$, $1\times X_2(D)$, $1\times X_3(D)$, $1\times X_4(D)$, $1\times X_5(D)$, $1\times X_6(D)$ do not exist;

terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ exist; and a term for $1\times P_1(D)$ exists but a term for $1\times P_2(D)$ does not exist.

Further, the relationship between column numbers and $X_1$, $X_2$, $X_3$, $X_4$, $X_5$, $X_6$, $X_7$, $X_8$, $X_9$, $X_{10}$, $X_{11}$, $X_{12}$, $X_{13}$, $P_1$, $P_2$ is as indicated in FIG. 94. Based on the relationship indicated in FIG. 94 and the fact that terms for $1\times X_1(D)$, $1\times X_2(D)$, $1\times X_3(D)$, $1\times X_4(D)$, $1\times X_5(D)$, $1\times X_6(D)$ do not exist, columns related to $X_1$, $X_2$, $X_3$, $X_4$, $X_5$, $X_6$ in the vector for the third row in FIG. 95 are "0". Further, based on the relationship indicated in FIG. 94 and the fact that terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ exist, columns related to $X_7$, $X_8$, $X_9$, $X_{10}$, $X_{11}$, $X_{12}$, $X_{13}$ in the vector for the third row in FIG. 95 are "1". In addition, based on the relationship indicated in FIG. 94 and the fact that a term for $1\times P_1(D)$ exists but a term for $1\times P_2(D)$ does not exist, a column related to $P_1$ in the vector for the third row in FIG. 95 is "1", and a column related to $P_2$ in the vector for the third row in FIG. 95 is "0".

As such, the vector for the third row in FIG. 95 is "000000111111110", as indicated by 3901-1 in FIG. 95.

A vector for the fourth row in FIG. 95 can be generated from a parity check polynomial when i=0 in expression (148-2-1) or expression (148-2-2) (refer to FIG. 93).

In expressions (148-2-1) and (148-2-2):

terms for $1\times X_1(D)$, $1\times X_2(D)$, $1\times X_3(D)$, $1\times X_4(D)$, $1\times X_5(D)$, $1\times X_6(D)$ exist;

terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ do not exist; and a term for $1\times P_1(D)$ may or may not exist but a term for $1\times P_2(D)$ exists.

Further, the relationship between column numbers and $X_1$, $X_2$, $X_3$, $X_4$, $X_5$, $X_6$, $X_7$, $X_8$, $X_9$, $X_{10}$, $X_{11}$, $X_{12}$, $X_{13}$, $P_1$, $P_2$ is as indicated in FIG. 94. Based on the relationship indicated in FIG. 94 and the fact that terms for $1\times X_1(D)$, $1\times X_2(D)$, $1\times X_3(D)$, $1\times X_4(D)$, $1\times X_5(D)$, $1\times X_6(D)$ exist, columns related to $X_1$, $X_2$, $X_3$, $X_4$, $X_5$, $X_6$ in the vector for the fourth row in FIG. 95 are "1". Further, based on the relationship indicated in FIG. 94 and the fact that terms for $1\times X_7(D)$, $1\times X_8(D)$, $1\times X_9(D)$, $1\times X_{10}(D)$, $1\times X_{11}(D)$, $1\times X_{12}(D)$, $1\times X_{13}(D)$ do not exist, columns related to $X_7$, $X_8$, $X_9$, $X_{10}$, $X_{11}$, $X_{12}$, $X_{13}$ in the vector for the fourth row in FIG. 95 are "0". In addition, based on the relationship indicated in FIG. 94 and the fact that a term for $1\times P_1(D)$ may or may not exist but a term for $1\times P_2(D)$ exists, a column related to $P_1$ in the vector for the fourth row in FIG. 95 is "Y", and a column related to $P_2$ in the vector for the fourth row in FIG. 95 is "1".

As such, the vector for the fourth row in FIG. 95 is "1111110000000Y1", as indicated by 3901-2 in FIG. 95.

Because it can be considered that the above similarly applies to cases where time point j=3, 4, 5, the parity check matrix H has the configuration indicated in FIG. 95.

That is, due to the parity check polynomials of expressions (147-1-1), (147-1-2), (147-2-1), (147-2-2) being used at time point j=2k+1 (where k is an integer no smaller than zero), "111111000000010" exists in the 2×(2k+1)−1th row of the parity check matrix H, and "0000001111111Y1" exists in the 2×(2k+1)th row of the parity check matrix H, as illustrated in FIG. 95.

Further, due to the parity check polynomials of expressions (148-1-1), (148-1-2), (148-2-1), (148-2-2) being used at time point j=2k+2 (where k is an integer no smaller than zero), "000000111111110" exists in the 2×(2k+2)−1th row of the parity check matrix H, and "1111110000000Y1" exists in the 2×(2k+2)th row of the parity check matrix H, as illustrated in FIG. 95.

Accordingly, as illustrated in FIG. 95, when denoting a column number of a leftmost column corresponding to "1" in "111111000000010" in a row where "111111000000010" exists (e.g., 3900-1 in FIG. 95) as "a", "000000111111110" (e.g., 3901-1 in FIG. 95) exists in a row that is two rows below the row where "111111000000010" exists, starting from column "a+15".

Similarly, as illustrated in FIG. 95, when denoting a column number of a leftmost column corresponding to "1" in "0000001111111Y1" in a row where "0000001111111Y1" exists (e.g., 3900-2 in FIG. 95) as "b", "1111110000000Y1" (e.g., 3901-2 in FIG. 95) exists in a row that is two rows below the row where "0000001111111Y1" exists, starting from column "b+15".

Similarly, as illustrated in FIG. 95, when denoting a column number of a leftmost column corresponding to "1" in "000000111111110" in a row where "000000111111110" exists (e.g., 3901-1 in FIG. 95) as "c", "111111000000010" (e.g., 3902-1 in FIG. 95) exists in a row that is two rows below the row where "000000111111110" exists, starting from column "c+15".

Similarly, as illustrated in FIG. 95, when denoting a column number of a leftmost column corresponding to "1" in "1111110000000Y1" in a row where "1111110000000Y1" exists (e.g., 3901-2 in FIG. 95) as "d", "0000001111111Y1" (e.g., 3902-2 in FIG. 95) exists in a row that is two rows below the row where "1111110000000Y1" exists, starting from column "d+15".

The following describes a parity check matrix for an LDPC-CC of coding rate 13/15 and time-varying period 2×m that is based on a parity check polynomial when tail-biting is not performed, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

In the following, $H_{com}[u][v]$ (where u and v are integers no smaller than one) denotes an element at row "u" column "v" of a parity check matrix for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Based on description above provided with reference to FIG. 93:

"a vector for the 2×g−1th row of the parity check matrix H can be generated from a parity check polynomial satisfying zero of #((g−1)%2m); first expression"; and "a vector for the (2×g)th row of the parity check matrix H can be generated from a parity check polynomial satisfying zero of #((g−1)%2m); second expression" (where g is an integer no smaller than one).

Based on description above provided with reference to FIG. 94:

"a vector for the 15×(j−1)+1th column of the parity check matrix H is related to $X_1$ at time point j";

"a vector for the 15×(j−1)+2th column of the parity check matrix H is related to $X_2$ at time point j";

"a vector for the 15×(j−1)+3th column of the parity check matrix H is related to $X_3$ at time point j";

"a vector for the 15×(j−1)+4th column of the parity check matrix H is related to $X_4$ at time point j";

"a vector for the 15×(j−1)+5th column of the parity check matrix H is related to $X_5$ at time point j";

"a vector for the 15×(j−1)+6th column of the parity check matrix H is related to $X_6$ at time point j";

"a vector for the 15×(j−1)+7th column of the parity check matrix H is related to $X_7$ at time point j";

"a vector for the 15×(j−1)+8th column of the parity check matrix H is related to $X_8$ at time point j";

"a vector for the 15×(j−1)+9th column of the parity check matrix H is related to $X_9$ at time point j";

"a vector for the 15×(j−1)+10th column of the parity check matrix H is related to $X_{10}$ at time point j";

"a vector for the 15×(j−1)+11h column of the parity check matrix H is related to $X_{11}$ at time point j";

"a vector for the 15×(j−1)+12th column of the parity check matrix H is related to $X_{12}$ at time point j";

"a vector for the 15×(j−1)+13th column of the parity check matrix H is related to $X_{13}$ at time point j";

"a vector for the 15×(j−1)+14th column of the parity check matrix H is related to $P_1$ at time point j"; and "a vector for the 15×(j−1)+15th column of the parity check matrix H is related to $P_2$ at time point j"; (where j is an integer no smaller than one).

Based on the above, the following describes component $H_{com}[2\times g-1][v]$ in row 2×g−1 (where g is an integer no smaller than one) and component $H_{com}[2\times g][v]$ in row 2×g of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

As already described above, a parity check polynomial satisfying zero of #((g−1)%2m); first expression can be used to generate a vector for row 2×g−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #((g−1)%2m); second expression can be used to generate a vector for row 2×g of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, when g=2×f−1 (where f is an integer no smaller than one), a parity check polynomial satisfying zero of #(((2×f−1)−1)%2m); first expression, or that is, a parity check polynomial satisfying zero of either expression (147-1-1) or expression (147-1-2), can be used to generate a vector for row 2×(2×f−1)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f−1)−1)%2m); second expression, or that is, a parity check polynomial satisfying zero of either expression (147-2-1) or expression (147-2-2), can be used to generate a vector for row 2×(2×f−1) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, when g=2×f (where f is an integer no smaller than one), a parity check polynomial satisfying zero of #(((2×f)−1)%2m); first expression, or that is, a parity check polynomial satisfying zero of either expression (148-1-1) or expression (148-1-2), can be used to generate a vector for row 2×(2×f)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Further, a parity check polynomial satisfying zero of #(((2×f)−1)%2m); second expression, or that is, a parity check polynomial satisfying zero of either expression (148-2-1) or expression (148-2-2), can be used to generate a vector for row 2×(2×f) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Accordingly, (1) when g=2×f−1 (where f is an integer no smaller than one), when a vector for row 2×(2×f−1)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (147-1-1), (2×f−1)−1)%2m=2c holds true. Accordingly, a parity check polynomial satisfying zero of expression (147-1-1) where 2i=2c holds true (where c is an integer no smaller than zero and no greater than m−1).

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 767]

$$H_{com}[2\times(2\times f-1)-1][15\times((2\times f-1)-0-1)+1]=1 \quad (149\text{-}1)$$

When y is an integer no smaller than one and no greater than $R_{\#(2c),1}$, and $(2\times f-1)-\alpha_{\#(2c),1,y}-1\geq 0$:

$$H_{com}[2\times(2\times f-1)-1][15\times((2\times f-1)-\alpha_{\#(2c),1,y}-1)+1]=1 \quad (149\text{-}2)$$

For all u being an integer no smaller than one satisfying $\{u\neq(2\times f-1)-0\}$ and $\{u\neq(2\times f-1)-\alpha_{\#(2c),1,y}\}$(where y is an integer no smaller than one and no greater than $R_{\#(2c),1}$):

$$H_{com}[2\times(2\times f-1)-1][15\times(u-1)+1]=0 \quad (149\text{-}3)$$

Considered in a similar manner, the following holds true for $X_w$. In the following, w is an integer no smaller than one and no greater than six.

[Math. 768]

$$H_{com}[2\times(2\times f-1)-1][15\times((2\times f-1)-0-1)+w]=1 \quad (150\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)-1][15\times((2\times f-1)-\alpha_{\#(2c),w,y}-1)+w]=1 \quad (150\text{-}2)$$

For all u being an integer no smaller than one satisfying $\{u\neq(2\times f-1)-0\}$ and $\{u\neq(2\times f-1)-\alpha_{\#(2c),w,y}\}$(where y is an integer no smaller than one and no greater than $R_{\#(2c),w}$):

$$H_{com}[2\times(2\times f-1)-1][15\times(u-1)+w]=0 \quad (150\text{-}3)$$

Further, the following holds true for $X_7$. In the following, y is an integer no smaller than $R_{\#(2c),7}+1$ and no greater than $r_{\#(2c),7}$.

[Math. 769]

When $(2\times f-1)-\alpha_{\#(2c),7,y}-1\geq 0$:

$$H_{com}[2\times(2\times f-1)-1][15\times((2\times f-1)-\alpha_{\#(2c),7,y}-1)+7]=1 \quad (151\text{-}1)$$

For all u being an integer no smaller than one satisfying $\{u\neq(2\times f-1)-\alpha_{\#(2c),7,y}\}$ (where y is an integer no smaller than $R_{\#(2c),7}+1$ and no greater than $r_{\#(2c),7}$):

$$H_{com}[2\times(2\times f-1)-1][15\times(u-1)+7]=0 \quad (151\text{-}2)$$

Considered in a similar manner, the following holds true for $X_z$. In the following, z is an integer no smaller than seven and no greater than thirteen, and y is an integer no smaller than $R_{\#(2c),z}+1$ and no greater than $r_{\#(2c),z}$.

[Math. 770]

When $(2\times f-1)-\alpha_{\#(2c),z,y}-1\geq 0$:

$$H_{com}[2\times(2\times f-1)-1][15\times((2\times f-1)-\alpha_{\#(2c),z,y}-1)+z]=1 \quad (152\text{-}1)$$

For all u being an integer no smaller than one satisfying $\{u\neq(2\times f-1)-\alpha_{\#(2c),z,y}\}$ (where y is an integer no smaller than $R_{\#(2c),z}+1$ and no greater than $r_{\#(2c),z}$):

$$H_{com}[2\times(2\times f-1)-1][15\times(u-1)+z]=0 \quad (152\text{-}2)$$

The following holds true for $P_1$.

[Math. 771]

$$H_{com}[2\times(2\times f-1)-1][15\times((2\times f-1)-0-1)+14]=1 \quad (153\text{-}1)$$

For all u being an integer no smaller than one satisfying $\{u\neq(2\times f-1)-0\}$:

$$H_{com}[2\times(2\times f-1)-1][15\times(u-1)+14]=0 \quad (153\text{-}2)$$

The following holds true for $P_2$.

[Math. 772]

When $(2\times f-1)-\beta_{\#(2c),0}-1\geq 0$:

$$H_{com}[2\times(2\times f-1)-1][15\times((2\times f-1)-\beta_{\#(2c),0}-1)+15]=1 \quad (154\text{-}1)$$

For all u being an integer no smaller than one satisfying $\{u\neq(2\times f-1)-\beta_{\#(2c),0}\}$:

$$H_{com}[2\times(2\times f-1)-1][15\times(u-1)+15]=0 \quad (154\text{-}2)$$

Further, (2) when g=2×f−1 (where f is an integer no smaller than one), when a vector for row 2×(2×f−1)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (147-1-2), ((2×f−1)−1)%2m=2c holds true. Accordingly, a parity check polynomial satisfying zero of expression (147-1-2) where 2i=2c holds true (where c is an integer no smaller than zero and no greater than m−1).

Accordingly, component $H_{com}[2\times g-1][v]=H_{com}[2\times(2\times f-1)-1][v]$ in row 2×g−1, or that is, row 2×(2×f−1)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 773]

$$H_{com}[2\times(2\times f-1)-1][15\times((2\times f-1)-0-1)+1]=1 \quad (155\text{-}1)$$

When y is an integer no smaller than one and no greater than $R_{\#(2c),1}$, and (2×f 1)$-\alpha_{\#(2c),1,y}-1\geq 0$:

$$H_{com}[2\times(2\times f-1)-1][15\times((2\times f-1)-\alpha_{\#(2c),1,y}-1)+1]=1 \quad (155\text{-}2)$$

For all u being an integer no smaller than one satisfying $\{u\neq(2\times f-1)-0\}$ and $\{u\neq(2\times f-1)-\alpha_{\#(2c),1,y}\}$(where y is an integer no smaller than one and no greater than $R_{\#(2c),1}$:

$$H_{com}[2\times(2\times f-1)-1][15\times(u-1)+1]=0 \quad (155\text{-}3)$$

Considered in a similar manner, the following holds true for $X_w$. In the following, w is an integer no smaller than one and no greater than six.

[Math. 774]

$$H_{com}[2\times(2\times f-1)-1][15\times((2\times f-1)-0-1)+w]=1 \quad (156\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)-1][15\times((2\times f-1)-\alpha_{\#(2c),w,y}-1)+w]=1 \quad (156\text{-}2)$$

For all u being an integer no smaller than one satisfying $\{u\neq(2\times f-1)-0\}$ and $\{u\neq(2\times f-1)-\alpha_{\#(2c),w,y}\}$ (where y is an integer no smaller than one and no greater than $R_{\#(2c),w}$):

$$H_{com}[2\times(2\times f-1)-1][15\times(u-1)+w]=0 \quad (156\text{-}3)$$

Further, the following holds true for $X_7$. In the following, y is an integer no smaller than $R_{\#(2c),7}+1$ and no greater than $r_{\#(2c),7}$.

[Math. 775]

When $(2\times f-1)-\alpha_{\#(2c),7,y}-1\geq 0$:

$$H_{com}[2\times(2\times f-1)-1][15\times((2\times f-1)-\alpha_{\#(2c),7,y}-1)+7]=1 \quad (157\text{-}1)$$

For all u being an integer no smaller than one satisfying $\{u\neq(2\times f-1)-\alpha_{\#(2c),7,y}\}$ (where y is an integer no smaller than $R_{\#(2c),7}+1$ and no greater than $r_{\#(2c),7}$):

$$H_{com}[2\times(2\times f-1)-1][15\times(u-1)+7]=0 \quad (157\text{-}2)$$

Considered in a similar manner, the following holds true for $X_z$. In the following, z is an integer no smaller than seven and no greater than thirteen, and y is an integer no smaller than $R_{\#(2c),z}+1$ and no greater than $r_{\#(2c),z}$.

[Math. 776]

When $(2\times f-1)-\alpha_{\#(2c),z,y}-1\geq 0$:

$$H_{com}[2\times(2\times f-1)-1][15\times((2\times f-1)-\alpha_{\#(2c),z,y}-1)+z]=1 \quad (158\text{-}1)$$

For all u being an integer no smaller than one satisfying $\{u\neq(2\times f-1)-\alpha_{\#(2c),z,y}\}$ (where y is an integer no smaller than $R_{\#(2c),z}+1$ and no greater than $r_{\#(2c),z}$):

$$H_{com}[2\times(2\times f-1)-1][15\times(u-1)+z]=0 \quad (158\text{-}2)$$

The following holds true for $P_1$.

[Math. 777]

$$H_{com}[2\times(2\times f-1)-1][15\times((2\times f-1)-0-1)+14]=1 \quad (159\text{-}1)$$

When $(2\times f-1)-\beta_{\#(2c),1}-1\geq 0$:

$$H_{com}[2\times(2\times f-1)-1][15\times((2\times f-1)-\beta_{\#(2c),1}-1)+14]=1 \quad (159\text{-}2)$$

For all u being an integer no smaller than one satisfying $\{u\neq(2\times f-1)-0 \text{ and } u\neq(2\times f-1)-\beta_{\#(2c),1}\}$:

$$H_{com}[2\times(2\times f-1)-1][15\times(u-1)+14]=0 \quad (159\text{-}3)$$

The following holds true for $P_2$.

[Math. 778]

For all u being an integer no smaller than one:

$$H_{com}[2\times(2\times f-1)-1][15\times(u-1)+15]=0 \quad (160)$$

Further, (3) when g=2×f−1 (where f is an integer no smaller than one), when a vector for row 2×(2×f−1) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (147-2-1), (2×f−1)−1)%2m=2c holds true. Accordingly, a parity check polynomial satisfying zero of expression (147-2-1) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, and y is an integer no smaller than $R_{\#(2c),1}+1$ and no greater than $r_{\#(2c),1}$.

[Math. 779]

When $(2\times f-1)-\alpha_{\#(2c),1,y}-1\geq 0$:

$$H_{com}[2\times(2\times f-1)][15\times((2\times f-1)-\alpha_{\#(2c),1,y}-1)+1]=1 \quad (161\text{-}1)$$

For all u being an integer no smaller than one satisfying $\{u\neq(2\times f-1)-\alpha_{\#(2c),1,y}\}$ (where y is an integer no smaller than $R_{\#(2c),1}+1$ and no greater than $r_{\#(2c),1}$):

$$H_{com}[2\times(2\times f-1)][15\times(u-1)+1]=0 \quad (161\text{-}2)$$

Considered in a similar manner, the following holds true for $X_z$. In the following, z is an integer no smaller than one and no greater than six, and y is an integer no smaller than $R_{\#(2c),z}+1$ and no greater than $r_{\#(2c),z}$.

[Math. 780]

When $(2\times f-1)-\alpha_{\#(2c),z,y}-1\geq 0$:

$$H_{com}[2\times(2\times f-1)][15\times((2\times f-1)-\alpha_{\#(2c),z,y}-1)+z]=1 \quad (162\text{-}1)$$

For all u being an integer no smaller than one satisfying $\{u\neq(2\times f-1)-\alpha_{\#(2c),z,y}\}$ (where y is an integer no smaller than $R_{\#(2c),z}+1$ and no greater than $r_{\#(2c),z}$):

$$H_{com}[2\times(2\times f-1)][15\times(u-1)+z]=0 \quad (162\text{-}2)$$

Further, the following holds true for $X_7$.

[Math. 781]

$$H_{com}[2\times(2\times f-1)][15\times((2\times f-1)-0-1)+7]=1 \quad (163\text{-}1)$$

When y is an integer no smaller than one and no greater than $R_{\#(2c),7}$, and $(2\times f-1)-\alpha_{\#(2c),7,y}-1\geq 0$:

$$H_{com}[2\times(2\times f-1)][15\times((2\times f-1)-\alpha_{\#(2c),7,y}-1)+7]=1 \quad (163\text{-}2)$$

For all u being an integer no smaller than one satisfying $\{u\neq(2\times f-1)-0\}$ and $\{u\neq(2\times f-1)-\alpha_{\#(2c),7,y}\}$(where y is an integer no smaller than one and no greater than $R_{\#(2c),7}$):

$$H_{com}[2\times(2\times f-1)][15\times(u-1)+7]=0 \quad (163\text{-}3)$$

Considered in a similar manner, the following holds true for $X_w$. In the following, w is an integer no smaller than seven and no greater than thirteen.

[Math. 782]

$$H_{com}[2\times(2\times f-1)][15\times((2\times f-1)-0-1)+w]=1 \quad (164\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)][15\times((2\times f-1)-\alpha_{\#(2c),w,y}-1)+w]=1 \quad (164\text{-}2)$$

For all u being an integer no smaller than one satisfying $\{u\neq(2\times f-1)-0\}$ and $\{u\neq(2\times f-1)-\alpha_{\#(2c),w,y}\}$(where y is an integer no smaller than one and no greater than $R_{\#(2c),w}$):

$$H_{com}[2\times(2\times f-1)][15\times(u-1)+w]=0 \quad (164\text{-}3)$$

The following holds true for $P_1$.

[Math. 783]

When $(2\times f-1)-\beta_{\#(2c),2}-1\geq 0$:

$$H_{com}[2\times(2\times f-1)][15\times((2\times f-1)-\beta_{\#(2c),2}-1)+14]=1 \quad (165\text{-}1)$$

For all u being an integer no smaller than one satisfying $\{u\neq(2\times f-1)-\beta_{\#(2c),2}\}$:

$$H_{com}[2\times(2\times f-1)][15\times(u-1)+14]=0 \quad (165\text{-}2)$$

The following holds true for $P_2$.

[Math. 784]

$$H_{com}[2\times(2\times f-1)][15\times((2\times f-1)-0-1)+15]=1 \quad (166\text{-}1)$$

For all u being an integer no smaller than one satisfying $\{u\neq(2\times f-1)-0\}$:

$$H_{com}[2\times(2\times f-1)][15\times(u-1)+15]=0 \quad (166\text{-}2)$$

Further, (4) when g=2×f−1 (where f is an integer no smaller than one), when a vector for row 2×(2×f−1) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (147-2-2), (2×f−1)−1)%2m=2c holds true. Accordingly, a parity check polynomial satisfying zero of expression (147-2-2) where 2i=2c holds true (where c is an integer no smaller than zero and no greater than m−1).

Accordingly, component $H_{com}[2\times g][v]=H_{com}[2\times(2\times f-1)][v]$ in row 2×g, or that is, row 2×(2×f−1) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than $R_{\#(2c),1}+1$ and no greater than $r_{\#(2c),1}$.

[Math. 785]

When $(2\times f-1)-\alpha_{\#(2c),1,y}-1\geq 0$:

$$H_{com}[2\times(2\times f-1)][15\times((2\times f-1)-\alpha_{\#(2c),1,y}-1)+1]=1 \quad (167\text{-}1)$$

For all u being an integer no smaller than one satisfying $\{u\neq(2\times f-1)-\alpha_{\#(2c),1,y}\}$ (where y is an integer no smaller than $R_{\#(2c),1}+1$ and no greater than $r_{\#(2c),1}$):

$$H_{com}[2\times(2\times f-1)][15\times(u-1)+1]=0 \quad (167\text{-}2)$$

Considered in a similar manner, the following holds true for $X_z$. In the following, z is an integer no smaller than one and no greater than six, and y is an integer no smaller than $R_{\#(2c),z}+1$ and no greater than $r_{\#(2c),z}$.

[Math. 786]

When $(2\times f-1)-\alpha_{\#(2c),z,y}-1\geq 0$:

$$H_{com}[2\times(2\times f-1)][15\times((2\times f-1)-\alpha_{\#(2c),z,y}-1)+z]=1 \quad (168\text{-}1)$$

For all u being an integer no smaller than one satisfying $\{u\neq(2\times f-1)-\alpha_{\#(2c),z,y}\}$ (where y is an integer no smaller than $R_{\#(2c),z}+1$ and no greater than $r_{\#(2c),z}$):

$$H_{com}[2\times(2\times f-1)][15\times(u-1)+z]=0 \quad (168\text{-}2)$$

Further, the following holds true for $X_7$.

[Math. 787]

$$H_{com}[2\times(2\times f-1)][15\times((2\times f-1)-0-1)+7]=1 \quad (169\text{-}1)$$

When y is an integer no smaller than one and no greater than $R_{\#(2c),7}$, and $(2\times f-1)-\alpha_{\#(2c),7,y}-1\geq 0$:

$$H_{com}[2\times(2\times f-1)][15\times((2\times f-1)-\alpha_{\#(2c),7,y}-1)+7]=1 \quad (169\text{-}2)$$

For all u being an integer no smaller than one satisfying $\{u\neq(2\times f-1)-0\}$ and $\{u\neq(2\times f-1)-\alpha_{\#(2c),7,y}\}$ (where y is an integer no smaller than one and no greater than $R_{\#(2c),7}$):

$$H_{com}[2\times(2\times f-1)][15\times(u-1)+7]=0 \quad (169\text{-}3)$$

Considered in a similar manner, the following holds true for $X_w$. In the following, w is an integer no smaller than seven and no greater than thirteen.

[Math. 788]

$$H_{com}[2\times(2\times f-1)][15\times((2\times f-1)-0-1)+w]=1 \quad (170\text{-}1)$$

When y is an integer no smaller than one and no greater than $R_{\#(2c),w}$, and $(2\times f-1)-\alpha_{\#(2c),w,y}-1\geq 0$:

$$H_{com}[2\times(2\times f-1)][15\times((2\times f-1)-\alpha_{\#(2c),w,y}-1)+w]=1 \quad (170\text{-}2)$$

For all u being an integer no smaller than one satisfying $\{u\neq(2\times f-1)-0\}$ and $\{u\neq(2\times f-1)-\alpha_{\#(2c),w,y}\}$ (where y is an integer no smaller than one and no greater than $R_{\#(2c),w}$):

$$H_{com}[2\times(2\times f-1)][15\times(u-1)+w]=0 \quad (170\text{-}3)$$

The following holds true for $P_1$.

[Math. 789]

For all u being an integer no smaller than one:

$$H_{com}[2\times(2\times f-1)][15\times(u-1)+14]=0 \quad (171)$$

The following holds true for $P_2$.

[Math. 790]

$$H_{com}[2\times(2\times f-1)][15\times((2\times f-1)-0-1)+15]=1 \quad (172\text{-}1)$$

When $(2\times f-1)-\beta_{\#(2c),3}-1\geq 0$:

$$H_{com}[2\times(2\times f-1)][15\times((2\times f-1)-\beta_{\#(2c),3}-1)+15]=1 \quad (172\text{-}2)$$

For all u being an integer no smaller than one satisfying $\{u\neq(2\times f-1)-0$ and $u\neq(2\times f-1)-\beta_{\#(2c),3}\}$:

$$H_{com}[2\times(2\times f-1)][15\times(u-1)+15]=0 \quad (172\text{-}3)$$

Further, (5) when g=2×f (where f is an integer no smaller than one), when a vector for row 2×(2×f)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (148-1-1), ((2×f)−1)%2m=2d+1 holds true. Accordingly, a parity check polynomial satisfying zero of expression (148-1-1) where 2i+1=2d+1 holds true (where d is an integer no smaller than zero and no greater than m−1).

Accordingly, component $H_{com}[2\times g-1][v]=H_{com}[2\times(2\times f)-1][v]$ in row 2×g−1, or that is, row 2×(2×f)−1 of the parity check matrix H, which is for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than $R_{\#(2d+1),1}+1$ and no greater than $r_{\#(2d+1),1}$.

[Math. 791]

When $(2\times f)-\alpha_{\#(2d+1),1,y}-1\geq 0$:

$$H_{com}[2\times(2\times f)-1][15\times((2\times f)-\alpha_{\#(2d+1),1,y}-1)+1]=1 \quad (173\text{-}1)$$

For all u being an integer no smaller than one satisfying $\{u \neq (2\times f)-\alpha_{\#(2d+1),1,y}\}$ (where y is an integer no smaller than $R_{\#(2d+1),1}+1$ and no greater than $r_{\#(2d+1),1}$):

$$H_{com}[2\times(2\times f)-1][15\times(u-1)+1]=0 \quad (173\text{-}2)$$

Considered in a similar manner, the following holds true for $X_z$. In the following, z is an integer no smaller than one and no greater than six, and y is an integer no smaller than $R_{\#(2d+1),z}+1$ and no greater than $r_{\#(2d+1),z}$.

[Math. 792]

When $(2\times f)-\alpha_{\#(2d+1),z,y}-1\geq 0$:

$$H_{com}[2\times(2\times f)-1][15\times((2\times f)-\alpha_{\#(2d+1),z,y}-1)+z]=1 \quad (174\text{-}1)$$

For all u being an integer no smaller than one satisfying $\{u \neq (2\times f)-\alpha_{\#(2d+1),z,y}\}$ (where y is an integer no smaller than $R_{\#(2d+1),z}+1$ and no greater than $r_{\#(2d+1),z}$):

$$H_{com}[2\times(2\times f)-1][15\times(u-1)+z]=0 \quad (174\text{-}2)$$

Further, the following holds true for $X_7$.

[Math. 793]

$$H_{com}[2\times(2\times f)-1][15\times((2\times f)-0-1)+7]=1 \quad (175\text{-}1)$$

When y is an integer no smaller than one and no greater than $R_{\#(2d+1),7}$, and $(2\times f)-\alpha_{\#(2d+1),7,y}-1\geq 0$:

$$H_{com}[2\times(2\times f)-1][15\times((2\times f)-\alpha_{2d+1),4,y}-1)+7]=1 \quad (175\text{-}2)$$

For all u being an integer no smaller than one satisfying $\{u \neq (2\times f)-0\}$ and $\{u \neq (2\times f)-\alpha_{\#(2d+1),7,y}\}$ (where y is an integer no smaller than one and no greater than $R_{\#(2d+1),7}$):

$$H_{com}[2\times(2\times f)-1][15\times(u-1)+7]=0 \quad (175\text{-}3)$$

Considered in a similar manner, the following holds true for $X_w$. In the following, w is an integer no smaller than seven and no greater than thirteen.

[Math. 794]

$$H_{com}[2\times(2\times f)-1][15\times((2\times f)-0-1)+w]=1 \quad (176\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)-1][15\times((2\times f)-\alpha_{\#(2d+1),w,y}-1)+w]=1 \quad (176\text{-}2)$$

For all u being an integer no smaller than one satisfying $\{u \neq (2\times f)-0\}$ and $\{u \neq (2\times f)-\alpha_{\#(2d+1),w,y}\}$ (where y is an integer no smaller than one and no greater than $R_{\#(2d+1),w}$):

$$H_{com}[2\times(2\times f)-1][15\times(u-1)+w]=0 \quad (176\text{-}3)$$

The following holds true for $P_1$.

[Math. 795]

$$H_{com}[2\times(2\times f)-1][15\times((2\times f)-0-1)+14]=1 \quad (177\text{-}1)$$

For all u being an integer no smaller than one satisfying $\{u \neq (2\times f)-0\}$:

$$H_{com}[2\times(2\times f)-1][15\times(u-1)+14]=0 \quad (177\text{-}2)$$

The following holds true for $P_2$.

[Math. 796]

When $(2\times f)-\alpha_{\#(2d+1),0}-1\geq 0$:

$$H_{com}[2\times(2\times f)-1][15\times((2\times f)-\beta_{\#(2d+1),0}-1)+15]=1 \quad (178\text{-}1)$$

For all u being an integer no smaller than one satisfying $\{u \neq (2\times f)-\beta_{\#(2d+1),0}\}$:

$$H_{com}[2\times(2\times f)-1][15\times(u-1)+15]=0 \quad (178\text{-}2)$$

Further, (6) when g=2×f (where f is an integer no smaller than one), when a vector for row 2×(2×f)−1 of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (148-1-2), ((2×f)−1)%2m=2d+1 holds true. Accordingly, a parity check polynomial satisfying zero of expression (148-1-2) where 2i+1=2d+1 holds true (where d is an integer no smaller than zero and no greater than m−1).

Accordingly, component $H_{com}[2\times g-1][v]=H_{com}[2\times(2\times f)-1][v]$ in row 2×g−1, or that is, row 2×(2×f)−1 of the parity check matrix H, which is for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$. In the following, y is an integer no smaller than $R_{\#(2d+1),1}+1$ and no greater than $r_{\#(2d+1),1}$.

[Math. 797]

When $(2\times f)-\alpha_{\#(2d+1),1,y}-1\geq 0$:

$$H_{com}[2\times(2\times f)-1][15\times((2\times f)-\alpha_{\#(2d+1),1,y}-1)+1]=1 \quad (179\text{-}1)$$

For all u being an integer no smaller than one satisfying $\{u \neq (2\times f)-\alpha_{\#(2d+1),1,y}\}$ (where y is an integer no smaller than $R_{\#(2d+1),1}+1$ and no greater than $r_{\#(2d+1),1}$):

$$H_{com}[2\times(2\times f)-1][15\times(u-1)+1]=0 \quad (179\text{-}2)$$

Considered in a similar manner, the following holds true for $X_z$. In the following, z is an integer no smaller than one and no greater than six, and y is an integer no smaller than $R_{\#(2d+1),z}+1$ and no greater than $r_{\#(2d+1),z}$.

[Math. 798]

When $(2\times f)-\alpha_{\#(2d+1),z,y}-1\geq 0$:

$$H_{com}[2\times(2\times f)-1][15\times((2\times f)-\alpha_{\#(2d+1),z,y}-1)+z]=1 \quad (180\text{-}1)$$

For all u being an integer no smaller than one satisfying $\{u \neq (2\times f)-\alpha_{\#(2d+1),z,y}\}$ (where y is an integer no smaller than $R_{\#(2d+1),z}+1$ and no greater than $r_{\#(2d+1),z}$):

$$H_{com}[2\times(2\times f)-1][15\times(u-1)+z]=0 \quad (180\text{-}2)$$

Further, the following holds true for $X_7$.

[Math. 799]

$$H_{com}[2\times(2\times f)-1][15\times((2\times f)-0-1)+7]=1 \quad (181\text{-}1)$$

When y is an integer no smaller than one and no greater than $R_{\#(2d+1),7}$, and $(2\times f)-\alpha_{\#(2d+1),7,y}-1\geq 0$:

$$H_{com}[2\times(2\times f)-1][15\times((2\times f)-\alpha_{\#(2d+1),7,y}-1)+7]=1 \quad (181\text{-}2)$$

For all u being an integer no smaller than one satisfying $\{u \neq (2\times f)-0\}$ and $\{u \neq (2\times f)-\alpha_{\#(2d+1),7,y}\}$ (where y is an integer no smaller than one and no greater than $R_{\#(2d+1),7}$):

$$H_{com}[2\times(2\times f)-1][15\times(u-1)+7]=0 \quad (181\text{-}3)$$

Considered in a similar manner, the following holds true for $X_w$. In the following, w is an integer no smaller than seven and no greater than thirteen.

[Math. 800]

$$H_{com}[2\times(2\times f)-1][15\times((2\times f)-0-1)+w]=1 \quad (182\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)-1][15\times((2\times f)-\alpha_{\#(2d+1),w,y}-1)+w]=1 \quad (182\text{-}2)$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$):

$$H_{com}[2\times(2\times f)-1][15\times(u-1)+w]=0 \quad (182\text{-}3)$$

The following holds true for $P_1$.

[Math. 801]

$$H_{com}[2\times(2\times f)-1][15\times((2\times f)-0-1)+14]=1 \quad (183\text{-}1)$$

When $(2\times f)-\beta_{\#(2d+1),1}-1\geq 0$:

$$H_{com}[2\times(2\times f)-1][15\times((2\times f)-\beta_{\#(2d+1),1}-1)+14]=1 \quad (183\text{-}2)$$

For all u being an integer no smaller than one satisfying $\{u\neq(2\times f)-0 \text{ and } u\neq(2\times f)-\beta_{\#(2d+1),1}\}$:

$$H_{com}[2\times(2\times f)-1][15\times(u-1)+14]=0 \quad (183\text{-}3)$$

The following holds true for $P_2$.

[Math. 802]

For all u being an integer no smaller than one:

$$H_{com}[2\times(2\times f)-1][15\times(u-1)+15]=0 \quad (184)$$

Further, (7) when g=2×f (where f is an integer no smaller than one), when a vector for row 2×(2×f) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (148-2-1), ((2×f)−1) %2m=2d+1 holds true. Accordingly, a parity check polynomial satisfying zero of expression (148-2-1) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 803]

$$H_{com}[2\times(2\times f)][15\times((2\times f)-0-1)+1]=1 \quad (185\text{-}1)$$

When y is an integer no smaller than one and no greater than $R_{\#(2d+1),1}$, and $(2\times f)-\alpha_{\#(2d+1),1,y}-1\geq 0$:

$$H_{com}[2\times(2\times f)][15\times((2\times f)-\alpha_{\#(2d+1),1,y}-1)+1]=1 \quad (185\text{-}2)$$

For all u being an integer no smaller than one satisfying $\{u\neq(2\times f)-0\}$ and $\{u\neq(2\times f)-\alpha_{\#(2d+1),1,y}\}$ (where y is an integer no smaller than one and no greater than $R_{\#(2d+1),1}$):

$$H_{com}[2\times(2\times f)][15\times(u-1)+1]=0 \quad (185\text{-}3)$$

Considered in a similar manner, the following holds true for $X_w$. In the following, w is an integer no smaller than one and no greater than six.

[Math. 804]

$$H_{com}[2\times(2\times f)][15\times((2\times f)-0-1)+w]=1 \quad (186\text{-}1)$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)][15\times((2\times f)-\alpha_{\#(2d+1),w,y}-1)+w]=1 \quad (186\text{-}2)$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$):

$$H_{com}[2\times(2\times f)][15\times(u-1)+w]=0 \quad (186\text{-}3)$$

Further, the following holds true for $X_7$. In the following, y is an integer no smaller than $R_{\#(2d+1),7}+1$ and no greater than $r_{\#(2d+1),7}$.

[Math. 805]

When $(2\times f)-\alpha_{\#(2d+1),7,y}-1\geq 0$:

$$H_{com}[2\times(2\times f)][15\times((2\times f)-\alpha_{\#(2d+1),7,y}-1)+7]=1 \quad (187\text{-}1)$$

For all u being an integer no smaller than one satisfying $\{u\neq(2\times f)-\alpha_{\#(2d+1),7,y}\}$ (where y is an integer no smaller than $R_{\#(2d+1),7}+1$ and no greater than $r_{\#(2d+1),7}$):

$$H_{com}[2\times(2\times f)][15\times(u-1)+7]=0 \quad (187\text{-}2)$$

Considered in a similar manner, the following holds true for $X_z$. In the following, z is an integer no smaller than seven and no greater than thirteen, and y is an integer no smaller than $R_{\#(2d+1),z}+1$ and no greater than $r_{\#(2d+1),z}$.

[Math. 806]

When $(2\times f)-\alpha_{\#(2d+1),z,y}-1\geq 0$:

$$H_{com}[2\times(2\times f)][15\times((2\times f)-\alpha_{\#(2d+1),z,y}-1)+z]=1 \quad (188\text{-}1)$$

For all u being an integer no smaller than one satisfying $\{u\neq(2\times f)-\alpha_{\#(2d+1),z,y}\}$ (where y is an integer no smaller than $R_{\#(2d+1),z}+1$ and no greater than $r_{\#(2d+1),z}$):

$$H_{com}[2\times(2\times f)][15\times(u-1)+z]=0 \quad (188\text{-}2)$$

The following holds true for $P_1$.

[Math. 807]

When $(2\times f)-\beta_{\#(2d+1),2}-1\geq 0$:

$$H_{com}[2\times(2\times f)][15\times((2\times f)-\beta_{\#(2d+1),2}-1)+14]=1 \quad (189\text{-}1)$$

For all u being an integer no smaller than one satisfying $\{u\neq(2\times f)-\beta_{\#(2d+1),2}\}$:

$$H_{com}[2\times(2\times f)][15\times(u-1)+14]=0 \quad (189\text{-}2)$$

The following holds true for $P_2$.

[Math. 808]

$$H_{com}[2\times(2\times f)][15\times((2\times f)-0-1)+15]=1 \quad (190\text{-}1)$$

For all u being an integer no smaller than one satisfying $\{u\neq(2\times f)-0\}$:

$$H_{com}[2\times(2\times f)][15\times(u-1)+15]=0 \quad (190\text{-}2)$$

Further, (8) when g=2×f (where f is an integer no smaller than one), when a vector for row 2×(2×f) of the parity check matrix H, which is for an LDPC-CC of coding rate 13/15 and time-varying period 2×m that is based on a parity check polynomial, the parity check matrix H definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, can be generated by using a parity check polynomial satisfying zero provided by expression (148-2-2), ((2×f)−1)%2m=2d+1 holds true. Accordingly, a parity check polynomial satisfying zero of expression (148-2-2) where 2i+1=2d+1 holds true (where d is an integer no smaller than zero and no greater than m−1).

Accordingly, component $H_{com}[2\times g][v]=H_{com}[2\times(2\times f)][v]$ in row 2×g, or that is, row 2×(2×f) of the parity check matrix H, which is for an LDPC-CC of coding rate 13/15 and time-varying period 2×m that is based on a parity check polynomial, the parity check matrix definable by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, is expressed as follows.

The following holds true for $X_1$.

[Math. 809]

$$H_{com}[2\times(2\times f)][15\times((2\times f)-0-1)+1]=1 \tag{191-1}$$

When y is an integer no smaller than one and no greater than $R_{\#(2d+1),1}$, and $(2\times f)-\alpha_{\#(2d+1),1,y}-1\geq 0$:

$$H_{com}[2\times(2\times f)][15\times((2\times f)-\alpha_{\#(2d+1),1,y}-1)+1]=1 \tag{191-2}$$

For all u being an integer no smaller than one satisfying $\{u\neq(2\times f)-0\}$ and $\{u\neq(2\times f)-\alpha_{\#(2d+1),1,y}\}$ (where y is an integer no smaller than one and no greater than $R_{\#(2d+1),1}$):

$$H_{com}[2\times(2\times f)][15\times(u-1)+1]=0 \tag{191-3}$$

Considered in a similar manner, the following holds true for $X_w$. In the following, w is an integer no smaller than one and no greater than six.

[Math. 810]

$$H_{com}[2\times(2\times f)][15\times((2\times f)-0-1)+w]=1 \tag{192-1}$$

When y is an integer no smaller than one and no greater than $R_{\#(2d+1),w}$, and $(2\times f)-\alpha_{\#(2d+1),w,y}-1\geq 0$:

$$H_{com}[2\times(2\times f)][15\times((2\times f)-\alpha_{\#(2d+1),w,y}-1)+w]=1 \tag{192-2}$$

For all u being an integer no smaller than one satisfying $\{u\neq(2\times f)-0\}$ and $\{u\neq(2\times f)-\alpha_{\#(2d+1),w,y}\}$ (where y is an integer no smaller than one and no greater than $R_{\#(2d+1),w}$):

$$H_{com}[2\times(2\times f)][15\times(u-1)+w]=0 \tag{192-3}$$

Further, the following holds true for $X_7$. In the following, y is an integer no smaller than $R_{\#(2d+1),7}+1$ and no greater than $r_{\#(2d+1),7}$.

[Math. 811]

When $(2\times f)-\alpha_{\#(2d+1),7,y}-1\geq 0$:

$$H_{com}[2\times(2\times f)][15\times((2\times f)-\alpha_{\#(2d+1),7,y}-1)+7]=1 \tag{193-1}$$

For all u being an integer no smaller than one satisfying $\{u\neq(2\times f)-\alpha_{\#(2d+1),7,y}\}$ (where y is an integer no smaller than $R_{\#(2d+1),7}+1$ and no greater than $r_{\#(2d+1),7}$):

$$H_{com}[2\times(2\times f)][15\times(u-1)+7]=0 \tag{193-2}$$

Considered in a similar manner, the following holds true for $X_z$. In the following, z is an integer no smaller than seven and no greater than thirteen, and y is an integer no smaller than $R_{\#(2d+1),z}+1$ and no greater than $r_{\#(2d+1),z}$.

[Math. 812]

When $(2\times f)-\alpha_{\#(2d+1),z,y}-1\geq 0$:

$$H_{com}[2\times(2\times f)][15\times((2\times f)-\alpha_{\#(2d+1),z,y}-1)+z]=1 \tag{194-1}$$

For all u being an integer no smaller than one satisfying $\{u\neq(2\times f)-\alpha_{\#(2d+1),z,y}\}$ (where y is an integer no smaller than $R_{\#(2d+1),z}+1$ and no greater than $r_{\#(2d+1),z}$):

$$H_{com}[2\times(2\times f)][15\times(u-1)+z]=0 \tag{194-2}$$

The following holds true for $P_1$.

[Math. 813]

For all u being an integer no smaller than one:

$$H_{com}[2\times(2\times f)][15\times(u-1)+14]=0 \tag{195}$$

The following holds true for $P_2$.

[Math. 814]

$$H_{com}[2\times(2\times f)][15\times((2\times f)-0-1)+15]=1 \tag{196-1}$$

When $(2\times f)-\beta_{\#(2d+1),3}-1\geq 0$:

$$H_{com}[2\times(2\times f)][15\times((2\times f)-\beta_{\#(2d+1),3}-1)+15]=1 \tag{196-2}$$

For all u being an integer no smaller than one satisfying $\{u\neq(2\times f)-0 \text{ and } u\neq(2\times f)-\beta_{\#(2d+1),3}\}$:

$$H_{com}[2\times(2\times f)][15\times(u-1)+15]=0 \tag{196-3}$$

As such, an LDPC-CC of coding rate 13/15 and time-varying period 2×m that is based on a parity check polynomial can be generated by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression, and the code so generated achieves high error correction capability.

Embodiment G3

In the present embodiment, description is provided of a device that uses the LDPC-CC of coding rate 13/15 that is based on a parity check polynomial, description of which has been provided in embodiments G1 and G2.

As one example, description is provided of a case where the LDPC-CC of coding rate 13/15 that is based on a parity check polynomial, description of which has been provided in embodiments G1 and G2, is applied to a communication device.

FIG. 22 illustrates the structures of a transmitting device 2200 and a receiving device 2210 in the communication device pertaining to the present embodiment.

An encoder 2201 receives information to be transmitted as input, and is capable of performing various types of encoding. In particular, when receiving a specification to perform encoding by using the LDPC-CC of coding rate 13/15 that is based on a parity check polynomial, description of which has been provided in embodiments G1 and G2, the encoder 2201 performs encoding by using the LDPC-CC of coding rate 13/15 that is based on a parity check polynomial, description of which has been provided in embodiments G1 and G2, to calculate parities $P_1$ and $P_2$. Further, the encoder 2201 outputs the information to be transmitted and the parities $P_1$ and $P_2$ as a transmission sequence.

A modulator 2202 receives the transmission sequence, which includes the information to be transmitted and the parities $P_1$ and $P_2$, performs mapping based on a predetermined modulation scheme (e.g., BPSK, QPSK, 16QAM, 64QAM), and outputs a baseband signal. Further, the modulator 2202 may also receive information other than the transmission sequence, which includes the information to be transmitted and the parities $P_1$ and $P_2$, as input, perform mapping, and output a baseband signal. For example, the modulator 2202 may receive control information as input.

The transmitting device outputs a transmission signal after performing predetermined signal processing (e.g., signal processing for generation of an OFDM signal, frequency conversion, amplification) with respect to such signals (e.g., baseband signals, pilot signals). The transmitting device may transmit the transmission signal over a wireless transmission path utilizing electromagnetic waves, or over a wired transmission path utilizing a coaxial cable, a power line, an optical cable, or the like.

The transmission signal is received by the receiving device 2210 after travelling over the transmission path. A receiver 2211 receives a reception signal as input, performs predetermined signal processing (e.g., bandwidth limitation, frequency conversion, signal processing for OFDM, frequency offset estimation, signal detection, channel estimation), and outputs a baseband signal and a channel estimation signal.

A log-likelihood ratio generation section 2212 receives the baseband signal and the channel estimation signal as input (may receive other signals as input), and for example, calculates and outputs a log-likelihood ratio for each bit (may calculate and output a hard value (hard decision value)).

A decoder 2213 receives the log-likelihood ratio for each bit as input, performs belief propagation decoding (e.g., sum-product decoding, scheduled sum-product decoding (Layered BP (belief propagation) decoding), min-sum decoding, Normalized BP decoding, offset BP decoding), and outputs an estimation sequence. The decoder 2213 performs the belief propagation decoding based on the parity check matrix for the LDPC-CC of coding rate 13/15 that is based on a parity check polynomial, description of which has been provided in embodiments G1 and G2.

Figure 96:
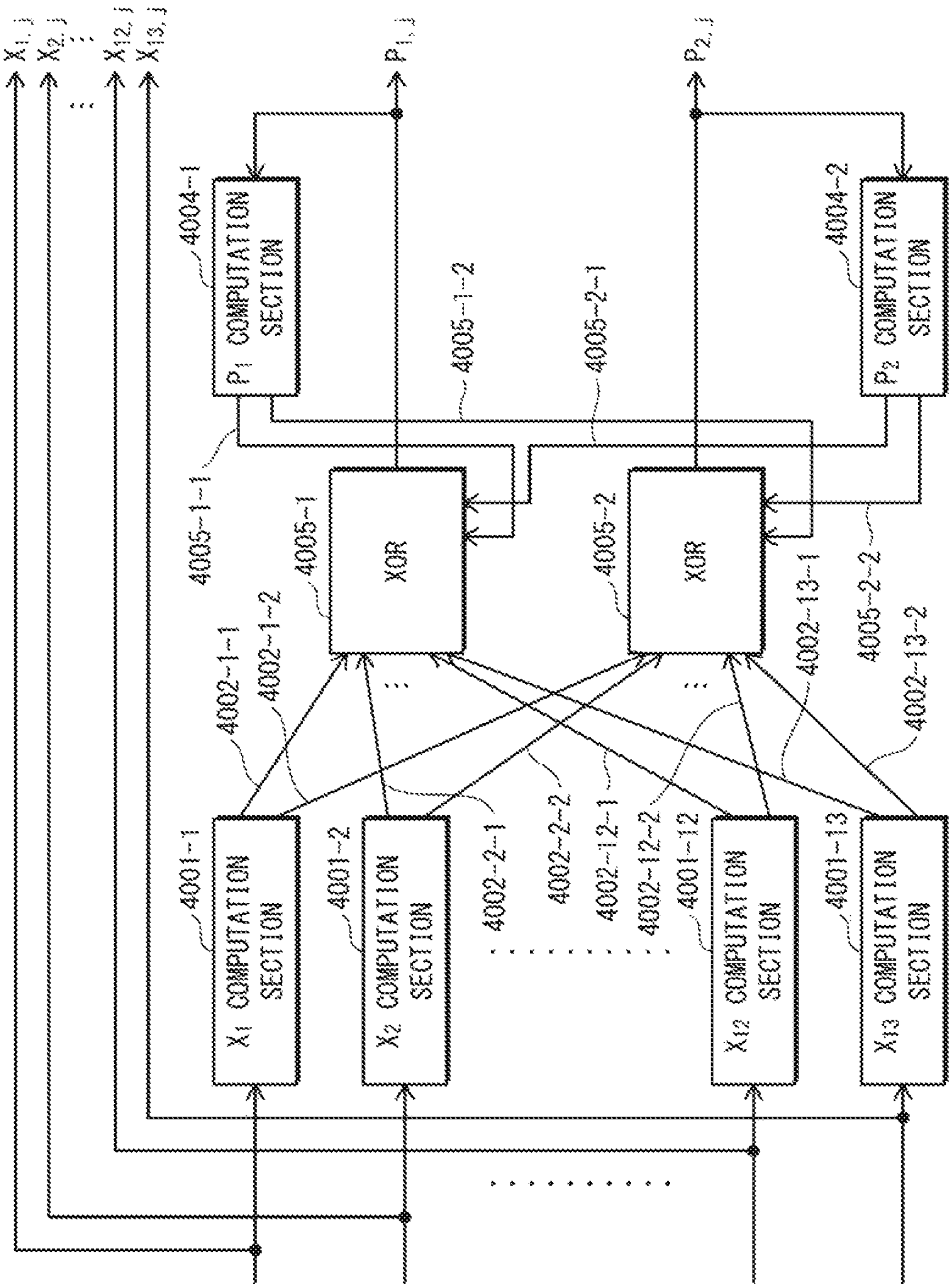
FIG. 96 shows an example of the configuration of an encoder for LDPC-CC of coding rate 13/15 that is based on a parity check polynomial.

FIG. 96 illustrates one example of the structure of an encoder for the LDPC-CC of coding rate 13/15 that is based on a parity check polynomial, description of which has been provided in embodiments G1 and G2. Description on such an encoder has been provided with reference to the encoder 2201 in FIG. 22.

In FIG. 96, an $X_z$ computation section 4001-*z* (where z is an integer no smaller than one and no greater than thirteen) includes a plurality of shift registers that are connected in series and a calculator that performs XOR calculation on bits collected from some of the shift registers (refer to FIGS. 2 and 22).

The $X_z$ computation section 4001-*z* receives an information bit $X_{z,j}$ at time point j as input, performs the XOR calculation, and outputs bits 4002-*z*–1 and 4002-*z*–2, which are acquired through the $X_z$ calculation.

A $P_1$ computation section 4004-1 includes a plurality of shift registers that are connected in series and a calculator that that performs XOR calculation on bits collected from some of the shift registers (refer to FIGS. 2 and 22).

The $P_1$ computation section 4004-1 receives a bit $P_{1,j}$ of parity $P_1$ at time point j as input, performs the XOR calculation, and outputs bits 4005-1-1 and 4005-1-2, which are acquired through the $P_1$ calculation.

A $P_2$ computation section 4004-2 includes a plurality of shift registers that are connected in series and a calculator that that performs XOR calculation on bits collected from some of the shift registers (refer to FIGS. 2 and 22).

The $P_2$ computation section 4004-2 receives a bit $P_{2,j}$ of parity $P_2$ at time point j as input, performs the XOR calculation, and outputs bits 4005-2-1 and 4005-2-2, which are acquired through the $P_2$ calculation.

An XOR (calculator) 4005-1 receives the bits 4002-1-1 through 4002-13-1 acquired by $X_1$ calculation through $X_{13}$ calculation, respectively, the bit 4005-1-1 acquired by $P_1$ calculation, and the bit 4005-2-1 acquired by the $P_2$ calculation as input, performs XOR calculation, and outputs a bit $P_{1,j}$ of parity $P_1$ at time point j.

An XOR (calculator) 4005-2 receives the bits 4002-1-2 through 4002-13-2 acquired by $X_1$ calculation through $X_{13}$ calculation, respectively, the bit 4005-1-2 acquired by $P_1$ calculation, and the bit 4005-2-2 acquired by the $P_2$ calculation as input, performs XOR calculation, and outputs a bit $P_{2,j}$ of parity $P_2$ at time point j.

It is preferable that initial values of the shift registers of the $X_z$ computation section 4001-*z*, the $P_1$ computation section 4004-1, and the $P_2$ computation section 4004-2 illustrated in FIG. 96 be set to "0" (zero). By making such a configuration, it becomes unnecessary to transmit to the receiving device parities $P_1$ and $P_2$ before the setting of initial values.

The following describes a method of information-zero termination.

Figure 97:
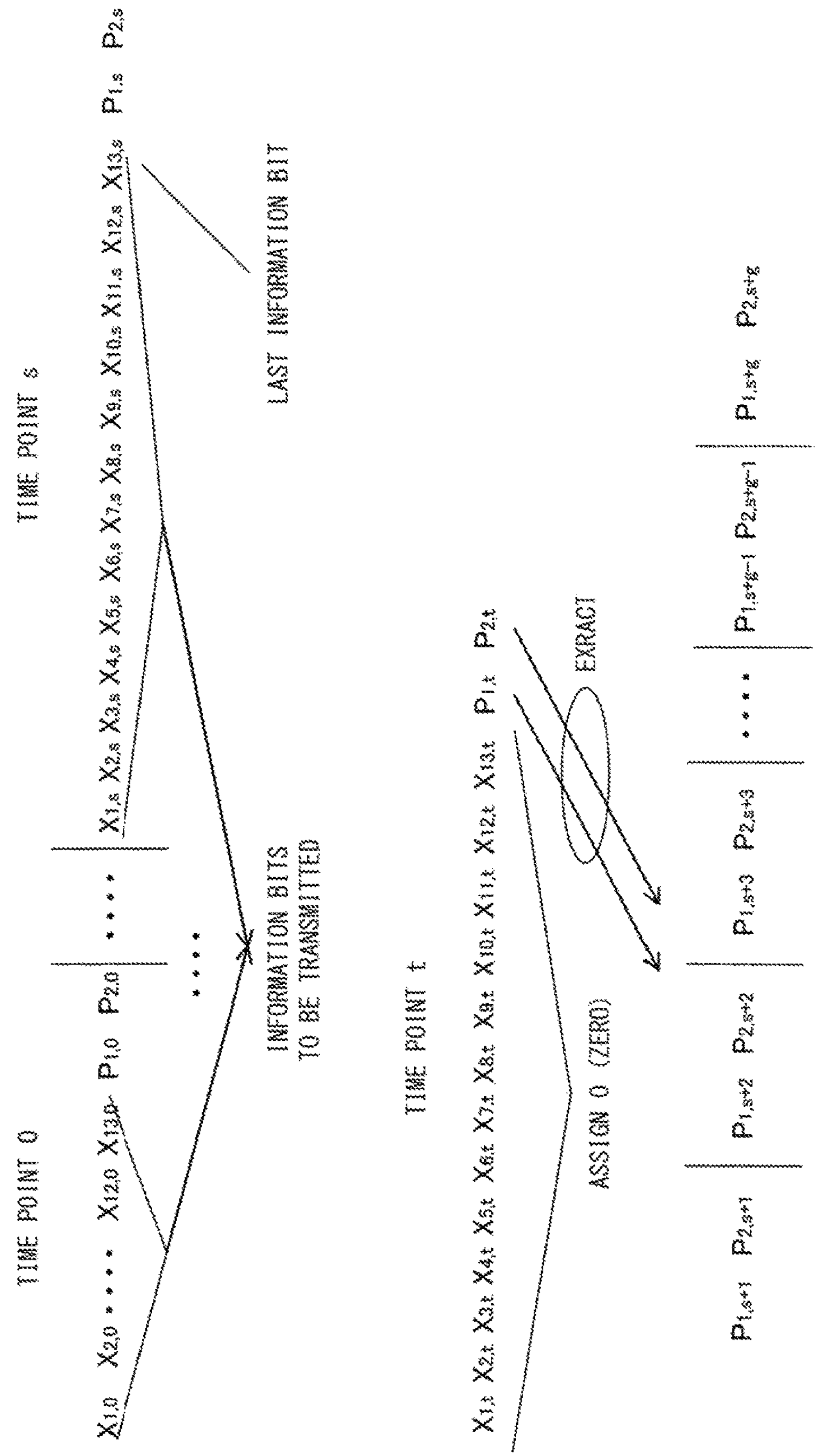
FIG. 97 is a diagram for explaining a zero-termination method.

Suppose that in FIG. 97, information $X_1$ through $X_{13}$ exist from time point 0, and information $X_{13}$ at time point s (where s is an integer no smaller than zero) is the last information bit. That is, suppose that the information to be transmitted from the transmitting device to the receiving device is information $X_{1,j}$ through $X_{13,j}$, being information $X_1$ through $X_{13}$ at time point j, respectively, where j is an integer no smaller than zero and no greater than s.

In such a case, the transmitting device transmits information $X_1$ through $X_{13}$, parity $P_1$, and parity $P_2$ from time point 0 to time point s, or that is, transmits $X_{1,j}$, $X_{2,j}$, $X_{3,j}$, $X_{4,j}$, $X_{5,j}$, $X_{6,j}$, $X_{7,j}$, $X_{8,j}$, $X_{9,j}$, $X_{10,j}$, $X_{11,j}$, $X_{12,j}$, $X_{13,j}$, $P_{1,j}$, $P_{2,j}$, where j is an integer no smaller than zero and no greater than s. (Note that $P_{1,j}$ and $P_{2,j}$ denote parity $P_1$ and parity $P_2$ at time point j, respectively.)

Further, suppose that information $X_1$ through $X_{13}$ from time point s+1 to time point s+g (where g is an integer no smaller than one) is "0", or that is, when denoting information $X_1$ through $X_{13}$ at time point t as $X_{1,t}$, $X_{2,t}$, $X_{3,t}$, $X_{4,t}$, $X_{5,t}$, $X_{6,t}$, $X_{7,t}$, $X_{8,t}$, $X_{9,t}$, $X_{10,t}$, $X_{11,t}$, $X_{12,t}$, $X_{13,t}$, respectively, $X_{1,t}=0$, $X_{2,t}=0$, $X_{3,t}=0$, $X_{4,t}=0$, $X_{5,t}=0$, $X_{6,t}=0$, $X_{7,t}=0$, $X_{8,t}=0$, $X_{9,t}=0$, $X_{10,t}=0$, $X_{11,t}=0$, $X_{12,t}0$, $X_{13,t}=0$ hold true for t being an integer no smaller than s+1 and no greater than s+g. The transmitting device, by performing encoding, acquires parities $P_{1,t}$ and $P_{2,t}$ for t being an integer no smaller than s+1 and no greater than s+g. The transmitting device, in addition to the information and parities described above, transmits parities $P_{1,t}$ and $P_{2,t}$ for t being an integer no smaller than s+1 and no greater than s+g.

Meanwhile, the receiving device performs decoding by using log-likelihood ratios for the information and the parities transmitted by the transmitting device, and log-likelihood ratios corresponding to $X_{1,t}=0$, $X_{2,t}=0$, $X_{3,t}=0$, $X_{4,t}=0$, $X_{5,t}=0$, $X_{6,t}=0$, $X_{7,t}=0$, $X_{8,t}=0$, $X_{9,t}=0$, $X_{10,t}=0$, $X_{11,t}=0$, $X_{12,t}=0$, $X_{13,t}=0$ for t being an integer no smaller than s+1 and no greater than s+g, and thereby acquires an estimation sequence of information.

Figure 98:
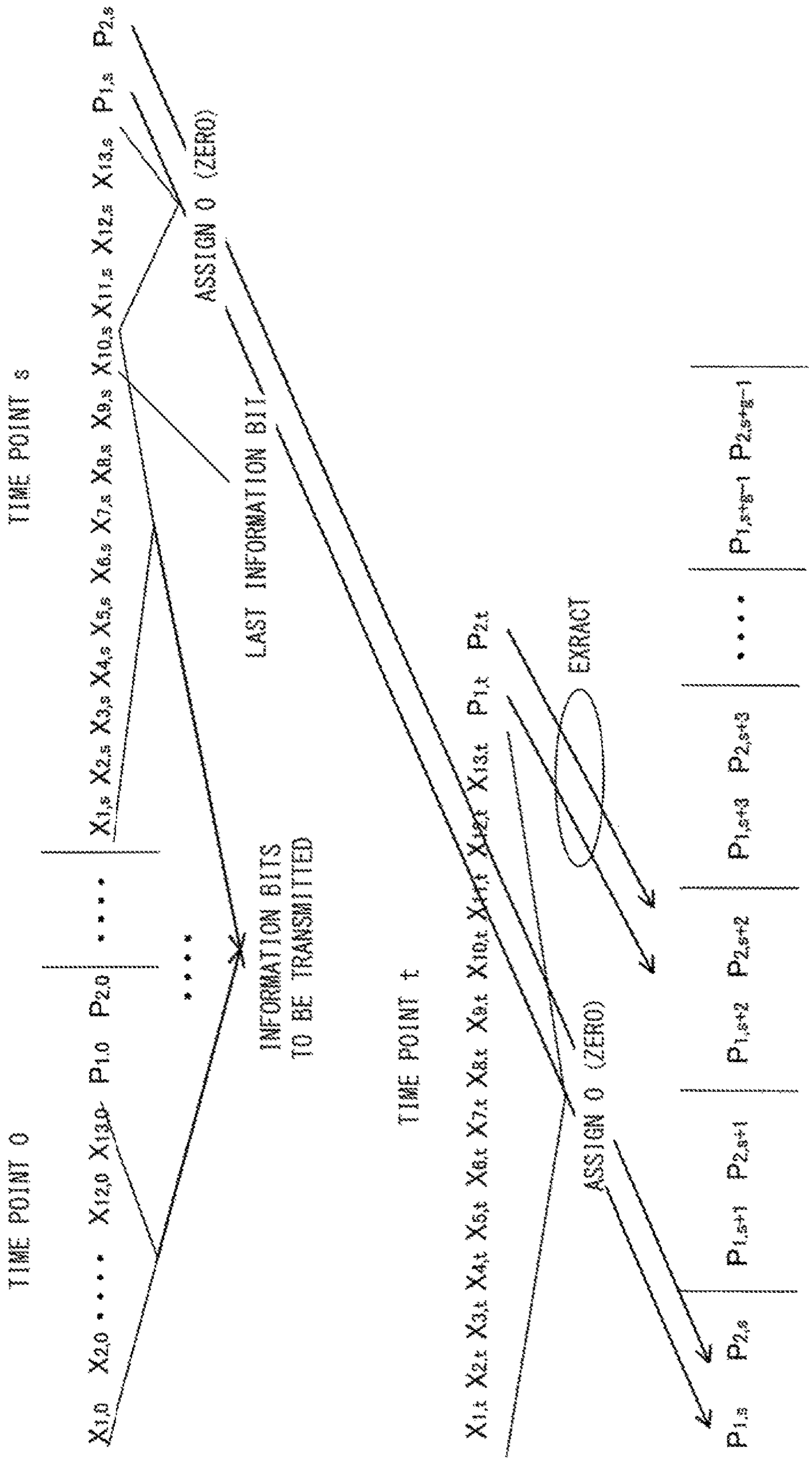
FIG. 98 is a diagram for explaining a zero-termination method.

FIG. 98 illustrates an example differing from that illustrated in FIG. 97. Suppose that information $X_1$ through $X_{13}$ exist from time point 0, and information $X_f$ for time point s (where s is an integer no smaller than zero) is the last information bit. Here, f is an integer no smaller than one and no greater than twelve. In FIG. 97, f equals 10, for example. That is, suppose that the information to be transmitted from the transmitting device to the receiving device is information $X_{i,s}$, where i is an integer no smaller than one and no greater than f, and information $X_{1,j}$, information $X_{2,j}$, information $X_{3,j}$, information $X_{4,j}$, information $X_{5,j}$, information $X_{6,j}$, information $X_{7,j}$, information $X_{8,j}$, information $X_{9,j}$, information $X_{10,j}$, information $X_{11,j}$, information $X_{12,j}$, information $X_{13,j}$, being information $X_1$ through $X_{13}$ at time point j, respectively, where j is an integer no smaller than zero and no greater than s−1.

In such a case, the transmitting device transmits information $X_1$ through $X_{13}$, parity $P_1$, and parity $P_2$ from time point 0 to time point s−1, or that is, transmits $X_{1,j}$, $X_{2,j}$, $X_{3,j}$, $X_{4,j}$, $X_{5,j}$, $X_{6,j}$, $X_{7,j}$, $X_{8,j}$, $X_{9,j}$, $X_{10,j}$, $X_{11,j}$, $X_{12,j}$, $P_{2,j}$, where j is an integer no smaller than zero and no greater than s−1. (Note that $P_{1,j}$ and $P_{2,j}$ denote parity $P_1$ and parity $P_2$ at time point j, respectively.)

Further, suppose that at time point s, information $X_{i,s}$, when i is an integer no smaller than one and no greater than f, is information that the transmitting device is to transmit, and suppose that $X_{k,s}$, when k is an integer so smaller than f+1 and no greater than thirteen, equals "0" (zero).

Further, suppose that information $X_1$ through $X_{13}$ from time point s+1 to time point s+g−1 (where g is an integer no smaller than two) is "0", or that is, when denoting information $X_1$ through $X_{13}$ at time point t as $X_{1,t}$, $X_{2,t}$, $X_{3,t}$, $X_{4,t}$, $X_{5,t}$, $X_{6,t}$, $X_{7,t}$, $X_{8,t}$=0, $X_{9,t}$=0, $X_{10,t}$=0, $X_{11,t}$=0, $X_{12,t}$=0, $X_{13,t}$=0 respectively, $X_{1,t}$=0, $X_{2,t}$=0, $X_{3,t}$=0, $X_{4,t}$=0, $X_{5,t}$=0, $X_{6,t}$=0, $X_{7,t}$=0, $X_{8,t}$=0, $X_{9,t}$=0, $X_{10,t}$=0, $X_{11,t}$=0, $X_{12,t}$=0, $X_{13,t}$=0 hold true when t is an integer no smaller than s+1 and no greater than s+g−1. The transmitting device, by performing encoding from time point s to time point s+g−1, acquires parities $P_{1,u}$ and $P_{2,u}$ for u being an integer no smaller than s and no greater than s+g−1. The transmitting device, in addition to the information and parities described above, transmits $X_{i,s}$ for i being an integer no smaller than one and no greater than f, and parities $P_{1,u}$ and $P_{2,u}$ for u being an integer no smaller than s and no greater than s+g−1.

Meanwhile, the receiving device performs decoding by using log-likelihood ratios for the information and the parities transmitted by the transmitting device, log-likelihood ratios corresponding to $X_{k,s}$=0 (where k is an integer no smaller than f+1 and no greater than thirteen) and log-likelihood ratios corresponding to $X_{1,t}$=0, $X_{2,t}$=0, $X_{3,t}$=0, $X_{4,t}$=0, $X_{5,t}$=0, $X_{6,t}$=0, $X_{7,t}$=0, $X_{8,t}$=0, $X_{9,t}$=0, $X_{10,t}$=0, $X_{11,t}$=0, $X_{12,t}$=0, $X_{13,t}$=0 for t being an integer no smaller than s+1 and no greater than s+g−1, and thereby acquires an estimation sequence of information.

Although description is provided above taking an example where error correction coding is introduced to a communication device, the error correction coding described above is not limited to being introduced to a communication device, and for example, may be introduced to a storage medium (storage). When making such a modification, information that is to be stored to a storage medium (storage) is encoded by using the LDPC-CC of coding rate 13/15 that is based on a parity check polynomial, description of which has been provided in embodiments G1 and G2, and resultant information and parities are stored to the storage medium (storage). When making such a modification, it is preferable that information-zero termination be introduced as described above and that a data sequence as described above corresponding to a data sequence (information and parities) transmitted by the transmitting device when information-zero termination is applied be stored to the storage medium (storage).

Further, the LDPC-CC of coding rate 13/15 that is based on a parity check polynomial, description of which has been provided in embodiments G1 and G2, is applicable to any device that requires error correction coding (e.g., a memory, a hard disk).

Embodiment G4

In the present embodiment, description is provided of a method of configuring an LDPC-CC of coding rate 13/15 that uses an improved tail-biting scheme (an LDPC block code using an LDPC-CC). The LDPC-CC of coding rate 13/15 that uses an improved tail-biting scheme described in the present embodiment is based on the LDPC-CC of coding rate 13/15 that is based on a parity check polynomial, description of which has been provided in embodiments G1 and G2.

Patent Literature 2 includes explanation regarding an LDPC-CC of coding rate (n−1)/n (where n is an integer no smaller than two) that uses an improved tail-biting scheme (an LDPC block code using an LDPC-CC). However, Patent Literature 2 poses a problem for not disclosing an LDPC-CC of a coding rate not satisfying (n−1)/n that uses an improved tail-biting scheme (an LDPC block code using an LDPC-CC).

In the present embodiment, as one example of an LDPC-CC of a coding rate not satisfying (n−1)/n that uses an improved tail-biting scheme (an LDPC block code using an LDPC-CC), description is provided of a method of configuring an LDPC-CC of coding rate 13/15 that uses an improved tail-biting scheme (an LDPC block code using an LDPC-CC).

[Periodic Time-Varying LDPC-CC of Coding Rate 13/15 Using Improved Tail-Biting Scheme and Based on Parity Check Polynomial]

The following describes a periodic time-varying LDPC-CC of coding rate 13/15 that uses an improved tail-biting scheme and is based on a parity check polynomial, based on the configuration of the LDPC-CC of coding rate 13/15 and time-varying period 2m that is based on a parity check polynomial, description of which has been provided in embodiments G1 and G2.

The following describes a method of configuring an LDPC-CC of coding rate 13/15 and time-varying period 2m that is based on a parity check polynomial. Such method has already been described in embodiment G2.

First, the following parity check polynomials satisfying zero are prepared.

[Math. 815-1]

$$\left(1+\sum_{s=1}^{R_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+ \quad (197\text{-}1\text{-}1)$$

$$\left(1+\sum_{s=1}^{R_{\#(2i),3}} D^{\alpha\#(2i),3,s}\right)X_3(D)+\left(1+\sum_{s=1}^{R_{\#(2i),3}} D^{\alpha\#(2i),3,s}\right)X_4(D)+$$

$$\left(1+\sum_{s=1}^{R_{\#(2i),3}} D^{\alpha\#(2i),3,s}\right)X_2(D)+\left(1+\sum_{s=1}^{R_{\#(2i),6}} D^{\alpha\#(2i),6,s}\right)X_6(D)+$$

$$\left(\sum_{s=R_{\#(2i),7}+1}^{r_{\#(2i),7}} D^{\alpha\#(2i),7,s}\right)$$

$$X_7(D)+$$

-continued $$\left(\sum_{s=R_{\#(2i),8}+1}^{r_{\#(2i),8}} D^{\alpha\#(2i),8,s}\right)X_8(D)+\left(\sum_{s=R_{\#(2i),9}+1}^{r_{\#(2i),9}} D^{\alpha\#(2i),9,s}\right)X_9(D)+ \left(\sum_{s=R_{\#(2i),10}+1}^{r_{\#(2i),10}} D^{\alpha\#(2i),10,s}\right)X_{10}(D)+ \left(\sum_{s=R_{\#(2i),11}+1}^{r_{\#(2i),11}} D^{\alpha\#(2i),11,s}\right)X_{11}(D)+ \left(\sum_{s=R_{\#(2i),12}+1}^{r_{\#(2i),12}} D^{\alpha\#(2i),12,s}\right)X_{12}(D)+ \left(\sum_{s=R_{\#(2i),13}+1}^{r_{\#(2i),13}} D^{\alpha\#(2i),13,s}\right)X_{13}(D)+$$

$$P_1(D)+D^{\beta\#(2i),0}P_2(D)= (D^{\alpha\#(2i),1,R_{\#(2i),1}}+\ldots+D^{\alpha\#(2i),1,1}+1)X_1(D)+ (D^{\alpha\#(2i),2,R_{\#(2i),2}}+\ldots+D^{\alpha\#(2i),2,1}+1)X_2(D)+ (D^{\alpha\#(2i),3,R_{\#(2i),3}}+\ldots+D^{\alpha\#(2i),3,1}+1)X_3(D)+ (D^{\alpha\#(2i),4,R_{\#(2i),4}}+\ldots+D^{\alpha\#(2i),4,1}+1)X_4(D)+ (D^{\alpha\#(2i),5,R_{\#(2i),5}}+\ldots+D^{\alpha\#(2i),5,1}+1)X_5(D)+ (D^{\alpha\#(2i),6,R_{\#(2i),6}}+\ldots+D^{\alpha\#(2i),6,1}+1)X_6(D)+$$

$$\left(D^{\alpha\#(2i),7,r_{\#(2i),7}}+\ldots+D^{\alpha\#(2i),7,R_{\#(2i),7}+1}\right)X_7(D)+ \left(D^{\alpha\#(2i),8,r_{\#(2i),8}}+\ldots+D^{\alpha\#(2i),8,R_{\#(2i),8}+1}\right)X_8(D)+ \left(D^{\alpha\#(2i),9,r_{\#(2i),9}}+\ldots+D^{\alpha\#(2i),9,R_{\#(2i),9}+1}\right)X_9(D)+ \left(D^{\alpha\#(2i),10,r_{\#(2i),10}}+\ldots+D^{\alpha\#(2i),10,R_{\#(2i),10}+1}\right)X_{10}(D)+ \left(D^{\alpha\#(2i),11,r_{\#(2i),11}}+\ldots+D^{\alpha\#(2i),11,R_{\#(2i),11}+1}\right)X_{11}(D)+ \left(D^{\alpha\#(2i),12,r_{\#(2i),12}}+\ldots+D^{\alpha\#(2i),12,R_{\#(2i),12}+1}\right)X_{12}(D)+ \left(D^{\alpha\#(2i),13,r_{\#(2i),13}}+\ldots+D^{\alpha\#(2i),13,R_{\#(2i),13}+1}\right)X_{13}(D)+ P_1(D)+D^{\beta\#(2i),0}P_2(D)=0$$

[Math. 815-2]

$$\left(1+\sum_{s=1}^{R_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+ \left(1+\sum_{s=1}^{R_{\#(2i),3}} D^{\alpha\#(2i),3,s}\right)X_3(D)+\left(1+\sum_{s=1}^{R_{\#(2i),3}} D^{\alpha\#(2i),3,s}\right)X_4(D)+ \left(1+\sum_{s=1}^{R_{\#(2i),3}} D^{\alpha\#(2i),3,s}\right)X_2(D)+\left(1+\sum_{s=1}^{R_{\#(2i),6}} D^{\alpha\#(2i),6,s}\right)X_6(D)+ \left(\sum_{s=R_{\#(2i),7}+1}^{r_{\#(2i),7}} D^{\alpha\#(2i),7,s}\right)X_7(D)+ \quad (197\text{-}1\text{-}2)$$

-continued $$\left(\sum_{s=R_{\#(2i),8}+1}^{r_{\#(2i),8}} D^{\alpha\#(2i),8,s}\right)X_8(D)+\left(\sum_{s=R_{\#(2i),9}+1}^{r_{\#(2i),9}} D^{\alpha\#(2i),9,s}\right)X_9(D)+ \left(\sum_{s=R_{\#(2i),10}+1}^{r_{\#(2i),10}} D^{\alpha\#(2i),10,s}\right)X_{10}(D)+ \left(\sum_{s=R_{\#(2i),11}+1}^{r_{\#(2i),11}} D^{\alpha\#(2i),11,s}\right)X_{11}(D)+ \left(\sum_{s=R_{\#(2i),12}+1}^{r_{\#(2i),12}} D^{\alpha\#(2i),12,s}\right)X_{12}(D)+ \left(\sum_{s=R_{\#(2i),13}+1}^{r_{\#(2i),13}} D^{\alpha\#(2i),13,s}\right)X_{13}(D)+$$

$$P_1(D)+D^{\beta\#(2i),1}P_1(D)= (D^{\alpha\#(2i),1,R_{\#(2i),1}}+\ldots+D^{\alpha\#(2i),1,1}+1)X_1(D)+ (D^{\alpha\#(2i),2,R_{\#(2i),2}}+\ldots+D^{\alpha\#(2i),2,1}+1)X_2(D)+ (D^{\alpha\#(2i),3,R_{\#(2i),3}}+\ldots+D^{\alpha\#(2i),3,1}+1)X_3(D)+ (D^{\alpha\#(2i),4,R_{\#(2i),4}}+\ldots+D^{\alpha\#(2i),4,1}+1)X_4(D)+ (D^{\alpha\#(2i),5,R_{\#(2i),5}}+\ldots+D^{\alpha\#(2i),5,1}+1)X_5(D)+ (D^{\alpha\#(2i),6,R_{\#(2i),6}}+\ldots+D^{\alpha\#(2i),6,1}+1)X_6(D)+$$

$$\left(D^{\alpha\#(2i),7,r_{\#(2i),7}}+\ldots+D^{\alpha\#(2i),7,R_{\#(2i),7}+1}\right)X_7(D)+ \left(D^{\alpha\#(2i),8,r_{\#(2i),8}}+\ldots+D^{\alpha\#(2i),8,R_{\#(2i),8}+1}\right)X_8(D)+ \left(D^{\alpha\#(2i),9,r_{\#(2i),9}}+\ldots+D^{\alpha\#(2i),9,R_{\#(2i),9}+1}\right)X_9(D)+ \left(D^{\alpha\#(2i),10,r_{\#(2i),10}}+\ldots+D^{\alpha\#(2i),10,R_{\#(2i),10}+1}\right)X_{10}(D)+ \left(D^{\alpha\#(2i),11,r_{\#(2i),11}}+\ldots+D^{\alpha\#(2i),11,R_{\#(2i),11}+1}\right)X_{11}(D)+ \left(D^{\alpha\#(2i),12,r_{\#(2i),12}}+\ldots+D^{\alpha\#(2i),12,R_{\#(2i),12}+1}\right)X_{12}(D)+ \left(D^{\alpha\#(2i),13,r_{\#(2i),13}}+\ldots+D^{\alpha\#(2i),13,R_{\#(2i),13}+1}\right)X_{13}(D)+ P_1(D)+D^{\beta\#(2i),1}P_1(D)=0$$

[Math. 815-3]

$$\left(\sum_{s=R_{\#(2i),1}+1}^{r_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+ \left(\sum_{s=R_{\#(2i),3}+1}^{r_{\#(2i),3}} D^{\alpha\#(2i),3,s}\right)X_3(D)+\left(\sum_{s=R_{\#(2i),4}+1}^{r_{\#(2i),4}} D^{\alpha\#(2i),4,s}\right)X_4(D)+ \left(\sum_{s=R_{\#(2i),5}+1}^{r_{\#(2i),5}} D^{\alpha\#(2i),5,s}\right)X_5(D)+\left(\sum_{s=R_{\#(2i),6}+1}^{r_{\#(2i),6}} D^{\alpha\#(2i),6,s}\right)X_6(D)+ \left(1+\sum_{s=1}^{R_{\#(2i),7}} D^{\alpha\#(2i),7,s}\right)X_7(D)+ \quad (197\text{-}2\text{-}1)$$

-continued $$\left(1+\sum_{s=1}^{R_{\#(2i),8}} D^{\alpha\#(2i),8,s}\right)X_8(D)+\left(1+\sum_{s=1}^{R_{\#(2i),9}} D^{\alpha\#(2i),9,s}\right)X_9(D)+$$
$$\left(1+\sum_{s=1}^{R_{\#(2i),10}} D^{\alpha\#(2i),10,s}\right)X_{10}(D)+$$
$$\left(1+\sum_{s=1}^{R_{\#(2i),11}} D^{\alpha\#(2i),11,s}\right)X_{11}(D)+$$
$$\left(1+\sum_{s=1}^{R_{\#(2i),12}} D^{\alpha\#(2i),12,s}\right)X_{12}(D)+$$
$$\left(1+\sum_{s=1}^{R_{\#(2i),13}} D^{\alpha\#(2i),13,s}\right)X_{13}(D)+$$

$$P_2(D)+D^{\beta\#(2i),2}P_1(D)=$$
$$\left(D^{\alpha\#(2i),1,r_{\#(2i),1}}+\ldots+D^{\alpha\#(2i),1,R_{\#(2i),1}+1}\right)X_1(D)+$$
$$\left(D^{\alpha\#(2i),2,r_{\#(2i),2}}+\ldots+D^{\alpha\#(2i),2,R_{\#(2i),2}+1}\right)X_2(D)+$$
$$\left(D^{\alpha\#(2i),3,r_{\#(2i),3}}+\ldots+D^{\alpha\#(2i),3,R_{\#(2i),3}+1}\right)X_3(D)+$$
$$\left(D^{\alpha\#(2i),4,r_{\#(2i),4}}+\ldots+D^{\alpha\#(2i),4,R_{\#(2i),4}+1}\right)X_4(D)+$$
$$\left(D^{\alpha\#(2i),5,r_{\#(2i),5}}+\ldots+D^{\alpha\#(2i),5,R_{\#(2i),5}+1}\right)X_5(D)+$$
$$\left(D^{\alpha\#(2i),6,r_{\#(2i),6}}+\ldots+D^{\alpha\#(2i),6,R_{\#(2i),6}+1}\right)X_6(D)+$$

$$\left(D^{\alpha\#(2i),7,R_{\#(2i),7}}+\ldots+D^{\alpha\#(2i),7,1}+1\right)X_7(D)+$$
$$\left(D^{\alpha\#(2i),8,R_{\#(2i),8}}+\ldots+D^{\alpha\#(2i),8,1}+1\right)X_8(D)+$$
$$\left(D^{\alpha\#(2i),9,R_{\#(2i),9}}+\ldots+D^{\alpha\#(2i),9,1}+1\right)X_9(D)+$$
$$\left(D^{\alpha\#(2i),10,R_{\#(2i),10}}+\ldots+D^{\alpha\#(2i),10,1}+1\right)X_{10}(D)+$$
$$\left(D^{\alpha\#(2i),11,R_{\#(2i),11}}+\ldots+D^{\alpha\#(2i),11,1}+1\right)X_{11}(D)+$$
$$\left(D^{\alpha\#(2i),12,R_{\#(2i),12}}+\ldots+D^{\alpha\#(2i),12,1}+1\right)X_{12}(D)+$$
$$\left(D^{\alpha\#(2i),13,R_{\#(2i),13}}+\ldots+D^{\alpha\#(2i),13,1}+1\right)X_{13}(D)+$$
$$P_2(D)+D^{\beta\#(2i),2}P_1(D)=0$$

[Math. 815-4]

$$\left(\sum_{s=R_{\#(2i),1}+1}^{r_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+ \quad (197\text{-}2\text{-}2)$$
$$\left(\sum_{s=R_{\#(2i),3}+1}^{r_{\#(2i),3}} D^{\alpha\#(2i),3,s}\right)X_3(D)+\left(\sum_{s=R_{\#(2i),4}+1}^{r_{\#(2i),4}} D^{\alpha\#(2i),4,s}\right)X_4(D)+$$
$$\left(\sum_{s=R_{\#(2i),5}+1}^{r_{\#(2i),5}} D^{\alpha\#(2i),5,s}\right)X_5(D)+\left(\sum_{s=R_{\#(2i),6}+1}^{r_{\#(2i),6}} D^{\alpha\#(2i),6,s}\right)X_6(D)+$$
$$\left(1+\sum_{s=1}^{R_{\#(2i),7}} D^{\alpha\#(2i),7,s}\right)X_7(D)+$$

-continued $$\left(1+\sum_{s=1}^{R_{\#(2i),8}} D^{\alpha\#(2i),8,s}\right)X_8(D)+\left(1+\sum_{s=1}^{R_{\#(2i),9}} D^{\alpha\#(2i),9,s}\right)X_9(D)+$$
$$\left(1+\sum_{s=1}^{R_{\#(2i),10}} D^{\alpha\#(2i),10,s}\right)X_{10}(D)+$$
$$\left(1+\sum_{s=1}^{R_{\#(2i),11}} D^{\alpha\#(2i),11,s}\right)X_{11}(D)+$$
$$\left(1+\sum_{s=1}^{R_{\#(2i),12}} D^{\alpha\#(2i),12,s}\right)X_{12}(D)+$$
$$\left(1+\sum_{s=1}^{R_{\#(2i),13}} D^{\alpha\#(2i),13,s}\right)X_{13}(D)+$$

$$P_2(D)+D^{\beta\#(2i),3}P_2(D)=$$
$$\left(D^{\alpha\#(2i),1,r_{\#(2i),1}}+\ldots+D^{\alpha\#(2i),1,R_{\#(2i),1}+1}\right)X_1(D)+$$
$$\left(D^{\alpha\#(2i),2,r_{\#(2i),2}}+\ldots+D^{\alpha\#(2i),2,R_{\#(2i),2}+1}\right)X_2(D)+$$
$$\left(D^{\alpha\#(2i),3,r_{\#(2i),3}}+\ldots+D^{\alpha\#(2i),3,R_{\#(2i),3}+1}\right)X_3(D)+$$
$$\left(D^{\alpha\#(2i),4,r_{\#(2i),4}}+\ldots+D^{\alpha\#(2i),4,R_{\#(2i),4}+1}\right)X_4(D)+$$
$$\left(D^{\alpha\#(2i),5,r_{\#(2i),5}}+\ldots+D^{\alpha\#(2i),5,R_{\#(2i),5}+1}\right)X_5(D)+$$
$$\left(D^{\alpha\#(2i),6,r_{\#(2i),6}}+\ldots+D^{\alpha\#(2i),6,R_{\#(2i),6}+1}\right)X_6(D)+$$

$$\left(D^{\alpha\#(2i),7,R_{\#(2i),7}}+\ldots+D^{\alpha\#(2i),7,1}+1\right)X_7(D)+$$
$$\left(D^{\alpha\#(2i),8,R_{\#(2i),8}}+\ldots+D^{\alpha\#(2i),8,1}+1\right)X_8(D)+$$
$$\left(D^{\alpha\#(2i),9,R_{\#(2i),9}}+\ldots+D^{\alpha\#(2i),9,1}+1\right)X_9(D)+$$
$$\left(D^{\alpha\#(2i),10,R_{\#(2i),10}}+\ldots+D^{\alpha\#(2i),10,1}+1\right)X_{10}(D)+$$
$$\left(D^{\alpha\#(2i),11,R_{\#(2i),11}}+\ldots+D^{\alpha\#(2i),11,1}+1\right)X_{11}(D)+$$
$$\left(D^{\alpha\#(2i),12,R_{\#(2i),12}}+\ldots+D^{\alpha\#(2i),12,1}+1\right)X_{12}(D)+$$
$$\left(D^{\alpha\#(2i),13,R_{\#(2i),13}}+\ldots+D^{\alpha\#(2i),13,1}+1\right)X_{13}(D)+$$
$$P_2(D)+D^{\beta\#(2i),3}P_2(D)=0$$

In expressions (197-1-1), (197-1-2), (197-2-1), (197-2-2), i is an integer no smaller than zero and no greater than m−1 (i=0, 1, . . . , m−2, m−1).

In expressions (197-1-1), (197-1-2), (197-2-1), (197-2-2), $\alpha_{\#(2i),p,q}$ (where p is an integer no smaller than one and no greater than thirteen, q is an integer no smaller than one and no greater than $r_{\#(2i),p}$ (where $r_{\#(2i),p}$ is a natural number)) and $\beta_{\#(2i),0}$ is a natural number, $\beta_{\#(2i),1}$ is a natural number, $\beta_{\#(2i),2}$ is an integer no smaller than zero, and $\beta_{\#(2i),3}$ is a natural number.

Further, $R_{\#(2i),p}$ is a natural number satisfying $1 \le R_{\#(2i),p} < r_{\#(2i),p}$.

Further, y is an integer no smaller than one and no greater than $r_{\#(2i),p}$, z is an integer no smaller than one and no greater than $r_{\#2i,p}$, and $\alpha_{\#(2i),p,y} \neq \alpha_{\#(2i),p,z}$ holds true for $\forall$(y, z) where y≠z. $\forall$ is a universal quantifier. (y is an integer no smaller than one and no greater than $r_{\#(2i),p}$, z is an integer no smaller than one and no greater than $r_{\#2i,p}$, and $\alpha_{\#(2i),p,y} \neq \alpha_{\#(2i),p,z}$ holds true for all y and all z satisfying y≠z.)

Note that in the following, to simplify explanation, a parity check polynomial satisfying zero that is expressed by expression (197-1-1) or expression (197-1-2) is referred to as "#(2i); first expression" for realizing a time-varying period 2m, and a parity check polynomial satisfying zero that is expressed by expression (197-2-1) or expression (197-2-2) is referred to as "#(2i); second expression" for realizing a time-varying period 2m.

Thus, for each i, as #(2i); first expression for realizing a time-varying period 2m, a parity check polynomial satisfying zero expressed by either expression (197-1-1) or expression (197-1-2) is prepared.

That is, for i=0, a parity check polynomial satisfying zero provided by expression (197-1-1) where i=0, or a parity check polynomial satisfying zero provided by expression (197-1-2) where i=0 is prepared.

Similarly:

for i=1, a parity check polynomial satisfying zero provided by expression (197-1-1) where i=1, or a parity check polynomial satisfying zero provided by expression (197-1-2) where i=1 is prepared;

for i=2, a parity check polynomial satisfying zero provided by expression (197-1-1) where i=2, or a parity check polynomial satisfying zero provided by expression (197-1-2) where i=2 is prepared;

⋮ for i=z, a parity check polynomial satisfying zero provided by expression (197-1-1) where i=z, or a parity check polynomial satisfying zero provided by expression (197-1-2) where i=z is prepared (where z is an integer no smaller than zero and no greater than m−1); and

⋮ for i=m−1, a parity check polynomial satisfying zero provided by expression (197-1-1) where i=m−1, or a parity check polynomial satisfying zero provided by expression (197-1-2) where i=m−1 is prepared.

Similarly, for each i, as #(2i); second expression for realizing a time-varying period 2m, a parity check polynomial satisfying zero expressed by either expression (197-2-1) or expression (197-2-2) is prepared.

That is, for i=0, a parity check polynomial satisfying zero provided by expression (197-2-1) where i=0, or a parity check polynomial satisfying zero provided by expression (197-2-2) where i=0 is prepared.

Similarly:

for i=1, a parity check polynomial satisfying zero provided by expression (197-2-1) where i=1, or a parity check polynomial satisfying zero provided by expression (197-2-2) where i=1 is prepared;

for i=2, a parity check polynomial satisfying zero provided by expression (197-2-1) where i=2, or a parity check polynomial satisfying zero provided by expression (197-2-2) where i=2 is prepared;

⋮ for i=z, a parity check polynomial satisfying zero provided by expression (197-2-1) where i=z, or a parity check polynomial satisfying zero provided by expression (197-2-2) where i=z is prepared (where z is an integer no smaller than zero and no greater than m−1); and

⋮ for i=m−1, a parity check polynomial satisfying zero provided by expression (197-2-1) where i=m−1, or a parity check polynomial satisfying zero provided by expression (197-2-2) where i=m−1 is prepared.

Similarly, the following parity check polynomials satisfying zero are provided.

[Math. 816-1]

$$\begin{aligned}
&\left(\sum_{s=R_{\#(2i+1),1}+1}^{r_{\#(2i+1),1}} D^{\alpha\#(2i+1),1,s}\right)X_1(D) + \left(\sum_{s=R_{\#(2i+1),1}+2}^{r_{\#(2i+1),2}} D^{\alpha\#(2i+1),2,s}\right)X_2(D) + \\
&\left(\sum_{s=R_{\#(2i+1),1}+3}^{r_{\#(2i+1),3}} D^{\alpha\#(2i+1),3,s}\right)X_3(D) + \left(\sum_{s=R_{\#(2i+1),1}+4}^{r_{\#(2i+1),4}} D^{\alpha\#(2i+1),4,s}\right)X_4(D) + \\
&\left(\sum_{s=R_{\#(2i+1),1}+5}^{r_{\#(2i+1),5}} D^{\alpha\#(2i+1),5,s}\right)X_5(D) + \left(\sum_{s=R_{\#(2i+1),1}+6}^{r_{\#(2i+1),6}} D^{\alpha\#(2i+1),6,s}\right)X_6(D) + \\
&\left(1+\sum_{s=1}^{R_{\#(2i+1),7}} D^{\alpha\#(2i+1),7,s}\right)X_7(D) + \left(1+\sum_{s=1}^{R_{\#(2i+1),8}} D^{\alpha\#(2i+1),8,s}\right)X_8(D) + \left(1+\sum_{s=1}^{R_{\#(2i+1),9}} D^{\alpha\#(2i+1),9,s}\right)X_9(D) + \\
&\left(1+\sum_{s=1}^{R_{\#(2i+1),10}} D^{\alpha\#(2i+1),10,s}\right)X_{10}(D) + \left(1+\sum_{s=1}^{R_{\#(2i+1),11}} D^{\alpha\#(2i+1),11,s}\right)X_{11}(D) + \\
&\left(1+\sum_{s=1}^{R_{\#(2i+1),12}} D^{\alpha\#(2i+1),12,s}\right)X_{12}(D) + \left(1+\sum_{s=1}^{R_{\#(2i+1),13}} D^{\alpha\#(2i+1),13,s}\right)X_{13}(D) + \\
&P_1(D) + D^{\beta\#(2i+1),0}P_2(D) = \\
&\left(D^{\alpha\#(2i+1),1,r_{\#(2i+1),1}} + \dots + D^{\alpha\#(2i+1),1,R_{\#(2i+1),1}+1}\right)X_1(D) + \\
&\left(D^{\alpha\#(2i+1),2,r_{\#(2i+1),2}} + \dots + D^{\alpha\#(2i+1),2,R_{\#(2i+1),2}+1}\right)X_2(D) + \\
&\left(D^{\alpha\#(2i+1),3,r_{\#(2i+1),3}} + \dots + D^{\alpha\#(2i+1),3,R_{\#(2i+1),3}+1}\right)X_3(D) + \\
&\left(D^{\alpha\#(2i+1),4,r_{\#(2i+1),4}} + \dots + D^{\alpha\#(2i+1),4,R_{\#(2i+1),4}+1}\right)X_4(D) + \\
&\left(D^{\alpha\#(2i+1),5,r_{\#(2i+1),5}} + \dots + D^{\alpha\#(2i+1),5,R_{\#(2i+1),5}+1}\right)X_5(D) + \\
&\left(D^{\alpha\#(2i+1),6,r_{\#(2i+1),6}} + \dots + D^{\alpha\#(2i+1),6,R_{\#(2i+1),6}+1}\right)X_6(D) + \\
&\left(D^{\alpha\#(2i+1),7,R_{\#(2i+1),7}} + \dots + D^{\alpha\#(2i+1),7,1} + 1\right)X_7(D) + \\
&\left(D^{\alpha\#(2i+1),8,R_{\#(2i+1),8}} + \dots + D^{\alpha\#(2i+1),8,1} + 1\right)X_8(D) + \\
&\left(D^{\alpha\#(2i+1),9,R_{\#(2i+1),9}} + \dots + D^{\alpha\#(2i+1),9,1} + 1\right)X_9(D) + \\
&\left(D^{\alpha\#(2i+1),10,R_{\#(2i+1),10}} + \dots + D^{\alpha\#(2i+1),10,1} + 1\right)X_{10}(D) + \\
&\left(D^{\alpha\#(2i+1),11,R_{\#(2i+1),11}} + \dots + D^{\alpha\#(2i+1),11,1} + 1\right)X_{11}(D) + \\
&\left(D^{\alpha\#(2i+1),12,R_{\#(2i+1),12}} + \dots + D^{\alpha\#(2i+1),12,1} + 1\right)X_{12}(D) + \\
&\left(D^{\alpha\#(2i+1),13,R_{\#(2i+1),13}} + \dots + D^{\alpha\#(2i+1),13,1} + 1\right)X_{13}(D) + \\
&P_1(D) + D^{\beta\#(2i+1),0}P_2(D) = 0
\end{aligned} \tag{198-1-1}$$

[Math. 816-2]

$$\left(\sum_{s=R_{\#(2i+1),1}+1}^{r_{\#(2i+1),1}} D^{\alpha\#(2i+1),1,s}\right)X_1(D)+\left(\sum_{s=R_{\#(2i+1),1}+2}^{r_{\#(2i+1),2}} D^{\alpha\#(2i+1),2,s}\right)X_2(D)+\left(\sum_{s=R_{\#(2i+1),1}+3}^{r_{\#(2i+1),3}} D^{\alpha\#(2i+1),3,s}\right)X_3(D)+\left(\sum_{s=R_{\#(2i+1),1}+4}^{r_{\#(2i+1),4}} D^{\alpha\#(2i+1),4,s}\right)X_4(D)+\left(\sum_{s=R_{\#(2i+1),1}+5}^{r_{\#(2i+1),5}} D^{\alpha\#(2i+1),5,s}\right)X_5(D)+\left(\sum_{s=R_{\#(2i+1),1}+6}^{r_{\#(2i+1),6}} D^{\alpha\#(2i+1),6,s}\right)X_6(D)+\left(1+\sum_{s=1}^{R_{\#(2i+1),7}} D^{\alpha\#(2i+1),7,s}\right)X_7(D)+\left(1+\sum_{s=1}^{R_{\#(2i+1),8}} D^{\alpha\#(2i+1),8,s}\right)X_8(D)+\left(1+\sum_{s=1}^{R_{\#(2i+1),9}} D^{\alpha\#(2i+1),9,s}\right)X_9(D)+\left(1+\sum_{s=1}^{R_{\#(2i+1),10}} D^{\alpha\#(2i+1),10,s}\right)X_{10}(D)+\left(1+\sum_{s=1}^{R_{\#(2i+1),11}} D^{\alpha\#(2i+1),11,s}\right)X_{11}(D)+\left(1+\sum_{s=1}^{R_{\#(2i+1),12}} D^{\alpha\#(2i+1),12,s}\right)X_{12}(D)+\left(1+\sum_{s=1}^{R_{\#(2i+1),13}} D^{\alpha\#(2i+1),13,s}\right)X_{13}(D)+P_1(D)+D^{\beta\#(2i+1),1}P_1(D)= \tag{198-1-2}$$

$$\left(D^{\alpha\#(2i+1),1,r_{\#(2i+1),1}}+\ldots+D^{\alpha\#(2i+1),1,R_{\#(2i+1),1}+1}\right)X_1(D)+\left(D^{\alpha\#(2i+1),2,r_{\#(2i+1),2}}+\ldots+D^{\alpha\#(2i+1),2,R_{\#(2i+1),2}+1}\right)X_2(D)+\left(D^{\alpha\#(2i+1),3,r_{\#(2i+1),3}}+\ldots+D^{\alpha\#(2i+1),3,R_{\#(2i+1),3}+1}\right)X_3(D)+\left(D^{\alpha\#(2i+1),4,r_{\#(2i+1),4}}+\ldots+D^{\alpha\#(2i+1),4,R_{\#(2i+1),4}+1}\right)X_4(D)+\left(D^{\alpha\#(2i+1),5,r_{\#(2i+1),5}}+\ldots+D^{\alpha\#(2i+1),5,R_{\#(2i+1),5}+1}\right)X_5(D)+\left(D^{\alpha\#(2i+1),6,r_{\#(2i+1),6}}+\ldots+D^{\alpha\#(2i+1),6,R_{\#(2i+1),6}+1}\right)X_6(D)+\left(D^{\alpha\#(2i+1),7,R_{\#(2i+1),7}}+\ldots+D^{\alpha\#(2i+1),7,1}+1\right)X_7(D)+\left(D^{\alpha\#(2i+1),8,R_{\#(2i+1),8}}+\ldots+D^{\alpha\#(2i+1),8,1}+1\right)X_8(D)+\left(D^{\alpha\#(2i+1),9,R_{\#(2i+1),9}}+\ldots+D^{\alpha\#(2i+1),9,1}+1\right)X_9(D)+\left(D^{\alpha\#(2i+1),10,R_{\#(2i+1),10}}+\ldots+D^{\alpha\#(2i+1),10,1}+1\right)X_{10}(D)+\left(D^{\alpha\#(2i+1),11,R_{\#(2i+1),11}}+\ldots+D^{\alpha\#(2i+1),11,1}+1\right)X_{11}(D)+\left(D^{\alpha\#(2i+1),12,R_{\#(2i+1),12}}+\ldots+D^{\alpha\#(2i+1),12,1}+1\right)X_{12}(D)+\left(D^{\alpha\#(2i+1),13,R_{\#(2i+1),13}}+\ldots+D^{\alpha\#(2i+1),13,1}+1\right)X_{13}(D)+P_1(D)+D^{\beta\#(2i+1),1}P_1(D)=0$$

[Math. 816-3]

$$\left(1+\sum_{s=1}^{R_{\#(2i+1),1}} D^{\alpha\#(2i+1),1,s}\right)X_1(D)+\left(1+\sum_{s=1}^{R_{\#(2i+1),2}} D^{\alpha\#(2i+1),2,s}\right)X_2(D)+\left(1+\sum_{s=1}^{R_{\#(2i+1),3}} D^{\alpha\#(2i+1),3,s}\right)X_3(D)+\left(1+\sum_{s=1}^{R_{\#(2i+1),4}} D^{\alpha\#(2i+1),4,s}\right)X_4(D)+\left(1+\sum_{s=1}^{R_{\#(2i+1),5}} D^{\alpha\#(2i+1),5,s}\right)X_5(D)+\left(1+\sum_{s=1}^{R_{\#(2i+1),6}} D^{\alpha\#(2i+1),6,s}\right)X_6(D)+\left(\sum_{s=R_{\#(2i+1),7}+1}^{r_{\#(2i+1),7}} D^{\alpha\#(2i+1),7,s}\right)X_7(D)+\left(\sum_{s=R_{\#(2i+1),8}+1}^{r_{\#(2i+1),8}} D^{\alpha\#(2i+1),8,s}\right)X_8(D)+\left(\sum_{s=R_{\#(2i+1),9}+1}^{r_{\#(2i+1),9}} D^{\alpha\#(2i+1),9,s}\right)X_9(D)+\left(\sum_{s=R_{\#(2i+1),10}+1}^{r_{\#(2i+1),10}} D^{\alpha\#(2i+1),10,s}\right)X_{10}(D)+\left(\sum_{s=R_{\#(2i+1),11}+1}^{r_{\#(2i+1),11}} D^{\alpha\#(2i+1),11,s}\right)X_{11}(D)+\left(\sum_{s=R_{\#(2i+1),12}+1}^{r_{\#(2i+1),12}} D^{\alpha\#(2i+1),12,s}\right)X_{12}(D)+\left(\sum_{s=R_{\#(2i+1),13}+1}^{r_{\#(2i+1),13}} D^{\alpha\#(2i+1),13,s}\right)X_{13}(D)+ \tag{198-2-1}$$

-continued $$
\begin{aligned}
&P_2(D)+D^{\beta\#(2i+1),2}P_1(D)=\\
&\left(D^{\alpha\#(2i+1),1,R_{\#(2i+1),1}}+\ldots+D^{\alpha\#(2i+1),1,1}+1\right)X_1(D)+\\
&\left(D^{\alpha\#(2i+1),2,R_{\#(2i+1),2}}+\ldots+D^{\alpha\#(2i+1),2,1}+1\right)X_2(D)+\\
&\left(D^{\alpha\#(2i+1),3,R_{\#(2i+1),3}}+\ldots+D^{\alpha\#(2i+1),3,1}+1\right)X_3(D)+\\
&\left(D^{\alpha\#(2i+1),4,R_{\#(2i+1),4}}+\ldots+D^{\alpha\#(2i+1),4,1}+1\right)X_4(D)+\\
&\left(D^{\alpha\#(2i+1),5,R_{\#(2i+1),5}}+\ldots+D^{\alpha\#(2i+1),5,1}+1\right)X_5(D)+\\
&\left(D^{\alpha\#(2i+1),6,R_{\#(2i+1),6}}+\ldots+D^{\alpha\#(2i+1),6,1}+1\right)X_6(D)+\\
&\left(D^{\alpha\#(2i+1),7,r_{\#(2i+1),7}}+\ldots+D^{\alpha\#(2i+1),7,R_{\#(2i+1),7}+1}\right)X_7(D)+\\
&\left(D^{\alpha\#(2i+1),8,r_{\#(2i+1),8}}+\ldots+D^{\alpha\#(2i+1),8,R_{\#(2i+1),8}+1}\right)X_8(D)+\\
&\left(D^{\alpha\#(2i+1),9,r_{\#(2i+1),9}}+\ldots+D^{\alpha\#(2i+1),9,R_{\#(2i+1),9}+1}\right)X_9(D)+\\
&\left(D^{\alpha\#(2i+1),10,r_{\#(2i+1),10}}+\ldots+D^{\alpha\#(2i+1),10,R_{\#(2i+1),10}+1}\right)X_{10}(D)+\\
&\left(D^{\alpha\#(2i+1),11,r_{\#(2i+1),11}}+\ldots+D^{\alpha\#(2i+1),11,R_{\#(2i+1),11}+1}\right)X_{11}(D)+\\
&\left(D^{\alpha\#(2i+1),12,r_{\#(2i+1),12}}+\ldots+D^{\alpha\#(2i+1),12,R_{\#(2i+1),12}+1}\right)X_{12}(D)+\\
&\left(D^{\alpha\#(2i+1),13,r_{\#(2i+1),13}}+\ldots+D^{\alpha\#(2i+1),13,R_{\#(2i+1),13}+1}\right)X_{13}(D)+P_2(D)+D^{\beta\#(2i+1),2}P_1(D)=0
\end{aligned}
$$

[Math. 816-4]

$$
\begin{aligned}
&\left(1+\sum_{s=1}^{R_{\#(2i+1),1}}D^{\alpha\#(2i+1),1,s}\right)X_1(D)+
\left(1+\sum_{s=1}^{R_{\#(2i+1),2}}D^{\alpha\#(2i+1),2,s}\right)X_2(D)+\\
&\left(1+\sum_{s=1}^{R_{\#(2i+1),3}}D^{\alpha\#(2i+1),3,s}\right)X_3(D)+
\left(1+\sum_{s=1}^{R_{\#(2i+1),4}}D^{\alpha\#(2i+1),4,s}\right)X_4(D)+\\
&\left(1+\sum_{s=1}^{R_{\#(2i+1),5}}D^{\alpha\#(2i+1),5,s}\right)X_5(D)+
\left(1+\sum_{s=1}^{R_{\#(2i+1),6}}D^{\alpha\#(2i+1),6,s}\right)X_6(D)+\\
&\left(\sum_{s=R_{\#(2i+1),7}+1}^{r_{\#(2i+1),7}}D^{\alpha\#(2i+1),7,s}\right)X_7(D)+
\left(\sum_{s=R_{\#(2i+1),8}+1}^{r_{\#(2i+1),8}}D^{\alpha\#(2i+1),8,s}\right)X_8(D)+\\
&\left(\sum_{s=R_{\#(2i+1),9}+1}^{r_{\#(2i+1),9}}D^{\alpha\#(2i+1),9,s}\right)X_9(D)+
\left(\sum_{s=R_{\#(2i+1),10}+1}^{r_{\#(2i+1),10}}D^{\alpha\#(2i+1),10,s}\right)X_{10}(D)+\\
&\left(\sum_{s=R_{\#(2i+1),11}+1}^{r_{\#(2i+1),11}}D^{\alpha\#(2i+1),11,s}\right)X_{11}(D)+
\left(\sum_{s=R_{\#(2i+1),12}+1}^{r_{\#(2i+1),12}}D^{\alpha\#(2i+1),12,s}\right)X_{12}(D)+\\
&\left(\sum_{s=R_{\#(2i+1),13}+1}^{r_{\#(2i+1),13}}D^{\alpha\#(2i+1),13,s}\right)X_{13}(D)+\\
&P_2(D)+D^{\beta\#(2i+1),3}P_2(D)=\\
&\left(D^{\alpha\#(2i+1),1,R_{\#(2i+1),1}}+\ldots+D^{\alpha\#(2i+1),1,1}+1\right)X_1(D)+\\
&\left(D^{\alpha\#(2i+1),2,R_{\#(2i+1),2}}+\ldots+D^{\alpha\#(2i+1),2,1}+1\right)X_2(D)+\\
&\left(D^{\alpha\#(2i+1),3,R_{\#(2i+1),3}}+\ldots+D^{\alpha\#(2i+1),3,1}+1\right)X_3(D)+\\
&\left(D^{\alpha\#(2i+1),4,R_{\#(2i+1),4}}+\ldots+D^{\alpha\#(2i+1),4,1}+1\right)X_4(D)+\\
&\left(D^{\alpha\#(2i+1),5,R_{\#(2i+1),5}}+\ldots+D^{\alpha\#(2i+1),5,1}+1\right)X_5(D)+\\
&\left(D^{\alpha\#(2i+1),6,R_{\#(2i+1),6}}+\ldots+D^{\alpha\#(2i+1),6,1}+1\right)X_6(D)+\\
&\left(D^{\alpha\#(2i+1),7,r_{\#(2i+1),7}}+\ldots+D^{\alpha\#(2i+1),7,R_{\#(2i+1),7}+1}\right)X_7(D)+\\
&\left(D^{\alpha\#(2i+1),8,r_{\#(2i+1),8}}+\ldots+D^{\alpha\#(2i+1),8,R_{\#(2i+1),8}+1}\right)X_8(D)+\\
&\left(D^{\alpha\#(2i+1),9,r_{\#(2i+1),9}}+\ldots+D^{\alpha\#(2i+1),9,R_{\#(2i+1),9}+1}\right)X_9(D)+\\
&\left(D^{\alpha\#(2i+1),10,r_{\#(2i+1),10}}+\ldots+D^{\alpha\#(2i+1),10,R_{\#(2i+1),10}+1}\right)X_{10}(D)+\\
&\left(D^{\alpha\#(2i+1),11,r_{\#(2i+1),11}}+\ldots+D^{\alpha\#(2i+1),11,R_{\#(2i+1),11}+1}\right)X_{11}(D)+\\
&\left(D^{\alpha\#(2i+1),12,r_{\#(2i+1),12}}+\ldots+D^{\alpha\#(2i+1),12,R_{\#(2i+1),12}+1}\right)X_{12}(D)+\\
&\left(D^{\alpha\#(2i+1),13,r_{\#(2i+1),13}}+\ldots+D^{\alpha\#(2i+1),13,R_{\#(2i+1),13}+1}\right)X_{13}(D)+P_2(D)+D^{\beta\#(2i+1),3}P_2(D)=0
\end{aligned}
\tag{198-2-2}
$$

In expressions (198-1-1), (198-1-2), (198-2-1), (198-2-2), i is an integer no smaller than zero and no greater than m−1 (i=0, 1, . . . , m−2, m−1).

In expressions (198-1-1), (198-1-2), (198-2-1), (198-2-2), $\alpha_{\#(2i+1),p,q}$ (where p is an integer no smaller than one and no greater than thirteen, q is an integer no smaller than one and no greater than $r_{\#(2i+1),p}$ (where $r_{\#(2i+1),p}$ is a natural number)) and $\beta_{\#(2i+1),0}$ is a natural number, $\beta_{\#(2i+1),1}$ is a natural number, $\beta_{\#(2i+1),2}$ is an integer no smaller than zero, and $\beta_{\#(2i+1),3}$ is a natural number.

Further, $R_{\#(2i+1),p}$ is a natural number satisfying $1\leq R_{\#(2i+1),p}<r_{\#(2i+1),p}$.

Further, y is an integer no smaller than one and no greater than $r_{\#(2i+1),p}$, z is an integer no smaller than one and no greater than $r_{\#(2i+1),p}$, and $\alpha_{\#(2i+1),p,y}\neq\alpha_{\#(2i+1),p,z}$ holds true for $^\forall$(y, z) where y≠z. ∀ is a universal quantifier. (y is an integer no smaller than one and no greater than $r_{\#(2i+1),p}$, z is an integer no smaller than one and no greater than $r_{\#(2i+1),p}$, and $\alpha_{\#(2i+1),p,y}\neq\alpha_{\#(2i+1),p,z}$ holds true for all y and all z satisfying y≠z.)

Note that in the following, to simplify explanation, a parity check polynomial satisfying zero that is expressed by expression (198-1-1) or expression (198-1-2) is referred to as "#(2i+1); first expression" for realizing a time-varying period 2m, and a parity check polynomial satisfying zero that is expressed by expression (198-2-1) or expression (198-2-2) is referred to as "#(2i+1); second expression" for realizing a time-varying period 2m.

Thus, for each i, as #(2i+1); first expression for realizing a time-varying period 2m, a parity check polynomial satisfying zero expressed by either expression (198-1-1) or expression (198-1-2) is prepared.

That is, for i=0, a parity check polynomial satisfying zero provided by expression (198-1-1) where i=0, or a parity check polynomial satisfying zero provided by expression (198-1-2) where i=0 is prepared.

Similarly:

for i=1, a parity check polynomial satisfying zero provided by expression (198-1-1) where i=1, or a parity check polynomial satisfying zero provided by expression (198-1-2) where i=1 is prepared;

for i=2, a parity check polynomial satisfying zero provided by expression (198-1-1) where i=2, or a parity check polynomial satisfying zero provided by expression (198-1-2) where i=2 is prepared;

⋮ for i=z, a parity check polynomial satisfying zero provided by expression (198-1-1) where i=z, or a parity check polynomial satisfying zero provided by expression (198-1-2) where i=z is prepared (where z is an integer no smaller than zero and no greater than m−1); and

⋮ for i=m−1, a parity check polynomial satisfying zero provided by expression (198-1-1) where i=m−1, or a parity check polynomial satisfying zero provided by expression (198-1-2) where i=m−1 is prepared.

Similarly, for each i, as #(2i+1); second expression for realizing a time-varying period 2m, a parity check polynomial satisfying zero expressed by either expression (198-2-1) or expression (198-2-2) is prepared.

That is, for i=0, a parity check polynomial satisfying zero provided by expression (198-2-1) where i=0, or a parity check polynomial satisfying zero provided by expression (198-2-2) where i=0 is prepared.

Similarly:

for i=1, a parity check polynomial satisfying zero provided by expression (198-2-1) where i=1, or a parity check polynomial satisfying zero provided by expression (198-2-2) where i=1 is prepared;

for i=2, a parity check polynomial satisfying zero provided by expression (198-2-1) where i=2, or a parity check polynomial satisfying zero provided by expression (198-2-2) where i=2 is prepared;

⋮ for i=z, a parity check polynomial satisfying zero provided by expression (198-2-1) where i=z, or a parity check polynomial satisfying zero provided by expression (198-2-2) where i=z is prepared (where z is an integer no smaller than zero and no greater than m−1); and

⋮ for i=m−1, a parity check polynomial satisfying zero provided by expression (198-2-1) where i=m−1, or a parity check polynomial satisfying zero provided by expression (198-2-2) where i=m−1 is prepared.

As such, an LDPC-CC of coding rate 13/15 and time-varying period 2×m that is based on a parity check polynomial can be defined by using a total of 4×m parity check polynomials satisfying zero, which include an m number of parity check polynomials satisfying zero of #(2i); first expression, an m number of parity check polynomials satisfying zero of #(2i); second expression, an m number of parity check polynomials satisfying zero of #(2i+1); first expression, and an m number of parity check polynomials satisfying zero of #(2i+1); second expression.

Here, m is an integer no smaller than one. Further, different parity check polynomials are to be prepared, so that the time varying period 2×m is formed by a 4×m number of parity check polynomials satisfying zero including parity check polynomials satisfying zero provided by expression (197-1-1) or expression (197-1-2), parity check polynomials satisfying zero provided by expression (197-2-1) or expression (197-2-2), parity check polynomials satisfying zero provided by expression (198-1-1) or expression (198-1-2), and parity check polynomials satisfying zero provided by expression (198-2-1) or expression (198-2-2).

For example, the time varying period 2×m is formed by preparing a 4×m number of different parity check polynomials satisfying zero.

Meanwhile, even if the 4×m number of parity check polynomials satisfying zero include a same parity check polynomial in plurality, the time-varying period 2×m can be formed by configuring the arrangement of the parity check polynomials.

The following describes the relationship between time point j and expressions (197-1-1), (197-1-2), (197-2-1), (197-2-2), (198-1-1), (198-1-2), (198-2-1), and (198-2-2) (where j is an integer no smaller than zero).

The following presumes that 2k=j%2m holds true. In the following, % means a modulo, and for example, α%6 represents a remainder after dividing α by 6. (Accordingly, k is integer no smaller than zero and no greater than m−1).

Accordingly, at time point j, #(2k); first expression and #(2k); second expression, which are respectively acquired by setting i=k in #(2i); first expression and #(2i); second expression, hold true.

Further, when 2h+1=j%2m holds true (accordingly, h is an integer no smaller than zero and no greater than m−1), at time point j, #(2h+1); first expression and #(2h+1); second expression, which are respectively acquired by setting i=h in #(2i+1); first expression and #(2i+1); second expression, hold true.

Note that in the parity check polynomials satisfying zero of expressions (197-1-1), (197-1-2), (197-2-1), (197-2-2), (198-1-1), (198-1-2), (198-2-1), and (198-2-2), a sum of the number of terms of $P_1(D)$ and the number of terms of $P_2(D)$ equals two. This realizes sequentially finding parities $P_1$ and $P_2$ when applying an improved tail-biting scheme, and thus, is a significant factor realizing a reduction in computation amount (circuit scale).

The following describes the relationship between the time-varying period of the parity check polynomials satisfying zero for the LDPC-CC of coding rate 13/15 and time-varying period 2m that is based on a parity check polynomial, description of which has been provided in embodiments G1 and G2 and on which the LDPC-CC of coding rate 13/15 that uses an improved tail-biting scheme (an LDPC block code using an LDPC-CC) is based, and block size in the LDPC-CC of coding rate 13/15 that uses an improved tail-biting scheme (an LDPC block code using an LDPC-CC) proposed in the present embodiment.

Regarding this point, in order to achieve error correction capability of even higher level, a configuration is preferable where a Tanner graph formed by the LDPC-CC of coding rate 13/15 and time-varying period 2m that is based on a parity check polynomial, description of which has been provided in embodiments G1 and G2 and on which the LDPC-CC of coding rate 13/15 that uses an improved tail-biting scheme (an LDPC block code using an LDPC-CC) is based, resembles a Tanner graph of the LDPC-CC of coding rate 13/15 that uses an improved tail-biting scheme (an LDPC block code using an LDPC-CC). Thus, the following conditions are significant.

<Condition #N1>

The number of rows in a parity check matrix for the LDPC-CC of coding rate 13/15 that uses an improved tail-biting scheme (an LDPC block code using an LDPC-CC) is a multiple of 4×m.

Accordingly, the number of columns in the parity check matrix for the LDPC-CC of coding rate 13/15 that uses an improved tail-biting scheme (an LDPC block code using an LDPC-CC) is a multiple of 15×2×m. According to this condition, (for example) a log-likelihood ratio that is necessary in decoding is a log-likelihood ratio of the number of columns in the parity check matrix for the LDPC-CC of coding rate 13/15 that uses an improved tail-biting scheme (an LDPC block code using an LDPC-CC).

Note that the relationship between the LDPC-CC of coding rate 13/15 that uses an improved tail-biting scheme (an LDPC block code using an LDPC-CC) and the LDPC-CC of coding rate 13/15 and time-varying period 2m that is based on a parity check polynomial, description of which has been provided in embodiments G1 and G2 and on which the LDPC-CC of coding rate 13/15 that uses an improved tail-biting scheme (an LDPC block code using an LDPC-CC) is based, is described in detail later in the present disclosure.

Thus, when denoting the parity check matrix for the LDPC-CC of coding rate 13/15 that uses an improved tail-biting scheme (an LDPC block code using an LDPC-CC) as $H_{pro}$, the number of columns of $H_{pro}$ can be expressed as 15×2×m×z (where z is a natural number).

Accordingly, a transmission sequence (encoded sequence (codeword)) $v_s$ of block s of the LDPC-CC of coding rate 13/15 that uses an improved tail-biting scheme (an LDPC block code using an LDPC-CC) can be expressed as $v_s=(X_{s,1,1}, X_{s,2,1}, \ldots, X_{s,13,1}, P^{pro}_{s,1,1}, P^{pro}_{s,2,1}, X_{s,1,2}, X_{s,2,2}, \ldots, X_{s,13,2}, P^{pro}_{s,1,2}, P^{pro}_{s,2,2}, \ldots, X_{s,1,k}, X_{s,2,k}, \ldots, X_{s,13,k}, P^{pro}_{s,1,k}, P^{pro}_{s,2,k}, \ldots, X_{s,1,2\times m\times z}, X_{s,2,2\times m\times z}, \ldots, X_{s,13,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}v_s$ are zeroes).

$X_{s,j,k}$ (where j is an integer no smaller than one and no greater than thirteen) is a bit of information $X_j$, $P^{pro}_{s,1,k}$ is a bit of parity $P_1$ of the LDPC-CC of coding rate 13/15 that uses an improved tail-biting scheme (an LDPC block code using an LDPC-CC), and $P^{pro}_{s,2,k}$ is a bit of parity $P_2$ of the LDPC-CC of coding rate 13/15 that uses an improved tail-biting scheme (an LDPC block code using an LDPC-CC).

Further, $\lambda_{pro,s,k}=(X_{s,1,k}, X_{s,2,k}, X_{s,3,k}, X_{s,4,k}, X_{s,5,k}, X_{s,6,k}, X_{s,7,k}, X_{s,8,k}, X_{s,9,k}, X_{s,10,k}, X_{s,11,k}, X_{s,12,k}, X_{s,13,k}, P^{pro}_{s,1,k}, P^{pro}_{s,2,k})$ holds true.

In addition, the number of rows in the parity check matrix $H_{pro}$ for the LDPC-CC of coding rate 13/15 that uses an improved tail-biting scheme (an LDPC block code using an LDPC-CC) is 4×m×z.

It has been indicated above that the LDPC-CC of coding rate 13/15 that uses an improved tail-biting scheme (an LDPC block code using an LDPC-CC) is based on the LDPC-CC of coding rate 13/15 and time-varying period 2m that is based on a parity check polynomial, description of which has been provided in embodiments G1 and G2. This is explained in the following.

First, consideration is made of a parity check matrix when configuring a periodic time-varying LDPC-CC using tail-biting by using only parity check polynomials satisfying zero for the LDPC-CC of coding rate 13/15 and time-varying period 2m that is based on a parity check polynomial, description of which has been provided in embodiments G1 and G2.

Figure 99:
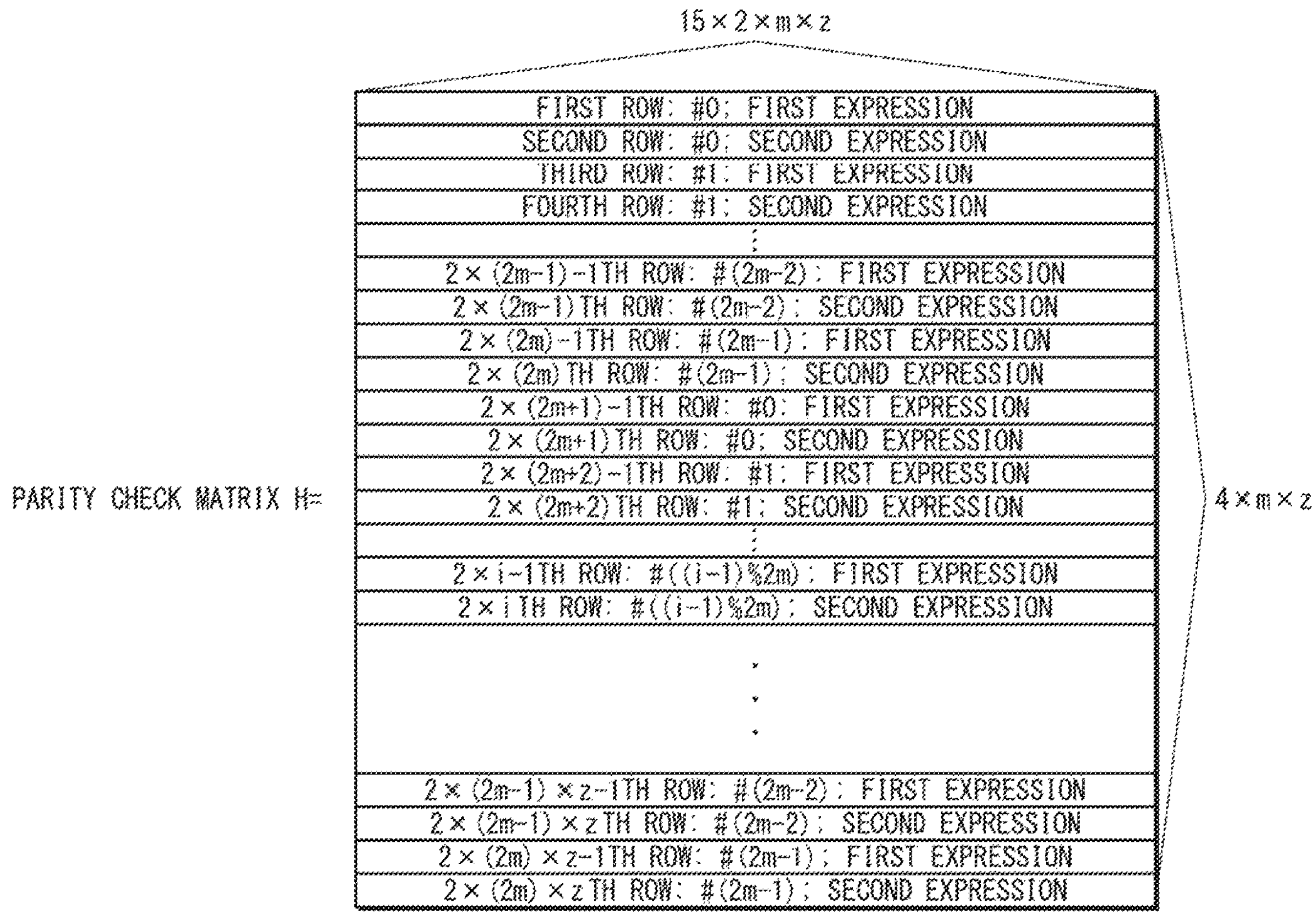
FIG. 99 shows an example of the configuration of check matrix for LDPC-CC of coding rate 13/15 when tail-biting is performed.

FIG. 99 illustrates a configuration of a parity check matrix H when configuring a periodic time-varying LDPC-CC using tail-biting by performing tail-biting by using only parity check polynomials satisfying zero for an LDPC-CC of coding rate 13/15 and time-varying period 2m.

Since Condition #N1 is satisfied in FIG. 99, the number of rows of the parity check matrix is m×z and the number of columns of the parity check matrix is 15×2×m×z.

As illustrated in FIG. 99:

"a vector for the first row of the parity check matrix H can be generated from a parity check polynomial satisfying zero of #0; first expression";

"a vector for the second row of the parity check matrix H can be generated from a parity check polynomial satisfying zero of #0; second expression";

"a vector for the third row of the parity check matrix H can be generated from a parity check polynomial satisfying zero of #1; first expression";

"a vector for the fourth row of the parity check matrix H can be generated from a parity check polynomial satisfying zero of #1; second expression";

⋮

"a vector for the 2×(2m−1)−1th row of the parity check matrix H can be generated from a parity check polynomial satisfying zero of #(2m−2); first expression";

"a vector for the 2×(2m−1)th row of the parity check matrix H can be generated from a parity check polynomial satisfying zero of #(2m−2); second expression";

"a vector for the 2×(2m)−1th row of the parity check matrix H can be generated from a parity check polynomial satisfying zero of #(2m−1); first expression";

"a vector for the 2×(2m)th row of the parity check matrix H can be generated from a parity check polynomial satisfying zero of #(2m−1); second expression";

"a vector for the 2×(2m+1)−1th row of the parity check matrix H can be generated from a parity check polynomial satisfying zero of #0; first expression";

"a vector for the 2×(2m+1)th row of the parity check matrix H can be generated from a parity check polynomial satisfying zero of #0; second expression";

"a vector for the 2×(2m+2)−1th row of the parity check matrix H can be generated from a parity check polynomial satisfying zero of #1; first expression";

"a vector for the 2×(2m+2)th row of the parity check matrix H can be generated from a parity check polynomial satisfying zero of #1; second expression";

⋮

"a vector for the 2×i−1th row of the parity check matrix H can be generated from a parity check polynomial satisfying zero of #((i−1)%2m); first expression";

"a vector for the (2×i)th row of the parity check matrix H can be generated from a parity check polynomial satisfying zero of #((i−1)%2m); second expression" (where i is an integer no smaller than one and no greater than 2×m×z);

⋮

"a vector for the 2×(2m−1)×z−1th row of the parity check matrix H can be generated from a parity check polynomial satisfying zero of #(2m−2); first expression";

"a vector for the 2×(2m−1)×zth row of the parity check matrix H can be generated from a parity check polynomial satisfying zero of #(2m−2); second expression";

"a vector for the 2×(2m)×z−1th row of the parity check matrix H can be generated from a parity check polynomial satisfying zero of #(2m−1); first expression"; and "a vector for the 2×(2m)×zth row of the parity check matrix H can be generated from a parity check polynomial satisfying zero of #(2m−1); second expression".

To prepare for the explanation to be provided in the following, a mathematical expression is provided of the parity check matrix H in FIG. 99, which is a parity check matrix when configuring a periodic time-varying LDPC-CC by performing tail-biting by using only parity check polynomials satisfying zero for the LDPC-CC of coding rate 13/15 and time-varying period 2m that is based on a parity check polynomial, description of which is provided in embodiments G1 and G2. When denoting a vector having one row and 15×2×m×z columns in row k of the parity check matrix H as $h_k$, the parity check matrix H in FIG. 99 is expressed as follows.

[Math. 817]

$$H = \begin{pmatrix} h_1 \\ h_2 \\ \vdots \\ h_{2\times(2m)\times z-1} \\ h_{2\times(2m)\times z} \end{pmatrix} \tag{199}$$

The following describes a parity check matrix for the LDPC-CC of coding rate 13/15 that uses an improved tail-biting scheme (an LDPC block code using an LDPC-CC).

Figure 100:
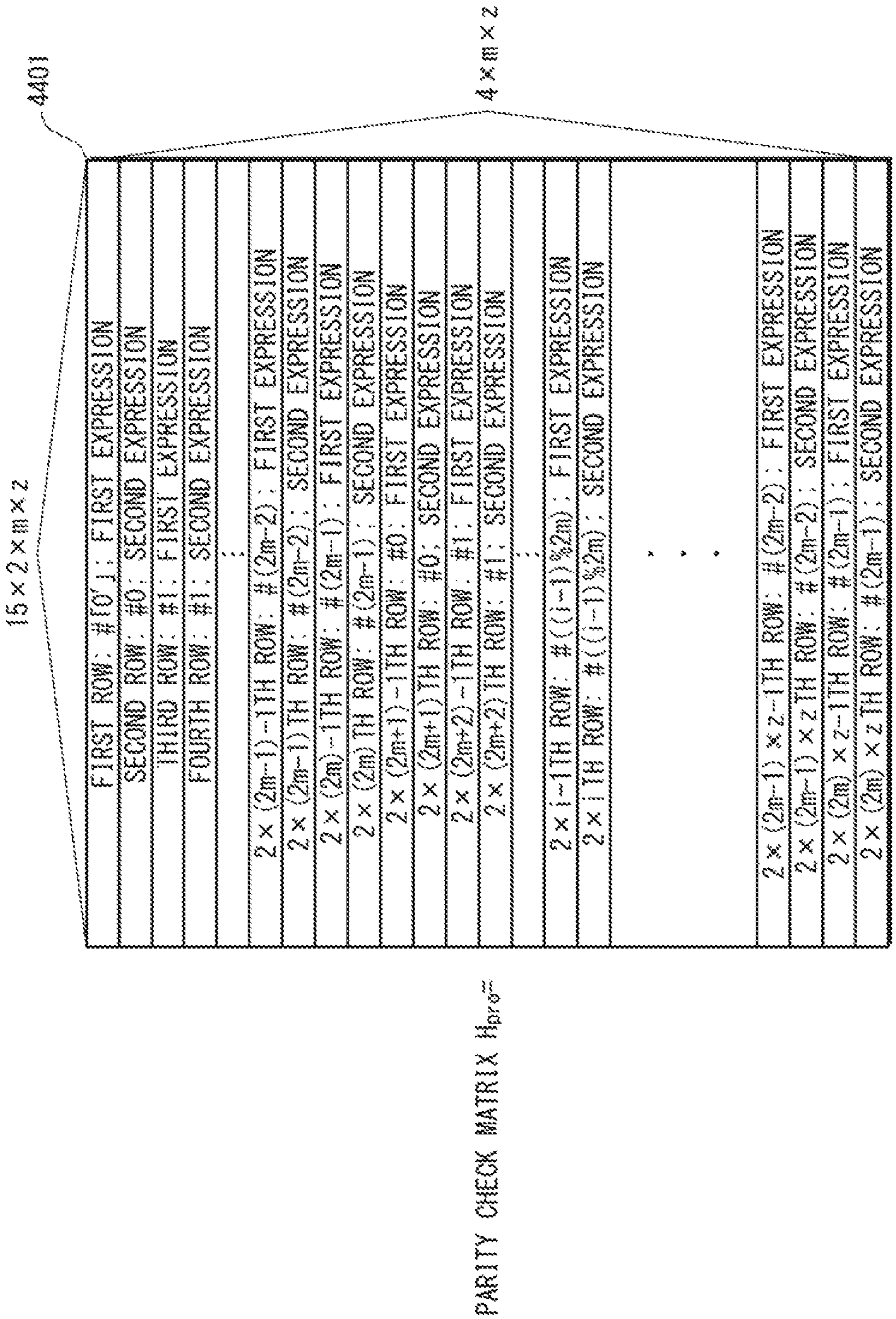
FIG. 100 shows an example of the configuration of check matrix for LDPC-CC of coding rate 13/15 when improved tail-biting is performed.

FIG. 100 illustrates one example of a configuration of a parity check matrix $H_{pro}$ for the LDPC-CC of coding rate 13/15 that uses an improved tail-biting scheme (an LDPC block code using an LDPC-CC).

The parity check matrix $H_{pro}$ for the LDPC-CC of coding rate 13/15 that uses an improved tail-biting scheme (an LDPC block code using an LDPC-CC) satisfies Condition #N1.

When denoting a vector having one row and 15×2×m×z columns in row k of the parity check matrix $H_{pro}$ in FIG. 100, which is for the LDPC-CC of coding rate 13/15 that uses an improved tail-biting scheme (an LDPC block code using an LDPC-CC), as $g_k$, the parity check matrix $H_{pro}$ in FIG. 100 is expressed as follows.

[Math. 818]

$$H_{pro} = \begin{pmatrix} g_1 \\ g_2 \\ \vdots \\ g_{2\times(2m)\times z-1} \\ g_{2\times(2m)\times z} \end{pmatrix} \tag{200}$$

A transmission sequence (encoded sequence (codeword)) $v_s$ of block s of the LDPC-CC of coding rate 13/15 that uses an improved tail-biting scheme (an LDPC block code using an LDPC-CC) can be expressed as $v_s=(X_{s,1,1}, X_{s,2,1}, \ldots, X_{s,13,1}, P^{pro}_{s,1,1}, X_{s,1,2\times m\times z}, X_{s,2,2\times m\times z}, \ldots, X_{s,13,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}v_s$ are zeroes).

$X_{s,j,k}$ (where j is an integer no smaller than one and no greater than thirteen) is a bit of information $X_j$, $P^{pro}_{s,1,k}$ is a bit of parity $P_1$ of the LDPC-CC of coding rate 13/15 that uses an improved tail-biting scheme (an LDPC block code using an LDPC-CC), and $P^{pro}_{s,2,k}$ is a bit of parity $P_2$ of the LDPC-CC of coding rate 13/15 that uses an improved tail-biting scheme (an LDPC block code using an LDPC-CC).

In the parity check matrix $H_{pro}$ in FIG. 100, which illustrates one example of a configuration of a parity check matrix $H_{pro}$ for the LDPC-CC of coding rate 13/15 that uses an improved tail-biting scheme (an LDPC block code using an LDPC-CC), rows other than row one, or that is, rows between row two to row 2×(2×m)×z in the parity check matrix $H_{pro}$ in FIG. 100, have the same configuration as rows between row two and row 2×(2×m)×z in the parity check matrix H in FIG. 99 (refer to FIGS. 99 and 100). Accordingly, FIG. 100 includes an indication of #0'; first expression at 4401 in the first row. (This point is explained later in the present disclosure.) Accordingly, the following relational expression holds true based on expressions 199 and 200.

[Math. 819]

For all i no smaller than two and no greater than 2×(2×m)×z, the following holds true:

$$g_i=h_i \tag{201}$$

Further, the following holds true when i=1.

[Math. 820]

$$g_1 \neq h_1 \tag{202}$$

Accordingly, the parity check matrix $H_{pro}$ for the LDPC-CC of coding rate 13/15 that uses an improved tail-biting scheme (an LDPC block code using an LDPC-CC) can be expressed as follows.

[Math. 821]

$$H_{pro} = \begin{pmatrix} g_1 \\ h_2 \\ \vdots \\ h_{2\times(2m)\times z-1} \\ h_{2\times(2m)\times z} \end{pmatrix} \tag{203}$$

In expression 203, expression 202 holds true.

Next, explanation is provided of a method of configuring $g_1$ in expression 203 so that parities can be found sequentially and high error correction capability can be achieved.

One example of a method of configuring $g_1$ in expression 203, so that parities can be found sequentially and high error correction capability can be achieved, is using a parity check polynomial satisfying zero of #0; first expression of the LDPC-CC of coding rate 13/15 that uses an improved tail-biting scheme (an LDPC block code using an LDPC-CC), which serves as the basis.

Since $g_1$ is row one of the parity check matrix $H_{pro}$ for the LDPC-CC of coding rate 13/15 that uses an improved tail-biting scheme (an LDPC block code using an LDPC-CC), $g_1$ is generated from a parity check polynomial satisfying zero that is obtained by transforming a parity check polynomial satisfying zero of #0; first expression. As described above, a parity check polynomial satisfying zero of #0; first expression is expressed by either expression (204-1-1) or expression (204-1-2).

[Math. 822-1]

$$\left(1+\sum_{s=1}^{R_{\#(0),1}} D^{\alpha\#(0),1,s}\right)X_1(D)+\left(1+\sum_{s=1}^{R_{\#(0),2}} D^{\alpha\#(0),2,s}\right)X_2(D)+\left(1+\sum_{s=1}^{R_{\#(0),3}} D^{\alpha\#(0),3,s}\right)X_3(D)+\left(1+\sum_{s=1}^{R_{\#(0),4}} D^{\alpha\#(0),4,s}\right)X_4(D)+\left(1+\sum_{s=1}^{R_{\#(0),5}} D^{\alpha\#(0),5,s}\right)X_5(D)+\left(1+\sum_{s=1}^{R_{\#(0),6}} D^{\alpha\#(0),6,s}\right)X_6(D)+\left(\sum_{s=R_{\#(0),7}+1}^{r_{\#(0),7}} D^{\alpha\#(0),7,s}\right)X_7(D)+\left(\sum_{s=R_{\#(0),8}+1}^{r_{\#(0),8}} D^{\alpha\#(0),8,s}\right)X_8(D)+\left(\sum_{s=R_{\#(0),9}+1}^{r_{\#(0),9}} D^{\alpha\#(0),9,s}\right)X_9(D)+\left(\sum_{s=R_{\#(0),10}+1}^{r_{\#(0),10}} D^{\alpha\#(0),10,s}\right)X_{10}(D)+\left(\sum_{s=R_{\#(0),11}+1}^{r_{\#(0),11}} D^{\alpha\#(0),11,s}\right)X_{11}(D)+\left(\sum_{s=R_{\#(0),12}+1}^{r_{\#(0),12}} D^{\alpha\#(0),12,s}\right)X_{12}(D)+\left(\sum_{s=R_{\#(0),13}+1}^{r_{\#(0),13}} D^{\alpha\#(0),13,s}\right)X_{13}(D)+P_1(D)+D^{\beta\#(0),0}P_2(D)=$$

$$\left(D^{\alpha\#(0),1,R_{\#(0),1}}+\ldots+D^{\alpha\#(0),1,1}+1\right)X_1(D)+\left(D^{\alpha\#(0),2,R_{\#(0),2}}+\ldots+D^{\alpha\#(0),2,1}+1\right)X_2(D)+\left(D^{\alpha\#(0),3,R_{\#(0),3}}+\ldots+D^{\alpha\#(0),3,1}+1\right)X_3(D)+\left(D^{\alpha\#(0),4,R_{\#(0),4}}+\ldots+D^{\alpha\#(0),4,1}+1\right)X_4(D)+\left(D^{\alpha\#(0),5,R_{\#(0),5}}+\ldots+D^{\alpha\#(0),5,1}+1\right)X_5(D)+\left(D^{\alpha\#(0),6,R_{\#(0),6}}+\ldots+D^{\alpha\#(0),6,1}+1\right)X_6(D)+\left(D^{\alpha\#(0),7,r_{\#(0),7}}+\ldots+D^{\alpha\#(0),7,R_{\#(0),7}+1}\right)X_7(D)+\left(D^{\alpha\#(0),8,r_{\#(0),8}}+\ldots+D^{\alpha\#(0),8,R_{\#(0),8}+1}\right)X_8(D)+\left(D^{\alpha\#(0),9,r_{\#(0),9}}+\ldots+D^{\alpha\#(0),9,R_{\#(0),9}+1}\right)X_9(D)+\left(D^{\alpha\#(0),10,r_{\#(0),10}}+\ldots+D^{\alpha\#(0),10,R_{\#(0),10}+1}\right)X_{10}(D)+\left(D^{\alpha\#(0),11,r_{\#(0),11}}+\ldots+D^{\alpha\#(0),11,R_{\#(0),11}+1}\right)X_{11}(D)+\left(D^{\alpha\#(0),12,r_{\#(0),12}}+\ldots+D^{\alpha\#(0),12,R_{\#(0),12}+1}\right)X_{12}(D)+\left(D^{\alpha\#(0),13,r_{\#(0),13}}+\ldots+D^{\alpha\#(0),13,R_{\#(0),13}+1}\right)X_{13}(D)+P_1(D)+D^{\beta\#(0),0}P_2(D)=0 \qquad (204\text{-}1\text{-}1)$$

-continued

[Math. 822-2]

$$\left(1+\sum_{s=1}^{R_{\#(0),1}} D^{\alpha\#(0),1,s}\right)X_1(D)+\left(1+\sum_{s=1}^{R_{\#(0),2}} D^{\alpha\#(0),2,s}\right)X_2(D)+\left(1+\sum_{s=1}^{R_{\#(0),3}} D^{\alpha\#(0),3,s}\right)X_3(D)+\left(1+\sum_{s=1}^{R_{\#(0),4}} D^{\alpha\#(0),4,s}\right)X_4(D)+\left(1+\sum_{s=1}^{R_{\#(0),5}} D^{\alpha\#(0),5,s}\right)X_5(D)+\left(1+\sum_{s=1}^{R_{\#(0),6}} D^{\alpha\#(0),6,s}\right)X_6(D)+\left(\sum_{s=R_{\#(0),7}+1}^{r_{\#(0),7}} D^{\alpha\#(0),7,s}\right)X_7(D)+\left(\sum_{s=R_{\#(0),8}+1}^{r_{\#(0),8}} D^{\alpha\#(0),8,s}\right)X_8(D)+\left(\sum_{s=R_{\#(0),9}+1}^{r_{\#(0),9}} D^{\alpha\#(0),9,s}\right)X_9(D)+\left(\sum_{s=R_{\#(0),10}+1}^{r_{\#(0),10}} D^{\alpha\#(0),10,s}\right)X_{10}(D)+\left(\sum_{s=R_{\#(0),11}+1}^{r_{\#(0),11}} D^{\alpha\#(0),11,s}\right)X_{11}(D)+\left(\sum_{s=R_{\#(0),12}+1}^{r_{\#(0),12}} D^{\alpha\#(0),12,s}\right)X_{12}(D)+\left(\sum_{s=R_{\#(0),13}+1}^{r_{\#(0),13}} D^{\alpha\#(0),13,s}\right)X_{13}(D)+P_1(D)+D^{\beta\#(0),1}P_1(D)=$$

$$\left(D^{\alpha\#(0),1,R_{\#(0),1}}+\ldots+D^{\alpha\#(0),1,1}+1\right)X_1(D)+\left(D^{\alpha\#(0),2,R_{\#(0),2}}+\ldots+D^{\alpha\#(0),2,1}+1\right)X_2(D)+\left(D^{\alpha\#(0),3,R_{\#(0),3}}+\ldots+D^{\alpha\#(0),3,1}+1\right)X_3(D)+\left(D^{\alpha\#(0),4,R_{\#(0),4}}+\ldots+D^{\alpha\#(0),4,1}+1\right)X_4(D)+\left(D^{\alpha\#(0),5,R_{\#(0),5}}+\ldots+D^{\alpha\#(0),5,1}+1\right)X_5(D)+\left(D^{\alpha\#(0),6,R_{\#(0),6}}+\ldots+D^{\alpha\#(0),6,1}+1\right)X_6(D)+\left(D^{\alpha\#(0),7,r_{\#(0),7}}+\ldots+D^{\alpha\#(0),7,R_{\#(0),7}+1}\right)X_7(D)+\left(D^{\alpha\#(0),8,r_{\#(0),8}}+\ldots+D^{\alpha\#(0),8,R_{\#(0),8}+1}\right)X_8(D)+\left(D^{\alpha\#(0),9,r_{\#(0),9}}+\ldots+D^{\alpha\#(0),9,R_{\#(0),9}+1}\right)X_9(D)+\left(D^{\alpha\#(0),10,r_{\#(0),10}}+\ldots+D^{\alpha\#(0),10,R_{\#(0),10}+1}\right)X_{10}(D)+\left(D^{\alpha\#(0),11,r_{\#(0),11}}+\ldots+D^{\alpha\#(0),11,R_{\#(0),11}+1}\right)X_{11}(D)+\left(D^{\alpha\#(0),12,r_{\#(0),12}}+\ldots+D^{\alpha\#(0),12,R_{\#(0),12}+1}\right)X_{12}(D)+\left(D^{\alpha\#(0),13,r_{\#(0),13}}+\ldots+D^{\alpha\#(0),13,R_{\#(0),13}+1}\right)X_{13}(D)+P_1(D)+D^{\beta\#(0),1}P_1(D)=0 \qquad (204\text{-}1\text{-}2)$$

As one example of a parity check polynomial satisfying zero for generating vector $g_1$ in row one of the parity check matrix $H_{pro}$ for the LDPC-CC of coding rate 13/15 that uses an improved tail-biting scheme (an LDPC block code using an LDPC-CC), a parity check polynomial satisfying zero of #0; first expression is expressed as follows, for either expression (204-1-1) or expression (204-1-2).

[Math. 823]

$$\left(1+\sum_{s=1}^{R_{\#(0),1}} D^{\alpha\#(0),1,s}\right)X_1(D) + \left(1+\sum_{s=1}^{R_{\#(0),2}} D^{\alpha\#(0),2,s}\right)X_2(D) + \left(1+\sum_{s=1}^{R_{\#(0),3}} D^{\alpha\#(0),3,s}\right)X_3(D) + \left(1+\sum_{s=1}^{R_{\#(0),4}} D^{\alpha\#(0),4,s}\right)X_4(D) + \left(1+\sum_{s=1}^{R_{\#(0),5}} D^{\alpha\#(0),5,s}\right)X_5(D) + \left(1+\sum_{s=1}^{R_{\#(0),6}} D^{\alpha\#(0),6,s}\right)X_6(D) + \left(1+\sum_{s=R_{\#(0),7}+1}^{R_{\#(0),7}} D^{\alpha\#(0),7,s}\right)X_7(D) + \left(1+\sum_{s=R_{\#(0),8}+1}^{R_{\#(0),8}} D^{\alpha\#(0),8,s}\right)X_8(D) + \left(1+\sum_{s=R_{\#(0),9}+1}^{R_{\#(0),9}} D^{\alpha\#(0),9,s}\right)X_9(D) + \left(1+\sum_{s=R_{\#(0),10}+1}^{R_{\#(0),10}} D^{\alpha\#(0),10,s}\right)X_{10}(D) + \left(1+\sum_{s=R_{\#(0),11}+1}^{R_{\#(0),11}} D^{\alpha\#(0),11,s}\right)X_{11}(D) + \left(1+\sum_{s=R_{\#(0),12}+1}^{R_{\#(0),12}} D^{\alpha\#(0),12,s}\right)X_{12}(D) + \left(1+\sum_{s=R_{\#(0),13}+1}^{R_{\#(0),13}} D^{\alpha\#(0),13,s}\right)X_{13}(D) + P_1(D) =$$

$$(D^{\alpha\#(0),1,}R_{\#(0),1} + \dots + D^{\alpha\#(0),1,1} + 1)X_1(D) + (D^{\alpha\#(0),2,}R_{\#(0),2} + \dots + D^{\alpha\#(0),2,1} + 1)X_2(D) + (D^{\alpha\#(0),3,}R_{\#(0),3} + \dots + D^{\alpha\#(0),3,1} + 1)X_3(D) + (D^{\alpha\#(0),4,}R_{\#(0),4} + \dots + D^{\alpha\#(0),4,1} + 1)X_4(D) + (D^{\alpha\#(0),5,}R_{\#(0),5} + \dots + D^{\alpha\#(0),5,1} + 1)X_5(D) + (D^{\alpha\#(0),6,}R_{\#(0),6} + \dots + D^{\alpha\#(0),6,1} + 1)X_6(D) + (D^{\alpha\#(0),7,}r_{\#(0),7} + \dots + D^{\alpha\#(0),7,}R_{\#(0),7} + 1)X_7(D) + (D^{\alpha\#(0),8,}r_{\#(0),8} + \dots + D^{\alpha\#(0),8,}R_{\#(0),8} + 1)X_8(D) + (D^{\alpha\#(0),9,}r_{\#(0),9} + \dots + D^{\alpha\#(0),9,}R_{\#(0),9} + 1)X_9(D) + (D^{\alpha\#(0),10,}r_{\#(0),10} + \dots + D^{\alpha\#(0),10,}R_{\#(0),10} + 1)X_{10}(D) + (D^{\alpha\#(0),11,}r_{\#(0),11} + \dots + D^{\alpha\#(0),11,}R_{\#(0),11} + 1)X_{11}(D) + (D^{\alpha\#(0),12,}r_{\#(0),12} + \dots + D^{\alpha\#(0),12,}R_{\#(0),12} + 1)X_{12}(D) + (D^{\alpha\#(0),13,}r_{\#(0),13} + \dots + D^{\alpha\#(0),13,}R_{\#(0),13} + 1)X_{13}(D) + P_1(D) = 0 \quad (205)$$

Accordingly, vector $g_1$ is a vector having one row and 15×2×m×z columns that is obtained by performing tail-biting with respect to expression 205.

Note that in the following, a parity check polynomial that satisfies zero provided by expression 205 is referred to as #0'; first expression.

Accordingly, row one of the parity check matrix $H_{pro}$ for the LDPC-CC of coding rate 13/15 that uses an improved tail-biting scheme (an LDPC block code using an LDPC-CC) can be obtained by transforming #0'; first expression of expression 205 (that is, a vector $g_1$ corresponding to one row and 15×2×m×z columns can be obtained).

A transmission sequence (encoded sequence (codeword)) $v_s$ of block s of the LDPC-CC of coding rate 13/15 that uses an improved tail-biting scheme (an LDPC block code using an LDPC-CC) is $v_s=(X_{s,1,1}, X_{s,2,1}, \ldots, X_{s,13,1}, P^{pro}_{s,1,1}, P^{pro}_{s,2,1}, X_{s,1,2}, X_{s,2,2}, \ldots, X_{s,13,2}, P^{pro}_{s,1,2}, P^{pro}_{s,2,2}, \ldots, X_{s,1,k}, X_{s,2,k}, \ldots, X_{s,13,k}, P^{pro}_{s,1,k}, P^{pro}_{s,2,k}, \ldots, X_{s,1,2\times m\times z}, X_{s,2,2\times m\times z}, \ldots, X_{s,13,2\times m\times z}, P^{pro}_{s,1,2\times m\times z}, P^{pro}_{s,2,2\times m\times z})^T = (\lambda_{pro,s,1}, \lambda_{pro,s,2}, \ldots, \lambda_{pro,s,2\times m\times z-1}, \lambda_{pro,s,2\times m\times z})^T$, and the number of parity check polynomials satisfying zero necessary for obtaining this transmission sequence is 2×(2×m)×z.

Here, when arranging such 2×(2×m)×z number of parity check polynomials satisfying zero in order, a parity check polynomial satisfying zero appearing eth is referred to in the following as an "eth parity check polynomial satisfying zero" (where e is an integer no smaller than zero and no greater than 2×(2×m)×z−1).

As such, the parity check polynomials satisfying zero are arranged in the following order:

zeroth: zeroth parity check polynomial satisfying zero;
first: first parity check polynomial satisfying zero;
second: second parity check polynomial satisfying zero;
⋮
eth: eth parity check polynomial satisfying zero;
⋮
2×(2×m)×z−2th: 2×(2×m)×z−2th parity check polynomial satisfying zero; and
2×(2×m)×z−1th: 2×(2×m)×z−1th parity check polynomial satisfying zero.

Accordingly, the transmission sequence (encoded sequence (codeword)) $v_s$ of block s of the LDPC-CC of coding rate 13/15 that uses an improved tail-biting scheme (an LDPC block code using an LDPC-CC) is obtained. (As can be seen from description provided above, when expressing the parity check matrix $H_{pro}$ for the LDPC-CC of coding rate 13/15 that uses an improved tail-biting scheme (an LDPC block code using an LDPC-CC) as provided in expression 200, a vector composed of row e+1 of the parity check matrix $H_{pro}$ corresponds to the eth parity check polynomial satisfying zero.)

Accordingly, in the LDPC-CC of coding rate 13/15 that uses an improved tail-biting scheme (an LDPC block code using an LDPC-CC):

the 0th parity check polynomial satisfying zero is a parity check polynomial satisfying zero of #0'; first expression provided by expression 205;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 205;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

As description has been provided above, the LDPC-CC of coding rate 13/15 that uses an improved tail-biting scheme (an LDPC block code using an LDPC-CC), at the same time as achieving high error correction capability, enables finding multiple parities sequentially, and therefore, achieves an advantageous effect of reducing circuit scale of an encoder.

In the following, explanation is provided of what is meant by “finding parities sequentially”.

In the example described above, since bits of information $X_1$ through $X_{13}$ are pre-acquired, $P^{pro}_{s,1,1}$ can be calculated by using the 0th parity check polynomial satisfying zero of the LDPC-CC of coding rate 13/15 that uses an improved tail-biting scheme (an LDPC block code using an LDPC-CC), or that is, by using the parity check polynomial satisfying zero of #0'; first expression provided by expression 205.

Then, from the bits of information $X_1$ through $X_{13}$ and $P^{pro}_{s,1,1}$, another parity (denoted as $P_{c=1}$) can be calculated by using another parity check polynomial satisfying zero.

Further, from the bits of information $X_1$ through $X_{13}$ and $P_{c=1}$, another parity (denoted as $P_{c=2}$) can be calculated by using another parity check polynomial satisfying zero.

By repeating such operation, from the bits of information $X_1$ through $X_{13}$ and $P_{c=h}$, another parity (denoted as $P_{c=h+1}$) can be calculated by using a given parity check polynomial satisfying zero.

This is referred to as “finding parities sequentially”, and when parities can be found sequentially, multiple parities can be obtained without calculation of complex simultaneous equations, whereby an advantageous effect is achieved of reducing circuit scale (computation amount) of an encoder.

Next, explanation is provided of configurations and operations of an encoder and a decoder for the LDPC-CC of coding rate 13/15 that uses an improved tail-biting scheme (an LDPC block code using an LDPC-CC).

In the following, one example case is considered where the LDPC-CC of coding rate 13/15 that uses an improved tail-biting scheme (an LDPC block code using an LDPC-CC) is used in a communication system. When applying the LDPC-CC of coding rate 13/15 that uses an improved tail-biting scheme (an LDPC block code using an LDPC-CC) to a communication system, the encoder and the decoder for the LDPC-CC of coding rate 13/15 that uses an improved tail-biting scheme (an LDPC block code using an LDPC-CC) are characterized for each being configured and each operating based on the parity check matrix $H_{pro}$ for the LDPC-CC of coding rate 13/15 that uses an improved tail-biting scheme (an LDPC block code using an LDPC-CC) and based on the relationship $H_{pro}v_s=0$.

The following provides explanation while referring to FIG. 25, which is an overall diagram of a communication system. An encoder 2511 of a transmitting device 2501 receives an information sequence of block s ($X_{s,1,1}$, $X_{s,2,1}$, . . . , $X_{s,13,1}$, $X_{s,1,2}$, $X_{s,2,2}$, . . . , $X_{s,13,2}$, . . . , $X_{s,1,k}$, $X_{s,2,k}$, . . . , $X_{s,13,k}$, . . . , $X_{s,1,2\times m\times z}$, $X_{s,2,2\times m\times z}$, . . . , $X_{s,13,2\times m\times z}$) as input. The encoder 2511 performs encoding based on the parity check matrix $H_{pro}$ for the LDPC-CC of coding rate 13/15 that uses an improved tail-biting scheme (an LDPC block code using an LDPC-CC) and based on the relationship $H_{pro}v_s=0$. The encoder 2511 generates a transmission sequence (encoded sequence (codeword)) $v_s$ of block s of the LDPC-CC of coding rate 13/15 that uses an improved tail-biting scheme (an LDPC block code using an LDPC-CC), denoted as $v_s=(X_{s,1,1}, X_{s,2,1}, \ldots, X_{s,13,1}, P^{pro}_{s,1,1}, P^{pro}_{s,2,1}, X_{s,1,2}, X_{s,2,2}, \ldots, X_{s,13,2}, P^{pro}_{s,1,2}, P^{pro}_{s,2,2}, \ldots, X_{s,1,k}, X_{s,2,k}, \ldots, X_{s,13,k}, P^{pro}_{s,1,k}, P^{pro}_{s,2,k}, \ldots, X_{s,1,2\times m\times z}, X_{s,2,2\times m\times z}, \ldots, X_{s,13,2\times m\times z}, P^{pro}_{s,1,2\times m\times z}, P^{pro}_{s,2,2\times m\times z})^T$, and outputs the transmission sequence $v_s$. As already described above, the LDPC-CC of coding rate 13/15 that uses an improved tail-biting scheme (an LDPC block code using an LDPC-CC) is characterized for enabling parities to be found sequentially.

A decoder 2523 of a receiving device 2520 in FIG. 25 receives, as input, a log-likelihood ratio of each bit of, for example, the transmission sequence $v_s=(X_{s,1,1}, X_{s,2,1}, \ldots, X_{s,7,1}, P^{pro}_{s,1,1}, P^{pro}_{s,2,1}, X_{s,1,2}, X_{s,2,2}, \ldots, X_{s,7,2}, P^{pro}_{s,1,2}, P^{pro}_{s,2,2}, \ldots, X_{s,1,k}, X_{s,2,k}, \ldots, X_{s,7,k}, P^{pro}_{s,1,k}, P^{pro}_{s,2,k}, \ldots, X_{s,1,2\times m\times z}, X_{s,2,2\times m\times z}, \ldots, X_{s,7,2\times m\times z}, P^{pro}_{s,1,2\times m\times z}, P^{pro}_{s,2,2\times m\times z})^T$. The log-likelihood ratios are output from a log-likelihood ratio generator 2522. The decoder 2523 performs decoding for an LDPC code according to the parity check matrix $H_{pro}$ for the LDPC-CC of coding rate 13/15 that uses an improved tail-biting scheme (an LDPC block code using an LDPC-CC). For example, the decoding may be decoding disclosed in Non-Patent Literature 4, Non-Patent Literature 6, Non-Patent Literature 7, Non-Patent Literature 8, etc., i.e., simple BP decoding such as min-sum decoding, offset BP decoding, or Normalized BP decoding, or Belief Propagation (BP) decoding in which scheduling is performed with respect to the row operations (Horizontal operations) and the column operations (Vertical operations) such as Shuffled BP decoding or Layered BP decoding. The decoding may also be decoding such as bit-flipping decoding disclosed in Non-Patent Literature 17, for example. The decoder 2523 obtains an estimation transmission sequence (estimation encoded sequence) (reception sequence) of block s through the decoding, and outputs the estimation transmission sequence.

In the above, explanation is provided on operations of the encoder and the decoder in a communication system as one example. Alternatively, the encoder and the decoder may be used in technical fields related to storages, memories, etc.

The following describes a specific example of a configuration of a parity check matrix for the LDPC-CC of coding rate 13/15 that uses an improved tail-biting scheme (an LDPC block code using an LDPC-CC).

When denoting the parity check matrix for the LDPC-CC of coding rate 13/15 that uses an improved tail-biting scheme (an LDPC block code using an LDPC-CC) as $H_{pro}$ as described above, the number of columns of $H_{pro}$ can be expressed as 15×2×m×z (where z is a natural number). (Note that m denotes a time-varying period of the LDPC-CC of coding rate 13/15 that is based on a parity check polynomial, which serves as the basis.)

Accordingly, as already described above, a transmission sequence (encoded sequence (codeword)) $v_s$ composed of a 15×2×m×z number of bits in block s of the LDPC-CC of coding rate 13/15 that uses an improved tail-biting scheme (an LDPC block code using an LDPC-CC) can be expressed as $v_s=(X_{s,1,1}, X_{s,2,1}, \ldots, X_{s,13,1}, P^{pro}_{s,1,1}, P^{pro}_{s,2,1}, X_{s,1,2}, X_{s,2,2}, \ldots, X_{s,13,2}, P^{pro}_{s,1,2}, P^{pro}_{s,2,2}, \ldots, X_{s,1,k}, X_{s,2,k}, \ldots, X_{s,13,k}, P^{pro}_{s,1,k}, P^{pro}_{s,2,k}, \ldots, X_{s,1,2\times m\times z}, X_{s,2,2\times m\times z}, \ldots, X_{s,13,2\times m\times z}, P^{pro}_{s,1,2\times m\times z}, P^{pro}_{s,2,2\times m\times z})^T (\lambda_{pro,s,1}, \lambda_{pro,s,2}, \ldots, \lambda_{pro,s,2\times m\times z-1}, \lambda_{pro,s,2\times m\times z})^T$ (where k=1, 2, . . . , 2×m×z−1, 2×m×z (i.e., k is an integer no smaller than one and no greater than 2×m×z)), and $H_{pro}v_s=0$ holds true (here, $H_{pro}v_s=0$ indicates that all elements of the vector $H_{pro}v_s$ are zeroes).

$X_{s,j,k}$ (where j is an integer no smaller than one and no greater than thirteen) is a bit of information $X_j$, $P^{pro}_{s,1,k}$ is a bit of parity $P_1$ of the LDPC-CC of coding rate 13/15 that uses an improved tail-biting scheme (an LDPC block code using an LDPC-CC), and $P^{pro}_{s,2,k}$ is a bit of parity $P_2$ of the LDPC-CC of coding rate 13/15 that uses an improved tail-biting scheme (an LDPC block code using an LDPC-CC).

Further, $\lambda_{pro,s,k}=(X_{s,1,k}, X_{s,2,k}, X_{s,3,k}, X_{s,4,k}, X_{s,5,k}, X_{s,6,k}, X_{s,7,k}, X_{s,8,k}, X_{s,9,k}, X_{s,10,k}, X_{s,11,k}, X_{s,12,k}, X_{s,13,k}, P^{pro}_{s,1,k}, P^{pro}_{s,2,k})$ holds true.

In addition, the number of rows in the parity check matrix $H_{pro}$ for the LDPC-CC of coding rate 13/15 that uses an improved tail-biting scheme (an LDPC block code using an LDPC-CC) is 4×m×z.

Note that the method of configuring parity check polynomials satisfying zero for the LDPC-CC of coding rate 13/15 that uses an improved tail-biting scheme (an LDPC block code using an LDPC-CC) has already been described above.

In the above, description has been provided of a parity check matrix $H_{pro}$ for the LDPC-CC of coding rate 13/15 that uses an improved tail-biting scheme (an LDPC block code using an LDPC-CC), whose transmission sequence (encoded sequence (codeword)) $v_s$ of block s is $v_s=(X_{s,1,1}, X_{s,2,1}, \ldots, X_{s,13,1}, P^{pro}_{s,1,1}, P^{pro}_{s,2,1}, X_{s,1,2}, X_{s,2,2}, \ldots, X_{s,13,2}, P^{pro}_{s,1,2}, P^{pro}_{s,2,2}, \ldots, X_{s,1,k}, X_{s,2,k}, \ldots, X_{s,13,k}, P^{pro}_{s,1,k}, P^{pro}_{s,2,k}, \ldots, X_{s,1,2\times m\times z}, X_{s,2,2\times m\times z}, \ldots, X_{s,13,2\times m\times z}, P^{pro}_{s,1,2\times m\times z}, P^{pro}_{s,2,2\times m\times z})^T=(\lambda_{pro,s,1}, \lambda_{pro,s,2}, \ldots, \lambda_{pro,s,2\times m\times z-1}, \lambda_{pro,s,2\times m\times z})^T$ and for which $H_{pro}v_s=0$ holds true (here, $H_{pro}v_s=0$ indicates that all elements of the vector $H_{pro}v_s$ are zeroes). The following provides description of a configuration of a parity check matrix $H_{pro\_m}$ for the LDPC-CC of coding rate 13/15 that uses an improved tail-biting scheme (an LDPC block code using an LDPC-CC), for which $H_{pro\_m}u_s=0$ holds true (here, $H_{pro\_m}u_s=0$ indicates that all elements of the vector $H_{pro\_m}u_s$ are zeroes) when expressing a transmission sequence (encoded sequence (codeword)) $u_s$ of block s as $u_s=(X_{s,1,1}, X_{s,2,2}, \ldots, X_{s,1,2\times m\times z-1}, X_{s,1,2\times m\times z}, X_{s,2,1}, X_{s,2,2}, \ldots, X_{s,2,2\times m\times z-1}, X_{s,2,2\times m\times z}, X_{s,3,1}, X_{s,3,2}, \ldots, X_{s,3,2\times m\times z-1}, X_{s,3,2\times m\times z}, X_{s,4,1}, X_{s,4,2}, \ldots, X_{s,4,2\times m\times z-1}, X_{s,4,2\times m\times z}, X_{s,5,1}, X_{s,5,2}, \ldots, X_{s,5,2\times m\times z-1}, X_{s,5,2\times m\times z}, X_{s,6,1}, X_{s,6,2}, \ldots, X_{s,6,2\times m\times z-1}, X_{s,6,2\times m\times z}, X_{s,7,1}, X_{s,7,2}, \ldots, X_{s,7,2\times m\times z-1}, X_{s,7,2\times m\times z}, X_{s,8,1}, X_{s,8,2}, \ldots, X_{s,8,2\times m\times z-1}, X_{s,8,2\times m\times z}, X_{s,9,1}, X_{s,9,2}, \ldots, X_{s,9,2\times m\times z-1}, X_{s,9,2\times m\times z}, X_{s,10,1}, X_{s,10,2}, \ldots, X_{s,10,2\times m\times z-1}, X_{s,10,2\times m\times z}, X_{s,11,1}, X_{s,11,2}, \ldots, X_{s,11,2\times m\times z-1}, X_{s,11,2\times m\times z}, X_{s,12,1}, X_{s,12,2}, \ldots, X_{s,12,2\times m\times z-1}, X_{s,12,2\times m\times z}, X_{s,13,1}, X_{s,13,2}, \ldots, X_{s,13,2\times m\times z-1}, X_{s,13,2\times m\times z}, P^{pro}_{s,1,1}, P^{pro}_{s,1,2}, \ldots, P^{pro}_{s,1,2\times m\times z-1}, P^{pro}_{s,1,2\times m\times z}, P^{pro}_{s,2,1}, P^{pro}_{s,2,2}, \ldots, P^{pro}_{s,2,2\times m\times z-1}, P^{pro}_{s,2,2\times m\times z})^T=(\Lambda_{X1,s}, \Lambda_{X2,s}, \Lambda_{X3,s}, \Lambda_{X4,s}, \Lambda_{X5,s}, \Lambda_{X6,s}, \Lambda_{X7,s}, \Lambda_{X8,s}, \Lambda_{X9,s}, \Lambda_{X10,s}, \Lambda_{X11,s}, \Lambda_{X12,s}, \Lambda_{X13,s}, \Lambda_{pro1,s}, \Lambda_{pro2,s})^T$.

Note that $\Lambda_{Xf,s}$ (where f is an integer no smaller than one and no greater than thirteen) satisfies $\Lambda_{Xf,s}=(X_{s,f,1}, X_{s,f,2}, X_{s,f,3}, \ldots, X_{s,f,2\times m\times z-2}, X_{s,f,2\times m\times z-1}, X_{s,f,2\times m\times z})$ ($\Lambda_{Xf,s}$ is a vector having one row and 2×m×z columns), and $\Lambda_{pro1,s}$ and $\Lambda_{pro2,s}$ satisfy $\Lambda_{pro1,s}=(P^{pro}_{s,1,1}, P^{pro}_{s,1,2}, \ldots, P^{pro}_{s,1,2\times m\times z-1}, P^{pro}_{s,1,2\times m\times z})$ and $\Lambda_{pro2,s}=(P^{pro}_{s,2,1}, P^{pro}_{s,2,2}, \ldots, P^{pro}_{s,2,2\times m\times z-1}, P^{pro}_{s,2,2\times m\times z})$, respectively ($\Lambda_{pro1,s}$ and $\Lambda_{pro2,s}$ are both vectors having one row and 2×m×z columns).

Figure 101:
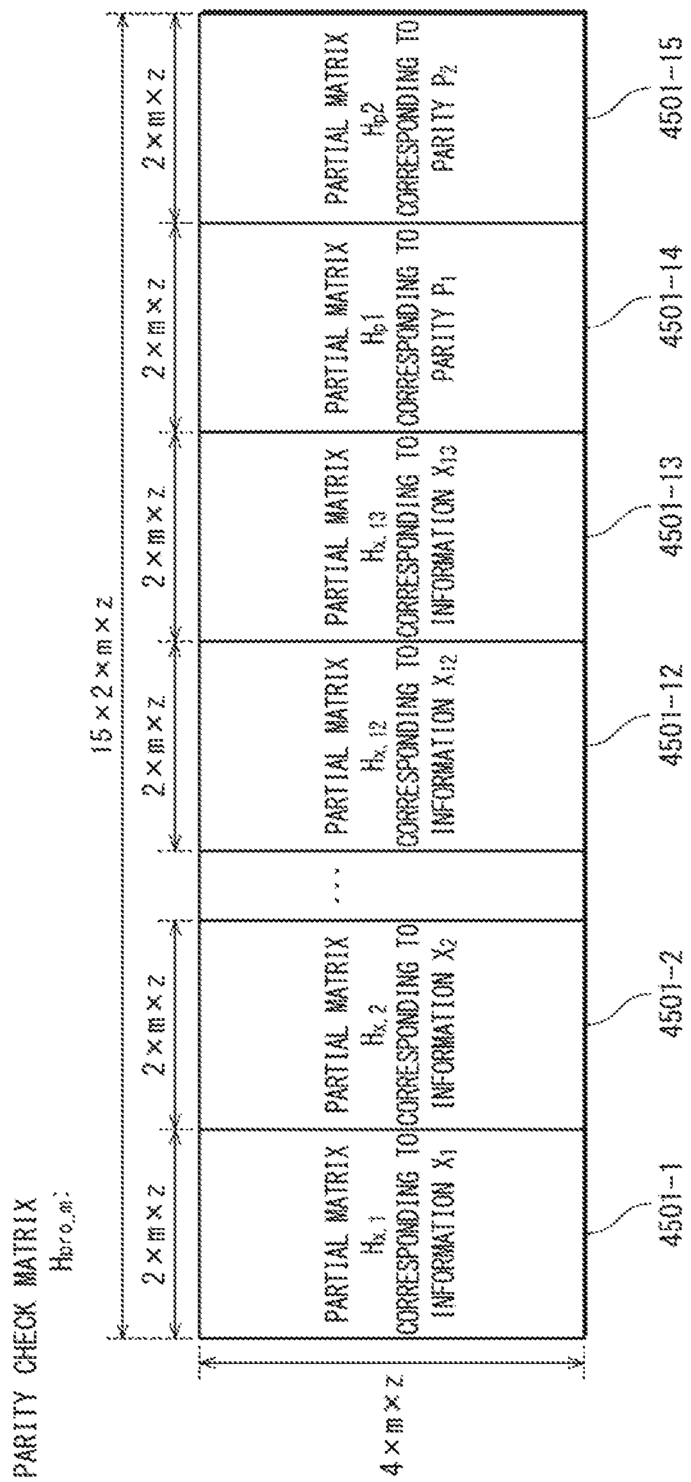
FIG. 101 shows an example of the configuration of check matrix for LDPC-CC of coding rate 13/15 when improved tail-biting is performed.

Here, the number of bits of information $X_1$ included in one block is 2×m×z, the number of bits of information $X_2$ included in one block is 2×m×z, the number of bits of information $X_3$ included in one block is 2×m×z, the number of bits of information $X_4$ included in one block is 2×m×z, the number of bits of information $X_5$ included in one block is 2×m×z, the number of bits of information $X_6$ included in one block is 2×m×z, the number of bits of information $X_7$ included in one block is 2×m×z, the number of bits of information $X_8$ included in one block is 2×m×z, the number of bits of information $X_9$ included in one block is 2×m×z, the number of bits of information $X_{10}$ included in one block is 2×m×z, the number of bits of information $X_{11}$ included in one block is 2×m×z, the number of bits of information $X_{12}$ included in one block is 2×m×z, the number of bits of information $X_{13}$ included in one block is 2×m×z, the number of bits of parity bits $P_1$ included in one block is 2×m×z, and the number of bits of parity bits $P_2$ included in one block is 2×m×z. Accordingly, the parity check matrix $H_{pro\_m}$ for the LDPC-CC of coding rate 13/15 that uses an improved tail-biting scheme (an LDPC block code using an LDPC-CC) can be expressed as $H_{pro\_m}=[H_{x,1}, H_{x,2}, H_{x,3}, H_{x,4}, H_{x,5}, H_{x,6}, H_{x,7}, H_{x,8}, H_{x,9}, H_{x,10}, H_{x,11}, H_{x,12}, H_{x,13}, H_{p1}, H_{p2}]$, as illustrated in FIG. 101. Since a transmission sequence (encoded sequence (codeword)) $u_s$ of block s is $u_s=(X_{s,1,1}, X_{s,1,2}, \ldots, X_{s,1,2\times m\times z-1}, X_{s,1,2\times m\times z}, X_{s,2,1}, X_{s,2,2}, \ldots, X_{s,2,2\times m\times z-1}, X_{s,2,2\times m\times z}, X_{s,3,1}, X_{s,3,2}, \ldots, X_{s,3,2\times m\times z-1}, X_{s,3,2\times m\times z}, X_{s,4,1}, X_{s,4,2}, \ldots, X_{s,4,2\times m\times z-1}, X_{s,4,2\times m\times z}, X_{s,5,1}, X_{s,5,2}, \ldots, X_{s,5,2\times m\times z-1}, X_{s,5,2\times m\times z}, X_{s,6,1}, X_{s,6,2}, \ldots, X_{s,6,2\times m\times z-1}, X_{s,6,2\times m\times z}, X_{s,7,1}, X_{s,7,2}, \ldots, X_{s,7,2\times m\times z-1}, X_{s,7,2\times m\times z}, X_{s,8,1}, X_{s,8,2}, \ldots, X_{s,8,2\times m\times z-1}, X_{s,8,2\times m\times z}, X_{s,9,1}, X_{s,9,2}, \ldots, X_{s,9,2\times m\times z-1}, X_{s,9,2\times m\times z}, X_{s,10,1}, X_{s,10,2}, \ldots, X_{s,10,2\times m\times z-1}, X_{s,10,2\times m\times z}, X_{s,11,1}, X_{s,11,2}, \ldots, X_{s,11,2\times m\times z-1}, X_{s,11,2\times m\times z}, X_{s,12,1}, X_{s,12,2}, \ldots, X_{s,12,2\times m\times z-1}, X_{s,12,2\times m\times z}, X_{s,13,1}, X_{s,13,2}, \ldots, X_{s,13,2\times m\times z-1}, X_{s,13,2\times m\times z}, P^{pro}_{s,1,1}, P^{pro}_{s,1,2}, \ldots, P^{pro}_{s,1,2\times m\times z-1}, P^{pro}_{s,1,2\times m\times z}, P^{pro}_{s,2,1}, P^{pro}_{s,2,2}, \ldots, P^{pro}_{s,2,2\times m\times z-1}, P^{pro}_{s,2,2\times m\times z})^T=(\Lambda_{X1,s}, \Lambda_{X2,s}, \Lambda_{X3,s}, \Lambda_{X4,s}, \Lambda_{X5,s}, \Lambda_{X6,s}, \Lambda_{X7,s}, \Lambda_{X8,s}, \Lambda_{X9,s}, \Lambda_{X10,s}, \Lambda_{X11,s}, \Lambda_{X12,s}, \Lambda_{X13,s}, \Lambda_{pro1,s}, \Lambda_{pro2,s})^T$, $H_{x,1}$ is a partial matrix related to information $X_1$, $H_{x,2}$ is a partial matrix related to information $X_2$, $H_{x,3}$ is a partial matrix related to information $X_3$, $H_{x,4}$ is a partial matrix related to information $X_4$, $H_{x,5}$ is a partial matrix related to information $X_5$, $H_{x,6}$ is a partial matrix related to information $X_6$, $H_{x,7}$ is a partial matrix related to information $X_7$, $H_{x,8}$ is a partial matrix related to information $X_8$, $H_{x,9}$ is a partial matrix related to information $X_9$, $H_{x,10}$ is a partial matrix related to information $X_{10}$, $H_{x,11}$ is a partial matrix related to information $X_{11}$, $H_{x,12}$ is a partial matrix related to information $X_{12}$, $H_{x,13}$ is a partial matrix related to information $X_{13}$, $H_{p1}$ is a partial matrix related to parity $P_1$, and $H_{p2}$ is a partial matrix related to parity $P_2$. As illustrated in FIG. 101, the parity check matrix $H_{pro\_m}$ has 4×m×z rows and 15×2×m×z columns, the partial matrix $H_{x,1}$ related to information $X_1$ has 4×m×z rows and 2×m×z columns, the partial matrix $H_{x,2}$ related to information $X_2$ has 4×m×z rows and 2×m×z columns, the partial matrix $H_{x,3}$ related to information $X_3$ has 4×m×z rows and 2×m×z columns, the partial matrix $H_{x,4}$ related to information $X_4$ has 4×m×z rows and 2×m×z columns, the partial matrix $H_{x,5}$ related to information $X_5$ has 4×m×z rows and 2×m×z columns, the partial matrix $H_{x,6}$ related to information $X_6$ has 4×m×z rows and 2×m×z columns, the partial matrix $H_{x,7}$ related to information $X_7$ has 4×m×z rows and 2×m×z columns, the partial matrix $H_{x,8}$ related to information $X_8$ has 4×m×z rows and 2×m×z columns, the partial matrix $H_{x,9}$ related to information $X_9$ has 4×m×z rows and 2×m×z columns, the partial matrix $H_{x,10}$ related to information $X_{10}$ has 4×m×z rows and 2×m×z columns, the partial matrix $H_{x,11}$ related to information $X_{11}$ has 4×m×z rows and 2×m×z columns, the partial matrix $H_{x,12}$ related to information $X_{12}$ has 4×m×z rows and 2×m×z columns, the partial matrix $H_{x,13}$ related to information $X_{13}$ has 4×m×z rows and 2×m×z columns, the partial matrix $H_{p1}$ related to parity $P_1$ has 4×m×z rows and 2×m×z columns, and the partial matrix $H_{p2}$ related to parity $P_2$ has 4×m×z rows and 2×m×z columns.

The transmission sequence (encoded sequence (codeword)) $u_s$ composed of a 15×2×m×z number of bits in block s of the LDPC-CC of coding rate 13/15 that uses an improved tail-biting scheme (an LDPC block code using an LDPC-CC) is $u_s=(X_{s,1,1}, X_{s,1,2}, \ldots, X_{s,1,2\times m\times z-1}, X_{s,1,2\times m\times z}, X_{s,2,1}, X_{s,2,2}, \ldots, X_{s,2,2\times m\times z-1}, X_{s,2,2\times m\times z}, X_{s,3,1}, X_{s,3,2}, \ldots, X_{s,3,2\times m\times z-1}, X_{s,3,2\times m\times z}, X_{s,4,1}, X_{s,4,2}, \ldots, X_{s,4,2\times m\times z-1}, X_{s,4,2\times m\times z}, X_{s,5,1}, X_{s,5,2}, \ldots, X_{s,5,2\times m\times z-1}, X_{s,5,2\times m\times z}, X_{s,6,1}, X_{s,6,2}, \ldots, X_{s,6,2\times m\times z-1}, X_{s,6,2\times m\times z}, X_{s,7,1}, X_{s,7,2}, \ldots, X_{s,7,2\times m\times z-1}, X_{s,7,2\times m\times z}, X_{s,8,1}, X_{s,8,2}, \ldots, X_{s,8,2\times m\times z-1}, X_{s,8,2\times m\times z}, X_{s,9,1}, X_{s,9,2}, \ldots, X_{s,9,2\times m\times z-1}, X_{s,9,2\times m\times z}, X_{s,10,1}, X_{s,10,2}, \ldots, X_{s,10,2\times m\times z-1}, X_{s,10,2\times m\times z}, X_{s,11,1}, X_{s,11,2}, \ldots, X_{s,11,2\times m\times z-1}, X_{s,11,2\times m\times z}, X_{s,12,1}, X_{s,12,2}, \ldots, X_{s,12,2\times m\times z-1}, X_{s,12,2\times m\times z}, X_{s,13,1}, X_{s,13,2}, \ldots, X_{s,13,2\times m\times z-1}, X_{s,13,2\times m\times z}, P^{pro}_{s,1,1}, P^{pro}_{s,1,2}, \ldots, P^{pro}_{s,1,2\times m\times z-1}, P^{pro}_{s,1,2\times m\times z}, P^{pro}_{s,2,1}, P^{pro}_{s,2,2}, \ldots, P^{pro}_{s,2,2\times m\times z-1}, P^{pro}_{s,2,2\times m\times z})^T=(\Lambda_{X1,s}, \Lambda_{X2,s}, \Lambda_{X3,s}, \Lambda_{X4,s}, \Lambda_{X5,s}, \Lambda_{X6,s}, \Lambda_{X7,s}, \Lambda_{X8,s}, \Lambda_{X9,s}, \Lambda_{X10,s}, \Lambda_{X11,s}, \Lambda_{X12,s}, \Lambda_{X13,s}, \Lambda_{pro1,s}, \Lambda_{pro2,s})^T$, and the number of parity check polynomials satisfying zero necessary for obtaining this transmission sequence is 4×m×z.

Here, when arranging such 2×(2×m)×z number of parity check polynomials satisfying zero in order, a parity check polynomial satisfying zero appearing eth is referred to in the following as an "eth parity check polynomial satisfying zero" (where e is an integer no smaller than zero and no greater than 2×(2×m)×z−1).

As such, the parity check polynomials satisfying zero are arranged in the following order:

zeroth: zeroth parity check polynomial satisfying zero;

first: first parity check polynomial satisfying zero;

second: second parity check polynomial satisfying zero;

⋮ eth: eth parity check polynomial satisfying zero;

⋮

2×(2×m)×z−2th: 2×(2×m)×z−2th parity check polynomial satisfying zero; and

2×(2×m)×z−1th: 2×(2×m)×z−1th parity check polynomial satisfying zero.

Accordingly, the transmission sequence (encoded sequence (codeword)) $u_s$ of block s of the LDPC-CC of coding rate 13/15 that uses an improved tail-biting scheme (an LDPC block code using an LDPC-CC) is obtained.

Accordingly, in the LDPC-CC of coding rate 13/15 that uses an improved tail-biting scheme (an LDPC block code using an LDPC-CC):

the 0th parity check polynomial satisfying zero is a parity check polynomial satisfying zero of #0'; first expression provided by expression 205;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 205;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

In the present embodiment (in fact, commonly applying to the entirety of the present disclosure), % means a modulo, and for example, α%q represents a remainder after dividing α by q (where α is an integer no smaller than zero, and q is a natural number).

The following describes details of the configuration of the parity check matrix $H_{pro\_m}$ for the LDPC-CC of coding rate 13/15 that uses an improved tail-biting scheme (an LDPC block code using an LDPC-CC) based on what has been described above.

The parity check matrix $H_{pro\_m}$ for the LDPC-CC of coding rate 13/15 that uses an improved tail-biting scheme (an LDPC block code using an LDPC-CC) has 4×m×z rows and 15×2×m×z columns.

Accordingly, the parity check matrix $H_{pro\_m}$ for the LDPC-CC of coding rate 13/15 that uses an improved tail-biting scheme (an LDPC block code using an LDPC-CC) has rows one through 4×m×z, and columns one through 15×2×m×z.

Here, the topmost row of the parity check matrix $H_{pro\_m}$ is considered as the first row. Further, row number is incremented by one each time moving to a lower row. Accordingly, the topmost row is considered as the first row, the row immediately below the first row is considered as the second row, and the subsequent rows are considered as the third row, the fourth row, and so on.

Further, the leftmost column of the parity check matrix $H_{pro\_m}$ is considered as the first column. Further, column number is incremented by one each time moving to a rightward column. Accordingly, the leftmost column is considered as the first column, the column immediately to the right of the first column is considered as the second column, and the subsequent columns are considered as the third column, the fourth column, and so on.

In the parity check matrix $H_{pro\_m}$, the partial matrix $H_{x,1}$ related to information $X_1$ has 4×m×z rows and 2×m×z columns. In the following, an element at row u, column v of the partial matrix $H_{x,1}$ related to information $X_1$ is denoted as $H_{x,1,comp}[u][v]$ (where u is an integer no smaller than one and no greater than 4×m×z, and v is an integer no smaller than one and no greater than 2×m×z).

Similarly, in the parity check matrix $H_{pro\_m}$, the partial matrix $H_{x,2}$ related to information $X_2$ has 4×m×z rows and 2×m×z columns. In the following, an element at row u, column v of the partial matrix $H_{x,2}$ related to information $X_2$ is denoted as $H_{x,2,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,3}$ related to information $X_3$ has 4×m×z rows and 2×m×z columns. In the following, an element at row u, column v of the partial matrix $H_{x,3}$ related to information $X_3$ is denoted as $H_{x,3,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,4}$ related to information $X_4$ has 4×m×z rows and 2×m×z columns. In the following, an element at row u, column v of the partial matrix $H_{x,4}$ related to information $X_4$ is denoted as $H_{x,4,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,5}$ related to information $X_5$ has 4×m×z rows and 2×m×z columns. In the following, an element at row u, column v of the partial matrix $H_{x,5}$ related to information $X_5$ is denoted as $H_{x,5,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,6}$ related to information $X_6$ has 4×m×z rows and 2×m×z columns. In the following, an element at row u, column v of the partial matrix $H_{x,6}$ related to information $X_6$ is denoted as $H_{x,6,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,7}$ related to information $X_7$ has 4×m×z rows and 2×m×z columns. In the following, an element at row u, column v of the partial matrix $H_{x,7}$ related to information $X_7$ is denoted as $H_{x,7,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,8}$ related to information $X_8$ has 4×m×z rows and 2×m×z columns. In the following, an element at row u, column v of the partial matrix $H_{x,8}$ related to information $X_8$ is denoted as $H_{x,8,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,9}$ related to information $X_9$ has 4×m×z rows and 2×m×z columns. In the following, an element at row u, column v of the partial matrix $H_{x,9}$ related to information $X_9$ is denoted as $H_{x,9,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,10}$ related to information $X_{10}$ has 4×m×z rows and 2×m×z columns. In the following, an element at row u, column v of the partial matrix $H_{x,10}$ related to information $X_{10}$ is denoted as $H_{x,10,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,11}$ related to information $X_{11}$ has 4×m×z rows and 2×m×z columns. In the following, an element at row u, column v of the partial matrix $H_{x,11}$ related to information $X_{11}$ is denoted as $H_{x,11,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,12}$ related to information $X_{12}$ has 4×m×z rows and 2×m×z columns. In the following, an element at row u, column v of the partial matrix $H_{x,12}$ related to information $X_{12}$ is denoted as $H_{x,12,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{x,13}$ related to information $X_{13}$ has 4×m×z rows and 2×m×z columns. In the following, an element at row u, column v of the partial matrix $H_{x,13}$ related to information $X_{13}$ is denoted as $H_{x,13,comp}[u][v]$ (where u is an integer no smaller than one and no greater than 4×m×z, and v is an integer no smaller than one and no greater than 2×m×z).

Further, in the parity check matrix $H_{pro\_m}$, the partial matrix $H_{p,1}$ related to parity $P_1$ has 4×m×z rows and 2×m×z columns. In the following, an element at row u, column v of the partial matrix $H_{p,1}$ related to parity $P_1$ is denoted as $H_{p1,comp}[u][v]$ (where u is an integer no smaller than one and no greater than 4×m×z, and v is an integer no smaller than one and no greater than 2×m×z).

Similarly, in the parity check matrix $H_{pro\_m}$, the partial matrix $H_{p,2}$ related to parity $P_2$ has 4×m×z rows and 2×m×z columns. In the following, an element at row u, column v of the partial matrix $H_{p,2}$ related to parity $P_2$ is denoted as $H_{p2,comp}[u][v]$ (where u is an integer no smaller than one and no greater than 4×m×z, and v is an integer no smaller than one and no greater than 2×m×z).

The following provides detailed description of the configuration of $H_{x,1,comp}[u][v]$, $H_{x,2,comp}[u][v]$, $H_{x,3,comp}[u][v]$, $H_{x,4,comp}[u][v]$, $H_{x,5,comp}[u][v]$, $H_{x,6,comp}[u][v]$, $H_{x,7,comp}[u][v]$, $H_{x,8,comp}[u][v]$, $H_{x,9,comp}[u][v]$, $H_{x,10,comp}[u][v]$, $H_{x,11,comp}[u][v]$, $H_{x,12,comp}[u][v]$, $H_{x,13,comp}[u][v]$, $H_{p1,comp}[u][v]$, and $H_{p2,comp}[u][v]$.

As already described above, in the LDPC-CC of coding rate 13/15 that uses an improved tail-biting scheme (an LDPC block code using an LDPC-CC):

the 0th parity check polynomial satisfying zero is a parity check polynomial satisfying zero of #0'; first expression provided by expression 205;

the first parity check polynomial satisfying zero is a parity check polynomial satisfying zero of #0; second expression;

the second parity check polynomial satisfying zero is a parity check polynomial satisfying zero of #1; first expression;

the third parity check polynomial satisfying zero is a parity check polynomial satisfying zero of #1; second expression;

⋮ the 2×(2m−1)−2th parity check polynomial satisfying zero is a parity check polynomial satisfying zero of #(2m−2); first expression;

the 2×(2m−1)−1th parity check polynomial satisfying zero is a parity check polynomial satisfying zero of #(2m−2); second expression;

the 2×(2m)−2th parity check polynomial satisfying zero is a parity check polynomial satisfying zero of #(2m−1); first expression;

the 2×(2m)−1th parity check polynomial satisfying zero is a parity check polynomial satisfying zero of #(2m−1); second expression;

the 2×(2m+1)−2th parity check polynomial satisfying zero is a parity check polynomial satisfying zero of #0; first expression;

the 2×(2m+1)−1th parity check polynomial satisfying zero is a parity check polynomial satisfying zero of #0; second expression;

the 2×(2m+2)−2th parity check polynomial satisfying zero is a parity check polynomial satisfying zero of #1; first expression;

the 2×(2m+2)−1th parity check polynomial satisfying zero is a parity check polynomial satisfying zero of #1; second expression;

⋮ the 2×(2m−1)×z−2th parity check polynomial satisfying zero is a parity check polynomial satisfying zero of #(2m−2); first expression;

the 2×(2m−1)×z−1th parity check polynomial satisfying zero is a parity check polynomial satisfying zero of #(2m−2); second expression;

the 2×(2m)×z−2th parity check polynomial satisfying zero is a parity check polynomial satisfying zero of #(2m−1); first expression; and the 2×(2m)×z−1th parity check polynomial satisfying zero is a parity check polynomial satisfying zero of #(2m−1); second expression.

That is, the 0th parity check polynomial satisfying zero is a parity check polynomial satisfying zero of #0'; first expression provided by expression 205;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

Further, a vector composed of row e+1 of the parity check matrix $H_{pro\_m}$ corresponds to the eth parity check polynomial satisfying zero.

Accordingly, a vector composed of row one of the parity check matrix $H_{pro\_m}$ is generated by using a parity check polynomial satisfying zero of #0'; first expression provided by expression 205;

a vector composed of row two of the parity check matrix $H_{pro\_m}$ is generated by using a parity check polynomial satisfying zero of #0; second expression;

a vector composed of row 2×g−1 of the parity check matrix $H_{pro\_m}$ is generated by using a parity check polynomial satisfying zero of #((g−1)%2m); first expression; and a vector composed of row 2×g of the parity check matrix $H_{pro\_m}$ is generated by using a parity check polynomial satisfying zero of #((g−1)%2m); second expression (where g is an integer no smaller than two and no greater than 2×m×z).

$H_{x,1,comp}[u][v]$, $H_{x,2,comp}[u][v]$, $H_{x,3,comp}[u][v]$, $H_{x,4,comp}[u][v]$, $H_{x,5,comp}[u][v]$, $H_{x,6,comp}[u][v]$, $H_{x,7,comp}[u][v]$, $H_{x,8,comp}[u][v]$, $H_{x,9,comp}[u][v]$, $H_{x,10,comp}[u][v]$, $H_{x,11,comp}[u][v]$, $H_{x,12,comp}[u][v]$, $H_{x,13,comp}[u][v]$, $H_{p1,comp}[u][v]$, and $H_{p2,comp}[u][v]$ can be expressed according to the relationship described above.

First, description is provided of the configuration of $H_{x,1,comp}[u][v]$, $H_{x,2,comp}[u][v]$, $H_{x,3,comp}[u][v]$, $H_{x,4,comp}[u][v]$, $H_{x,5,comp}[u][v]$, $H_{x,6,comp}[u][v]$, $H_{x,7,comp}[u][v]$, $H_{x,8,comp}[u][v]$, $H_{x,9,comp}[u][v]$, $H_{x,10,comp}[u][v]$, $H_{x,11,comp}[u][v]$, $H_{x,12,comp}[u][v]$, $H_{x,13,comp}[u][v]$, $H_{p1,comp}[u][v]$, and $H_{p2,comp}[u][v]$ for row one of the parity check matrix $H_{pro\_m}$, or that is, for u=1.

The vector composed of row one of the parity check matrix $H_{pro\_m}$ is generated by using a parity check polynomial satisfying zero of #0'; first expression provided by expression 205. Accordingly, $H_{x,1,comp}[1][v]$ can be expressed as follows.

[Math. 824]

$$H_{x,w,comp}[1][1]=1 \tag{206-1}$$

When y is an integer no smaller than one and no greater than $R_{\#(0),1}$:

$$H_{x,1,comp}[1][1-\alpha_{\#(0),1,y}+(2\times m\times z)]=1 \tag{206-2}$$

For all v being an integer no smaller than one and no greater than 2×m×z satisfying {v≠1} and $\{v\neq 1-\alpha_{\#(0),1,y}+(2\times m\times z)\}$ (where y is an integer no smaller than one and no greater than $R_{\#(0),1}$), the following holds true:

$$H_{x,1,comp}[1][v]=0 \tag{206-3}$$

Considered in a similar manner, the following holds true for $H_{x,w,comp}[1][v]$, where w is an integer no smaller than one and no greater than six.

[Math. 825]

$$H_{x,w,comp}[1][1]=1 \quad (207\text{-}1)$$

When y is an integer no smaller than one and no greater than $R_{\#(0),w}$:

$$H_{x,w,comp}[1][1-\alpha_{\#(0),w,y}+(2\times m\times z)]=1 \quad (207\text{-}2)$$

For all v being an integer no smaller than one and no greater than 2×m×z satisfying {v≠1} and $\{v\neq 1-\alpha_{\#(0),w,y}+(2\times m\times z)\}$ (where y is an integer no smaller than one and no greater than $R_{\#(0),w}$), the following holds true:

$$H_{x,w,comp}[1][v]=0 \quad (207\text{-}3)$$

Further, $H_{x,7,comp}[1][v]$ can be expressed as follows.

[Math. 826]

When y is an integer no smaller than $R_{\#(0),7}+1$ and no greater than $r_{\#((0),7}$:

$$H_{x,7,comp}[1][1-\alpha_{\#(0),7,y}+(2\times m\times z)]=1 \quad (208\text{-}1)$$

For all v being an integer no smaller than one and no greater than 2×m×z satisfying $\{v\neq 1-\alpha_{\#(0),7,y}+(2\times m\times z)\}$ (where y is an integer no smaller than $R_{\#(0),7}+1$ and no greater than $r_{\#((0),7)}$), the following holds true:

$$H_{x,7,comp}[1][v]=0 \quad (208\text{-}2)$$

Considered in a similar manner, the following holds true for $H_{x\Omega,comp}[1][v]$. In the following, Ω is an integer no smaller than seven and no greater than thirteen.

[Math. 827]

When y is an integer no smaller than $R_{\#(0),\Omega}+1$ and no greater than $r_{\#(0),\Omega}$:

$$H_{x,\Omega,comp}[1][1-\alpha_{\#(0),\Omega,y}+(2\times m\times z)]=1 \quad (209\text{-}1)$$

For all v being an integer no smaller than one and no greater than 2×m×z satisfying $\{v\neq 1-\alpha_{\#(0),\Omega,y}+(2\times m\times z)\}$ (where y is an integer no smaller than $R_{\#(0),\Omega}+1$ and no greater than $r_{\#((0),\Omega)}$), the following holds true:

$$H_{x,\Omega,comp}[1][v]=0 \quad (209\text{-}2)$$

Further, $H_{p1,comp}[1][v]$ can be expressed as follows.

[Math. 828]

$$H_{p1,comp}[1][1]=1 \quad (210\text{-}1)$$

For all v being an integer no smaller than two and no greater than 2×m×z, the following holds true:

$$H_{p1,comp}[1][v]=0 \quad (210\text{-}2)$$

Further, $H_{p2,comp}[1][v]$ can be expressed as follows.

[Math. 829]

For all v being an integer no smaller than one and no greater than 2×m×z, the following holds true:

$$H_{p2,comp}[1][v]=0 \quad (211)$$

The vector composed of row two of the parity check matrix $H_{pro\_m}$ is generated by using a parity check polynomial satisfying zero of #0; second expression. As described above, a parity check polynomial satisfying zero of #0; second expression is expressed by either expression (197-2-1) or expression (197-2-2).

Accordingly, $H_{x,1,comp}[2][v]$ can be expressed as follows.

<1> When a parity check polynomial satisfying zero of #0; second expression is expressed as provided in expression (197-2-1):

$H_{x,1,comp}[2][v]$ is expressed as follows.

[Math. 830]

When y is an integer no smaller than $R_{\#(0),1}+1$ and no greater than $r_{\#(0),1}$:

$$H_{x,1,comp}[2][1-\alpha_{\#(0),1,y}+(2\times m\times z)]=1 \quad (212\text{-}1)$$

For all v being an integer no smaller than one and no greater than 2×m×z satisfying $\{v\neq 1-\alpha_{\#(0),1,y}+(2\times m\times z)\}$ (where y is an integer no smaller than $R_{\#(0),1}+1$ and no greater than $r_{\#((0),1)}$), the following holds true:

$$H_{x,1,comp}[2][v]=0 \quad (212\text{-}2)$$

Considered in a similar manner, the following holds true for $H_{x,\Omega,comp}[2][v]$, where Ω is an integer no smaller than one and no greater than six.

[Math. 831]

When y is an integer no smaller than $R_{\#(0),\Omega}+1$ and no greater than $r_{\#(0),\Omega}$:

$$H_{x,\Omega,comp}[2][1-\alpha_{\#(0),\Omega,y}+(2\times m\times z)]=1 \quad (213\text{-}1)$$

For all v being an integer no smaller than one and no greater than 2×m×z satisfying {v≠1} and $\{v\neq 1-\alpha_{\#(0),\Omega,y}+(2\times m\times z)\}$ (where y is an integer no smaller than $R_{\#(0),\Omega}+1$ and no greater than $r_{\#((0),\Omega)}$), the following holds true:

$$H_{x,\Omega,comp}[2][v]=0 \quad (213\text{-}2)$$

Further, $H_{x,7,comp}[2][v]$ is expressed as follows.

[Math. 832]

$$H_{x,7,comp}[2][1]=1 \quad (214\text{-}1)$$

When y is an integer no smaller than one and no greater than $R_{\#(0),7}$:

$$H_{x,7,comp}[2][1-\alpha_{\#(0),7,y}+(2\times m\times z)]=1 \quad (214\text{-}2)$$

For all v being an integer no smaller than one and no greater than 2×m×z satisfying {v≠1} and $\{v\neq 1-\alpha_{\#(0),7,y}+(2\times m\times z)\}$ (where y is an integer no smaller than one and no greater than $R_{\#(0),7}$), the following holds true:

$$H_{x,7,comp}[2][v]=0 \quad (214\text{-}3)$$

Considered in a similar manner, the following holds true for $H_{x,w,comp}[2][v]$, where w is an integer no smaller than seven and no greater than thirteen.

[Math. 833]

$$H_{x,w,comp}[2][1]=1 \quad (215\text{-}1)$$

When y is an integer no smaller than one and no greater than $R_{\#(0),w}$:

$$H_{x,w,comp}[2][1-\alpha_{\#(0),w,y}+(2\times m\times z)]=1 \quad (215\text{-}2)$$

For all v being an integer no smaller than one and no greater than 2×m×z satisfying {v≠1} and $\{v\neq 1-\alpha_{\#(0),w,y}+(2\times m\times z)\}$ (where y is an integer no smaller than one and no greater than $R_{\#(0),w}$), the following holds true:

$$H_{x,w,comp}[2][v]=0 \quad (215\text{-}3)$$

Further, $H_{p1,comp}[2][v]$ can be expressed as follows.

[Math. 834]

$$H_{p1,comp}[2][1-\beta_{\#(0),2}+(2\times m\times z)]=1 \quad (216\text{-}1)$$

For all v being an integer no smaller than one and no greater than 2×m×z satisfying $\{v\neq 1-\beta_{\#(0),2}+(2\times m\times z)\}$, the following holds true:

$$H_{p1,comp}[2][v]=0 \quad (216\text{-}2)$$

Further, $H_{p2,comp}[2][v]$ can be expressed as follows.

[Math. 835]

$$H_{p2,comp}[2][1]=1 \quad (217\text{-}1)$$

For all v being an integer no smaller than two and no greater than 2×m×z, the following holds true:

$$H_{p2,comp}[2][v]=0 \quad (217\text{-}2)$$

<2> When a parity check polynomial satisfying zero of #0; second expression is expressed as provided in expression (197-2-2):

$H_{x,1,comp}[2][v]$ is expressed as follows.

[Math. 836]

When y is an integer no smaller than $R_{\#(0),1}+1$ and no greater than $r_{\#(0),1}$:

$$H_{x,1,comp}[2][1-\alpha_{\#(0),1,y}+(2\times m\times z)]=1 \quad (218\text{-}1)$$

For all v being an integer no smaller than one and no greater than 2×m×z satisfying $\{v\neq 1-\alpha_{\#(0),1,y}+(2\times m\times z)\}$ (where y is an integer no smaller than $R_{\#(0),1}+1$ and no greater than $r_{\#((0),1)}$), the following holds true:

$$H_{x,1,comp}[2][v]=0 \quad (218\text{-}2)$$

Considered in a similar manner, the following holds true for $H_{x,\Omega,comp}[2][v]$, where Ω is an integer no smaller than one and no greater than six.

[Math. 837]

When y is an integer no smaller than $R_{\#(0),\Omega}+1$ and no greater than $r_{\#(0),\Omega}$:

$$H_{x,\Omega,comp}[2][1-\alpha_{\#(0),\Omega,y}+(2\times m\times z)]=1 \quad (219\text{-}1)$$

For all v being an integer no smaller than one and no greater than 2×m×z satisfying $\{v\neq 1\}$ and $\{v\neq 1-\alpha_{\#(0),\Omega,y}+(2\times m\times z)\}$ (where y is an integer no smaller than $R_{\#(0),\Omega}+1$ and no greater than $r_{\#((0),\Omega)}$), the following holds true:

$$H_{x,\Omega,comp}[2][v]=0 \quad (219\text{-}2)$$

Further, $H_{x,7,comp}[2][v]$ is expressed as follows.

[Math. 838]

$$H_{x,7,comp}[2][1]=1 \quad (220\text{-}1)$$

When y is an integer no smaller than one and no greater than $R_{\#(0),7}$:

$$H_{x,7,comp}[2][1-\alpha_{\#(0),7,y}+(2\times m\times z)]=1 \quad (220\text{-}2)$$

For all v being an integer no smaller than one and no greater than 2×m×z satisfying $\{v\neq 1\}$ and $\{v\neq 1-\alpha_{\#(0),7,y}+(2\times m\times z)\}$ (where y is an integer no smaller than one and no greater than $R_{\#(0),7}$), the following holds true:

$$H_{x,7,comp}[2][v]=0 \quad (220\text{-}3)$$

Considered in a similar manner, the following holds true for $H_{x,w,comp}[2][v]$, where w is an integer no smaller than seven and no greater than thirteen.

[Math. 839]

$$H_{x,w,comp}[2][1]=1 \quad (221\text{-}1)$$

When y is an integer no smaller than one and no greater than $R_{\#(0),w}$:

$$H_{x,w,comp}[2][1-\alpha_{\#(0),w,y}+(2\times m\times z)]=1 \quad (221\text{-}2)$$

For all v being an integer no smaller than one and no greater than 2×m×z satisfying $\{v\neq 1\}$ and $\{v\neq 1-\alpha_{\#(0),w,y}+(2\times m\times z)\}$ (where y is an integer no smaller than one and no greater than $R_{\#(0),w}$), the following holds true:

$$H_{x,w,comp}[2][v]=0 \quad (221\text{-}3)$$

Further, $H_{p1,comp}[2][v]$ can be expressed as follows.

[Math. 840]

For all v being an integer no smaller than one and no greater than 2×m×z, the following holds true:

$$H_{p1,comp}[2][v]=0 \quad (222)$$

Further, $H_{p2,comp}[2][v]$ can be expressed as follows.

[Math. 841]

$$H_{p2,comp}[2][1]=1 \quad (223\text{-}1)$$

$$H_{p2,comp}[2][1-\beta_{\#(0),3}+(2\times m\times z)]=1 \quad (223\text{-}2)$$

For all v being an integer no smaller than one and no greater than 2×m×z satisfying $\{v\neq 1\}$ and $\{v\neq 1-\beta_{\#(0),3}+(2\times m\times z)\}$, the following holds true:

$$H_{p2,comp}[2][v]=0 \quad (223\text{-}3)$$

As already described above, the vector composed of row 2×g−1 of the parity check matrix $H_{pro\_m}$ is generated by using a parity check polynomial satisfying zero of #((g−1)%2m); first expression; and the vector composed of row 2×g of the parity check matrix $H_{pro\_m}$ is generated by using a parity check polynomial satisfying zero of #((g−1)%2m); second expression (where g is an integer no smaller than two and no greater than 2×m×z).

Accordingly, when g=2×f−1 (where f is an integer no smaller than two and no greater than m×z), a vector of row 2×(2×f−1)−1 of the parity check matrix $H_{pro\_m}$ for the LDPC-CC of coding rate 13/15 that uses an improved tail-biting scheme (an LDPC block code using an LDPC-CC) can be generated by using a parity check polynomial satisfying zero of #(((2×f−1)−1)%2m); first expression, or that is, by using a parity check polynomial satisfying zero provided by expression (197-1-1) or expression (197-1-2).

Further, a vector of row 2×(2×f−1) of the parity check matrix $H_{pro\_m}$ for the LDPC-CC of coding rate 13/15 that uses an improved tail-biting scheme (an LDPC block code using an LDPC-CC) can be generated by using a parity check polynomial satisfying zero of #(((2×f−1)−1)%2m); second expression, or that is, by using a parity check polynomial satisfying zero provided by expression (197-2-1) or expression (197-2-2).

Further, when g=2×f (where f is an integer no smaller than one and no greater than m×z), a vector of row 2×(2×f)−1 of the parity check matrix $H_{pro\_m}$ for the LDPC-CC of coding rate 13/15 that uses an improved tail-biting scheme (an LDPC block code using an LDPC-CC) can be generated by using a parity check polynomial satisfying zero of #(((2×f)−1)%2m); first expression, or that is, by using a parity check polynomial satisfying zero provided by expression (198-1-1) or expression (198-1-2).

Further, a vector of row 2×(2×f) of the parity check matrix $H_{pro\_m}$ for the LDPC-CC of coding rate 13/15 that uses an improved tail-biting scheme (an LDPC block code using an LDPC-CC) can be generated by using a parity check polynomial satisfying zero of #(((2×f)−1)%2m); second expression, or that is, by using a parity check polynomial satisfying zero provided by expression (198-2-1) or expression (198-2-2).

Accordingly, (1) when g=2×f−1 (where f is an integer no smaller than two and no greater than m×z), when a vector for row 2×(2×f−1)−1 of the parity check matrix $H_{pro\_m}$, which is for the LDPC-CC of coding rate 13/15 that uses an improved tail-biting scheme (an LDPC block code using an LDPC-CC), can be generated by using a parity check polynomial satisfying zero provided by expression (197-1-1), ((2×f−1)−1)%2m=2c holds true. Accordingly, a parity check polynomial satisfying zero of expression (197-1-1) where 2i=2c holds true (where c is an integer no smaller than zero and no greater than m−1).

Accordingly, components $H_{x,1,comp}[2\times g-1][v]=H_{x,1,comp}[2\times(2\times f-1)-1][v]$, $H_{x,2,comp}[2\times g-1][v]=H_{x,2,comp}[2\times(2\times f-1)-1][v]$, $H_{x,3,comp}[2\times g-1][v]=H_{x,3,comp}[2\times(2\times f-1)-1]$

[v], $H_{x,4,comp}[2\times g-1][v]=H_{x,4,comp}[2\times(2\times f-1)-1][v]$, $H_{x,5,comp}[2\times g-1][v]=H_{x,5,comp}[2\times(2\times f-1)-1][v]$, $H_{x,6,comp}[2\times g-1][v]=H_{x,6,comp}[2\times(2\times f-1)-1][v]$, $H_{x,7,comp}[2\times g-1][v]=H_{x,7,comp}[2\times(2\times f-1)-1][v]$, $H_{x,8,comp}[2\times g-1][v]=H_{x,8,comp}[2\times(2\times f-1)-1][v]$, $H_{x,9,comp}[2\times g-1][v]=H_{x,9,comp}[2\times(2\times f-1)-1][v]$, $H_{x,10,comp}[2\times g-1][v]=H_{x,10,comp}[2\times(2\times f-1)-1][v]$, $H_{x,11,comp}[2\times g-1][v]=H_{x,11,comp}[2\times(2\times f-1)-1][v]$, $H_{x,12,comp}[2\times g-1][v]=H_{x,12,comp}[2\times(2\times f-1)-1][v]$, $H_{x,13,comp}[2\times g-1][v]=H_{x,13,comp}[2\times(2\times f-1)-1][v]$, $H_{p1,comp}[2\times g-1][v]=H_{p1,comp}[2\times(2\times f-1)-1][v]$, and $H_{p2,comp}[2\times g-1][v]=H_{p2,comp}[2\times(2\times f-1)-1][v]$ in row 2×g−1, or that is, row 2×(2×f−1)−1 of the parity check matrix $H_{pro\_m}$, which is for the LDPC-CC of coding rate 13/15 that uses an improved tail-biting scheme (an LDPC block code using an LDPC-CC), is expressed as follows.

First, the following holds true for $H_{x,1,comp}[2\times(2\times f-1)-1][v]$.

[Math. 842]

$$H_{x,1,comp}[2\times(2\times f-1)-1][((2\times f-1)-0-1)+1]=1 \quad (224\text{-}1)$$

When y is an integer no smaller than one and no greater than $R_{\#(2c),1}$, and $(2\times f-1)-\alpha_{\#(2c),1,y}-1\geq 0$:

$$H_{x,1,comp}[2\times(2\times f-1)-1][((2\times f-1)-\alpha_{\#(2c),1,y}-1)+1]=1 \quad (224\text{-}2)$$

When $(2\times f-1)-\alpha_{\#(2c),1,y}-1<0$:

$$H_{x,1,comp}[2\times(2\times f-1)-1][((2\times f-1)-\alpha_{\#(2c),1,y}-1)+1+(2\times m\times z)]=1 \quad (224\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),1,y}-1)+1\}$, and $\{v\neq((2\times f-1)-\alpha_{\#(2c),1,y}-1)+1+(2\times m\times z)\}$ (where y is an integer no smaller than one and no greater than $R_{\#(2c),1}$), the following holds true:

$$H_{x,1,comp}[2\times(2\times f-1)-1][v]=0 \quad (224\text{-}4)$$

Considered in a similar manner, the following holds true for $H_{x,w,comp}[2\times(2\times f-1)-1][v]$. In the following, w is an integer no smaller than one and no greater than six.

[Math. 843]

$$H_{x,w,comp}[2\times(2\times f-1)-1][((2\times f-1)-0-1)+1]=1 \quad (225\text{-}1)$$

When y is an integer no smaller than one and no greater than $R_{\#(2c),w}$, and $(2\times f-1)-\alpha_{\#(2c),w,y}-1\geq 0$:

$$H_{x,w,comp}[2\times(2\times f-1)-1][((2\times f-1)-\alpha_{\#(2c),w,y}-1)+1]=1 \quad (225\text{-}2)$$

When $(2\times f-1)-\alpha_{\#(2c),w,y}-1<0$:

$$H_{x,w,comp}[2\times(2\times f-1)-1][((2\times f-1)-\alpha_{\#(2c),w,y}-1)+1+(2\times m\times z)]=1 \quad (225\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),w,y}-1)+1\}$, and $\{v\neq((2\times f-1)-\alpha_{\#(2c),w,y}-1)+1+(2\times m\times z)\}$ (where y is an integer no smaller than one and no greater than $R_{\#(2c),w}$), the following holds true:

$$H_{x,w,comp}[2\times(2\times f-1)-1][v]=0 \quad (225\text{-}4)$$

Further, the following holds true for $H_{x,7,comp}[2\times(2\times f-1)-1][v]$. In the following, y is an integer no smaller than $R_{\#(2c),7}+1$ and no greater than $r_{\#(2c),7}$.

[Math. 844]

When $(2\times f-1)-\alpha_{\#(2c),7,y}-1\geq 0$:

$$H_{x,7,comp}[2\times(2\times f-1)-1][((2\times f-1)-\alpha_{\#(2c),7,y}-1)+1]=1 \quad (226\text{-}1)$$

When $(2\times f-1)-\alpha_{\#(2c),7,y}-1<0$:

$$H_{x,7,comp}[2\times(2\times f-1)-1][((2\times f-1)-\alpha_{\#(2c),7,y}-1)+1+(2\times m\times z)]=1 \quad (226\text{-}2)$$

For all v being an integer no smaller than one and no greater than 2×m×z satisfying $\{v\neq((2\times f-1)-\alpha_{\#(2c),7,y}-1)+1\}$, and $\{v\neq((2\times f-1)-\alpha_{\#(2c),7,y}-1)+1+(2\times m\times z)\}$ (where y is an integer no smaller than $R_{\#(2c),7}+1$ and no greater than $r_{\#(2c),7}$), the following holds true:

$$H_{x,7,comp}[2\times(2\times f-1)-1][v]=0 \quad (226\text{-}3)$$

Considered in a similar manner, the following holds true for $H_{x,\Omega,comp}[2\times(2\times f-1)-1][v]$. In the following, Ω is an integer no smaller than seven and no greater than thirteen, and y is an integer no smaller than $R_{\#(2c),\Omega}+1$ and no greater than $r_{\#(2c),\Omega}$.

[Math. 845]

When $(2\times f-1)-\alpha_{\#(2c),\Omega,y}-1\geq 0$:

$$H_{x,\Omega,comp}[2\times(2\times f-1)-1][((2\times f-1)-\alpha_{\#(2c),\Omega,y}-1)+1]=1 \quad (227\text{-}1)$$

When $(2\times f-1)-\alpha_{\#(2c),\Omega,y}-1<0$:

$$H_{x,\Omega,comp}[2\times(2\times f-1)-1][((2\times f-1)-\alpha_{\#(2c),\Omega,y}-1)+1+(2\times m\times z)]=1 \quad (227\text{-}2)$$

For all v being an integer no smaller than one and no greater than 2×m×z satisfying $\{v\neq((2\times f-1)-\alpha_{\#(2c),\Omega,y}-1)+1\}$ and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)-1][v]=0 \quad (227\text{-}3)$$

Further, the following holds true for $H_{p1,comp}[2\times(2\times f-1)-1][v]$.

[Math. 846]

$$H_{p1,comp}[2\times(2\times f-1)-1][((2\times f-1)-0-1)+1]=1 \quad (228\text{-}1)$$

For all v being an integer no smaller than one and no greater than 2×m×z satisfying $\{v\neq((2\times f-1)-0-1)+1\}$, the following holds true:

$$H_{p1,comp}[2\times(2\times f-1)-1][v]=0 \quad (228\text{-}2)$$

Further, the following holds true for $H_{p2,comp}[2\times(2\times f-1)-1][v]$.

[Math. 847]

When $(2\times f-1)-\beta_{\#(2c),0}-1\geq 0$:

$$H_{p2,comp}[2\times(2\times f-1)-1][((2\times f-1)-\beta_{\#(2c),0}-1)+1]=1 \quad (229\text{-}1)$$

When $(2\times f-1)-\beta_{\#(2c),0}-1<0$:

$$H_{p2,comp}[2\times(2\times f-1)-1][((2\times f-1)-\beta_{\#(2c),0}-1)+1+(2\times m\times z)]=1 \quad (229\text{-}2)$$

For all v being an integer no smaller than one and no greater than 2×m×z satisfying $\{v\neq((2\times f-1)-\beta_{\#(2c),0}-1)+1\}$ and $\{v\neq((2\times f-1)-\beta_{\#(2c),0}-1)+1+(2\times m\times z)\}$, the following holds true:

$$H_{p2,comp}[2\times(2\times f-1)-1][v]=0 \quad (229\text{-}3)$$

Further, (2) when g=2×f−1 (where f is an integer no smaller than two and no greater than m×z), when a vector for row 2×(2×f−1)−1 of the parity check matrix $H_{pro\_m}$, which is for the LDPC-CC of coding rate 13/15 that uses an improved tail-biting scheme (an LDPC block code using an LDPC-CC), can be generated by using a parity check polynomial satisfying zero provided by expression (197-1-2), ((2×f−1)−1)%2m=2c holds true. Accordingly, a parity check polynomial satisfying zero of expression (197-1-2) where 2i=2c holds true (where c is an integer no smaller than zero and no greater than m−1).

Accordingly, components $H_{x,1,comp}[2\times g-1][v]=H_{x,1,comp}[2\times(2\times f-1)-1][v]$, $H_{x,2,comp}[2\times g-1][v]=H_{x,2,comp}[2\times(2\times f-1)-1][v]$, $H_{x,3,comp}[2\times g-1][v]=H_{x,3,comp}[2\times(2\times f-1)-1][v]$, $H_{x,4,comp}[2\times g-1][v]=H_{x,4,comp}[2\times(2\times f-1)-1][v]$, $H_{x,5,comp}[2\times g-1][v]=H_{x,5,comp}[2\times(2\times f-1)-1][v]$, $H_{x,6,comp}[2\times g-1][v]=H_{x,6,comp}[2\times(2\times f-1)-1][v]$, $H_{x,7,comp}[2\times g-1][v]=H_{x,7,comp}[2\times(2\times f-1)-1][v]$, $H_{x,8,comp}[2\times g-1][v]=H_{x,8,comp}[2\times(2\times f-1)-1][v]$, $H_{x,9,comp}[2\times g-1][v]=H_{x,9,comp}[2\times(2\times f-$ 1)−1][v], $H_{x,10,comp}[2\times g-1][v]=H_{x,10,comp}[2\times(2\times f-1)-1][v]$, $H_{x,11,comp}[2\times g-1][v]=H_{x,11,comp}[2\times(2\times f-1)-1][v]$, $H_{x,12,comp}[2\times g-1][v]=H_{x,12,comp}[2\times(2\times f-1)-1][v]$, $H_{x,13,comp}[2\times g-1][v]=H_{x,13,comp}[2\times(2\times f-1)-1][v]$, $H_{p1,comp}[2\times g-1][v]=H_{p1,comp}[2\times(2\times f-1)-1][v]$, and $H_{p2,comp}[2\times g-1][v]=H_{p2,comp}[2\times(2\times f-1)-1][v]$ in row 2×g−1, or that is, row 2×(2×f−1)−1 of the parity check matrix $H_{pro\_m}$, which is for the LDPC-CC of coding rate 13/15 that uses an improved tail-biting scheme (an LDPC block code using an LDPC-CC), is expressed as follows.

First, the following holds true for $H_{x,1,comp}[2\times(2\times f-1)-1][v]$

[Math. 848]

$$H_{x,1,comp}[2\times(2\times f-1)-1][((2\times f-1)-0-1)+1]=1 \quad (230\text{-}1)$$

When y is an integer no smaller than one and no greater than $R_{\#(2c),1}$, and $(2\times f-1)-\alpha_{\#(2c),1,y}-1\geq 0$:

$$H_{x,1,comp}[2\times(2\times f-1)-1][((2\times f-1)-\alpha_{\#(2c),1,y}-1)+1]=1 \quad (230\text{-}2)$$

When $(2\times f-1)-\alpha_{\#(2c),1,y}-1<0$:

$$H_{x,1,comp}[2\times(2\times f-1)-1][((2\times f-1)-\alpha_{\#(2c),1,y}-1)+1+(2\times m\times z)]=1 \quad (230\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),1,y}-1)+1\}$, and $\{v\neq((2\times f-1)-\alpha_{\#(2c),1,y}-1)+1+(2\times m\times z)\}$ (where y is an integer no smaller than one and no greater than $R_{\#(2c),1}$), the following holds true:

$$H_{x,1,comp}[2\times(2\times f-1)-1][v]=0 \quad (230\text{-}4)$$

Considered in a similar manner, the following holds true for $H_{x,w,comp}[2\times(2\times f-1)-1][v]$. In the following, w is an integer no smaller than one and no greater than six.

[Math. 849]

$$H_{x,w,comp}[2\times(2\times f-1)-1][((2\times f-1)-0-1)+1]=1 \quad (231\text{-}1)$$

When y is an integer no smaller than one and no greater than $R_{\#(2c),w}$, and $(2\times f-1)-\alpha_{\#(2c),w,y}-1\geq 0$:

$$H_{x,w,comp}[2\times(2\times f-1)-1][((2\times f-1)-\alpha_{\#(2c),w,y}-1)+1]=1 \quad (231\text{-}2)$$

When $(2\times f-1)-\alpha_{\#(2c),w,y}-1<0$:

$$H_{x,w,comp}[2\times(2\times f-1)-1][((2\times f-1)-\alpha_{\#(2c),w,y}-1)+1+(2\times m\times z)]=1 \quad (231\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),w,y}-1)+1\}$, and $\{v\neq((2\times f-1)-\alpha_{\#(2c),w,y}-1)+1+(2\times m\times z)\}$ (where y is an integer no smaller than one and no greater than $R_{\#(2c),w}$), the following holds true:

$$H_{x,w,comp}[2\times(2\times f-1)-1][v]=0 \quad (231\text{-}4)$$

Further, the following holds true for $H_{x,7,comp}[2\times(2\times f-1)-1][v]$. In the following, y is an integer no smaller than $R_{\#(2c),7}+1$ and no greater than $r_{\#(2c),7}$.

[Math. 850]

When $(2\times f-1)-\alpha_{\#(2c),7,y}-1\geq 0$:

$$H_{x,7,comp}[2\times(2\times f-1)-1][((2\times f-1)-\alpha_{\#(2c),7,y}-1)+1]=1 \quad (232\text{-}1)$$

When $(2\times f-1)-\alpha_{\#(2c),7,y}-1\geq 0$:

$$H_{x,7,comp}[2\times(2\times f-1)-1][((2\times f-1)-\alpha_{\#(2c),7,y}-1)+1+(2\times m\times z)]=1 \quad (232\text{-}2)$$

For all v being an integer no smaller than one and no greater than 2×m×z satisfying $\{v\neq((2\times f-1)-\alpha_{\#(2c),7,y}-1)+1\}$, and $\{v\neq((2\times f-1)-\alpha_{\#(2c),7,y}-1)+1+(2\times m\times z)\}$ (where y is an integer no smaller than $R_{\#(2c),7}+1$ and no greater than $r_{\#(2c),7}$), the following holds true:

$$H_{x,7,comp}[2\times(2\times f-1)-1][v]=0 \quad (232\text{-}3)$$

Considered in a similar manner, the following holds true for $H_{x,\Omega,comp}[2\times(2\times f-1)-1][v]$. In the following, Ω is an integer no smaller than seven and no greater than thirteen, and y is an integer no smaller than $R_{\#(2c),\Omega}+1$ and no greater than $r_{\#(2c),\Omega}$.

[Math. 851]

When $(2\times f-1)-\alpha_{\#(2c),\Omega,y}-1<0$:

$$H_{x,\Omega,comp}[2\times(2\times f-1)-1][((2\times f-1)-\alpha_{\#(2c),\Omega,y}-1)+1]=1 \quad (233\text{-}1)$$

When $(2\times f-1)-\alpha_{\#(2c),\Omega,y}-1<0$:

$$H_{x,\Omega,comp}[2\times(2\times f-1)-1][((2\times f-1)-\alpha_{\#(2c),\Omega,y}-1)+1+(2\times m\times z)]=1 \quad (233\text{-}2)$$

For all v being an integer no smaller than one and no greater than 2×m×z satisfying $\{v\neq(2\times f-1)-\alpha_{\#(2c),\Omega,y}-1)+1\}$ and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)-1][v]=0 \quad (233\text{-}3)$$

Further, the following holds true for $H_{p1,comp}[2\times(2\times f-1)-1][v]$.

[Math. 852]

$$H_{p1,comp}[2\times(2\times f-1)-1][((2\times f-1)-0-1)+1]=1 \quad (234\text{-}1)$$

When $(2\times f-1)-\beta_{\#(2c),1}-1\geq 0$:

$$H_{p1,comp}[2\times(2\times f-1)-1][((2\times f-1)-\beta_{\#(2c),1}-1)+1]=1 \quad (234\text{-}2)$$

When $(2\times f-1)-\beta_{\#(2c),1}-1<0$:

$$H_{p1,comp}[2\times(2\times f-1)-1][((2\times f-1)-\beta_{\#(2c),1}-1)+1+(2\times m\times z)]=1 \quad (234\text{-}3)$$

For all v being an integer no smaller than one and no greater than 2×m×z satisfying $\{v\neq((2\times f-1)-0-1)+1\}$, $\{v\neq((2\times f-1)-\beta_{\#(2c),1}-1)+1\}$, and $\{v\neq((2\times f-1)-\beta_{\#(2c),1}-1)+1+(2\times m\times z)\}$, the following holds true:

$$H_{p1,comp}[2\times(2\times f-1)-1][v]=0 \quad (234\text{-}4)$$

Further, the following holds true for $H_{p2,comp}[2\times(2\times f-1)-1][v]$.

[Math. 853]

For all v being an integer no smaller than one and no greater than 2×m×z, the following holds true:

$$H_{p2,comp}[2\times(2\times f-1)-1][v]=0 \quad (235)$$

Further, (3) when g=2×f−1 (where f is an integer no smaller than two and no greater than m×z), when a vector for row 2×(2×f−1) of the parity check matrix $H_{pro\_m}$, which is for the LDPC-CC of coding rate 13/15 that uses an improved tail-biting scheme (an LDPC block code using an LDPC-CC), can be generated by using a parity check polynomial satisfying zero provided by expression (197-2-1), ((2×f−1)−1)%2m=2c holds true. Accordingly, a parity check polynomial satisfying zero of expression (197-2-1) where 2i=2c holds true (where c is an integer no smaller than zero and no greater than m−1).

Accordingly, components $H_{x,1,comp}[2\times g][v]=H_{x,1,comp}[2\times(2\times f-1)][v]$, $H_{x,2,comp}[2\times g][v]=H_{x,2,comp}[2\times(2\times f-1)][v]$, $H_{x,3,comp}[2\times g][v]H_{x,3,comp}[2\times(2\times f-1)][v]$, $H_{x,4,comp}[2\times g][v]=H_{x,4,comp}[2\times(2\times f-1)][v]$, $H_{x,5,comp}[2\times g][v]H_{x,5,comp}[2\times(2\times f-1)][v]$, $H_{x,6,comp}[2\times g][v]=H_{x,6,comp}[2\times(2\times f-1)][v]$, $H_{x,7,comp}[2\times g][v]H_{x,7,comp}[2\times(2\times f-1)][v]$, $H_{x,8,comp}[2\times g][v]=H_{x,8,comp}[2\times(2\times f-1)][v]$, $H_{x,9,comp}[2\times g][v]H_{x,9,comp}[2\times(2\times f-1)][v]$, $H_{x,10,comp}[2\times g][v]=H_{x,10,comp}[2\times(2\times f-1)][v]$, $H_{x,11,comp}[2\times g][v]=H_{x,11,comp}[2\times(2\times f-1)][v]$, $H_{x,12,comp}[2\times g][v]=H_{x,12,comp}[2\times(2\times f-1)][v]$, $H_{x,13,comp}[2\times g][v]=H_{x,13,comp}[2\times(2\times f-1)][v]$, $H_{p1,comp}[2\times g][v]=H_{p1,comp}[2\times(2\times f-1)][v]$, and $H_{p2,comp}[2\times g][v]=H_{p2,comp}[2\times(2\times f-1)][v]$ in row 2×g, or that is, row 2×(2×f−1) of the parity check matrix $H_{pro\_m}$, which is for the LDPC-CC of coding rate 13/15 that uses an improved tail-biting scheme (an LDPC block code using an LDPC-CC), is expressed as follows.

First, the following holds true for $H_{x,1,comp}[2\times(2\times f-1)][v]$. In the following, y is an integer no smaller than $R_{\#(2c),1}+1$ and no greater than $r_{\#(2c),1}$.

[Math. 854]

When $(2\times f-1)-\alpha_{\#(2c),1,y}-1\geq 0$:

$$H_{x,1,comp}[2\times(2\times f-1)][((2\times f-1)-\alpha_{\#(2c),1,y}-1)+1]=1 \quad (236\text{-}1)$$

When $(2\times f-1)-\alpha_{\#(2c),1,y}-1<0$:

$$H_{x,1,comp}[2\times(2\times f-1)][((2\times f-1)-\alpha_{\#(2c),1,y}-1)+1+(2\times m\times z)]=1 \quad (236\text{-}2)$$

For all v being an integer no smaller than one and no greater than $2\times m\times z$ satisfying $\{v\neq((2\times f-1)-\alpha_{\#(2c),1,y}-1)+1\}$ and $\{v\neq((2\times f-1)-\alpha_{\#(2c),1,y}-1)+1+(2\times m\times z)\}$ (where y is an integer no smaller than $R_{\#(2c),1}+1$ and no greater than $r_{\#(2c),1}$), the following holds true:

$$H_{x,1,comp}[2\times(2\times f-1)][v]=0 \quad (236\text{-}3)$$

Considered in a similar manner, the following holds true for $H_{x,\Omega,comp}[2\times(2\times f-1)][v]$. In the following, $\Omega$ is an integer no smaller than one and no greater than six, and y is an integer no smaller than $R_{\#(2c),\Omega}+1$ and no greater than $r_{\#(2c),\Omega}$.

[Math. 855]

When $(2\times f-1)-\alpha_{\#(2c),\Omega,y}-1\geq 0$:

$$H_{x,\Omega,comp}[2\times(2\times f-1)][((2\times f-1)-\alpha_{\#(2c),\Omega,y}-1)+1]=1 \quad (237\text{-}1)$$

When $(2\times f-1)-\alpha_{\#(2c),\Omega,y}-1<0$:

$$H_{x,\Omega,comp}[2\times(2\times f-1)][((2\times f-1)-\alpha_{\#(2c),\Omega,y}-1)+1+(2\times m\times z)]=1 \quad (237\text{-}2)$$

For all v being an integer no smaller than one and no greater than $2\times m\times z$ satisfying $\{v\neq((2\times f-1)-\alpha_{\#(2c),\Omega,y}-1)+1\}$, and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)][v]=0 \quad (237\text{-}3)$$

Further, the following holds true for $H_{x,7,comp}[2\times(2\times f-1)][v]$.

[Math. 856]

$$H_{x,7,comp}[2\times(2\times f-1)][((2\times f-1)-0-1)+1]=1 \quad (238\text{-}1)$$

When y is an integer no smaller than one and no greater than $R_{\#(2c),7}$, and $(2\times f-1)-\alpha_{\#(2c),7,y}-1\geq 0$:

$$H_{x,7,comp}[2\times(2\times f-1)][((2\times f-1)-\alpha_{\#(2c),7,y}-1)+1]=1 \quad (238\text{-}2)$$

When $(2\times f-1)-\alpha_{\#(2c),7,y}-1<0$:

$$H_{x,7,comp}[2\times(2\times f-1)][((2\times f-1)-\alpha_{\#(2c),7,y}-1)+1+(2\times m\times z)]=1 \quad (238\text{-}3)$$

For all v being an integer no smaller than one and no greater than $2\times m\times z$ satisfying $\{v\neq((2\times f-1)-0-1)+1\}$, $\{v\neq((2\times f-1)-\alpha_{\#(2c),7,y}-1)+1\}$, and $\{v\neq((2\times f-1)-\alpha_{\#(2c),7,y}-1)+1+(2\times m\times z)\}$ (where y is an integer no smaller than one and no greater than $R_{\#(2c),7}$), the following holds true:

$$H_{x,7,comp}[2\times(2\times f-1)][v]=0 \quad (238\text{-}4)$$

Considered in a similar manner, the following holds true for $H_{x,w,comp}[2\times(2\times f-1)][v]$. In the following, w is an integer no smaller than seven and no greater than thirteen.

[Math. 857]

$$H_{x,w,comp}[2\times(2\times f-1)][((2\times f-1)-0-1)+1]=1 \quad (239\text{-}1)$$

When y is an integer no smaller than one and no greater than $R_{\#(2c),w}$, and $(2\times f-1)-\alpha_{\#(2c),w,y}-1\geq 0$:

$$H_{x,w,comp}[2\times(2\times f-1)][((2\times f-1)-\alpha_{\#(2c),w,y}-1)+1]=1 \quad (239\text{-}2)$$

When $(2\times f-1)-\alpha_{\#(2c),w,y}-1<0$:

$$H_{x,w,comp}[2\times(2\times f-1)][((2\times f-1)-\alpha_{\#(2c),w,y}-1)+1+(2\times m\times z)]=1 \quad (239\text{-}3)$$

For all v being an integer no smaller than one and no greater than $2\times m\times z$ satisfying $\{v\neq((2\times f-1)-0-1)+1\}$, $\{v\neq((2\times f-1)-\alpha_{\#(2c),w,y}-1)+1\}$, and $\{v\neq((2\times f-1)-\alpha_{\#(2c),w,y}-1)+1+(2\times m\times z)\}$ (where y is an integer no smaller than one and no greater than $R_{\#(2c),w}$), the following holds true:

$$H_{x,w,comp}[2\times(2\times f-1)][v]=0 \quad (239\text{-}4)$$

Further, the following holds true for $H_{p1,comp}[2\times(2\times f-1)][v]$.

[Math. 858]

When $(2\times f-1)-\beta_{\#(2c),2}-1\geq 0$:

$$H_{p1,comp}[2\times(2\times f-1)][((2\times f-1)-\beta_{\#(2c),2}-1)+1]=1 \quad (240\text{-}1)$$

When $(2\times f-1)-\beta_{\#(2c),2}-1<0$:

$$H_{p1,comp}[2\times(2\times f-1)][((2\times f-1)-\beta_{\#(2c),2}-1)+1+(2\times m\times z)]=1 \quad (240\text{-}2)$$

For all v being an integer no smaller than one and no greater than $2\times m\times z$ satisfying $\{v\neq((2\times f-1)-\beta_{\#(2c),2}-1)+1\}$ and $\{v\neq((2\times f-1)-\beta_{\#(2c),2}-1)+1+(2\times m\times z)\}$, the following holds true:

$$H_{p1,comp}[2\times(2\times f-1)][v]=0 \quad (240\text{-}3)$$

Further, the following holds true for $H_{p2,comp}[2\times(2\times f-1)][v]$.

[Math. 859]

$$H_{p2,comp}[2\times(2\times f-1)][((2\times f-1)-0-1)+1]=1 \quad (241\text{-}1)$$

For all v being an integer no smaller than one and no greater than $2\times m\times z$ satisfying $\{v\neq((2\times f-1)-0-1)+1\}$, the following holds true:

$$H_{p2,comp}[2\times(2\times f-1)][v]=0 \quad (241\text{-}2)$$

Further, (4) when $g=2\times f-1$ (where f is an integer no smaller than two and no greater than $m\times z$), when a vector for row $2\times(2\times f-1)$ of the parity check matrix $H_{pro\_m}$, which is for the LDPC-CC of coding rate 13/15 that uses an improved tail-biting scheme (an LDPC block code using an LDPC-CC), can be generated by using a parity check polynomial satisfying zero provided by expression (197-2-2), $((2\times f-1)-1)\%2m=2c$ holds true. Accordingly, a parity check polynomial satisfying zero of expression (197-2-2) where $2i=2c$ holds true (where c is an integer no smaller than zero and no greater than $m-1$).

Accordingly, components $H_{x,1,comp}[2\times g][v]=H_{x,1,comp}[2\times(2\times f-1)][v]$, $H_{x,2,comp}[2\times g][v]=H_{x,2,comp}[2\times(2\times f-1)][v]$, $H_{x,3,comp}[2\times g][v]=H_{x,3,comp}[2\times(2\times f-1)][v]$, $H_{x,4,comp}[2\times g][v]=H_{x,4,comp}[2\times(2\times f-1)][v]$, $H_{x,5,comp}[2\times g][v]=H_{x,5,comp}[2\times(2\times f-1)][v]$, $H_{x,6,comp}[2\times g][v]=H_{x,6,comp}[2\times(2\times f-1)][v]$, $H_{x,7,comp}[2\times g][v]=H_{x,7,comp}[2\times(2\times f-1)][v]$, $H_{x,8,comp}[2\times g][v]=H_{x,8,comp}[2\times(2\times f-1)][v]$, $H_{x,9,comp}[2\times g][v]=H_{x,9,comp}[2\times(2\times f-1)][v]$, $H_{x,10,comp}[2\times g][v]=H_{x,10,comp}[2\times(2\times f-1)][v]$, $H_{x,11,comp}[2\times g][v]=H_{x,11,comp}[2\times(2\times f-1)][v]$, $H_{x,12,comp}[2\times g][v]=H_{x,12,comp}[2\times(2\times f-1)][v]$, $H_{x,13,comp}[2\times g][v]=H_{x,13,comp}[2\times(2\times f-1)][v]$, $H_{p1,comp}[2\times g][v]=H_{p1,comp}[2\times(2\times f-1)][v]$, and $H_{p2,comp}[2\times g][v]=H_{p2,comp}[2\times(2\times f-1)][v]$ in row $2\times g$, or that is, row $2\times(2\times f-1)$ of the parity check matrix $H_{pro\_m}$ which is for the LDPC-CC of coding rate 13/15 that uses an improved tail-biting scheme (an LDPC block code using an LDPC-CC), is expressed as follows.

First, the following holds true for $H_{x,1,comp}[2\times(2\times f-1)][v]$. In the following, y is an integer no smaller than $R_{\#(2c),1}+1$ and no greater than $r_{\#(2c),1}$.

[Math. 860]

When $(2\times f-1)-\alpha_{\#(2c),1,y}-1\geq 0$:

$$H_{x,1,comp}[2\times(2\times f-1)][((2\times f-1)-\alpha_{\#(2c),1,y}-1)+1]=1 \quad (242\text{-}1)$$

When $(2\times f-1)-\alpha_{\#(2c),1,y}-1<0$:

$$H_{x,1,comp}[2\times(2\times f-1)][((2\times f-1)-\alpha_{\#(2c),1,y}-1)+1+(2\times m\times z)]=1 \quad (242\text{-}2)$$

For all v being an integer no smaller than one and no greater than 2×m×z satisfying $\{v\neq((2\times f-1)-\alpha_{\#(2c),1,y}-1)+1\}$ and $\{v\neq((2\times f-1)-\alpha_{\#(2c),1,y}-1)+1+(2\times m\times z)\}$ (where y is an integer no smaller than $R_{\#(2c),1}+1$ and no greater than $r_{\#(2c),1}$), the following holds true:

$$H_{x,1,comp}[2\times(2\times f-1)][v]=0 \quad (242\text{-}3)$$

Considered in a similar manner, the following holds true for $H_{x,\Omega,comp}[2\times(2\times f-1)][v]$. In the following, Ω is an integer no smaller than one and no greater than six, and y is an integer no smaller than $R_{\#(2c),\Omega}+1$ and no greater than $r_{\#(2c),\Omega}$.

[Math. 861]

When $(2\times f-1)-\alpha_{\#(2c),\Omega,y}-1\geq 0$:

$$H_{x,\Omega,comp}[2\times(2\times f-1)][((2\times f-1)-\alpha_{\#(2c),\Omega,y}-1)+1]=1 \quad (243\text{-}1)$$

When $(2\times f-1)-\alpha_{\#(2c),\Omega,y}-1<0$:

$$H_{x,\Omega,comp}[2\times(2\times f-1)][((2\times f-1)-\alpha_{\#(2c),\Omega,y}-1)+1+(2\times m\times z)]=1 \quad (243\text{-}2)$$

For all v being an integer no smaller than one and no greater than 2×m×z satisfying $\{v\neq((2\times f-1)-\alpha_{\#(2c),\Omega,y}-1)+1\}$, and $\{v\neq((2\times f-1)-\alpha_{\#(2c),\Omega,y}-1)+1+(2\times m\times z)\}$ (where y is an integer no smaller than $R_{\#(2c),\Omega}+1$ and no greater than $r_{\#(2c),\Omega}$), the following holds true:

$$H_{x,\Omega,comp}[2\times(2\times f-1)][v]=0 \quad (243\text{-}3)$$

Further, the following holds true for $H_{x,7,comp}[2\times(2\times f-1)][v]$.

[Math. 862]

$$H_{x,7,comp}[2\times(2\times f-1)][((2\times f-1)-0-1)+1]=1 \quad (244\text{-}1)$$

When y is an integer no smaller than one and no greater than $R_{\#(2c),7}$, and $(2\times f-1)-\alpha_{\#(2c),7,y}-1\geq 0$:

$$H_{x,7,comp}[2\times(2\times f-1)][((2\times f-1)-\alpha_{\#(2c),7,y}-1)+1]=1 \quad (244\text{-}2)$$

When $(2\times f-1)-\alpha_{\#(2c),7,y}-1<0$:

$$H_{x,3,comp}[2\times(2\times f-1)][((2\times f-1)-\alpha_{\#(2c),7,y}-1)+1+(2\times m\times z)]=1 \quad (244\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),7,y}-1)+1\}$, and $\{v\neq((2\times f-1)-\alpha_{\#(2c),7,y}-1)+1+(2\times m\times z)\}$ (where y is an integer no smaller than one and no greater than $R_{\#(2c),7}$), the following holds true:

$$H_{x,7,comp}[2\times(2\times f-1)][v]=0 \quad (244\text{-}4)$$

Considered in a similar manner, the following holds true for $H_{x,w,comp}[2\times(2\times f-1)][v]$. In the following, w is an integer no smaller than seven and no greater than thirteen.

[Math. 863]

$$H_{x,w,comp}[2\times(2\times f-1)][((2\times f-1)-0-1)+1]=1 \quad (245\text{-}1)$$

When y is an integer no smaller than one and no greater than $R_{\#(2c),w}$, and $(2\times f-1)-\alpha_{\#(2c),w,y}-1\geq 0$:

$$H_{x,w,comp}[2\times(2\times f-1)][((2\times f-1)-\alpha_{\#(2c),w,y}-1)+1]=1 \quad (245\text{-}2)$$

When $(2\times f-1)-\alpha_{\#(2c),w,y}-1<0$:

$$H_{x,w,comp}[2\times(2\times f-1)][((2\times f-1)-\alpha_{\#(2c),w,y}-1)+1+(2\times m\times z)]=1 \quad (245\text{-}3)$$

For all v being an integer no smaller than one and no greater than 2×m×z satisfying $\{v\neq((2\times f-1)-0-1)+1\}$, $\{v\neq((2\times f-1)-\alpha_{\#(2c),w,y}-1)+1\}$, and $\{v\neq((2\times f-1)-\alpha_{\#(2c),w,y}-1)+1+(2\times m\times z)\}$ (where y is an integer no smaller than one and no greater than $R_{\#(2c),w}$), the following holds true:

$$H_{x,w,comp}[2\times(2\times f-1)][v]=0 \quad (245\text{-}4)$$

Further, the following holds true for $H_{p1,comp}[2\times(2\times f-1)][v]$.

[Math. 864]

For all v being an integer no smaller than one and no greater than 2×m×z, the following holds true:

$$H_{p1,comp}[2\times(2\times f-1)][v]=0 \quad (246)$$

Further, the following holds true for $H_{p2,comp}[2\times(2\times f-1)][v]$.

[Math. 865]

$$H_{p2,comp}[2\times(2\times f-1)][((2\times f-1)-0-1)+1]=1 \quad (247\text{-}1)$$

When $(2\times f-1)-\beta_{\#(2c),3}-1\geq 0$:

$$H_{p2,comp}[2\times(2\times f-1)][((2\times f-1)-\beta_{\#(2c),3}-1)+1]=1 \quad (247\text{-}2)$$

When $(2\times f-1)-\beta_{\#(2c),3}-1<0$:

$$H_{p2,comp}[2\times(2\times f-1)][((2\times f-1)-\beta_{\#(2c),3}-1)+1+(2\times m\times z)]=1 \quad (247\text{-}3)$$

For all v being an integer no smaller than one and no greater than 2×m×z satisfying $\{v\neq((2\times f-1)-0-1)+1\}$, $\{v\neq((2\times f-1)-\beta_{\#(2c),3}-1)+1\}$, and $\{v\neq((2\times f-1)-\beta_{\#(2c),3}-1)+1+(2\times m\times z)\}$, the following holds true:

$$H_{p2,comp}[2\times(2\times f-1)][v]=0 \quad (247\text{-}4)$$

Further, (5) when g=2×f (where f is an integer no smaller than one and no greater than m×z), when a vector for row 2×(2×f)−1 of the parity check matrix $H_{pro\_m}$, which is for the LDPC-CC of coding rate 13/15 that uses an improved tail-biting scheme (an LDPC block code using an LDPC-CC), can be generated by using a parity check polynomial satisfying zero provided by expression (198-1-1), ((2×f)−1) %2m=2d+1 holds true. Accordingly, a parity check polynomial satisfying zero of expression (198-1-1) where 2i+1=2d+1 holds true (where d is an integer no smaller than zero and no greater than m−1).

Accordingly, components $H_{x,1,comp}[2\times g-1][v]=H_{x,1,comp}[2\times(2\times f)-1][v]$, $H_{x,2,comp}[2\times g-1][v]=H_{x,2,comp}[2\times(2\times f)-1][v]$, $H_{x,3,comp}[2\times g-1][v]=H_{x,3,comp}[2\times(2\times f)-1][v]$, $H_{x,4,comp}[2\times g-1][v]=H_{x,4,comp}[2\times(2\times f)-1][v]$, $H_{x,5,comp}[2\times g-1][v]=H_{x,5,comp}[2\times(2\times f)-1][v]$, $H_{x,6,comp}[2\times g-1][v]=H_{x,6,comp}[2\times(2\times f)-1][v]$, $H_{x,7,comp}[2\times g-1][v]=H_{x,7,comp}[2\times(2\times f)-1][v]$, $H_{x,8,comp}[2\times g-1][v]=H_{x,8,comp}[2\times(2\times f)-1][v]$, $H_{x,9,comp}[2\times g-1][v]=H_{x,9,comp}[2\times(2\times f)-1][v]$, $H_{x,10,comp}[2\times g-1][v]=H_{x,10,comp}[2\times(2\times f)-1][v]$, $H_{x,11,comp}[2\times g-1][v]=H_{x,11,comp}[2\times(2\times f)-1][v]$, $H_{x,12,comp}[2\times g-1][v]=H_{x,12,comp}[2\times(2\times f)-1][v]$, $H_{x,13,comp}[2\times g-1][v]=H_{x,13,comp}[2\times(2\times f)-1][v]$, $H_{p1,comp}[2\times g-1][v]=H_{p1,comp}[2\times(2\times f)-1][v]$, and $H_{p2,comp}[2\times g-1][v]=H_{p2,comp}[2\times(2\times f)-1][v]$ in row 2×g−1, or that is, row 2×(2×f)−1 of the parity check matrix $H_{pro\_m}$, which is for the LDPC-CC of coding rate 13/15 that uses an improved tail-biting scheme (an LDPC block code using an LDPC-CC), is expressed as follows.

First, the following holds true for $H_{x,1,comp}[2\times(2\times f)-1][v]$. In the following, y is an integer no smaller than $R_{\#(2d+1),1}+1$ and no greater than $r_{\#(2d+1),1}$.

[Math. 866]

When $(2\times f)-\alpha_{\#(2d+1),1,y}-1\geq 0$:

$$H_{x,1,comp}[2\times(2\times f)-1][((2\times f)-\alpha_{\#(2d+1),1,y}-1)+1]=1 \quad (248\text{-}1)$$

When $(2\times f)-\alpha_{\#(2d+1),1,y}-1<0$:

$$H_{x,1,comp}[2\times(2\times f)-1][((2\times f)-\alpha_{\#(2d+1),1,y}-1)+1+(2\times m\times z)]=1 \quad (248\text{-}2)$$

For all v being an integer no smaller than one and no greater than 2×m×z satisfying {v≠((2×f)−$\alpha_{\#(2d+1),1,y}$−1)+1} and {v≠((2×f)−$\alpha_{\#(2d+1),1,y}$−1)+1+(2×m×z)} (where y is an integer no smaller than $R_{\#(2d+1),1}$+1 and no greater than $r_{\#(2d+1),1}$), the following holds true:

$$H_{x,1,comp}[2\times(2\times f)-1][v]=0 \quad (248\text{-}3)$$

Considered in a similar manner, the following holds true for $H_{x,\Omega,comp}$[2×(2×f)−1)][v]. In the following, Ω is an integer no smaller than one and no greater than six, and y is an integer no smaller than $R_{\#(2d+1),\Omega}$+1 and no greater than $r_{\#(2d+1),\Omega}$.

[Math. 867]

When (2×f)−$\alpha_{\#(2d+1),\Omega,y}$−1≥0:

$$H_{x,\Omega,comp}[2\times(2\times f)-1][((2\times f)-\alpha_{\#(2d+1),\Omega,y}-1)+1]=1 \quad (249\text{-}1)$$

When (2×f)−$\alpha_{\#(2d+1),\Omega,y}$−1<0:

$$H_{x,\Omega,comp}[2\times(2\times f)-1][((2\times f)-\alpha_{\#(2d+1),\Omega,y}-1)+1+(2\times m\times z)]=1 \quad (249\text{-}2)$$

For all v being an integer no smaller than one and no greater than 2×m×z satisfying {v≠((2×f)−$\alpha_{\#(2d+1),\Omega,y}$−1)+1}, and {v≠((2×f)−$\alpha_{\#(2d+1),\Omega,y}$−1)+1+(2×m×z)} (where y is an integer no smaller than $R_{\#(2d+1),\Omega}$+1 and no greater than $r_{\#(2d+1),\Omega}$), the following holds true:

$$H_{x,\Omega,comp}[2\times(2\times f)-1][v]=0 \quad (249\text{-}3)$$

Further, the following holds true for $H_{x,7,comp}$[2×(2×f)−1][v].

[Math. 868]

$$H_{x,7,comp}[2\times(2\times f)-1][((2\times f)-0-1)+1]=1 \quad (250\text{-}1)$$

When y is an integer no smaller than one and no greater than $R_{\#(2d+1),7}$, and (2×f)−$\alpha_{\#(2d+1),7,y}$−1≥0:

$$H_{x,7,comp}[2\times(2\times f)-1][((2\times f)-\alpha_{\#(2d+1),7,y}-1)+1]=1 \quad (250\text{-}2)$$

When (2×f)−$\alpha_{\#(2d+1),7,y}$−1<0:

$$H_{x,7,comp}[2\times(2\times f)-1][((2\times f)-\alpha_{\#(2d+1),7,y}-1)+1+(2\times m\times z)]=1 \quad (250\text{-}3)$$

For all v being an integer no smaller than one and no greater than 2×m×z satisfying {v≠((2×f)−0−1)+1}, {v≠((2×f)−$\alpha_{\#(2d+1),7,y}$−1)+1}, and {v≠((2×f)−$\alpha_{\#(2d+1),7,y}$−1)+1+(2×m×z)} (where y is an integer no smaller than one and no greater than $R_{\#(2d+1),7}$), the following holds true:

$$H_{x,7,comp}[2\times(2\times f)-1][v]=0 \quad (250\text{-}4)$$

Considered in a similar manner, the following holds true for $H_{x,w,comp}$[2×(2×f)−1][v]. In the following, w is an integer no smaller than seven and no greater than thirteen.

[Math. 869]

$$H_{x,w,comp}[2\times(2\times f)-1][((2\times f)-0-1)+1]=1 \quad (251\text{-}1)$$

When y is an integer no smaller than one and no greater than $R_{\#(2d+1),w}$, and (2×f)−$\alpha_{\#(2d+1),w,y}$−1≥0:

$$H_{x,w,comp}[2\times(2\times f)-1][((2\times f)-\alpha_{\#(2d+1),w,y}-1)+1]=1 \quad (251\text{-}2)$$

When (2×f)−$\alpha_{\#(2d+1),w,y}$−1<0:

$$H_{x,w,comp}[2\times(2\times f)-1][((2\times f)-\alpha_{\#(2d+1),w,y}-1)+1+(2\times m\times z)]=1 \quad (251\text{-}3)$$

For all v being an integer no smaller than one and no greater than 2×m×z satisfying {v≠((2×f)−0−1)+1}, {v≠(2×f)−$\alpha_{\#(2d+1),w,y}$−1)+1}, and {v≠((2×f)−$\alpha_{\#(2d+1),w,y}$−1)+1+(2×m×z)} (where y is an integer no smaller than one and no greater than $R_{\#(2d+1),w}$), the following holds true:

$$H_{x,w,comp}[2\times(2\times f)-1][v]=0 \quad (251\text{-}4)$$

Further, the following holds true for $H_{p1,comp}$[2×(2×f)−1][v].

[Math. 870]

$$H_{p1,comp}[2\times(2\times f)-1][((2\times f)-0-1)+1]=1 \quad (252\text{-}1)$$

For all v being an integer no smaller than one and no greater than 2×m×z satisfying {v≠((2×f)−0−1)+1}, the following holds true:

$$H_{p1,comp}[2\times(2\times f)-1][v]=0 \quad (252\text{-}2)$$

Further, the following holds true for $H_{p2,comp}$[2×(2×f)−1][v].

[Math. 871]

When (2×f)−$\beta_{\#(2d+1),0}$−1≥0:

$$H_{p2,comp}[2\times(2\times f)-1][((2\times f)-\beta_{\#(2d+1),0}-1)+1]=1 \quad (253\text{-}1)$$

When (2×f)−$\beta_{\#(2d+1),0}$−1<0:

$$H_{p2,comp}[2\times(2\times f)-1][((2\times f)-\beta_{\#(2d+1),0}-1)+1+(2\times m\times z)]=1 \quad (253\text{-}2)$$

For all v being an integer no smaller than one and no greater than 2×m×z satisfying {v≠((2×f)−$\beta_{\#(2d+1),0}$−1)+1} and {v≠((2×f)−$\beta_{\#(2d+1),0}$−1)+1+(2×m×z)}, the following holds true:

$$H_{p2,comp}[2\times(2\times f)-1][v]=0 \quad (253\text{-}3)$$

Further, (6) when g=2×f (where f is an integer no smaller than one and no greater than m×z), when a vector for row 2×(2×f)−1 of the parity check matrix $H_{pro\_m}$, which is for the LDPC-CC of coding rate 13/15 that uses an improved tail-biting scheme (an LDPC block code using an LDPC-CC), can be generated by using a parity check polynomial satisfying zero provided by expression (198-1-2), ((2×f)−1) %2m=2d+1 holds true. Accordingly, a parity check polynomial satisfying zero of expression (198-1-2) where 2i+1=2d+1 holds true (where d is an integer no smaller than zero and no greater than m−1).

Accordingly, components $H_{x,1,comp}$[2×g−1][v]=$H_{x,1,comp}$[2×(2×f)−1][v], $H_{x,2,comp}$[2×g−1][v]=$H_{x,2,comp}$[2×(2×f)−1][v], $H_{x,3,comp}$[2×g−1][v]=$H_{x,3,comp}$[2×(2×f)−1][v], $H_{x,4,comp}$[2×g−1][v]=$H_{x,4,comp}$[2×(2×f)−1][v], $H_{x,5,comp}$[2×g−1][v]=$H_{x,5,comp}$[2×(2×f)−1][v], $H_{x,6,comp}$[2×g−1][v]=$H_{x,6,comp}$[2×(2×f)−1][v], $H_{x,7,comp}$[2×g−1][v]=$H_{x,7,comp}$[2×(2×f)−1][v], $H_{x,8,comp}$[2×g−1][v]=$H_{x,8,comp}$[2×(2×f)−1][v], $H_{x,9,comp}$[2×g−1][v]=$H_{x,9,comp}$[2×(2×f)−1][v], $H_{x,10,comp}$[2×g−1][v]=$H_{x,10,comp}$[2×(2×f)−1][v], $H_{x,11,comp}$[2×g−1][v]=$H_{x,11,comp}$[2×(2×f)−1][v], $H_{x,12,comp}$[2×g−1][v]=$H_{x,12,comp}$[2×(2×f)−1][v], $H_{x,13,comp}$[2×g−1][v]=$H_{x,13,comp}$[2×(2×f)−1][v], $H_{p1,comp}$[2×g−1][v]=$H_{p1,comp}$[2×(2×f)−1][v], and $H_{p2,comp}$[2×g−1][v]=$H_{p2,comp}$[2×(2×f)−1][v] in row 2×g−1, or that is, row 2×(2×f)−1 of the parity check matrix $H_{pro\_m}$, which is for the LDPC-CC of coding rate 13/15 that uses an improved tail-biting scheme (an LDPC block code using an LDPC-CC), is expressed as follows.

First, the following holds true for $H_{x,1,comp}$[2×(2×f)−1][v]. In the following, y is an integer no smaller than $R_{\#(2d+1),1}$+1 and no greater than $r_{\#(2d+1),1}$.

[Math. 872]

When (2×f)−$\alpha_{\#(2d+1),1,y}$−1≥0:

$$H_{x,1,comp}[2\times(2\times f)-1][((2\times f)-\alpha_{\#(2d+1),1,y}-1)+1]=1 \quad (254\text{-}1)$$

When (2×f)−$\alpha_{\#(2d+1),1,y}$−1<0:

$$H_{x,1,comp}[2\times(2\times f)-1][((2\times f)-\alpha_{\#(2d+1),1,y}-1)+1+(2\times m\times z)]=1 \quad (254\text{-}2)$$

For all v being an integer no smaller than one and no greater than 2×m×z satisfying {v≠((2×f)−$\alpha_{\#(2d+1),1,y}$−1)+1} and {v≠((2f)−$\alpha_{\#(2d+1),1,y}$−1)+1+(2×m×z)} (where y is an integer no smaller than $R_{\#(2d+1),1}$+1 and no greater than $r_{\#(2d+1),1}$), the following holds true:

$$H_{x,1,comp}[2\times(2\times f)-1][v]=0 \quad (254\text{-}3)$$

Considered in a similar manner, the following holds true for $H_{x,\Omega,comp}[2\times(2\times f)-1)][v]$. In the following, $\Omega$ is an integer no smaller than one and no greater than six, and y is an integer no smaller than $R_{\#(2d+1),\Omega}+1$ and no greater than $r_{\#(2d+1),\Omega}$.

[Math. 873]

When $(2\times f)-\alpha_{\#(2d+1),\Omega,y}-1\geq 0$:

$$H_{x,\Omega,comp}[2\times(2\times f)-1][((2\times f)-\alpha_{\#(2d+1),\Omega,y}-1)+1]=1 \tag{255-1}$$

When $(2\times f)-\alpha_{\#(2d+1),\Omega,y}-1<0$:

$$H_{x,\Omega,comp}[2\times(2\times f)-1][((2\times f)-\alpha_{\#(2d+1),\Omega,y}-1)+1+(2\times m\times z)]=1 \tag{255-2}$$

For all v being an integer no smaller than one and no greater than 2×m×z satisfying $\{v\neq((2\times f)-\alpha_{\#(2d+1),\Omega,y}-1)+1\}$, and $\{v\neq((2\times f)-\alpha_{\#(2d+1),\Omega,y}-1)+1+(2\times m\times z)\}$ (where y is an integer no smaller than $R_{\#(2d+1),\Omega}+1$ and no greater than $r_{\#(2d+1),\Omega}$), the following holds true:

$$H_{x,\Omega,comp}[2\times(2\times f)-1][v]=0 \tag{255-3}$$

Further, the following holds true for $H_{x,7,comp}[2\times(2\times f)-1][v]$.

[Math. 874]

$$H_{x,7,comp}[2\times(2\times f)-1][((2\times f)-0-1)+1]=1 \tag{256-1}$$

When y is an integer no smaller than one and no greater than $R_{\#(2d+1),7}$, and $(2\times f)-\alpha_{\#(2d+1),7,y}-1\geq 0$:

$$H_{x,7,comp}[2\times(2\times f)-1][((2\times f)-\alpha_{\#(2d+1),7,y}-1)+1]=1 \tag{256-2}$$

When $(2\times f)-\alpha_{\#(2d+1),7,y}-1<0$:

$$H_{x,7,comp}[2\times(2\times f)-1][((2\times f)-\alpha_{\#(2d+1),7,y}-1)+1+(2\times m\times z)]=1 \tag{256-3}$$

For all v being an integer no smaller than one and no greater than 2×m×z satisfying $\{v\neq((2\times f)-0-1)+1\}$, $\{v\neq((2\times f)-\alpha_{\#(2d+1),7,y}-1)+1\}$, and $\{v\neq((2\times f)-\alpha_{\#(2d+1),7,y}-1)+1+(2\times m\times z)\}$ (where y is an integer no smaller than one and no greater than $R_{\#(2d+1),7}$), the following holds true:

$$H_{x,7,comp}[2\times(2\times f)-1][v]=0 \tag{256-4}$$

Considered in a similar manner, the following holds true for $H_{x,w,comp}[2\times(2\times f)-1][v]$. In the following, w is an integer no smaller than seven and no greater than thirteen.

[Math. 875]

$$H_{x,w,comp}[2\times(2\times f)-1][((2\times f)-0-1)+1]=1 \tag{257-1}$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)-1][((2\times f)-\alpha_{\#(2d+1),w,y}-1)+1]=1 \tag{257-2}$$

When $(2\times f)-\alpha_{\#(2d+1),w,y}-1<0$:

$$H_{x,w,comp}[2\times(2\times f)-1][((2\times f)-\alpha_{\#(2d+1),w,y}-1)+1+(2\times m\times z)]=1 \tag{257-3}$$

For all v being an integer no smaller than one and no greater than 2×m×z satisfying $\{v\neq((2\times f)-0-1)+1\}$, $\{v\neq((2\times f)-\alpha_{\#(2d+1),w,y}-1)+1\}$, and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)-1][v]=0 \tag{257-4}$$

Further, the following holds true for $H_{p1,comp}[2\times(2\times f)-1][v]$.

[Math. 876]

$$H_{p1,comp}[2\times(2\times f)-1][((2\times f)-0-1)+1]=1 \tag{258-1}$$

When $(2\times f)-\beta_{\#(2d+1),1}-1\geq 0$:

$$H_{p1,comp}[2\times(2\times f)-1][((2\times f)-\beta_{\#(2d+1),1}-1)+1]=1 \tag{258-2}$$

When $(2\times f)-\beta_{\#(2d+1),1}-1<0$:

$$H_{p1,comp}[2\times(2\times f)-1][((2\times f)-\beta_{\#(2d+1),1}-1)+1+(2\times m\times z)]=1 \tag{258-3}$$

For all v being an integer no smaller than one and no greater than 2×m×z satisfying $\{v\neq((2\times f)-0-1)+1\}$, $\{v\neq((2\times f)-\beta_{\#(2d+1),1}-1)+1\}$, and $\{v\neq((2\times f)-\beta_{\#(2d+1),1}-1)+1+(2\times m\times z)\}$, the following holds true:

$$H_{p1,comp}[2\times(2\times f)-1][v]=0 \tag{258-4}$$

Further, the following holds true for $H_{p2,comp}[2\times(2\times f)-1][v]$.

[Math. 877]

For all v being an integer no smaller than one and no greater than 2×m×z, the following holds true:

$$H_{p2,comp}[2\times(2\times f)-1][v]=0 \tag{259}$$

Further, (7) when g=2×f (where f is an integer no smaller than one and no greater than m×z), when a vector for row 2×(2×f) of the parity check matrix $H_{pro\_m}$, which is for the LDPC-CC of coding rate 13/15 that uses an improved tail-biting scheme (an LDPC block code using an LDPC-CC), can be generated by using a parity check polynomial satisfying zero provided by expression (198-2-1), ((2×f)−1) %2m=2d+1 holds true. Accordingly, a parity check polynomial satisfying zero of expression (198-2-1) where 2i+1=2d+1 holds true (where d is an integer no smaller than zero and no greater than m−1).

Accordingly, components $H_{x,1,comp}[2\times g][v]=H_{x,1,comp}[2\times(2\times f)][v]$, $H_{x,2,comp}[2\times g][v]=H_{x,2,comp}[2\times(2\times f)][v]$, $H_{x,3,comp}[2\times g][v]=H_{x,3,comp}[2\times(2\times f)][v]$, $H_{x,4,comp}[2\times g][v]=H_{x,4,comp}[2\times(2\times f)][v]$, $H_{x,5,comp}[2\times g][v]=H_{x,5,comp}[2\times(2\times f)][v]$, $H_{x,6,comp}[2\times g][v]=H_{x,6,comp}[2\times(2\times f)][v]$, $H_{x,7,comp}[2\times g][v]=H_{x,7,comp}[2\times(2\times f)][v]$, $H_{x,8,comp}[2\times g][v]=H_{x,8,comp}[2\times(2\times f)][v]$, $H_{x,9,comp}[2\times g][v]=H_{x,9,comp}[2\times(2\times f)][v]$, $H_{x,10,comp}[2\times g][v]=H_{x,10,comp}[2\times(2\times f)][v]$, $H_{x,11,comp}[2\times g][v]=H_{x,11,comp}[2\times(2\times f)][v]$, $H_{x,12,comp}[2\times g][v]=H_{x,12,comp}[2\times(2\times f)][v]$, $H_{x,13,comp}[2\times g][v]=H_{x,13,comp}[2\times(2\times f)][v]$, $H_{p1,comp}[2\times g][v]=H_{p1,comp}[2\times(2\times f)][v]$, and $H_{p2,comp}[2\times g][v]=H_{p2,comp}[2\times(2\times f)][v]$ in row 2xg, or that is, row 2×(2×f) of the parity check matrix $H_{pro\_m}$, which is for the LDPC-CC of coding rate 13/15 that uses an improved tail-biting scheme (an LDPC block code using an LDPC-CC), is expressed as follows.

The following holds true for $H_{x,1,comp}[2\times(2\times f)][v]$.

[Math. 878]

$$H_{x,1,comp}[2\times(2\times f)][((2\times f)-0-1)+1]=1 \tag{260-1}$$

When y is an integer no smaller than one and no greater than $R_{\#(2d+1),1}$, and $(2\times f)-\alpha_{\#(2d+1),1,y}-1\geq 0$:

$$H_{x,1,comp}[2\times(2\times f)][((2\times f)-\alpha_{\#(2d+1),1,y}-1)+1]=1 \tag{260-2}$$

When $(2\times f)-\alpha_{\#(2d+1),1,y}-1<0$:

$$H_{x,1,comp}[2\times(2\times f)][((2\times f)-\alpha_{\#(2d+1),1,y}-1)+1+(2\times m\times z)]=1 \tag{260-3}$$

For all v being an integer no smaller than one and no greater than 2×m×z satisfying $\{v\neq((2\times f)-0-1)+1\}$, $\{v\neq((2\times f)-\alpha_{\#(2d+1),1,y}-1)+1\}$, and $\{v\neq(2\times f)-\alpha_{\#(2d+1),1,y}-1)+1+(2\times m\times z)\}$ (where y is an integer no smaller than one and no greater than $R_{\#(2d+1),1}$), the following holds true:

$$H_{x,1,comp}[2\times(2\times f)][v]=0 \tag{260-4}$$

Considered in a similar manner, the following holds true for $H_{x,w,comp}[2\times(2\times f)][v]$. In the following, w is an integer no smaller than one and no greater than six.

[Math. 879]

$$H_{x,w,comp}[2\times(2\times f)][((2\times f)-0-1)+1]=1 \tag{261-1}$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)][((2\times f)-\alpha_{\#(2d+1),w,y}-1)+1]=1 \tag{261-2}$$

When $(2\times f)-\alpha_{\#(2d+1),w,y}+<0$:

$$H_{x,w,comp}[2\times(2\times f)][((2\times f)-\alpha_{\#(2d+1),w,y}-1)+1+(2\times m\times z)]=1 \quad (261\text{-}3)$$

For all v being an integer no smaller than one and no greater than 2×m×z satisfying $\{v\neq((2\times f)-0-1)+1\}$, $\{v\neq((2\times f)-\alpha_{\#(2d+1),w,y}-1)+1\}$, and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)][v]=0 \quad (261\text{-}4)$$

Further, the following holds true for $H_{x,7,comp}[2\times(2\times f)][v]$. In the following, y is an integer no smaller than $R_{\#(2d+1),7}+1$ and no greater than $r_{\#(2d+1),7}$.

[Math. 880]

When $(2\times f)-\alpha_{\#(2d+1),7,y}-1\geq 0$:

$$H_{x,7,comp}[2\times(2\times f)][((2\times f)-\alpha_{\#(2d+1),7,y}-1)+1]=1 \quad (262\text{-}1)$$

When $(2\times f)-\alpha_{\#(2d+1),7,y}-1<0$:

$$H_{x,7,comp}[2\times(2\times f)][((2\times f)-\alpha_{\#(2d+1),7,y}-1)+1+(2\times m\times z)]=1 \quad (262\text{-}2)$$

For all v being an integer no smaller than one and no greater than 2×m×z satisfying $\{v\neq((2\times f)-\alpha_{\#(2d+1),7,y}-1)+1\}$, and $\{v\neq((2\times f)-\alpha_{\#(2d+1),7,y}-1)+1+(2\times m\times z)\}$ (where y is an integer no smaller than $R_{\#(2d+1),7}+1$ and no greater than $r_{\#(2d+1),7}$), the following holds true:

$$H_{x,7,comp}[2\times(2\times f)][v]=0 \quad (262\text{-}3)$$

Considered in a similar manner, the following holds true for $H_{x,\Omega,comp}[2\times(2\times f)][v]$. In the following, Ω is an integer no smaller than seven and no greater than thirteen, and y is an integer no smaller than $R_{\#(2d+1),\Omega}+1$ and no greater than $r_{\#(2d+1),\Omega}$.

[Math. 881]

When $(2\times f)-\alpha_{\#(2d+1),\Omega,y}-1\geq 0$:

$$H_{x,\Omega,comp}[2\times(2\times f)][((2\times f)-\alpha_{\#(2d+1),\Omega,y}-1),+1]=1 \quad (263\text{-}1)$$

When $(2\times f)-\alpha_{\#(2d+1),\Omega,y}-1<0$:

$$H_{x,\Omega,comp}[2\times(2\times f)][((2\times f)-\alpha_{\#(2d+1),\Omega,y}-1)+1+(2\times m\times z)]=1 \quad (263\text{-}2)$$

For all v being an integer no smaller than one and no greater than 2×m×z satisfying $\{v\neq(2\times f)-\alpha_{\#(2d+1),\Omega,y}-1)++1\}$ and $\{v\neq((2\times f)-\alpha_{\#(2d+1),\Omega,y}-1)+1+(2\times m\times z)\}$ (where y is an integer no smaller than $R_{\#(2d+1),\Omega}+1$ and no greater than $r_{\#(2d+1),\Omega}$), the following holds true:

$$H_{x,\Omega,comp}[2\times(2\times f)][v]=0 \quad (263\text{-}3)$$

Further, the following holds true for $H_{p1,comp}[2\times(2\times f)][v]$.

[Math. 882]

When $(2\times f)-\beta_{\#(2d+1),2}-1\geq 0$:

$$H_{p1,comp}[2\times(2\times f)][((2\times f)-\beta_{\#(2d+1),2}-1)+1]=1 \quad (264\text{-}1)$$

When $(2\times f)-\beta_{\#(2d+1),2}-1<0$:

$$H_{p1,comp}[2\times(2\times f)][((2\times f)-\beta_{\#(2d+1),2}-1)+1+(2\times m\times z)]=1 \quad (264\text{-}2)$$

For all v being an integer no smaller than one and no greater than 2×m×z satisfying $\{v\neq((2\times f)-\beta_{\#(2d+1),2}-1)+1\}$ and $\{v\neq((2\times f)-\beta_{\#(2d+1),2}-1)+1+(2\times m\times z)\}$, the following holds true:

$$H_{p1,comp}[2\times(2\times f)][v]=0 \quad (264\text{-}3)$$

Further, the following holds true for $H_{p2,comp}[2\times(2\times f)][v]$.

[Math. 883]

$$H_{p2,comp}[2\times(2\times f)][((2\times f)-0-1)+1]=1 \quad (265\text{-}1)$$

For all v being an integer no smaller than one and no greater than 2×m×z satisfying $\{v\neq((2\times f)-0-1)+1\}$, the following holds true:

$$H_{p2,comp}[2\times(2\times f)][v]=0 \quad (265\text{-}2)$$

Further, (8) when g=2×f (where f is an integer no smaller than one and no greater than m×z), when a vector for row 2×(2×f) of the parity check matrix $H_{pro\_m}$, which is for the LDPC-CC of coding rate 13/15 that uses an improved tail-biting scheme (an LDPC block code using an LDPC-CC), can be generated by using a parity check polynomial satisfying zero provided by expression (198-2-2), ((2×f)−1) %2m=2d+1 holds true. Accordingly, a parity check polynomial satisfying zero of expression (198-2-2) where 2i+1=2d+1 holds true (where d is an integer no smaller than zero and no greater than m−1).

Accordingly, components $H_{x,1,comp}[2\times g][v]=H_{x,1,comp}[2\times(2\times f)][v]$, $H_{x,2,comp}[2\times g][v]=H_{x,2,comp}[2\times(2\times f)][v]$, $H_{x,3,comp}[2\times g][v]=H_{x,3,comp}[2\times(2\times f)][v]$, $H_{x,4,comp}[2\times g][v]=H_{x,4,comp}[2\times(2\times f)][v]$, $H_{x,5,comp}[2\times g][v]=H_{x,5,comp}[2\times(2\times f)][v]$, $H_{x,6,comp}[2\times g][v]=H_{x,6,comp}[2\times(2\times f)][v]$, $H_{x,7,comp}[2\times g][v]=H_{x,7,comp}[2\times(2\times f)][v]$, $H_{x,8,comp}[2\times g][v]=H_{x,8,comp}[2\times(2\times f)][v]$, $H_{x,9,comp}[2\times g][v]=H_{x,9,comp}[2\times(2\times f)][v]$, $H_{x,10,comp}[2\times g][v]=H_{x,10,comp}[2\times(2\times f)][v]$, $H_{x,11,comp}[2\times g][v]=H_{x,11,comp}[2\times(2\times f)][v]$, $H_{x,12,comp}[2\times g][v]=H_{x,12,comp}[2\times(2\times f)][v]$, $H_{x,13,comp}[2\times g][v]=H_{x,13,comp}[2\times(2\times f)][v]$, $H_{p1,comp}[2\times g][v]=H_{p1,comp}[2\times(2\times f)][v]$, and $H_{p2,comp}[2\times g][v]=H_{p2,comp}[2\times(2\times f)][v]$ in row 2×g, or that is, row 2×(2×f) of the parity check matrix $H_{pro\_m}$, which is for the LDPC-CC of coding rate 13/15 that uses an improved tail-biting scheme (an LDPC block code using an LDPC-CC), is expressed as follows.

The following holds true for $H_{x,1,comp}[2\times(2\times f)][v]$.

[Math. 884]

$$H_{x,1,comp}[2\times(2\times f)][((2\times f)-0-1)+1]=1 \quad (266\text{-}1)$$

When y is an integer no smaller than one and no greater than $R_{\#(2d+1),1}$, and $(2\times f)-\alpha_{\#(2d+1),1,y}-1\geq 0$:

$$H_{x,1,comp}[2\times(2\times f)][((2\times f)-\alpha_{\#(2d+1),1,y}-1)+1]=1 \quad (266\text{-}2)$$

When $(2\times f)-\alpha_{\#(2d+1),1,y}-1<0$:

$$H_{x,1,comp}[2\times(2\times f)][((2\times f)-\alpha_{\#(2d+1),1,y}-1)+1+(2\times m\times z)]=1 \quad (266\text{-}3)$$

For all v being an integer no smaller than one and no greater than 2×m×z satisfying $\{v\neq((2\times f)-0-1)+1\}$, $\{v\neq((2\times f)-\alpha_{\#(2d+1),1,y}-1)+1\}$, and $\{v\neq((2\times f)-\alpha_{\#(2d+1),1,y}-1)+1+(2\times m\times z)\}$ (where y is an integer no smaller than one and no greater than $R_{\#(2d+1),1}$), the following holds true:

$$H_{x,1,comp}[2\times(2\times f)][v]=0 \quad (266\text{-}4)$$

Considered in a similar manner, the following holds true for $H_{x,w,comp}[2\times(2\times f)][v]$. In the following, w is an integer no smaller than one and no greater than six.

[Math. 885]

$$H_{x,w,comp}[2\times(2\times f)][((2\times f)-0-1)+1]=1 \quad (267\text{-}1)$$

When y is an integer no smaller than one and no greater than $R_{\#(2d+1),w}$, and $(2\times f)-\alpha_{\#(2d+1),w,y}-1\geq 0$:

$$H_{x,w,comp}[2\times(2\times f)][((2\times f)-\alpha_{\#(2d+1),w,y}-1)+1]=1 \quad (267\text{-}2)$$

When $(2\times f)-\alpha_{\#(2d+1),w,y}-1<0$:

$$H_{x,w,comp}[2\times(2\times f)][((2\times f)-\alpha_{\#(2d+1),w,y}-1)+1+(2\times m\times z)]=1 \quad (267\text{-}3)$$

For all v being an integer no smaller than one and no greater than 2×m×z satisfying $\{v\neq((2\times f)-0-1)+1\}$, $\{v\neq((2\times f)-\alpha_{\#(2d+1),w,y}-1)+1\}$, and $\{v\neq((2\times f)-\alpha_{\#(2d+1),w,y}-1)+1+(2\times m\times z)\}$ (where y is an integer no smaller than one and no greater than $R_{\#(2d+1),w}$), the following holds true:

$$H_{x,w,comp}[2\times(2\times f)][v]=0 \quad (267\text{-}4)$$

Further, the following holds true for $H_{x,7,comp}[2\times(2\times f)][v]$. In the following, y is an integer no smaller than $R_{\#(2d+1),7}+1$ and no greater than $r_{\#(2d+1),7}$.

[Math. 886]

When $(2\times f)-\alpha_{\#(2d+1),7,y}-1\geq 0$:

$$H_{x,7,comp}[2\times(2\times f)][((2\times f)-\alpha_{\#(2d+1),7,y}-1)+1]=1 \quad (268\text{-}1)$$

When $(2\times f)-\alpha_{\#(2d+1),7,y}-1<0$:

$$H_{x,7,comp}[2\times(2\times f)][((2\times f)-\alpha_{\#(2d+1),7,y}-1)+1+(2\times m\times z)]=1 \quad (268\text{-}2)$$

For all v being an integer no smaller than one and no greater than $2\times m\times z$ satisfying $\{v\neq((2\times f)-\alpha_{\#(2d+1),7,y}-1)+1\}$, and $\{v\neq((2\times f)-\alpha_{\#(2d+1),7,y}-1)+1+(2\times m\times z)\}$ (where y is an integer no smaller than $R_{\#(2d+1),7}+1$ and no greater than $r_{\#(2d+1),7}$), the following holds true:

$$H_{x,7,comp}[2\times(2\times f)][v]=0 \quad (268\text{-}3)$$

Considered in a similar manner, the following holds true for $H_{x,\Omega,comp}[2\times(2\times f)][v]$. In the following, $\Omega$ is an integer no smaller than seven and no greater than thirteen, and y is an integer no smaller than $R_{\#(2d+1),\Omega}+1$ and no greater than $r_{\#(2d+1),\Omega}$.

[Math. 887]

When $(2\times f)-\alpha_{\#(2d+1),\Omega,y}-1\geq 0$:

$$H_{x,\Omega,comp}[2\times(2\times f)][((2\times f)-\alpha_{\#(2d+1),\Omega,y}-1)+1]=1 \quad (269\text{-}1)$$

When $(2\times f)-\alpha_{\#(2d+1),\Omega,y}-1\geq 0$:

$$H_{x,\Omega,comp}[2\times(2\times f)][((2\times f)-\alpha_{\#(2d+1),\Omega,y}-1)+1+(2\times m\times z)]=1 \quad (269\text{-}2)$$

For all v being an integer no smaller than one and no greater than $2\times m\times z$ satisfying $\{v\neq(2\times f)-\alpha_{\#(2d+1),\Omega,y}-1)+1\}$ and $\{v\neq((2\times f)-\alpha_{\#(2d+1),\Omega,y}-1)+1+(2\times m\times z)\}$ (where y is an integer no smaller than $R_{\#(2d+1),\Omega}+1$ and no greater than $r_{\#(2d+1),\Omega}$), the following holds true:

$$H_{x,\Omega,comp}[2\times(2\times f)][v]=0 \quad (269\text{-}3)$$

Further, the following holds true for $H_{p1,comp}[2\times(2\times f)][v]$.

[Math. 888]

For all v being an integer no smaller than one and no greater than $2\times m\times z$, the following holds true:

$$H_{p1,comp}[2\times(2\times f)][v]=0 \quad (270)$$

Further, the following holds true for $H_{p2,comp}[2\times(2\times f)][v]$.

[Math. 889]

$$H_{p2,comp}[2\times(2\times f)][((2\times f)-0-1)+1]=1 \quad (271\text{-}1)$$

When $(2\times f)-\beta_{\#(2d+1),3}-1\geq 0$:

$$H_{p2,comp}[2\times(2\times f)][((2\times f)-\beta_{\#(2d+1),3}-1)+1]=1 \quad (271\text{-}2)$$

When $(2\times f)-\beta_{\#(2d+1),3}-1<0$:

$$H_{p2,comp}[2\times(2\times f)][((2\times f)-\beta_{\#(2d+1),3}-1)+1+(2\times m\times z)]=1 \quad (271\text{-}3)$$

For all v being an integer no smaller than one and no greater than $2\times m\times z$ satisfying $\{v\neq((2\times f)-0-1)+1\}$, $\{v\neq((2\times f)-\beta_{\#(2d+1),3}-1)+1\}$, and $\{v\neq((2\times f)-\beta_{\#(2d+1),3}-1)+1+(2\times m\times z)\}$, the following holds true:

$$H_{p2,comp}[2\times(2\times f)][v]=0 \quad (271\text{-}4)$$

An LDPC-CC of coding rate 13/15 that uses an improved tail-biting scheme (an LDPC block code using an LDPC-CC) can be generated as described above, and the code so generated achieves high error correction capability.

In the above, parity check polynomials satisfying zero for the LDPC-CC of coding rate 13/15 that uses an improved tail-biting scheme (an LDPC block code using an LDPC-CC) are set as follows:

the 0th parity check polynomial satisfying zero is a parity check polynomial satisfying zero of #0'; first expression provided by expression 205;

the first parity check polynomial satisfying zero is a parity check polynomial satisfying zero of #0; second expression;

the 2×i−2th parity check polynomial satisfying zero is a parity check polynomial satisfying zero of #((i−1)%2m); first expression; and the 2×i−1th parity check polynomial satisfying zero is a parity check polynomial satisfying zero of #((i−1)%2m); second expression (where i is an integer no smaller than two and no greater than 2×m×z).

Based on this, the following method is conceivable as a configuration where usage of parity check polynomials satisfying zero is limited.

In this configuration, parity check polynomials satisfying zero for the LDPC-CC of coding rate 13/15 that uses an improved tail-biting scheme (an LDPC block code using an LDPC-CC) are set as follows:

the 0th parity check polynomial satisfying zero is a parity check polynomial satisfying zero of #0'; first expression provided by expression 205;

the first parity check polynomial satisfying zero is a parity check polynomial satisfying zero of #0; second expression provided by expression (197-2-1);

the 2×i−2th parity check polynomial satisfying zero is a parity check polynomial satisfying zero of #((i−1)%2m); first expression provided by expression (197-1-1) or expression (198-1-1); and the 2×i−1th parity check polynomial satisfying zero is a parity check polynomial satisfying zero of #((i−1)%2m); second expression provided by expression (197-2-1) or expression (198-2-1) (where i is an integer no smaller than two and no greater than 2×m×z).

Accordingly, in the parity check matrix $H_{pro\_m}$ for the LDPC-CC of coding rate 13/15 that uses an improved tail-biting scheme (an LDPC block code using an LDPC-CC):

the vector composed of row one of the parity check matrix $H_{pro\_m}$ is generated by using a parity check polynomial satisfying zero of #0'; first expression provided by expression 205;

the vector composed of row two of the parity check matrix $H_{pro\_m}$ is generated by using a parity check polynomial satisfying zero of #0; second expression provided by expression (197-2-1);

the vector composed of row 2×g−1 of the parity check matrix $H_{pro\_m}$ is generated by using a parity check polynomial satisfying zero of #((g−1)%2m); first expression provided by expression (197-1-1) or expression (198-1-1); and the vector composed of row 2×g of the parity check matrix $H_{pro\_m}$ is generated by using a parity check polynomial satisfying zero of #((g−1)%2m); second expression provided by expression (197-2-1) or expression (198-2-1) (where g is an integer no smaller than two and no greater than 2×m×z).

Note that when making such a configuration, the above-described method of configuring the parity check matrix $H_{pro}$ for the LDPC-CC of coding rate 13/15 that uses an improved tail-biting scheme (an LDPC block code using an LDPC-CC) is applicable.

Such a method also enables generating a code with high error correction capability.

Embodiment G5

In embodiment G4, description is provided of an LDPC-CC of coding rate 13/15 that uses an improved tail-biting scheme (an LDPC block code using an LDPC-CC) and a method of configuring a parity check matrix for the code.

With regards to parity check matrices for low density parity check (block) codes, one example of which is the LDPC-CC of coding rate 13/15 that uses an improved tail-biting scheme (an LDPC block code using an LDPC-CC), a parity check matrix equivalent to a parity check matrix defined for a given LDPC code can be generated by using the parity check matrix defined for the given LDPC code.

For example, a parity check matrix equivalent to the parity check matrix $H_{pro\_m}$ described in embodiment G4, which is for the LDPC-CC of coding rate 13/15 that uses an improved tail-biting scheme (an LDPC block code using an LDPC-CC), can be generated by using the parity check matrix $H_{pro\_m}$.

The following describes a method of generating a parity check matrix equivalent to a parity check matrix defined for a given LDPC by using the parity check matrix defined for the given LDPC code.

Note that the method of generating an equivalent parity check matrix described in the present embodiment is not only applicable to the LDPC-CC of coding rate 13/15 that uses an improved tail-biting scheme (an LDPC block code using an LDPC-CC) described in embodiment G4, but also is widely applicable to LDPC codes in general.

FIG. 31 illustrates the configuration of a parity check matrix H for an LDPC (block) code of coding rate (N−M)/N (N>M>0). For example, the parity check matrix of FIG. 31 has M rows and N columns. Here, to provide a general description, the parity check matrix H in FIG. 31 is considered to be a parity check matrix for defining an LDPC (block) code #A of coding rate (N−M)/N (N>M>0).

In FIG. 31, a transmission sequence (codeword) for block j is $v_j^T=(Y_{j,1}, Y_{j,2}, Y_{j,3}, \ldots, Y_{j,N-2}, Y_{j,N-1}, Y_{j,N})$ (for systematic codes, $Y_{j,k}$ (where k is an integer no smaller than one and no greater than N) is information X or parity P (parity $P_{pro}$)).

Here, $Hv_j=0$ holds true (where the zero in $Hv_j=0$ indicates that all elements of the vector $Hv_j$ are zeroes. That is, row k of the vector $Hv_j$ has a value of zero for all k (where k is an integer no smaller than one and no greater than M)).

Then, an element of row k (where k is an integer no smaller than one and no greater than N) of the transmission sequence $v_j$ of block j (in FIG. 31, an element of column k in the transpose matrix $v_j^T$ of the transmission sequence $v_j$) is $Y_{j,k}$, and a vector obtained by extracting column k of the parity check matrix H for the LDPC (block) code #A of coding rate (N−M)/N (N>M>0) can be expressed as $c_k$, as illustrated in FIG. 31. Here, the parity check matrix H is expressed as follows.

[Math. 890]

$$H=[c_1 c_2 c_3 \ldots c_{N-2} c_{N-1} c_N] \tag{272}$$

FIG. 32 illustrates a configuration when interleaving is applied to the transmission sequence (codeword) $v_j^T=(Y_{j,1}, Y_{j,2}, Y_{j,3}, \ldots, Y_{j,N-2}, Y_{j,N-1}, Y_{j,N})$ of block j. In FIG. 32, an encoding section 3202 receives information 3201 as input, performs encoding thereon, and outputs encoded data 3203. For example, when encoding the LDPC (block) code #A of coding rate (N−M)/N (N>M>0), the encoder 3202 receives information in block j as input, performs encoding thereon based on the parity check matrix H for the LDPC (block) code #A of coding rate (N−M)/N (N>M>0), and outputs the transmission sequence (codeword) $v_j^T=(Y_{j,1}, Y_{j,2}, Y_{j,3}, \ldots, Y_{j,N-2}, Y_{j,N-1}, Y_{j,N})$ of block j.

Then, an accumulation and reordering section (interleaving section) 3204 receives the encoded data 3203 as input, accumulates the encoded data 3203, performs reordering thereon, and outputs interleaved data 3205. Accordingly, the accumulation and reordering section (interleaving section) 3204 receives the transmission sequence $v_j=(Y_{j,1}, Y_{j,2}, Y_{j,3}, \ldots, Y_{j,N-2}, Y_{j,N-1}, Y_{j,N})^T$ of block j as input, and outputs a transmission sequence (codeword) $v'_j=(Y_{j,32}, Y_{j,99}, Y_{j,23}, \ldots, Y_{j,234}, Y_{j,3}, Y_{j,43})^T$, which is illustrated in FIG. 32, as a result of reordering being performed on the elements of the transmission sequence $v_j$ ($v'_j$ being an example). Here, as discussed above, the transmission sequence $v'_j$ is obtained by reordering the elements of the transmission sequence $v_j$ of block j. Accordingly, $v'_j$ is a vector having one row and n columns, and the N elements of $v'_j$ are such that one each of the terms $Y_{j,1}, Y_{j,2}, Y_{j,3}, \ldots, Y_{j,N-2}, Y_{j,N-1}, Y_{j,N}$ is present.

Here, an encoding section 3207 as shown in FIG. 32 having the functions of the encoding section 3202 and the accumulation and reordering section (interleaving section) 3204 is considered. Accordingly, the encoding section 3207 receives the information 3201 as input, performs encoding thereon, and outputs the encoded data 3203. For example, the encoding section 3207 receives information in block j as input, and as shown in FIG. 32, outputs the transmission sequence (codeword) $v'_j=(Y_{j,32}, Y_{j,99}, Y_{j,23}, \ldots, Y_{j,234}, Y_{j,3}, Y_{j,43})^T$. In the following, explanation is provided of a parity check matrix H' for the LDPC (block) code of coding rate (N−M)/N (N>M>0) corresponding to the encoding section 3207 (i.e., a parity check matrix H' that is equivalent to the parity check matrix H for the LDPC (block) code #A of coding rate (N−M)/N (N>M>0)), while referring to FIG. 33. (Needless to say, the parity check matrix H' is a parity check matrix for the LDPC (block) code #A of coding rate (N−M)/N (N>M>0).)

FIG. 33 shows a configuration of the parity check matrix H', which is a parity check matrix equivalent to the parity check matrix H for the LDPC (block) code #A of coding rate (N−M)/N (N>M>0), when the transmission sequence (codeword) is $v'_j=(Y_{j,32}, Y_{j,99}, Y_{j,23}, \ldots, Y_{j,234}, Y_{j,3}, Y_{j,43})^T$. Here, an element of row one of the transmission sequence $v'_j$ of block j (an element of column one in the transpose matrix $v'^T_j$ of the transmission sequence $v'_j$ in FIG. 33) is $Y_{j,32}$. Accordingly, a vector obtained by extracting column one of the parity check matrix H', when using the above-described vector $c_k$ (k=1, 2, 3, . . . , N−2, N−1, N), is $c_{32}$. Similarly, an element of row two of the transmission sequence $v'_j$ of block j (an element of column two in the transpose matrix $v'^T_j$ of the transmission sequence $v'_j$ in FIG. 33) is $Y_{j,99}$. Accordingly, a vector obtained by extracting column two of the parity check matrix H' is $c_{99}$. Further, as shown in FIG. 33, a vector obtained by extracting column three of the parity check matrix H' is $c_{23}$, a vector obtained by extracting column N−2 of the parity check matrix H' is $c_{234}$, a vector obtained by extracting column N−1 of the parity check matrix H' is $c_3$, and a vector obtained by extracting column N of the parity check matrix H' is $c_{43}$.

That is, when denoting an element of row i of the transmission sequence $v'_j$, of block j (an element of column i in the transpose matrix $v'^T_j$ of the transmission sequence $v'_j$ in FIG. 33) as $Y_{j,g}$ (where g=1, 2, 3, . . . , N−1, N−1, N), then a vector obtained by extracting column i of the parity check matrix H' is $c_g$, when using the vector $c_k$ described above.

Accordingly, the parity check matrix H' for transmission sequence (codeword) $v'_j=(Y_{j,32}, Y_{j,99}, Y_{j,23}, \ldots, Y_{j,234}, Y_{j,3}, Y_{j,43})^T$ is expressed as follows.

[Math. 891]

$$H'=[c_{32}c_{99}c_{23} \ldots c_{234}c_3c_{43}] \quad (273)$$

When denoting an element of row i of the transmission sequence $v'_j$ of block j (an element of column i in the transpose matrix $v'^T_j$ of the transmission sequence $v'_j$ in FIG. 33) as $Y_{j,g}$ (where g=1, 2, 3, . . . , N−1, N−1, N), a vector obtained by extracting column i of the parity check matrix H' is $c_g$, when using the vector $c_k$ described above. When the above is followed to create a parity check matrix, then a parity check matrix for the transmission sequence $v'_j$ of block j can be obtained with no limitation to the above-given example.

Accordingly, when interleaving is applied to the transmission sequence (codeword) of the LDPC (block) code #A of coding rate (N−M)/N (N>M>0), a matrix for the interleaved transmission sequence is obtained by performing reordering of columns (column permutation) as described above on the parity check matrix H for the LDPC (block) code #A of coding rate (N−M)/N (N>M>0).

As such, it naturally follows that the transmission sequence (codeword) ($v_j$) obtained by reverting the interleaved transmission sequence (codeword) ($v'_j$) to its original order is the transmission sequence (codeword) of the LDPC (block) code #A of coding rate (N−M)/N (N>M>0). Accordingly, by reverting the interleaved transmission sequence (codeword) ($v'_j$) and a parity check matrix H' corresponding to the interleaved transmission sequence (codeword) ($v'_j$) to their respective orders, the transmission sequence $v_j$ and a parity check matrix corresponding to the transmission sequence $v_j$ can be obtained, respectively. Further, the parity check matrix obtained by performing the reordering as described above is the parity check matrix H in FIG. 31, description of which has been provided above.

FIG. 34 illustrates an example of a decoding-related configuration of a receiving device, when encoding of FIG. 32 has been performed. The transmission sequence obtained when the encoding of FIG. 32 is performed undergoes processing such as mapping in accordance with a modulation scheme, frequency conversion, and modulated signal amplification, whereby a modulated signal is obtained. A transmitting device transmits the modulated signal. The receiving device then receives the modulated signal transmitted by the transmitting device to obtain a received signal. A log-likelihood ratio calculation section 3400 illustrated in FIG. 34 takes the received signal as input, calculates a log-likelihood ratio for each bit of the codeword, and outputs a log-likelihood ratio signal 3401.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ of block j. Then, the log-likelihood ratio calculation section 3400 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios.

An accumulation and reordering section (deinterleaving section) 3402 receives the log-likelihood ratio signal 3401 as input, performs accumulation and reordering thereon, and outputs a deinterleaved log-likelihood ratio signal 3403.

For example, the accumulation and reordering section (deinterleaving section) 3402 receives, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, performs reordering, and outputs the log-likelihood ratios in the order of: the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order.

A decoder 3404 receives the deinterleaved log-likelihood ratio signal 3403 as input, performs belief propagation (BP) decoding as disclosed in Non-Patent Literature 6 to 8, such as sum-product decoding, min-sum decoding, offset BP decoding, normalized BP decoding, shuffled BP decoding, and layered BP decoding in which scheduling is performed, based on the parity check matrix H for the LDPC (block) code #A of coding rate (N−M)/N (N>M>0) as illustrated in FIG. 31, and thereby obtains an estimation sequence 3405 (note that decoding schemes other than belief propagation decoding may be used).

For example, the decoder 3404 receives, as input, the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order, performs belief propagation decoding based on the parity check matrix H for the LDPC (block) code #A of coding rate (N−M)/N (N>M>0) as illustrated in FIG. 31, and obtains the estimation sequence (note that decoding schemes other than belief propagation decoding may be used).

The following describes a decoding-related configuration that differs from that described above. The decoding-related configuration described in the following differs from the decoding-related configuration described above in that the accumulation and reordering section (deinterleaving section) 3402 is not included. The operations of the log-likelihood ratio calculation section 3400 are similar to those described above, and thus, explanation thereof is omitted in the following.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ of block j. Then, the log-likelihood ratio calculation section 3400 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios (corresponding to 3406 in FIG. 34).

A decoder 3407 receives the log-likelihood ratio signal 3406 for each bit as input, performs belief propagation (BP) decoding as disclosed in Non-Patent Literature 6 to 8, such as sum-product decoding, min-sum decoding, offset BP decoding, normalized BP decoding, shuffled BP decoding, and layered BP decoding in which scheduling is performed, based on the parity check matrix H' for the LDPC (block) code #A of coding rate (N−M)/N (N>M>0) as illustrated in FIG. 33, and thereby obtains an estimation sequence 3409 (note that decoding schemes other than belief propagation decoding may be used).

For example, the decoder 3407 receives, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$ in the stated order, performs belief propagation decoding based on the parity check matrix H' for the LDPC (block) code #A of coding rate (N−M)/N (N>M>0) as illustrated in FIG. 33, and obtains the estimation sequence (note that decoding schemes other than belief propagation decoding may be used).

As explained above, even when the transmitted data is reordered due to the transmitting device interleaving the transmission sequence $v_j=(Y_{j,1}, Y_{j,2}, Y_{j,3}, \ldots, Y_{j,N-2}, Y_{j,N-1}, Y_{j,N})^T$ of block j, the receiving device is able to obtain the estimation sequence by using a parity check matrix corresponding to the reordered transmitted data.

Accordingly, when interleaving is applied to the transmission sequence (codeword) of the LDPC (block) code #A of coding rate (N−M)/N (N>M>0), a parity check matrix for the interleaved transmission sequence (codeword) is obtained by performing reordering of columns (i.e., column permutation) as described above on the parity check matrix for the LDPC (block) code #A of coding rate (N−M)/N (N>M>0). As such, the receiving device is able to perform belief propagation decoding and thereby obtain an estimation sequence without performing interleaving on the log-likelihood ratio for each acquired bit.

Note that in the above, explanation is provided of the relation between interleaving applied to a transmission sequence and a parity check matrix. In the following, explanation is provided of reordering of rows (row permutation) performed on a parity check matrix.

FIG. 35 illustrates a configuration of a parity check matrix H corresponding to a transmission sequence (codeword) $v_j^T=(Y_{j,1}, Y_{j,2}, Y_{j,3}, \ldots, Y_{j,N-2}, Y_{j,N-1}, Y_{j,N})$ of block j of the LDPC (block) code #A of coding rate (N−M)/N (N>M>0). For example, the parity check matrix H of FIG. 35 is a matrix having M rows and N columns. (for systematic codes, $Y_{j,k}$ (where k is an integer no smaller than one and no greater than N) is information X or parity P (parity $P_{pro}$), and is composed of (N−M) information bits and M parity bits). Here, $Hv_j=0$ holds true. (Here, the zero in $Hv_j=0$ indicates that all elements of the vector $Hv_j$ are zeroes. That is, row k of the vector $Hv_j$ has a value of zero for all k (where k is an integer no smaller than one and no greater than M.)

Further, a vector obtained by extracting column k (where k is an integer no smaller than one and no greater than M) of the parity check matrix H for the LDPC (block) code #A of coding rate (N−M)/N (N>M>0) as illustrated in FIG. 35 is denoted as $z_k$. Then, the parity check matrix H for the LDPC (block) code is expressed as follows.

[Math. 892]

$$H=\begin{bmatrix} z_1 \\ z_2 \\ \vdots \\ z_{M-1} \\ z_M \end{bmatrix} \tag{274}$$

Next, a parity check matrix obtained by performing reordering of rows (row permutation) on the parity check matrix H of FIG. 35 is considered.

FIG. 36 shows an example of a parity check matrix H' obtained by performing reordering of rows (row permutation) on the parity check matrix H of FIG. 35. The parity check matrix H', similar to the parity check matrix shown in FIG. 35, is a parity check matrix corresponding to the transmission sequence (codeword) $v_j^T=(Y_{j,1}, Y_{j,2}, Y_{j,3}, \ldots, Y_{j,N-2}, Y_{j,N-1}, Y_{j,N})$ of block j of the LDPC (block) code #A of coding rate (N−M)/N (N>M>0).

The parity check matrix H' of FIG. 36 is composed of vectors $z_k$ obtained by extracting row k (where k is an integer no smaller one and no greater than M) of the parity check matrix H of FIG. 35. For example, in the parity check matrix H', the first row is composed of vector $z_{130}$, the second row is composed of vector $z_{24}$, the third row is composed of vector $z_{45}$, . . . , the (M−2)th row is composed of vector $z_{33}$, the (M−1)th row is composed of vector $z_9$, and the Mth row is composed of vector $z_3$. Note that each of the M row-vectors obtained by extracting row k (where k is an integer no smaller than one and no greater than M) of the parity check matrix H' is such that one each of $z_1, z_2, z_3, \ldots z_{M-2}, z_{M-1}$, and $z_M$ is present.

Here, the parity check matrix H' for the LDPC (block) code #A of coding rate (N−M)/N (N>M>0) is expressed as follows.

[Math. 893]

$$H'=\begin{bmatrix} z_{130} \\ z_{24} \\ \vdots \\ z_9 \\ z_3 \end{bmatrix} \tag{275}$$

Further, $H'v_j=0$ holds true. (Here, the zero in $H'v_j=0$ indicates that all elements of the vector $H'v_j$ are zeroes. That is, row k of the vector $H'v_j$ has a value of zero for all k (where k is an integer no smaller than one and no greater than M.)

That is, for the transmission sequence $v_j^T$ of block j, a vector obtained by extracting row i of the parity check matrix H' in FIG. 36 is expressed as $c_k$ (where k is an integer no smaller than one and no greater than M), and each of the M row vectors obtained by extracting row k (where k is an integer no smaller than one and no greater than M) of the parity check matrix H' in FIG. 36 is such that one each of $z_1, z_2, z_3, \ldots z_{M-2}, z_{M-1}$, and $z_M$ is present.

As described above, for the transmission sequence $v_j^T$ of block j, a vector obtained by extracting row i of the parity check matrix H' in FIG. 36 is expressed as $c_k$ (where k is an integer no smaller than one and no greater than M), and each of the M row vectors obtained by extracting row k (where k is an integer no smaller than one and no greater than M) of the parity check matrix H' in FIG. 36 is such that one each of $z_1, z_2, z_3, \ldots z_{M-2}, z_{M-1}$, and $z_M$ is present. Note that, when the above is followed to create a parity check matrix, then a parity check matrix for the transmission sequence parity $v_j$ of block j can be obtained with no limitation to the above-given example.

Accordingly, even when the LDPC (block) code #A of coding rate (N−M)/N (N>M>0) is being used, it does not necessarily follow that a transmitting device and a receiving device are using the parity check matrix H. As such, a transmitting device and a receiving device may use as a parity check matrix, for example, a matrix obtained by performing reordering of columns (column permutation) as described above on the parity check matrix H or a matrix obtained by performing reordering of rows (row permutation) on the parity check matrix H.

In addition, a matrix obtained by performing both reordering of columns (column permutation) and reordering of rows (row permutation) as described above on the parity check matrix H for the LDPC (block) code #A of coding rate (N−M)/N (N>M>0) may be used as a parity check matrix.

In such a case, a parity check matrix $H_1$ is obtained by performing reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_2$ is obtained by performing reordering of rows (row permutation) on the parity check matrix $H_1$ (i.e., through conversion from the parity check matrix shown in FIG. 35 to the parity check matrix shown in FIG. 36). A transmitting device and a receiving device may perform encoding and decoding by using the parity check matrix $H_2$ so obtained.

Also, a parity check matrix $H_{1,1}$ is obtained by performing a first reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_{2,1}$ may be obtained by performing a first reordering of rows (row permutation) on the parity check matrix $H_{1,1}$ (i.e., through conversion from the parity check matrix shown in FIG. 35 to the parity check matrix shown in FIG. 36).

Further, a parity check matrix $H_{1,2}$ may be obtained by performing a second reordering of columns (column permutation) on the parity check matrix $H_{2,1}$. Finally, a parity check matrix $H_{2,2}$ may be obtained by performing a second reordering of rows (row permutation) on the parity check matrix $H_{1,2}$.

As described above, a parity check matrix $H_{2,s}$ may be obtained by repetitively performing reordering of columns (column permutation) and reordering of rows (row permutation) for s iterations (where s is an integer no smaller than two). In such a case, a parity check matrix $H_{1,k}$ is obtained by performing a kth (where k is an integer no smaller than two and no greater than s) reordering of columns (column permutation) on a parity check matrix $H_{2,k-1}$. Then, a parity check matrix $H_{2,k}$ is obtained by performing a kth reordering of rows (row permutation) on the parity check matrix $H_{1,k}$. Note that in the first instance, a parity check matrix $H_{1,1}$ is obtained by performing a first reordering of columns (column permutation) on the parity check matrix H for the LDPC (block) code #A of coding rate (N−M)/N (N>M>0). Then, a parity check matrix $H_{2,1}$ is obtained by performing a first reordering of rows (row permutation) on the parity check matrix $H_{1,1}$.

In such a case, a transmitting device and a receiving device may perform encoding and decoding by using the parity check matrix $H_{2,s}$.

In an alternative method, a parity check matrix $H_3$ is obtained by performing reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_4$ is obtained by performing reordering of columns (column permutation) on the parity check matrix $H_3$ (i.e., through conversion from the parity check matrix shown in FIG. 31 to the parity check matrix shown in FIG. 33). In such a case, a transmitting device and a receiving device may perform encoding and decoding by using the parity check matrix $H_4$ so obtained.

Also, a parity check matrix $H_{3,1}$ is obtained by performing a first reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_{4,1}$ may be obtained by performing a first reordering of columns (column permutation) on the parity check matrix $H_{3,1}$ (i.e., through conversion from the parity check matrix shown in FIG. 31 to the parity check matrix shown in FIG. 33).

Then, a parity check matrix $H_{3,2}$ may be obtained by performing a second reordering of rows (row permutation) on the parity check matrix $H_{4,1}$. Finally, a parity check matrix $H_{4,2}$ may be obtained by performing a second reordering of columns (column permutation) on the parity check matrix $H_{3,2}$.

As described above, a parity check matrix $H_{4,s}$ may be obtained by repetitively performing reordering of rows (row permutation) and reordering of columns (column permutation) for s iterations (where s is an integer no smaller than two). In such a case, a parity check matrix $H_{3,k}$ is obtained by performing a kth (where k is an integer no smaller two and no greater than s) reordering of rows (row permutation) on a parity check matrix $H_{4,k-1}$. Then, a parity check matrix $H_{4,k}$ is obtained by performing a kth reordering of columns (column permutation) on the parity check matrix $H_{3,k}$. Note that in the first instance, a parity check matrix $H_{3,1}$ is obtained by performing a first reordering of rows (row permutation) on the parity check matrix H for the LDPC (block) code #A of coding rate (N−M)/N (N>M>0). Then, a parity check matrix $H_{4,1}$ is obtained by performing a first reordering of columns (column permutation) on the parity check matrix $H_{3,1}$.

In such a case, a transmitting device and a receiving device may perform encoding and decoding by using the parity check matrix $H_{4,s}$.

Here, note that by performing reordering of rows (row permutation) and reordering of columns (column permutation), the parity check matrix H for the LDPC (block) code #A of coding rate (N−M)/N (N>M>0) can be obtained from each of the parity check matrix $H_2$, the parity check matrix $H_{2,s}$, the parity check matrix $H_4$, and the parity check matrix $H_{4,s}$.

Similarly, a matrix obtained by performing both reordering of columns (column permutation) as described above and reordering of rows (row permutation) as described above on the parity check matrix H for the LDPC (block) code #A of coding rate (N−M)/N (N>M>0) may be used as a parity check matrix.

In such a case, a parity check matrix $H_5$ is obtained by performing reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_6$ is obtained by performing reordering of rows (row permutation) on the parity check matrix $H_5$ (i.e., through conversion from the parity check matrix shown in FIG. 35 to the parity check matrix shown in FIG. 36). A transmitting device and a receiving device may perform encoding and decoding by using the parity check matrix $H_6$ so obtained.

Also, a parity check matrix $H_{5,1}$ is obtained by performing a first reordering of columns (column permutation) on the parity check matrix H for the LDPC (block) code #A of coding rate (N−M)/N (N>M>0) (i.e., through conversion from the parity check matrix shown in FIG. 31 to the parity check matrix shown in FIG. 33). Subsequently, a parity check matrix $H_{6,1}$ may be obtained by performing a first reordering of rows (row permutation) on the parity check matrix $H_{5,1}$ (i.e., through conversion from the parity check matrix shown in FIG. 35 to the parity check matrix shown in FIG. 36).

Further, a parity check matrix $H_{5,2}$ may be obtained by performing a second reordering of columns (column permutation) on the parity check matrix $H_{6,1}$. Finally, a parity check matrix $H_{6,2}$ may be obtained by performing a second reordering of rows (row permutation) on the parity check matrix $H_{5,2}$.

As described above, a parity check matrix $H_{6,s}$ may be obtained by repetitively performing reordering of columns (column permutation) and reordering of rows (row permutation) for s iterations (where s is an integer no smaller than two). In such a case, a parity check matrix $H_{5,k}$ is obtained by performing a kth (where k is an integer no smaller than two and no greater than s) reordering of columns (column permutation) on a parity check matrix $H_{6,k-1}$. Then, a parity check matrix $H_{6,k}$ is obtained by performing a kth reordering of rows (row permutation) on the parity check matrix $H_{5,k}$. Note that in the first instance, a parity check matrix $H_{5,1}$ is obtained by performing a first reordering of columns (column permutation) on the parity check matrix H for the LDPC (block) code #A of coding rate (N−M)/N (N>M>0). Then, a parity check matrix $H_{6,1}$ is obtained by performing a first reordering of rows (row permutation) on the parity check matrix $H_{5,1}$.

In such a case, a transmitting device and a receiving device may perform encoding and decoding by using the parity check matrix $H_{6,s}$.

In an alternative method, a parity check matrix $H_7$ is obtained by performing reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_8$ is obtained by performing reordering of columns (column permutation) on the parity check matrix $H_7$ (i.e., through conversion from the parity check matrix shown in FIG. 31 to the parity check matrix shown in FIG. 33). In such a case, a transmitting device and a receiving device may perform encoding and decoding by using the parity check matrix $H_8$ so obtained.

Also, a parity check matrix $H_{7,1}$ is obtained by performing a first reordering of rows (row permutation) on the parity check matrix H for the LDPC (block) code #A of coding rate (N−M)/N (N>M>0) (i.e., through conversion from the parity check matrix shown in FIG. 35 to the parity check matrix shown in FIG. 36). Subsequently, a parity check matrix $H_{8,1}$ may be obtained by performing a first reordering of columns (column permutation) on the parity check matrix $H_{7,1}$ (i.e., through conversion from the parity check matrix shown in FIG. 31 to the parity check matrix shown in FIG. 33).

Then, a parity check matrix $H_{7,2}$ may be obtained by performing a second reordering of rows (row permutation) on the parity check matrix $H_{8,1}$. Finally, a parity check matrix $H_{8,2}$ may be obtained by performing a second reordering of columns (column permutation) on the parity check matrix $H_{7,2}$.

As described above, a parity check matrix $H_{8,s}$ may be obtained by repetitively performing reordering of rows (row permutation) and reordering of columns (column permutation) for s iterations (where s is an integer no smaller than two). In such a case, a parity check matrix $H_{7,k}$ is obtained by performing a kth (where k is an integer no smaller two and no greater than s) reordering of rows (row permutation) on a parity check matrix $H_{8,k-1}$. Then, a parity check matrix $H_{8,k}$ is obtained by performing a kth reordering of columns (column permutation) on the parity check matrix $H_{7,k}$. Note that in the first instance, a parity check matrix $H_{7,1}$ is obtained by performing a first reordering of rows (row permutation) on the parity check matrix H for the LDPC (block) code #A of coding rate (N−M)/N (N>M>0). Then, a parity check matrix $H_{8,1}$ is obtained by performing a first reordering of columns (column permutation) on the parity check matrix $H_{7,1}$.

In such a case, a transmitting device and a receiving device may perform encoding and decoding by using the parity check matrix $H_{8,s}$.

Here, note that by performing reordering of rows (row permutation) and reordering of columns (column permutation), the parity check matrix H for the LDPC (block) code #A of coding rate (N−M)/N (N>M>0) can be obtained from each of the parity check matrix $H_6$, the parity check matrix $H_{6,s}$, the parity check matrix $H_8$, and the parity check matrix $H_{8,s}$.

In the present embodiment, description is provided of a method of generating a parity check matrix equivalent to a parity check matrix H for the LDPC (block) code #A of coding rate (N−M)/N (N>M>0) by performing reordering of rows (row permutation) and/or reordering of columns (column permutation) with respect to the parity check matrix H. Further, description is provided of a method of applying the equivalent parity check matrix in, for example, a communication/broadcast system using an encoder and a decoder using the equivalent parity check matrix. Note that the error correction code described herein may be applied to various fields, including but not limited to communication/broadcast systems.

Embodiment G6

In the present embodiment, description is provided of a device that uses the LDPC-CC of coding rate 13/15 that uses an improved tail-biting scheme (an LDPC block code using an LDPC-CC), description of which is provided in embodiment G4.

As one example, description is provided of a case where the LDPC-CC of coding rate 13/15 that uses an improved tail-biting scheme (an LDPC block code using an LDPC-CC) is applied to a communication device.

FIG. 22 illustrates the structures of a transmitting device 2200 and a receiving device 2210 in the communication device pertaining to the present embodiment.

An encoder 2201 receives information to be transmitted as input, and is capable of performing various types of encoding (e.g., various coding rates and various block lengths of block codes (for example, in systematic codes, the sum of the number of information bits and the number of parity bits)). In particular, when receiving a specification to perform encoding by using the LDPC-CC of coding rate 13/15 that uses an improved tail-biting scheme (an LDPC block code using an LDPC-CC), the encoder 2201 performs encoding by using the LDPC-CC of coding rate 13/15 that uses an improved tail-biting scheme (an LDPC block code using an LDPC-CC) to calculate parities $P_1$ and $P_2$. Further, the encoder 2201 outputs the information to be transmitted and the parities $P_1$ and $P_2$ as a transmission sequence.

A modulator 2202 receives the transmission sequence, which includes the information to be transmitted and the parities P1 and P2, performs mapping based on a predetermined modulation scheme (for example, BPSK, QPSK, 16QAM, or 64QAM), and outputs a baseband signal. Further, the modulator 2202 may also receive information other than the transmission sequence, which includes the information to be transmitted and the parities $P_1$ and $P_2$, as input, perform mapping, and output a baseband signal. For example, the modulator 2202 may receive control information as input.

The transmitting device outputs a transmission signal after performing predetermined signal processing (e.g., signal processing for generation of an OFDM signal, frequency conversion, amplification) with respect to such signals (e.g., baseband signals, pilot signals). The transmitting device may transmit the transmission signal over a wireless transmission path utilizing electromagnetic waves, or over a wired transmission path utilizing a coaxial cable, a power line, an optical cable, or the like.

The transmission signal is received by the receiving device 2210 after travelling over the transmission path. A receiver 2211 receives a reception signal as input, performs predetermined signal processing (e.g., bandwidth limitation, frequency conversion, signal processing for OFDM, frequency offset estimation, signal detection, channel estimation), and outputs a baseband signal and a channel estimation signal.

A log-likelihood ratio generation section 2212 receives the baseband signal and the channel estimation signal as input (may receive other signals as input), and for example, calculates and outputs a log-likelihood ratio for each bit (may calculate and output a hard value (hard decision value)).

A decoder 2213 receives the log-likelihood ratio for each bit as input, performs belief propagation decoding (e.g., sum-product decoding, scheduled sum-product decoding (Layered BP (belief propagation) decoding), min-sum decoding, Normalized BP decoding, offset BP decoding), and outputs an estimation sequence. The decoder 2213 performs the belief propagation decoding based on the parity check matrix for the LDPC-CC of coding rate 13/15 that uses an improved tail-biting scheme (an LDPC block code using an LDPC-CC).

Although description is provided above taking an example where error correction coding is introduced to a communication device, the error correction coding described above is not limited to being introduced to a communication device, and for example, may be introduced to a storage medium (storage). When making such a modification, information that is to be stored to a storage medium (storage) is encoded by using the LDPC-CC of coding rate 13/15 that uses an improved tail-biting scheme (an LDPC block code using an LDPC-CC), and resultant information and parities are stored to the storage medium (storage).

Further, the LDPC-CC of coding rate 13/15 that uses an improved tail-biting scheme (an LDPC block code using an LDPC-CC) is applicable to any device that requires error correction coding (e.g., a memory, a hard disk).

Note that when using a block code such as the LDPC-CC of coding rate 13/15 that uses an improved tail-biting scheme (an LDPC block code using an LDPC-CC) in a device, there as cases where special processing needs to be executed.

Assume that a block length of the LDPC-CC of coding rate 13/15 that uses an improved tail-biting scheme (an LDPC block code using an LDPC-CC) used in a device is 15000 bits (13000 information bits, and 2000 parity bits).

In such a case, the number of information bits necessary for encoding one block is 13000. Meanwhile, there are cases where the number of bits of information input to an encoding section of the device does not reach 13000. For example, assume a case where only 12000 information bits are input to the encoding section.

Here, it is assumed that the encoding section, in the above-described case, adds 1000 padding bits of information to the 12000 information bits having been input, and performs encoding by using a total of 13000 bits, composed of the 12000 information bits having been input and the 1000 padding bits, to generate 2000 parity bits. Here, assume that all of the 1000 padding bits are known bits. For example, assume that each of the 1000 padding bits is "0".

A transmitting device may output the 12000 information bits having been input, the 1000 padding bits, and the 2000 parity bits. Alternatively, a transmitting device may output the 12000 information bits having been input and the 2000 parity bits.

In addition, a transmitting device may perform puncturing with respect to the 12000 information bits having been input and the 2000 parity bits, and thereby output a number of bits smaller than 14000 in total.

Note that when performing transmission in such a manner, the transmitting device is required to transmit, to a receiving device, information notifying the receiving device that transmission has been performed in such a manner.

As described above, the LDPC-CC of coding rate 13/15 that uses an improved tail-biting scheme (an LDPC block code using an LDPC-CC), description of which is provided in embodiment G4, is applicable to various devices.

(Other Matters)

Needless to say, two or more of the embodiments described in the present disclosure may be combined for implementation.

INDUSTRIAL APPLICABILITY

The encoding method, encoder, and the like pertaining to the present invention achieve high error correction capability, and can thereby secure high data reception quality.

REFERENCE SIGNS LIST

2200 transmitting device

The invention claimed is:

1. An encoding method comprising:

generating, by performing encoding of coding rate 3/5 on an information sequence $X_1$, an information sequence $X_2$, and an information sequence $X_3$, an encoded sequence composed of the information sequence $X_1$, the information sequence $X_2$, the information sequence $X_3$, and a parity sequence P, the encoding based on a predetermined parity check matrix having m×z rows and 2×m×z columns, where m is an even number no smaller than two and z is a natural number, wherein the predetermined parity check matrix is one of a first parity check matrix and a second parity check matrix, the first parity check matrix corresponding to a low density parity check (LDPC) convolutional code that uses a plurality of parity check polynomials, the second parity check matrix being generated by performing at least one of row permutation and column permutation on the first parity check matrix, wherein two parity check polynomials satisfying zero are provided for each of $1 \times P_1(D)$ and $1 \times P_2(D)$ in accordance with the LDPC convolutional code, wherein each parity check polynomial satisfying zero of the LDPC convolutional code is expressed by one of a first group of expressions or one of a second group of expressions, wherein the first group of expressions consist of the following expressions:

$$\left(1+\sum_{s=1}^{R_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+\left(\sum_{s=R_{\#(2i),3}+1}^{r_{\#(2i),3}} D^{\alpha\#(2i),3,s}\right)X_3(D)+P_1(D)+D^{\beta\#(2i),0}P_2(D)=$$
$$(D^{\alpha\#(2i),1,}R_{\#(2i),1}+\ldots+D^{\alpha\#(2i),1,1}+1)X_1(D)+$$
$$(D^{\alpha\#(2i),2,}r_{\#(2i),2}+\ldots+D^{\alpha\#(2i),2,}R_{\#(2i),2}+1)X_2(D)+$$
$$(D^{\alpha\#(2i),3,}r_{\#(2i),3}+\ldots+D^{\alpha\#(2i),3,}R_{\#(2i),3}+1)X_3(D)+$$
$$P_1(D)+D^{\beta\#(2i),0}P_2(D)=0;$$

$$\left(1+\sum_{s=1}^{R_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+\left(\sum_{s=R_{\#(2i),3}+1}^{r_{\#(2i),3}} D^{\alpha\#(2i),3,s}\right)X_3(D)+P_1(D)+D^{\beta\#(2i),1}P_1(D)=$$
$$(D^{\alpha\#(2i),1,}R_{\#(2i),1}+\ldots+D^{\alpha\#(2i),1,1}+1)X_1(D)+$$
$$(D^{\alpha\#(2i),2,}r_{\#(2i),2}+\ldots+D^{\alpha\#(2i),2,}R_{\#(2i),2}+1)X_2(D)+$$
$$(D^{\alpha\#(2i),3,}r_{\#(2i),3}+\ldots+D^{\alpha\#(2i),3,}R_{\#(2i),3}+1)X_3(D)+$$
$$P_1(D)+D^{\beta\#(2i),1}P_1(D)=0;$$

$$\left(\sum_{s=R_{\#(2i),1}+1}^{r_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(1+\sum_{s=1}^{R_{\#(2i),3}} D^{\alpha\#(2i),3,s}\right)X_3(D)+P_2(D)+D^{\beta\#(2i),2}P_1(D)=$$
$$(D^{\alpha\#(2i),1,}r_{\#(2i),1}+\ldots+D^{\alpha\#(2i),1,}R_{\#(2i),1}+1)X_1(D)+$$
$$(D^{\alpha\#(2i),2,}R_{\#(2i),2}+\ldots+D^{\alpha\#(2i),2,1}+1)X_2(D)+$$
$$(D^{\alpha\#(2i),3,}R_{\#(2i),3}+\ldots+D^{\alpha\#(2i),3,1}+1)X_3(D)+$$
$$P_2(D)+D^{\beta\#(2i),2}P_1(D)=0;$$

$$\left(\sum_{s=R_{\#(2i),1}+1}^{r_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(1+\sum_{s=1}^{R_{\#(2i),3}} D^{\alpha\#(2i),3,s}\right)X_3(D)+P_2(D)+D^{\beta\#(2i),3}P_2(D)=$$
$$(D^{\alpha\#(2i),1,}r_{\#(2i),1}+\ldots+D^{\alpha\#(2i),1,}R_{\#(2i),1}+1)X_1(D)+$$
$$(D^{\alpha\#(2i),2,}R_{\#(2i),2}+\ldots+D^{\alpha\#(2i),2,1}+1)X_2(D)+$$
$$(D^{\alpha\#(2i),3,}R_{\#(2i),3}+\ldots+D^{\alpha\#(2i),3,1}+1)X_3(D)+$$
$$P_2(D)+D^{\beta\#(2i),3}P_2(D)=0$$

where

- p is an integer no smaller than one and no greater than three,
- q is an integer no smaller than one and no greater than $r_{\#(2i),p}$,
- when $r_{\#(2),p}$ is a natural number, $X_p(D)$ is a polynomial expression of the information sequence $X_p$ and P(D) is a polynomial expression of the parity sequence P, D being a delay operator,
- $a_{\#(2i),p,q}$ and $\beta_{\#(2i),0}$ are natural numbers,
- $\beta_{\#(2i),1}$ is a natural number,
- $\beta_{\#(2i),2}$ is an integer no smaller than zero,
- $\beta_{\#(2i),3}$ is a natural number,
- $R_{\#(2i),p}$ is a natural number,
- $1 \le R_{\#(2i),p} < r_{\#(2i),p}$ holds true, and
- $\alpha_{\#(2i),p,y} \ne \alpha_{\#(2i),p,z}$ holds true for $\forall$(y, z) where y is an integer no smaller than one and no greater than $r_{\#(2i),p}$, z is an integer no smaller than one and no greater than $r_{\#2i,p}$, and y and z satisfy y≠z, and wherein the second group of expressions consist of the following expressions:

$$\left(\sum_{s=R_{\#(2i+1),1}+1}^{r_{\#(2i+1),1}} D^{\alpha\#(2i+1),1,s}\right)X_1(D)+\left(1+\sum_{s=1}^{R_{\#(2i+1),2}} D^{\alpha\#(2i+1),2,s}\right)X_2(D)+\left(1+\sum_{s=1}^{R_{\#(2i+1),3}} D^{\alpha\#(2i+1),3,s}\right)X_3(D)+P_1(D)+D^{\beta\#(2i+1),0}P_2(D)=$$
$$(D^{\alpha\#(2i+1),1,}r_{\#(2i+1),1}+\ldots+D^{\alpha\#(2i+1),1,}R_{\#(2i+1),1}+1)X_1(D)+$$
$$(D^{\alpha\#(2i+1),2,}R_{\#(2i+1),2}+\ldots+D^{\alpha\#(2i+1),2,1}+1)X_2(D)+$$
$$(D^{\alpha\#(2i+1),3,}R_{\#(2i+1),3}+\ldots+D^{\alpha\#(2i+1),3,1}+1)X_3(D)+$$
$$P_1(D)+D^{\beta\#(2i+1),0}P_2(D)=0;$$

$$\left(\sum_{s=R_{\#(2i+1),1}+1}^{r_{\#(2i+1),1}} D^{\alpha\#(2i+1),1,s}\right)X_1(D)+\left(1+\sum_{s=1}^{R_{\#(2i+1),2}} D^{\alpha\#(2i+1),2,s}\right)X_2(D)+\left(1+\sum_{s=1}^{R_{\#(2i+1),3}} D^{\alpha\#(2i+1),3,s}\right)X_3(D)+P_1(D)+D^{\beta\#(2i+1),1}P_1(D)=$$
$$(D^{\alpha\#(2i+1),1,}r_{\#(2i+1),1}+\ldots+D^{\alpha\#(2i+1),1,}R_{\#(2i+1),1}+1)X_1(D)+$$
$$(D^{\alpha\#(2i+1),2,}R_{\#(2i+1),2}+\ldots+D^{\alpha\#(2i+1),2,1}+1)X_2(D)+$$
$$(D^{\alpha\#(2i+1),3,}R_{\#(2i+1),3}+\ldots+D^{\alpha\#(2i+1),3,1}+1)X_3(D)+$$
$$P_1(D)+D^{\beta\#(2i+1),1}P_1(D)=0;$$

$$\left(1+\sum_{s=1}^{R_{\#(2i+1),1}} D^{\alpha\#(2i+1),1,s}\right)X_1(D)+\left(\sum_{s=R_{\#(2i+1),2}+1}^{r_{\#(2i+1),2}} D^{\alpha\#(2i+1),2,s}\right)X_2(D)+\left(\sum_{s=R_{\#(2i+1),3}+1}^{r_{\#(2i+1),3}} D^{\alpha\#(2i+1),3,s}\right)X_3(D)+P_2(D)+D^{\beta\#(2i+1),2}P_1(D)=$$
$$(D^{\alpha\#(2i+1),1,}R_{\#(2i+1),1}+\ldots+D^{\alpha\#(2i+1),1,1}+1)X_1(D)+$$
$$(D^{\alpha\#(2i+1),2,}r_{\#(2i+1),2}+\ldots+D^{\alpha\#(2i+1),2,}R_{\#(2i+1),2}+1)X_2(D)+$$
$$(D^{\alpha\#(2i+1),3,}r_{\#(2i+1),3}+\ldots+D^{\alpha\#(2i+1),3,}R_{\#(2i+1),3}+1)X_3(D)+$$
$$P_2(D)+D^{\beta\#(2i+1),2}P_1(D)=0;$$

$$\left(1+\sum_{s=1}^{R_{\#(2i+1),1}} D^{\alpha\#(2i+1),1,s}\right)X_1(D)+\left(\sum_{s=R_{\#(2i+1),2}+1}^{r_{\#(2i+1),2}} D^{\alpha\#(2i+1),2,s}\right)X_2(D)+\left(\sum_{s=R_{\#(2i+1),3}+1}^{r_{\#(2i+1),3}} D^{\alpha\#(2i+1),3,s}\right)X_3(D)+P_2(D)+D^{\beta\#(2i+1),2}P_2(D)=$$
$$(D^{\alpha\#(2i+1),1,}R_{\#(2i+1),1}+\ldots+D^{\alpha\#(2i+1),1,1}+1)X_1(D)+$$
$$(D^{\alpha\#(2i+1),2,}r_{\#(2i+1),2}+\ldots+D^{\alpha\#(2i+1),2,}R_{\#(2i+1),2}+1)X_2(D)+$$
$$(D^{\alpha\#(2i+1),3,}r_{\#(2i+1),3}+\ldots+D^{\alpha\#(2i+1),3,}R_{\#(2i+1),3}+1)X_3(D)+$$
$$P_2(D)+D^{\beta\#(2i+1),3}P_2(D)=0$$

where

- p is an integer no smaller than one and no greater than three,
- q is an integer no smaller than one and no greater than $r_{\#(2i+1),p}$, when $r_{\#(2i+1),p}$ is a natural number, $X_p(D)$ is a polynomial expression of the information sequence $X_p$ and P(D) is a polynomial expression of the parity sequence P, D being a delay operator, $\alpha_{\#(2i+1),p,q}$ and $\beta\#(_{2i+1),0}$ are natural numbers, $\beta_{\#(2i+1),1}$ is a natural number, $\beta_{\#(2i+1),2}$ is an integer no smaller than zero, $\beta_{\#(2i+1),3}$ is a natural number, $R_{\#(2i+1),p}$ is a natural number, $1 \leq R_{\#(2i+1),p} < r_{\#(2i+1),p}$ holds true, and $\alpha_{\#(2i+1),p,y} \neq \alpha_{\#(2i+1),p,z}$ holds true for $^{\forall}$(y, z) where y is an integer no smaller than one and no greater than $r_{\#(2i+1),p}$, z is an integer no smaller than one and no greater than $r_{(\#2i+1),p}$, and y and z satisfy y≠z.

2. A decoding method of decoding an encoded sequence encoded by employing a predetermined encoding method, wherein the predetermined encoding method generates the encoded sequence by performing encoding of coding rate 3/5 on an information sequence $X_1$, an information sequence $X_2$, and an information sequence $X_3$, the encoded sequence composed of the information sequence $X_1$, the information sequence $X_2$, the information sequence $X_3$, and a parity sequence P, the encoding based on a predetermined parity check matrix having m×z rows and 2×m×z columns, where m is an even number no smaller than two and z is a natural number, wherein the predetermined parity check matrix is one of a first parity check matrix and a second parity check matrix, the first parity check matrix corresponding to a low density parity check (LDPC) convolutional code that uses a plurality of parity check polynomials, the second parity check matrix being generated by performing at least one of row permutation and column permutation on the first parity check matrix, wherein two parity check polynomials satisfying zero are provided for each of $1 \times P_1(D)$ and $1 \times P_2(D)$ in accordance with the LDPC convolutional code, wherein each parity check polynomial satisfying zero of the LDPC convolutional code is expressed by one of a first group of expressions or one of a second group of expressions, wherein the first group of expressions consist of the following expressions:

$$\left(1+\sum_{s=1}^{R_{\#(2i),1}} D^{\alpha\#(2i+1),1,s}\right)X_1(D)+\left(\sum_{s=R_{\#(2i),2}+1}^{r_{\#(2i),2}} D^{\alpha\#(2i),2,s}\right)X_2(D)+\left(\sum_{s=R_{\#(2i),3}+1}^{r_{\#(2i),3}} D^{\alpha\#(2i+1),3,s}\right)X_3(D)+P_1(D)+D^{\beta\#(2i+1),0}P_2(D)=$$
$$(D^{\alpha\#(2i),1,}R_{\#(2i),1}+\ldots+D^{\alpha\#(2i),1,1}+1)X_1(D)+(D^{\alpha\#(2i),2,}r_{\#(2i),2}+\ldots+D^{\alpha\#(2i),2,}R_{\#(2i),2}+1)X_2(D)+(D^{\alpha\#(2i+1),3,}r_{\#(2i),3}+\ldots+D^{\alpha\#(2i),3,}R_{\#(2i,),3}+1)X_3(D)+P_1(D)+D^{\beta\#(2i),0}P_2(D)=0;$$

$$\left(1+\sum_{s=1}^{R_{\#(2i),1}} D^{\alpha\#(2i),1,s}\right)X_1(D)+\left(\sum_{s=R_{\#(2i),2}+1}^{r_{\#(2i),2}} D^{\alpha\#(2i),2,s}\right)X_2(D)+\left(\sum_{s=R_{\#(2i),3}+1}^{r_{\#(2i),3}} D^{\alpha\#(2i),3,s}\right)X_3(D)+P_1(D)+D^{\beta\#(2i),1}P_1(D)=$$

-continued $$(D^{\alpha\#(2i),1,}R_{\#(2i),1}+\ldots+D^{\alpha\#(2i),1,1}+1)X_1(D)+(D^{\alpha\#(2i),2,}r_{\#(2i),2}+\ldots+D^{\alpha\#(2i),2,}R_{\#(2i),2}+1)X_2(D)+(D^{\alpha\#(2i),3,}r_{\#(2i),3}+\ldots+D^{\alpha\#(2i),3,}R_{\#(2i),3}+1)X_3(D)+P_1(D)+D^{\beta\#(2i),1}P_1(D)=0;$$

$$\left(\sum_{s=R_{\#(2i),2}+1}^{r_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(1+\sum_{s=1}^{R_{\#(2i),3}} D^{\alpha\#(2i),3,s}\right)X_3(D)+P_2(D)+D^{\beta\#(2i),2}P_1(D)=$$
$$(D^{\alpha\#(2i),1,}r_{\#(2i),1}+\ldots+D^{\alpha\#(2i),1}R_{\#(2i),1}+1)X_1(D)+(D^{\alpha\#(2i),2,}R_{\#(2i),2}+\ldots+D^{\alpha\#(2i),2,1}+1)X_2(D)+(D^{\alpha\#(2i),3,}R_{\#(2i),3}+\ldots+D^{\alpha\#(2i),3,1}+1)X_3(D)+P_2(D)+D^{\beta\#(2i),2}P_1(D)=0;$$

$$\left(\sum_{s=R_{\#(2i),1}+1}^{r_{\#(2i),1}} D^{\alpha\#(2i),1,s}\right)X_1(D)+\left(1+\sum_{s=1}^{R_{\#(2i),2}} D^{\alpha\#(2i),2,s}\right)X_2(D)+\left(1+\sum_{s=1}^{R_{\#(2i),3}} D^{\alpha\#(2i),3,s}\right)X_3(D)+P_2(D)+D^{\beta\#(2i),3}P_2(D)=$$
$$(D^{\alpha\#(2i),1,}r_{\#(2i+1),1}+\ldots+D^{\alpha\#(2i),1,}R_{\#(2i),1}+1)X_1(D)+(D^{\alpha\#(2i),2,}R_{\#(2i),2}+\ldots+D^{\alpha\#(2i),2,1}+1)X_2(D)+(D^{\alpha\#(2i),3,}R_{\#(2i),3}+\ldots+D^{\alpha\#(2i),3,1}+1)X_3(D)+P_2(D)+D^{\beta\#(2i),3}P_2(D)=0$$

where p is an integer no smaller than one and no greater than three, q is an integer no smaller than one and no greater than $r_{\#(2i),p}$, when $r_{\#(2i),p}$ is a natural number, $X_p(D)$ is a polynomial expression of the information sequence $X_p$ and P(D) is a polynomial expression of the parity sequence P, D being a delay operator, $\alpha_{\#(2i),p,q}$ and $\beta_{\#(2i),0}$ are natural numbers, $\beta_{\#(2i),1}$ is a natural number, $\beta_{\#(2i),2}$ is an integer no smaller than zero, $\beta_{\#(2i),3}$ is a natural number, $R_{\#(2i),p}$ is a natural number, $1 \leq R_{\#(2),p} < r_{\#(2),p}$ holds true, and $\alpha_{\#(2i),p,y} \neq \alpha_{\#(2i),p,z}$ holds true for $^{\forall}$(y, z) where y is an integer no smaller than one and no greater than $r_{\#(2i),p}$, z is an integer no smaller than one and no greater than $r_{\#2i,p}$, and y and z satisfy y≠z, wherein the second group of expressions consist of the following expressions:

$$\left(\sum_{s=R_{\#(2i+1),1}+1}^{r_{\#(2i+1),1}} D^{\alpha\#(2i+1),1,s}\right)X_1(D)+\left(1+\sum_{s=1}^{R_{\#(2i+1),2}} D^{\alpha\#(2i+1),2,s}\right)X_2(D)+\left(1+\sum_{s=1}^{R_{\#(2i+1),3}} D^{\alpha\#(2i+1),3,s}\right)X_3(D)+P_1(D)+D^{\beta\#(2i+1),0}P_2(D)=$$
$$(D^{\alpha\#(2i+1),1,}r_{\#(2i+1),1}+\ldots+D^{\alpha\#(2i+1),1,}R_{\#(2i+1),1}+1)X_1(D)+(D^{\alpha\#(2i+1),2,}R_{\#(2i+1),2}+\ldots+D^{\alpha\#(2i+1),2,1}+1)X_2(D)+$$

-continued $$(D^{\alpha\#(2i+1),3,R_{\#(2i+1),3}} + \dots + D^{\alpha\#(2i+1),3,1} + 1)X_3(D) + P_1(D) + D^{\beta\#(2i+1),0}P_2(D) = 0;$$

$$\left(\sum_{s=R_{\#(2i+1),1}+1}^{r_{\#(2i+1),1}} D^{\alpha\#(2i+1),1,s}\right)X_1(D) + \left(1 + \sum_{s=1}^{R_{\#(2i+1),2}} D^{\alpha\#(2i+1),2,s}\right)X_2(D) + \left(1 + \sum_{s=1}^{R_{\#(2i+1),3}} D^{\alpha\#(2i+1),3,s}\right)X_3(D) + P_1(D) + D^{\beta\#(2i+1),1}P_1(D) =$$
$$(D^{\alpha\#(2i+1),1,r_{\#(2i+1),1}} + \dots + D^{\alpha\#(2i+1),1,R_{\#(2i+1),1}} + 1)X_1(D) + (D^{\alpha\#(2i+1),2,R_{\#(2i+1),2}} + \dots + D^{\alpha\#(2i+1),2,1} + 1)X_2(D) + (D^{\alpha\#(2i+1),3,R_{\#(2i+1),3}} + \dots + D^{\alpha\#(2i+1),3,1} + 1)X_3(D) + P_1(D) + D^{\beta\#(2i+1),1}P_1(D) = 0;$$

$$\left(1 + \sum_{s=1}^{R_{\#(2i+1),1}} D^{\alpha\#(2i+1),1,s}\right)X_1(D) + \left(\sum_{s=R_{\#(2i+1),2}+1}^{r_{\#(2i+1),2}} D^{\alpha\#(2i+1),2,s}\right)X_2(D) + \left(\sum_{s=R_{\#(2i+1),3}+1}^{r_{\#(2i+1),3}} D^{\alpha\#(2i+1),3,s}\right)X_3(D) + P_2(D) + D^{\beta\#(2i+1),2}P_1(D) =$$
$$(D^{\alpha\#(2i+1),1,R_{\#(2i+1),1}} + \dots + D^{\alpha\#(2i+1),1,1} + 1)X_1(D) + (D^{\alpha\#(2i+1),2,r_{\#(2i+1),2}} + \dots + D^{\alpha\#(2i+1),2,R_{\#(2i+1),2}} + 1)X_2(D) + (D^{\alpha\#(2i+1),3,r_{\#(2i+1),3}} + \dots + D^{\alpha\#(2i+1),3,R_{\#(2i+1),3}} + 1)X_3(D) + P_2(D) + D^{\beta\#(2i+1),2}P_1(D) = 0;$$

$$\left(1 + \sum_{s=1}^{R_{\#(2i+1),1}} D^{\alpha\#(2i+1),1,s}\right)X_1(D) + \left(\sum_{s=R_{\#(2i+1),2}+1}^{r_{\#(2i+1),2}} D^{\alpha\#(2i+1),2,s}\right)X_2(D) + \left(\sum_{s=R_{\#(2i+1),3}+1}^{r_{\#(2i+1),3}} D^{\alpha\#(2i+1),3,s}\right)X_3(D) + P_2(D) + D^{\beta\#(2i+1),2}P_2(D) =$$
$$(D^{\alpha\#(2i+1),1,R_{\#(2i+1),1}} + \dots + D^{\alpha\#(2i+1),1,1} + 1)X_1(D) + (D^{\alpha\#(2i+1),2,r_{\#(2i+1),2}} + \dots + D^{\alpha\#(2i+1),2,R_{\#(2i+1),2}} + 1)X_2(D) + (D^{\alpha\#(2i+1),3,r_{\#(2i+1),3}} + \dots + D^{\alpha\#(2i+1),3,R_{\#(2i+1),3}} + 1)X_3(D) + P_2(D) + D^{\beta\#(2i+1),3}P_2(D) = 0$$

where p is an integer no smaller than one and no greater than three, q is an integer no smaller than one and no greater than $r_{\#(2i+1),p}$, when $r_{\#(2i+1),p}$ is a natural number, $X_p(D)$ is a polynomial expression of the information sequence $X_p$ and P(D) is a polynomial expression of the parity sequence P, D being a delay operator, $\alpha_{\#(2i+1),p,q}$ and $\beta_{\#(2i+1),0}$ are natural numbers, $\beta_{\#(2i+1),1}$ is a natural number, $\beta_{\#(2i+1),2}$ is an integer no smaller than zero, $\beta_{\#(2i+1),3}$ is a natural number, $R_{\#(2i+1),p}$ is a natural number, $1 \leq R_{\#(2i+1),p} < r_{\#(2i+1),p}$ holds true, and $a_{\#(2i+1),p,y} \neq \alpha_{\#(2i+1),p,z}$ holds true for $^{\forall}(y, z)$ where y is an integer no smaller than one and no greater than $r_{\#(2i+1),p}$, z is an integer no smaller than one and no greater than $r_{(\#2i+1),p}$, and y and z satisfy y≠z, and wherein the decoding method comprises decoding the encoded sequence based on the predetermined parity check matrix and by using belief propagation (BP).

* * * * *